US012538638B2

(12) United States Patent
Toyoshima et al.

(10) Patent No.: US 12,538,638 B2
(45) Date of Patent: Jan. 27, 2026

(54) ORGANIC ELECTROLUMINESCENT ELEMENT AND ELECTRONIC DEVICE

(71) Applicant: IDEMITSU KOSAN CO., LTD., Tokyo (JP)

(72) Inventors: Hiroaki Toyoshima, Tokyo (JP); Kazuki Nishimura, Tokyo (JP); Yuichiro Kawamura, Tokyo (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 312 days.

(21) Appl. No.: 18/269,469

(22) PCT Filed: Dec. 24, 2021

(86) PCT No.: PCT/JP2021/048441
§ 371 (c)(1),
(2) Date: Jun. 23, 2023

(87) PCT Pub. No.: WO2022/138976
PCT Pub. Date: Jun. 30, 2022

(65) Prior Publication Data

US 2024/0130146 A1 Apr. 18, 2024

(30) Foreign Application Priority Data

Dec. 25, 2020 (JP) ................................ 2020-217950
Mar. 11, 2021 (JP) ................................ 2021-039722
Mar. 12, 2021 (JP) ................................ 2021-040810

(51) Int. Cl.
*H10K 50/13* (2023.01)
*H10K 50/11* (2023.01)
(Continued)

(52) U.S. Cl.
CPC ............ *H10K 50/13* (2023.02); *H10K 50/11* (2023.02); *H10K 50/16* (2023.02); *H10K 50/171* (2023.02);
(Continued)

(58) Field of Classification Search
CPC .......................... H10K 50/13; H10K 2101/30
See application file for complete search history.

(56) References Cited

U.S. PATENT DOCUMENTS 12,114,520 B2 * 10/2024 Yamada .............. H10K 50/166
2010/0295444 A1 11/2010 Kuma et al.
(Continued)

FOREIGN PATENT DOCUMENTS

CN 105576146 A * 5/2016 .......... H10K 50/181
JP 2007-294261 A 11/2007
(Continued)

OTHER PUBLICATIONS

International Searching Authority, "International Search Report," issued in connection with International Patent Application No. PCT/JP2021/048441, dated Mar. 8, 2022.
(Continued)

*Primary Examiner* — Evren Seven
(74) *Attorney, Agent, or Firm* — Foley & Lardner LLP

(57) ABSTRACT

An organic electroluminescence device includes: a first emitting layer disposed between an anode and a cathode; and a second emitting layer disposed between the first emitting layer and the cathode. The first emitting layer contains a first host material and a first emitting compound, and the second emitting layer contains a second host material and a second emitting compound. A triplet energy of the first host material $T_1(H1)$ and a triplet energy of the second host material $T_1(H2)$ satisfy the relationship of a Numerical Formula 1 ($T_1(H1)<T_1(H2)$), and a lowest unoccupied
(Continued)

molecular orbital energy level of the second host material LUMO(H2) and a lowest unoccupied molecular orbital energy level of the second emitting compound LUMO(D2) satisfy the relationship of a Numerical Formula 2 ($|LUMO(D2)|-|LUMO(H2)|<0.74$ eV).

48 Claims, 5 Drawing Sheets

(51) Int. Cl.
*H10K 50/16* (2023.01)
*H10K 50/17* (2023.01)
*H10K 85/60* (2023.01)
(52) U.S. Cl.
CPC ....... *H10K 85/654* (2023.02); *H10K 85/6572* (2023.02); *H10K 85/658* (2023.02)

(56) References Cited

U.S. PATENT DOCUMENTS

2013/0001542 A1* 1/2013 Okajima ................ C09K 11/06 257/40
2013/0264550 A1* 10/2013 Muta ...................... H10K 50/15 257/40
2014/0183500 A1 7/2014 Ikeda et al.
2014/0231787 A1* 8/2014 Ishige .................... H10K 50/11 257/40
2017/0324043 A1 11/2017 Ikeda et al.
2018/0323396 A1* 11/2018 Tsukamoto .......... H10K 50/121
2019/0280209 A1 9/2019 Fujita
2020/0052222 A1* 2/2020 Bae ...................... H10K 85/656
2021/0098713 A1 4/2021 Choi et al.

FOREIGN PATENT DOCUMENTS

JP 2013-157552 A 8/2013
JP 2019-186521 A 10/2019
KR 20130074816 A * 7/2013 ............. H10K 50/13
KR 2019-0088651 A 7/2019
KR 20190137436 A * 12/2019 ................ C07F 5/02
WO WO-2010/134350 A1 11/2010
WO WO-2014/104144 A1 7/2014
WO WO-2021/049655 A1 3/2021

OTHER PUBLICATIONS

International Searching Authority, "Written Opinion," issued in connection with International Patent Application No. PCT/JP2021/048441, dated Mar. 8, 2022.
PCT International Preliminary Report on Patentability, dated Jun. 13, 2023, which includes a translation of International Searching Authority, "Written Opinion," issued in connection with International Patent Application No. PCT/JP2021/048441, dated Mar. 8, 2022.

* cited by examiner

ORGANIC ELECTROLUMINESCENT ELEMENT AND ELECTRONIC DEVICE

CROSS-REFERENCE TO RELATED APPLICATIONS

The present application claims priority under 35 U.S.C. § 371 to International Patent Application No. PCT/JP2021/048441, filed Dec. 24, 2021, which claims priority to and the benefit of Japanese Patent Application Nos. 2020-217950, filed on Dec. 25, 2020, 2021-039722, filed on Mar. 11, 2021, and 2021-040810, filed on Mar. 12, 2021. The contents of these applications are hereby incorporated by reference in their entireties.

TECHNICAL FIELD

The present invention relates to an organic electroluminescence device and an electronic device.

BACKGROUND ART

An organic electroluminescence device (hereinafter, occasionally referred to as "organic EL device") has found its application in a full-color display for mobile phones, televisions, and the like.

When voltage is applied to an organic EL device, holes are injected from an anode and electrons are injected from a cathode into an emitting layer.

The injected holes and electrons are recombined in the emitting layer to form excitons.

Specifically, according to the electron spin statistics theory, singlet excitons and triplet excitons are generated at a ratio of 25%:75%.

In order to enhance performance of the organic EL device, several studies have been conducted on techniques for layering a plurality of emitting layers, for example, in Patent Literature 1, Patent Literature 2, and Patent Literature 3.

In addition, in order to enhance the performance of the organic EL device, Patent Literature 4 describes a phenomenon in which a singlet exciton is generated by collision and fusion of two triplet excitons (hereinafter, occasionally referred to as a Triplet-Triplet Fusion (TTF) phenomenon).

The performance of the organic EL device is evaluable in terms of, for instance, luminance, emission wavelength, chromaticity, luminous efficiency, drive voltage, and lifetime.

CITATION LIST

Patent Literature(s)

Patent Literature 1 JP 2013-157552 A
Patent Literature 2 JP 2007-294261 A
Patent Literature 3 US Patent Application Publication No. 2019/280209
Patent Literature 4 International Publication No. WO 2010/134350

SUMMARY OF THE INVENTION

Problems to be Solved by the Invention

An object of the present invention is to provide an organic electroluminescence device having a long lifetime and an electronic device including the organic electroluminescence device.

Means for Solving the Problem(s)

An aspect of the invention provides an organic electroluminescence device including: an anode; a cathode; a first emitting layer disposed between the anode and the cathode; and a second emitting layer disposed between the first emitting layer and the cathode, in which the first emitting layer and the second emitting layer are disposed in this order between the anode and the cathode, the first emitting layer contains a first host material, the second emitting layer contains a second host material, the first host material and the second host material are mutually different, the first emitting layer contains at least a first emitting compound, the second emitting layer contains at least a second emitting compound, the first emitting compound and the second emitting compound are mutually the same or different, a triplet energy of the first host material $T_1(H1)$ and a triplet energy of the second host material $T_1(H2)$ satisfy a relationship of a numerical formula (Numerical Formula 1) below, and a lowest unoccupied molecular orbital energy level of the second host material LUMO(H2) and a lowest unoccupied molecular orbital energy level of the second emitting compound LUMO(D2) satisfy a relationship of a numerical formula (Numerical Formula 2) below.

$$T_1(H1) < T_1(H2) \quad \text{(Numerical Formula 1)}$$

$$|LUMO(D2)| - |LUMO(H2)| < 0.74 \text{ eV} \quad \text{(Numerical Formula 2)}$$

According to the above aspect of the invention, an organic electroluminescence device having a long lifetime can be provided.

Another aspect of the invention provides an organic electroluminescence device including: an anode; a cathode; a first anode side organic layer; a first emitting layer; a second emitting layer; and a first cathode side organic layer, in which the first anode side organic layer, the first emitting layer, the second emitting layer, and the first cathode side organic layer are disposed in this order between the anode and the cathode, the first anode side organic layer contains a first anode side organic material, the first emitting layer contains a first host material represented by a formula (1H) below, the second emitting layer contains a second host material, the first cathode side organic layer contains a first cathode side organic material, the first host material and the second host material are mutually different, the first emitting layer contains at least a first emitting compound, the second emitting layer contains at least a second emitting compound, the first emitting compound and the second emitting compound are mutually the same or different, a triplet energy of the first host material $T_1(H1)$, a triplet energy of the second host material $T_1(H2)$, and a triplet energy of the second emitting compound $T_1(D2)$ satisfy a relationship of a numerical formula (Numerical Formula A1) below.

$$T_1(H1) < T_1(H2) < T_1(D2) \quad \text{(Numerical Formula A1)}$$

$$A\text{-}L\text{-}B \quad \text{(1H)}$$

In the formula (1H):

A is a triplet structural moiety;

B is a hole injecting structural moiety;

L is a single bond or a linking group; and a calculation value of a highest occupied molecular orbital energy level HOMO(B) of the hole injecting structural moiety B is −5.70 eV or more.

According to the above aspect of the invention, a long-lifetime organic electroluminescence device having high luminous efficiency can be provided.

Another aspect of the invention provides an organic electroluminescence device including: an anode; a cathode; an emitting layer disposed between the anode and the cathode; an electron injecting layer disposed between the emitting layer and the cathode; and an electron transporting layer disposed between the electron injecting layer and the emitting layer, in which the electron injecting layer contains a metal element-containing compound containing a metal element in an amount of 70 mass % or more based on the mass of the electron injecting layer, the electron transporting layer includes at least an electron transporting zone material as at least one compound forming the electron transporting layer, a triplet energy of the electron transporting layer $T_1$(ETL) that is calculated using a numerical formula (Numerical Formula 1A) below is larger than 2.00 eV, the electron transporting layer is a single layer, the electron transporting layer is in direct contact with the emitting layer and with the electron injecting layer, the emitting layer includes a first emitting layer and a second emitting layer, the first emitting layer contains a first host material and a first emitting compound, the second emitting layer contains a second host material and a second emitting compound, the first host material and the second host material are mutually different, the first emitting compound and the second emitting compound are mutually the same or different, and a triplet energy of the first host material $T_1$(H1) and a triplet energy of the second host material $T_1$(H2) satisfy a relationship of a numerical formula (Numerical Formula 1) below.

$$T_1(H2) > T_1(H1) \quad \text{(Numerical Formula 1)}$$

[Formula 1]

$$T_1(ETL) = \sum_{k=1}^{n} (T_1(ET_k) \times R(ET_k)) \quad \text{(Numerical Formula 1A)}$$

In the above numerical formula (Numerical Formula 1A): $T_1(ET_k)$ is a triplet energy of each of the at least one compound forming the electron transporting layer; $R(ET_k)$ is a content ratio of the each of the at least one compound forming the electron transporting layer; and n is the number of the at least one compound forming the electron transporting layer.

According to the above aspect, an organic electroluminescence device that can have extended lifetime even when the organic compound layer disposed between the emitting layer and the electron injecting layer is a single layer and an electronic device equipped with the organic electroluminescence device can be provided.

According to the above aspect, an electronic device including the organic electroluminescence device according to any of the above aspects can be provided.

BRIEF EXPLANATION OF DRAWING(S)

FIG. 1 schematically illustrates an exemplary arrangement of an organic electroluminescence device according to a first exemplary embodiment of the invention.

Figure 4:
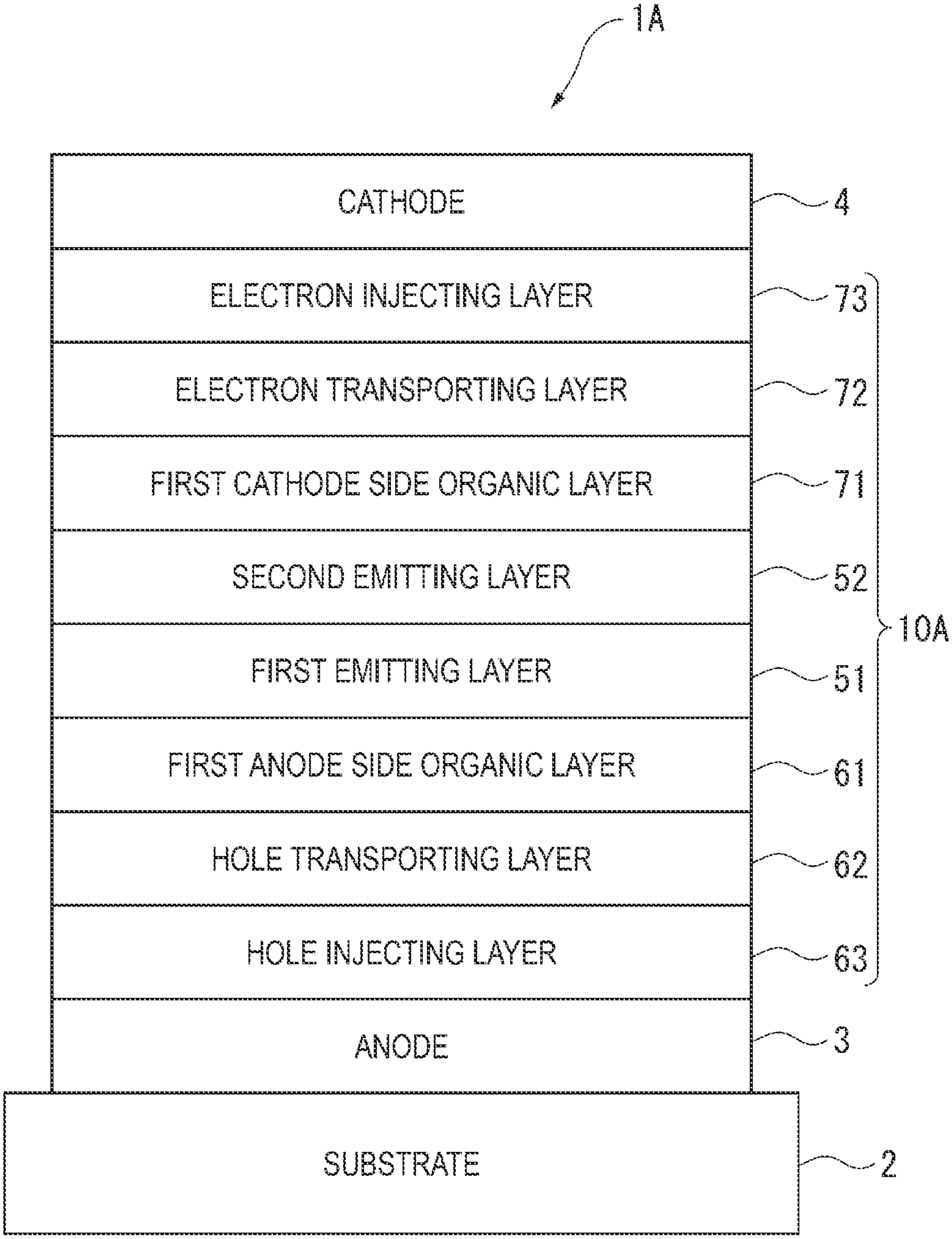

FIG. 4 schematically illustrates an exemplary arrangement of an organic electroluminescence device according to a second exemplary embodiment of the invention.

Figure 5:
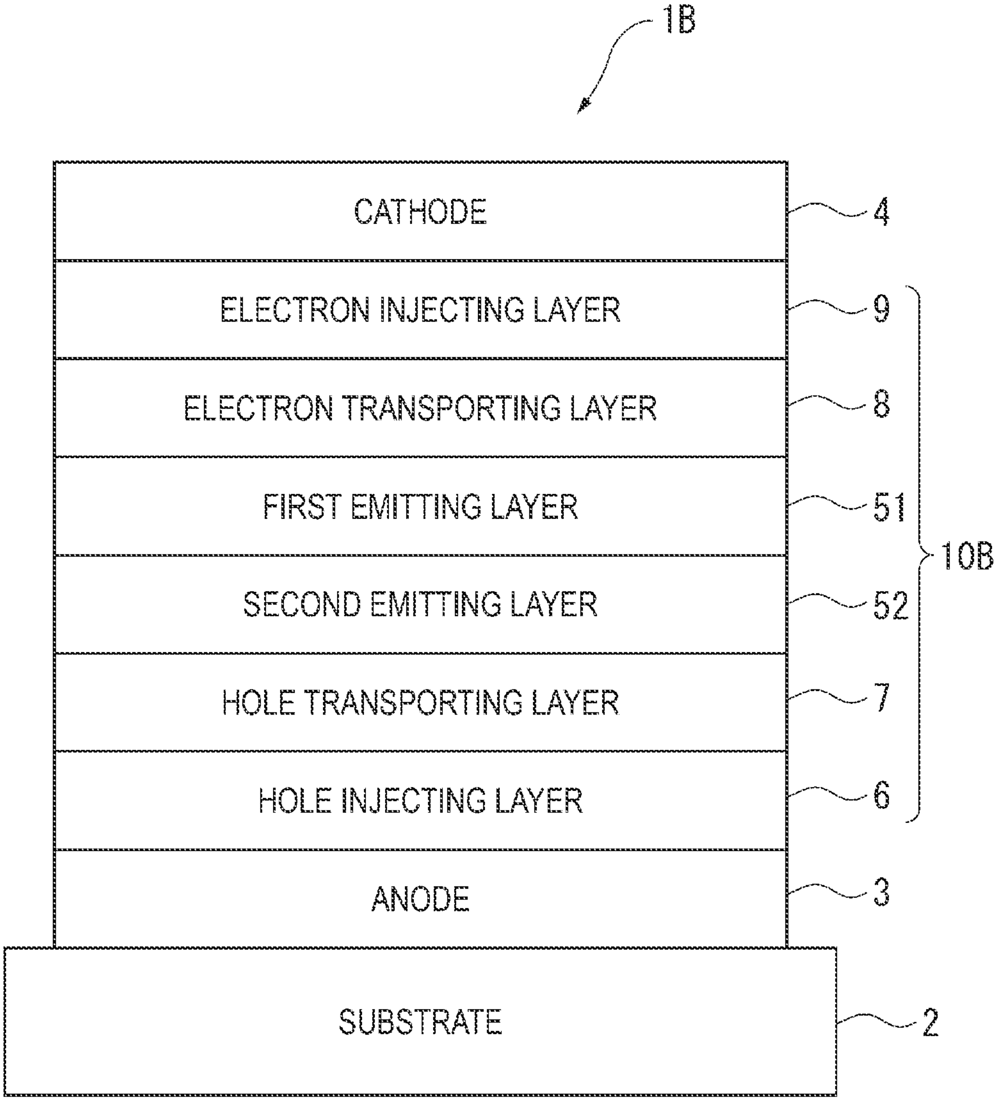

FIG. 5 schematically illustrates an exemplary arrangement of an organic electroluminescence device according to a third exemplary embodiment of the invention.

DESCRIPTION OF EMBODIMENT(S)

Definitions

Herein, a hydrogen atom includes isotope having different numbers of neutrons, specifically, protium, deuterium and tritium.

In chemical formulae herein, it is assumed that a hydrogen atom (i.e. protium, deuterium and tritium) is bonded to each of bondable positions that are not annexed with signs "R" or the like or "D" representing a deuterium.

Herein, the ring carbon atoms refer to the number of carbon atoms among atoms forming a ring of a compound (e.g., a monocyclic compound, fused-ring compound, cross-linking compound, carbon ring compound, and heterocyclic compound) in which the atoms are bonded to each other to form the ring.

When the ring is substituted by a substituent(s), carbon atom(s) contained in the substituent(s) is not counted in the ring carbon atoms.

Unless otherwise specified, the same applies to the "ring carbon atoms" described later.

For instance, a benzene ring has 6 ring carbon atoms, a naphthalene ring has 10 ring carbon atoms, a pyridine ring has 5 ring carbon atoms, and a furan ring has 4 ring carbon atoms.

Further, for instance, 9,9-diphenylfluorenyl group has 13 ring carbon atoms and 9,9'-spirobifluorenyl group has 25 ring carbon atoms.

When a benzene ring is substituted by a substituent in a form of, for instance, an alkyl group, the number of carbon atoms of the alkyl group is not counted in the number of the ring carbon atoms of the benzene ring.

Accordingly, the benzene ring substituted by an alkyl group has 6 ring carbon atoms.

When a naphthalene ring is substituted by a substituent in a form of, for instance, an alkyl group, the number of carbon atoms of the alkyl group is not counted in the number of the ring carbon atoms of the naphthalene ring.

Accordingly, the naphthalene ring substituted by an alkyl group has 10 ring carbon atoms.

Herein, the ring atoms refer to the number of atoms forming a ring of a compound (e.g., a monocyclic compound, fused-ring compound, cross-linking compound, carbon ring compound, and heterocyclic compound) in which the atoms are bonded to each other to form the ring (e.g., monocyclic ring, fused ring, and ring assembly).

Atom(s) not forming the ring (e.g., hydrogen atom(s) for saturating the valence of the atom which forms the ring) and atom(s) in a substituent by which the ring is substituted are not counted as the ring atoms.

Unless otherwise specified, the same applies to the "ring atoms" described later.

For instance, a pyridine ring has 6 ring atoms, a quinazoline ring has 10 ring atoms, and a furan ring has 5 ring atoms.

For instance, the number of hydrogen atom(s) bonded to a pyridine ring or the number of atoms forming a substituent are not counted as the pyridine ring atoms.

Accordingly, a pyridine ring bonded to a hydrogen atom (s) or a substituent(s) has 6 ring atoms.

For instance, the hydrogen atom(s) bonded to carbon atom(s) of a quinazoline ring or the atoms forming a substituent are not counted as the quinazoline ring atoms.

Accordingly, a quinazoline ring bonded to hydrogen atom(s) or a substituent(s) has 10 ring atoms.

Herein, "XX to YY carbon atoms" in the description of "substituted or unsubstituted ZZ group having XX to YY carbon atoms" represent carbon atoms of an unsubstituted ZZ group and do not include carbon atoms of a substituent(s) of the substituted ZZ group.

Herein, "YY" is larger than "XX," "XX" representing an integer of 1 or more and "YY" representing an integer of 2 or more.

Herein, "XX to YY atoms" in the description of "substituted or unsubstituted ZZ group having XX to YY atoms" represent atoms of an unsubstituted ZZ group and does not include atoms of a substituent(s) of the substituted ZZ group.

Herein, "YY" is larger than "XX," "XX" representing an integer of 1 or more and "YY" representing an integer of 2 or more.

Herein, an unsubstituted ZZ group refers to an "unsubstituted ZZ group" in a "substituted or unsubstituted ZZ group," and a substituted ZZ group refers to a "substituted ZZ group" in a "substituted or unsubstituted ZZ group."

Herein, the term "unsubstituted" used in a "substituted or unsubstituted ZZ group" means that a hydrogen atom(s) in the ZZ group is not substituted with a substituent(s).

The hydrogen atom(s) in the "unsubstituted ZZ group" is protium, deuterium, or tritium.

Herein, the term "substituted" used in a "substituted or unsubstituted ZZ group" means that at least one hydrogen atom in the ZZ group is substituted with a substituent.

Similarly, the term "substituted" used in a "BB group substituted by AA group" means that at least one hydrogen atom in the BB group is substituted with the AA group.

Substituent Mentioned Herein

Substituent mentioned herein will be described below.

An "unsubstituted aryl group" mentioned herein has, unless otherwise specified herein, 6 to 50, preferably 6 to 30, more preferably 6 to 18 ring carbon atoms.

An "unsubstituted heterocyclic group" mentioned herein has, unless otherwise specified herein, 5 to 50, preferably 5 to 30, more preferably 5 to 18 ring atoms.

An "unsubstituted alkyl group" mentioned herein has, unless otherwise specified herein, 1 to 50, preferably 1 to 20, more preferably 1 to 6 carbon atoms.

An "unsubstituted alkenyl group" mentioned herein has, unless otherwise specified herein, 2 to 50, preferably 2 to 20, more preferably 2 to 6 carbon atoms.

An "unsubstituted alkynyl group" mentioned herein has, unless otherwise specified herein, 2 to 50, preferably 2 to 20, more preferably 2 to 6 carbon atoms.

An "unsubstituted cycloalkyl group" mentioned herein has, unless otherwise specified herein, 3 to 50, preferably 3 to 20, more preferably 3 to 6 ring carbon atoms.

An "unsubstituted arylene group" mentioned herein has, unless otherwise specified herein, 6 to 50, preferably 6 to 30, more preferably 6 to 18 ring carbon atoms.

An "unsubstituted divalent heterocyclic group" mentioned herein has, unless otherwise specified herein, 5 to 50, preferably 5 to 30, more preferably 5 to 18 ring atoms.

An "unsubstituted alkylene group" mentioned herein has, unless otherwise specified herein, 1 to 50, preferably 1 to 20, more preferably 1 to 6 carbon atoms.

Substituted or Unsubstituted Aryl Group

Specific examples (specific example group G1) of the "substituted or unsubstituted aryl group" mentioned herein include unsubstituted aryl groups (specific example group G1A) below and substituted aryl groups (specific example group G1B).

(Herein, an unsubstituted aryl group refers to an "unsubstituted aryl group" in a "substituted or unsubstituted aryl group", and a substituted aryl group refers to a "substituted aryl group" in a "substituted or unsubstituted aryl group.")

A simply termed "aryl group" herein includes both of an "unsubstituted aryl group" and a "substituted aryl group".

The "substituted aryl group" refers to a group derived by substituting at least one hydrogen atom in an "unsubstituted aryl group" with a substituent.

Examples of the "substituted aryl group" include a group derived by substituting at least one hydrogen atom in the "unsubstituted aryl group" in the specific example group G1A below with a substituent, and examples of the substituted aryl group in the specific example group G1B below.

It should be noted that the examples of the "unsubstituted aryl group" and the "substituted aryl group" mentioned herein are merely exemplary, and the "substituted aryl group" mentioned herein includes a group derived by further substituting a hydrogen atom bonded to a carbon atom of a skeleton of a "substituted aryl group" in the specific example group G1B below, and a group derived by further substituting a hydrogen atom of a substituent of the "substituted aryl group" in the specific example group G1B below.

Unsubstituted Aryl Group (Specific Example Group G1A):

a phenyl group,
p-biphenyl group,
m-biphenyl group,
o-biphenyl group,
p-terphenyl-4-yl group,
p-terphenyl-3-yl group,
p-terphenyl-2-yl group,
m-terphenyl-4-yl group,
m-terphenyl-3-yl group,
m-terphenyl-2-yl group,
o-terphenyl-4-yl group,
o-terphenyl-3-yl group,
o-terphenyl-2-yl group,
1-naphthyl group,
2-naphthyl group,
anthryl group,
benzanthryl group,
phenanthryl group,
benzophenanthryl group,
phenalenyl group,
pyrenyl group,
chrysenyl group,
benzochrysenyl group,
triphenylenyl group,
benzotriphenylenyl group,
tetracenyl group,
pentacenyl group,
fluorenyl group,
9,9'-spirobifluorenyl group,
benzofluorenyl group,
dibenzofluorenyl group,
fluoranthenyl group,
benzofluoranthenyl group,
perylenyl group, and
monovalent aryl group derived by removing one hydrogen atom from cyclic
structures represented by formulae (TEMP-1) to (TEMP-15) below.

[Formula 1]
(TEMP-1)
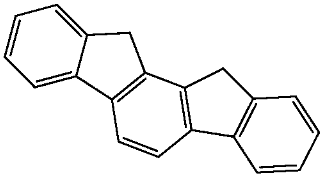
(TEMP-2)
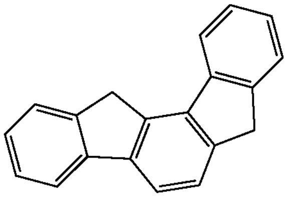
(TEMP-3)
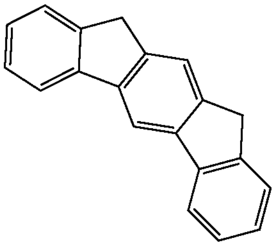
(TEMP-4)
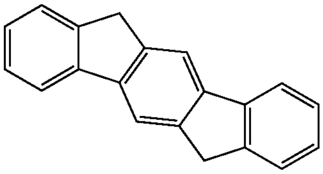
(TEMP-5)
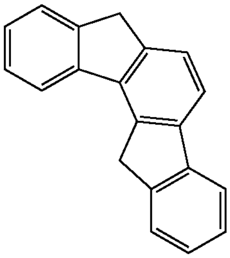
(TEMP-6)
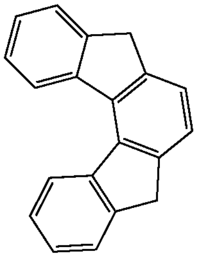
(TEMP-7)
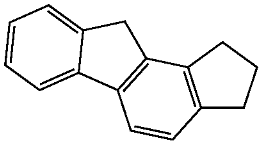
-continued
(TEMP-8)
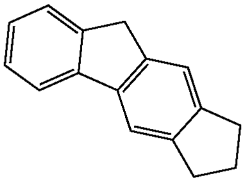
(TEMP-9)
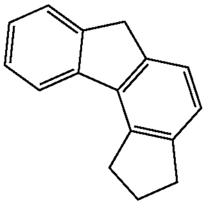
[Formula 2]
(TEMP-10)
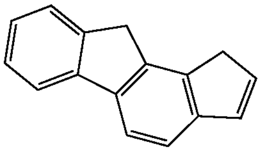
(TEMP-11)
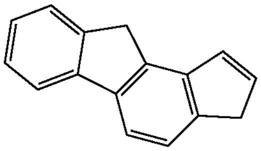
(TEMP-12)
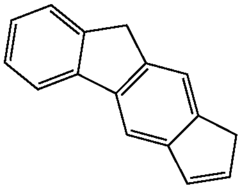
(TEMP-13)
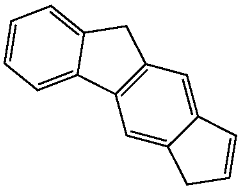
(TEMP-14)
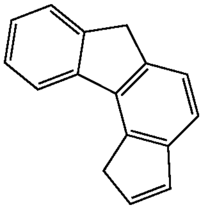
(TEMP-15)
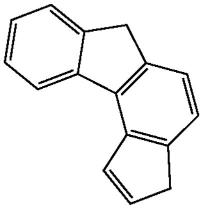

Substituted Aryl Group (Specific Example Group G1B):
o-tolyl group,
m-tolyl group,
p-tolyl group,
para-xylyl group,
meta-xylyl group,
ortho-xylyl group,
para-isopropylphenyl group,
meta-isopropylphenyl group,
ortho-isopropylphenyl group,
para-t-butylphenyl group,
meta-t-butylphenyl group,
ortho-t-butylphenyl group,
3,4,5-trimethylphenyl group,
9,9-dimethylfluorenyl group,
9,9-diphenylfluorenyl group,
9,9-bis(4-methylphenyl)fluorenyl group,
9,9-bis(4-isopropylphenyl)fluorenyl group,
9,9-bis(4-t-butylphenyl)fluorenyl group,
cyanophenyl group,
triphenylsilylphenyl group,
trimethylsilylphenyl group,
phenylnaphthyl group,
naphthylphenyl group, and
group derived by substituting at least one hydrogen atom of a monovalent group derived from one of the cyclic structures represented by the formulae (TEMP-1) to (TEMP-15) with a substituent.

Substituted or Unsubstituted Heterocyclic Group

The "heterocyclic group" mentioned herein refers to a cyclic group having at least one hetero atom in the ring atoms.

Specific examples of the hetero atom include a nitrogen atom, oxygen atom, sulfur atom, silicon atom, phosphorus atom, and boron atom.

The "heterocyclic group" mentioned herein is a monocyclic group or a fused-ring group.

The "heterocyclic group" mentioned herein is an aromatic heterocyclic group or a non-aromatic heterocyclic group.

Specific examples (specific example group G2) of the "substituted or unsubstituted heterocyclic group" mentioned herein include unsubstituted heterocyclic groups (specific example group G2A) and substituted heterocyclic groups (specific example group G2B).

(Herein, an unsubstituted heterocyclic group refers to an "unsubstituted heterocyclic group" in a "substituted or unsubstituted heterocyclic group," and a substituted heterocyclic group refers to a "substituted heterocyclic group" in a "substituted or unsubstituted heterocyclic group.")

A simply termed "heterocyclic group" herein includes both of an "unsubstituted heterocyclic group" and a "substituted heterocyclic group."

The "substituted heterocyclic group" refers to a group derived by substituting at least one hydrogen atom in an "unsubstituted heterocyclic group" with a substituent.

Specific examples of the "substituted heterocyclic group" include a group derived by substituting at least one hydrogen atom in the "unsubstituted heterocyclic group" in the specific example group G2A below with a substituent, and examples of the substituted heterocyclic group in the specific example group G2B below.

It should be noted that the examples of the "unsubstituted heterocyclic group" and the "substituted heterocyclic group" mentioned herein are merely exemplary, and the "substituted heterocyclic group" mentioned herein includes a group derived by further substituting a hydrogen atom bonded to a ring atom of a skeleton of a "substituted heterocyclic group" in the specific example group G2B below, and a group derived by further substituting a hydrogen atom of a substituent of the "substituted heterocyclic group" in the specific example group G2B below.

The specific example group G2A includes, for instance, unsubstituted heterocyclic groups including a nitrogen atom (specific example group G2A1) below, unsubstituted heterocyclic groups including an oxygen atom (specific example group G2A2) below, unsubstituted heterocyclic groups including a sulfur atom (specific example group G2A3) below, and monovalent heterocyclic groups (specific example group G2A4) derived by removing a hydrogen atom from cyclic structures represented by formulae (TEMP-16) to (TEMP-33) below.

The specific example group G2B includes, for instance, substituted heterocyclic groups including a nitrogen atom (specific example group G2B1) below, substituted heterocyclic groups including an oxygen atom (specific example group G2B2) below, substituted heterocyclic groups including a sulfur atom (specific example group G2B3) below, and groups derived by substituting at least one hydrogen atom of the monovalent heterocyclic groups (specific example group G2B4) derived from the cyclic structures represented by formulae (TEMP-16) to (TEMP-33) below.

Unsubstituted Heterocyclic Groups Including Nitrogen Atom (Specific Example Group G2A1):
a pyrrolyl group,
imidazolyl group,
pyrazolyl group,
triazolyl group,
tetrazolyl group,
oxazolyl group,
isoxazolyl group,
oxadiazolyl group,
thiazolyl group,
isothiazolyl group,
thiadiazolyl group,
pyridyl group,
pyridazynyl group,
pyrimidinyl group,
pyrazinyl group,
triazinyl group,
indolyl group,
isoindolyl group,
indolizinyl group,
quinolizinyl group,
quinolyl group,
isoquinolyl group,
cinnolyl group,
phthalazinyl group,
quinazolinyl group,
quinoxalinyl group,
benzimidazolyl group,
indazolyl group,
phenanthrolinyl group,
phenanthridinyl group,
acridinyl group,
phenazinyl group,
carbazolyl group,
benzocarbazolyl group,
morpholino group,
phenoxazinyl group,
phenothiazinyl group,
azacarbazolyl group, and diazacarbazolyl group.

Unsubstituted Heterocyclic Groups Including Oxygen Atom (Specific Example Group G2A2):

a furyl group,
oxazolyl group,
isoxazolyl group,
oxadiazolyl group,
xanthenyl group,
benzofuranyl group,
isobenzofuranyl group,
dibenzofuranyl group,
naphthobenzofuranyl group,
benzoxazolyl group,
benzisoxazolyl group,
phenoxazinyl group,
morpholino group,
dinaphthofuranyl group,
azadibenzofuranyl group,
diazadibenzofuranyl group,
azanaphthobenzofuranyl group, and
diazanaphthobenzofuranyl group.

Unsubstituted Heterocyclic Groups Including Sulfur Atom (Specific Example Group G2A3):

a thienyl group,
thiazolyl group,
isothiazolyl group,
thiadiazolyl group,
benzothiophenyl group (benzothienyl group),
isobenzothiophenyl group (isobenzothienyl group),
dibenzothiophenyl group (dibenzothienyl group),
naphthobenzothiophenyl group (nahthobenzothienyl group),
benzothiazolyl group,
benzisothiazolyl group,
phenothiazinyl group,
dinaphthothiophenyl group (dinaphthothienyl group),
azadibenzothiophenyl group (azadibenzothienyl group),
diazadibenzothiophenyl group (diazadibenzothienyl group),
azanaphthobenzothiophenyl group (azanaphthobenzothienyl group), and
diazanaphthobenzothiophenyl group (diazanaphthobenzothienyl group).

Monovalent Heterocyclic Groups Derived by Removing One Hydrogen Atom from Cyclic Structures Represented by Formulae (TEMP-16) to (TEMP-33) (Specific Example Group G2A4):

[Formula 3]

(TEMP-16)

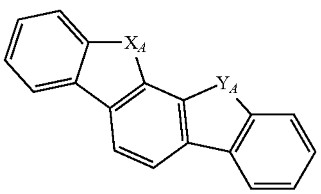

(TEMP-17)

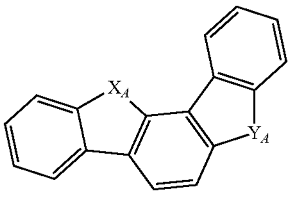

-continued (TEMP-18)

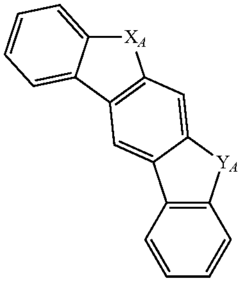

(TEMP-19)

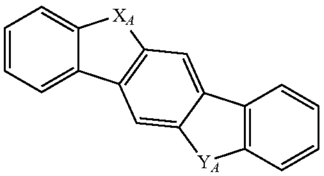

(TEMP-20)

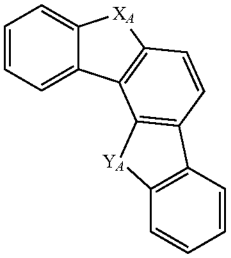

(TEMP-21)

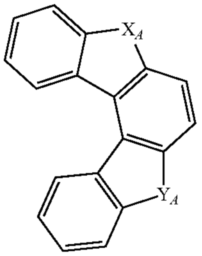

(TEMP-22)

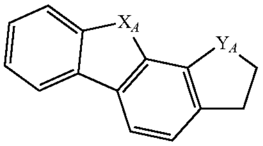

(TEMP-23)

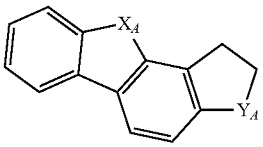

(TEMP-24)

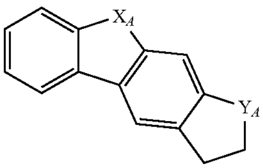

-continued

[Formula 4]

(TEMP-25)

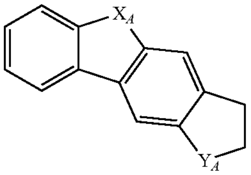

(TEMP-26)

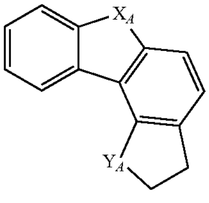

(TEMP-27)

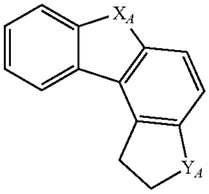

(TEMP-28)

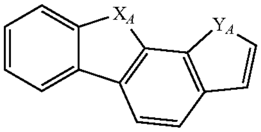

(TEMP-29)

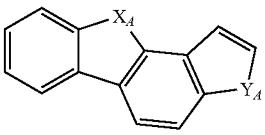

(TEMP-30)

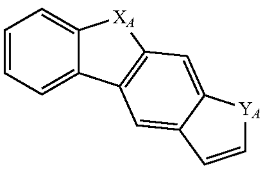

(TEMP-31)

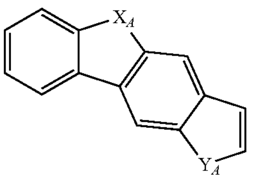

(TEMP-32)

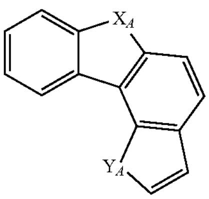

-continued (TEMP-33)

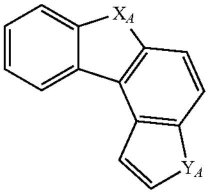

In the formulae (TEMP-16) to (TEMP-33), $X_A$ and $Y_A$ are each independently an oxygen atom, a sulfur atom, NH or $CH_2$, with a proviso that at least one of $X_A$ or $Y_A$ is an oxygen atom, a sulfur atom, or NH.

When at least one of $X_A$ or $Y_A$ in the formulae (TEMP-16) to (TEMP-33) is NH or $CH_2$, the monovalent heterocyclic groups derived from the cyclic structures represented by the formulae (TEMP-16) to (TEMP-33) include a monovalent group derived by removing one hydrogen atom from NH or $CH_2$.

Substituted Heterocyclic Groups Including Nitrogen Atom (Specific Example Group G2B1):

(9-phenyl)carbazolyl group,
(9-biphenylyl)carbazolyl group,
(9-phenyl)phenylcarbazolyl group,
(9-naphthyl)carbazolyl group,
diphenylcarbazole-9-yl group,
phenylcarbazole-9-yl group,
methylbenzimidazolyl group,
ethylbenzimidazolyl group,
phenyltriazinyl group,
biphenylyltriazinyl group,
diphenyltriazinyl group,
phenylquinazolinyl group, and biphenylquinazolinyl group.

Substituted Heterocyclic Groups Including Oxygen Atom (Specific Example Group G2B2):

phenyldibenzofuranyl group,
methyldibenzofuranyl group,
t-butyldibenzofuranyl group, and
monovalent residue of spiro[9H-xanthene-9,9'-[9H]fluorene].

Substituted Heterocyclic Groups Including Sulfur Atom (Specific Example Group G2B3):

a phenyldibenzothiophenyl group,
methyldibenzothiophenyl group,
t-butyldibenzothiophenyl group, and
monovalent residue of spiro[9H-thioxanthene-9,9'-[9H] fluorene].

Groups Obtained by Substituting at Least One Hydrogen Atom of Monovalent Heterocyclic Group Derived from Cyclic Structures Represented by Formulae (TEMP-16) to (TEMP-33) with Substituent (Specific Example Group G2B4):

The "at least one hydrogen atom of the monovalent heterocyclic groups" means at least one hydrogen atom selected from hydrogen atoms bonded to ring carbon atoms in the monovalent heterocyclic groups, a hydrogen atom bonded to a nitrogen atom when at least one of $X_A$ or $Y_A$ is NH, and hydrogen atoms in a methylene group when one of $X_A$ and $Y_A$ is $CH_2$.

Substituted or Unsubstituted Alkyl Group

Specific examples (specific example group G3) of the "substituted or unsubstituted alkyl group" mentioned herein include unsubstituted alkyl groups (specific example group G3A) and substituted alkyl groups (specific example group G3B) below.

(Herein, an unsubstituted alkyl group refers to an "unsubstituted alkyl group" in a "substituted or unsubstituted alkyl group," and a substituted alkyl group refers to a "substituted alkyl group" in a "substituted or unsubstituted alkyl group.")

A simply termed "alkyl group" herein includes both of an "unsubstituted alkyl group" and a "substituted alkyl group".

The "substituted alkyl group" refers to a group derived by substituting at least one hydrogen atom in an "unsubstituted alkyl group" with a substituent.

Specific examples of the "substituted alkyl group" include a group derived by substituting at least one hydrogen atom of an "unsubstituted alkyl group" (specific example group G3A) below with a substituent, and examples of the substituted alkyl group (specific example group G3B) below.

Herein, the alkyl group for the "unsubstituted alkyl group" refers to a chain alkyl group.

Accordingly, the "unsubstituted alkyl group" include linear "unsubstituted alkyl group" and branched "unsubstituted alkyl group."

It should be noted that the examples of the "unsubstituted alkyl group" and the "substituted alkyl group" mentioned herein are merely exemplary, and the "substituted alkyl group" mentioned herein includes a group derived by further substituting a hydrogen atom of a skeleton of the "substituted alkyl group" in the specific example group G3B, and a group derived by further substituting a hydrogen atom of a substituent of the "substituted alkyl group" in the specific example group G3B.

Unsubstituted Alkyl Group (Specific Example Group G3A):

a methyl group,
ethyl group,
n-propyl group,
isopropyl group,
n-butyl group,
isobutyl group,
s-butyl group, and t-butyl group.

Substituted Alkyl Group (Specific Example Group G3B):

a heptafluoropropyl group (including isomer thereof),
pentafluoroethyl group,
2,2,2-trifluoroethyl group, and
trifluoromethyl group.

Substituted or Unsubstituted Alkenyl Group

Specific examples (specific example group G4) of the "substituted or unsubstituted alkenyl group" mentioned herein include unsubstituted alkenyl groups (specific example group G4A) and substituted alkenyl groups (specific example group G4B).

(Herein, an unsubstituted alkenyl group refers to an "unsubstituted alkenyl group" in a "substituted or unsubstituted alkenyl group," and a substituted alkenyl group refers to a "substituted alkenyl group" in a "substituted or unsubstituted alkenyl group.")

A simply termed "alkenyl group" herein includes both of an "unsubstituted alkenyl group" and a "substituted alkenyl group".

The "substituted alkenyl group" refers to a group derived by substituting at least one hydrogen atom in an "unsubstituted alkenyl group" with a substituent.

Specific examples of the "substituted alkenyl group" include an "unsubstituted alkenyl group" (specific example group G4A) substituted by a substituent, and examples of the substituted alkenyl group (specific example group G4B) below.

It should be noted that the examples of the "unsubstituted alkenyl group" and the "substituted alkenyl group" mentioned herein are merely exemplary, and the "substituted alkenyl group" mentioned herein includes a group derived by further substituting a hydrogen atom of a skeleton of the "substituted alkenyl group" in the specific example group G4B with a substituent, and a group derived by further substituting a hydrogen atom of a substituent of the "substituted alkenyl group" in the specific example group G4B with a substituent.

Unsubstituted Alkenyl Group (Specific Example Group G4A):

a vinyl group,
allyl group,
1-butenyl group,
2-butenyl group, and
3-butenyl group.

Substituted Alkenyl Group (Specific Example Group G4B):

a 1,3-butanedienyl group,
1-methylvinyl group,
1-methylallyl group,
1,1-dimethylallyl group,
2-methylallyl group, and
1,2-dimethylallyl group.

Substituted or Unsubstituted Alkynyl Group

Specific examples (specific example group G5) of the "substituted or unsubstituted alkynyl group" mentioned herein include unsubstituted alkynyl groups (specific example group G5A) below.

(Herein, an unsubstituted alkynyl group refers to an "unsubstituted alkynyl group" in a "substituted or unsubstituted alkynyl group.")

A simply termed "alkynyl group" herein includes both of "unsubstituted alkynyl group" and "substituted alkynyl group".

The "substituted alkynyl group" refers to a group derived by substituting at least one hydrogen atom in an "unsubstituted alkynyl group" with a substituent.

Specific examples of the "substituted alkynyl group" include a group derived by substituting at least one hydrogen atom of the "unsubstituted alkynyl group" (specific example group G5A) below with a substituent.

Unsubstituted Alkynyl Group (Specific Example Group G5A):

an ethynyl group.

Substituted or Unsubstituted Cycloalkyl Group

Specific examples (specific example group G6) of the "substituted or unsubstituted cycloalkyl group" mentioned herein include unsubstituted cycloalkyl groups (specific example group G6A) and substituted cycloalkyl groups (specific example group G6B).

(Herein, an unsubstituted cycloalkyl group refers to an "unsubstituted cycloalkyl group" in a "substituted or unsubstituted cycloalkyl group," and a substituted cycloalkyl group refers to a "substituted cycloalkyl group" in a "substituted or unsubstituted cycloalkyl group.")

A simply termed "cycloalkyl group" herein includes both of "unsubstituted cycloalkyl group" and "substituted cycloalkyl group".

The "substituted cycloalkyl group" refers to a group derived by substituting at least one hydrogen atom of an "unsubstituted cycloalkyl group" with a substituent.

Specific examples of the "substituted cycloalkyl group" include a group derived by substituting at least one hydrogen atom of the "unsubstituted cycloalkyl group" (specific example group G6A) below with a substituent, and examples of the substituted cycloalkyl group (specific example group G6B) below.

It should be noted that the examples of the "unsubstituted cycloalkyl group" and the "substituted cycloalkyl group" mentioned herein are merely exemplary, and the "substituted cycloalkyl group" mentioned herein includes a group derived by substituting at least one hydrogen atom bonded to a carbon atom of a skeleton of the "substituted cycloalkyl group" in the specific example group G6B with a substituent, and a group derived by further substituting a hydrogen atom of a substituent of the "substituted cycloalkyl group" in the specific example group G6B with a substituent.

Unsubstituted Cycloalkyl Group (Specific Example Group G6A):

a cyclopropyl group,
cyclobutyl group,
cyclopentyl group,
cyclohexyl group,
1-adamantyl group,
2-adamantyl group,
1-norbornyl group, and
2-norbornyl group.

Substituted Cycloalkyl Group (Specific Example Group G6B):

a 4-methylcyclohexyl group.

Group Represented by —Si($R_{901}$)($R_{902}$)($R_{903}$)

Specific examples (specific example group G7) of the group represented herein by —Si($R_{901}$)($R_{902}$)($R_{903}$) include: —Si(G1)(G1)(G1); —Si(G1)(G2)(G2); —Si(G1)(G1)(G2); —Si(G2)(G2)(G2); —Si(G3)(G3)(G3); and —Si(G6)(G6)(G6);

where:

G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3;

G6 represents a "substituted or unsubstituted cycloalkyl group" in the specific example group G6;

a plurality of G1 in —Si(G1)(G1)(G1) are mutually the same or different; a plurality of G2 in —Si(G1)(G2)(G2) are mutually the same or different;

a plurality of G1 in —Si(G1)(G1)(G2) are mutually the same or different;

a plurality of G2 in —Si(G2)(G2)(G2) are mutually the same or different;

a plurality of G3 in —Si(G3)(G3)(G3) are mutually the same or different; and a plurality of G6 in —Si(G6)(G6)(G6) are mutually the same or different.

Group Represented by —O—($R_{904}$)

Specific examples (specific example group G8) of a group represented by —O—($R_{904}$) herein include: —O(G1); —O(G2); —O(G3); and —O(G6);

where:

G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3; and G6 represents a "substituted or unsubstituted cycloalkyl group" in the specific example group G6.

Group Represented by —S—($R_{905}$)

Specific examples (specific example group G9) of a group represented herein by —S—($R_{905}$) include: —S(G1); —S(G2); —S(G3); and —S(G6);

where:

G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3; and G6 represents a "substituted or unsubstituted cycloalkyl group" in the specific example group G6;

Group Represented by —N($R_{906}$)($R_{907}$)

Specific examples (specific example group G10) of a group represented herein by —N($R_{906}$)($R_{907}$) include: —N(G1)(G1); —N(G2)(G2); —N(G1)(G2); —N(G3)(G3); and —N(G6)(G6), where:

G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3;

G6 represents a "substituted or unsubstituted cycloalkyl group" in the specific example group G6;

a plurality of G1 in —N(G1)(G1) are mutually the same or different;

a plurality of G2 in —N(G2)(G2) are mutually the same or different;

a plurality of G3 in —N(G3)(G3) are mutually the same or different; and a plurality of G6 in —N(G6)(G6) are mutually the same or different.

Halogen Atom

Specific examples (specific example group G11) of "halogen atom" mentioned herein include a fluorine atom, chlorine atom, bromine atom, and iodine atom.

Substituted or Unsubstituted Fluoroalkyl Group

The "substituted or unsubstituted fluoroalkyl group" mentioned herein refers to a group derived by substituting at least one hydrogen atom bonded to at least one of carbon atoms forming an alkyl group in the "substituted or unsubstituted alkyl group" with a fluorine atom, and also includes a group (perfluoro group) derived by substituting all of hydrogen atoms bonded to carbon atoms forming the alkyl group in the "substituted or unsubstituted alkyl group" with fluorine atoms.

An "unsubstituted fluoroalkyl group" has, unless otherwise specified herein, 1 to 50, preferably 1 to 30, more preferably 1 to 18 carbon atoms.

The "substituted fluoroalkyl group" refers to a group derived by substituting at least one hydrogen atom in a "fluoroalkyl group" with a substituent.

It should be noted that the examples of the "substituted fluoroalkyl group" mentioned herein include a group derived by further substituting at least one hydrogen atom bonded to a carbon atom of an alkyl chain of a "substituted fluoroalkyl group" with a substituent, and a group derived by further substituting at least one hydrogen atom of a substituent of the "substituted fluoroalkyl group" with a substituent.

Specific examples of the "substituted fluoroalkyl group" include a group derived by substituting at least one hydrogen atom of the "alkyl group" (specific example group G3) with a fluorine atom.

Substituted or Unsubstituted Haloalkyl Group

The "substituted or unsubstituted haloalkyl group" mentioned herein refers to a group derived by substituting at least one hydrogen atom bonded to carbon atoms forming the alkyl group in the "substituted or unsubstituted alkyl group" with a halogen atom, and also includes a group derived by substituting all hydrogen atoms bonded to carbon atoms forming the alkyl group in the "substituted or unsubstituted alkyl group" with halogen atoms.

An "unsubstituted haloalkyl group" has, unless otherwise specified herein, 1 to 50, preferably 1 to 30, and more preferably 1 to 18 carbon atoms.

The "substituted haloalkyl group" refers to a group derived by substituting at least one hydrogen atom in a "haloalkyl group" with a substituent.

It should be noted that the examples of the "substituted haloalkyl group" mentioned herein include a group derived by further substituting at least one hydrogen atom bonded to a carbon atom of an alkyl chain of a "substituted haloalkyl group" with a substituent, and a group derived by further substituting at least one hydrogen atom of a substituent of the "substituted haloalkyl group" with a substituent.

Specific examples of the "substituted haloalkyl group" include a group derived by substituting at least one hydrogen atom of the "alkyl group" (specific example group G3) with a halogen atom.

The haloalkyl group is sometimes referred to as a halogenated alkyl group.

Substituted or Unsubstituted Alkoxy Group

Specific examples of a "substituted or unsubstituted alkoxy group" mentioned herein include a group represented by —O(G3), G3 being the "substituted or unsubstituted alkyl group" in the specific example group G3.

An "unsubstituted alkoxy group" has, unless otherwise specified herein, 1 to 50, preferably 1 to 30, more preferably 1 to 18 carbon atoms.

Substituted or Unsubstituted Alkylthio Group

Specific examples of a "substituted or unsubstituted alkylthio group" mentioned herein include a group represented by —S(G3), G3 being the "substituted or unsubstituted alkyl group" in the specific example group G3.

An "unsubstituted alkylthio group" has, unless otherwise specified herein, 1 to 50, preferably 1 to 30, more preferably 1 to 18 carbon atoms.

Substituted or Unsubstituted Aryloxy Group

Specific examples of a "substituted or unsubstituted aryloxy group" mentioned herein include a group represented by —O(G1), G1 being the "substituted or unsubstituted aryl group" in the specific example group G1.

An "unsubstituted aryloxy group" has, unless otherwise specified herein, 6 to 50, preferably 6 to 30, more preferably 6 to 18 ring carbon atoms.

Substituted or Unsubstituted Arylthio Group

Specific examples of a "substituted or unsubstituted arylthio group" mentioned herein include a group represented by —S(G1), G1 being the "substituted or unsubstituted aryl group" in the specific example group G1.

An "unsubstituted arylthio group" has, unless otherwise specified herein, 6 to 50, preferably 6 to 30, more preferably 6 to 18 ring carbon atoms.

Substituted or Unsubstituted Trialkylsilyl Group

Specific examples of a "trialkylsilyl group" mentioned herein include a group represented by —Si(G3)(G3)(G3), G3 being the "substituted or unsubstituted alkyl group" in the specific example group G3.

The plurality of G3 in —Si(G3)(G3)(G3) are mutually the same or different.

Each of the alkyl groups in the "trialkylsilyl group" has, unless otherwise specified herein, 1 to 50, preferably 1 to 20, more preferably 1 to 6 carbon atoms.

Substituted or Unsubstituted Aralkyl Group

Specific examples of a "substituted or unsubstituted aralkyl group" mentioned herein include a group represented by -(G3)-(G1), G3 being the "substituted or unsubstituted alkyl group" in the specific example group G3, G1 being the "substituted or unsubstituted aryl group" in the specific example group G1.

Accordingly, the "aralkyl group" is a group derived by substituting a hydrogen atom of the "alkyl group" with a substituent in a form of the "aryl group," which is an example of the "substituted alkyl group."

An "unsubstituted aralkyl group," which is an "unsubstituted alkyl group" substituted by an "unsubstituted aryl group," has, unless otherwise specified herein, 7 to 50 carbon atoms, preferably 7 to 30 carbon atoms, more preferably 7 to 18 carbon atoms.

Specific examples of the "substituted or unsubstituted aralkyl group" include a benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, and 2-β-naphthylisopropyl group.

Preferable examples of the substituted or unsubstituted aryl group mentioned herein include, unless otherwise specified herein, a phenyl group, p-biphenyl group, m-biphenyl group, o-biphenyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-terphenyl-4-yl group, o-terphenyl-3-yl group, o-terphenyl-2-yl group, 1-naphthyl group, 2-naphthyl group, anthryl group, phenanthryl group, pyrenyl group, chrysenyl group, triphenylenyl group, fluorenyl group, 9,9'-spirobifluorenyl group, 9,9-dimethylfluorenyl group, and 9,9-diphenylfluorenyl group.

Preferable examples of the substituted or unsubstituted heterocyclic group mentioned herein include, unless otherwise specified herein, a pyridyl group, pyrimidinyl group, triazinyl group, quinolyl group, isoquinolyl group, quinazolinyl group, benzimidazolyl group, phenanthrolinyl group, carbazolyl group (1-carbazolyl group, 2-carbazolyl group, 3-carbazolyl group, 4-carbazolyl group, or 9-carbazolyl group), benzocarbazolyl group, azacarbazolyl group, diazacarbazolyl group, dibenzofuranyl group, naphthobenzofuranyl group, azadibenzofuranyl group, diazadibenzofuranyl group, dibenzothiophenyl group, naphthobenzothiophenyl group, azadibenzothiophenyl group, diazadibenzothiophenyl group, (9-phenyl)carbazolyl group ((9-phenyl)carbazole-1-yl group, (9-phenyl)carbazole-2-yl group, (9-phenyl)carbazole-3-yl group, or (9-phenyl)carbazole-4-yl group), (9-biphenylyl)carbazolyl group, (9-phenyl)phenylcarbazolyl group, diphenylcarbazole-9-yl group, phenylcarbazole-9-yl group, phenyltriazinyl group, biphenylyltriazinyl group, diphenyltriazinyl group, phenyldibenzofuranyl group, and phenyldibenzothiophenyl group.

The carbazolyl group mentioned herein is, unless otherwise specified herein, specifically a group represented by one of formulae below.

[Formula 5]

(TEMP-Cz1)

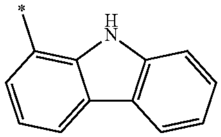

(TEMP-Cz2)

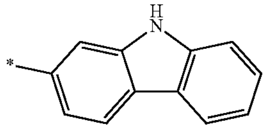

(TEMP-Cz3)

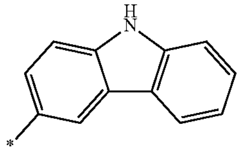

(TEMP-Cz4)

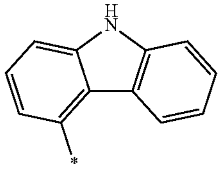

(TEMP-Cz5)

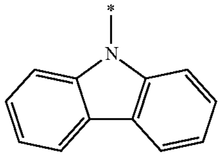

The (9-phenyl)carbazolyl group mentioned herein is, unless otherwise specified herein, specifically a group represented by one of formulae below.

[Formula 6]

(TEMP-Cz6)

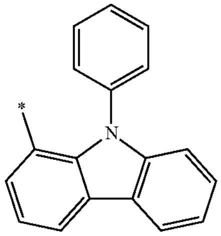

(TEMP-Cz7)

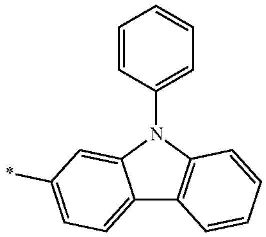

-continued (TEMP-Cz8)

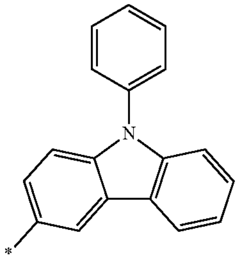

(TEMP-Cz9)

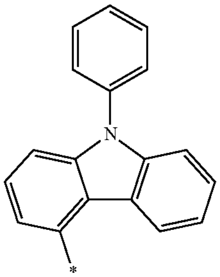

In the formulae (TEMP-Cz1) to (TEMP-Cz9), * represents a bonding position.

The dibenzofuranyl group and dibenzothiophenyl group mentioned herein are, unless otherwise specified herein, each specifically represented by one of formulae below.

[Formula 7]

(TEMP-34)

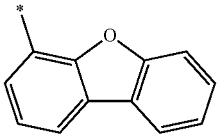

(TEMP-35)

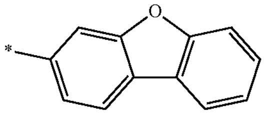

(TEMP-36)

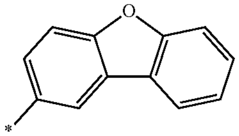

(TEMP-37)

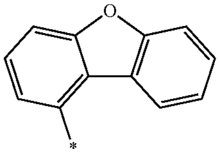

(TEMP-38)

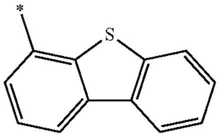

-continued (TEMP-39)

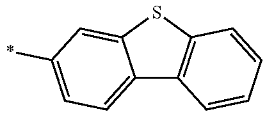

(TEMP-40)

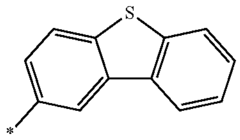

(TEMP-41)

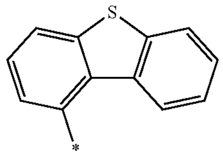

In the formulae (TEMP-34) to (TEMP-41), * represents a bonding position.

Preferable examples of the substituted or unsubstituted alkyl group mentioned herein include, unless otherwise specified herein, a methyl group, ethyl group, propyl group, isopropyl group, n-butyl group, isobutyl group, and t-butyl group.

Substituted or Unsubstituted Arylene Group

The "substituted or unsubstituted arylene group" mentioned herein is, unless otherwise specified herein, a divalent group derived by removing one hydrogen atom on an aryl ring of the "substituted or unsubstituted aryl group."

Specific examples of the "substituted or unsubstituted arylene group" (specific example group G12) include a divalent group derived by removing one hydrogen atom on an aryl ring of the "substituted or unsubstituted aryl group" in the specific example group G1.

Substituted or Unsubstituted Divalent Heterocyclic Group

The "substituted or unsubstituted divalent heterocyclic group" mentioned herein is, unless otherwise specified herein, a divalent group derived by removing one hydrogen atom on a heterocycle of the "substituted or unsubstituted heterocyclic group."

Specific examples of the "substituted or unsubstituted divalent heterocyclic group" (specific example group G13) include a divalent group derived by removing one hydrogen atom on a heterocyclic ring of the "substituted or unsubstituted heterocyclic group" in the specific example group G2.

Substituted or Unsubstituted Alkylene Group

The "substituted or unsubstituted alkylene group" mentioned herein is, unless otherwise specified herein, a divalent group derived by removing one hydrogen atom on an alkyl chain of the "substituted or unsubstituted alkyl group."

Specific examples of the "substituted or unsubstituted alkylene group" (specific example group G14) include a divalent group derived by removing one hydrogen atom on an alkyl chain of the "substituted or unsubstituted alkyl group" in the specific example group G3.

The substituted or unsubstituted arylene group mentioned herein is, unless otherwise specified herein, preferably any one of groups represented by formulae (TEMP-42) to (TEMP-68) below.

[Formula 8]

(TEMP-42)

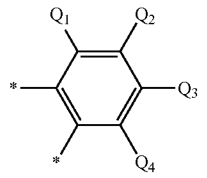

(TEMP-43)

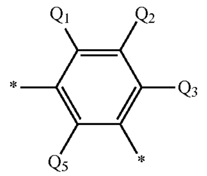

(TEMP-44)

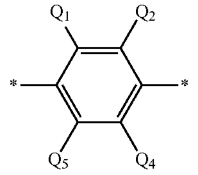

(TEMP-45)

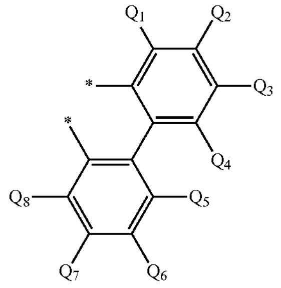

(TEMP-46)

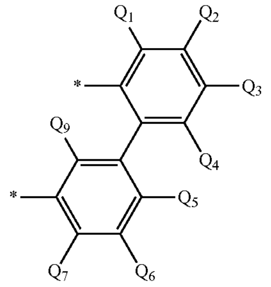

(TEMP-47)

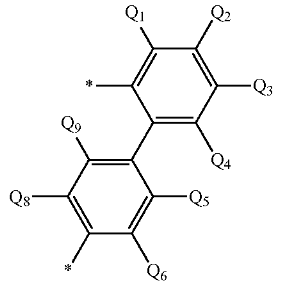

-continued
[Formula 9]
(TEMP-48)
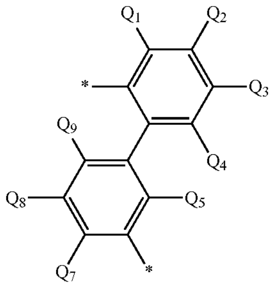
(TEMP-49)
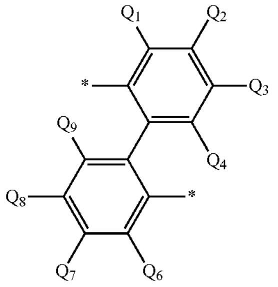
(TEMP-49)
(TEMP-50)
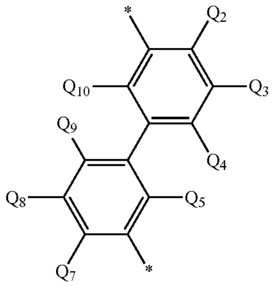
(TEMP-50)
(TEMP-51)
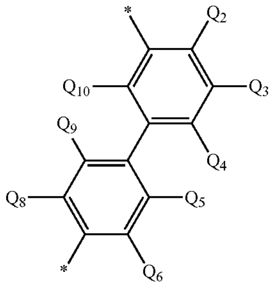
(TEMP-51)
(TEMP-52)
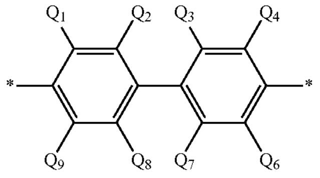
(TEMP-52)
In the formulae (TEMP-42) to (TEMP-52), $Q_1$ to $Q_{10}$ are each independently a hydrogen atom or a substituent.
In the formulae (TEMP-42) to (TEMP-52), * represents a bonding position.
[Formula 10]
(TEMP-53)
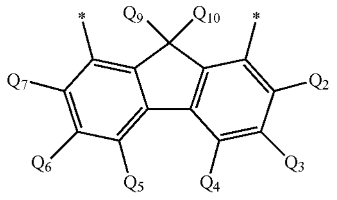
(TEMP-54)
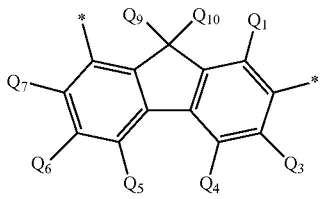
(TEMP-55)
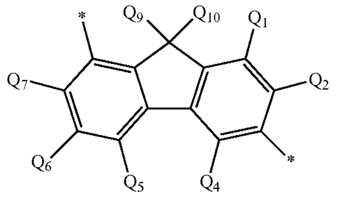
(TEMP-56)
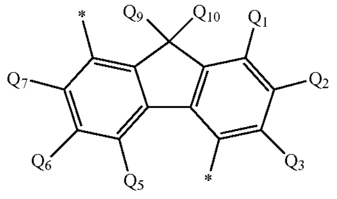
(TEMP-57)
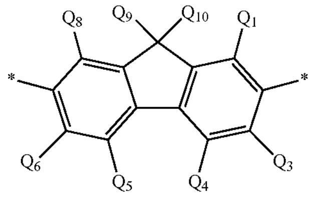
(TEMP-58)
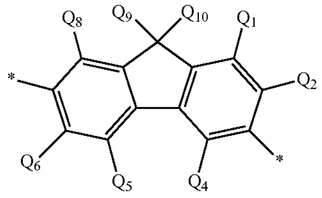
(TEMP-59)
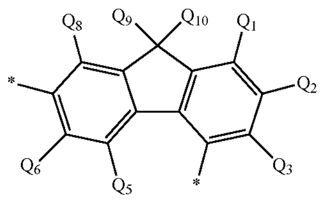

-continued (TEMP-60)

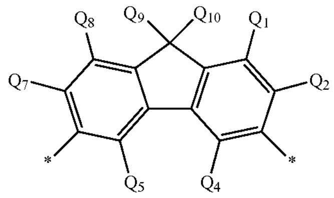

(TEMP-61)

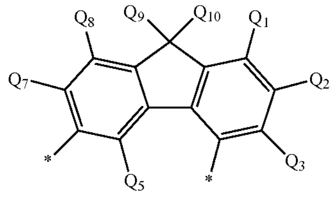

(TEMP-62)

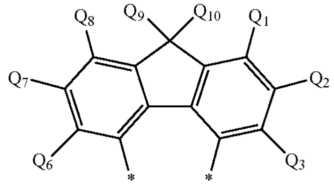

In the formulae (TEMP-53) to (TEMP-62), $Q_1$ to $Q_{10}$ are each independently a hydrogen atom or a substituent.

In the formulae, $Q_9$ and $Q_{10}$ may be mutually bonded through a single bond to form a ring.

In the formulae (TEMP-53) to (TEMP-62), * represents a bonding position.

[Formula 11]

(TEMP-63)

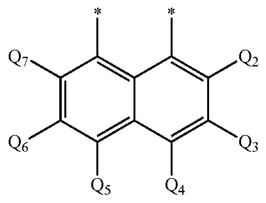

(TEMP-64)

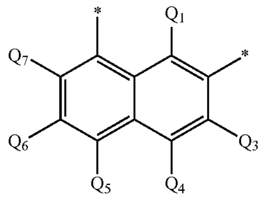

(TEMP-65)

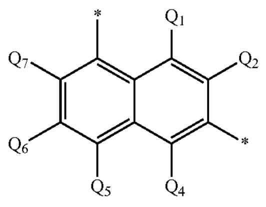

-continued (TEMP-66)

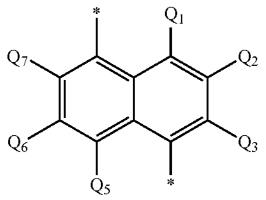

(TEMP-67)

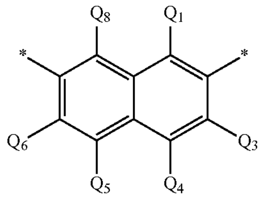

(TEMP-68)

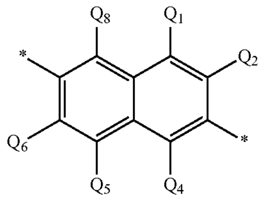

In the formulae (TEMP-63) to (TEMP-68), $Q_1$ to $Q_8$ are each independently a hydrogen atom or a substituent.

In the formulae (TEMP-63) to (TEMP-68), * represents a bonding position.

The substituted or unsubstituted divalent heterocyclic group mentioned herein is, unless otherwise specified herein, preferably a group represented by any one of formulae (TEMP-69) to (TEMP-102) below.

[Formula 12]

(TEMP-69)

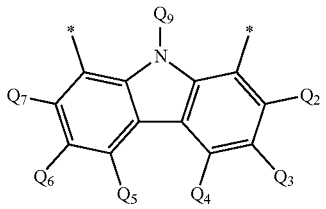

(TEMP-70)

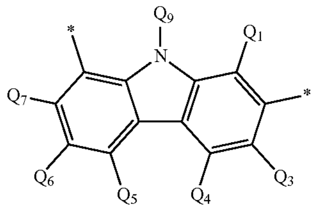

(TEMP-71)

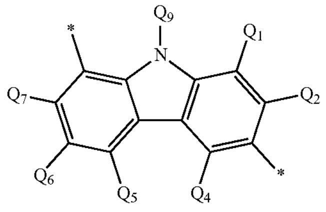

-continued
(TEMP-72)
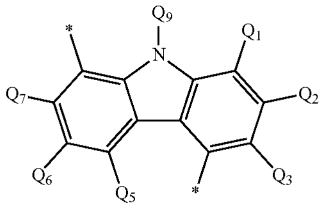
(TEMP-73)
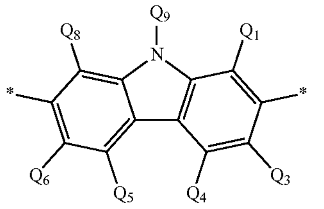
(TEMP-74)
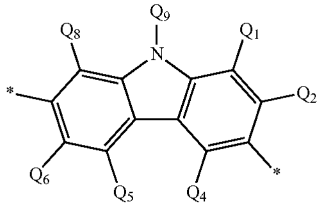
[Formula 13]
(TEMP-75)
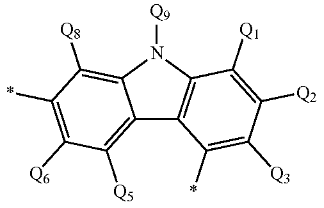
(TEMP-76)
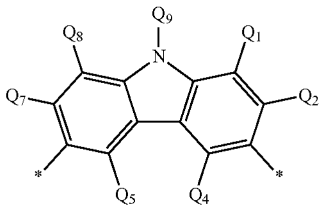
(TEMP-77)
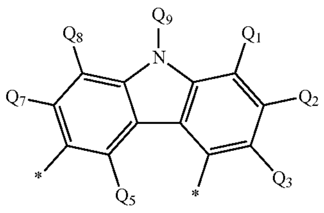
(TEMP-78)
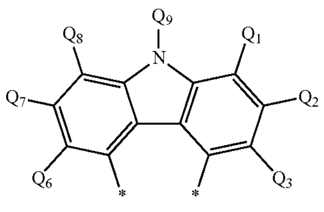
-continued
(TEMP-79)
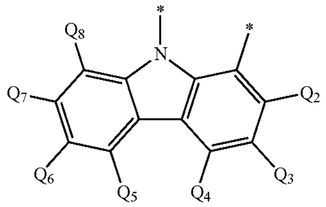
(TEMP-80)
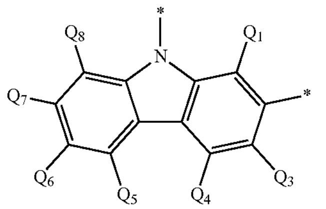
[Formula 14]
(TEMP-81)
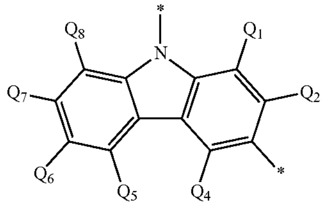
(TEMP-82)
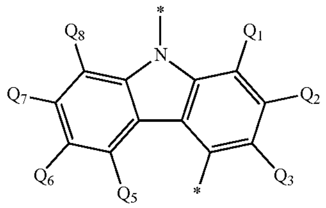
In the formulae (TEMP-69) to (TEMP-82), $Q_1$ to $Q_9$ are each independently a hydrogen atom or a substituent.
[Formula 15]
(TEMP-83)
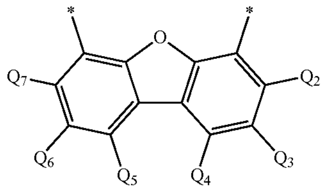
(TEMP-84)
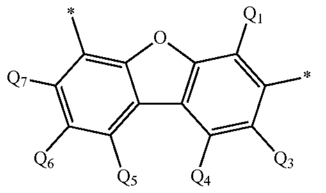

-continued
(TEMP-85)
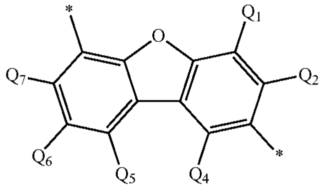
(TEMP-86)
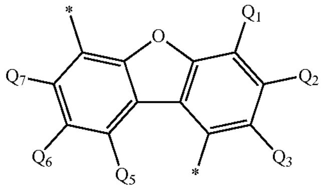
(TEMP-87)
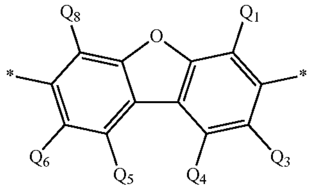
(TEMP-88)
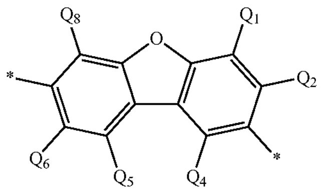
[Formula 16]
(TEMP-89)
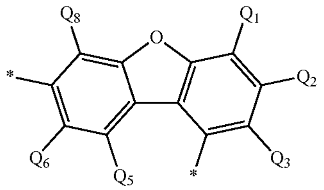
(TEMP-90)
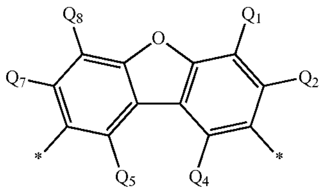
(TEMP-91)
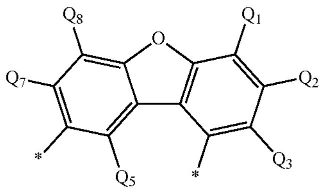
(TEMP-92)
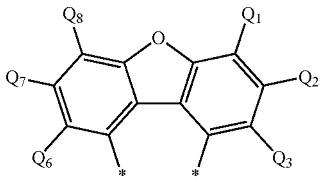
-continued
[Formula 17]
(TEMP-93)
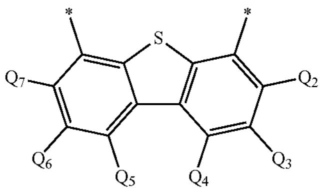
(TEMP-94)
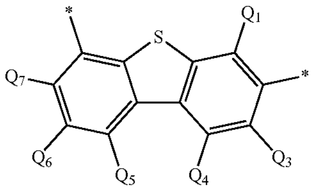
(TEMP-95)
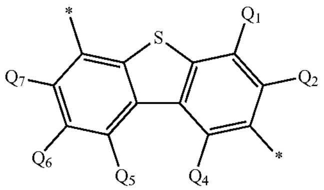
(TEMP-96)
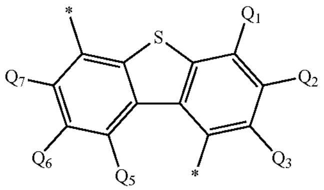
(TEMP-97)
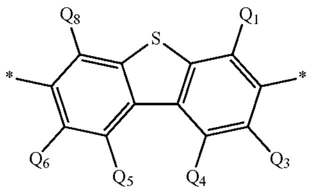
(TEMP-98)
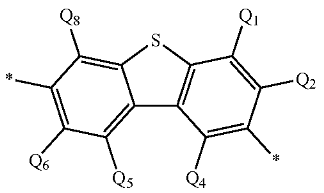
[Formula 18]
(TEMP-99)
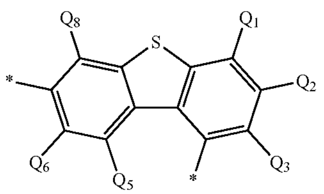

-continued (TEMP-100)

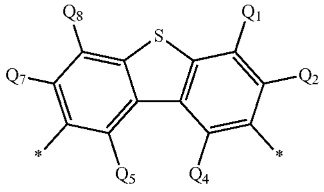

(TEMP-101)

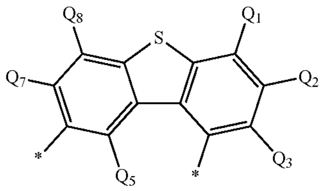

(TEMP-102)

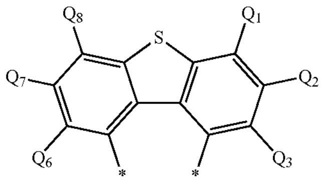

In the formulae (TEMP-83) to (TEMP-102), $Q_1$ to $Q_8$ are each independently a hydrogen atom or a substituent.

The substituent mentioned herein has been described above.

Instance of "Bonded to Form Ring"

Instances where "at least one combination of adjacent two or more (of . . . ) are mutually bonded to form a substituted or unsubstituted monocyclic ring, mutually bonded to form a substituted or unsubstituted fused ring, or not mutually bonded" mentioned herein refer to instances where "at least one combination of adjacent two or more (of . . . ) are mutually bonded to form a substituted or unsubstituted monocyclic ring, "at least one combination of adjacent two or more (of . . . ) are mutually bonded to form a substituted or unsubstituted fused ring," and "at least one combination of adjacent two or more (of . . . ) are not mutually bonded."

Instances where "at least one combination of adjacent two or more (of . . . ) are mutually bonded to form a substituted or unsubstituted monocyclic ring" mentioned herein and instances where "at least one combination of adjacent two or more (of . . . ) are mutually bonded to form a substituted or unsubstituted fused ring" mentioned herein (these may be collectively referred to as instances where "at least one combination of adjacent two or more (of . . . ) are mutually bonded to form a ring") will be described below.

An anthracene compound having a basic skeleton in a form of an anthracene ring and represented by a formula (TEMP-103) below will be used as an example for the description.

[Formula 19]

(TEMP-103)

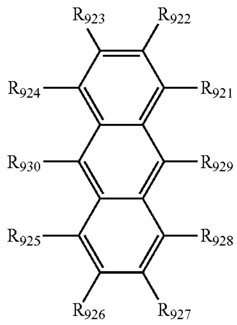

For instance, when "at least one combination of adjacent two or more of $R_{921}$ to $R_{930}$ are mutually bonded to form a ring," the combination of adjacent ones of $R_{921}$ to $R_{930}$ (i.e. the combination at issue) is a combination of $R_{921}$ and $R_{922}$, a combination of $R_{922}$ and $R_{923}$, a combination of $R_{923}$ and $R_{924}$, a combination of $R_{924}$ and $R_{930}$, a combination of $R_{930}$ and $R_{925}$, a combination of $R_{925}$ and $R_{926}$, a combination of $R_{926}$ and $R_{927}$, a combination of $R_{927}$ and $R_{928}$, a combination of $R_{928}$ and $R_{929}$, or a combination of $R_{929}$ and $R_{921}$.

The term "at least one combination" means that two or more of the above combinations of adjacent two or more of $R_{921}$ to $R_{930}$ may simultaneously form rings.

For instance, when $R_{921}$ and $R_{922}$ are mutually bonded to form a ring $Q_A$ and $R_{925}$ and $R_{926}$ are simultaneously mutually bonded to form a ring $Q_B$, the anthracene compound represented by the formula (TEMP-103) is represented by a formula (TEMP-104) below.

[Formula 20]

(TEMP-104)

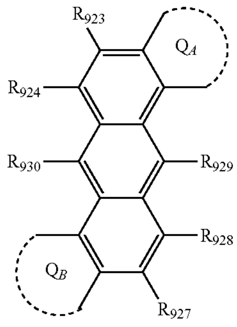

The instance where the "combination of adjacent two or more" form a ring means not only an instance where the "two" adjacent components are bonded but also an instance where adjacent "three or more" are bonded.

For instance, $R_{921}$ and $R_{922}$ are mutually bonded to form a ring $Q_A$ and $R_{922}$ and $R_{923}$ are mutually bonded to form a ring Qc, and mutually adjacent three components ($R_{921}$, $R_{922}$ and $R_{923}$) are mutually bonded to form a ring fused to the anthracene basic skeleton. In this case, the anthracene compound represented by the formula (TEMP-103) is represented by a formula (TEMP-105) below.

In the formula (TEMP-105) below, the ring $Q_A$ and the ring Qc share $R_{922}$.

[Formula 21]

(TEMP-105)

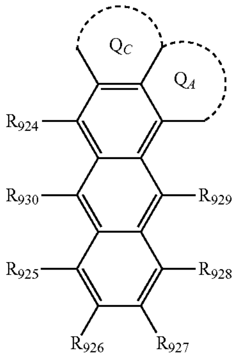

The formed "monocyclic ring" or "fused ring" may be, in terms of the formed ring in itself, a saturated ring or an unsaturated ring.

When the "combination of adjacent two" form a "monocyclic ring" or a "fused ring," the "monocyclic ring" or "fused ring" may be a saturated ring or an unsaturated ring.

For instance, the ring $Q_A$ and the ring $Q_B$ formed in the formula (TEMP-104) are each independently a "monocyclic ring" or a "fused ring."

Further, the ring $Q_A$ and the ring Qc formed in the formula (TEMP-105) are each a "fused ring."

The ring $Q_A$ and the ring Qc in the formula (TEMP-105) are fused to form a fused ring.

When the ring $Q_A$ in the formula (TEMP-104) is a benzene ring, the ring $Q_A$ is a monocyclic ring.

When the ring $Q_A$ in the formula (TEMP-104) is a naphthalene ring, the ring $Q_A$ is a fused ring.

The "unsaturated ring" represents an aromatic hydrocarbon ring or an aromatic heterocycle.

The "saturated ring" represents an aliphatic hydrocarbon ring or a non-aromatic heterocycle.

Specific examples of the aromatic hydrocarbon ring include a ring formed by terminating a bond of a group in the specific example of the specific example group G1 with a hydrogen atom.

Specific examples of the aromatic heterocycle include a ring formed by terminating a bond of an aromatic heterocyclic group in the specific example of the specific example group G2 with a hydrogen atom.

Specific examples of the aliphatic hydrocarbon ring include a ring formed by terminating a bond of a group in the specific example of the specific example group G6 with a hydrogen atom.

The phrase "to form a ring" herein means that a ring is formed only by a plurality of atoms of a basic skeleton, or by a combination of a plurality of atoms of the basic skeleton and one or more optional atoms.

For instance, the ring $Q_A$ formed by mutually bonding $R_{921}$ and $R_{922}$ shown in the formula (TEMP-104) is a ring formed by a carbon atom of the anthracene skeleton bonded to $R_{921}$, a carbon atom of the anthracene skeleton bonded to $R_{922}$, and one or more optional atoms.

Specifically, when the ring $Q_A$ is a monocyclic unsaturated ring formed by $R_{921}$ and $R_{922}$, the ring formed by a carbon atom of the anthracene skeleton bonded to $R_{921}$, a carbon atom of the anthracene skeleton bonded to $R_{922}$, and four carbon atoms is a benzene ring.

The "optional atom" is, unless otherwise specified herein, preferably at least one atom selected from the group consisting of a carbon atom, nitrogen atom, oxygen atom, and sulfur atom.

A bond of the optional atom (e.g. a carbon atom and a nitrogen atom) not forming a ring may be terminated by a hydrogen atom or the like or may be substituted by an "optional substituent" described later.

When the ring includes an optional element other than carbon atom, the resultant ring is a heterocycle.

The number of "one or more optional atoms" forming the monocyclic ring or fused ring is, unless otherwise specified herein, preferably in a range from 2 to 15, more preferably in a range from 3 to 12, further preferably in a range from 3 to 5.

Unless otherwise specified herein, the ring, which may be a "monocyclic ring" or "fused ring," is preferably a "monocyclic ring."

Unless otherwise specified herein, the ring, which may be a "saturated ring" or "unsaturated ring," is preferably an "unsaturated ring."

Unless otherwise specified herein, the "monocyclic ring" is preferably a benzene ring.

Unless otherwise specified herein, the "unsaturated ring" is preferably a benzene ring.

When "at least one combination of adjacent two or more" (of . . . ) are "mutually bonded to form a substituted or unsubstituted monocyclic ring" or "mutually bonded to form a substituted or unsubstituted fused ring," unless otherwise specified herein, at least one combination of adjacent two or more of components are preferably mutually bonded to form a substituted or unsubstituted "unsaturated ring" formed of a plurality of atoms of the basic skeleton, and 1 to 15 atoms of at least one element selected from the group consisting of carbon, nitrogen, oxygen and sulfur.

When the "monocyclic ring" or the "fused ring" has a substituent, the substituent is the substituent described in later-described "optional substituent."

When the "monocyclic ring" or the "fused ring" has a substituent, specific examples of the substituent are the substituents described in the above under the subtitle "Substituent Mentioned Herein."

When the "saturated ring" or the "unsaturated ring" has a substituent, the substituent is the substituent described in later-described "optional substituent."

When the "monocyclic ring" or the "fused ring" has a substituent, specific examples of the substituent are the substituents described in the above under the subtitle "Substituent Mentioned Herein."

The above is the description for the instances where "at least one combination of adjacent two or more (of . . . ) are mutually bonded to form a substituted or unsubstituted monocyclic ring" and "at least one combination of adjacent two or more (of . . . ) are mutually bonded to form a substituted or unsubstituted fused ring" mentioned herein (sometimes referred to as an instance of "bonded to form a ring").

Substituent for Substituted or Unsubstituted Group

In an exemplary embodiment herein, the substituent for the substituted or unsubstituted group (sometimes referred to as an "optional substituent" hereinafter) is, for instance, a group selected from the group consisting of an unsubstituted alkyl group having 1 to 50 carbon atoms, an unsubstituted alkenyl group having 2 to 50 carbon atoms, an unsubstituted alkynyl group having 2 to 50 carbon atoms, an unsubstituted cycloalkyl group having 3 to 50 ring carbon atoms, $—Si(R_{901})(R_{902})(R_{903})$, $—O—(R_{904})$, $—S—(R_{905})$, $—N(R_{906})$ ($R_{907}$), a halogen atom, a cyano group, a nitro group, an unsubstituted aryl group having 6 to 50 ring carbon atoms, and an unsubstituted heterocyclic group having 5 to 50 ring atoms;

$R_{901}$ to $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when two or more $R_{901}$ are present, the two or more $R_{901}$ are mutually the same or different;

when two or more $R_{902}$ are present, the two or more $R_{902}$ are mutually the same or different;

when two or more $R_{903}$ are present, the two or more $R_{903}$ are mutually the same or different;

when two or more $R_{904}$ are present, the two or more $R_{904}$ are mutually the same or different;

when two or more $R_{905}$ are present, the two or more $R_{905}$ are mutually the same or different;

when two or more $R_{906}$ are present, the two or more $R_{906}$ are mutually the same or different; and when two or more $R_{907}$ are present, the two or more $R_{907}$ are mutually the same or different.

In an exemplary embodiment, the substituent for the substituted or unsubstituted group is a group selected from the group consisting of an alkyl group having 1 to 50 carbon atoms, an aryl group having 6 to 50 ring carbon atoms, and a heterocyclic group having 5 to 50 ring atoms.

In an exemplary embodiment, the substituent for the substituted or unsubstituted group is a group selected from the group consisting of an alkyl group having 1 to 18 carbon atoms, an aryl group having 6 to 18 ring carbon atoms, and a heterocyclic group having 5 to 18 ring atoms.

Specific examples of the above optional substituent are the same as the specific examples of the substituent described in the above under the subtitle "Substituent Mentioned Herein."

Unless otherwise specified herein, adjacent ones of the optional substituents may form a "saturated ring" or an "unsaturated ring," preferably a substituted or unsubstituted saturated five-membered ring, a substituted or unsubstituted saturated six-membered ring, a substituted or unsubstituted unsaturated five-membered ring, or a substituted or unsubstituted unsaturated six-membered ring, more preferably a benzene ring.

Unless otherwise specified herein, the optional substituent may further include a substituent.

Examples of the substituent for the optional substituent are the same as the examples of the optional substituent.

Herein, numerical ranges represented by "AA to BB" represent a range whose lower limit is the value (AA) recited before "to" and whose upper limit is the value (BB) recited after "to."

First Exemplary Embodiment

Organic Electroluminescence Device

An organic electroluminescence device according to a first exemplary embodiment includes: an anode; a cathode; a first emitting layer disposed between the anode and the cathode; and a second emitting layer disposed between the first emitting layer and the cathode. The first emitting layer and the second emitting layer are disposed in this order between the anode and the cathode. The first emitting layer contains a first host material, and the second emitting layer contains a second host material. The first host material and the second host material are mutually different. The first emitting layer contains at least a first emitting compound, and the second emitting layer contains at least a second emitting compound. The first emitting compound and the second emitting compound are mutually the same or different. The triplet energy of the first host material $T_1(H1)$ and the triplet energy of the second host material $T_1(H2)$ satisfy the relationship of a numerical formula (Numerical Formula 1) below, and the lowest unoccupied molecular orbital energy level of the second host material LUMO(H2) and the lowest unoccupied molecular orbital energy level of the second emitting compound LUMO(D2) satisfy a numerical formula (Numerical Formula 2) below.

$$T_1(H1)<T_1(H2) \quad \text{(Numerical Formula 1)}$$

$$|\mathrm{LUMO}(D2)|-|\mathrm{LUMO}(H2)|<0.74\ \mathrm{eV} \quad \text{(Numerical Formula 2)}$$

In the organic EL device in the first exemplary embodiment, it is preferable that the lowest unoccupied molecular orbital energy level of the second host material LUMO(H2) and the lowest unoccupied molecular orbital energy level of the second emitting compound LUMO(D2) satisfy the relationship of the following numerical formula (Numerical Formula 2D).

$$0\ \mathrm{eV}<|\mathrm{LUMO}(D2)|-|\mathrm{LUMO}(H2)| \quad \text{(Numerical Formula 2D)}$$

One previously known technique for improving the luminous efficiency of an organic electroluminescence device is Tripret-Tripret-Annhilation (which may be referred to as TTA).

TTA is a mechanism in which triplet excitons collide with one another to generate singlet excitons.

The TTA mechanism is also referred to as a TTF mechanism as described in Patent Literature 4.

The TTF phenomenon will be described.

Holes injected from an anode and electrons injected from a cathode are recombined in an emitting layer to generate excitons.

As for the spin state, as is conventionally known, singlet excitons account for 25% and triplet excitons account for 75%.

In a conventionally known fluorescent device, light is emitted when singlet excitons of 25% are relaxed to the ground state. The remaining triplet excitons of 75% are returned to the ground state without emitting light through a thermal deactivation process.

Accordingly, the theoretical limit value of the internal quantum efficiency of the conventional fluorescent device is believed to be 25%.

The behavior of triplet excitons generated within an organic substance has been theoretically examined.

According to S. M. Bachilo et al. (J. Phys. Chem. A, 104, 7711 (2000)), assuming that high-order excitons such as quintet excitons are quickly returned to triplet excitons, triplet excitons (hereinafter abbreviated as $^3A^*$) collide with one another with an increase in density thereof, whereby a reaction shown by the following formula occurs.

In the formula, $^1A$ represents the ground state and $^1A^*$ represents the lowest singlet excitons.

$$^3A^*+^3A^*\rightarrow(4/9)^1A+(1/9)^1A^*+(13/9)^3A^*$$

In other words, $5^3A^*\rightarrow{}^*4^1A+1A^*$ is satisfied, and it is expected that, among triplet excitons initially generated, which account for 75%, one fifth thereof (i.e., 20%) is changed to singlet excitons.

Accordingly, the amount of singlet excitons which contribute to emission is 40%, which is a value obtained by adding 15% (75%×(⅕)=15%) to 25%, which is the amount ratio of initially generated singlet excitons.

At this time, a ratio of luminous intensity derived from TTF (TTF ratio) relative to the total luminous intensity is 15/40, i.e., 37.5%.

Assuming that singlet excitons are generated by collision of initially generated triplet excitons accounting for 75% (i.e., one singlet exciton is generated from two triplet excitons), a significantly high internal quantum efficiency of 62.5% is obtained, which is a value obtained by adding 37.5% (75%×(½)=37.5%) to 25% (the amount ratio of initially generated singlet excitons).

At this time, the TTF ratio is 37.5/62.5=60%.

In the organic electroluminescence device according to the first exemplary embodiment, triplet excitons are generated by recombination of holes and electrons in the second emitting layer. However, the triplet excitons present at the interface between the second emitting layer and an organic layer in direct contact therewith may not be easily quenched even when the number of carriers present at the interface between the second emitting layer and the organic layer is excessively large.

For example, when the recombination region is present locally at the interface between the second emitting layer and a hole transporting layer or an electron blocking layer, excessive electrons may cause quenching to occur.

When the recombination region is present locally at the interface between the second emitting layer and an electron transporting layer and or a hole blocking layer, excessive holes may cause quenching to occur.

The organic electroluminescence device according to the first exemplary embodiment includes at least two emitting layers (i.e., the first emitting layer and the second emitting layer) that satisfy the prescribed relationships. The triplet energy of the first host material $T_1$(H1) in the first emitting layer and the triplet energy of the second host material $T_1$(H2) in the second emitting layer satisfy the relationship of the above numerical formula (Numerical Formula 1).

When the first emitting layer and the second emitting layer are provided so as to satisfy the relationship of the above numerical formula (Numerical Formula 1), the triplet excitons generated in the second emitting layer can transfer to the first emitting layer without being quenched by excessive carriers, and back transfer of the triplet excitons from the first emitting layer to the second emitting layer can be prevented.

Therefore, the first emitting layer exhibits the TTF mechanism, and singlet excitons are generated efficiently, so that the luminous efficiency is improved.

As described above, in the organic electroluminescence device, the second emitting layer that mainly generates triplet excitons and the first emitting layer that mainly exhibits the TTF mechanism by utilizing the triplet excitons transferred from the second emitting layer are provided as different regions, and a compound having a smaller triplet energy than the second host material in the second emitting layer is used as the first host material in the first emitting layer to provide a difference in triplet energy, so that the luminous efficiency is improved.

If the difference between the absolute value |LUMO(D2)| of the lowest unoccupied molecular orbital energy level LUMO(D2) of the second emitting compound in the second emitting layer and the absolute value |LUMO(H2)| of the lowest unoccupied molecular orbital energy level LUMO (H2) of the second host material in the second emitting layer is excessively large, the number of electrons accumulated at the interface between the second emitting layer and an organic layer in contact therewith on its cathode side (e.g., the hole blocking layer or the electron transporting layer) becomes excessively large, and this may cause a reduction in the lifetime of the organic electroluminescence device.

In the organic EL device according to the first exemplary embodiment, the lowest unoccupied molecular orbital energy level of the second host material LUMO(H2) and the lowest unoccupied molecular orbital energy level of the second emitting compound LUMO(D2) satisfy the relationship of the above numerical formula (Numerical Formula 2).

As shown in this numerical formula (Numerical Formula 2), the difference between |LUMO(D2)| and |LUMO(H2)| is less than 0.74 eV. In this case, excessive accumulation of electrons at the cathode side interface of the second emitting layer is prevented, so that the lifetime of the organic EL device is extended.

In the organic EL device according to the first exemplary embodiment, the lowest unoccupied molecular orbital energy of the second host material level LUMO(H2) and the lowest unoccupied molecular orbital energy level of the second emitting compound LUMO(D2) preferably satisfy the relationship of a numerical formula (Numerical Formula 2A) below, more preferably satisfy the relationship of a numerical formula (Numerical Formula 2B) below, and still more preferably satisfy the relationship of a numerical formula (Numerical Formula 2C) below.

$$|LUMO(D2)|-|LUMO(H2)|\leq 0.70\ eV \quad \text{(Numerical Formula 2A)}$$

$$|LUMO(D2)|-|LUMO(H2)|\leq 0.60\ eV \quad \text{(Numerical Formula 2B)}$$

$$|LUMO(D2)|-|LUMO(H2)|\leq 0.50\ eV \quad \text{(Numerical Formula 2C)}$$

Method for Measuring HOMO

Herein, the highest occupied molecular orbital energy level HOMO is measured in air using a photoelectron spectrometer.

Specifically, the highest occupied molecular orbital energy level HOMO can be measured using a method described in Examples.

Method for Measuring LUMO Herein, the lowest unoccupied molecular orbital energy level LUMO is a value calculated using a formula (Numerical Formula 11X) below based on the measured value of the highest occupied molecular orbital energy level HOMO and the measured value of the singlet energy $S_1$.

The unit of the lowest unoccupied molecular orbital energy level LUMO, the unit of the highest occupied molecular orbital energy level HOMO, and the unit of the singlet energy $S_1$ are eV.

$$LUMO=HOMO+S_1 \quad \text{(Numerical Formula 11X)}$$

Second Emitting Layer

The second emitting layer contains the second host material.

The second host material is a compound different from the first host material contained in the first emitting layer.

The second emitting layer contains at least the second emitting compound.

The second emitting compound and the first emitting compound may be mutually the same or different. However, preferably, the second emitting compound and the first emitting compound are the same.

Preferably, the second emitting compound is a fluorescent compound.

In the organic EL device according to the first exemplary embodiment, it is preferable that an integrated value ITG(A) in a range of plus or minus 10 nm from a maximum peak wavelength of an emission spectrum of the second emitting compound and a total integrated value ITG(B) of the emission spectrum of the second emitting compound satisfy the relationship of the following numerical formula (Numerical Formula 3).

$$40 \leq \{ITG(A)/ITG(B)\} \times 100 \quad \text{(Numerical Formula 3)}$$

The integrated value ITG(A) of the emission spectrum and the total integrated value ITG(B) of the emission spectrum can be calculated using a method described later in Examples.

First Emitting Layer

The first emitting layer contains the first host material.

The first host material is a compound different from the second host material contained in the second emitting layer.

The first emitting layer contains at least the first emitting compound.

The first emitting compound is preferably a fluorescent compound.

Additional Layers of Organic EL Device

The organic EL device according to the first exemplary embodiment may include, in addition to the first emitting layer and the second emitting layer, one or more organic layers.

Examples of the organic layer include at least one layer selected from the group consisting of a hole injecting layer, a hole transporting layer, an emitting layer, an electron injecting layer, an electron transporting layer, a hole blocking layer, and an electron blocking layer.

The organic EL device according to the first exemplary embodiment may include only the first emitting layer and the second emitting layer. However, the organic EL device may further include, for example, at least one selected from the group consisting of a hole injecting layer, a hole transporting layer, an electron injecting layer, an electron transporting layer, a hole blocking layer, and an electron blocking layer.

Preferably, the organic EL device according to the first exemplary embodiment includes a hole transporting layer between the anode and the first emitting layer.

Preferably, the organic EL device according to the first exemplary embodiment includes an electron transporting layer between the second emitting layer and the cathode.

Figure 1:
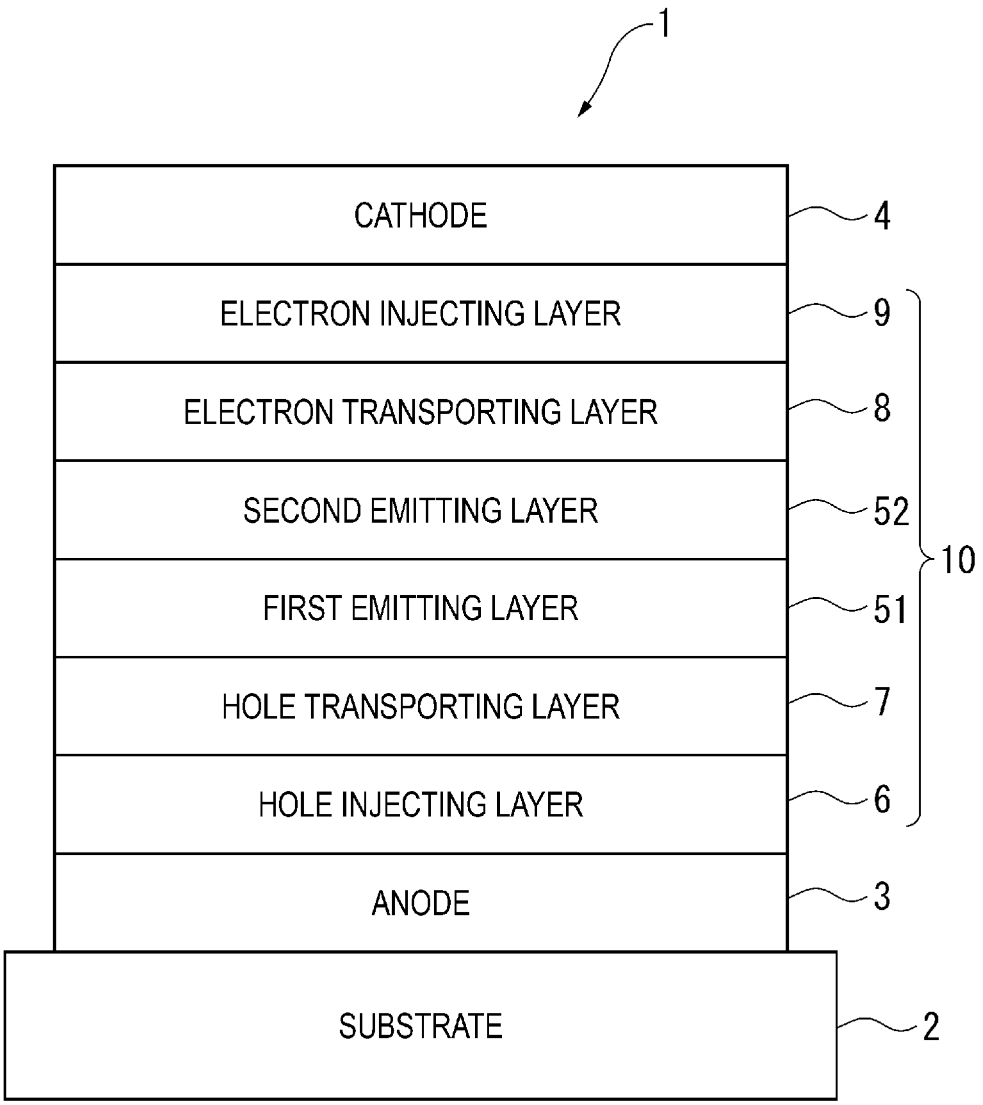
Figure 2:
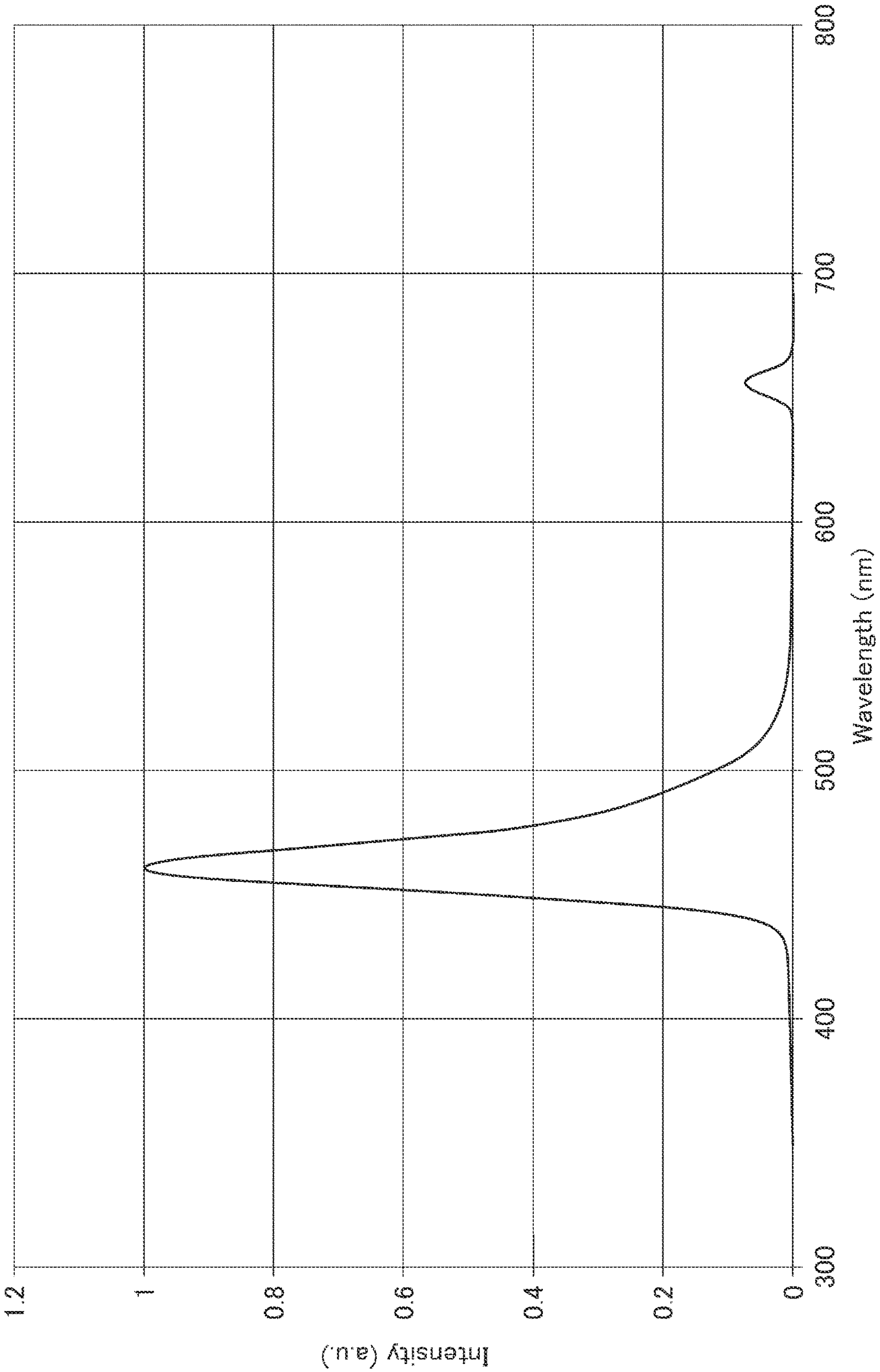
FIG. 2 shows PL spectrum of an emitting compound used to produce an organic electroluminescence device in an Example.
Figure 3:
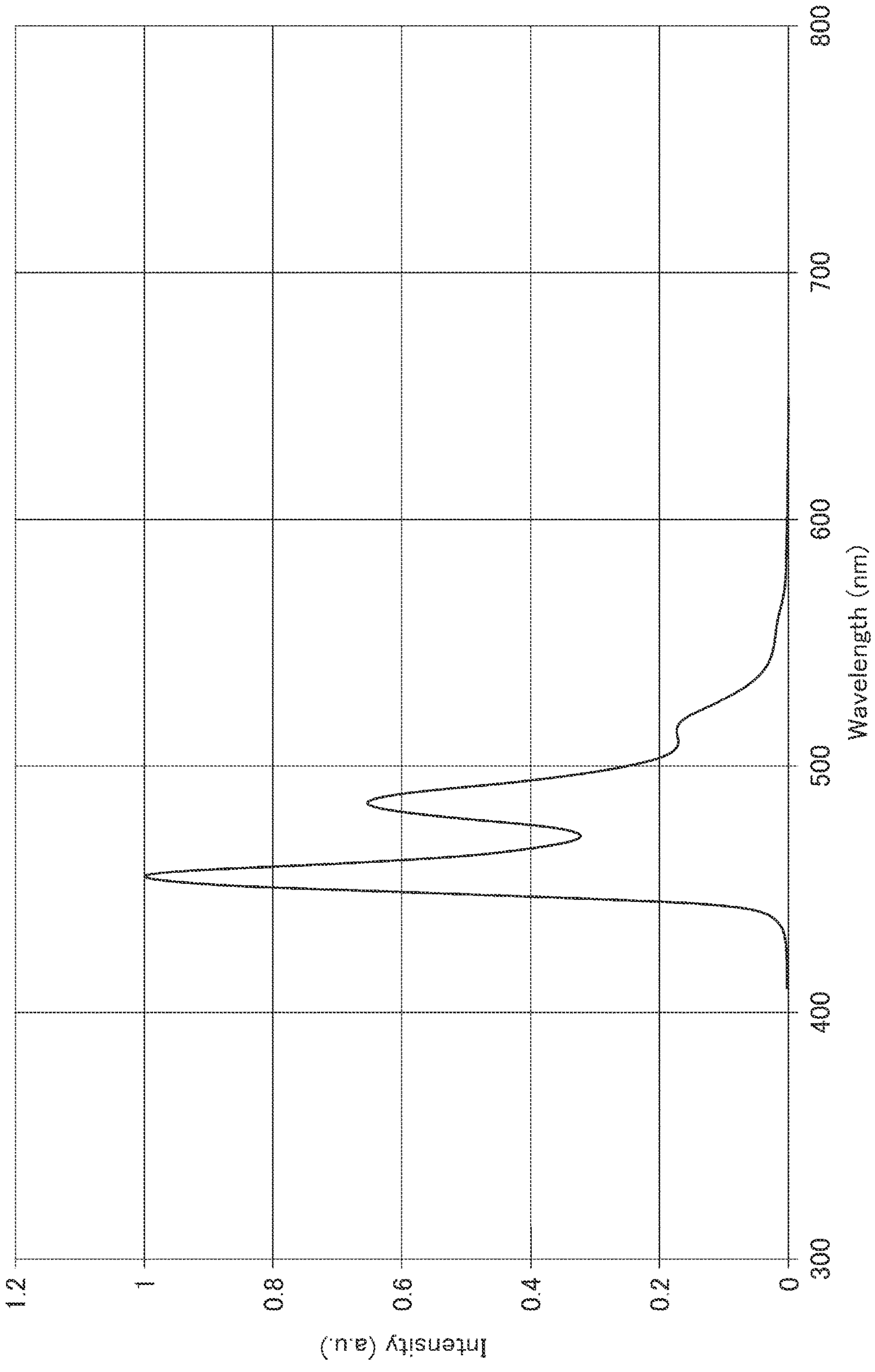
FIG. 3 shows PL spectrum of an emitting compound used to produce an organic electroluminescence device in a Comparative Example.

FIG. 1 schematically shows an exemplary arrangement of an organic EL device according to the first exemplary embodiment.

The organic EL device 1 includes a light-transmissive substrate 2, an anode 3, a cathode 4, and an organic layer 10 provided between the anode 3 and the cathode 4.

The organic layer 10 include the hole injecting layer 6, the hole transporting layer 7, the first emitting layer 51, the second emitting layer 52, the electron transporting layer 8, and the electron injecting layer 9 that are layered on the anode 3 in this order.

The organic EL device according to the first exemplary embodiment may include a first anode side organic layer and a first cathode side organic layer, and the first anode side organic layer, the first emitting layer, the second emitting layer, and the first cathode side organic layer may be disposed in this order between the anode and the cathode.

In this case, the first anode side organic layer may contain a first anode side organic material, and the first host material may be a compound represented by a formula (1H) below. The first cathode side organic layer may contain a first cathode side organic material. The triplet energy of the first host material $T_1(H1)$, the triplet energy of the second host material $T_1(H2)$, and the triplet energy of the second emitting compound $T_1(D2)$ may satisfy the relationship of the following numerical formula (Numerical Formula A1).

$$T_1(H1) < T_1(H2) < T_1(D2) \quad \text{(Numerical Formula A1)}$$

$$A\text{-}L\text{-}B \quad \text{(1H)}$$

In the formula (1H): A is a triplet structural moiety; B is a hole injecting structural moiety; L is a single bond or a linking group; and the calculation value of the highest occupied molecular orbital energy level HOMO(B) of the hole injecting structural moiety B is −5.70 eV or more.

The compound represented by the formula (1H) in the first exemplary embodiment will be described also in a second exemplary embodiment.

In the organic EL device according to the first exemplary embodiment, the calculation value $T_{1C}(A)$ of the triplet energy of the triplet structural moiety A in the first host material and the calculation value $T_{1C}(B)$ of the triplet energy of the hole injecting structural moiety in the first host material may satisfy the relationship of the following numerical formula (Numerical Formula B12).

$$T_{1C}(A) < T_{1C}(B) \quad \text{(Numerical Formula B12)}$$

In the organic EL device according to the first exemplary embodiment, the calculation value $T_{1C}(A)$ of the triplet energy of the triplet structural moiety A in the first host material and the calculation value $T_{1C}(H2)$ of the triplet energy of the second host material may satisfy the following numerical formula (Numerical Formula B11).

$$T_{1C}(A) < T_{1C}(H2) \quad \text{(Numerical Formula B11)}$$

In the organic EL device according to the first exemplary embodiment, the triplet structural moiety A in the first host material is preferably substituted or unsubstituted anthracene.

In the organic EL device according to the first exemplary embodiment, it is preferable that the carbon atom at the position 9 or the position 10 of the substituted or unsubstituted anthracene serving as the triplet structural moiety A is bonded to L.

In the organic EL device according to the first exemplary embodiment, L in the first host material is preferably a substituted or unsubstituted phenylene group or a substituted or unsubstituted biphenylene group.

In the organic EL device according to the first exemplary embodiment, the triplet structural moiety A in the first host material is preferably substituted or unsubstituted 9,10-diphenylanthracene, and L is preferably a single bond.

In the organic EL device according to the first exemplary embodiment, it is preferable that substituted or unsubstituted phenyl groups are respectively independently bonded to the carbon atoms at the positions 9 and 10 of the substituted or unsubstituted 9,10-diphenylanthracene serving as the triplet structural moiety A and that the hole injecting structural moiety B Is bonded to one of the substituted or unsubstituted phenyl groups.

In the organic EL device according to the first exemplary embodiment, the triplet energy $T_1(HBL)$ of the first cathode side organic material, the triplet energy $T_1(H1)$ of the first host material, the triplet energy $T_1(H2)$ of the second host material, and the triplet energy $T_1(D2)$ of the second emitting compound may satisfy the relationship of the following numerical formula (Numerical Formula A11).

$$T_1(H1) < T_1(H2) < T_1(D2) < T_1(HBL) \quad \text{(Numerical Formula A11)}$$

In the organic EL device according to the first exemplary embodiment, the triplet energy of the first anode side organic material $T_1$(EBL) and the triplet energy of the first host material $T_1$(H1) may satisfy the relationship of the following numerical formula (Numerical Formula A12).

$$T_1(EBL) > T_1(H1) \quad \text{(Numerical Formula A12)}$$

In the organic EL device according to the first exemplary embodiment, the calculation value $HOMO_C$(EBL) of the highest occupied molecular orbital energy level HOMO (EBL) of the first anode side organic material and the calculation value $HOMO_C$(B) of the highest occupied molecular orbital energy level HOMO(B) of the hole injecting structural moiety B may satisfy the relationship of the following numerical formula (Numerical Formula A13).

$$|HOMO_C(EBL)| < |HOMO_C(B)| \quad \text{(Numerical Formula A13)}$$

In the organic EL device according to the first exemplary embodiment, the first emitting layer and the first anode side organic layer may be in direct contact with each other.

In the organic EL device according to the first exemplary embodiment, the second emitting layer and the first cathode side organic layer may be in direct contact with each other.

The organic EL device according to the first exemplary embodiment may include: an electron injecting layer disposed between the second emitting layer and the cathode; and an electron transporting layer disposed between the electron injecting layer and the second emitting layer.

In this case, it is preferable that the electron injecting layer contains a metal element-containing compound containing a metal element in an amount of 70 mass % or more based on the mass of the electron injecting layer, that the electron transporting layer contains at least an electron transporting zone material as at least one compound forming the electron transporting layer, and that the triplet energy of the electron transporting layer $T_1$(ETL) that is calculated using a numerical formula (Numerical Formula 1A) below is larger than 2.00 eV. The electron transporting layer may be a single layer, and the electron transporting layer may be in direct contact with the second emitting layer and with the electron injecting layer.

[Formula 2]

$$T_1(ETL) = \sum_{k=1}^{n} (T_1(ET_k) \times R(ET_k)) \quad \text{(Numerical Formula 1A)}$$

In the above numerical formula (Numerical Formula 1A): $T_1(ET_k)$ is the triplet energy of one of the at least one compound forming the electron transporting layer; $R(ET_k)$ is the content ratio of the one of the at least one compound forming the electron transporting layer; and n is the number of the at least one compound forming the electron transporting layer.

In the organic EL device according to the first exemplary embodiment, the triplet energy of the electron transporting layer $T_1$(ETL) that is calculated using the above numerical formula (Numerical Formula 1A) is preferably 2.15 eV or more.

In the organic EL device according to the first exemplary embodiment, it is preferable that the electron transporting layer contains at least a first electron transporting-zone material and a second electron transporting-zone material as compounds forming the electron transporting layer.

In the organic EL device according to the first exemplary embodiment, the first electron transporting-zone material is preferably a compound represented by a formula (E21), (E22), (E23), or (E24) described later in a third exemplary embodiment.

In the organic EL device according to the first exemplary embodiment, the second electron transporting-zone material is preferably a compound represented by a formula (E11) described later in the third exemplary embodiment.

First Host Material and Second Host Material

In the organic EL device according to the first exemplary embodiment, the first host material and the second host material are mutually different, and no particular limitation is imposed on these materials so long as they are compounds satisfying the above numerical formula (Numerical Formula 1) and the above numerical formula (Numerical Formula 2).

The structure of the organic EL device in the first exemplary embodiment will be described in more detail later in "Structures Common to Each Exemplary Embodiment."

Second Exemplary Embodiment

Organic Electroluminescence Device

An organic electroluminescence device according to a second exemplary embodiment includes: an anode; a cathode; a first anode side organic layer; a first emitting layer; a second emitting layer; and a first cathode side organic layer. The first anode side organic layer, the first emitting layer, the second emitting layer, and the first cathode side organic layer are disposed in this order between the anode and the cathode. The first anode side organic layer contains a first anode side organic material, and the first emitting layer contains a first host material represented by a formula (1H) below. The second emitting layer contains a second host material, and the first cathode side organic layer contains a first cathode side organic material. The first host material and the second host material are mutually different. The first emitting layer contains at least a first emitting compound, and the second emitting layer contains at least a second emitting compound. The first emitting compound and the second emitting compound are mutually the same or different. The triplet energy of the first host material $T_1$(H1), the triplet energy of the second host material $T_1$(H2), and the triplet energy of the second emitting compound $T_1$(D2) satisfy the relationship of the following numerical formula (Numerical Formula A1).

$$T_1(H1) < T_1(H2) < T_1(D2) \quad \text{(Numerical Formula A1)}$$

$$A\text{-}L\text{-}B \quad \text{(1H)}$$

In the formula (1H):

A is a triplet structural moiety;

B is a hole injecting structural moiety;

L is a single bond or a linking group; and the calculation value of the highest occupied molecular orbital energy level HOMO(B) of the hole injecting structural moiety B is −5.70 eV or more.

In the organic EL device in the second exemplary embodiment also, as in the first exemplary embodiment, the first emitting layer exhibits the TTF mechanism. Therefore, singlet excitons are generated efficiently, and the luminous efficiency is improved.

In the organic EL device according to the second exemplary embodiment, the triplet energy of the second emitting compound $T_1$(D2) and the triplet energy of the second host material $T_1$(H2) satisfy the relationship $T_1(H2) < T_1(D2)$.

Since the second host material and the second emitting compound satisfy the relationship $T_1(H2) < T_1(D2)$, triplet excitons generated in the second emitting layer transfer not through the second emitting compound having a higher triplet energy but through the second host material and can easily transfer to the first emitting layer.

In the organic electroluminescence device in the second exemplary embodiment also, as in the first exemplary embodiment, the second emitting layer that mainly generates triplet excitons and the first emitting layer that mainly exhibits the TTF mechanism by utilizing the triplet excitons transferred from the second emitting layer are provided as different regions, and a compound having a smaller triplet energy than the second host material in the second emitting layer is used as the first host material in the first emitting layer to provide a difference in triplet energy, so that the luminous efficiency is improved.

In the organic EL device according to the second exemplary embodiment, since the first host material has the structure represented by the formula (1H), injection of holes from the first anode side organic layer is facilitated, and injection of holes to the second emitting layer is also facilitated. Therefore, accumulation and recombination of charges in the first emitting layer are avoided, and recombination of charges in the second emitting layer is facilitated, so that the lifetime of the organic EL device is extended.

According to the second exemplary embodiment, a long-lifetime organic electroluminescence device having high luminous efficiency can be provided.

First Host Material

In the organic EL device according to the second exemplary embodiment, the first host material and the second host materials are different compounds and are compounds represented by a formula (1H).

$$A\text{-}L\text{-}B \quad (1H)$$

In the formula (1H): A is a triplet structural moiety; B is a hole injecting structural moiety; and L is a single bond or a linking group.

The triplet structural moiety is a structural moiety of the compound that is present in order to allow the compound as a whole to have a low triplet energy.

The first host material has at least one triplet structural moiety.

It is also preferable that the calculation value $T_{1C}(A)$ of the triplet energy of the triplet structural moiety A in the first host material and the calculation value $T_{1C}(B)$ of the triplet energy of the hole injecting structural moiety in the first host material satisfy the relationship of the following numerical formula (Numerical Formula B12).

$$T_{1C}(A)<T_{1C}(B) \quad \text{(Numerical Formula B12)}$$

It is preferable that the calculation value $T_{1C}(A)$ of the triplet energy of the triplet structural moiety A in the first host material and the calculation value $T_{1C}(H2)$ of the triplet energy of the second host material satisfy the relationship of the following numerical formula (Numerical Formula B11).

$$T_{1C}(A)<T_{1C}(H2) \quad \text{(Numerical Formula B11)}$$

When the first host material has the triplet structural moiety A that satisfies the relationship of the above numerical formula (Numerical Formula B11), the TTF can occur efficiently in the first emitting layer.

The calculation value $T_{1C}(A)$ of the triplet energy of the triplet structural moiety A in the first host material is determined as follows. The triplet energy of a structure obtained by replacing a terminal end of the triplet structural moiety A with hydrogen and the triplet energy of a structure obtained by replacing the terminal end of the triplet structural moiety A with a phenyl group are calculated. Then the smaller one of the calculation values of these structures is used as the calculation value $T_{1C}(A)$.

The terminal end of the triplet structural moiety A in the first host material is a portion of the triplet structural moiety that forms a single bond with the linking group or a portion of the triplet structural moiety that forms a single bond with the hole injecting moiety.

The calculation value $T_{1C}(A)$ of the triplet energy of the triplet structural moiety A in the first host material is preferably less than 2.00 eV and more preferably less than 1.90 eV.

It is preferable that the calculation value $T_{1C}(A)$ of the triplet energy of the triplet structural moiety A in the first host material and the calculation value $T_{1C}(B)$ of the triplet energy of the hole injecting structural moiety B in the first host material satisfy the relationship of the following numerical formula (Numerical Formula B13).

$$T_{1C}(A)<T_{1C}(B) \quad \text{(Numerical Formula B13)}$$

The triplet structural moiety A in the first host material is preferably substituted or unsubstituted anthracene.

It is also preferable that the carbon atom at the position 9 or 10 of the substituted or unsubstituted anthracene serving as the triplet structural moiety A is bonded to L.

The triplet structural moiety A is, for example, the following structure.

[Formula 22]

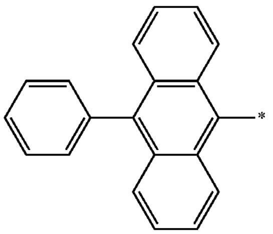

* in the triplet structural moiety A represents a bonding position to L.

One example of the structure obtained by replacing the terminal end of the triplet structural moiety A with hydrogen is the following structure.

[Formula 23]

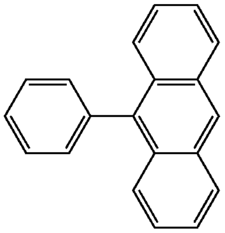

One example of the structure obtained by replacing the terminal end of the triplet structural moiety A with a phenyl group is the following structure.

[Formula 24]

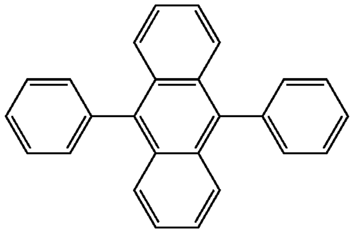

The hole injecting structural moiety is a moiety that is included in the compound and obtained by removing the triplet structural moiety A and L and is a structural moiety of the compound that allows the compound as a whole to contribute to hole injection.

The calculation value of the highest occupied molecular orbital energy level HOMO(B) of the hole injecting structural moiety B is −5.70 eV or more.

Since the first host material has the hole injecting structural moiety B whose calculated value of HOMO(B) is as described above, the hole injectability from the first anode side organic layer to the first emitting layer is improved.

The calculation value of the highest occupied molecular orbital energy level HOMO(B) of the hole injecting structural moiety B is preferably −5.60 eV or more and more preferably −5.30 eV or more.

The calculation value of the highest occupied molecular orbital energy level HOMO(B) of the hole injecting structural moiety B is a value calculated using a structure obtained by replacing a terminal end of the moiety with hydrogen.

It is preferable that the hole injecting structural moiety B is substituted or unsubstituted carbazole.

It is also preferable that the nitrogen atom at the position 9 of the substituted or unsubstituted carbazole serving as the hole injecting structural moiety B is bonded to L.

Examples of the hole injecting structural moiety B include the following structures.

[Formula 25]

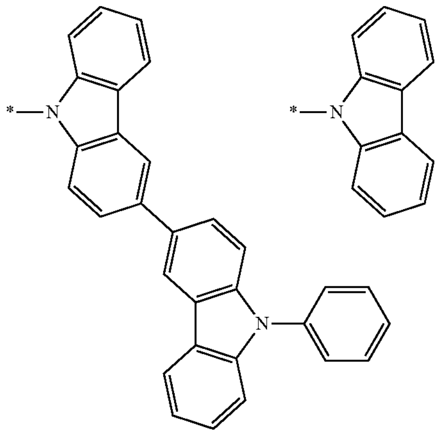

* in the hole injecting structural moiety B is a bonding position to L.

Examples of the structure obtained by replacing the terminal end of the hole injecting structural moiety B with hydrogen include the following structures.

[Formula 26]

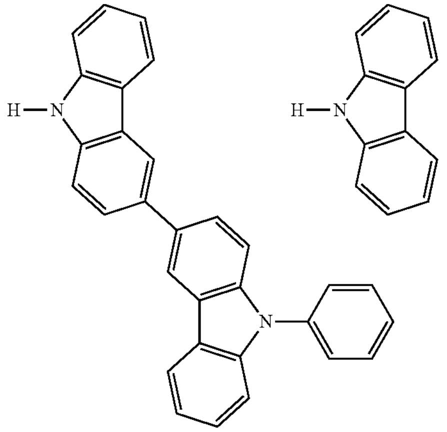

It is also preferable that the first host material is a compound represented by the following formula (11H).

[Formula 27]

(11H)

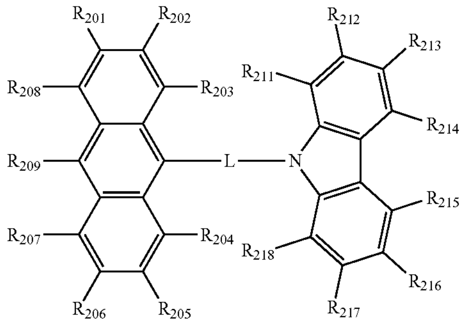

In the formula (11H):

at least one combination of adjacent two or more of $R_{211}$ to $R_{218}$ are mutually bonded to form a substituted or unsubstituted monocyclic ring, mutually bonded to form a substituted or unsubstituted fused ring, or not mutually bonded, $R_{201}$ to $R_{209}$ and $R_{211}$ to $R_{218}$ forming neither the substituted or unsubstituted monocyclic ring nor the substituted or unsubstituted fused ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

L is a single bond, a substituted or unsubstituted arylene group having 6 to 50 ring carbon atoms, or a substituted or unsubstituted divalent heterocyclic group having 5 to 50 ring atoms;

$R_{901}$, $R_{902}$, $R_{903}$, $R_{904}$, $R_{905}$, $R_{906}$, $R_{907}$, $R_{801}$, and $R\$_{02}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms, a substituted or unsubstituted alkyl group having 1 to 50 carbon atoms, or a substituted or unsubstituted aryl group having 6 to 50 ring carbon atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

Calculation Values of HOMO and $T_1$ of Each of Hole Injecting Structural Moiety and Triplet Structural Moiety of Compound The calculation value of the HOMO and the calculation value of $T_1$ of each of the hole injecting structural moiety and the triplet structural moiety of a compound are calculated using a quantum chemical calculation program (Gaussian 16, Revision B (Gaussian Inc.); computational method: B3LYP/6-31G* (this means that B3LYP is used for the theory and 6-31 G* is used for the basis function).

It is also preferable that L in the first host material is a substituted or unsubstituted phenylene group or a substituted or unsubstituted biphenylene group.

It is also preferable that the triplet structural moiety A of the first host material is substituted or unsubstituted 9,10-diphenylanthracene and that L is a single bond.

It is also preferable that substituted or unsubstituted phenyl groups are respectively independently bonded to the carbon atoms at the positions 9 and 10 of the substituted or unsubstituted 9,10-diphenylanthracene serving as the triplet structural moiety A and that the hole injecting structural moiety B Is bonded to one of the substituted or unsubstituted phenyl groups.

The ionization potential of the first host material is preferably 5.90 eV or less and more preferably 5.80 eV or less.

Method for Producing First Host Material

The compound used as the first host material can be produced by a well-known method.

The compound used as the first host material can also be produced according to a well-known method using a known alternative reaction and raw materials suitable for the target compound.

Specific Examples of Compound Used as First Host Material

Specific examples of the compound used as the first host material include compounds shown below.

However, the invention is by no means limited to the specifically listed compounds.

[Formula 28]

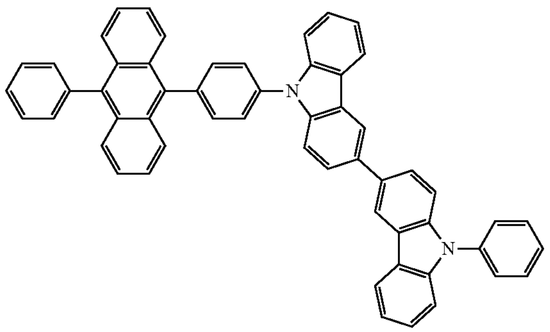

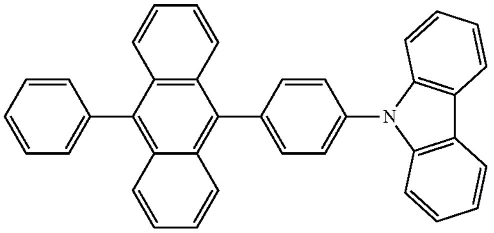

Second Emitting Layer

The second emitting layer contains the second host material.

The second host material is a compound different from the first host material contained in the first emitting layer.

The second emitting layer contains at least the second emitting compound.

The second emitting compound and the first emitting compound may be mutually the same or different. However, preferably, the second emitting compound and the first emitting compound are the same.

Preferably, the second emitting compound is a fluorescent compound.

First Emitting Layer

The first emitting layer contains the first host material.

The first host material is a compound different from the second host material contained in the second emitting layer.

The first emitting layer contains at least the first emitting compound.

The first emitting compound is preferably a fluorescent compound.

First Anode Side Organic Layer

The first anode side organic layer contains the first anode side organic material.

It is preferable that the triplet energy of the first anode side organic material $T_1$(EBL) and the triplet energy of the first host material $T_1$(H1) satisfy the relationship of the following numerical formula (Numerical Formula A12).

$$T_1(EBL)>T_1(H1) \quad \text{(Numerical Formula A12)}$$

In the organic EL device according to the second exemplary embodiment, when the first anode side organic material satisfies the relationship of the above numerical formula (Numerical Formula A12), the triplet excitons transferred to the first emitting layer are unlikely to transfer to the first anode side organic material in the first anode side organic layer that has a higher triplet energy, and the first emitting layer exhibits the TTF mechanism more efficiently. In this case, singlet excitons are generated efficiently, and the luminous efficiency tends to be improved.

In the organic EL device according to the second exemplary embodiment, it is also preferable that the calculation value $HOMO_C$(EBL) of the highest occupied molecular orbital energy level HOMO(EBL) of the first anode side organic material and the calculation value $HOMO_C$(B) of the highest occupied molecular orbital energy level HOMO (B) of the hole injecting structural moiety B satisfy the relationship of the following numerical formula (Numerical Formula A13).

$$|HOMO_C(EBL)|<|HOMO_C(B)| \quad \text{(Numerical Formula A13)}$$

In the organic EL device according to the second exemplary embodiment, it is also preferable that the first emitting layer and the first anode side organic layer are in direct contact with each other.

In the organic EL device according to the second exemplary embodiment, the first anode side organic layer is preferably an electron blocking layer or a hole transporting layer and more preferably an electron blocking layer.

The electron blocking layer is, for example, a layer that transports holes and prevents electrons from reaching a layer on the anode side of the blocking layer (for example, a hole transporting layer or a hole injecting layer).

The electron blocking layer may be a layer that prevents the excitation energy from leaking from the emitting layer to neighboring layers.

In this case, the electron blocking layer prevents excitons generated in the emitting layer from transferring to a layer on the anode side of the blocking layer (for example, the hole transporting layer or the hole injecting layer).

First Cathode Side Organic Layer

The first cathode side organic layer contains the first cathode side organic material.

It is preferable that the triplet energy of the first cathode side organic material $T_1$(HBL), the triplet energy of the first host material $T_1$(H1), the triplet energy of the second host material $T_1$(H2), and the triplet energy of the second emitting compound $T_1$(D2) satisfy the relationship of the following numerical formula (Numerical Formula A11).

$$T_1(H1)<T_1(H2)<T_1(D2)<T_1(HBL) \quad \text{(Numerical Formula A11)}$$

In the organic EL device according to the second exemplary embodiment, when the first cathode side organic material satisfies the relationship of the above numerical formula (Numerical Formula A11), the triplet excitons generated in the second emitting layer transfer not through the first cathode side organic material in the first cathode side organic layer that has a higher triplet energy but through the second host material and can easily transfer to the first emitting layer.

In the organic EL device according to the second exemplary embodiment, it is also preferable that the second emitting layer and the first cathode side organic layer are in direct contact with each other.

In the organic EL device according to the second exemplary embodiment, the first cathode side organic layer is preferably a hole blocking layer or an electron transporting layer and is more preferably a hole blocking layer.

The hole blocking layer is, for example, a layer that transports electrons and prevents holes from reaching a layer on the cathode side of the blocking layer (for example, an electron transporting layer or an electron injecting layer).

The hole blocking layer may be a layer that prevents the excitation energy from leaking from the emitting layer to neighboring layers.

In this case, the hole blocking layer prevents excitons generated in the emitting layer from transferring to a layer on the cathode side of the blocking layer (for example, the electron transporting layer or the electron injecting layer).

Additional Layers of Organic EL Device

The organic EL device according to the second exemplary embodiment may include, in addition to the first emitting layer and the second emitting layer, one or more organic layers.

Examples of the organic layer include at least one layer selected from the group consisting of a hole injecting layer, a hole transporting layer, an emitting layer, an electron injecting layer, an electron transporting layer, a hole blocking layer, and an electron blocking layer.

The organic EL device according to the second exemplary embodiment may include only the first emitting layer and the second emitting layer. However, the organic EL device may further include, for example, at least one selected from the group consisting of a hole injecting layer, a hole transporting layer, an electron injecting layer, an electron transporting layer, a hole blocking layer, and an electron blocking layer.

Preferably, the organic EL device according to the second exemplary embodiment includes a hole transporting layer between the anode and the first emitting layer.

Preferably, the organic EL device according to the second exemplary embodiment includes an electron transporting layer between the second emitting layer and the cathode.

FIG. 4 schematically shows an exemplary arrangement of an organic EL device according to the second exemplary embodiment.

The organic EL device 1A includes: a light-transmissive substrate 2; an anode 3; a cathode 4; and an organic layer 10A disposed between the anode 3 and the cathode 4.

The organic layer 10A includes a hole injecting layer 63, a hole transporting layer 62, a first anode side organic layer 61, a first emitting layer 51, a second emitting layer 52, a first cathode side organic layer 71, an electron transporting layer 72, and an electron injecting layer 73 that are layered in this order on the anode 3.

The structure of the organic EL device of the invention is not limited to the structure shown in FIG. 4.

For example, an organic EL device having a different structure includes an organic layer including a hole injecting layer, a first anode side organic layer, a first emitting layer, a second emitting layer, a first cathode side organic layer, an electron transporting layer, and an electron injecting layer that are layered in this order on the anode.

Second Host Material

In the organic EL device according to the second exemplary embodiment, no particular limitation is imposed on the second host material, so long as it is a compound different from the first host material and satisfies the relationship of the above numerical formula (Numerical Formula A1).

The structure of the organic EL device in the second exemplary embodiment will be described in more detail later in "Structures Common to Each Exemplary Embodiment."

Third Exemplary Embodiment

An organic electroluminescence device according to a third exemplary embodiment includes: an anode; a cathode;

an emitting layer disposed between the anode and the cathode; an electron injecting layer disposed between the emitting layer and the cathode; and an electron transporting layer disposed between the electron injecting layer and the emitting layer. The electron injecting layer contains a metal element-containing compound containing a metal element in an amount of 70 mass % or more based on the mass of the electron injecting layer, and the electron transporting layer contains at least an electron transporting zone material as at least one compound forming the electron transporting layer, The triplet energy of the electron transporting layer $T_1$(ETL) that is calculated using a numerical formula (Numerical Formula 1A) below is larger than 2.00 eV, and the electron transporting layer is a single layer. The electron transporting layer is in direct contact with the emitting layer and with the electron injecting layer, and the emitting layer includes a first emitting layer and a second emitting layer. The first emitting layer contains a first host material and a first emitting compound, and the second emitting layer contains a second host material and a second emitting compound. The first host material and the second host material are mutually different, and the first emitting compound and the second emitting compound are mutually the same or different. The triplet energy of the first host material $T_1$(H1) and the triplet energy of the second host material $T_1$(H2) satisfy the relationship of the following numerical formula (Numerical Formula 1).

$$T_1(H2) > T_1(H1) \quad \text{(Numerical Formula 1)}$$

[Formula 3]

$$T_1(ETL) = \sum_{k=1}^{n} (T_1(ET_k) \times R(ET_k)) \quad \text{(Numerical Formula 1A)}$$

In the above numerical formula (Numerical Formula 1A): $T_1(ET_k)$ is the triplet energy of each of the at least one compound forming the electron transporting layer; $R(ET_k)$ is the content ratio of the each of the at least one compound forming the electron transporting layer; and n is the number of the at least one compound forming the electron transporting layer.

In the organic EL device in the third exemplary embodiment, the emitting layer including the first emitting layer and the second emitting layer may be referred to as an emitting region.

In the organic EL device in the third exemplary embodiment also, as in the first exemplary embodiment, the first emitting layer exhibits the TTF mechanism. Therefore, singlet excitons are generated efficiently, and the luminous efficiency is improved.

In a conventional organic EL device, a plurality of organic compound layers such as a hole blocking layer and an electron transporting layer are layered between an emitting layer and an electron injecting layer.

If the hole blocking layer is omitted from the device structure of the conventional organic EL device in order to reduce the number of organic compound layers between the emitting layer and the electron injecting layer, there is a concern that the device performance may deteriorate.

The organic EL device according to the third exemplary embodiment includes the first emitting layer and the second emitting layer that satisfy the above numerical formula (Numerical Formula 1), and therefore the luminous efficiency of the device can be improved.

The organic EL device according to the third exemplary embodiment further includes the electron transporting layer as a single layer between the emitting layer and the electron injecting layer (the layer containing the metal element-containing compound containing the metal element in an amount of 70 mass % or more).

In a conventional organic EL device, a plurality of organic compound layers such as a hole blocking layer and an electron transporting layer are layered between the emitting layer and the electron injecting layer.

If the hole blocking layer in the conventional organic EL device is omitted and an electron transporting layer is disposed so as to be in direct contact with the cathode side of the emitting layer, the number of electrons in the emitting layer is excessively large, and the excessive electrons accelerate deterioration of the interface between the emitting layer and an electron blocking layer disposed on the anode side of the emitting layer, so that the lifetime of the device is shortened.

In the organic EL device according to the third exemplary embodiment, the electron transporting layer disposed between the emitting layer and the electron injecting layer is a single layer. However, the triplet energy $T_1$(ETL) of the electron transporting layer that is calculated using the above numerical formula (Numerical Formula 1A) is larger than 2.00 eV, and the first emitting layer and the second emitting layer are layered together. Therefore, a reduction in the amount of holes supplied to the first emitting layer is prevented, and the emission position is moved from the hole transporting-zone side to a position between the first emitting layer and the second emitting layer.

This allows the lifetime of the organic EL device according to the third exemplary embodiment to be extended.

In the third exemplary embodiment, although the organic compound layer disposed between the emitting layer and the electron injecting layer is a single layer, the organic electroluminescence device provided can have extended lifetime.

Electron Injecting Layer

In the organic EL device according to the third exemplary embodiment, the electron injecting layer is disposed between the electron transporting layer and the cathode.

Preferably, the electron injecting layer is in direct contact with the cathode.

In the organic EL device according to the third exemplary embodiment, the electron injecting layer is a layer containing the metal element-containing compound containing a metal element in an amount of 70 mass % or more based on the mass of the electron injecting layer.

In another exemplary embodiment, the electron injecting layer contains the metal element-containing compound in an amount of 80 mass % or more based on the mass of the electron injecting layer. In another exemplary embodiment, the electron injecting layer contains the metal element-containing compound in an amount of 90 mass % or more based on the mass of the electron injecting layer. In another exemplary embodiment, the electron injecting layer contains the metal element-containing compound in an amount of 99 mass % or more based on the mass of the electron injecting layer.

No particular limitation is imposed on the metal element-containing compound in the electron injecting layer. Examples of the metal element-containing compound include alkali metal compounds and alkaline earth metal compounds. More specific examples include lithium complexes such as Liq ((8-quinolinolato)lithium), fluorides such as lithium fluoride (LiF), cesium fluoride (CsF), and calcium fluoride ($CaF_2$), lithium oxides such as $Li_2O$, and carbonates such as cesium carbonate ($Cs_2CO_3$).

In the organic EL device according to the third exemplary embodiment, the thickness of the electron injecting layer is preferably in a range from 0.3 nm to 2 nm.

Electron Transporting Layer

In the organic EL device according to the third exemplary embodiment, the electron transporting layer is an organic compound layer disposed between the emitting layer and the electron injecting layer and is in direct contact with the emitting layer and with the electron injecting layer.

In the organic EL device according to the third exemplary embodiment, the emitting layer, the electron transporting layer, and the electron injecting layer are layered in this order from the anode side.

In the organic EL device according to the third exemplary embodiment, it is preferable that one of the first emitting layer and the second emitting layer that is disposed on the cathode side is in direct contact with the electron transporting layer.

In the organic EL device according to the third exemplary embodiment, the triplet energy of the electron transporting layer $T_1(ETL)$ that is calculated using the above numerical formula (Numerical Formula 1A) is larger than 2.00 eV.

In the organic EL device according to the third exemplary embodiment, the triplet energy $T_1(ETL)$ of the electron transporting layer that is calculated using the above numerical formula (Numerical Formula 1A) is preferably larger than 2.15 eV.

When the triplet energy of the electron transporting layer $T_1(ETL)$ is larger than 2.15 eV, the effect of preventing the reduction in the lifetime of the device is expected to be enhanced.

When the number of compounds (electron transporting-zone materials) forming the electron transporting layer is n, the above numerical formula (Numerical Formula 1A) is represented by a numerical formula (Numerical Formula 1B) below.

The sum of $R(ET_1)$ to $R(ET_n)$ is 1.

$$T_1(ETL)=T_1(ET_1)\times R(ET_1)+T_1(ET_2)\times R(ET_2)+\ldots+T_1(ET_n)\times R(ET_n) \quad \text{(Numerical Formula 1B)}$$

When the number of compounds (electron transporting-zone materials) forming the electron transporting layer is, for example, one, n is 1 in the above numerical formula (Numerical Formula 1A), and the content ratio $R(ET_k)$ in the electron transporting layer is 1. In this case, $T_1(ETL)$ corresponds to the triplet energy of the one compound (electron transporting-zone material) forming the electron transporting layer.

In the organic EL device according to the third exemplary embodiment, the electron transporting layer may contain a plurality of compounds.

For example, when the number of compounds forming the electron transporting layer is 2 (e.g., a first electron transporting-zone material (k=1) and a second electron transporting-zone material (k=2)), n is 2 in the above numerical formula (Numerical Formula 1A).

In this case, $T_1(ETL)$ is the sum of the product of the triplet energy $T_1(ET_1)$ of the first electron transporting-zone material and the content ratio $R(ET_1)$ of the first electron transporting-zone material in the electron transporting layer and the product of the triplet energy $T_1(ET_2)$ of the second electron transporting-zone material and the content ratio $R(ET_2)$ of the second electron transporting-zone material in the electron transporting layer and is represented by a numerical formula (Numerical Formula 1C) below.

The sum of $R(ET_1)$ and $R(ET_2)$ is 1.

$$T_1(ETL)=T_1(ET_1)\times R(ET_1)+T_1(ET_2)\times R(ET_2) \quad \text{(Numerical Formula 1C)}$$

When two or more compounds are used to deposit the electron transporting layer, the two or more compounds may be co-deposited to form the electron transporting layer, or a mixture of the two or more compounds may be prepared in advance and used to deposit the electron transporting layer.

By adjusting the mixing ratio of the compounds in the electron transporting layer using a deposition method using co-deposition or a deposition method using the mixture, the mobility in the electron transporting layer can be easily adjusted.

From the viewpoint of adjusting the temperature of vapor deposition, the formation method using the mixture is preferred.

In the organic EL device according to the third exemplary embodiment, the thickness of the electron transporting layer is preferably in a range from 10 nm to 50 nm.

Electron Transporting-Zone Material

The electron transporting-zone material is a compound different from the metal element-containing compound in the electron injecting layer.

In the organic EL device according to the third exemplary embodiment, the content ratio of the electron transporting-zone material in the electron transporting layer is preferably more than 30 mass %, more preferably 40 mass % or more, and still more preferably 50 mass % or more.

In the organic EL device according to the third exemplary embodiment, it is preferable that the electron transporting layer contains at least a first electron transporting-zone material and a second electron transporting-zone material as the compounds forming the electron transporting layer.

The first electron transporting-zone material and the second electron transporting-zone material are mutually different compounds.

The first electron transporting-zone material and the second electron transporting-zone material differ from the metal element-containing compound in the electron injecting layer.

It is preferable that the triplet energy of the second electron transporting-zone material is larger than the triplet energy of the first electron transporting-zone material.

The triplet energy of the first electron transporting-zone material is preferably 2.00 eV or less, more preferably 1.90 eV or less, and still more preferably 1.85 eV or less.

The triplet energy of the second electron transporting-zone material is preferably larger than 2.00 eV, more preferably 2.20 eV or more, and still more preferably 2.30 eV or more.

It is preferable that the first electron transporting-zone material is a compound whose electron mobility is smaller than that of the second electron transporting-zone material.

In the organic EL device according to the third exemplary embodiment, the content ratio of the first electron transporting-zone material in the electron transporting layer is preferably 20 mass % or more, more preferably 30 mass % or more, and still more preferably 40 mass % or more.

In the organic EL device according to the third exemplary embodiment, the content ratio of the first electron transporting-zone material in the electron transporting layer is preferably 80 mass % or less, more preferably 70 mass % or less, and still more preferably 60 mass % or less.

In the organic EL device according to the third exemplary embodiment, the content ratio of the second electron transporting-zone material in the electron transporting layer is preferably 20 mass % or more, more preferably 30 mass % or more, and still more preferably 40 mass % or more.

In the organic EL device according to the third exemplary embodiment, the content ratio of the second electron transporting-zone material in the electron transporting layer is preferably 80 mass % or less, more preferably 70 mass % or less, and still more preferably 60 mass % or less.

In the organic EL device according to the third exemplary embodiment, the total content ratio of the first electron transporting-zone material and the second electron transporting-zone material in the electron transporting layer is preferably in a range from 70 mass % to 100 mass %.

In the organic EL device according to the third exemplary embodiment, when the electron transporting layer contains the metal element-containing compound contained in the electron injecting layer, the content ratio of the metal element-containing compound in the electron transporting layer is less than 30 mass %.

In the organic EL device according to the third exemplary embodiment, it is also preferable that the first electron transporting-zone material is a compound represented by any of the following formulae (E21), (E22), (E23), and (E24).

[Formula 29]

(E21)

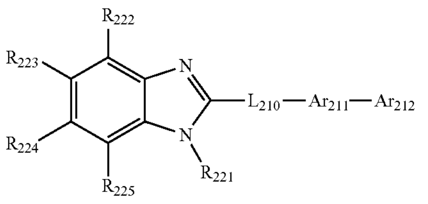

In the formula (E21):

$R_{221}$ is a substituted or unsubstituted aryl group having 6 to 50 ring carbon atoms, a substituted or unsubstituted pyridyl group, a substituted or unsubstituted quinolyl group, a substituted or unsubstituted alkyl group having 1 to 50 carbon atoms, or a group represented by —O—($R_{904}$);

$R_{222}$ to $R_{225}$ are each independently a hydrogen atom, a substituted or unsubstituted aryl group having 6 to 50 ring carbon atoms, a substituted or unsubstituted pyridyl group, a substituted or unsubstituted quinolyl group, a substituted or unsubstituted alkyl group having 1 to 50 carbon atoms, or a group represented by —O—($R_{904}$);

$L_{210}$ is a substituted or unsubstituted arylene group having 6 to 50 ring carbon atoms, a substituted or unsubstituted pyridinylene group, a substituted or unsubstituted quinolinylene group, or a substituted or unsubstituted fluorenylene group;

$Ar_{211}$ is a substituted or unsubstituted arylene group having 6 to 50 ring carbon atoms, a substituted or unsubstituted pyridinylene group, or a substituted or unsubstituted quinolinylene group;

$Ar_{212}$ is a substituted or unsubstituted aryl group having 6 to 50 ring carbon atoms, a substituted or unsubstituted pyridyl group, a substituted or unsubstituted quinolyl group, a substituted or unsubstituted alkyl group having 1 to 50 carbon atoms, or, a group represented by —O—($R_{904}$).

[Formula 30]

(E22)

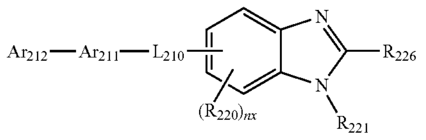

In the formula (E22):

$R_{221}$, $L_{210}$, $Ar_{211}$, and $Ar_{212}$ respectively represent the same as $R_{221}$, $L_{210}$, $Ar_{211}$, and $Ar_{212}$ in the formula (E21);

$R_{220}$ and $R_{226}$ are each independently a hydrogen atom, a substituted or unsubstituted aryl group having 6 to 50 ring carbon atoms, a substituted or unsubstituted pyridyl group, a substituted or unsubstituted quinolyl group, a substituted or unsubstituted alkyl group having 1 to 50 carbon atoms, or a group represented by —O—($R_{904}$);

nx is 3; and a plurality of $R_{220}$ are mutually the same or different.

[Formula 31]

(E23)

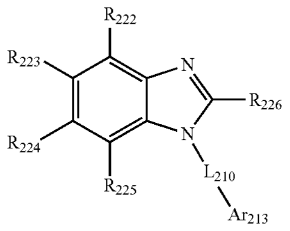

In the formula (E23):

$R_{222}$ to $R_{226}$ are each independently a hydrogen atom, a substituted or unsubstituted aryl group having 6 to 50 ring carbon atoms, a substituted or unsubstituted pyridyl group, a substituted or unsubstituted quinolyl group, a substituted or unsubstituted alkyl group having 1 to 50 carbon atoms, or a group represented by —O—($R_{904}$);

$L_{210}$ represents the same as $L_{210}$ in the formula (E21);

$Ar_{213}$ is a substituted or unsubstituted aryl group having 6 to 50 ring carbon atoms, a substituted or unsubstituted pyridyl group, a substituted or unsubstituted quinolyl group, a substituted or unsubstituted alkyl group having 1 to 50 carbon atoms, a group represented by —O—($R_{904}$), or a group represented by —$Ar_{214}$—$Ar_{215}$;

$Ar_{214}$ represents the same as $Ar_{211}$ in the formula (E21); and $Ar_{215}$ represents the same as $Ar_{212}$ in the formula (E21).

[Formula 32]

(E24)

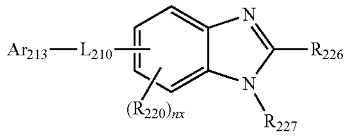

In the formula (E24):

$R_{220}$, $R_{226}$, and $R_{227}$ are each independently a hydrogen atom, a substituted or unsubstituted aryl group having 6 to 50 ring carbon atoms, a substituted or unsubstituted pyridyl group, a substituted or unsubstituted quinolyl group, a substituted or unsubstituted alkyl group having 1 to 50 carbon atoms, or a group represented by —O—($R_{904}$);

nx is 3;

a plurality of $R_{220}$ are mutually the same or different;

$L_{210}$ represents the same as $L_{210}$ in the formula (E21); and $Ar_{213}$ represents the same as $Ar_{213}$ in the formula (E23).

In the formulae (E21) to (E24):

$R_{904}$ is a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms; and when a plurality of $R_{904}$ are present, the plurality of $R_{904}$ are mutually the same or different.

In the organic EL device according to the third exemplary embodiment, it is also preferable that the first electron transporting-zone material is a compound represented by the following formula (E25).

[Formula 33]

(E25)

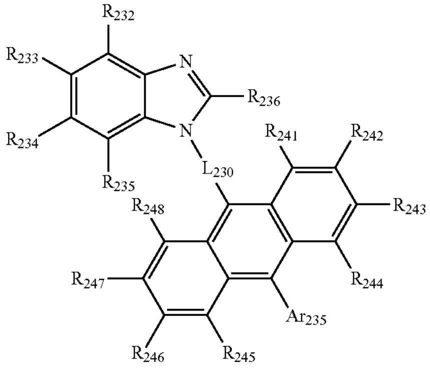

In the formula (E25):

$Ar_{235}$, $R_{232}$ to $R_{235}$ and $R_{241}$ to $R_{248}$ are each independently a hydrogen atom, a substituted or unsubstituted aryl group having 6 to 50 ring carbon atoms, a substituted or unsubstituted heterocyclic group having 5 to 50 ring atoms, a substituted or unsubstituted alkyl group having 1 to 50 carbon atoms, a substituted or unsubstituted cycloalkyl group having 3 to 50 ring carbon atoms, a substituted or unsubstituted aralkyl group having 7 to 50 carbon atoms, a group represented by —O—($R_{904}$), a group represented by —S—($R_{905}$), a group represented by —N($R_{906}$)($R_{907}$), a group represented by —COOR$_{802}$, a halogen atom, a cyano group, or a nitro group;

$R_{236}$ is a substituted or unsubstituted alkyl group having 2 to 10 carbon atoms, or a substituted or unsubstituted cycloalkyl group having 3 to 10 ring carbon atoms;

$L_{230}$ is a substituted or unsubstituted arylene group having 6 to 50 ring carbon atoms, a substituted or unsubstituted divalent heterocyclic group having 5 to 50 ring atoms, or a substituted or unsubstituted fluorenylene group;

$R_{904}$, $R_{905}$, $R_{906}$, $R_{907}$ and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different; and when a plurality of $R_{802}$ are present, the plurality of $R_{802}$ are mutually the same or different.

In the organic EL device according to the third exemplary embodiment, it is also preferable that the second electron transporting-zone material is a compound represented by the following formula (E11).

[Formula 34]

(E11)

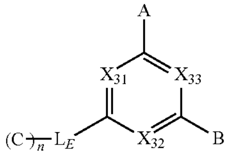

In the formula (E11):

$X_{31}$, $X_{32}$, and $X_{33}$ are each independently a nitrogen atom or $CR_E$;

at least one of $X_{31}$, $X_{32}$, or $X_{33}$ is a nitrogen atom;

$R_E$ is a hydrogen atom, a cyano group, a substituted or unsubstituted alkyl group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a substituted or unsubstituted aryl group having 6 to 50 ring carbon atoms, or a substituted or unsubstituted heterocyclic group having 5 to 50 ring atoms;

when a plurality of $R_E$ are present, the plurality of $R_E$ are mutually the same or different;

A is a substituted or unsubstituted aryl group having 6 to 18 ring carbon atoms, or a substituted or unsubstituted heterocyclic group having 5 to 13 ring atoms;

B is a substituted or unsubstituted aryl group having 6 to 18 ring carbon atoms, or a substituted or unsubstituted heterocyclic group having 5 to 13 ring atoms;

$L_E$ is a single bond, a substituted or unsubstituted (n+1)-valent aromatic hydrocarbon ring group having 6 to 18 ring carbon atoms, a substituted or unsubstituted (n+1)-valent heterocyclic group having 5 to 13 ring atoms, or an (n+1)-valent group having a structure in which two or three mutually different groups selected from the group consisting of a substituted or unsubstituted aromatic hydrocarbon ring group having 6 to 18 ring carbon atoms and a substituted or unsubstituted heterocyclic group having 5 to 13 ring atoms are bonded to each other;

C is a substituted or unsubstituted aryl group having 6 to 30 ring carbon atoms, or a substituted or unsubstituted heterocyclic group having 5 to 50 ring atoms;

n is 1, 2, or 3;

when n is 2 or more, $L_E$ is not a single bond;

when n is 2 or more, the plurality of C are mutually the same or different;

$R_{901}$, $R_{902}$, $R_{903}$, and $R_{904}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different; and when a plurality of $R_{904}$ are present, the plurality of $R_{904}$ are mutually the same or different.

In the organic EL device according to the third exemplary embodiment, it is also preferable that the second electron transporting-zone material is a compound represented by the following formula (E12).

[Formula 35]

(E12)

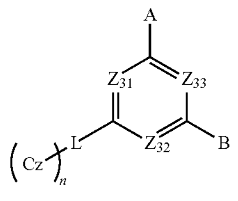

In the formula (E12):

$Z_{31}$, $Z_{32}$, and $Z_{33}$ are each independently a nitrogen atom or $CR_E$;

two or three of $Z_{31}$, $Z_{32}$, and $Z_{33}$ are each a nitrogen atom;

$R_E$ is a hydrogen atom, a cyano group, a substituted or unsubstituted alkyl group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a substituted or unsubstituted aryl group having 6 to 50 ring carbon atoms, or a substituted or unsubstituted heterocyclic group having 5 to 50 ring atoms;

A is a substituted or unsubstituted aryl group having 6 to 18 ring carbon atoms, or a substituted or unsubstituted heterocyclic group having 5 to 13 ring atoms;

B is a substituted or unsubstituted aryl group having 6 to 18 ring carbon atoms, or a substituted or unsubstituted heterocyclic group having 5 to 13 ring atoms;

L is a single bond, a substituted or unsubstituted (n+1)-valent aromatic hydrocarbon ring group having 6 to 18 ring carbon atoms, a substituted or unsubstituted (n+1)-valent heterocyclic group having 5 to 13 ring atoms, or an (n+1)-valent group having a structure in which two or more mutually different substituted or unsubstituted aromatic hydrocarbon rings are bonded to each other:

Cz is a group represented by a formula (Cz1), (Cz2), or (Cz3) below;

n is 1, 2, or 3; and when n is 2 or 3, the plurality of Cz are mutually the same or different.

[Formula 36]

(Cz1)

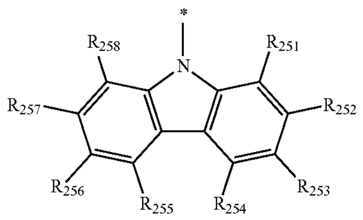

[Formula 37]

(Cz2)

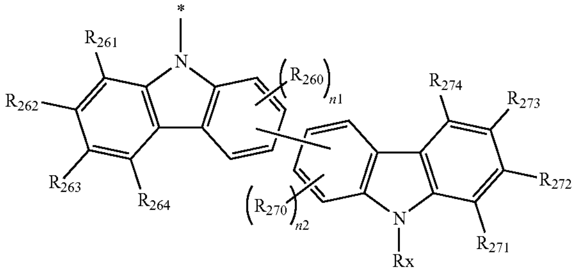

[Formula 38]

(Cz3)

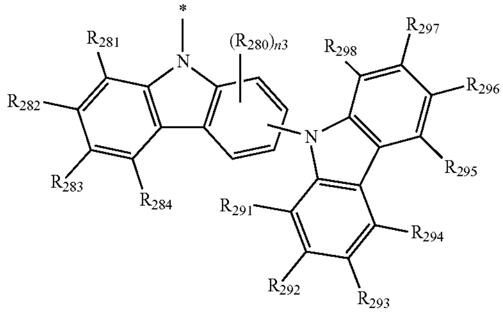

In the formulae (Cz1), (Cz2), and (Cz3):

at least one combination of adjacent two or more of $R_{251}$ to $R_{258}$ are mutually bonded to form a substituted or unsubstituted monocyclic ring, mutually bonded to form a substituted or unsubstituted fused ring, or not mutually bonded; and at least one combination of adjacent two or more of $R_{260}$ to $R_{264}$ are mutually bonded to form a substituted or unsubstituted monocyclic ring, mutually bonded to form a substituted or unsubstituted fused ring, or not mutually bonded; and at least one combination of adjacent two or more of $R_{270}$ to $R_{274}$ and RX are mutually bonded to form a substituted or unsubstituted monocyclic ring, mutually bonded to form a substituted or unsubstituted fused ring, or not mutually bonded;

and at least one combination of adjacent two or more of $R_{280}$ to $R_{284}$ are mutually bonded to form a substituted or unsubstituted monocyclic ring, mutually bonded to form a substituted or unsubstituted fused ring, or not mutually bonded; and at least one combination of adjacent two or more of $R_{291}$ to $R_{298}$ are mutually bonded to form a substituted or unsubstituted monocyclic ring, mutually bonded to form a substituted or unsubstituted fused ring, or not mutually bonded; and $R_{251}$ to $R_{258}$, $R_{260}$ to $R_{264}$, $R_{270}$ to $R_{274}$, RX, $R_{280}$ to $R_{284}$, and $R_{291}$ to $R_{298}$ forming neither the substituted or unsubstituted monocyclic ring nor the substituted or unsubstituted fused ring are each independently a hydrogen atom, a cyano group, a substituted or unsubstituted alkyl group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a substituted or unsubstituted aryl group having 6 to 50 ring carbon atoms, or a substituted or unsubstituted heterocyclic group having 5 to 50 ring atoms;

n1, n2, and n3 are each 3;

three $R_{260}$ are mutually the same or different;

three $R_{270}$ are mutually the same or different;

three $R_{280}$ are mutually the same or different;

* in each of the formulae (Cz1), (Cz2), and (Cz3) is bonded to L; and $R_{901}$, $R_{902}$, $R_{903}$, and $R_{904}$ are as defined for the formula (E11).

In the organic EL device according to the third exemplary embodiment, it is also preferable that the second electron transporting-zone material is a compound represented by the following formula (E121).

[Formula 39]

(E121)

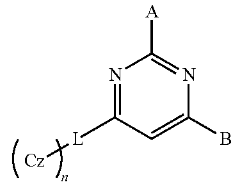

In the formula (E121):

A, B, and L are as defined for the formula (E12);

Cz is as defined for the formula (E12);

n is 1, 2, or 3; and when n is 2 or 3, a plurality of Cz are mutually the same or different.

In the organic EL device according to the third exemplary embodiment, it is also preferable that the second electron transporting-zone material is a compound represented by the following formula (E122).

[Formula 40]

(E122)

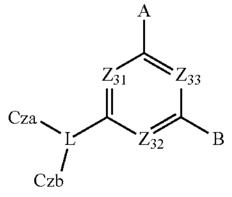

In the formula (E122):

A and B are as defined for the formula (E12);

$Z_{31}$, $Z_{32}$, and $Z_{33}$ are as defined for the formula (E12);

Cza and Czb are each independently a group represented by the formula (Cz1), (Cz2), or (Cz3);

L is a single bond, a substituted or unsubstituted trivalent aromatic hydrocarbon ring group having 6 to 18 ring carbon atoms, a substituted or unsubstituted trivalent heterocyclic group having 5 to 13 ring atoms, or a trivalent group having a structure in which two or more mutually different substituted or unsubstituted aromatic hydrocarbon rings are bonded to each other.

In the organic EL device according to the third exemplary embodiment, it is preferable that $L_E$ or L in each formula representing the second electron transporting-zone material is a single bond, or a substituted or unsubstituted (n+1)-valent aromatic hydrocarbon ring group having 6 to 12 ring carbon atoms.

In the organic EL device according to the third exemplary embodiment, it is also preferable that the second electron transporting-zone material is a compound represented by the following formula (E13).

[Formula 41]

(E13)

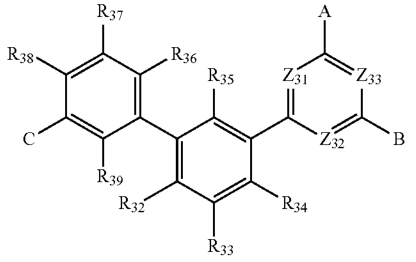

In the formula (E13):

A, B, and C are as defined for the formula (E11);

$Z_{31}$, $Z_{32}$, and $Z_{33}$ are as defined for the formula (E11) or (E12);

at least one combination of adjacent two or more of $R_{32}$ to $R_{39}$ are mutually bonded to form a substituted or unsubstituted monocyclic ring, mutually bonded to form a substituted or unsubstituted fused ring, or not mutually bonded; and $R_{32}$ to $R_{39}$ forming neither the substituted or unsubstituted monocyclic ring nor the substituted or unsubstituted fused ring are each independently a hydrogen atom, a cyano group, a substituted or unsubstituted alkyl group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a substituted or unsubstituted aryl group having 6 to 50 ring carbon atoms, or a substituted or unsubstituted heterocyclic group having 5 to 50 ring atoms; and $R_{901}$, $R_{902}$, $R_{903}$, and $R_{904}$ are as defined for the formula (E11).

In the organic EL device according to the third exemplary embodiment, it is also preferable that the second electron transporting-zone material is a compound represented by the following formula (E131).

[Formula 42]

(E131)

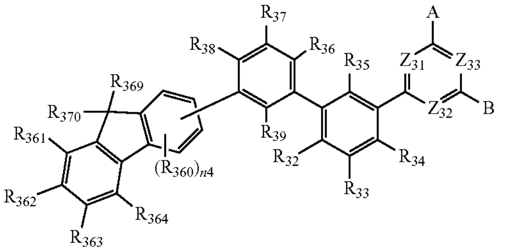

In the formula (E131):

A and B as defined for the formula (E11);

$Z_{31}$, $Z_{32}$, and $Z_{33}$ are as defined for the formula (E11) or (E12);

$R_{32}$ to $R_{39}$ are as defined for the formula (E13);

at least one combination of adjacent two or more of $R_{360}$ to $R_{364}$ are mutually bonded to form a substituted or unsubstituted monocyclic ring, mutually bonded to form a substituted or unsubstituted fused ring, or not mutually bonded; and a combination of $R_{369}$ and $R_{370}$ are mutually bonded to form a substituted or unsubstituted monocyclic ring, mutually bonded to form a substituted or unsubstituted fused ring, or not mutually bonded; and $R_{360}$ to $R_{364}$, $R_{369}$ and $R_{370}$ forming neither the substituted or unsubstituted monocyclic ring nor the substituted or unsubstituted fused ring are each independently a hydrogen atom, a cyano group, a substituted or unsubstituted alkyl group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a substituted or unsubstituted aryl group having 6 5 to 50 ring carbon atoms, or a substituted or unsubstituted heterocyclic group having 5 to 50 ring atoms;

$R_{901}$, $R_{902}$, $R_{903}$, and $R_{904}$ are as defined for the formula (E11);

n4 is 3; and three $R_{360}$ are mutually the same or different.

In the organic EL device according to the third exemplary embodiment, it is preferable that C in each formula representing the second electron transporting-zone material is a substituted or unsubstituted aryl group having 13 to 24 ring carbon atoms.

In the organic EL device according to the third exemplary embodiment, it is preferable that A in each formula representing the second electron transporting-zone material is a substituted or unsubstituted aryl group having 6 to 12 ring carbon atoms.

In the organic EL device according to the third exemplary embodiment, it is preferable that A in each formula representing the second electron transporting-zone material is a substituted or unsubstituted phenyl group, a substituted or unsubstituted biphenyl group, or a substituted or unsubstituted naphthyl group.

In the organic EL device according to the third exemplary embodiment, it is preferable that A in each formula representing the second electron transporting-zone material is a phenyl group, a biphenyl group, or a naphthyl group.

In the organic EL device according to the third exemplary embodiment, it is preferable that B in each formula representing the second electron transporting-zone material is a substituted or unsubstituted aryl group having 6 to 12 ring carbon atoms.

In the organic EL device according to the third exemplary embodiment, it is preferable that B in each formula representing the second electron transporting-zone material is a substituted or unsubstituted phenyl group, a substituted or unsubstituted biphenyl group, or a substituted or unsubstituted naphthyl group.

In the organic EL device according to the third exemplary embodiment, it is preferable that the second electron transporting-zone material does not have a substituted or unsubstituted pyridine ring in its molecule.

In the organic EL device according to the third exemplary embodiment, it is preferable that the second electron transporting-zone material does not have a substituted or unsubstituted imidazole ring in its molecule.

Method for Producing Electron Transporting-Zone Material

The electron transporting-zone material in the third exemplary embodiment can be produced by a well-known method or can be produced according to this method using a known alternative reaction and raw materials suitable for the target material.

Specific Examples of Electron Transporting-Zone Material

Specific examples of the electron transporting-zone material in the third exemplary embodiment include compounds shown below.

However, the invention is not limited to these specific examples.

[Formula 43]

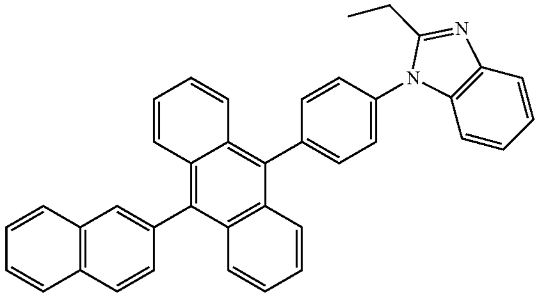

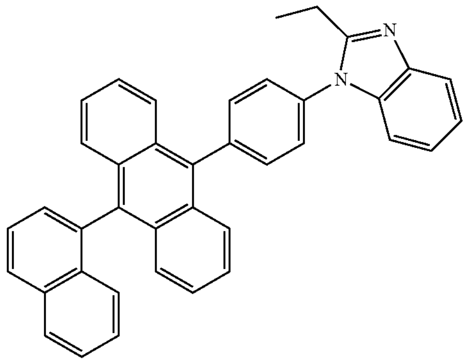

-continued
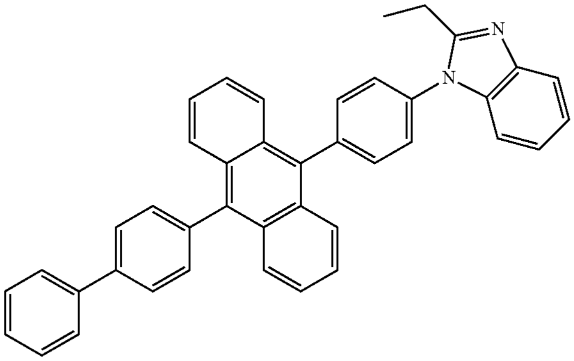
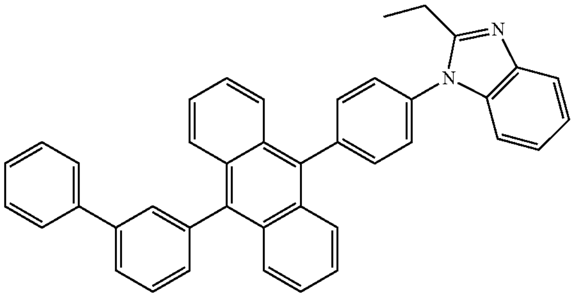
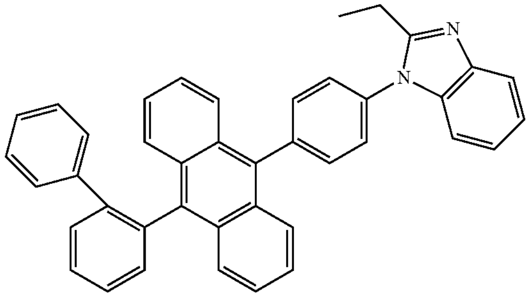
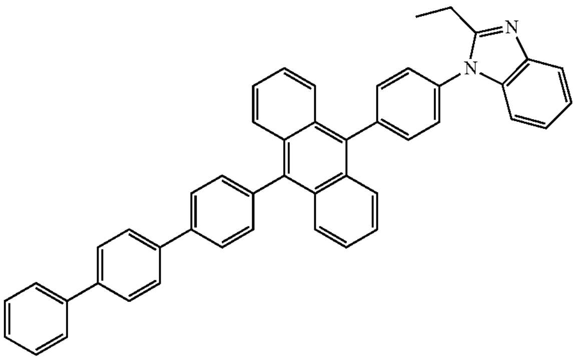
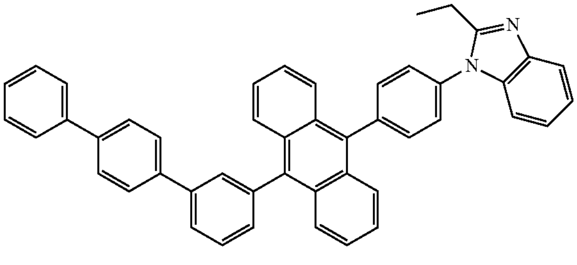
-continued
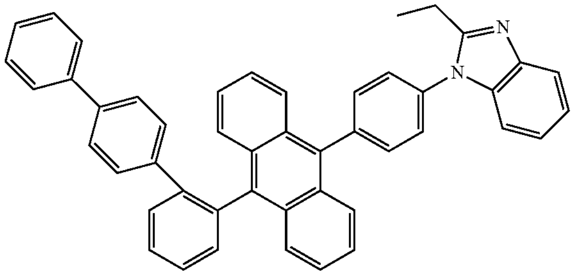
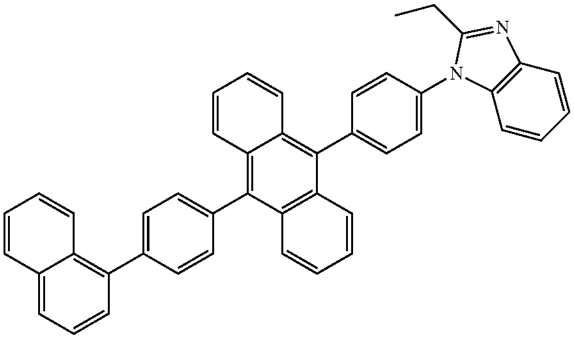
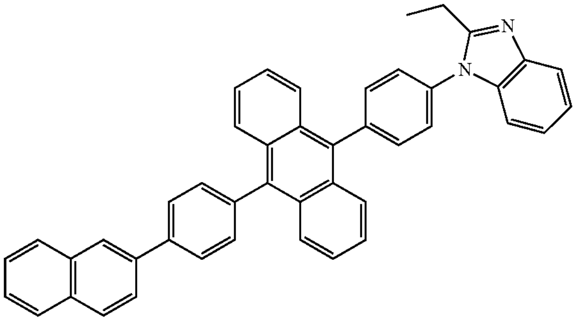
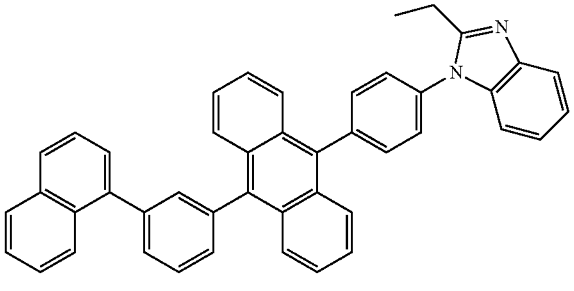
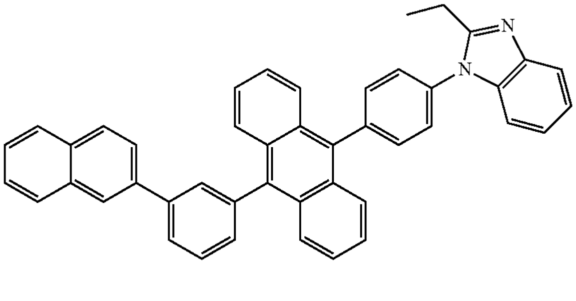

-continued
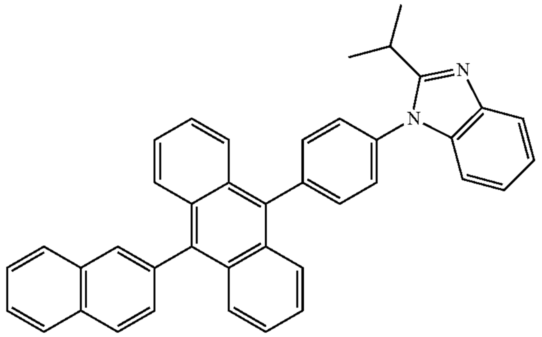
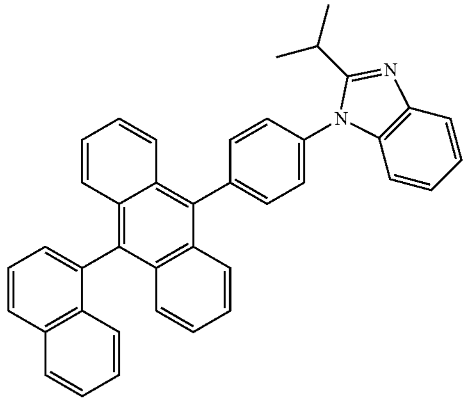
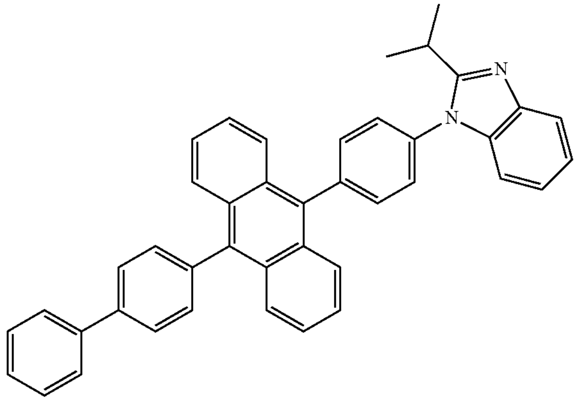
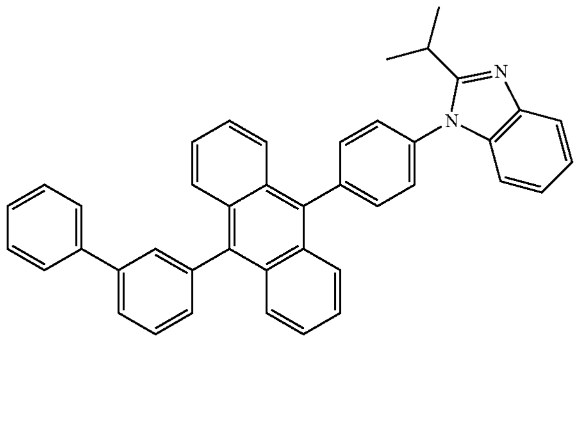
-continued
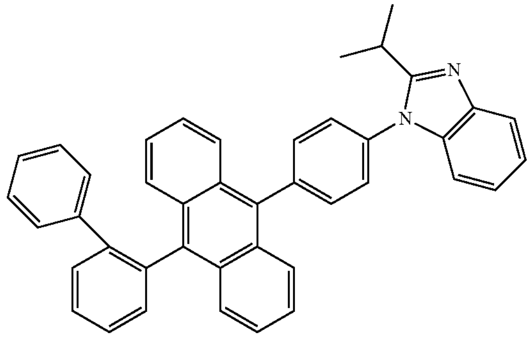
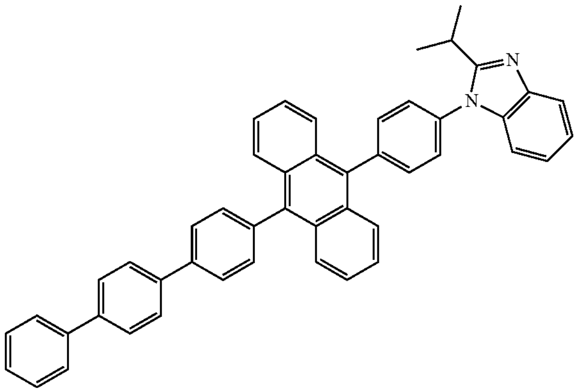
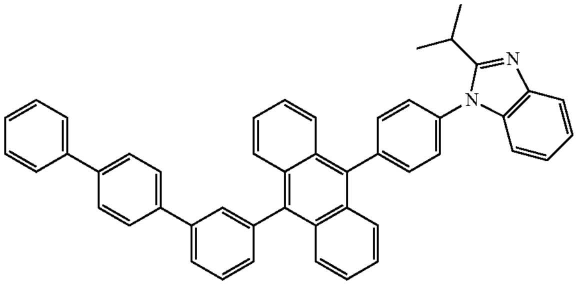
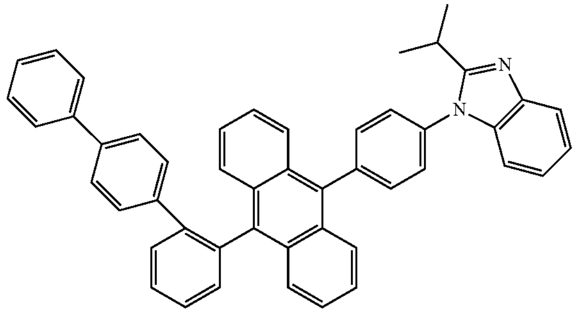
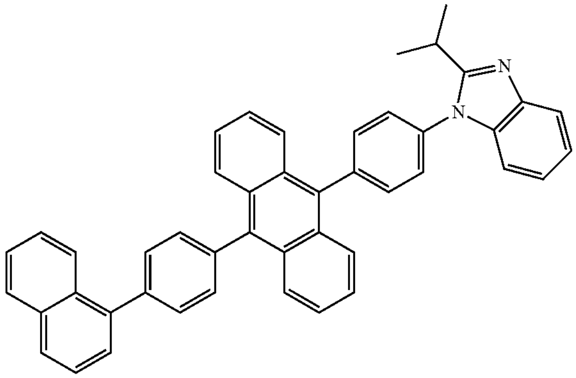

-continued
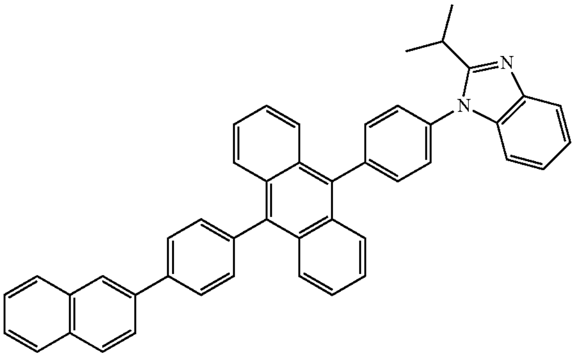
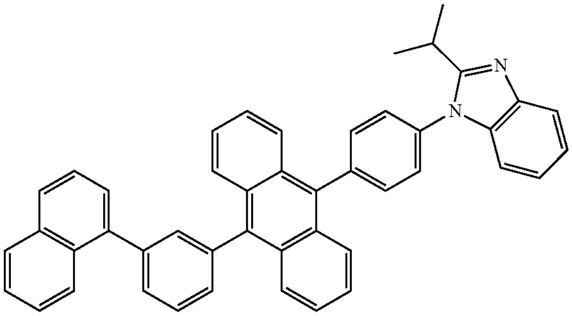
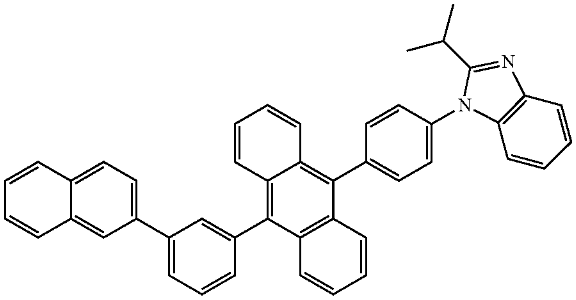
[Formula 44]
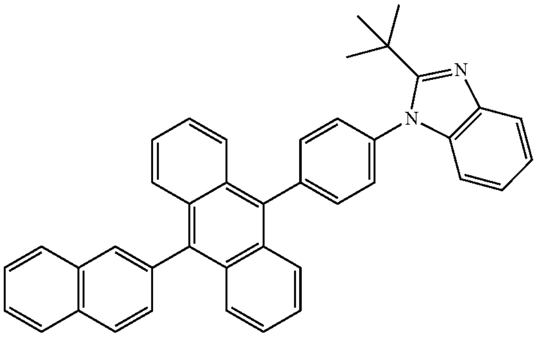
-continued
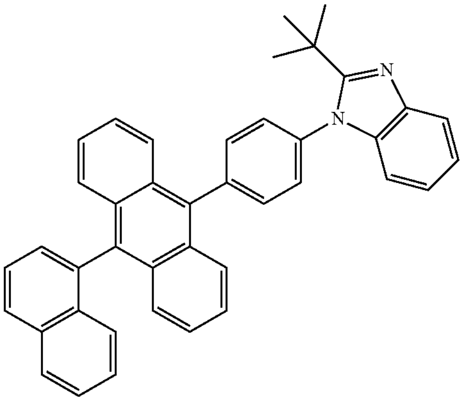
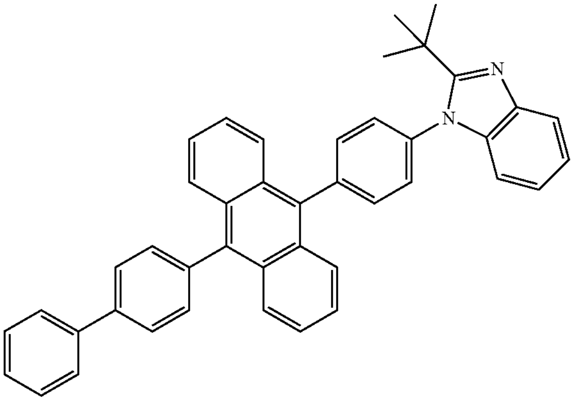
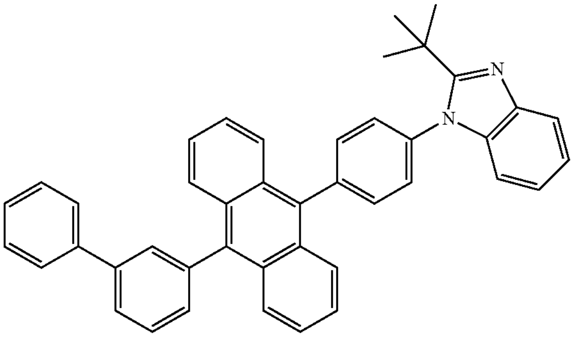
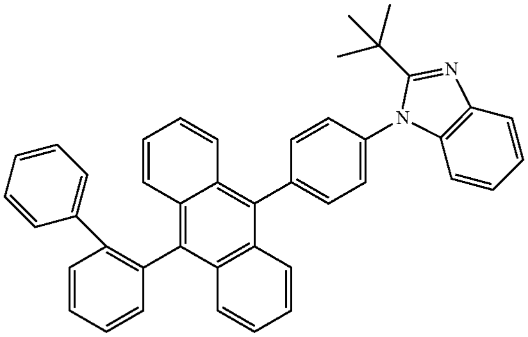

-continued
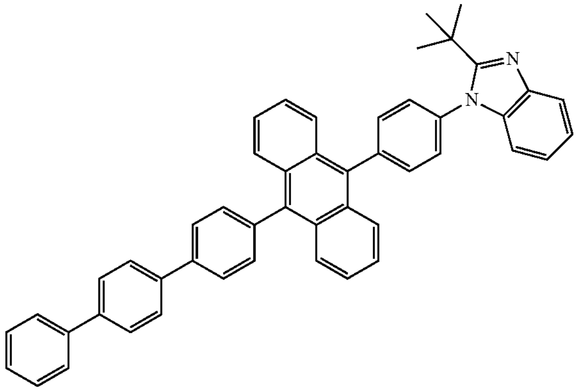
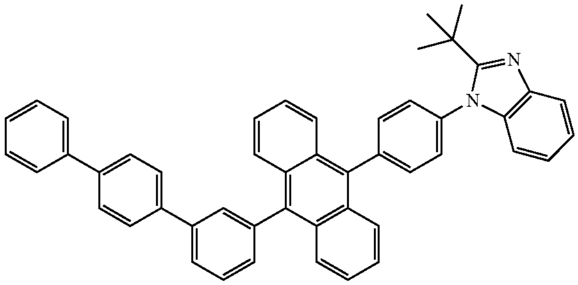
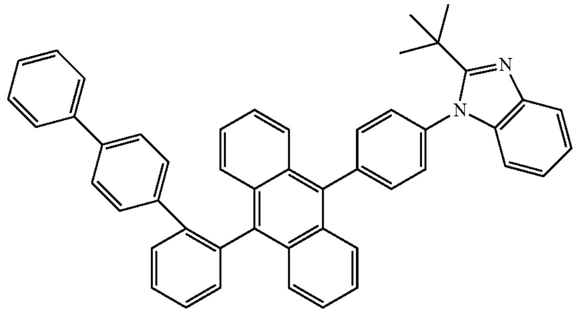
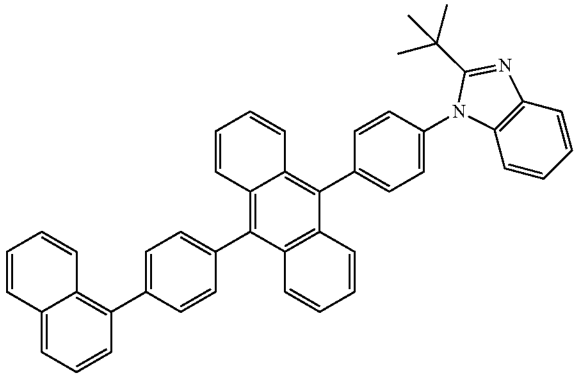
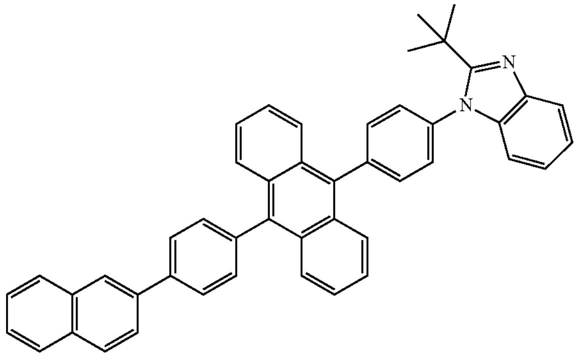
-continued
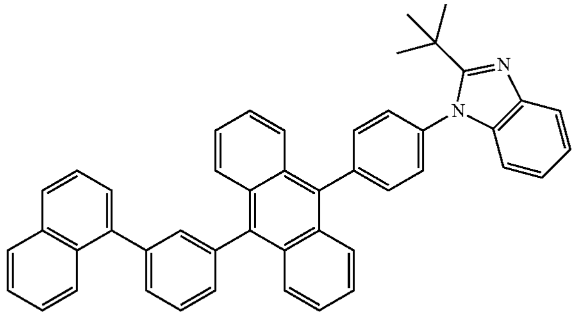
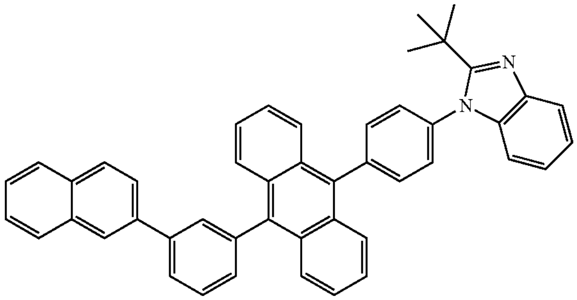
[Formula 45]
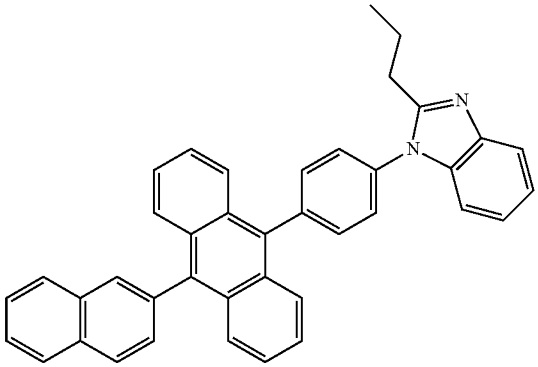
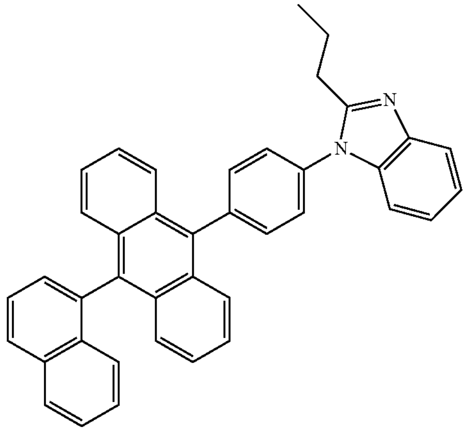

-continued
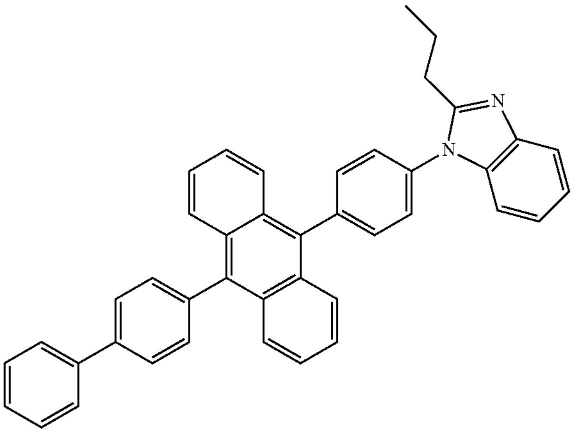
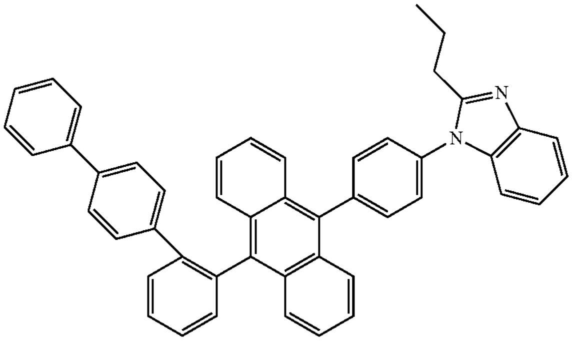
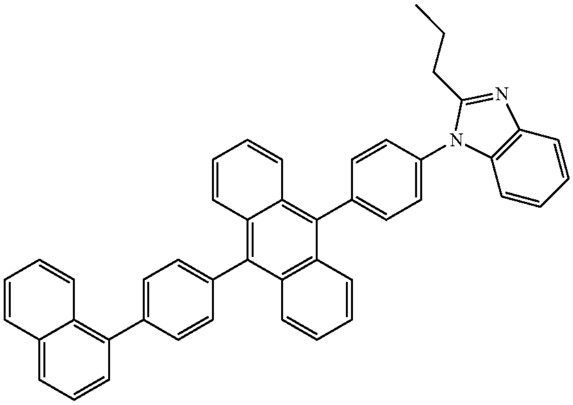
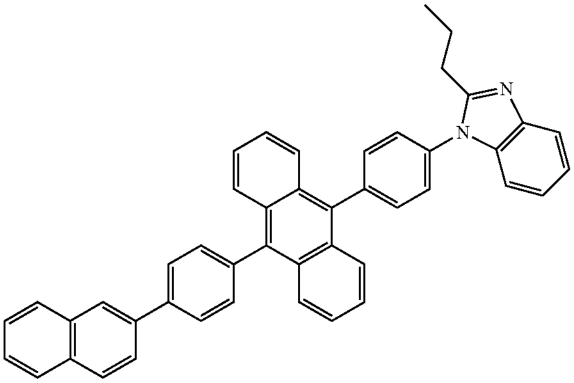
-continued
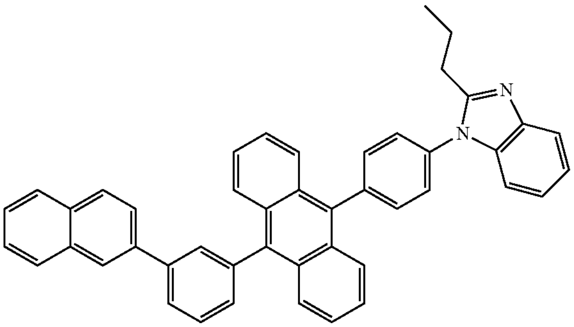
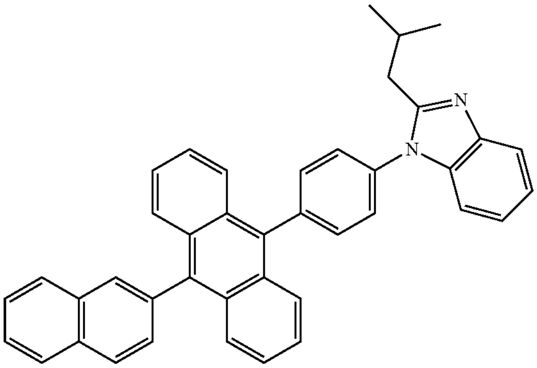
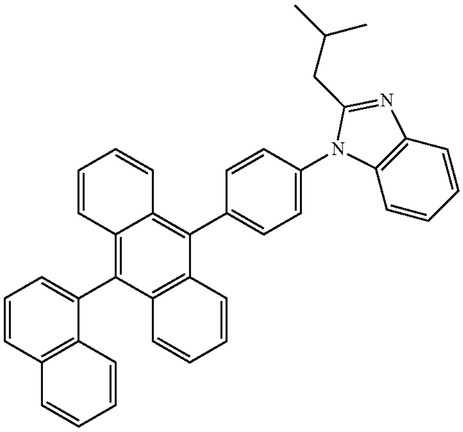
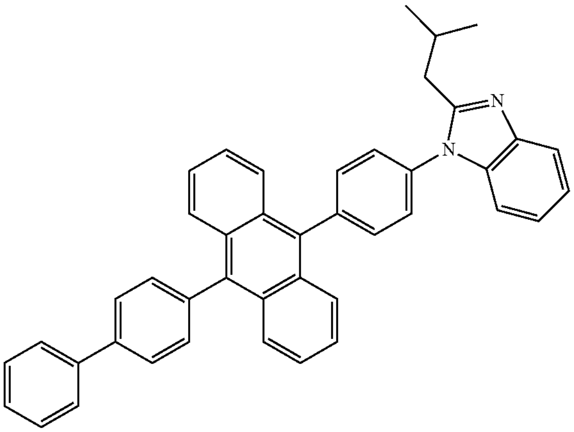

-continued
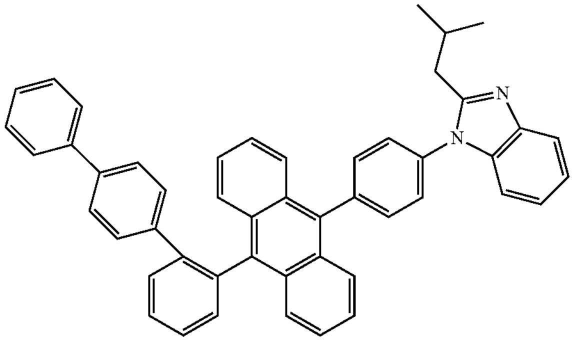
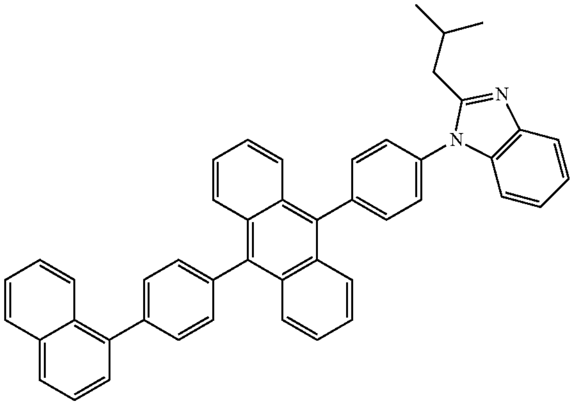
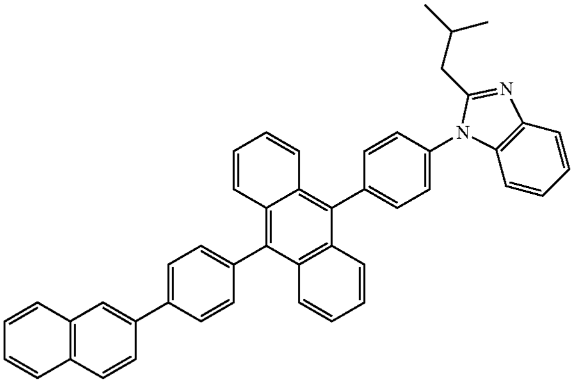
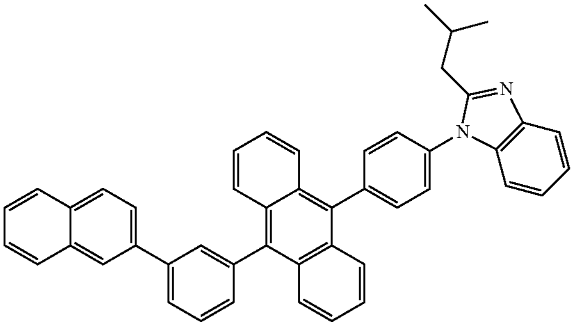
-continued
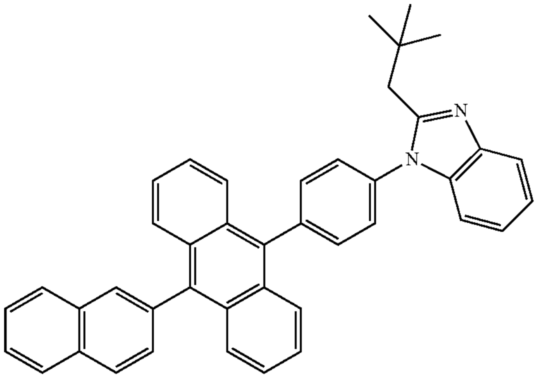
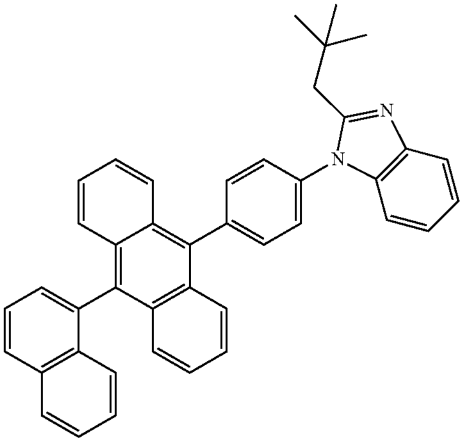
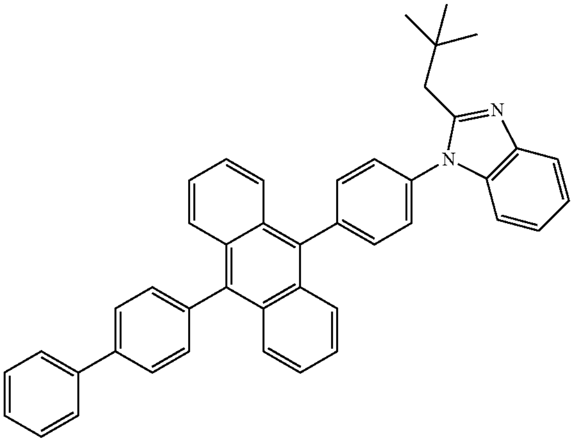
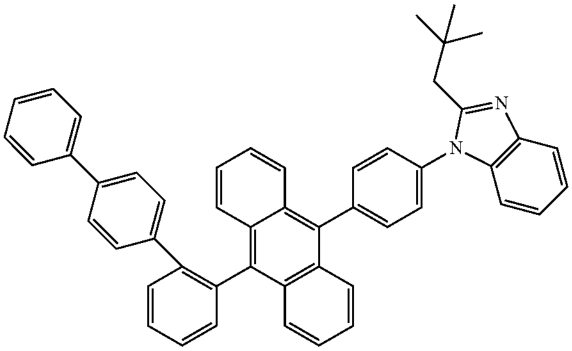

-continued
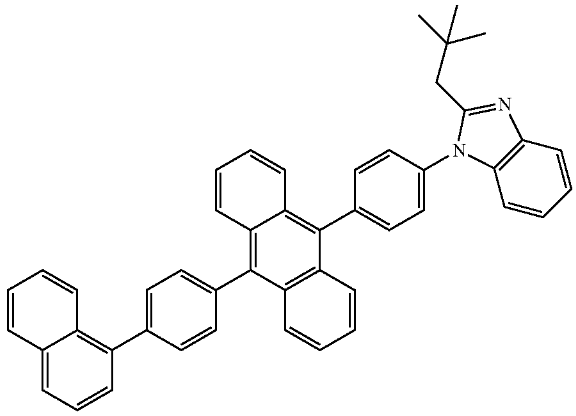
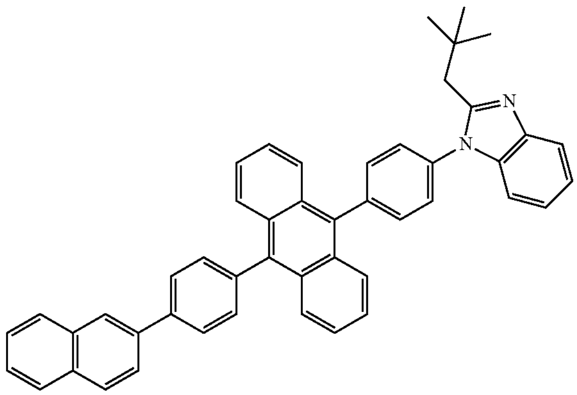
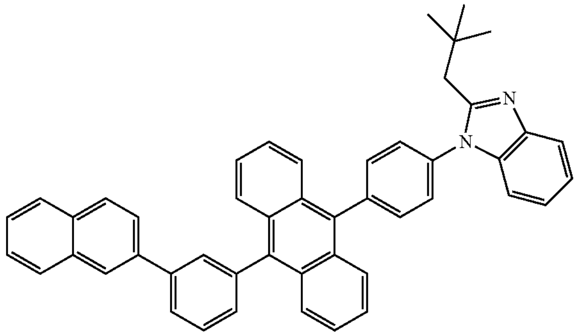
[Formula 46]
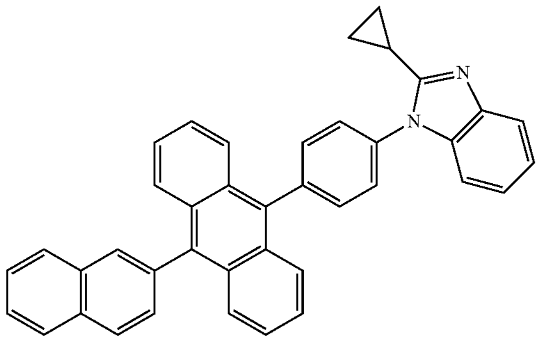
-continued
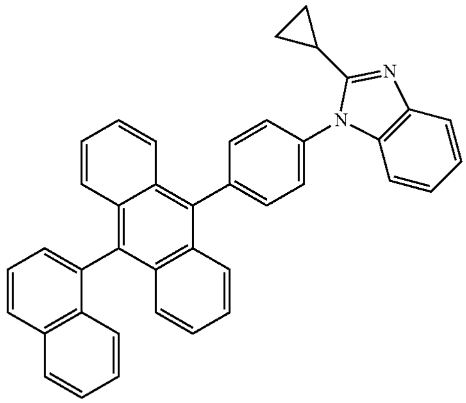
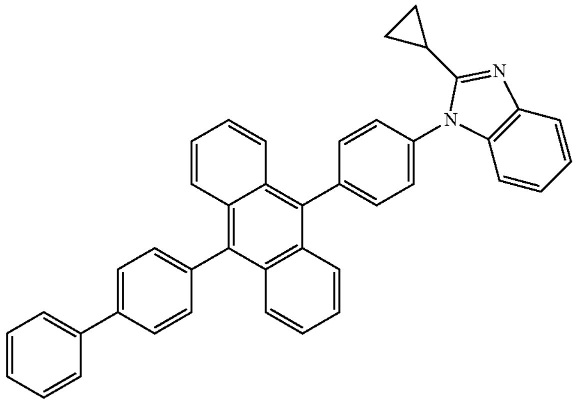
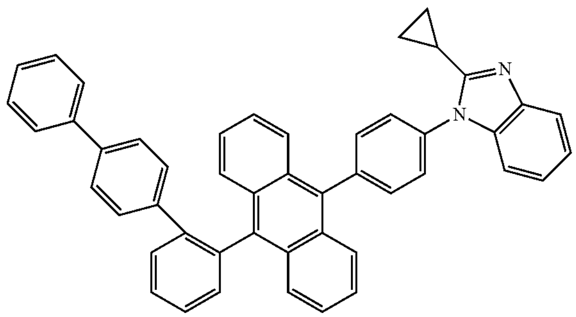
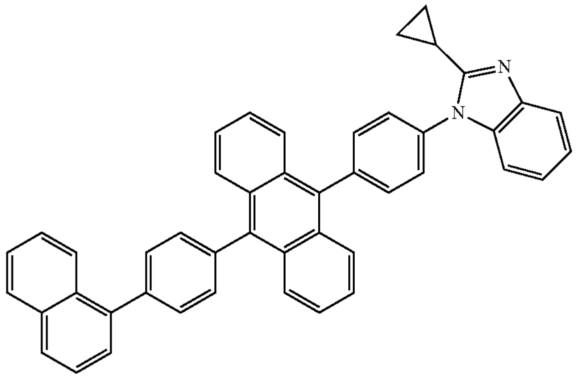

-continued
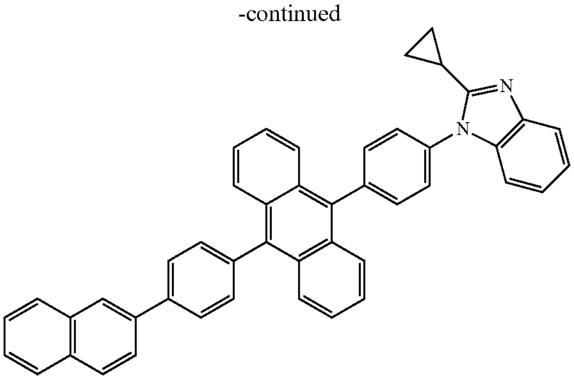
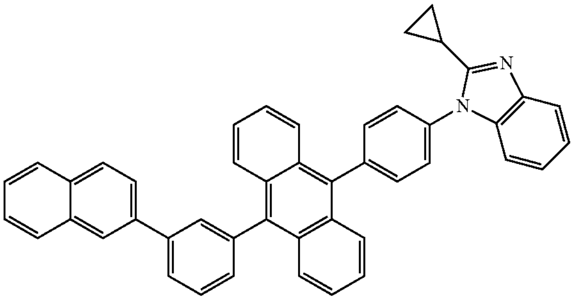
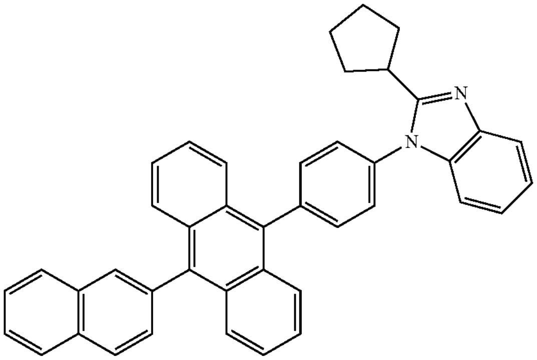
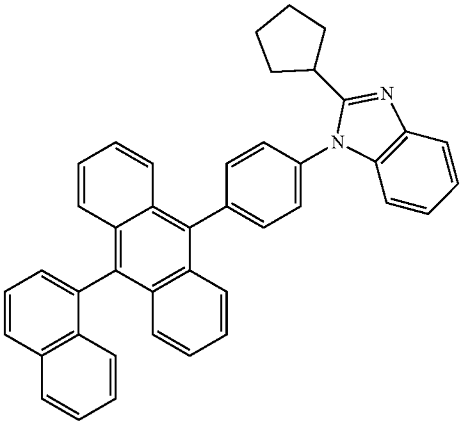
-continued
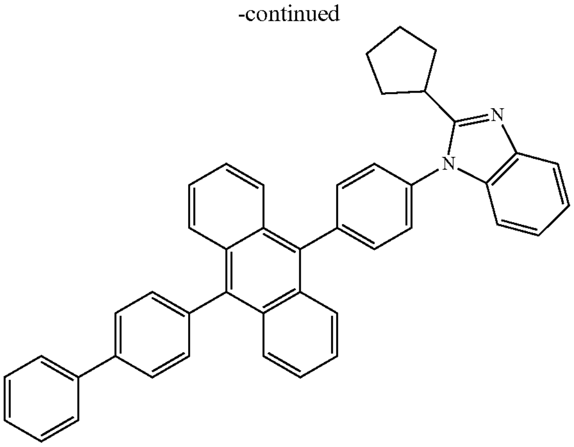
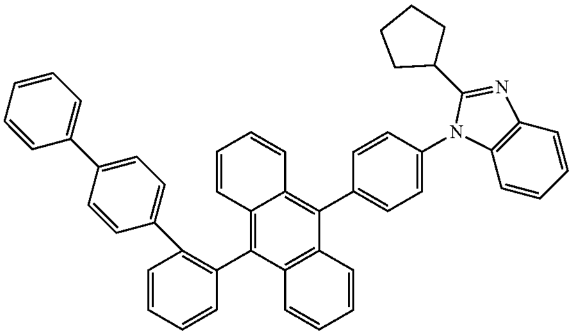
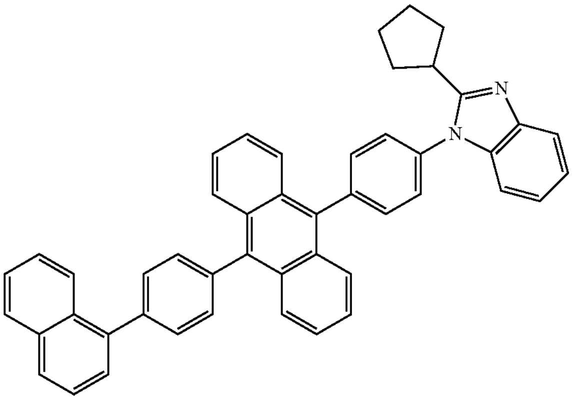
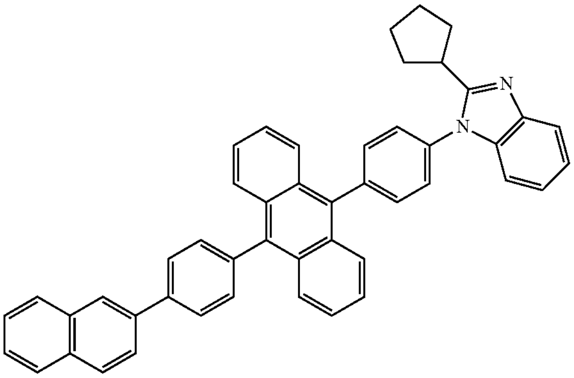

-continued
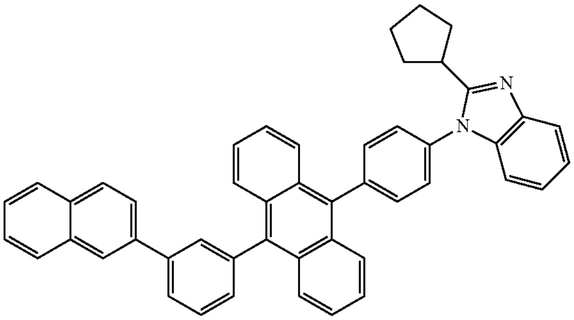
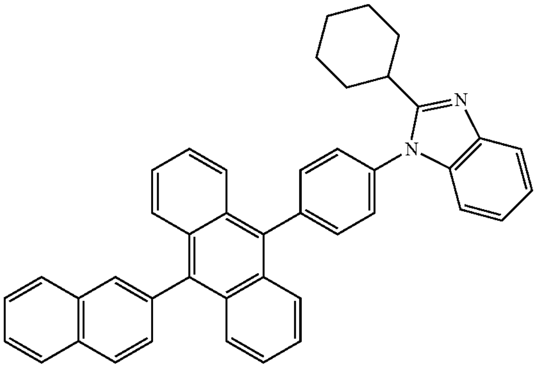
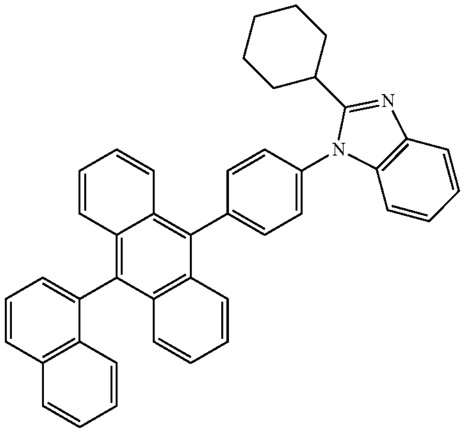
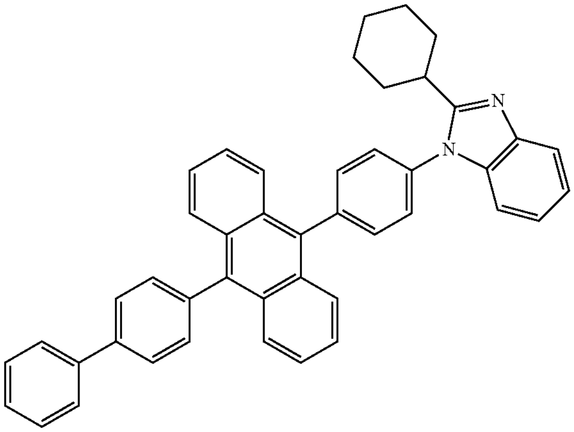
-continued
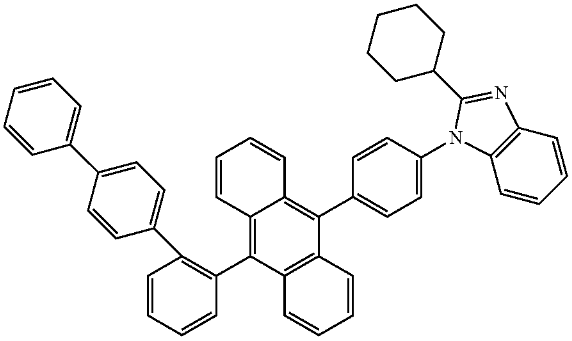
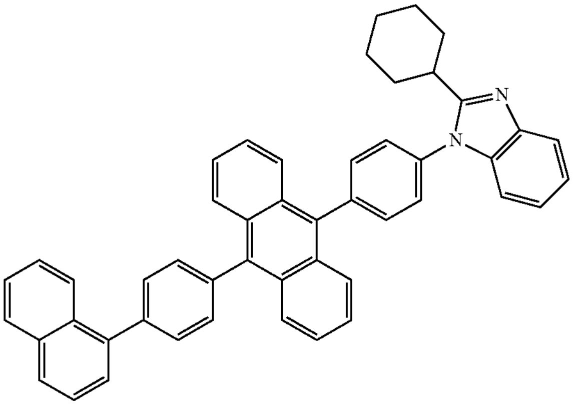
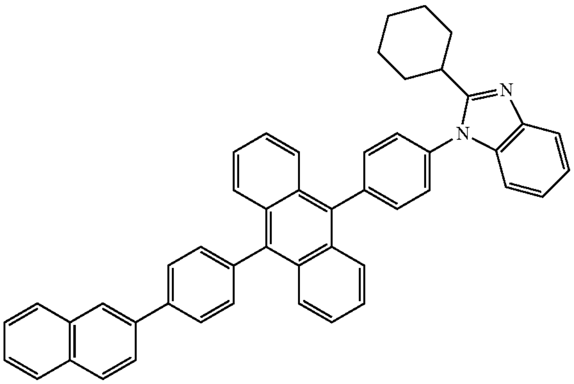
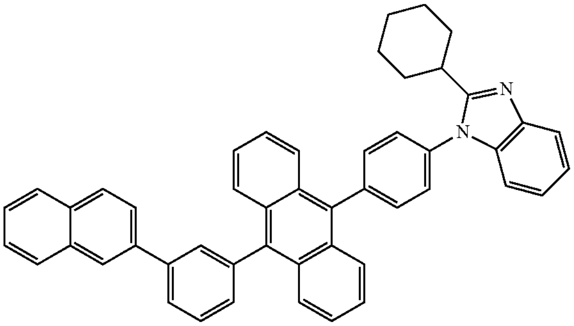

-continued
[Formula 47]
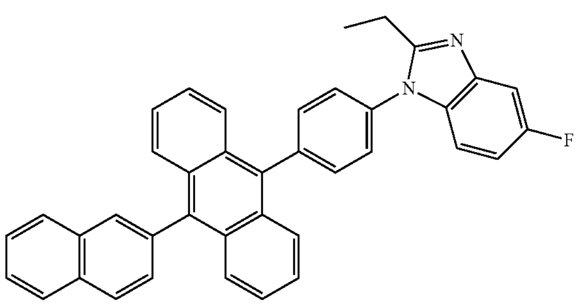
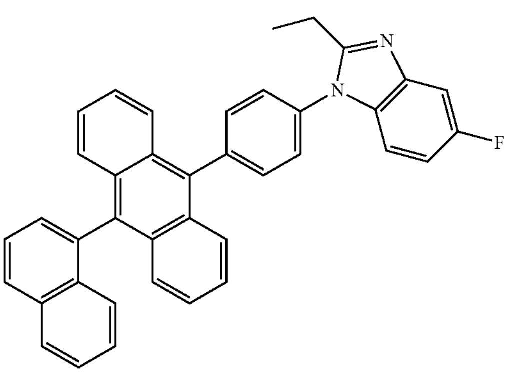
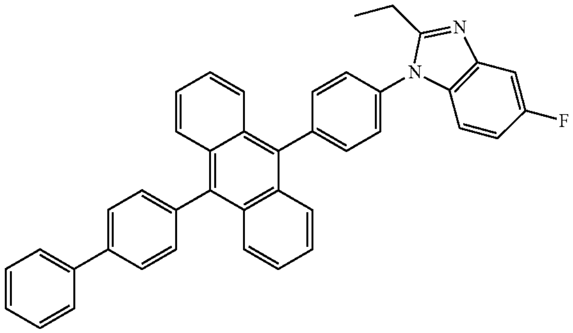
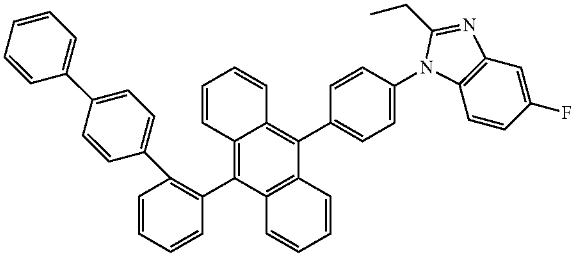
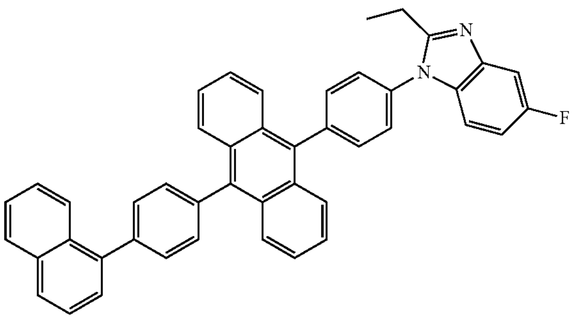
-continued
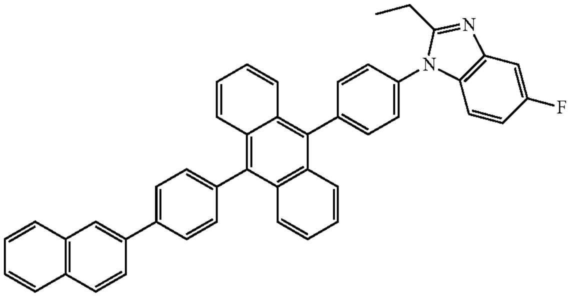
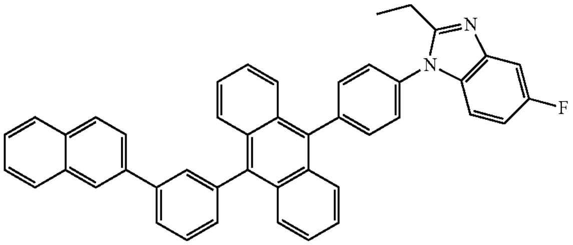
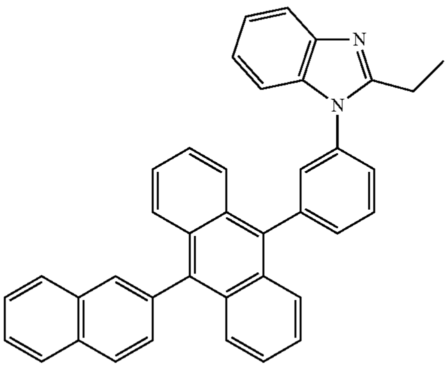
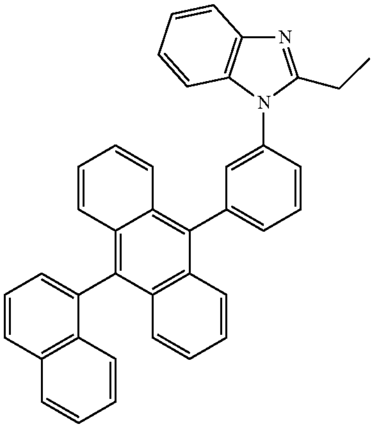

-continued
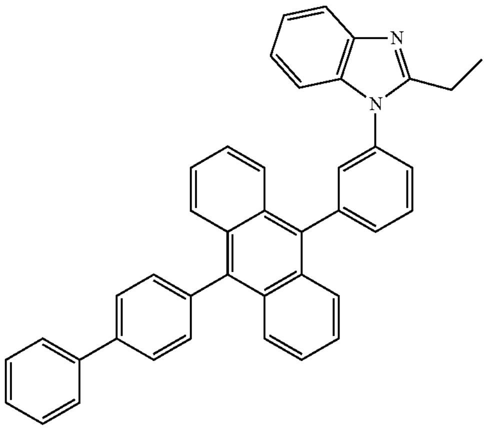
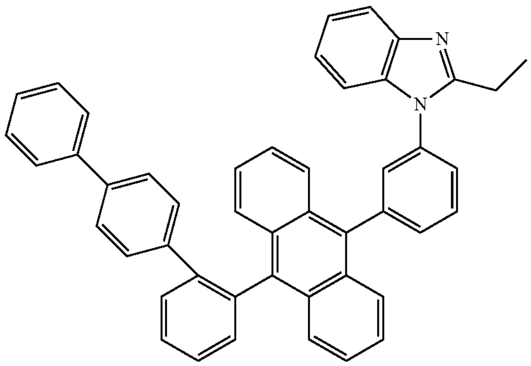
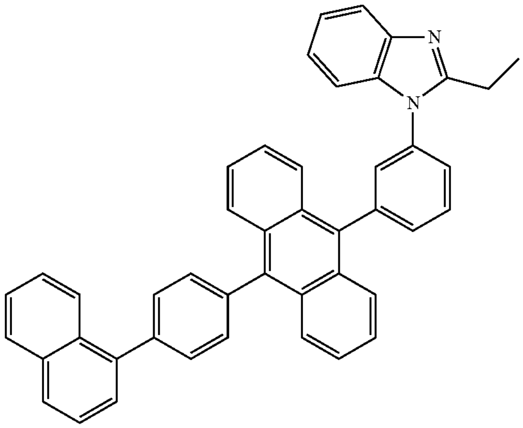
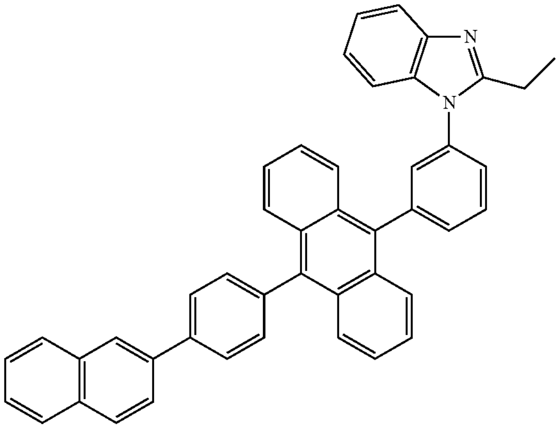
-continued
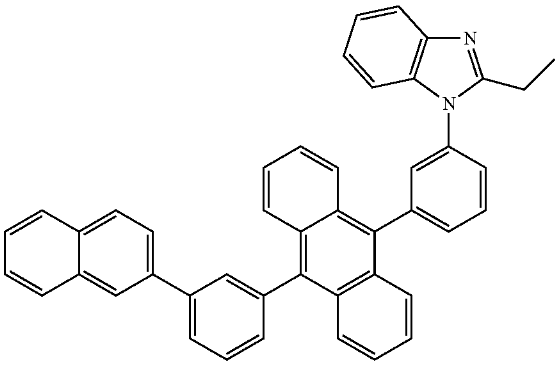
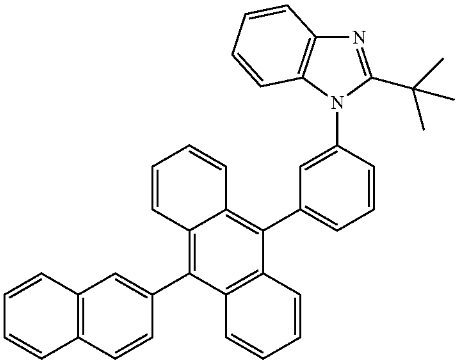
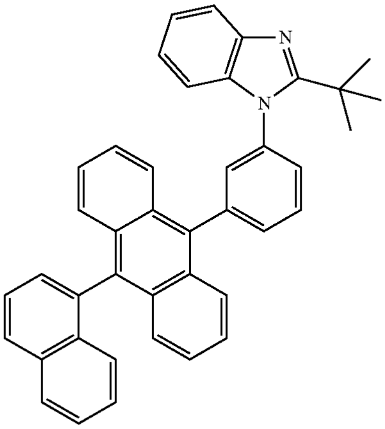
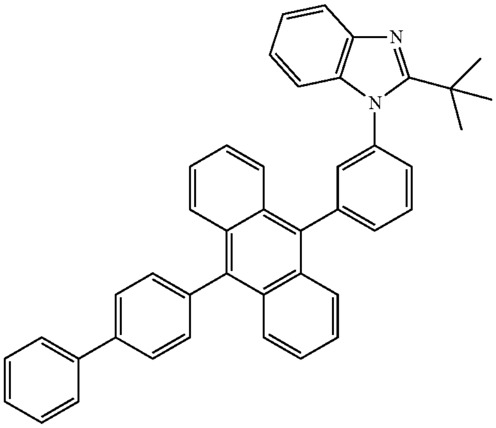

-continued
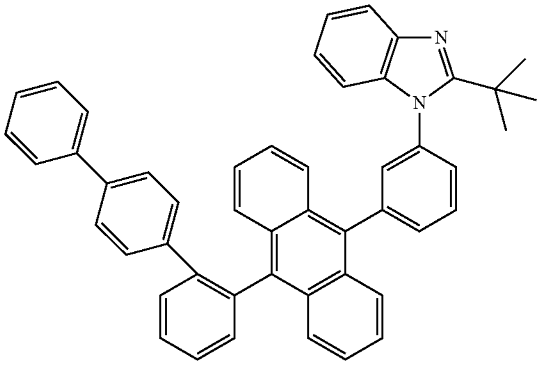
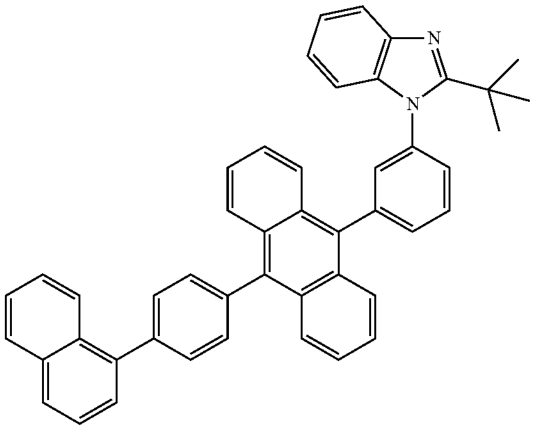
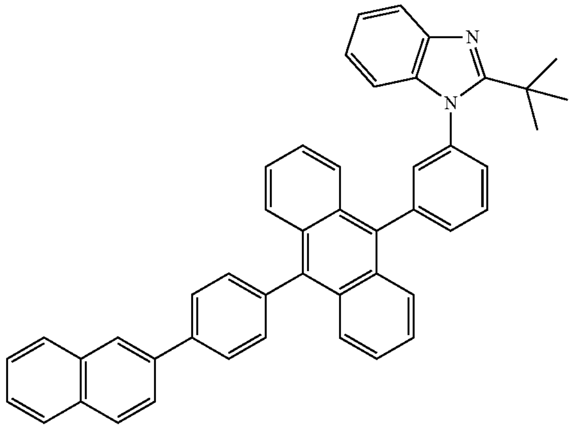
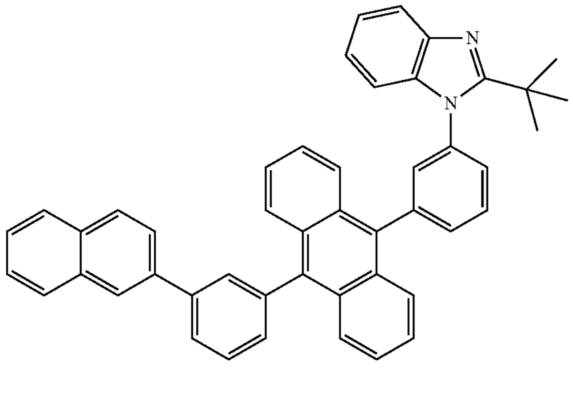
-continued
[Formula 48]
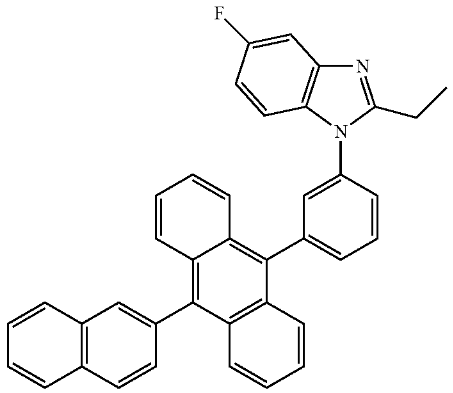
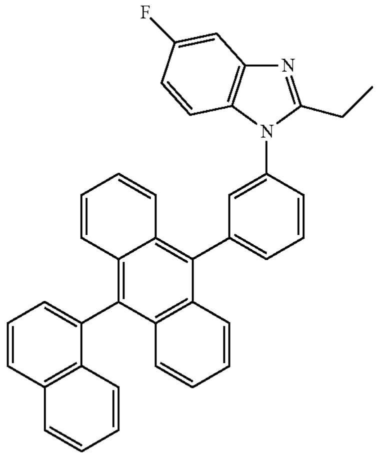
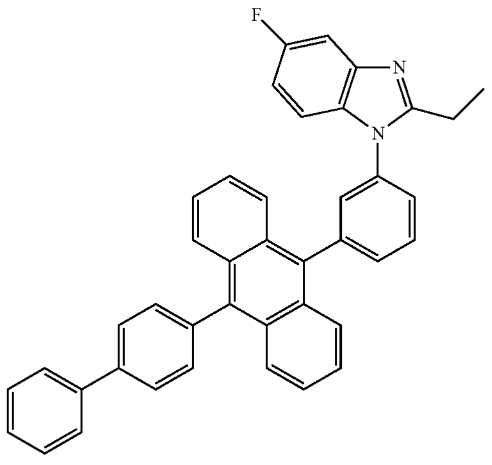

-continued
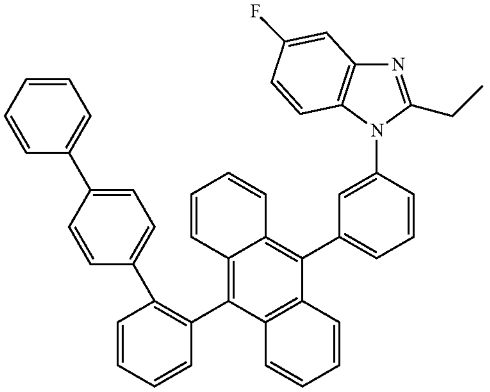
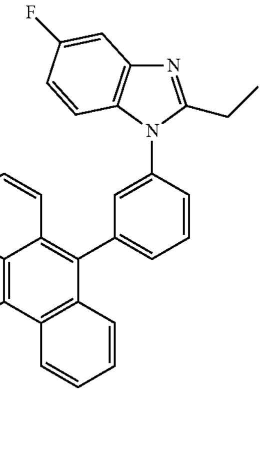
-continued
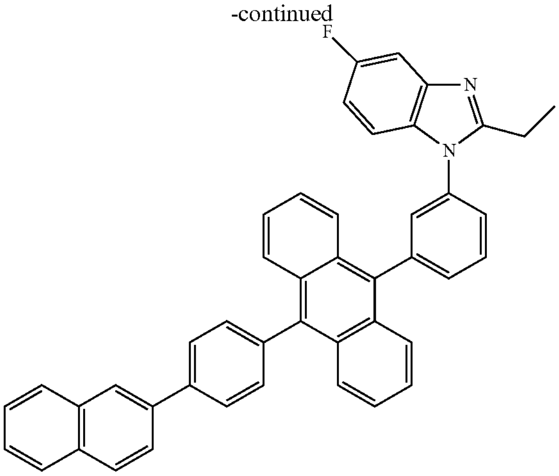
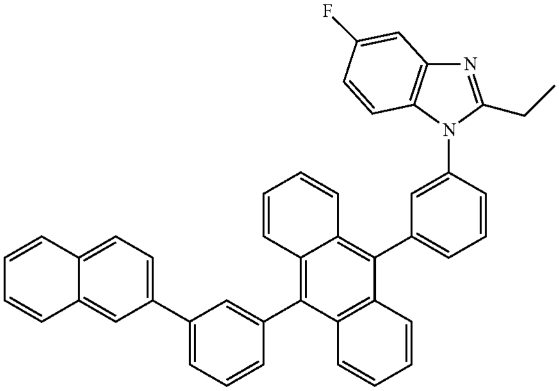
[Formula 49]
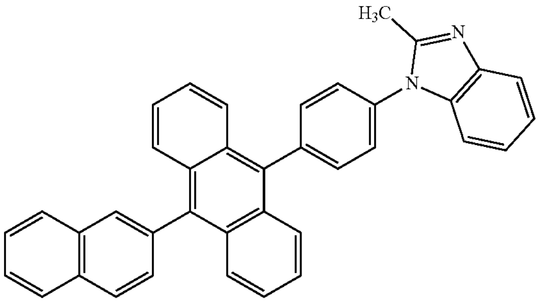
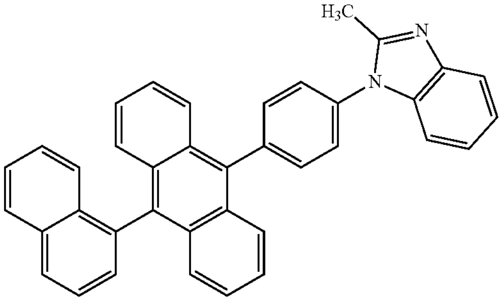

-continued
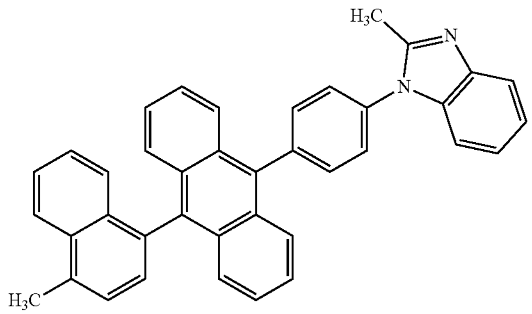
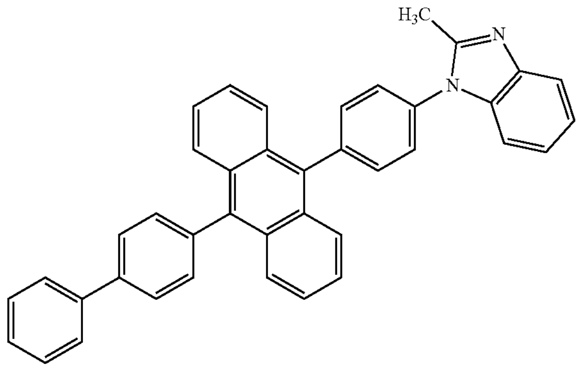
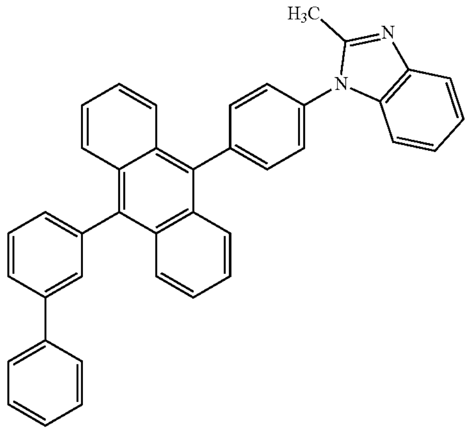
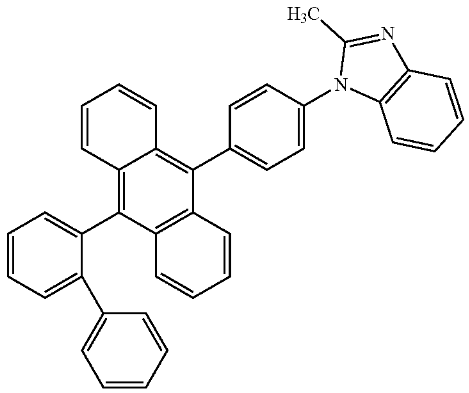

-continued
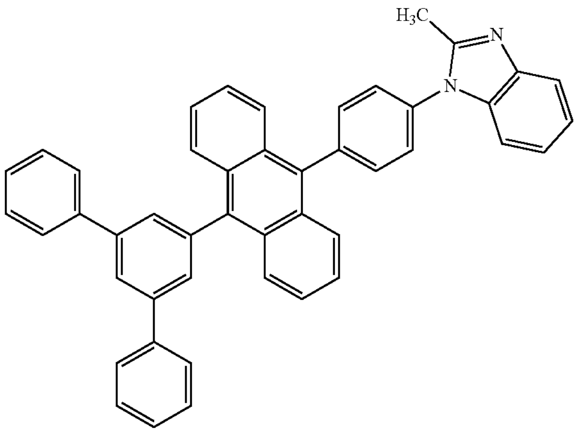
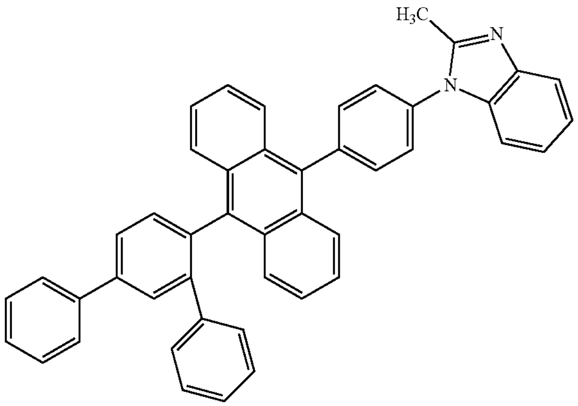
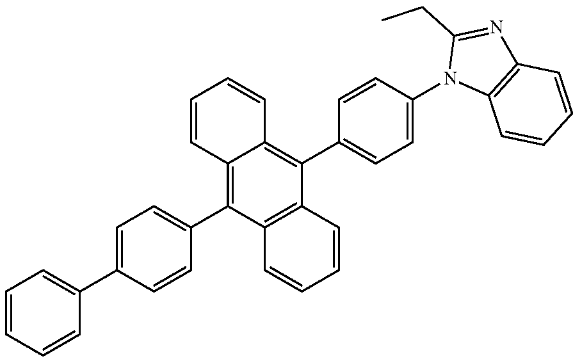
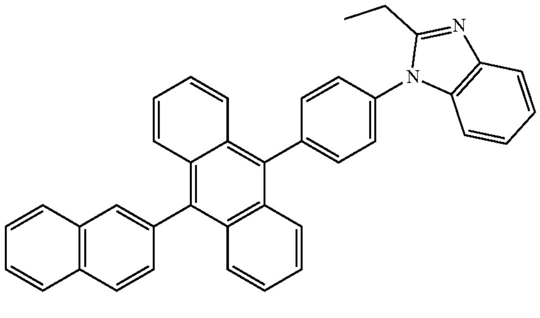

-continued
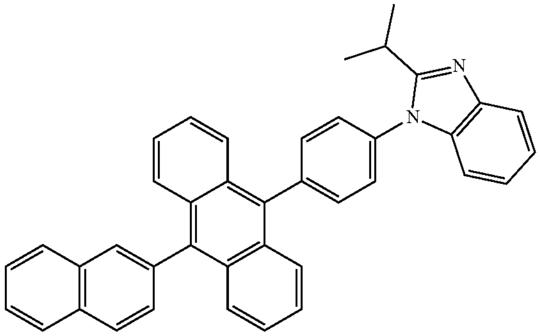
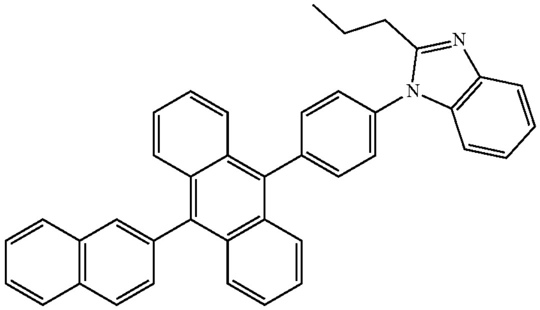
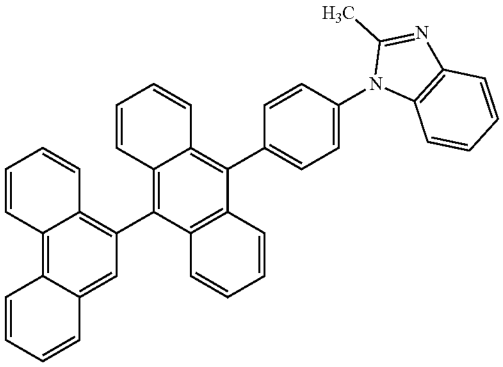
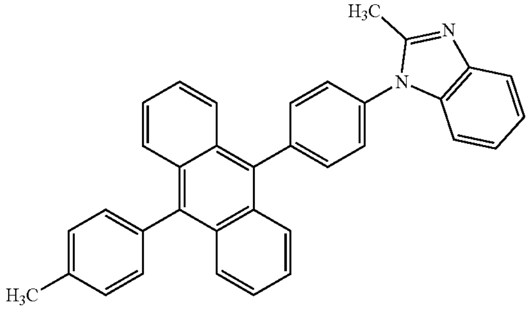

-continued
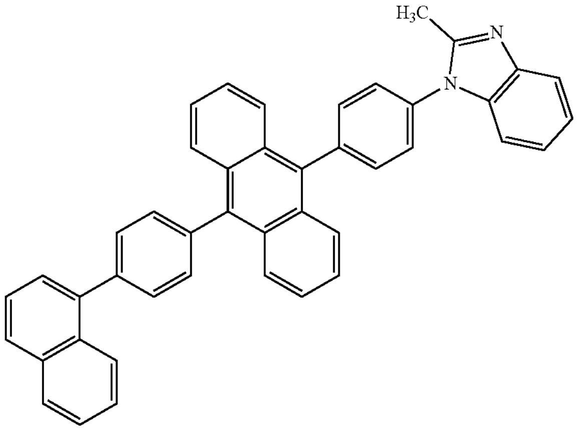
[Formula 50]
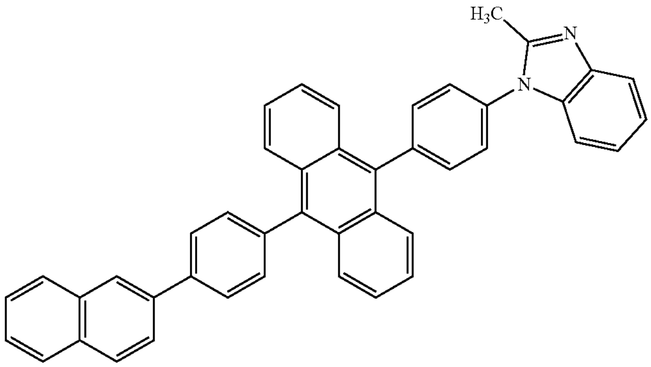
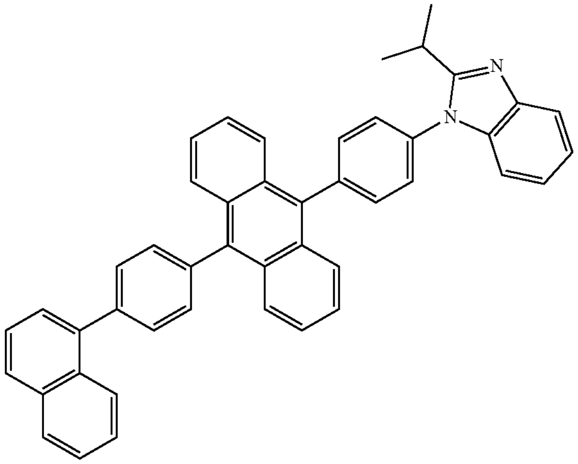
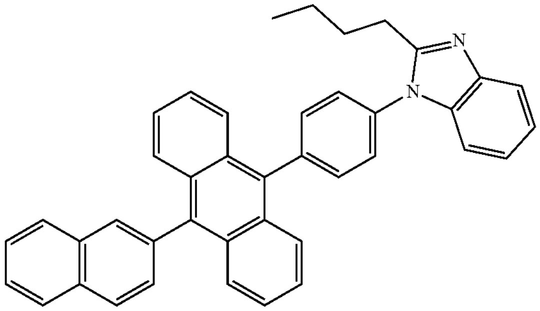

-continued
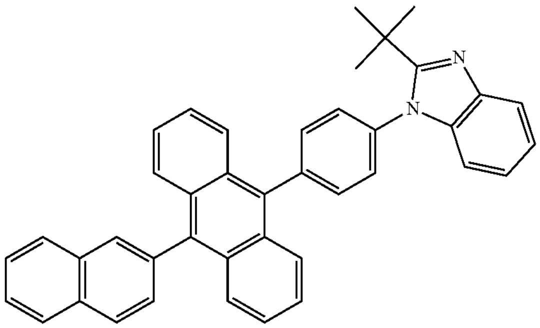
[Formula 51]
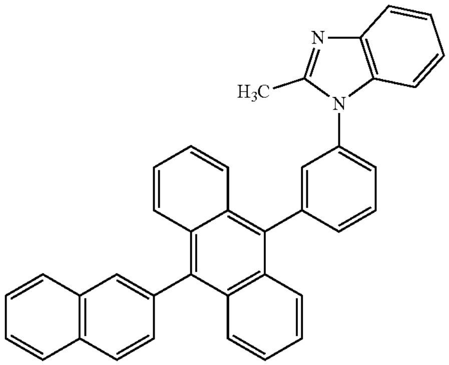
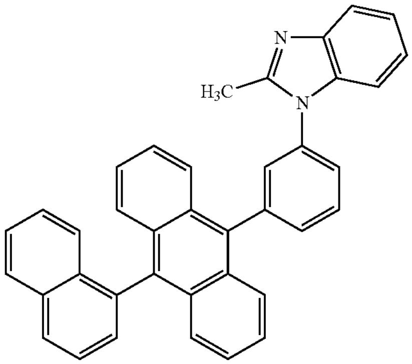
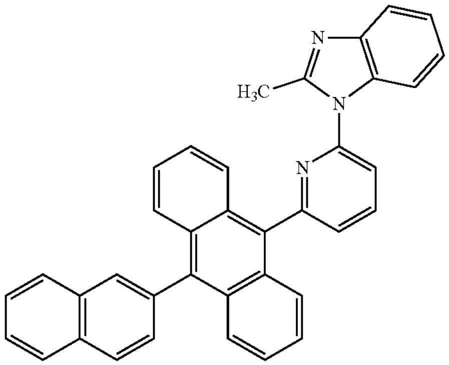

-continued
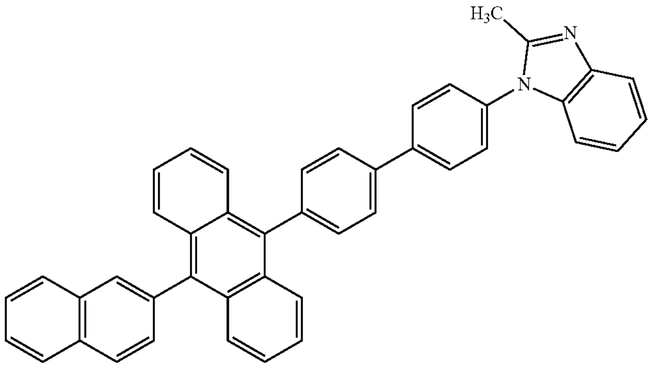
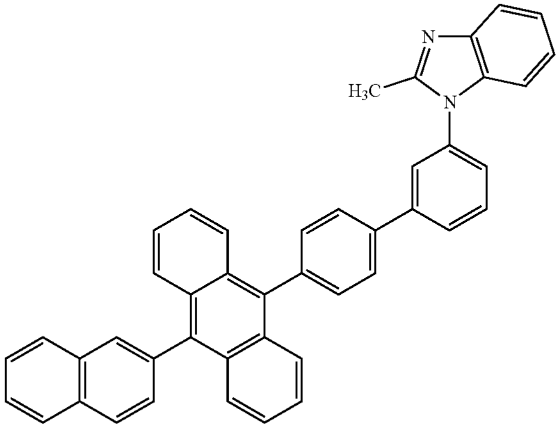
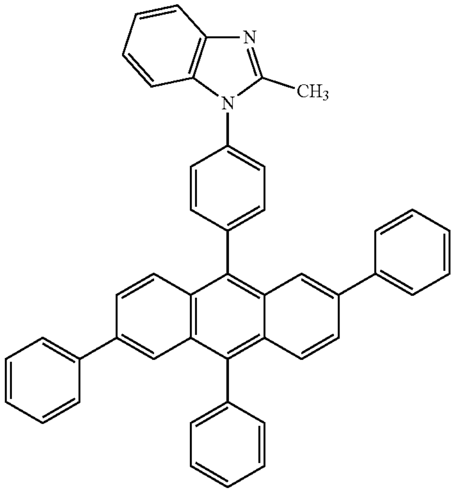

-continued
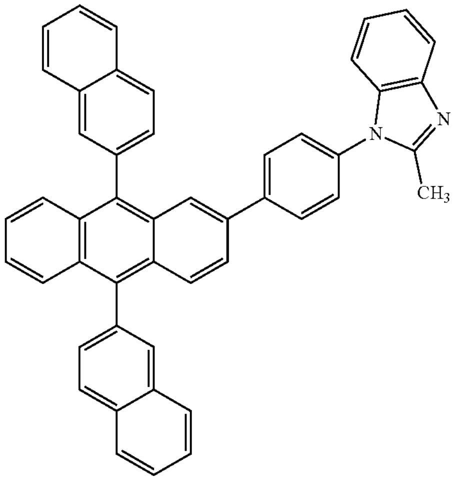
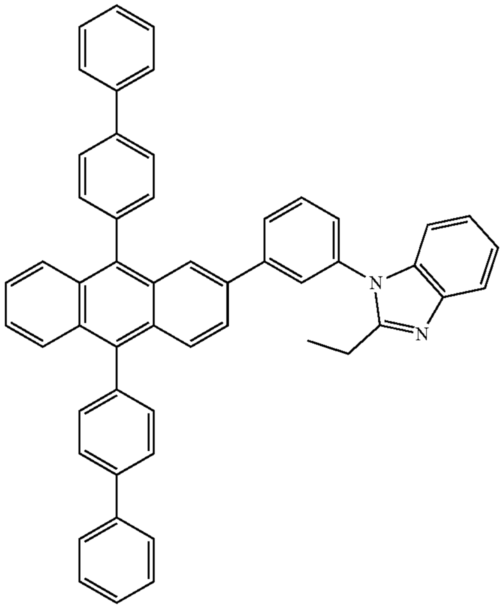
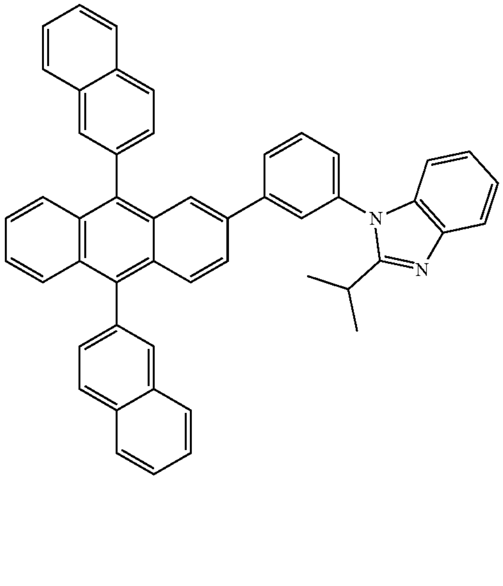

-continued
[Formula 52]
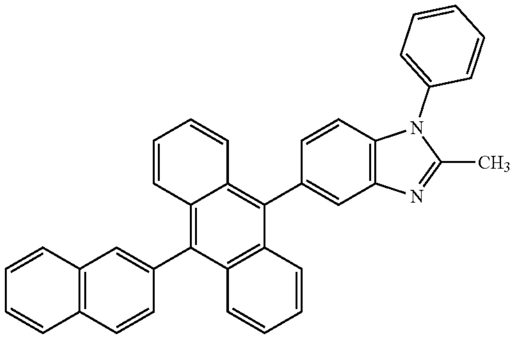
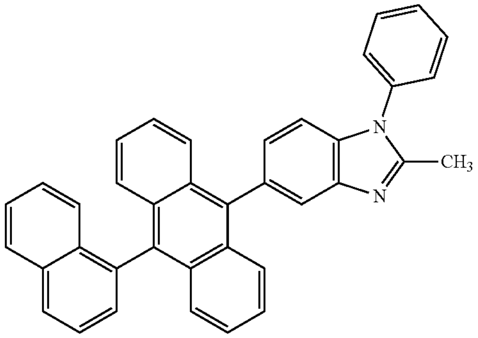
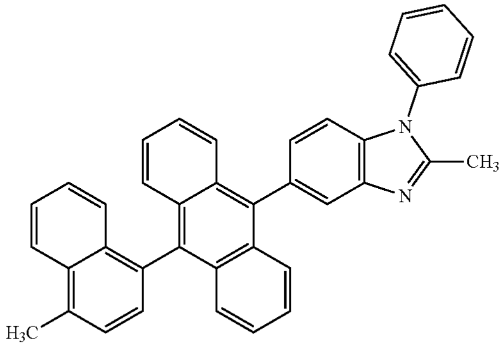
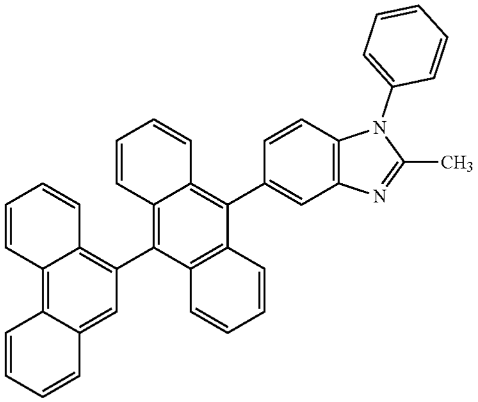

-continued
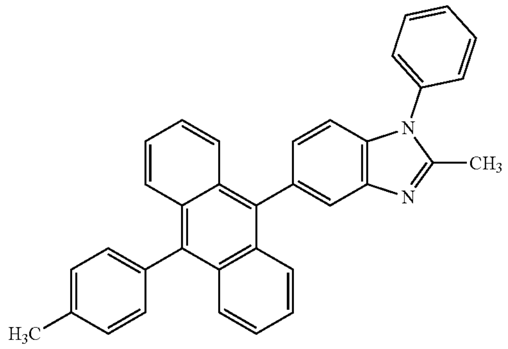
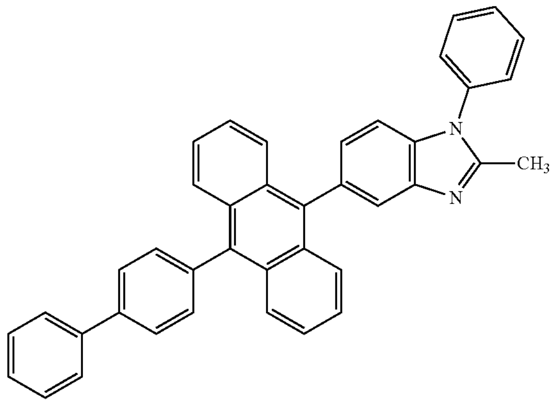
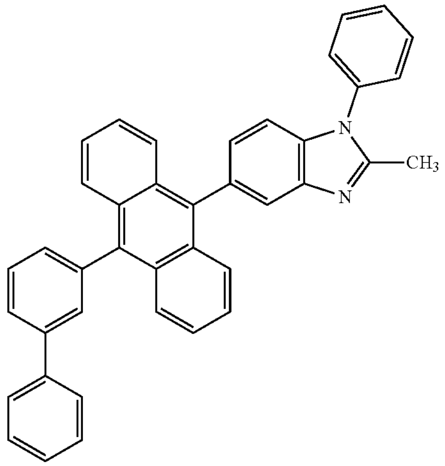
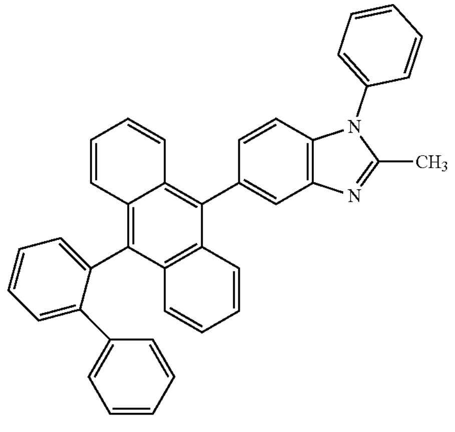

-continued
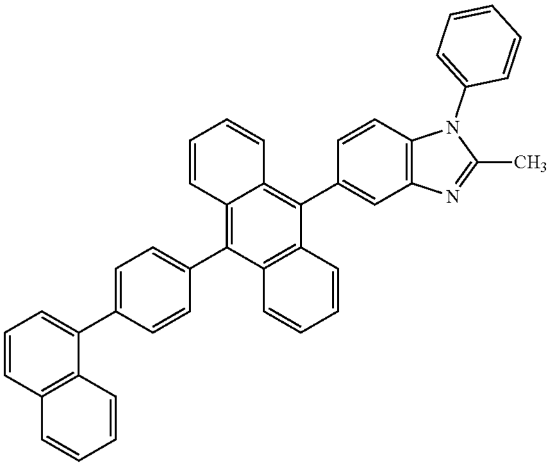
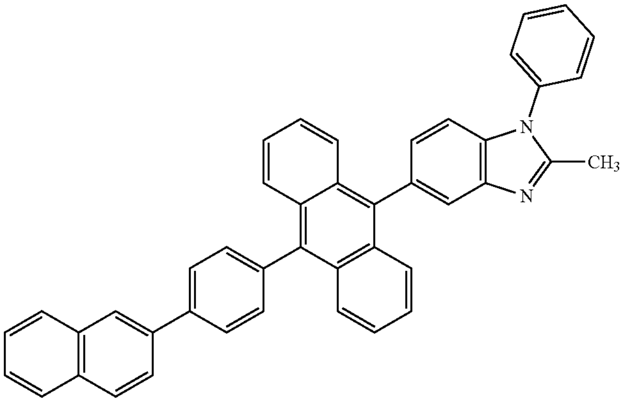
[Formula 53]
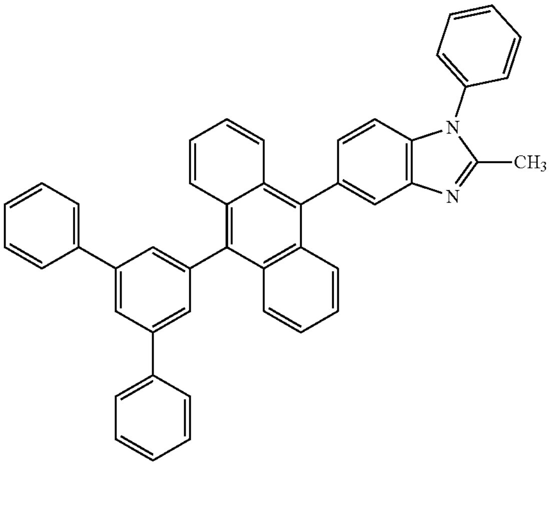

-continued
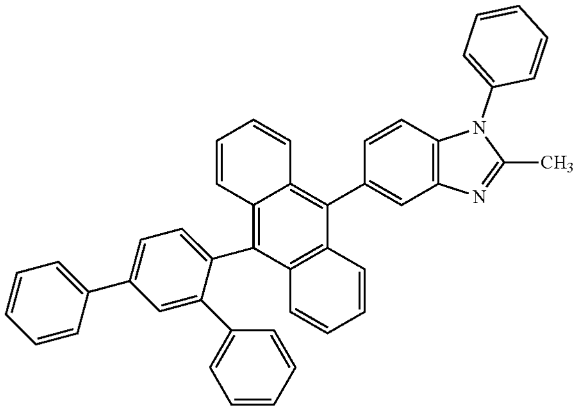
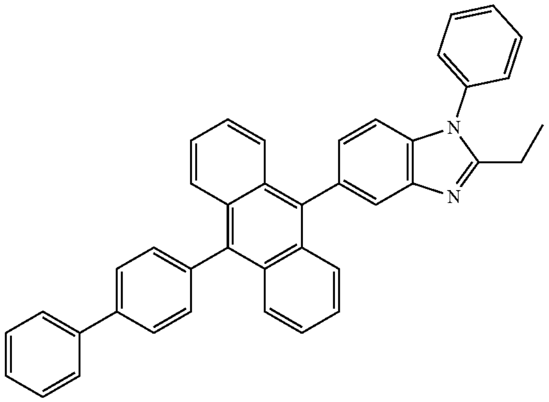
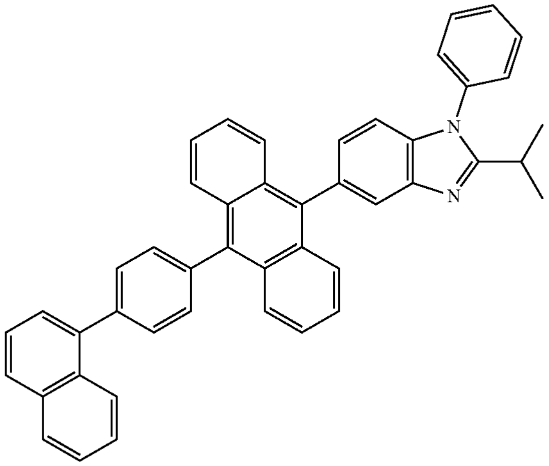
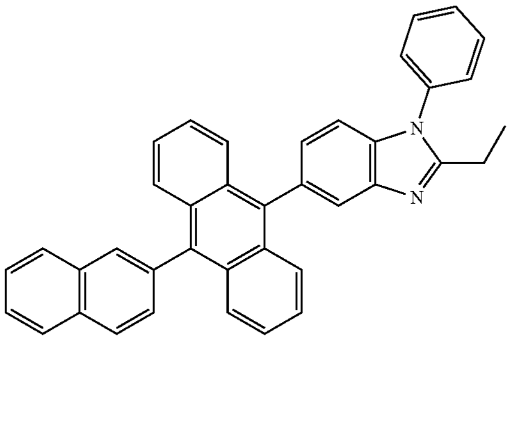

-continued
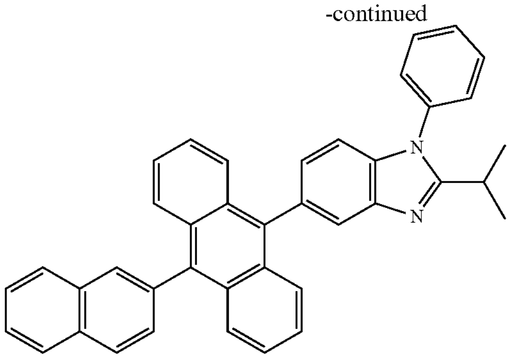
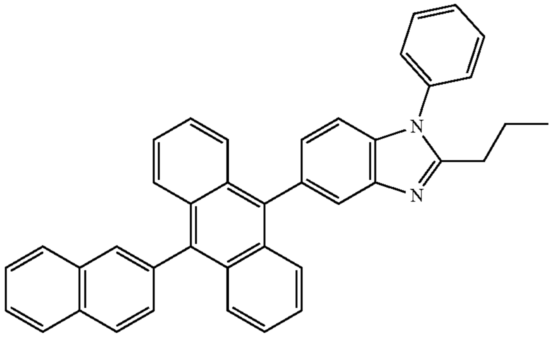
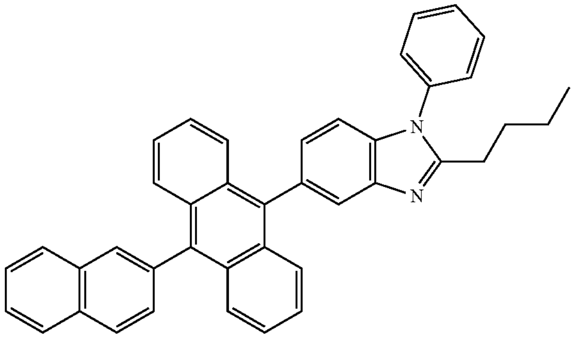
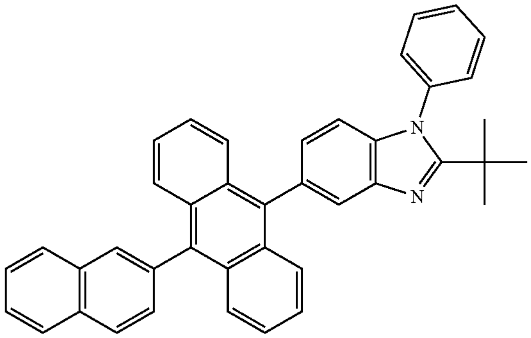
[Formula 54]
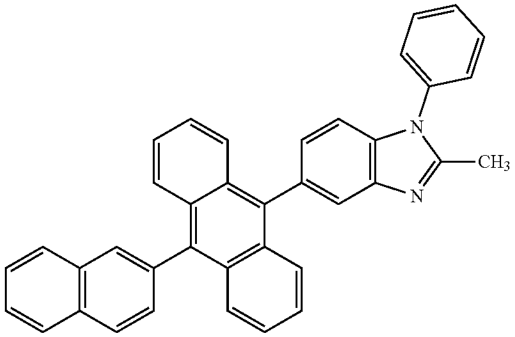

-continued
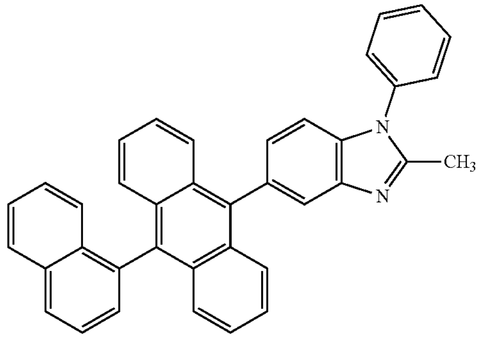
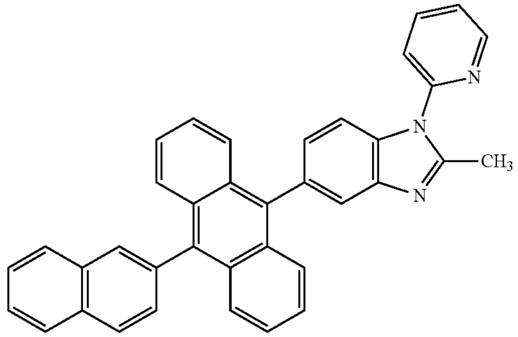
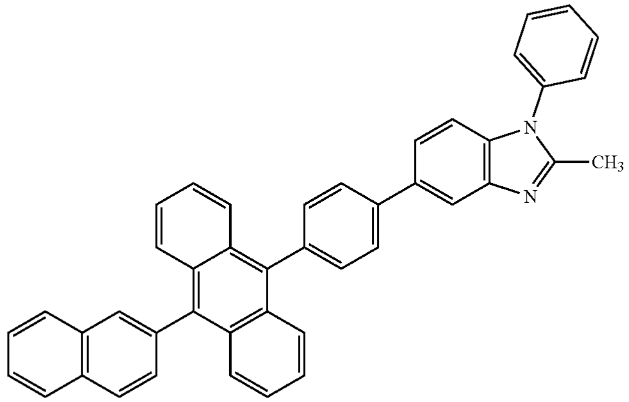
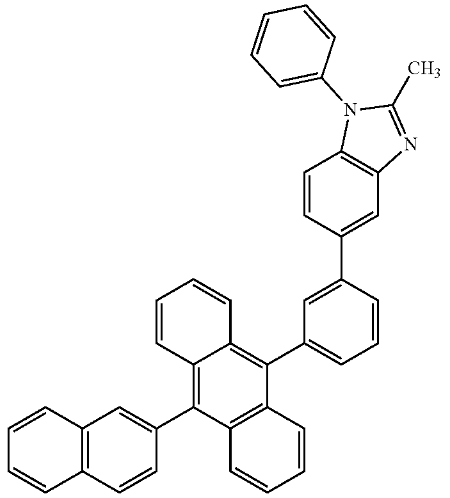

-continued
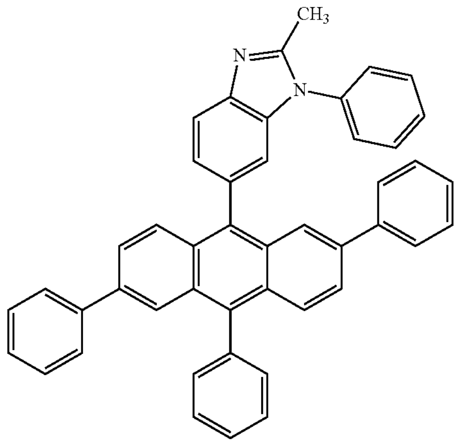
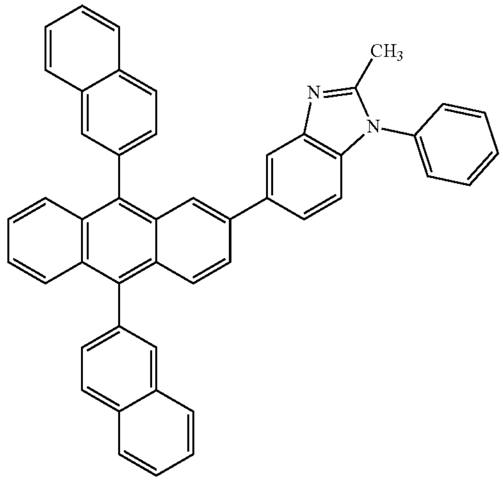
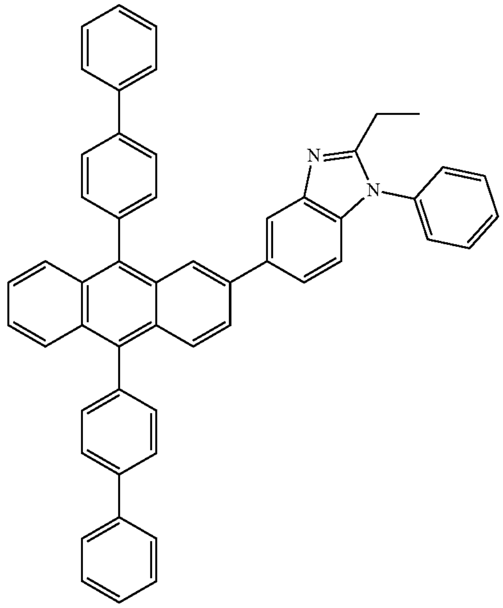

-continued
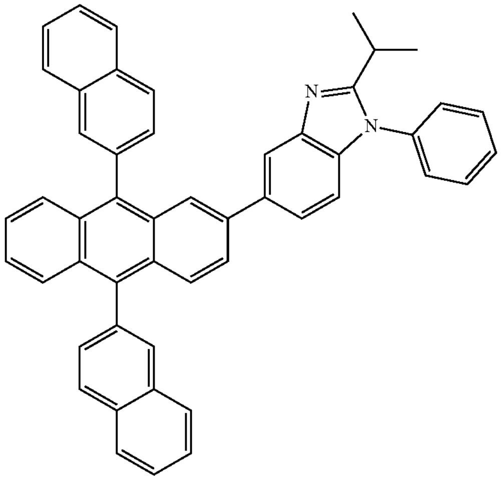
[Formula 55]
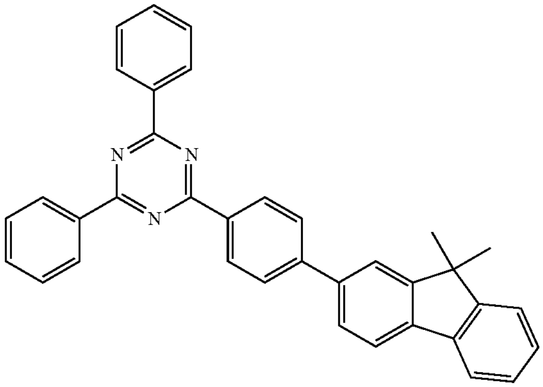
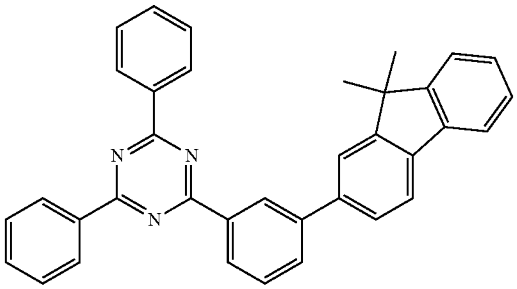
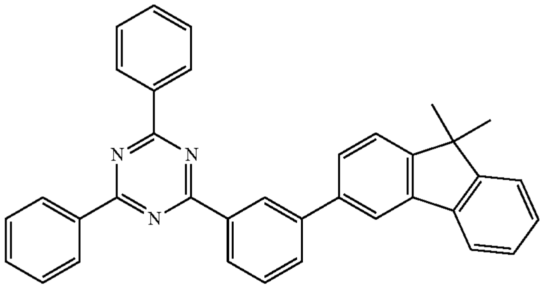

-continued
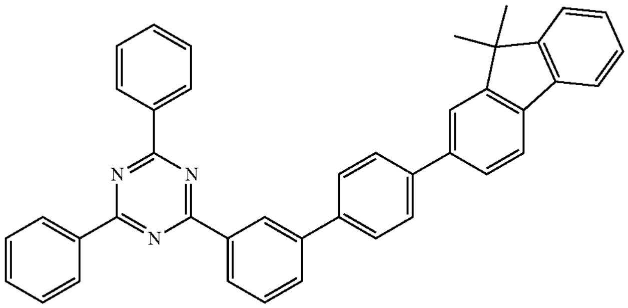
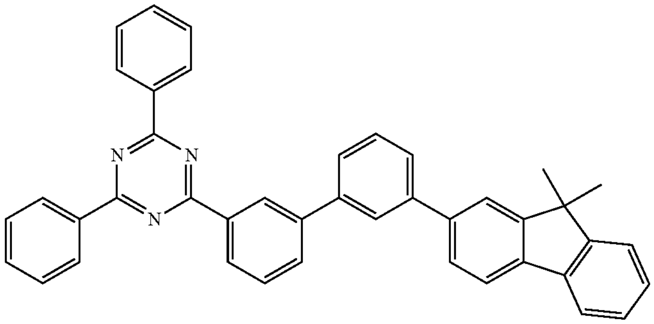
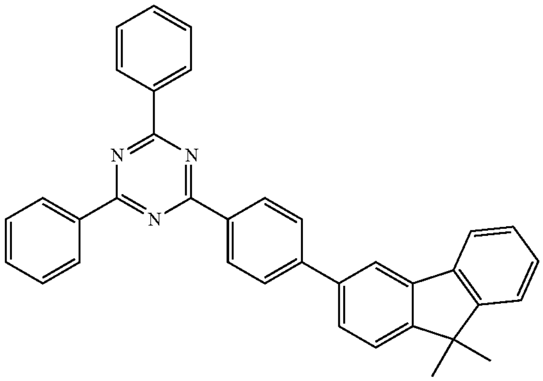
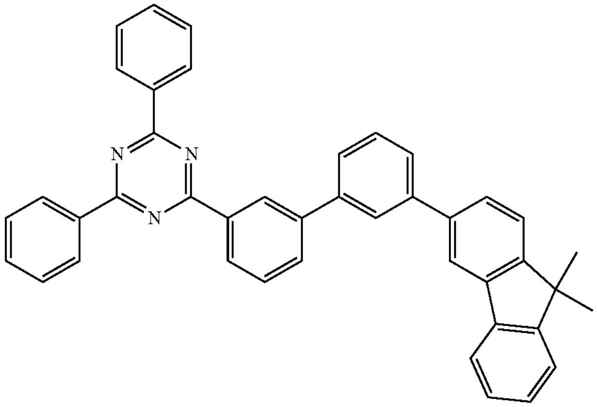
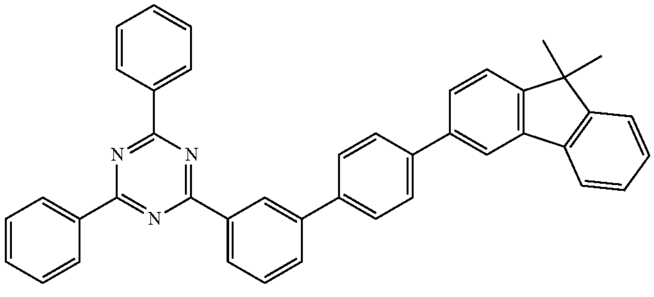

-continued
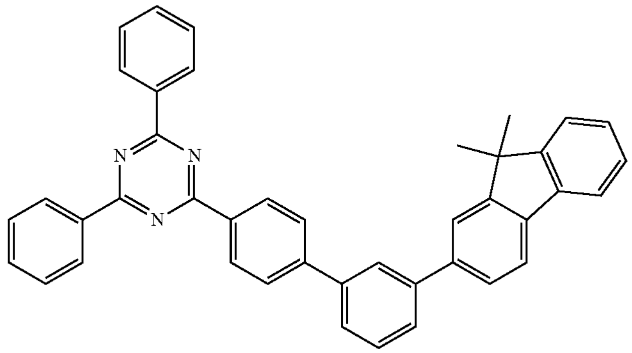
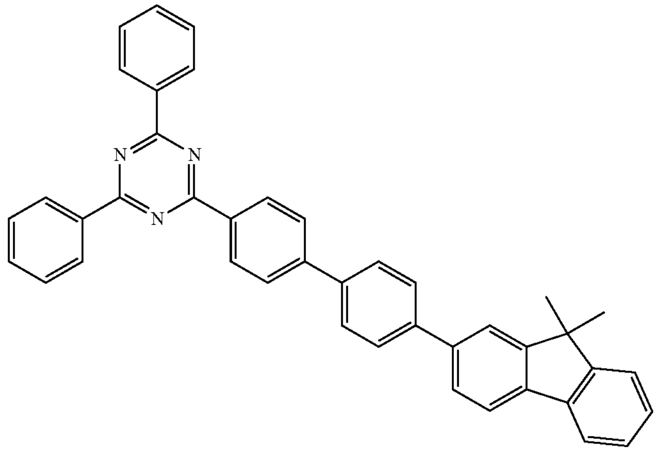
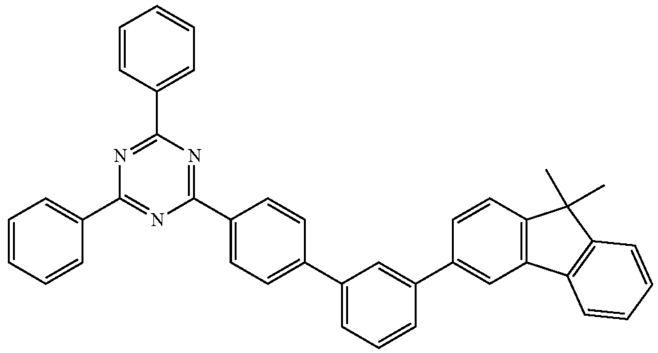
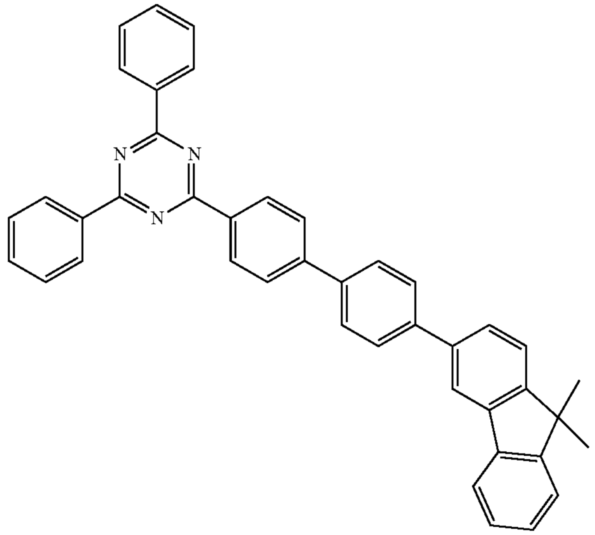

-continued
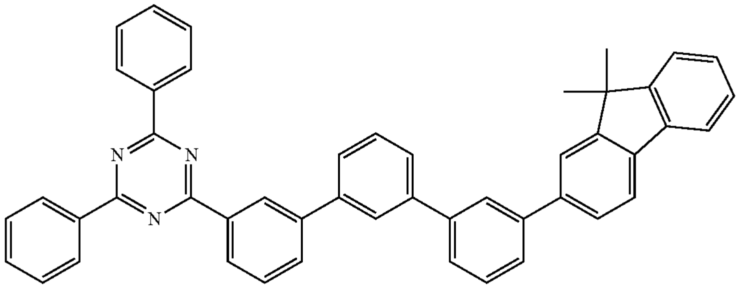
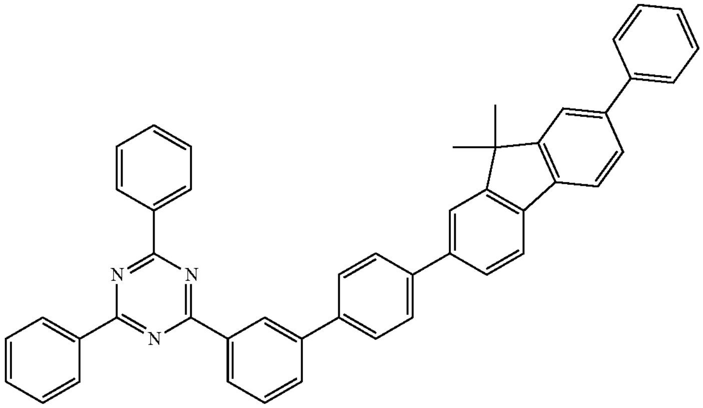
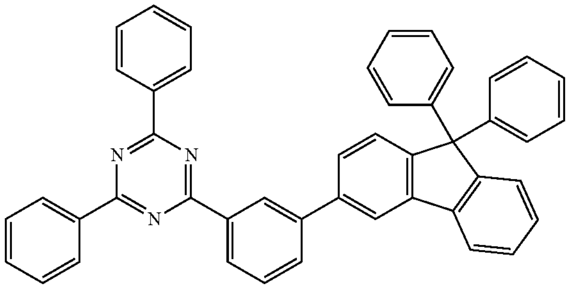
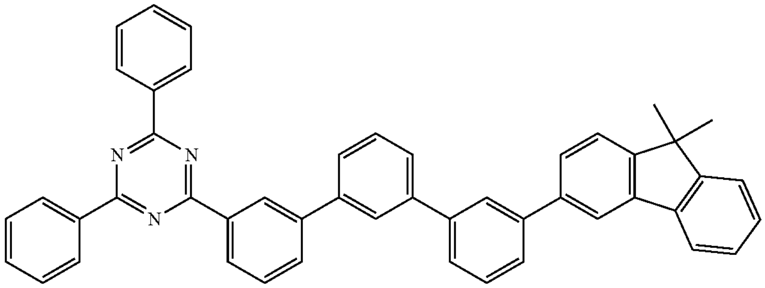
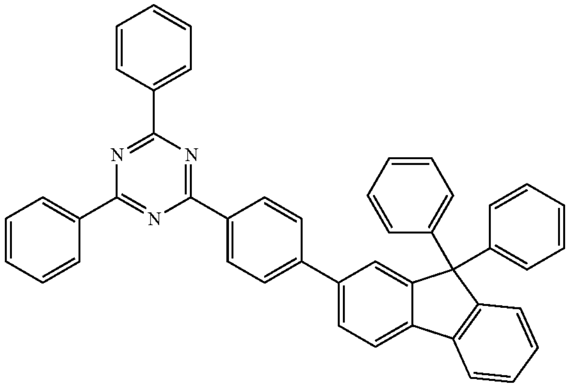

-continued
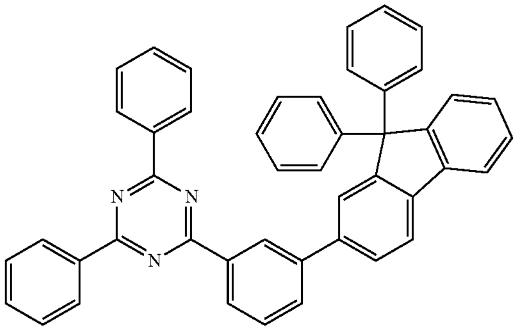
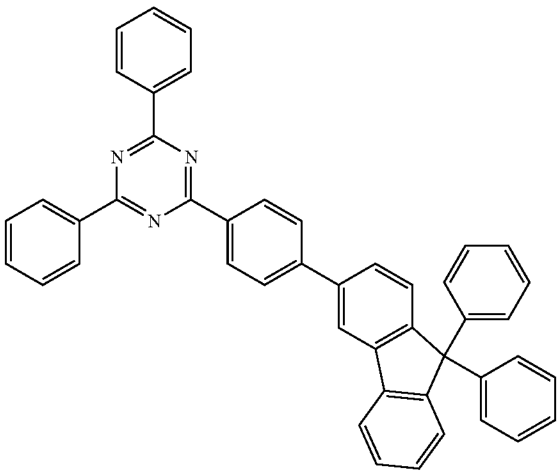
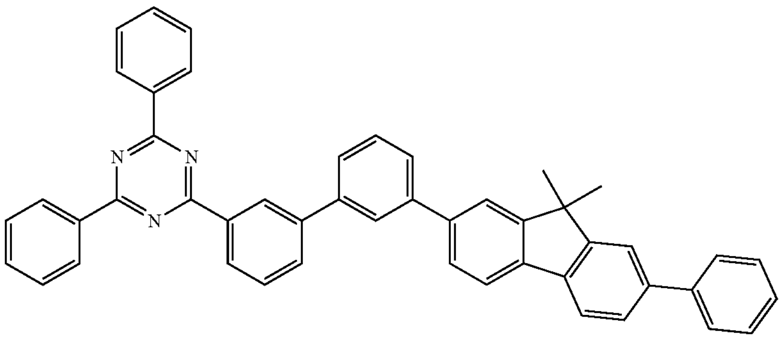
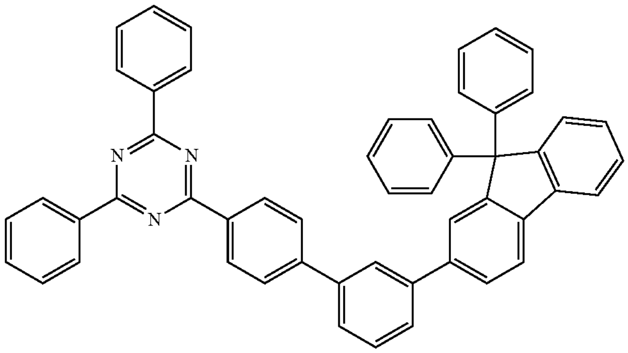

-continued
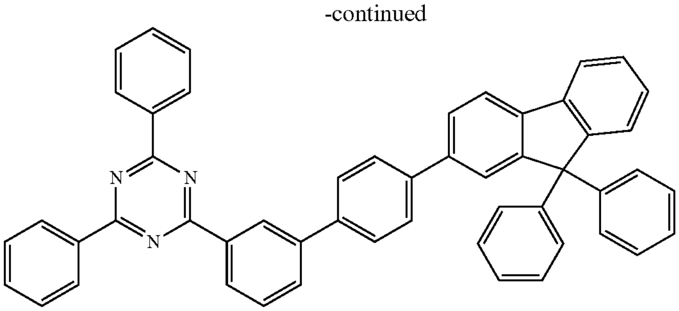
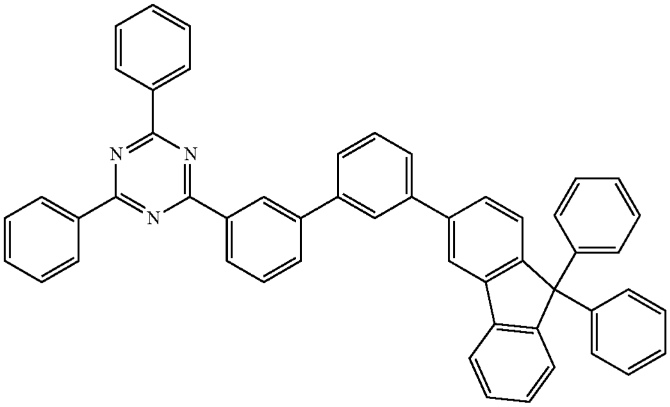
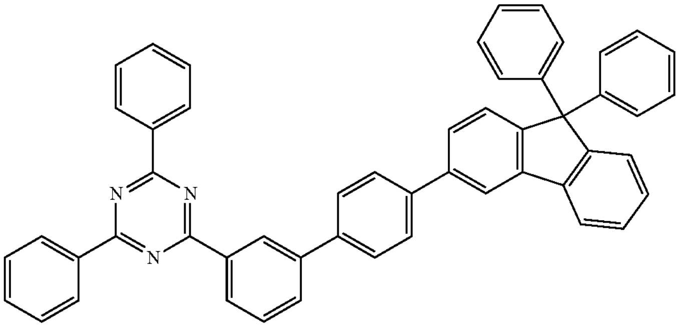
[Formula 56]
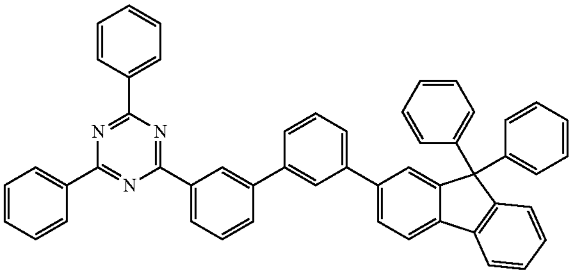
-continued
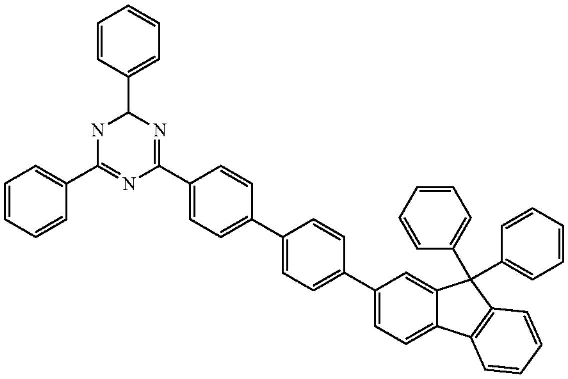

-continued
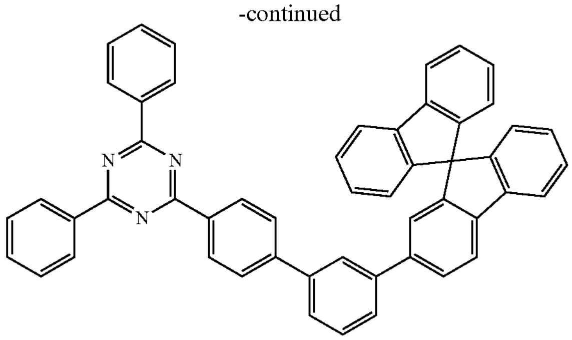
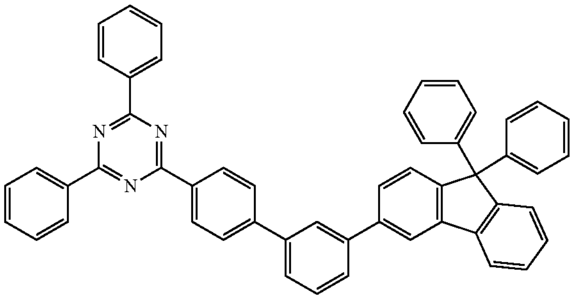
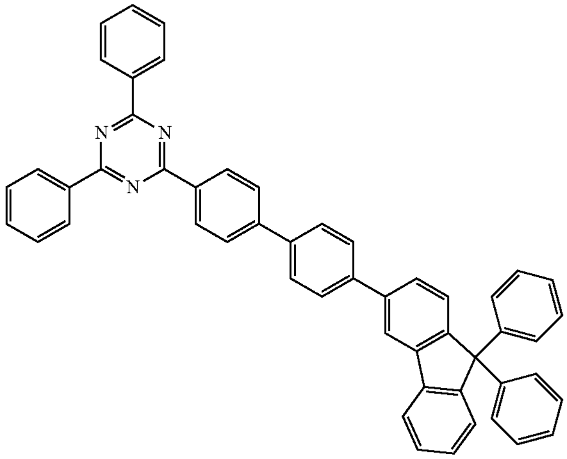
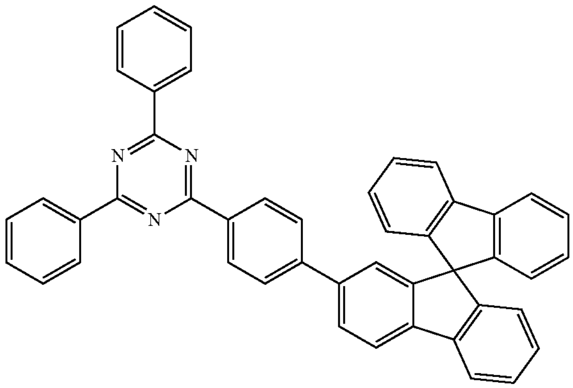
-continued
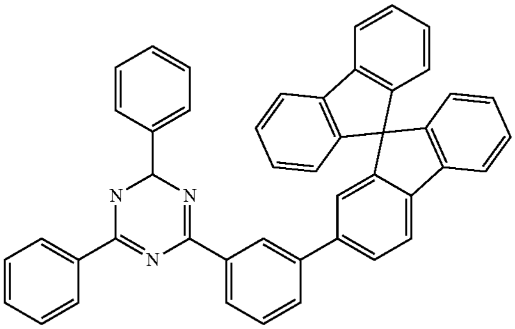
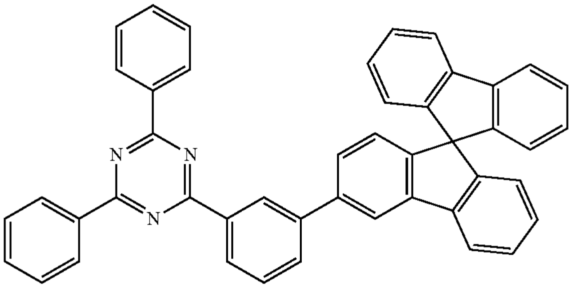
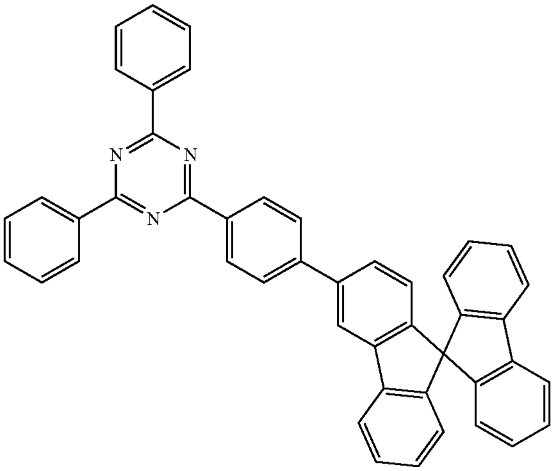
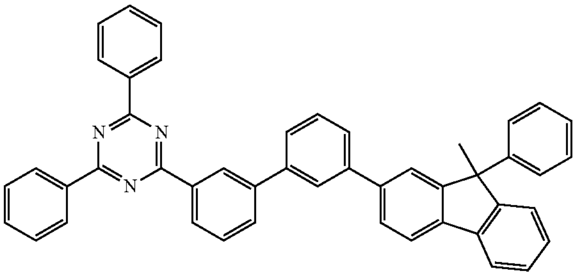
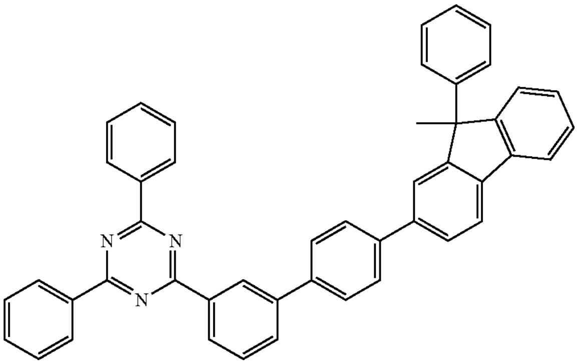

-continued
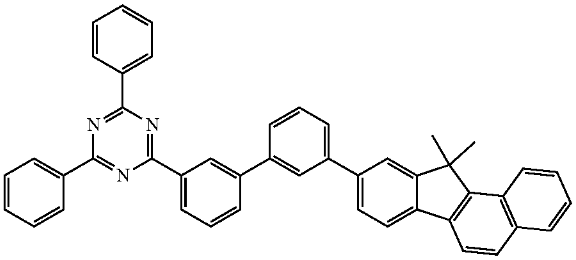
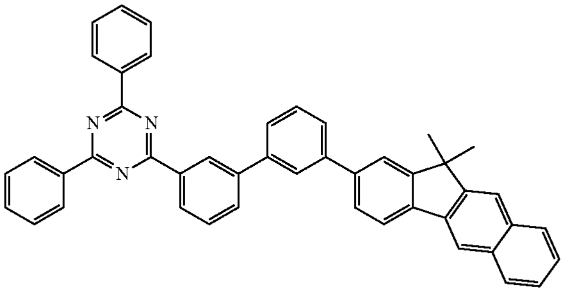
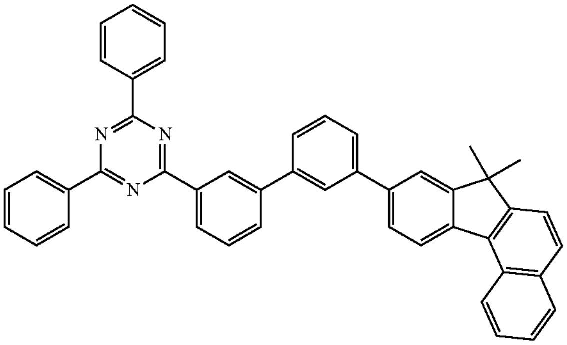
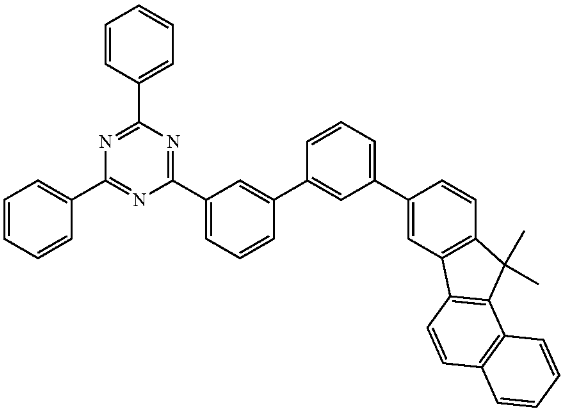
-continued
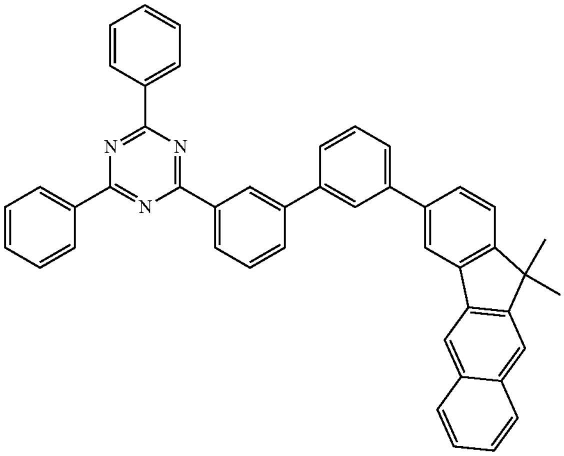
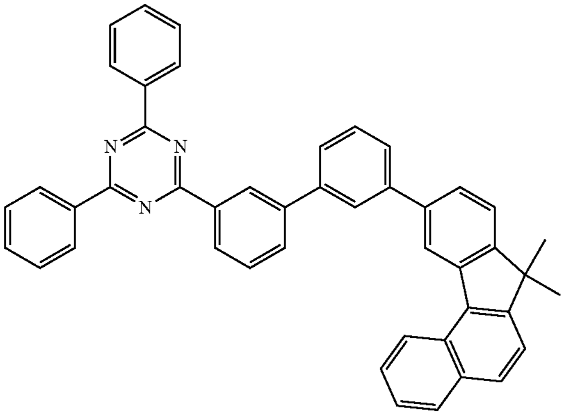
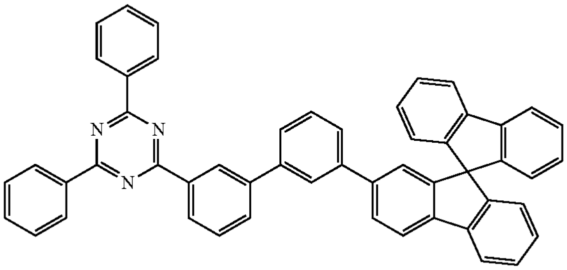
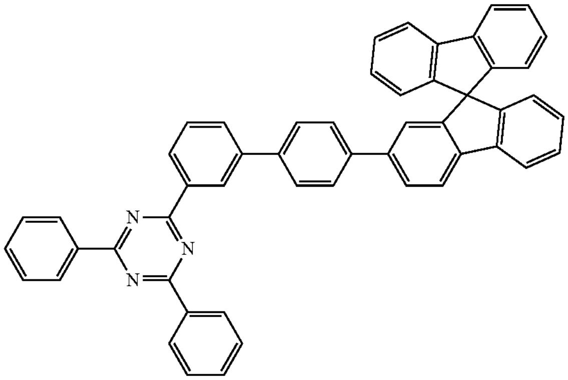

-continued
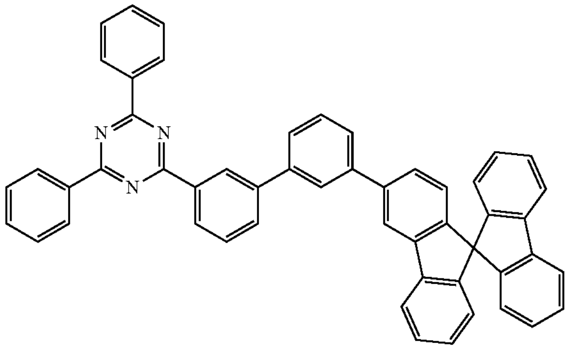
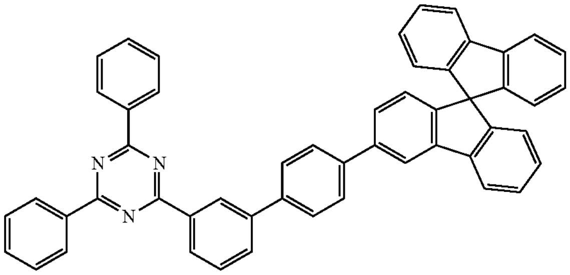
[Formula 57]
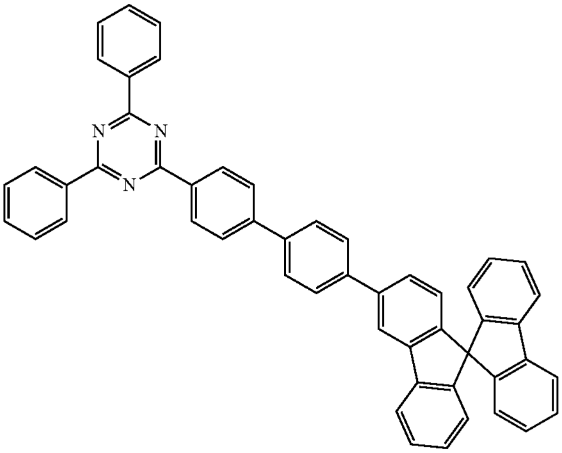
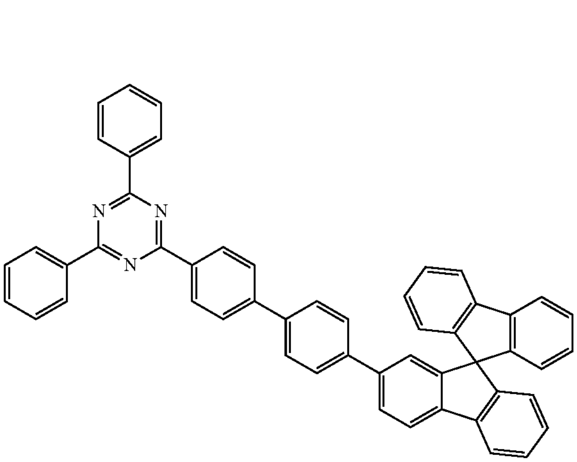
-continued
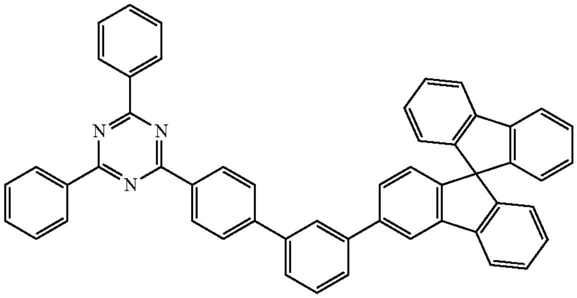
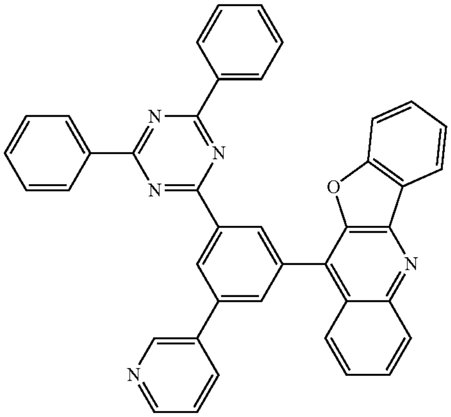
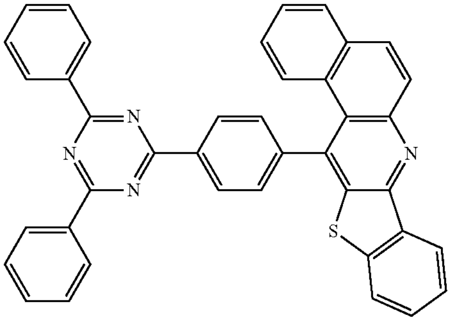
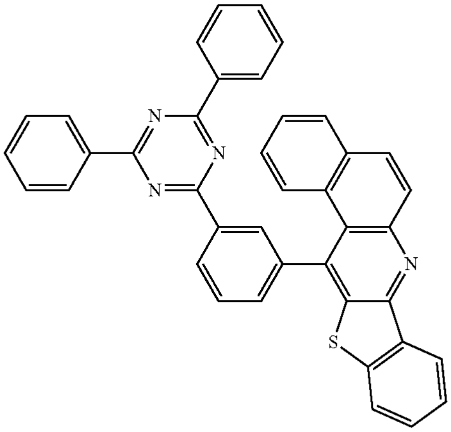

-continued
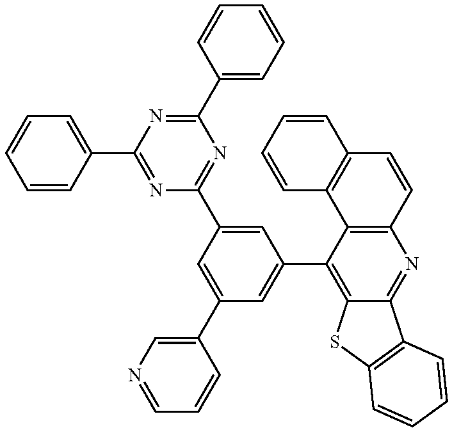
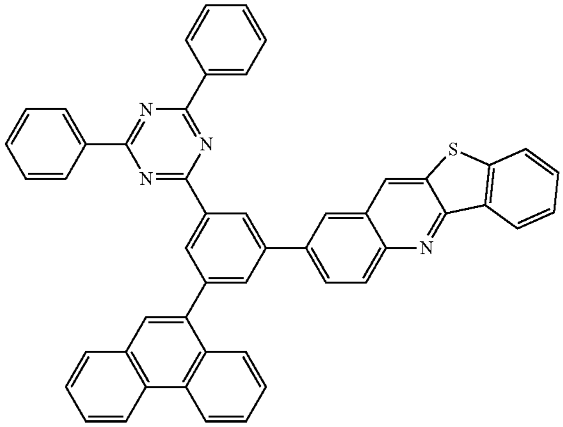
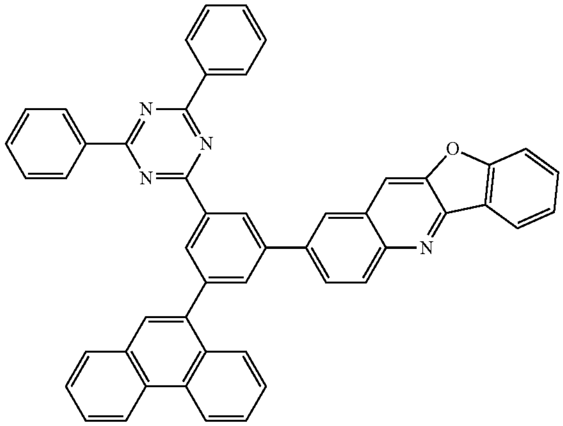
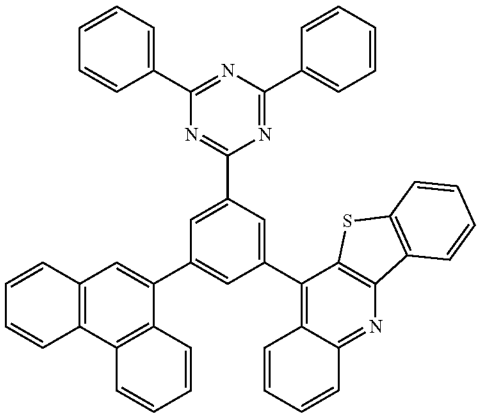
-continued
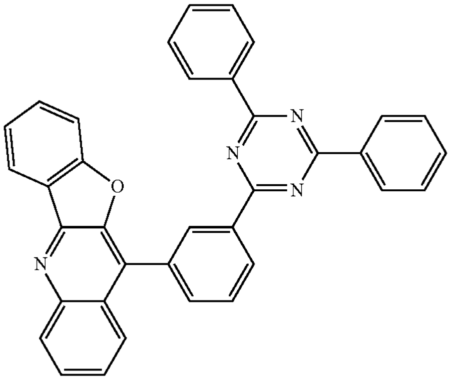
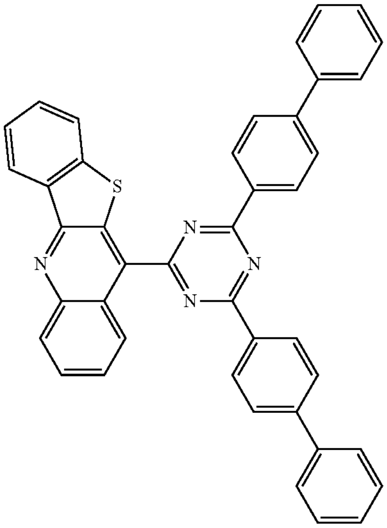
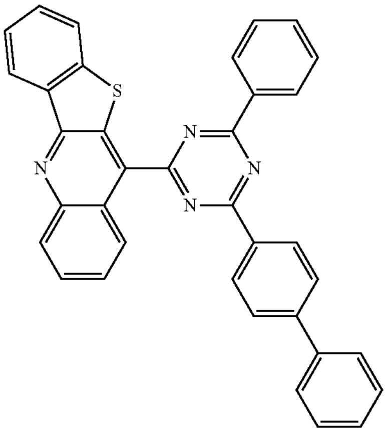

-continued
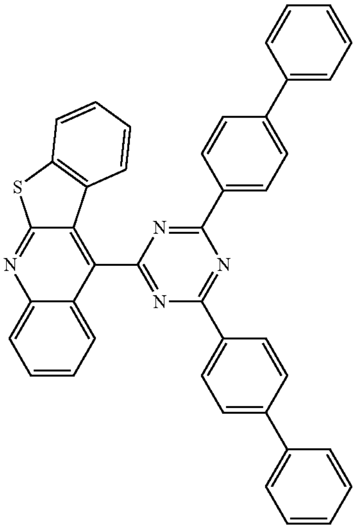
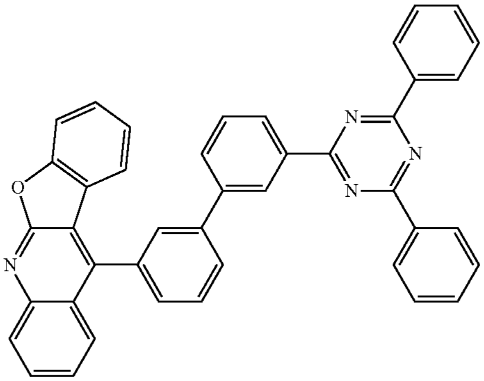
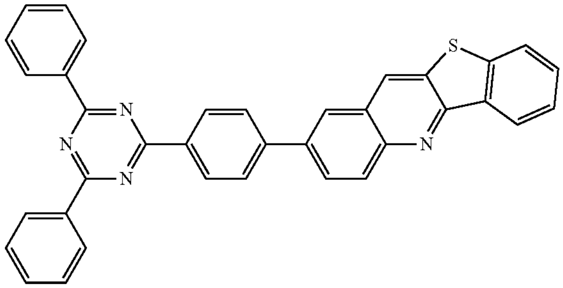
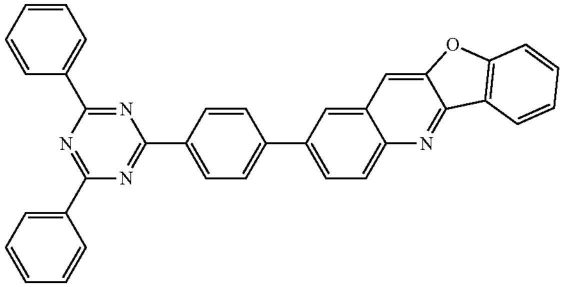
-continued
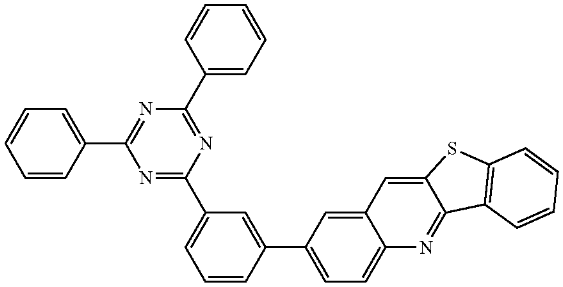
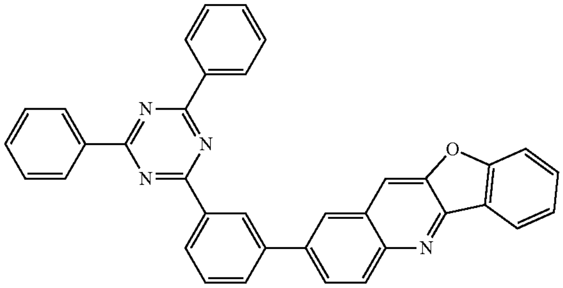
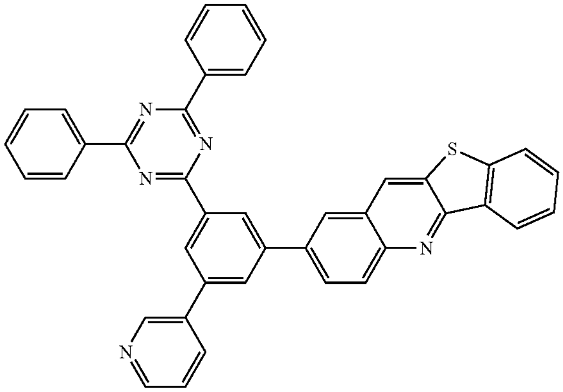
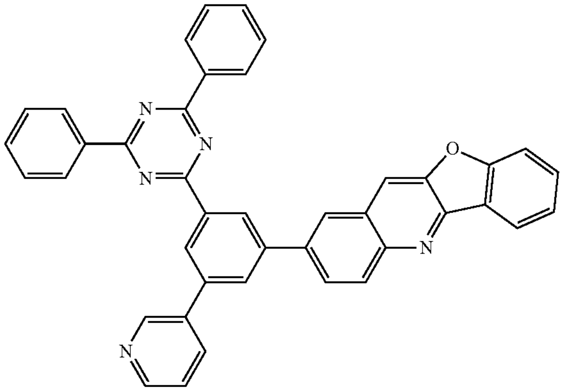
[Formula 58]
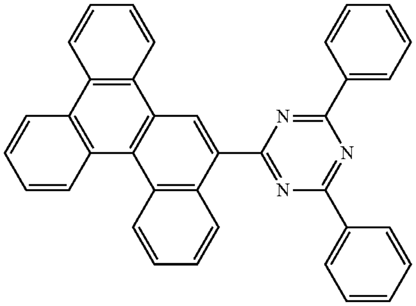

-continued
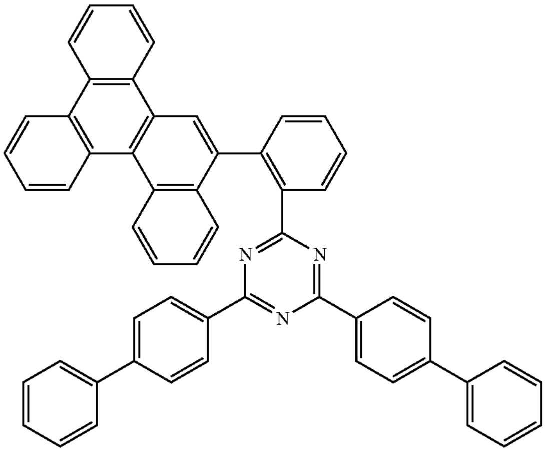
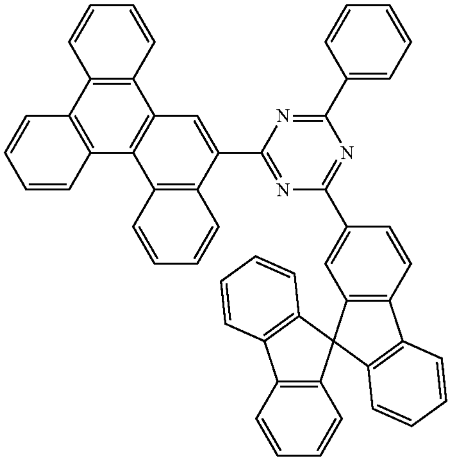
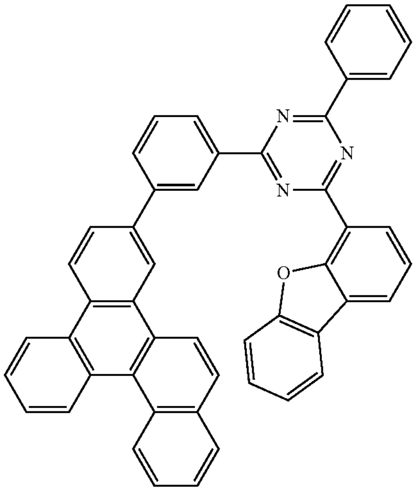
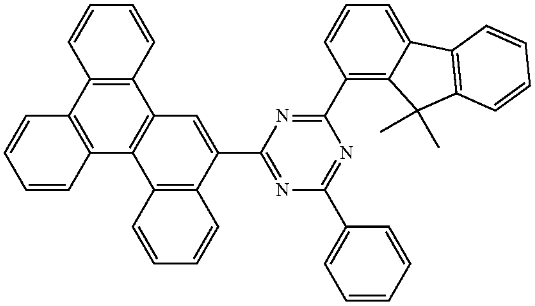
-continued
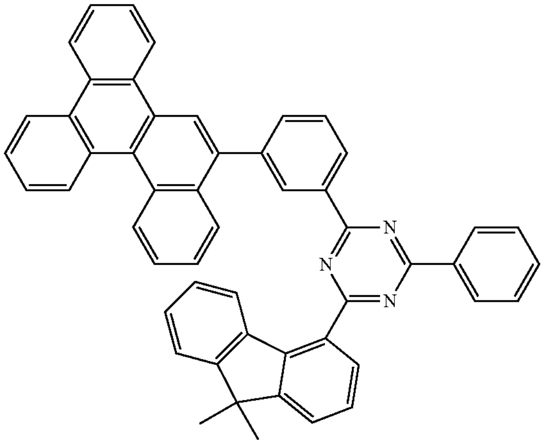
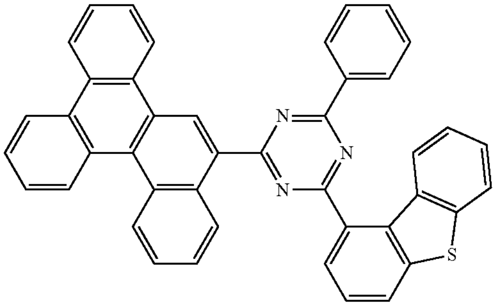
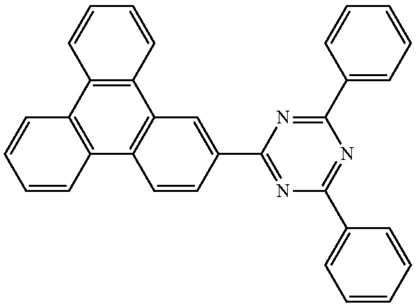
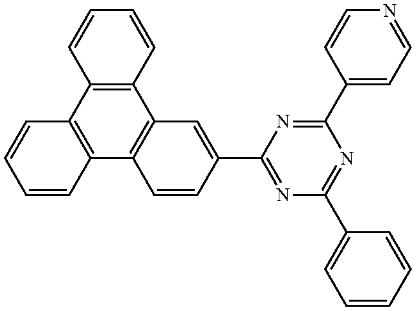

-continued
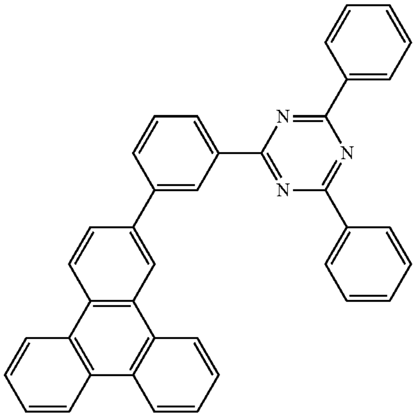
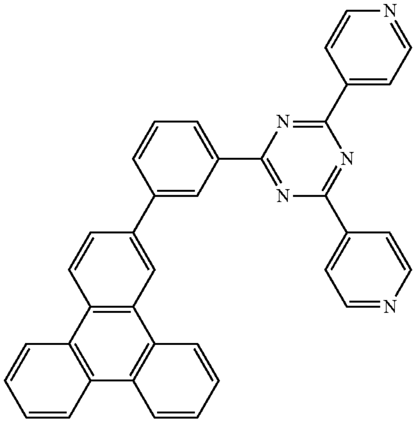
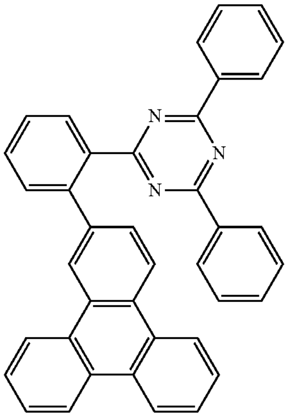
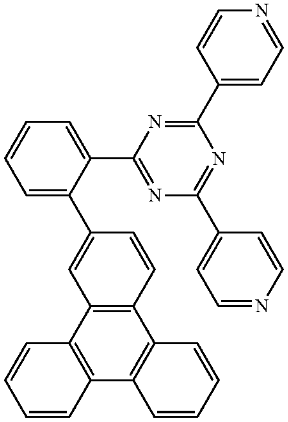
-continued
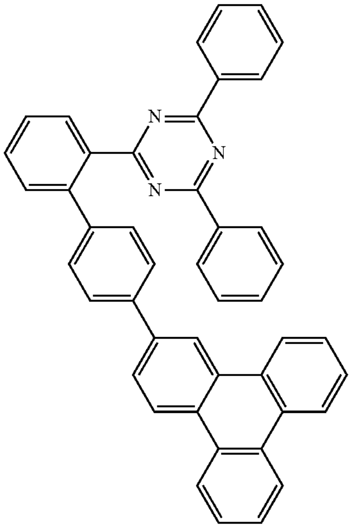
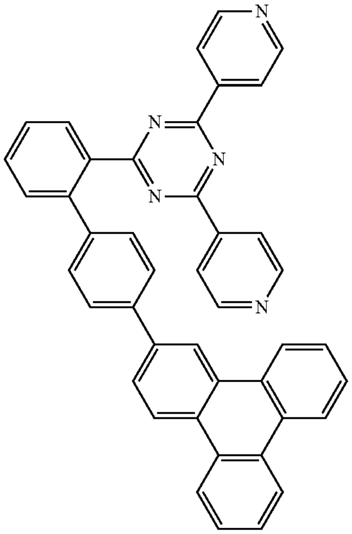
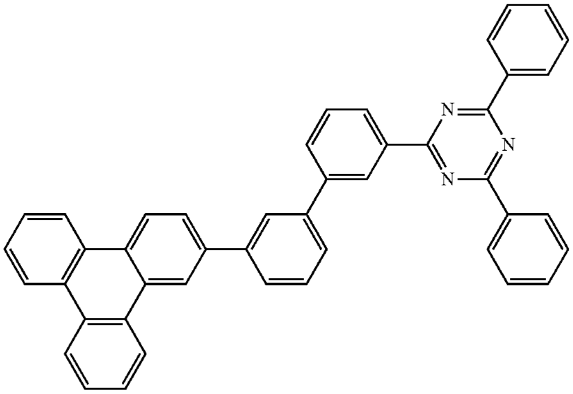

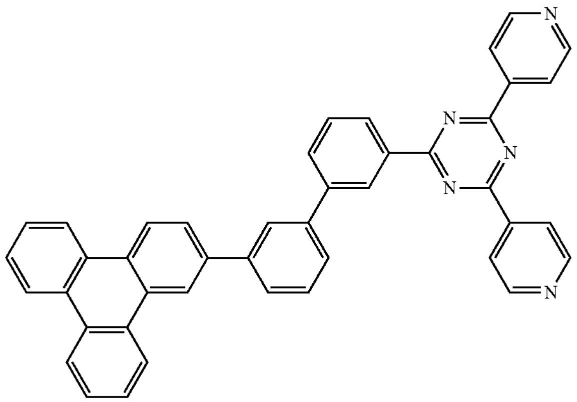
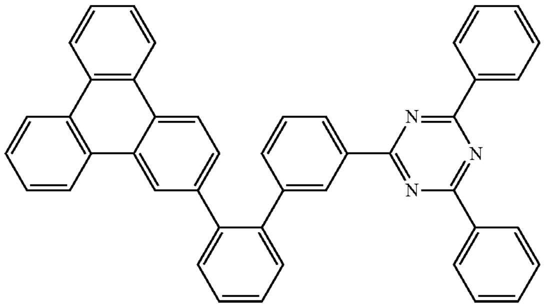
[Formula 59]
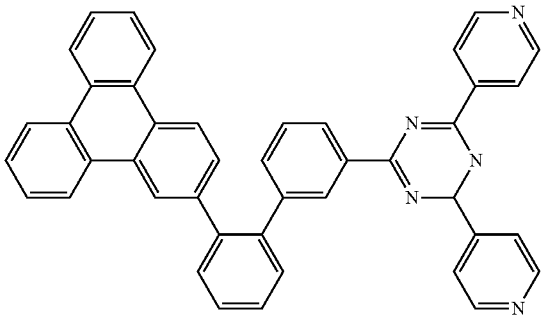
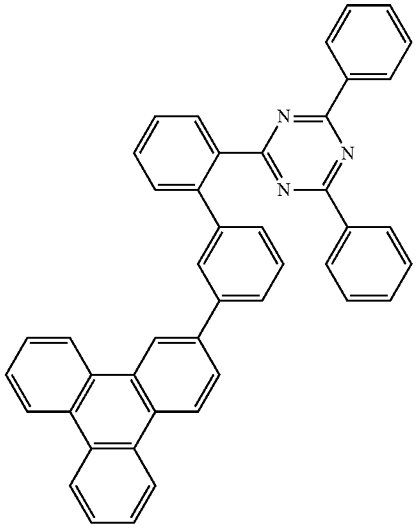
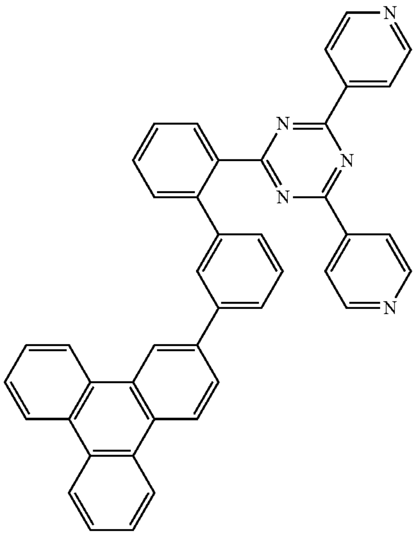
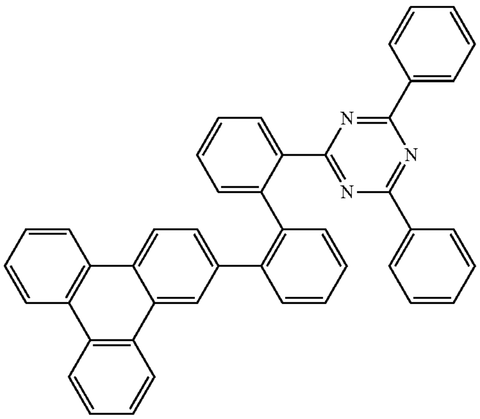
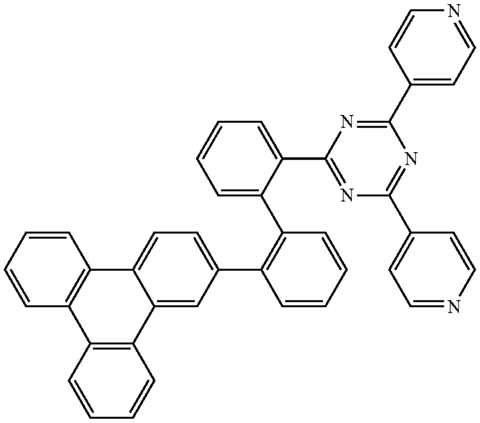
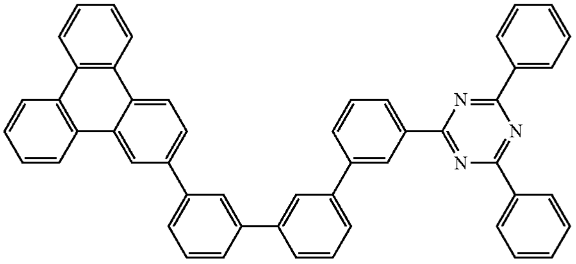

-continued
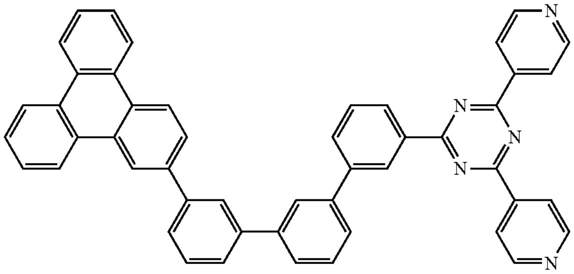
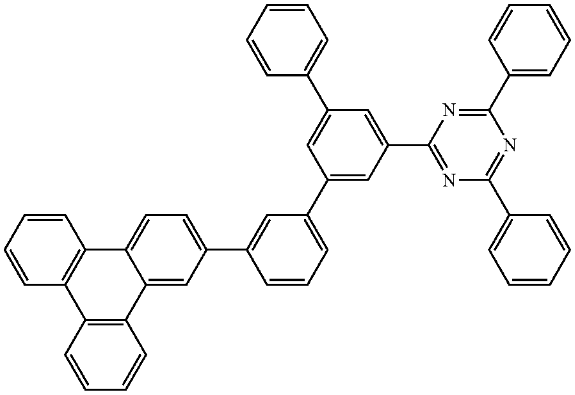
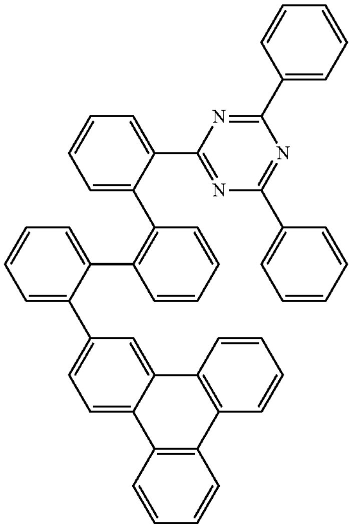
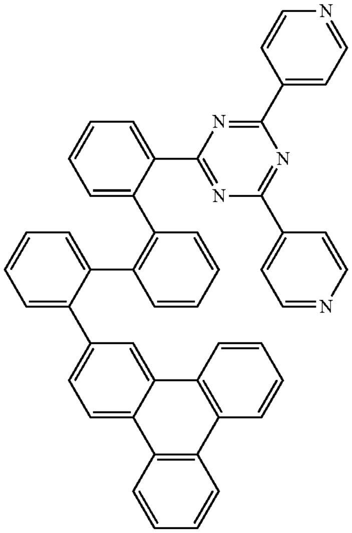
-continued
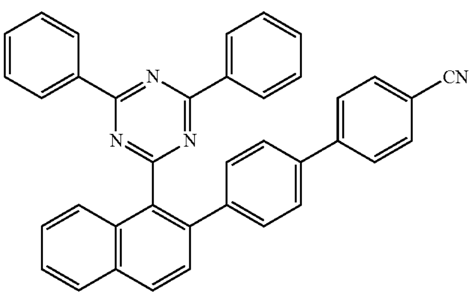
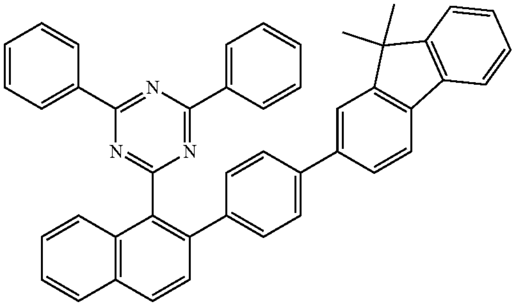
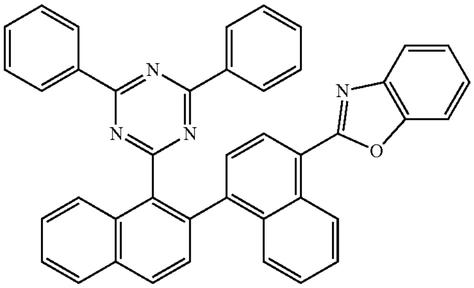
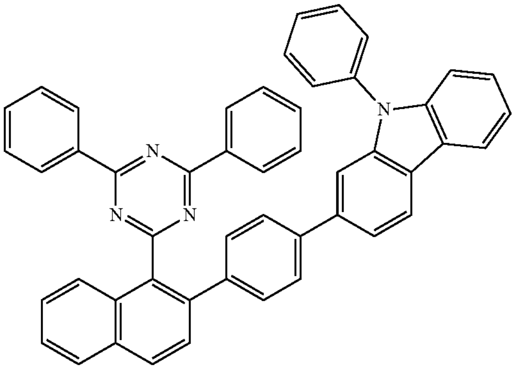
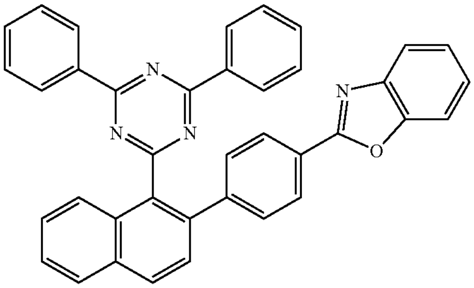

-continued
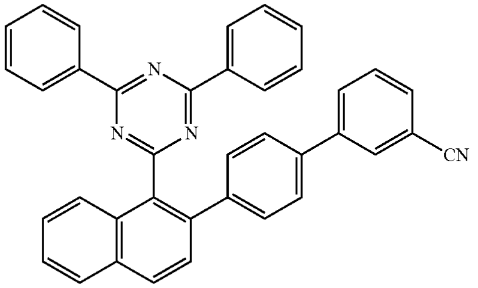
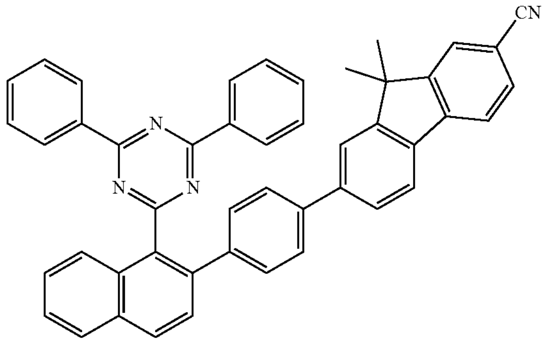
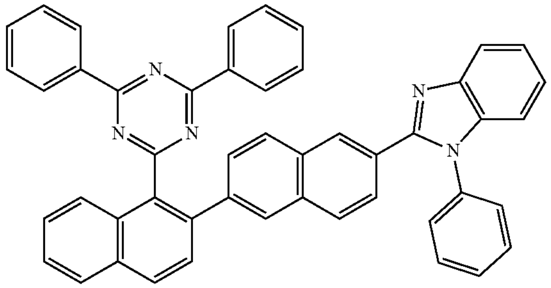
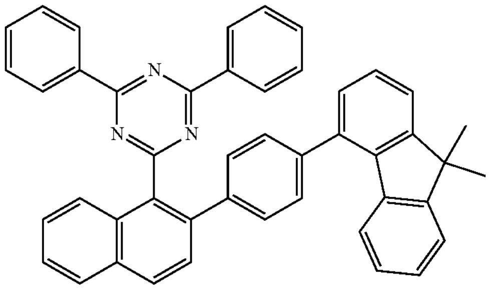
[Formula 60]
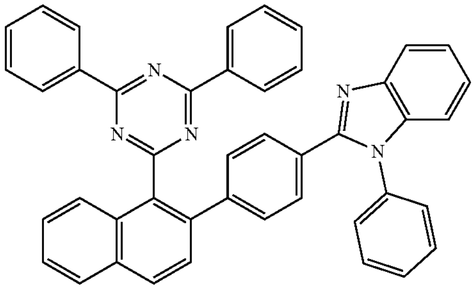
-continued
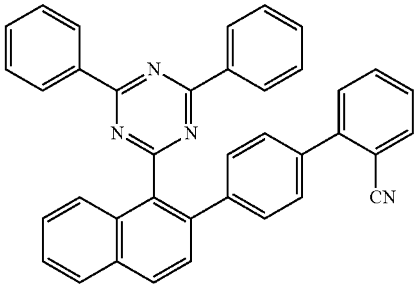
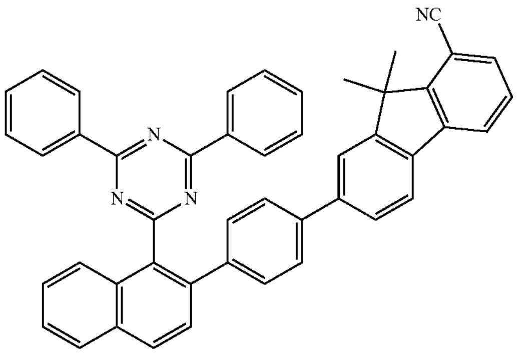
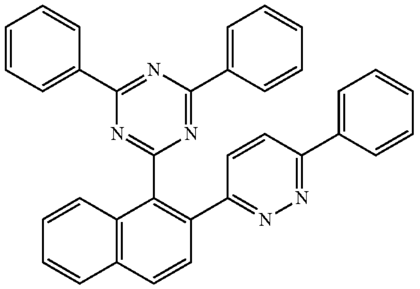
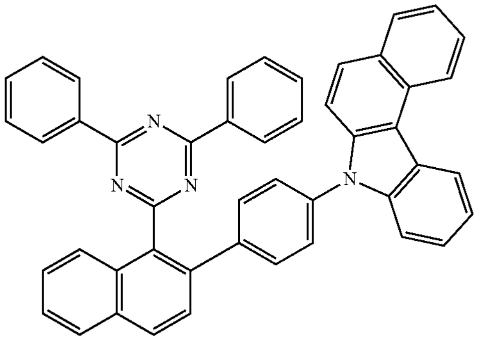
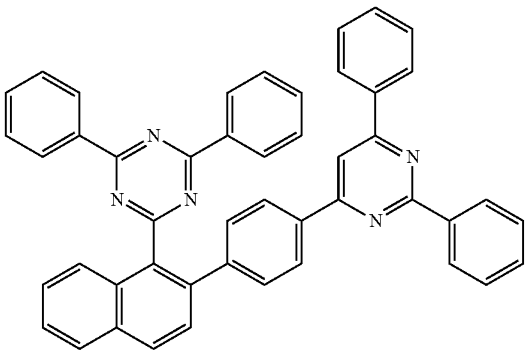

-continued
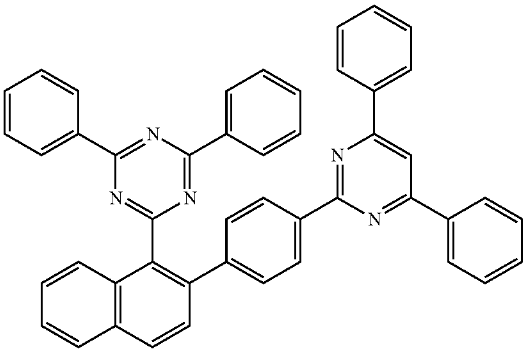
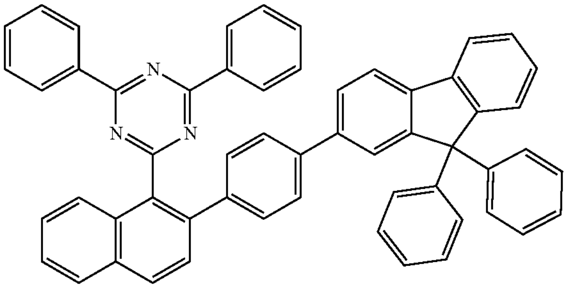
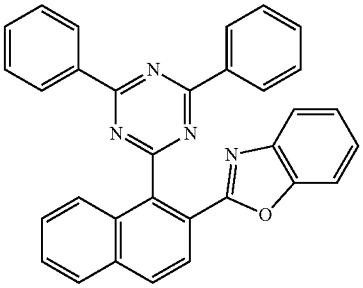
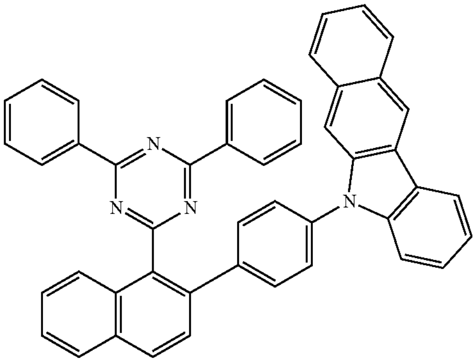
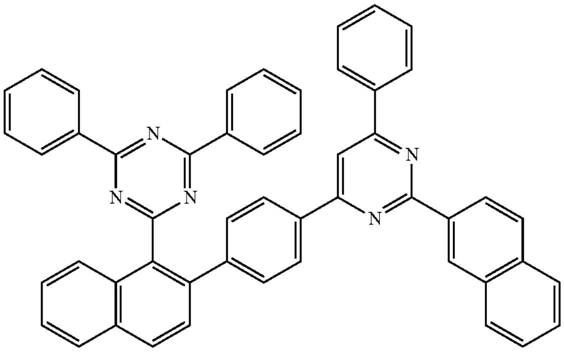
-continued
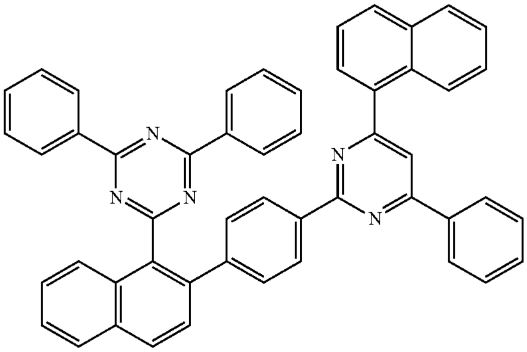
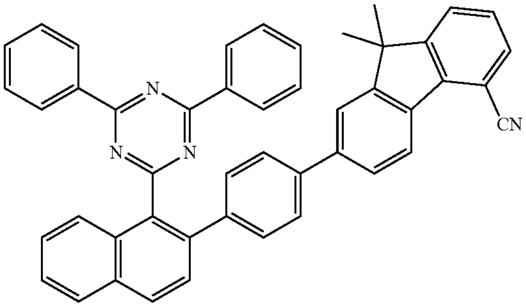
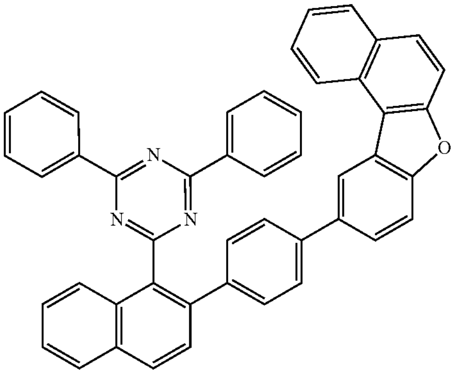
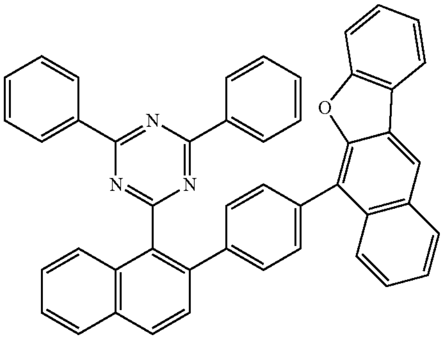
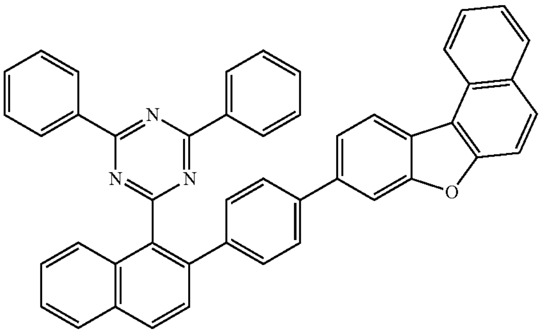

-continued
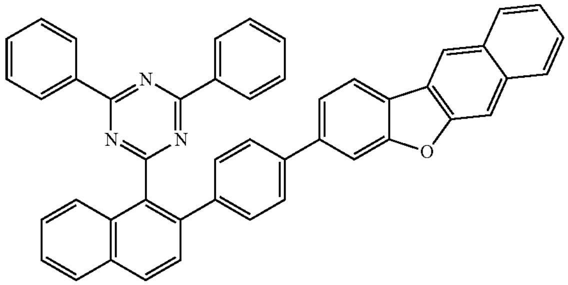
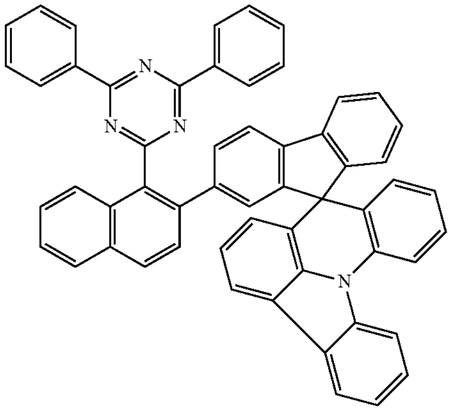
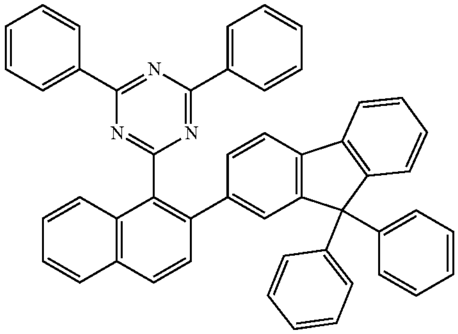
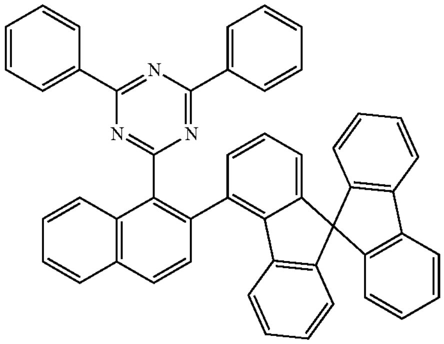
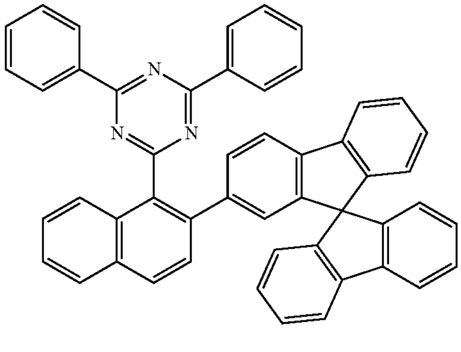
[Formula 61]
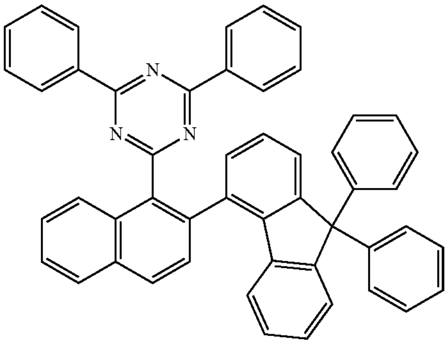
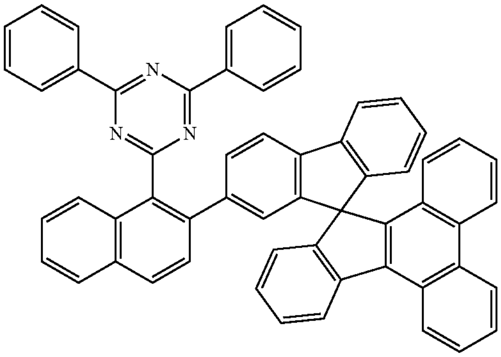
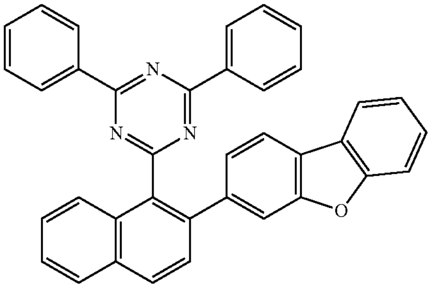
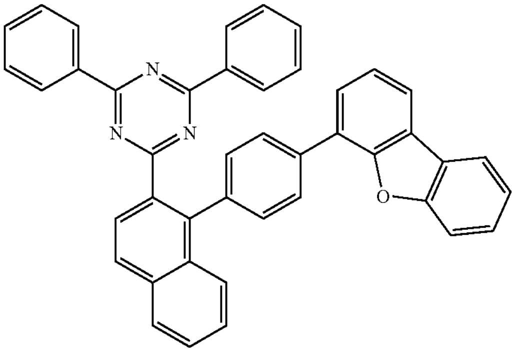
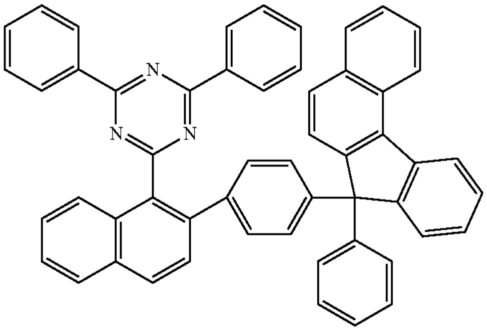

-continued
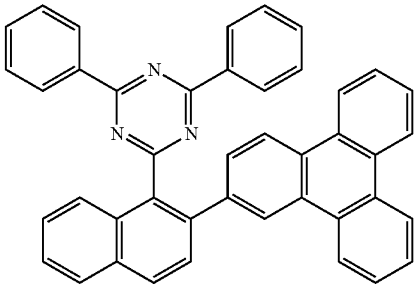
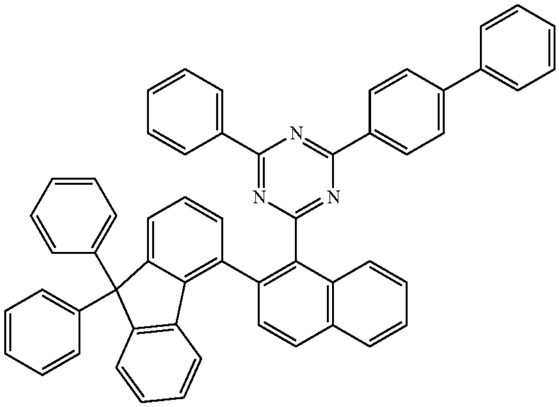
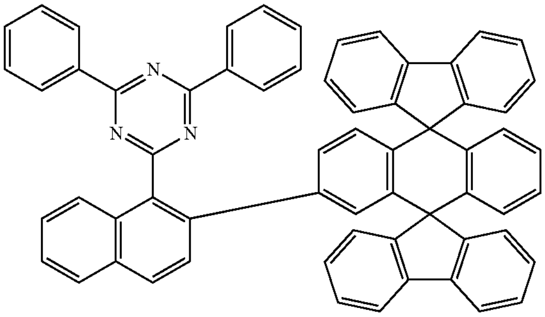
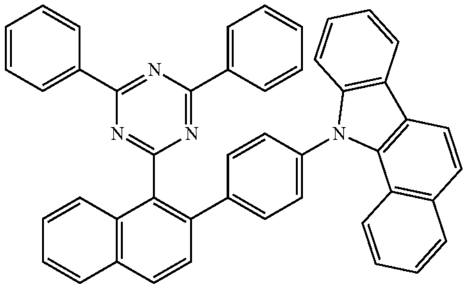
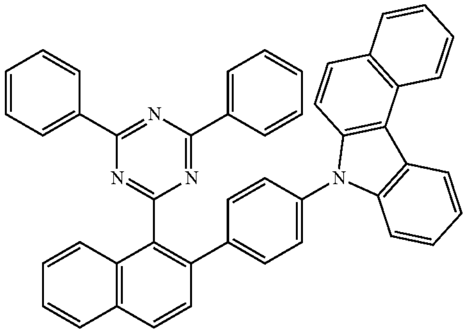
-continued
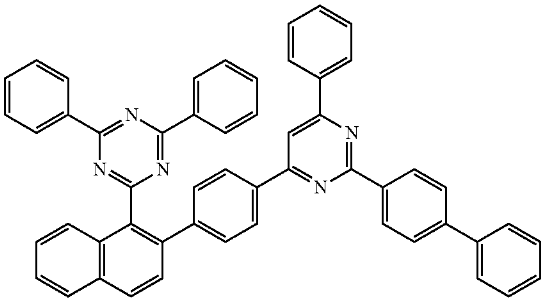
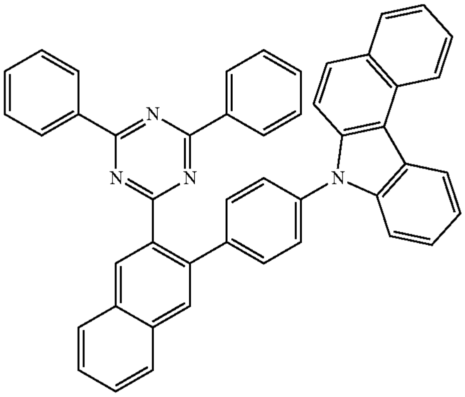
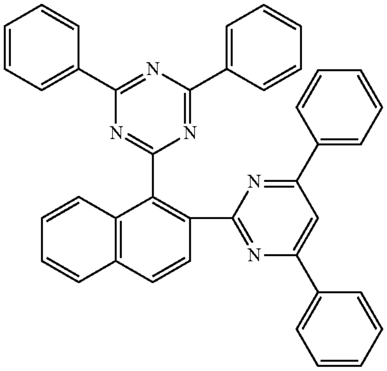
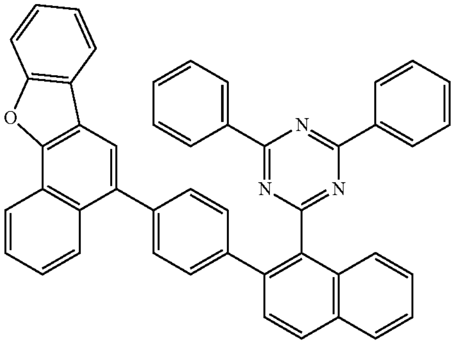

-continued
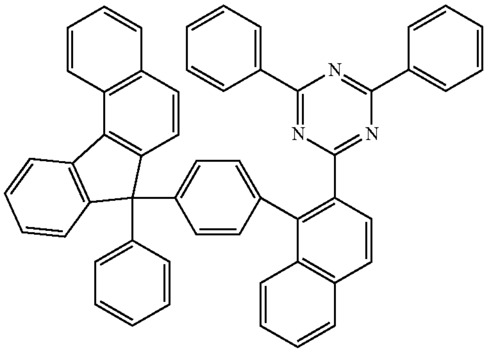
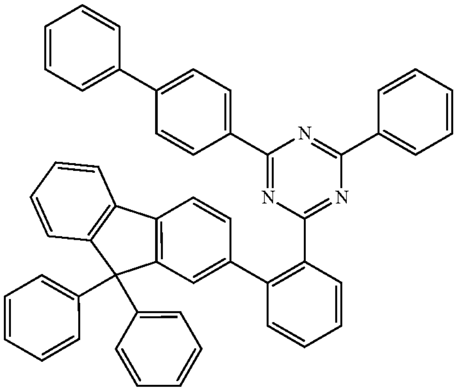
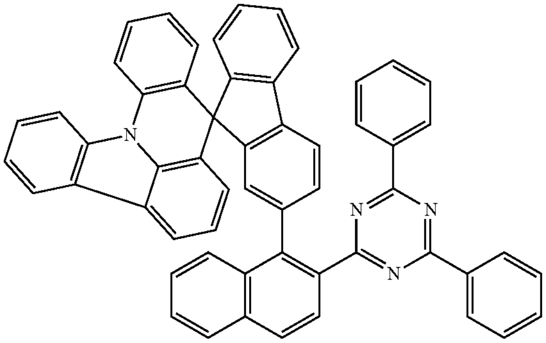
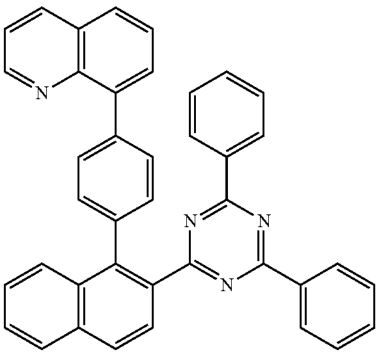
-continued
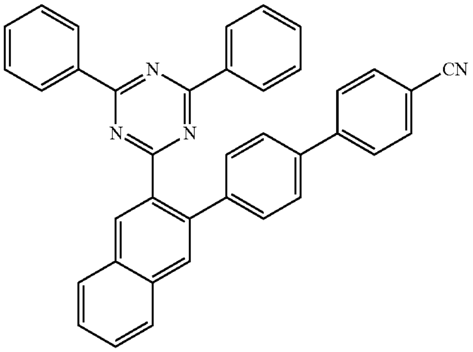
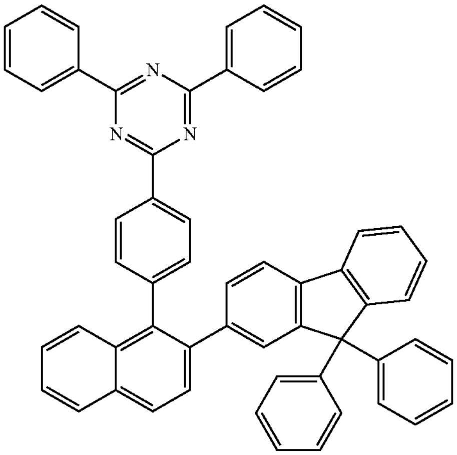
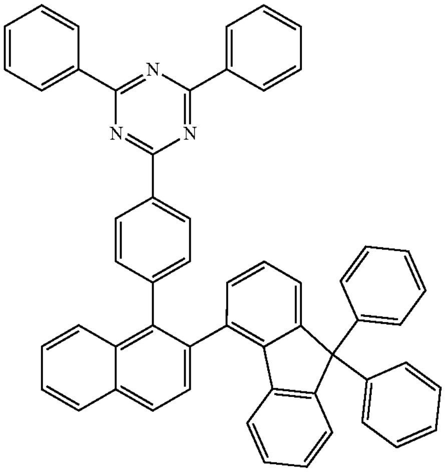

-continued
[Formula 62]
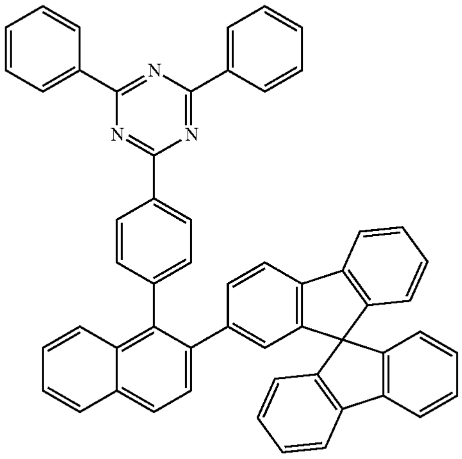
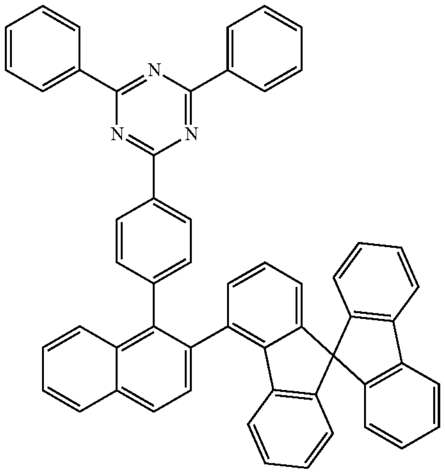
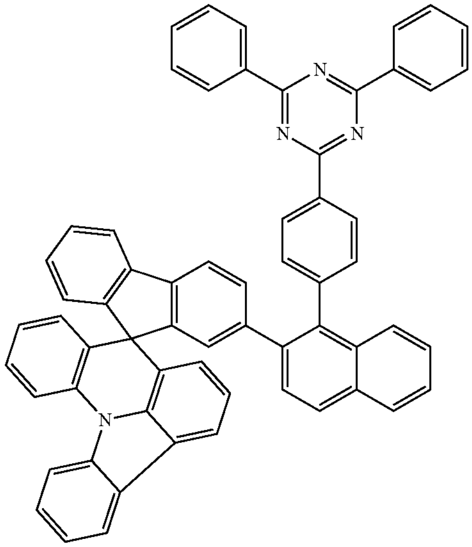
-continued
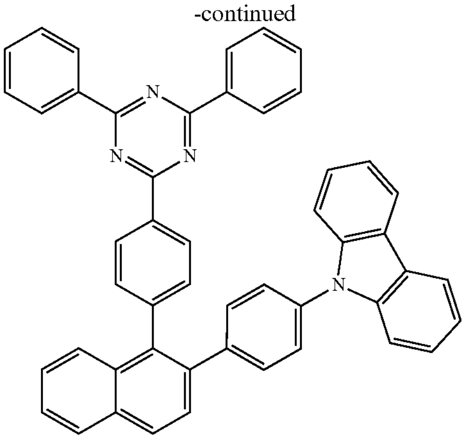
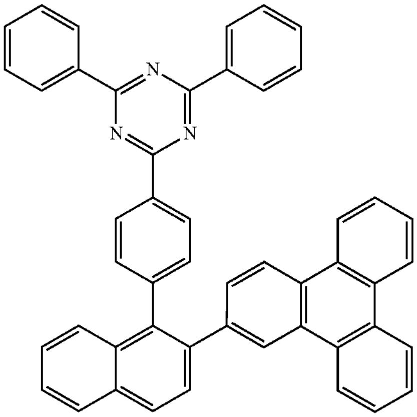
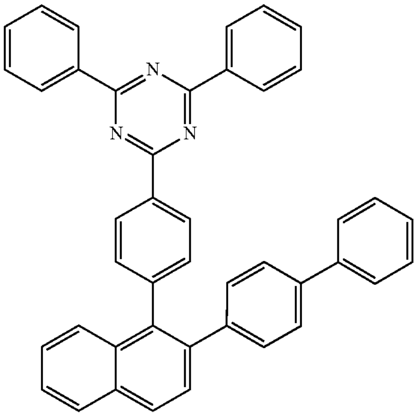
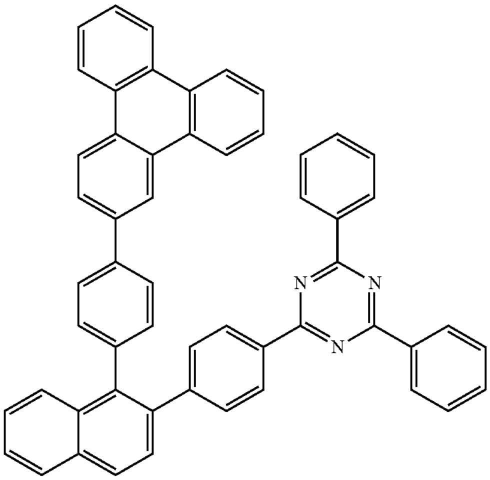

-continued
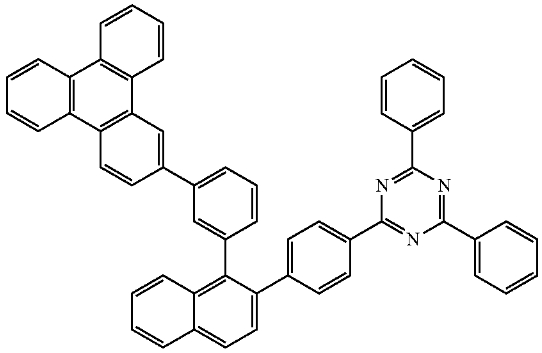
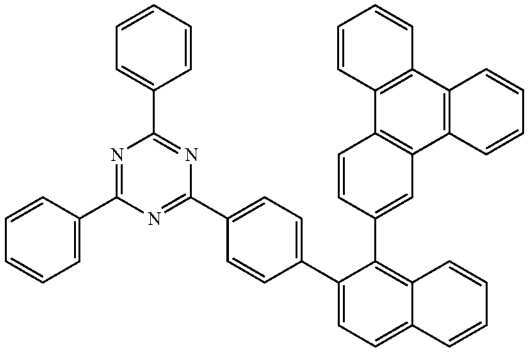
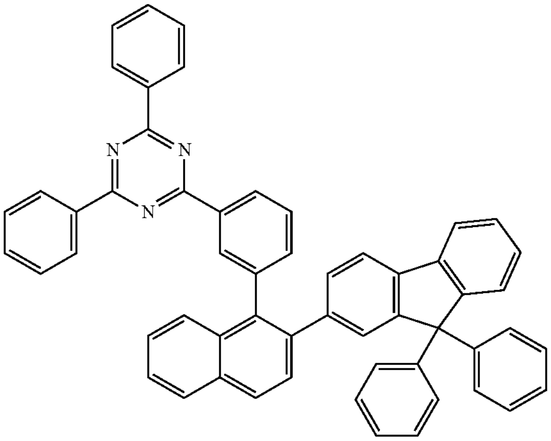
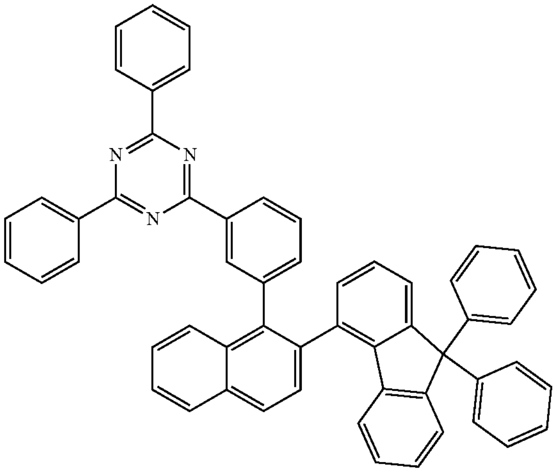
-continued
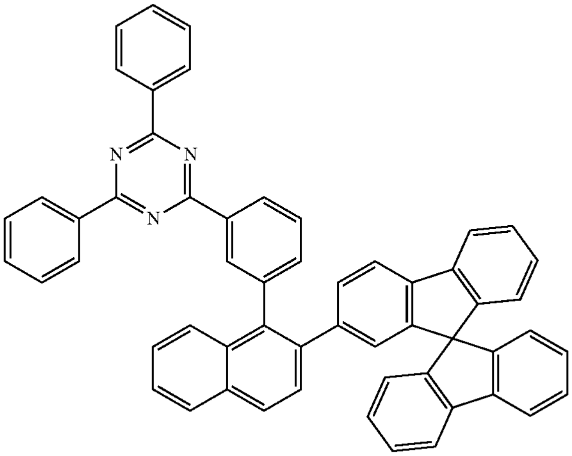
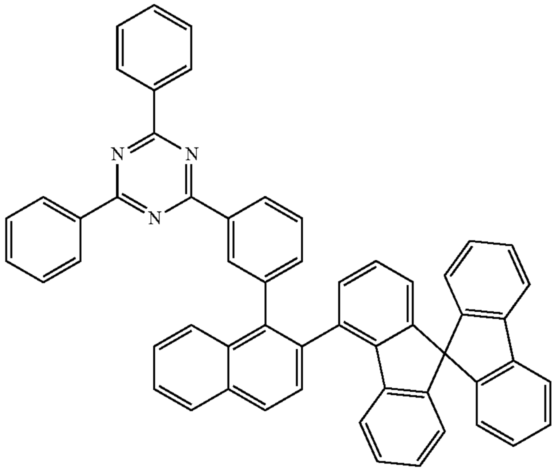
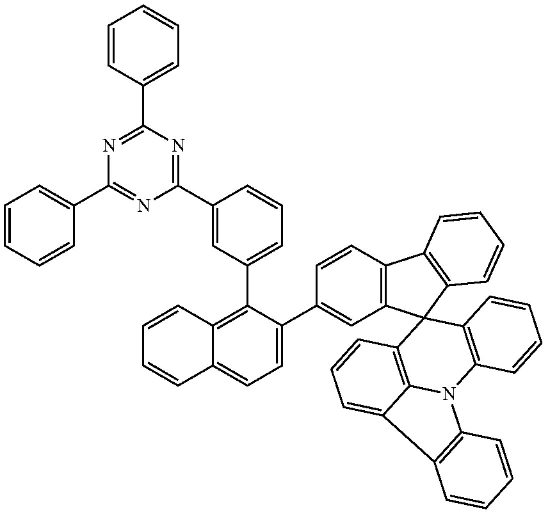

-continued
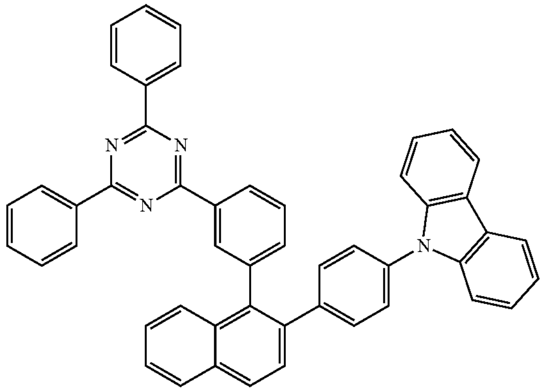
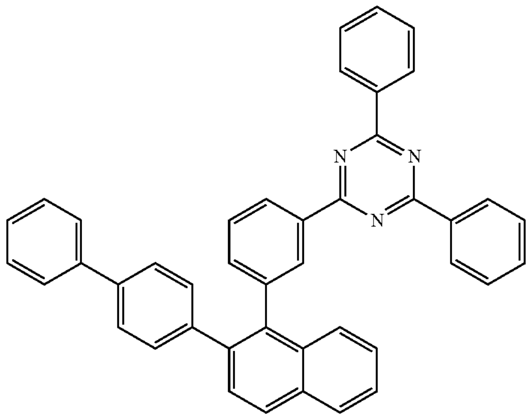
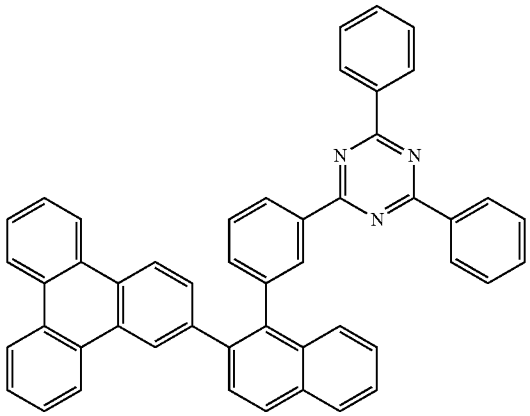
-continued
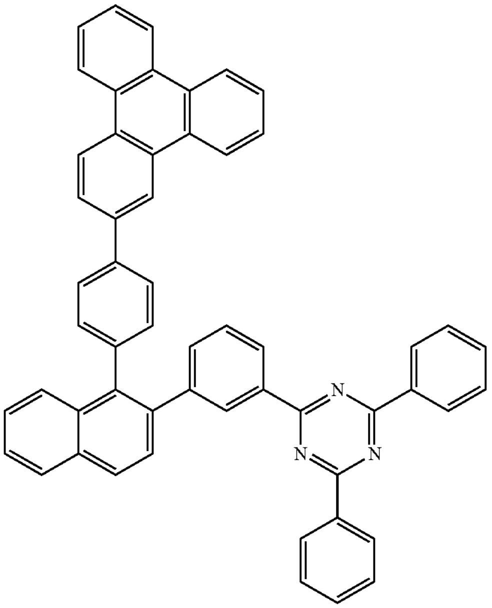
[Formula 63]
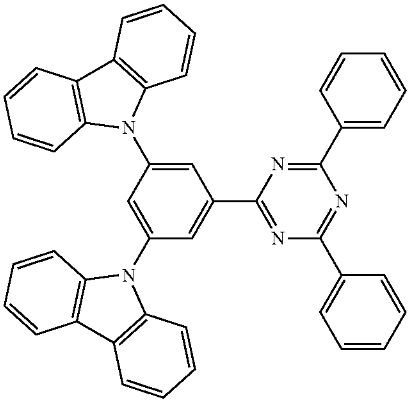
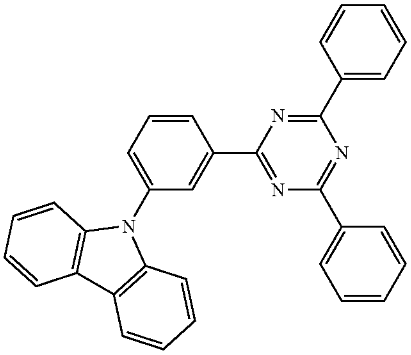
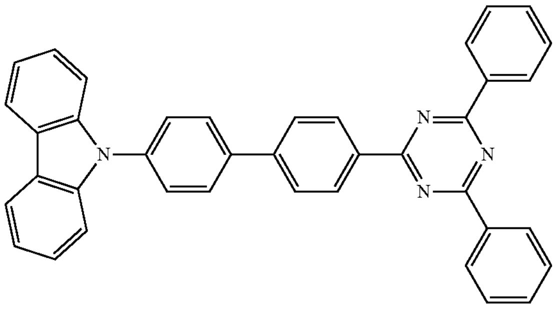

-continued
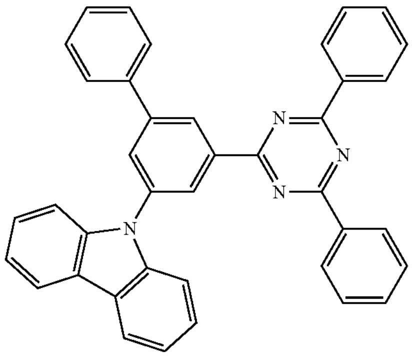
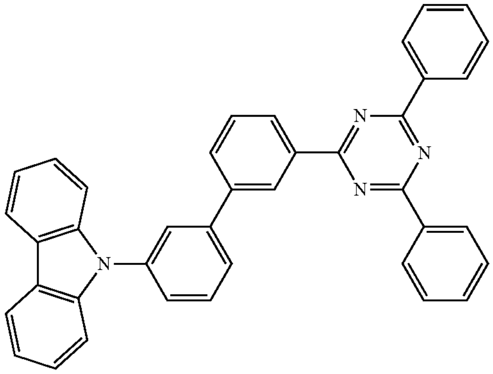
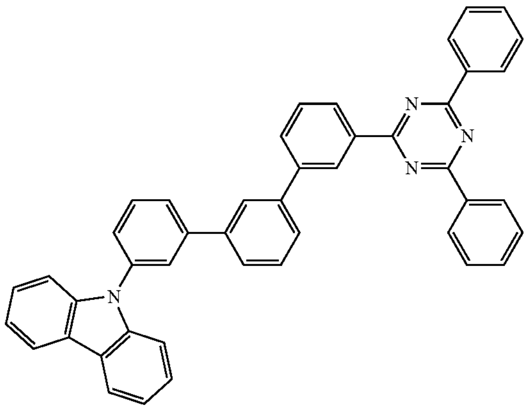
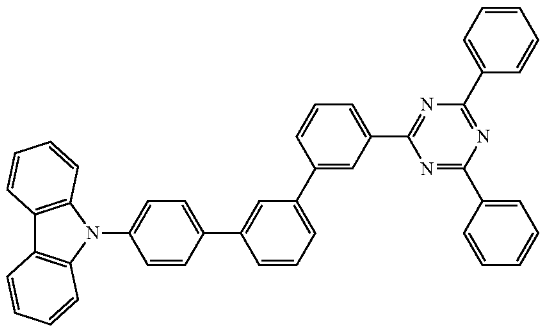
-continued
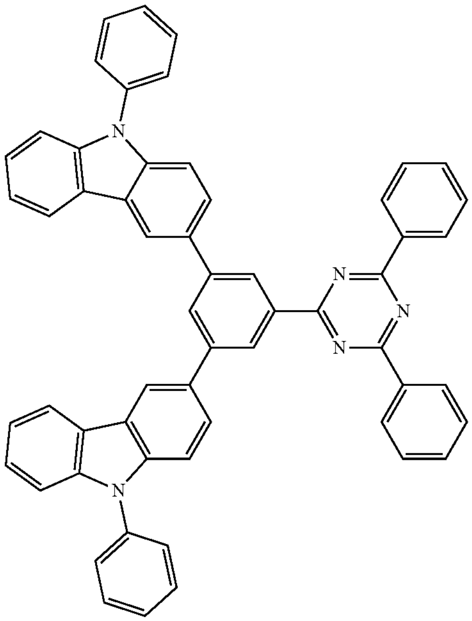
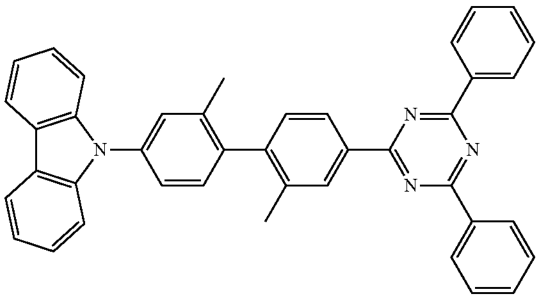
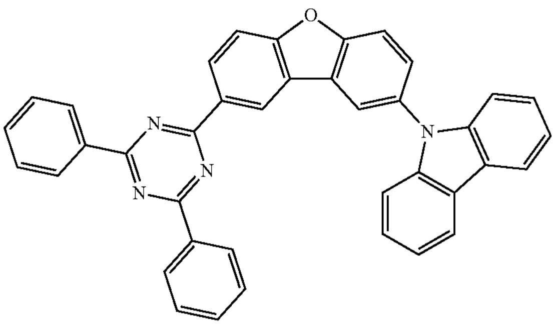
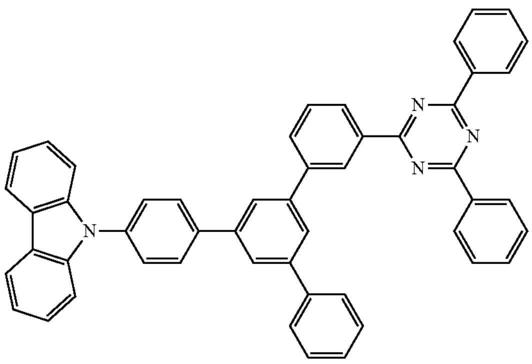

-continued
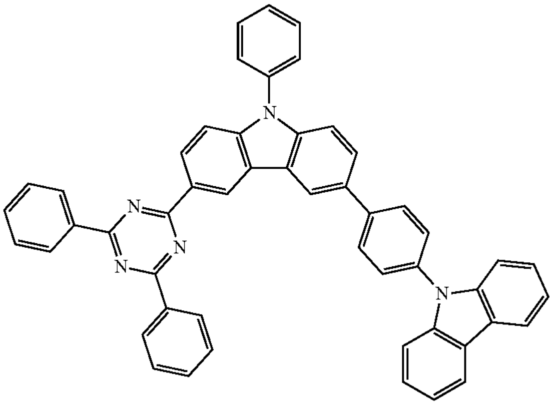
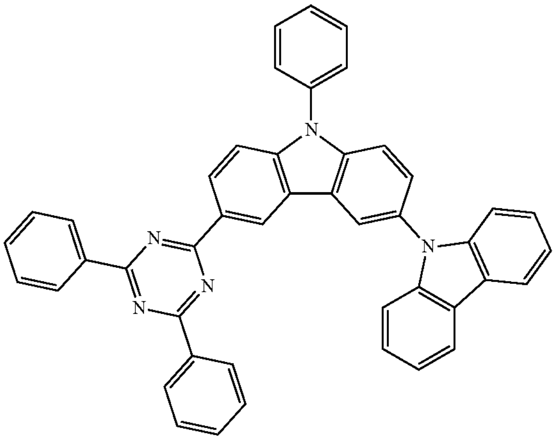
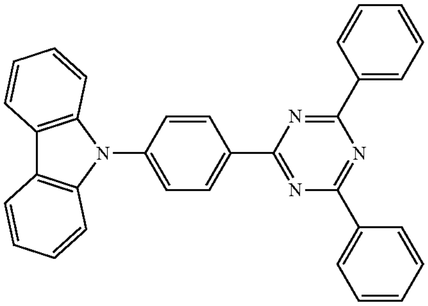
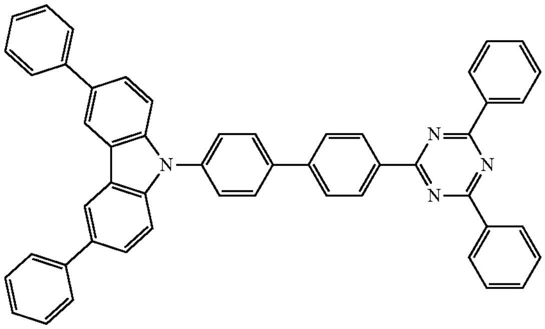
-continued
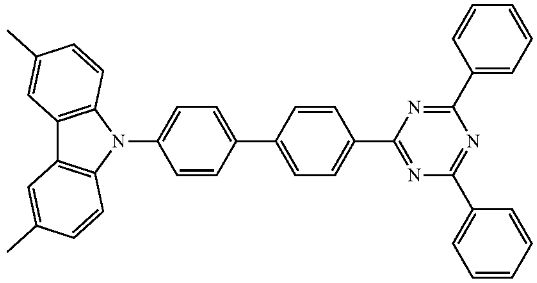
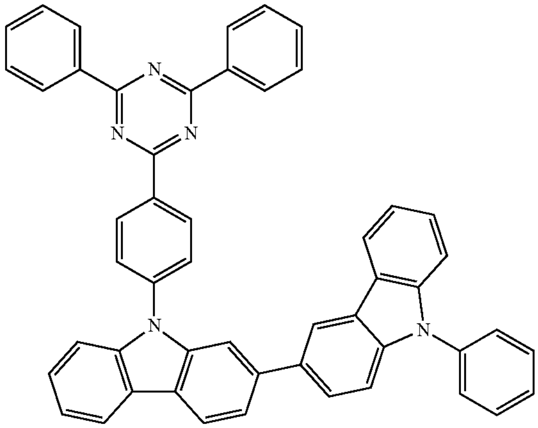
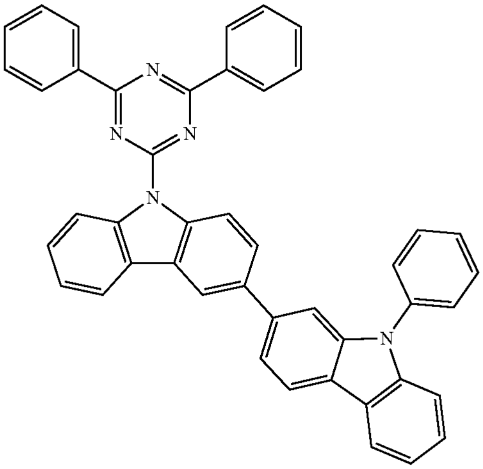

-continued
[Formula 64]
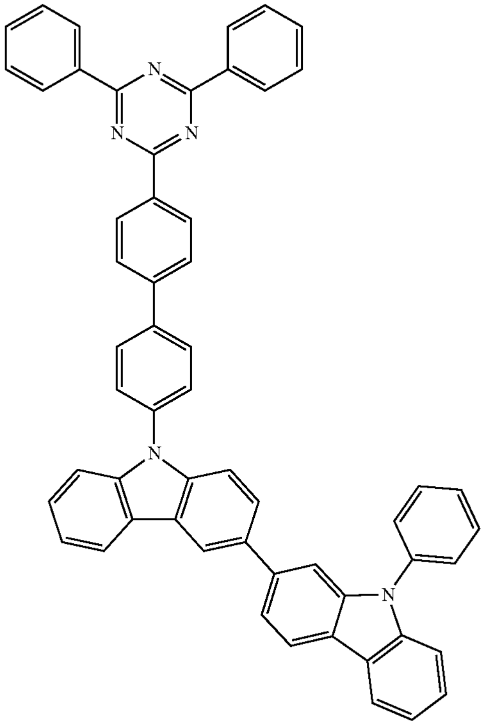
-continued
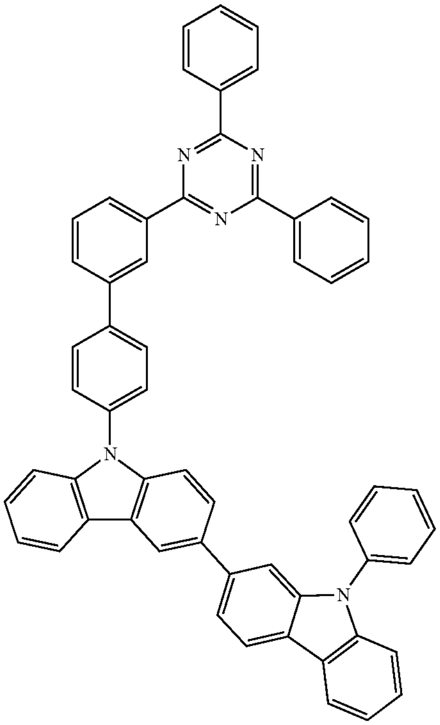
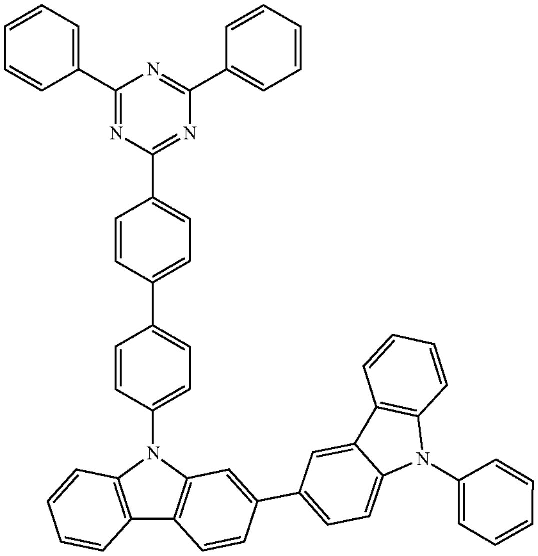
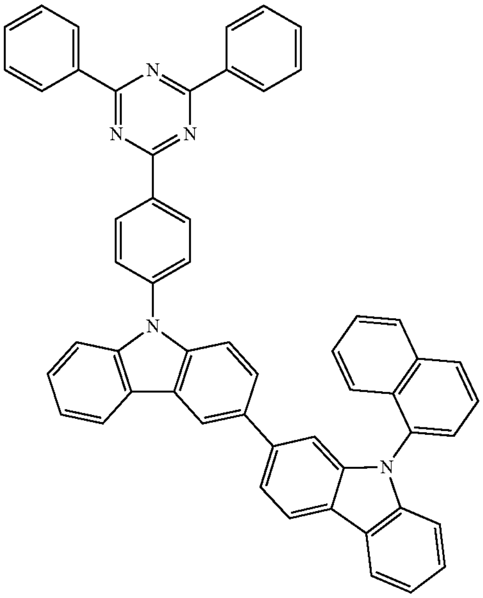

-continued
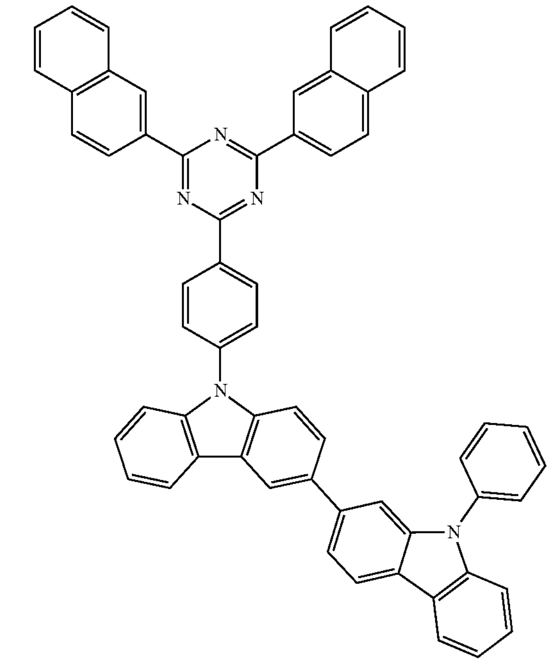
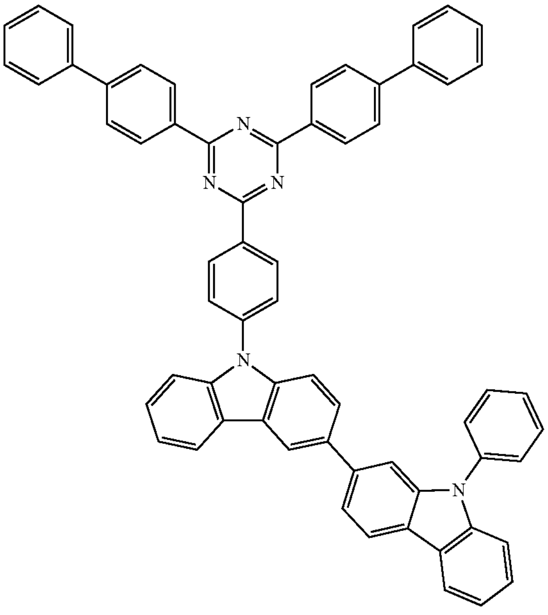
-continued
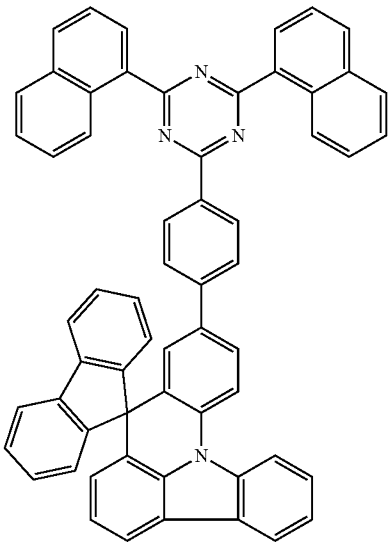
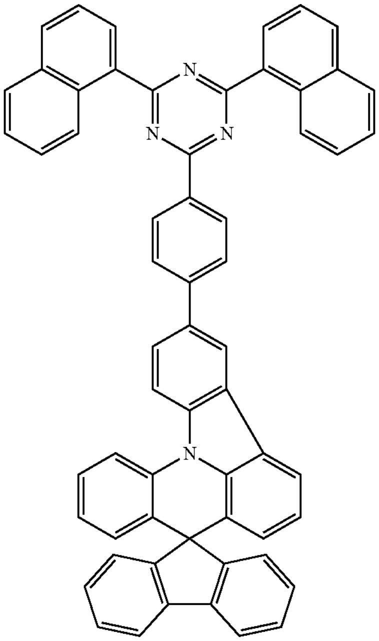
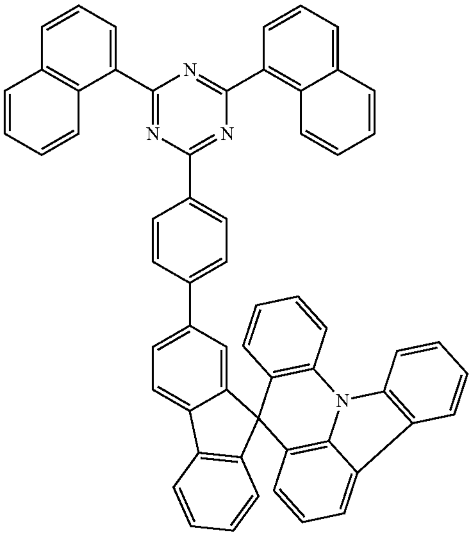

-continued
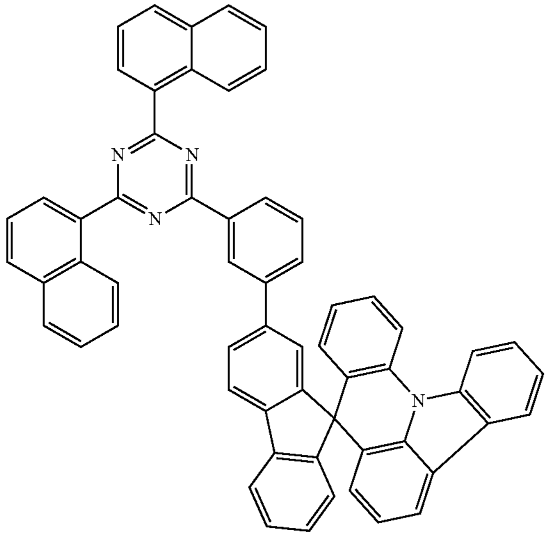
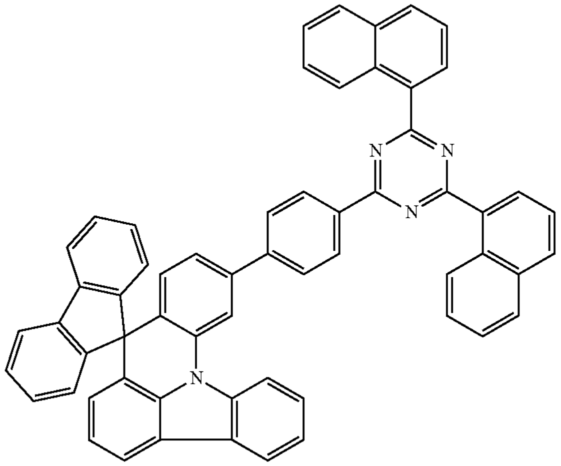
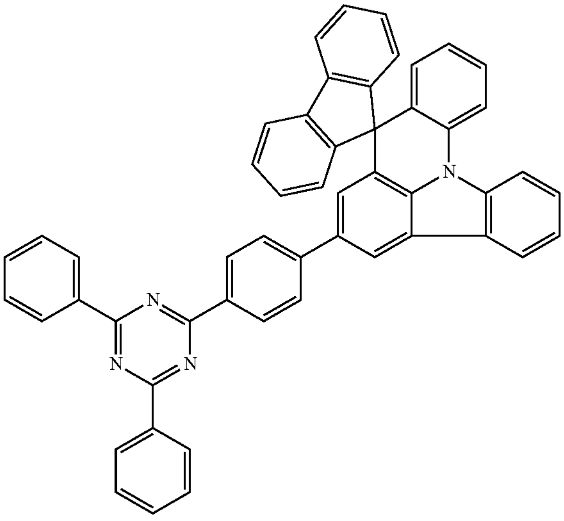
-continued
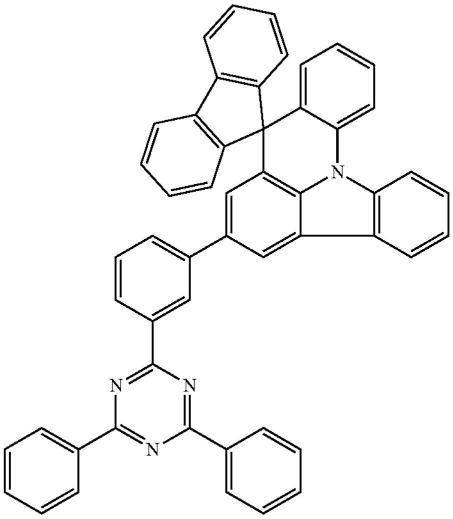
[Formula 65]
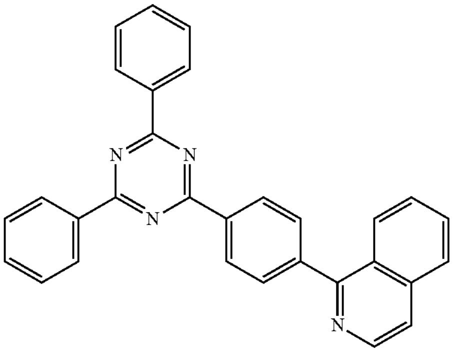
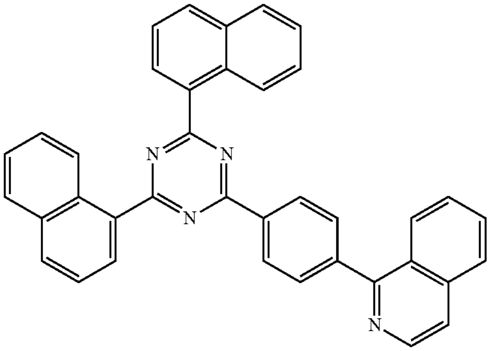
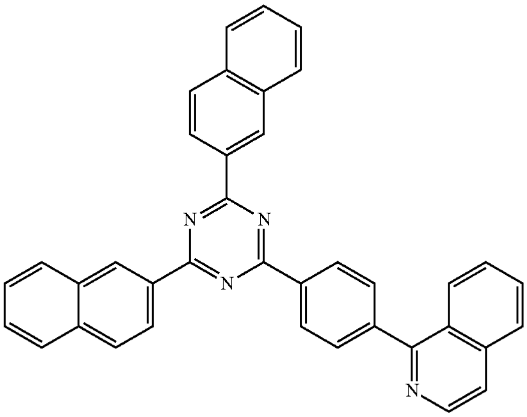

-continued
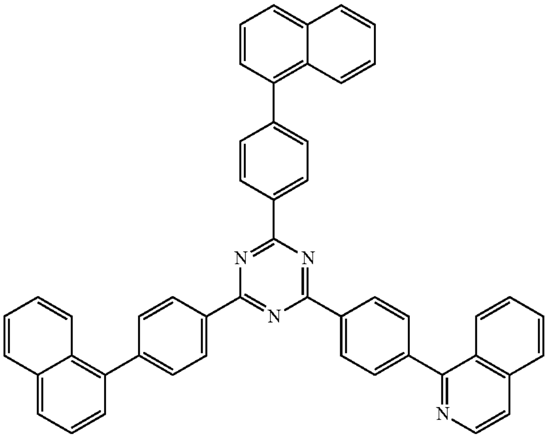
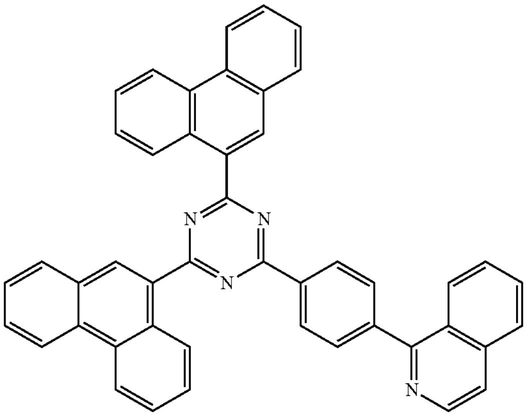
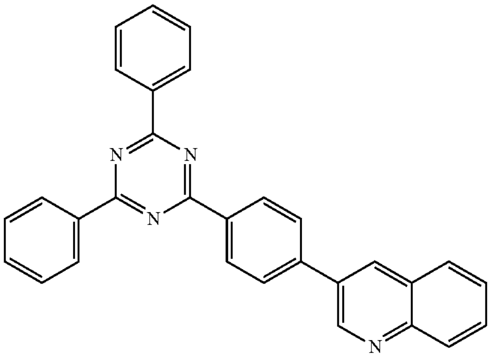
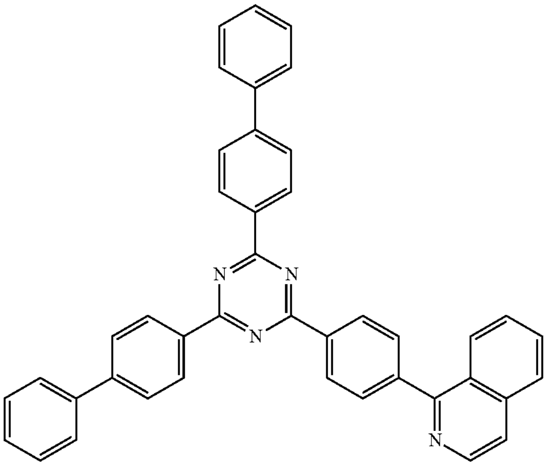
-continued
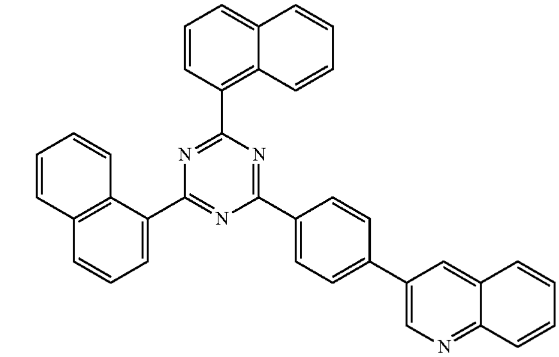
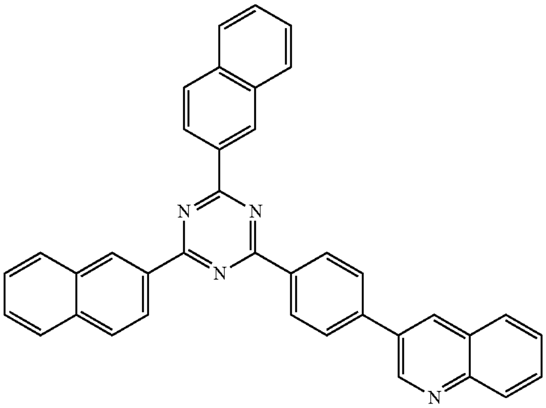
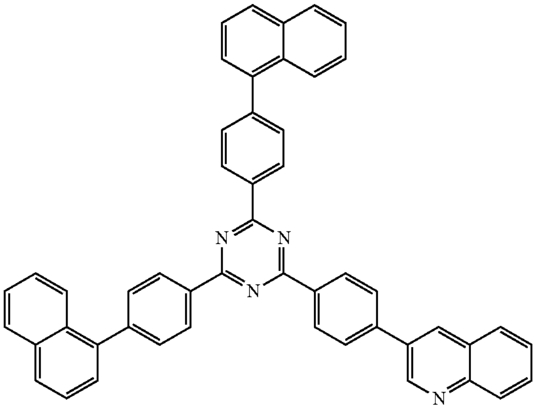
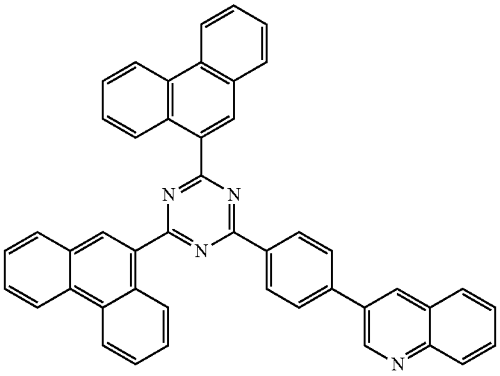

-continued
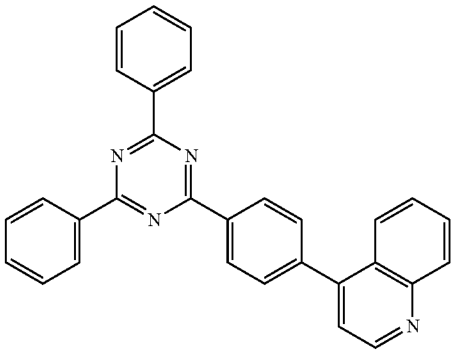
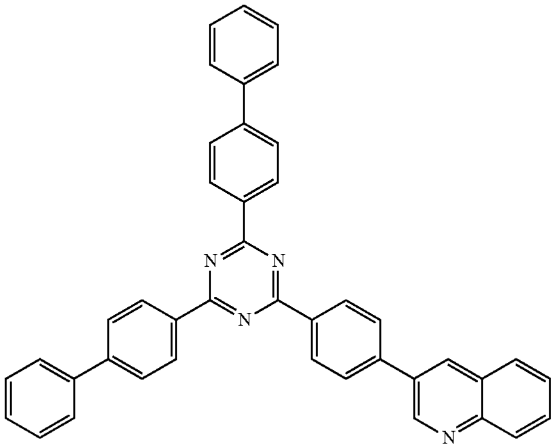
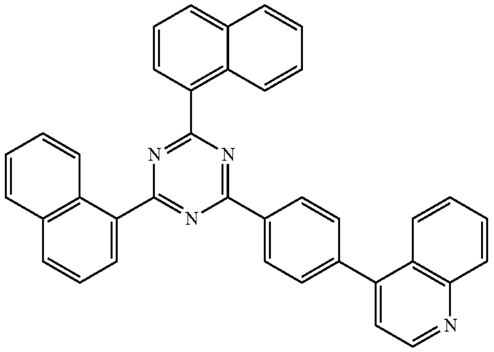
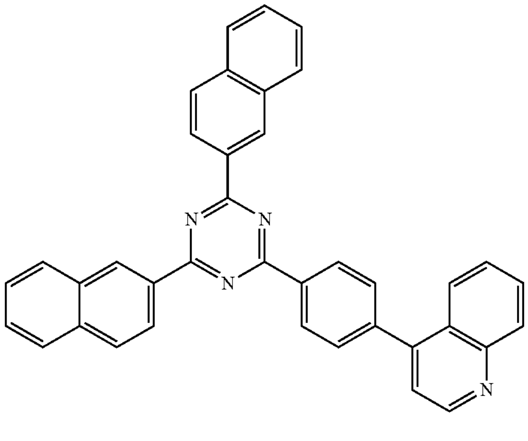
-continued
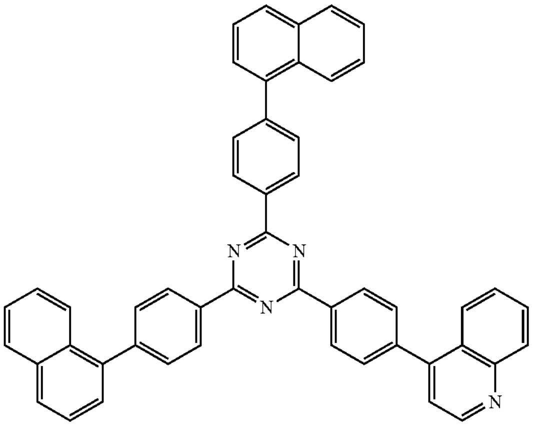
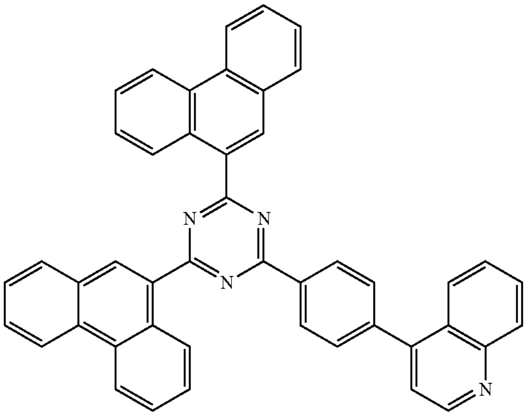
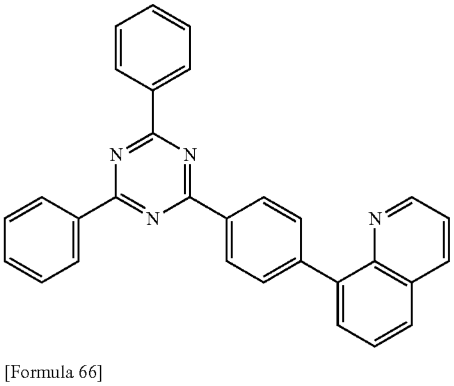
[Formula 66]
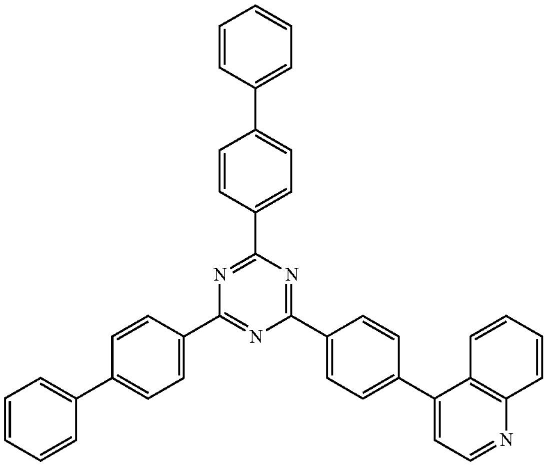

-continued
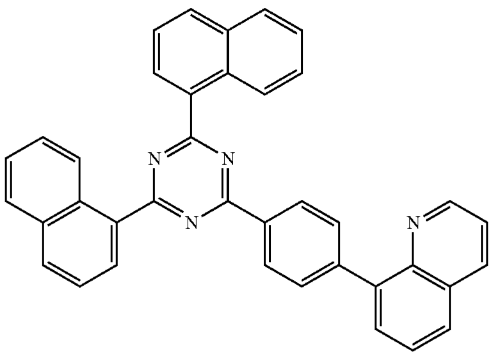
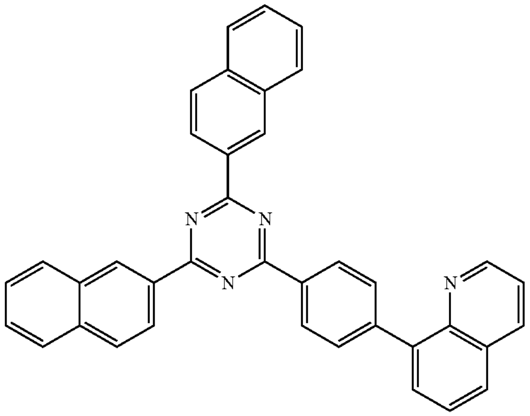
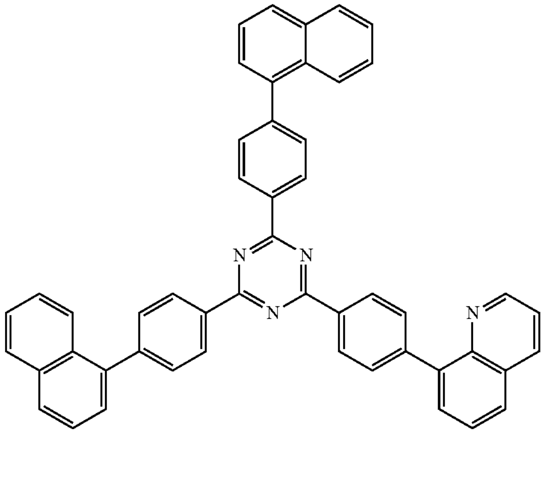
-continued
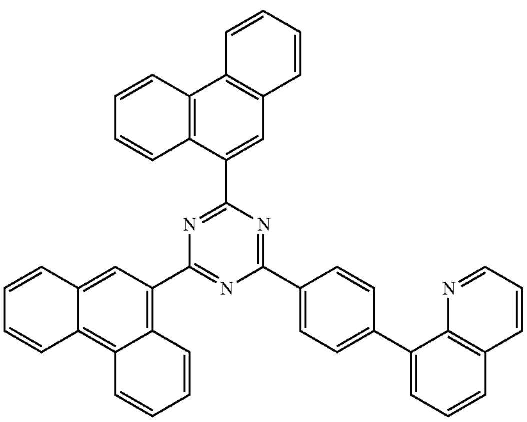
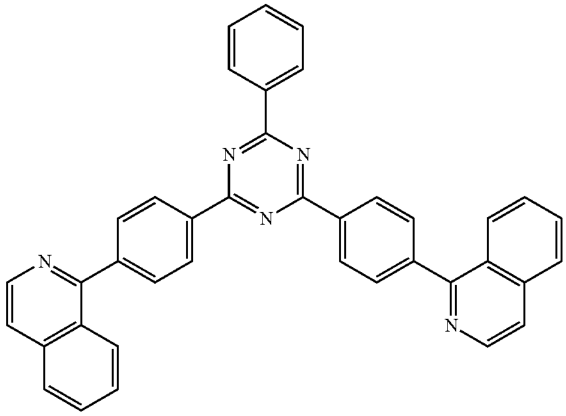
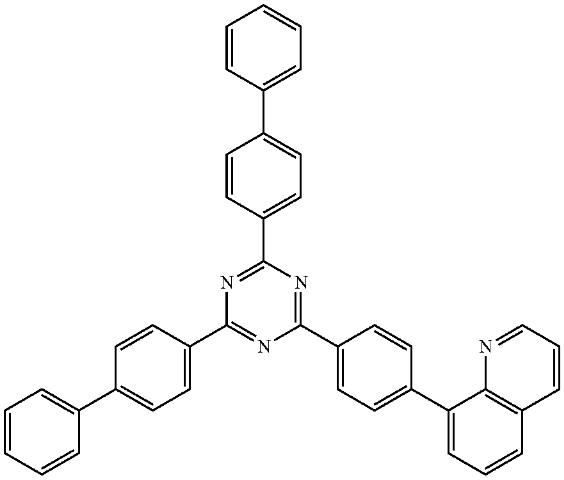

-continued
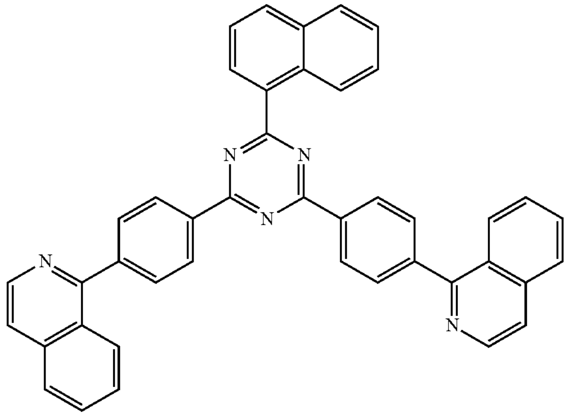
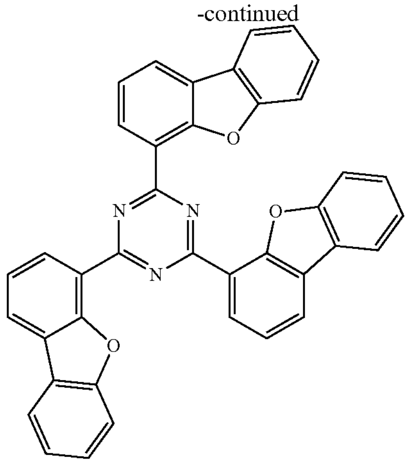
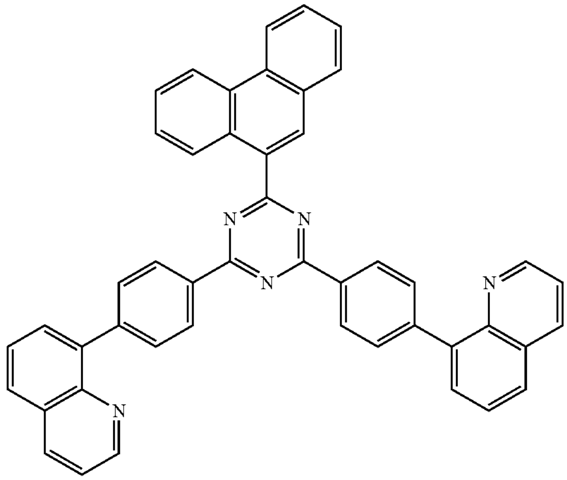
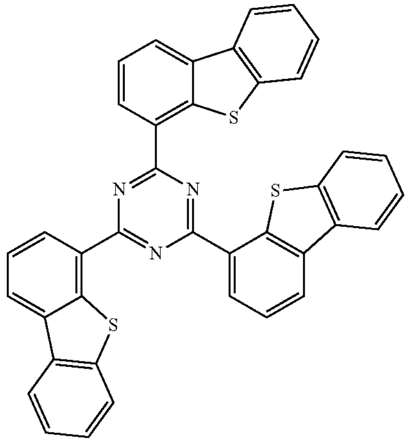
[Formula 67]
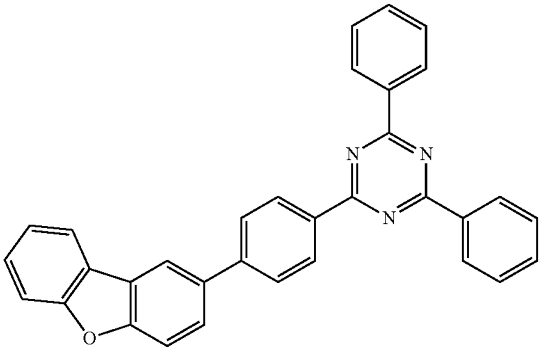
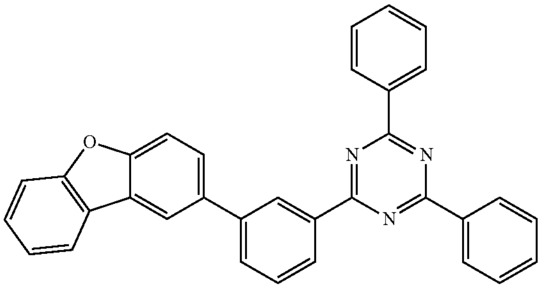

-continued
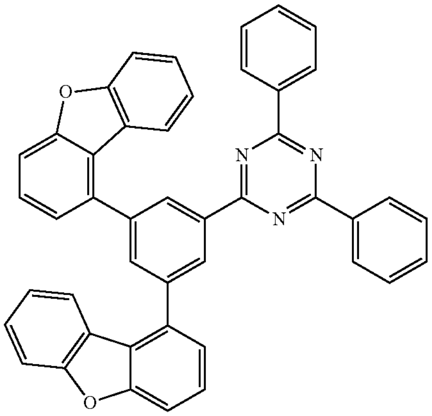
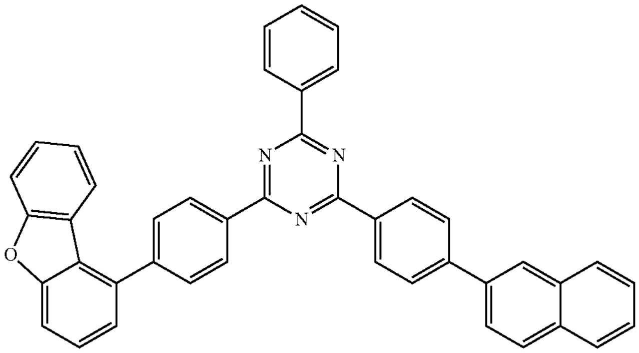
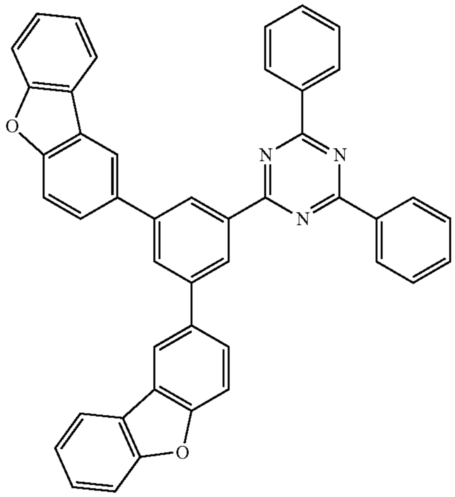
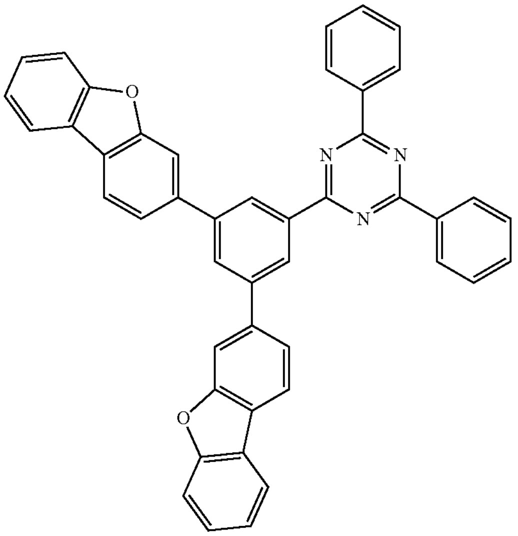
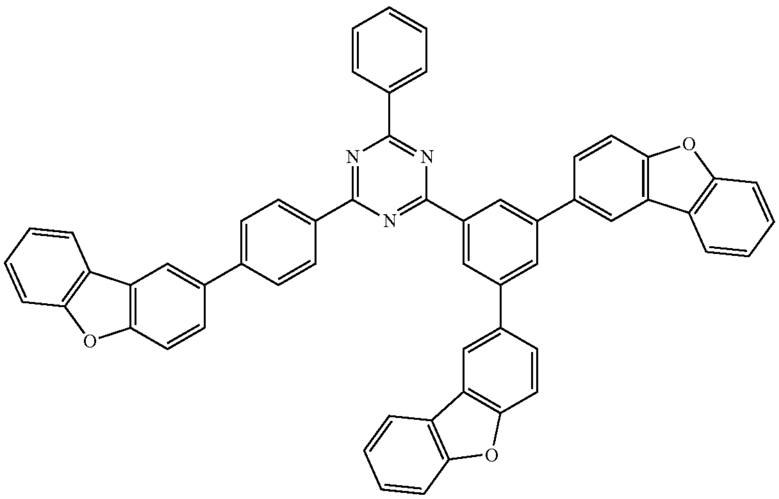

-continued
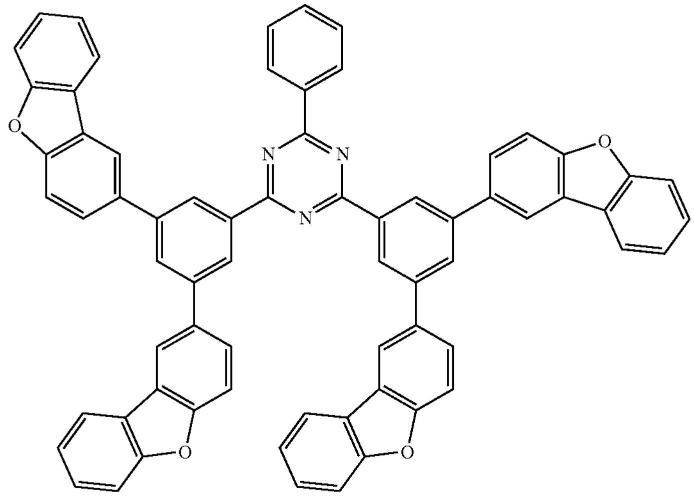
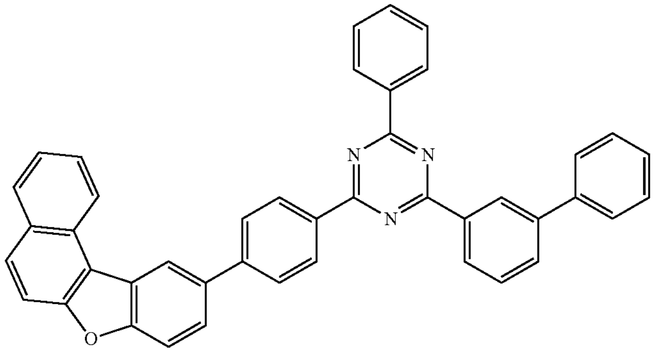
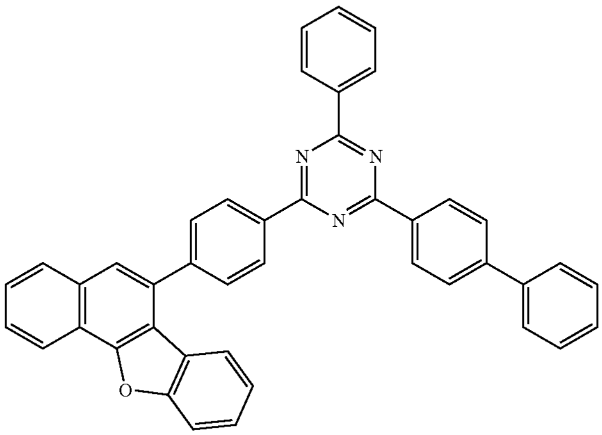
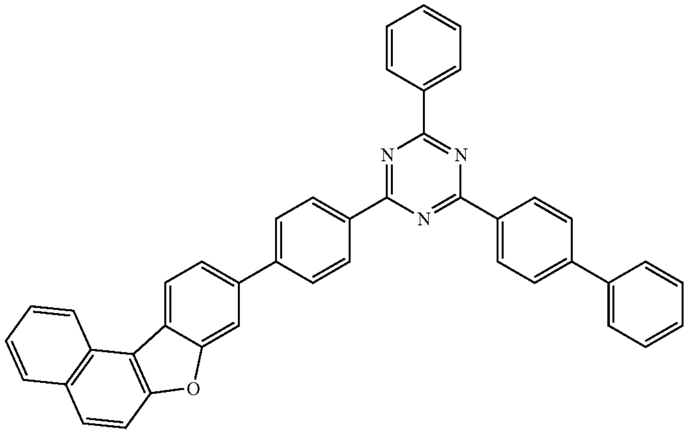

-continued
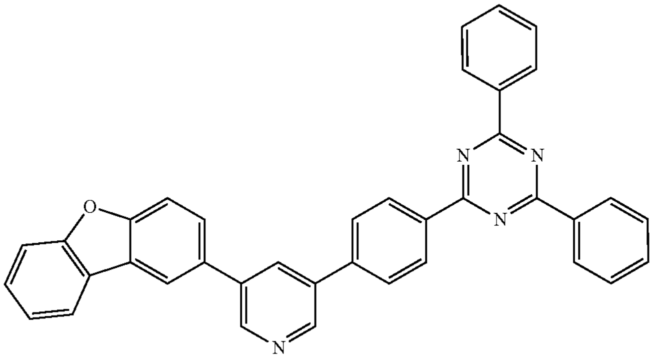
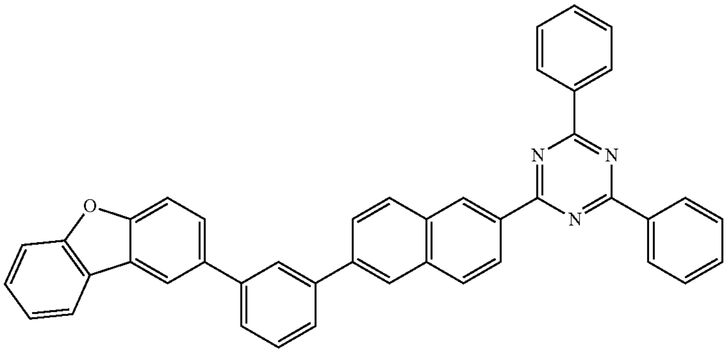
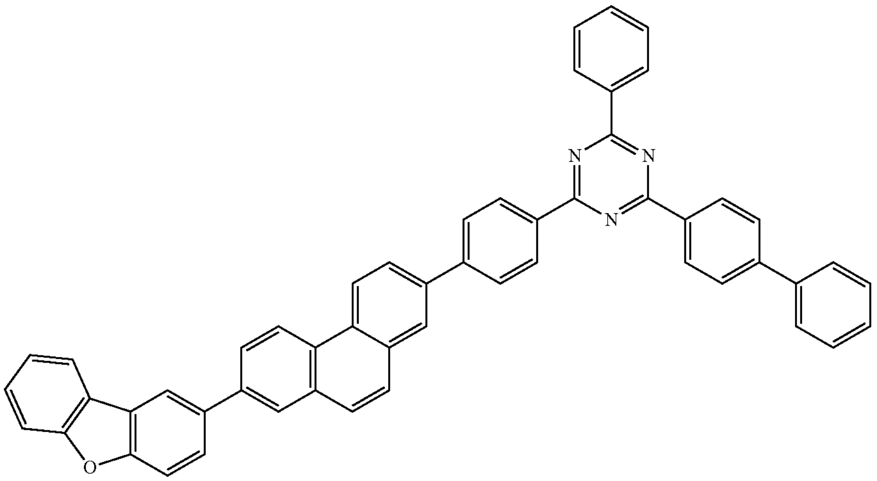
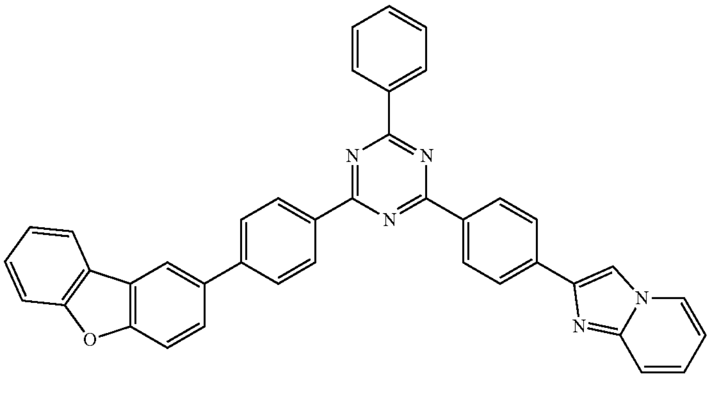

-continued
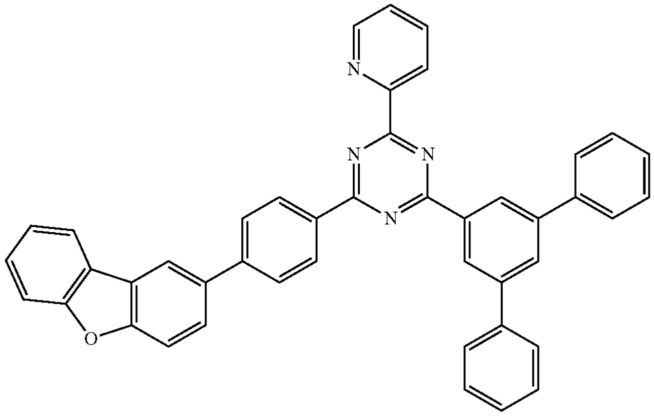
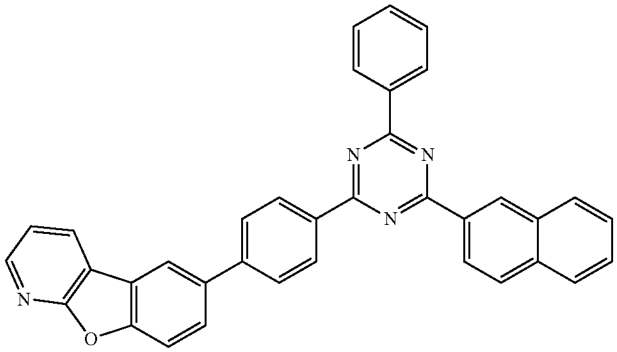
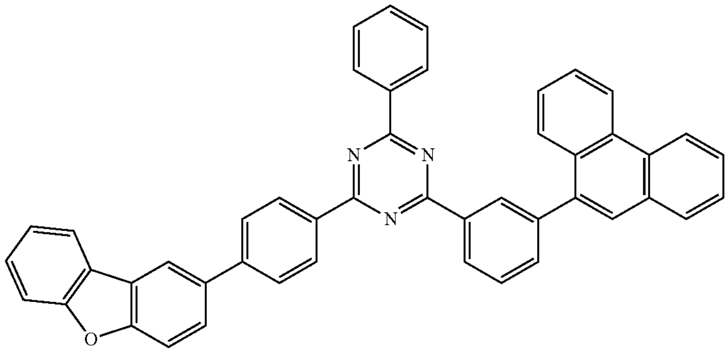
[Formula 68]
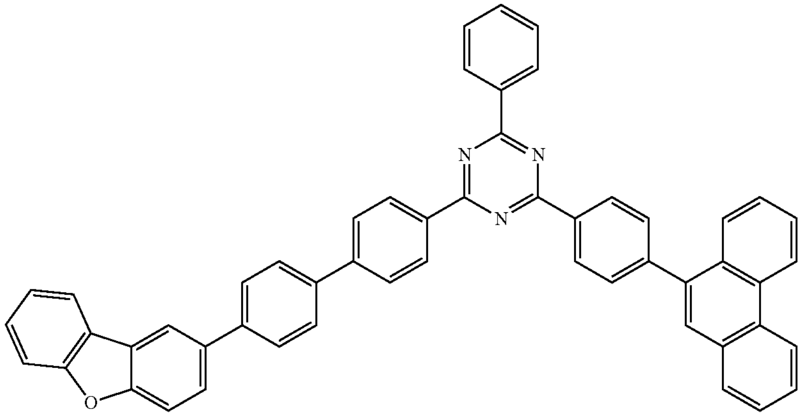

-continued
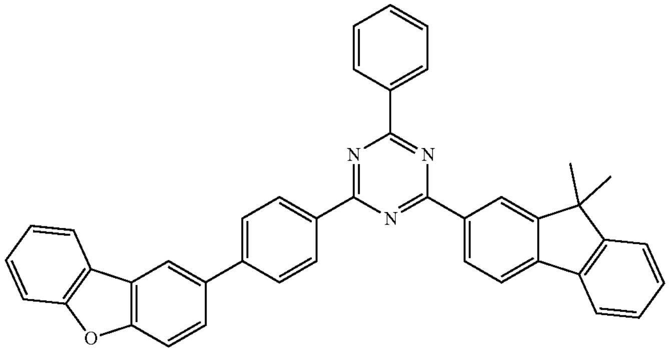
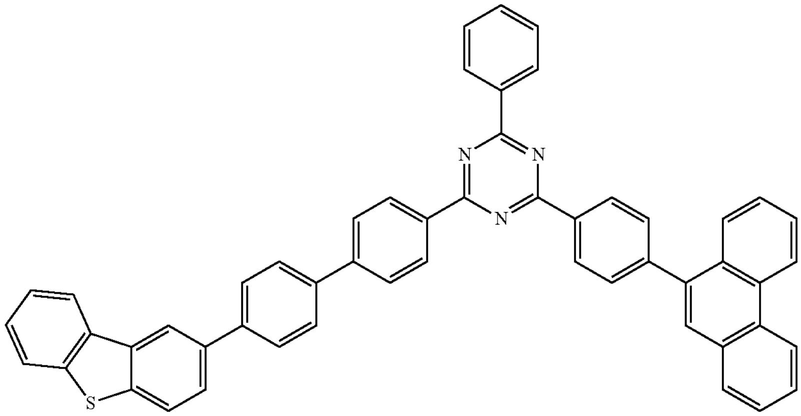
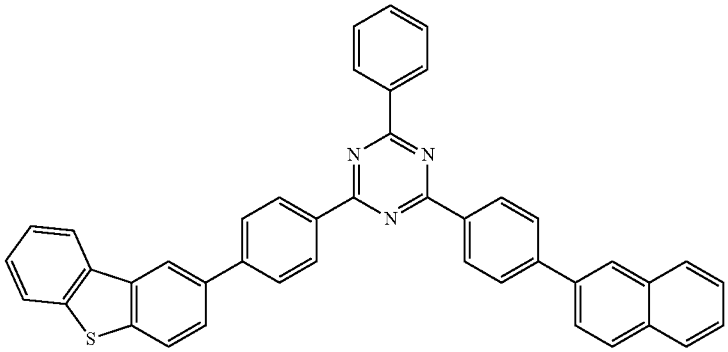
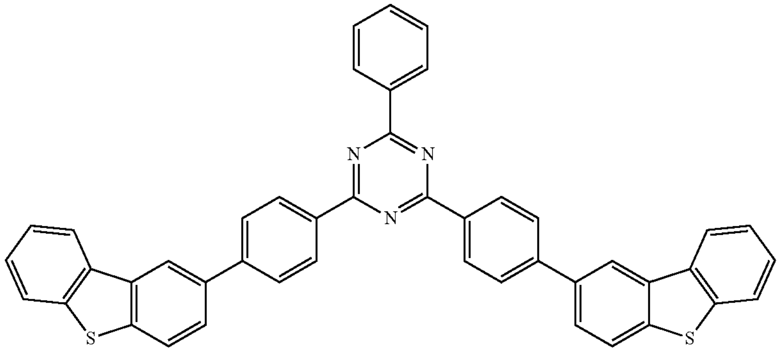

-continued
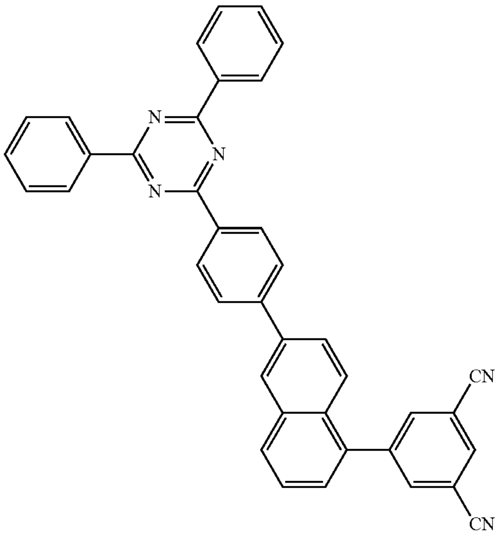
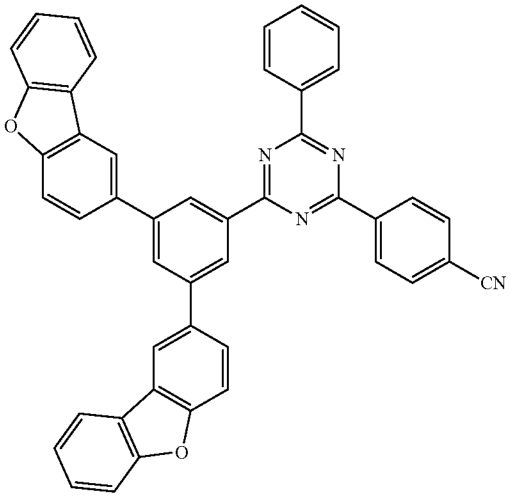
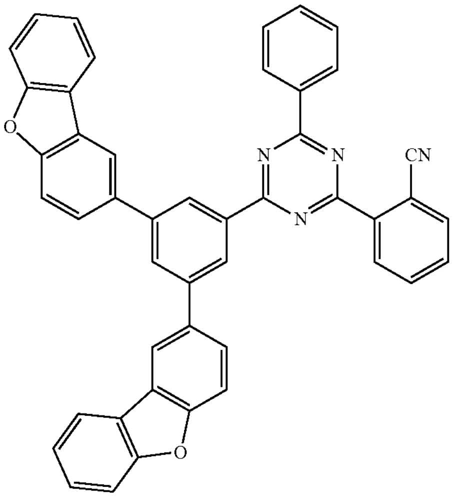
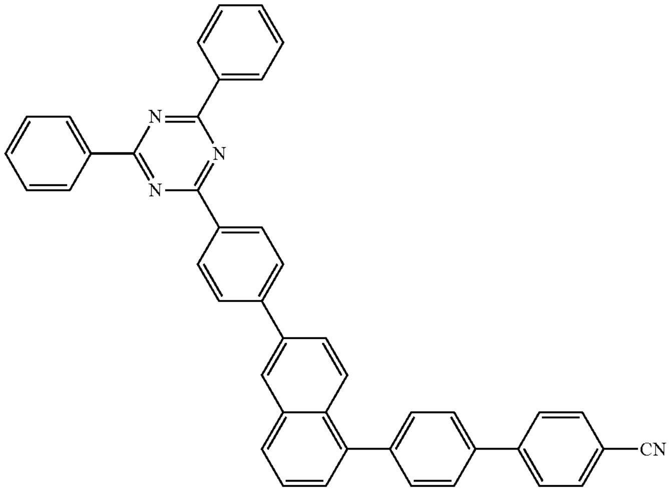
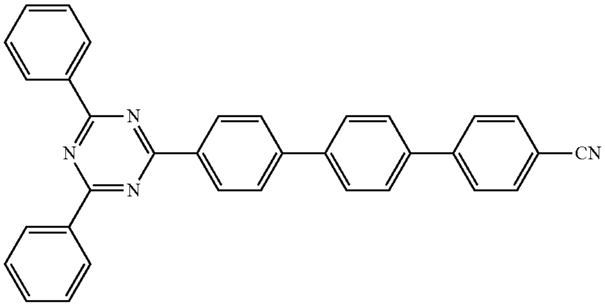
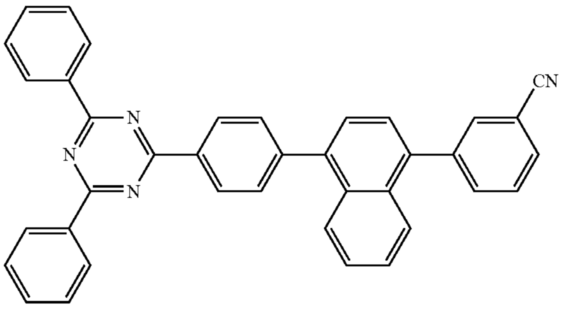

-continued
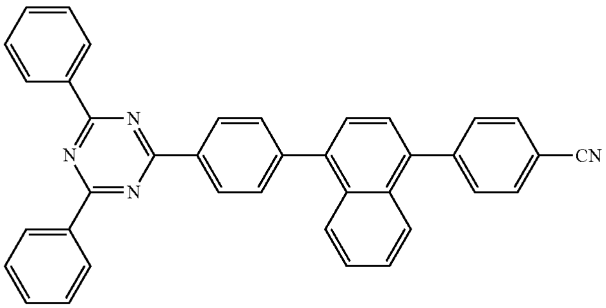
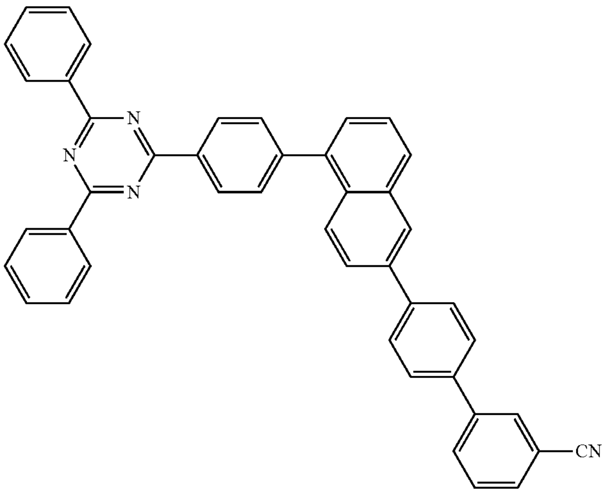
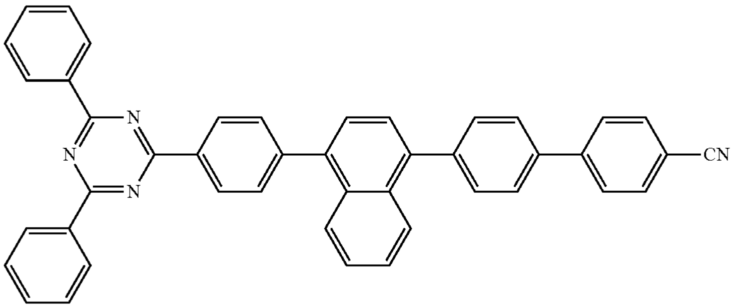
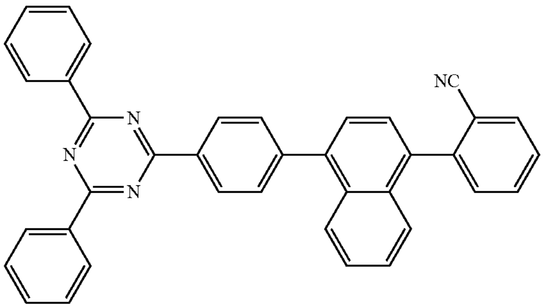
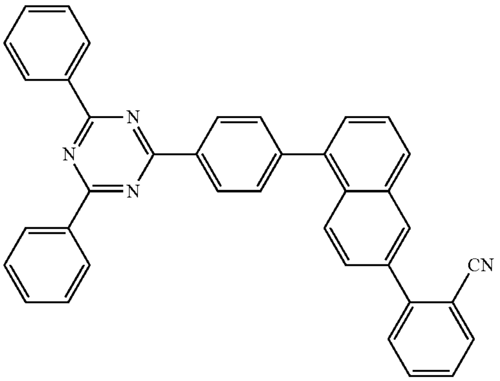

-continued
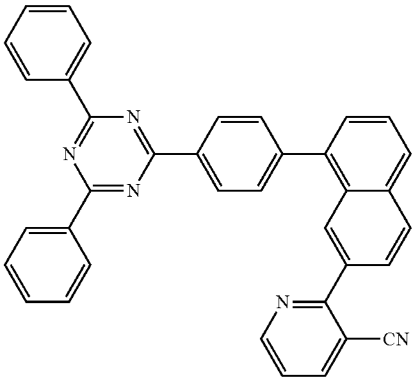
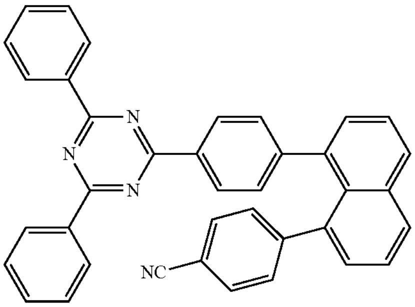
[Formula 69]
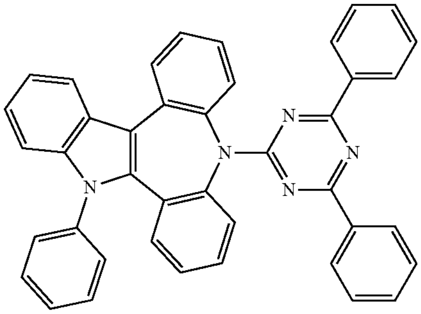
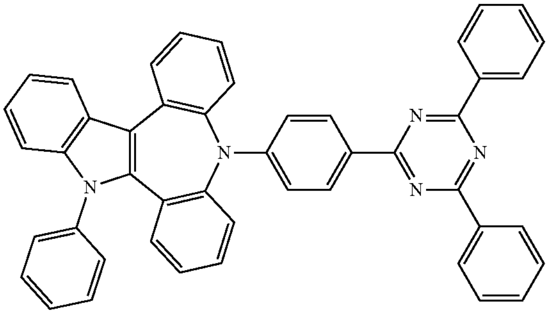
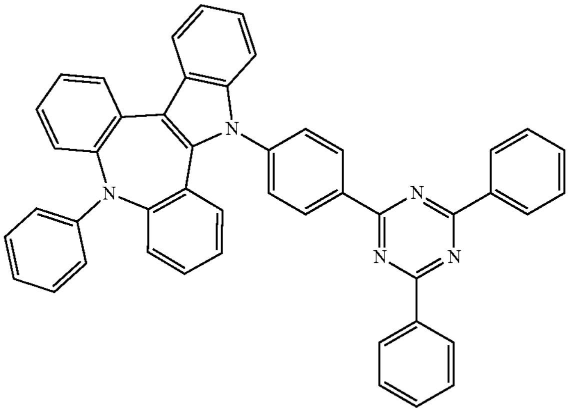
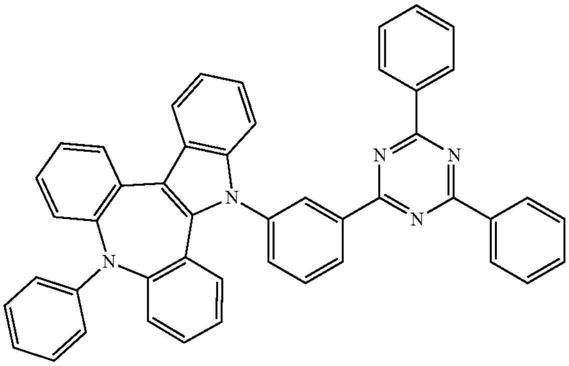
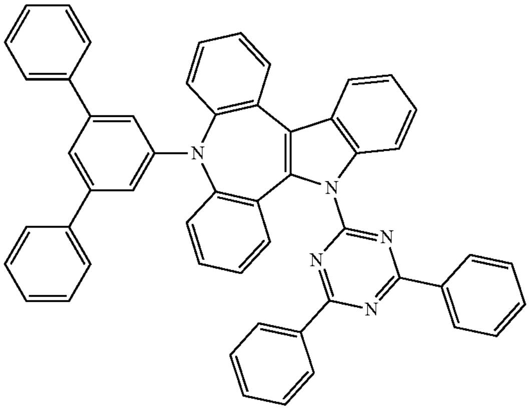

-continued
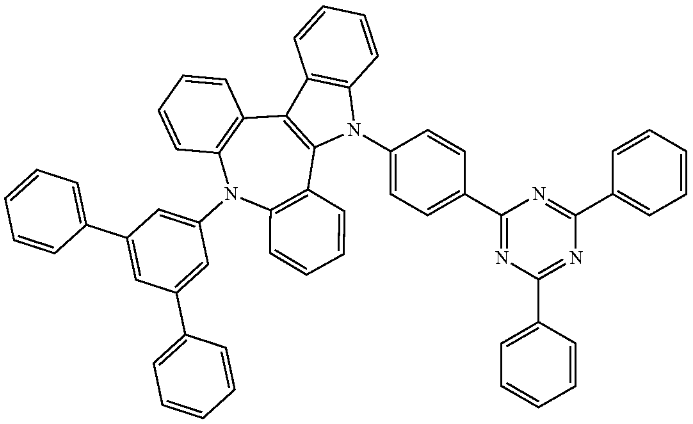
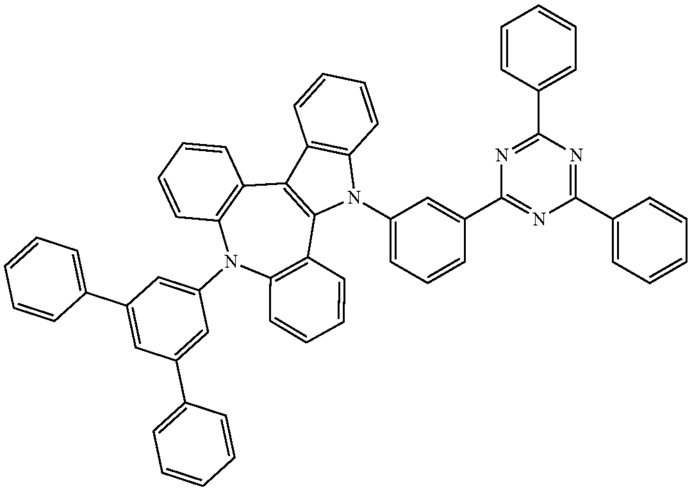
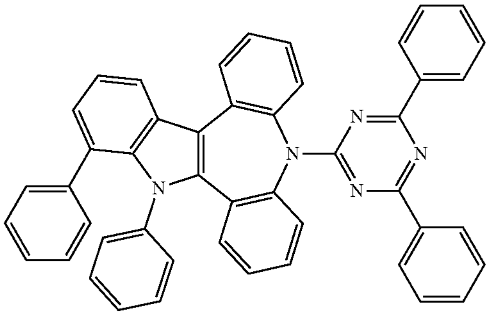
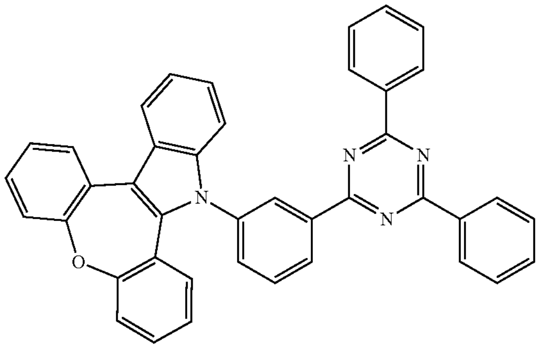
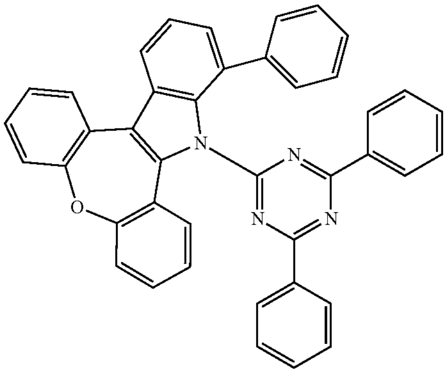
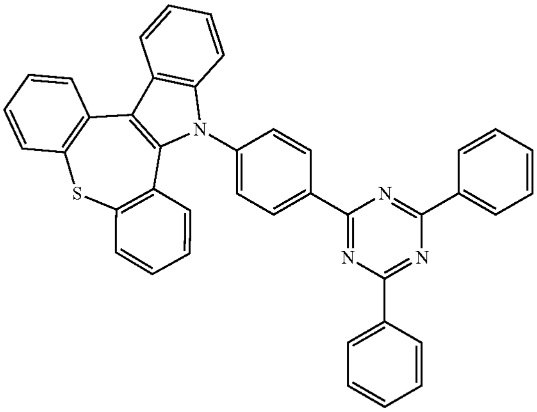

-continued
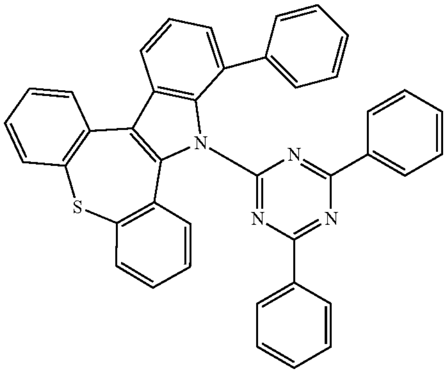
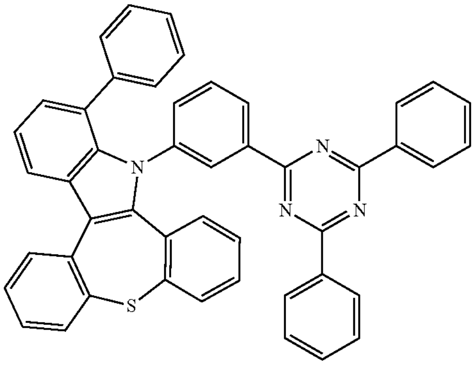
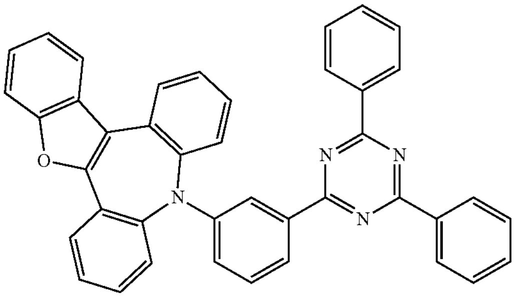
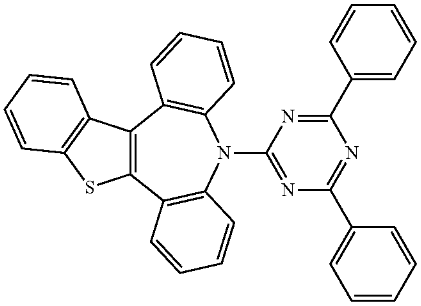
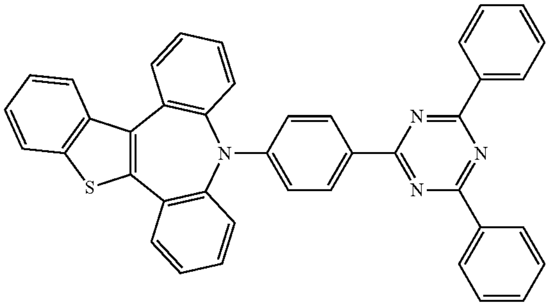
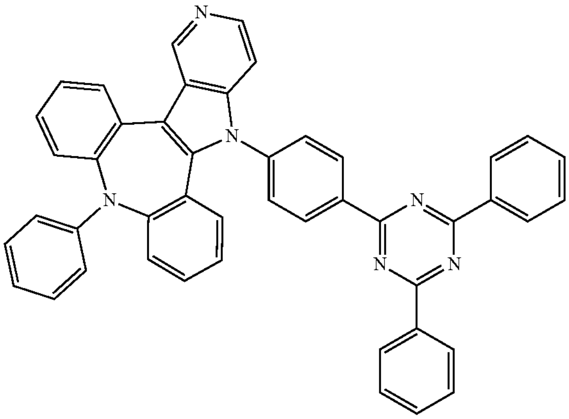
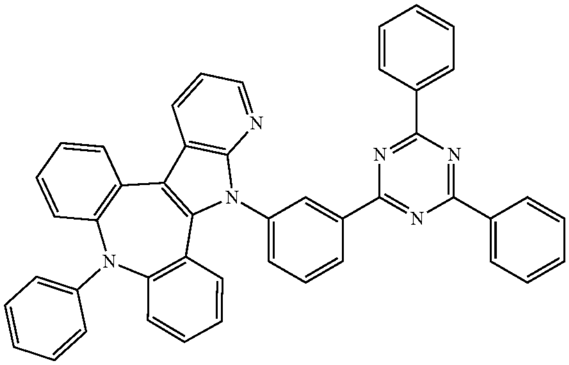

-continued
[Formula 70]
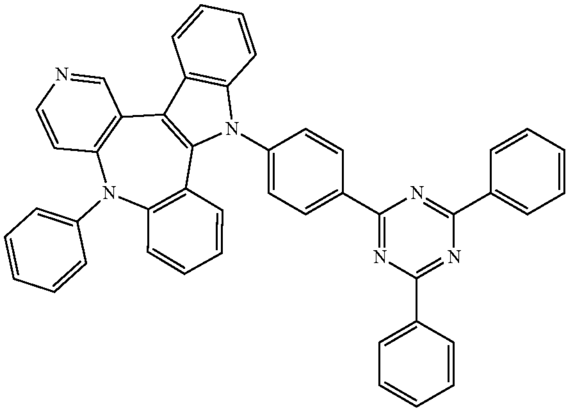
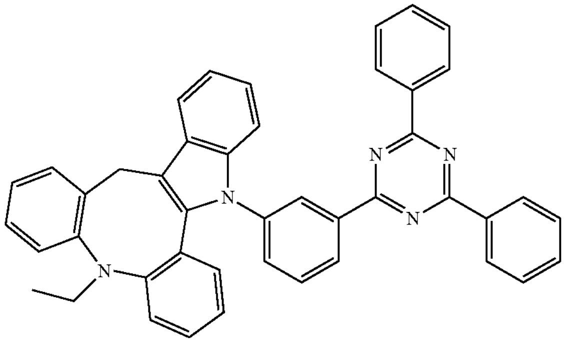
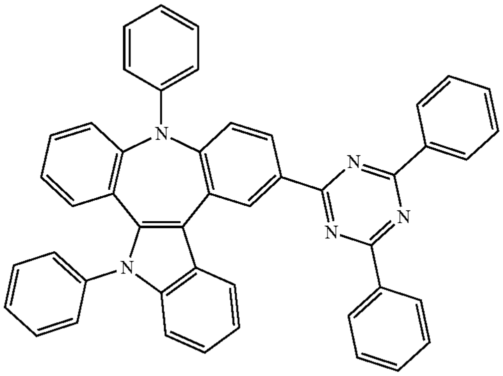
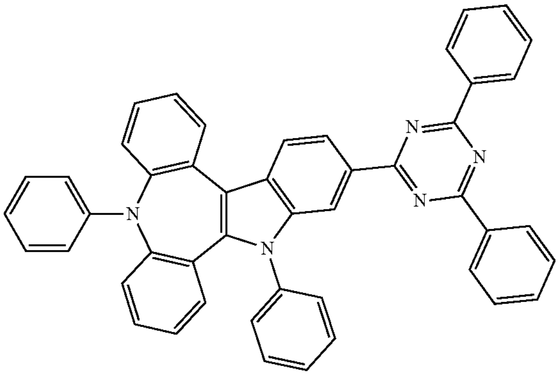
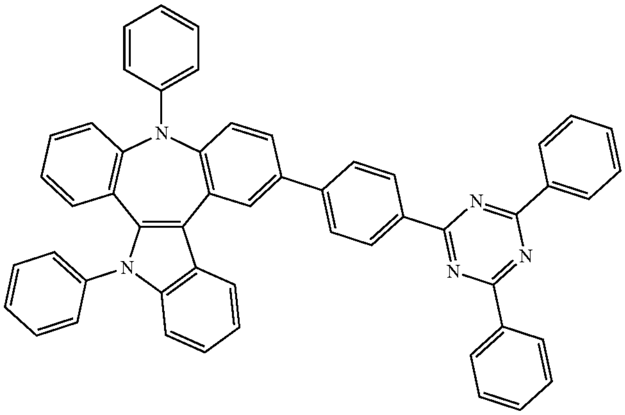

-continued
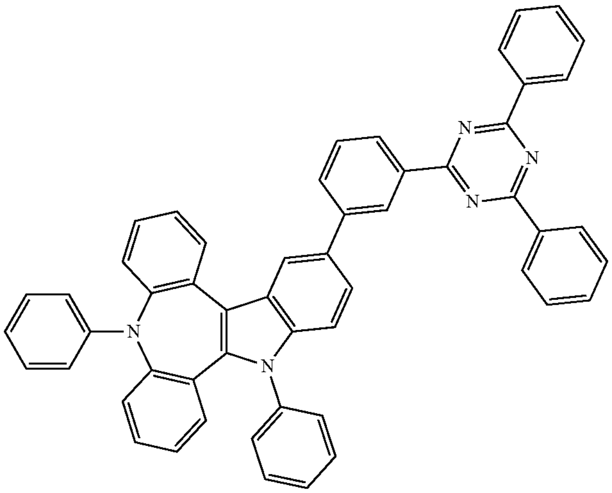
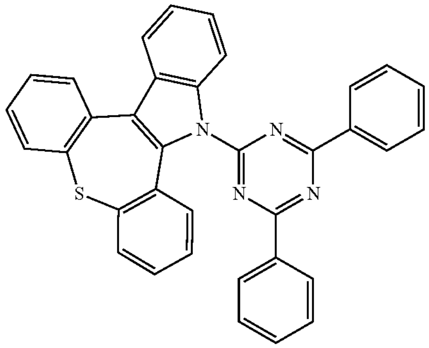
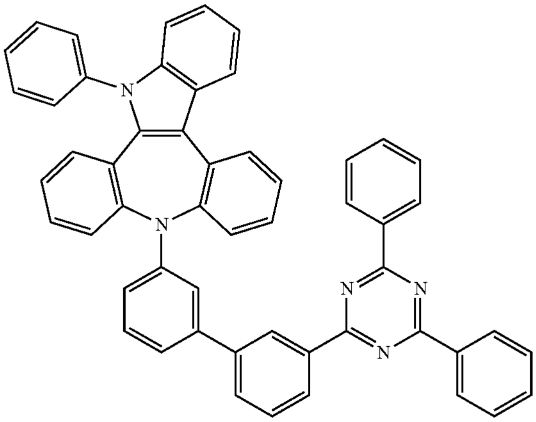
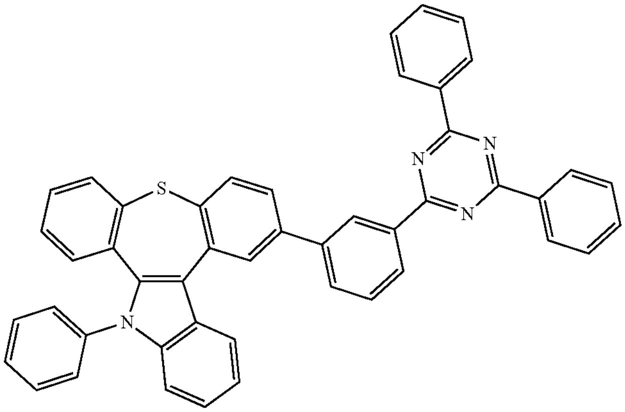
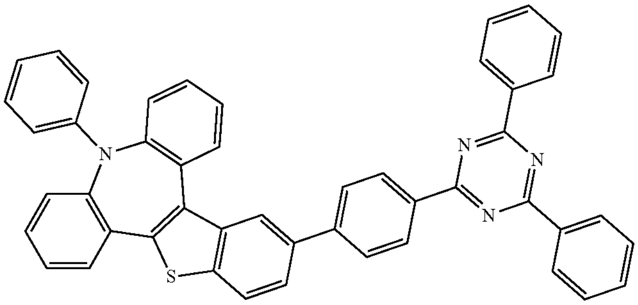

-continued
[Formula 71]
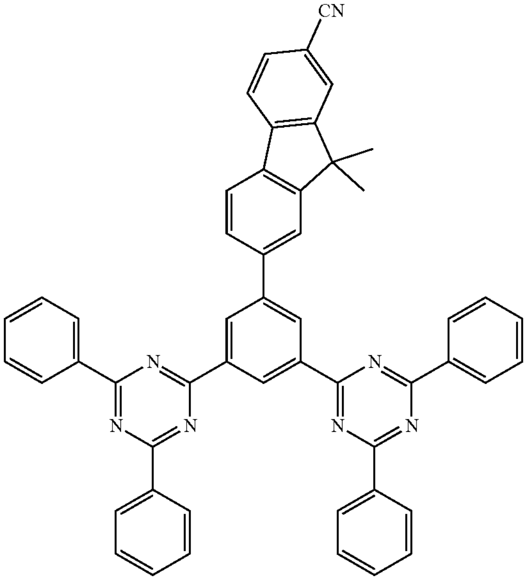
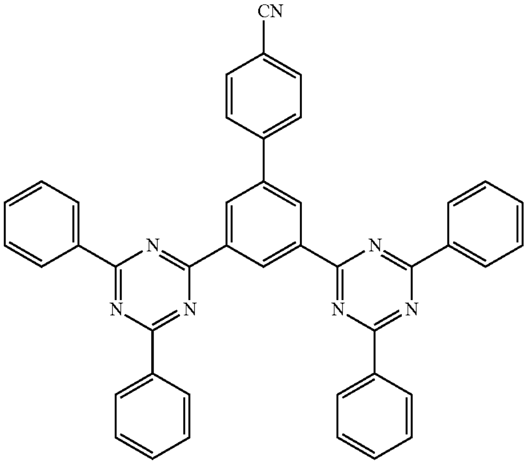
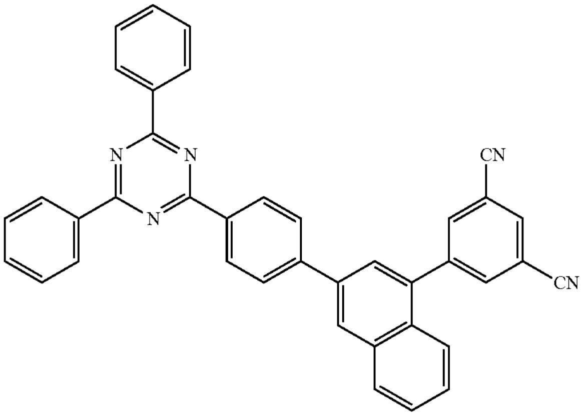
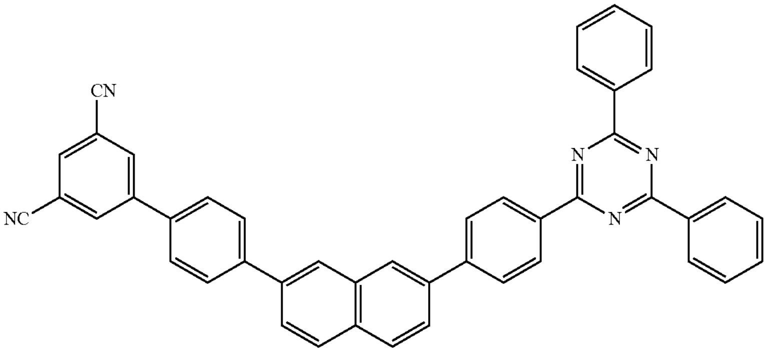
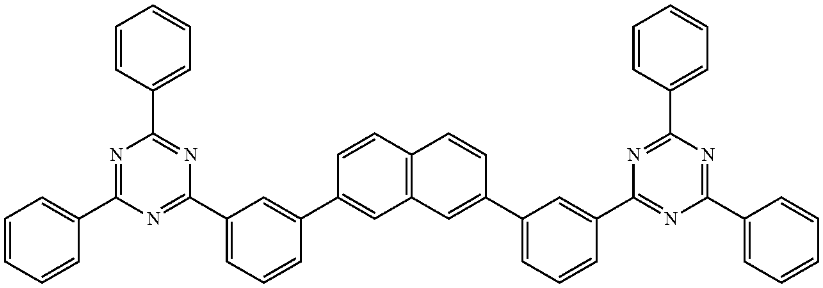

-continued
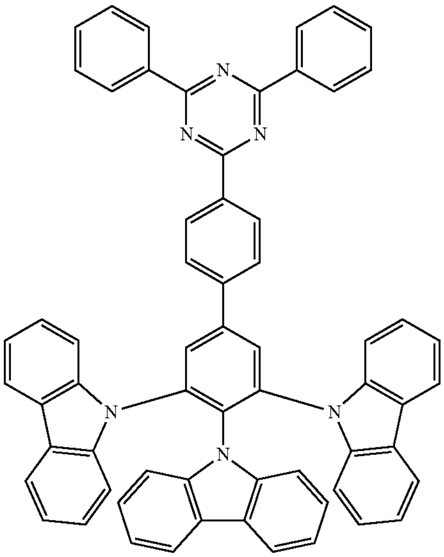
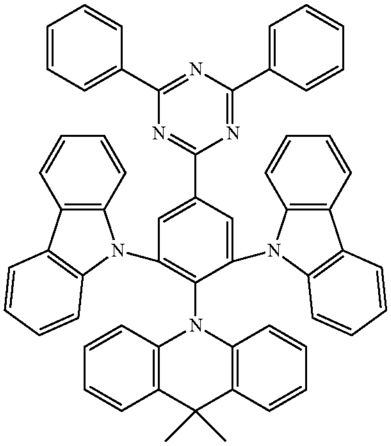
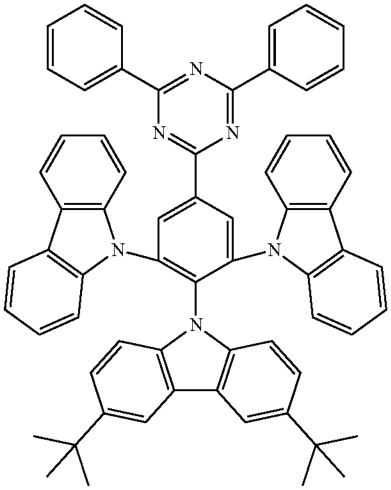
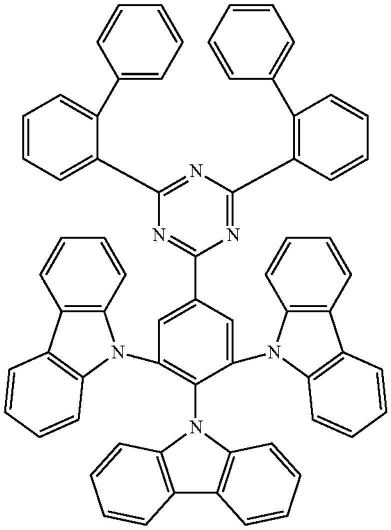
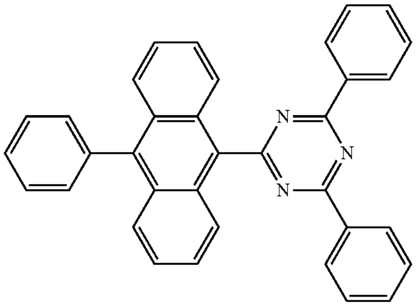
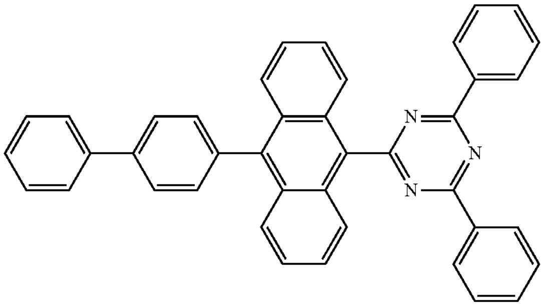

-continued
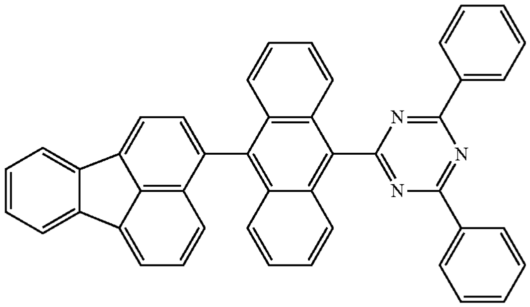
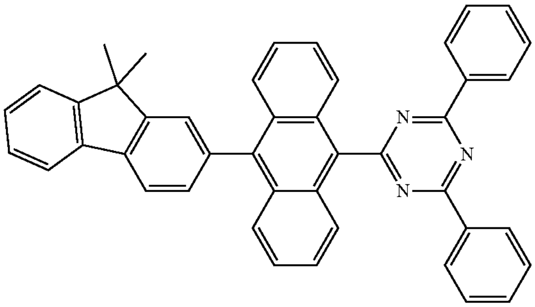
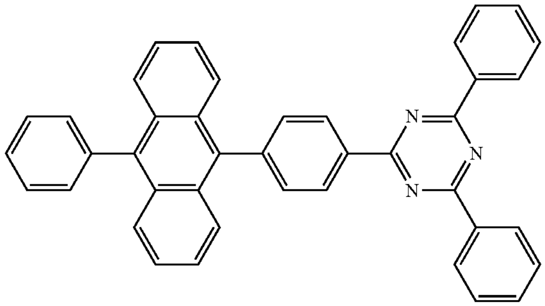
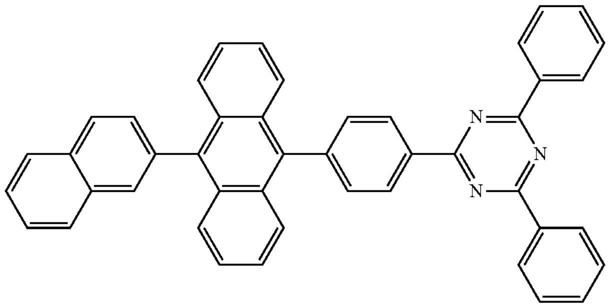
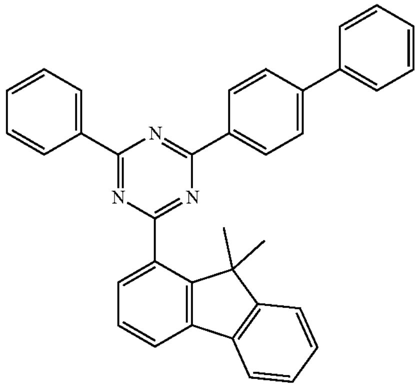
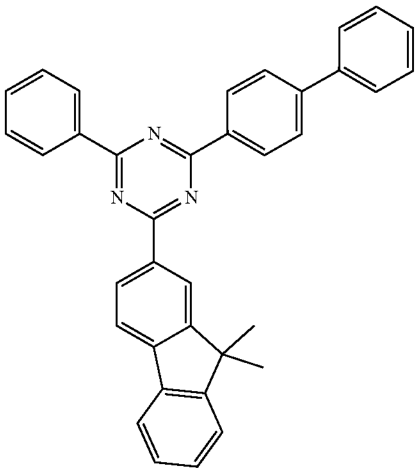
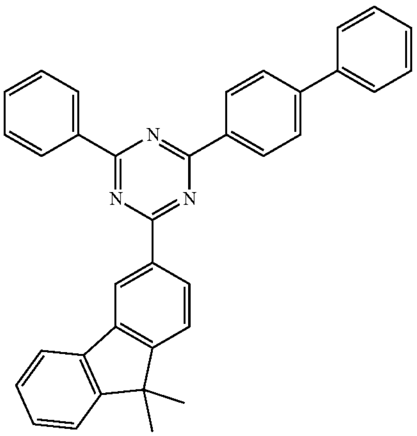

-continued
[Formula 72]
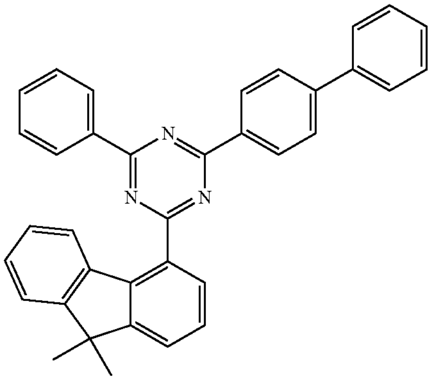
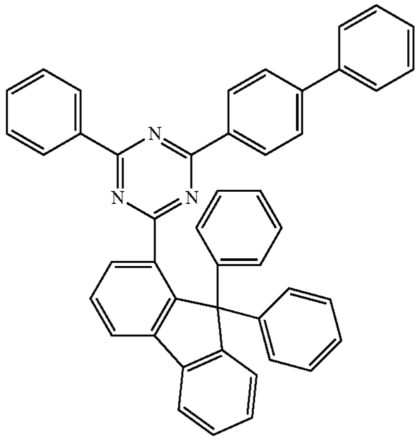
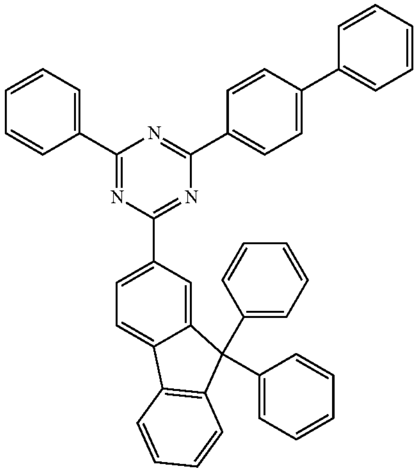
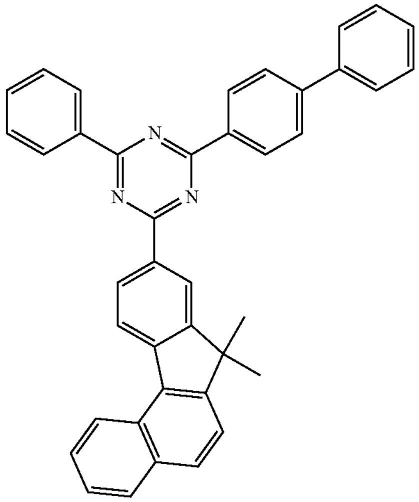
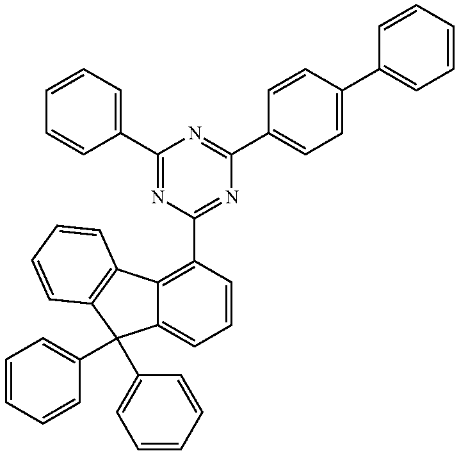
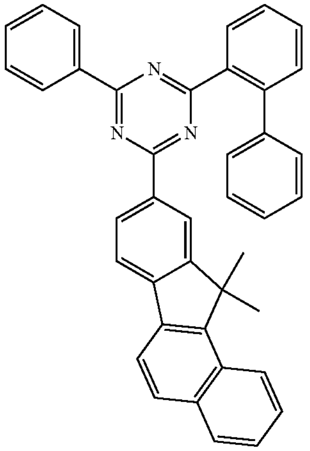

-continued
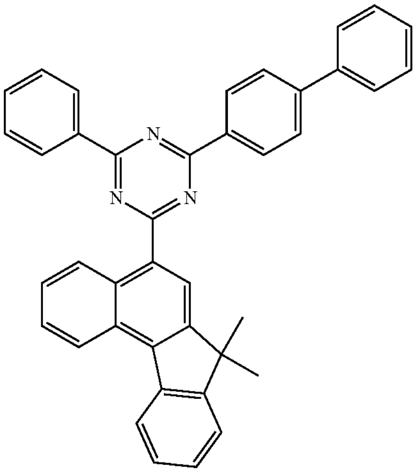
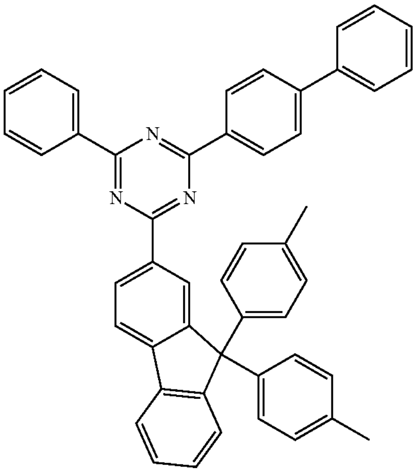
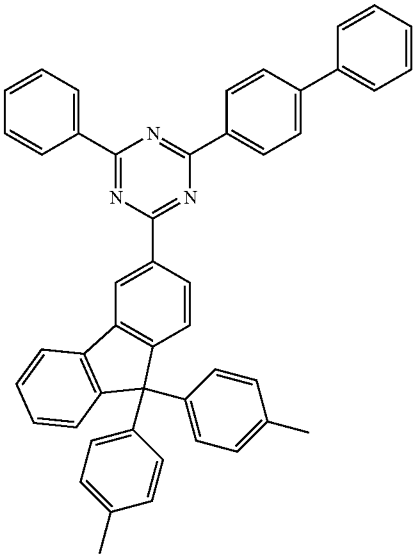
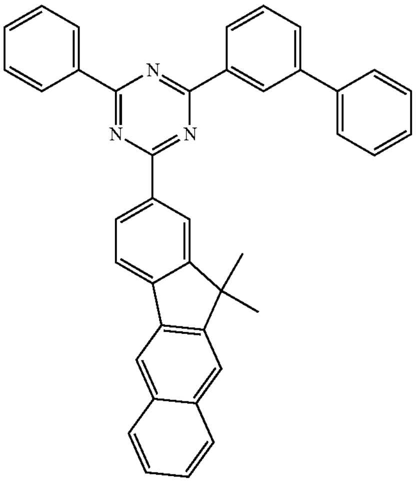
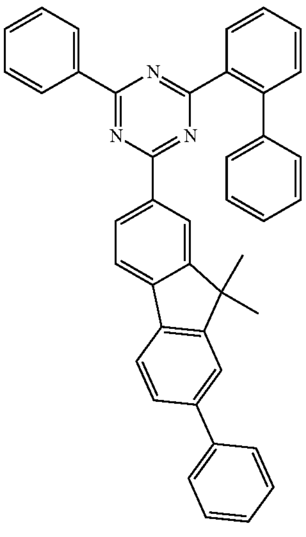
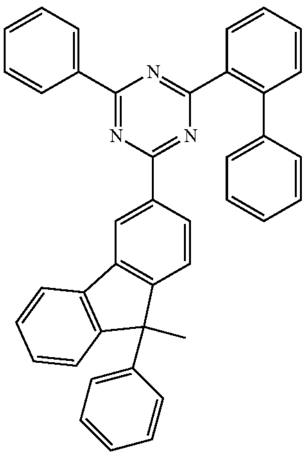
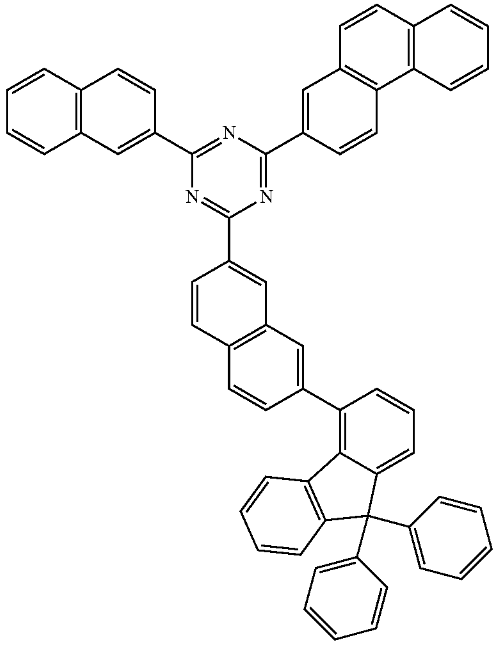

-continued
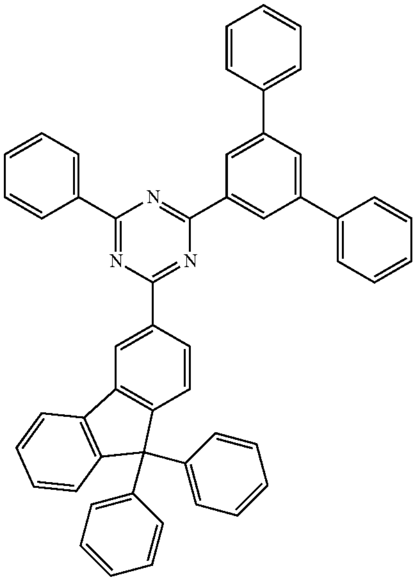
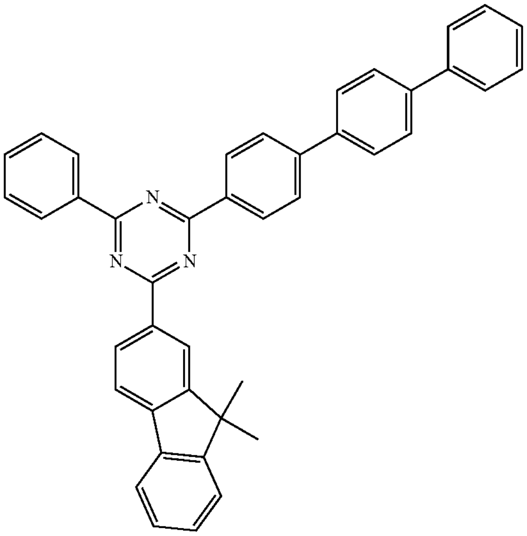
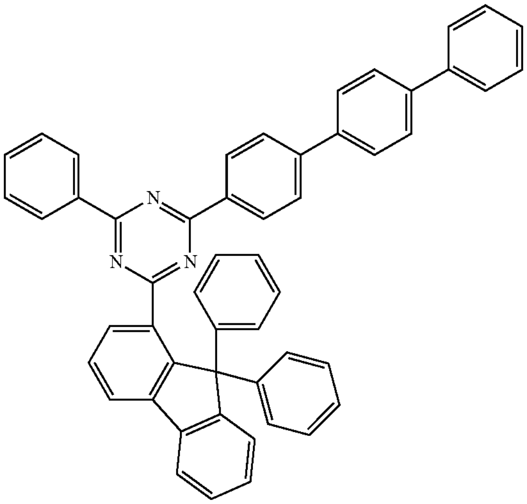
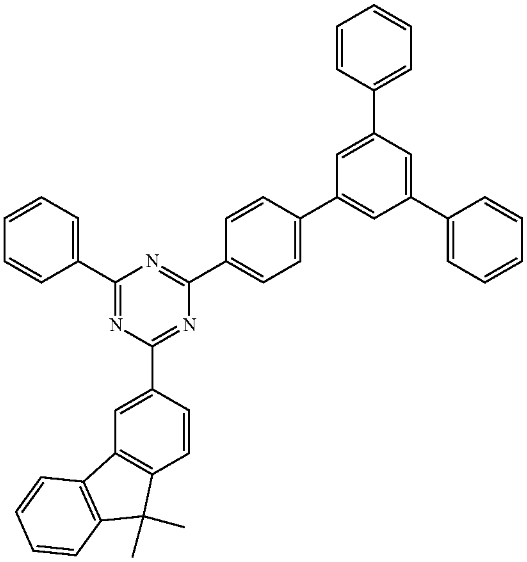

-continued
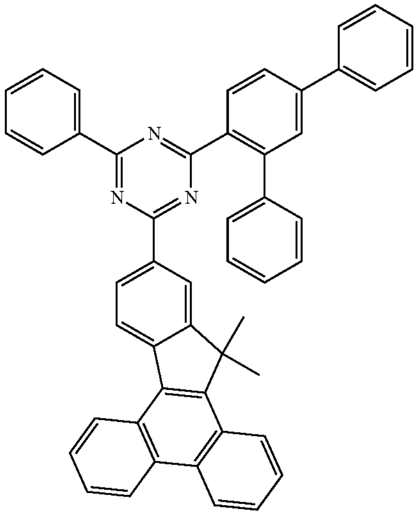
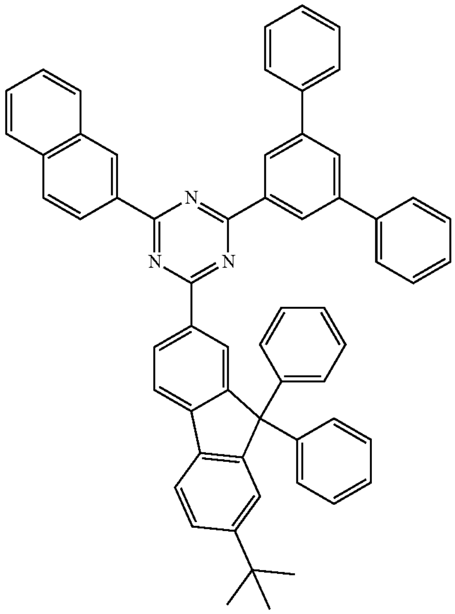
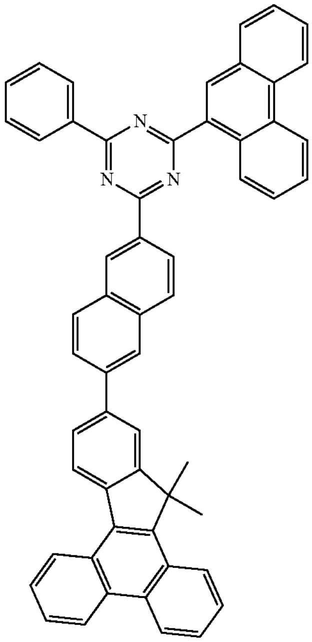 [SMILES: CC1(C)c2cc(-c3ccc4cc(-c5nc(-c6ccccc6)nc(-c6cc7ccccc7c7ccccc67)n5)ccc4c3)ccc2-c2c1c1ccccc1c1ccccc21]

[Formula 73]
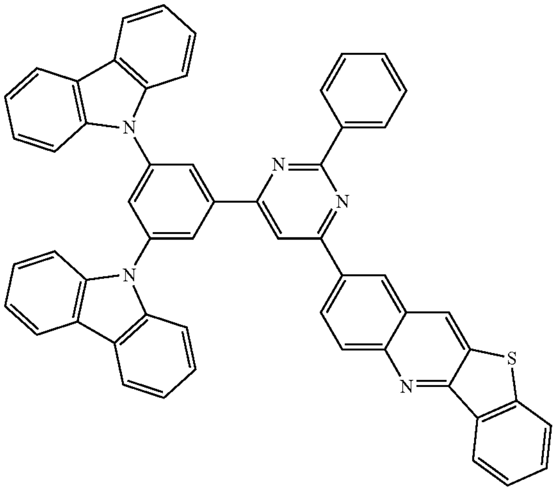
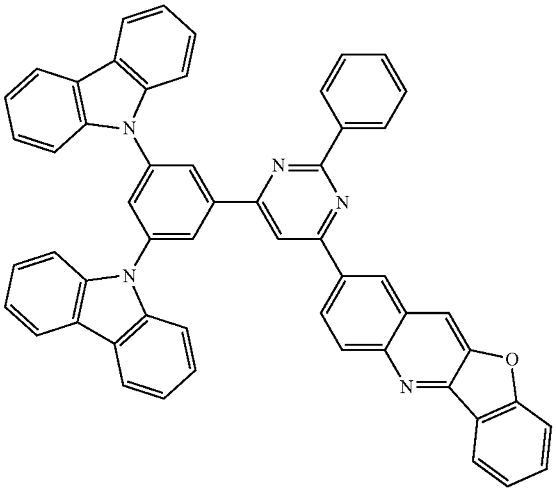
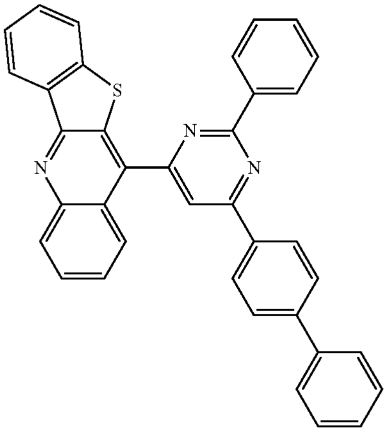
-continued
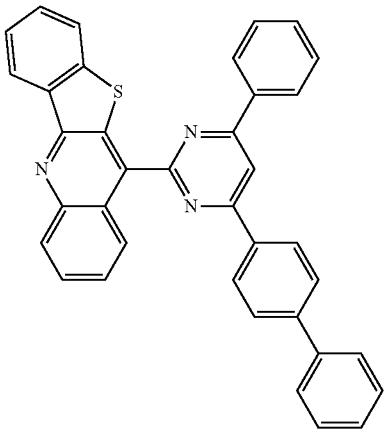
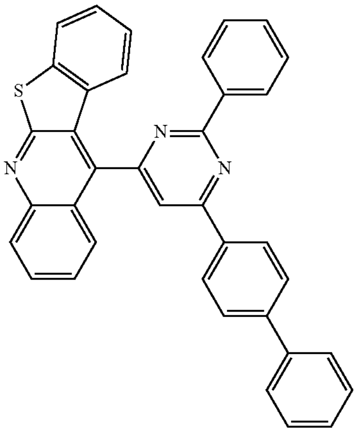
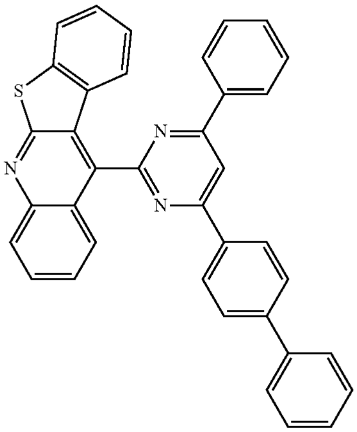
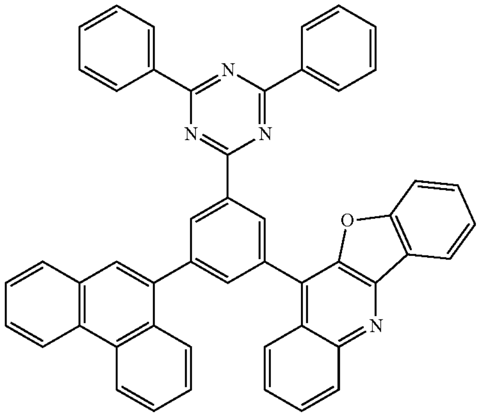

-continued
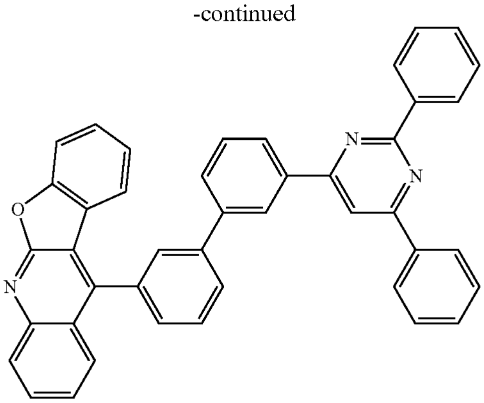
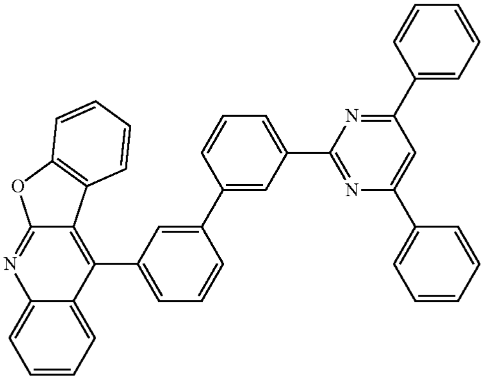
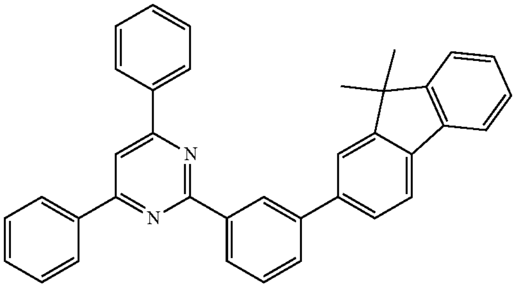
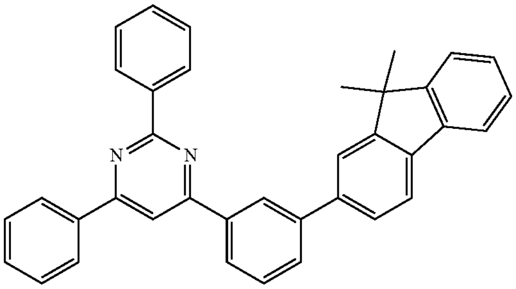
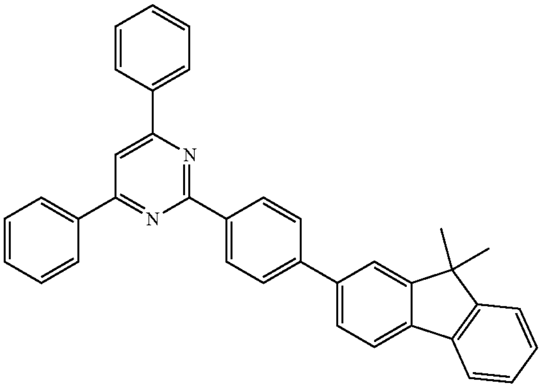
-continued
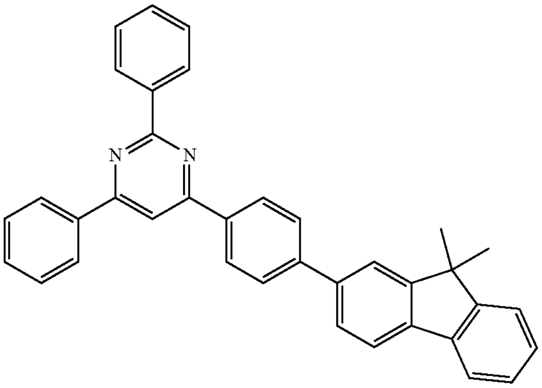
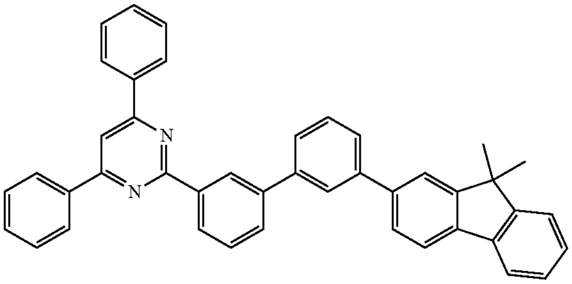
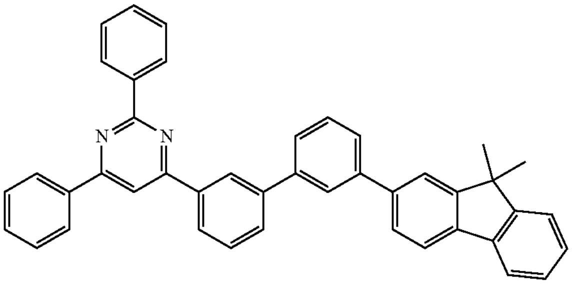
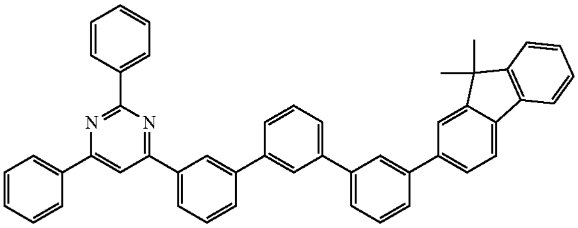
[Formula 74]
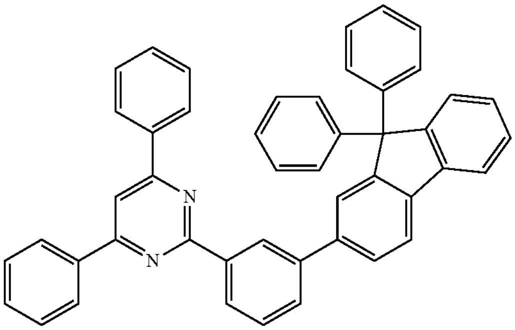

-continued
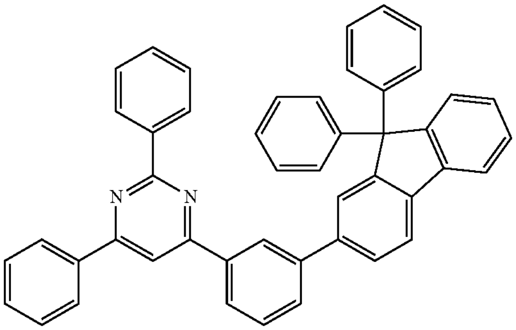
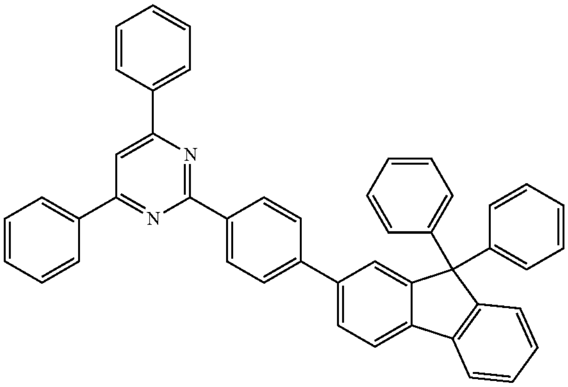
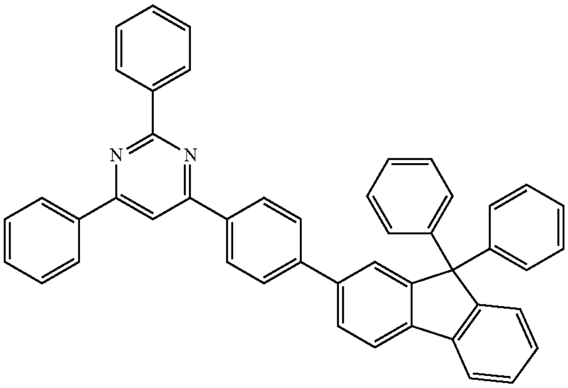
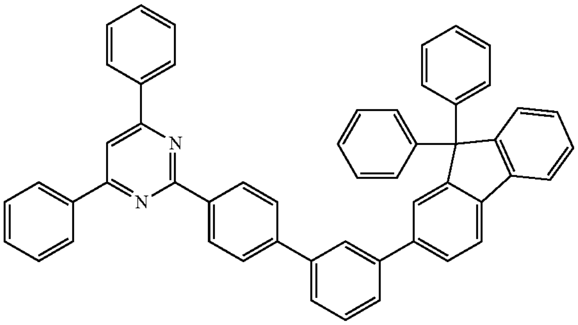
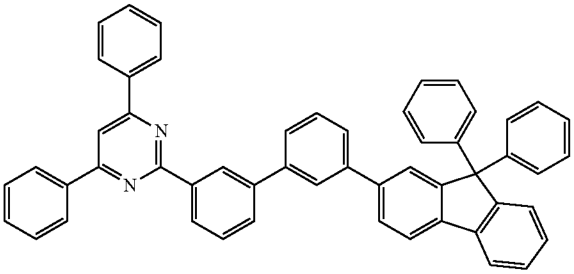
-continued
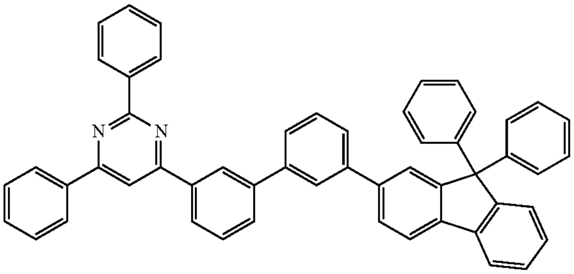
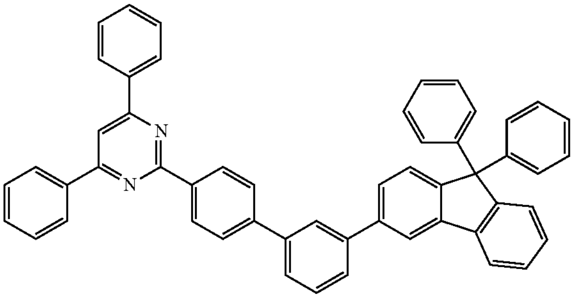
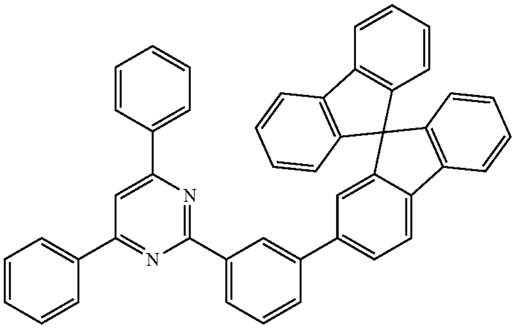
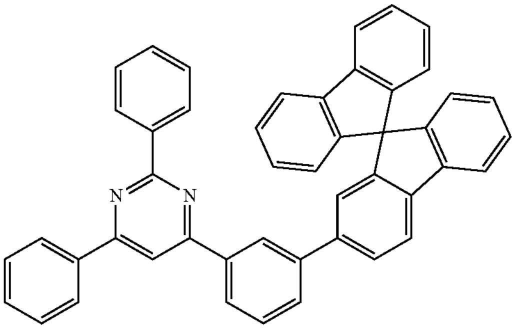
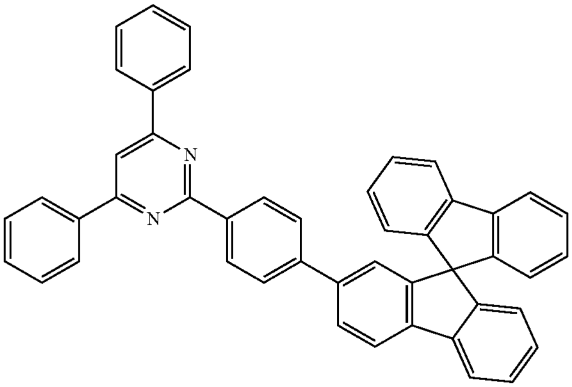

-continued
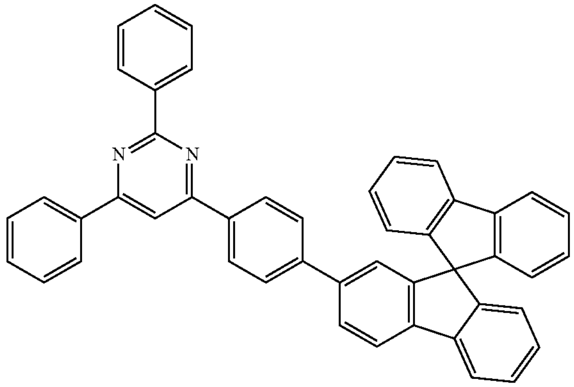
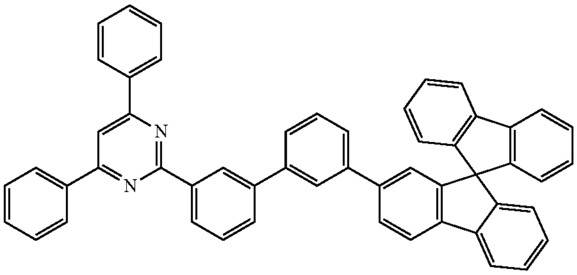
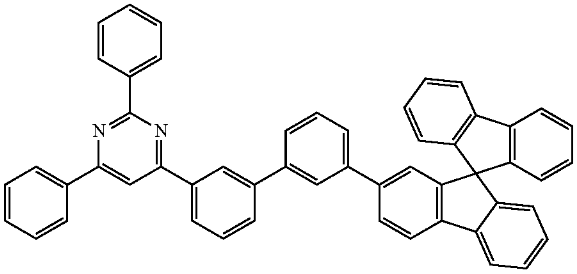
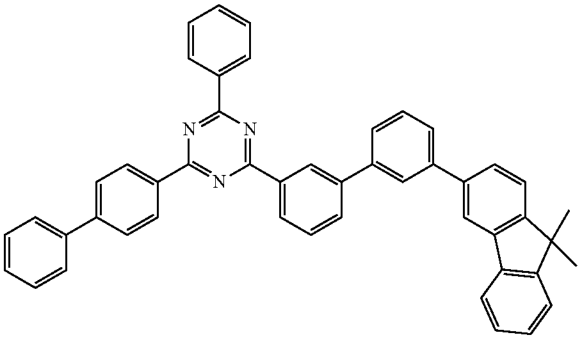
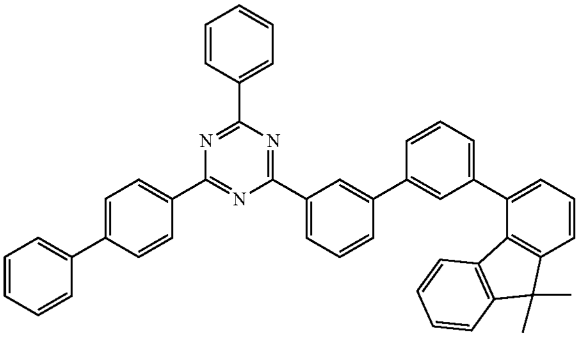
-continued
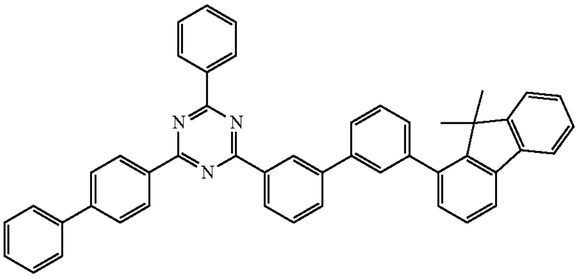
[Formula 75]
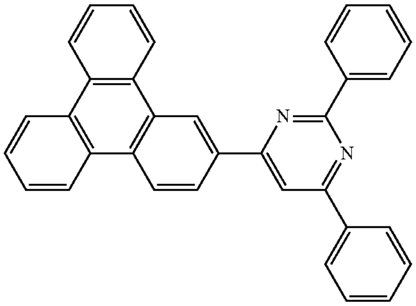
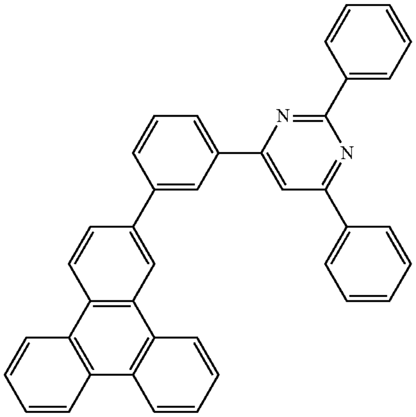
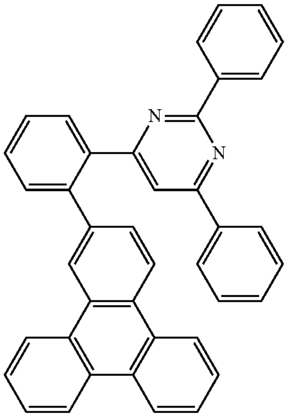

-continued
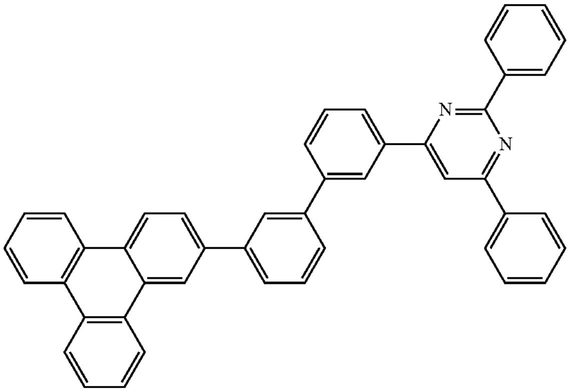
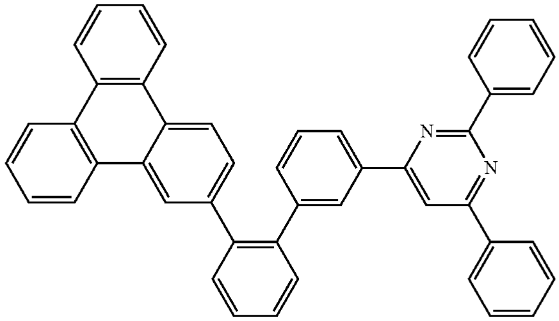
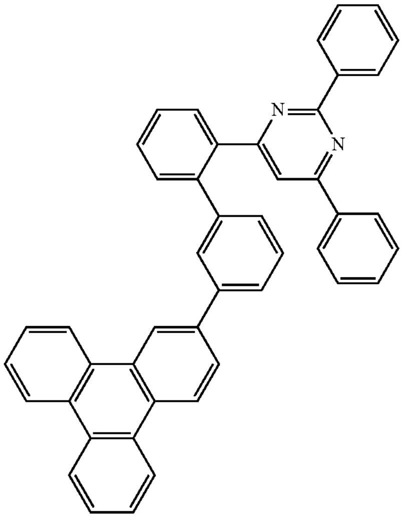
-continued
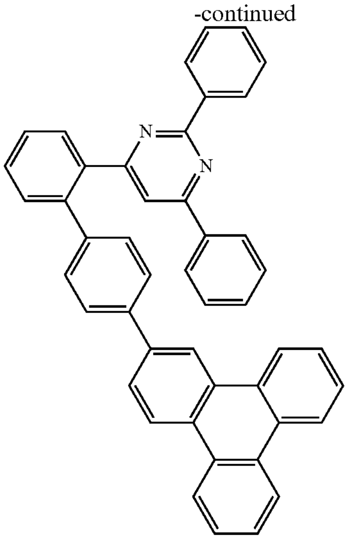
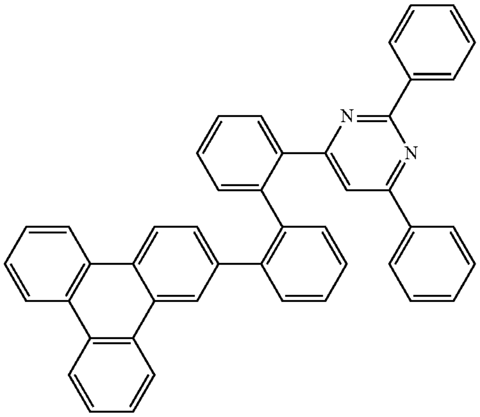
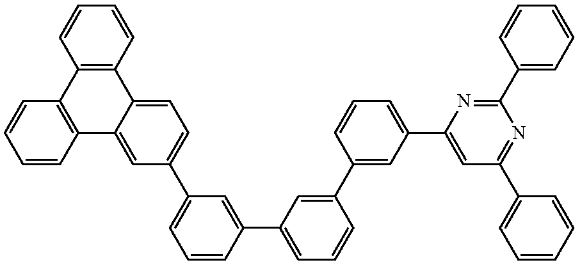
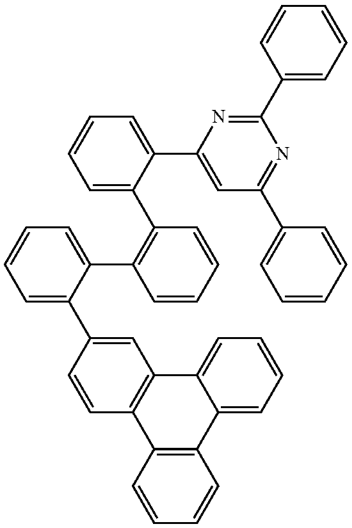

-continued
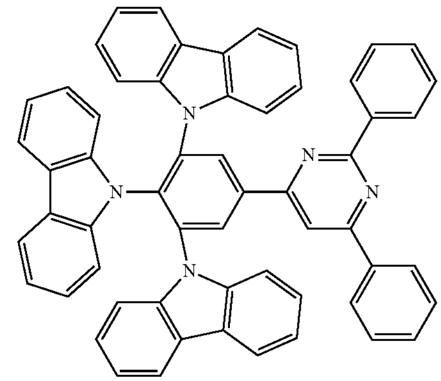
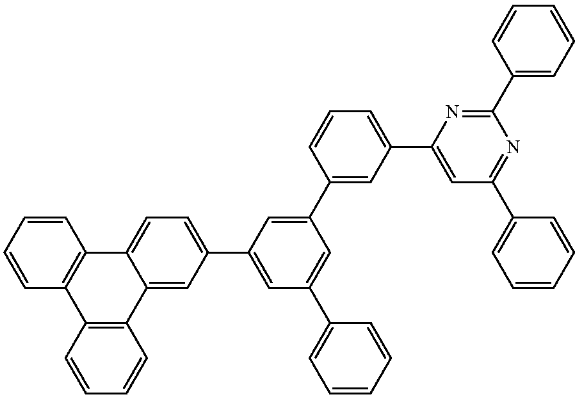
[Formula 76]
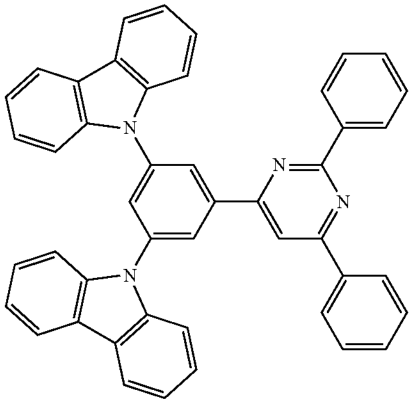
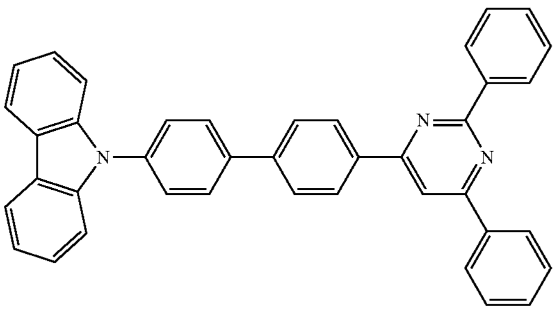
-continued
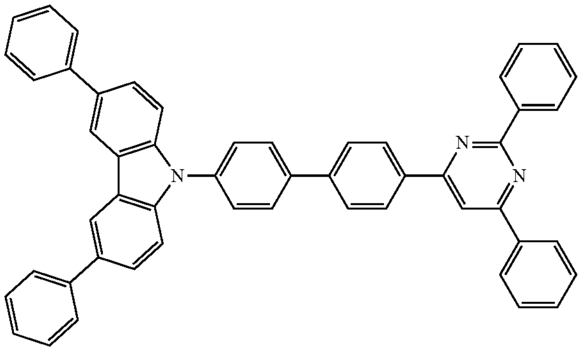
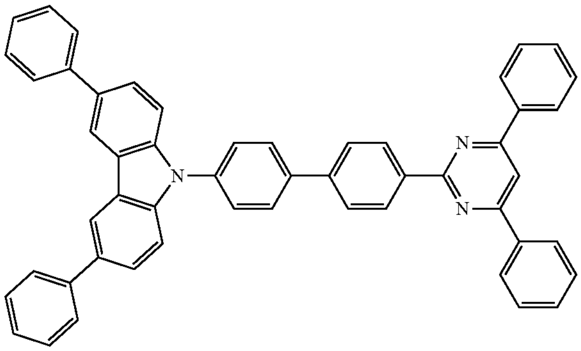
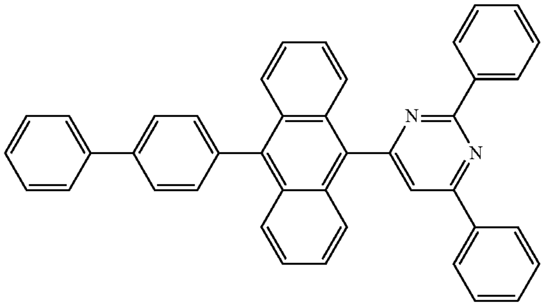
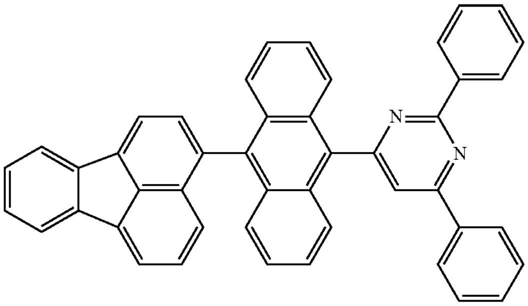
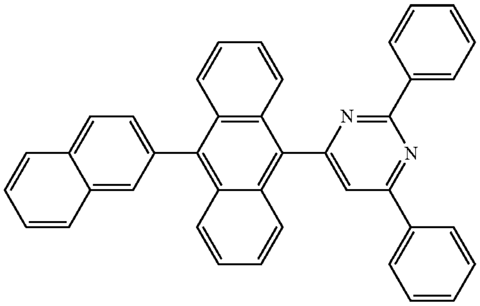

-continued
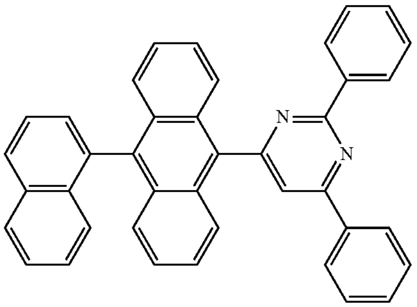
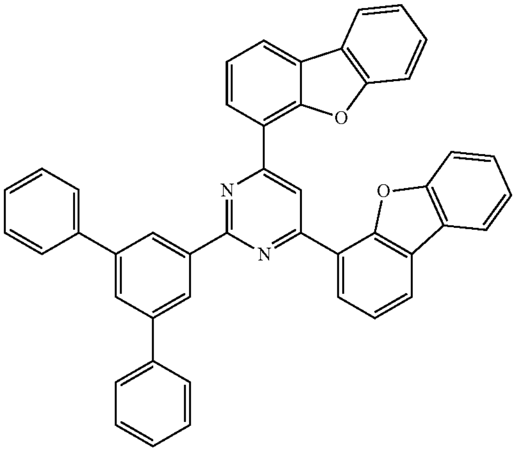
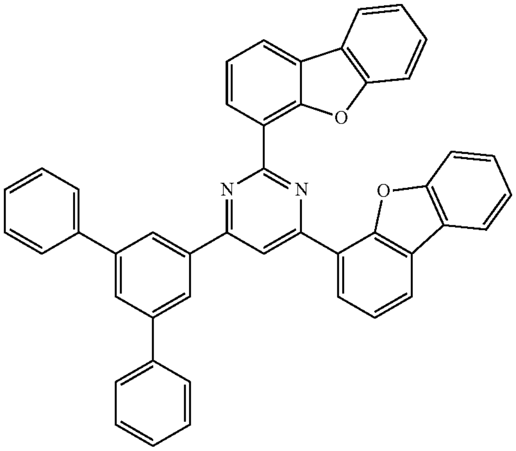
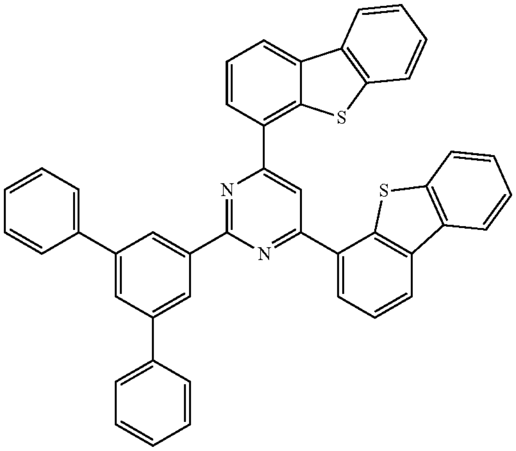
-continued
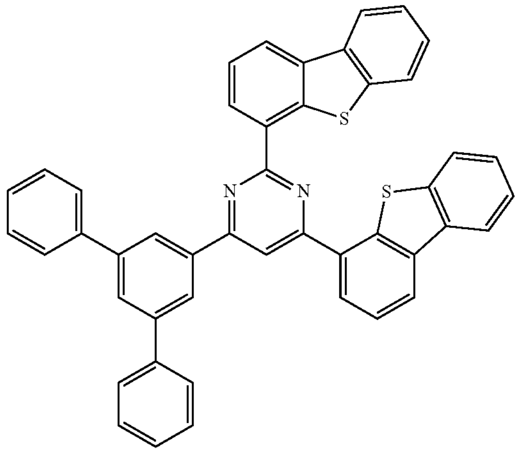
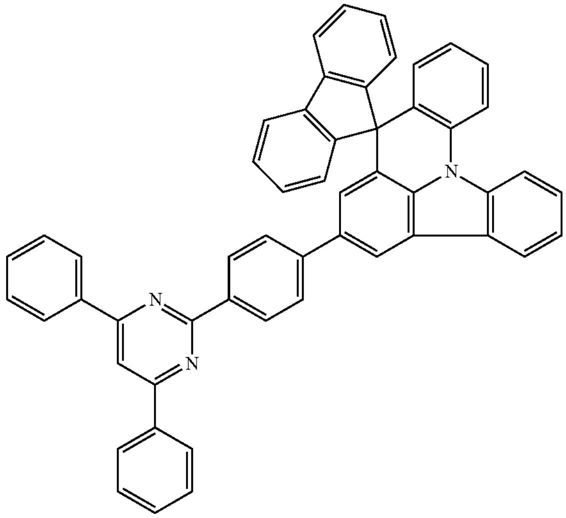
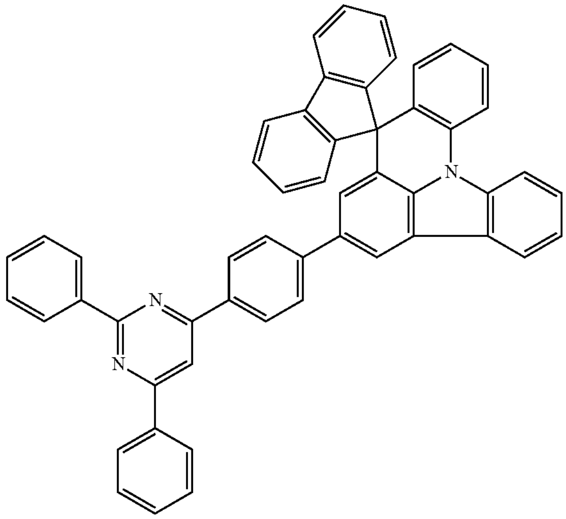

-continued
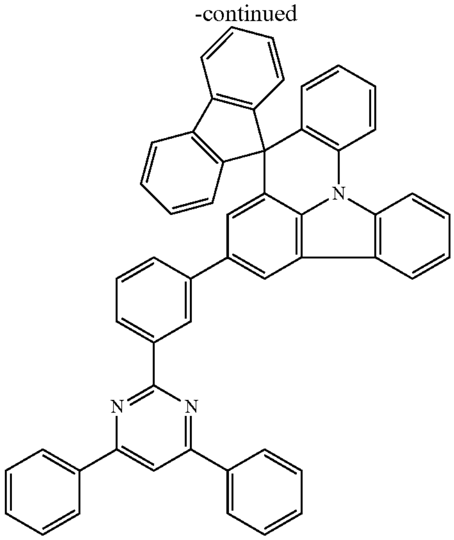
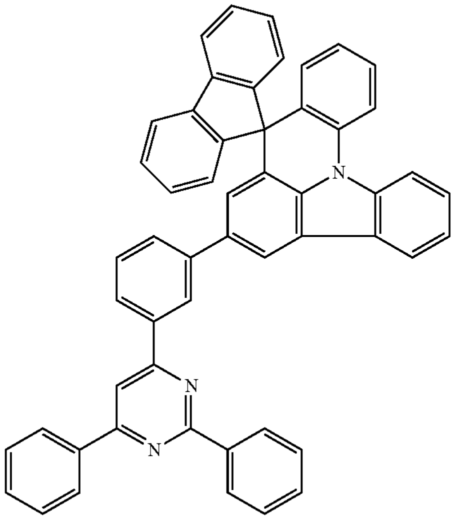
[Formula 77]
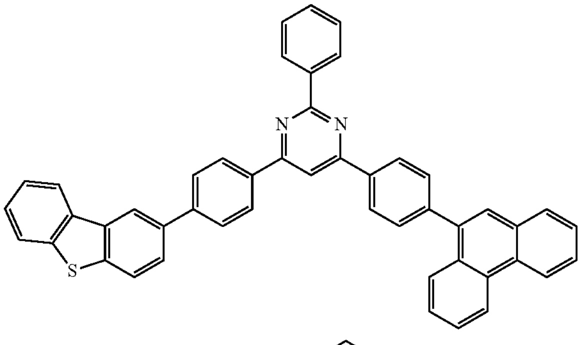
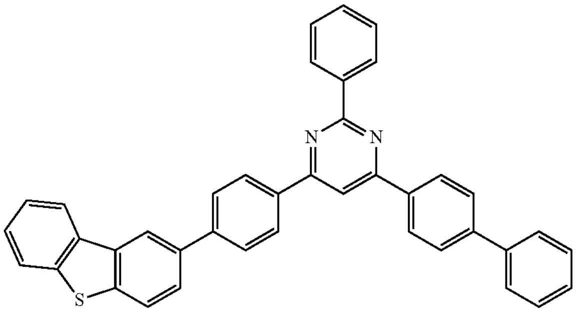
-continued
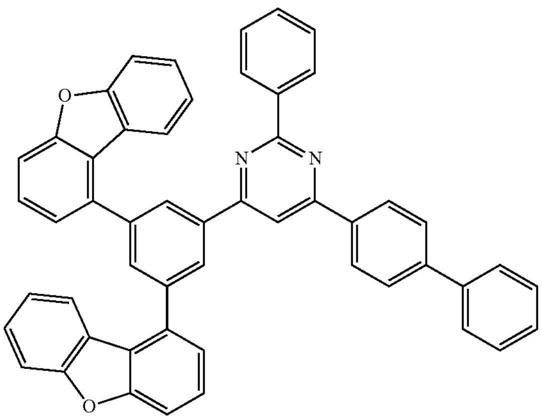
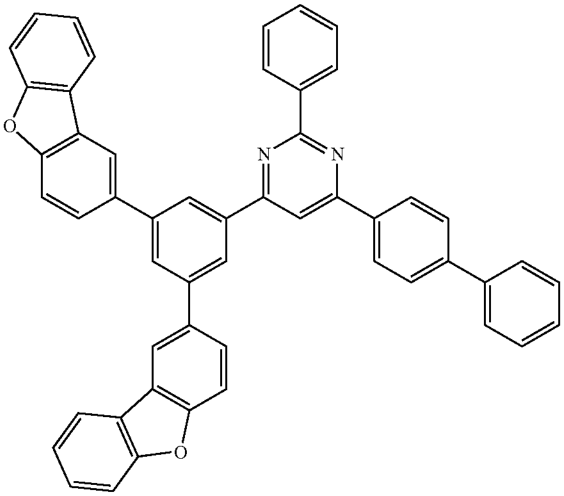
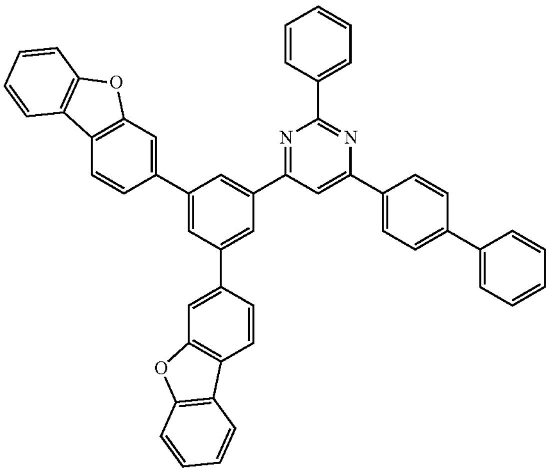

-continued
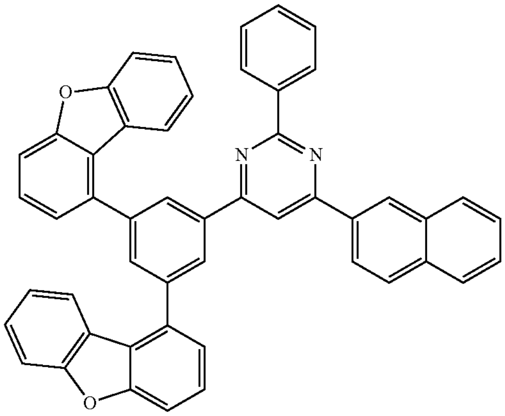
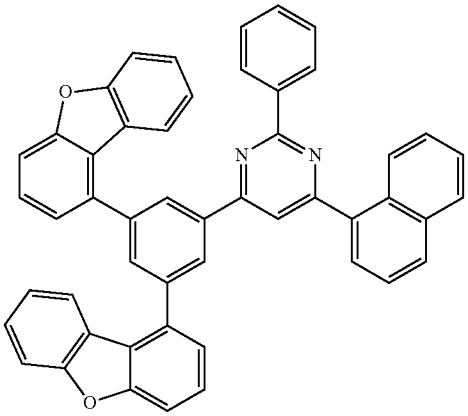
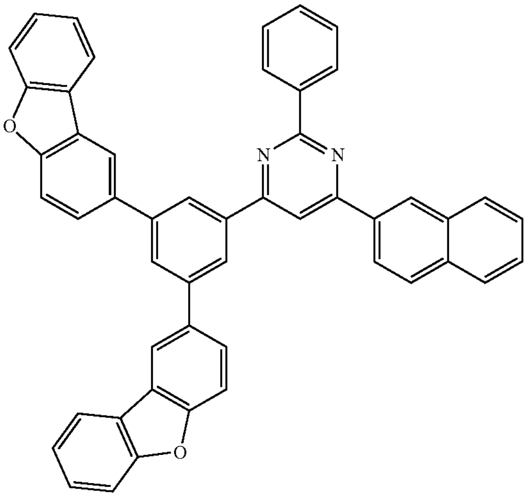
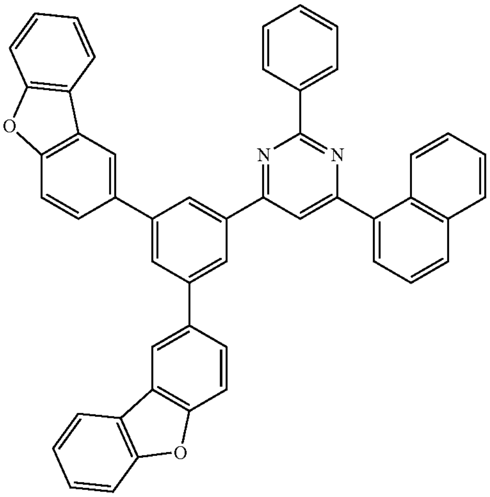
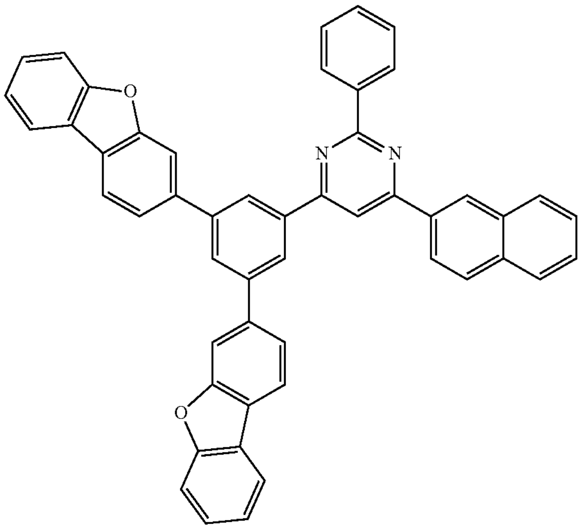
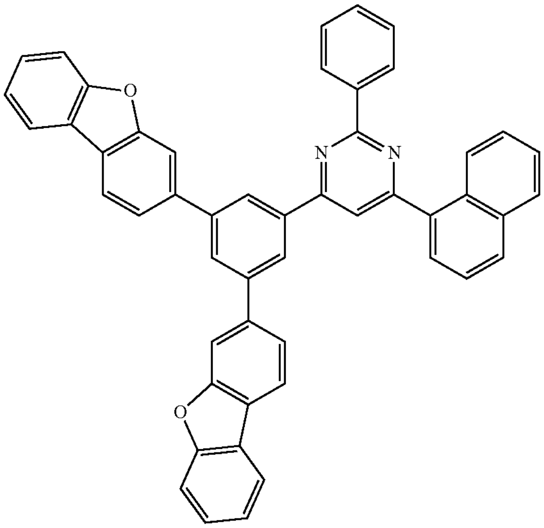

-continued
-continued
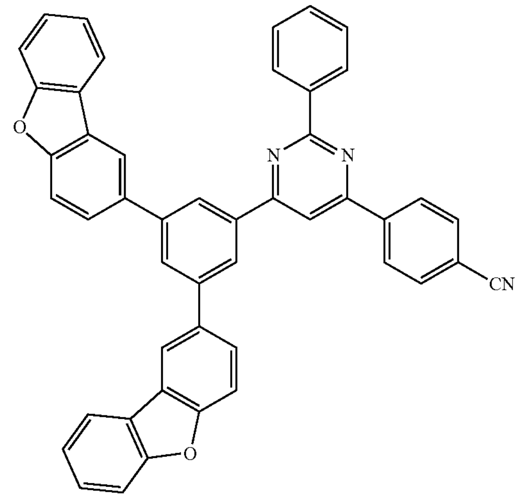
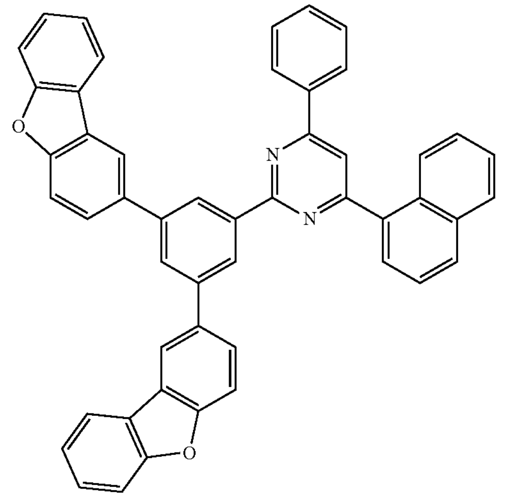
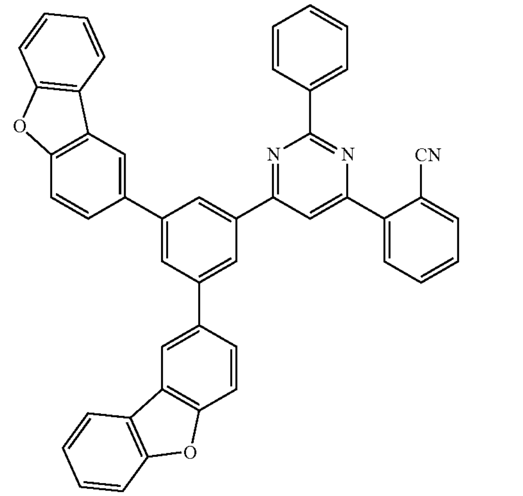
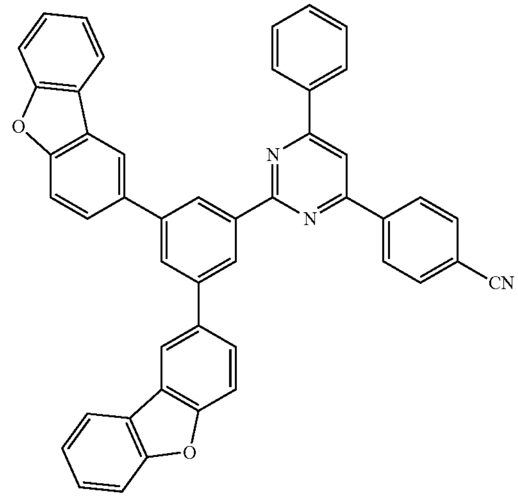
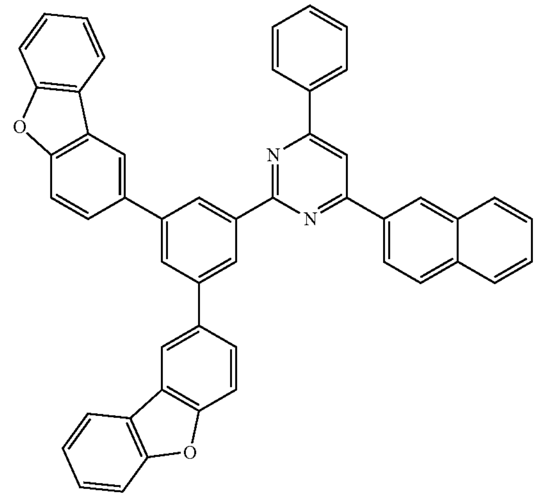
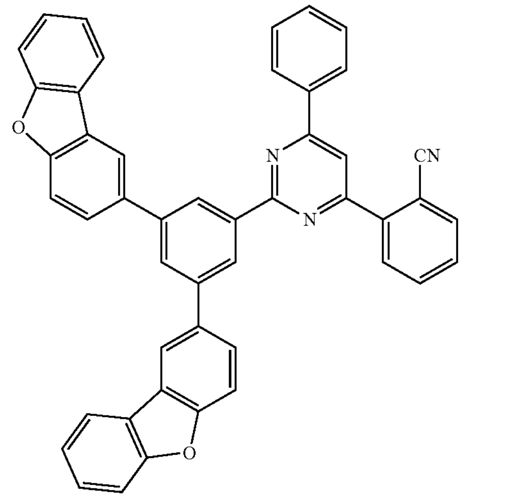

-continued
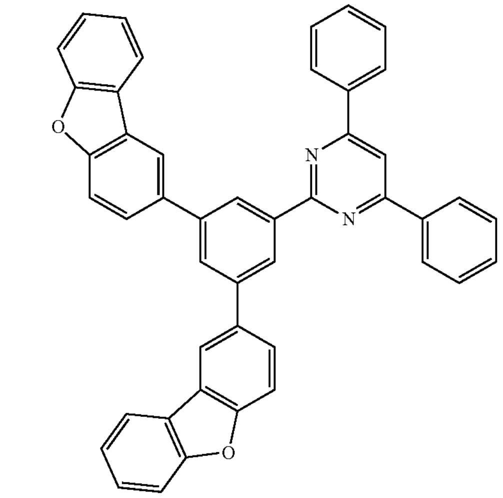
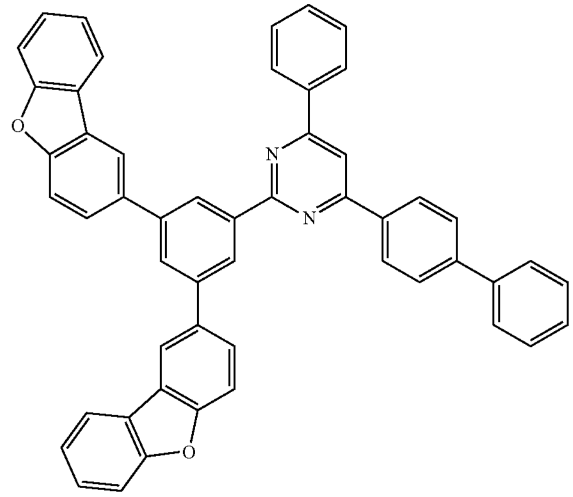
[Formula 78]
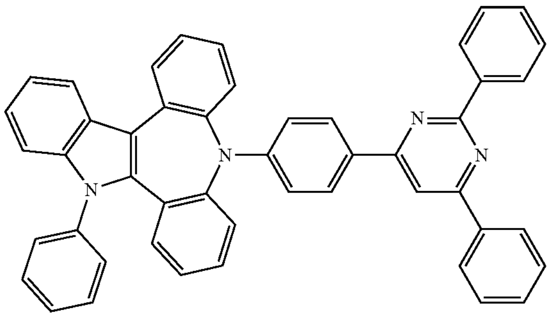
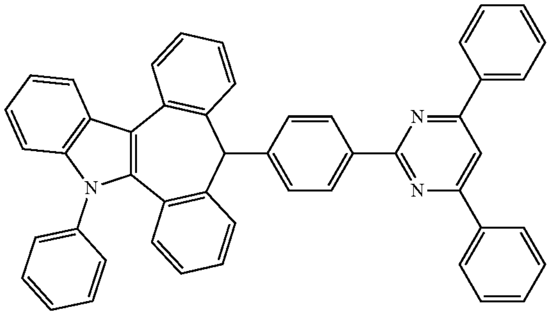
-continued
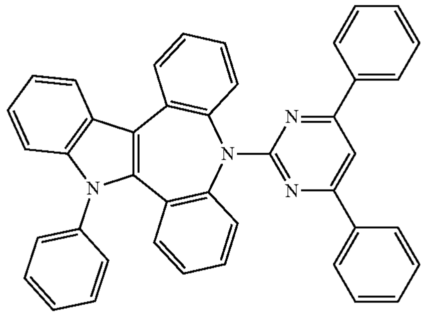
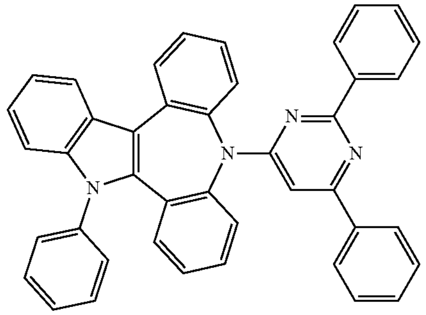
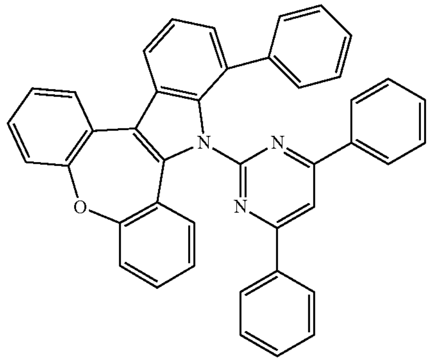
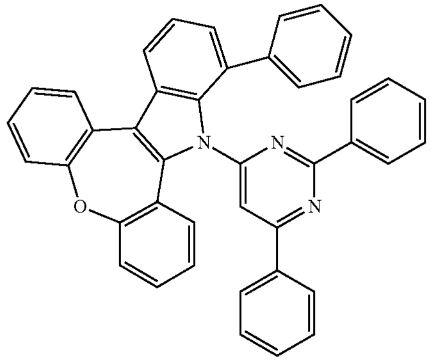
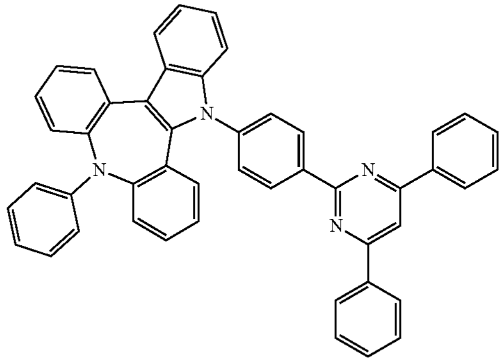

-continued
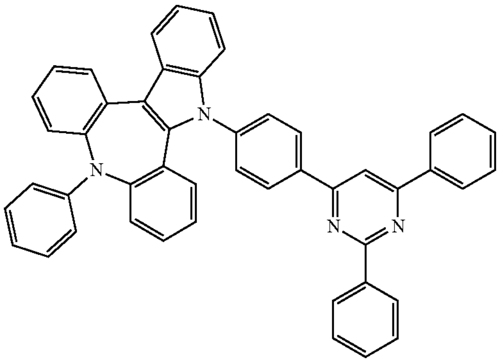
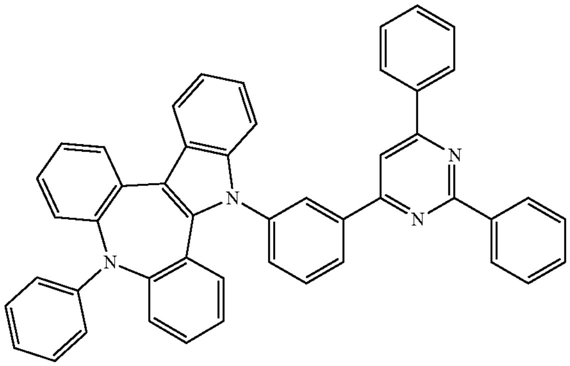
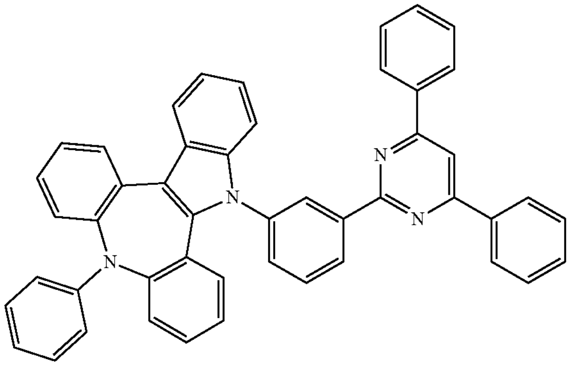
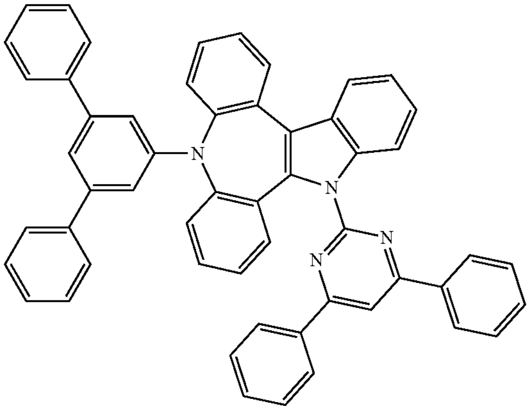
-continued
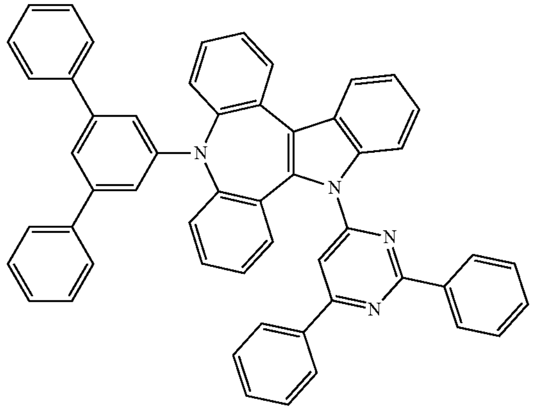
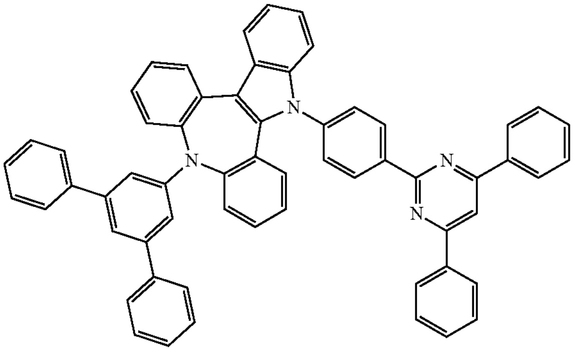
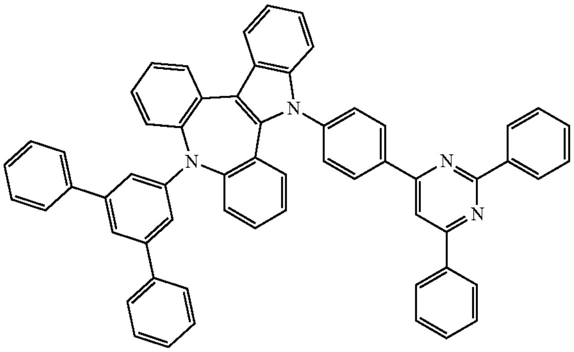
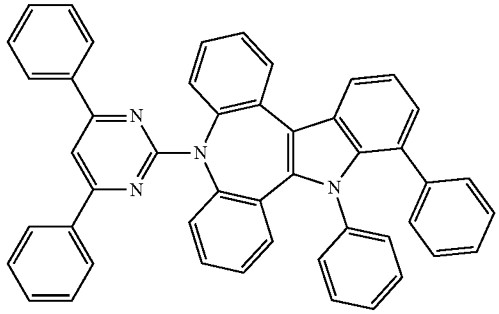

-continued
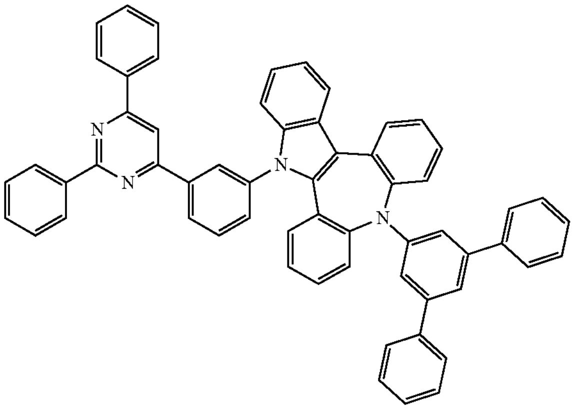
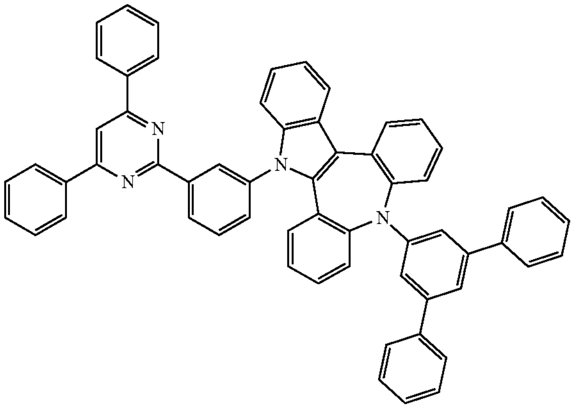
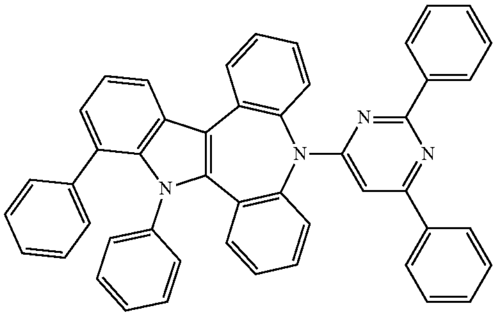
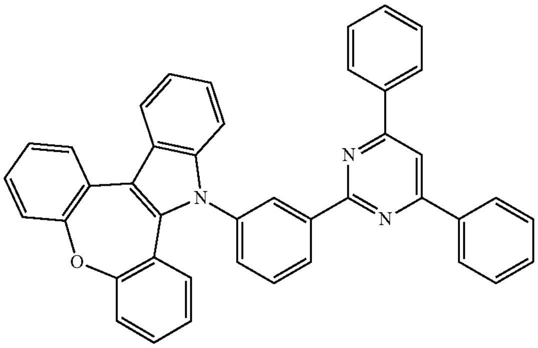
-continued
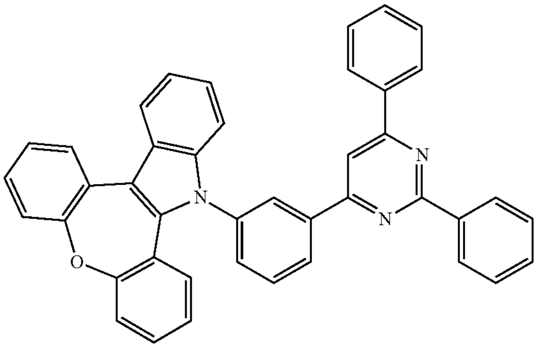
[Formula 79]
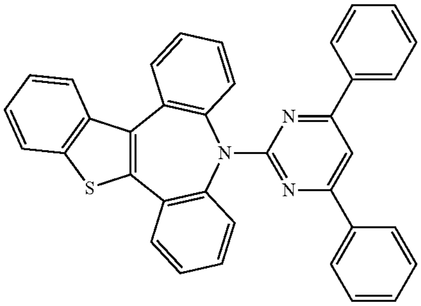
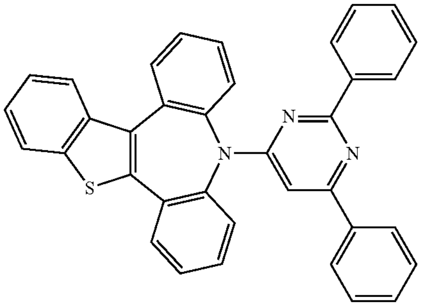
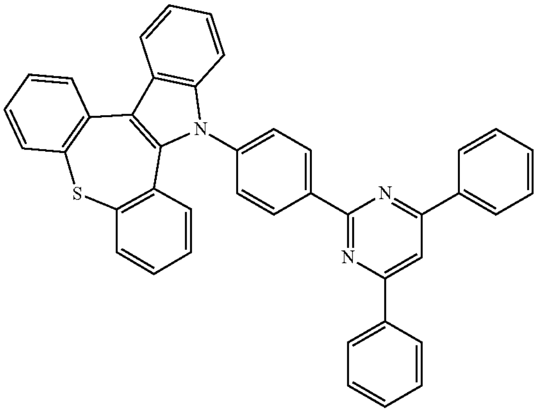

-continued
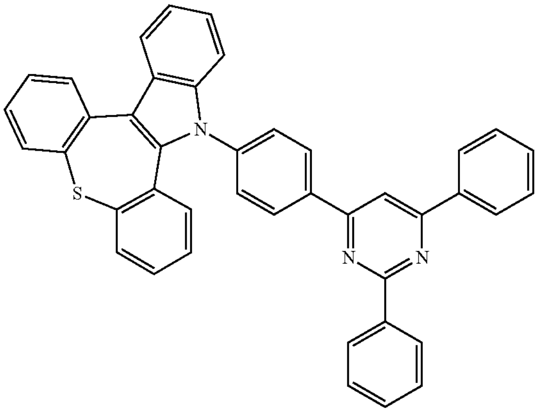
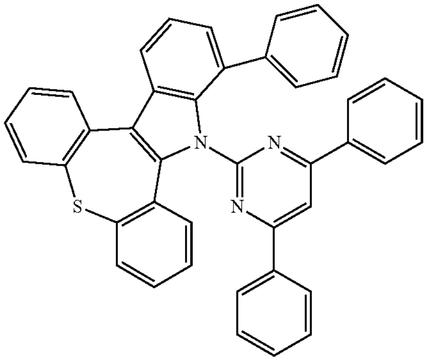
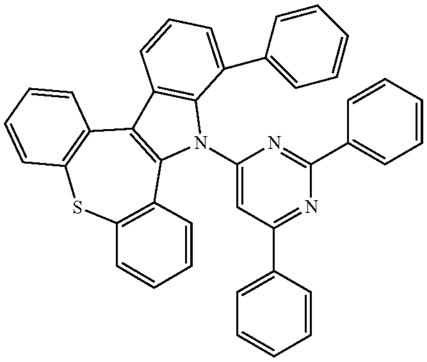
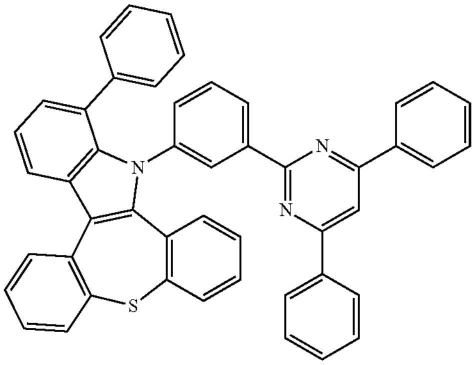
-continued
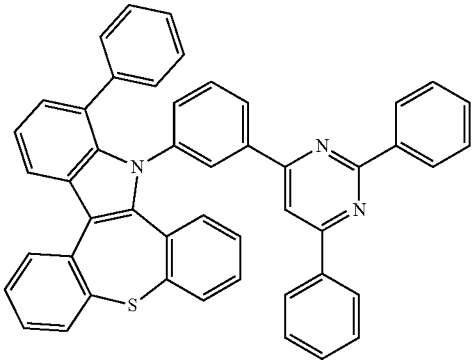
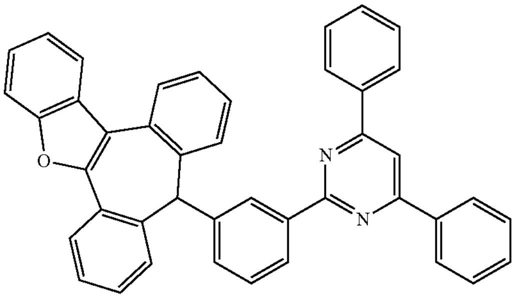
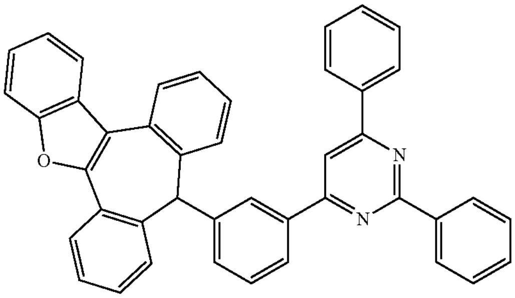
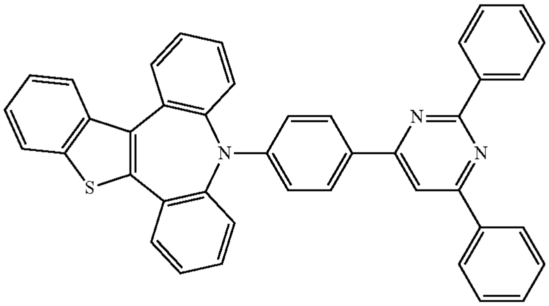
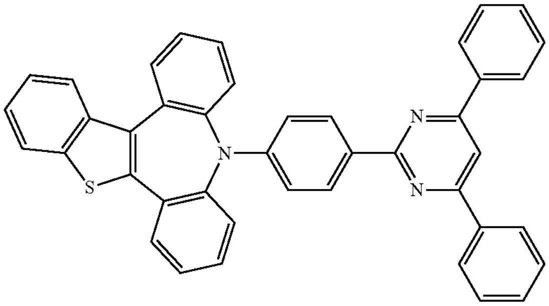

-continued
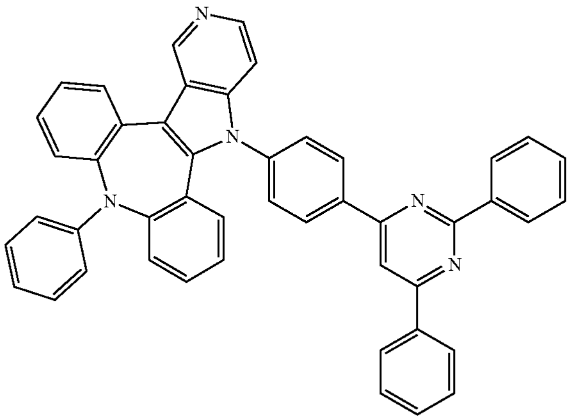
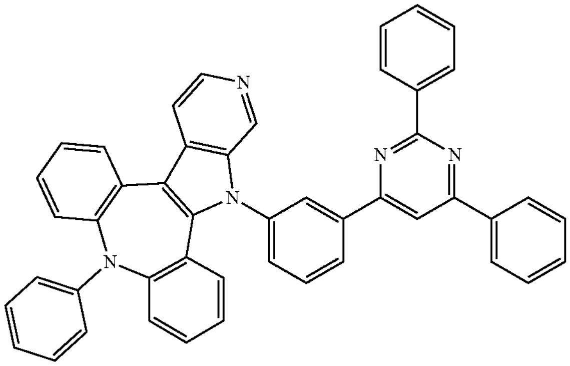
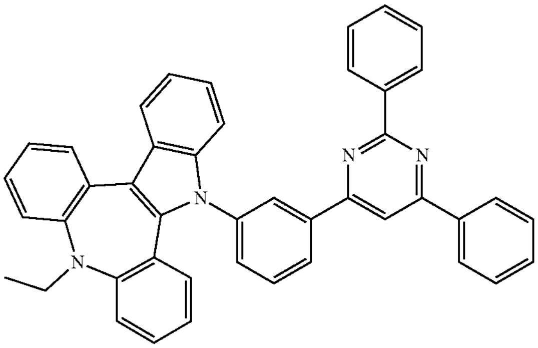
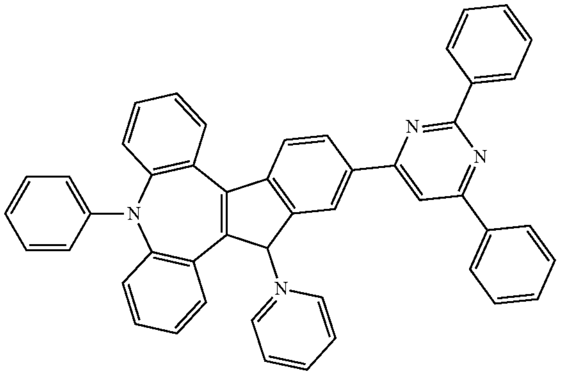
-continued
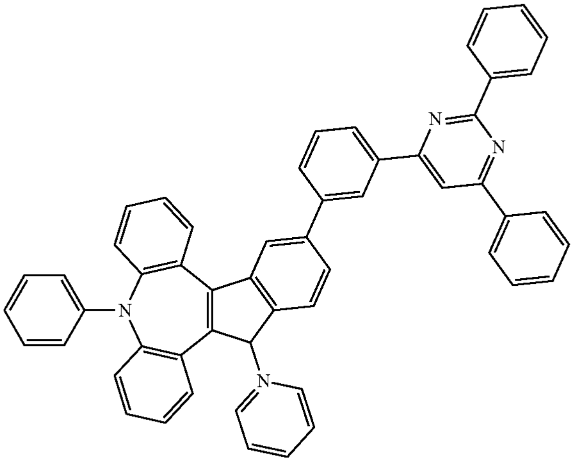
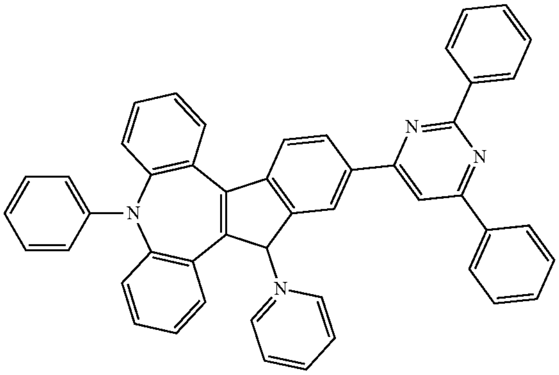
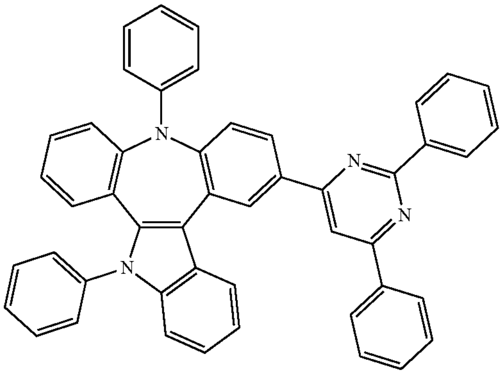
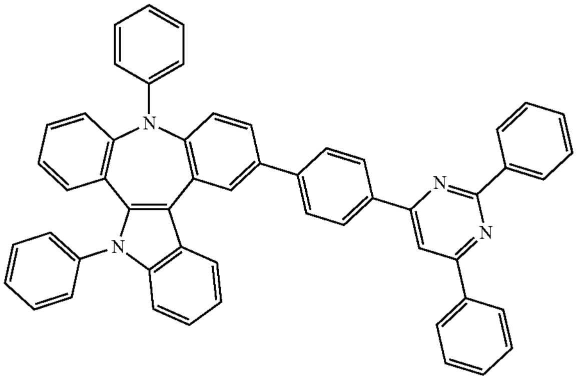

-continued
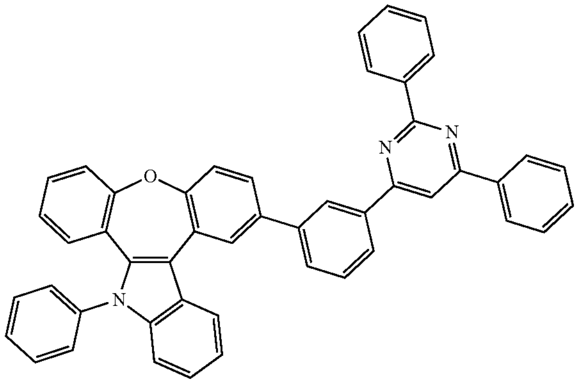
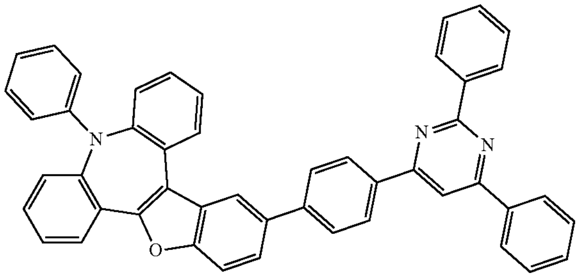
[Formula 80]
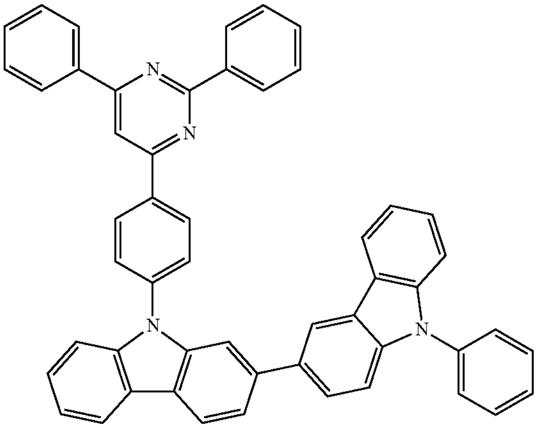
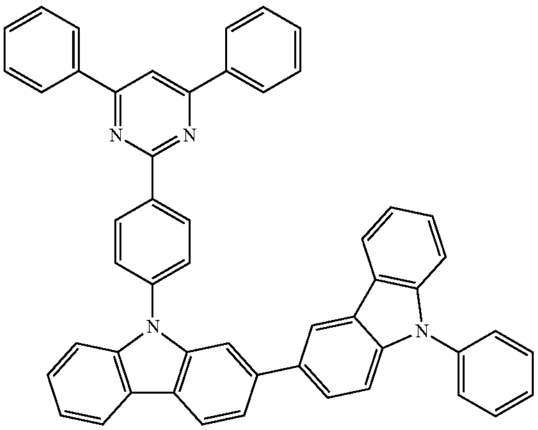
-continued
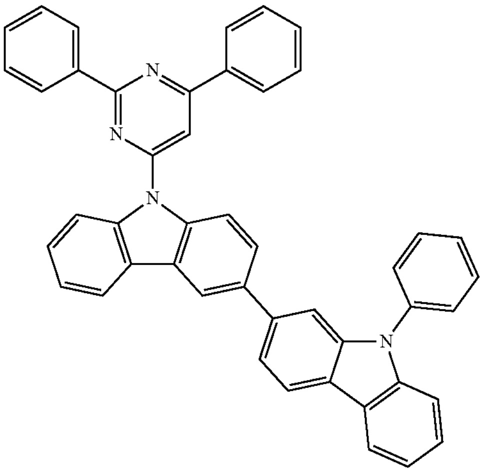
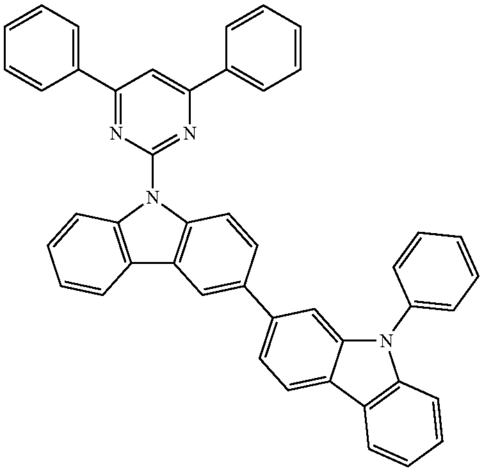
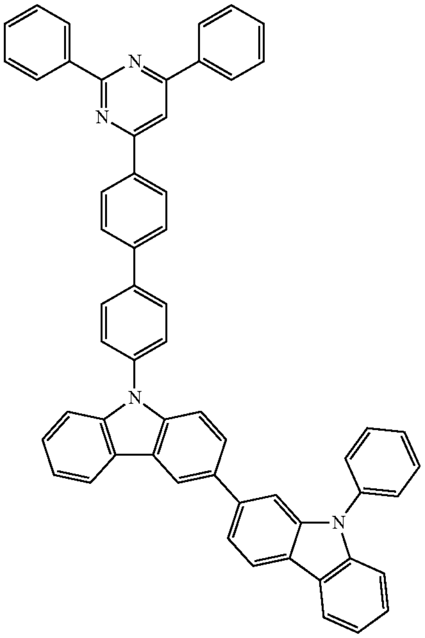

-continued
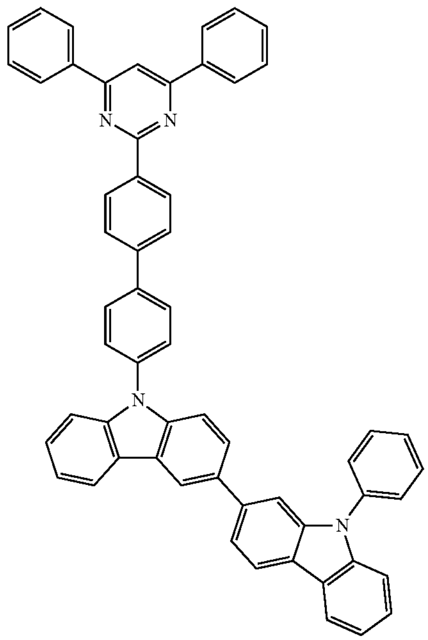
-continued
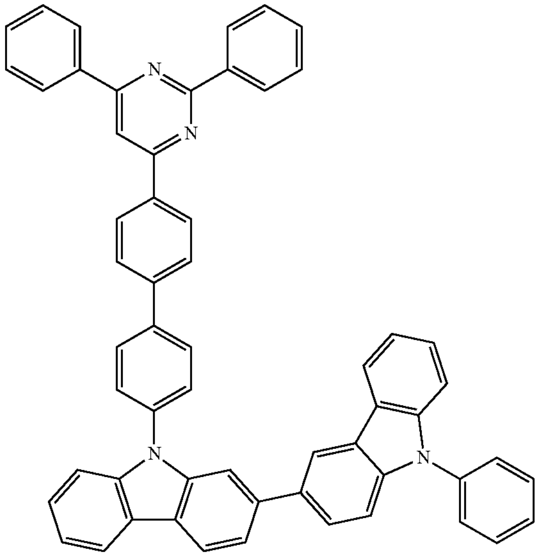
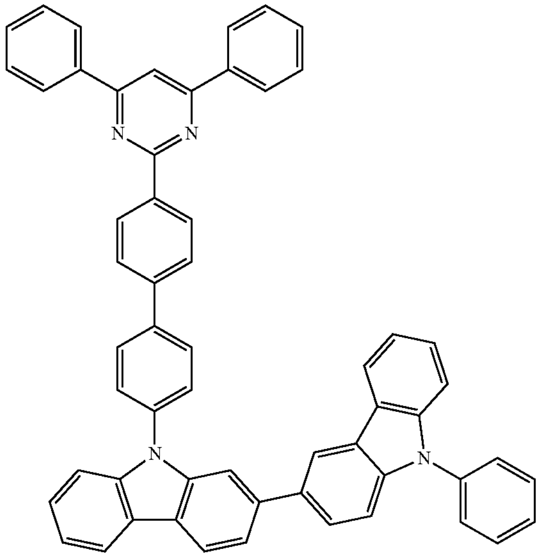
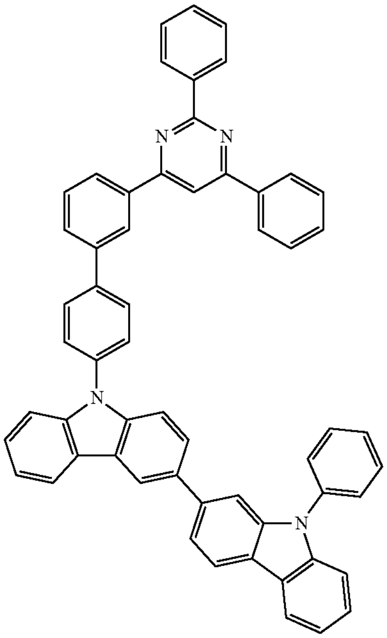

-continued
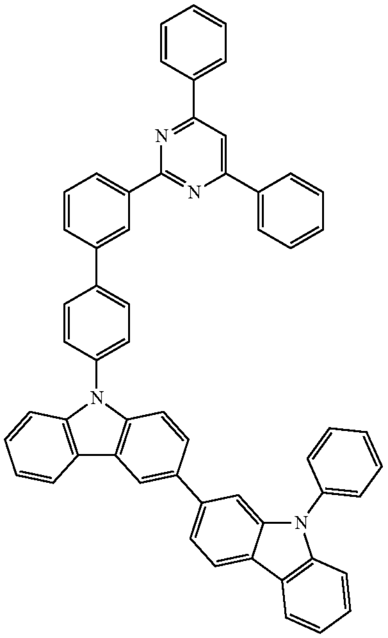
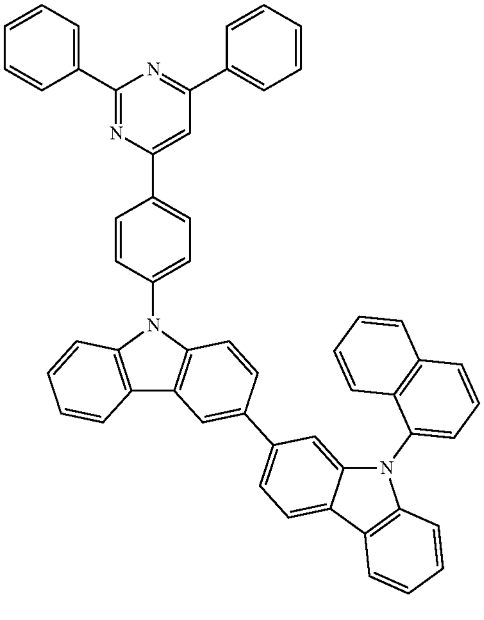
-continued
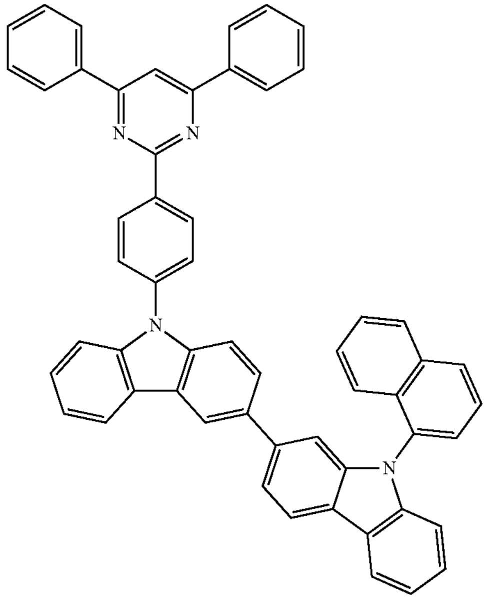
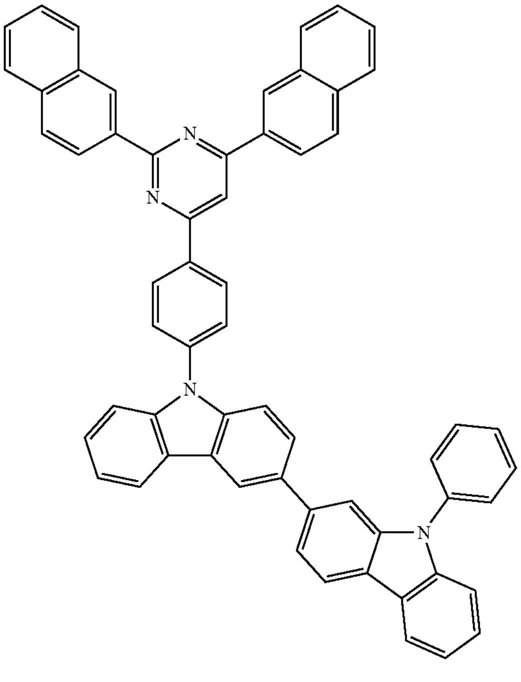

-continued

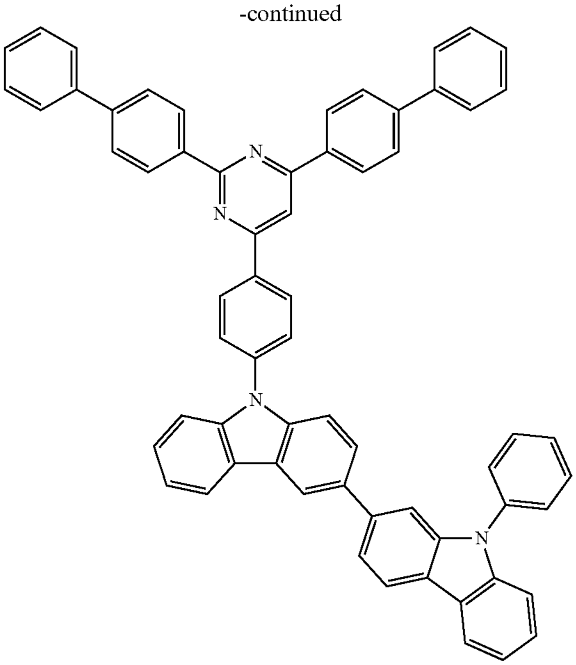

[Formula 81]

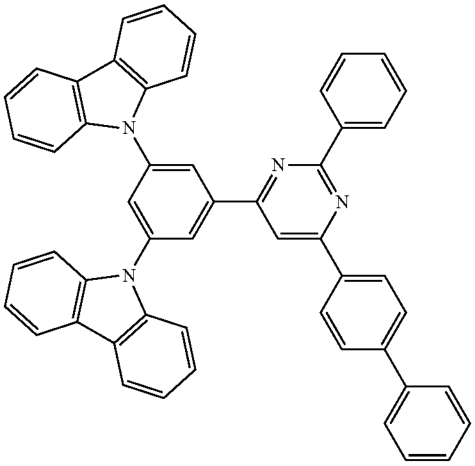

First Emitting Layer

The first emitting layer contains the first host material.

The first host material is a compound different from the second host material contained in the second emitting layer.

It is preferable that the first emitting layer contains at least the first emitting compound that emits light with a maximum peak wavelength of 500 nm or less.

Second Emitting Layer

The second emitting layer contains the second host material.

The second host material is a compound different from the first host material contained in the first emitting layer.

It is preferable that the second emitting layer contains at least the second emitting compound that emits light with a maximum peak wavelength of 500 nm or less.

First Host Material and Second Host Material

In the organic EL device according to the third exemplary embodiment, no particular limitation is imposed on the first host material and the second host material, so long as they are mutually different materials and satisfy the above numerical formula (Numerical Formula 1).

In the organic EL device according to the third exemplary embodiment, it is also preferable that the first host material and the second host material are each independently, for example, a compound selected from the group consisting of compounds represented by formulae (1), (1X), (12X), (13X), (14X), (15X), (16X), and (2) described below.

The compound represented by the formula (1X), (12X), (13X), (14X), (15X), or (16X) may be referred to as a first compound.

The compound represented by the formula (2) may be referred to as a second compound.

In the organic EL device according to the third exemplary embodiment, it is also preferable that the first emitting layer is disposed between the anode and the cathode and that the second emitting layer is disposed between the first emitting layer and the cathode.

Specifically, it is also preferable that the first emitting layer is disposed on the anode side of the second emitting layer.

In the organic EL device according to the third exemplary embodiment, it is also preferable that the first emitting layer is disposed between the anode and the cathode and that the second emitting layer is disposed between the first emitting layer and the anode.

Specifically, it is also preferable that the second emitting layer is disposed on the anode side of the first emitting layer.

The organic EL device according to the third exemplary embodiment may include the first emitting layer and the second emitting layer that are arranged in this order from the anode side or may include the second emitting layer and the first emitting layer that are arranged in this order from the anode side.

By selecting a combination of materials that satisfy the relationship of the above numerical formula (Numerical Formula 1), the effect of the layered structure of the emitting layer can be expected, irrespective of the order of the first emitting layer and the second emitting layer.

When the second emitting layer is disposed on the cathode side of the first emitting layer, it is preferable that the second emitting layer and the electron transporting layer are in direct contact with each other.

When the first emitting layer is disposed on the cathode side of the second emitting layer, it is preferable that the first emitting layer and the electron transporting layer are in direct contact with each other.

In the organic EL device according to the third exemplary embodiment, when the first emitting layer and the second emitting layer are layered in the order of the second emitting layer and the first emitting layer from the anode side, it is preferable that the hole mobility μh(H2) of the second host material and the hole mobility μh(H1) of the first host material satisfy the relationship of the following numerical formula (Numerical Formula C1).

$$\mu h(H2) > \mu h(H1) \quad \text{(Numerical Formula C1)}$$

In the organic EL device according to the third exemplary embodiment, when the first emitting layer and the second emitting layer are layered in the order of the second emitting layer and the first emitting layer from the anode side, it is preferable that the hole mobility μh(H2) of the second host material, the electron mobility μe(H2) of the second host material, the hole mobility μh(H1) of the first host material, and the electron mobility μe(H1) of the first host material satisfy the relationship of the following numerical formula (Numerical Formula C2).

$$\mu e(H1)/(\mu h(H1)) > \mu e(H2)/\mu h(H2)) \quad \text{(Numerical Formula C2)}$$

In the organic EL device according to the third exemplary embodiment, when the first emitting layer and the second emitting layer are layered in the order of the second emitting layer and the first emitting layer from the anode side, it is preferable that the electron mobility μe(H2) of the second host material and the electron mobility μe(H1) of the first host material satisfy the relationship of the following numerical formula (Numerical Formula C3).

$$\mu e(H1) > \mu e(H2) \quad \text{(Numerical Formula C3)}$$

When the first host material and the second host material satisfy the relationship of the above numerical formula (Numerical Formula C3), the ability of the second emitting layer to recombine holes and electrons is improved.

The electron mobility can be measured by the following method using impedance spectroscopy.

A measurement target layer having a thickness in a range from 100 nm to 200 nm is held between the anode and the cathode, to which a small alternating voltage of 100 mV or less is applied while a bias DC voltage is applied.

A value of an alternating current (absolute value and phase) which flows at this time is measured.

This measurement is performed while changing a frequency of the alternating voltage, and complex impedance (Z) is calculated from the current value and the voltage value.

A frequency dependency of the imaginary part (ImM) of the modulus M=iωZ (i: imaginary unit, ω: angular frequency) is obtained. The reciprocal number of a frequency ω at which the ImM becomes the maximum is defined as a response time of electrons carried in the measurement target layer.

The electron mobility is calculated by the following equation.

$$\text{Electron Mobility} = (\text{Film Thickness of Measurement Target Layer})^2 / (\text{Response Time} \cdot \text{Voltage})$$

The hole mobility can be measured by placing a mobility evaluation device in an impedance measurement apparatus to measure the impedance. Specifically, the hole mobility can be measured using a method described later in Examples.

Additional Layers of Organic EL Device

The organic EL device according to the third exemplary embodiment may include one or more organic layers in addition to the electron transporting layer, the electron injecting layer, the first emitting layer, and the second emitting layer.

The one or more organic layers are, for example, at least one layer selected from the group consisting of a hole injecting layer, a hole transporting layer, and a hole blocking layer.

The organic EL device according to the third exemplary embodiment may include only the electron transporting layer, the electron injecting layer, the first emitting layer, and the second emitting layer. However, the organic EL device may further include, for example, at least one layer selected from the group consisting of a hole injecting layer, a hole transporting layer, and a hole blocking layer.

FIG. 5 schematically shows an exemplary arrangement of an organic EL device according to the third exemplary embodiment.

The organic EL device 1B includes: a light-transmissive substrate 2; an anode 3; a cathode 4; and an organic layer 10B disposed between the anode 3 and the cathode 4.

The organic layer 10B includes a hole injecting layer 6, a hole transporting layer 7, a second emitting layer 52, a first emitting layer 51, an electron transporting layer 8, and an electron injecting layer 9 that are layered in this order on the anode 3.

The structure of the organic EL device in the invention is not limited to the structure shown in FIG. 5.

For example, an organic EL device having a different structure includes an organic layer including a hole injecting layer, a hole transporting layer, a first emitting layer, a second emitting layer, an electron transporting layer, and an electron injecting layer that are layered in this order on the anode.

It is preferable that the organic EL device according to the third exemplary embodiment includes a hole transporting layer between the anode and the emitting layer (emitting region).

The structure of the organic EL device in the third exemplary embodiment will be described in more detail in "Structures Common to Each Exemplary Embodiment."

Structures Common to Each Exemplary Embodiment

Structures applicable to each of the exemplary embodiments (the first exemplary embodiment, the second exemplary embodiment, the third exemplary embodiment, etc.) described herein will be described.

First Emitting Layer

In the organic EL device according to each exemplary embodiment, the maximum peak wavelength of the first emitting compound is preferably 500 nm or less and more preferably in a range from 430 nm to 480 nm.

The first emitting compound is preferably a compound that emits fluorescence with a maximum peak wavelength of 500 nm or less and is more preferably a compound that emits fluorescence with a maximum peak wavelength in a range from 430 nm to 480 nm.

A method for measuring the maximum peak wavelength of a compound is as described later.

In the organic EL device according to each exemplary embodiment, it is also preferable that the highest occupied molecular orbital energy level HOMO(H1) of the first host material and the highest occupied molecular orbital energy level HOMO(D1) of the first emitting compound satisfy the relationship of the following numerical formula (Numerical Formula 4).

$$|\text{HOMO}(D1)| - |\text{HOMO}(H1)| < 0.21 \text{ eV} \quad \text{(Numerical Formula 4)}$$

When the first host material and the first emitting compound satisfy the relationship of the above numerical formula (Numerical Formula 4), holes can easily transfer to the second emitting layer, and the recombination of the holes and electrons in the second emitting layer is facilitated.

In the organic EL device according to each exemplary embodiment, the first emitting layer preferably emits light with a maximum peak wavelength of 500 nm or less when the device is driven and more preferably emits light with a maximum peak wavelength in a range from 430 nm to 500 nm.

In the organic EL device according to each exemplary embodiment, the full width at half maximum FWHM of the maximum peak of the first emitting compound is preferably in a range from 1 nm to 30 nm.

In the organic EL device according to each exemplary embodiment, the full width at half maximum FWHM of the maximum peak of the first emitting compound is preferably in a range from 1 nm to 20 nm.

In the organic EL device according to each exemplary embodiment, the Stokes shift of the first emitting compound is preferably more than 7 nm.

When the Stokes shift of the first emitting compound exceeds 7 nm, a reduction in the luminous efficiency by self-absorption is easily prevented.

The self-absorption is a phenomenon in which emitted light is absorbed by the same compound to reduce luminous efficiency.

The self-absorption is notably observed in a compound having a small Stokes shift (i.e., a large overlap between an absorption spectrum and a fluorescence spectrum). Accordingly, in order to reduce the self-absorption, it is preferable to use a compound having a large Stokes shift (i.e., a small overlap between the absorption spectrum and the fluorescence spectrum).

In the organic EL device according to each exemplary embodiment, it is preferable that the triplet energy of the first host material $T_1(H1)$ and the triplet energy of the first emitting compound $T_1(D1)$ satisfy the relationship of the following numerical formula (Numerical Formula 6).

$$T_1(D1)>T_1(H1) \quad \text{(Numerical Formula 6)}$$

In the organic EL device according to each exemplary embodiment, the first emitting compound and the first host material may satisfy the relationship of the above numerical formula (Numerical Formula 6). In this case, when triplet excitons generated in the second emitting layer transfer to the first emitting layer, the triplet excitons undergo energy transfer not to the first emitting compound having a higher triplet energy but to the molecules of the first host material.

Triplet excitons generated by the recombination of holes and electrons in the first host material do not transfer to the first emitting compound having a higher triplet energy.

Triplet excitons generated by recombination on the molecules of the first emitting compound rapidly undergo energy transfer to the molecules of the first host material.

The triplet excitons of the first host material do not transfer to the first emitting compound but collide with one another efficiently in the first host material through the TTF phenomenon, and singlet excitons are thereby generated.

In the organic EL device according to each exemplary embodiment, it is preferable that the singlet energy $S_1(H1)$ of the first host material and the singlet energy $S_1(D1)$ of the first emitting compound satisfy the relationship of the following numerical formula (Numerical Formula 5).

$$S_1(H1)>S_1(D1) \quad \text{(Numerical Formula 5)}$$

In the organic EL device according to each exemplary embodiment, when the first emitting compound and the first host material satisfy the relationship of the above numerical formula (Numerical Formula 5), the singlet energy of the first emitting compound is smaller than the singlet energy of the first host material. In this case, the singlet excitons generated through the TTF phenomenon undergo energy transfer from the first host material to the first emitting compound and contribute to the fluorescence emission of the first emitting compound.

In the organic EL device according to each exemplary embodiment, it is preferable that the first emitting compound is a compound containing no azine ring structure in its molecule.

In the organic EL device according to each exemplary embodiment, it is preferable that the first emitting compound is not a boron-containing complex, and it is more preferable that the first emitting compound is not a complex.

In the organic EL device according to each exemplary embodiment, it is preferable that the first emitting layer contains no metal complex.

Moreover, in the organic EL device according to each exemplary embodiment, it is also preferable that the first emitting layer contains no boron-containing complex.

In the organic EL device according to each exemplary embodiment, it is preferable that the first emitting layer contains no phosphorescent material (dopant material).

It is also preferable that the first emitting layer contains no heavy-metal complex and no phosphorescent rare earth metal complex.

Examples of the heavy-metal complex herein include iridium complex, osmium complex, and platinum complex.

In the organic EL device according to each exemplary embodiment, the first emitting layer contains the first emitting compound in an amount of preferably 0.5 mass % or more based on the total mass of the first emitting layer.

In the organic EL device according to each exemplary embodiment, the first emitting layer may contain the first emitting compound in an amount of more than 1.1 mass % based on the total mass of the first emitting layer, 1.2 mass % or more based on the total mass of the first emitting layer, and 1.5 mass % or more based on the total mass of the first emitting layer.

In the organic EL device according to each exemplary embodiment, the first emitting layer may contain the first emitting compound in an amount of preferably 10 mass % or less based on the total mass of the first emitting layer, more preferably 7 mass % or less based on the total mass of the first emitting layer, and still more preferably 5 mass % or less based on the total mass of the first emitting layer.

In the organic EL device according to each exemplary embodiment, the first emitting layer contains the first host material in an amount of preferably 60 mass % or more based on the total mass of the first emitting layer, more preferably 70 mass % or more based on the total mass of the first emitting layer, still more preferably 80 mass % or more based on the total mass of the first emitting layer, still further more preferably 90 mass % or more based on the total mass of the first emitting layer, and yet still further more preferably 95 mass % or more based on the total mass of the first emitting layer.

In the organic EL device according to each exemplary embodiment, the first emitting layer preferably contains the first host material in an amount of 99 mass % or less based on the total mass of the first emitting layer.

In the organic EL device according to each exemplary embodiment, when the first emitting layer contains the first host material and the first emitting compound, the upper limit of the total content ratio of the first host material and the first emitting compound is 100 mass %.

In each of the exemplary embodiments, it is not excluded that the first emitting layer contains a material other than the first host material and the first emitting compound.

The first emitting layer may contain a single type of the first host material or may contain two or more types of the first host material.

The first emitting layer may contain a single type of the first emitting compound or may contain two or more types of the first emitting compound.

In the organic EL device according to each exemplary embodiment, it is preferable that the thickness of the first emitting layer is larger than the thickness of the second emitting layer.

In the organic EL device according to each exemplary embodiment, when the thickness of the second emitting layer is smaller than the thickness of the first emitting layer, the triplet excitons generated in the second emitting layer do not remain in the second emitting layer and can effectively diffuse to the first emitting layer.

It is therefore preferable that the thickness of the second emitting layer is smaller than the thickness of the first emitting layer.

In the organic EL device according to each exemplary embodiment, the thickness of the first emitting layer is preferably 5 nm or more and more preferably 15 nm or more.

When the thickness of the first emitting layer is 5 nm or more, the triplet excitons transferred from the second emitting layer to the first emitting layer are easily prevented from returning again to the second emitting layer.

When the thickness of the first emitting layer is 5 nm or more, the triplet excitons can be sufficiently separated from the recombination portion of the second emitting layer.

In the organic EL device according to each exemplary embodiment, the thickness of the first emitting layer is preferably 25 nm or less and more preferably 20 nm or less.

When the thickness of the first emitting layer is 25 nm or less, the density of the triplet excitons in the first emitting layer can be increased to facilitate the occurrence of the TTF phenomenon.

In the organic EL device according to each exemplary embodiment, the thickness of the first emitting layer is preferably in a range from 5 nm to 25 nm.

In the organic EL device according to each exemplary embodiment, the thickness of the first emitting layer is more preferably in a range from 5 nm to 20 nm.

Second Emitting Layer

In the organic EL device according to each exemplary embodiment, the maximum peak wavelength of the second emitting compound is preferably 500 nm or less and more preferably in a range from 430 nm to 480 nm.

The second emitting compound is preferably a compound that emits fluorescence with a maximum peak wavelength of 500 nm or less and is more preferably a compound that emits fluorescence with a maximum peak wavelength in a range from 430 nm to 480 nm.

In the organic EL device according to each exemplary embodiment, the absolute value |LUMO(D2)| of the lowest unoccupied molecular orbital energy level LUMO(D2) of the second emitting compound is preferably 3.25 eV or less, more preferably 3.20 eV or less, and still more preferably 3.15 eV or less.

In the organic EL device according to each exemplary embodiment, the full width at half maximum FWHM of the maximum peak of the second emitting compound is preferably in a range from 1 nm to 30 nm.

In the organic EL device according to each exemplary embodiment, the second emitting compound is preferably a compound containing no azine ring structure in its molecule.

In the organic EL device according to each exemplary embodiment, it is preferable that the second emitting compound is not a boron-containing complex, and it is more preferable that the second emitting compound is not a complex.

In the organic EL device according to each exemplary embodiment, it is preferable that the second emitting layer contains no metal complex.

In the organic EL device according to the present exemplary embodiment, it is also preferable that the second emitting layer contains no boron-containing complex.

In the organic EL device according to each exemplary embodiment, it is preferable that the second emitting layer contains no phosphorescent material (dopant material).

In the organic EL device according to each exemplary embodiment, it is preferable that the second emitting layer contains no heavy-metal complex and no phosphorescent rare earth metal complex.

Examples of the heavy-metal complex herein include iridium complex, osmium complex, and platinum complex.

In the organic EL device according to each exemplary embodiment, when the largest luminous intensity peak in the emission spectrum of the second emitting compound is defined as the maximum peak and the height of the maximum peak is set to 1, it is preferable that the heights of other peaks in the emission spectrum are less than 0.6.

It should be noted that the peaks in the emission spectrum are defined as local maximum values.

In the organic EL device according to each exemplary embodiment, the number of peaks in the emission spectrum of the second emitting compound is less than 3.

In the organic EL device according to each exemplary embodiment, the second emitting layer preferably emits light with a maximum peak wavelength of 500 nm or less when the device is driven and more preferably emits light with a maximum peak wavelength in a range from 430 nm to 480 nm.

In the organic EL device according to each exemplary embodiment, it is preferable that the singlet energy $S_1(H2)$ of the second host material and the singlet energy $S_1(D2)$ of the second emitting compound satisfy the relationship of a numerical formula (Numerical Formula 7) below.

The singlet energy $S_1$ means an energy difference between the lowest singlet state and the ground state.

$$S_1(H2)>S_1(D2) \quad \text{(Numerical Formula 7)}$$

When the second host material and the second emitting compound satisfy the relationship of the above numerical formula (Numerical Formula 7), singlet excitons generated in the second host material can easily undergo energy transfer from the second host material to the second emitting compound and contribute to the fluorescence emission of the second emitting compound.

In the organic EL device according to each exemplary embodiment, it is preferable that the triplet energy $T_1(D2)$ of the second emitting compound and the triplet energy $T_1(H2)$ of the second host material satisfy the relationship of the following numerical formula (Numerical Formula 8).

$$T_1(D2)>T_1(H2) \quad \text{(Numerical Formula 8)}$$

When the second host material and the second emitting compound satisfy the relationship of the above numerical formula (Numerical Formula 8), the triplet excitons generated in the second emitting layer transfer not through the second emitting compound having a higher triplet energy but through the second host material and can easily transfer to the first emitting layer.

It is preferable that the organic EL device according to each exemplary embodiment satisfies the relationship of the following numerical formula (Numerical Formula 20B).

$$T_1(D2)>T_1(H2)>T_1(H1) \quad \text{(Numerical Formula 20B)}$$

In the organic EL device according to each exemplary embodiment, the second emitting layer contains the second emitting compound in an amount of preferably 0.5 mass % or more based on the total mass of the second emitting layer.

In the organic EL device according to each exemplary embodiment, the second emitting layer may contain the second emitting compound in an amount of more than 1.1 mass % based on the total mass of the second emitting layer, 1.2 mass % or more based on the total mass of the second emitting layer, and 1.5 mass % or more based on the total mass of the second emitting layer.

In the organic EL device according to each exemplary embodiment, the second emitting layer contains the second emitting compound in an amount of preferably 10 mass % or less based on the total mass of the second emitting layer, more preferably 7 mass % or less based on the total mass of the second emitting layer, and still more preferably 5 mass % or less based on the total mass of the second emitting layer.

In the organic EL device according to each exemplary embodiment, the second emitting layer contains the second host material in an amount of preferably 60 mass % or more based on the total mass of the second emitting layer, more preferably 70 mass % or more based on the total mass of the second emitting layer, still more preferably 80 mass % or more based on the total mass of the second emitting layer, still further more preferably 90 mass % or more based on the total mass of the second emitting layer, and yet still further more preferably 95 mass % or more based on the total mass of the second emitting layer.

The second emitting layer preferably contains the second host material at 99.5 mass % or less with respect to the total mass of the second emitting layer.

It is also preferable that the second emitting layer contains the second host material in an amount of 99 mass % or less based on the total mass of the second emitting layer.

When the second emitting layer contains the second host material and the second emitting compound, the upper limit of the total content ratio of the second host material and the second emitting compound is 100 mass %.

In each of the exemplary embodiments, it is not excluded that the second emitting layer contains a material other than the second host material and the second emitting compound.

The second emitting layer may contain a single type of the second host material or may contain two or more types of the second host material.

The second emitting layer may contain a single type of the second emitting compound or may contain two or more types of the second emitting compound.

In the organic EL device according to each exemplary embodiment, it is preferable that the thickness of the second emitting layer is 3 nm or more.

It is also preferable that the thickness of the second emitting layer is 5 nm or more.

When the thickness of the second emitting layer is 3 nm or more, the second emitting layer is thick enough to allow the holes and electrons to recombine.

In the organic EL device according to each exemplary embodiment, the thickness of the second emitting layer is preferably 15 nm or less and more preferably 10 nm or less.

When the thickness of the second emitting layer is 15 nm or less, the second emitting layer is thin enough to allow the triplet excitons to transfer to the first emitting layer.

In the organic EL device according to each exemplary embodiment, the thickness of the second emitting layer is more preferably in a range from 3 nm to 15 nm.

In the organic EL device according to the third exemplary embodiment, the second emitting layer may contain a compound represented by the following formula (HT100).

[Formula 82]

(HT100)

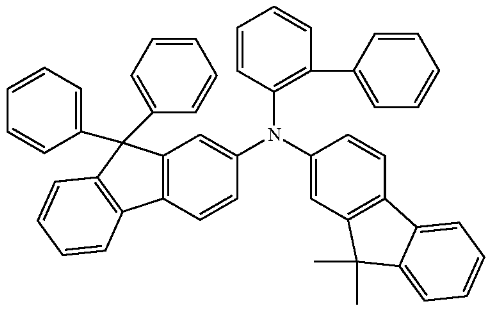

Relationship Between First Emitting Layer and Second Emitting Layer

In the organic EL device according to each exemplary embodiment, it is preferable that the triplet energy of the first host material $T_1(H1)$ and the triplet energy of the second host material $T_1(H2)$ satisfy the relationship of the following numerical formula (Numerical Formula 9).

$$T_1(H2)-T_1(H1)>0.03\ \text{eV} \quad \text{(Numerical Formula 9)}$$

In the organic EL device according to each exemplary embodiment, it is preferable that a triplet energy of the first emitting compound or the second emitting compound $T_1(DX)$, the triplet energy of the first host material $T_1(H1)$, and the triplet energy of the second host material $T_1(H2)$ satisfy the relationship of the following numerical formula (Numerical Formula 10).

$$2.6\ \text{eV}>T_1(DX)>T_1(H2)>T_1(H1) \quad \text{(Numerical Formula 10)}$$

In the organic EL device according to each exemplary embodiment, when the first emitting layer contains the first emitting compound, it is preferable that the triplet energy of the first emitting compound $T_1(D1)$ satisfies the relationship of the following numerical formula (Numerical Formula 10A).

$$2.6\ \text{eV}>T_1(D1)>T_1(H2)>T_1(H1) \quad \text{(Numerical Formula 10A)}$$

In the organic EL device according to each exemplary embodiment, when the second emitting layer contains the second emitting compound, it is preferable that the triplet energy of the second emitting compound $T_1(D2)$ satisfies the relationship of the following numerical formula (Numerical Formula 10B).

$$2.6\ \text{eV}>T_1(D2)>T_1(H2)>T_1(H1) \quad \text{(Numerical Formula 10B)}$$

In the organic EL device according to each exemplary embodiment, it is preferable that the triplet energy of the first emitting compound or the second emitting compound $T_1(DX)$ and the triplet energy of the second host material $T_1(H2)$ satisfy the relationship of the following numerical formula (Numerical Formula 11).

$$0\ \text{eV}<T_1(DX)-T_1(H2)<0.6\ \text{eV} \quad \text{(Numerical Formula 11).}$$

In the organic EL device according to each exemplary embodiment, when the second emitting layer contains the second emitting compound, it is preferable that the triplet energy of the second emitting compound $T_1(D2)$ satisfies the relationship of the following numerical formula (Numerical Formula 11A).

$$0\ \text{eV}<T_1(D2)-T_1(H2)<0.6\ \text{eV} \quad \text{(Numerical Formula 11A)}$$

In the organic EL device according to each exemplary embodiment, when the first emitting layer contains the first emitting compound, it is preferable that the triplet energy of the first emitting compound $T_1$(D1) satisfies the relationship of the following numerical formula (Numerical Formula 11B).

$$0\ \text{eV}<T_1(D1)-T_1(H1)<0.8\ \text{eV} \quad \text{(Numerical Formula 11B)}$$

In the organic EL device according to each exemplary embodiment, it is preferable that the triplet energy of the second host material $T_1$(H2) satisfies the relationship of the following numerical formula (Numerical Formula 12).

$$T_1(H2)>2.0\ \text{eV} \quad \text{(Numerical Formula 12).}$$

In the organic EL device according to each exemplary embodiment, it is also preferable that the triplet energy of the second host material $T_1$(H2) satisfies the relationship of the following numerical formula (Numerical Formula 12A) or satisfies the relationship of the following numerical formula (Numerical Formula 12B).

$$T_1(H2)>2.10\ \text{eV} \quad \text{(Numerical Formula 12A)}$$

$$T_1(H2)>2.15\ \text{eV} \quad \text{(Numerical Formula 12B)}$$

In the organic EL device according to each exemplary embodiment, when the triplet energy $T_1$(H2) of the second host material satisfies the relationship of the above numerical formula (Numerical Formula 12A) or the above numerical formula (Numerical Formula 12B), the triplet excitons generated in the second emitting layer can easily transfer to the first emitting layer, and the back-transfer from the first emitting layer to the second emitting layer can be easily prevented.

Therefore, singlet excitons are generated efficiently in the first emitting layer, and the luminous efficiency is improved.

In the organic EL device according to each exemplary embodiment, it is also preferable that the triplet energy of the second host material $T_1$(H2) satisfies the relationship of the following numerical formula (Numerical Formula 12C) or satisfies the relationship of the following numerical formula (Numerical Formula 12D).

$$2.08\ \text{eV}>T_1(H2)>1.87\ \text{eV} \quad \text{(Numerical Formula 12C)}$$

$$2.05\ \text{eV}>T_1(H2)>1.90\ \text{eV} \quad \text{(Numerical Formula 12D)}$$

In the organic EL device according to each exemplary embodiment, when the triplet energy of the second host material $T_1$(H2) satisfies the relationship of the above numerical formula (Numerical Formula 12C) or the above numerical formula (Numerical Formula 12D), the energy of the triplet excitons generated in the second emitting layer is small, so that the lifetime of the organic EL device is expected to be extended.

In the organic EL device according to each exemplary embodiment, it is also preferable that the triplet energy of the second emitting compound $T_1$(D2) satisfies the relationship of the following numerical formula (Numerical Formula 14C) or satisfies the relationship of the following numerical formula (Numerical Formula 14D).

$$2.60\ \text{eV}>T_1(D2) \quad \text{(Numerical Formula 14C)}$$

$$2.50\ \text{eV}>T_1(D2) \quad \text{(Numerical Formula 14D)}$$

When the second emitting layer contains a compound satisfying the relationship of the above numerical formula (Numerical Formula 14C) or (Numerical Formula 14D), the lifetime of the organic EL device is extended.

In the organic EL device according to each exemplary embodiment, it is also preferable that the triplet energy of the first emitting compound $T_1$(D1) satisfies the relationship of the following numerical formula (Numerical Formula 14A) or satisfies the relationship of the following numerical formula (Numerical Formula 14B).

$$2.60\ \text{eV}>T_1(D1) \quad \text{(Numerical Formula 14A)}$$

$$2.50\ \text{eV}>T_1(D1) \quad \text{(Numerical Formula 14B)}$$

When the first emitting layer contains a compound satisfying the relationship of the above numerical formula (Numerical Formula 14A) or (Numerical Formula 14B), the lifetime of the organic EL device is extended.

In the organic EL device according to each exemplary embodiment, it is also preferable that the triplet energy of the first host material $T_1$(H1) satisfies the relationship of the following numerical formula (Numerical Formula 13).

$$T_1(H1)>1.9\ \text{eV} \quad \text{(Numerical Formula 13).}$$

In the organic EL device according to each exemplary embodiment, it is also preferable that the triplet energy of the first host material $T_1$(H2) satisfies the relationship of the following numerical formula (Numerical Formula 13A).

$$1.9\ \text{eV}>T_1(H1)>1.8\ \text{eV} \quad \text{(Numerical Formula 13A)}$$

In the organic EL device according to each exemplary embodiment, it is also preferable that the first emitting layer and the second emitting layer are in direct contact with each other.

Herein, the layer structure in which "the first emitting layer and the second emitting layer are in direct contact with each other" is meant to encompass, for example, the following embodiments (LS1), (LS2), and (LS3).

(LS1) An embodiment in which a region containing both the first host material and the second host material is generated in a process of vapor-depositing the compound of the first emitting layer and vapor-depositing the compound of the second emitting layer, and is present on the interface between the first emitting layer and the second emitting layer.

(LS2) An embodiment in which in a case of containing an emitting compound in the first emitting layer and the second emitting layer, a region containing the first host material, the second host material and the emitting compound is generated in a process of vapor-depositing the compound of the first emitting layer and vapor-depositing the compound of the second emitting layer, and is present on the interface between the first emitting layer and the second emitting layer.

(LS3) An embodiment in which in a case of containing an emitting compound in the first emitting layer and the second emitting layer, a region containing the emitting compound, a region containing the first host material or a region containing the second host material is generated in a process of vapor-depositing the compound of the first emitting layer and vapor-depositing the compound of the second emitting layer, and is present on the interface between the first emitting layer and the second emitting layer.

Third Emitting Layer

The organic EL device according to each exemplary embodiment may further include a third emitting layer.

It is preferable that the third emitting layer contains a third host material, that the first host material, the second host material, and the third host material are mutually different, that the third emitting layer contains at least a third emitting compound, that the first emitting compound, the second emitting compound, and the third emitting compound are mutually the same or different, and that the triplet energy $T_1(H2)$ of the second host material and the triplet energy $T_1(H3)$ of the third host material satisfy the relationship of the following numerical formula (Numerical Formula 40).

$$T_1(H2)>T_1(H3) \quad \text{(Numerical Formula 40)}$$

The third emitting compound is preferably a compound that emits light with a maximum peak wavelength of 500 nm or less and is more preferably a compound that emits light with a maximum peak wavelength in a range from 430 nm to 480 nm.

The third emitting compound is still more preferably a compound that emits fluorescence with a maximum peak wavelength of 500 nm or less and is still further more preferably a compound that emits fluorescence with a maximum peak wavelength in a range from 430 nm to 480 nm.

When the organic EL device according to each exemplary embodiment contains the third emitting layer, it is preferable that the triplet energy of the first host material $T_1(H1)$ and the triplet energy of the third host material $T_1(H3)$ satisfy the relationship of the following numerical formula (Numerical Formula 41).

$$T_1(H1)>T_1(H3) \quad \text{(Numerical Formula 41)}$$

In the organic EL device according to each exemplary embodiment, no particular limitation is imposed on the third host material so long as it is a compound satisfying the relationship of the above numerical formula (Numerical Formula 40).

When the organic EL device according to each exemplary embodiment contains the third emitting layer, it is also preferable that the first emitting layer and the second emitting layer are in direct contact with each other and that the second emitting layer and the third emitting layer are in direct contact with each other.

Herein, the structure in which "the second emitting layer and the third emitting layer are in direct contact with each other" is meant to encompass, for example, the following embodiments (LS4), (LS5), and (LS6).

(LS4) An embodiment in which a region containing both the second host material and the third host material is generated in a process of vapor-depositing the compound of the second emitting layer and vapor-depositing the compound of the third emitting layer, and is present on the interface between the second emitting layer and the third emitting layer.

(LS5) An embodiment in which in a case of containing an emitting compound in the second emitting layer and the third emitting layer, a region containing the second host material, the third host material and the emitting compound is generated in a process of vapor-depositing the compound of the second emitting layer and vapor-depositing the compound of the third emitting layer, and is present on the interface between the second emitting layer and the third emitting layer.

(LS6) An embodiment in which in a case of containing an emitting compound in the second emitting layer and the third emitting layer, a region containing the emitting compound, a region containing the second host material or a region containing the third host material is generated in a process of vapor-depositing the compound of the second emitting layer and vapor-depositing the compound of the third emitting layer, and is present on the interface between the second emitting layer and the third emitting layer.

First Host Material, Second Host Material, and Third Host Material

In each exemplary embodiment, it is also preferable that the first host material, the second host material, and the third host material are each independently, for example, a compound selected from the group consisting of compounds represented by formulae (1), (1X), (12X), (13X), (14X), (15X), (16X), and (2) described later.

In the organic EL device according to the second exemplary embodiment, it is also preferable that the first host material is a compound represented by the above formula (1H) and that the second host material is, for example, a compound selected from the group consisting of compounds represented by the formulae (1), (1X), (12X), (13X), (14X), (15X), and (16X) described later.

Compound Represented by Formula (2) In each exemplary embodiment, it is also preferable that the first host material is, for example, a compound represented by the following formula (2).

[Formula 83]

(2)

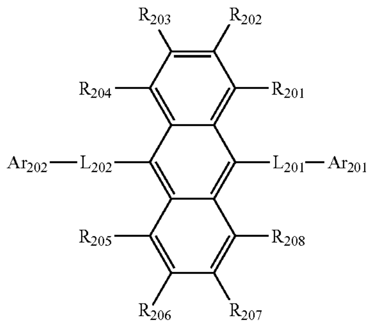

In the formula (2):

$R_{201}$ to $R_{208}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

$L_{201}$ and $L_{202}$ are each independently a single bond, a substituted or unsubstituted arylene group having 6 to 50 ring carbon atoms, or a substituted or unsubstituted divalent heterocyclic group having 5 to 50 ring atoms; and $Ar_{201}$ and $Ar_{202}$ are each independently a substituted or unsubstituted aryl group having 6 to 50 ring carbon atoms, or a substituted or unsubstituted heterocyclic group having 5 to 50 ring atoms.

In the compound represented by the formula (2) in each exemplary embodiment, $R_{901}$, $R_{902}$, $R_{903}$, $R_{904}$, $R_{905}$, $R_{906}$, $R_{907}$, $R_{801}$, and $R_{\$02}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

In the organic EL device according to each exemplary embodiment:

$R_{201}$ to $R_{208}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a substituted or unsubstituted aralkyl group having 7 to 50 carbon atoms, a group represented by $-C(=O)R_{801}$, a group represented by $-COOR_{802}$, a halogen atom, a cyano group, or a nitro group;

$L_{201}$ and $L_{202}$ are each independently a single bond, a substituted or unsubstituted arylene group having 6 to 50 ring carbon atoms, or a substituted or unsubstituted divalent heterocyclic group having 5 to 50 ring atoms; and $Ar_{201}$ and $Ar_{202}$ are each independently a substituted or unsubstituted aryl group having 6 to 50 ring carbon atoms, or a substituted or unsubstituted heterocyclic group having 5 to 50 ring atoms.

In the organic EL device according to each exemplary embodiment, it is preferable that $L_{201}$ and $L_{202}$ are each independently a single bond or a substituted or unsubstituted arylene group having 6 to 50 ring carbon atoms and that $Ar_{201}$ and $Ar_{202}$ are each independently a substituted or unsubstituted aryl group having 6 to 50 ring carbon atoms.

In the organic EL device according to each exemplary embodiment, it is preferable that $Ar_{201}$ and $Ar_{202}$ are each independently a phenyl group, a naphthyl group, a phenanthryl group, a biphenyl group, a terphenyl group, a diphenylfluorenyl group, a dimethylfluorenyl group, a benzodiphenylfluorenyl group, a benzodimethylfluorenyl group, a dibenzofuranyl group, a dibenzothienyl group, a naphthobenzofuranyl group, or a naphthobenzothienyl group.

In the organic EL device according to each exemplary embodiment, the compound represented by the formula (2) is preferably a compound represented by the following formula (201), (202), (203), (204), (205), (206), (207), (208), or (209).

[Formula 84]

(201)

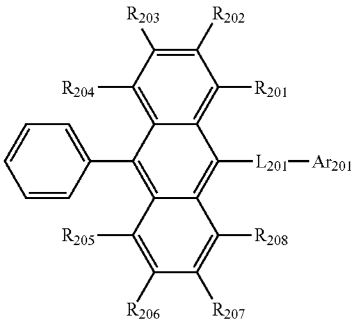

[Formula 85]

(202)

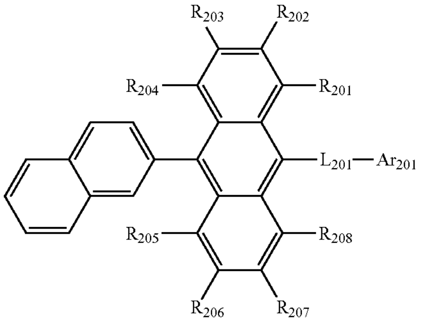

[Formula 86]

(203)

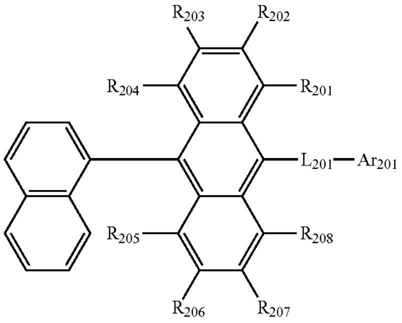

[Formula 87]

(204)

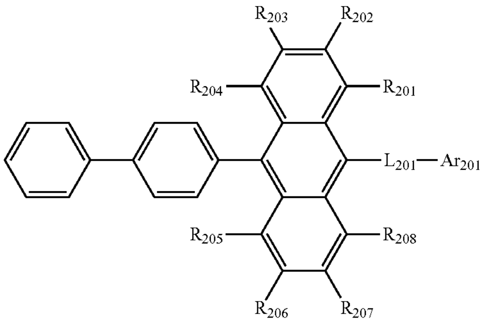

-continued

[Formula 88]

(205)

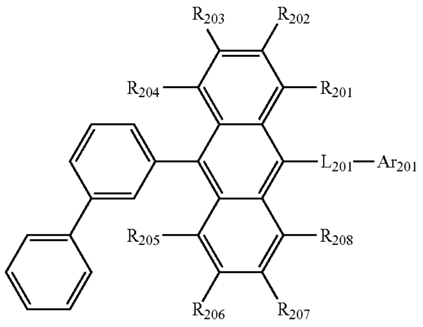

[Formula 89]

(206)

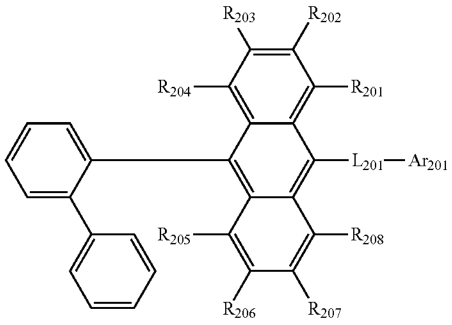

[Formula 90]

(207)

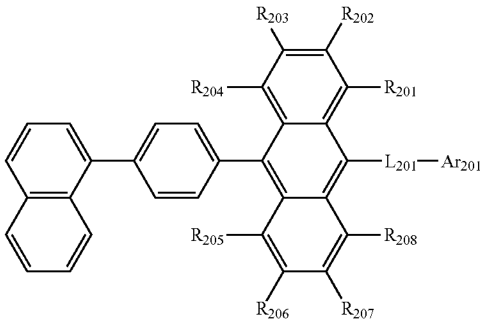

[Formula 91]

(208)

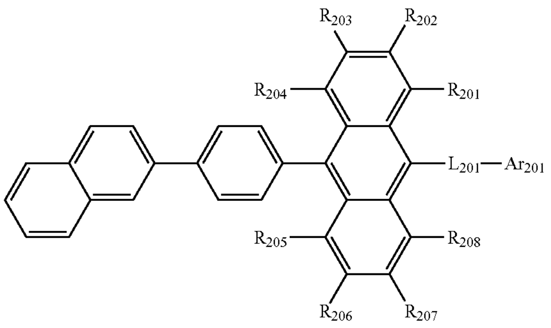

-continued

[Formula 92]

(209)

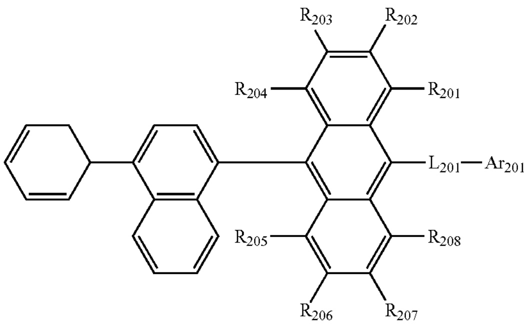

In the above formulae (201) to (209): $L_{201}$ and $Ar_{201}$ represent the same as $L_{201}$ and $Ar_{201}$ in the formula (2); and $R_{201}$ to $R_{208}$ each independently represent the same as $R_{201}$ to $R_{208}$ in the formula (2).

It is also preferable that the compound represented by the formula (2) is a compound represented by the following formula (221), (222), (223), (224), (225), (226), (227), (228), or (229).

[Formula 93]

(221)

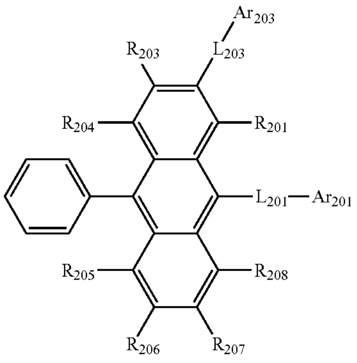

[Formula 94]

(222)

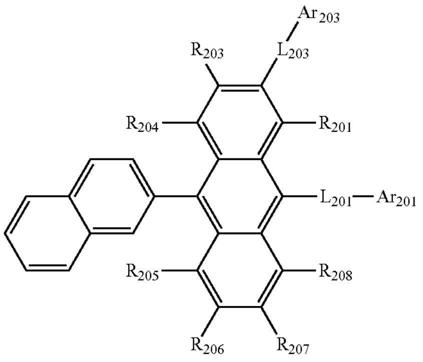

-continued

[Formula 95]

(223)

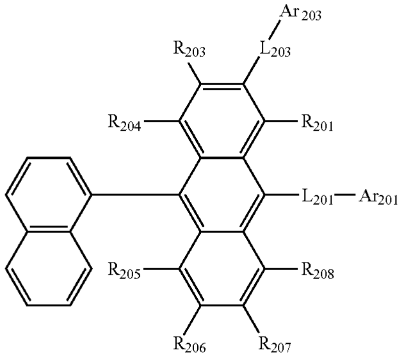

[Formula 96]

(224)

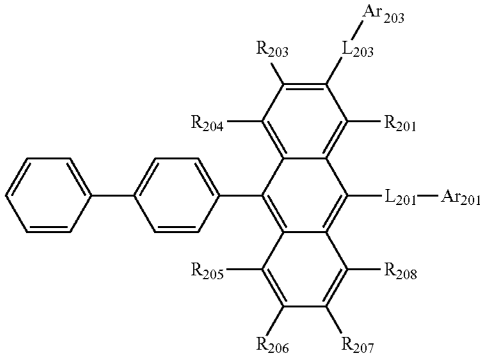

[Formula 97]

(225)

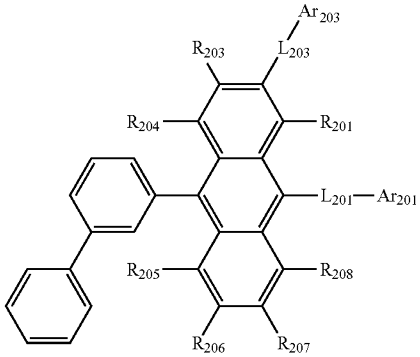

[Formula 98]

(226)

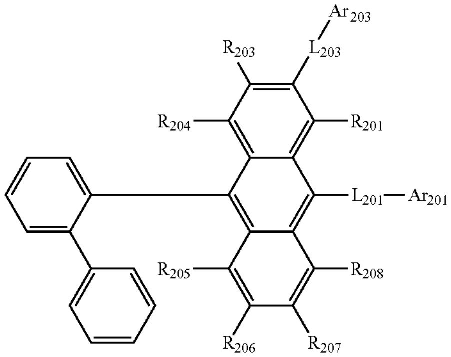

-continued

[Formula 99]

(227)

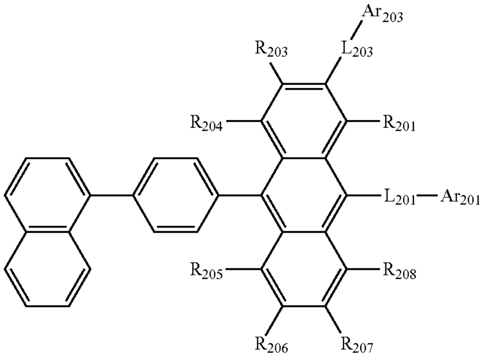

[Formula 100]

(228)

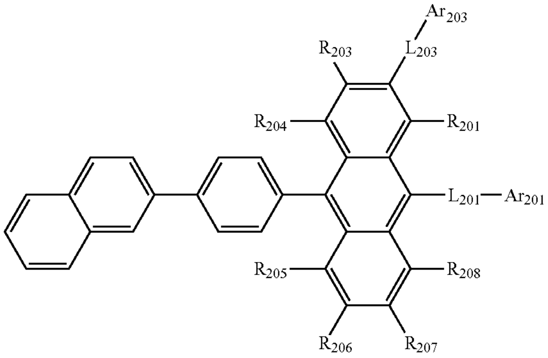

[Formula 101]

(229)

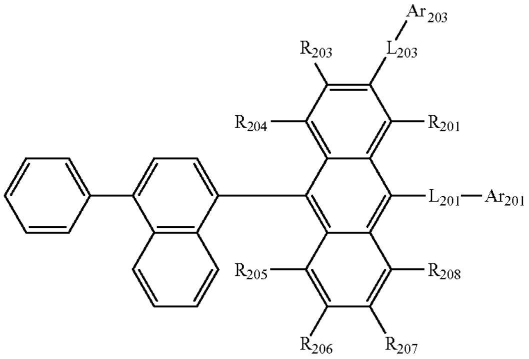

In the formulae (221), (222), (223), (224), (225), (226), (227), (228) and (229):

$R_{201}$ and $R_{203}$ to $R_{208}$ each independently represent the same as $R_{201}$ and $R_{203}$ to $R_{208}$ in the formula (2);

$L_{201}$ and $Ar_{201}$ respectively represent the same as $L_{201}$ and $Ar_{201}$ in the formula (2);

$L_{203}$ represents the same as $L_{201}$ in the formula (2);

$L_{203}$ and $L_{201}$ are mutually the same or different;

$Ar_{203}$ represents the same as $Ar_{201}$ in the formula (2); and $Ar_{203}$ and $Ar_{201}$ are mutually the same or different.

It is also preferable that the compound represented by the formula (2) is a compound represented by the following formula (241), (242), (243), (244), (245), (246), (247), (248), or (249).

[Formula 102]
(241)
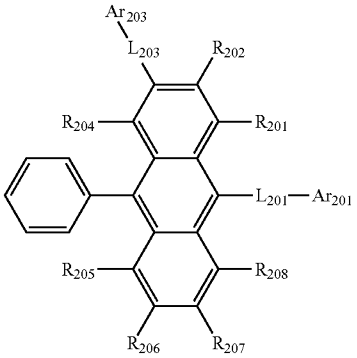
[Formula 103]
(242)
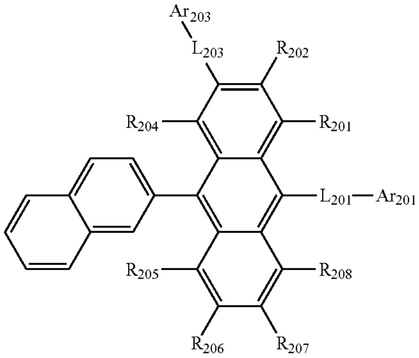
[Formula104]
(243)
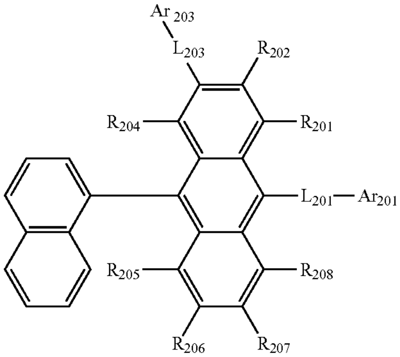
[Formula 105]
(244)
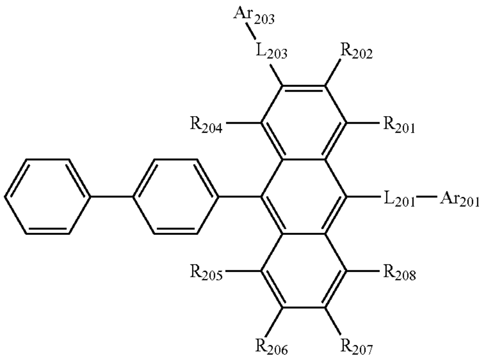
-continued
[Formula 106]
(245)
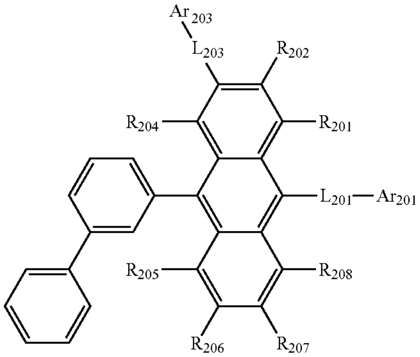
[Formula 107]
(246)
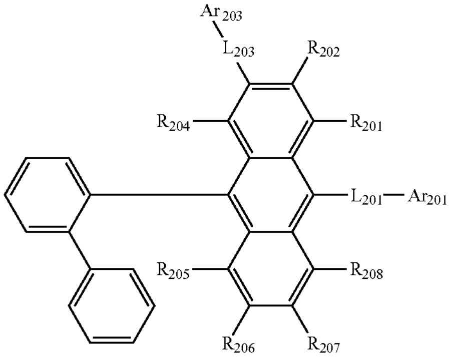
[Formula 108]
(247)
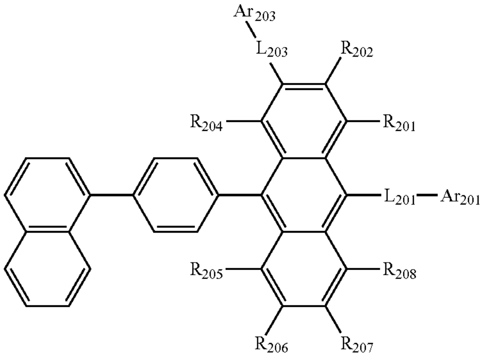
[Formula 109]
(248)
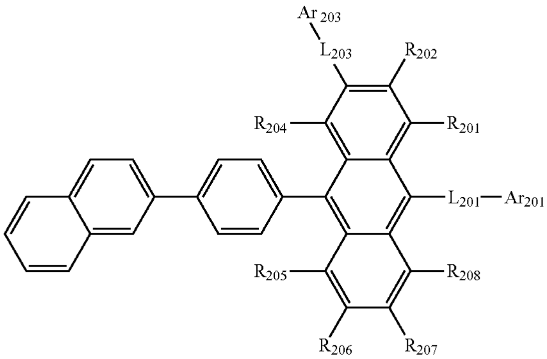

-continued

[Formula 110]

(249)

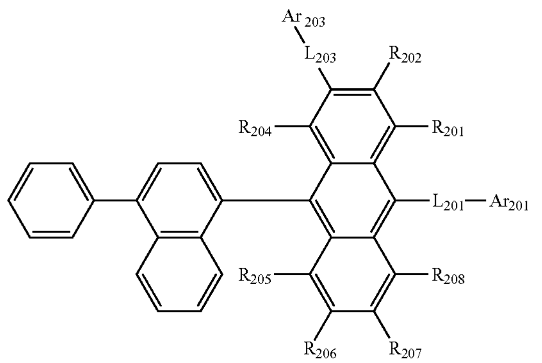

In the formulae (241), (242), (243), (244), (245), (246), (247), (248) and (249):

$R_{201}$, $R_{202}$ and $R_{204}$ to $R_{208}$ each independently represent the same as $R_{201}$, $R_{202}$ and $R_{204}$ to $R_{208}$ in the formula (2);

$L_{201}$ and $Ar_{201}$ respectively represent the same as $L_{201}$ and $Ar_{201}$ in the formula (2);

$L_{203}$ represents the same as $L_{201}$ in the formula (2);

$L_{203}$ and $L_{201}$ are mutually the same or different;

$Ar_{203}$ represents the same as $Ar_{201}$ in the formula (2); and $Ar_{203}$ and $Ar_{201}$ are mutually the same or different.

In the compound represented by the formula (2), it is preferable that $R_{201}$ to $R_{208}$ are each independently a hydrogen atom, a substituted or unsubstituted alkyl group having 1 to 50 carbon atoms, a substituted or unsubstituted cycloalkyl group having 3 to 50 ring carbon atoms, or a group represented by $-Si(R_{901})(R_{902})(R_{903})$.

It is preferable that $L_{201}$ is a single bond or an unsubstituted arylene group having 6 to 22 ring carbon atoms and that $Ar_{201}$ is a substituted or unsubstituted aryl group having 6 to 22 ring carbon atoms.

In the organic EL device according to each exemplary embodiment, $R_{201}$ to $R_{208}$, which are substituents on the anthracene skeleton of the compound represented by the formula (2), are each preferably a hydrogen atom, from the viewpoint of preventing inhibition of intermolecular interaction and preventing a reduction in electron mobility. However, $R_{201}$ to $R_{208}$ may be each a substituted or unsubstituted aryl group having 6 to 50 ring carbon atoms or a substituted or unsubstituted heterocyclic group having 5 to 50 ring atoms.

In the organic EL device according to the third exemplary embodiment, when $R_{201}$ to $R_{208}$ are each a bulky substituent such as an alkyl group or a cycloalkyl group, the intermolecular interaction is inhibited, and the electron mobility relative to that of the second host material is reduced. In this case, the relation $\mu e(H1) > \mu e(H2)$ described in the above numerical formula (Numerical Formula C3) may not be satisfied.

When the compound represented by the formula (2) is used for the first emitting layer and the relation $\mu e(H1) > \mu e(H2)$ is satisfied, it can be expected that a reduction in the hole-electron recombination ability in the second emitting layer and a reduction in luminous efficiency will be prevented.

It should be noted that substituents, namely, a haloalkyl group, alkenyl group, alkynyl group, group represented by $-Si(R_{901})(R_{902})(R_{903})$, group represented by $-O-(R_{904})$, group represented by $-S-(R_{905})$, group represented by $-N(R_{906})(R_{907})$, aralkyl group, group represented by $-C(=O)R_{801}$, group represented by $-COOR_{802}$, halogen atom, cyano group, and nitro group are likely to be bulky, and an alkyl group and cycloalkyl group are likely to be further bulky.

In the compound represented by the formula (2), it is preferable that $R_{201}$ to $R_{208}$, which are substituents on the anthracene skeleton, are not bulky substituents and are each not an alkyl group and a cycloalkyl group. It is more preferable that $R_{201}$ to $R_{208}$ are each not an alkyl group, a cycloalkyl group, a haloalkyl group, an alkenyl group, an alkynyl group, a group represented by $-Si(R_{901})(R_{902})(R_{903})$, a group represented by $-O-(R_{904})$, a group represented by $-S-(R_{905})$, a group represented by $-N(R_{906})(R_{907})$, an aralkyl group, a group represented by $-C(=O)R_{801}$, a group represented by $-COOR_{802}$, a halogen atom, a cyano group, and a nitro group.

In the compound represented by the formula (2), it is also preferable that substituents for the "substituted or unsubstituted" groups serving as $R_{201}$ to $R_{208}$ do not include the above-described substituents that are likely to be bulky, in particular substituted or unsubstituted alkyl groups and substituted or unsubstituted cycloalkyl groups.

When the substituents for the "substituted or unsubstituted" groups serving as $R_{201}$ to $R_{20}$ do not include substituted or unsubstituted alkyl groups and substituted or unsubstituted cycloalkyl groups, inhibition of the intermolecular interaction caused by the presence of bulky substituents such as alkyl groups and cycloalkyl groups can be prevented, and a reduction in electron mobility can be prevented. Moreover, when the above-described compound represented by the formula (2) is used for the first emitting layer, a reduction in the hole-electron recombination ability in the second emitting layer and a reduction in the luminous efficiency can be prevented.

Further preferably, $R_{201}$ to $R_{208}$ that are the substituents on the anthracene skeleton are not bulky substituents and $R_{201}$ to $R_{208}$ as substituents are unsubstituted.

Assuming that $R_{201}$ to $R_{208}$ that are the substituents on the anthracene skeleton are not bulky substituents and substituents are bonded to $R_{201}$ to $R_{208}$ that are not bulky substituents, the substituents bonded to $R_{201}$ to $R_{208}$ are preferably not bulky substituents; and the substituents bonded to $R_{201}$ to $R_{208}$ serving as substituents are preferably not an alkyl group and cycloalkyl group, more preferably not an alkyl group, cycloalkyl group, haloalkyl group, alkenyl group, alkynyl group, group represented by $-Si(R_{901})(R_{902})(R_{903})$, group represented by $-O-(R_{904})$, group represented by $-S-(R_{905})$, group represented by $-N(R_{906})(R_{907})$, aralkyl group, group represented by $-C(=O)R_{801}$, group represented by $-COOR_{802}$, halogen atom, cyano group, and nitro group.

In the organic EL device according to each exemplary embodiment, it is also preferable that $R_{201}$ to $R_{208}$ in the compound represented by the formula (2) are each independently a hydrogen atom, a substituted or unsubstituted alkyl group having 1 to 50 carbon atoms, a substituted or unsubstituted cycloalkyl group having 3 to 50 ring carbon atoms, or a group represented by $-Si(R_{901})(R_{902})(R_{903})$.

In the organic EL device according to each exemplary embodiment, $R_{201}$ to $R_{208}$ in the compound represented by the formula (2) are each preferably a hydrogen atom.

In the compound represented by the formula (2), each "substituted or unsubstituted" group is preferably an "unsubstituted" group.

Method for Producing Compound Represented by Formula (2)

The compound represented by the formula (2) can be produced using a well-known method.

The compound represented by the formula (2) can also be produced according to a well-known method using a known alternative reaction and raw materials suitable for the target compound.

Specific Examples of Compound Represented by Formula (2)

Specific examples of the compound represented by the formula (2) include compounds shown below.

However, the invention is not limited to these specific examples of the compound represented by the formula (2).

[Formula 111]

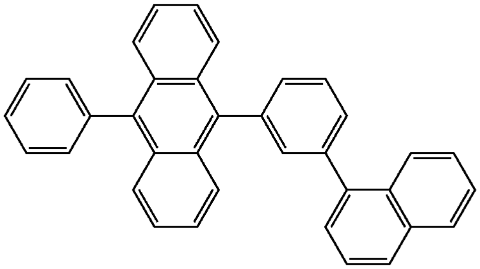

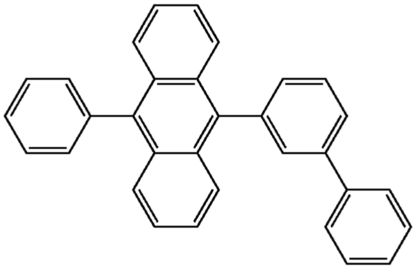

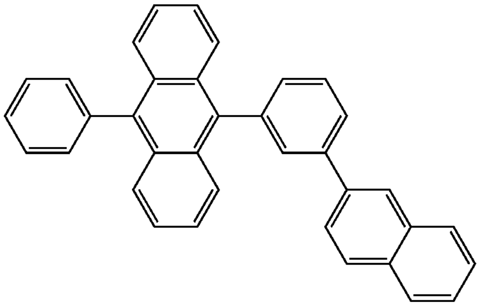

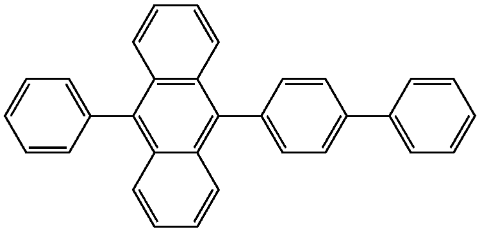

-continued

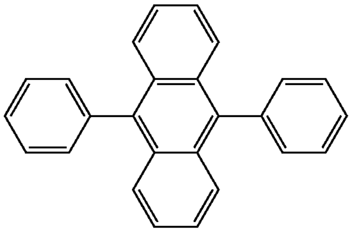

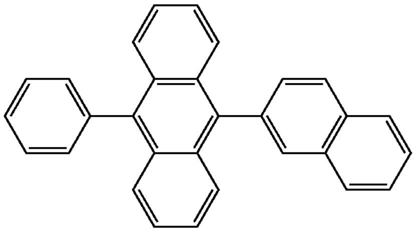

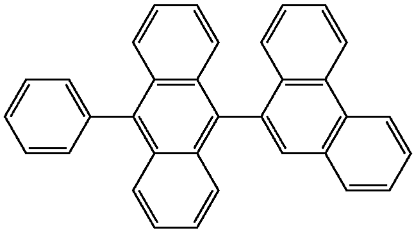

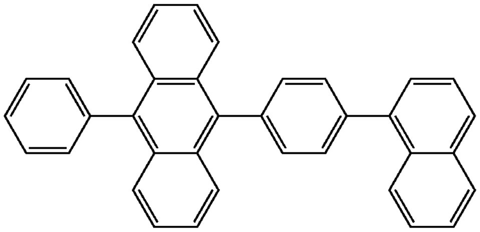

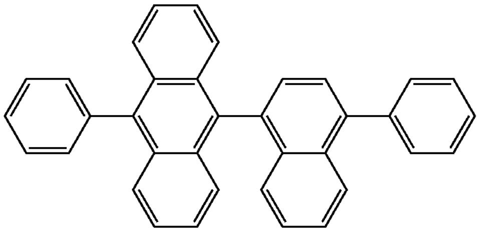

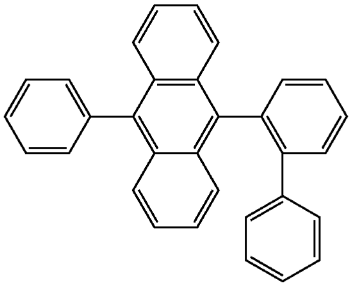

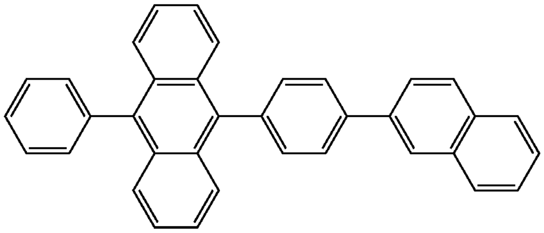

-continued
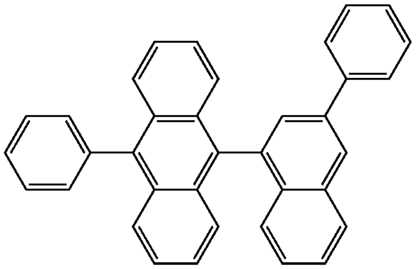
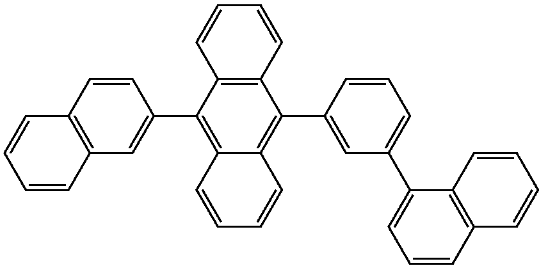
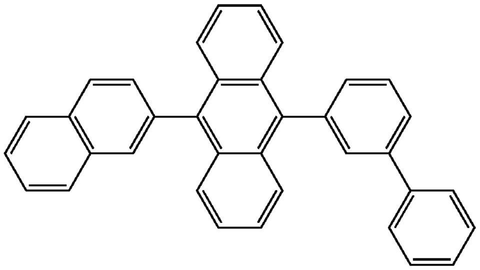
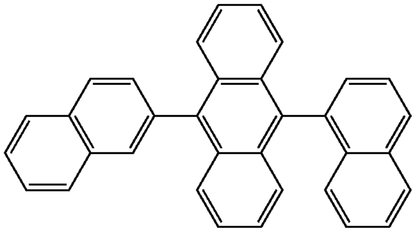
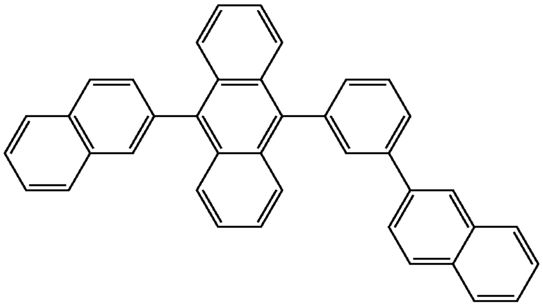
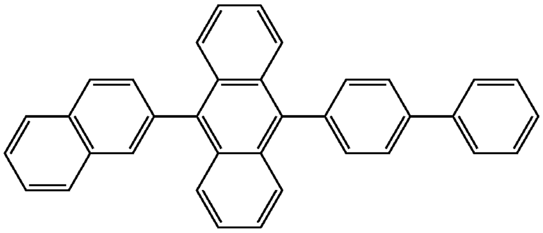
-continued
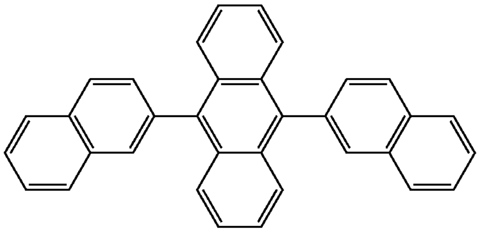
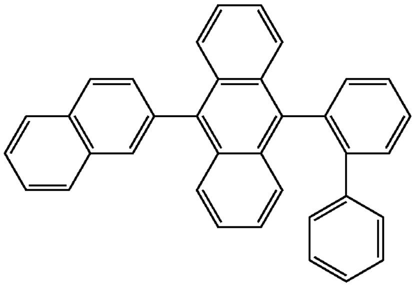
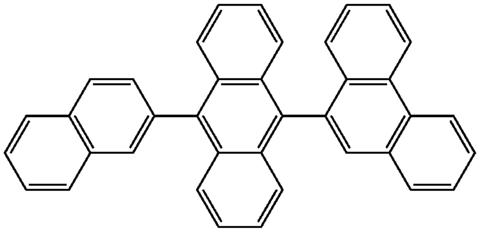
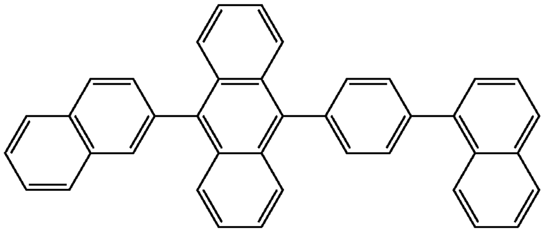
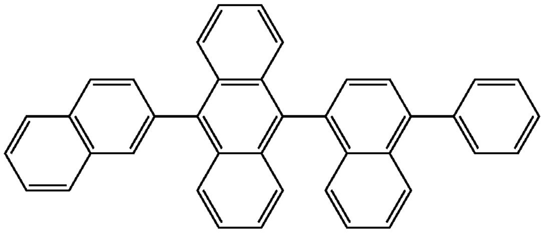
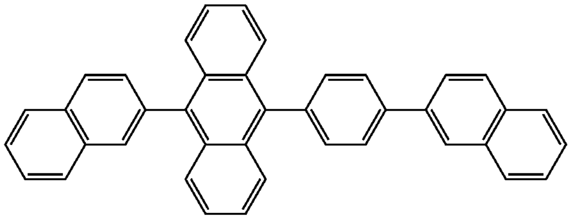
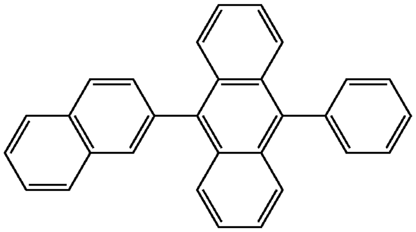

-continued
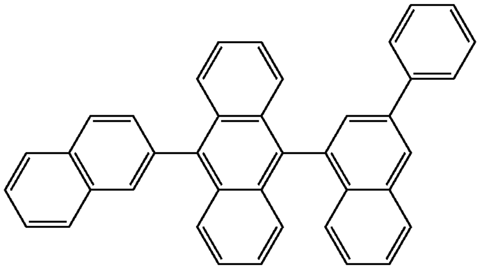
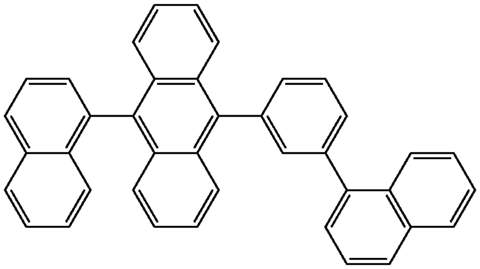
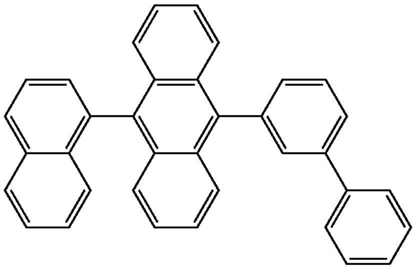
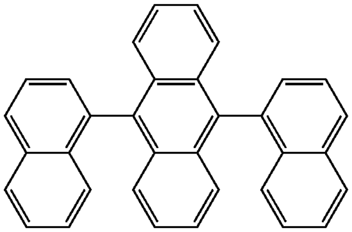
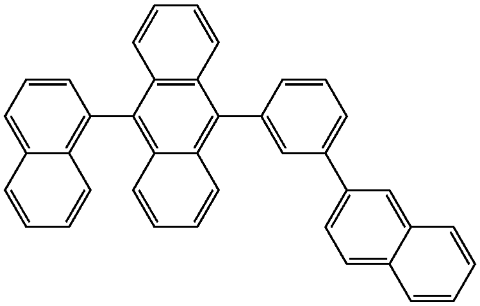
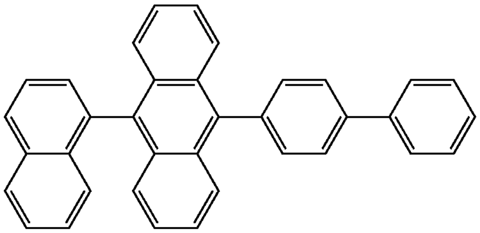
-continued
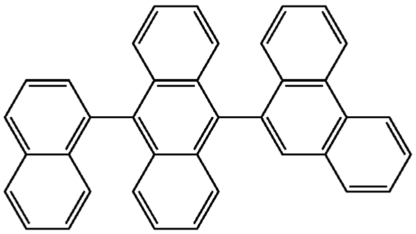
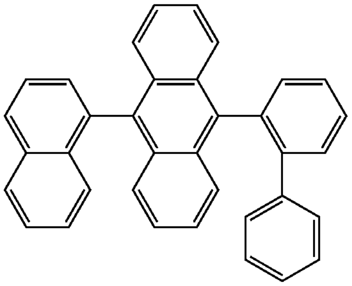
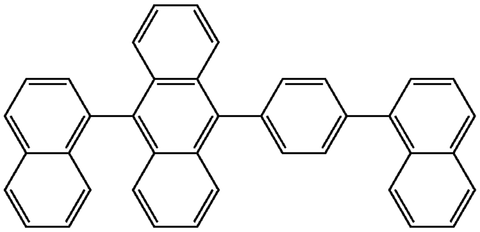
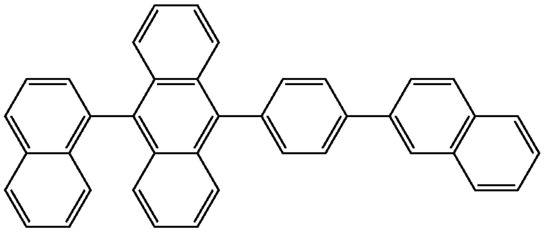
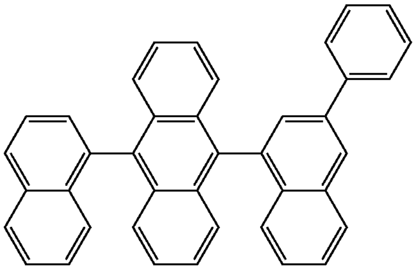
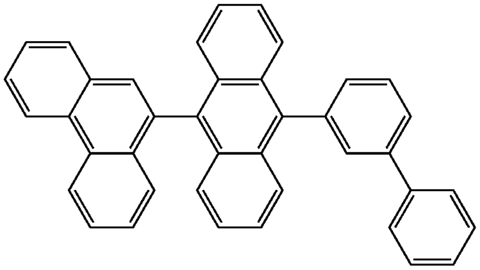

-continued
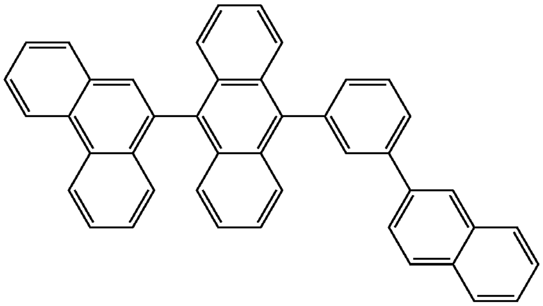
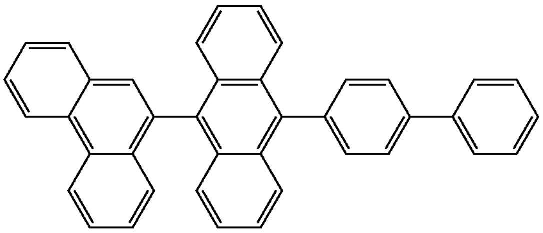
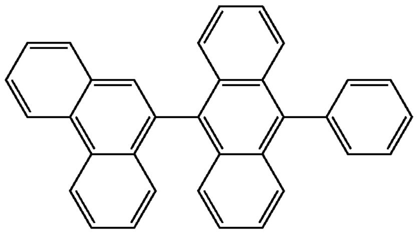
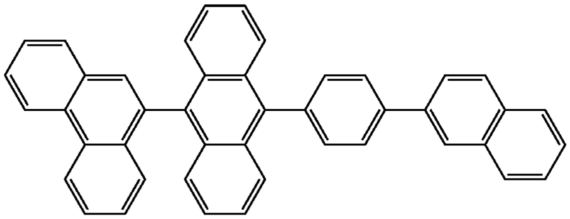
[Formula 112]
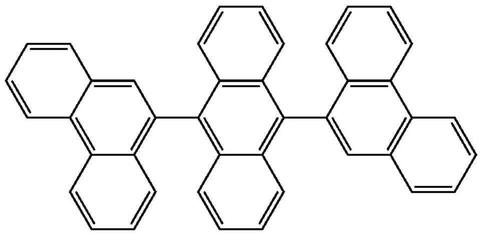
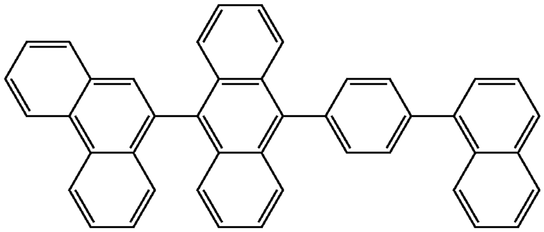
-continued
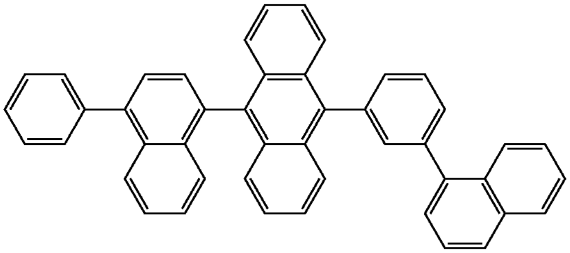
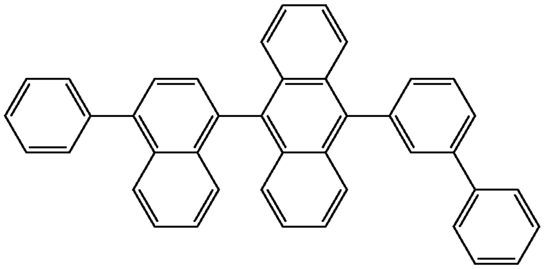
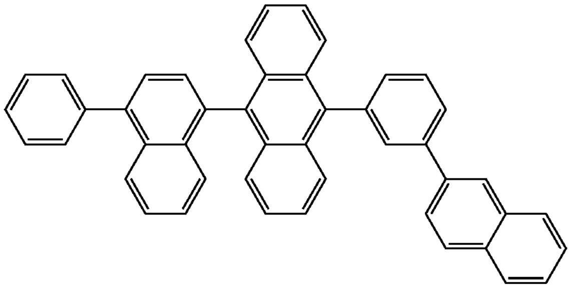
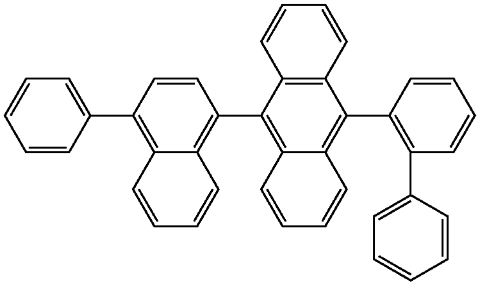
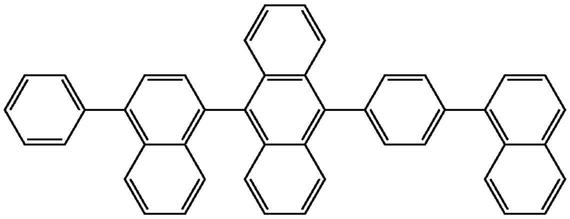
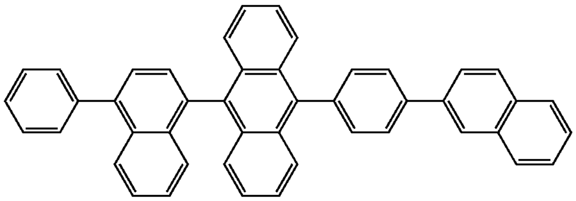

-continued
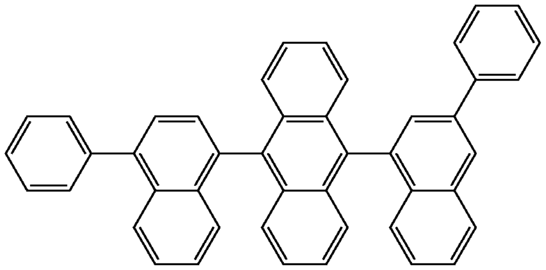
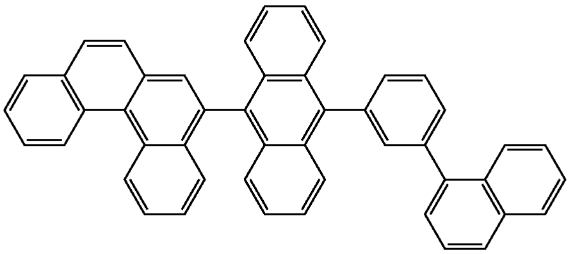
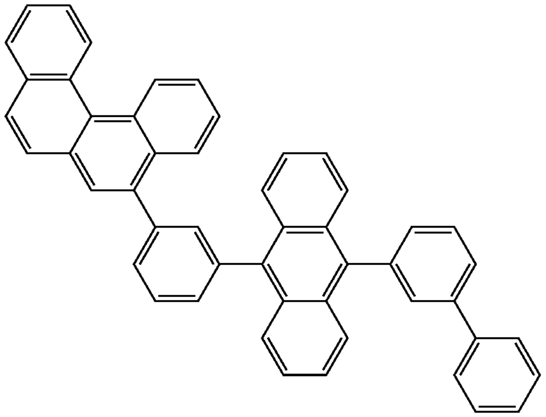
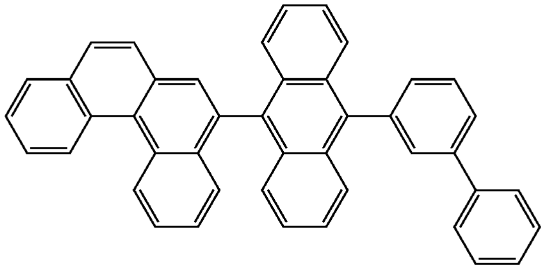
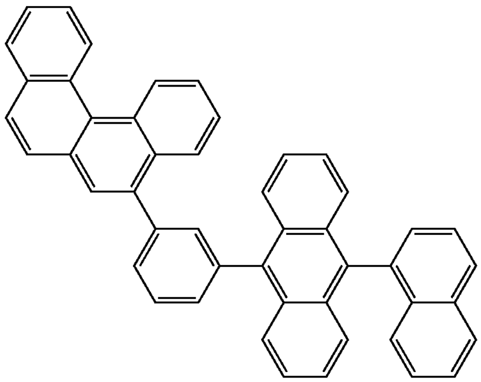
-continued
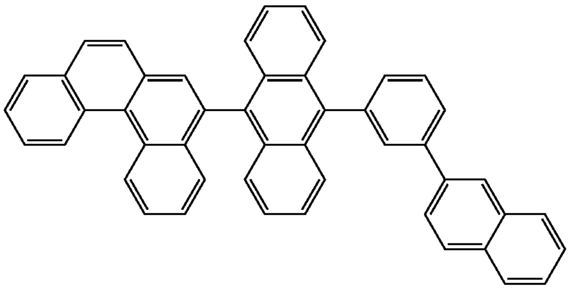
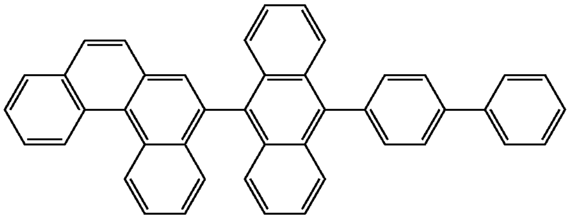
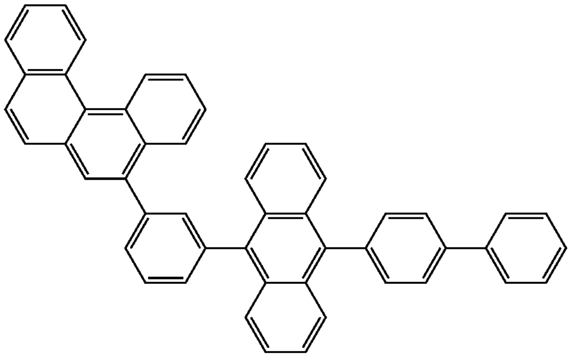
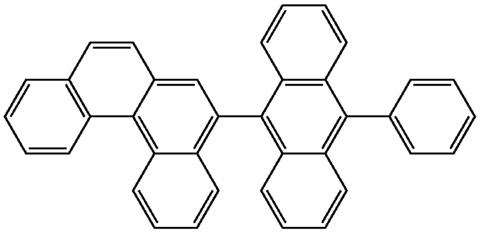
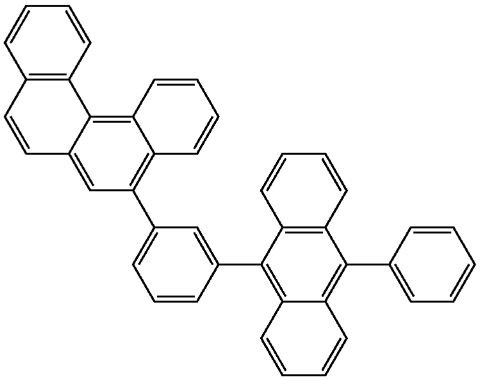

-continued
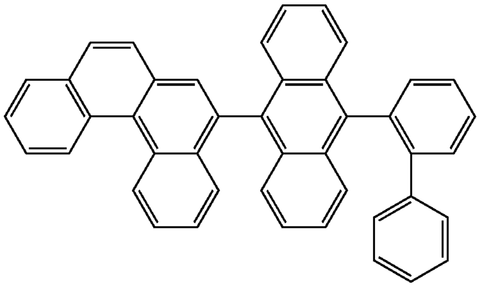
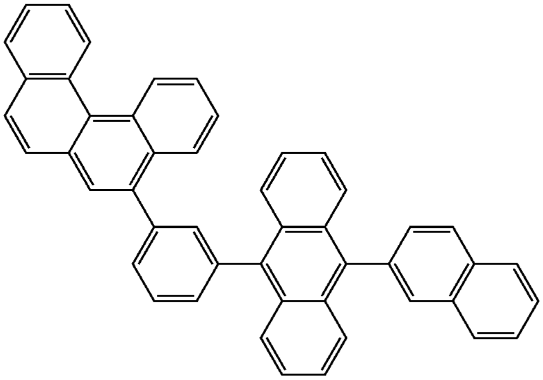
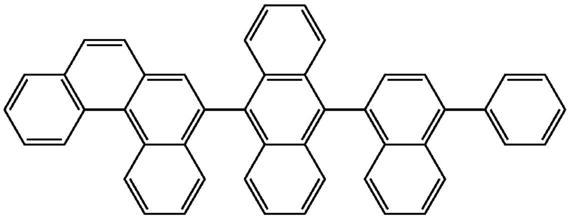
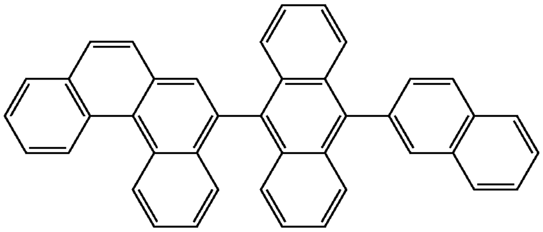
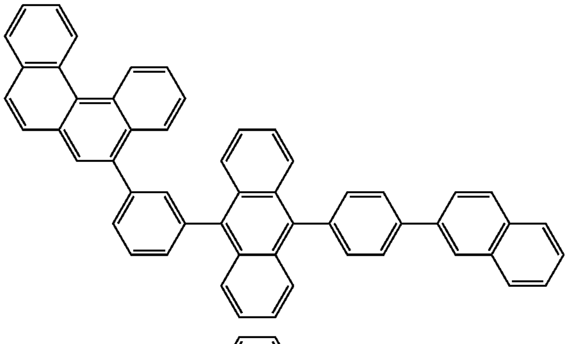
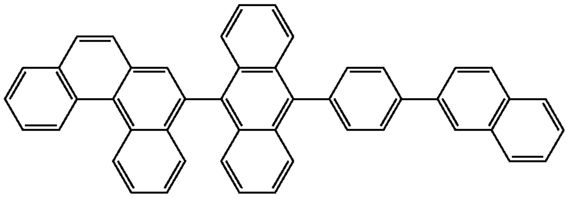
-continued
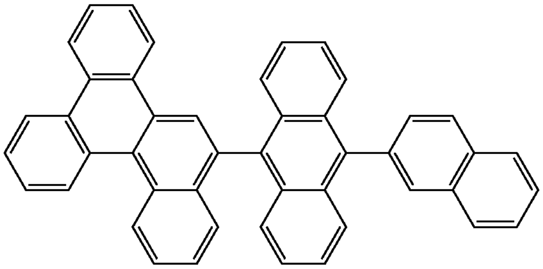
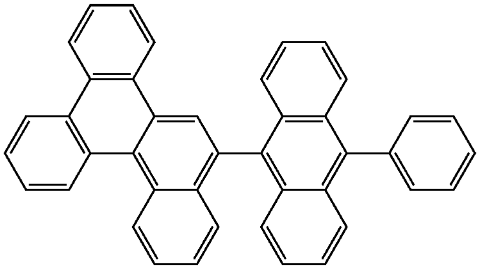
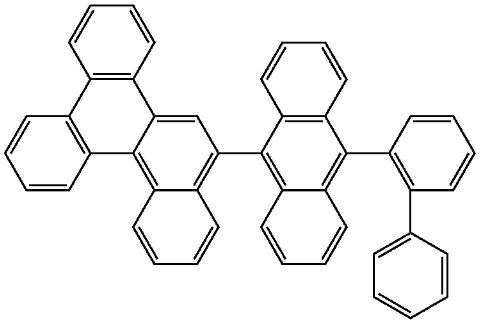
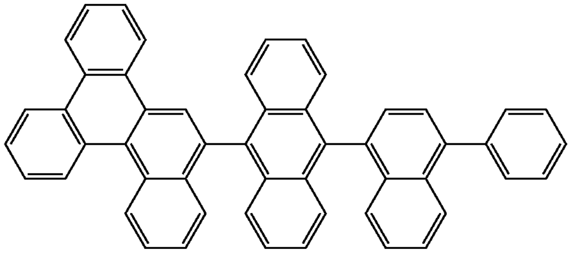
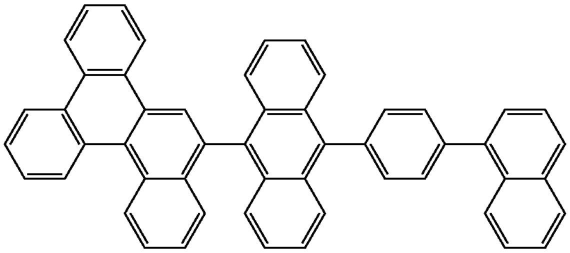
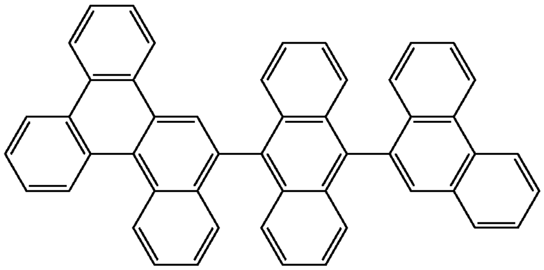

-continued
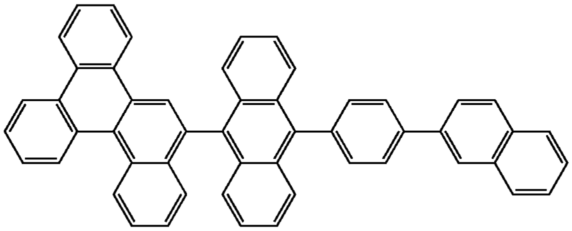
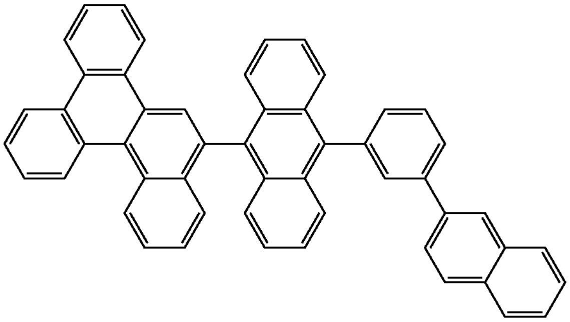
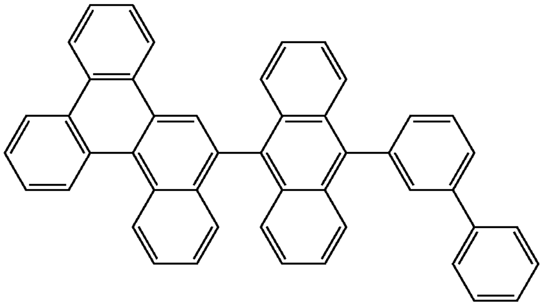
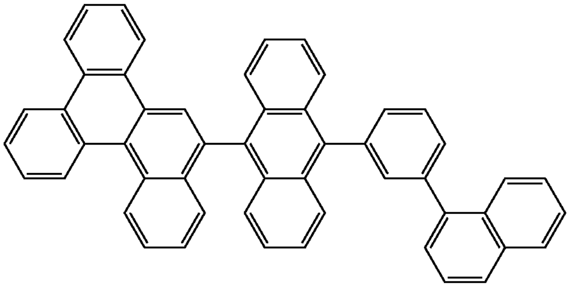
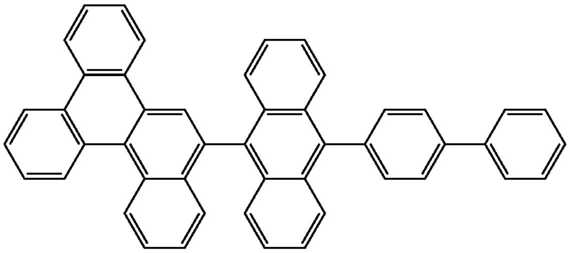
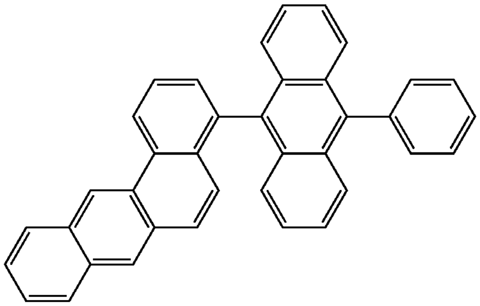
-continued
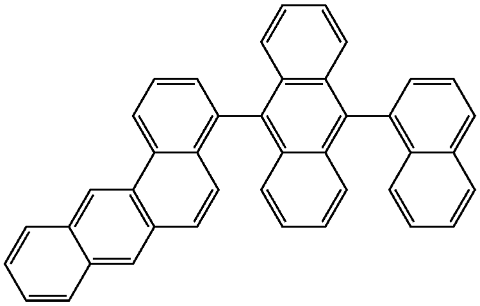
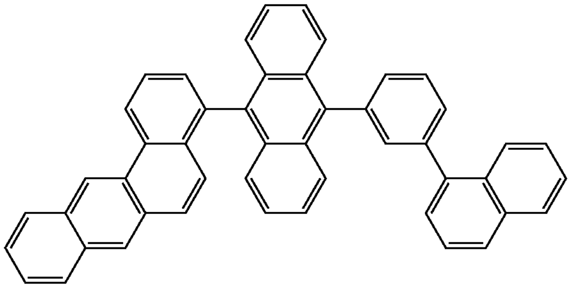
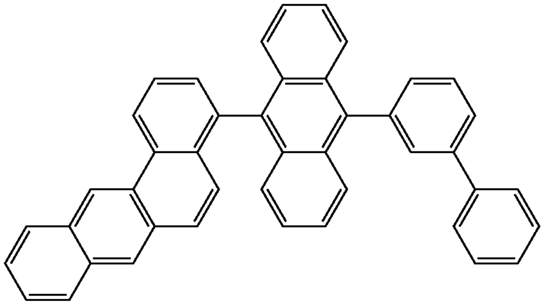
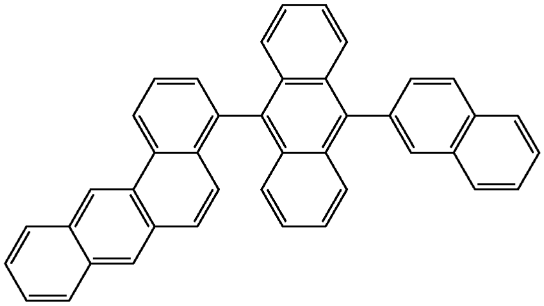
[Formula 113]
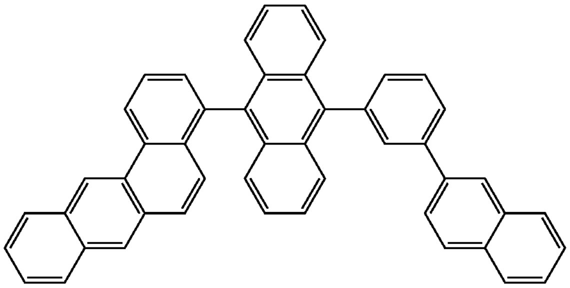

-continued
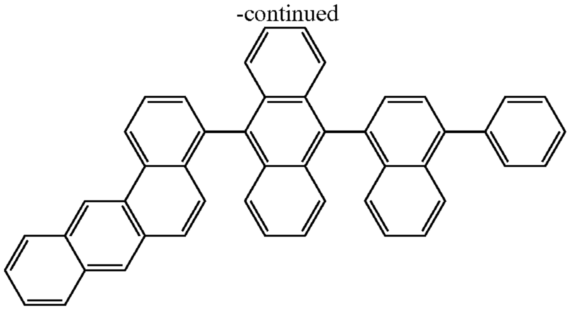
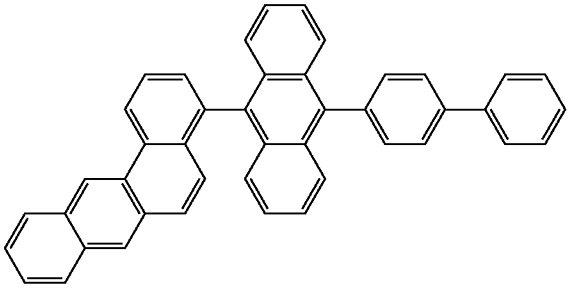
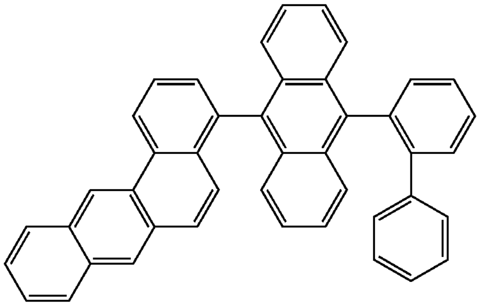
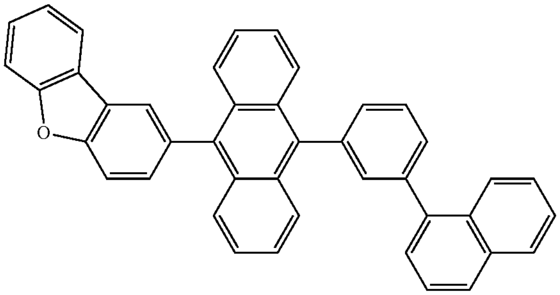
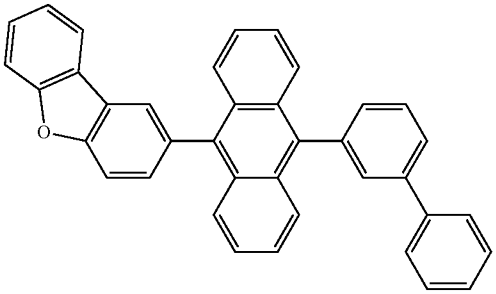
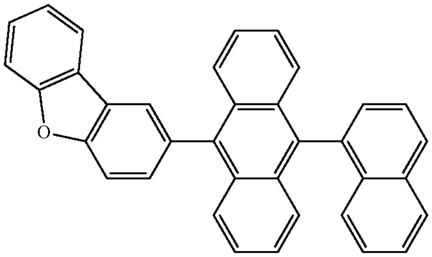
-continued
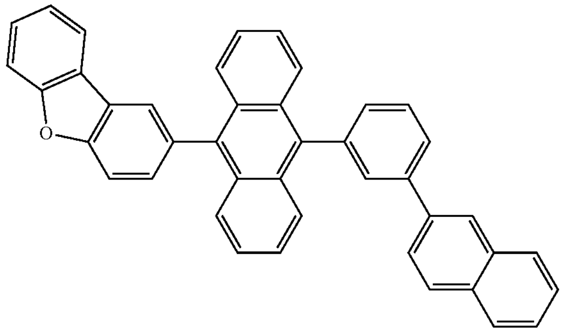
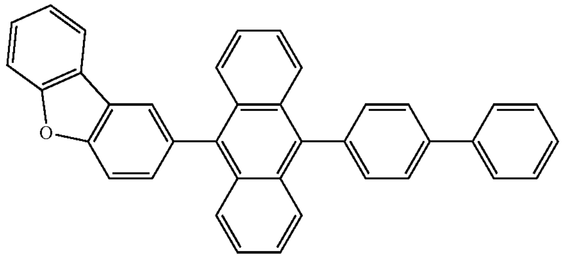
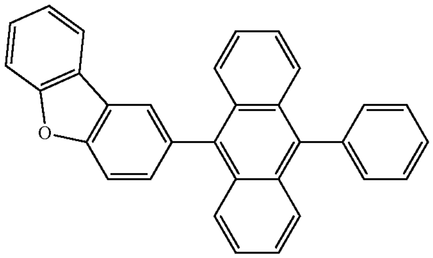
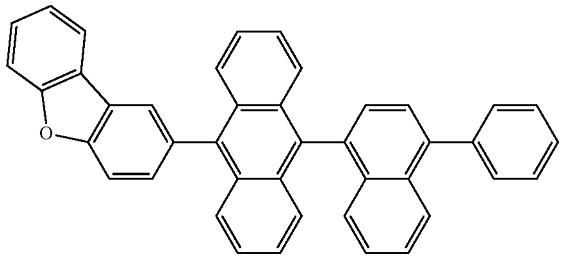
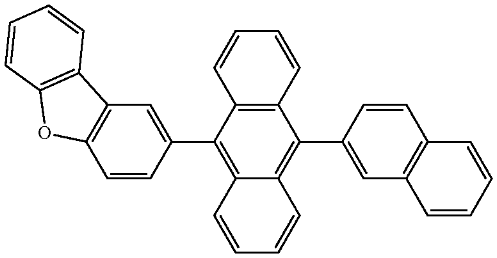
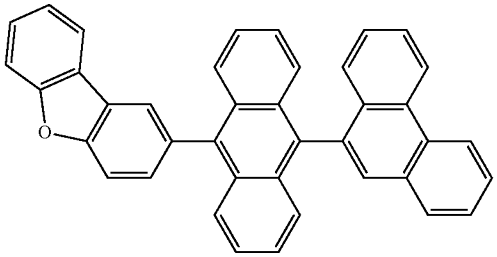

-continued
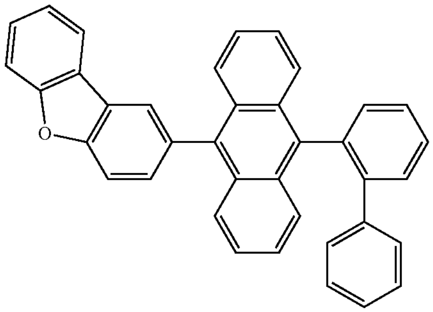
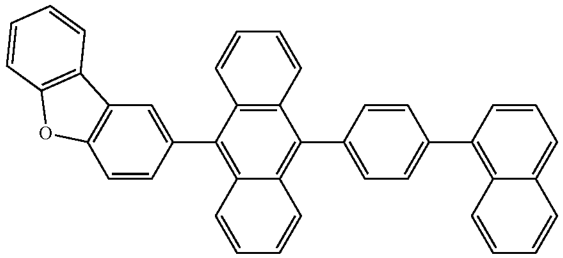
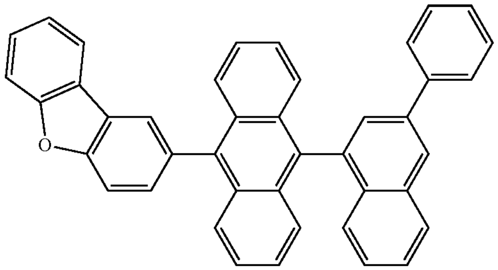
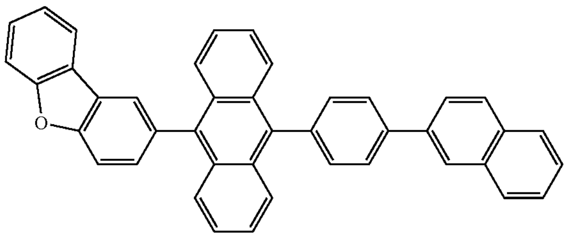
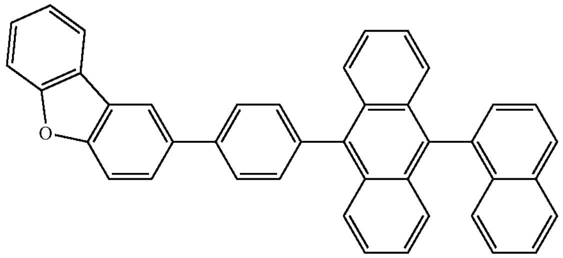
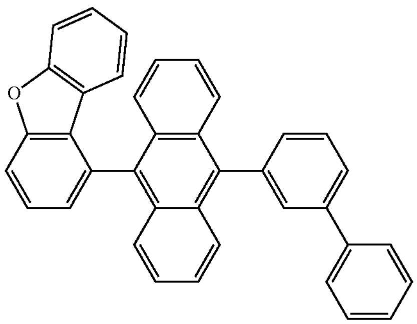
-continued
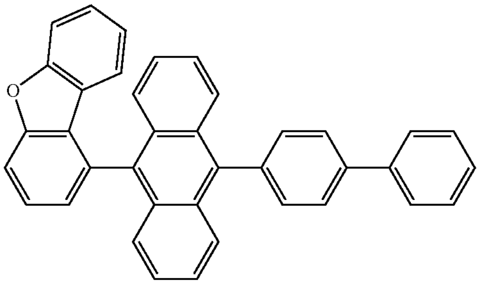
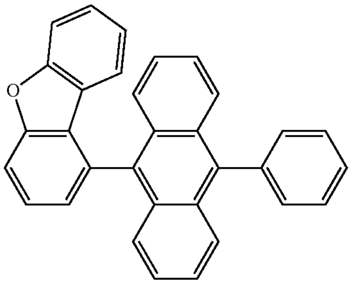
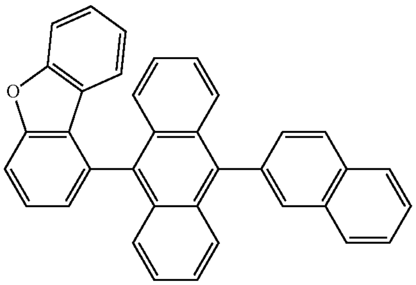
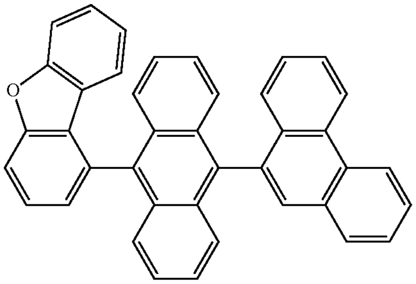
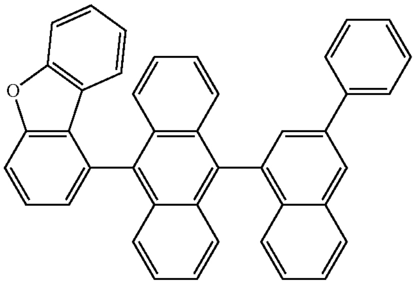

-continued
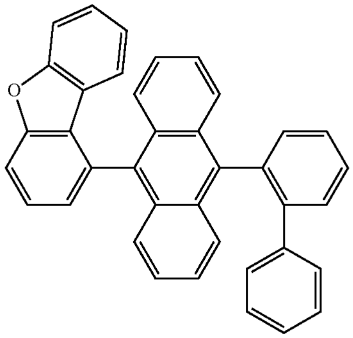
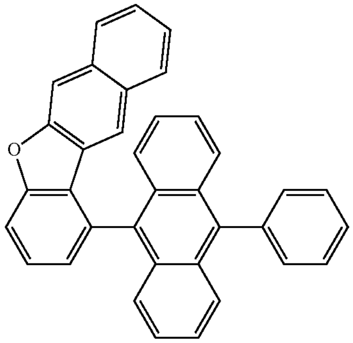
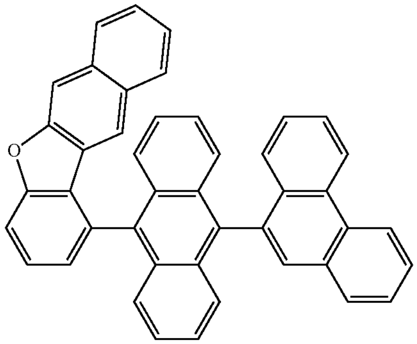
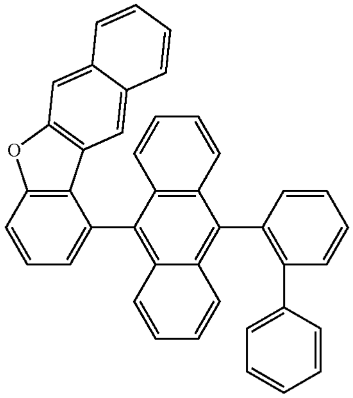
-continued
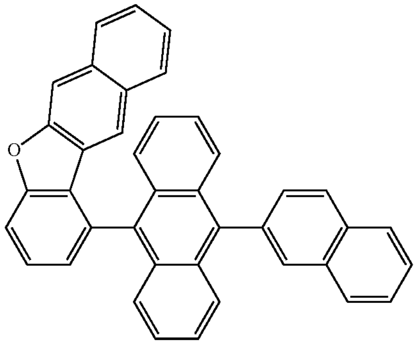
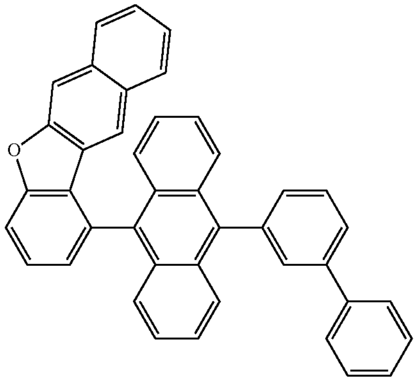
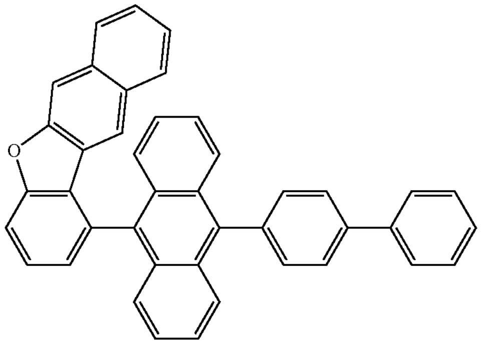
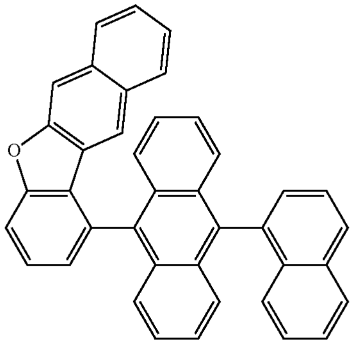

-continued
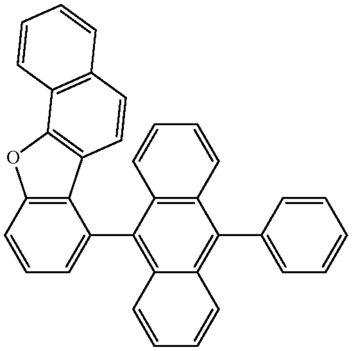
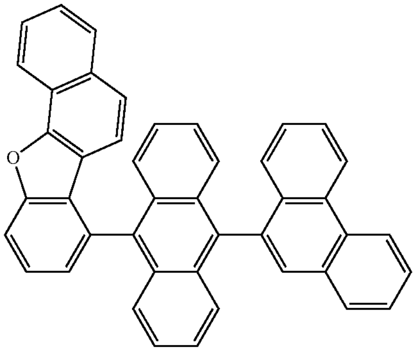
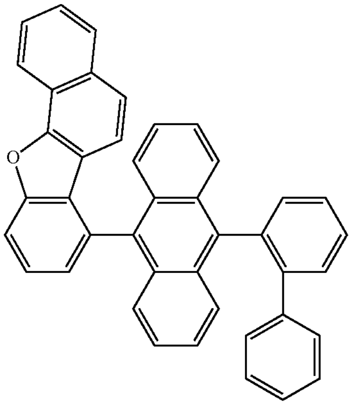
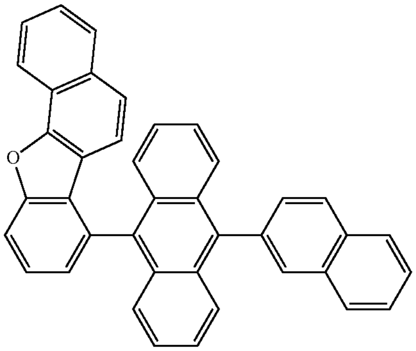
-continued
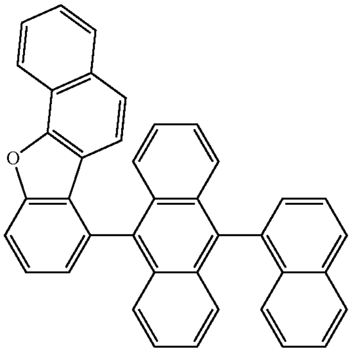
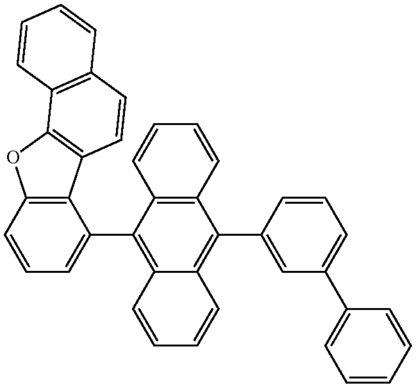
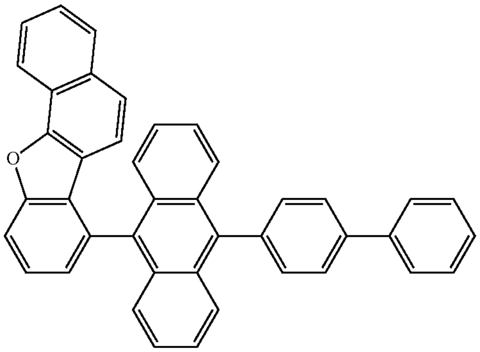
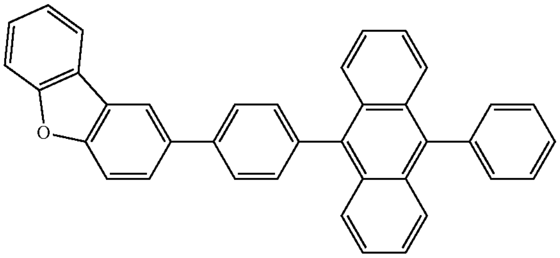
[Formula 114]
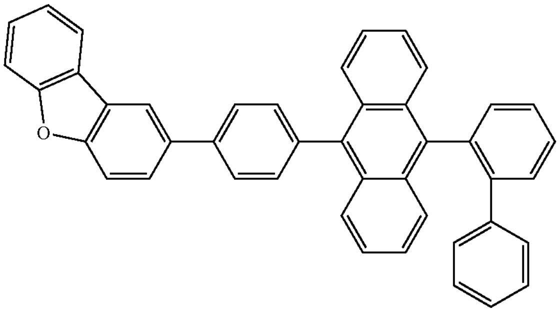

-continued
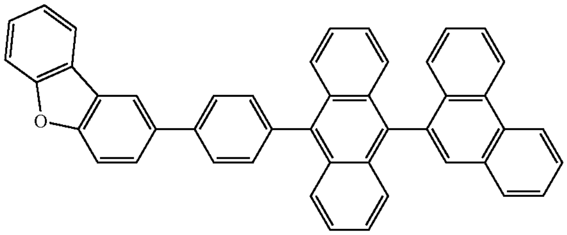
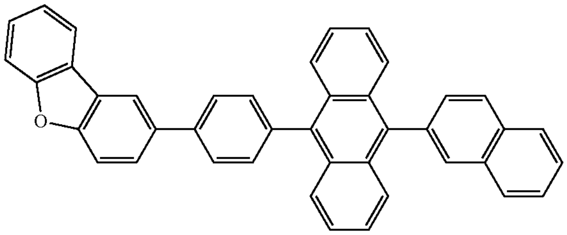
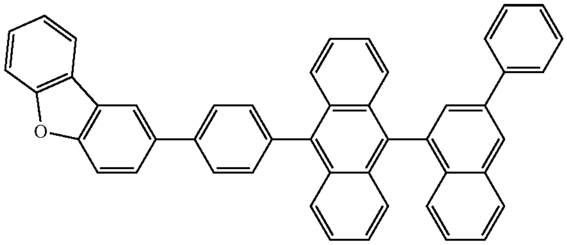
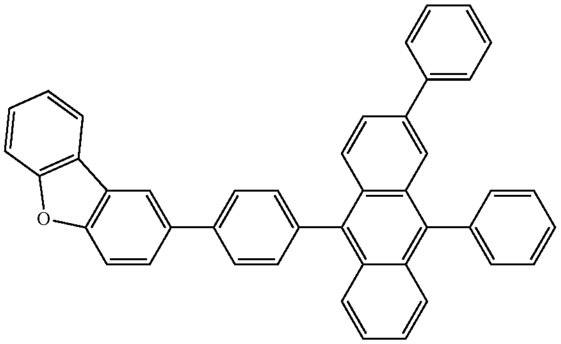
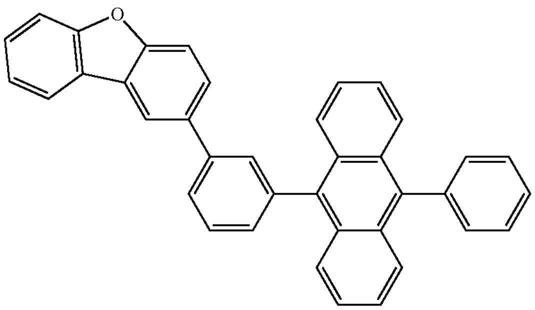
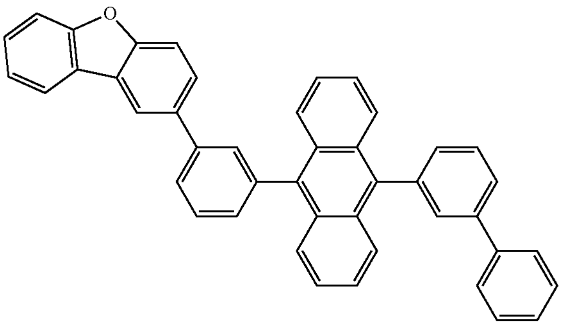
-continued
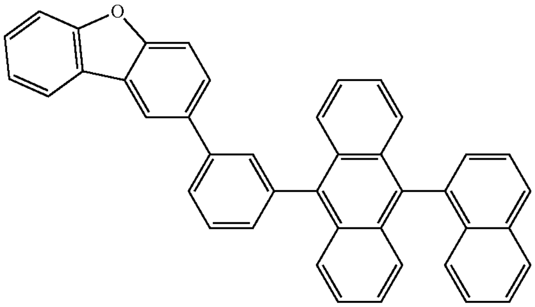
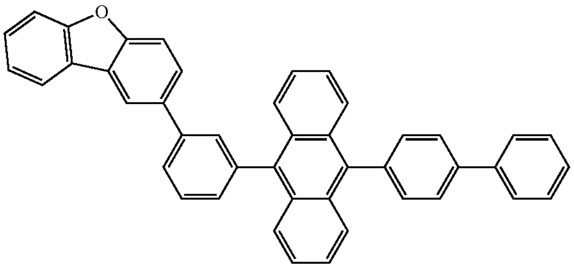
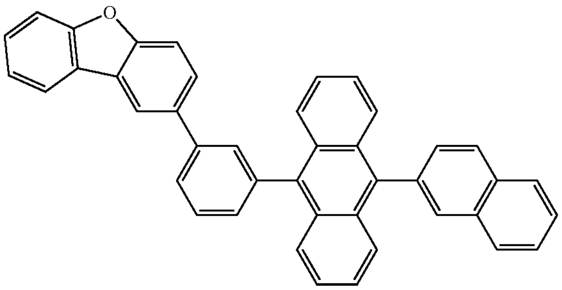
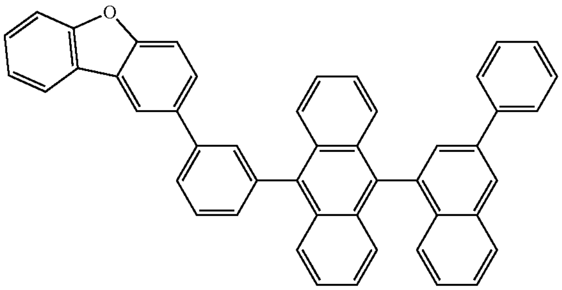
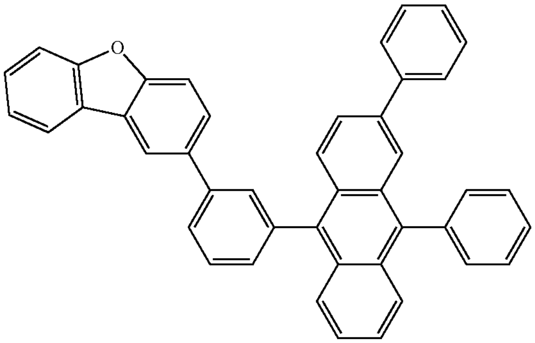

-continued
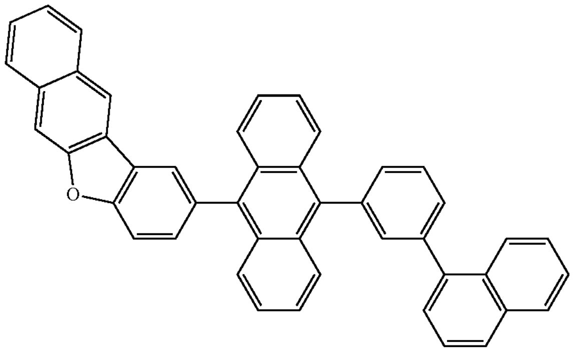
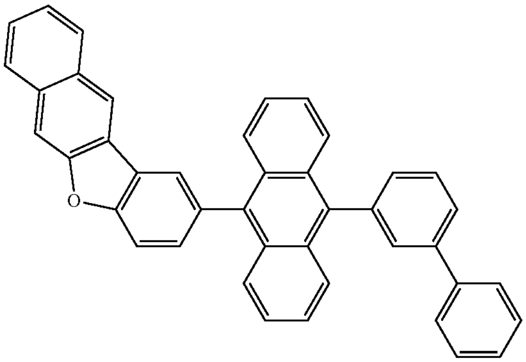
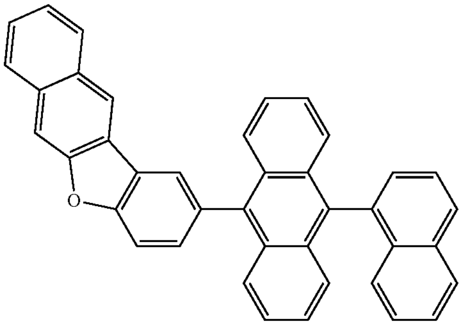
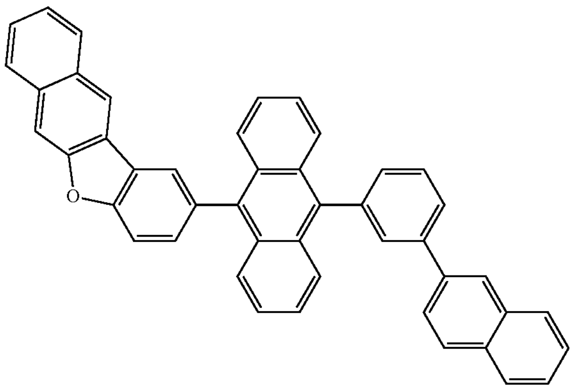
-continued
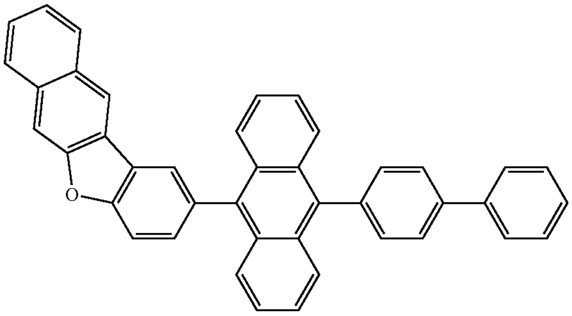
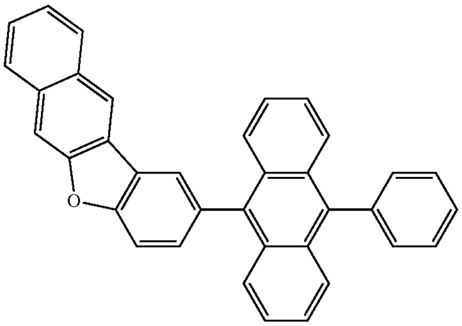
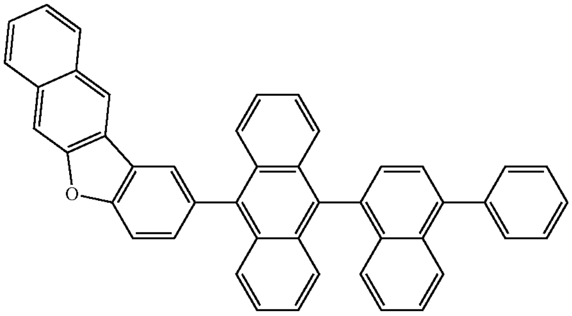
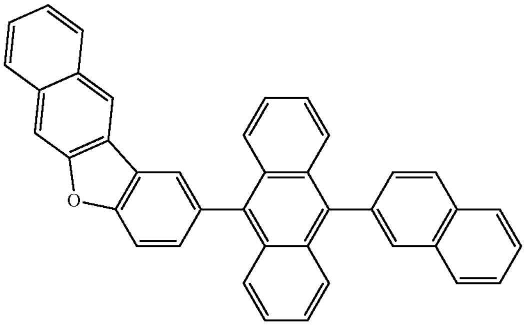
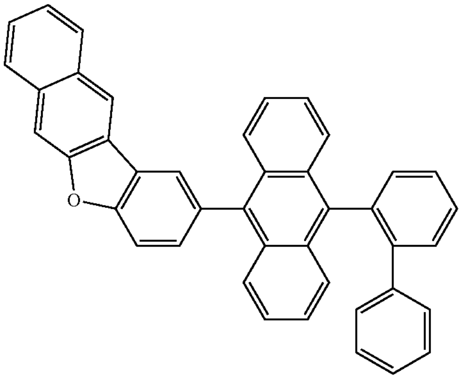

-continued
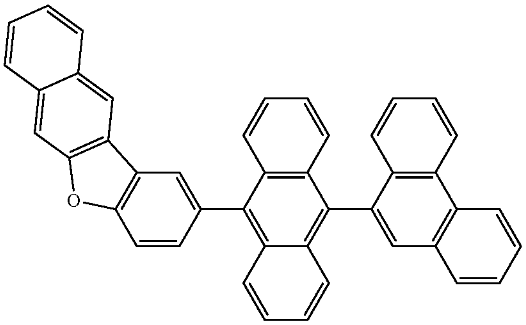
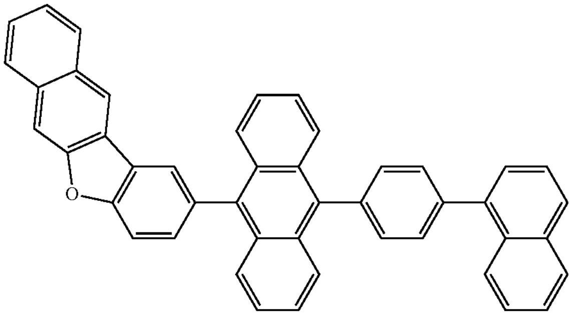
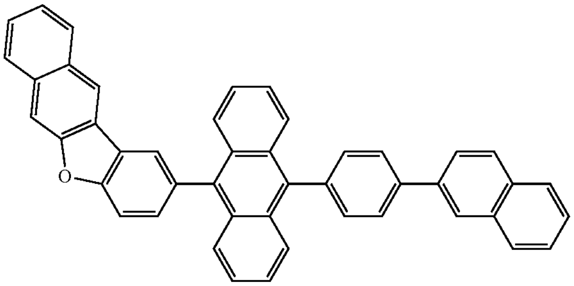
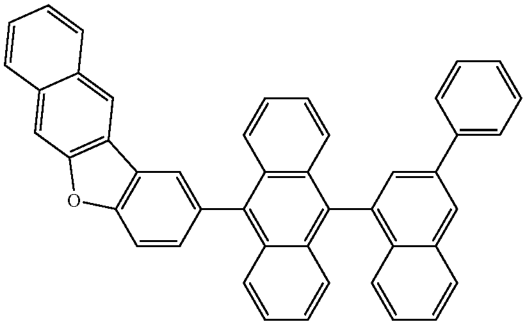
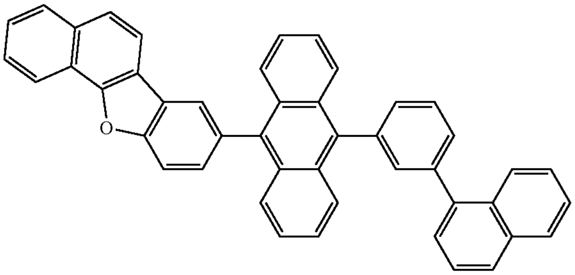
-continued
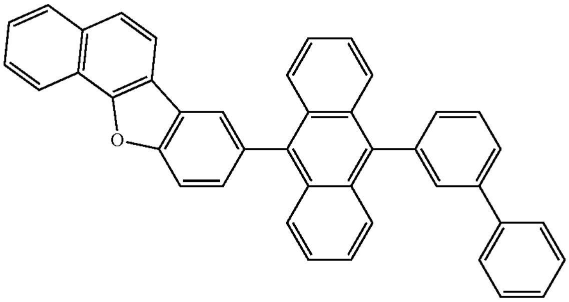
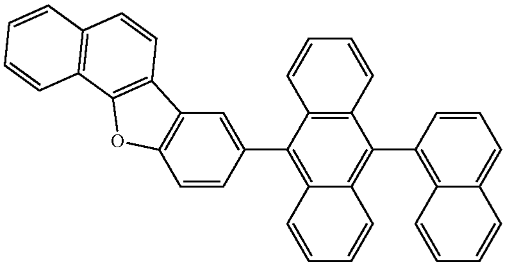
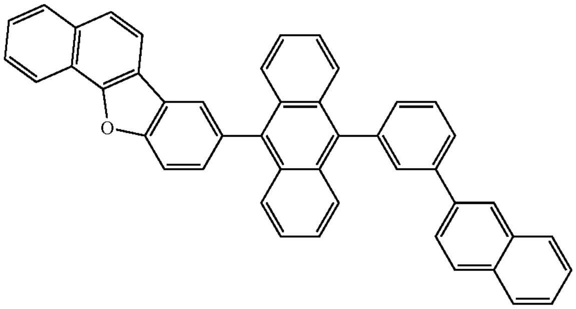
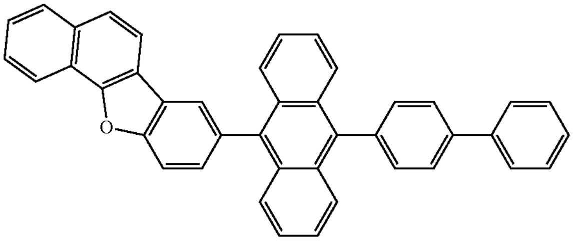
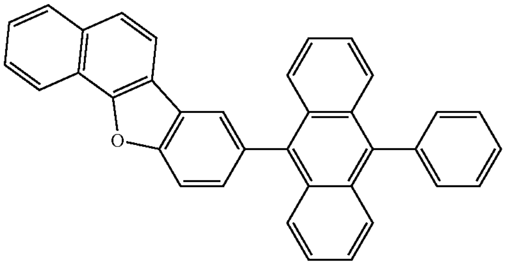
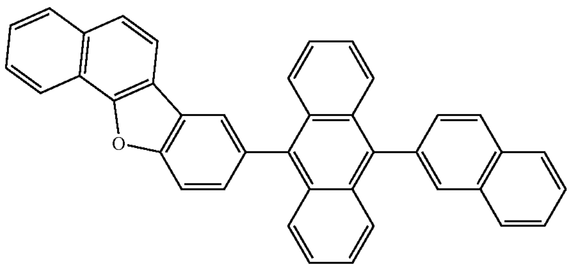

-continued
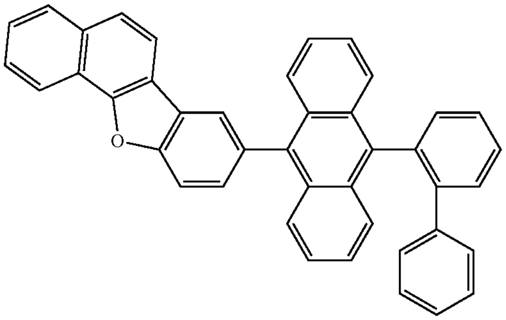
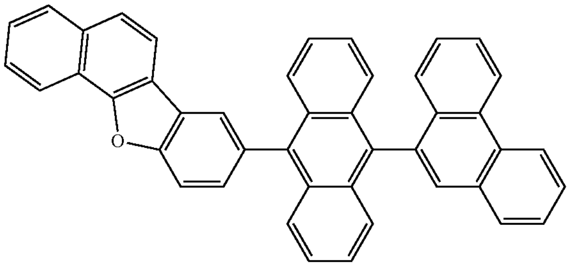
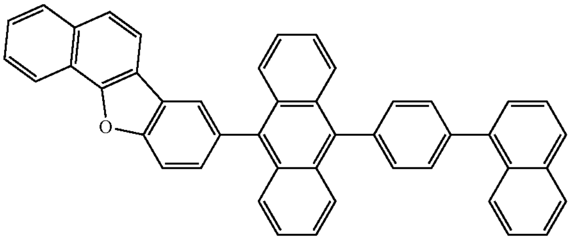
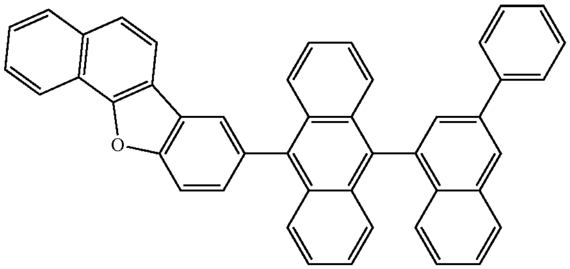
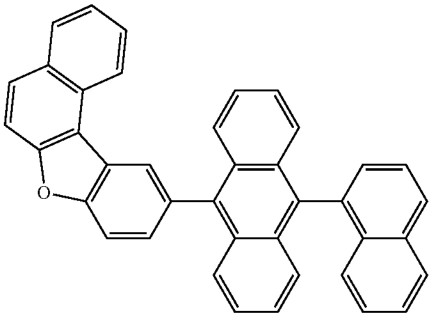
-continued
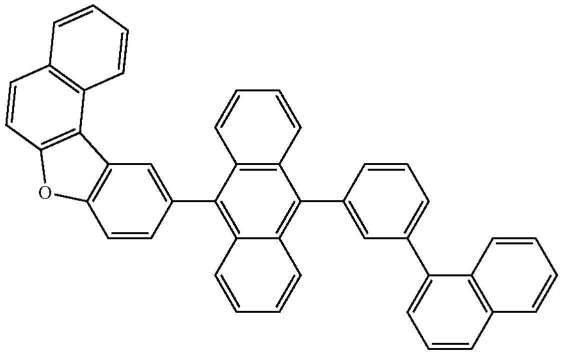
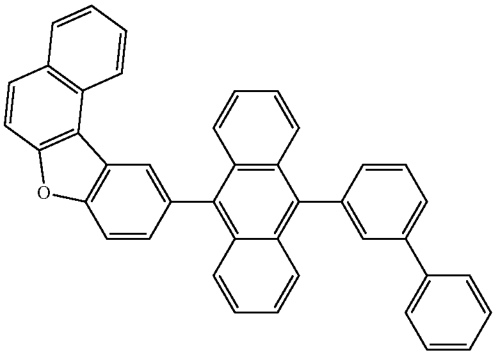
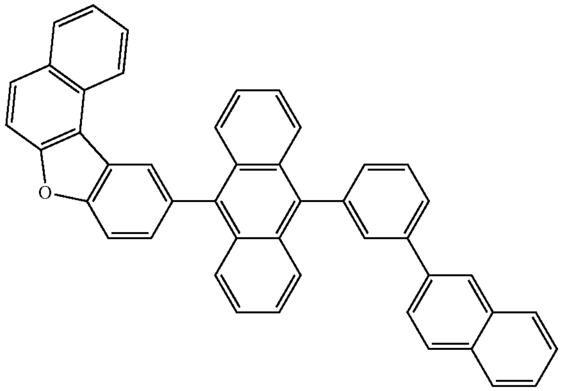
[Formula 115]
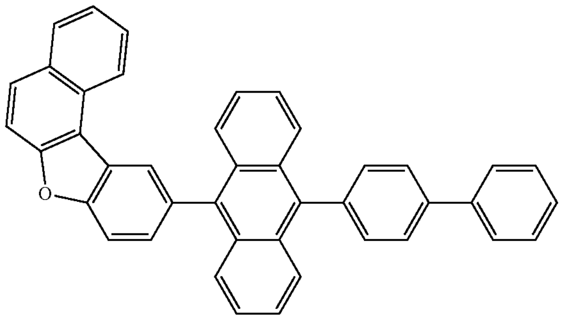

-continued
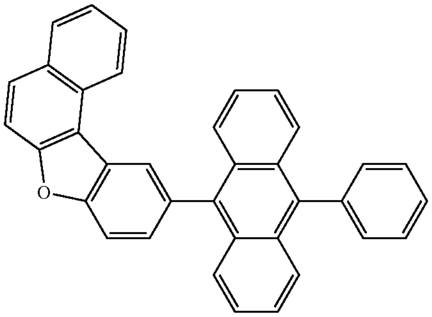
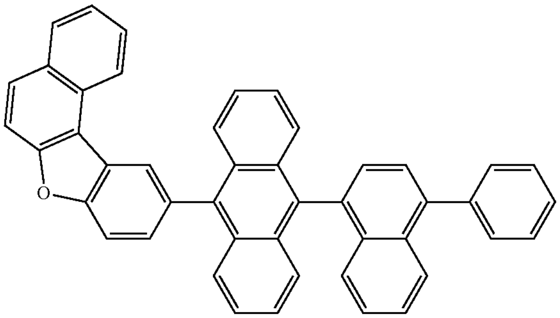
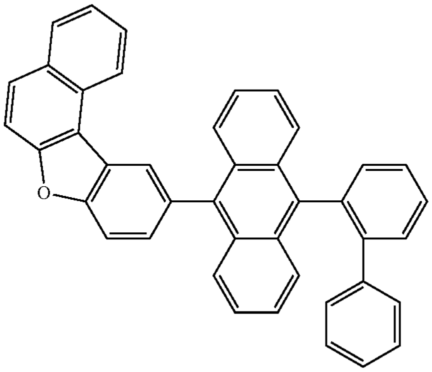
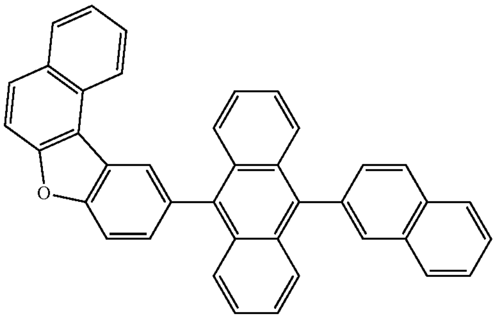
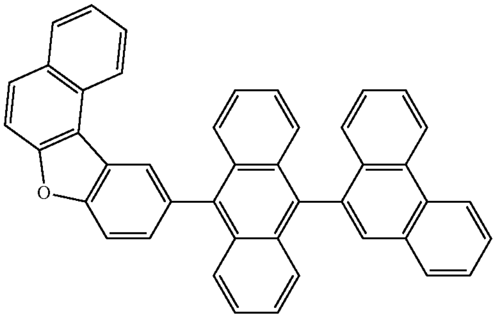
-continued
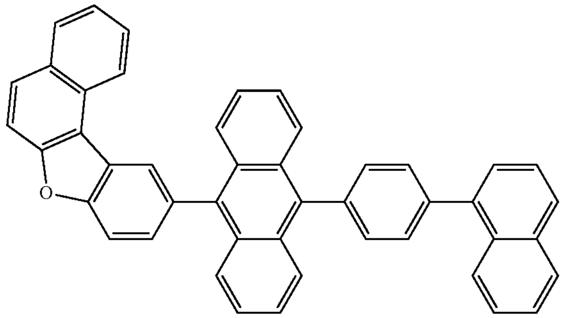
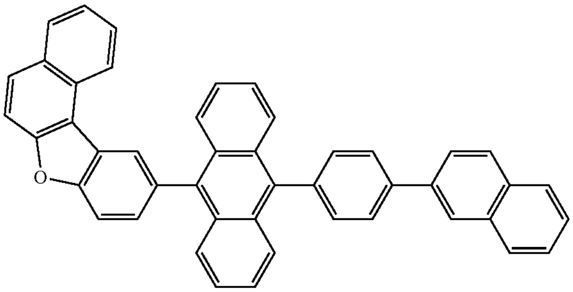
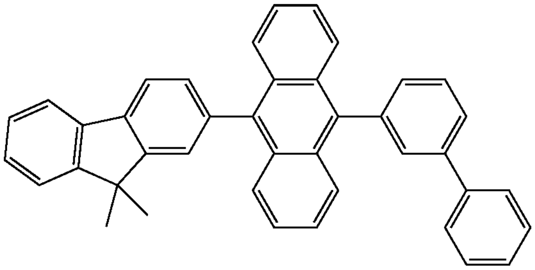
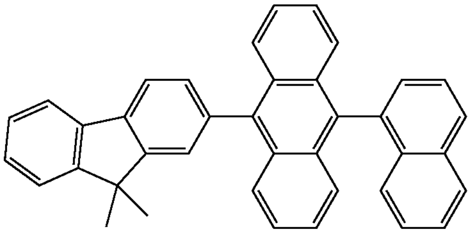
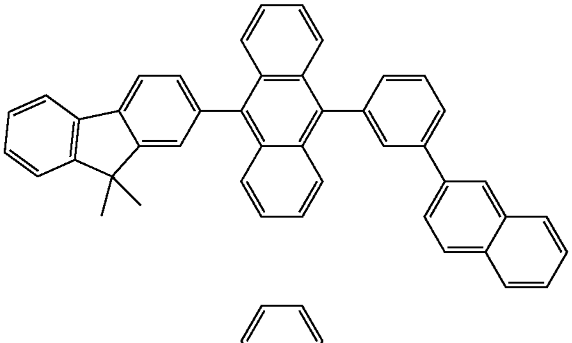
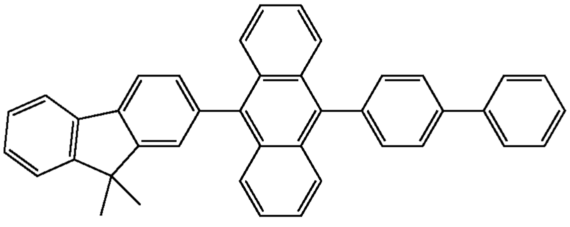

-continued
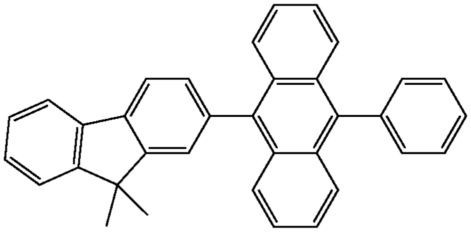
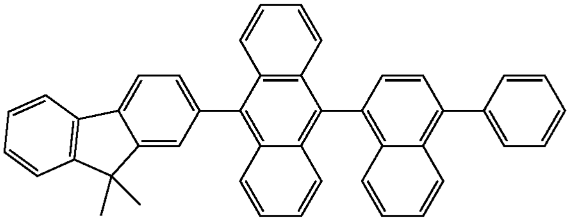
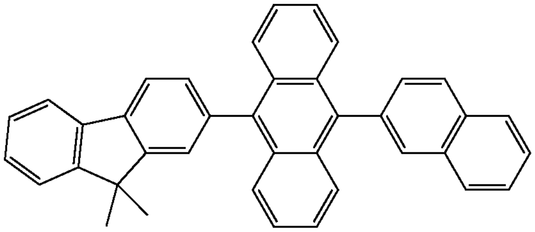
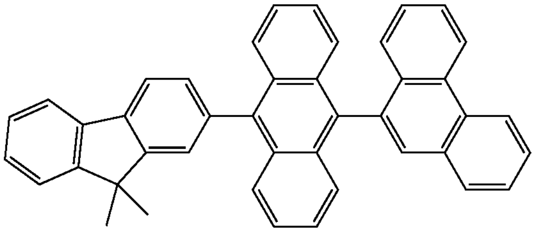
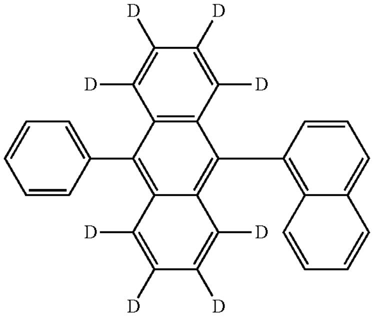
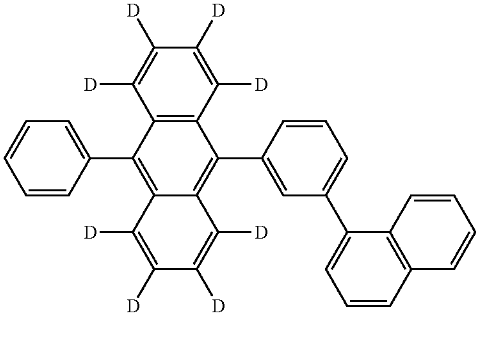
-continued
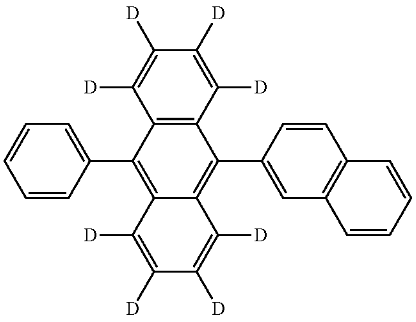
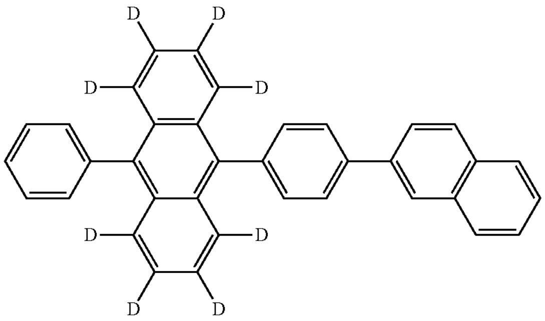
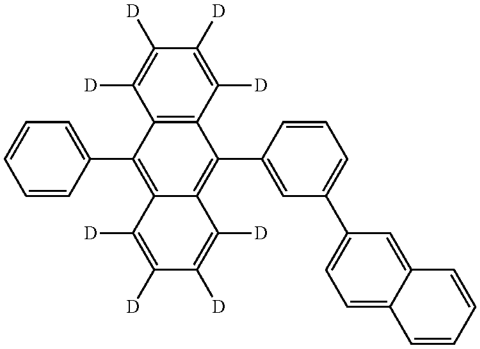
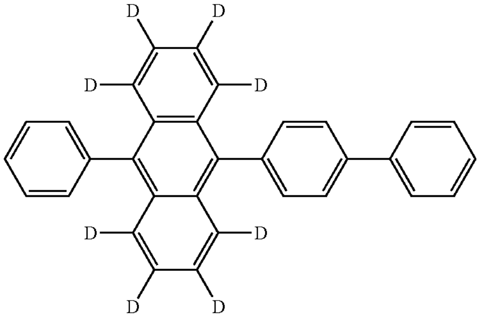
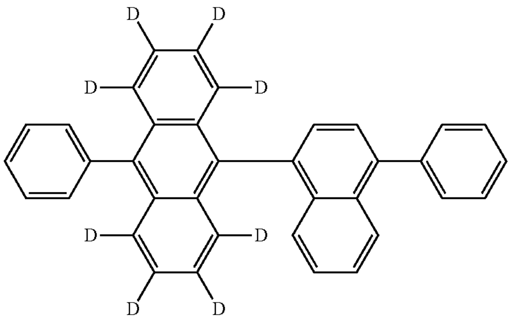

-continued
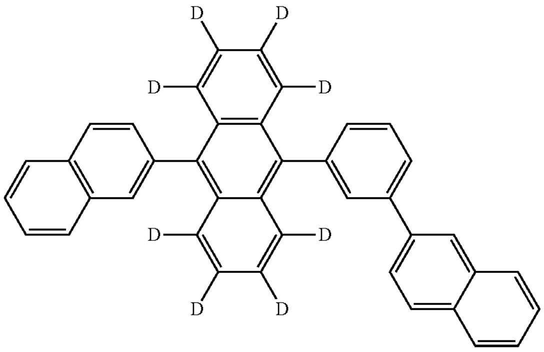
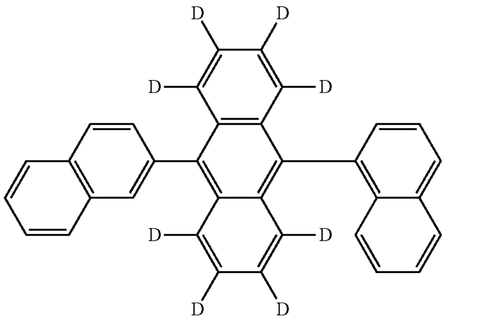
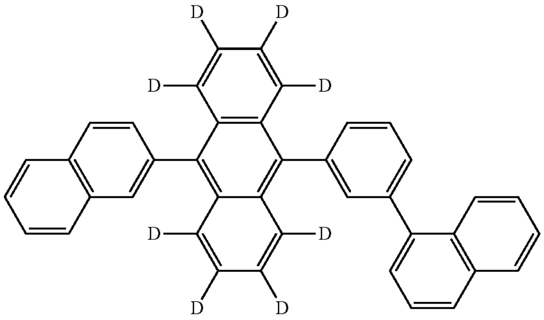
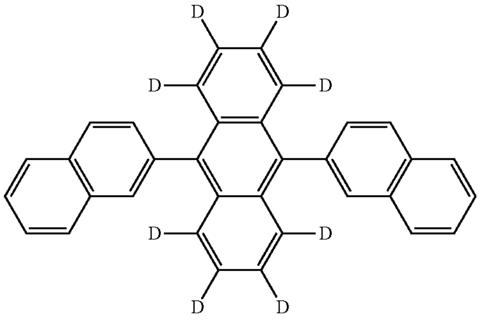
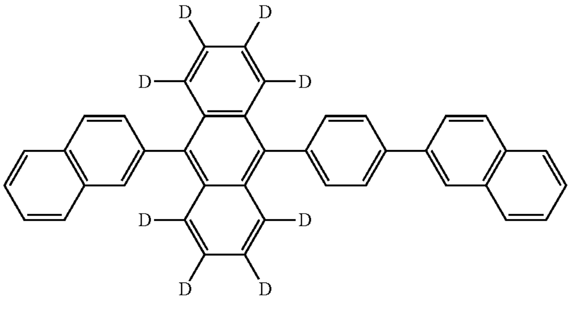
-continued
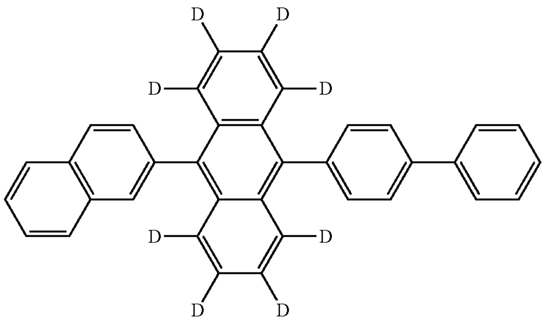
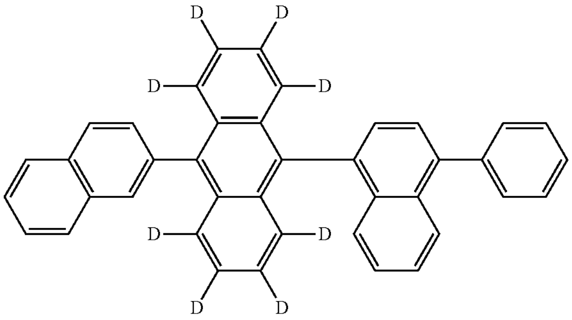
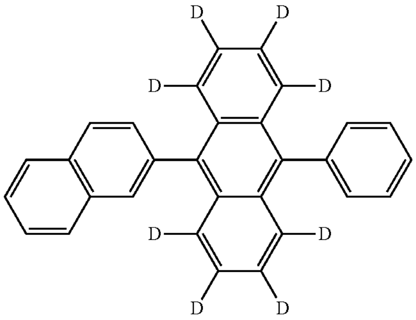
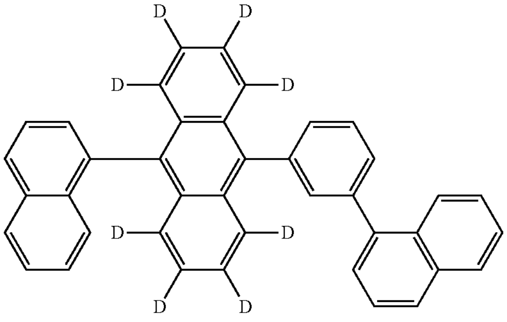
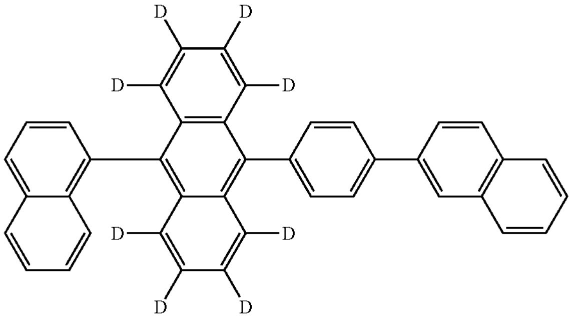

-continued
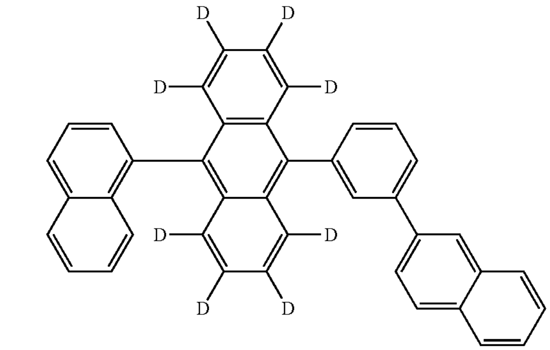
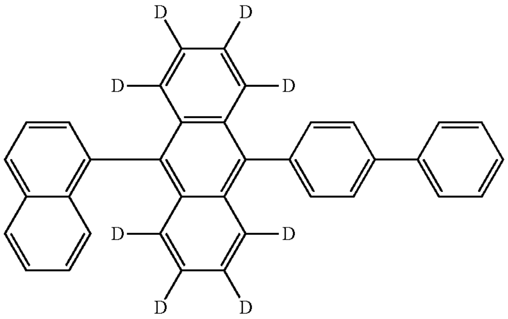
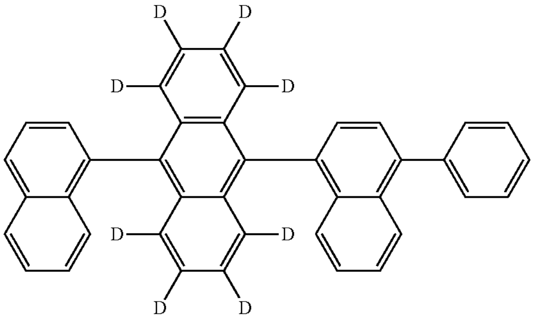
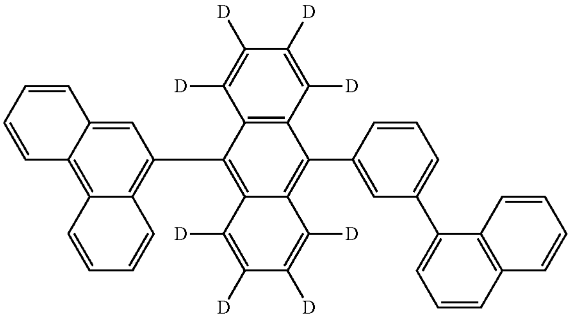
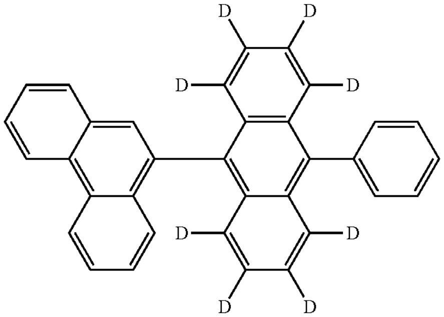
-continued
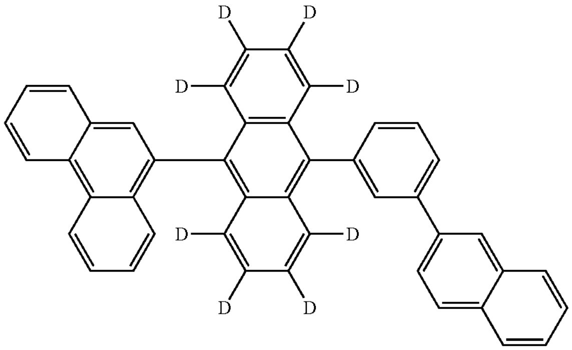
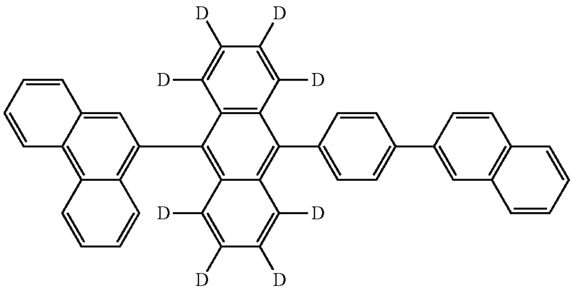
[Formula 116]
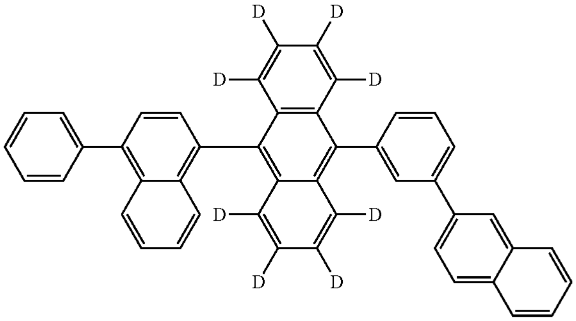
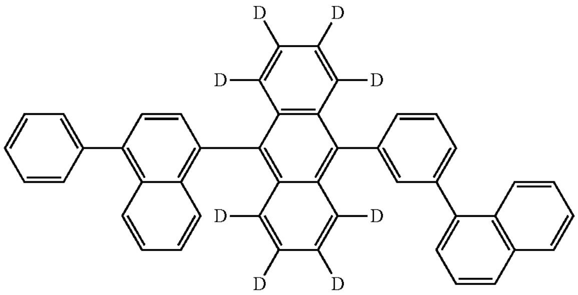
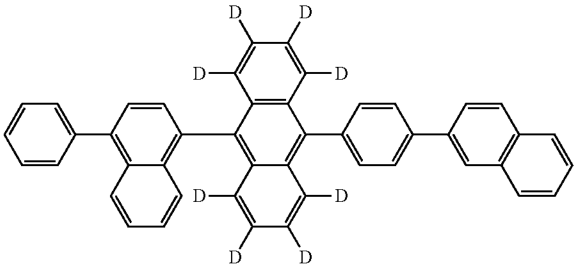

-continued
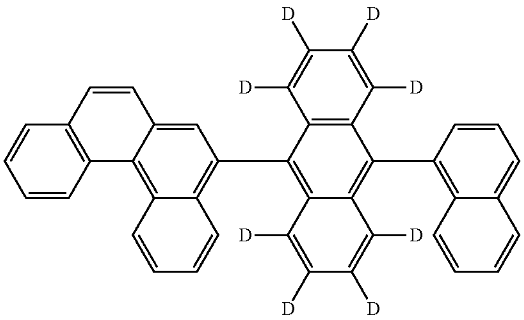
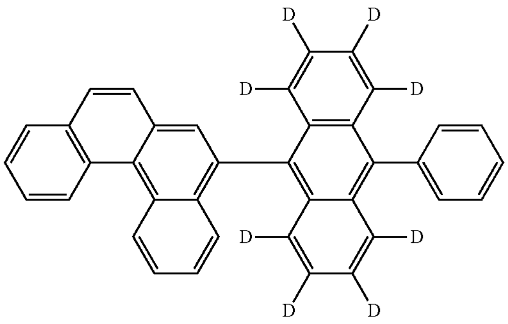
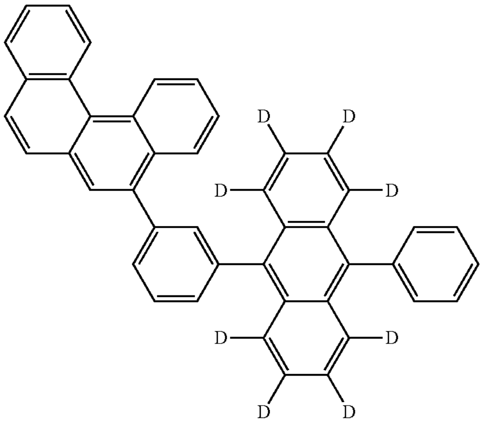
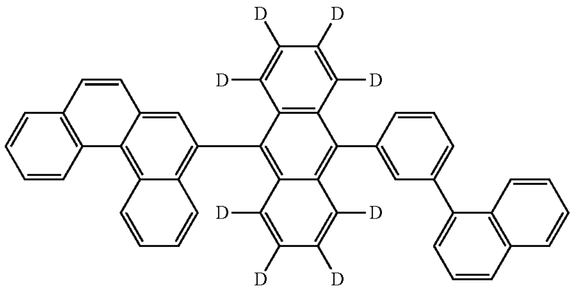
-continued
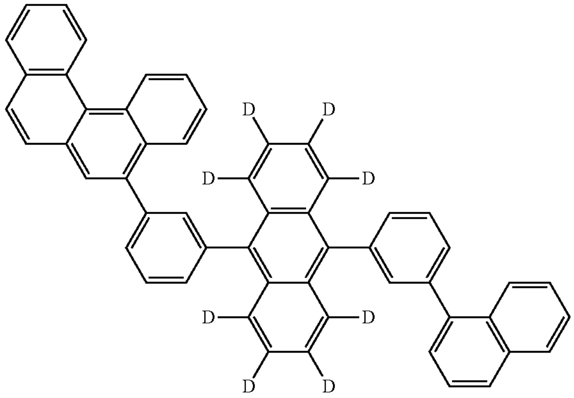
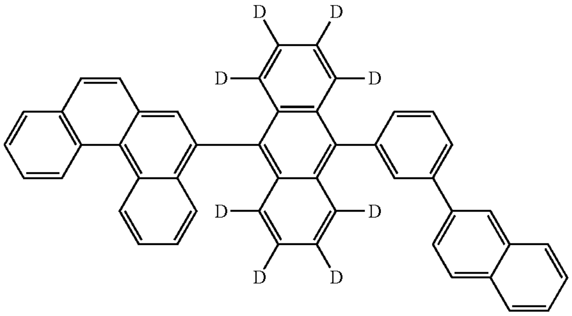
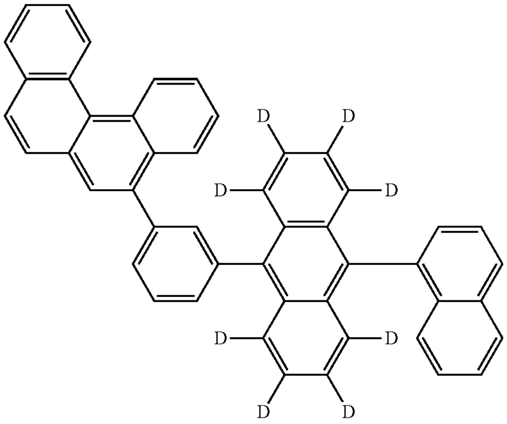
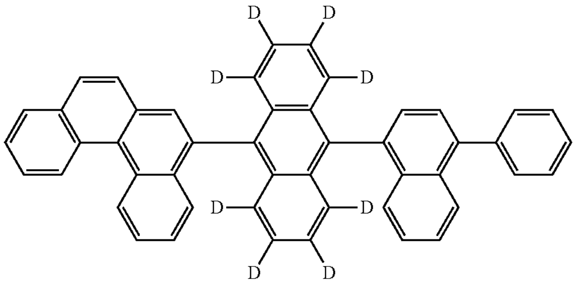
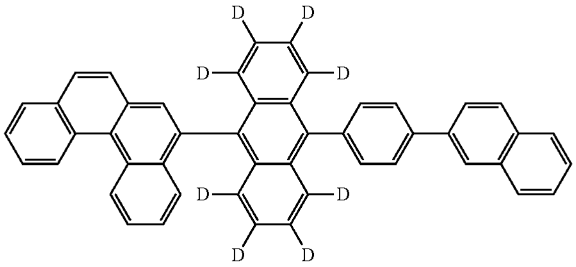

-continued
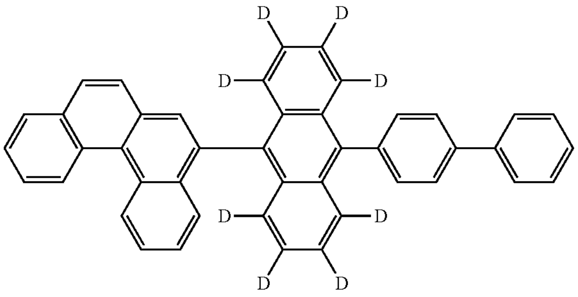
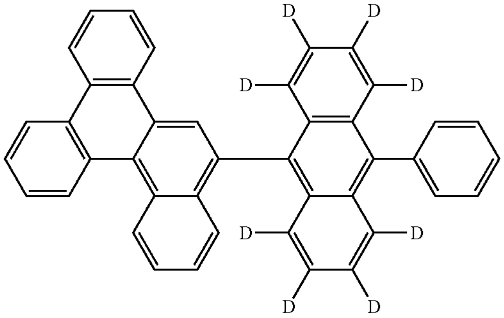
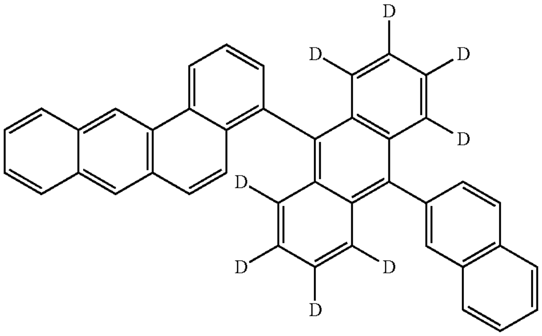
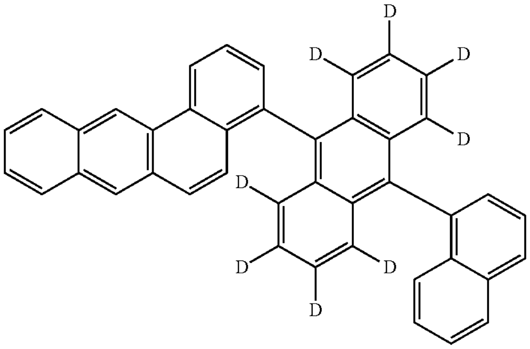
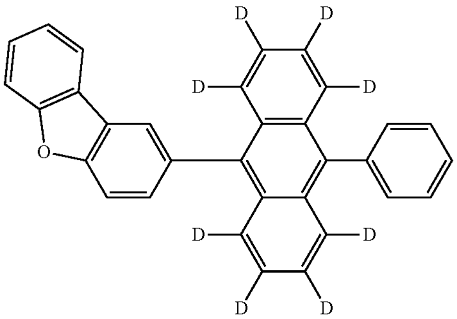
-continued
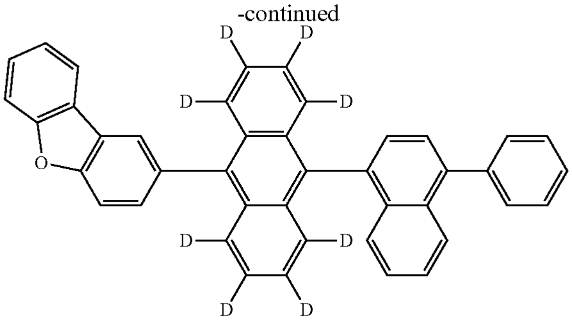
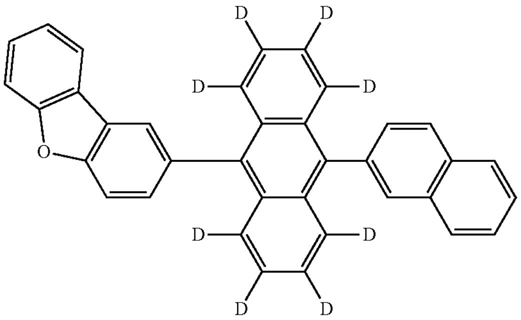
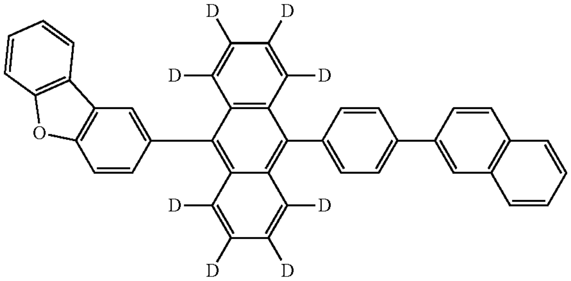
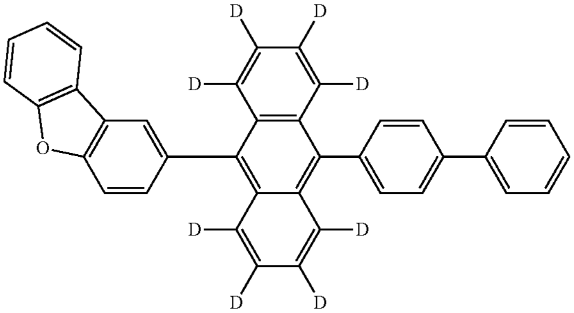
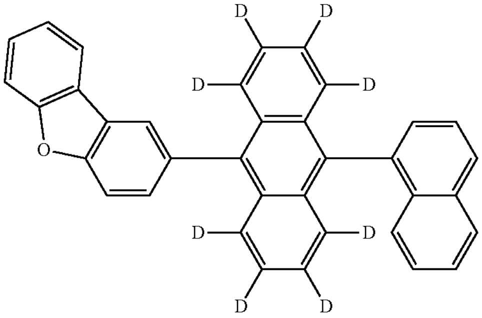

-continued
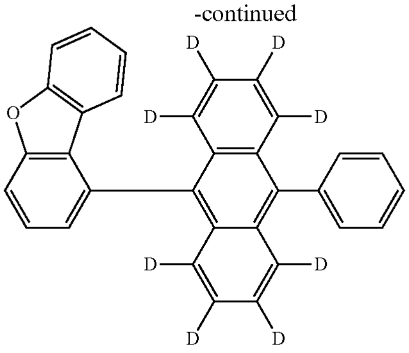
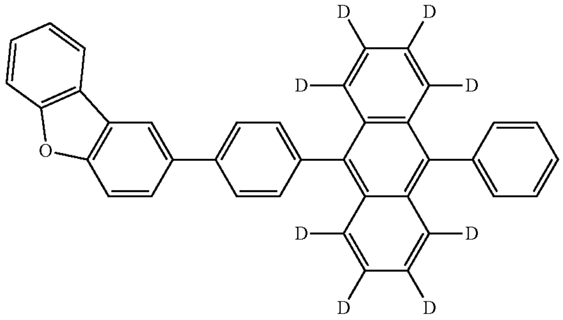
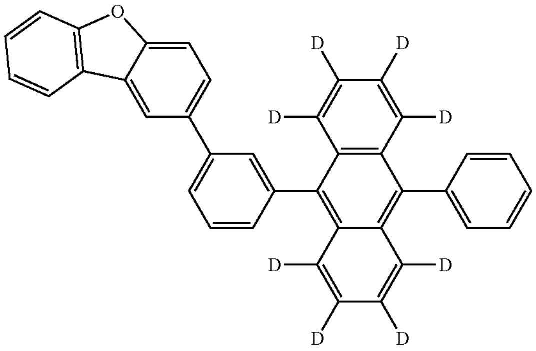
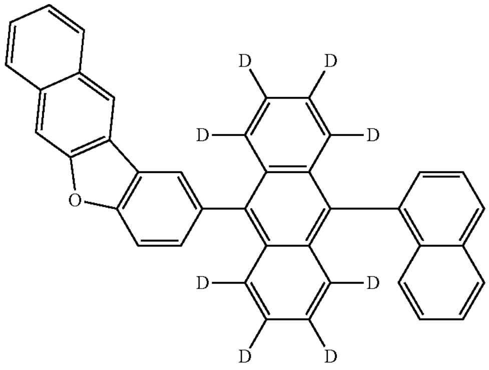
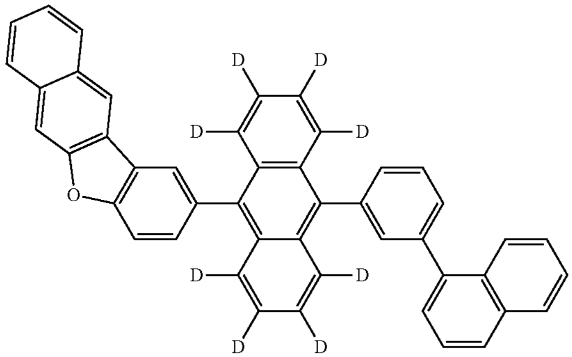
-continued
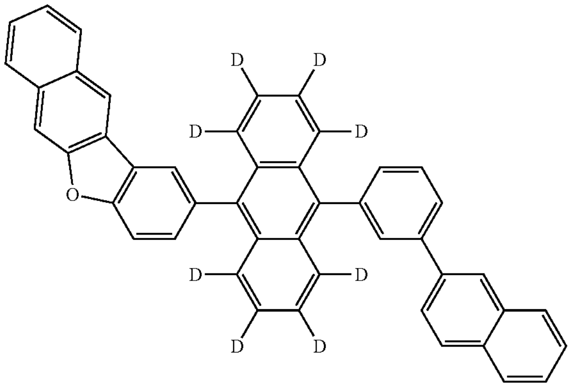
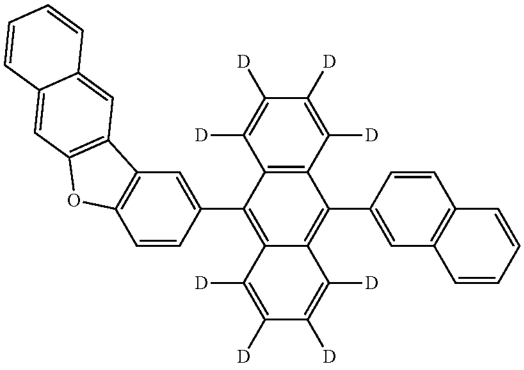
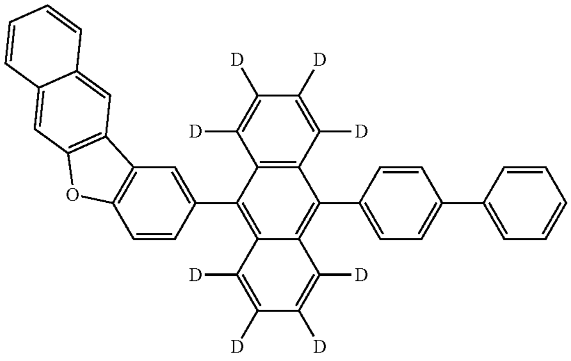
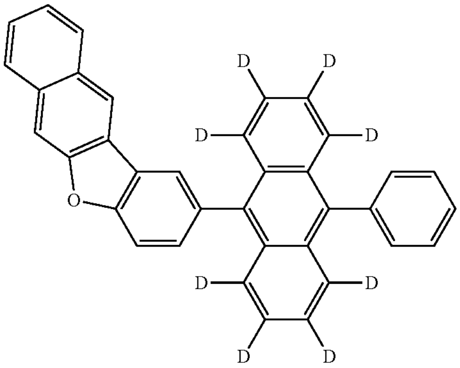

-continued
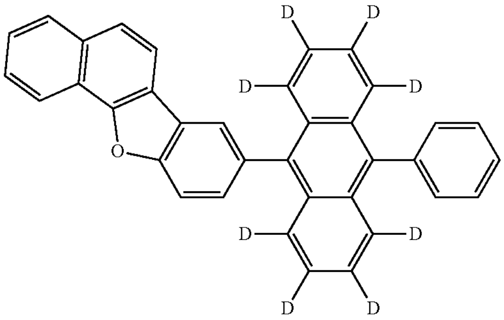
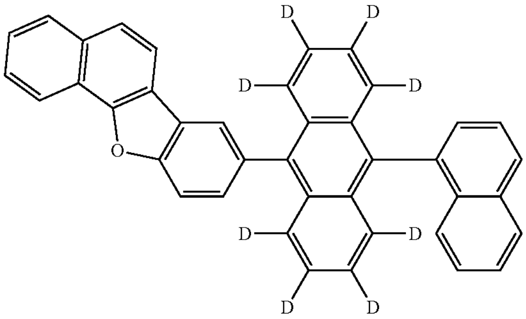
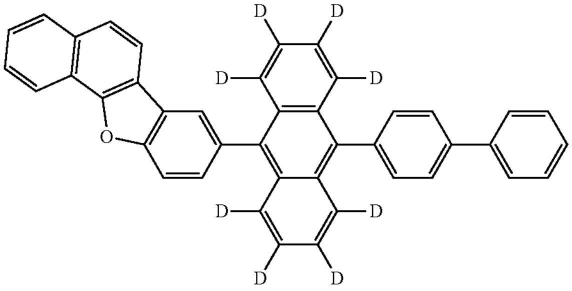
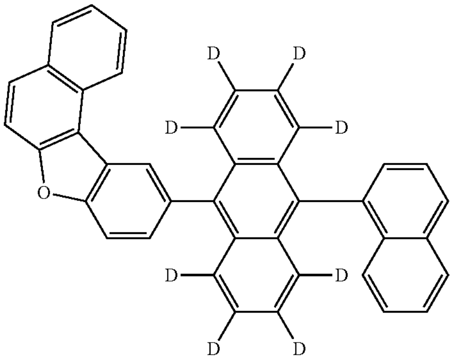
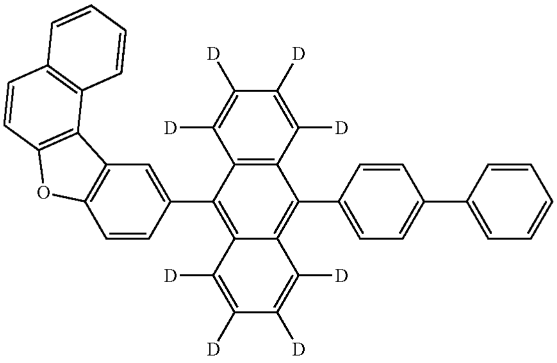
-continued
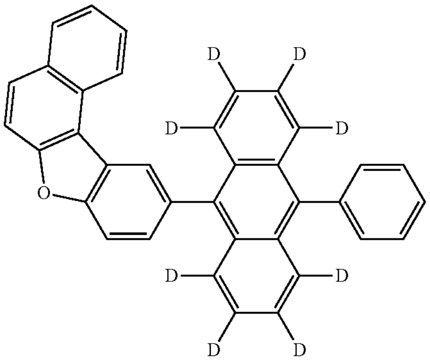
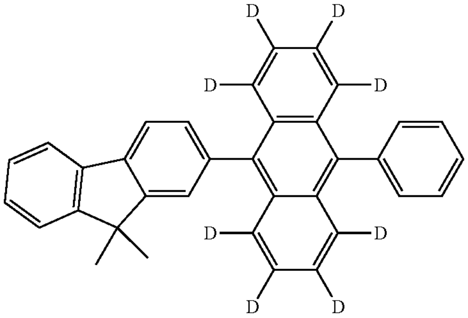
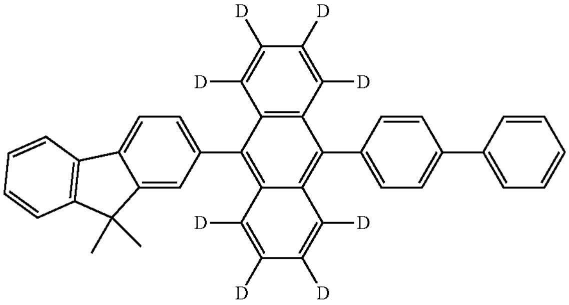
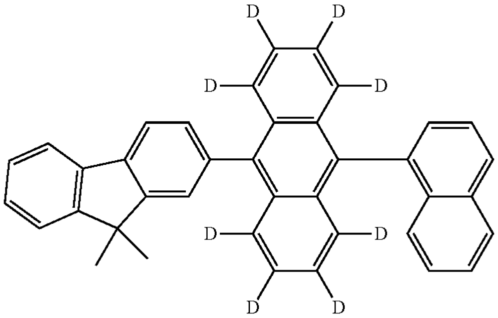
[Formula 177]
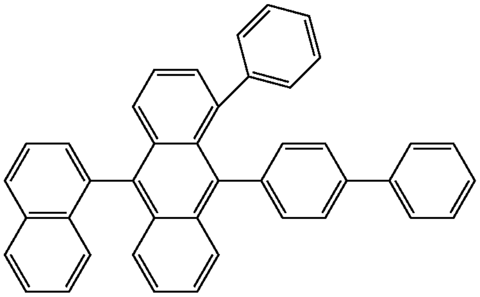

-continued
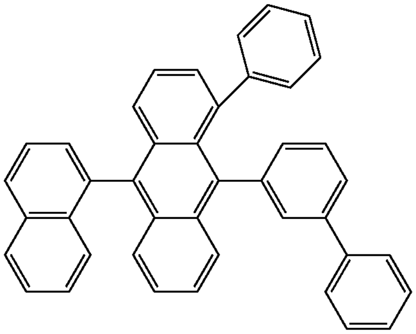
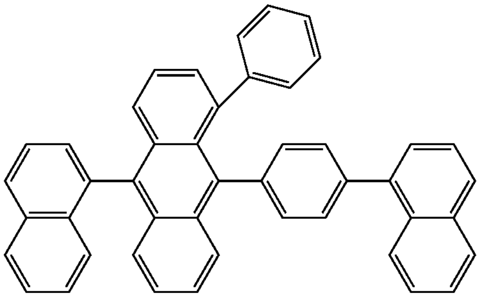
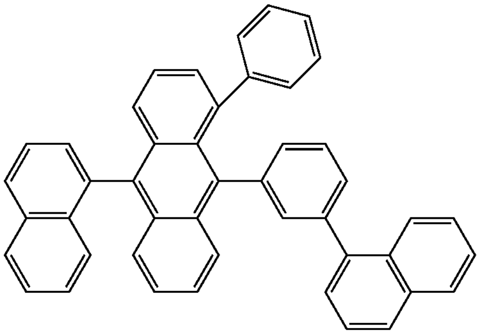
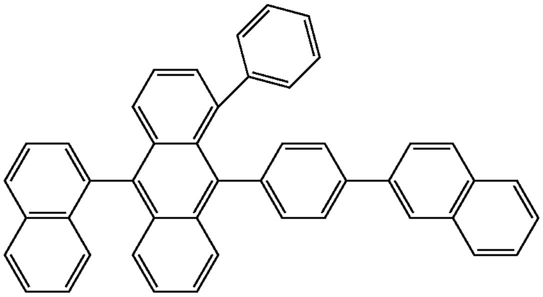
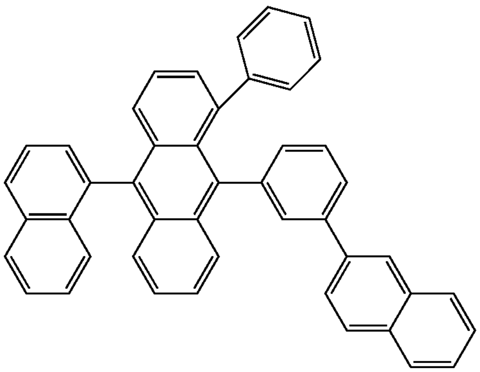
-continued
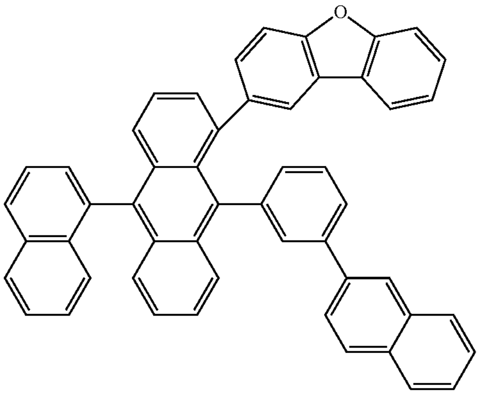
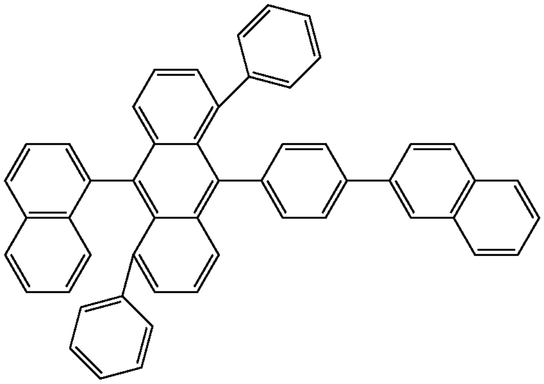
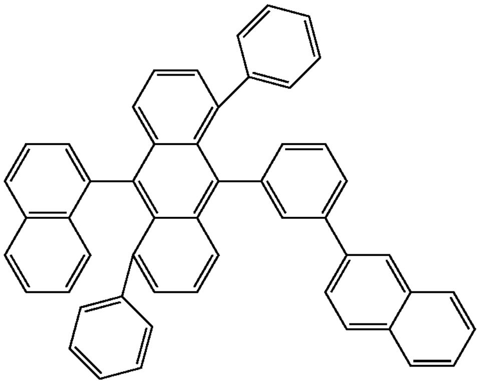
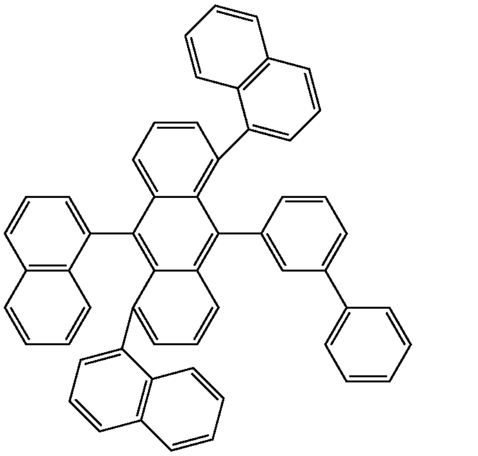

-continued
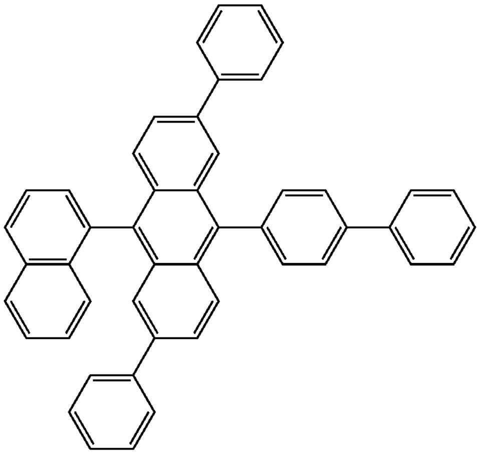
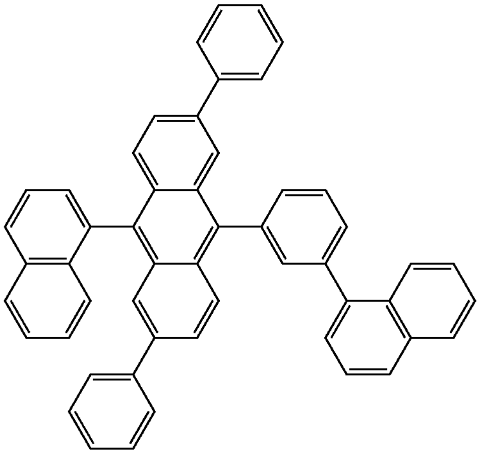
[Formula 118]
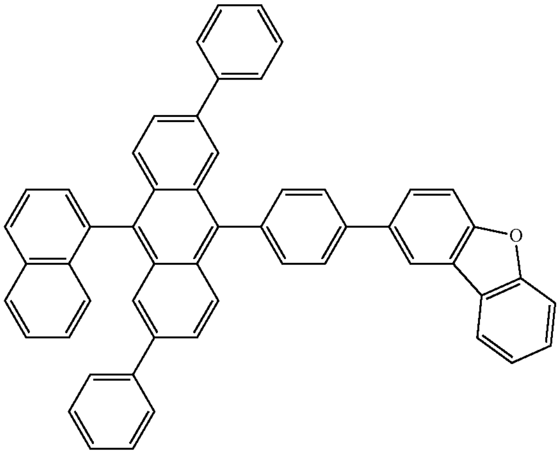
-continued
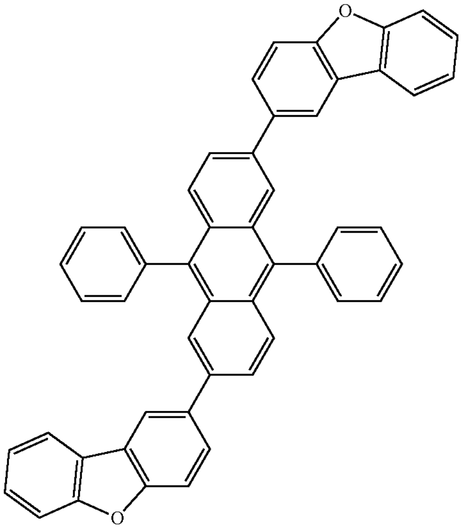
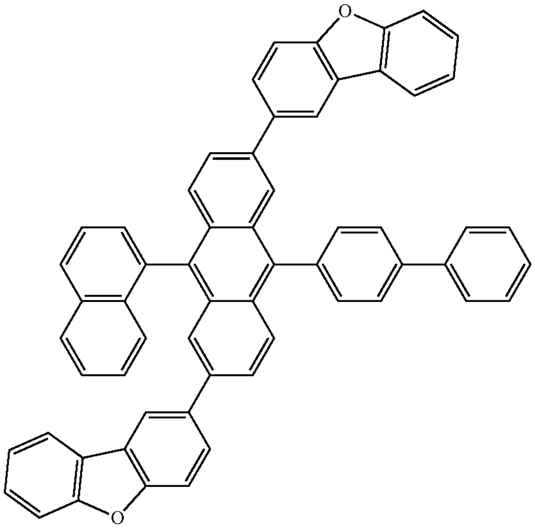
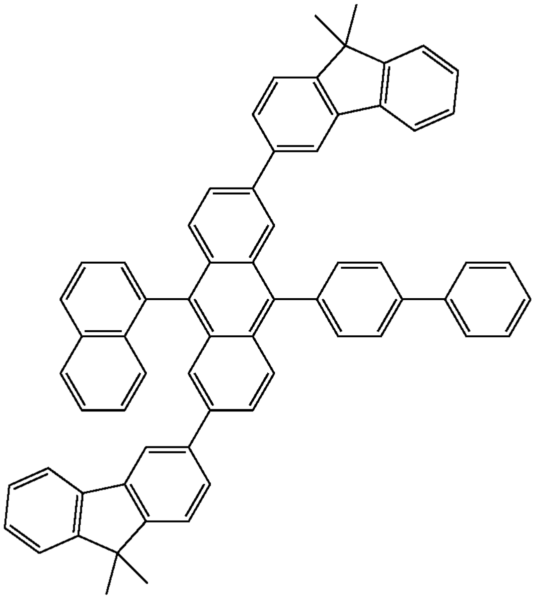

-continued
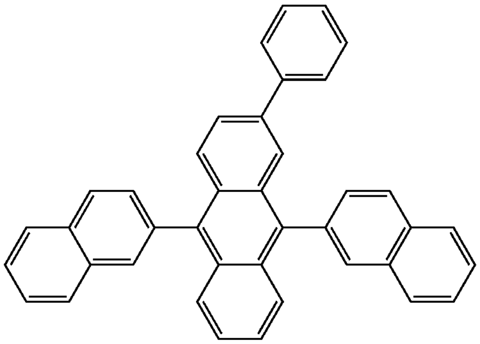
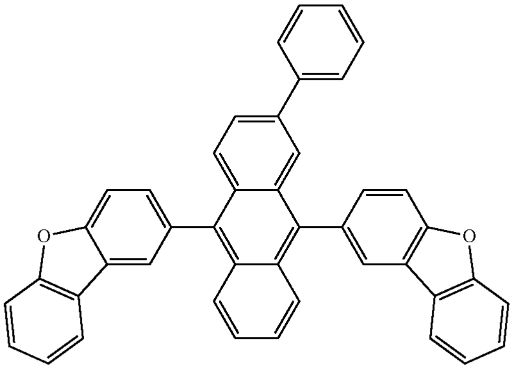
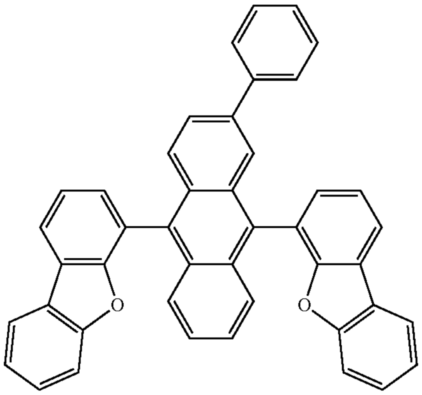
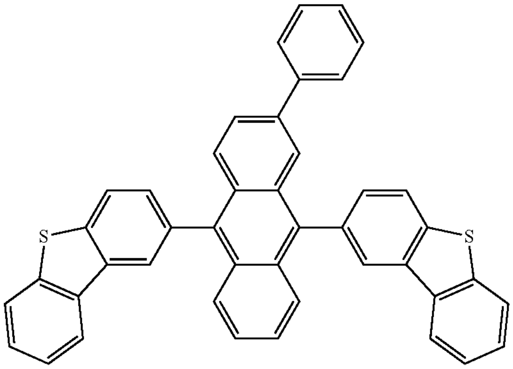
-continued
[Formula 119]
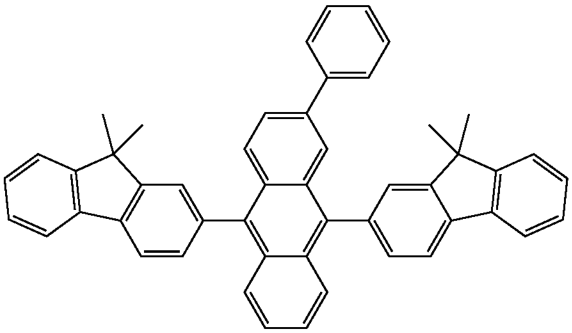
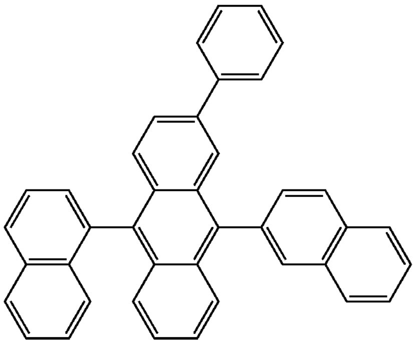
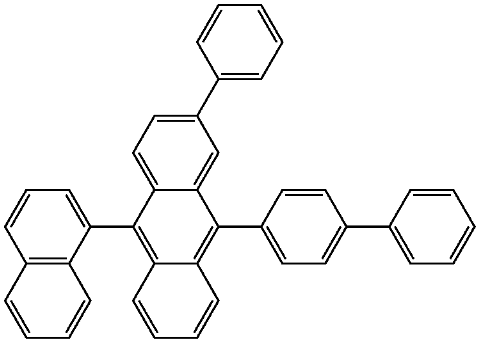
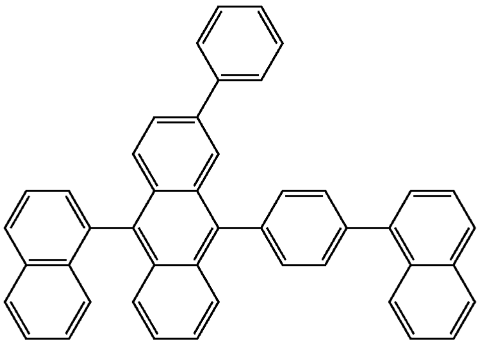

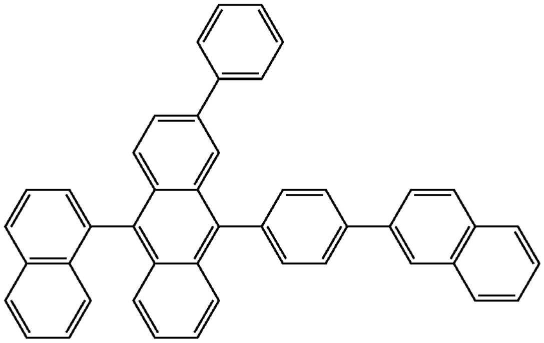
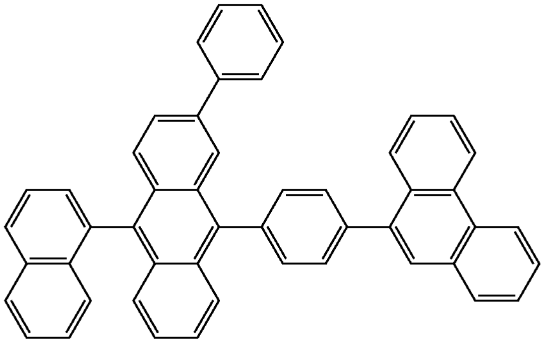
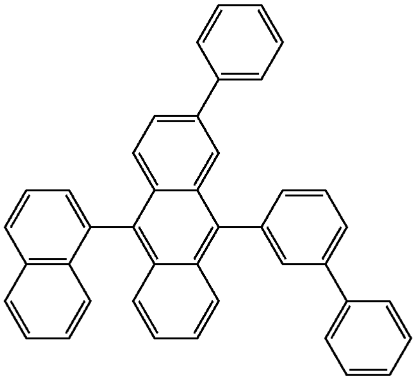
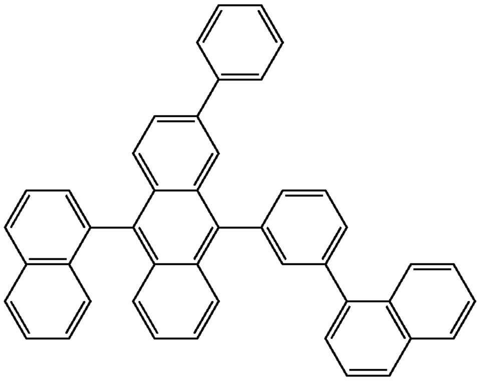
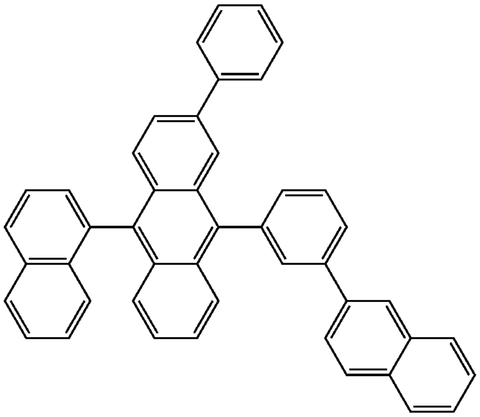
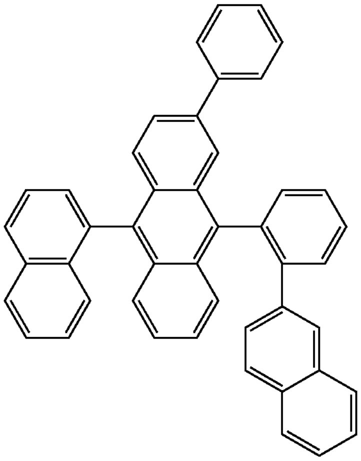
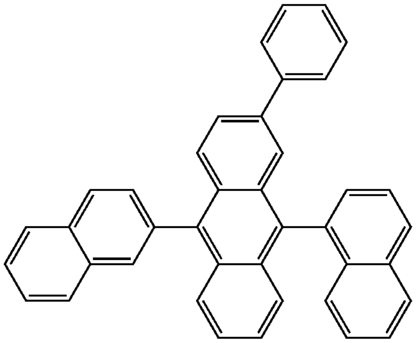
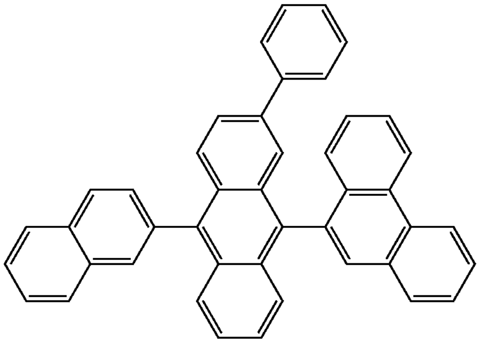

-continued
[Formula 120]
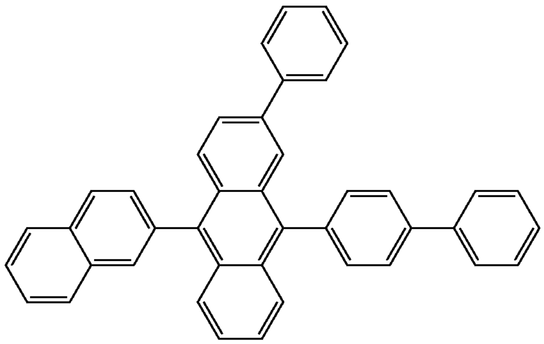
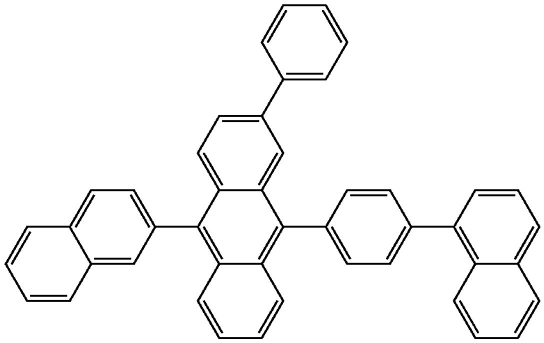
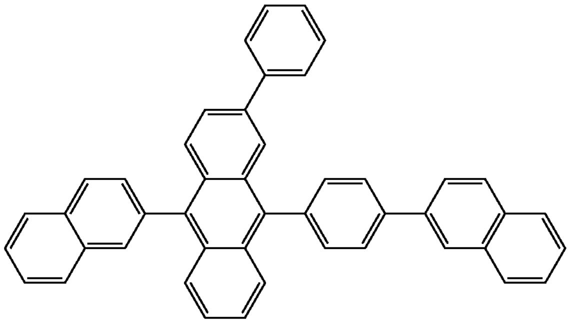
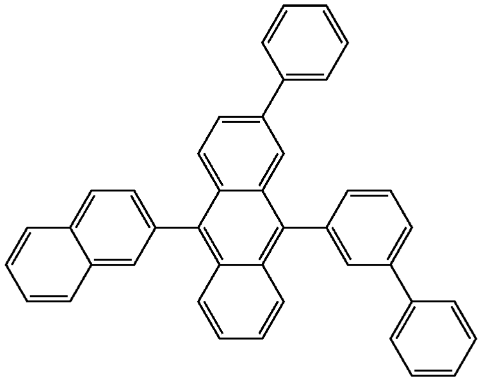
-continued
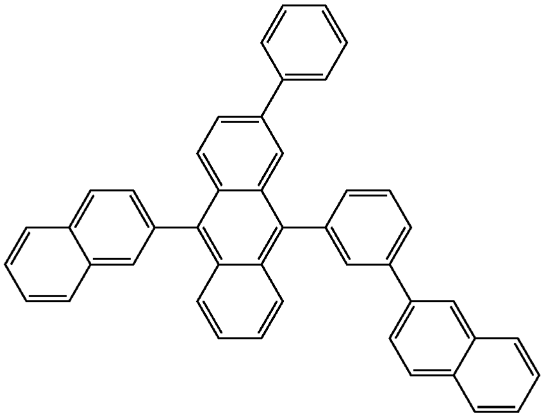
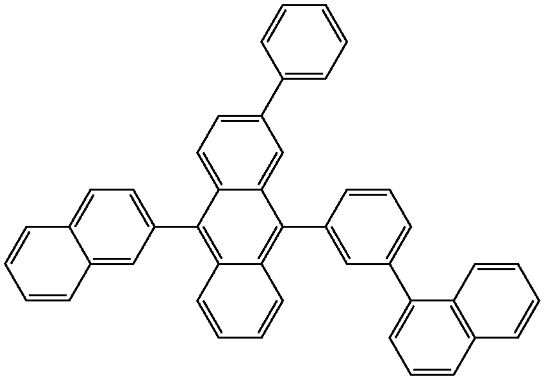
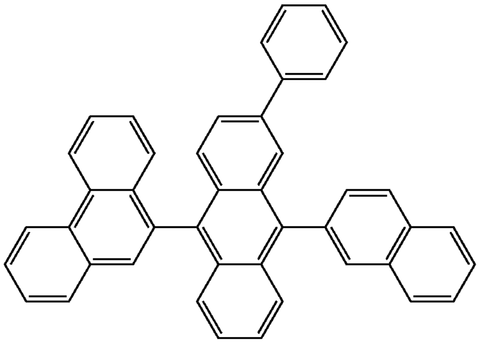
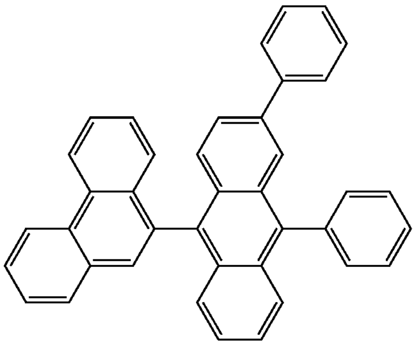

-continued
[Formula 121]
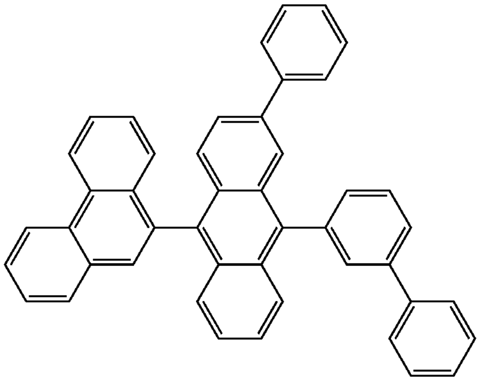
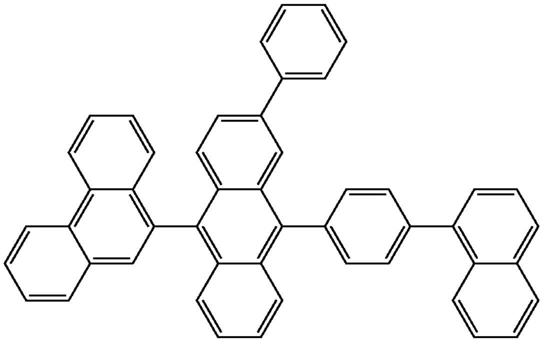
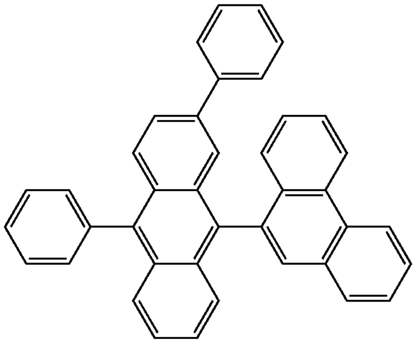
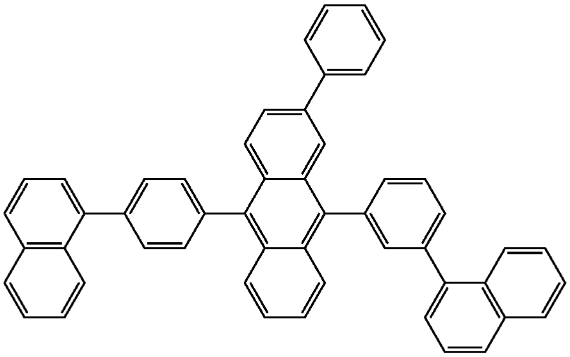
-continued
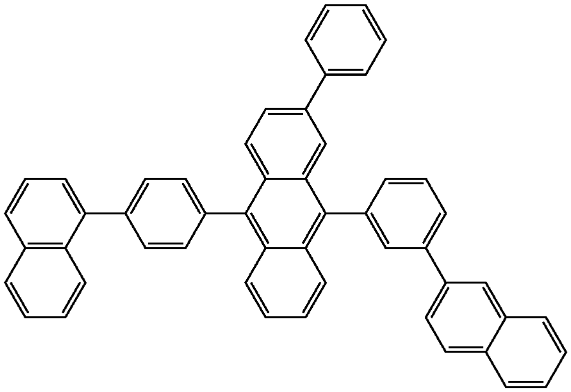
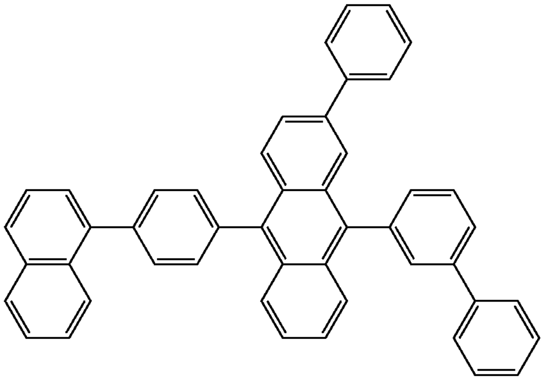
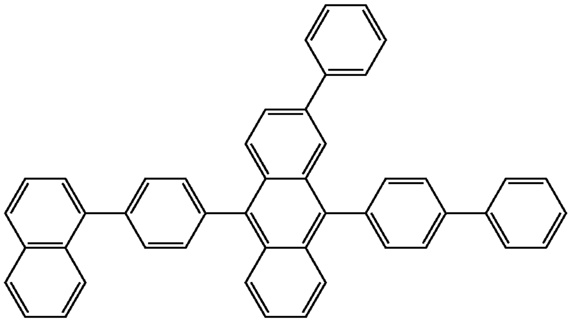
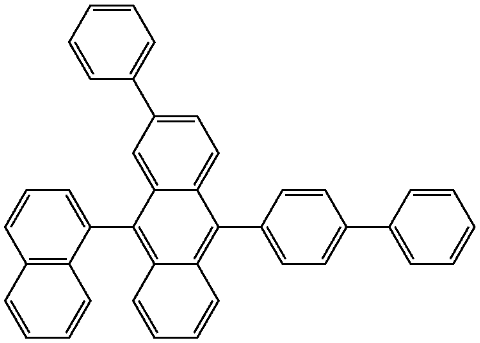

[Formula 122]
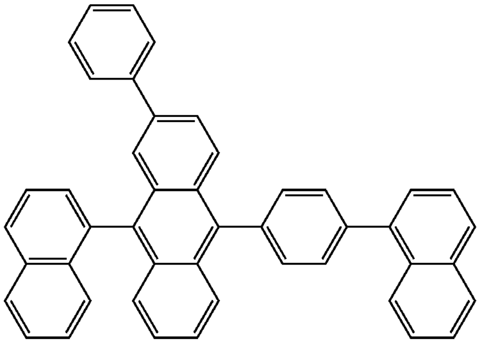
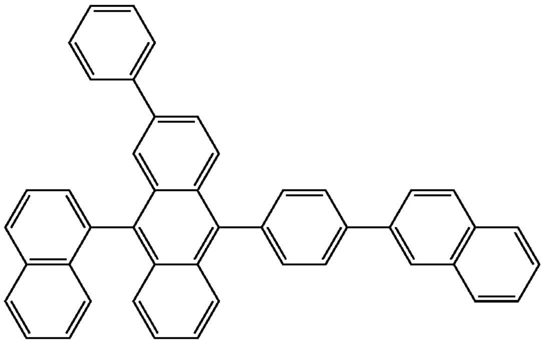
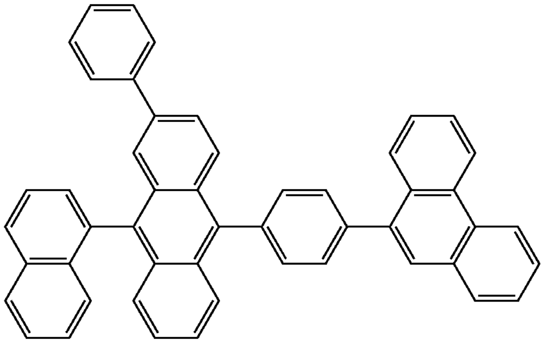
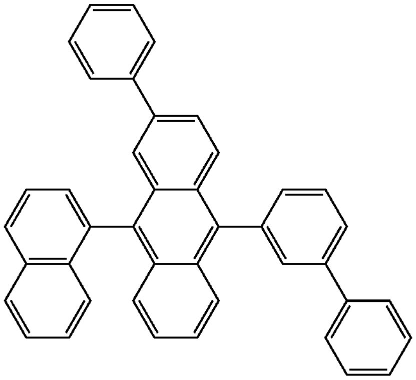
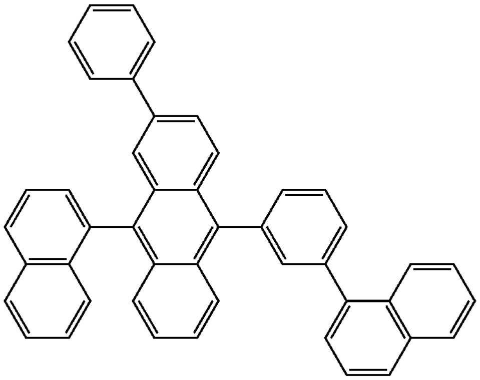
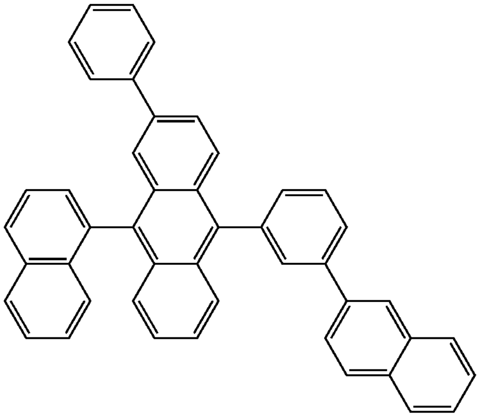
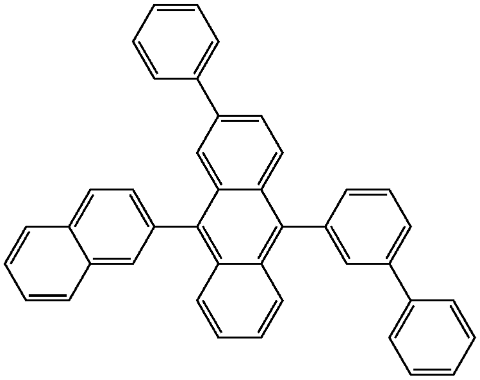
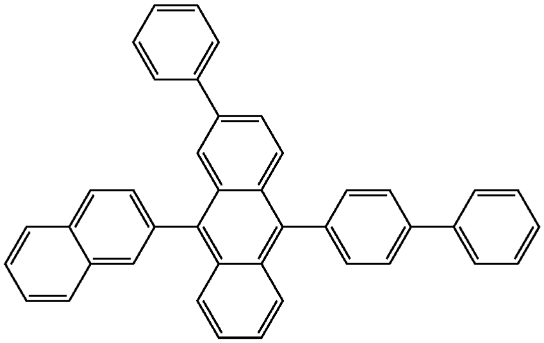

[Formula 123]
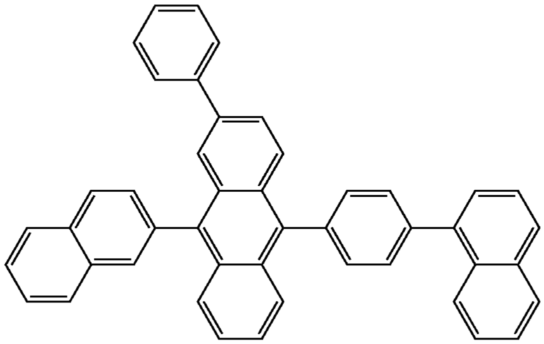
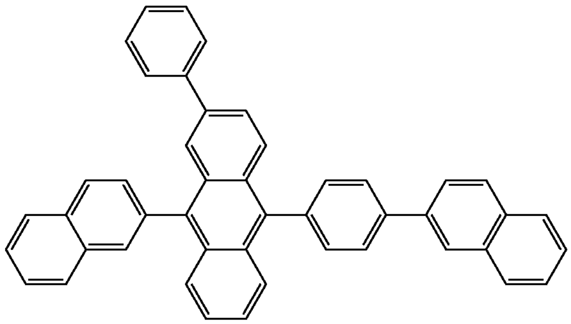
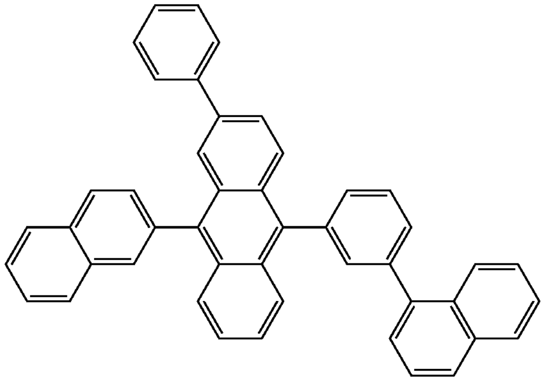
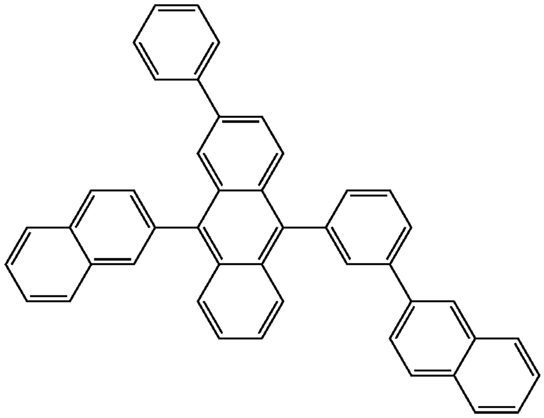
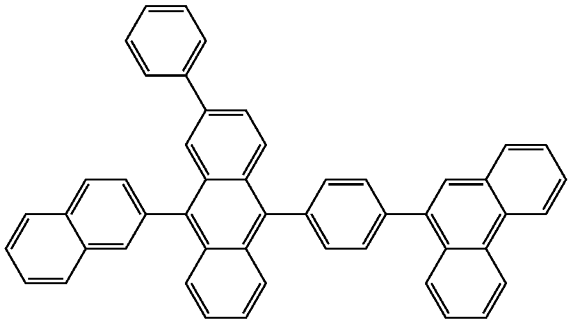
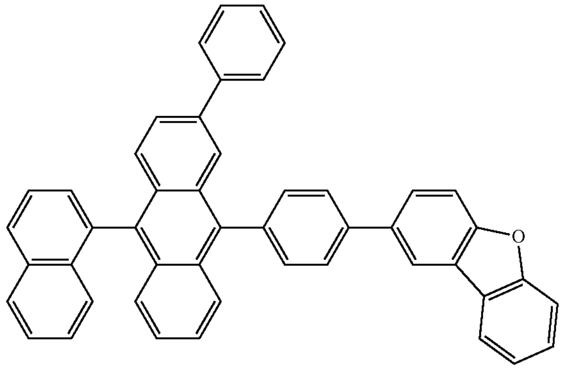
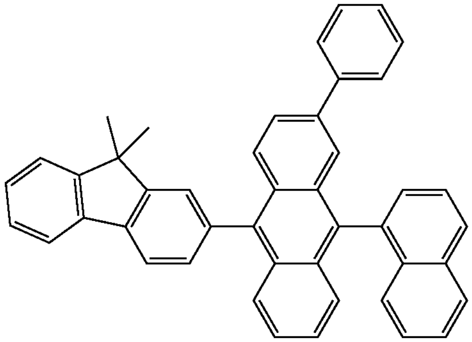
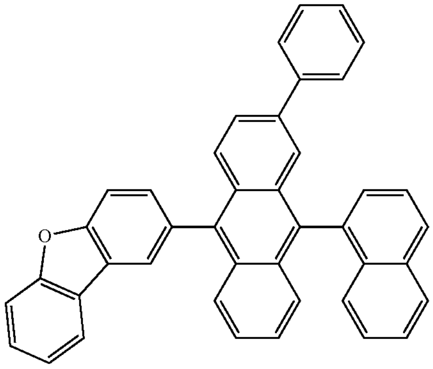

-continued
[Formula 124]
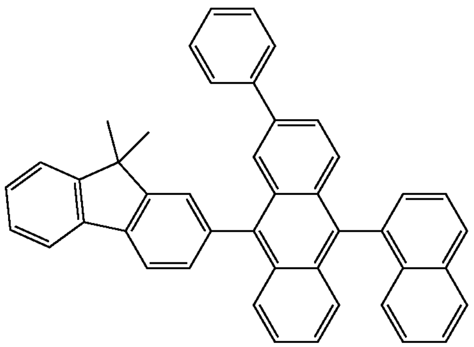
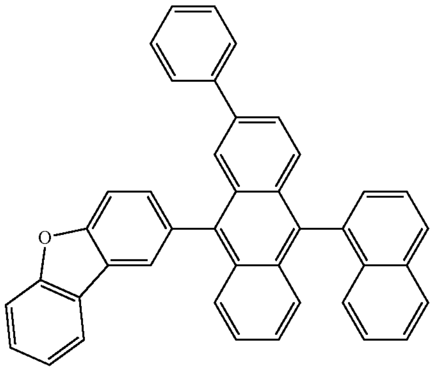
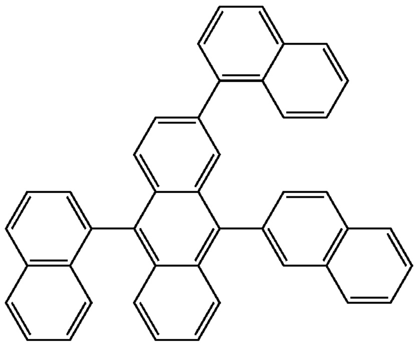
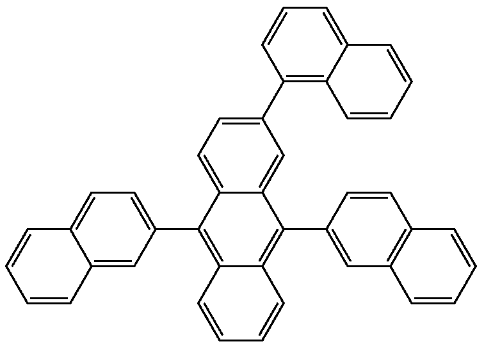
-continued
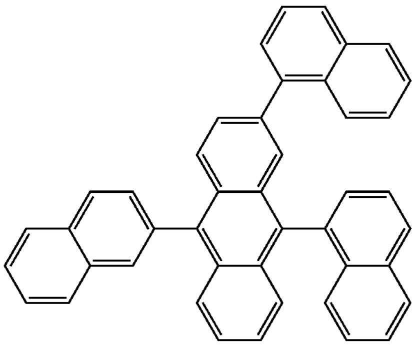
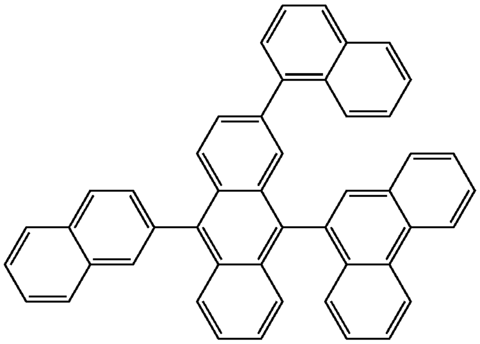
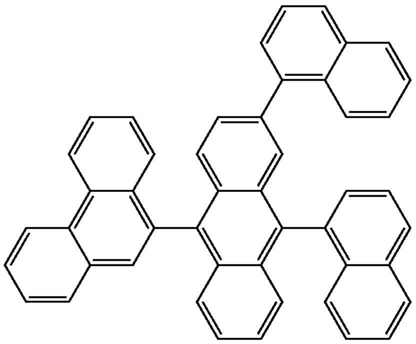
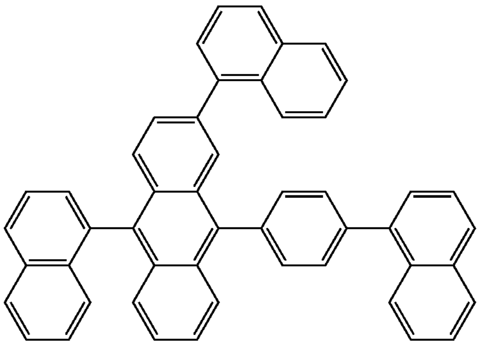

-continued
[Formula 125]
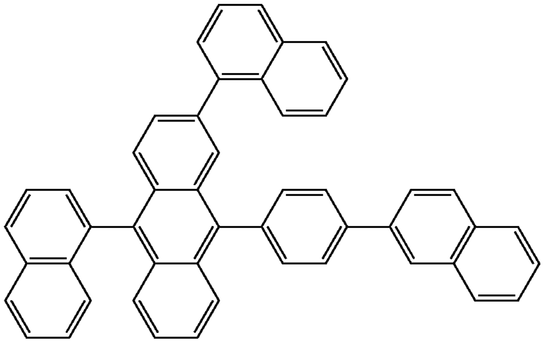
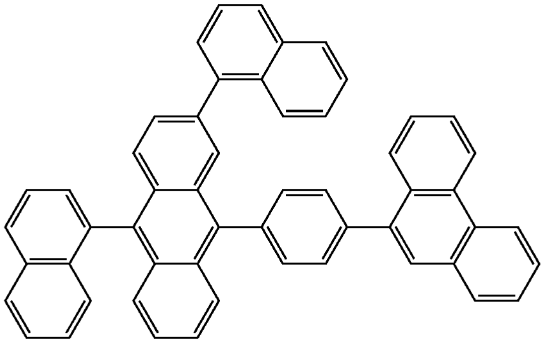
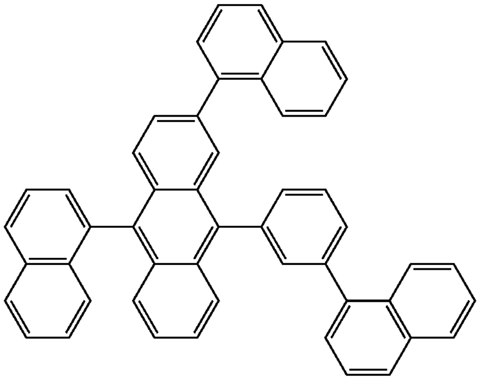
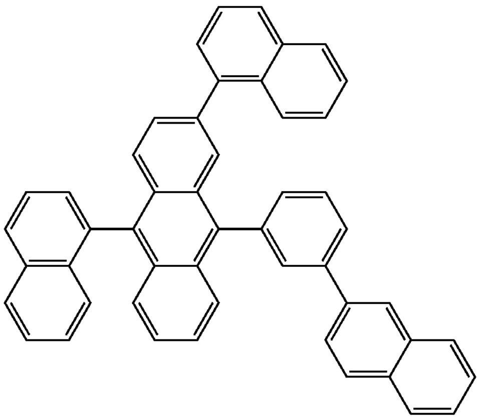
-continued
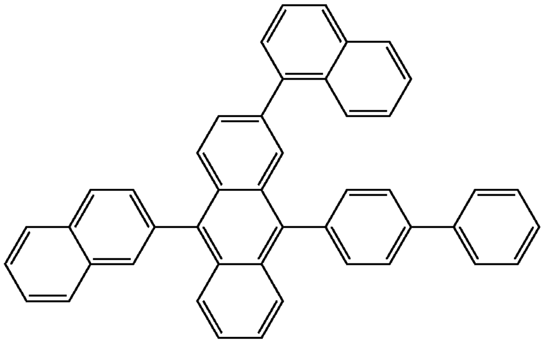
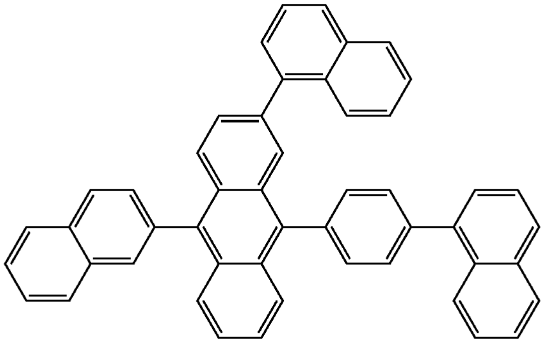
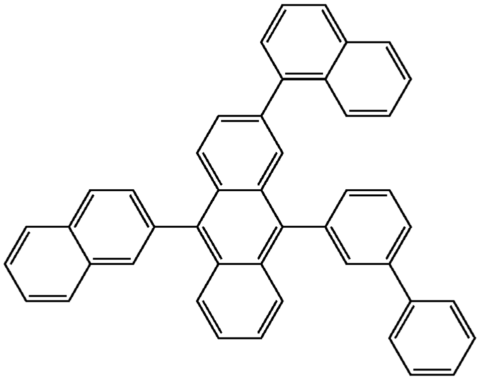
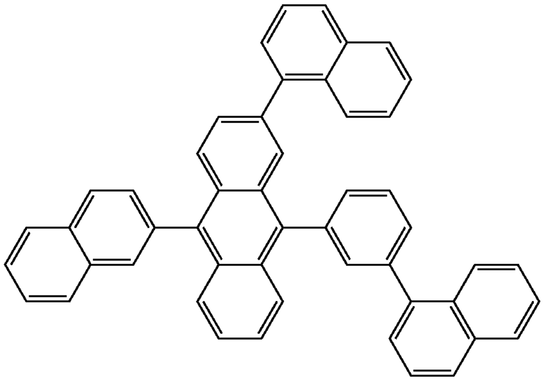

[Formula 126]
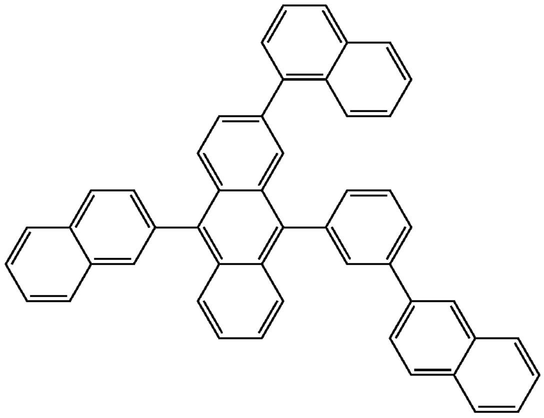
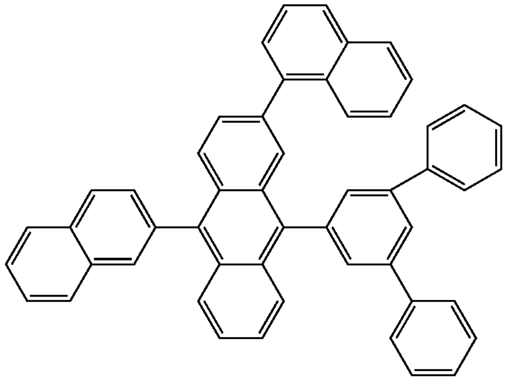
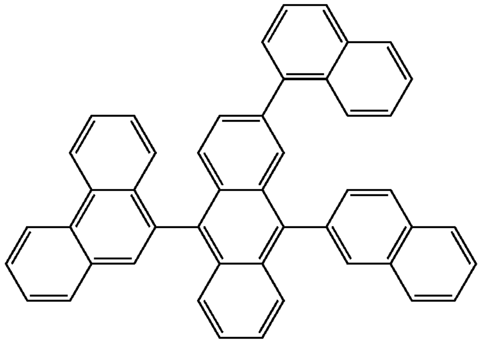
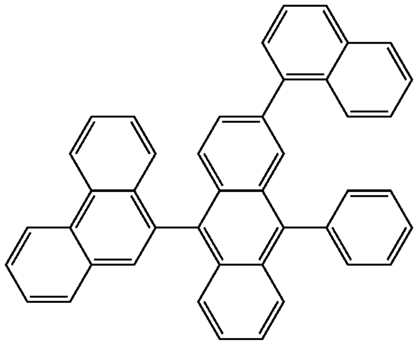
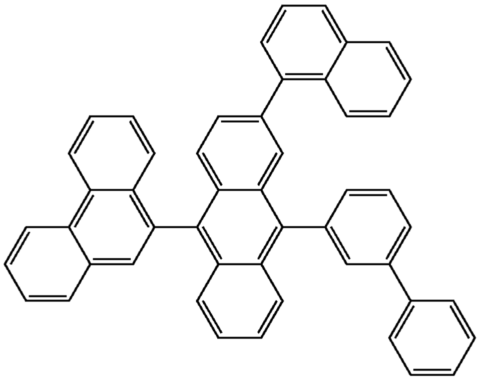
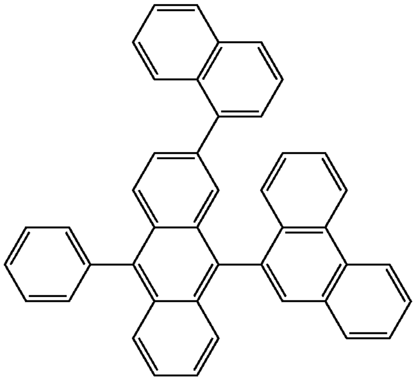
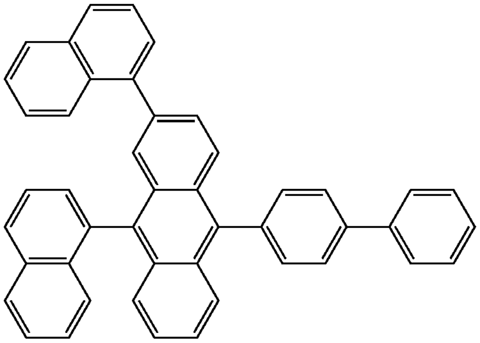
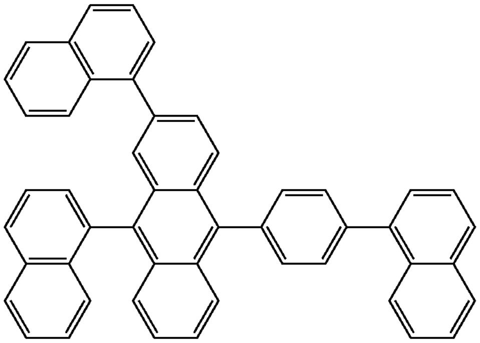

-continued
[Formula 127]
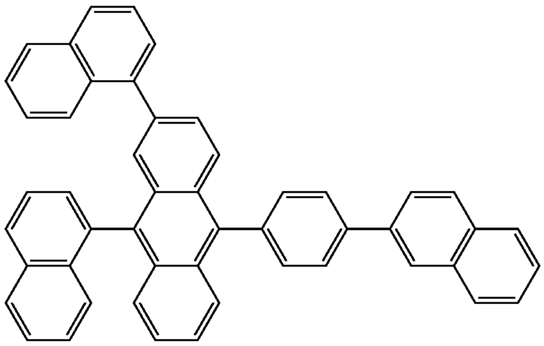
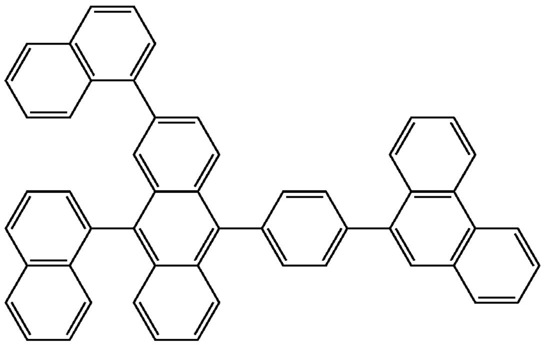
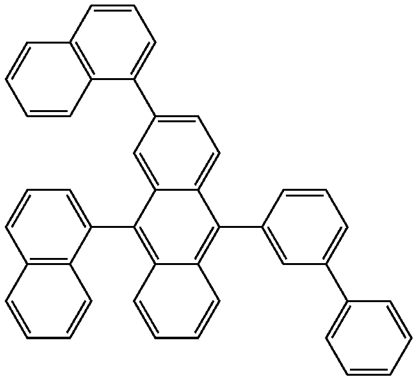
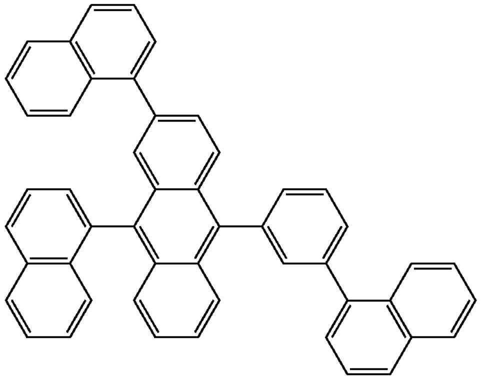
-continued
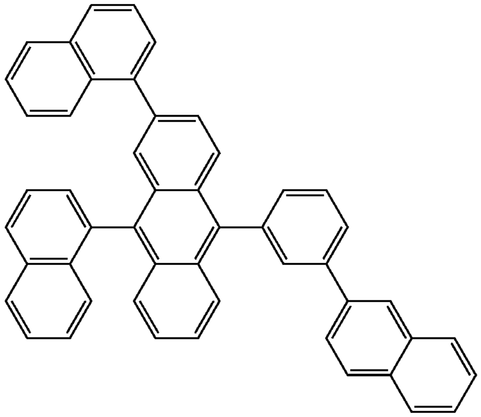
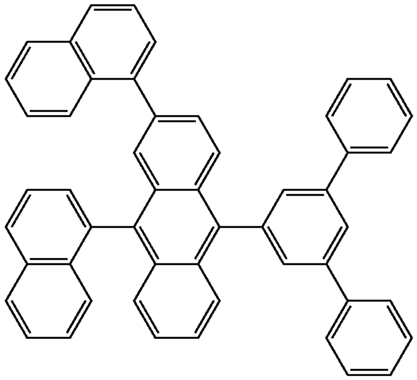
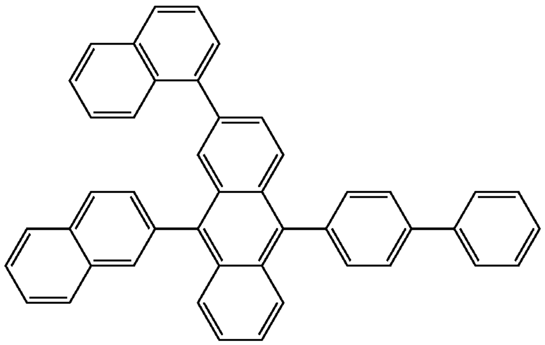
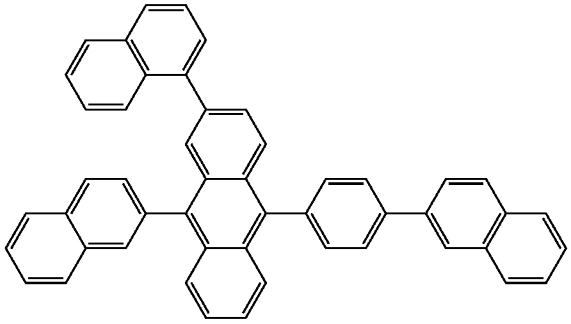

-continued
[Formula 128]
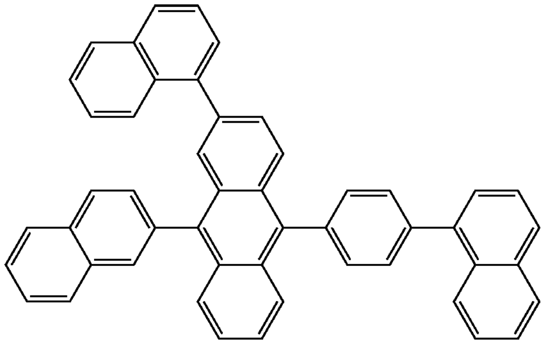
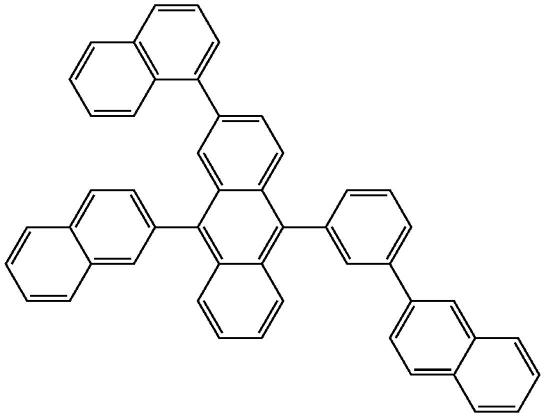
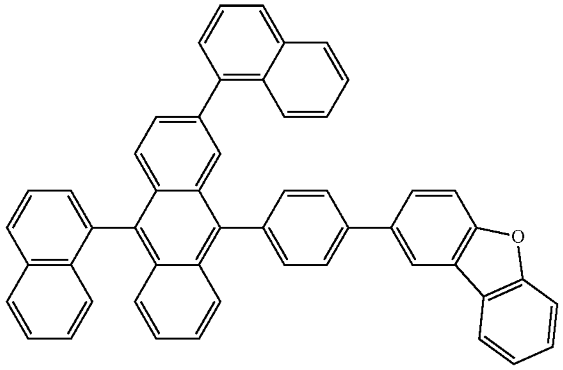
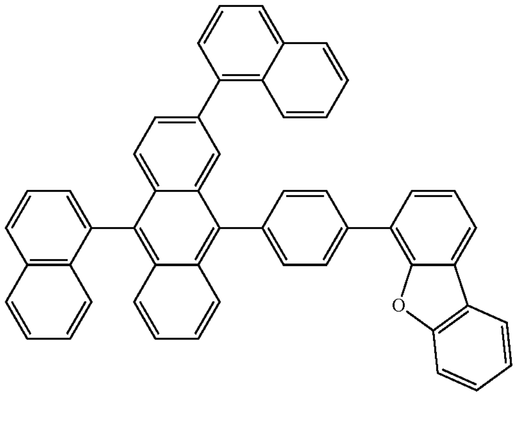
-continued
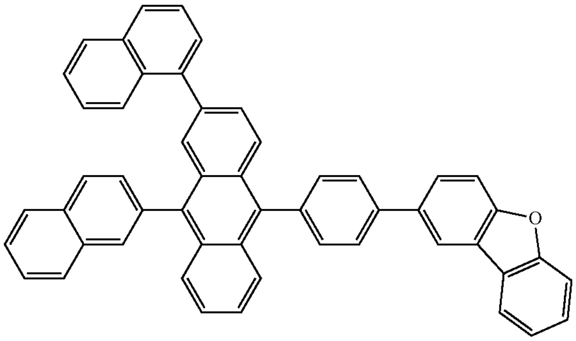
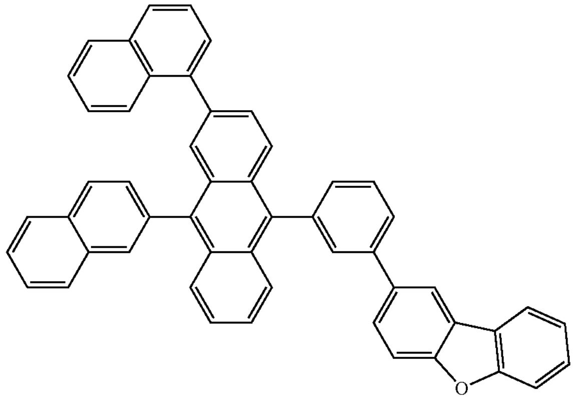
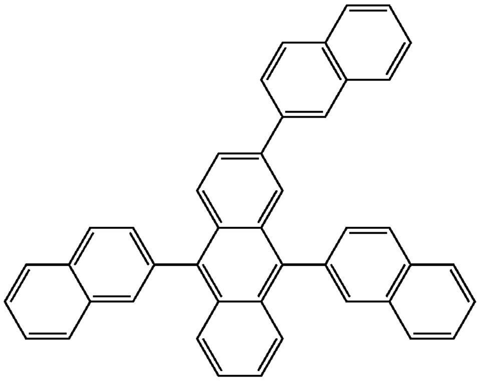
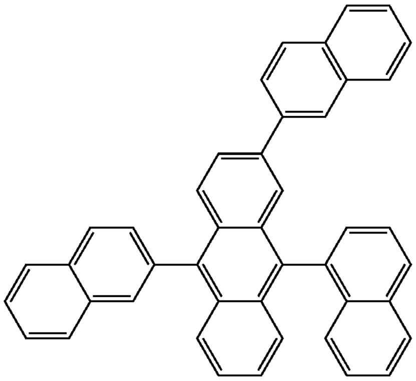

[Formula 129]
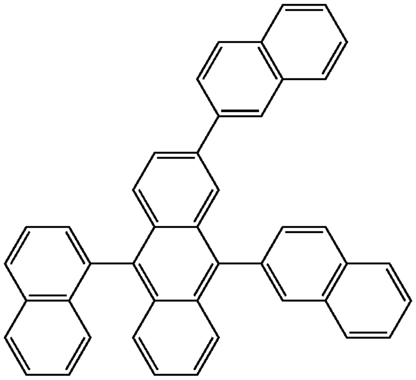
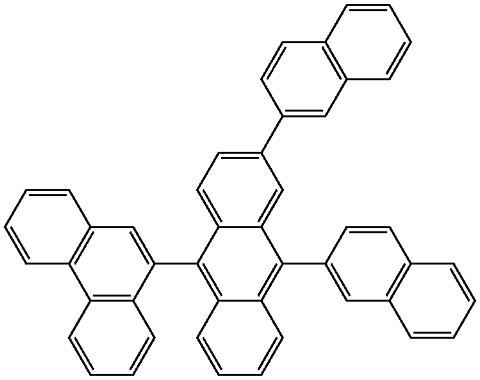
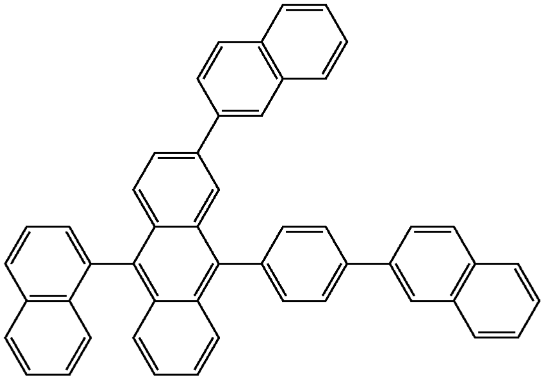
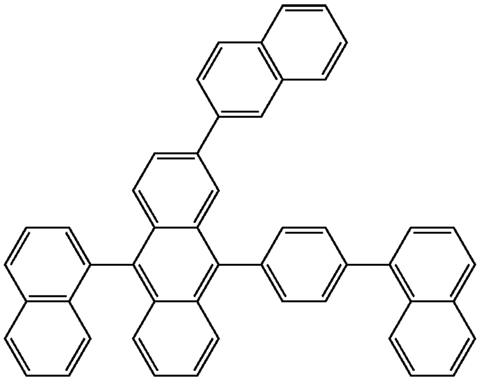
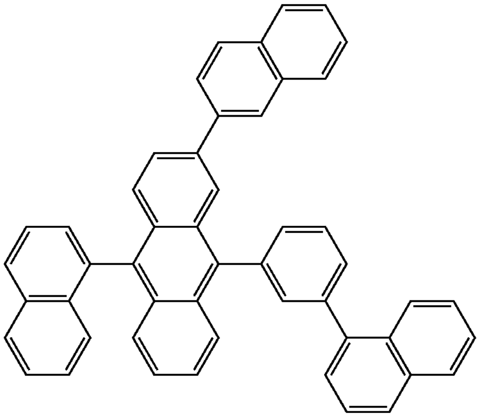
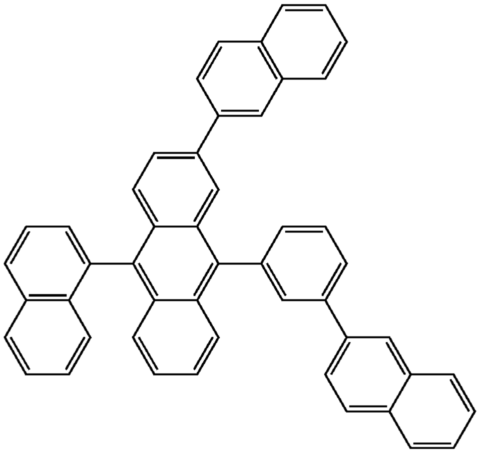
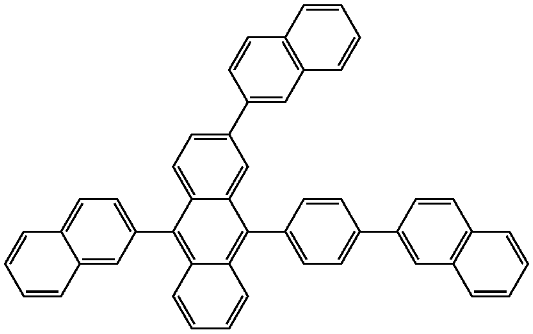
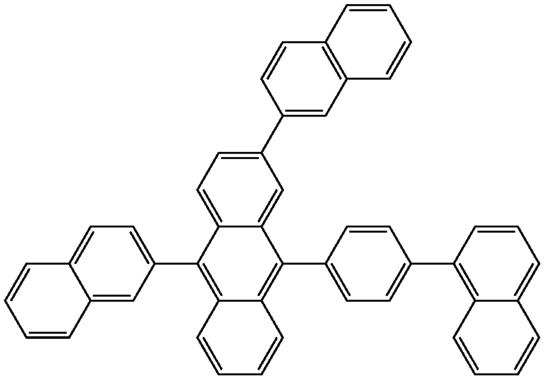

-continued
[Formula 130]
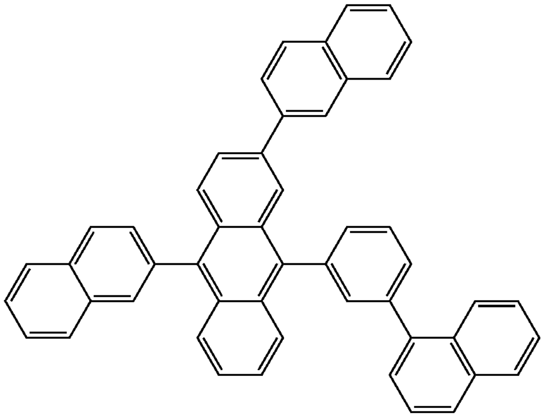
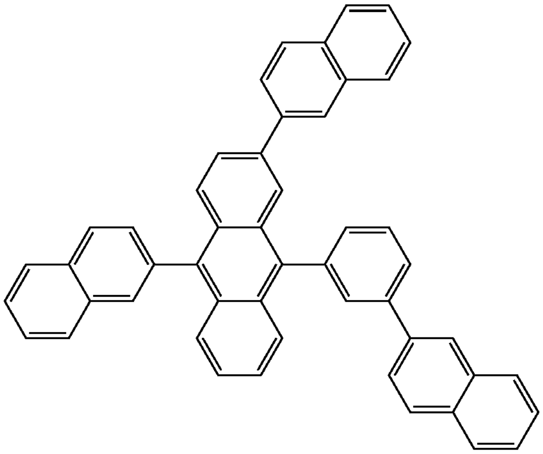
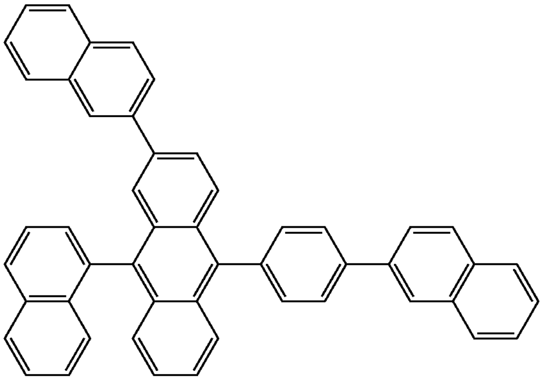
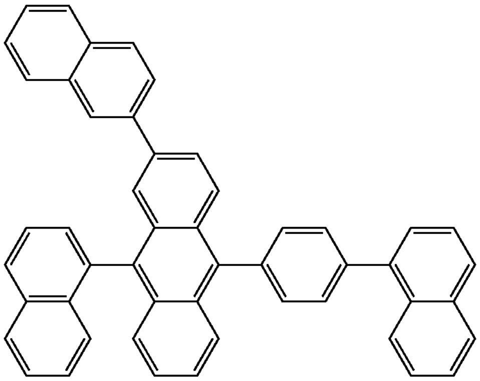
-continued
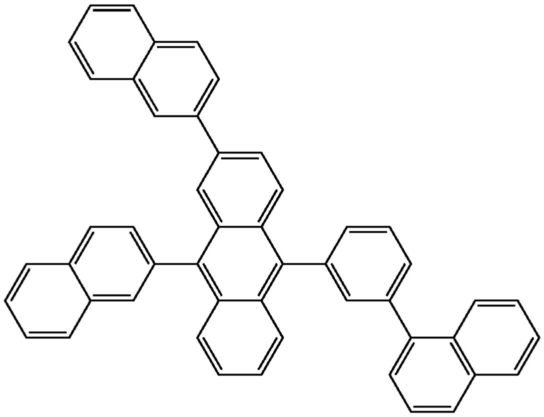
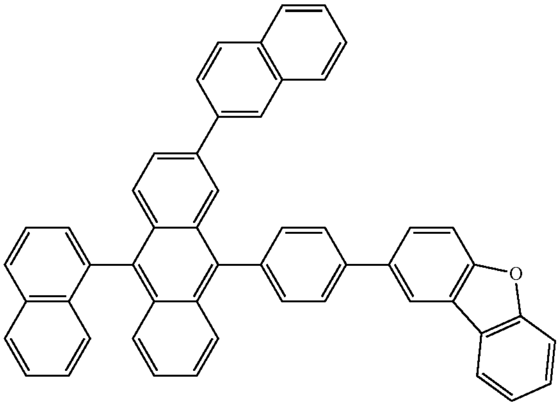
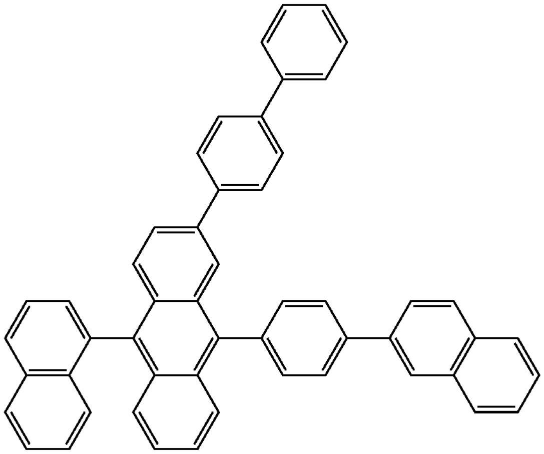

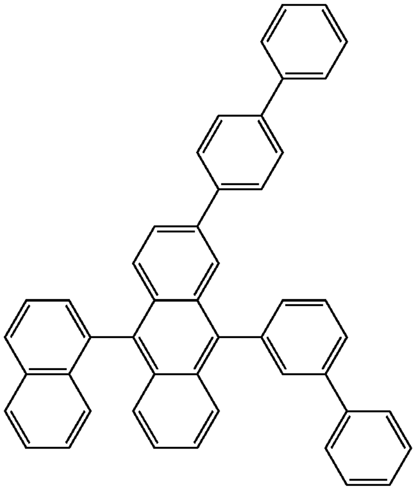
[Formula 131]
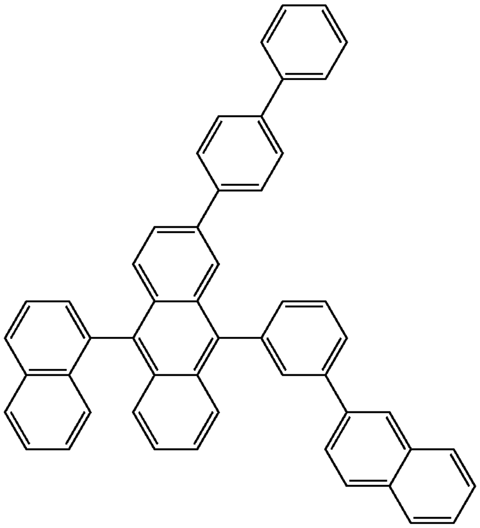
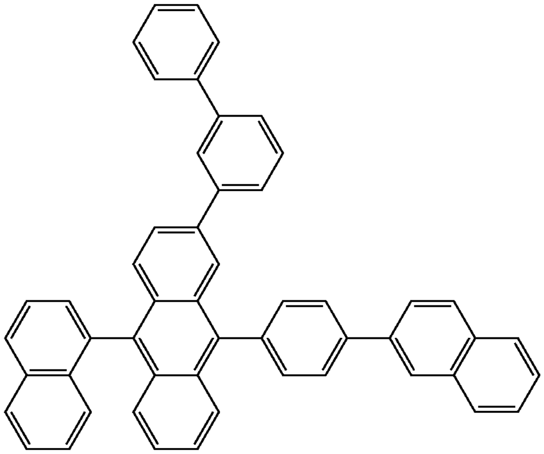
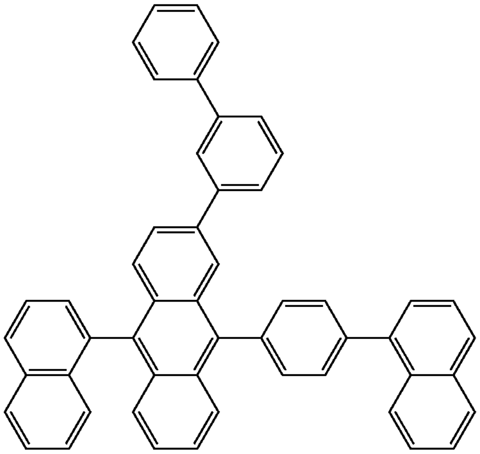
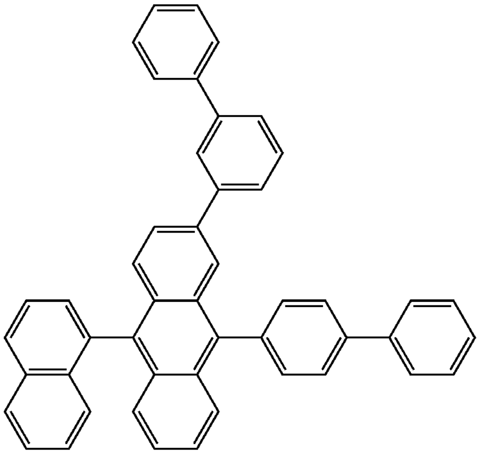
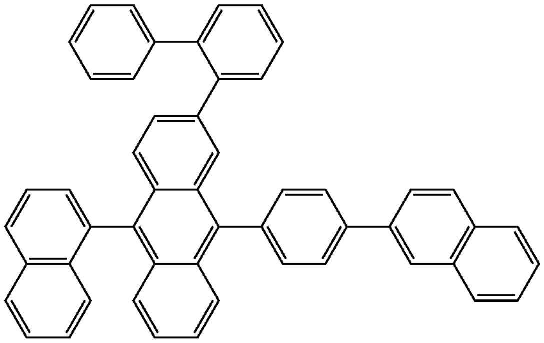
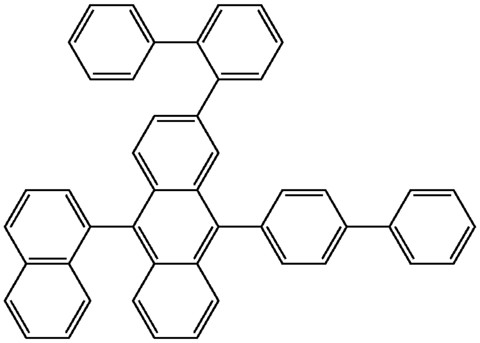

-continued
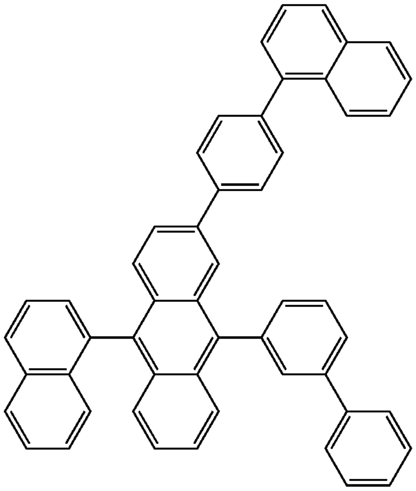
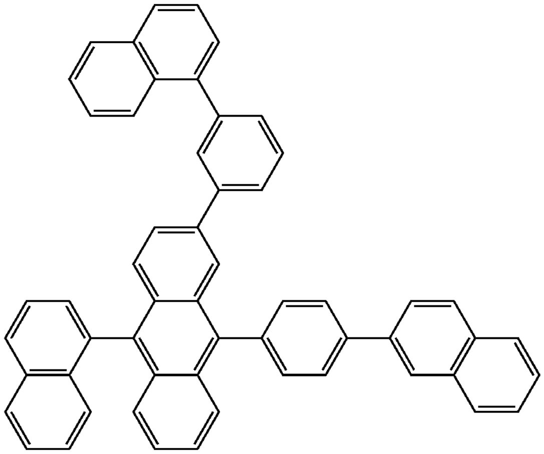
[Formula 132]
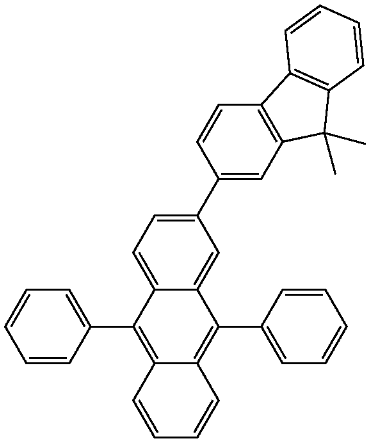
-continued
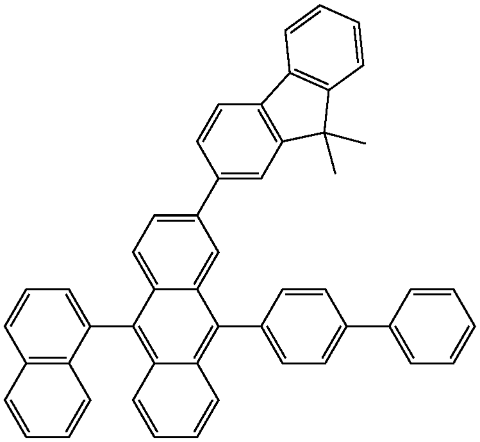
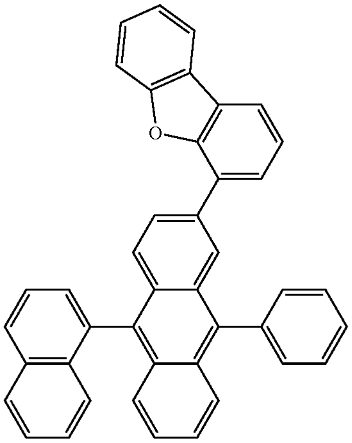
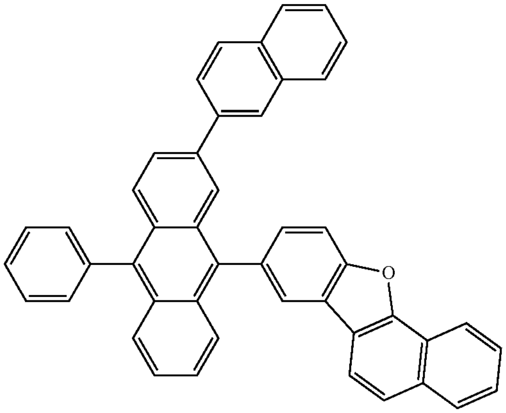
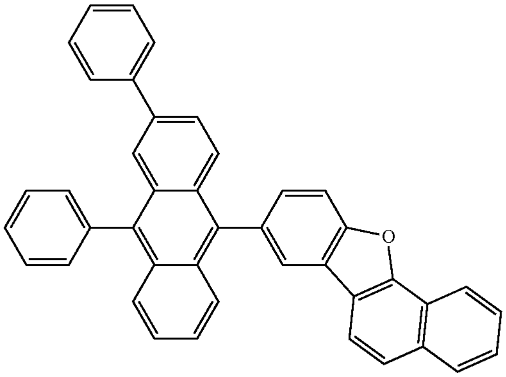

-continued
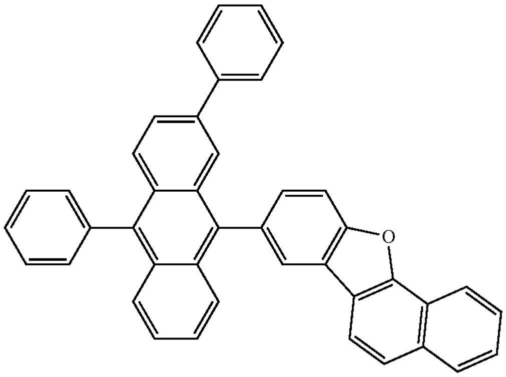
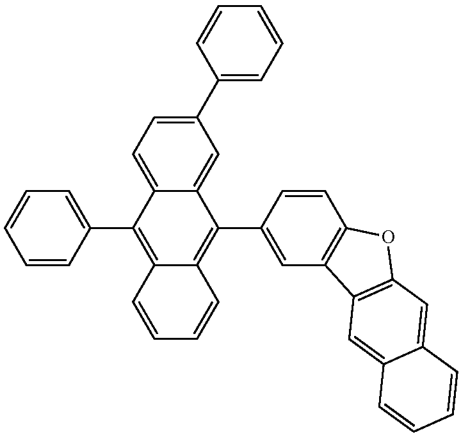
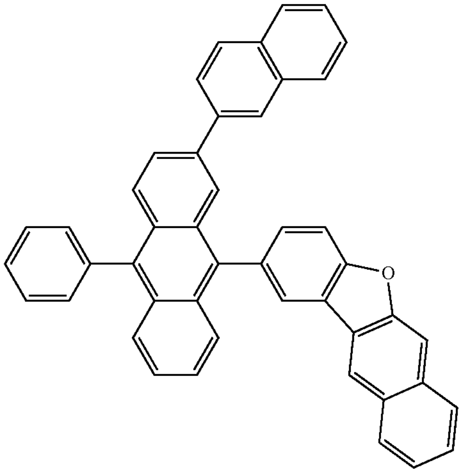
-continued
[Formula 133]
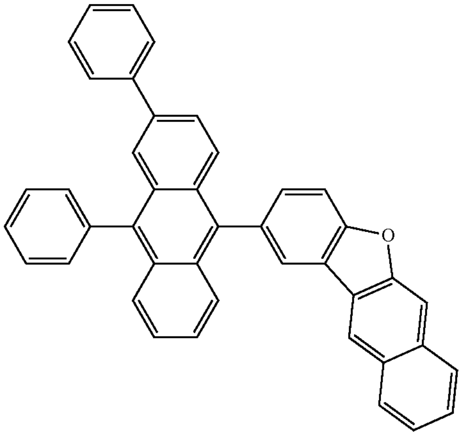
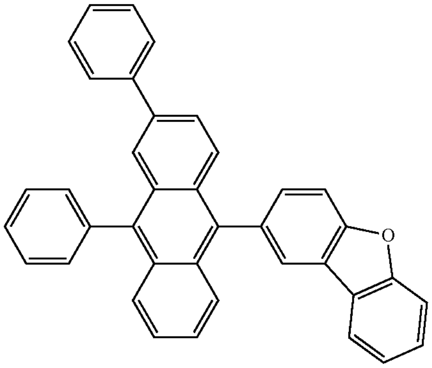
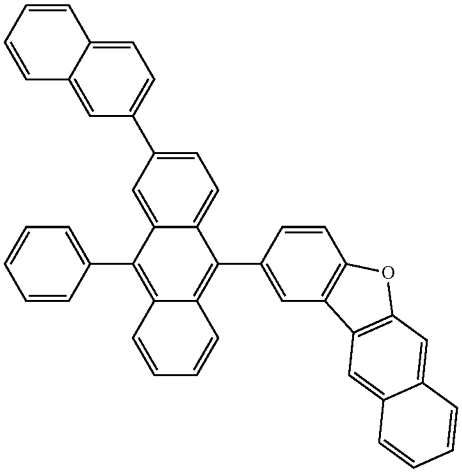
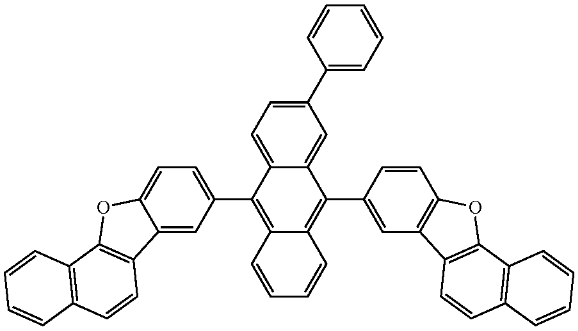

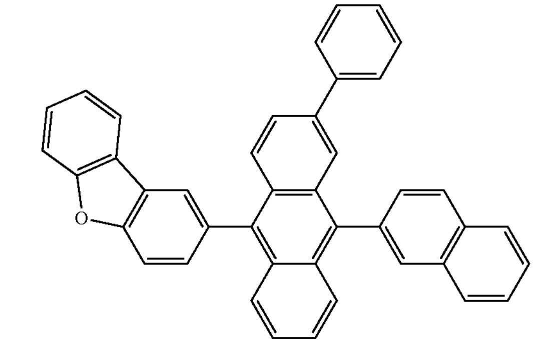
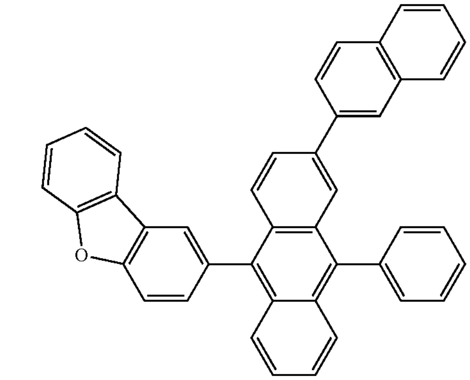
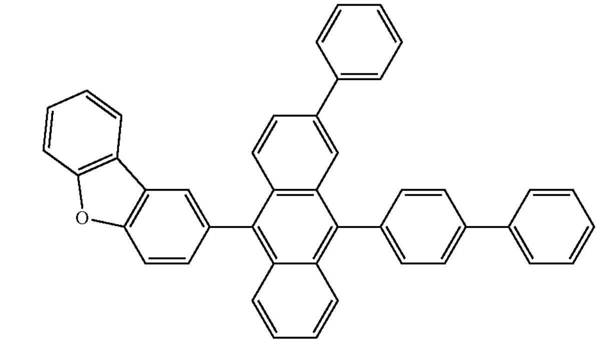
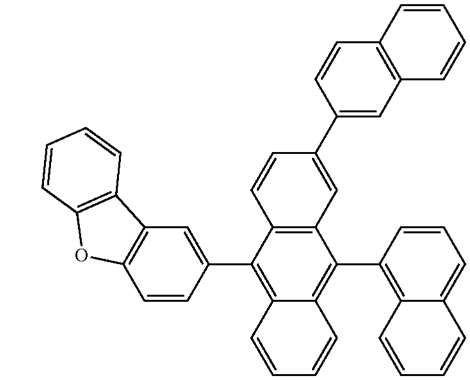
[Formula 134]
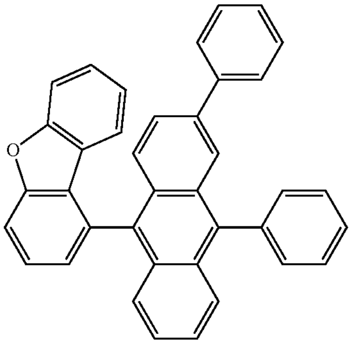
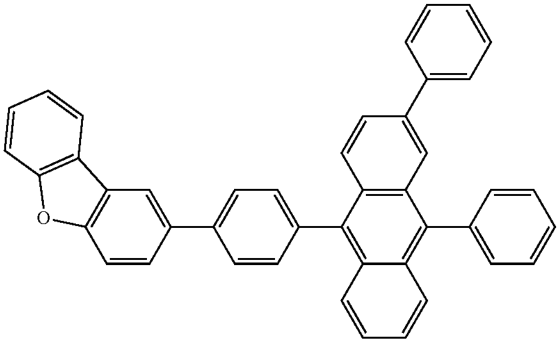
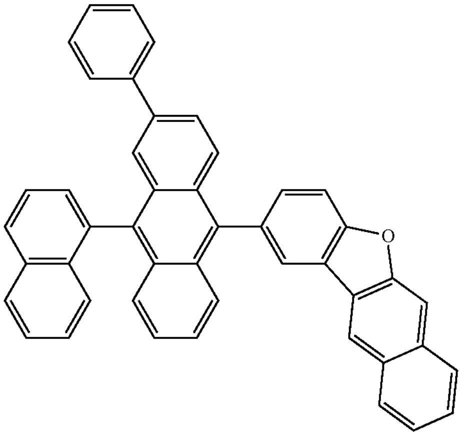
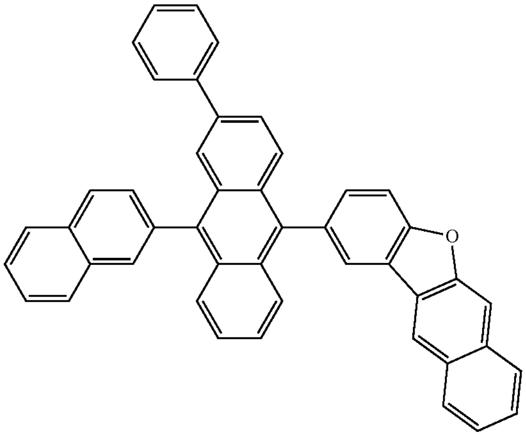

-continued
[Formula 135]
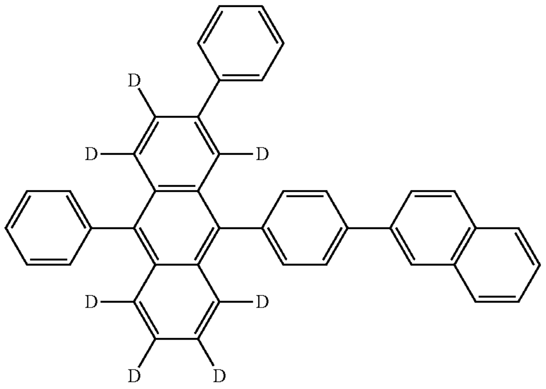
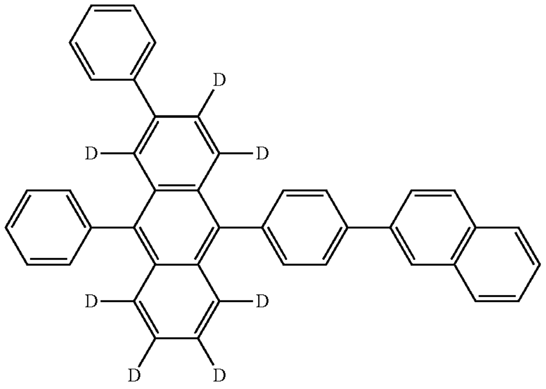
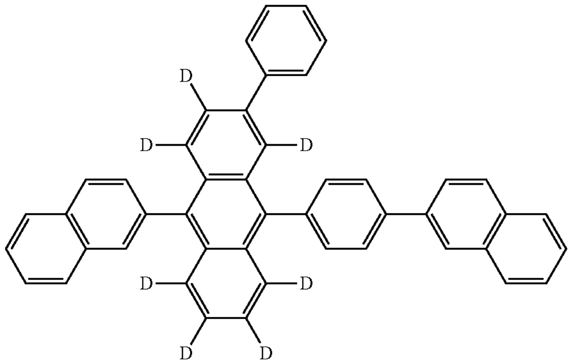
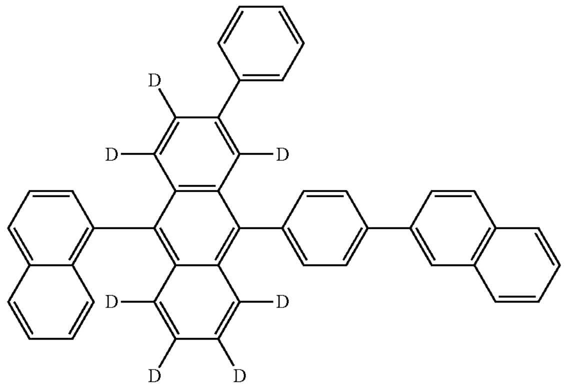
-continued
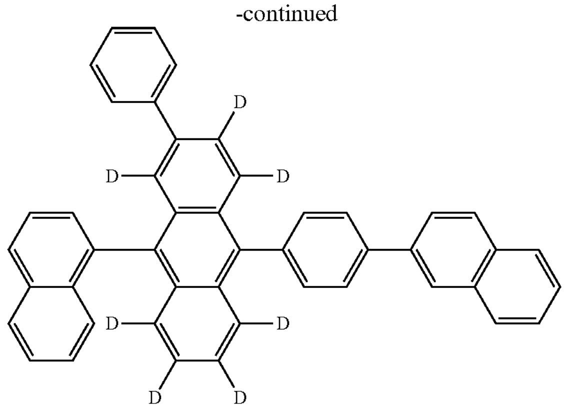
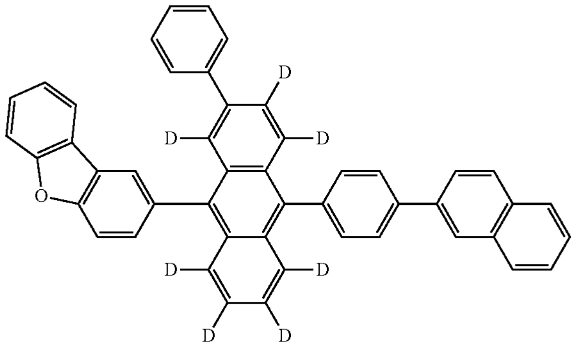
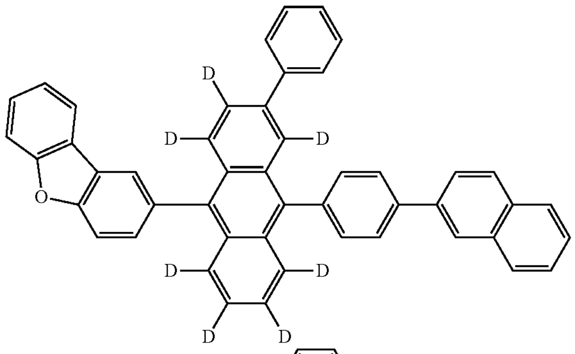
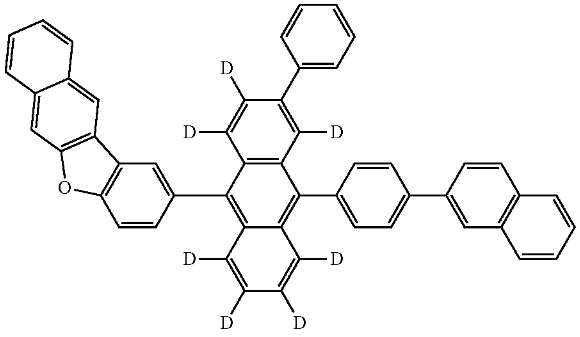
Compound Represented by Formula (1)
In each of the exemplary embodiments, it is also preferable that the second host material is, for example, a compound represented by the following formula (1).

[Formula 136]

(1)

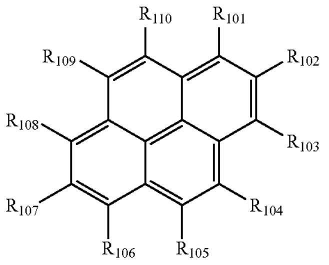

(11)

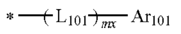

In the formula (1):

$R_{101}$ to $R_{110}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(═O)$R_{801}$, a group represented by —COO$R_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (11);

at least one of $R_{101}$ to $R_{110}$ is a group represented by the formula (11);

when a plurality of groups represented by the formula (11) are present, the plurality of groups represented by the formula (11) are mutually the same or different;

$L_{101}$ is a single bond, a substituted or unsubstituted arylene group having 6 to 50 ring carbon atoms, or a substituted or unsubstituted divalent heterocyclic group having 5 to 50 ring atoms;

$Ar_{101}$ is a substituted or unsubstituted aryl group having 6 to 50 ring carbon atoms, or a substituted or unsubstituted heterocyclic group having 5 to 50 ring atoms;

mx is 0, 1, 2, 3, 4, or 5;

when two or more $L_{101}$ are present, the two or more $L_{101}$ are mutually the same or different;

when two or more $Ar_{101}$ are present, the two or more $Ar_{101}$ are mutually the same or different; and

* in the formula (11) represents a bonding position to a pyrene ring in the formula (1).

In the compounds for the first host material, the second host material, and the third host material: $R_{901}$, $R_{902}$, $R_{903}$, $R_{904}$, $R_{905}$, $R_{906}$, $R_{907}$, $R_{801}$, and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

In the organic EL device according to the present exemplary embodiment, the group represented by the above formula (11) is preferably a compound represented by the following formula (111).

[Formula 137]

(111)

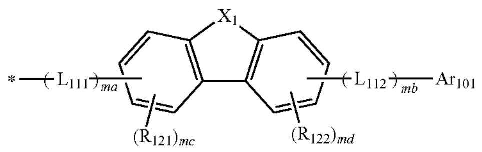

In the formula (111):

$X_1$ is $CR_{123}R_{124}$, an oxygen atom, a sulfur atom, or $NR_{125}$;

$L_{111}$ and $L_{112}$ are each independently a single bond, a substituted or unsubstituted arylene group having 6 to 50 ring carbon atoms, or a substituted or unsubstituted divalent heterocyclic group having 5 to 50 ring atoms;

ma is 0, 1, 2, 3, or 4;

mb is 0, 1, 2, 3, or 4;

ma+mb is 0, 1, 2, 3, or 4;

$Ar_{101}$ represents the same as $Ar_{101}$ in the formula (11);

$R_{121}$, $R_{122}$, $R_{123}$, $R_{124}$ and $R_{125}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(═O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

mc is 3;

three $R_{121}$ are mutually the same or different;

md is 3; and three $R_{122}$ are mutually the same or different.

Among positions *1 to *8 of carbon atoms in a cyclic structure represented by a formula (111a) below in the group represented by the formula (111), $L_{111}$ is bonded to one of the positions *1 to *4, $R_{121}$ is bonded to each of three positions of the rest of *1 to *4, $L_{112}$ is bonded to one of the positions *5 to *8, and $R_{122}$ is bonded to each of three positions of the rest of *5 to *8.

[Formula 138]

(111a)

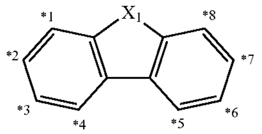

For instance, in the group represented by the formula (111), when $Li_1$ is bonded to a carbon atom at a position *2 in the cyclic structure represented by the formula (111a) and $L_{112}$ is bonded to a carbon atom at a position *7 in the cyclic structure represented by the formula (111a), the group represented by the formula (111) is represented by a formula (111 b) below.

[Formula 139]

(111b)

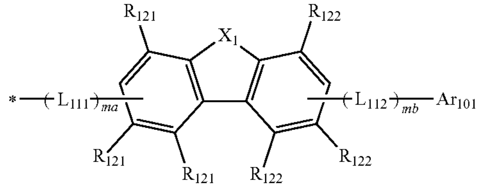

In the formula (111b):

$X_1$, $L_{111}$, $L_{112}$, ma, mb, $Ar_{101}$, $R_{121}$, $R_{122}$, $R_{123}$, $R_{124}$, and $R_{125}$ each independently represent the same as $X_1$, $L_{111}$, $L_{112}$, ma, mb, $Ar_{101}$, $R_{121}$, $R_{122}$, $R_{123}$, $R_{124}$, and $R_{125}$ in the formula (111);

a plurality of $R_{121}$ are mutually the same or different; and a plurality of $R_{122}$ are mutually the same or different.

In the organic EL device according to the present exemplary embodiment, the group represented by the formula (111) is preferably the group represented by the formula (111b).

In the organic EL device according to the present exemplary embodiment, it is preferable that ma is 0, 1, or 2 and that mb is 0, 1, or 2.

In the organic EL device according to the present exemplary embodiment, it is preferable that ma is 0 or 1 and that mb is 0 or 1.

In the organic EL device according to the present exemplary embodiment, $Ar_{101}$ is preferably a substituted or unsubstituted aryl group having 6 to 50 ring carbon atoms.

In the organic EL device according to the present exemplary embodiment, $Ar_{101}$ is preferably a substituted or unsubstituted phenyl group, a substituted or unsubstituted naphthyl group, a substituted or unsubstituted biphenyl group, a substituted or unsubstituted terphenyl group, a substituted or unsubstituted pyrenyl group, a substituted or unsubstituted phenanthryl group, or a substituted or unsubstituted fluorenyl group.

In the organic EL device according to the present exemplary embodiment, it is also preferable that $Ar_{101}$ is a group represented by the following formula (12), (13), or (14).

[Formula 140]

(12)

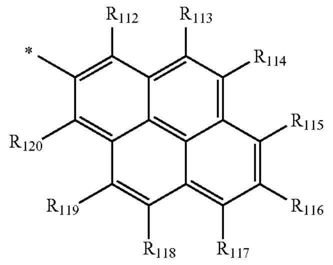

(13)

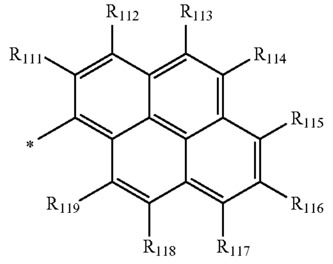

(14)

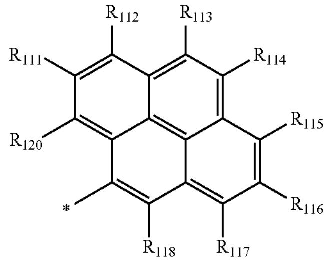

In the formulae (12), (13), and (14):

$R_{111}$ to $R_{120}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a substituted or unsubstituted aralkyl group having 7 to 50 carbon atoms, a group represented by $-C(=O)R_{124}$, a group represented by $-COOR_{125}$, a halogen atom, a cyano group, a nitro group, a substituted or unsubstituted aryl group having 6 to 50 ring carbon atoms, or a substituted or unsubstituted heterocyclic group having 5 to 50 ring atoms; and

* in the formulae (12), (13) and (14) represents a bonding position to $L_{101}$ in the formula (11), or a bonding position to $L_{112}$ in the formula (111) or (111b).

In the organic EL device according to the present exemplary embodiment, it is preferable that the compound represented by the formula (1) is represented by the following formula (101).

[Formula 141]

(101)

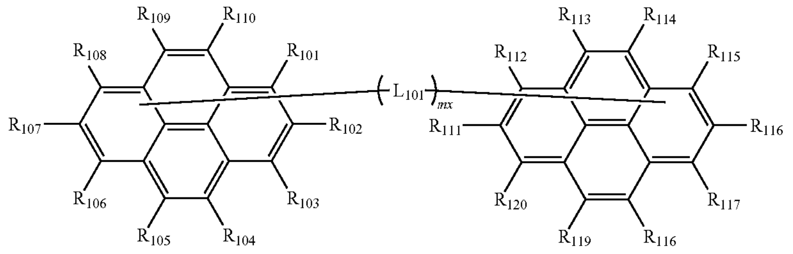

In the formula (101):

$R_{101}$ to $R_{120}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a substituted or unsubstituted aralkyl group having 7 to 50 carbon atoms, a group represented by —$C(=O)R_{801}$, a group represented by —$COOR_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

one of $R_{101}$ to $R_{110}$ represents a bonding position to $L_{101}$, and one of $R_{111}$ to $R_{120}$ represents a bonding position to $L_{101}$;

$L_{101}$ is a single bond, a substituted or unsubstituted arylene group having 6 to 50 ring carbon atoms, or a substituted or unsubstituted divalent heterocyclic group having 5 to 50 ring atoms;

mx is 0, 1, 2, 3, 4, or 5; and when two or more $L_{101}$ are present, the two or more $L_{101}$ are mutually the same or different.

In the organic EL device according to the present exemplary embodiment, $L_{101}$ is preferably a single bond or a substituted or unsubstituted arylene group having 6 to 50 ring carbon atoms.

In the organic EL device according to the present exemplary embodiment, it is preferable that the compound represented by the formula (1) is represented by the following formula (102).

In the formula (102):

$R_{101}$ to $R_{120}$ each independently represent the same as $R_{101}$ to $R_{120}$ in the formula (101);

one of $R_{101}$ to $R_{110}$ represents a bonding position to $L_{111}$, and one of $R_{111}$ to $R_{120}$ represents a bonding position to $L_{112}$;

$X_1$ is $CR_{123}R_{124}$, an oxygen atom, a sulfur atom, or $NR_{125}$;

$L_{111}$ and $L_{112}$ are each independently a single bond, a substituted or unsubstituted arylene group having 6 to 50 ring carbon atoms, or a substituted or unsubstituted divalent heterocyclic group having 5 to 50 ring atoms;

ma is 0, 1, 2, 3, or 4;

mb is 0, 1, 2, 3, or 4;

ma+mb is 0, 1, 2, 3, or 4;

$R_{121}$, $R_{122}$, $R_{123}$, $R_{124}$ and $R_{125}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a substituted or unsubstituted aralkyl group having 7 to 50 carbon atoms, a group represented by —$C(=O)R_{801}$, a group represented by —$COOR_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

mc is 3;

three $R_{121}$ are mutually the same or different;

md is 3; and

[Formula 142]

(102)

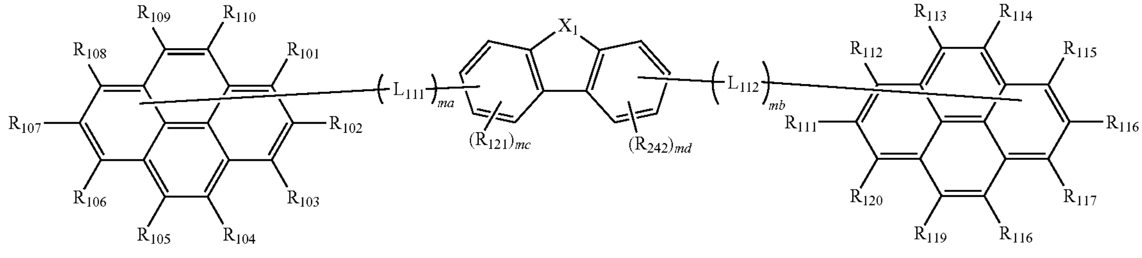

three $R_{122}$ are mutually the same or different.

In the compound represented by the formula (102), it is preferable that ma is 0, 1, or 2 and that mb is 0, 1, or 2.

In the formula represented by the formula (102), it is preferable that ma is 0 or 1 and that mb is 0 or 1.

In the organic EL device according to the present exemplary embodiment, it is preferable that two or more of $R_{101}$ to $R_{110}$ are each a group represented by the formula (11).

In the organic EL device according to the present exemplary embodiment, it is preferable that two or more of $R_{101}$ to $R_{110}$ are each a group represented by the formula (11) and that $Ar_{101}$ is a substituted or unsubstituted aryl group having 6 to 50 ring carbon atoms.

In the organic EL device according to the present exemplary embodiment, it is preferable that $Ar_{101}$ is not a substituted or unsubstituted pyrenyl group, that $L_{101}$ is not a substituted or unsubstituted pyrenylene group, and that each substituted or unsubstituted aryl group having 6 to 50 ring carbon atoms that serves as any of $R_{101}$ to $R_{110}$ that are not the group represented by the formula (11) is not a substituted or unsubstituted pyrenyl group.

In the organic EL device according to the present exemplary embodiment, it is preferable that $R_{101}$ to $R_{110}$ that are not the group represented by the formula (11) are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

In the organic EL device according to the present exemplary embodiment, it is preferable that $R_{101}$ to $R_{110}$ that are not the group represented by the formula (11) are each independently a hydrogen atom, a substituted or unsubstituted alkyl group having 1 to 50 carbon atoms, or a substituted or unsubstituted cycloalkyl group having 3 to 50 ring carbon atoms.

In the organic EL device according to the present exemplary embodiment, it is preferable that $R_{101}$ to $R_{110}$ that are not the group represented by the formula (11) are each a hydrogen atom.

Compound Represented by Formula (1X) In the organic EL device according to each exemplary embodiment, it is also preferable that the second host material is, for example, a compound represented by the following formula (1X).

[Formula 143]

(1X)

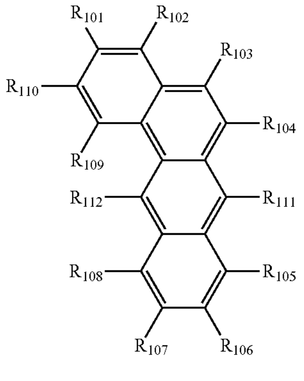

(11X)

$*-(L_{101})_{mx}-Ar_{101}$

In the formula (1X):

$R_{101}$ to $R_{112}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (11X); at least one of $R_{101}$ to $R_{112}$ is a group represented by the formula (11X);

when a plurality of groups represented by the formula (11X) are present, the plurality of groups represented by the formula (11X) are mutually the same or different;

$L_{101}$ is a single bond, a substituted or unsubstituted arylene group having 6 to 50 ring carbon atoms, or a substituted or unsubstituted divalent heterocyclic group having 5 to 50 ring atoms; $Ar_{101}$ is a substituted or unsubstituted aryl group having 6 to 50 ring carbon atoms, or a substituted or unsubstituted heterocyclic group having 5 to 50 ring atoms;

mx is 1, 2, 3, 4, or 5;

when two or more $L_{101}$ are present, the two or more $L_{101}$ are mutually the same or different;

when two or more $Ar_{101}$ are present, the two or more $Ar_{101}$ are mutually the same or different; and

* in the formula (11X) represents a bonding position to a benz[a]anthracene ring in the formula (1X).

In the organic EL device according to the present exemplary embodiment, the compound represented by the formula (11X) is preferably a compound represented by the following formula (111X).

[Formula 144]

(111X)

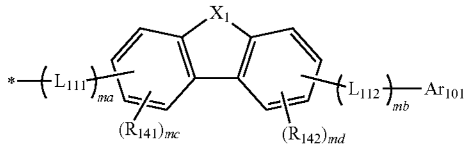

In the formula (111X):

$X_1$ is $CR_{143}R_{144}$, an oxygen atom, a sulfur atom, or $NR_{145}$;

$L_{111}$ and $L_{112}$ are each independently a single bond, a substituted or unsubstituted arylene group having 6 to 50 ring carbon atoms, or a substituted or unsubstituted divalent heterocyclic group having 5 to 50 ring atoms;

ma is 1, 2, 3 or 4;

mb is 1, 2, 3 or 4;

ma+mb is 2, 3, or 4;

$Ar_{101}$ represents the same as $Ar_{101}$ in the formula (11X);

$R_{141}$, $R_{142}$, $R_{143}$, $R_{144}$ and $R_{145}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

mc is 3;

three $R_{141}$ are mutually the same or different;

md is 3; and three $R_{142}$ are mutually the same or different.

Among positions *1 to *8 of carbon atoms in a cyclic structure represented by a formula (111aX) below in the group represented by the formula (111X), $L_{111}$ is bonded to one of the positions *1 to *4, $R_{141}$ is bonded to each of three positions of the rest of *1 to *4, $L_{112}$ is bonded to one of the positions *5 to *8, and $R_{142}$ is bonded to each of three positions of the rest of *5 to *8.

[Formula 145]

(111aX)

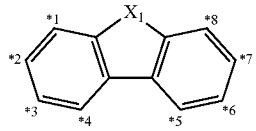

For instance, in the group represented by the formula (111X), when $L_{111}$ is bonded to a carbon atom at *2 in the cyclic structure represented by the formula (111aX) and $L_{112}$ is bonded to a carbon atom at *7 in the cyclic structure represented by the formula (111aX), the group represented by the formula (111X) is represented by a formula (111bX) below.

[Formula 146]

(111bX)

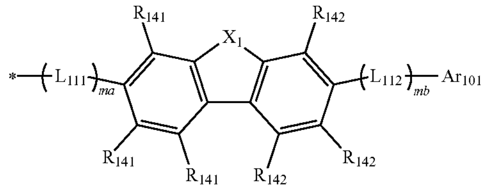

In the formula (111 bX):

$X_1$, $L_{111}$, $L_{112}$, ma, mb, $Ar_{101}$, $R_{141}$, $R_{142}$, $R_{143}$, $R_{144}$ and $R_{145}$ each independently represent the same as $X_1$, $L_{111}$, $L_{112}$, ma, mb, $Ar_{101}$, $R_{141}$, $R_{142}$, $R_{143}$, $R_{144}$ and $R_{145}$ in the formula (111X);

a plurality of $R_{141}$ are mutually the same or different; and a plurality of $R_{142}$ are mutually the same or different.

In the organic EL device according to the present exemplary embodiment, the group represented by the formula (111X) is preferably the group represented by the formula (111bX).

In the compound represented by the formula (1X), preferably, ma is 1 or 2 and mb is 1 or 2.

In the compound represented by the formula (1X), preferably, ma is 1 and mb is 1.

In the compound represented by the formula (1X), $Ar_{101}$ is preferably a substituted or unsubstituted aryl group having 6 to 50 ring carbon atoms.

In the compound represented by the formula (1X), $Ar_{101}$ is preferably a substituted or unsubstituted phenyl group, a substituted or unsubstituted naphthyl group, a substituted or unsubstituted biphenyl group, a substituted or unsubstituted terphenyl group, a substituted or unsubstituted benz[a]anthryl group, a substituted or unsubstituted pyrenyl group, a substituted or unsubstituted phenanthryl group, or a substituted or unsubstituted fluorenyl group.

The compound represented by the formula (1X) is also preferably represented by a formula (101X) below.

[Formula 147]

(101X)

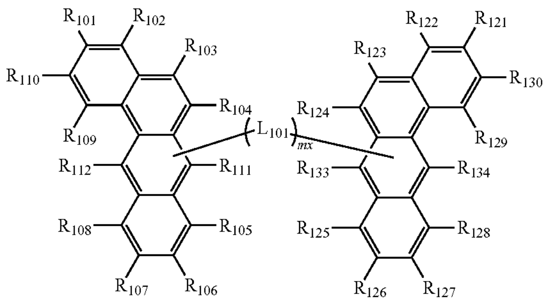

In the formula (101X):

one of $R_{111}$ and $R_{112}$ represents a bonding position to $L_{101}$ and one of $R_{133}$ and $R_{134}$ represents a bonding position to $L_{101}$;

$R_{101}$ to $R_{110}$, $R_{121}$ to $R_{130}$, $R_{111}$ or $R_{112}$ not being the bonding position to $L_{101}$, and $R_{133}$ or $R_{134}$ not being the bonding position to $L_{101}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

$L_{101}$ is a single bond, a substituted or unsubstituted arylene group having 6 to 50 ring carbon atoms, or a substituted or unsubstituted divalent heterocyclic group having 5 to 50 ring atoms;

mx is 1, 2, 3, 4, or 5; and when two or more $L_{101}$ are present, the two or more $L_{101}$ are mutually the same or different.

In the compound represented by the formula (1X), $L_{101}$ is preferably a single bond or a substituted or unsubstituted arylene group having 6 to 50 ring carbon atoms.

The compound represented by the formula (1X) is also preferably represented by a formula (102X) below.

[Formula 148]

(102X)

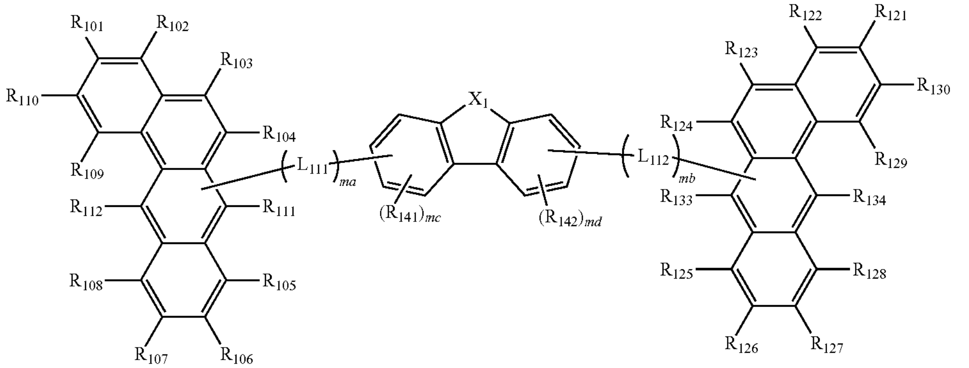

In the formula (102X):

one of $R_{111}$ and $R_{112}$ represents a bonding position to $L_{111}$ and one of $R_{133}$ and $R_{134}$ represents a bonding position to $L_{112}$;

$R_{101}$ to $R_{110}$, $R_{121}$ to $R_{130}$, $R_{111}$ or $R_{112}$ not being the bonding position to $L_{111}$, and $R_{133}$ or $R_{134}$ not being the bonding position to $L_{112}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(═O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

$X_1$ is $CR_{143}R_{144}$, an oxygen atom, a sulfur atom, or $NR_{145}$;

$L_{111}$ and $L_{112}$ are each independently a single bond, a substituted or unsubstituted arylene group having 6 to 50 ring carbon atoms, or a substituted or unsubstituted divalent heterocyclic group having 5 to 50 ring atoms;

ma is 1, 2, 3 or 4;

mb is 1, 2, 3 or 4;

ma+mb is 2, 3, 4, or 5;

$R_{141}$, $R_{142}$, $R_{143}$, $R_{144}$ and $R_{145}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(═O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

mc is 3;

three $R_{141}$ are mutually the same or different;

md is 3; and three $R_{142}$ are mutually the same or different.

In the compound represented by the formula (1X), preferably, ma is 1 or 2 and mb is 1 or 2 in the formula (102X).

In the compound represented by the formula (1X), preferably, ma is 1 and mb is 1 in the formula (102X).

In the compound represented by the formula (1X), the group represented by the formula (11X) is also preferably a group represented by a formula (11AX) or a group represented by a formula (11 BX) below.

[Formula 149]

(11AX)

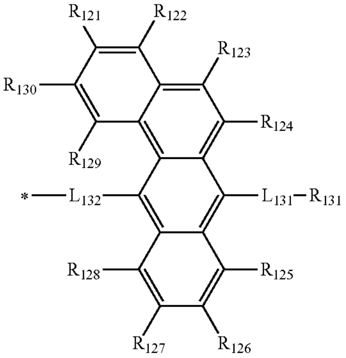

-continued (11BX)

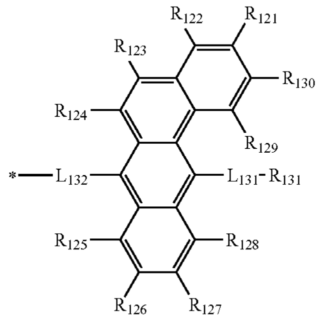

In the formulae (11AX) and (11BX):

$R_{121}$ to $R_{131}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(═O)$R_{801}$, a group represented by —COOR$_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

when a plurality of groups represented by the formula (11AX) are present, the plurality of groups represented by the formula (11AX) are mutually the same or different;

when a plurality of groups represented by the formula (11 BX) are present, the plurality of groups represented by the formula (11 BX) are mutually the same or different;

$L_{131}$ and $L_{132}$ are each independently a single bond, a substituted or unsubstituted arylene group having 6 to 50 ring carbon atoms, or a substituted or unsubstituted divalent heterocyclic group having 5 to 50 ring atoms; and

* in each of the formulae (11AX) and (11BX) represents a bonding position to a benz[a]anthracene ring in the formula (1X).

The compound represented by the formula (1X) is also preferably represented by a formula (103X) below.

[Formula 150]

(103X)

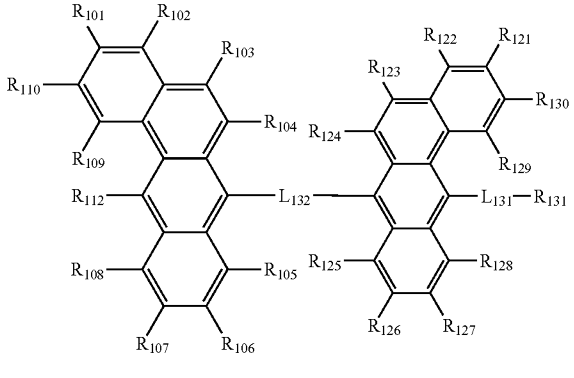

In the formula (103X):

$R_{101}$ to $R_{110}$ and $R_{112}$ respectively represent the same as $R_{101}$ to $R_{110}$ and $R_{112}$ in the formula (1X), and $R_{121}$ to $R_{131}$, $L_{131}$, and $L_{132}$ respectively represent the same as $R_{121}$ to $R_{131}$, $L_{131}$, and $L_{132}$ in the formula (11 BX).

In the compound represented by the formula (1X), $L_{131}$ is also preferably a substituted or unsubstituted arylene group having 6 to 50 ring carbon atoms.

In the compound represented by the formula (1X), $L_{132}$ is also preferably a substituted or unsubstituted arylene group having 6 to 50 ring carbon atoms.

In the compound represented by the formula (1X), it is also preferable that two or more of $R_{101}$ to $R_{112}$ are each the group represented by the formula (11X).

In the compound represented by the formula (1X), it is preferable that two or more of $R_{101}$ to $R_{112}$ are each a group represented by the formula (11X) and $Ar_{101}$ in the formula (11X) is a substituted or unsubstituted aryl group having 6 to 50 ring carbon atoms.

In the compound represented by the formula (1X), it is also preferable that $Ar_{101}$ is not a substituted or unsubstituted benz[a]anthryl group, $L_{101}$ is not a substituted or unsubstituted benz[a]anthrylene group, and, the substituted or unsubstituted aryl group having 6 to 50 ring carbon atoms for $R_{101}$ to $R_{110}$ not being the group represented by the formula (11X) is not a substituted or unsubstituted benz[a]anthryl group.

In the compound represented by the formula (1X), it is preferable that $R_{101}$ to $R_{112}$ that are not the group represented by the formula (11X) are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

In the compound represented by the formula (1X), it is preferable that $R_{101}$ to $R_{112}$ that are not the group represented by the formula (11X) are each a hydrogen atom, a substituted or unsubstituted alkyl group having 1 to 50 carbon atoms, or a substituted or unsubstituted cycloalkyl group having 3 to 50 ring carbon atoms.

In the compound represented by the formula (1X), $R_{101}$ to $R_{112}$ not being the group represented by the formula (11X) are each preferably a hydrogen atom.

Compound Represented by Formula (12X)

In the organic EL device according to each exemplary embodiment, it is also preferable that the second host material is, for example, a compound represented by the following formula (12X).

[Formula 151]

(12X)

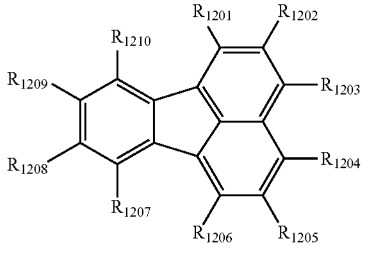

(121)

$*-(L_{1201})_{mx2}-Ar_{1201}$

In the formula (12X):

at least one combination of adjacent two or more of $R_{1201}$ to $R_{1210}$ are mutually bonded to form a substituted or unsubstituted monocyclic ring, or mutually bonded to form a substituted or unsubstituted fused ring;

$R_{1201}$ to $R_{1210}$ forming neither the substituted or unsubstituted monocyclic ring nor the substituted or unsubstituted fused ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a substituted or unsubstituted aralkyl group having 7 to 50 carbon atoms, a group represented by $—C(═O)R_{801}$, a group represented by $—COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (121);

at least one of a substituent, if present, for the substituted or unsubstituted monocyclic ring, a substituent, if present, for the substituted or unsubstituted fused ring, or $R_{1201}$ to $R_{1210}$ is a group represented by the formula (121);

when a plurality of groups represented by the formula (121) are present, the plurality of groups represented by the formula (121) are mutually the same or different;

$L_{1201}$ is a single bond, a substituted or unsubstituted arylene group having 6 to 50 ring carbon atoms, or a substituted or unsubstituted divalent heterocyclic group having 5 to 50 ring atoms;

$Ar_{1201}$ is a substituted or unsubstituted aryl group having 6 to 50 ring carbon atoms, or a substituted or unsubstituted heterocyclic group having 5 to 50 ring atoms;

mx2 is 0, 1, 2, 3, 4, or 5;

when two or more $L_{1201}$ are present, the two or more $L_{1201}$ are mutually the same or different;

when two or more $Ar_{1201}$ are present, the two or more $Ar_{1201}$ are mutually the same or different; and

* in the formula (121) represents a bonding position to a ring represented by the formula (12X).

In the formula (12X), combinations of adjacent two of $R_{1201}$ to $R_{1210}$ refer to a combination of $R_{1201}$ and $R_{1202}$, a combination of $R_{1202}$ and $R_{1203}$, a combination of $R_{1203}$ and $R_{1204}$, a combination of $R_{1204}$ and $R_{1205}$, a combination of $R_{1205}$ and $R_{1206}$, a combination of $R_{1207}$ and $R_{1208}$, a combination of $R_{1208}$ and $R_{1209}$, and a combination of $R_{1209}$ and $R_{1210}$.

Compound Represented by Formula (13X)

In the organic EL device according to each exemplary embodiment, it is also preferable that the second host material is, for example, a compound represented by the following formula (13X).

[Formula 152]

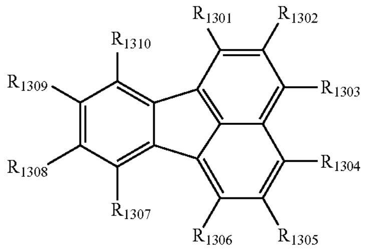

(13X)

$$*—(L_{1301})_{mx3}—Ar_{1301}$$

(131)

In the formula (13X):

$R_{1301}$ to $R_{1310}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a substituted or unsubstituted aralkyl group having 7 to 50 carbon atoms, a group represented by $—C(═O)R_{801}$, a group represented by $—COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (131);

at least one of $R_{1301}$ to $R_{1310}$ is a group represented by the formula (131);

when a plurality of groups represented by the formula (131) are present, the plurality of groups represented by the formula (131) are mutually the same or different;

$L_{1301}$ is a single bond, a substituted or unsubstituted arylene group having 6 to 50 ring carbon atoms, or a substituted or unsubstituted divalent heterocyclic group having 5 to 50 ring atoms;

$Ar_{1301}$ is a substituted or unsubstituted aryl group having 6 to 50 ring carbon atoms, or a substituted or unsubstituted heterocyclic group having 5 to 50 ring atoms;

mx3 is 0, 1, 2, 3, 4, or 5;

when two or more $L_{1301}$ are present, the two or more $L_{1301}$ are mutually the same or different;

when two or more $Ar_{1301}$ are present, the two or more $Ar_{1301}$ are mutually the same or different; and

* in the formula (131) represents a bonding position to a fluoranthene ring represented by the formula (13X).

In the organic EL device according to the present exemplary embodiment, none of combinations of adjacent two or more of $R_{1301}$ to $R_{1310}$ that are not the group represented by the formula (131) are bonded to each other.

Combinations of adjacent two of $R_{1301}$ to $R_{1310}$ in the formula (13X) refer to a combination of $R_{1301}$ and $R_{1302}$, a combination of $R_{1302}$ and $R_{1303}$, a combination of $R_{1303}$ and $R_{1304}$, a combination of $R_{1304}$ and $R_{1305}$, a combination of $R_{1305}$ and $R_{1306}$, a combination of $R_{1307}$ and $R_{1308}$, a combination of $R_{1308}$ and $R_{1309}$, and a combination of $R_{1309}$ and $R_{1310}$.

Compound Represented by Formula (14X)

In the organic EL device according to each exemplary embodiment, it is also preferable that the second host material is, for example, a compound represented by the following formula (14X).

[Formula 153]

(14X)

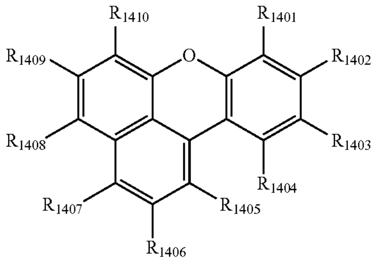

$$*-(L_{1401})_{mx4}-Ar_{1401}$$

(141)

In the formula (14X):

$R_{1401}$ to $R_{1410}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (141);

at least one of $R_{1401}$ to $R_{1410}$ is a group represented by the formula (141);

when a plurality of groups represented by the formula (141) are present, the plurality of groups represented by the formula (141) are mutually the same or different;

$L_{1401}$ is a single bond, a substituted or unsubstituted arylene group having 6 to 50 ring carbon atoms, or a substituted or unsubstituted divalent heterocyclic group having 5 to 50 ring atoms;

$Ar_{1401}$ is a substituted or unsubstituted aryl group having 6 to 50 ring carbon atoms, or a substituted or unsubstituted heterocyclic group having 5 to 50 ring atoms;

mx4 is 0, 1, 2, 3, 4, or 5;

when two or more $L_{1401}$ are present, the two or more $L_{1401}$ are mutually the same or different;

when two or more $Ar_{1401}$ are present, the two or more $Ar_{1401}$ are mutually the same or different; and

* in the formula (141) represents a bonding position to a ring represented by the formula (14X).

Compound Represented by Formula (15X)

In the organic EL device according to each exemplary embodiment, it is also preferable that the second host material is, for example, a compound represented by the following formula (15X).

[Formula 154]

(15X)

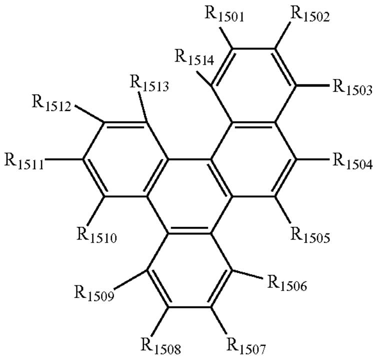

$$*-(L_{1501})_{mx5}-Ar_{1501}$$

(151)

In the formula (15X):

$R_{1501}$ to $R_{1514}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (151);

at least one of $R_{1501}$ to $R_{1514}$ is a group represented by the formula (151);

when a plurality of groups represented by the formula (151) are present, the plurality of groups represented by the formula (151) are mutually the same or different;

$L_{1501}$ is a single bond, a substituted or unsubstituted arylene group having 6 to 50 ring carbon atoms, or a substituted or unsubstituted divalent heterocyclic group having 5 to 50 ring atoms;

$Ar_{1501}$ is a substituted or unsubstituted aryl group having 6 to 50 ring carbon atoms, or a substituted or unsubstituted heterocyclic group having 5 to 50 ring atoms;

mx5 is 0, 1, 2, 3, 4, or 5;

when two or more $L_{1501}$ are present, the two or more $L_{1501}$ are mutually the same or different;

when two or more $Ar_{1501}$ are present, the two or more $Ar_{1501}$ are mutually the same or different; and

* in the formula (151) represents a bonding position to a ring represented by the formula (15X).

Compound Represented by Formula (16X)

In the organic EL device according to each exemplary embodiment, it is also preferable that the second host material is, for example, a compound represented by the following formula (16X).

[Formula 155]

(16X)

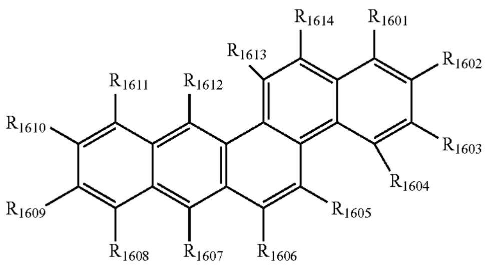

(161)

$* -(L_{1601})_{mx6}- Ar_{1601}$

In the formula (16X):

$R_{1601}$ to $R_{1614}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—($R_{904}$), a group represented by —S—($R_{905}$), a substituted or unsubstituted aralkyl group having 7 to 50 carbon atoms, a group represented by —C(=O)$R_{801}$, a group represented by —$COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (161);

at least one of $R_{1601}$ to $R_{1614}$ is a group represented by the formula (161);

when a plurality of groups represented by the formula (161) are present, the plurality of groups represented by the formula (161) are mutually the same or different;

$L_{1601}$ is a single bond, a substituted or unsubstituted arylene group having 6 to 50 ring carbon atoms, or a substituted or unsubstituted divalent heterocyclic group having 5 to 50 ring atoms;

$Ar_{1601}$ is a substituted or unsubstituted aryl group having 6 to 50 ring carbon atoms, or a substituted or unsubstituted heterocyclic group having 5 to 50 ring atoms;

mx6 is 0, 1, 2, 3, 4, or 5;

when two or more $L_{1601}$ are present, the two or more $L_{1601}$ are mutually the same or different;

when two or more $Ar_{101}$ are present, the two or more $Ar_{1601}$ are mutually the same or different; and

* in the formula (161) represents a bonding position to a ring represented by the formula (16X).

In the organic EL device according to each exemplary embodiment, it is also preferable that the second host material has in its molecule a linking structure including a benzene ring and a naphthalene ring linked to each other through a single bond, that the benzene ring and the naphthalene ring in the linking structure are each independently fused or not fused with a monocyclic ring or a fused ring, and that the benzene ring and the naphthalene ring in the linking structure are further linked to each other by cross-linking at at least one site other than the single bond.

When the second host material has the linking structure including the cross-linking, it can be expected that deterioration of the chromaticity of the organic EL device will be prevented.

It is only necessary that the second host material in this case have, in its molecule, a linking structure including a benzene ring and a naphthalene ring linked through a single bond as shown in a formula ($X_1$) or ($X_2$) below (this structure may be referred to as a benzene-naphthalene linking structure) as a minimum unit.

The benzene ring may be further fused with a monocyclic ring or a fused ring, and the naphthalene ring may be further fused with a monocyclic ring or a fused ring.

For example, even when the second host material has a linking structure including a naphthalene ring and another naphthalene ring linked through a single bond as represented by a formula (X3), (X4), or (X5) below (this structure may be referred to as a naphthalene-naphthalene linking structure), since one of the naphthalene rings includes a benzene ring, the second host material is considered to include the benzene-naphthalene linking structure.

[Formula 156]

(X1)

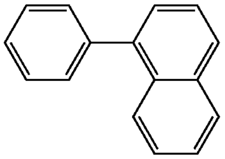

(X2)

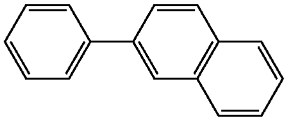

(X3)

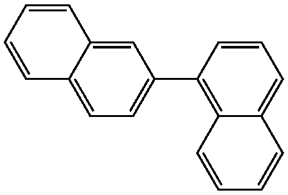

(X4)

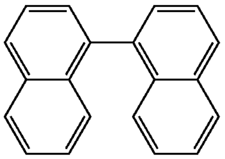

(X5)

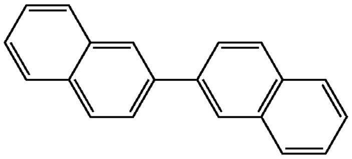

In the organic EL device according to each exemplary embodiment, it is preferable that the cross-linking includes a double bond.

Specifically, the first host material also preferably has a structure in which the benzene ring and the naphthalene ring are further linked to each other at any other site than the single bond by the cross-linking structure including a double bond.

Assuming that the benzene ring and the naphthalene ring in the benzene-naphthalene linking structure are further linked to each other at at least one site other than the single bond by cross-linking, for instance, a linking structure (fused ring) represented by a formula (X11) below is obtained in a case of the formula ($X_1$), and a linking structure (fused ring) represented by a formula (X31) below is obtained in a case of the formula (X3).

Assuming that the benzene ring and the naphthalene ring in the benzene-naphthalene linking structure are further linked to each other at any other site than the single bond by cross-linking including a double bond, for instance, a linking structure (fused ring) represented by a formula (X12) below is obtained in a case of the formula (X1), a linking structure (fused ring) represented by a formula (X21) or formula (X22) below is obtained in a case of the formula (X2), a linking structure (fused ring) represented by a formula (X41) below is obtained in a case of the formula (X4), and a linking structure (fused ring) represented by a formula (X51) below is obtained in a case of the formula (X5).

Assuming that the benzene ring and the naphthalene ring in the benzene-naphthalene linking structure are further linked to each other at at least one site other than the single bond by cross-linking including a hetero atom (e.g., an oxygen atom), for instance, a linking structure (fused ring) represented by a formula (X13) below is obtained in a case of the formula (X1).

[Formula 157]

(X11)

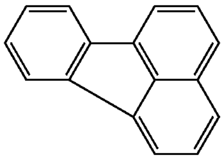

(X12)

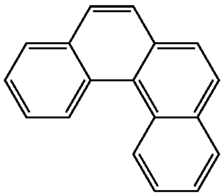

(X13)

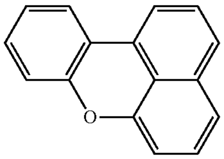

(X22)

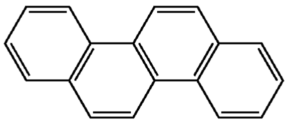

(X23)

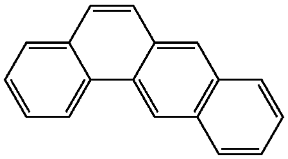

-continued (X31)

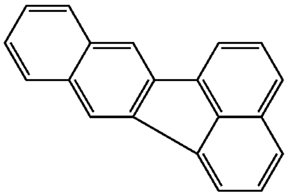

(X41)

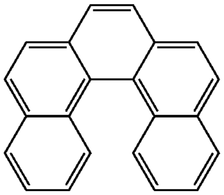

(X51)

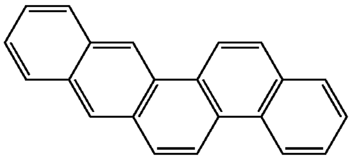

In the organic EL device according to each exemplary embodiment, it is also preferable that the second host material has, in its molecule, a biphenyl structure in which a first benzene ring and a second benzene ring are linked to each other through a single bond and that the first benzene ring and the second benzene ring in the biphenyl structure are further linked to each other by cross-linking at at least one site other than the single bond.

In the organic EL device according to each exemplary embodiment, it is also preferable that the first benzene ring and the second benzene ring in the biphenyl structure are further linked to each other by the cross-linking at one site other than the single bond.

When the second host material has the biphenyl structure including the cross-linking, it can be expected that deterioration of the chromaticity of the organic EL device will be prevented.

In the organic EL device according to each exemplary embodiment, it is also preferable that the cross-linking includes a double bond.

In the organic EL device according to each exemplary embodiment, it is also preferable that the cross-linking includes no double bond.

Also preferably, the first benzene ring and the second benzene ring in the biphenyl structure are further linked to each other by the cross-linking at two sites other than the single bond.

In the organic EL device according to each exemplary embodiment, it is also preferable that the first benzene ring and the second benzene ring in the biphenyl structure are further linked to each other by the cross-linking at two sites other than the single bond and that the cross-linking includes no double bond.

When the second host material has the biphenyl structure including the cross-linking, it can be expected that deterioration of the chromaticity of the organic EL device will be prevented.

For instance, assuming that the first benzene ring and the second benzene ring in the biphenyl structure represented by a formula (BP1) below are further linked to each other by cross-linking at at least one site other than the single bond, the biphenyl structure is exemplified by linking structures (fused rings) represented by formulae (BP11) to (BP15) below.

[Formula 158]

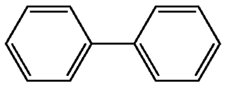
(BP1)

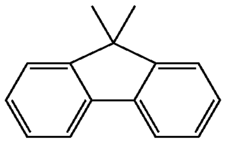
(BP11)

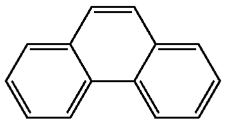
(BP12)

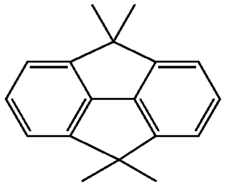
(BP13)

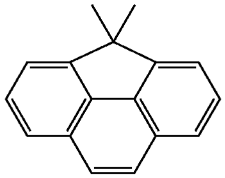
(BP14)

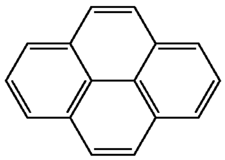
(BP15)

The formula (BP11) represents a linking structure in which the first benzene ring and the second benzene ring are linked to each other at one site other than the single bond by cross-linking including no double bond.

The formula (BP12) represents a linking structure in which the first benzene ring and the second benzene ring are linked to each other at one site other than the single bond by cross-linking including a double bond.

The formula (BP13) represents a linking structure in which the first benzene ring and the second benzene ring are linked to each other at two sites other than the single bond by cross-linking including no double bond.

The formula (BP14) represents a linking structure in which the first benzene ring and the second benzene ring are linked to each other by cross-linking including no double bond at one of two sites other than the single bond, and the first benzene ring and the second benzene ring are linked to each other by cross-linking including a double bond at the other of the two sites other than the single bond.

The formula (BP15) represents a linking structure in which the first benzene ring and the second benzene ring are linked to each other at two sites other than the single bond by cross-linking including a double bond.

In the first host material and the second host material in each of the exemplary embodiments, each "substituted or unsubstituted" group is preferably an "unsubstituted" group.

Methods for Producing Compounds Represented by Formulae (1), (1X), (12X), (13X), (14X), (15X), and (16X)

Each of the compounds represented by the formulae (1), (1X), (12X), (13X), (14X), (15X), and (16X) can be produced using a well-known method.

Each of the compounds represented by the formulae (1), (1X), (12X), (13X), (14X), (15X), and (16X) can also be produced according to a well-known method using a known alternative reaction and raw materials suitable for the target compound.

Specific Examples of Compounds Represented by Formulae (1), (1X), (12X), (13X), (14X), (15X), and (16X)

Specific examples of the compounds represented by the formulae (1), (1X), (12X), (13X), (14X), (15X), and (16X) include compounds shown below.

However, the invention is not limited to these specific examples of the compounds represented by the formulae (1), (1X), (12X), (13X), (14X), (15X), and (16X).

In the specific examples of the compound herein, D represents a deuterium atom, Me represents a methyl group, and tBu represents a tert-butyl group.

[Formula 159]

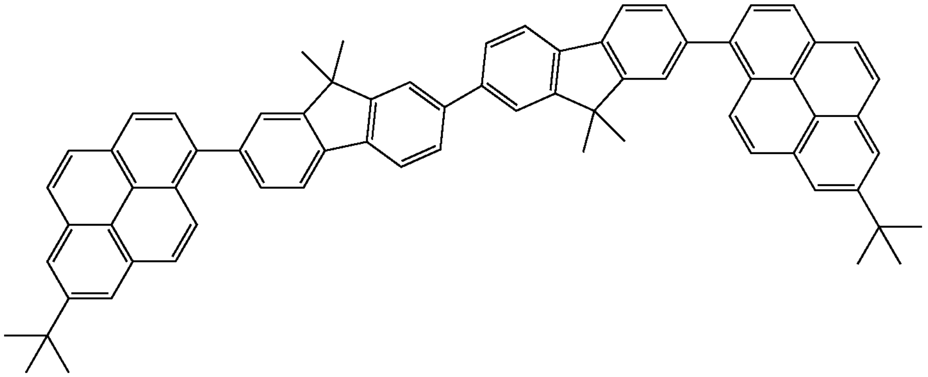

-continued
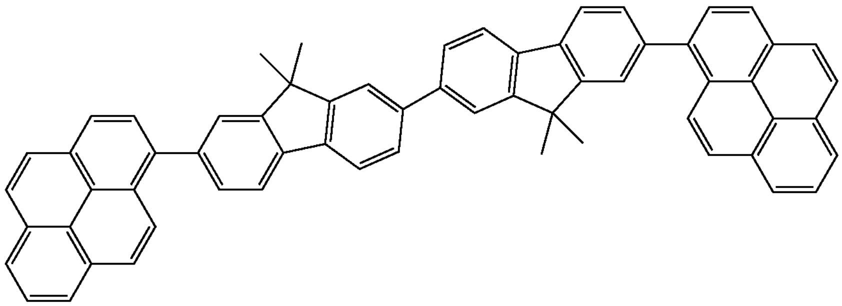
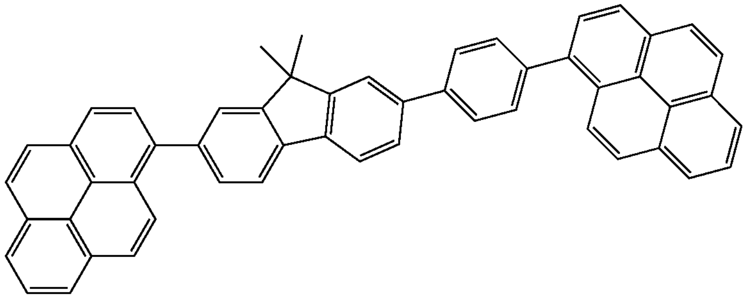
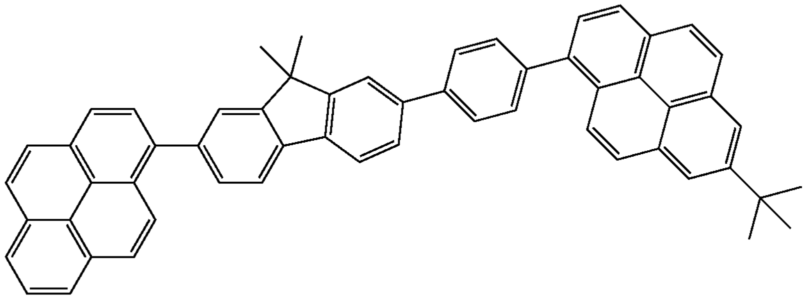
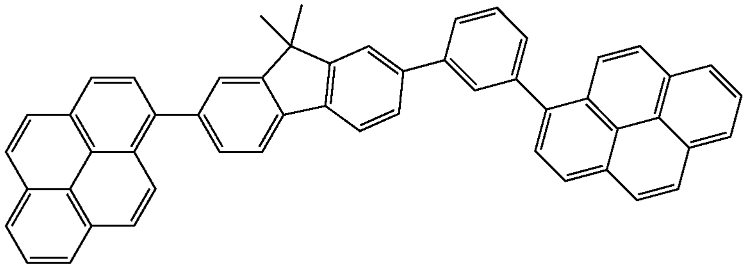
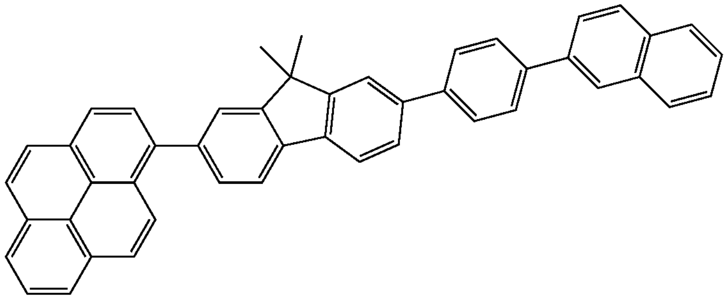

-continued
[Formula 160]
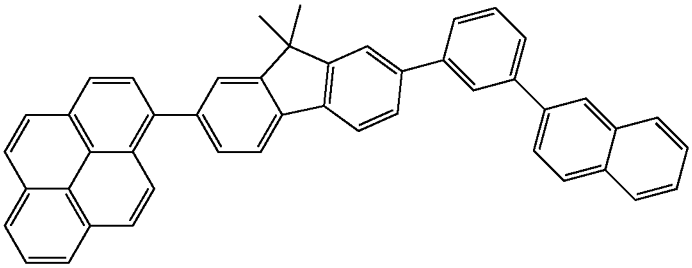
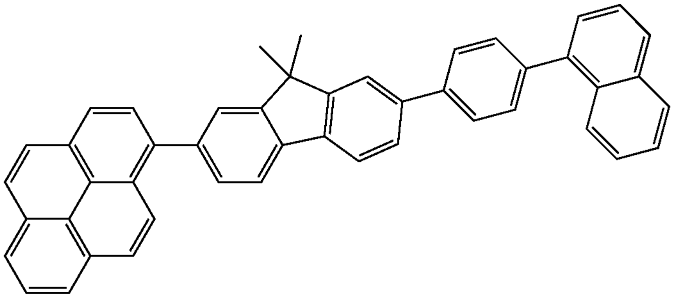
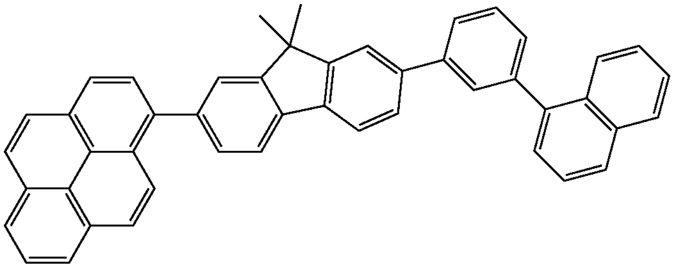
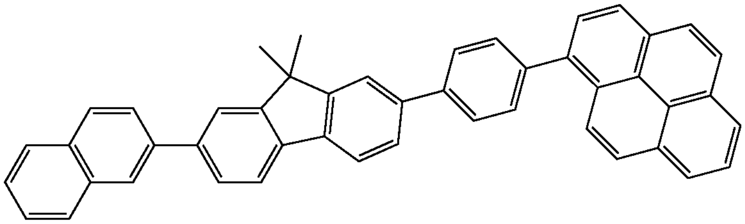
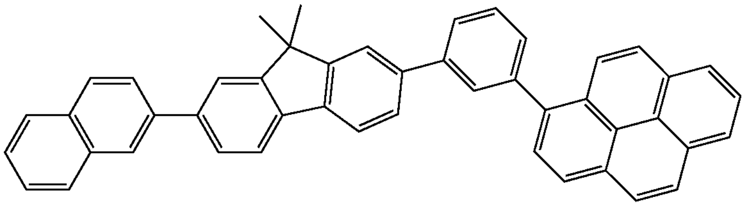
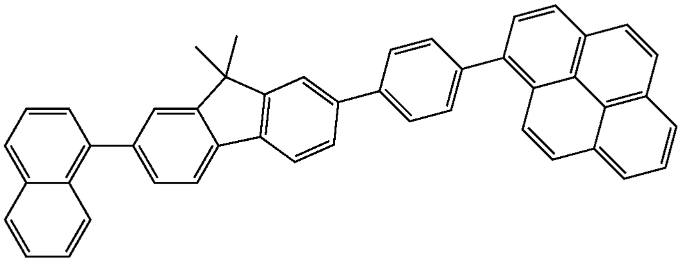

-continued
[Formula 161]
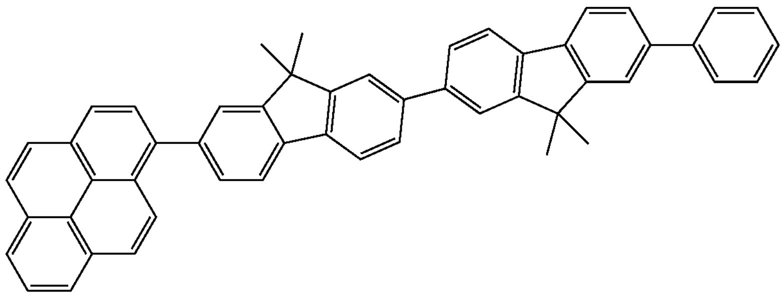
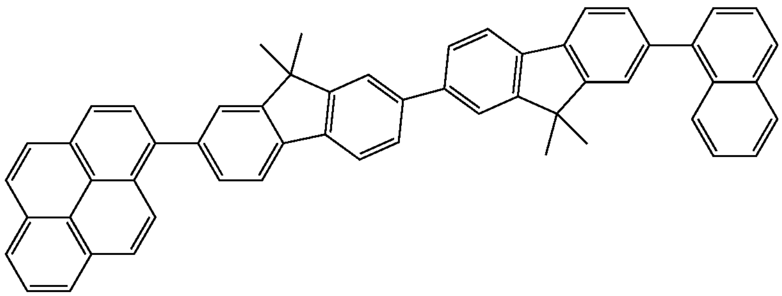
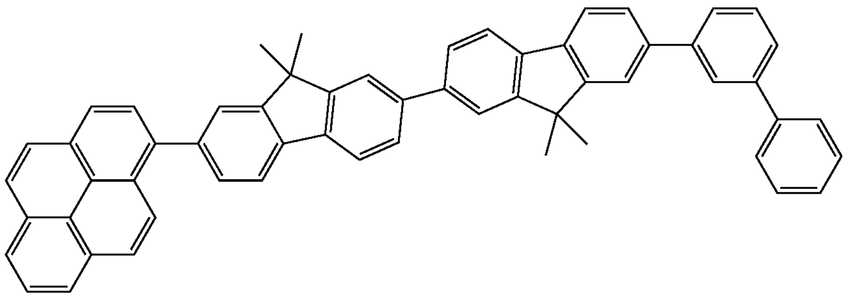
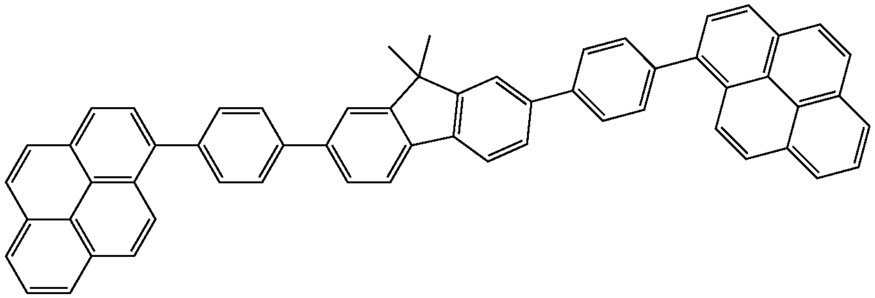
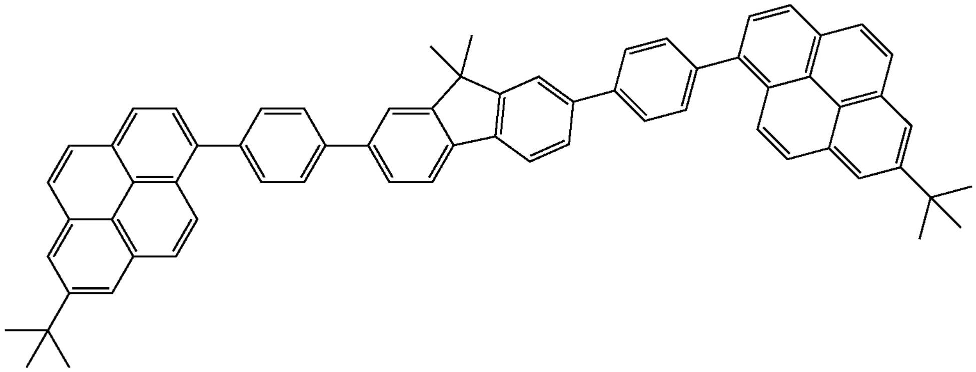

-continued
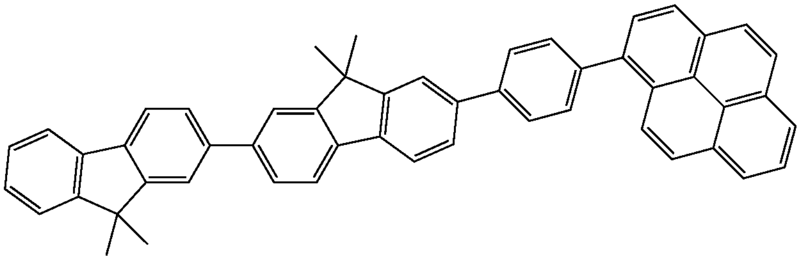
[Formula 162]
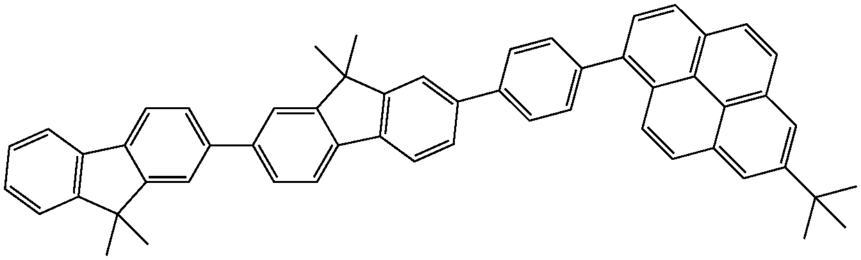
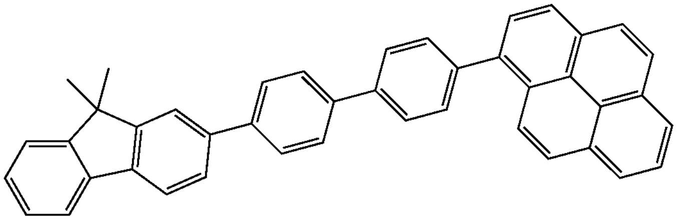
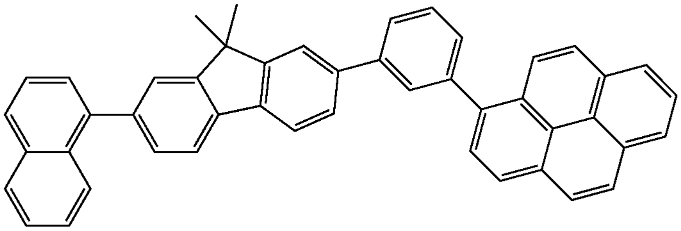
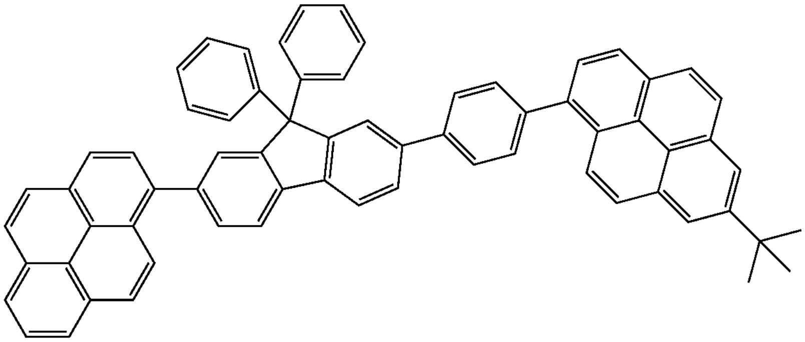
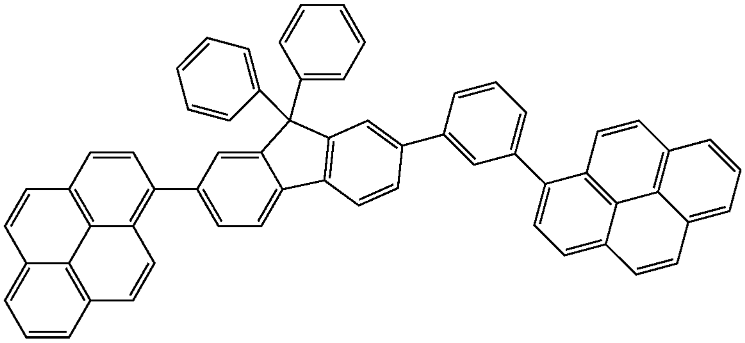

-continued
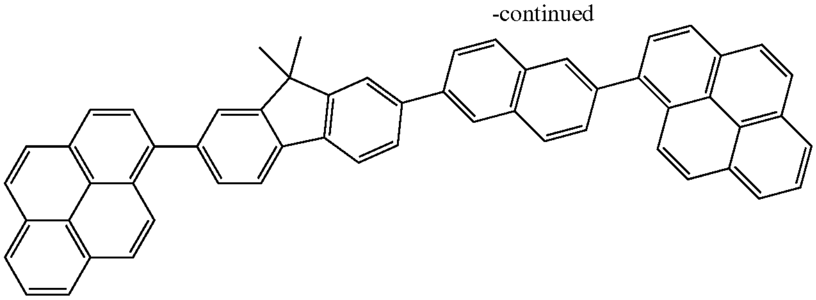
[Formula 163]
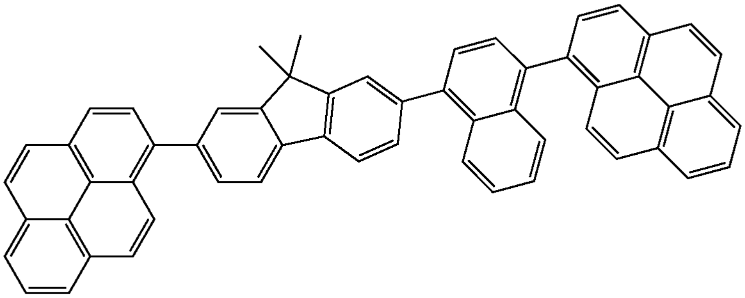
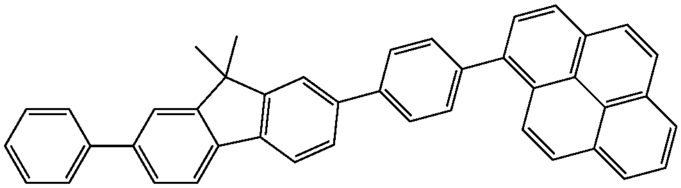
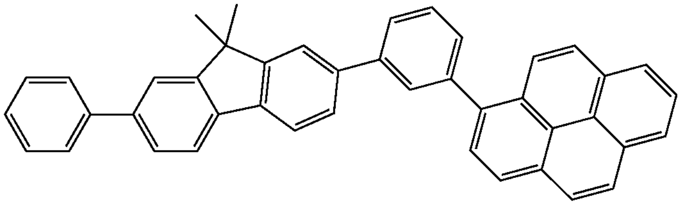
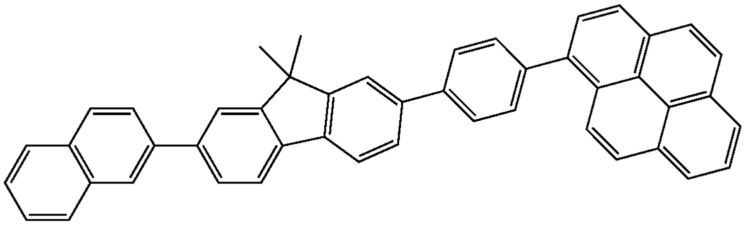
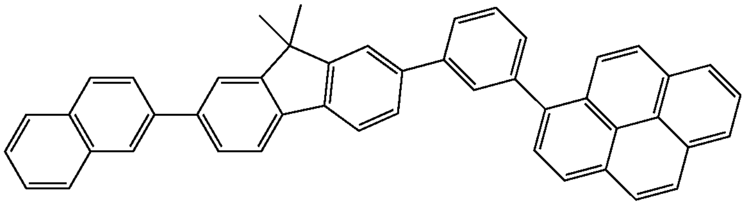
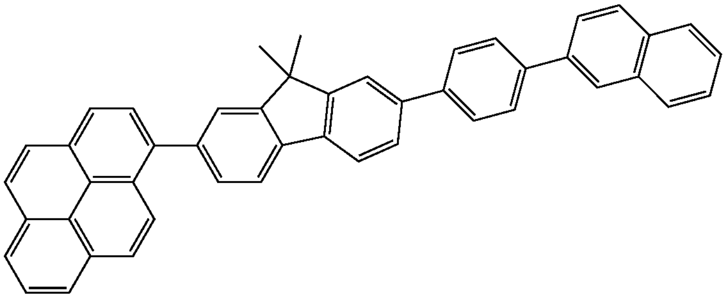

-continued
[Formula 164]
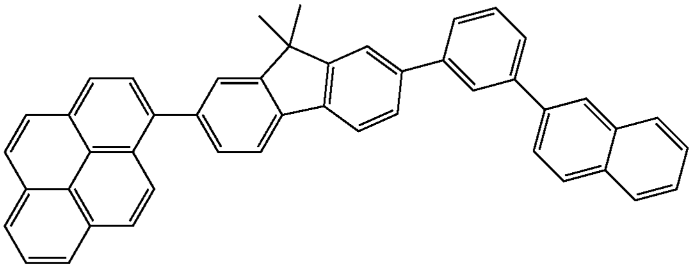
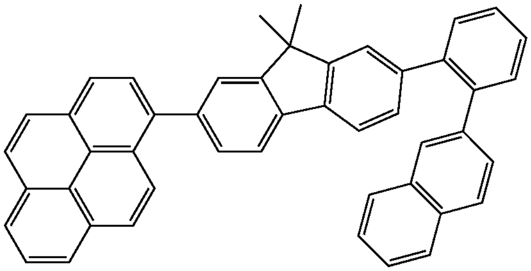
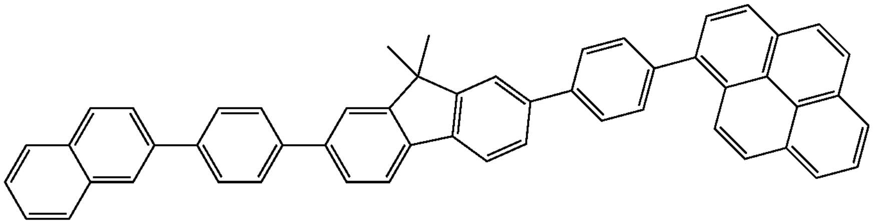
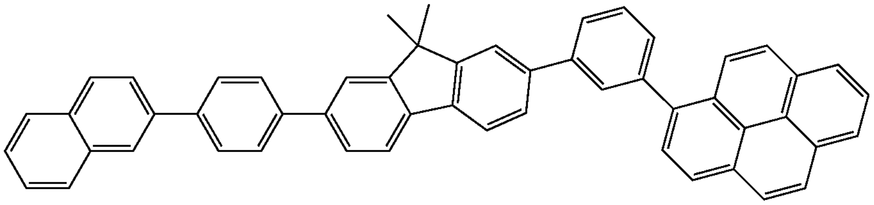
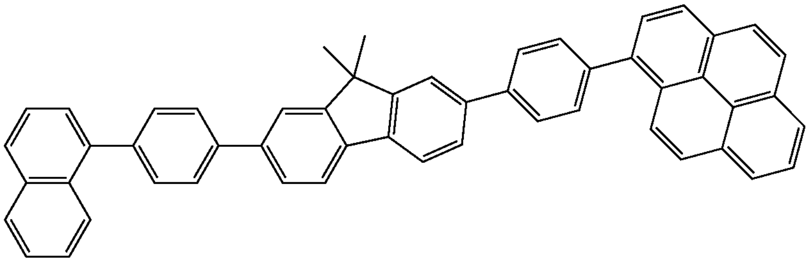
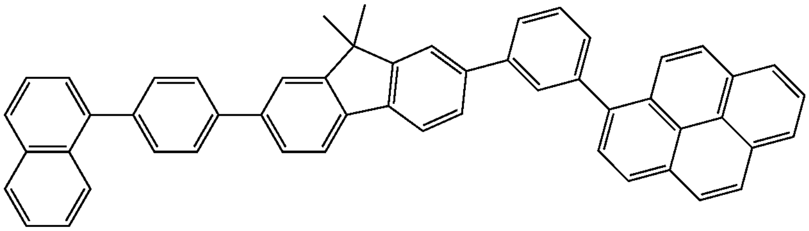

-continued
[Formula 165]
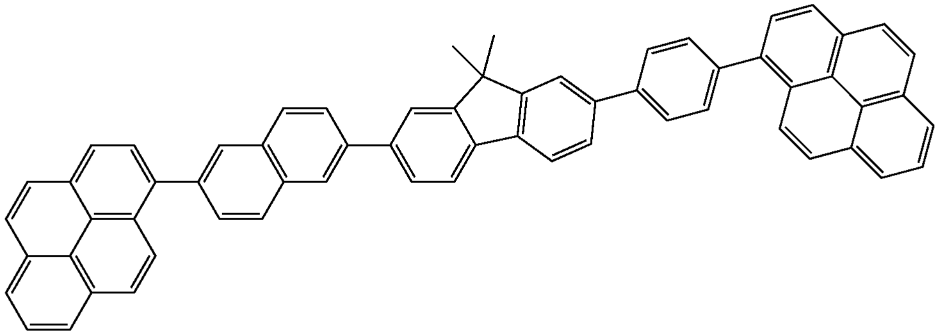
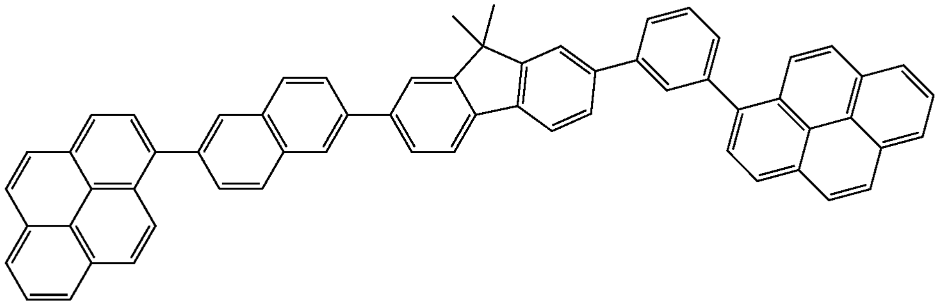
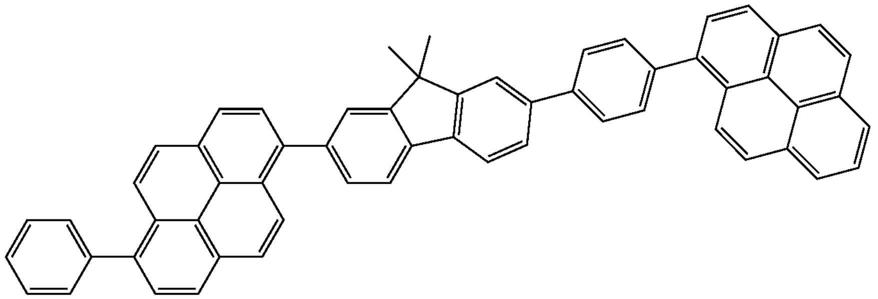
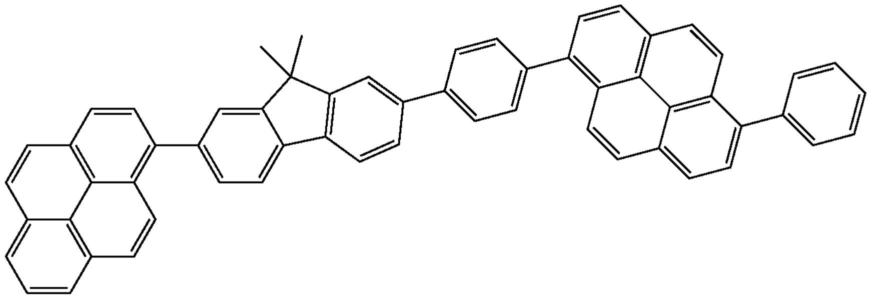
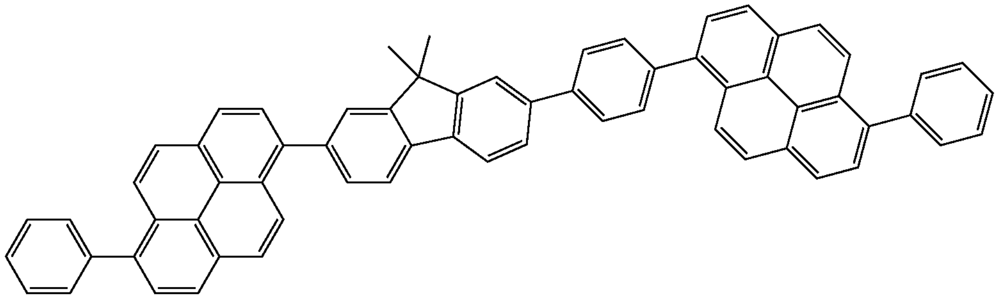

-continued
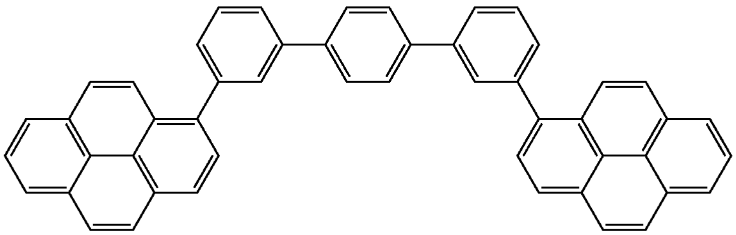
[Formula 166]
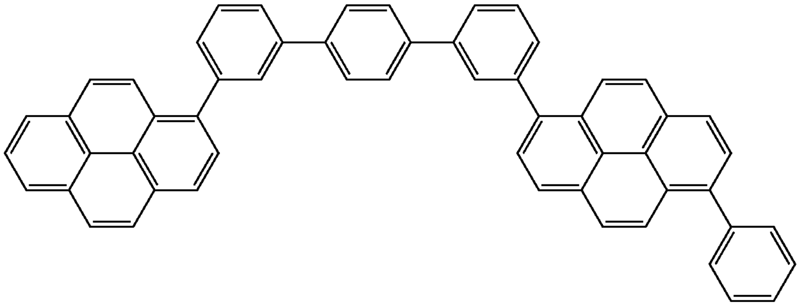
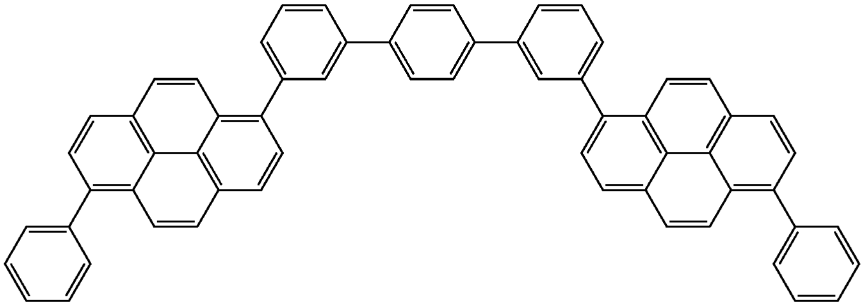
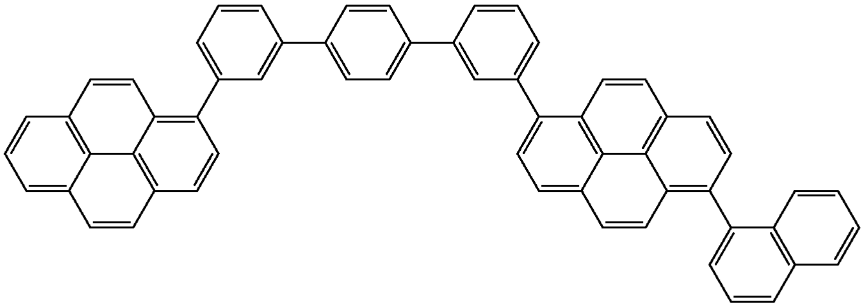
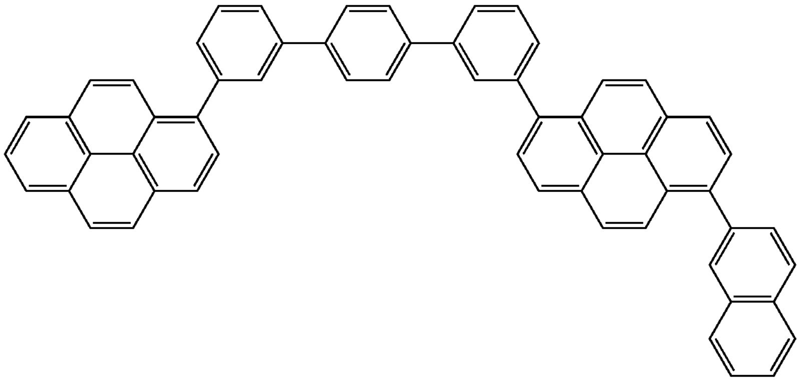

-continued
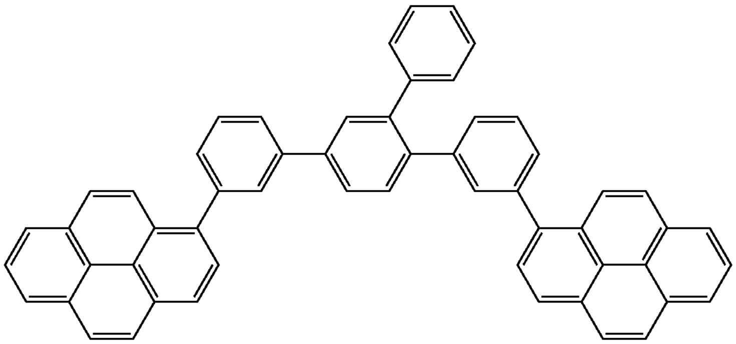
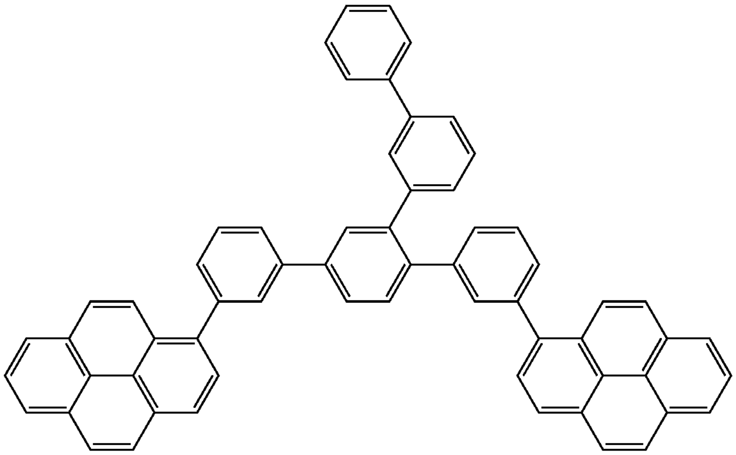
[Formula 167]
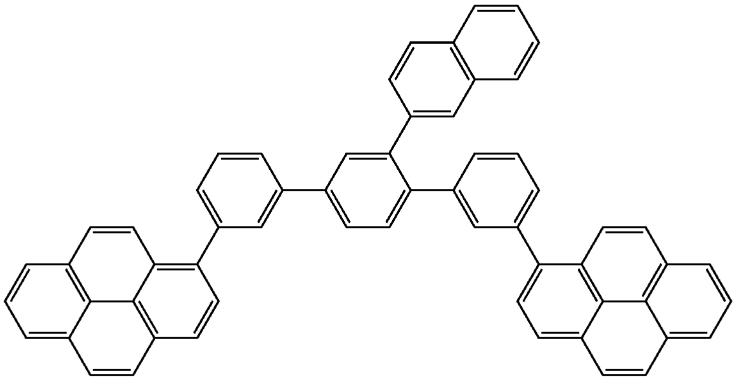
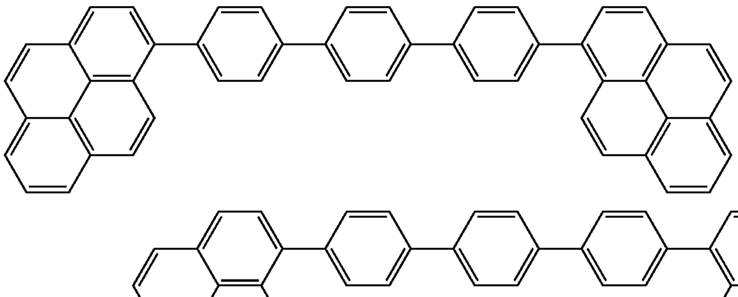
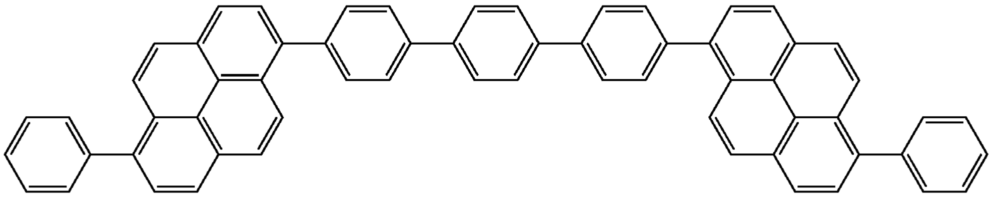

-continued
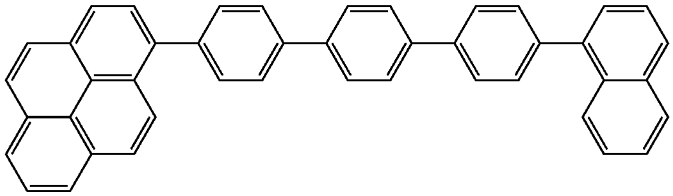
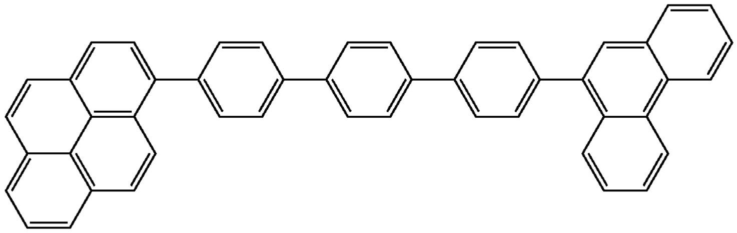
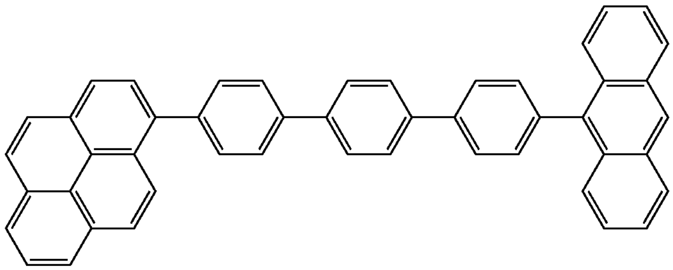
[Formula 168]
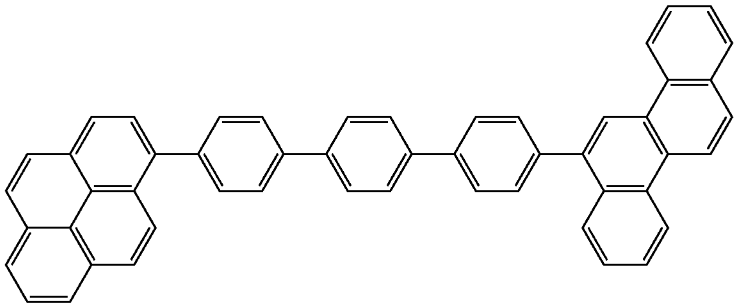
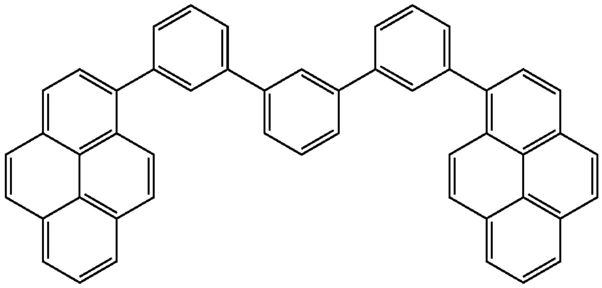
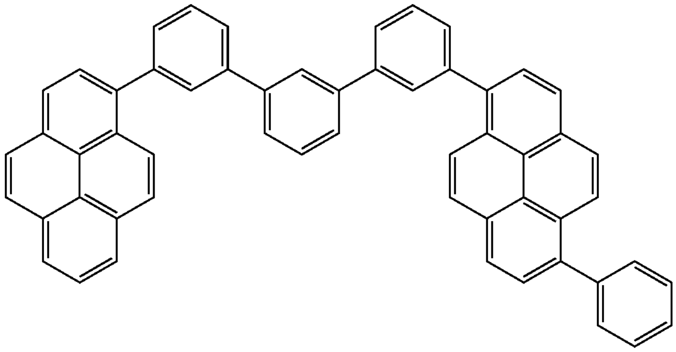

-continued
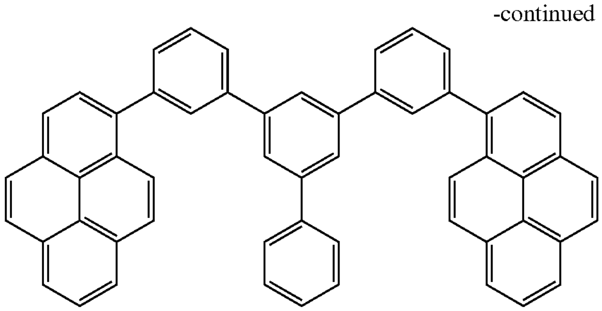
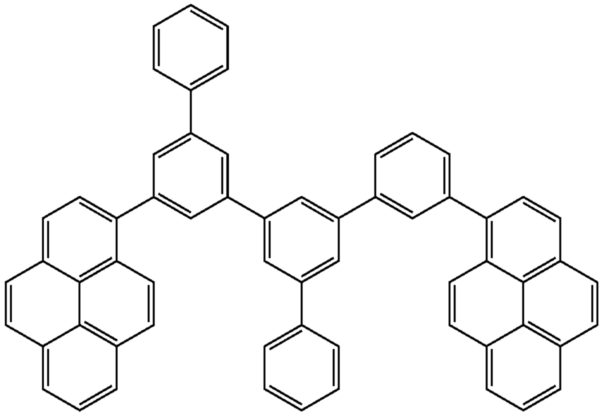
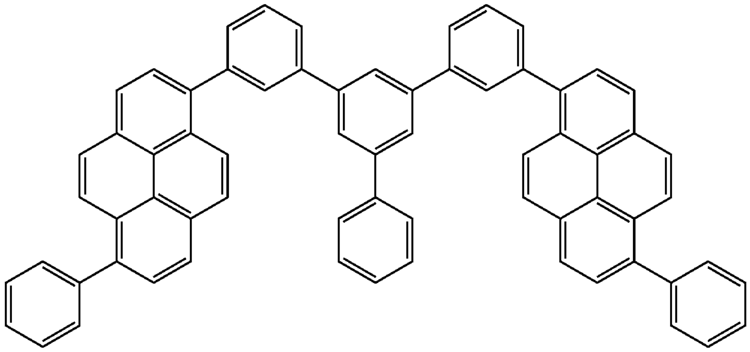
[Formula 169]
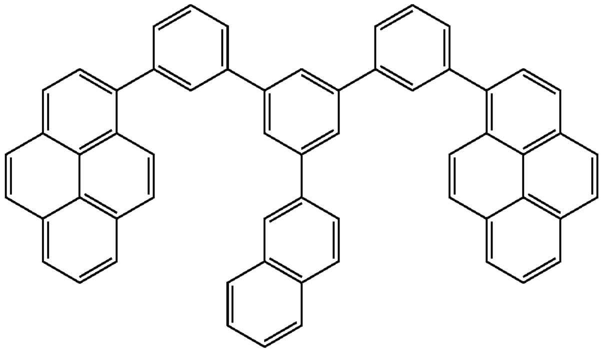
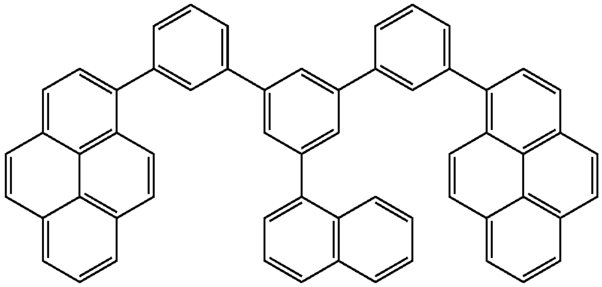

-continued
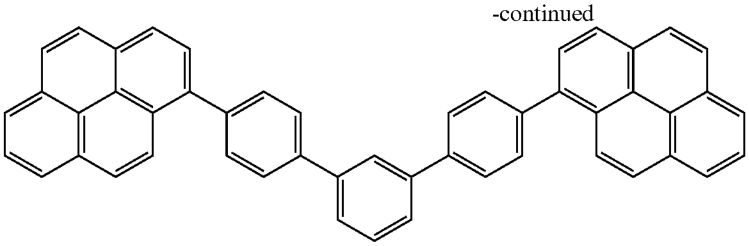
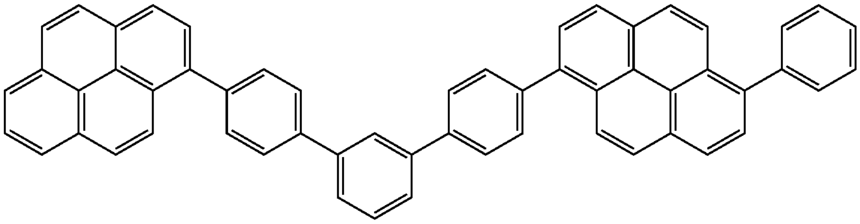
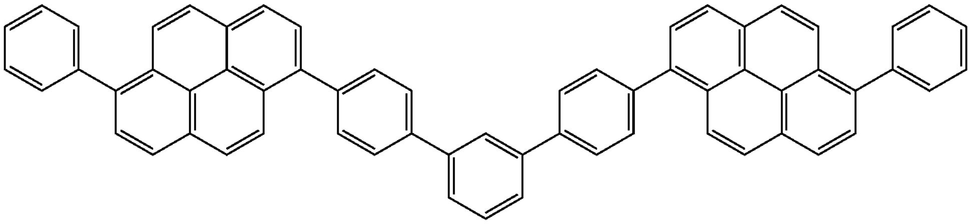
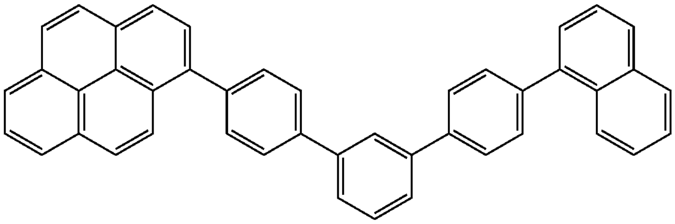
[Formula 170]
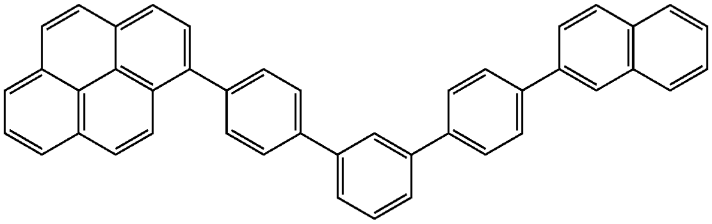
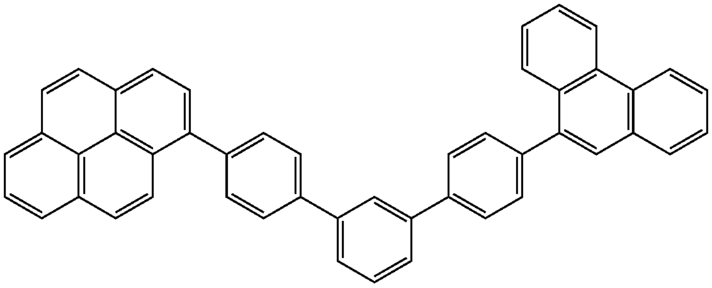

-continued
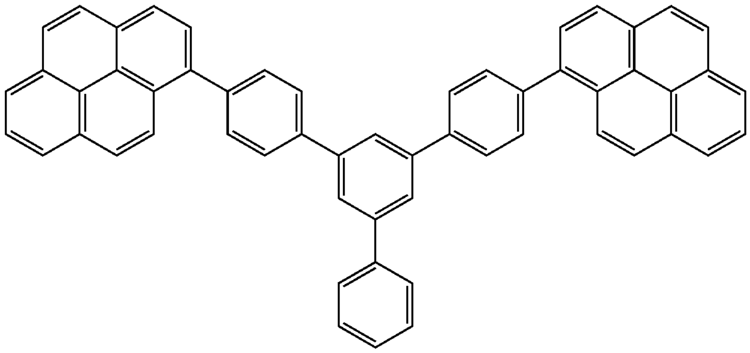
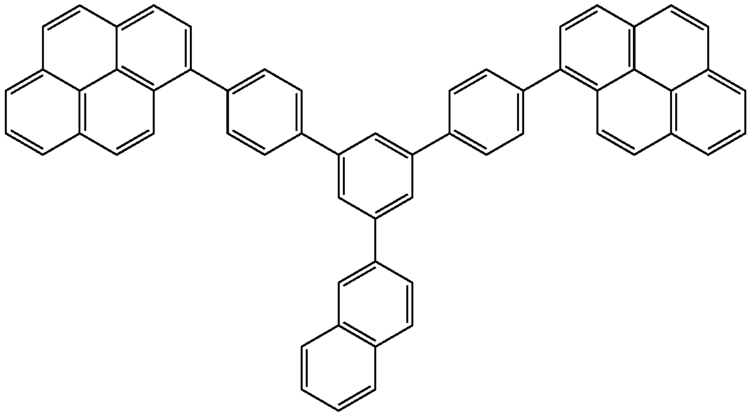
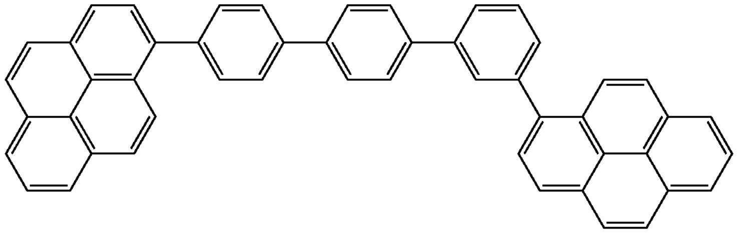
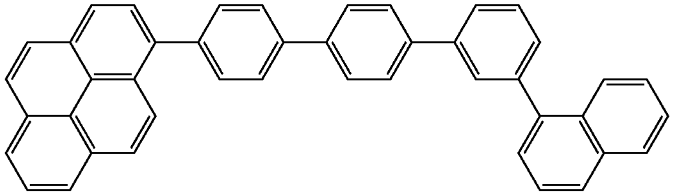
[Formula 171]
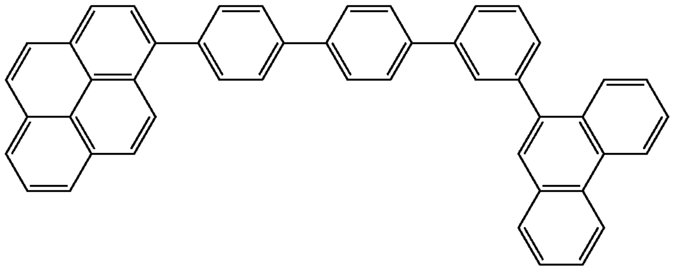
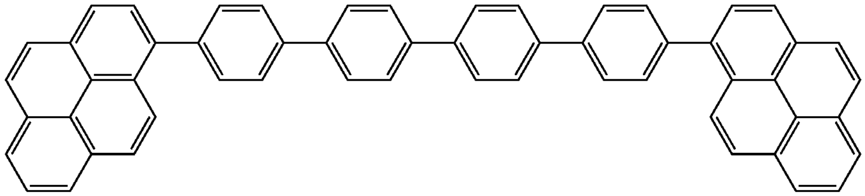

-continued
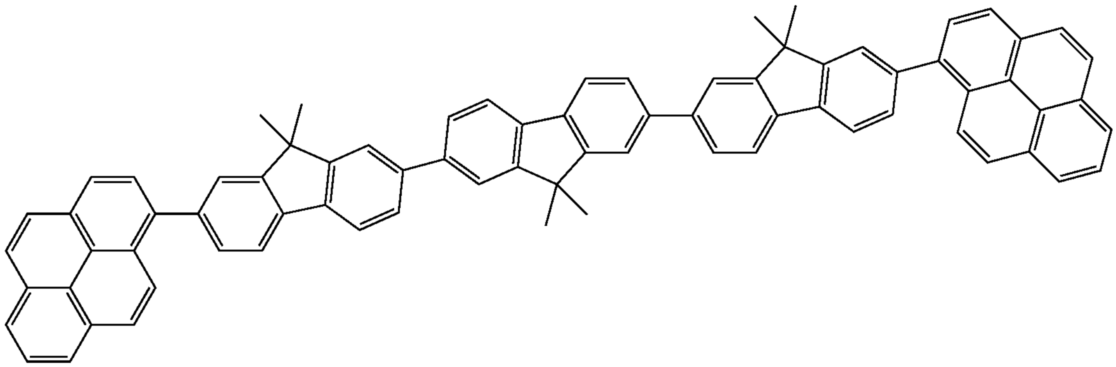
[Formula 172]
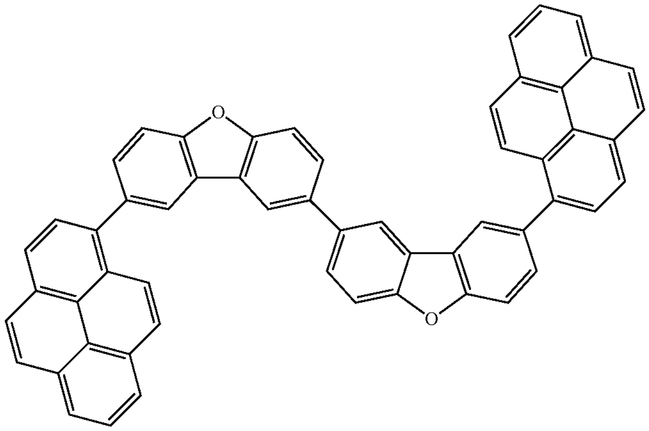
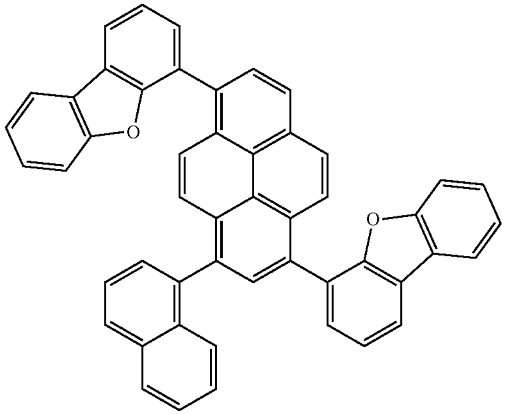
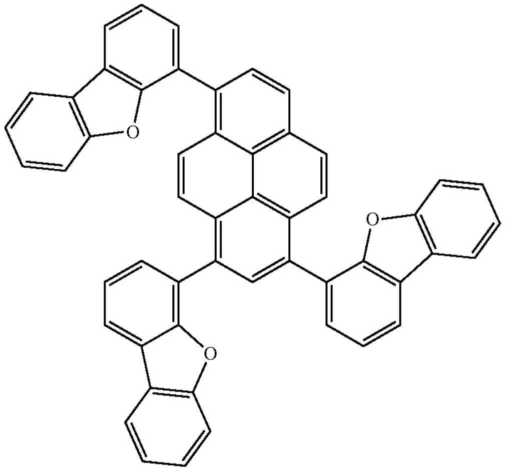
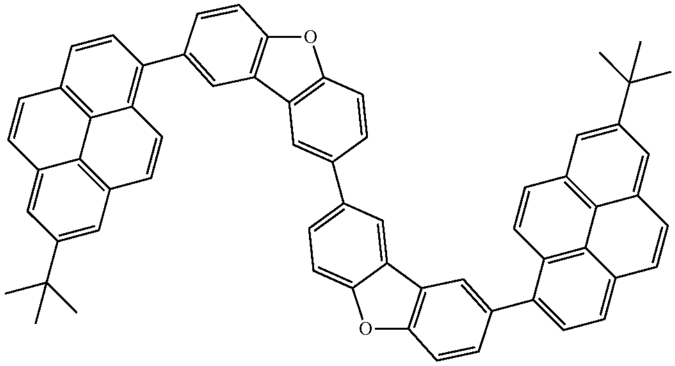

-continued
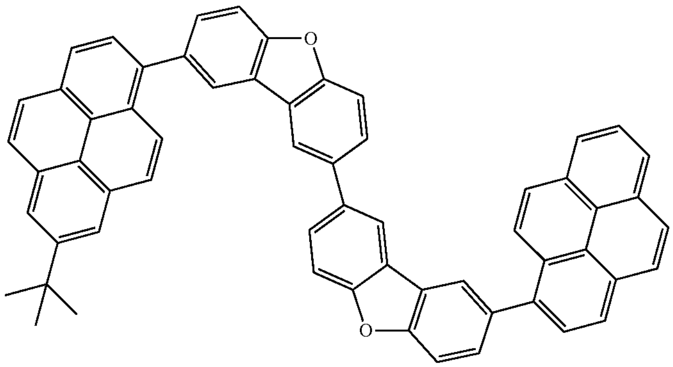
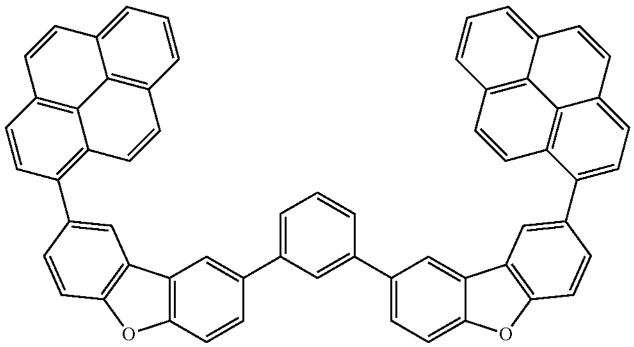
[Formula 173]
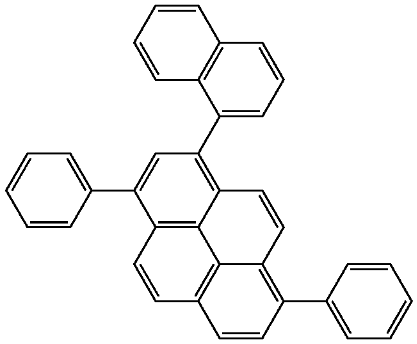
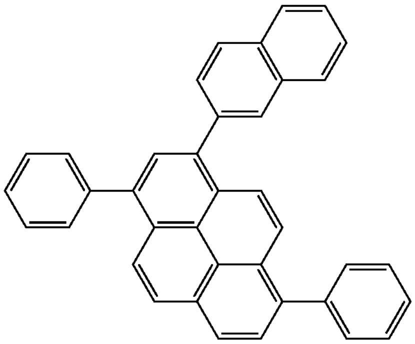
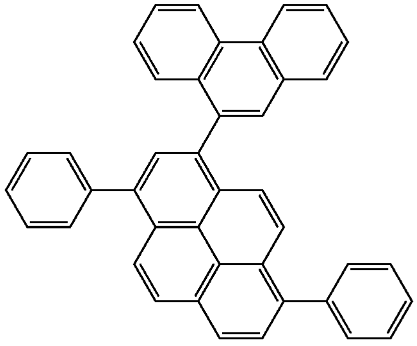
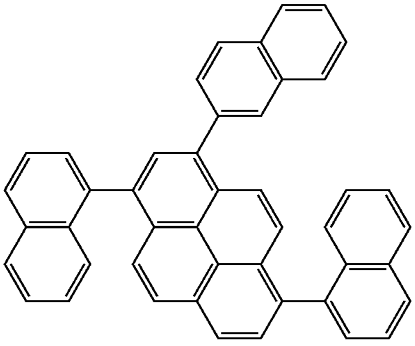

-continued
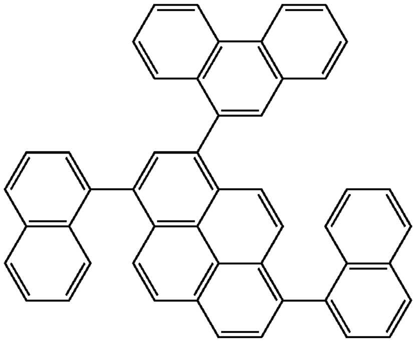
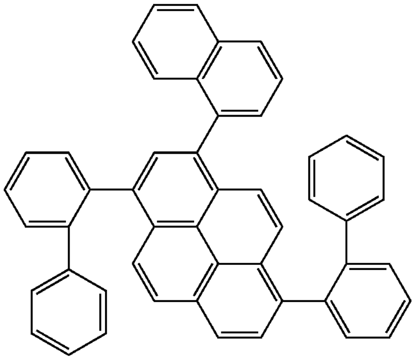
[Formula 174]
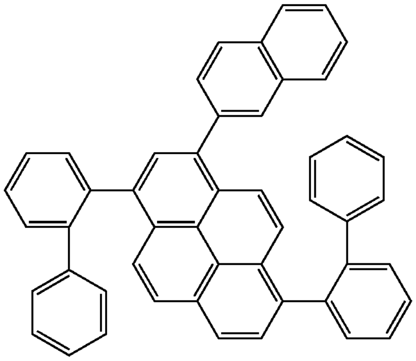
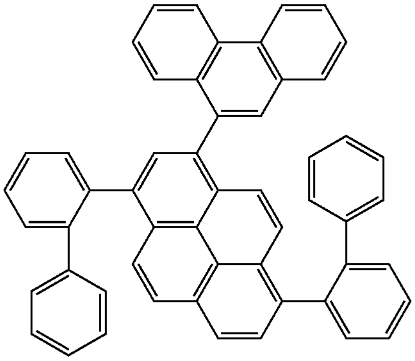
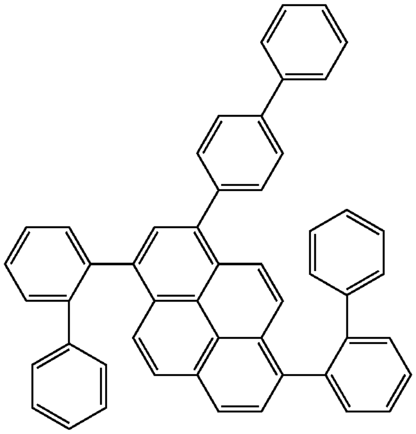
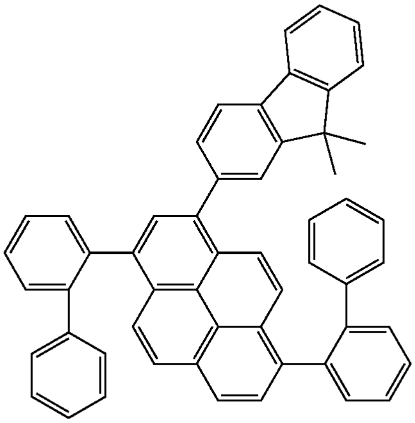
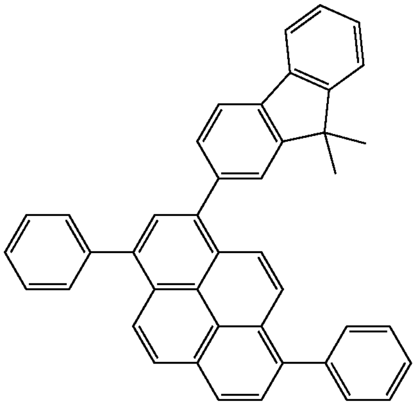
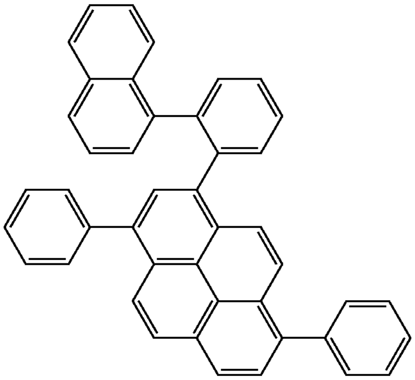

-continued
[Formula 175]
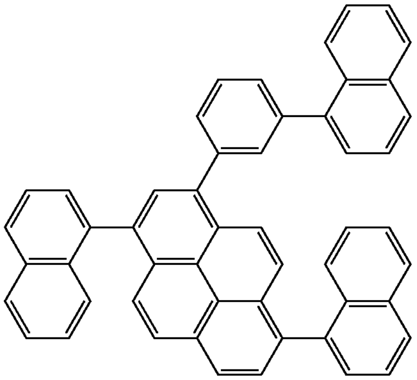
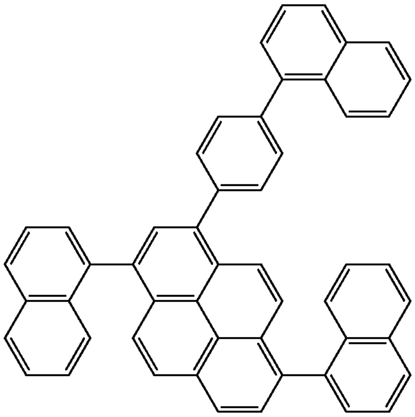
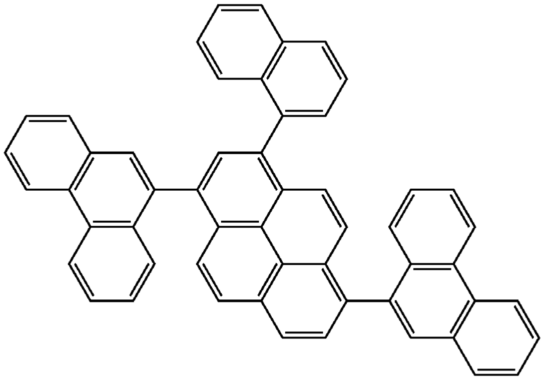
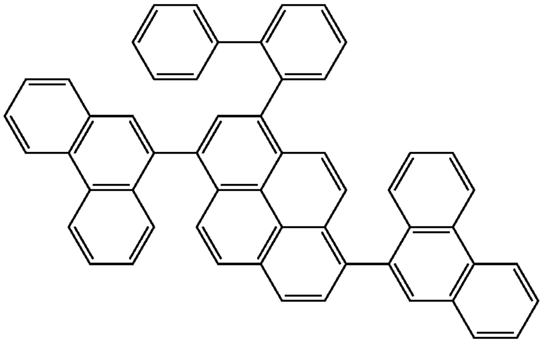
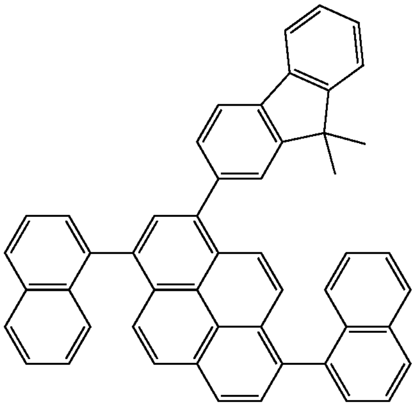
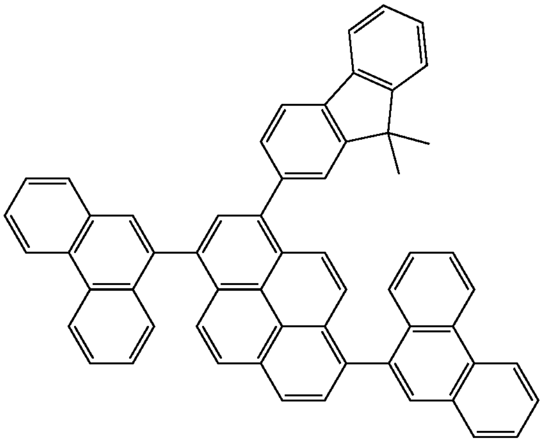

-continued
[Formula 176]
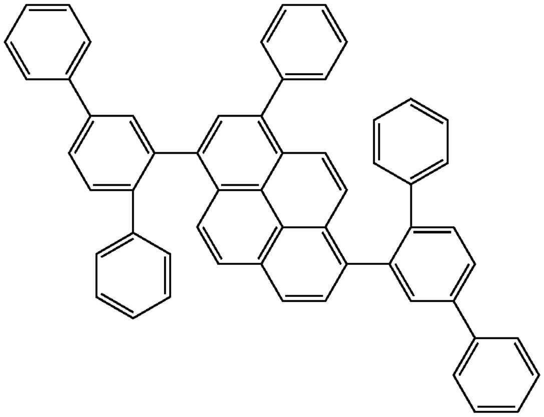
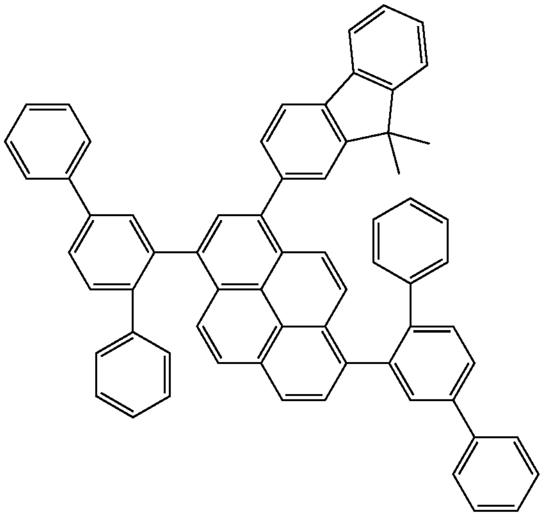
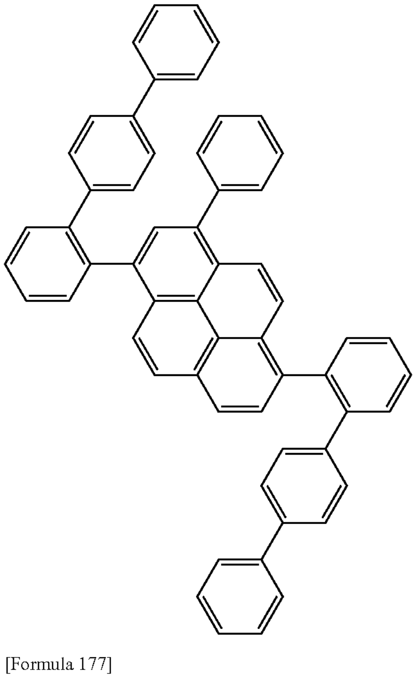
[Formula 177]
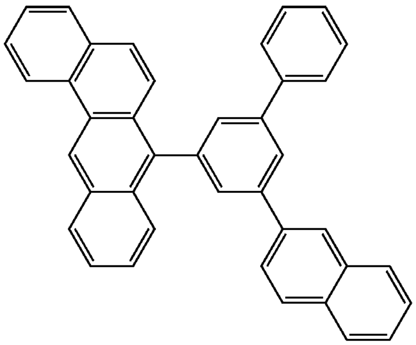
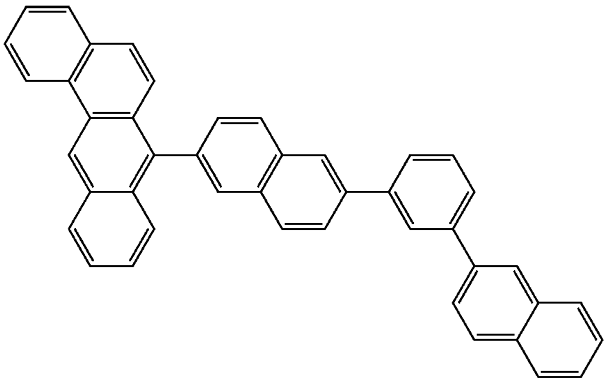

-continued
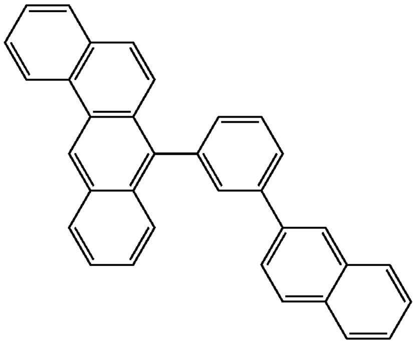
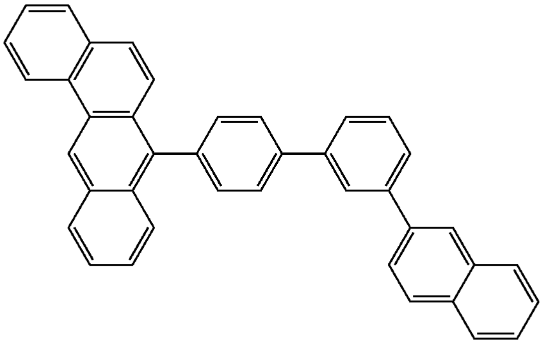
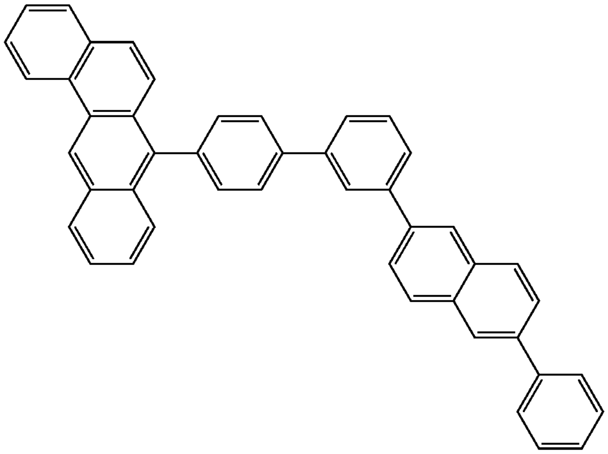
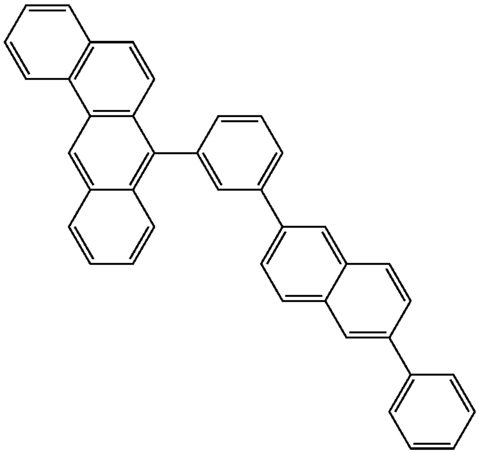
[Formula 178]
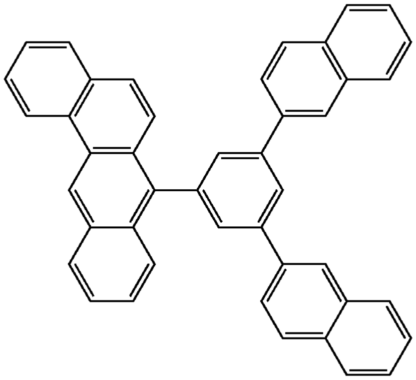
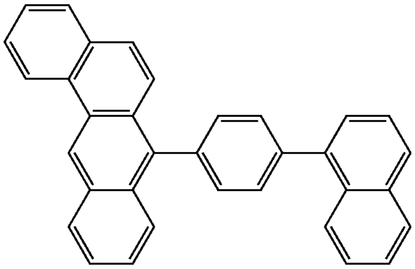
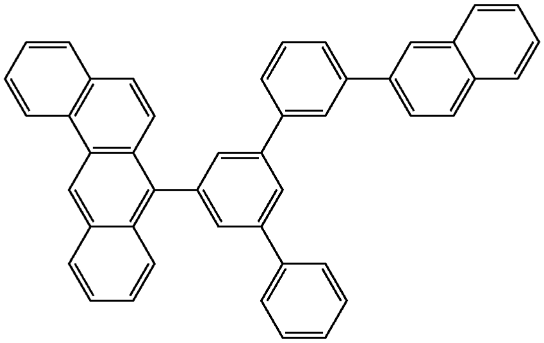

-continued
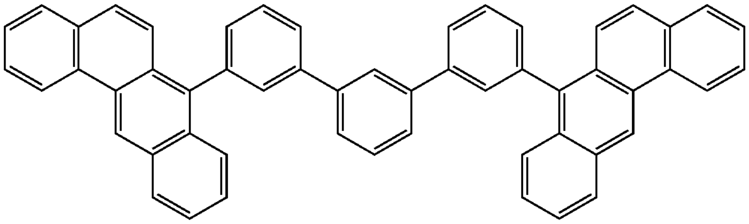
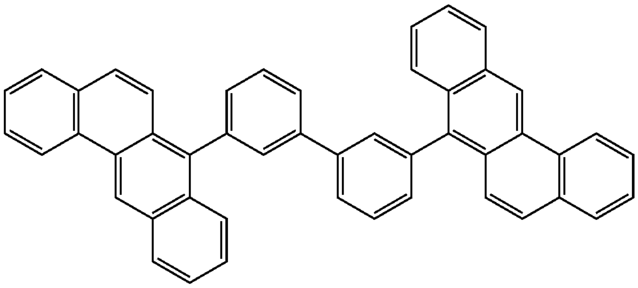
[Formula 179]
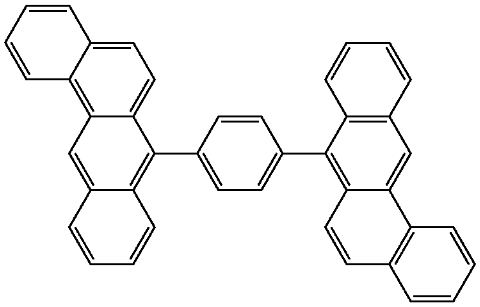
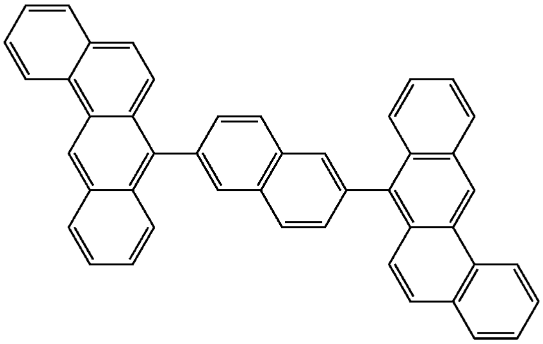
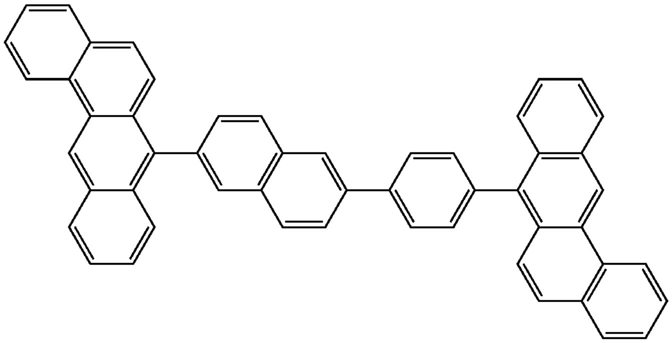
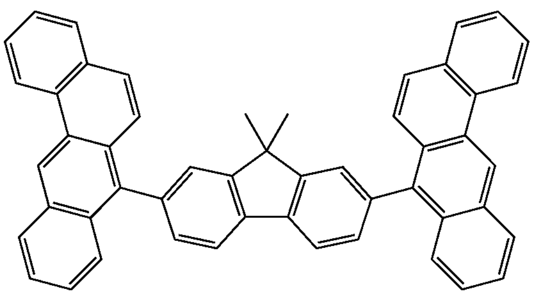
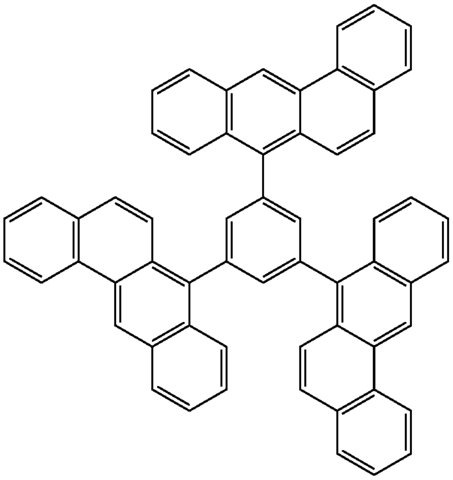

-continued
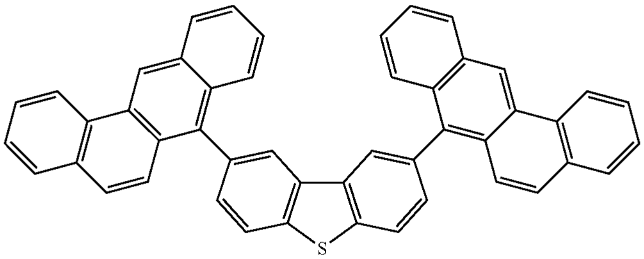
[Formula 180]
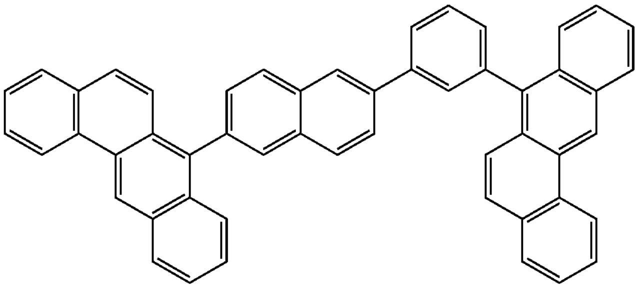
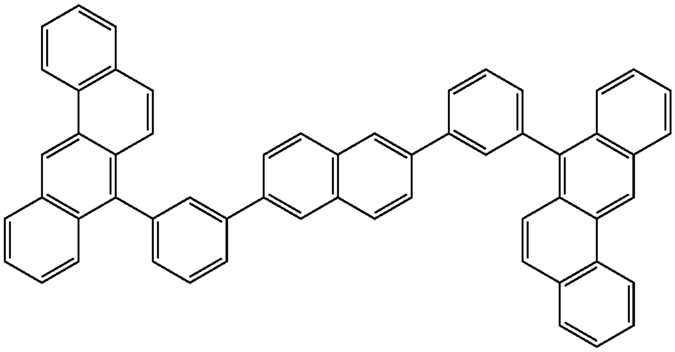
[Formula 181]
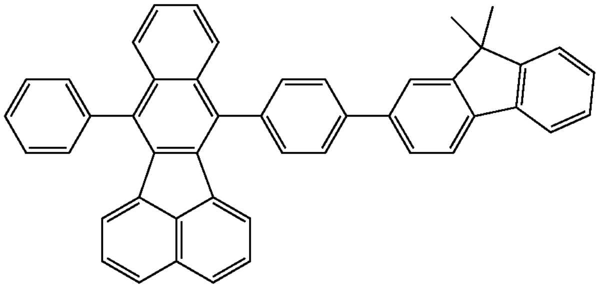
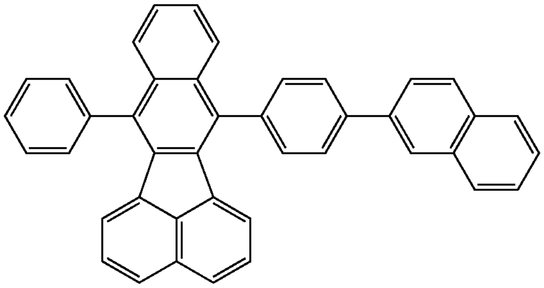
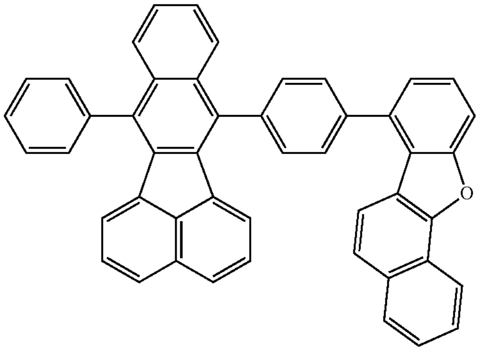

-continued
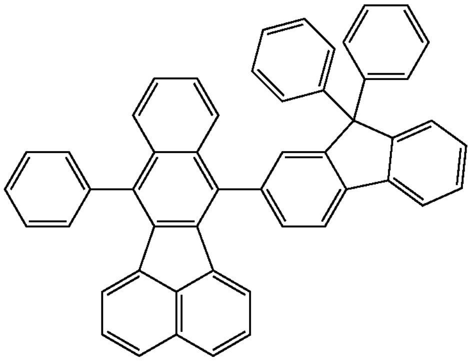
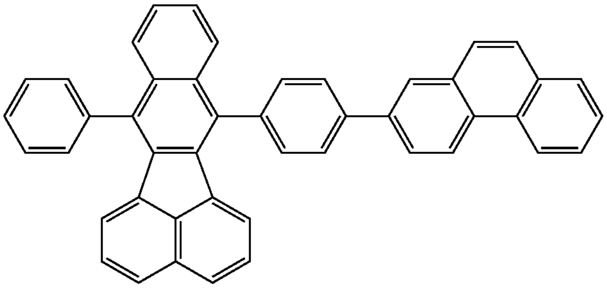
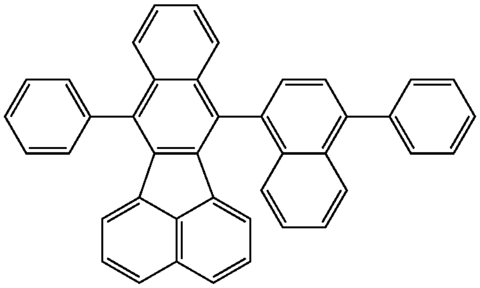
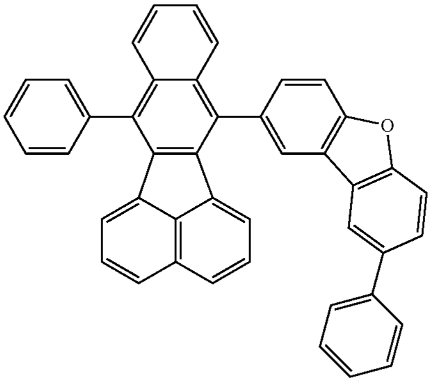
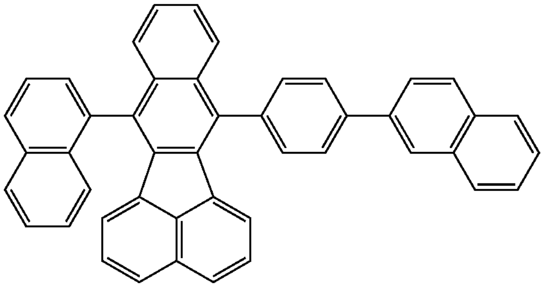
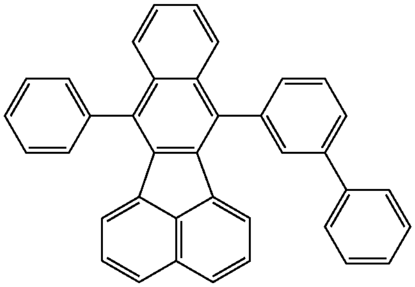
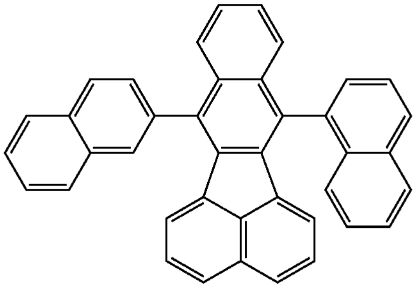
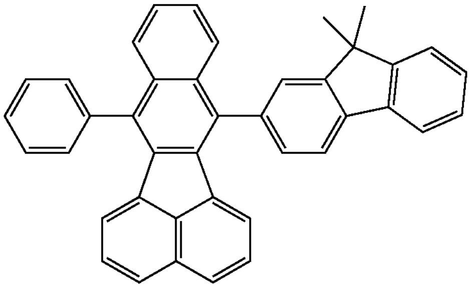
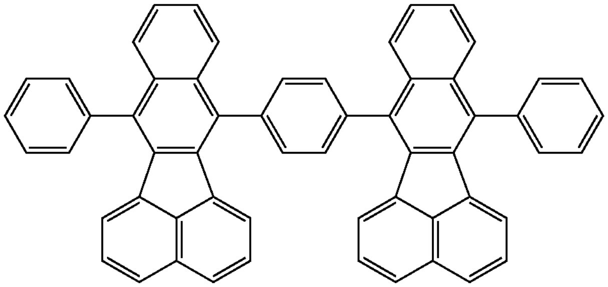

-continued
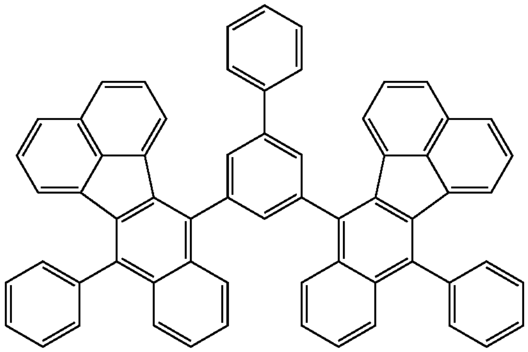
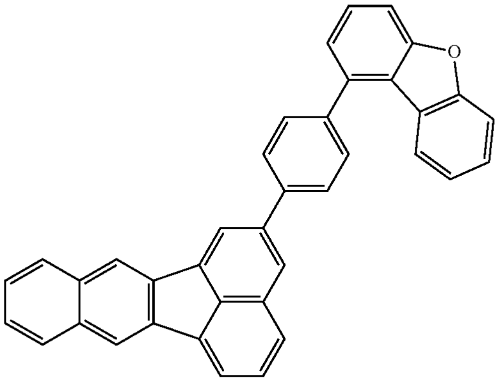
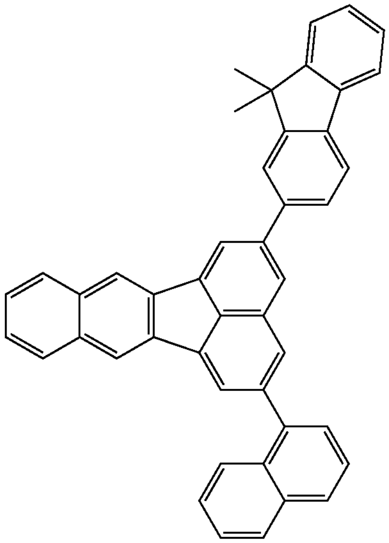
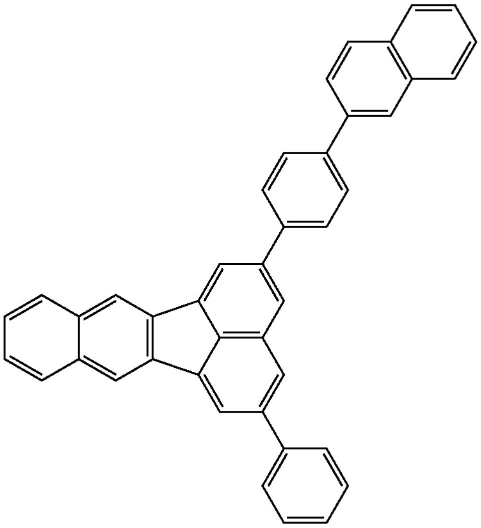
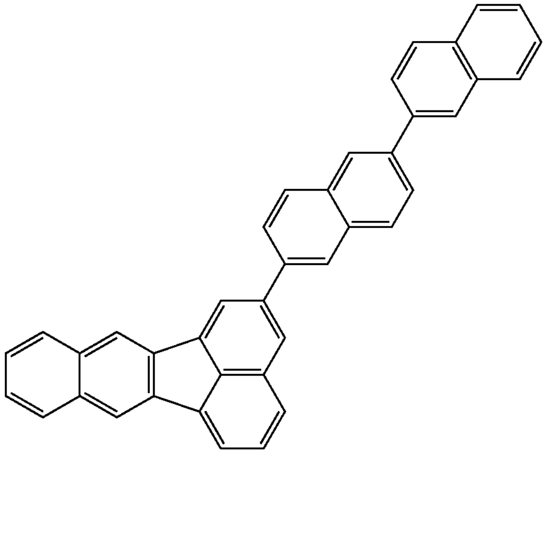

-continued
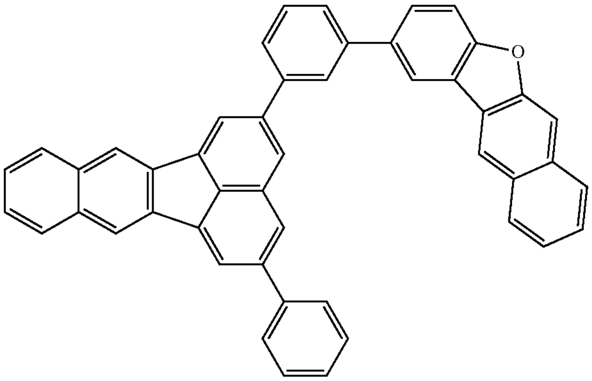
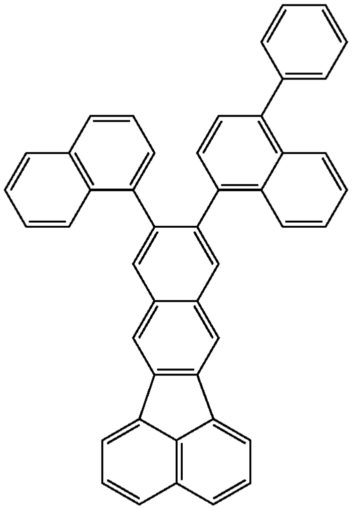
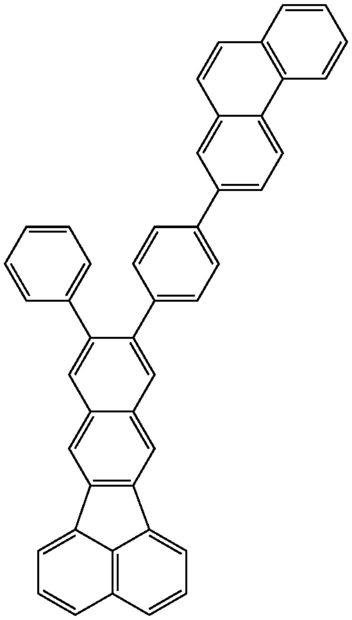
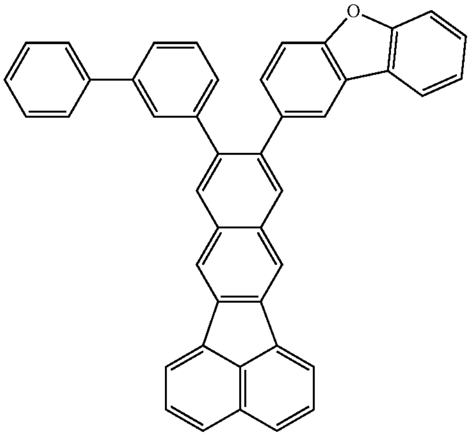
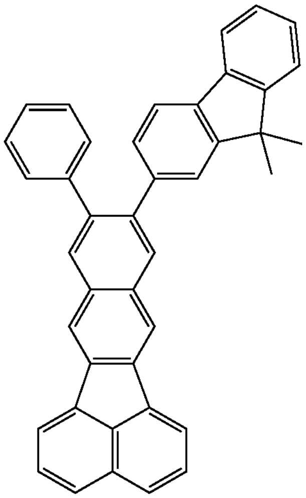
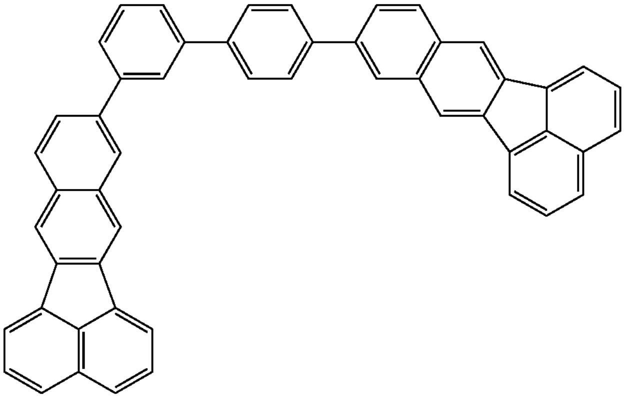

-continued
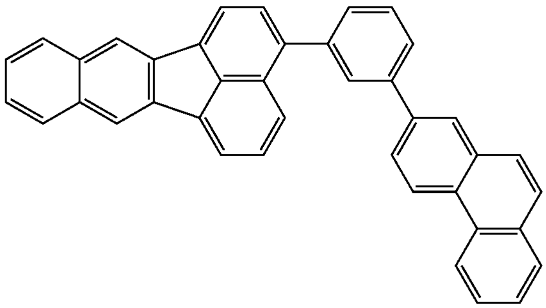
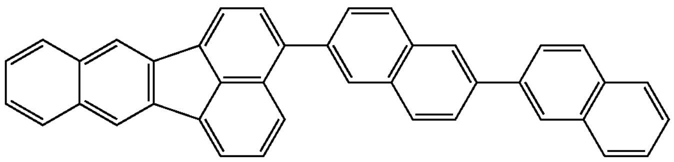
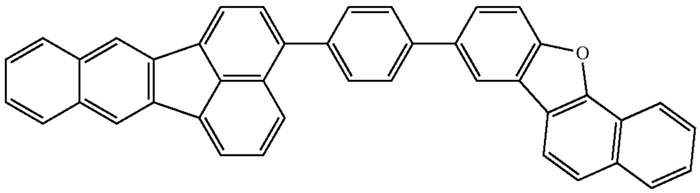
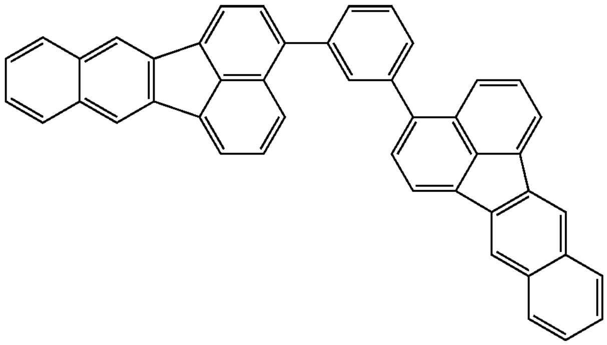
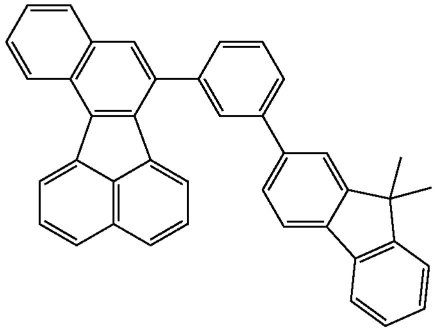
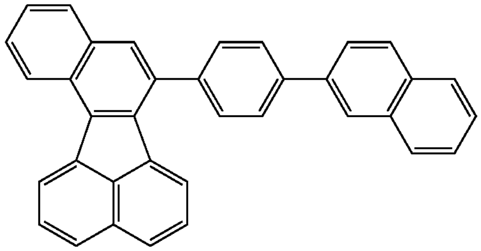
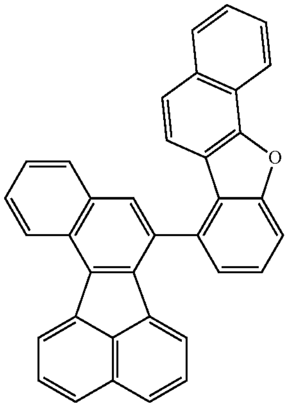

-continued
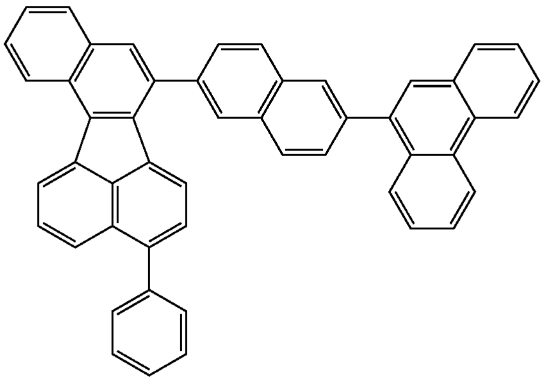
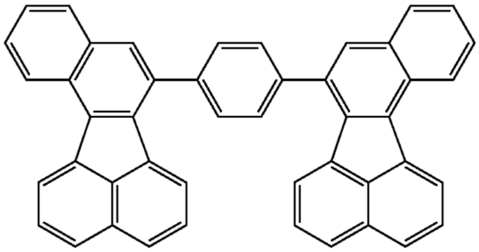
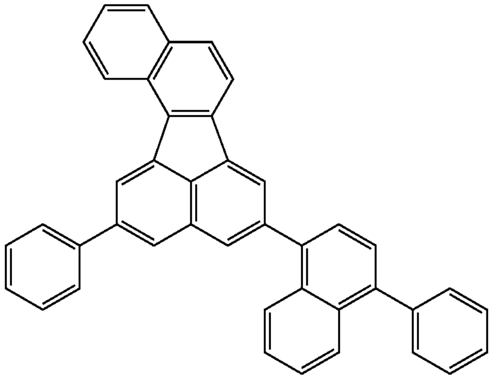
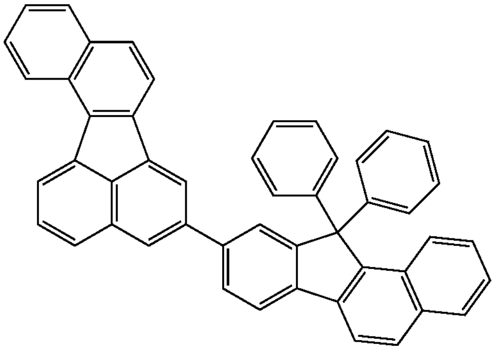
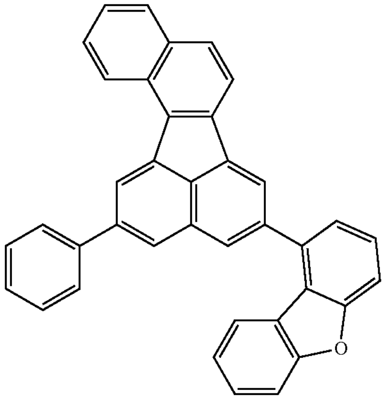
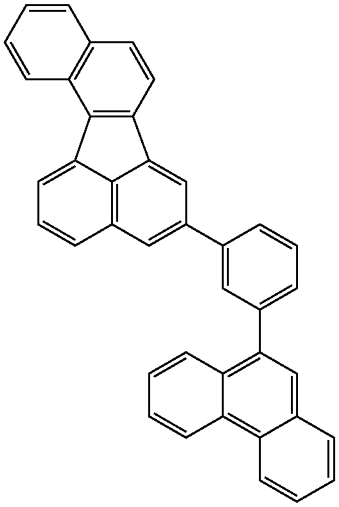
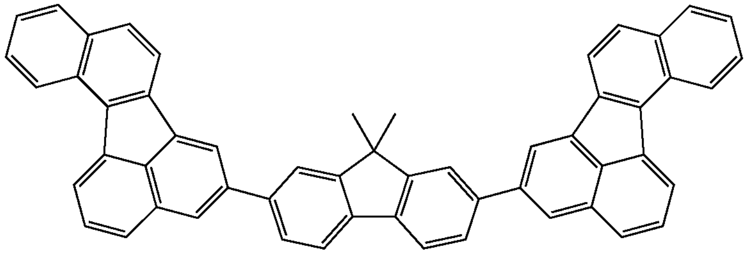

[Formula 182]
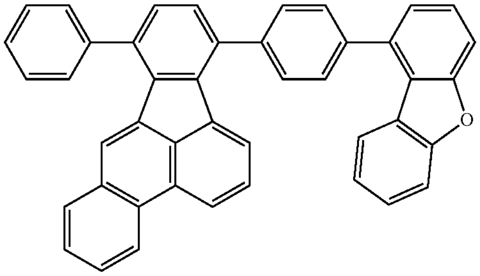
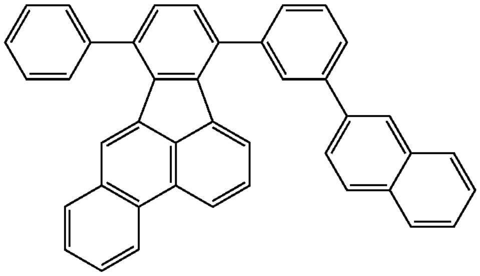
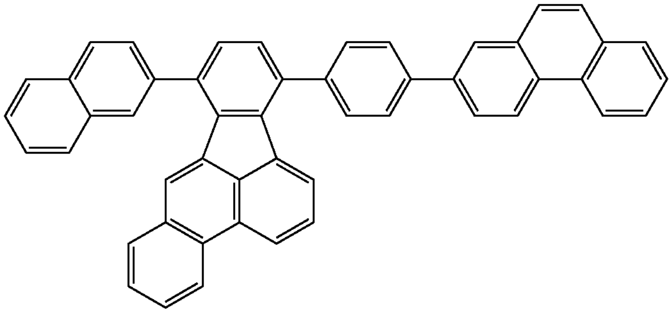
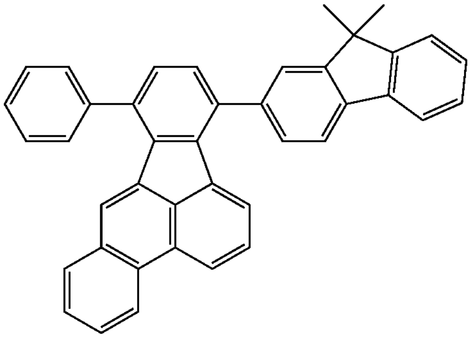
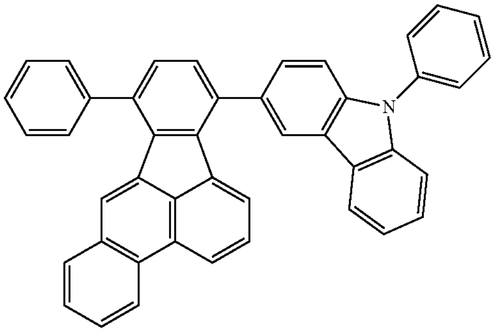
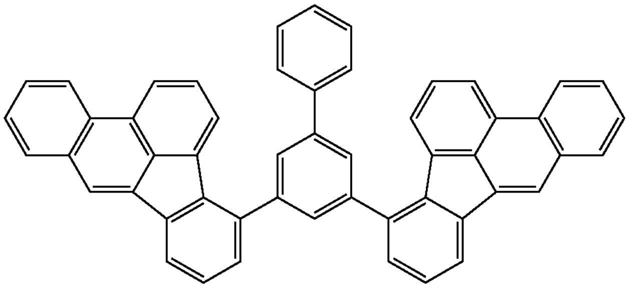
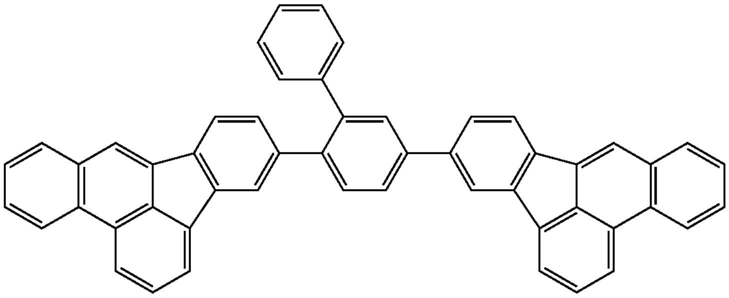
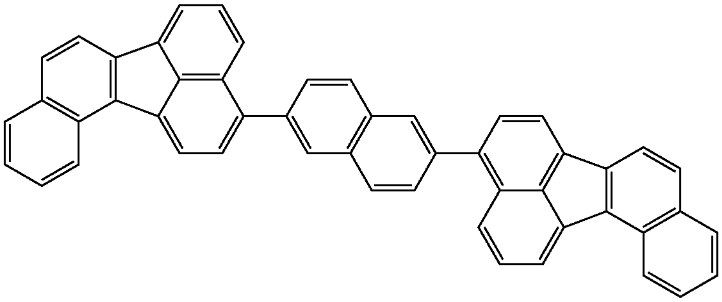

-continued
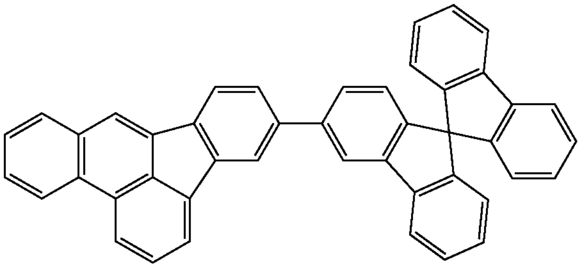
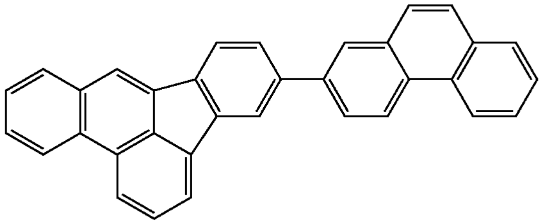
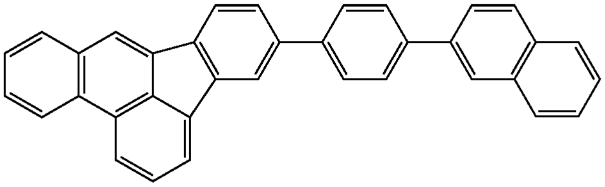
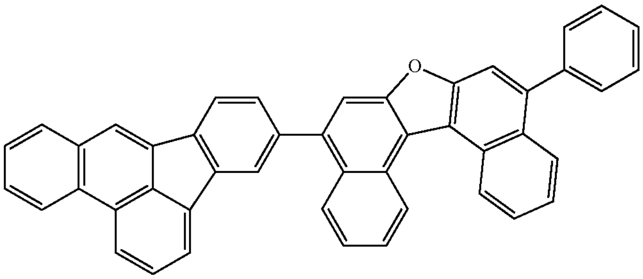
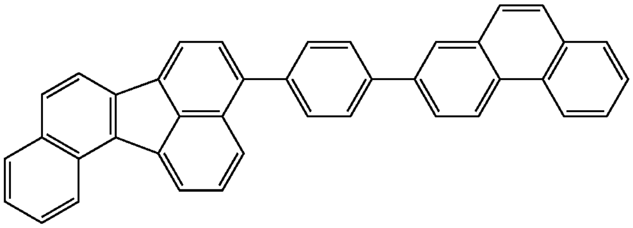
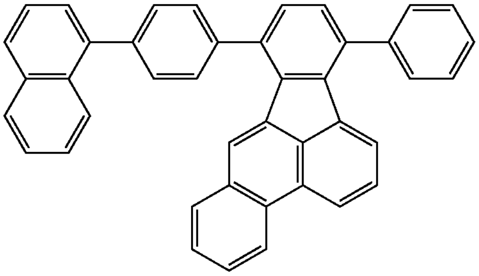
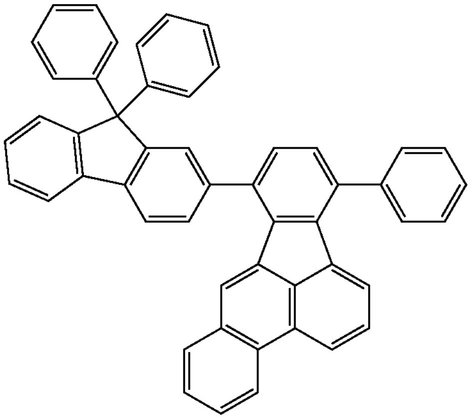
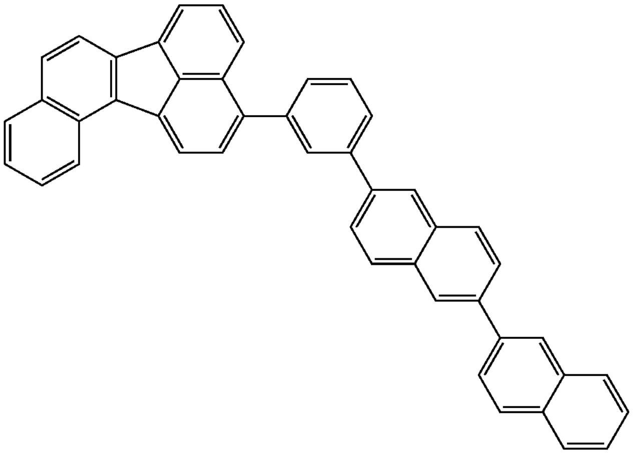

-continued
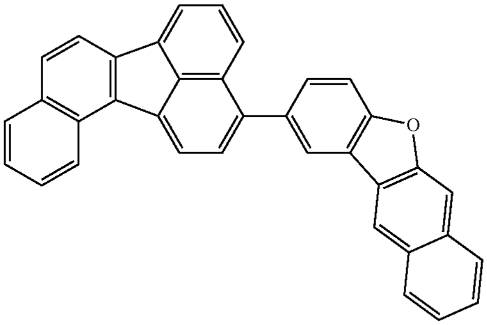
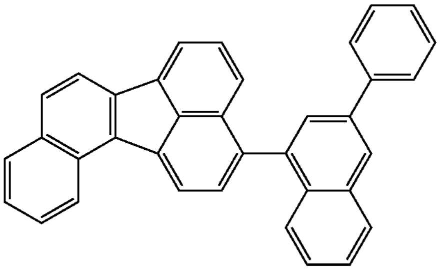
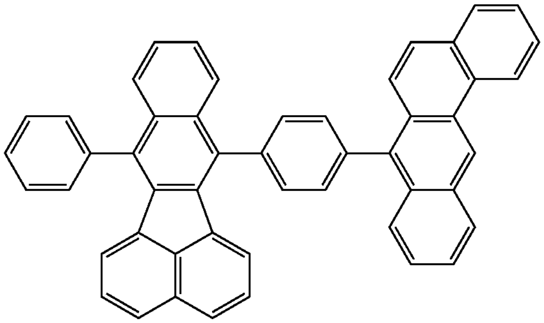
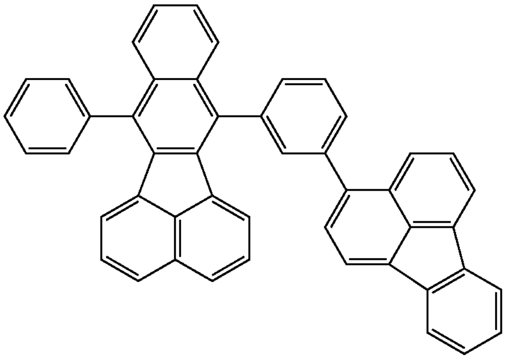
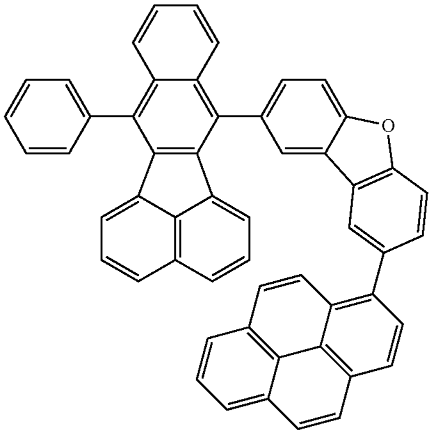
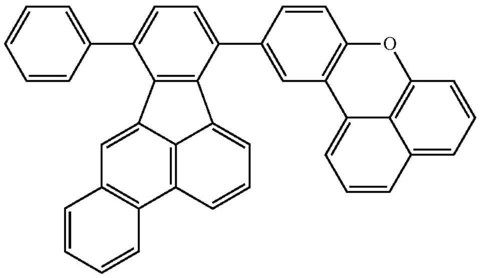
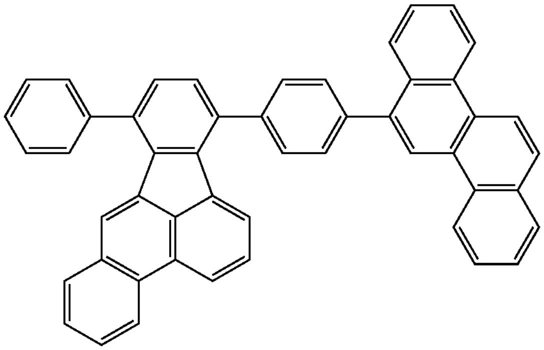

-continued
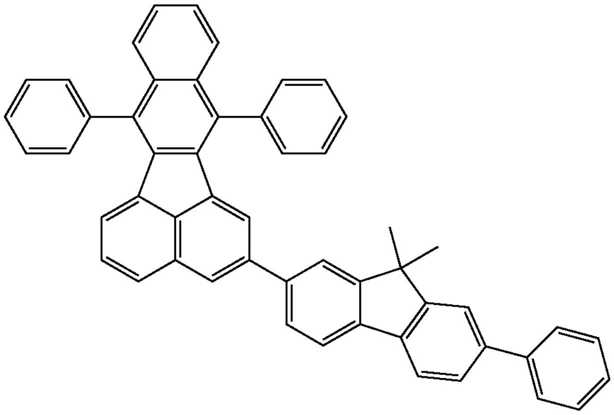
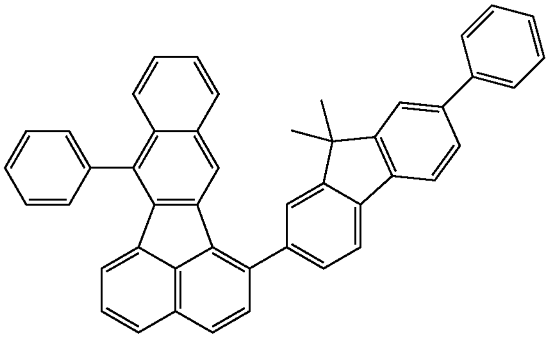
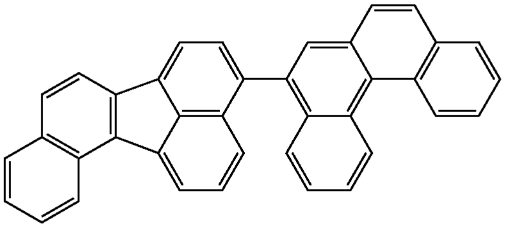
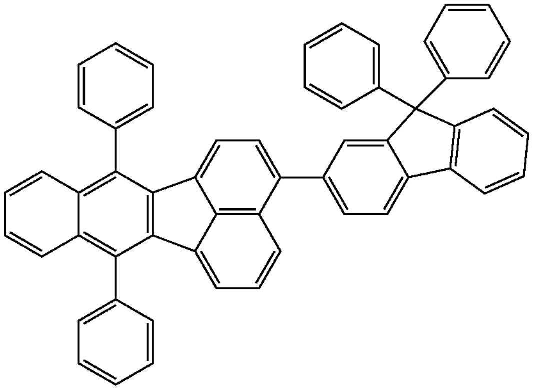
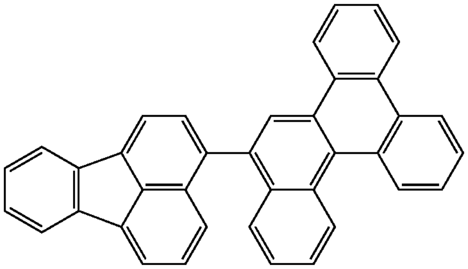
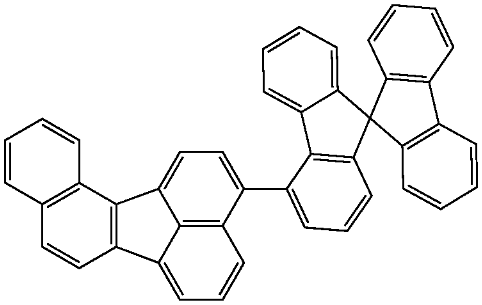
[Formula 183]
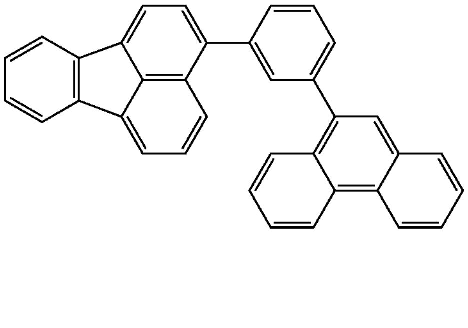
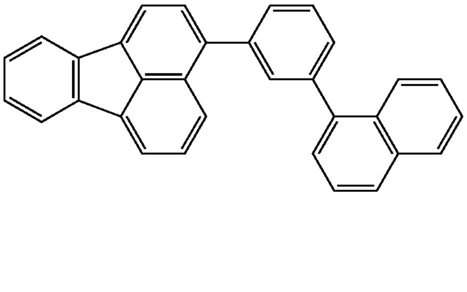

-continued
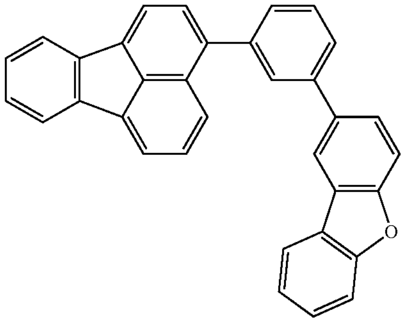
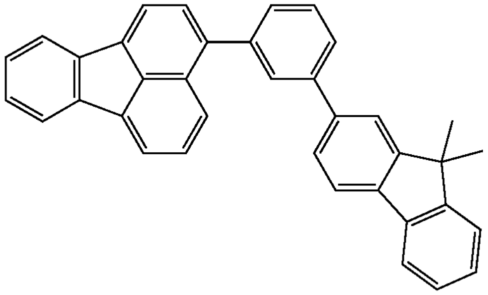
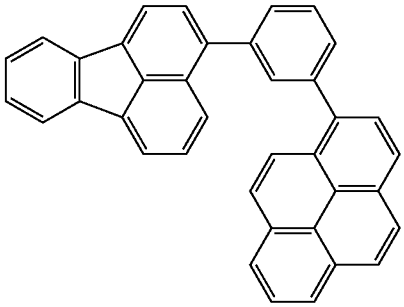
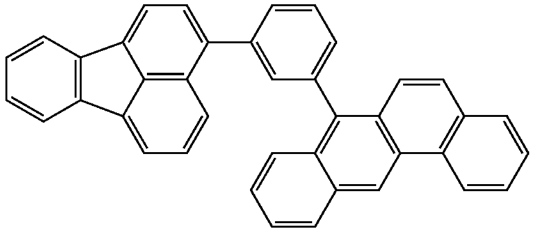
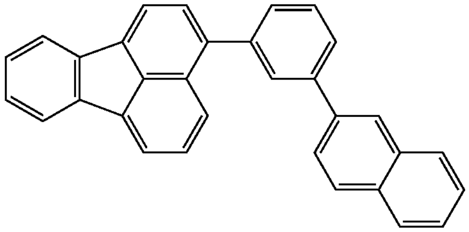
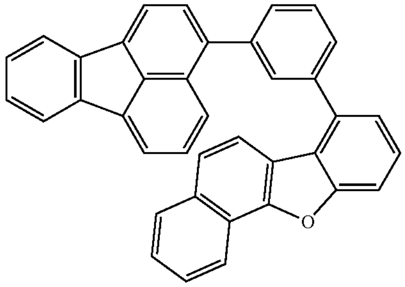
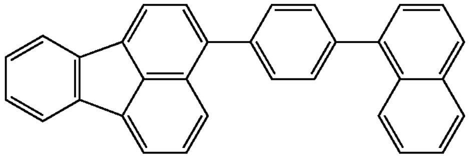
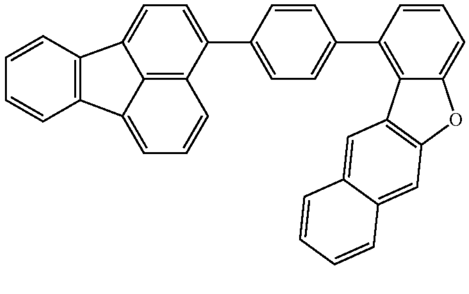
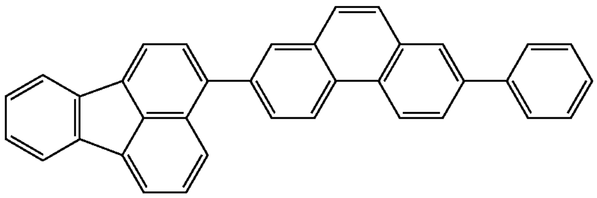
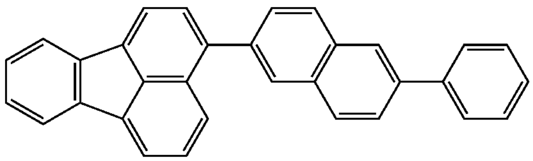
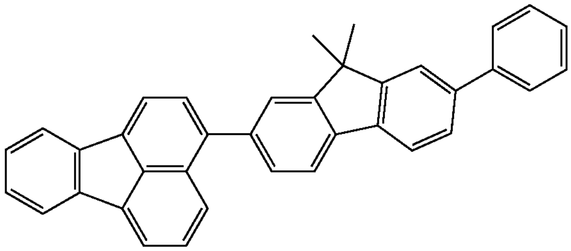
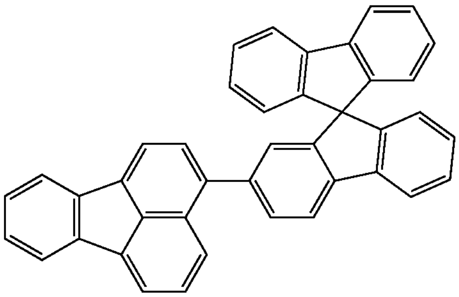

-continued
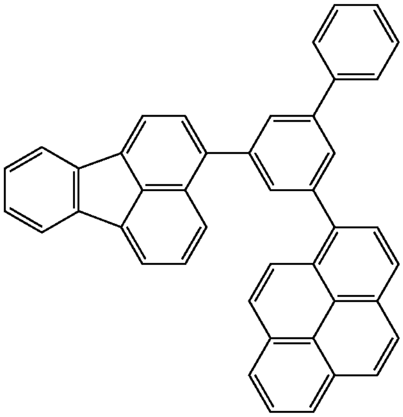
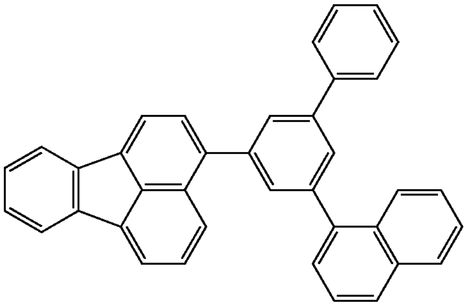
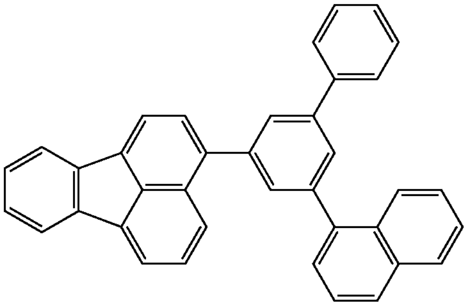
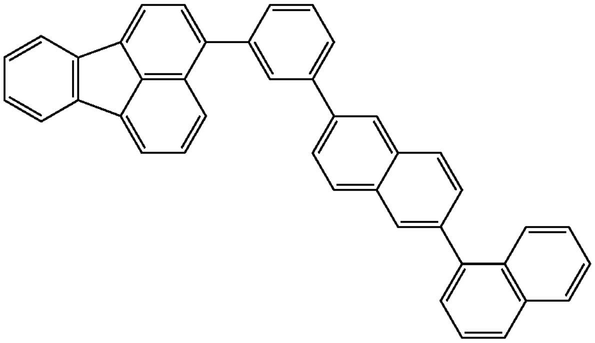
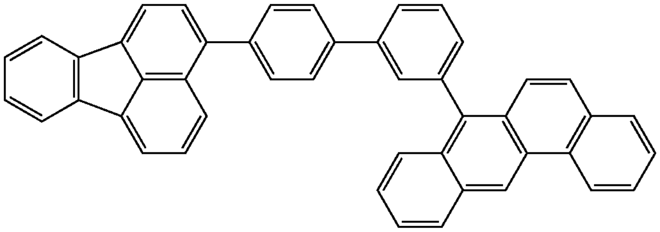
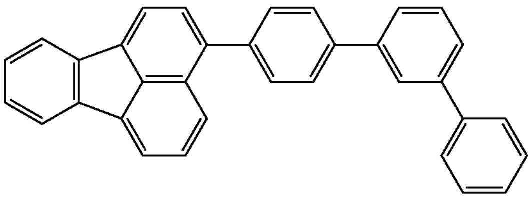
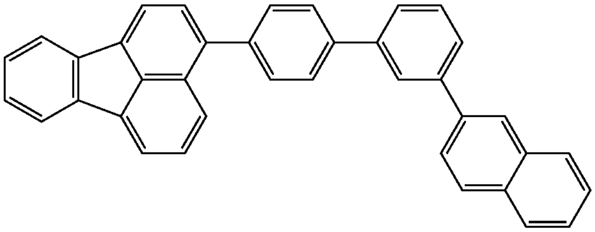
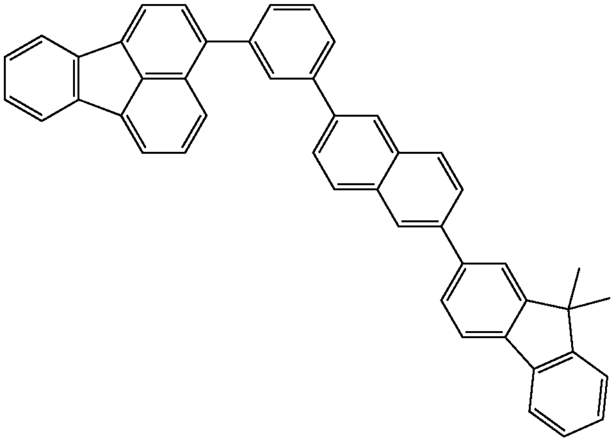
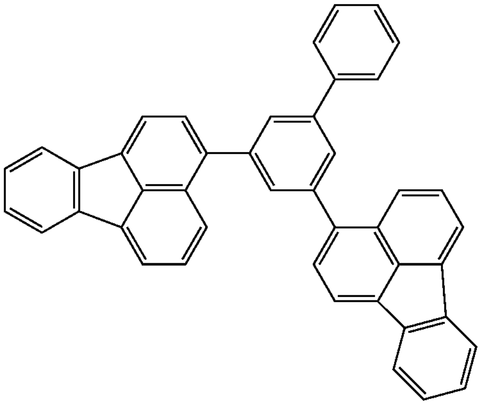

-continued
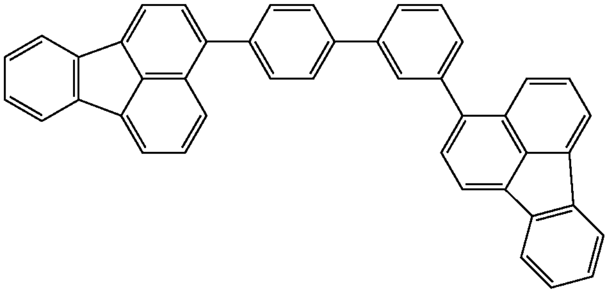
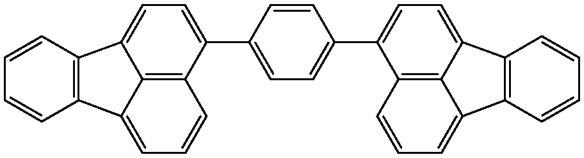
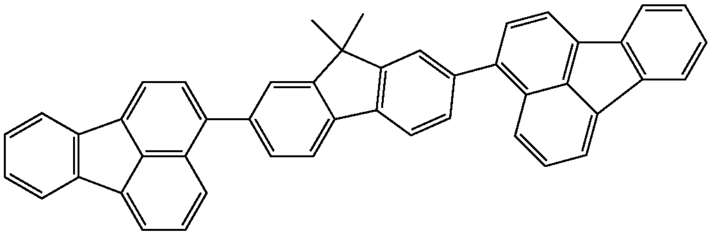
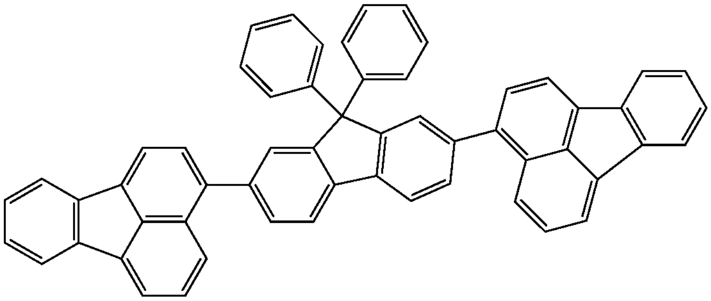
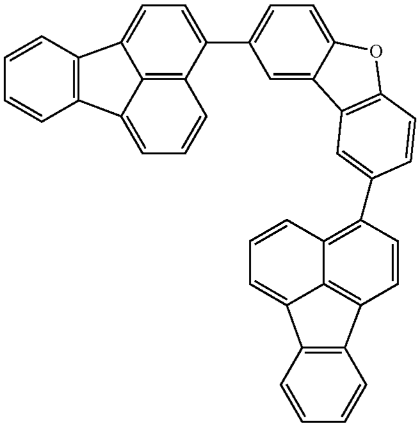
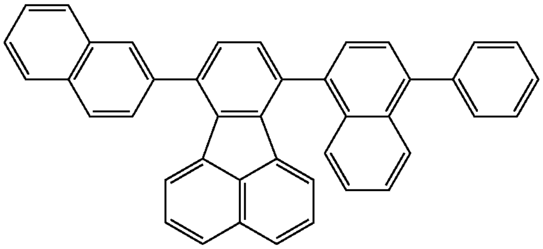
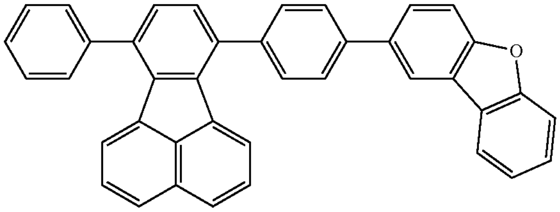

-continued
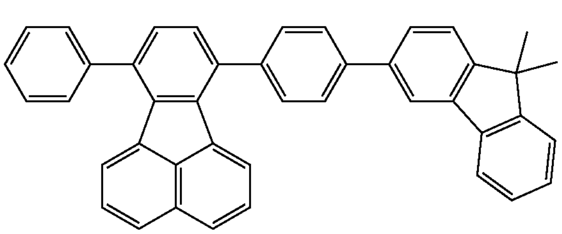
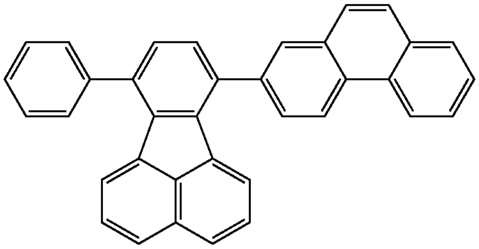
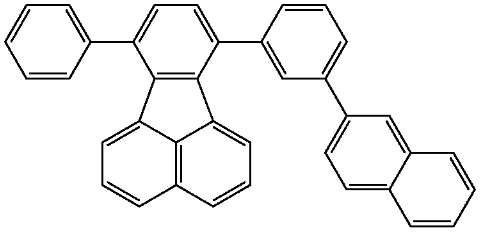
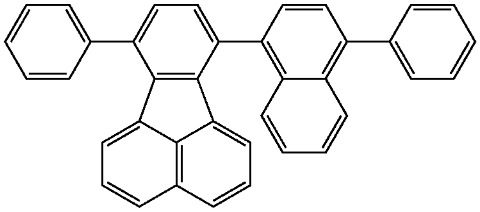
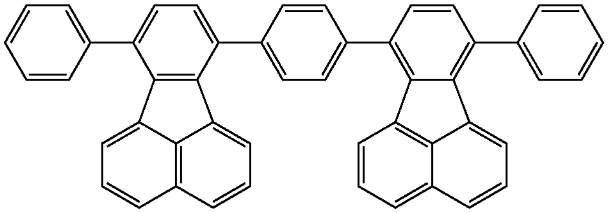
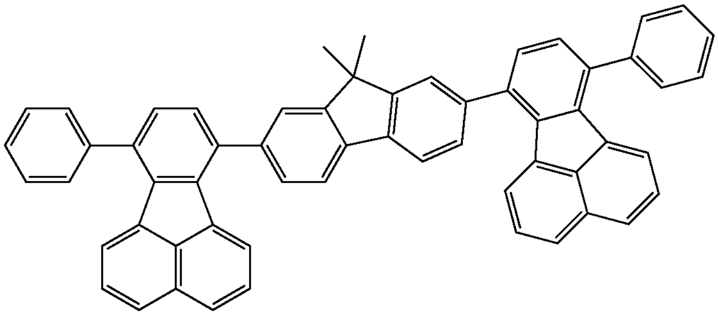
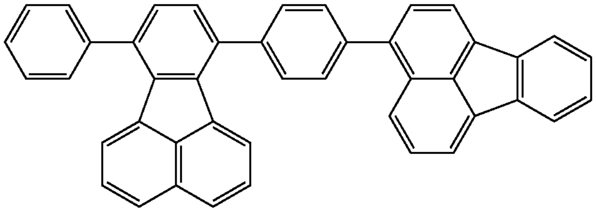
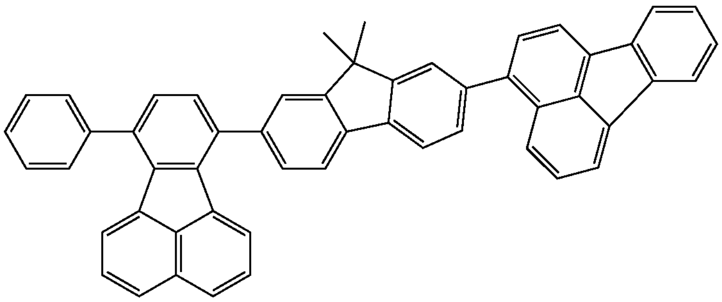

-continued
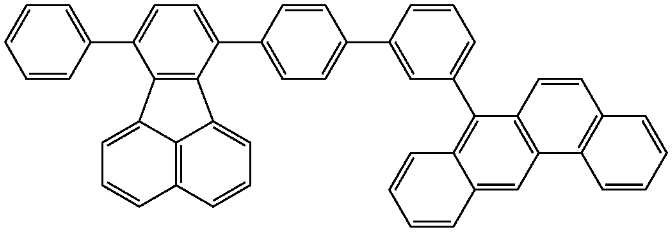
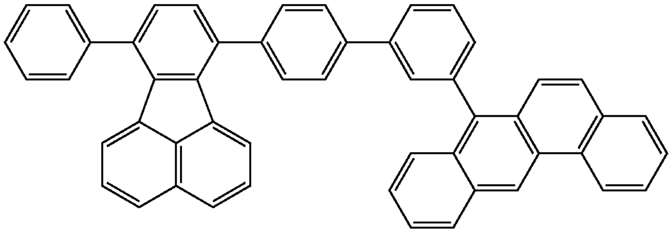
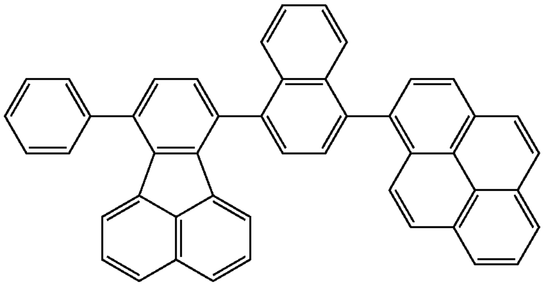
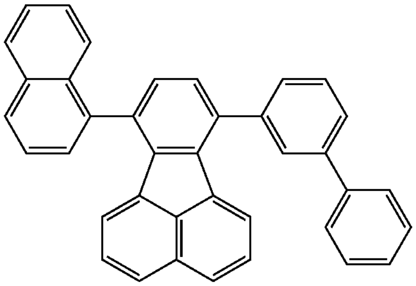
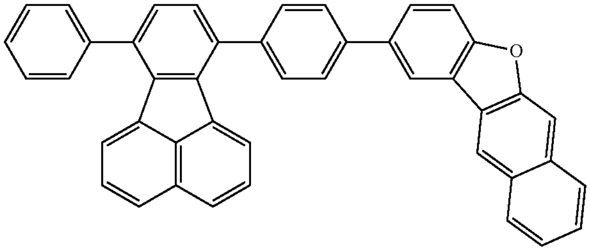
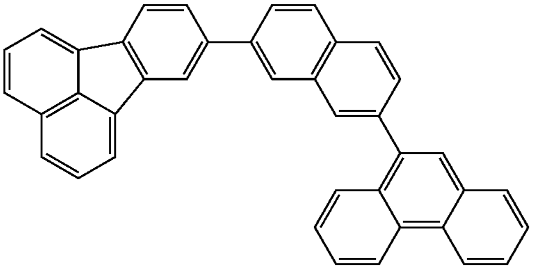
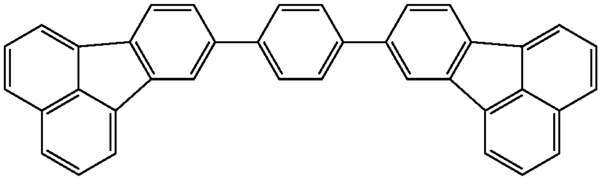
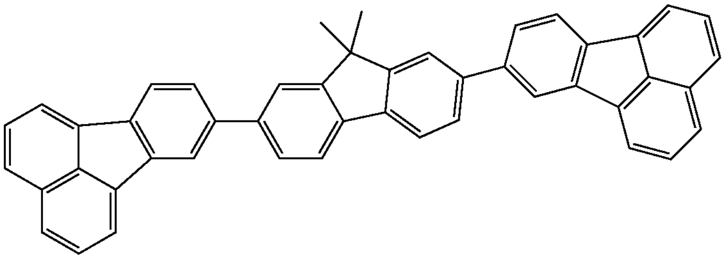

-continued
[Formula 184]
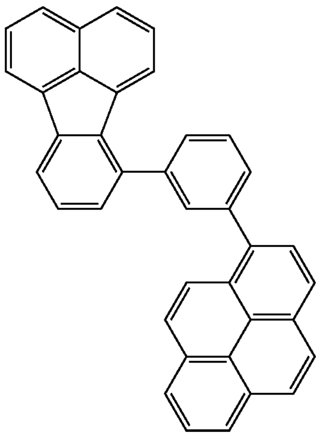
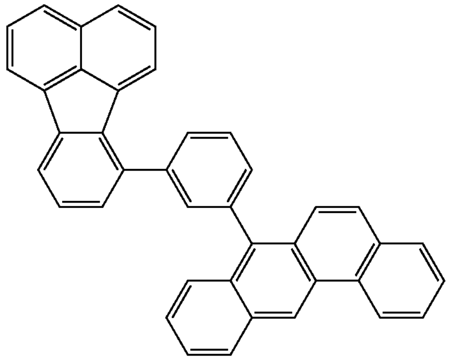
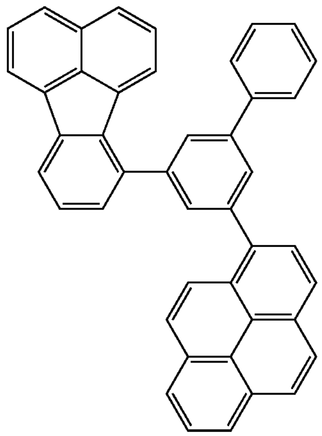
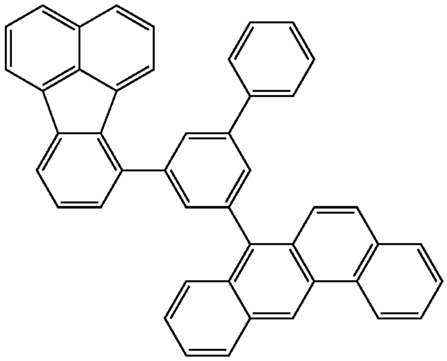
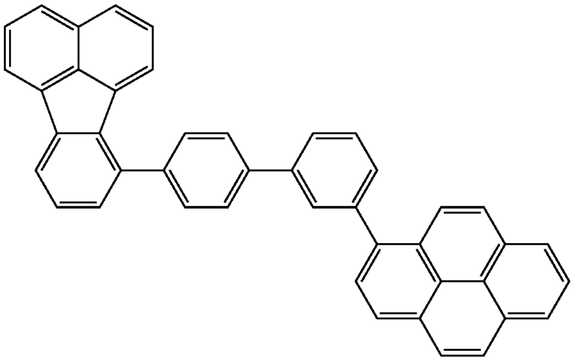
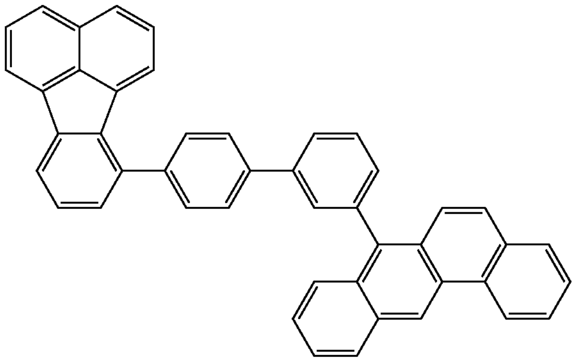
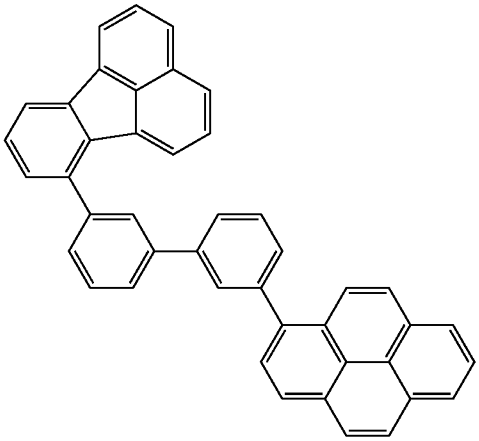
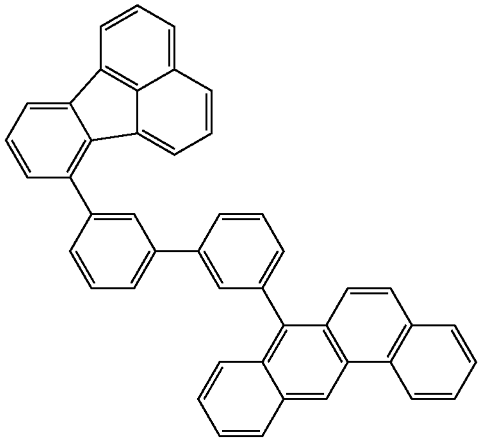

-continued
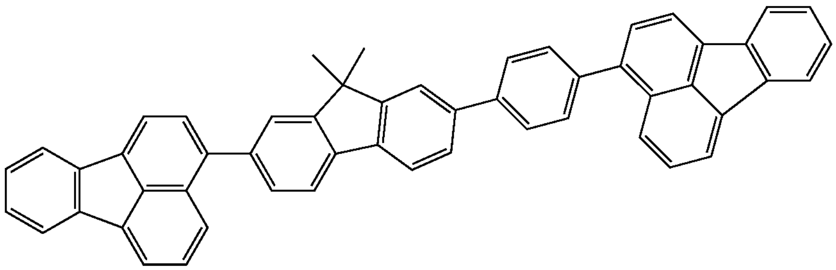
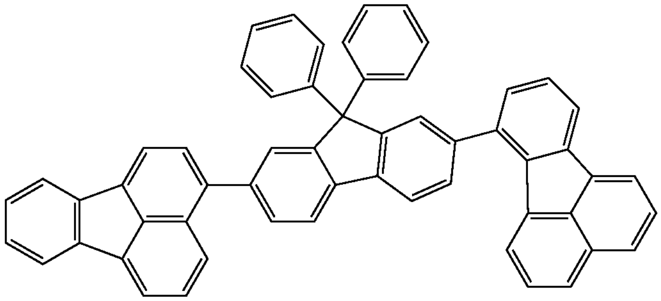
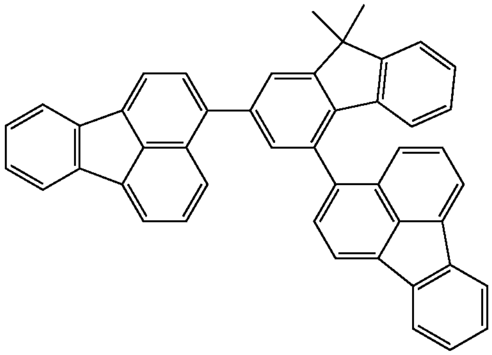
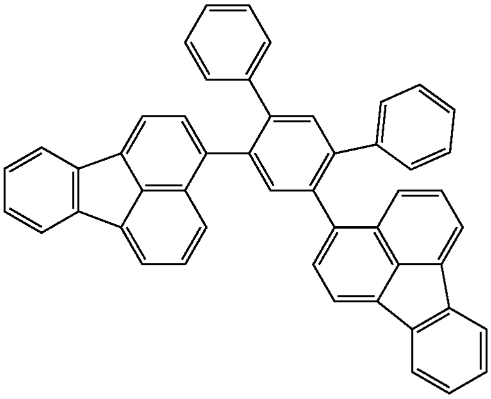
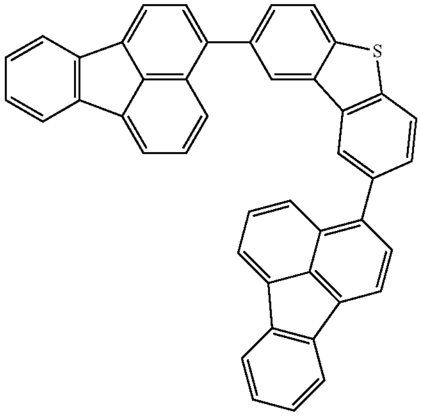
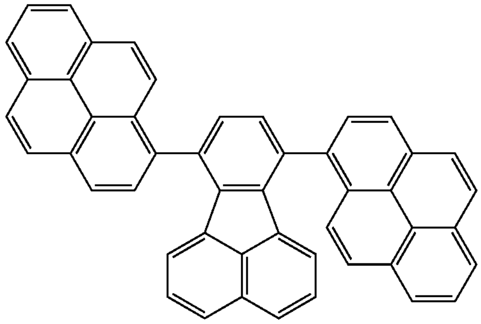

-continued
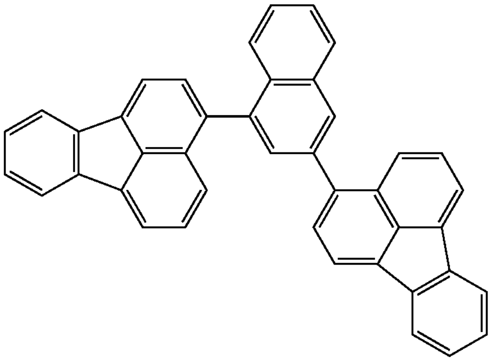
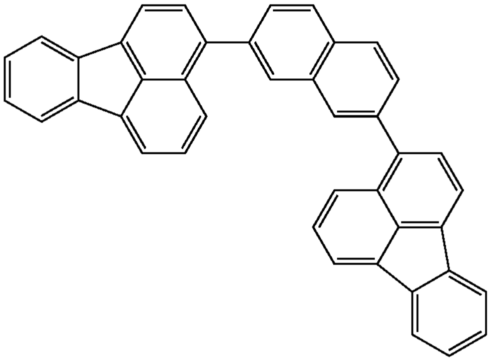
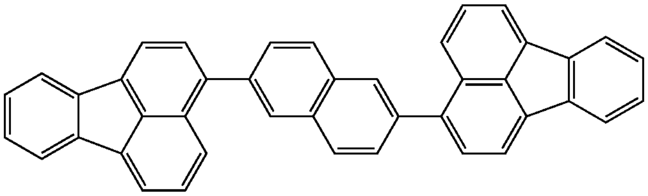
[Formula 185]
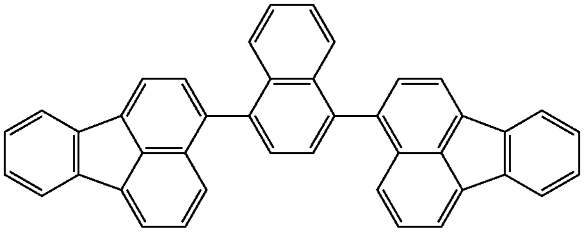
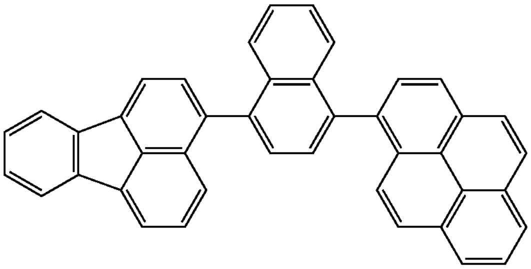
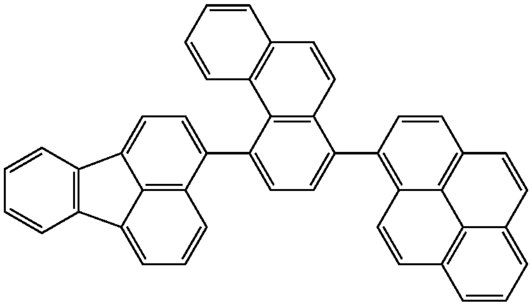
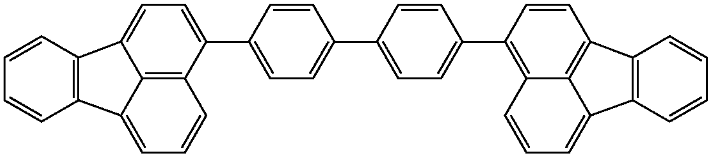
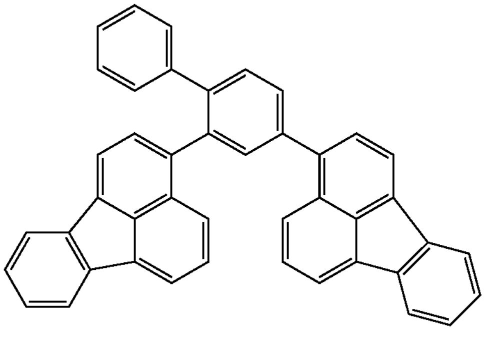
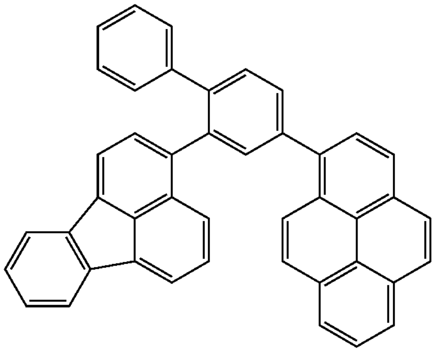

-continued
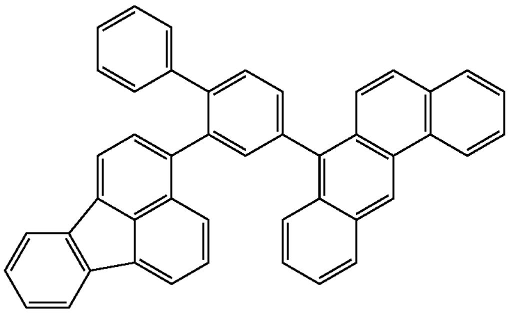
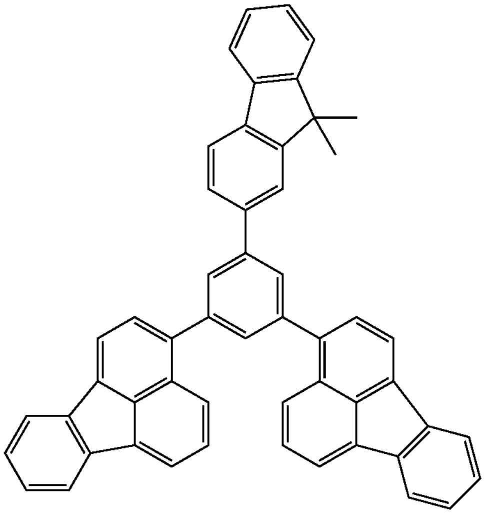
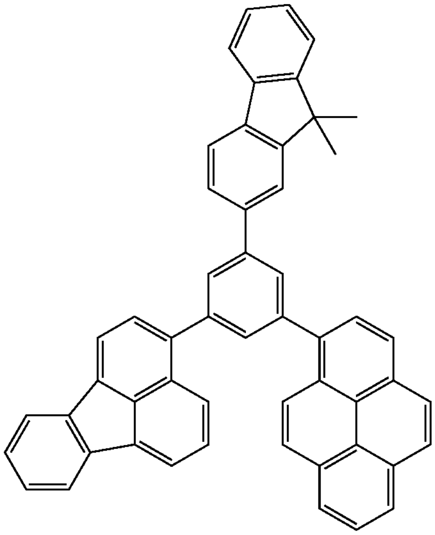
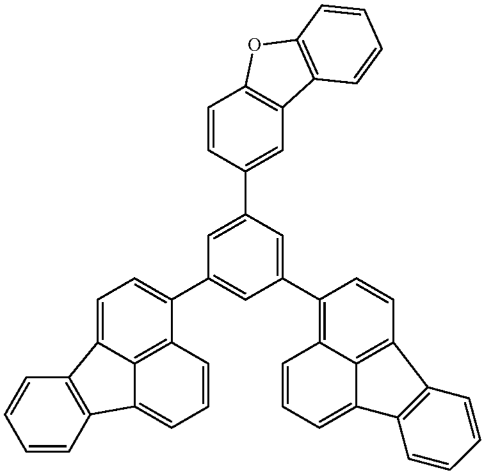
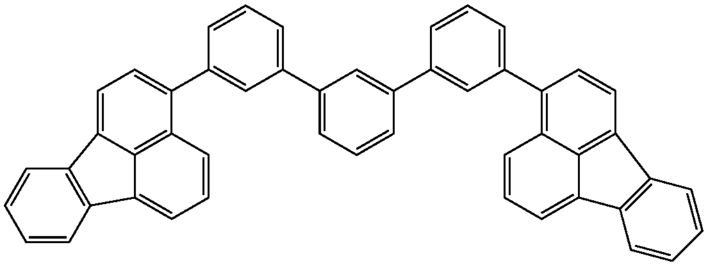
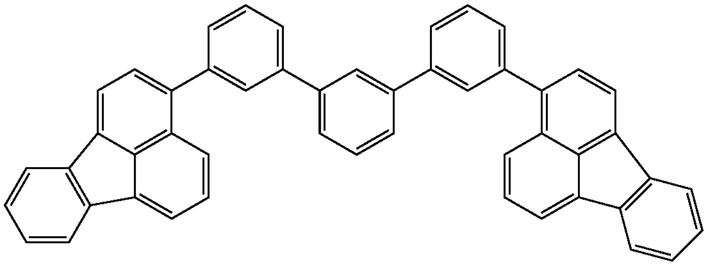

-continued
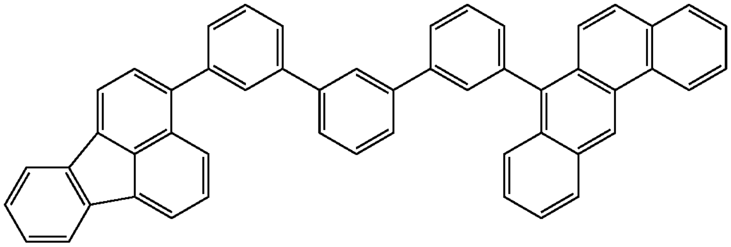
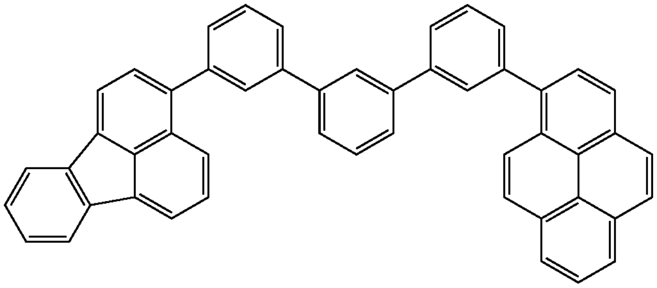
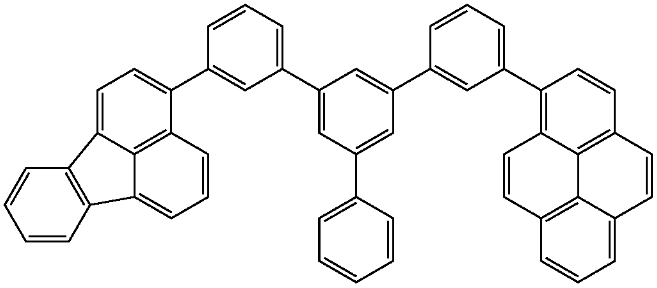
[Formula 186]
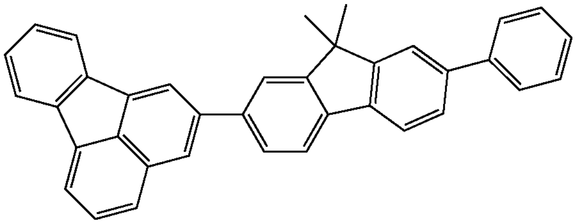
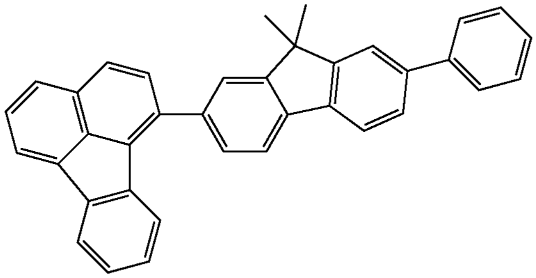
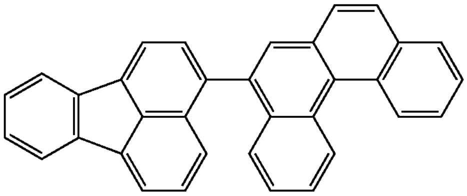
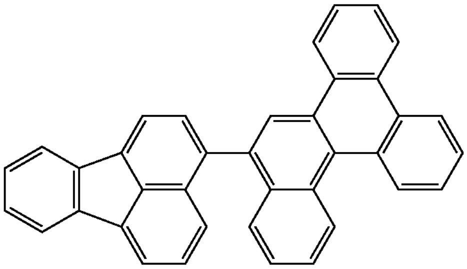
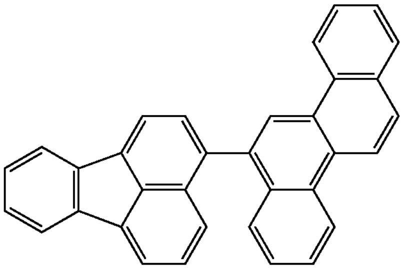
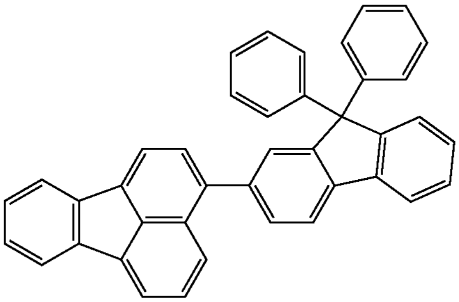

-continued
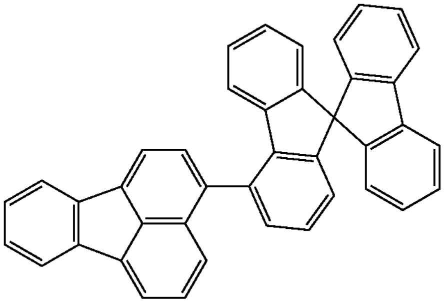
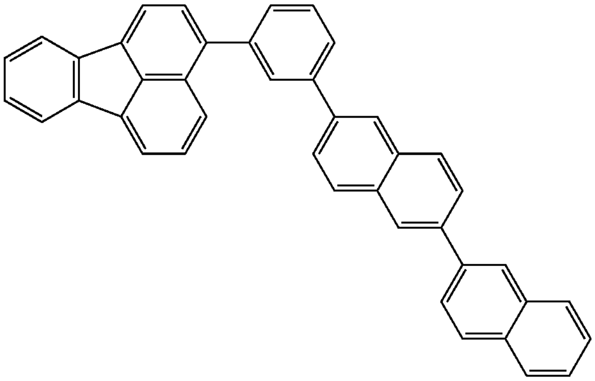
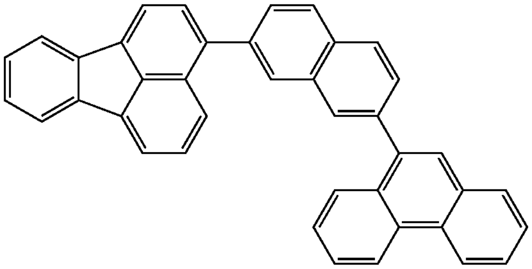
[Formula 187]
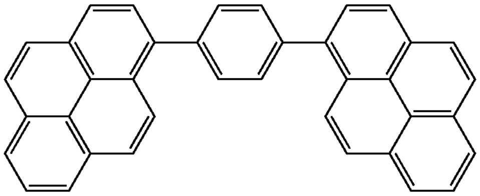
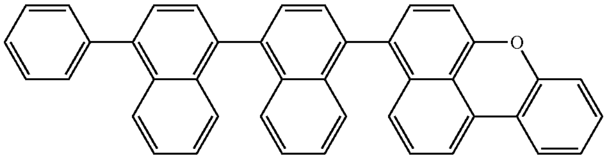
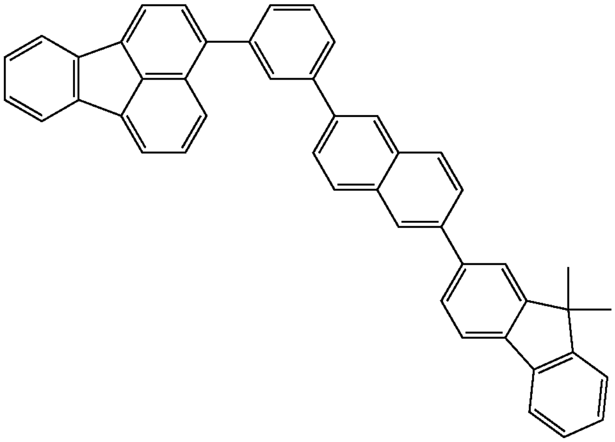
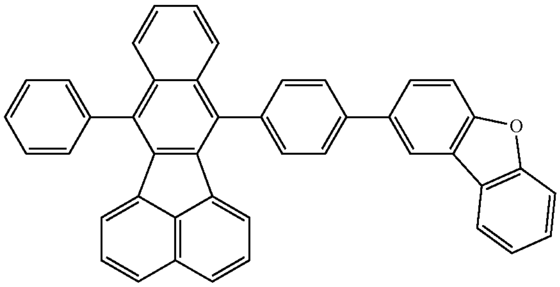
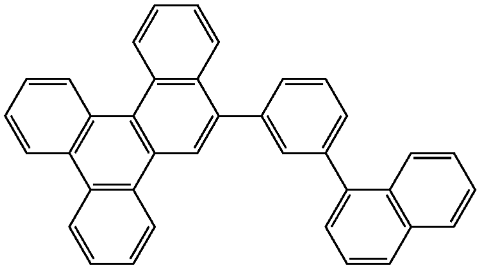

-continued
[Formula 188]
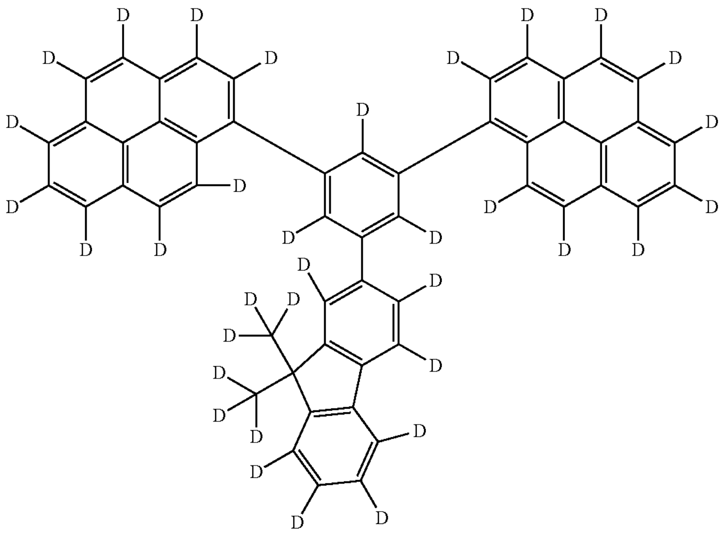
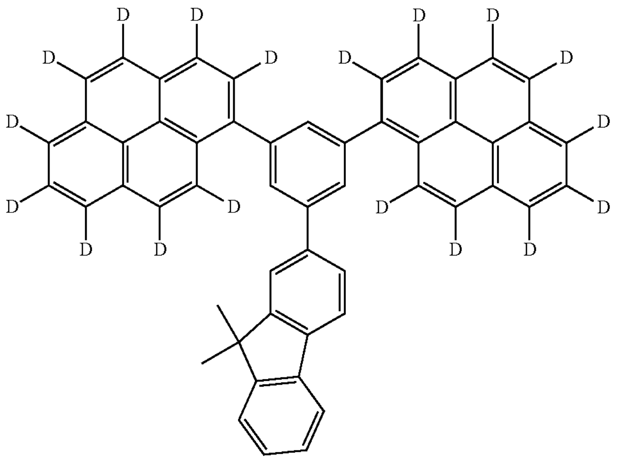
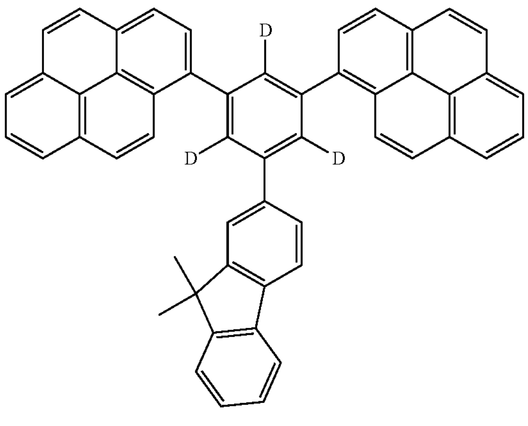
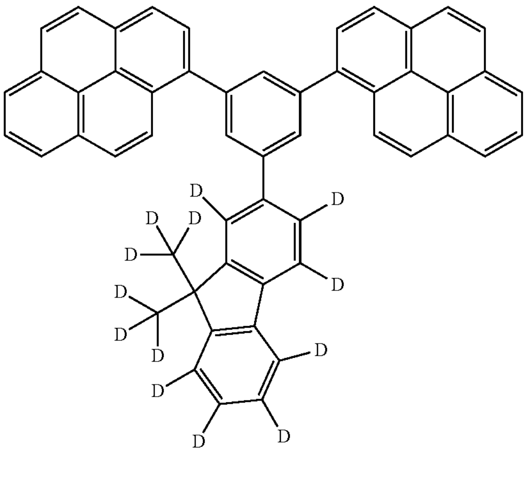

-continued
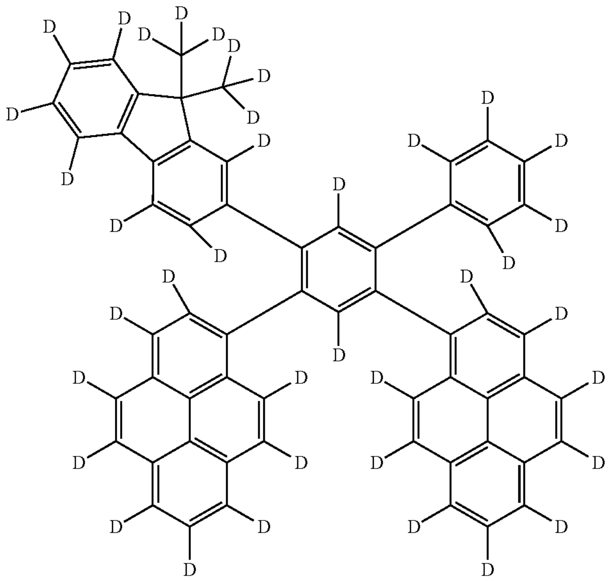
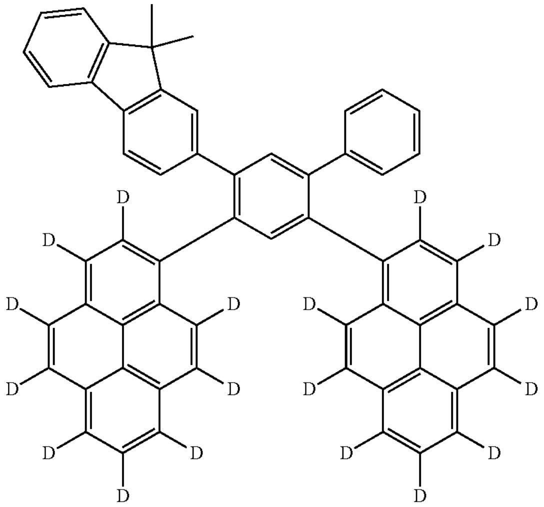
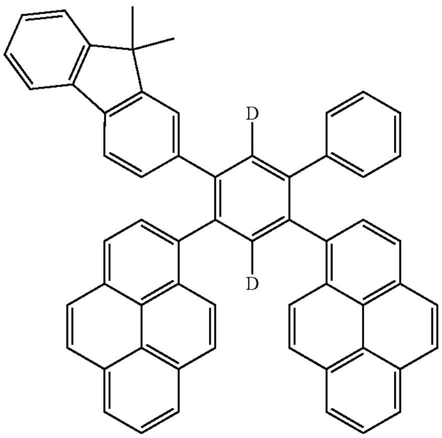
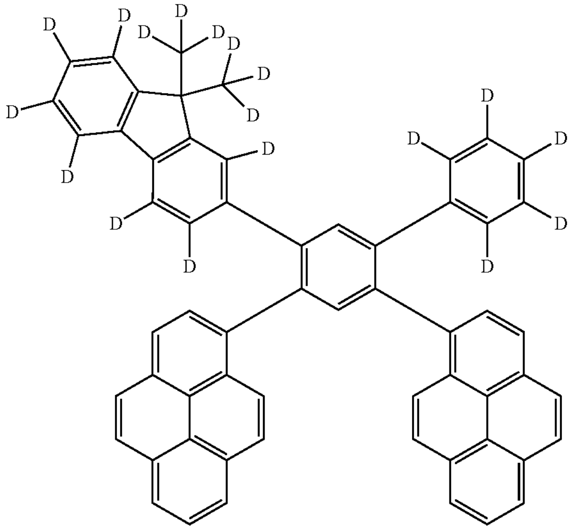

-continued
[Formula 189]
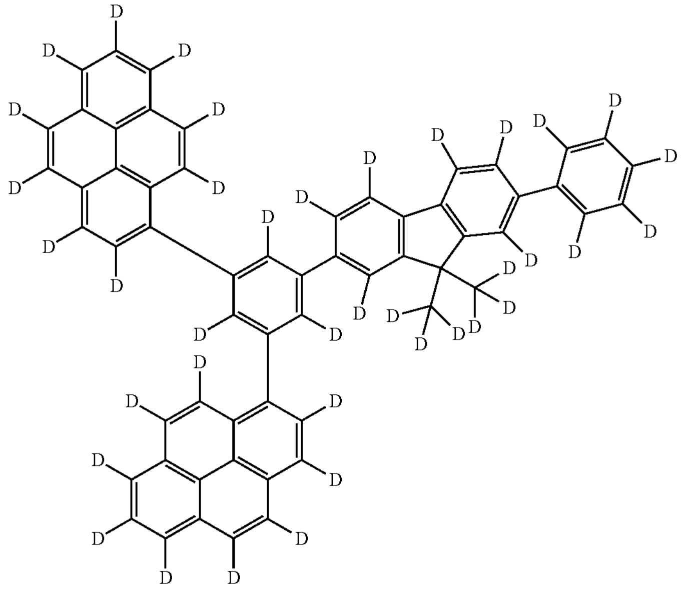
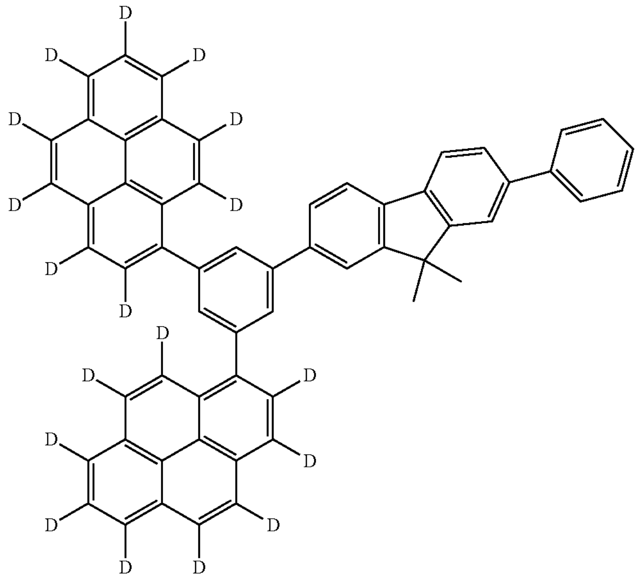
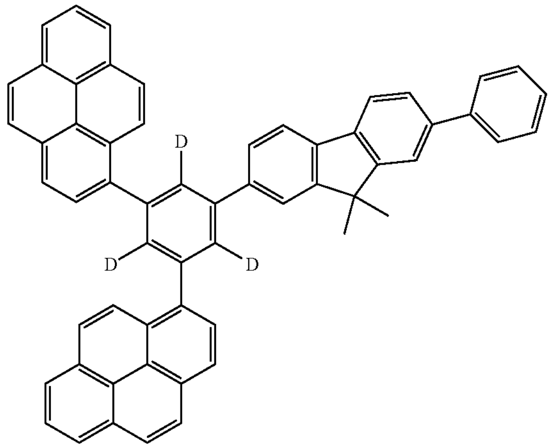

-continued
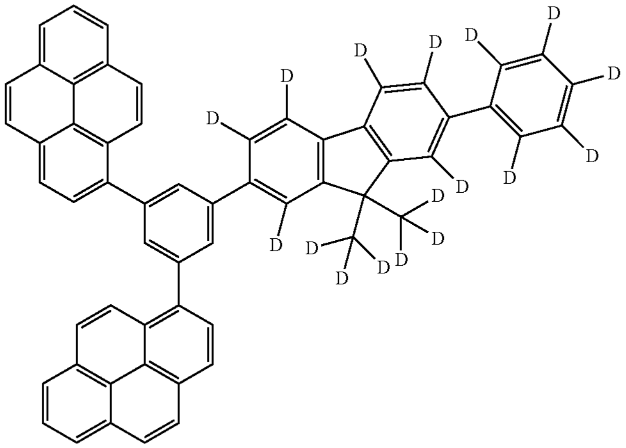
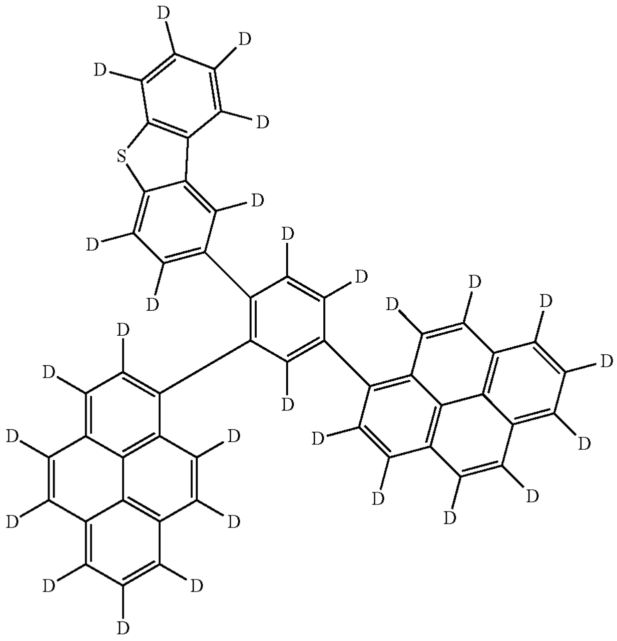
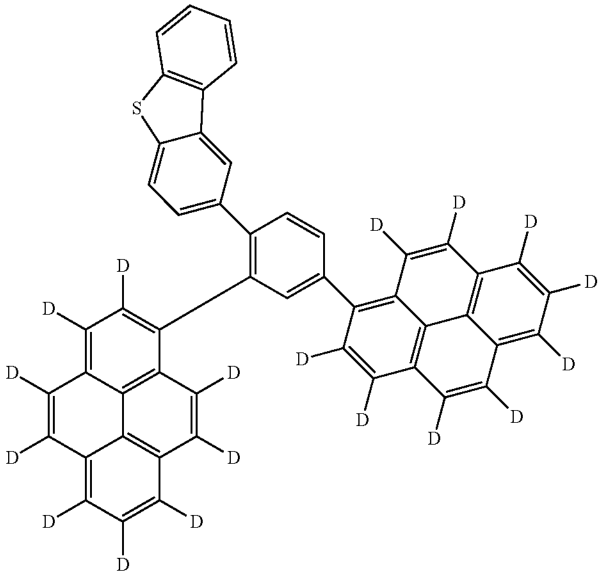
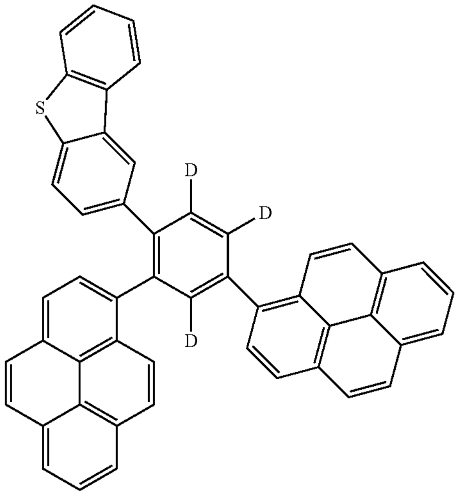

-continued
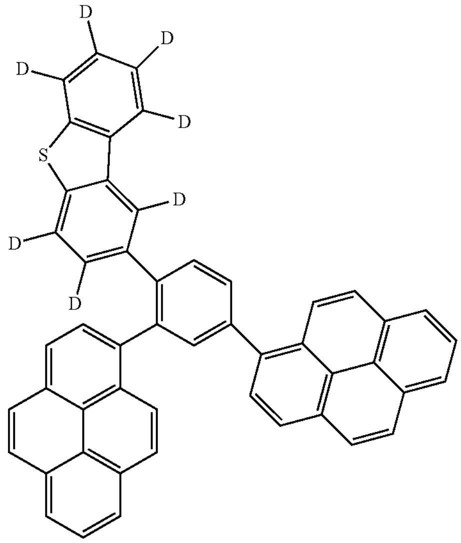
[Formula 198]
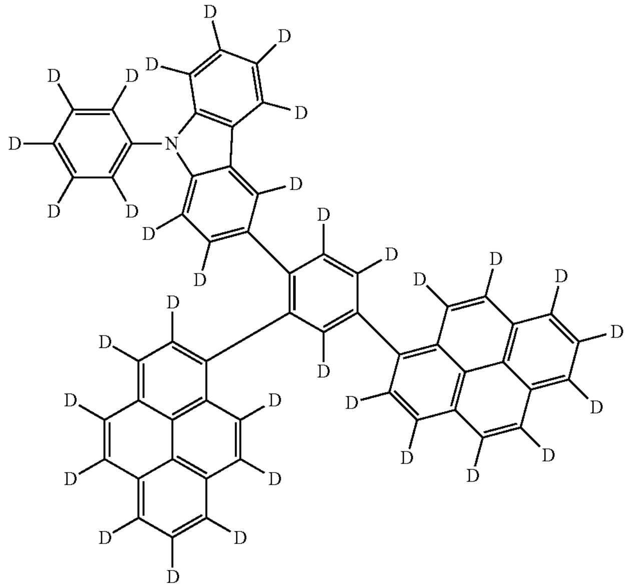
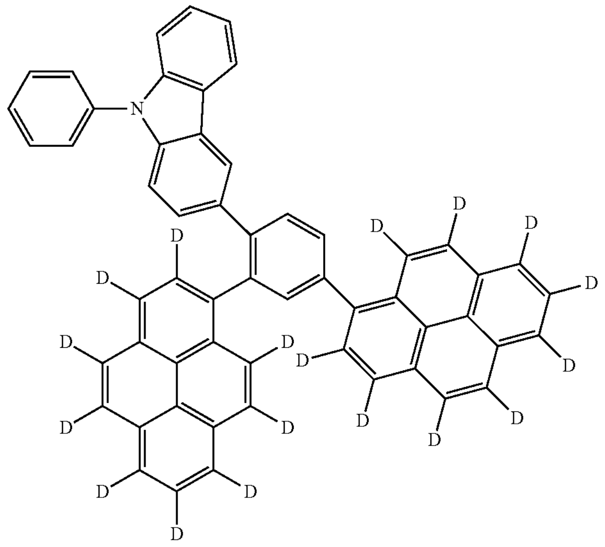

-continued
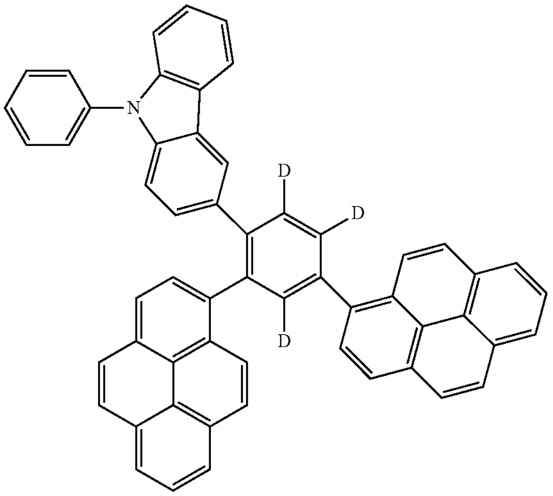
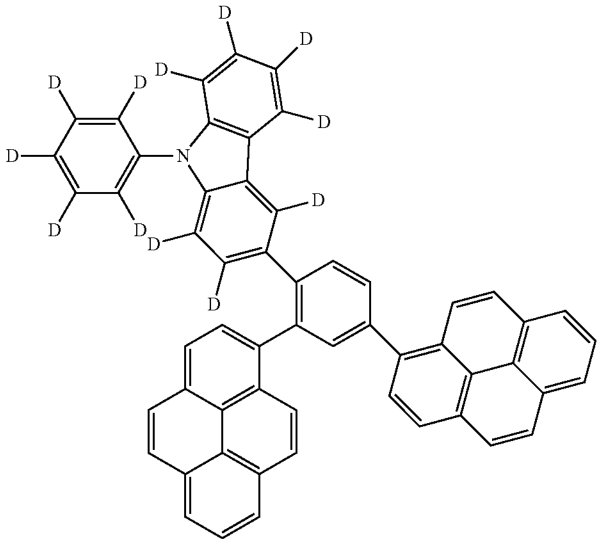 [SMILES: [2H]c1c([2H])c([2H])c(-n2c3c([2H])c([2H])c([2H])c([2H])c3c3c([2H])c(-c4ccc(-c5ccc6ccc7cccc8ccc5c6c78)cc4-c4ccc5ccc6cccc7ccc4c5c67)c([2H])c([2H])c32)c([2H])c1[2H]]
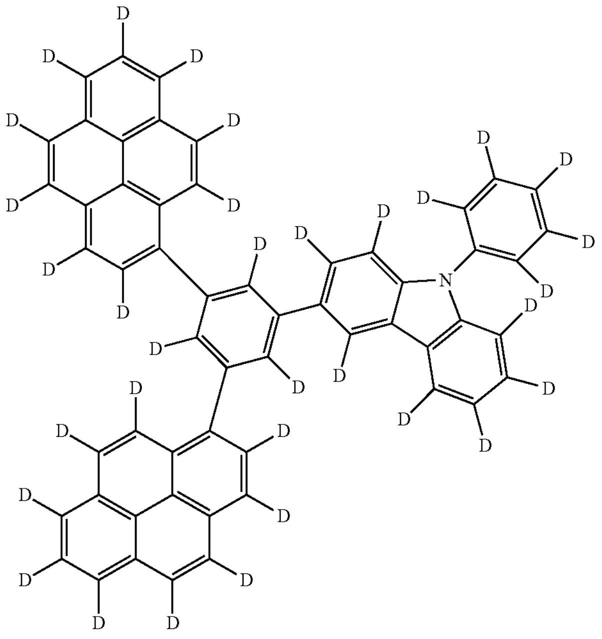

-continued
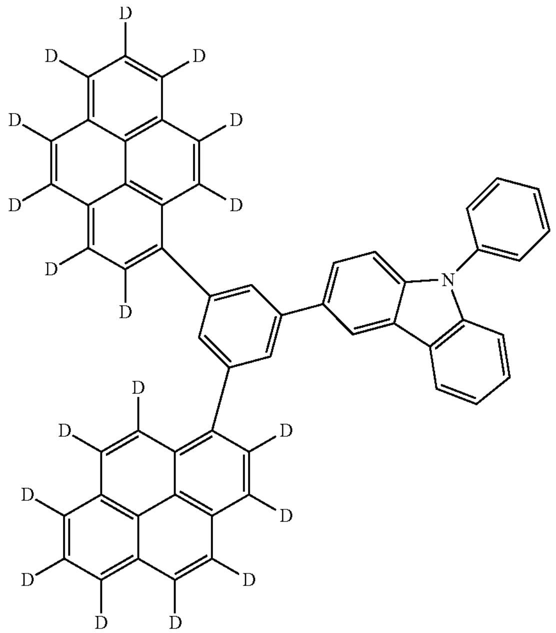
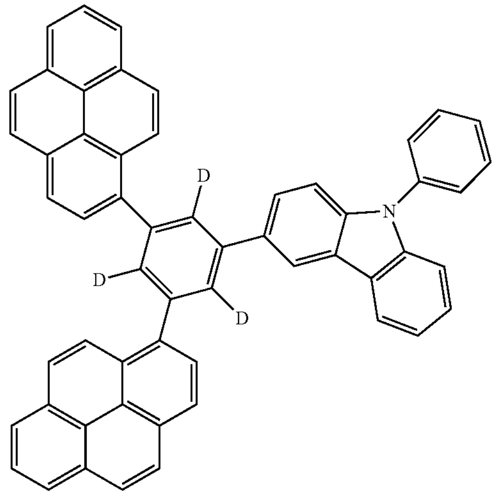
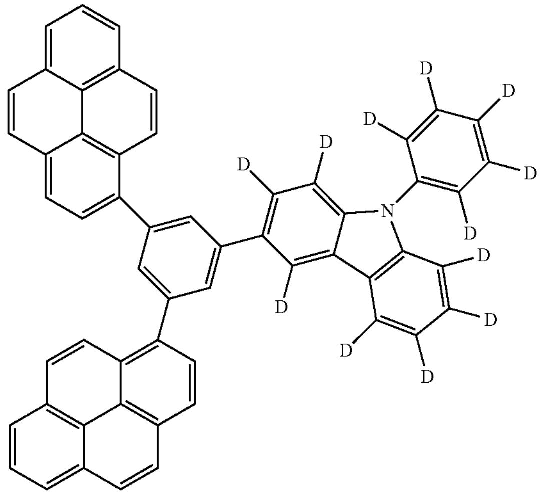 [SMILES: [2H]c1c([2H])c([2H])c(-n2c3c([2H])c([2H])c([2H])c([2H])c3c3c([2H])c(-c4cc(-c5ccc6ccc7cccc8ccc5c6c78)cc(-c5ccc6ccc7cccc8ccc5c6c78)c4)c([2H])c([2H])c32)c([2H])c1[2H]]

[Formula 191]
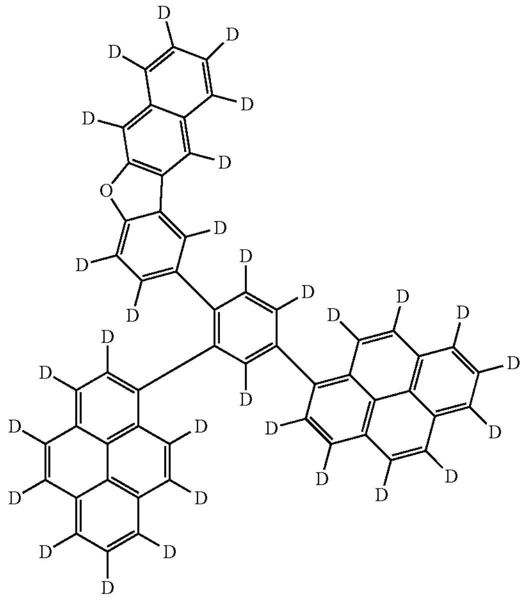
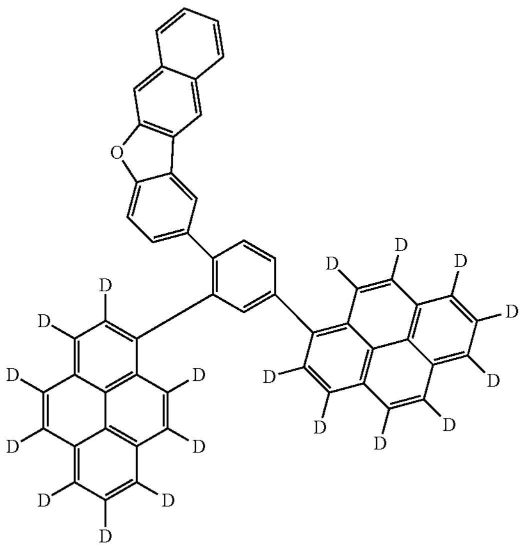
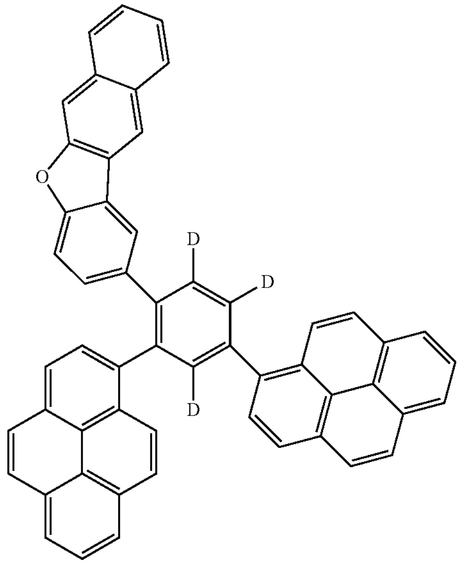
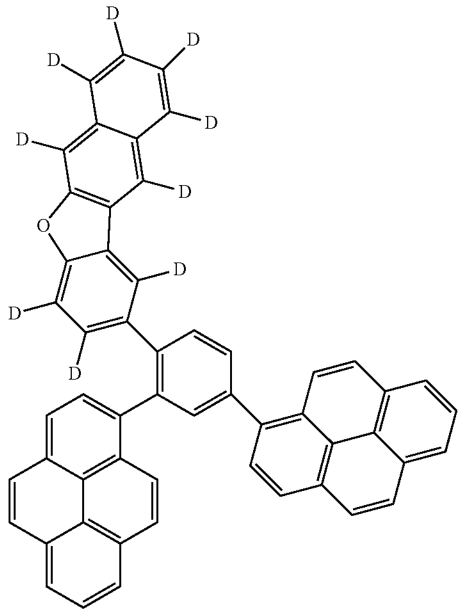

-continued
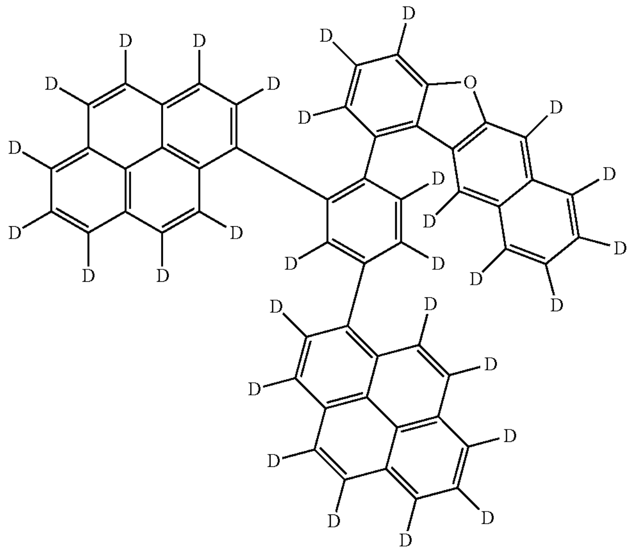
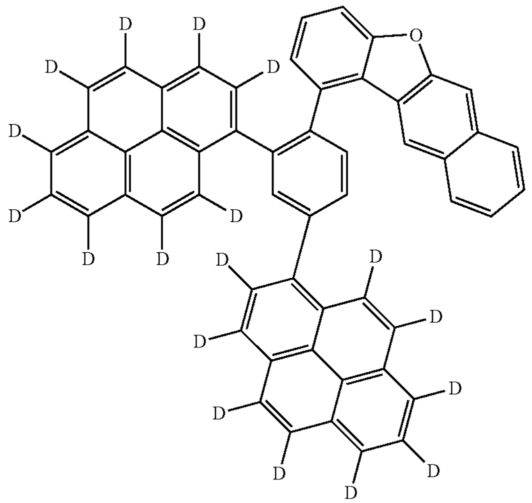
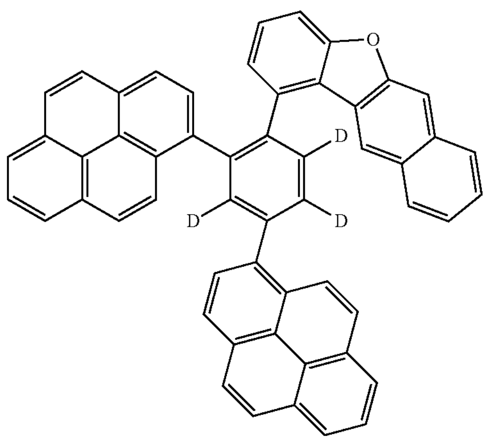
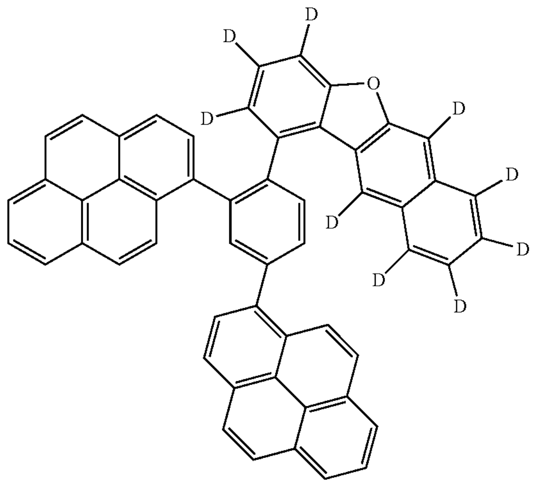

-continued
[Formula 192]
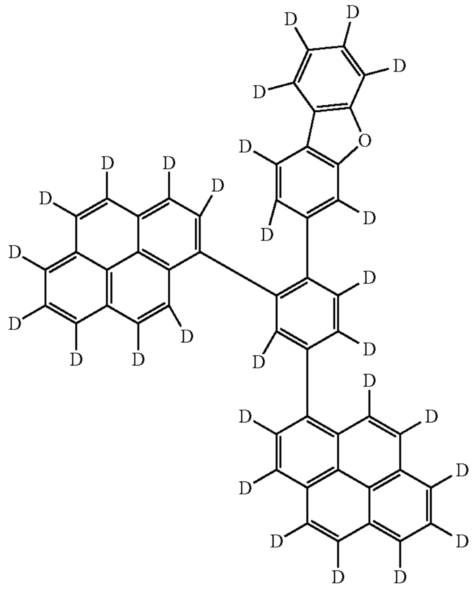
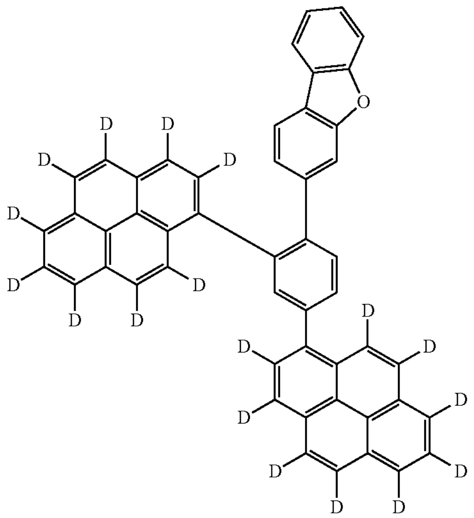
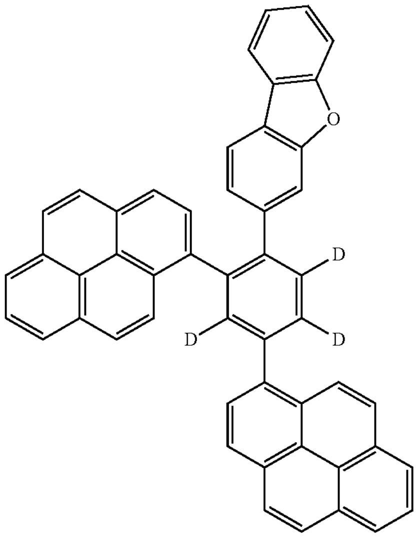
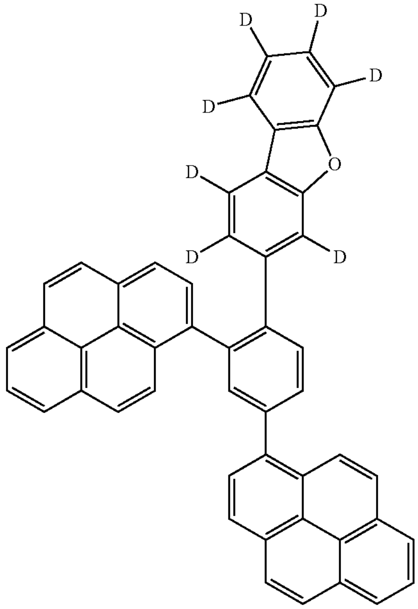

-continued
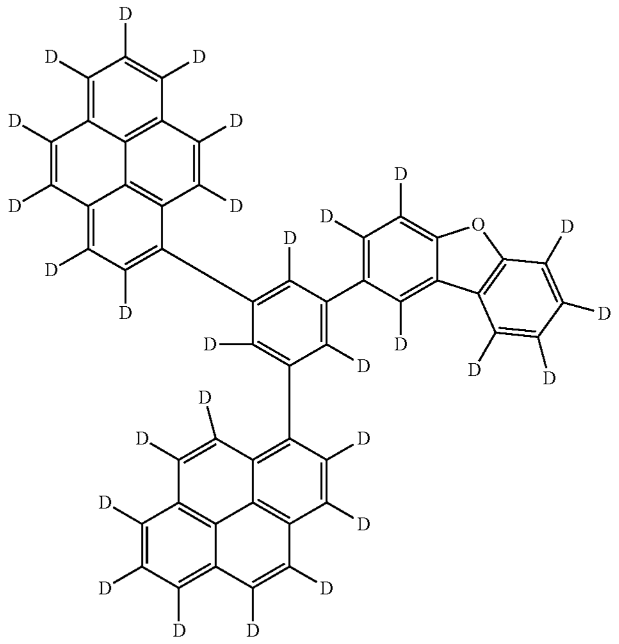
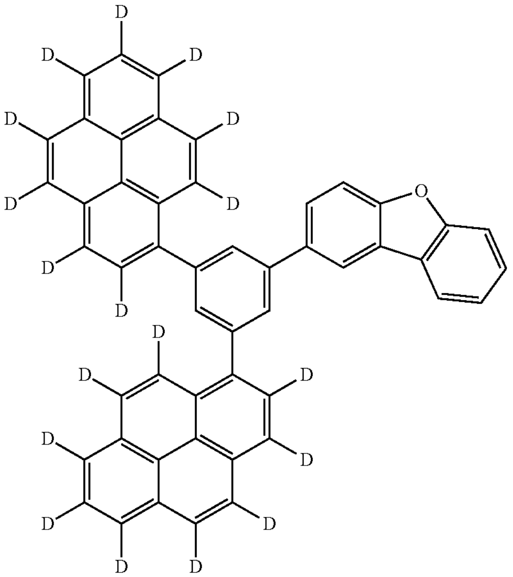
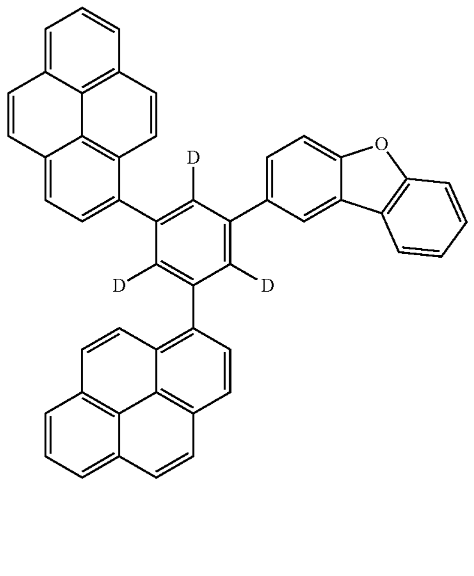
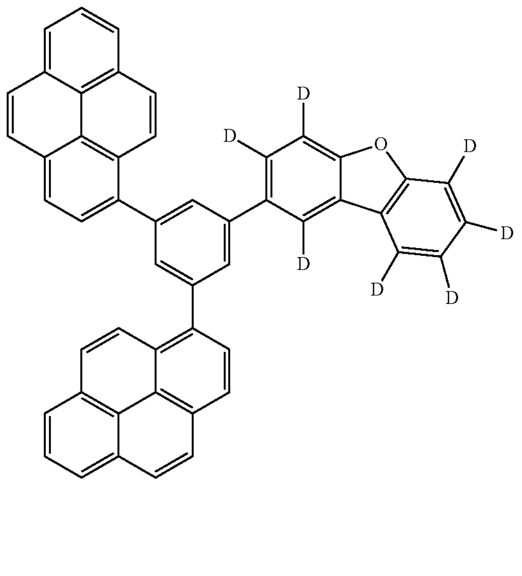

-continued
[Formula 193]
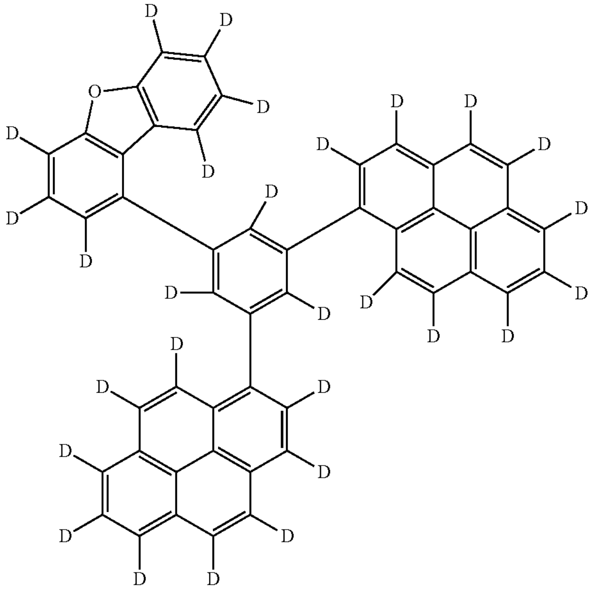
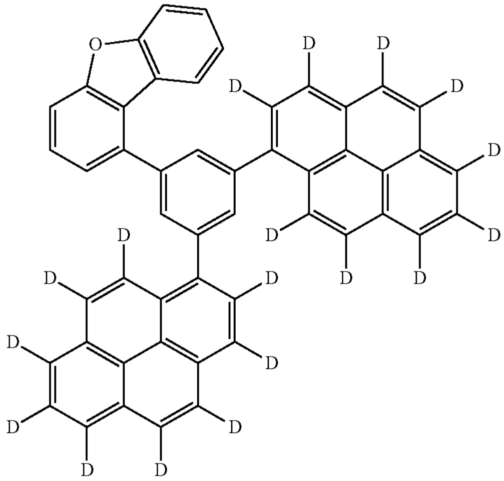
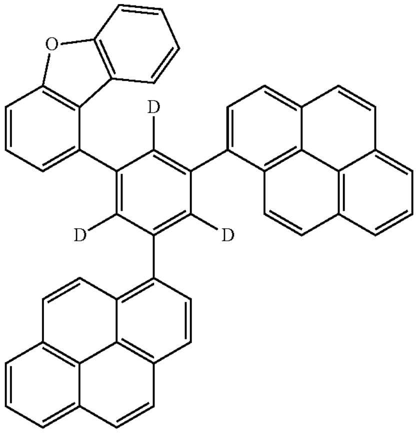
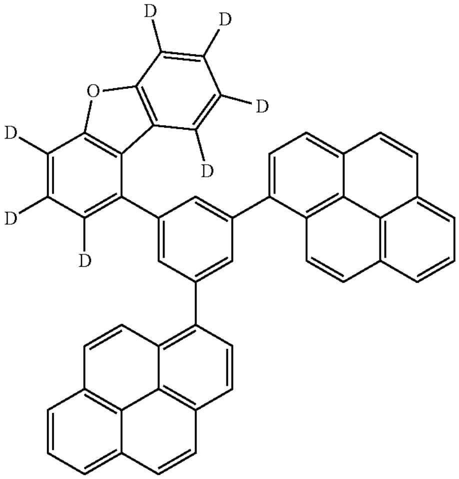
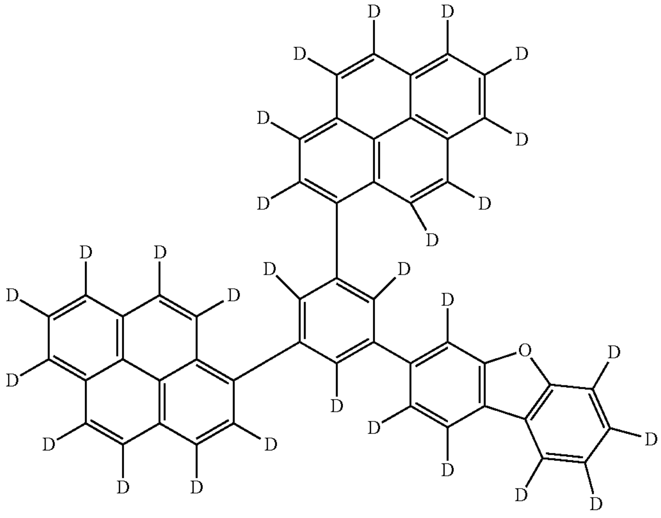

-continued
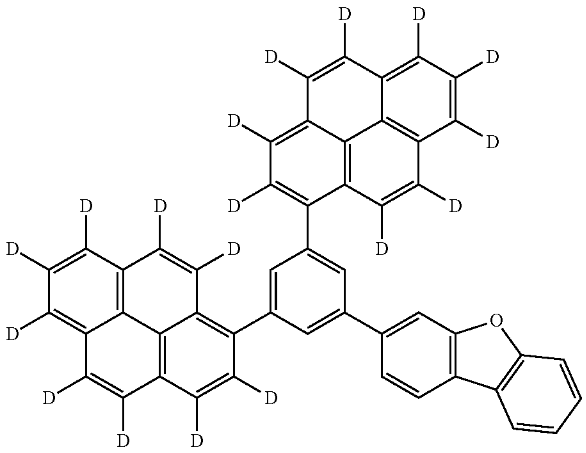
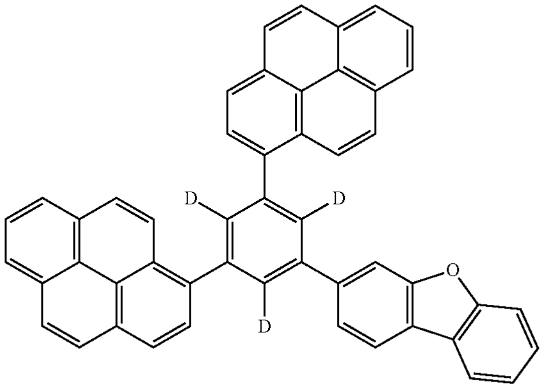
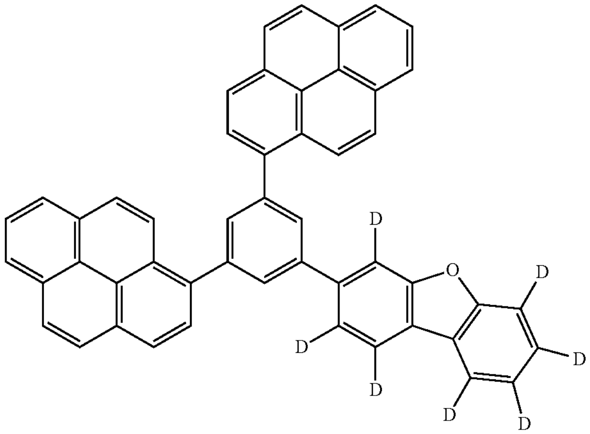
[Formula 194]
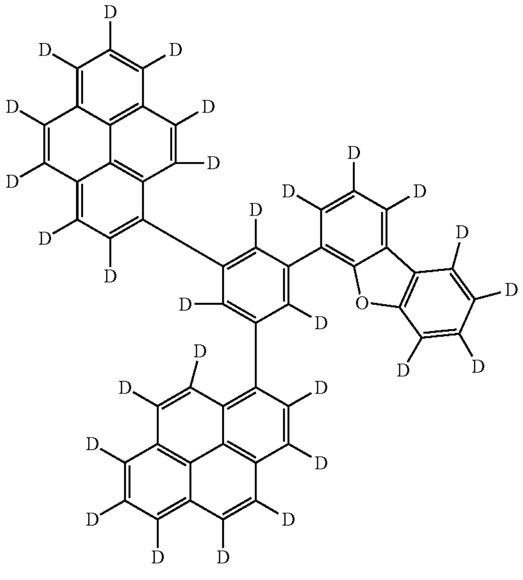
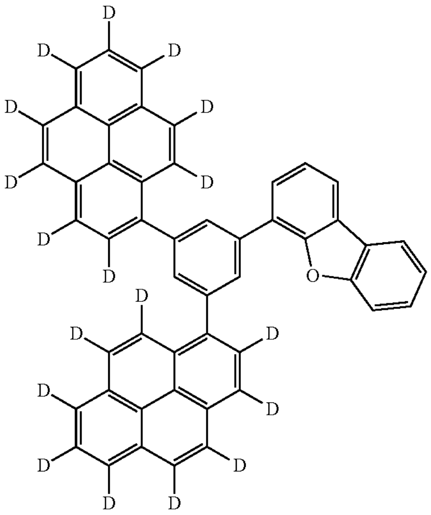

-continued
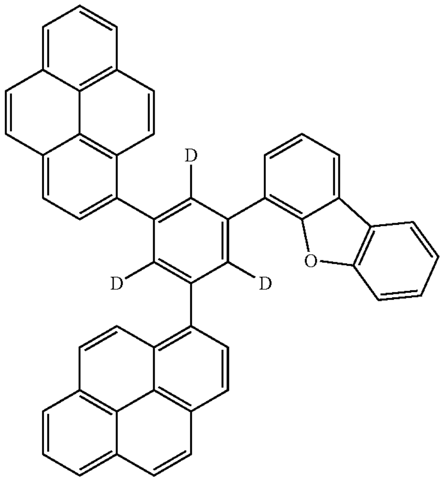
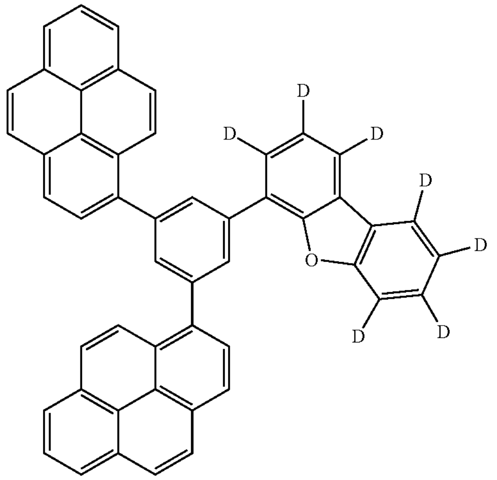
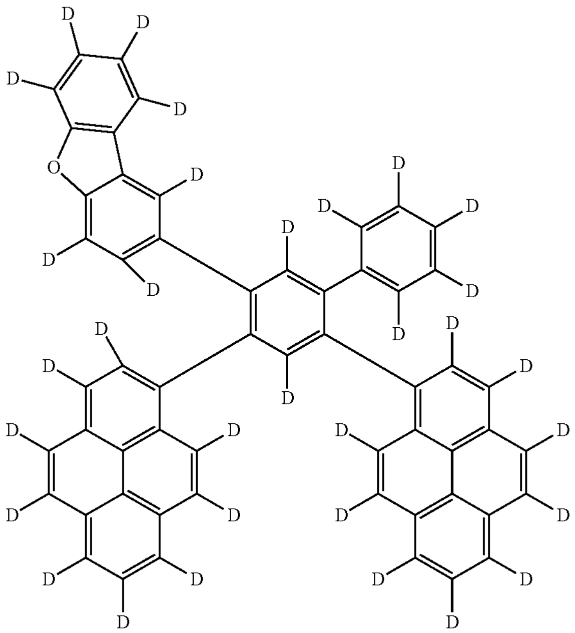
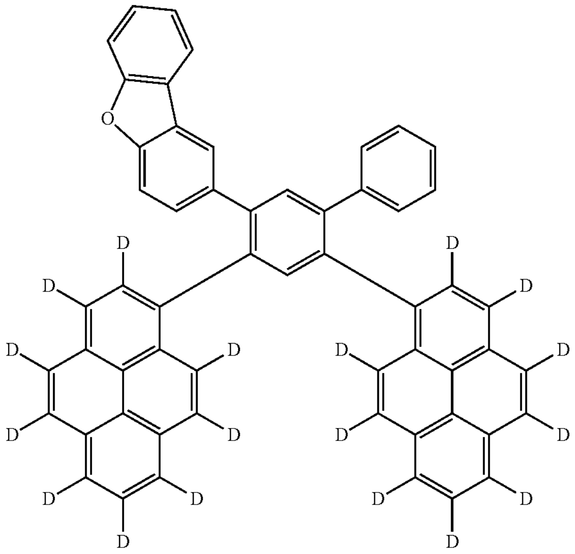
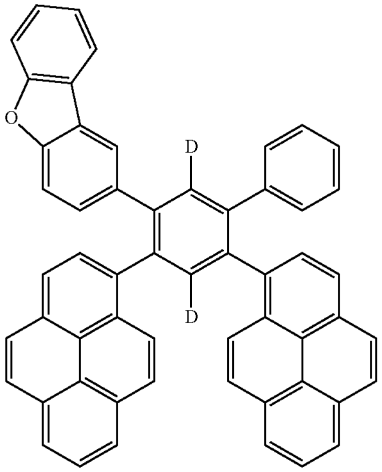

-continued
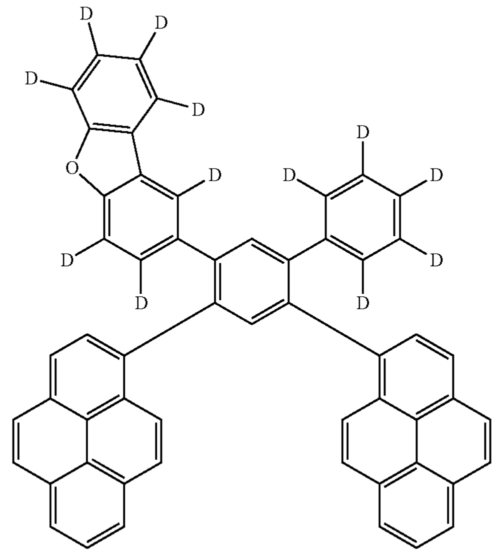
[Formula 195]
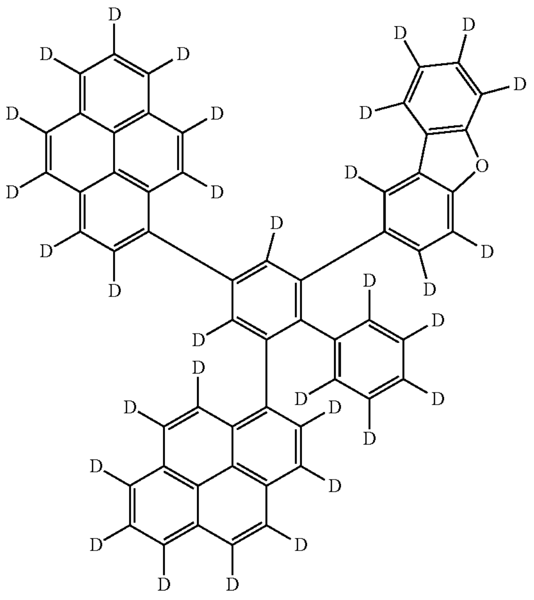
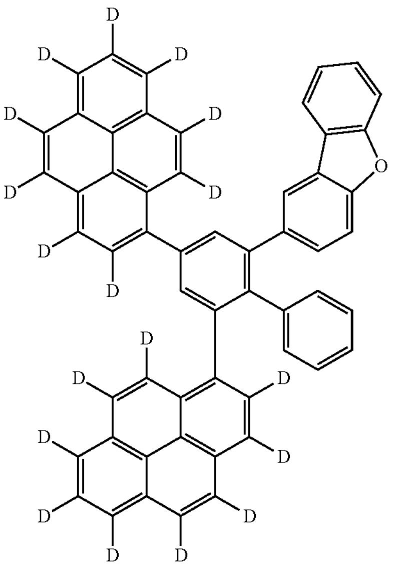

-continued
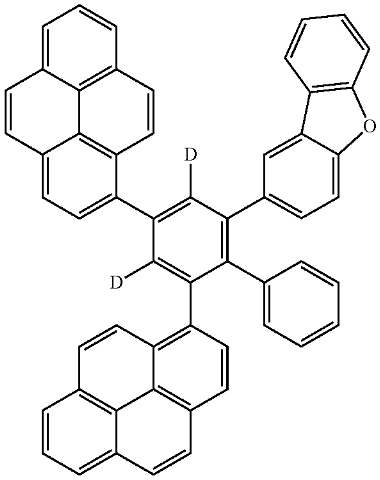
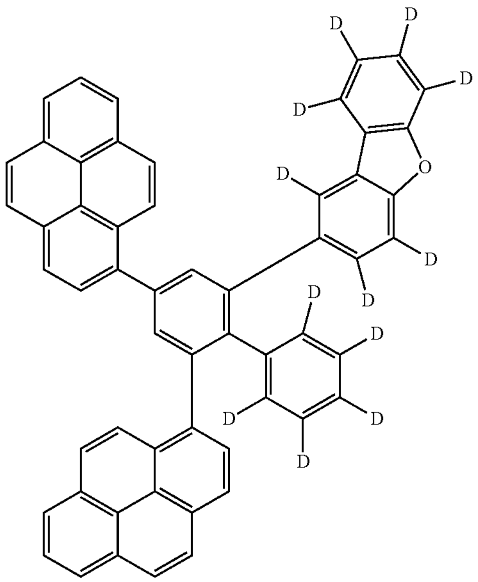
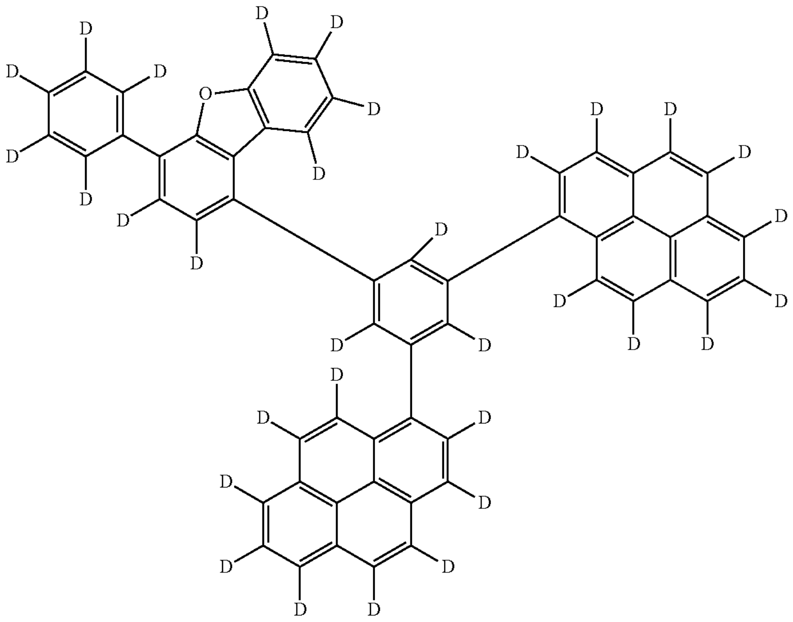
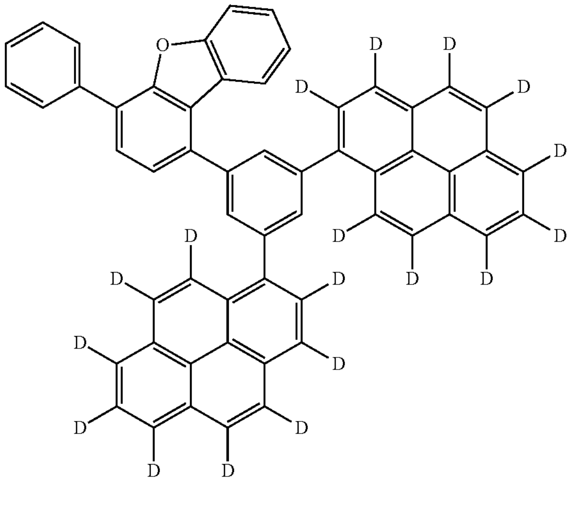
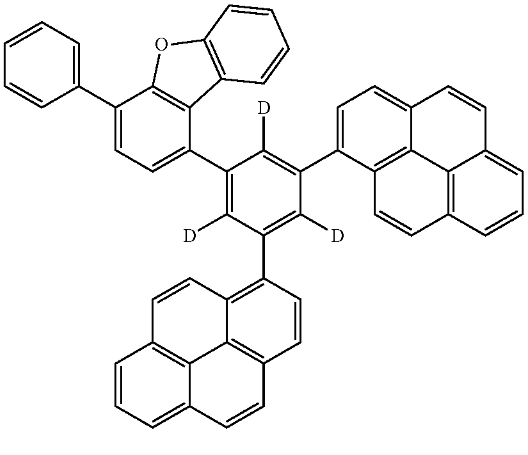

-continued
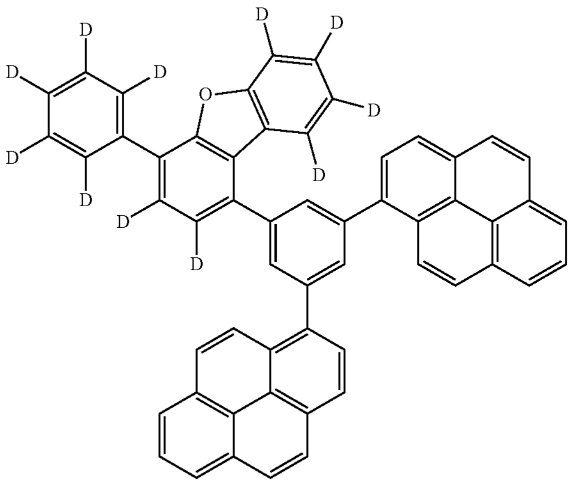
[Formula 196]
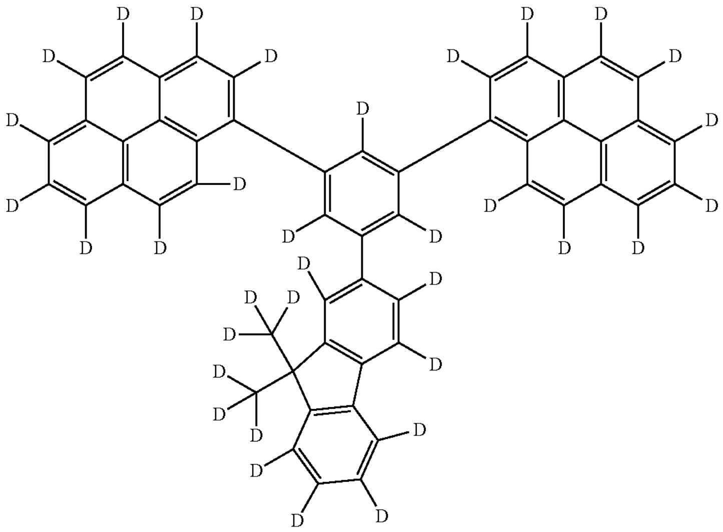
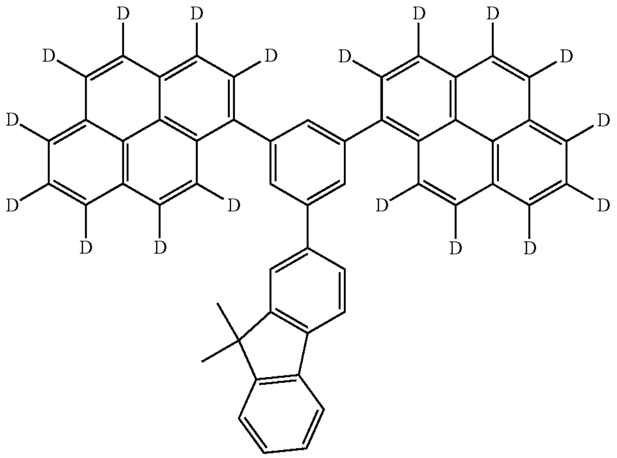

-continued
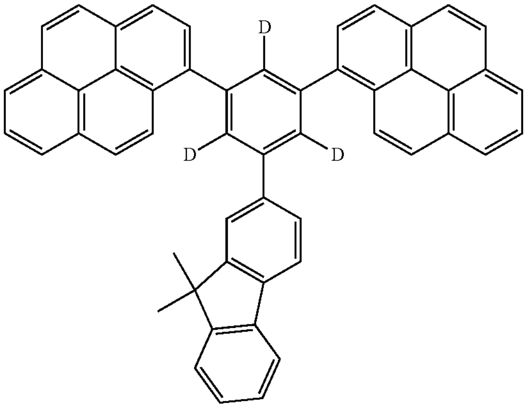
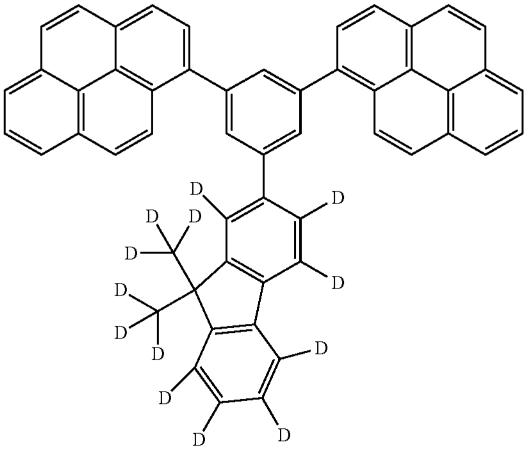
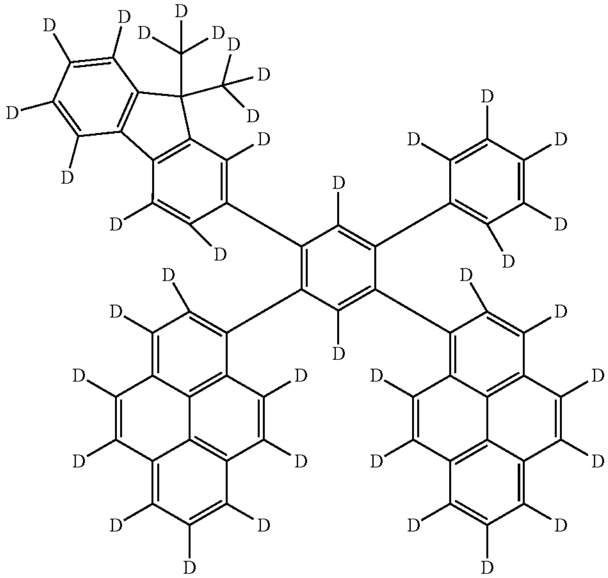
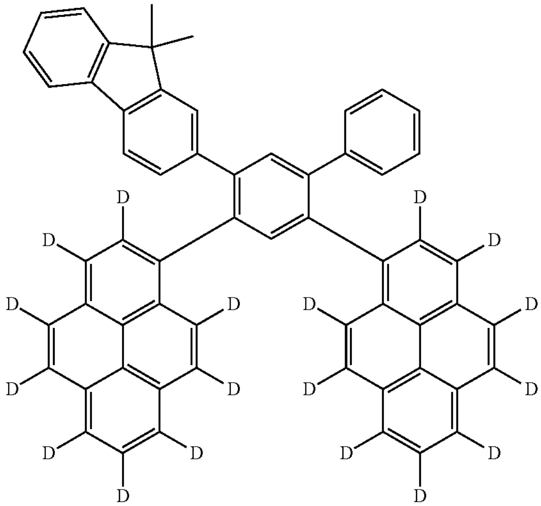
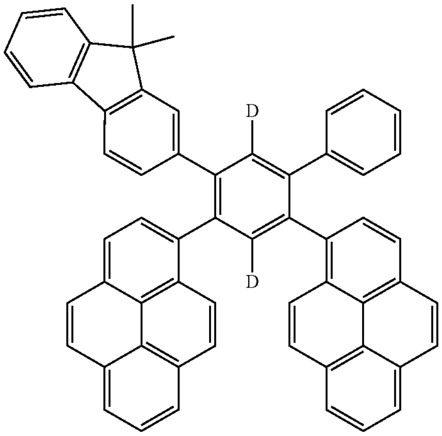

-continued
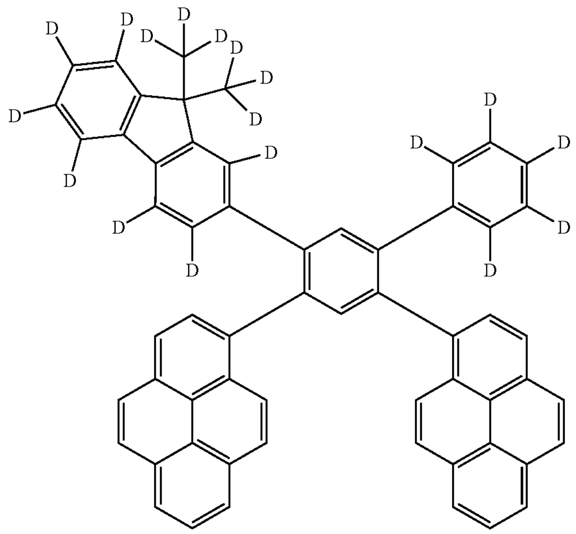
[Formula 197]
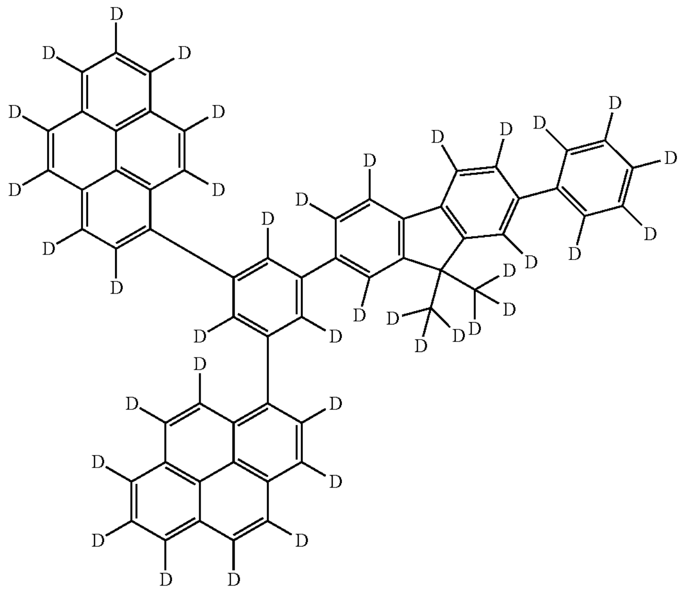

-continued
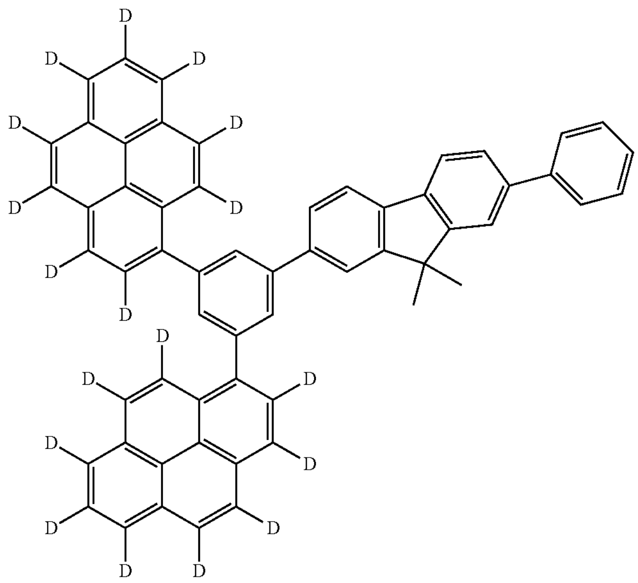
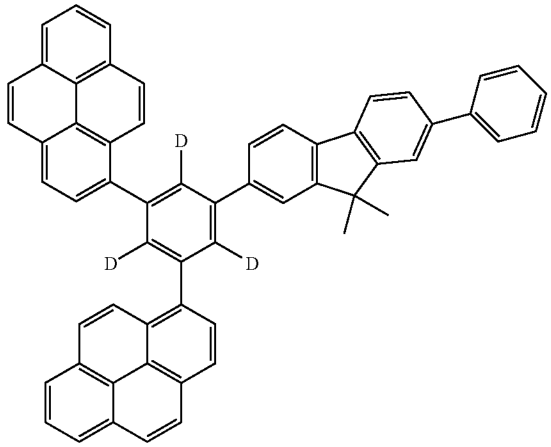
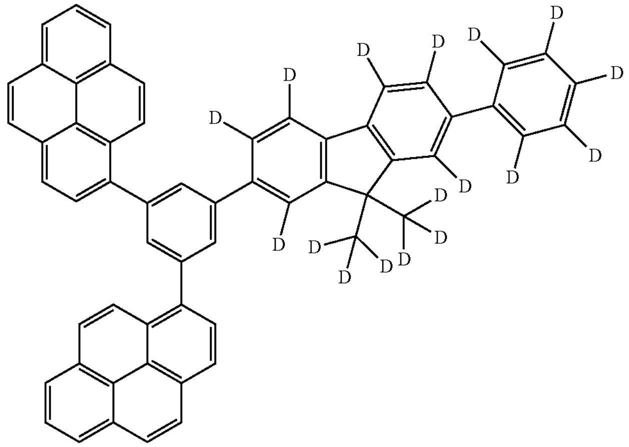

-continued
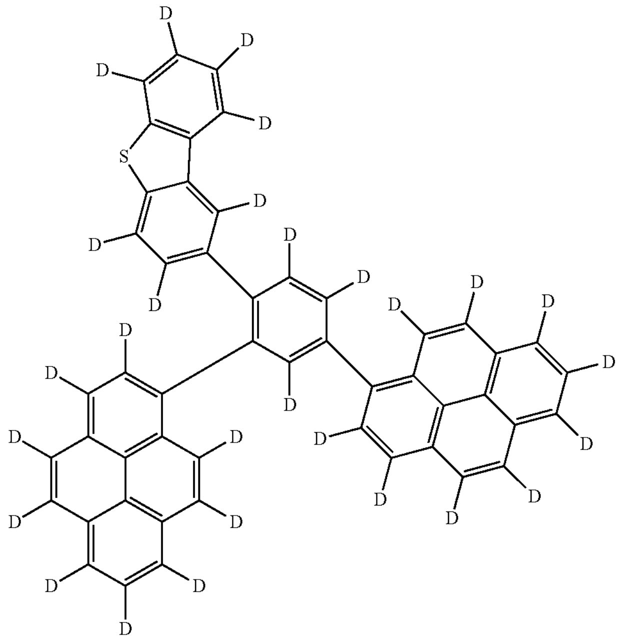
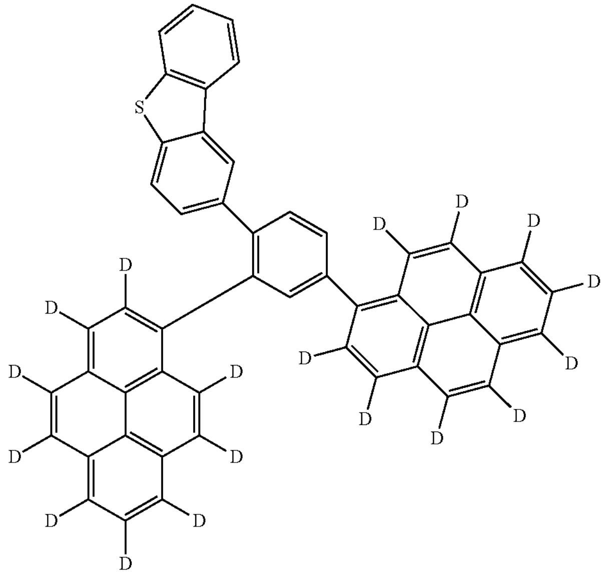
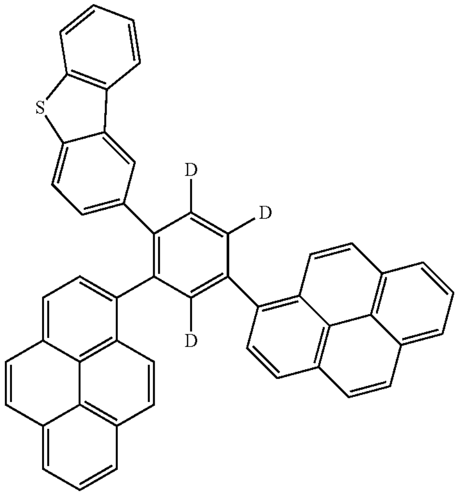

-continued
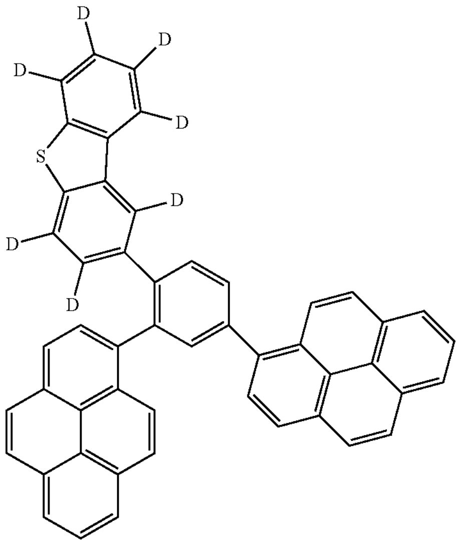
[Formula 198]
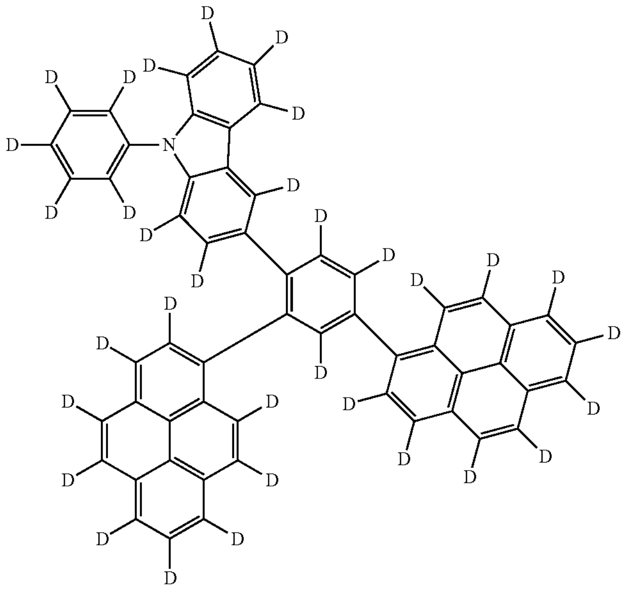
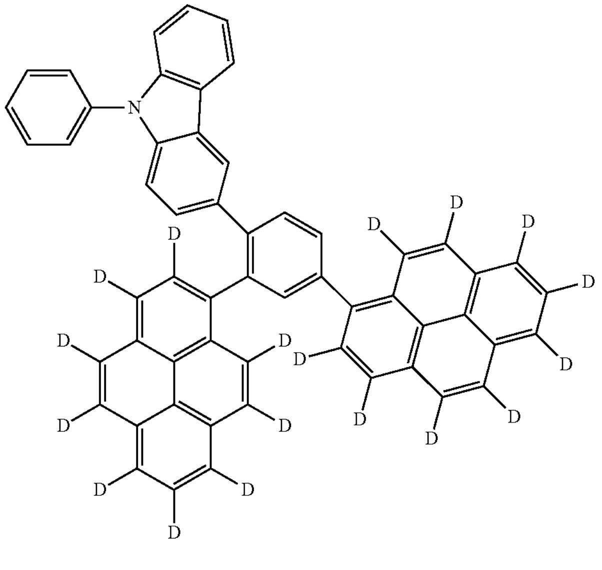

-continued
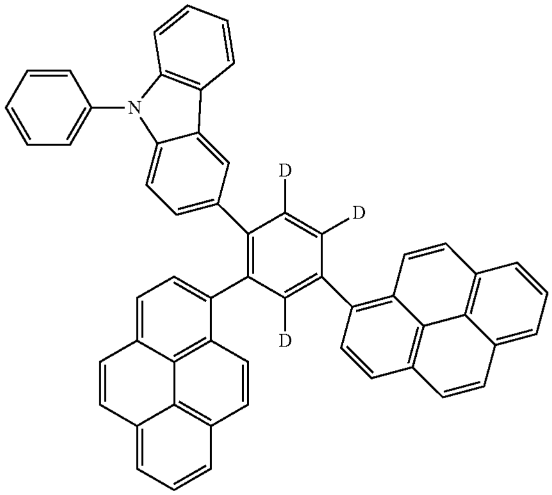
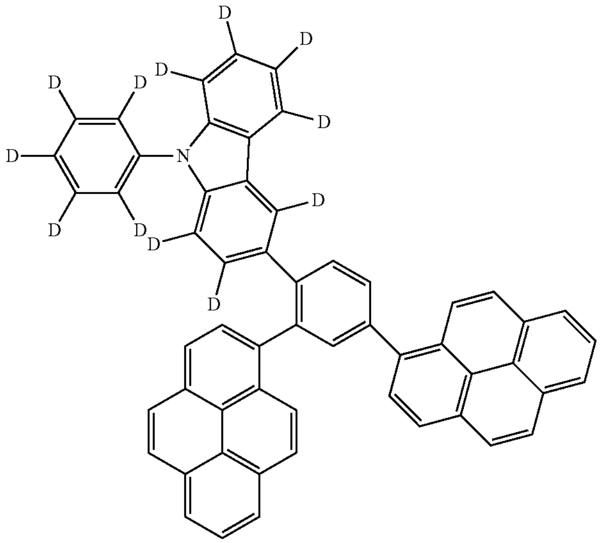 [SMILES: [2H]c1c([2H])c([2H])c(-n2c3c([2H])c([2H])c([2H])c([2H])c3c3c([2H])c(-c4ccc(-c5ccc6ccc7cccc8ccc5c6c78)cc4-c4ccc5ccc6cccc7ccc4c5c67)c([2H])c([2H])c32)c([2H])c1[2H]]
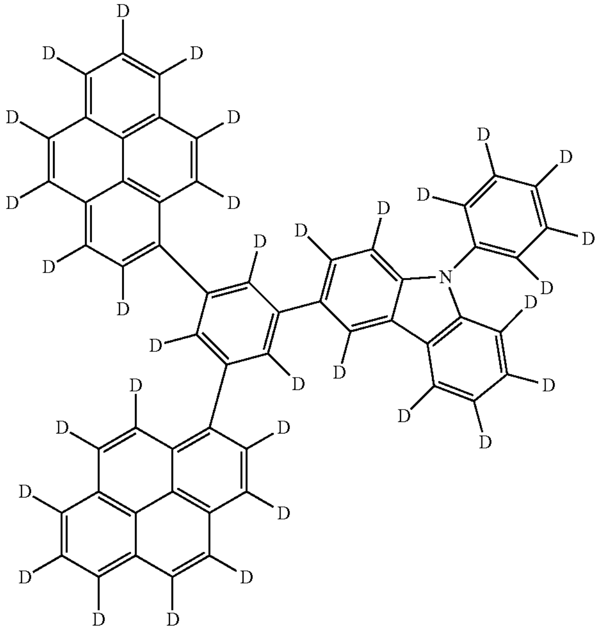

-continued
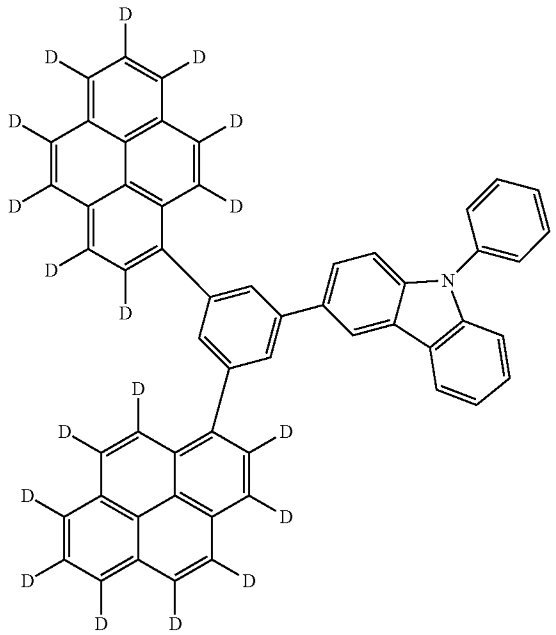
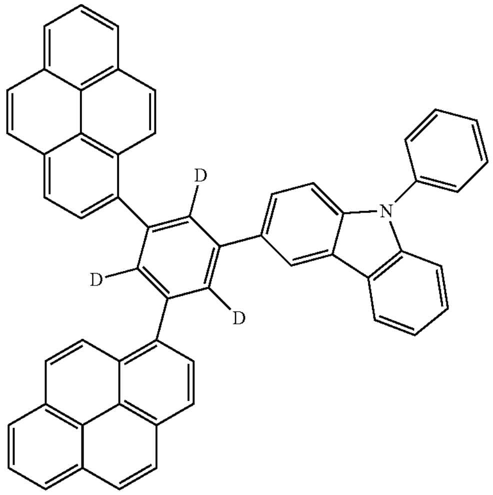
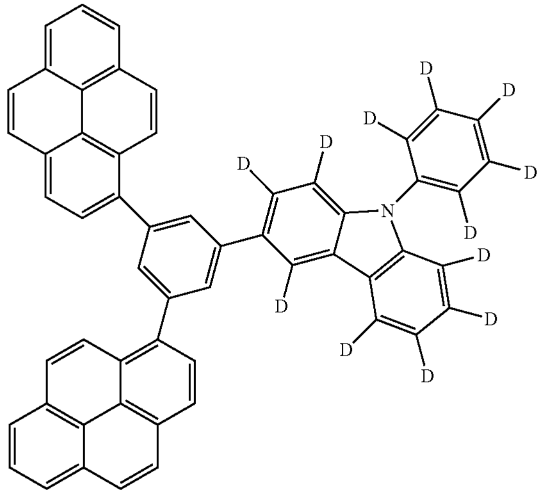 [SMILES: [2H]c1c([2H])c([2H])c(-n2c3c([2H])c([2H])c([2H])c([2H])c3c3c([2H])c(-c4cc(-c5ccc6ccc7cccc8ccc5c6c78)cc(-c5ccc6ccc7cccc8ccc5c6c78)c4)c([2H])c([2H])c32)c([2H])c1[2H]]

-continued
[Formula 199]
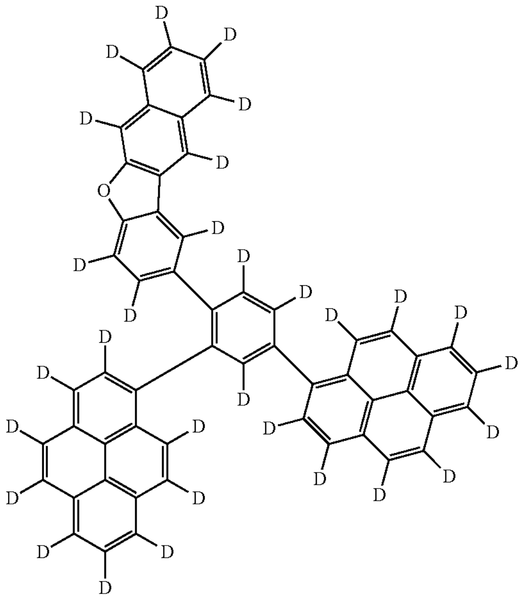
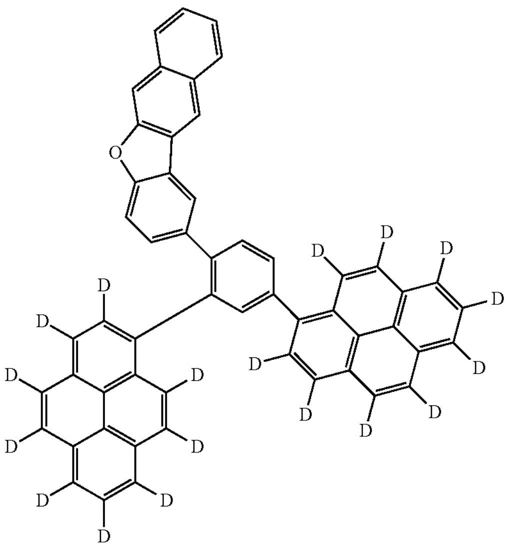
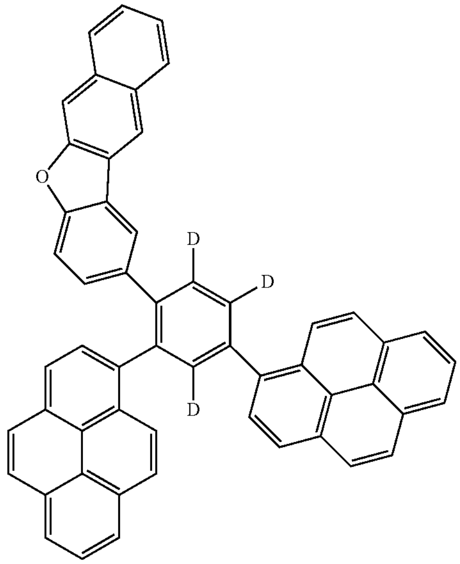
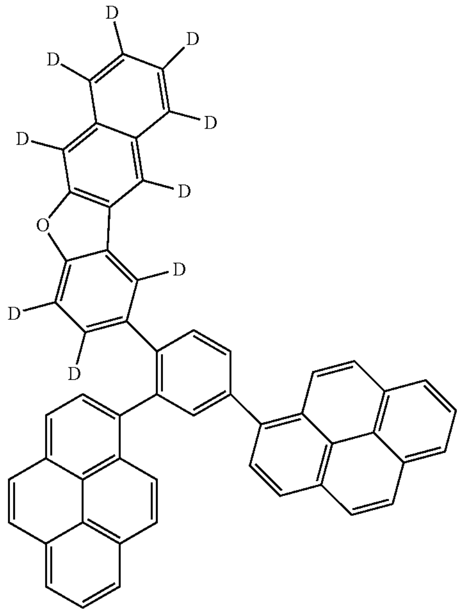

-continued
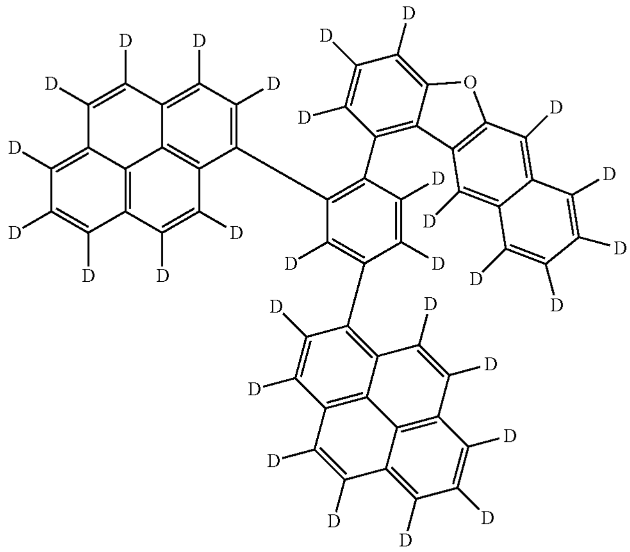
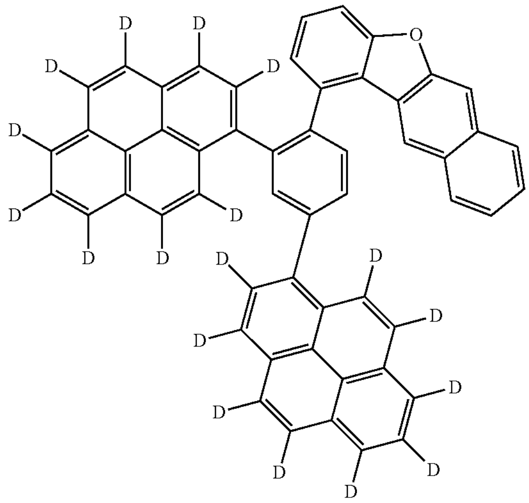
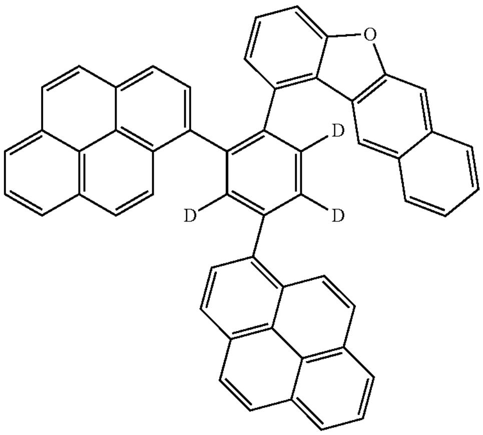
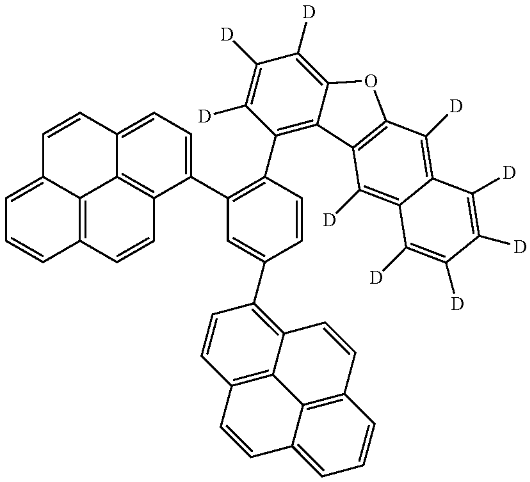

-continued
[Formula 200]
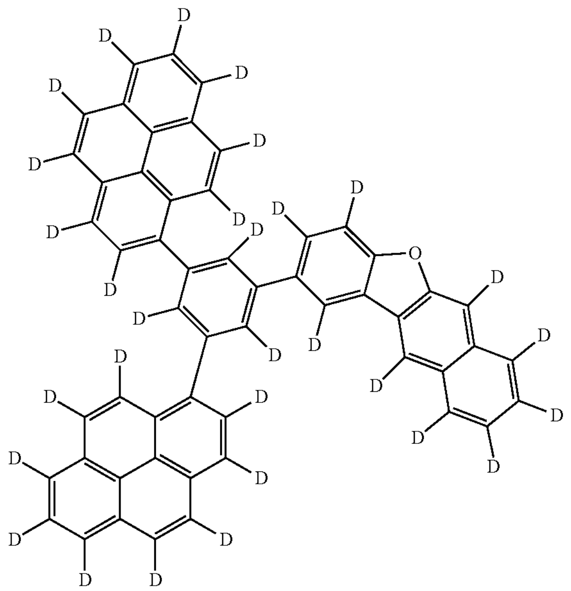
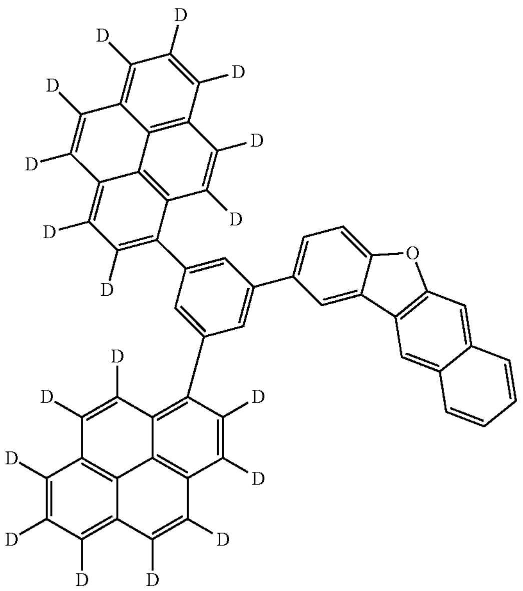
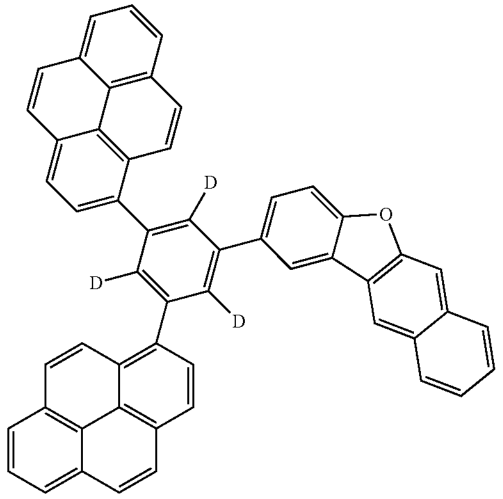
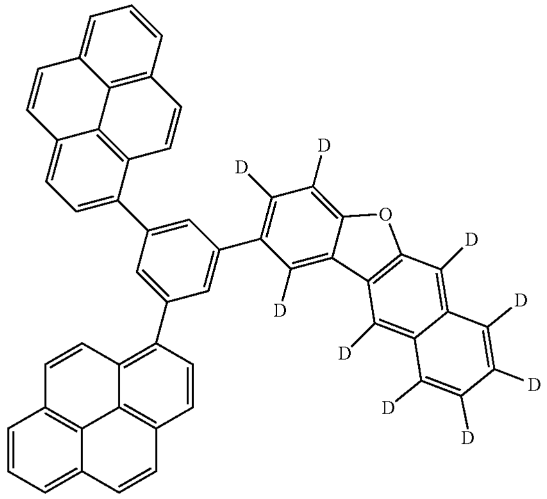
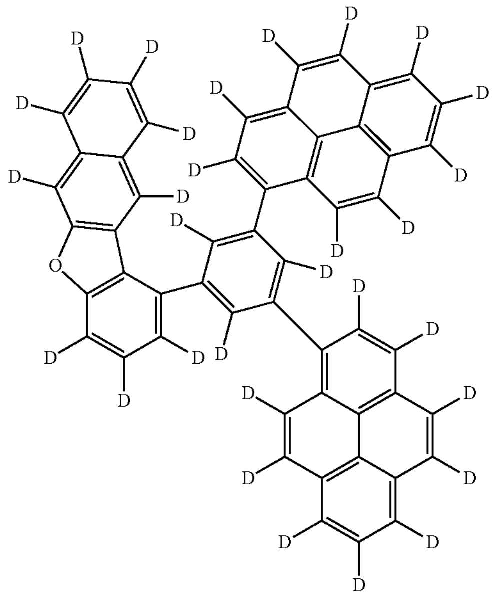
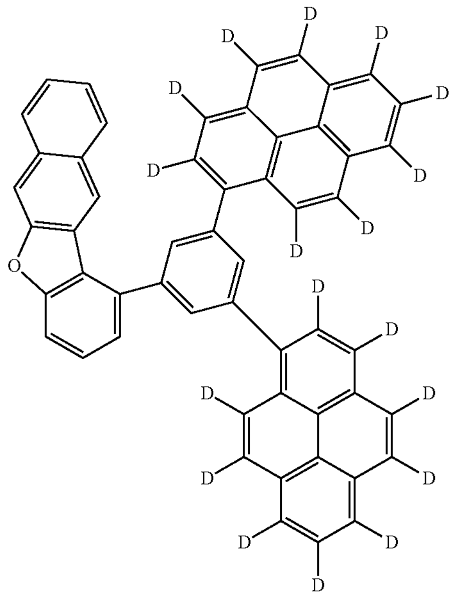

-continued
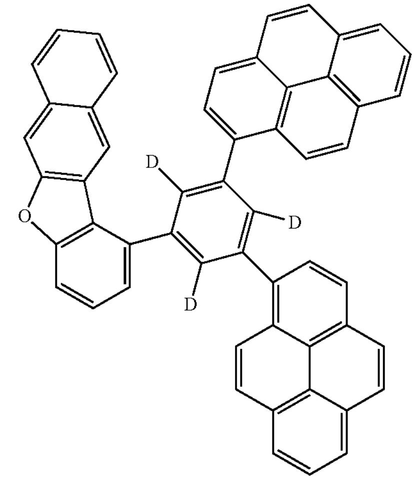
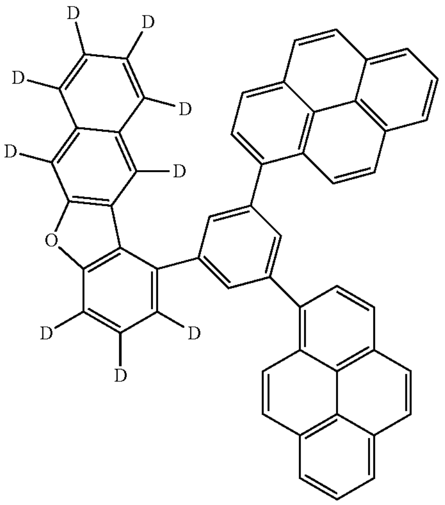
[Formula 201]
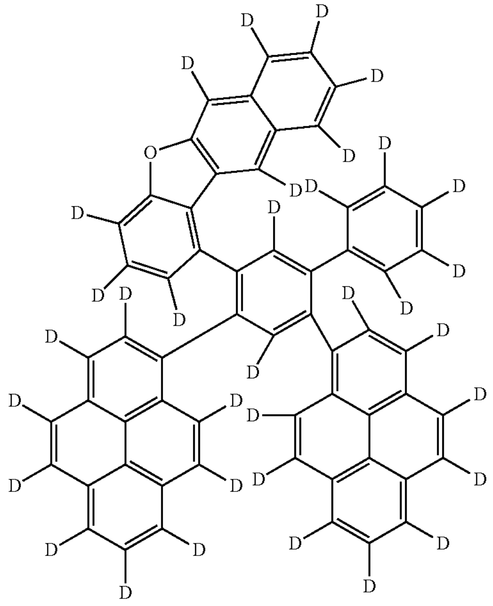
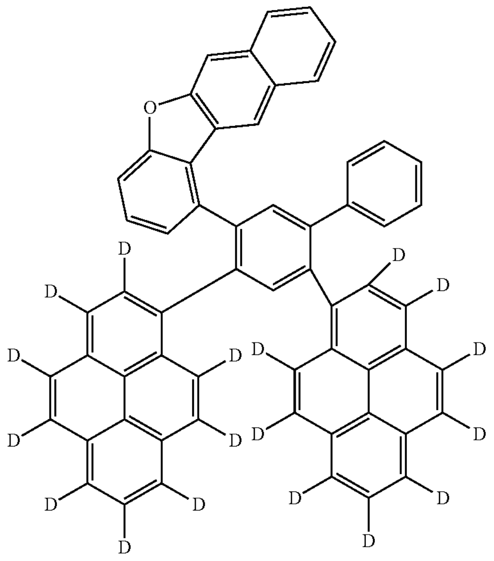
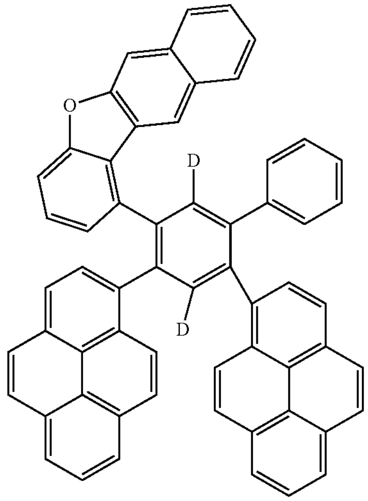
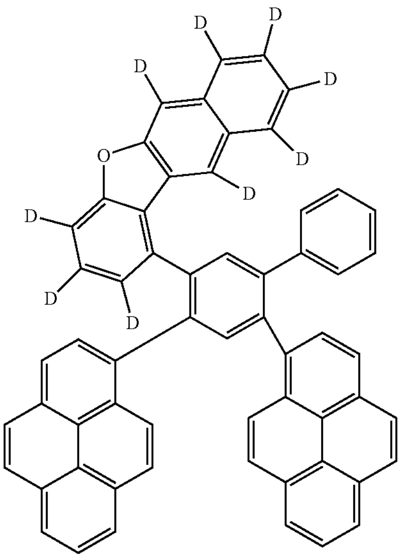

-continued
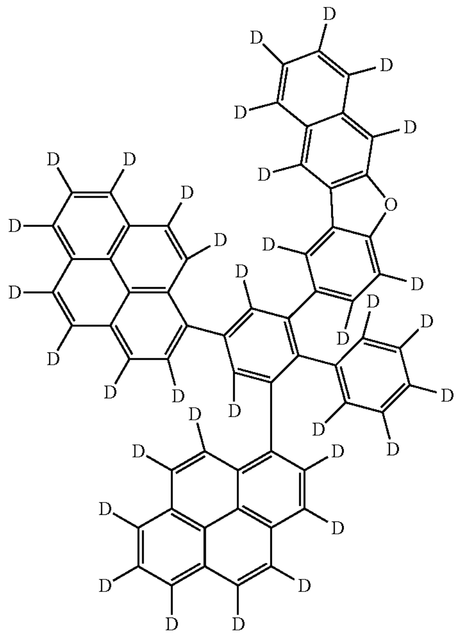
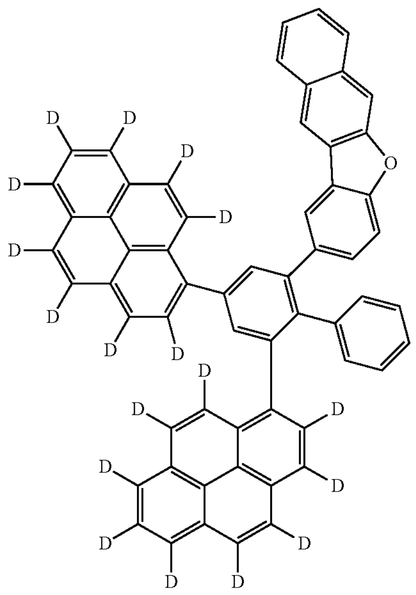
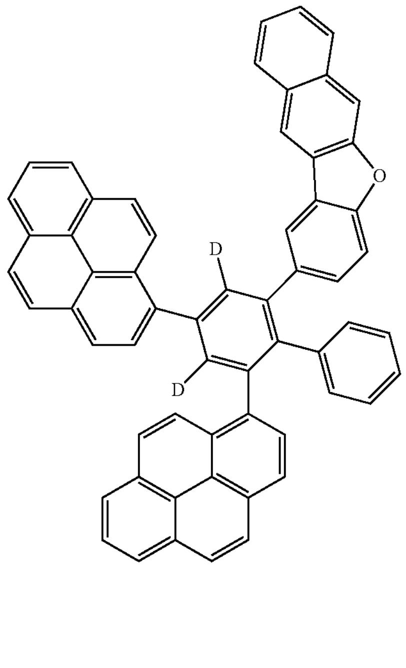
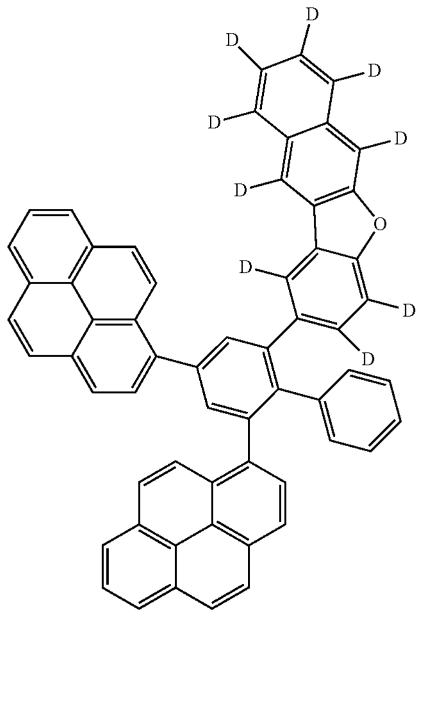

-continued
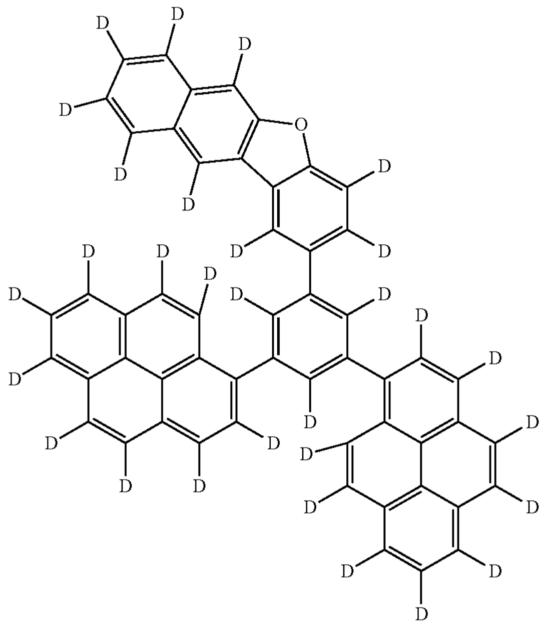
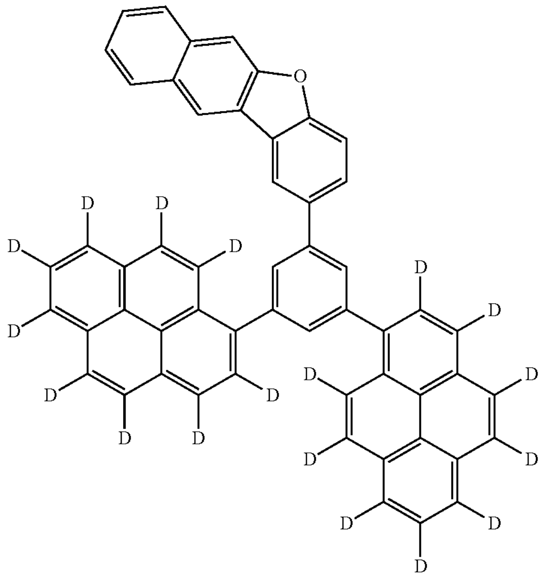
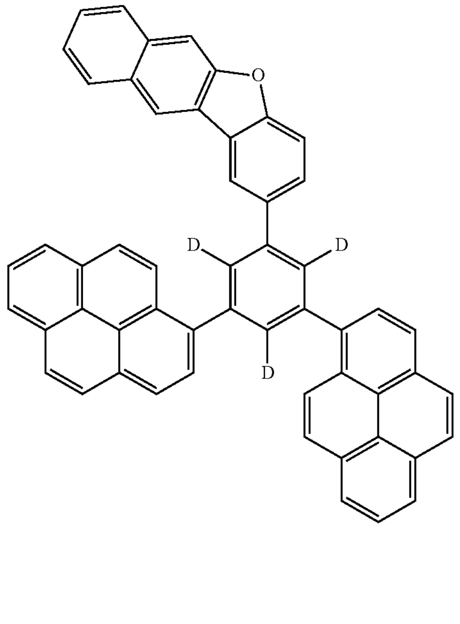
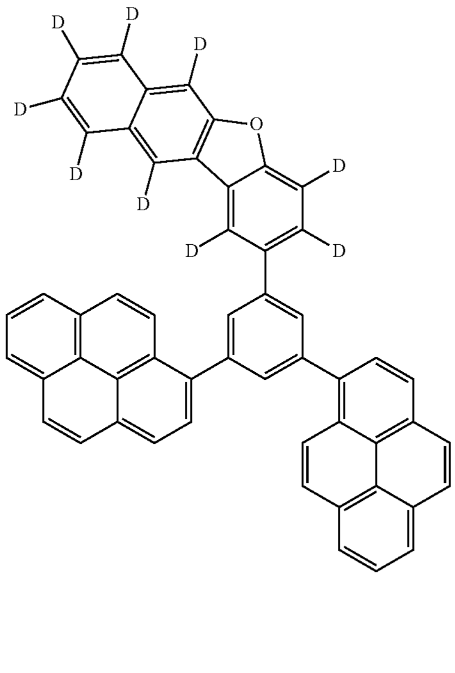

-continued
[Formula 202]
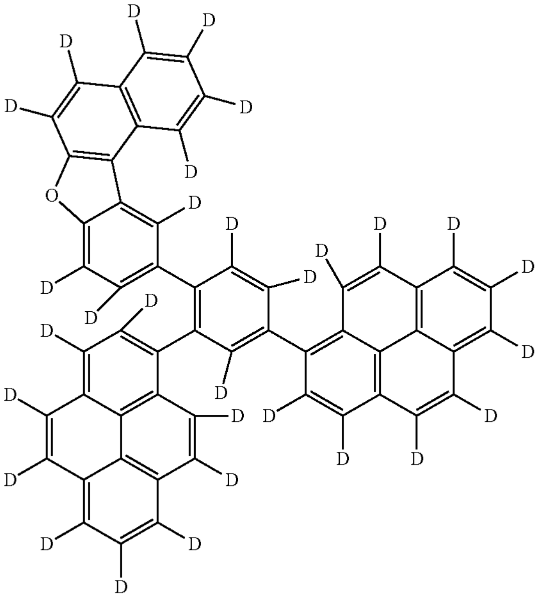
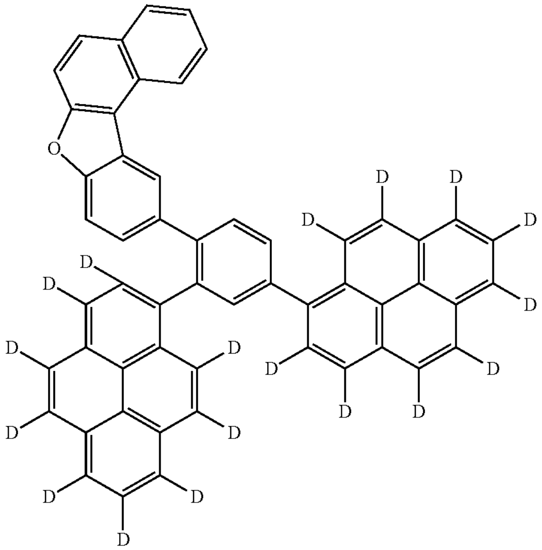
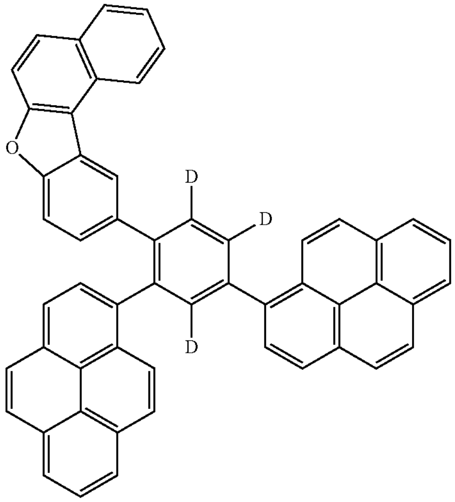
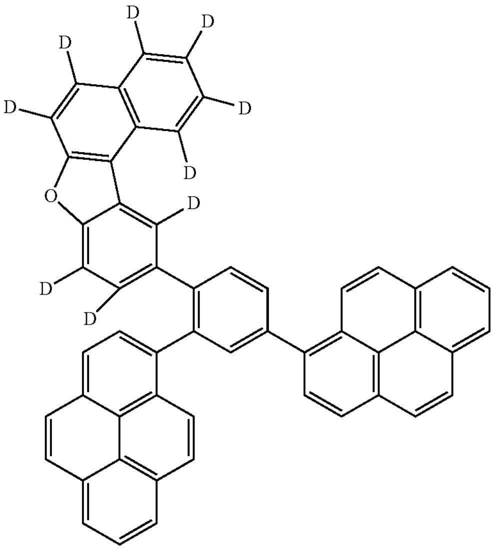

-continued
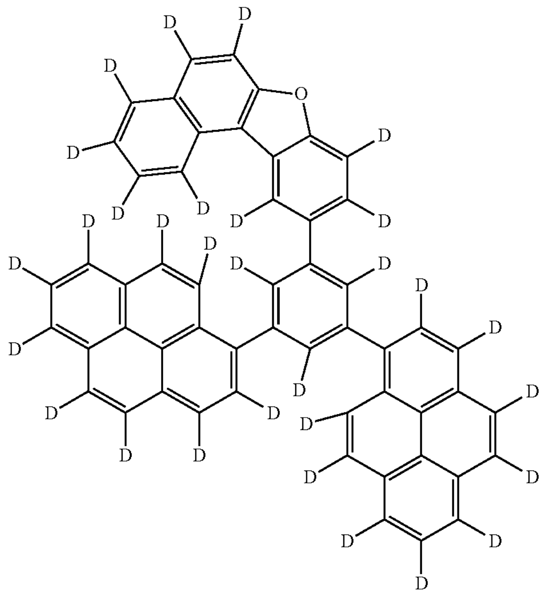
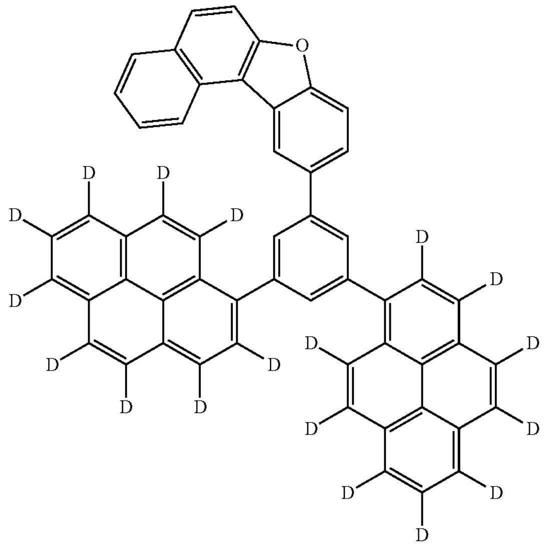
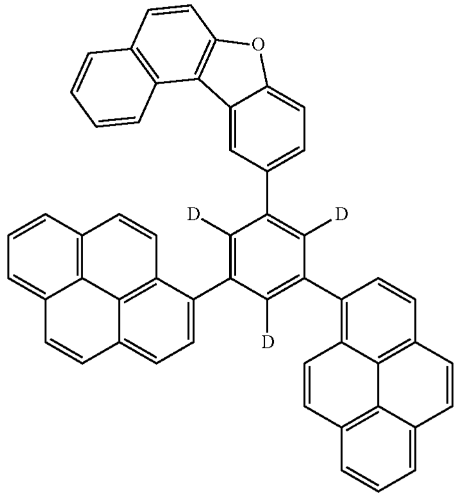
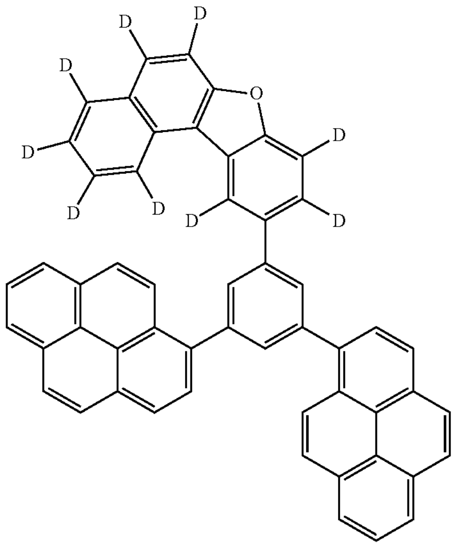

-continued
[Formula 203]
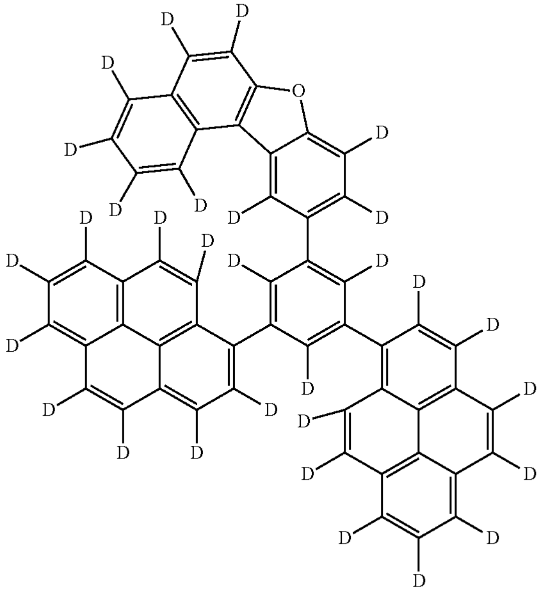
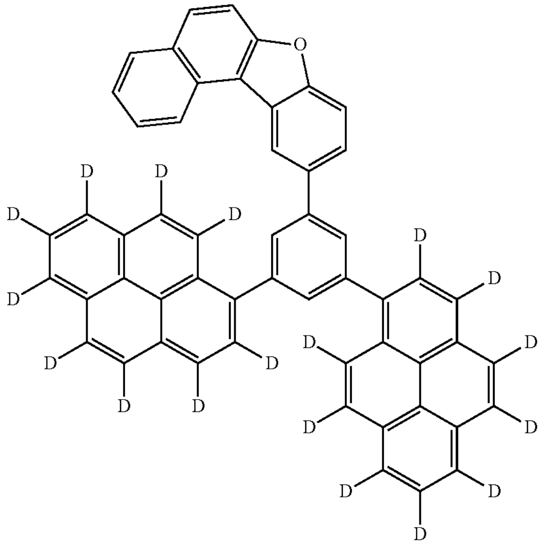
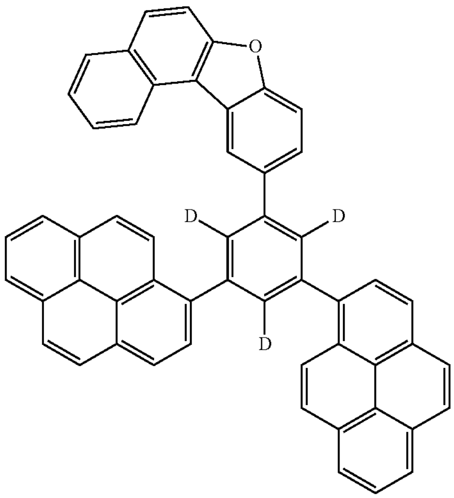
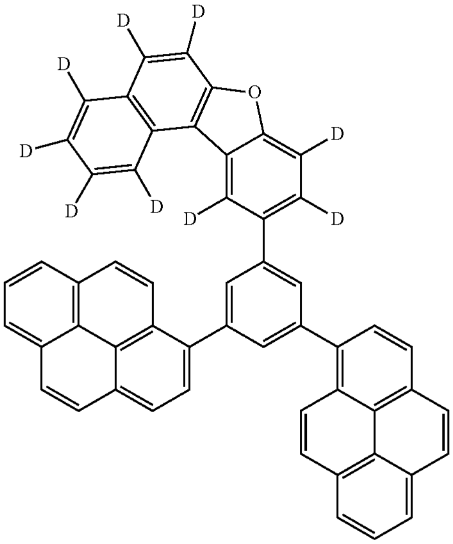

-continued
[Formula 204]
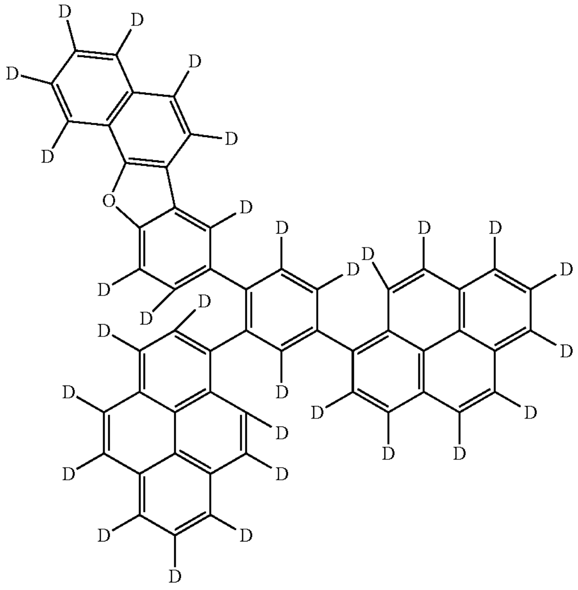
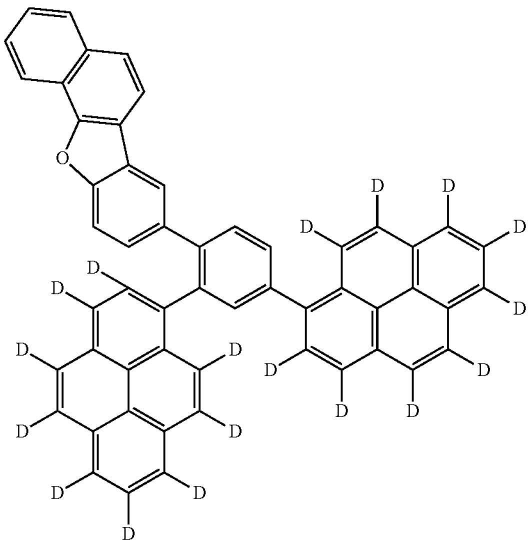
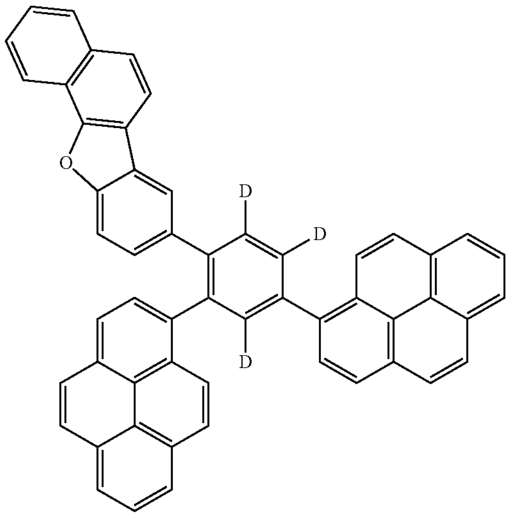
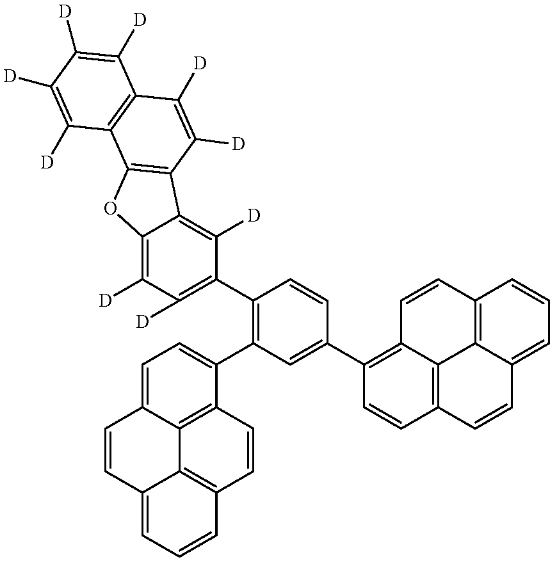

-continued
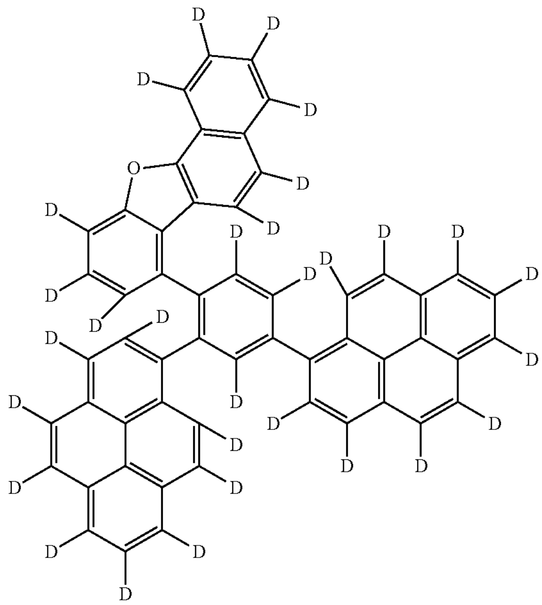
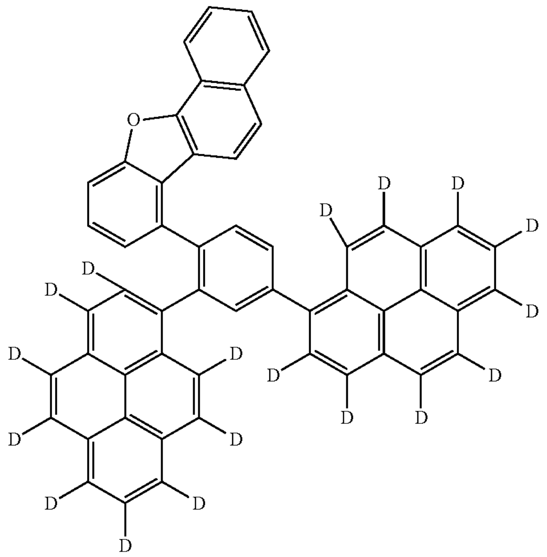
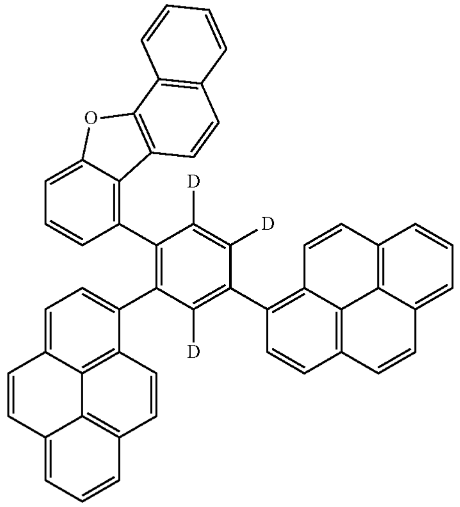
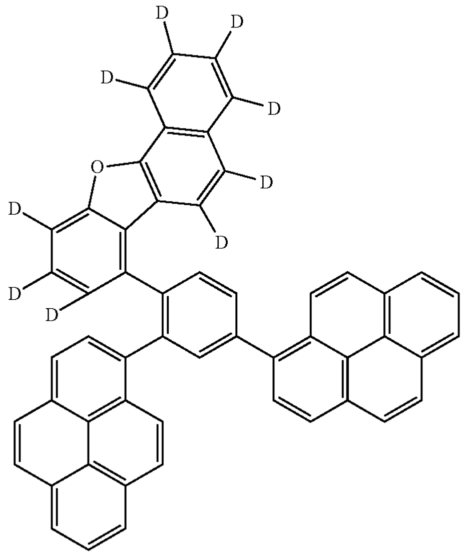

-continued
[Formula 205]
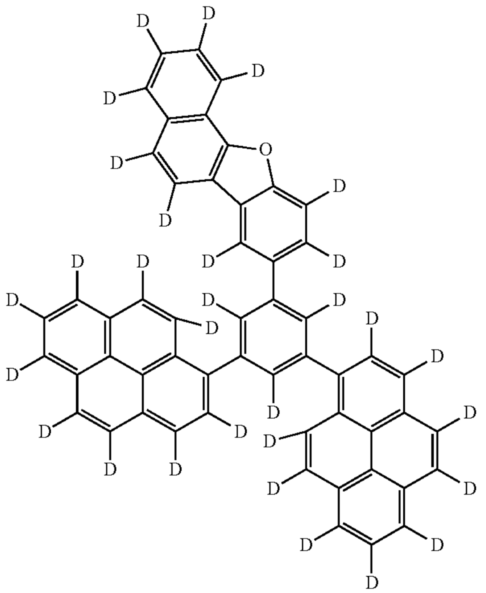
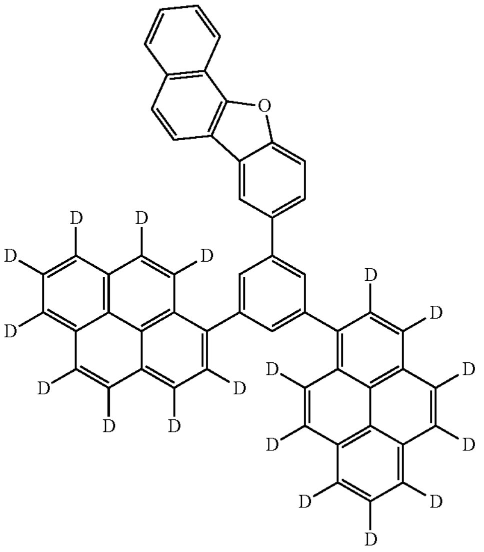
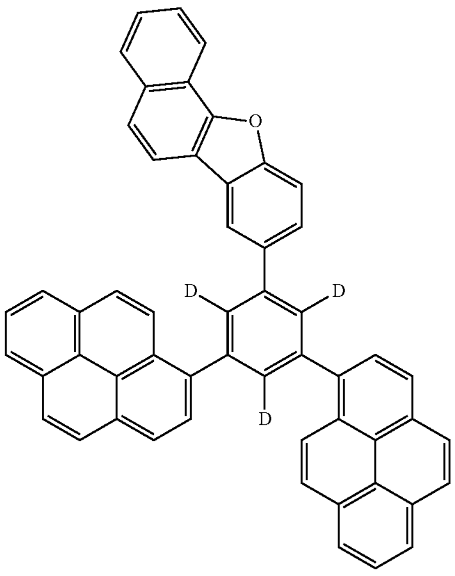
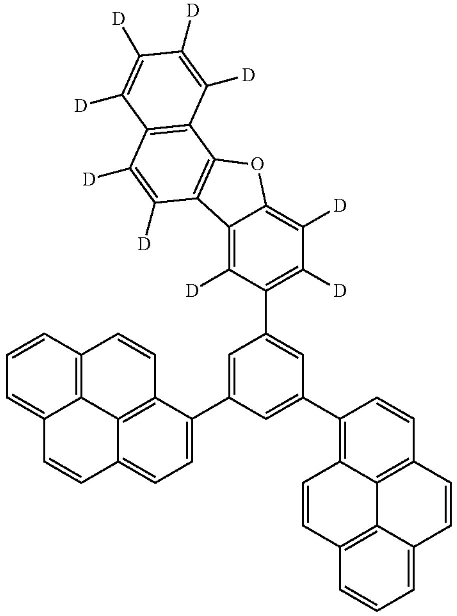

-continued
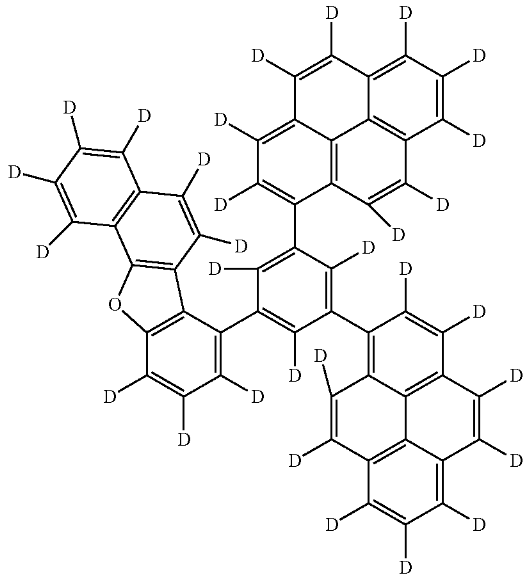
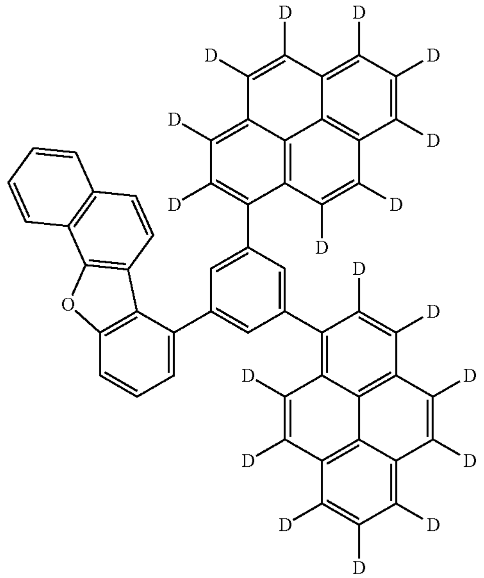
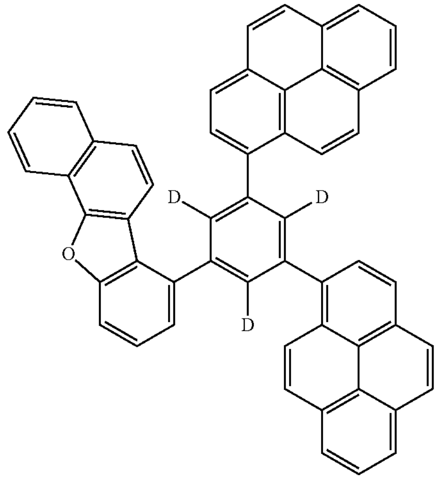
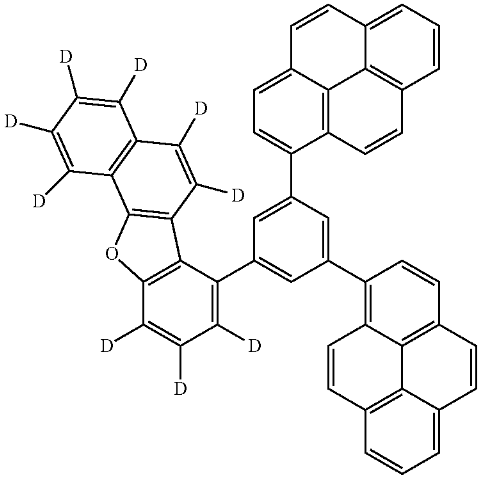
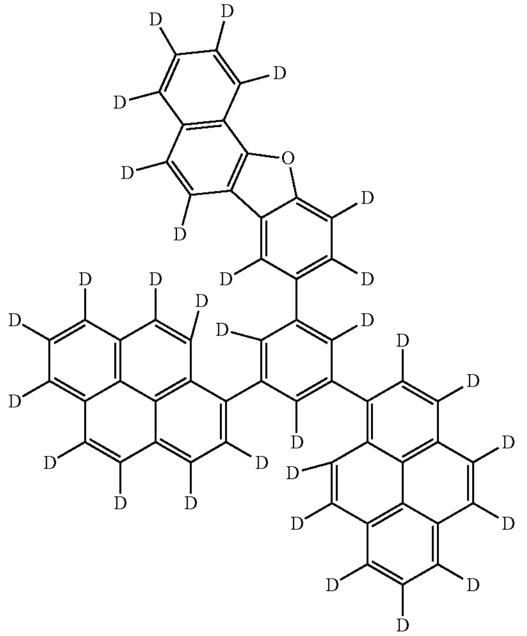
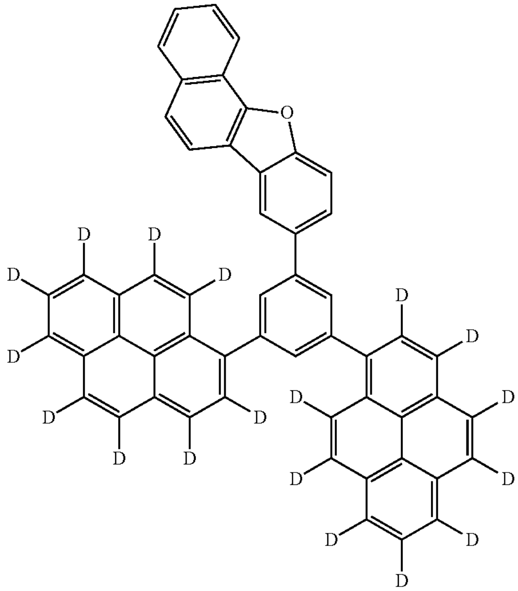

-continued
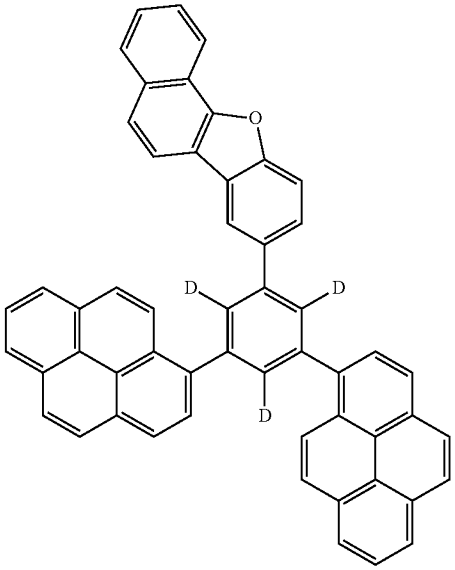
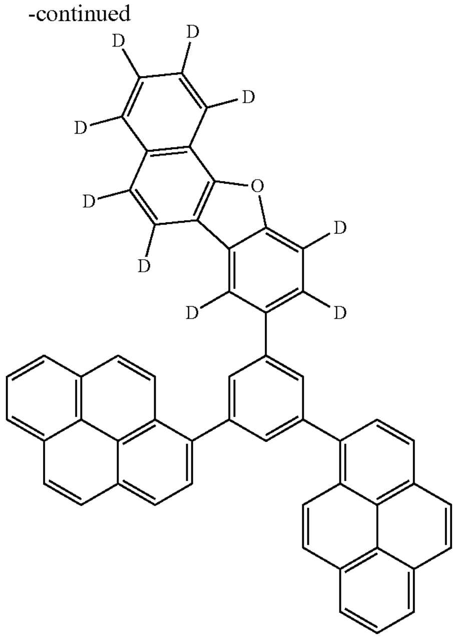
[Formula 206]
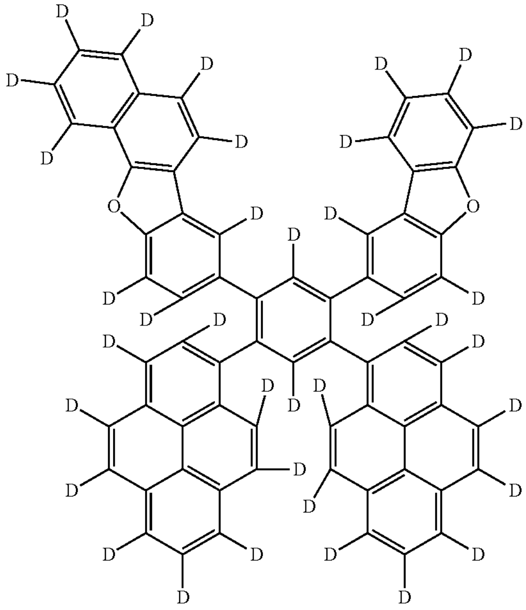
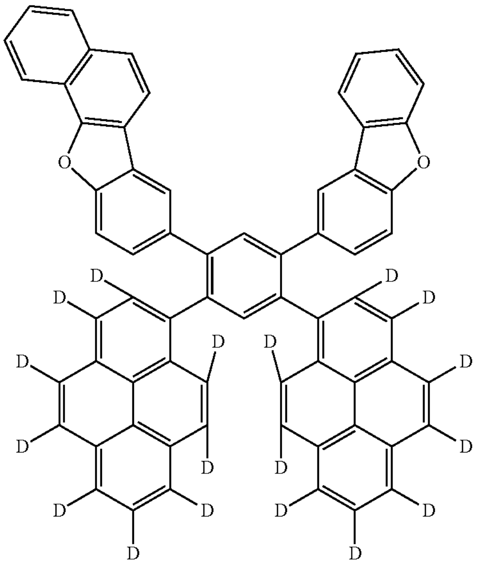

-continued
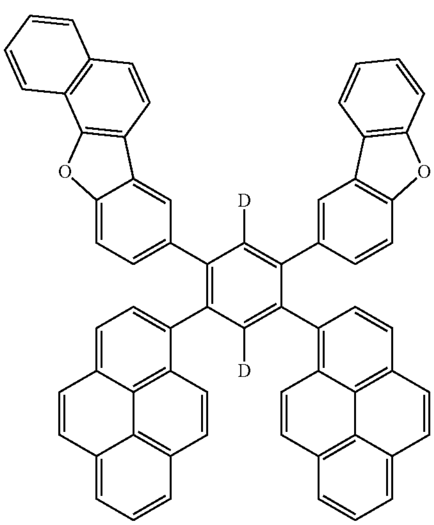
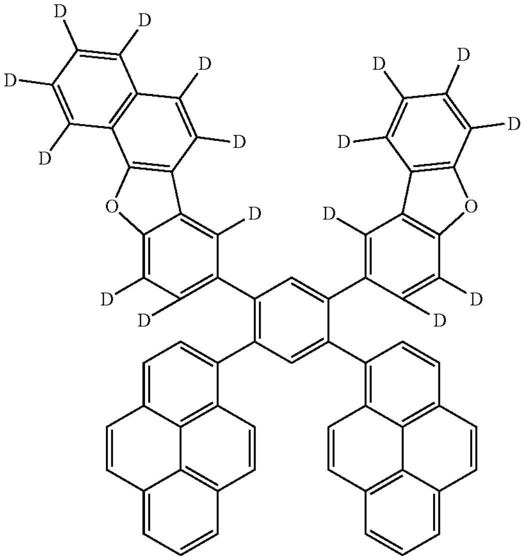
[Formula 207]
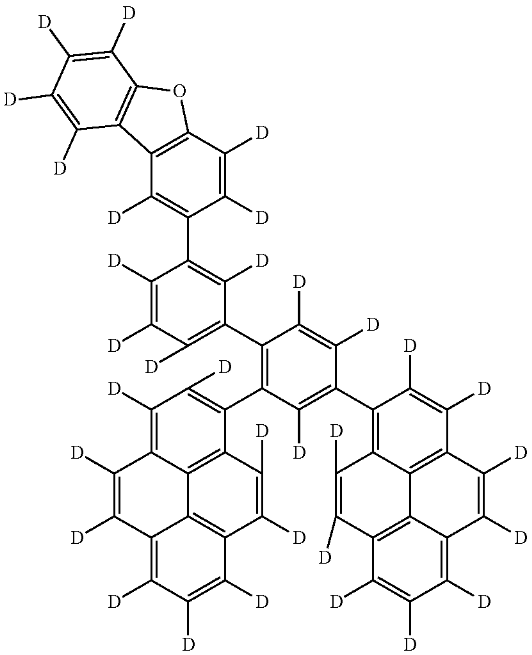
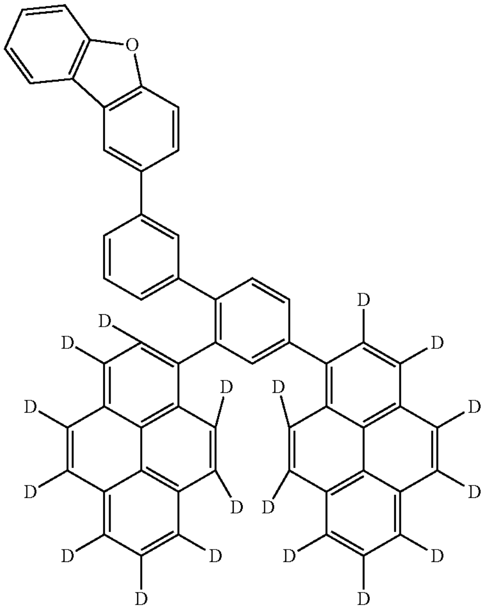

-continued
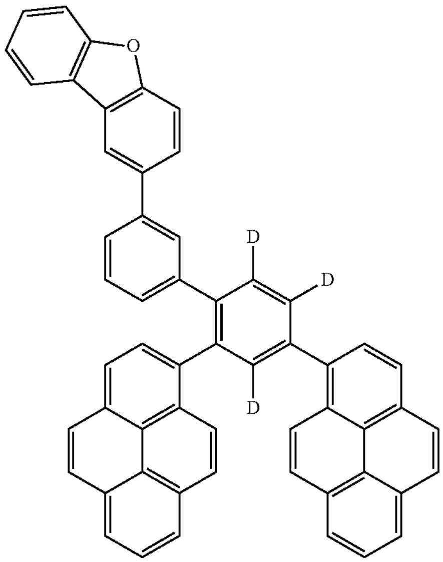 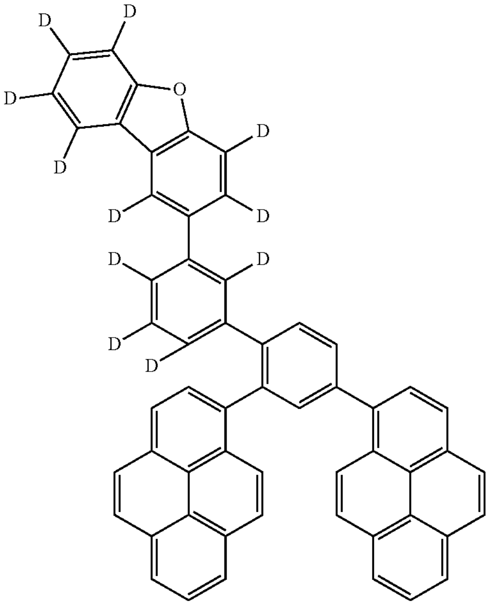
[Formula 208]
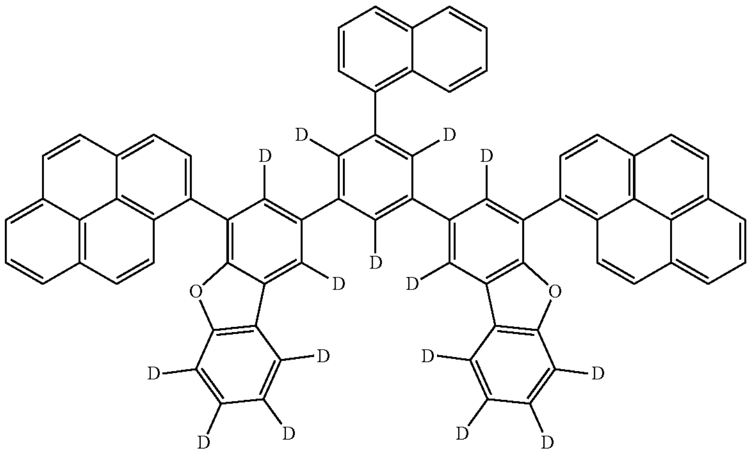
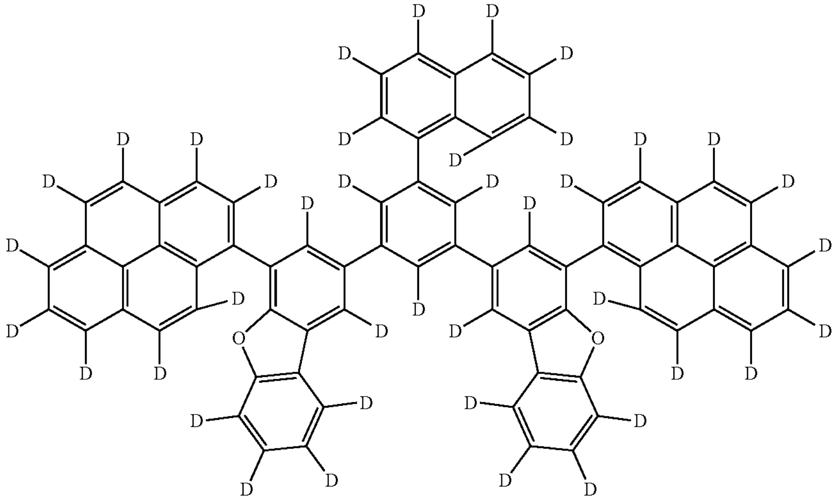

-continued
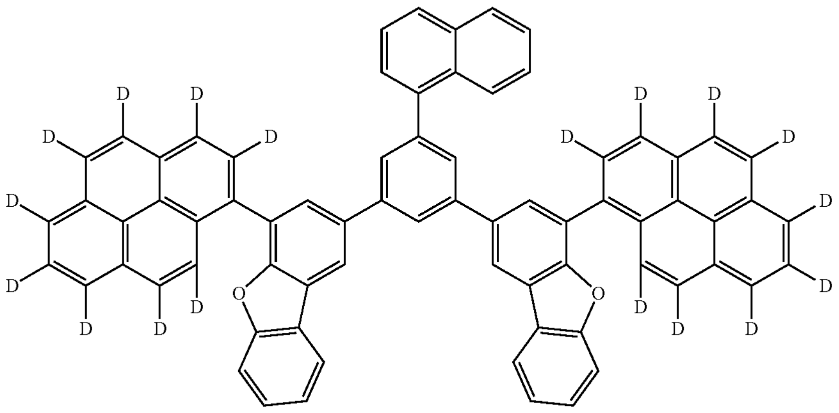
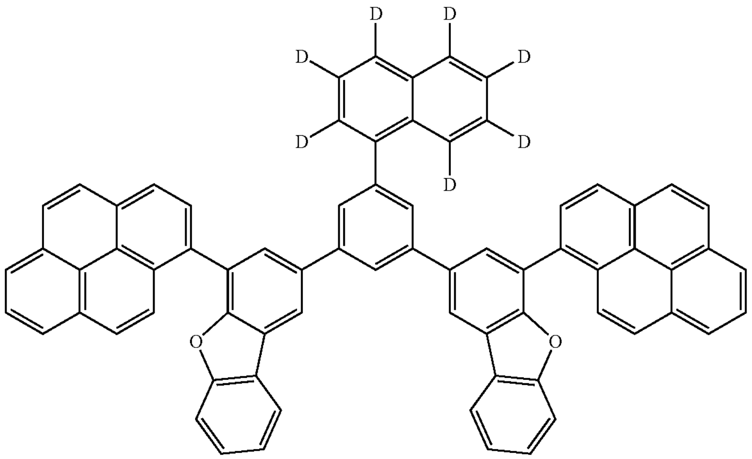
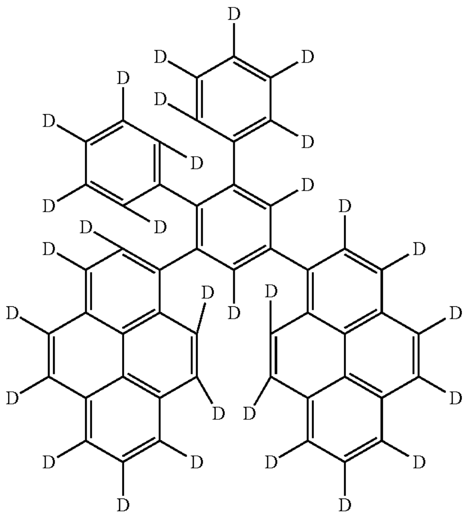
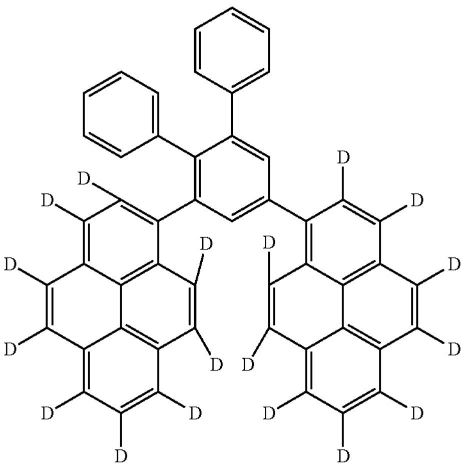

-continued
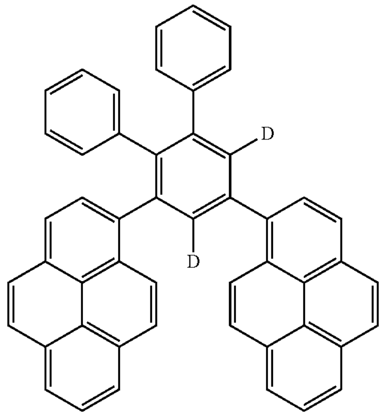
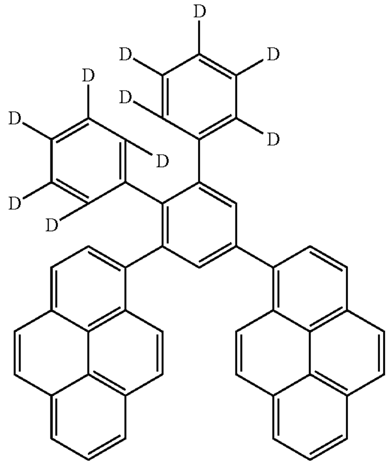
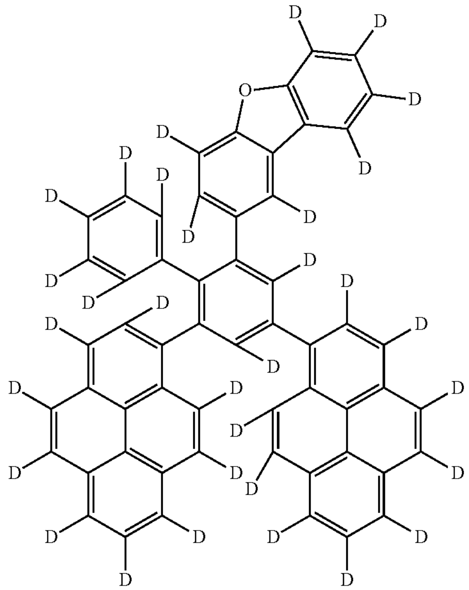
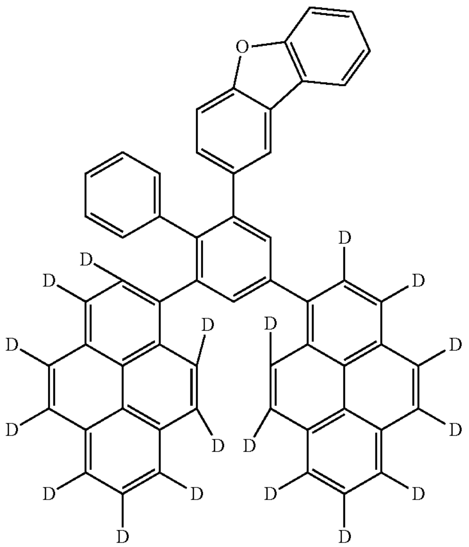
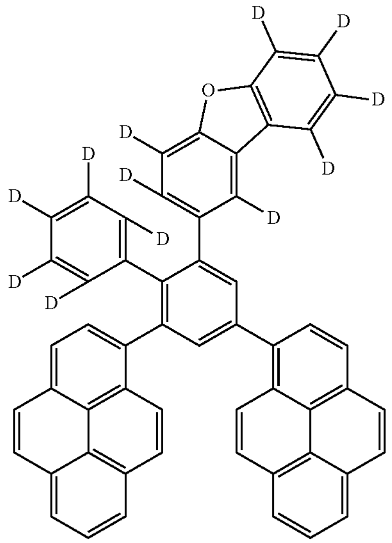

-continued
[Formula 209]
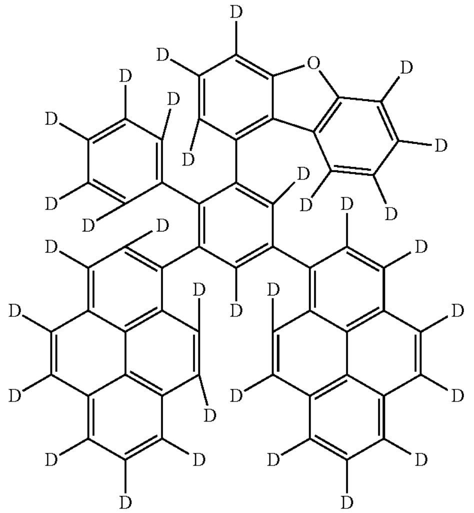
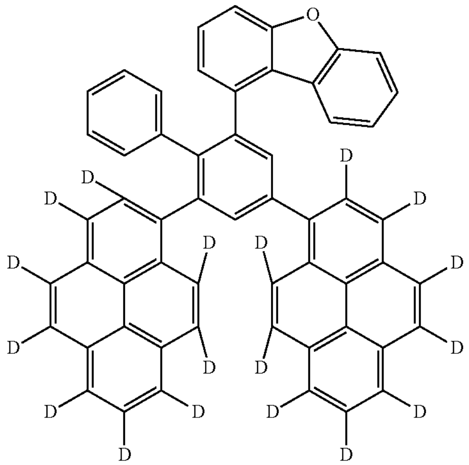
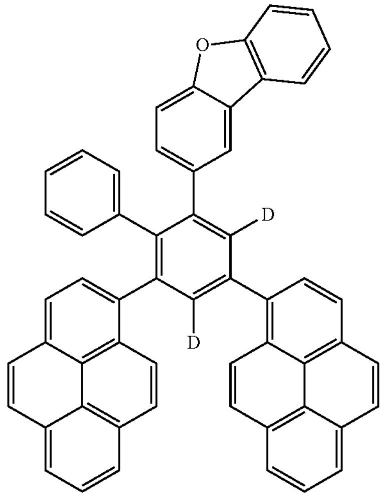
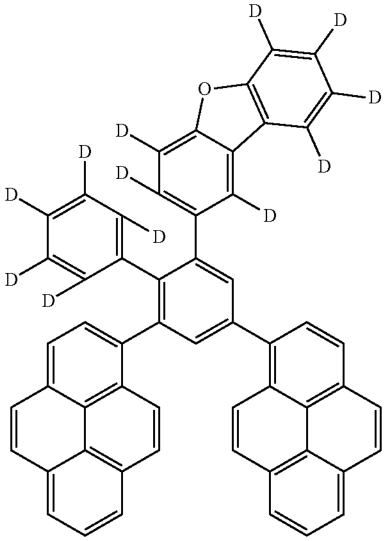
[Formula 210]
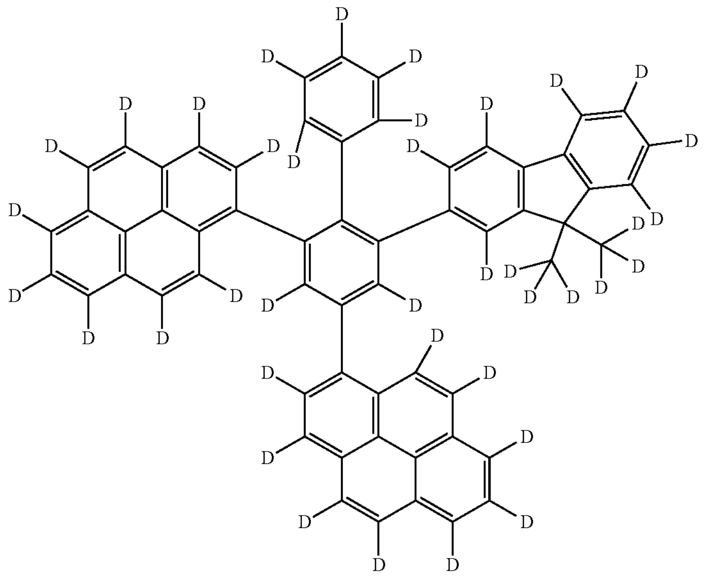

-continued
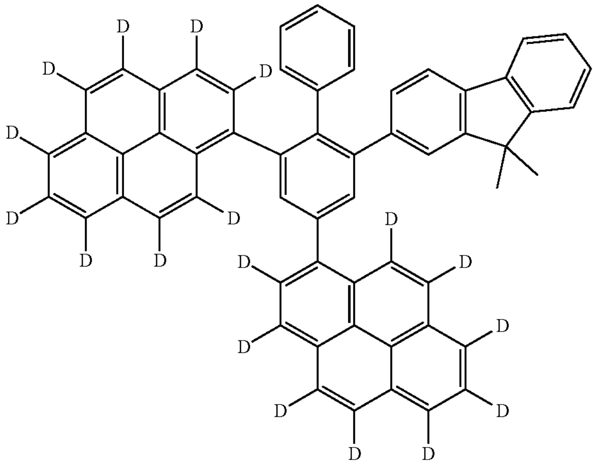
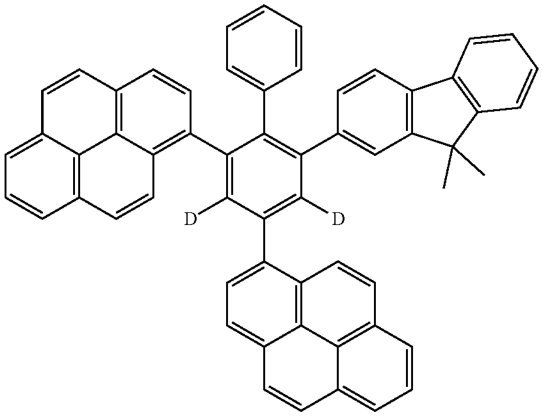
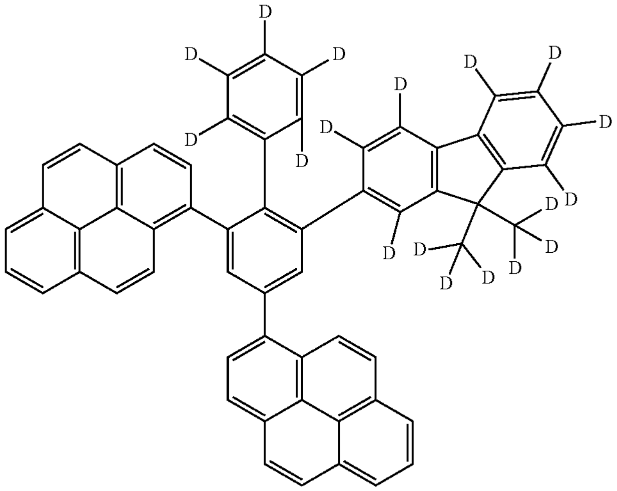
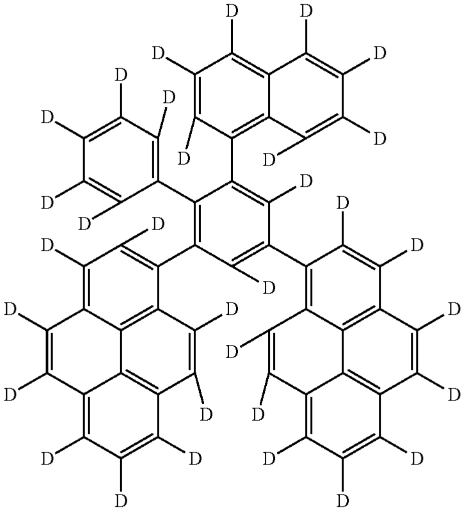
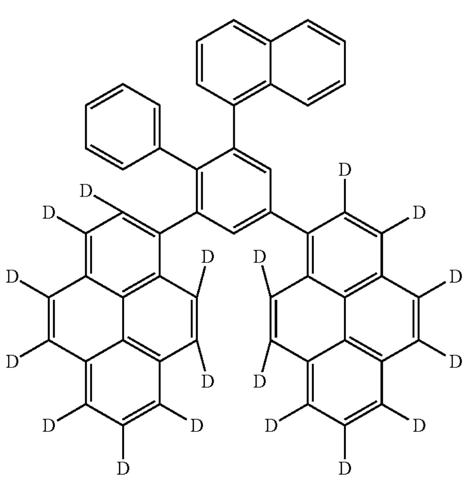
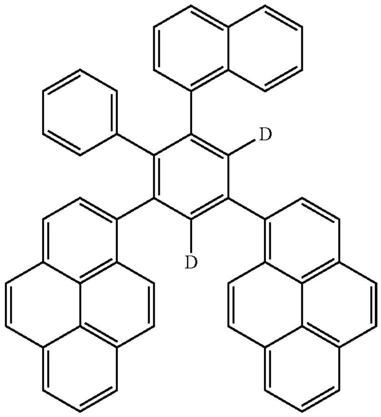

-continued
[Formula 211]
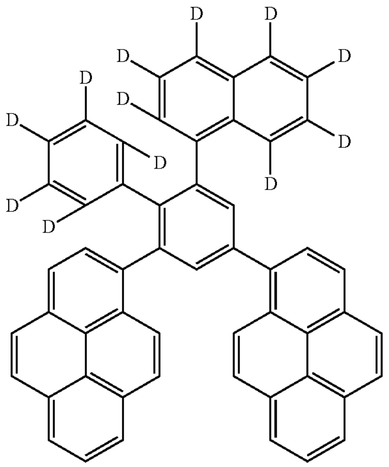
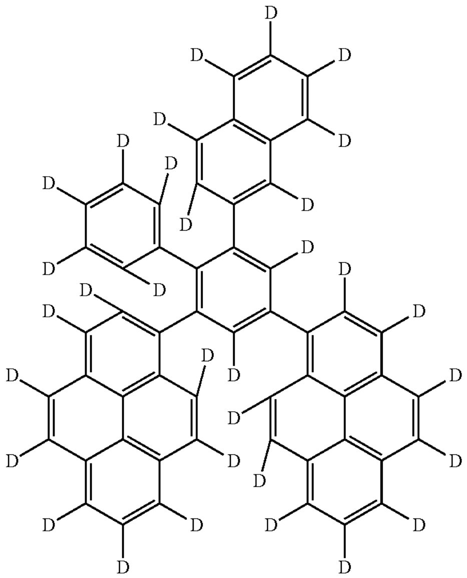
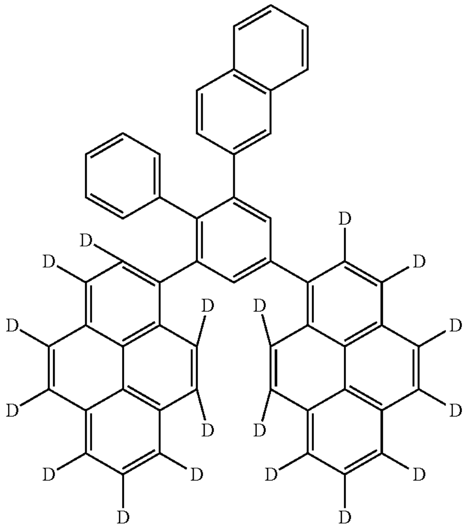
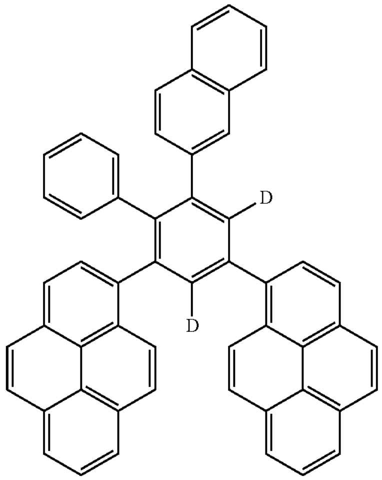
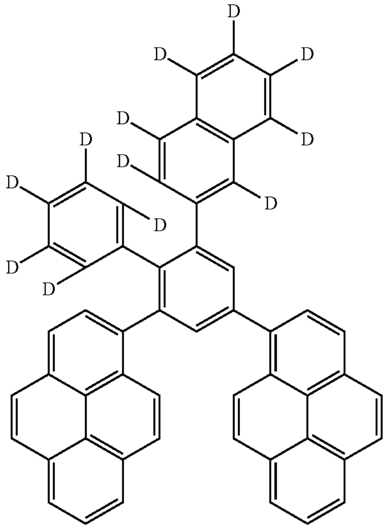
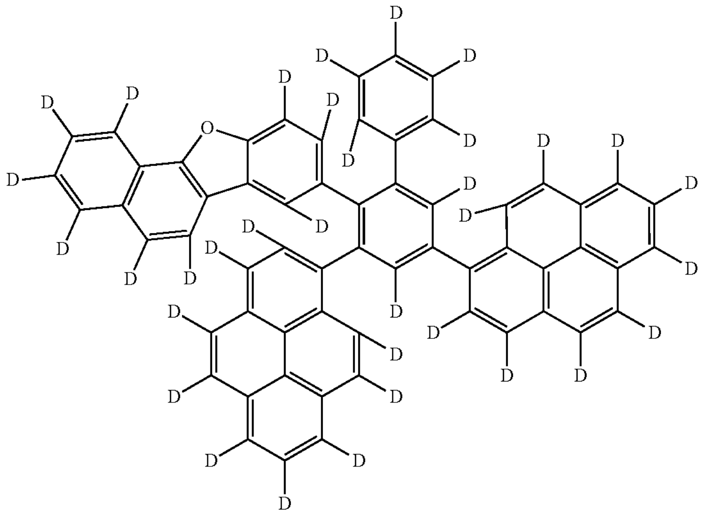

-continued
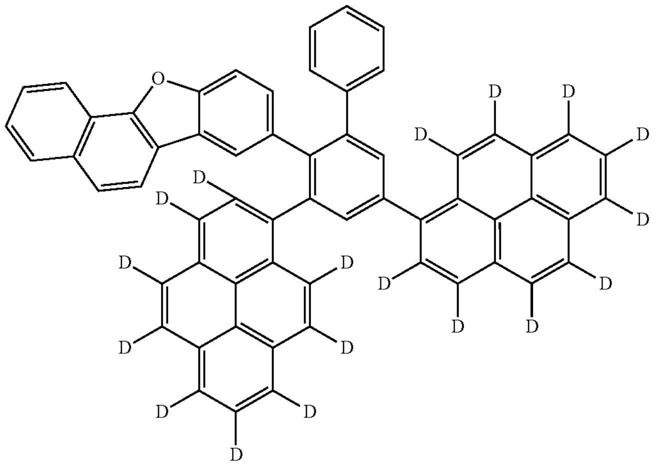
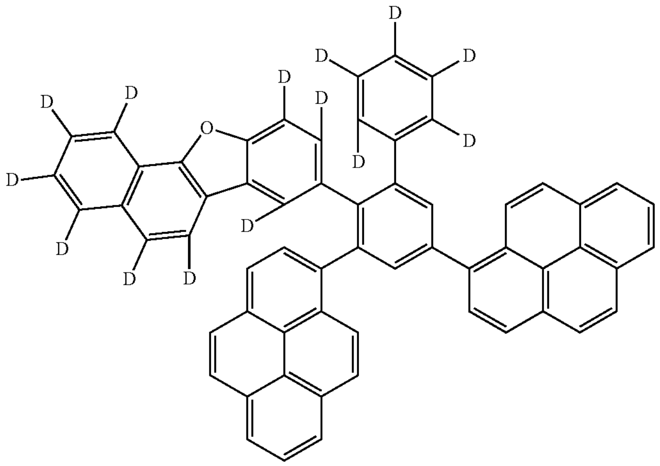
[Formula 212]
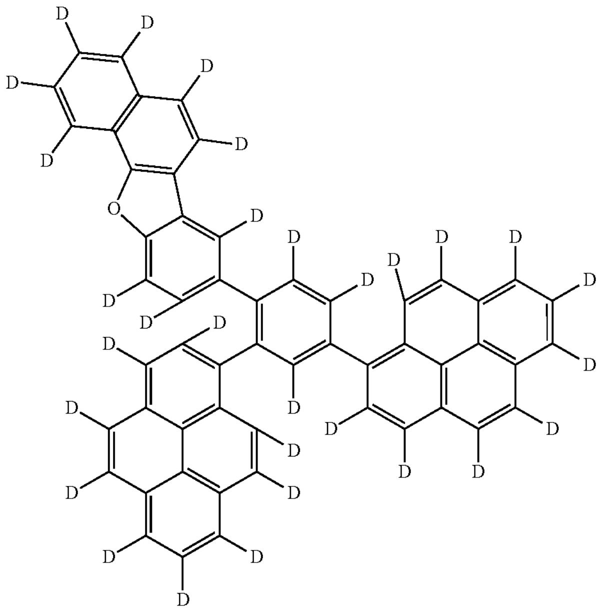

-continued
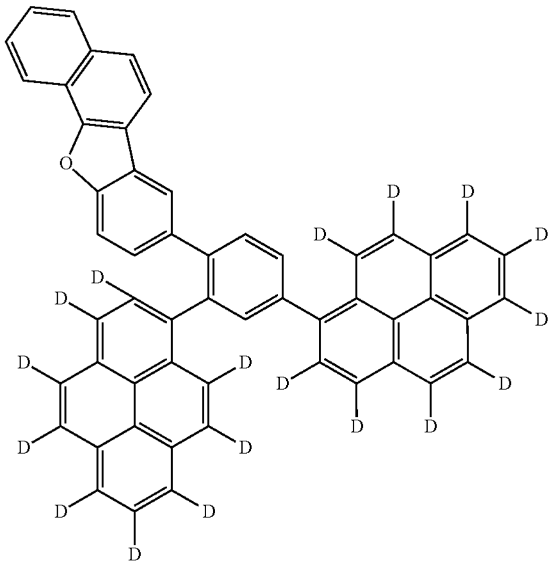
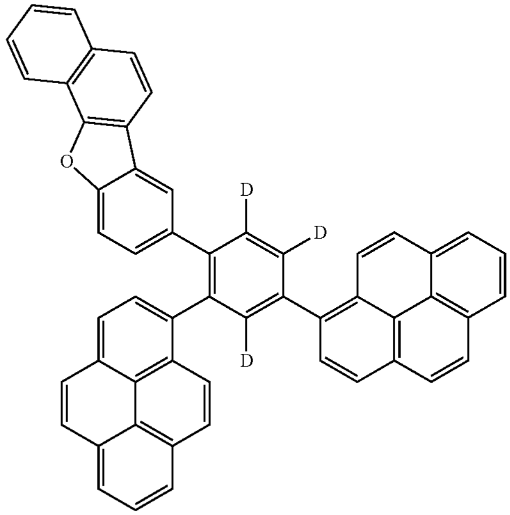
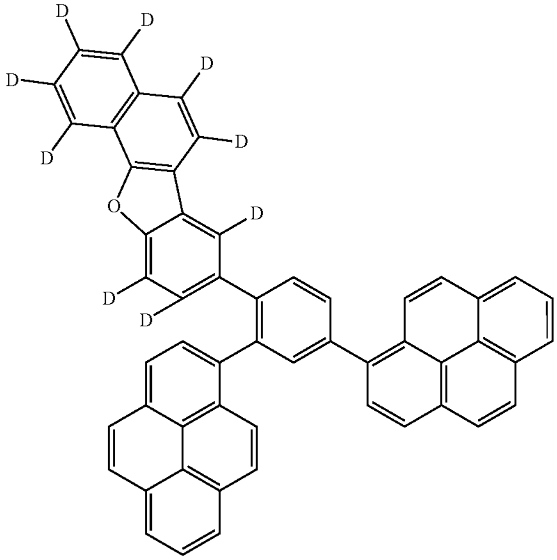

-continued
[Formula 213]
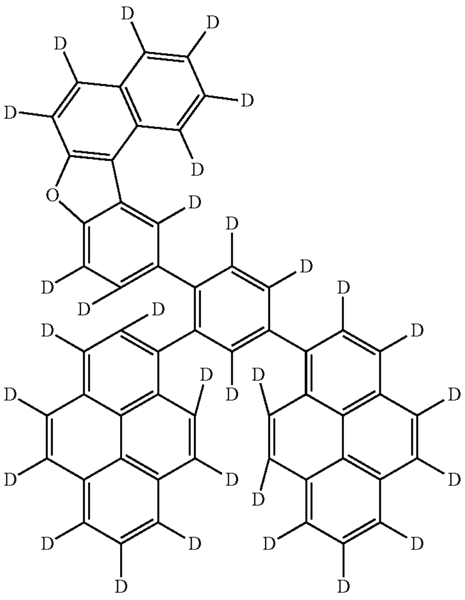
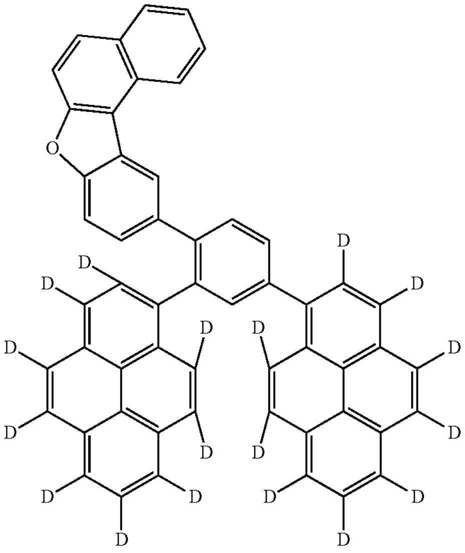
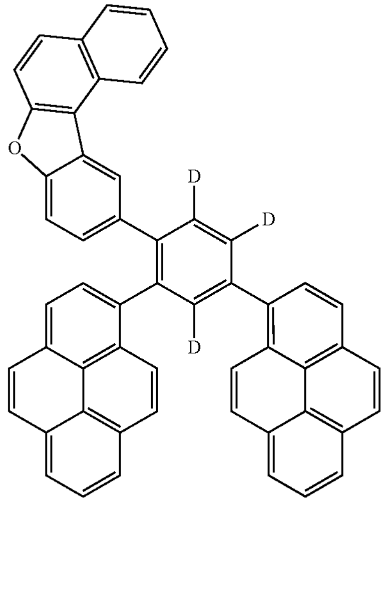
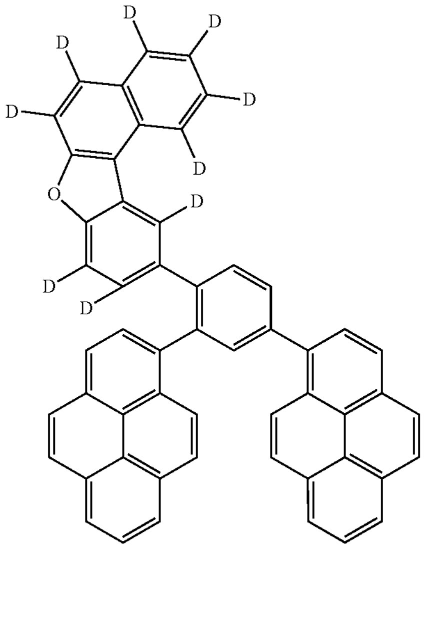

-continued
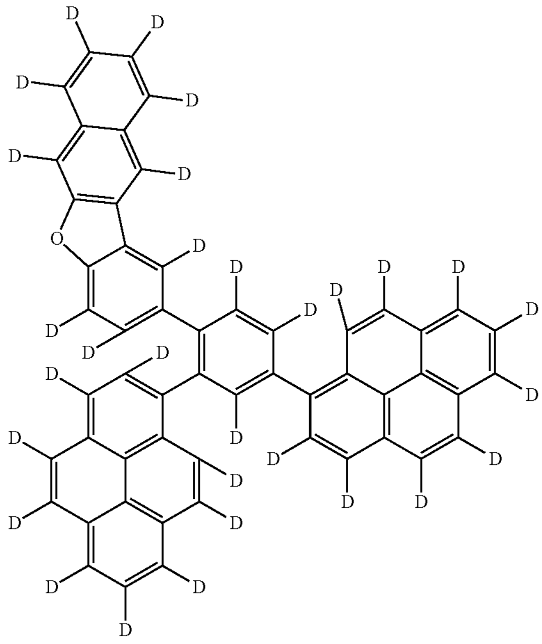
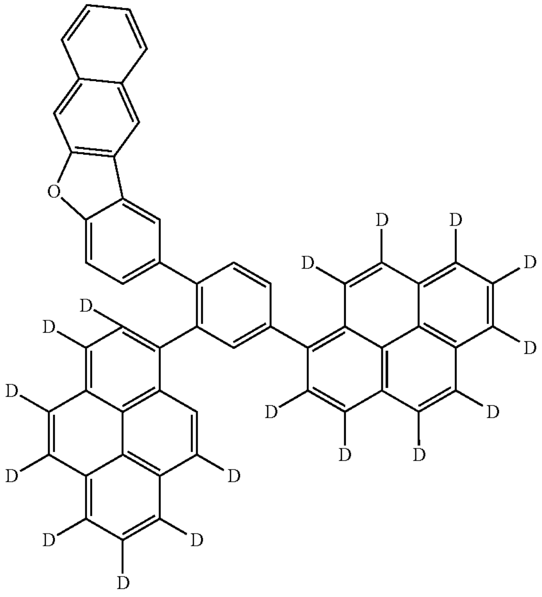
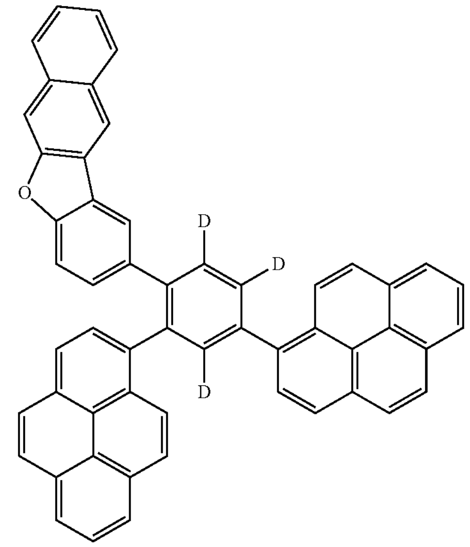
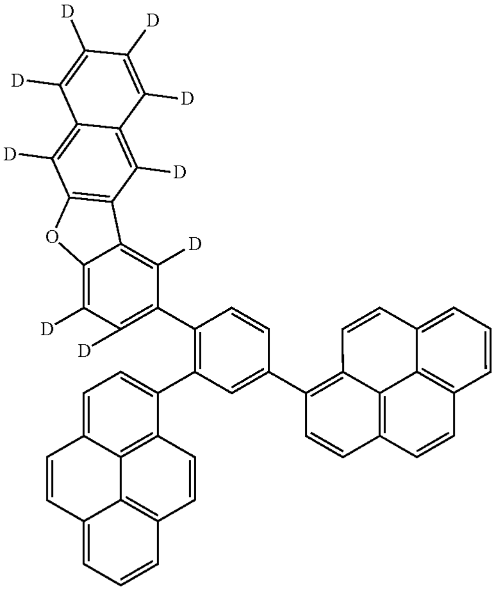

-continued
[Formula 214]
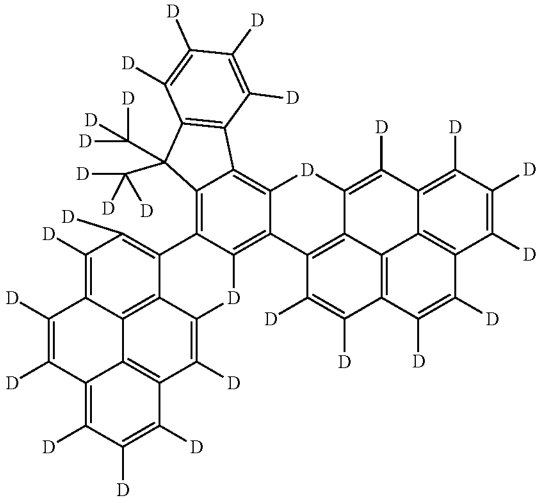
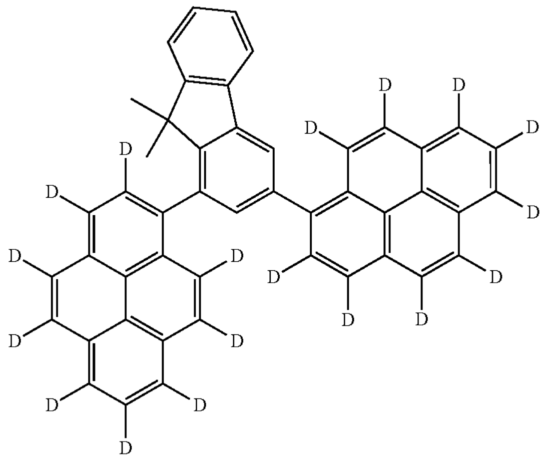
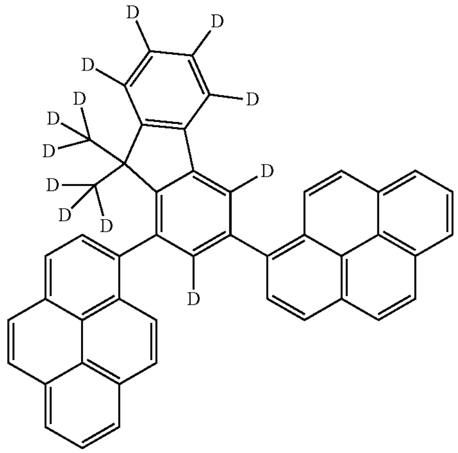
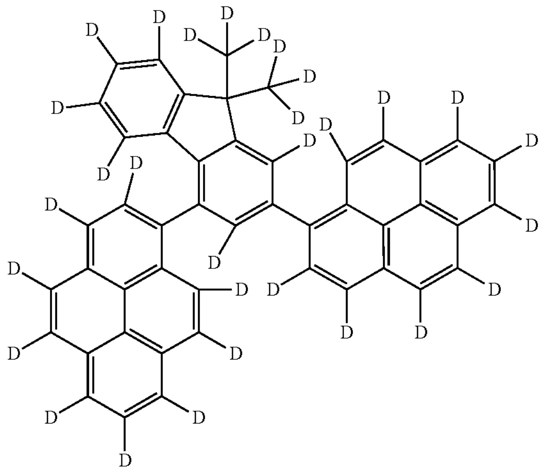
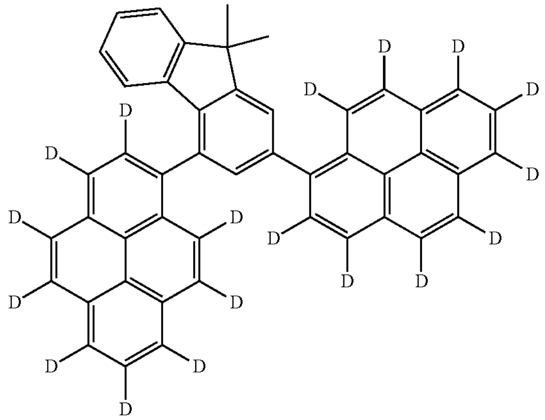
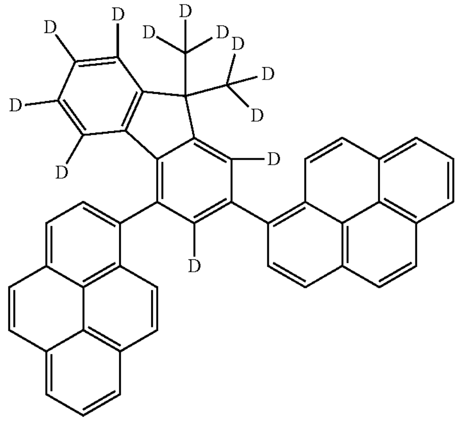
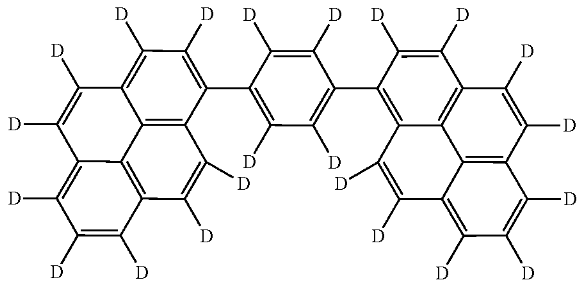

-continued
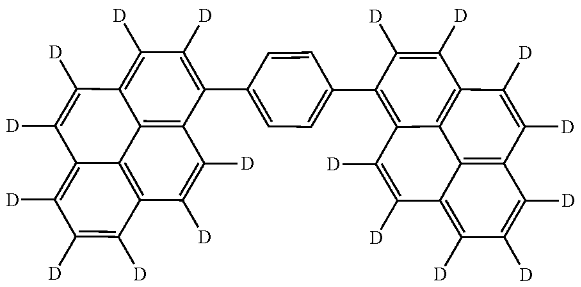
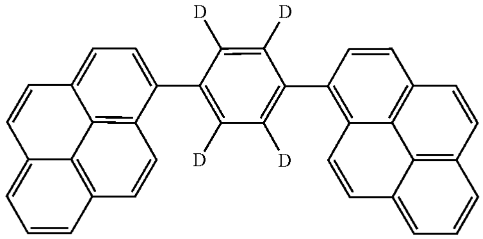
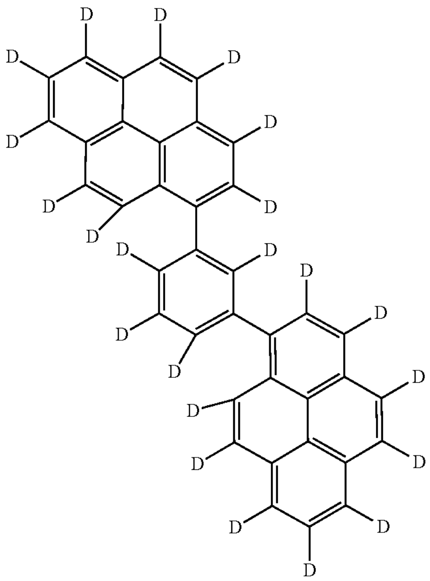
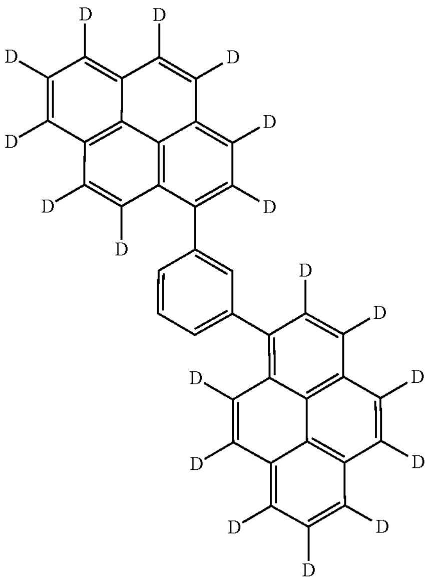
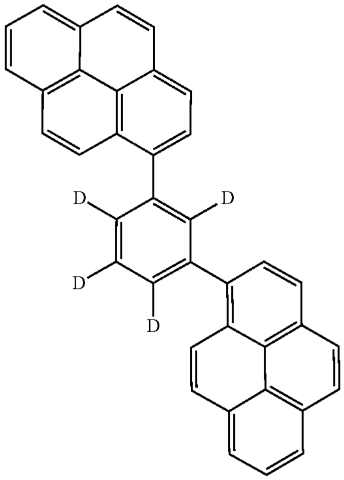

-continued
[Formula 215]
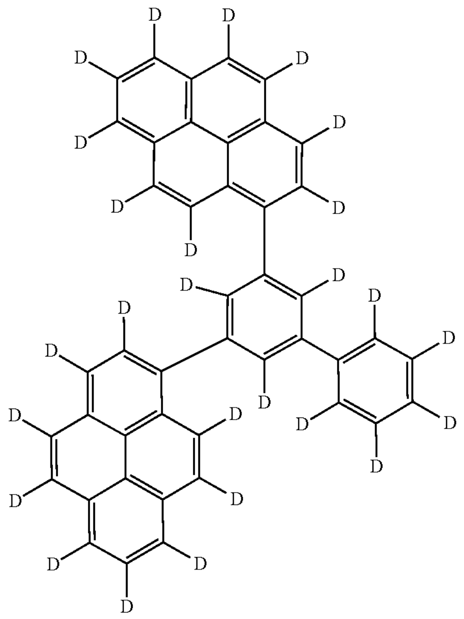
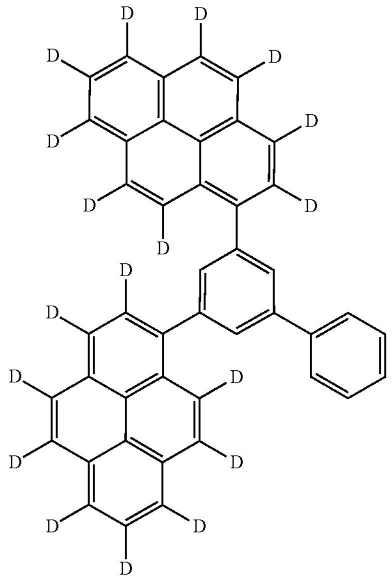
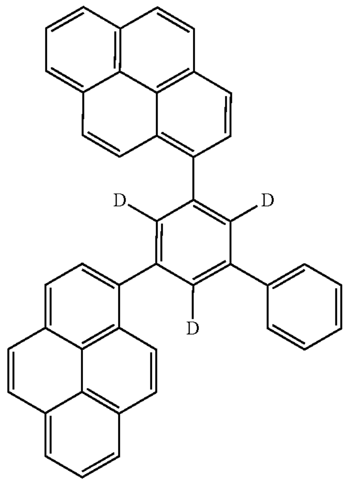
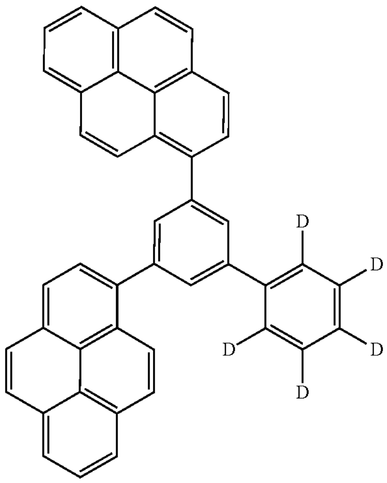
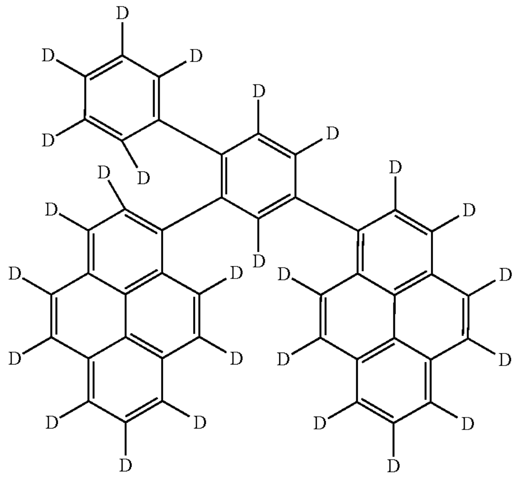
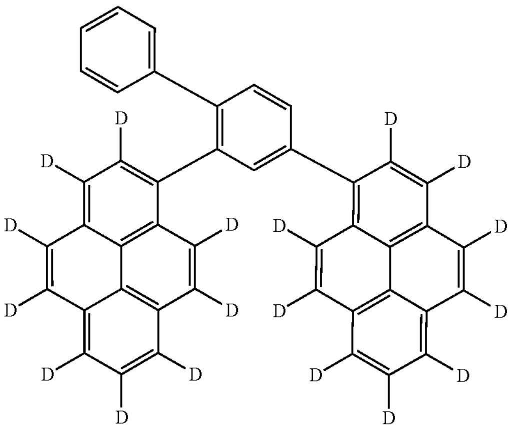

-continued
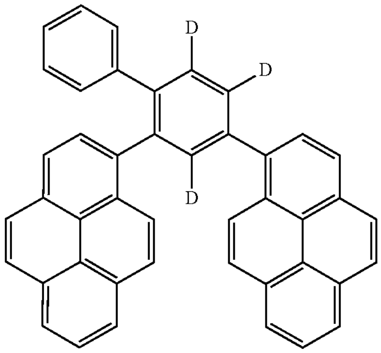
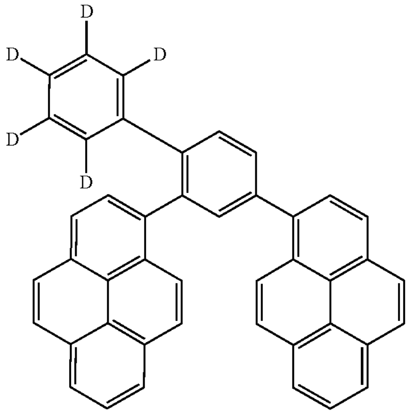
[Formula 216]
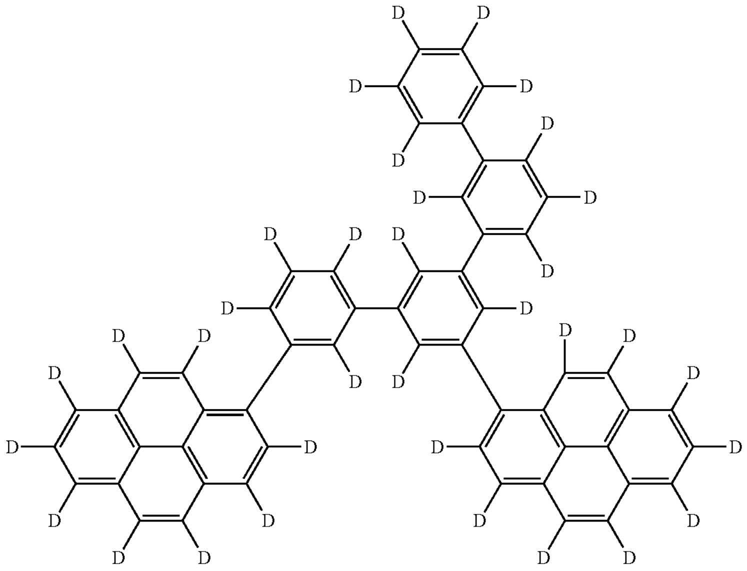
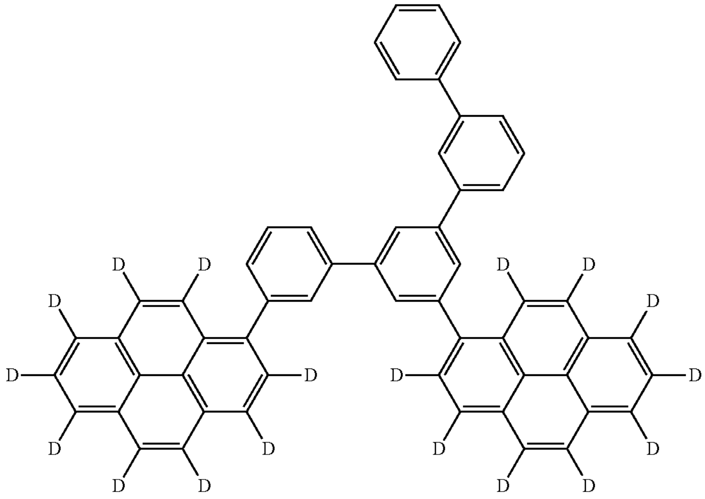

-continued
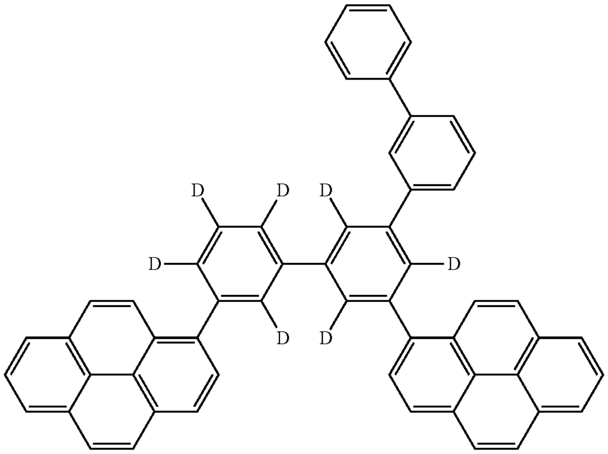
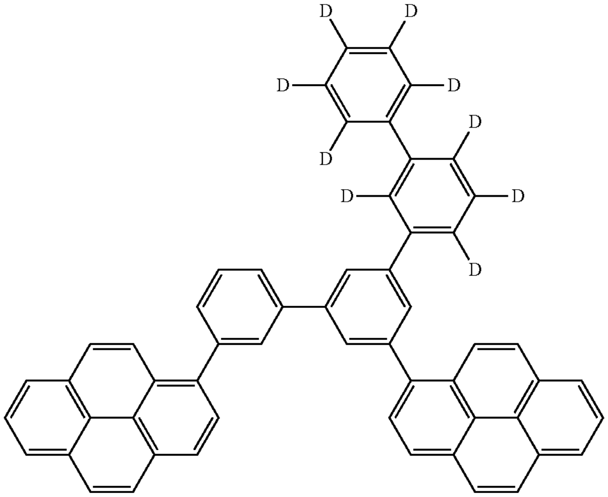
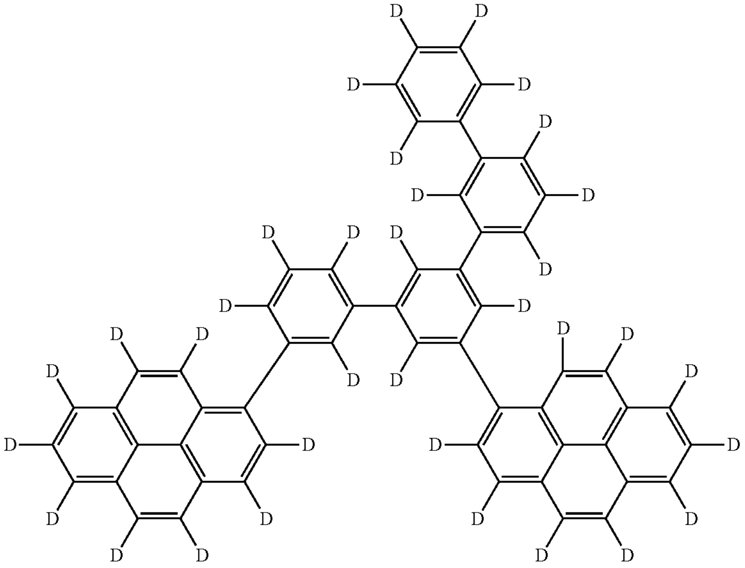

-continued
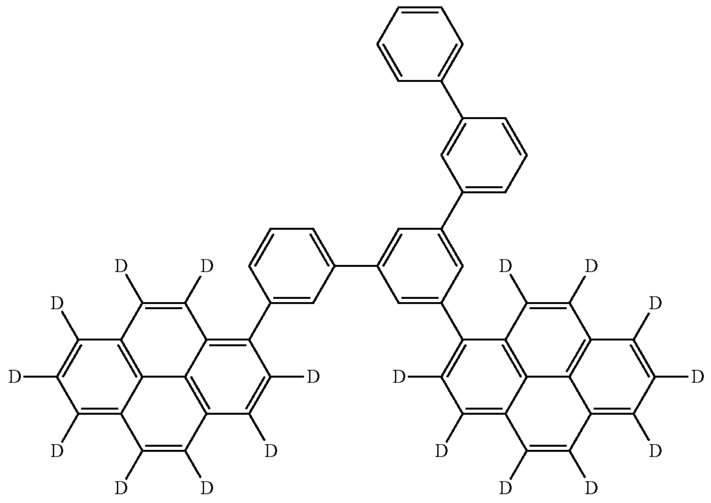
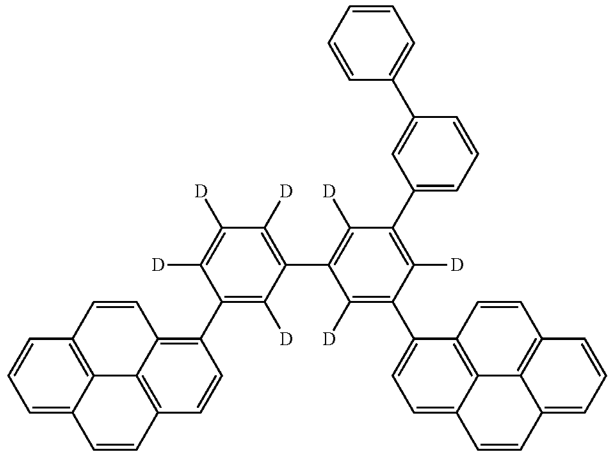
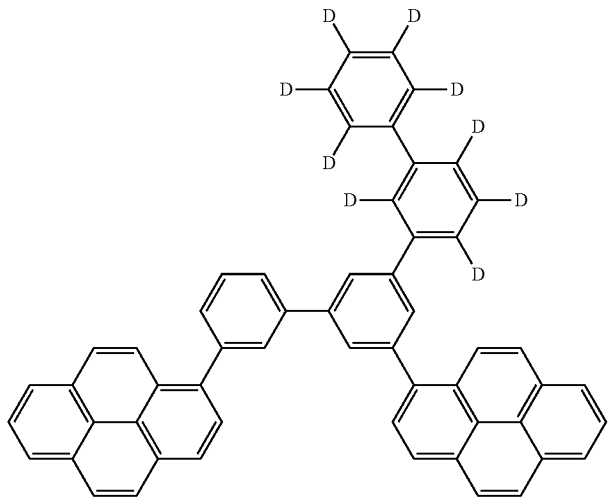

-continued
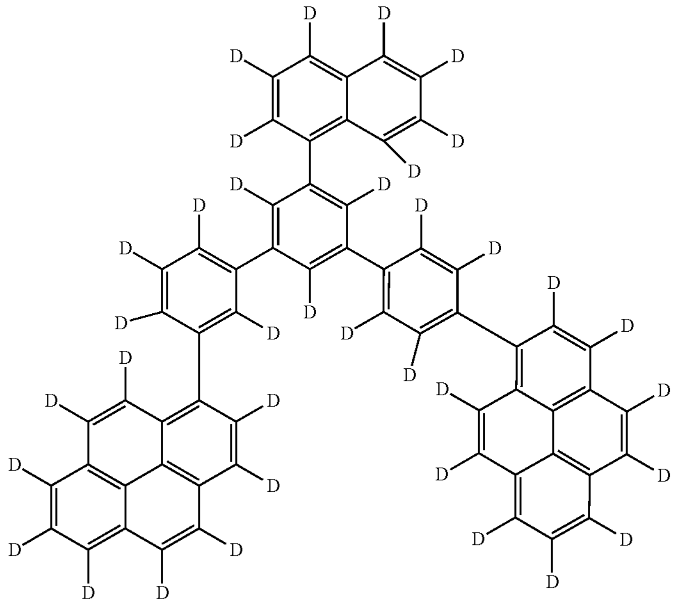
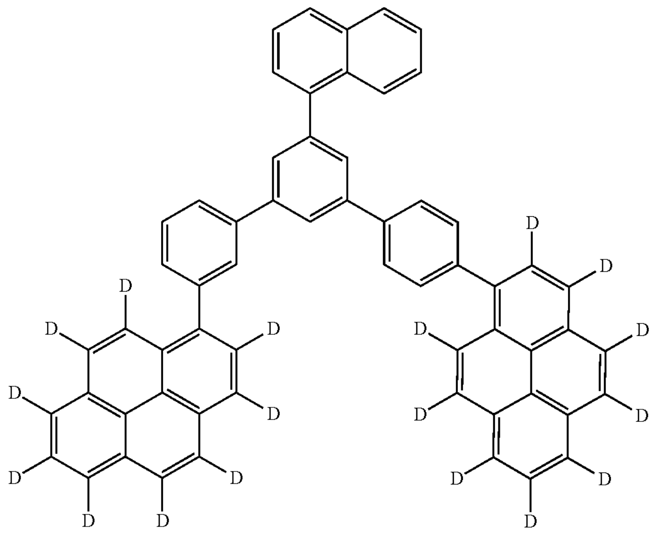
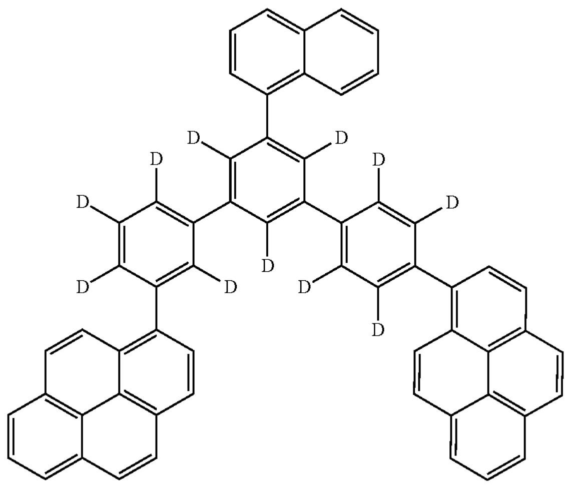
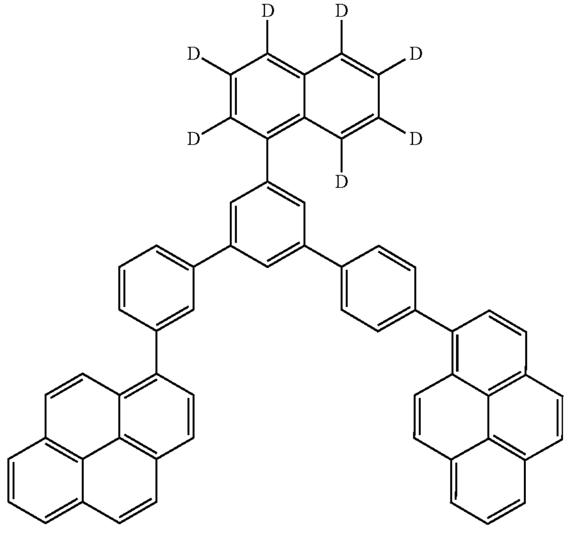

-continued
[Formula 217]
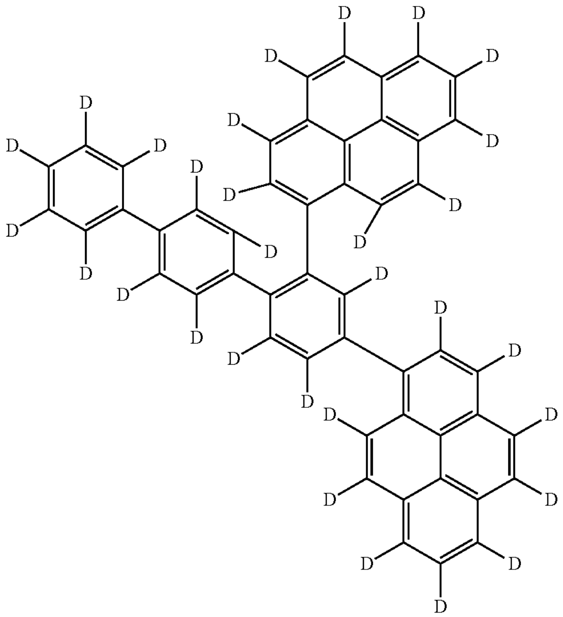
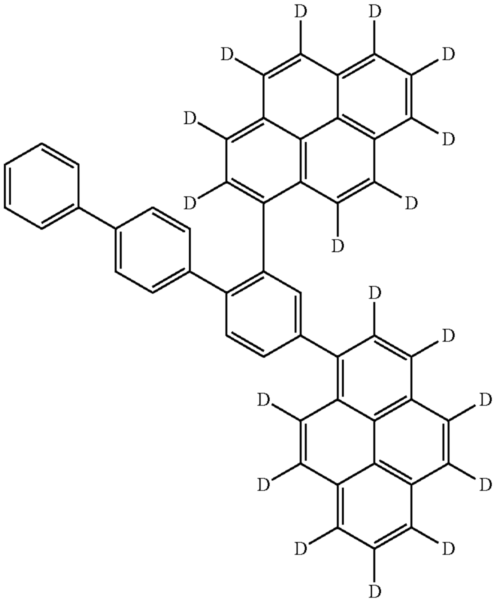
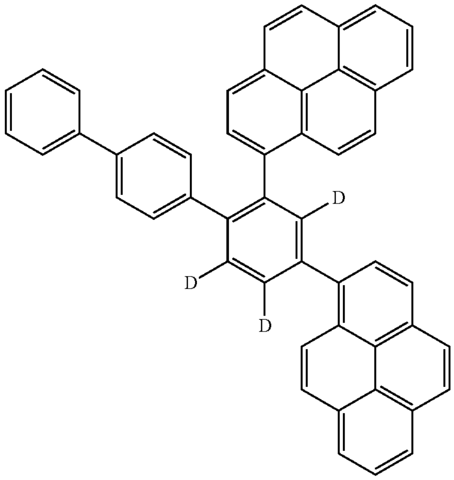
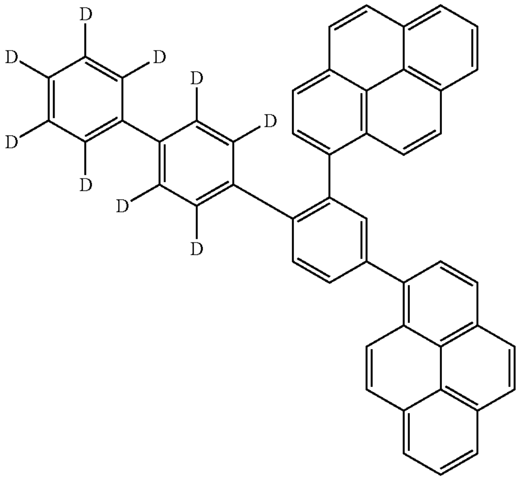

-continued
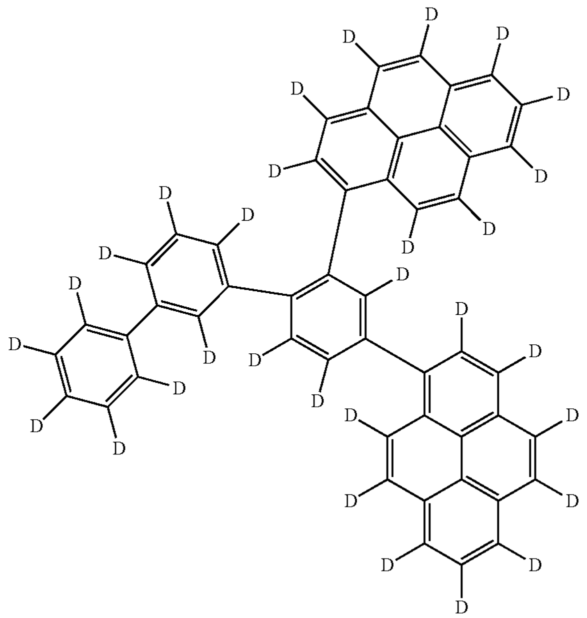
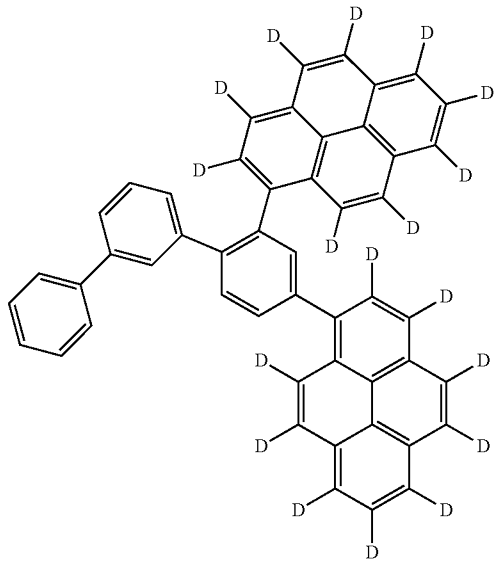
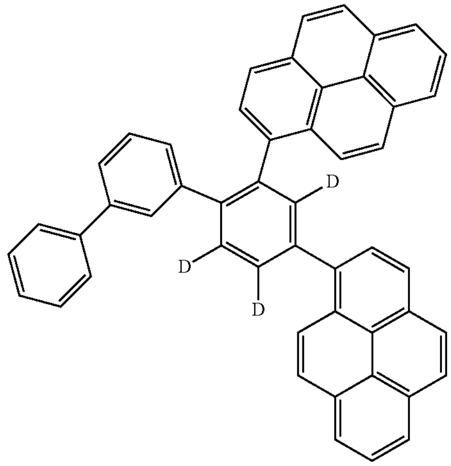
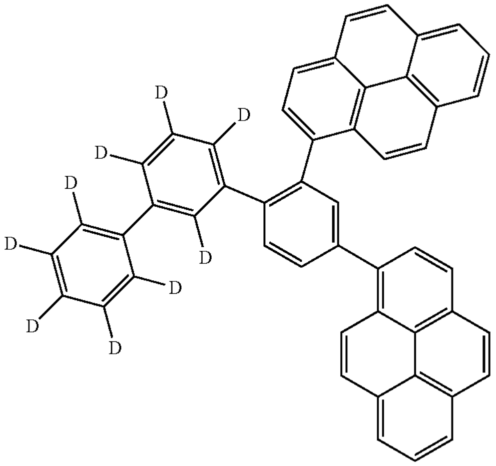
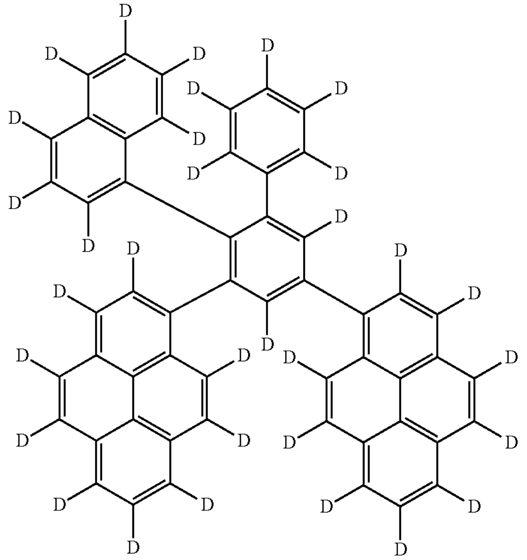
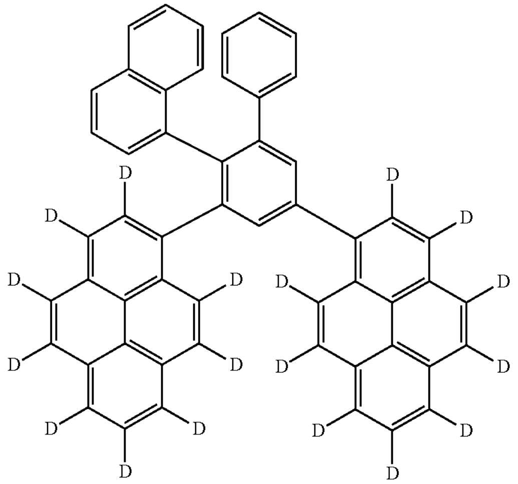

-continued
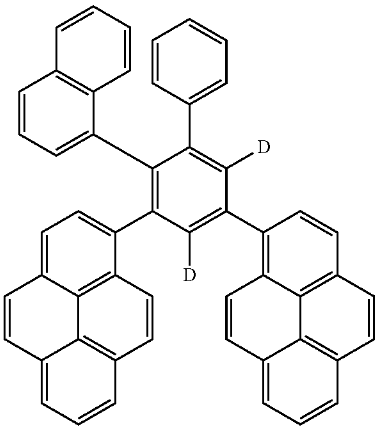
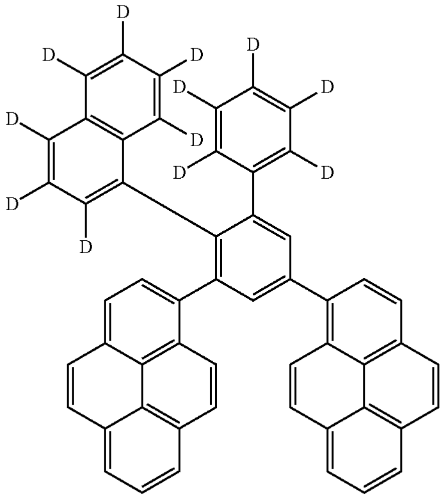
[Formula 218]
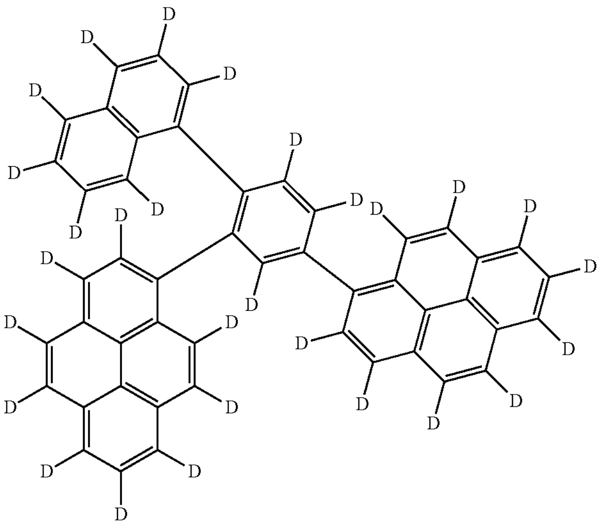
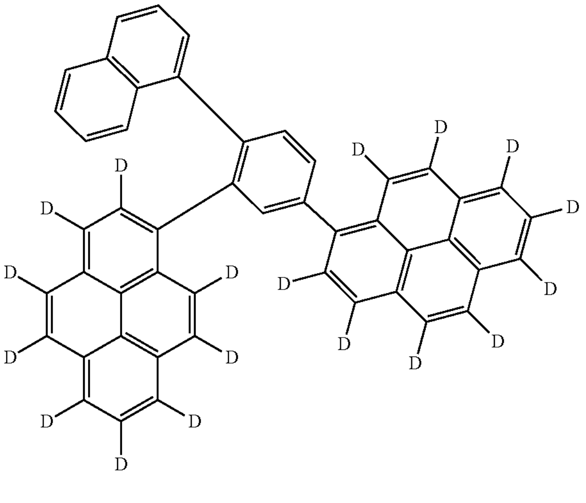
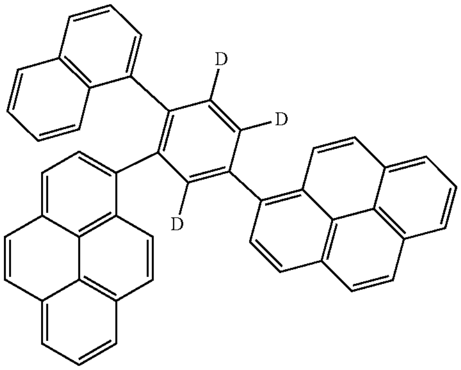

-continued
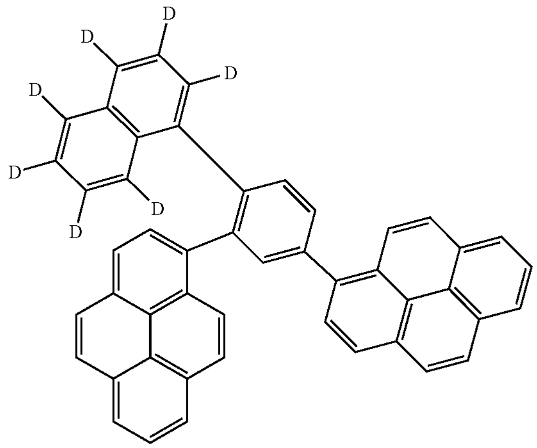
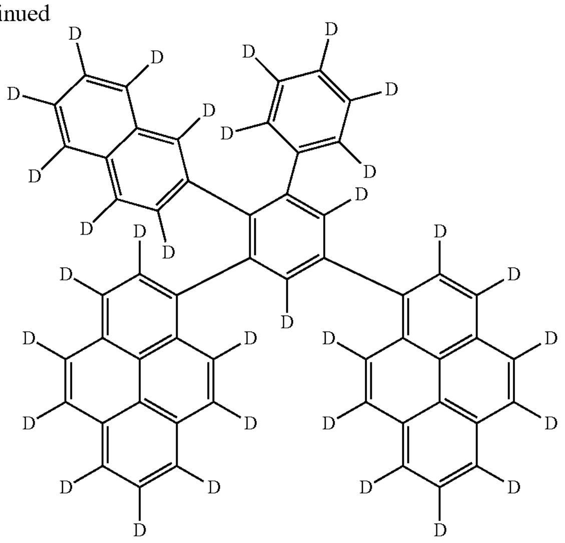
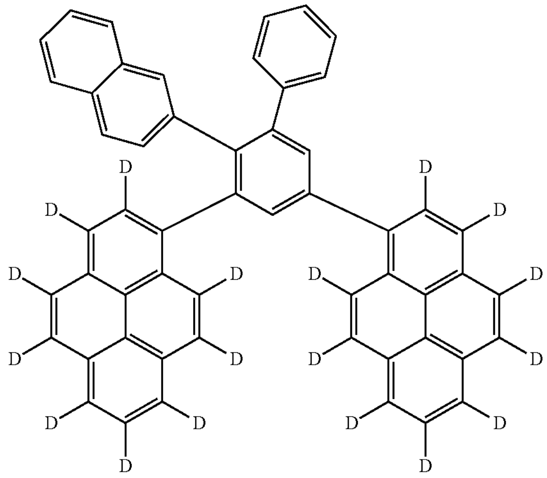
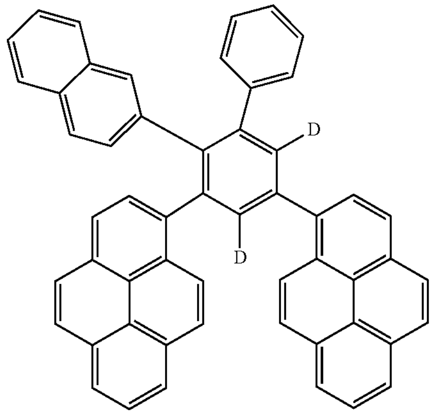
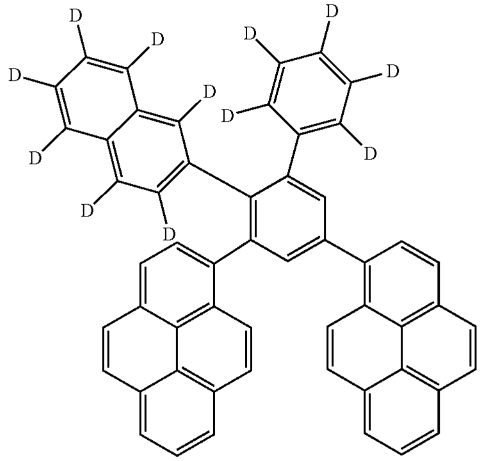

-continued
[Formula 219]
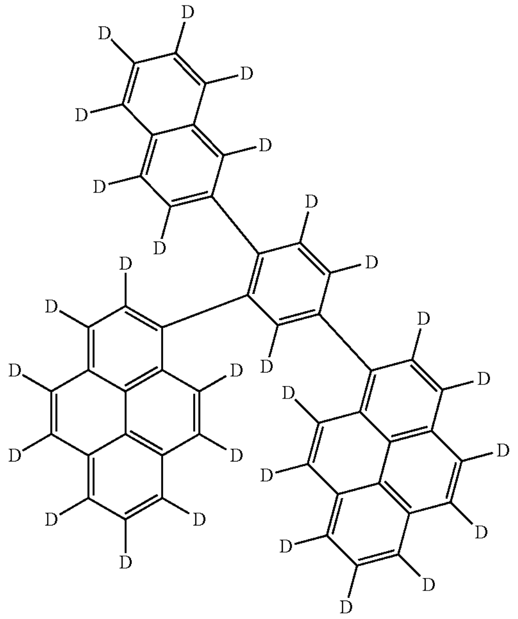
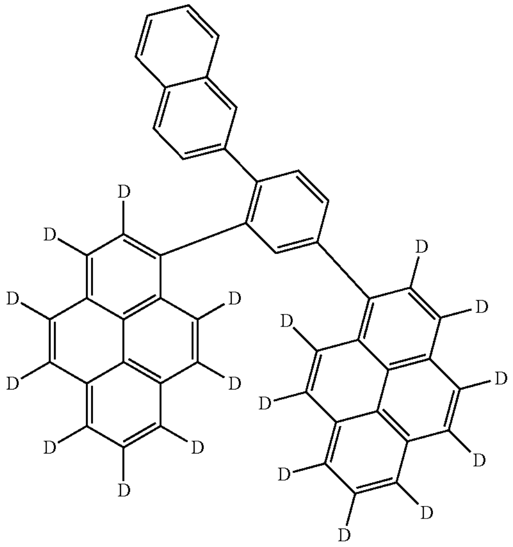
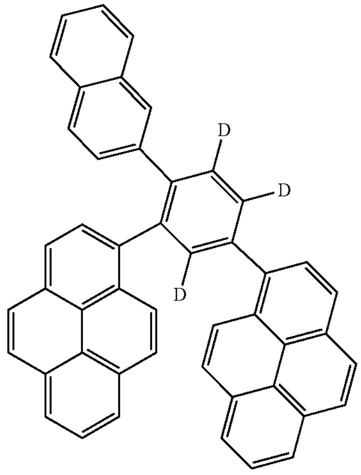
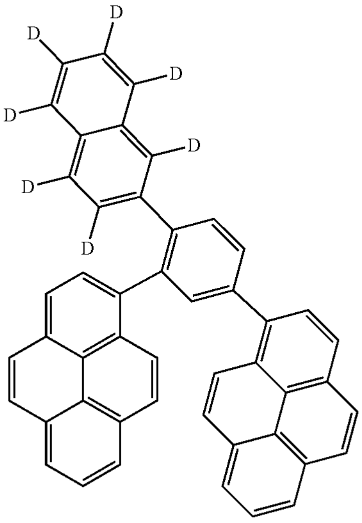

-continued
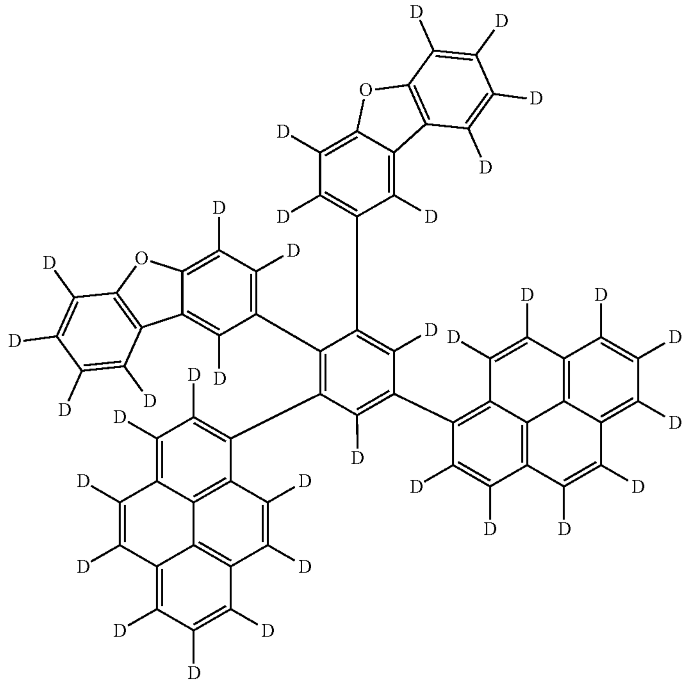
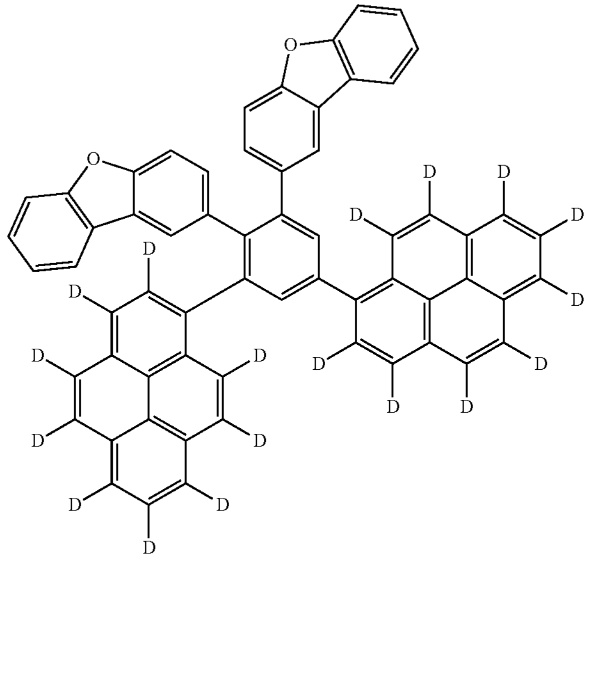
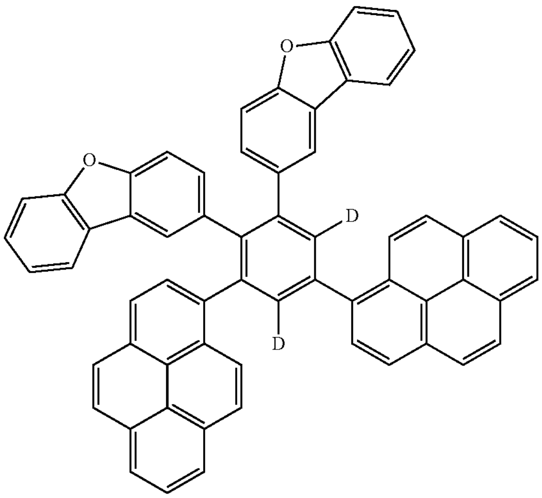

-continued
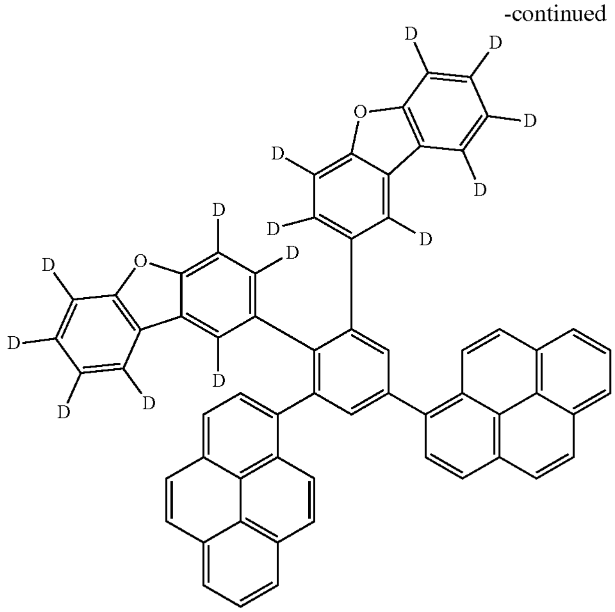
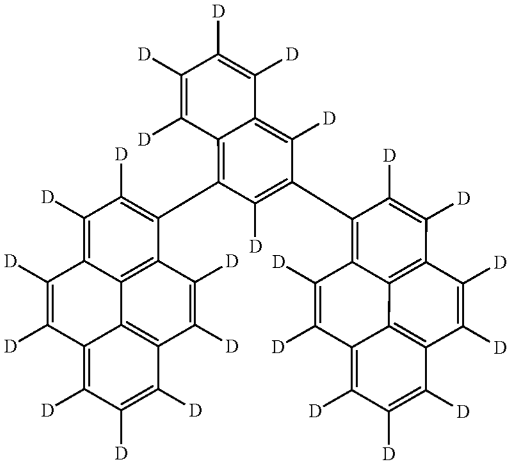
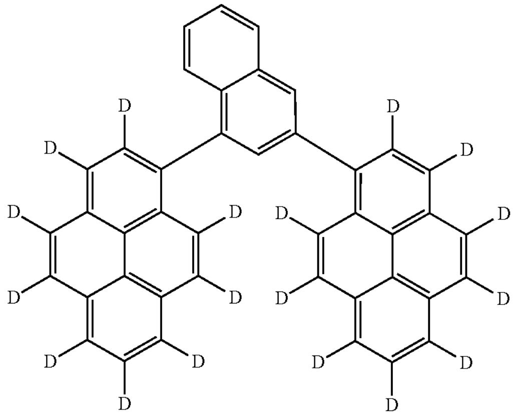
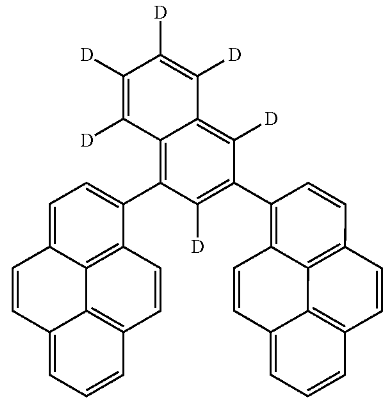
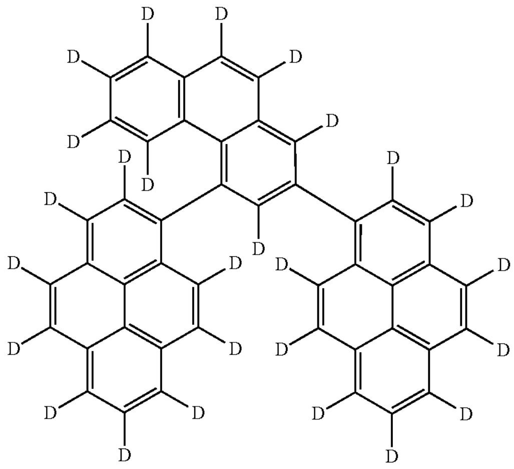

-continued
[Formula 220]
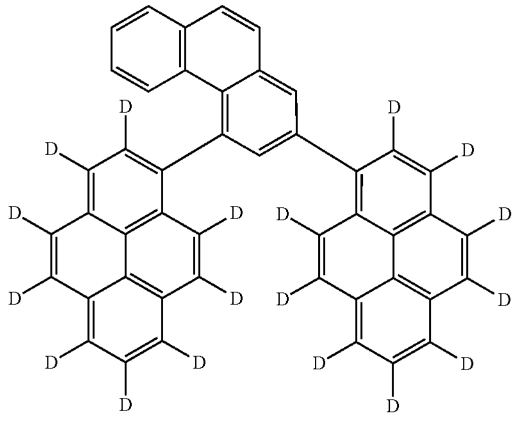
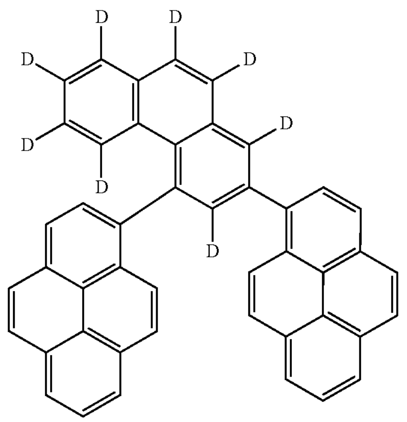
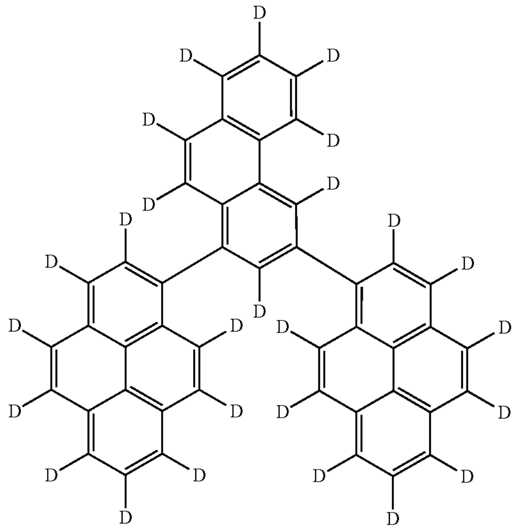
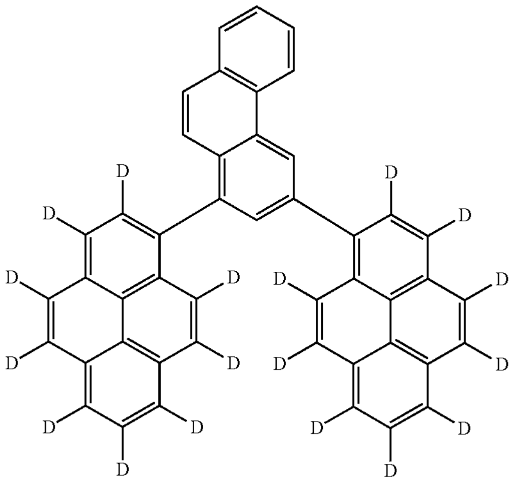
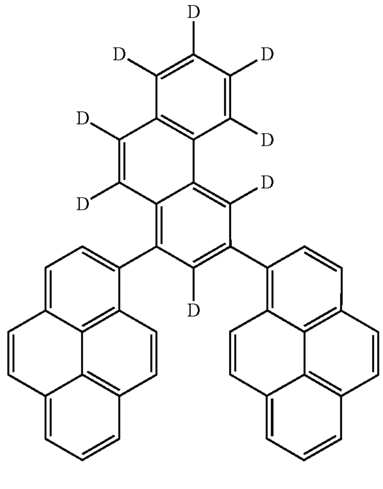
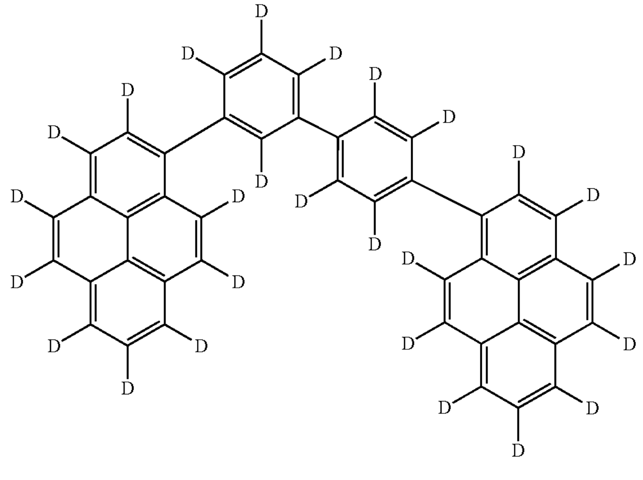

-continued
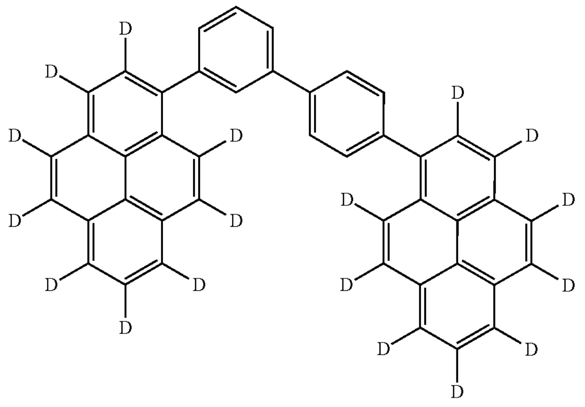
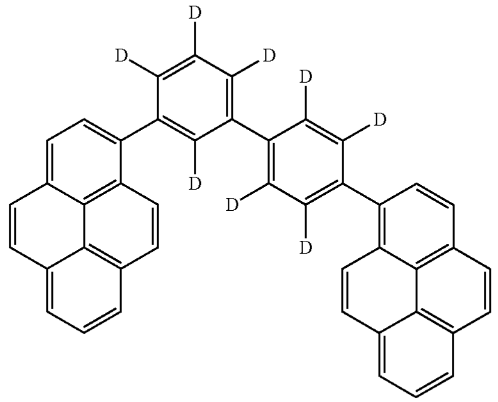
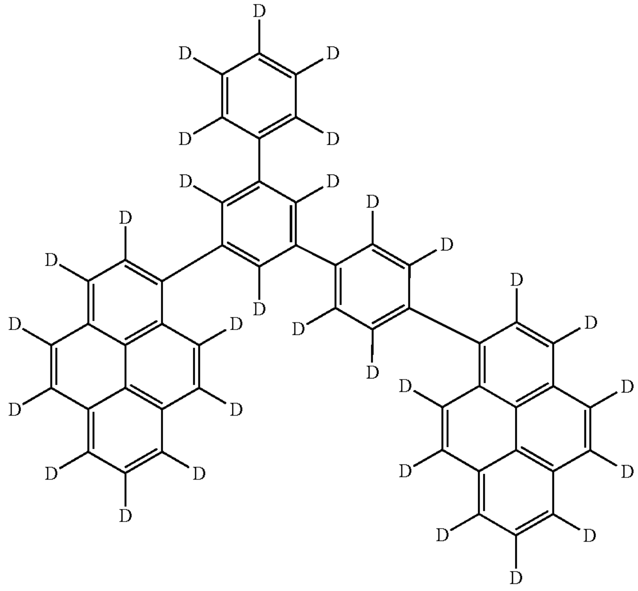
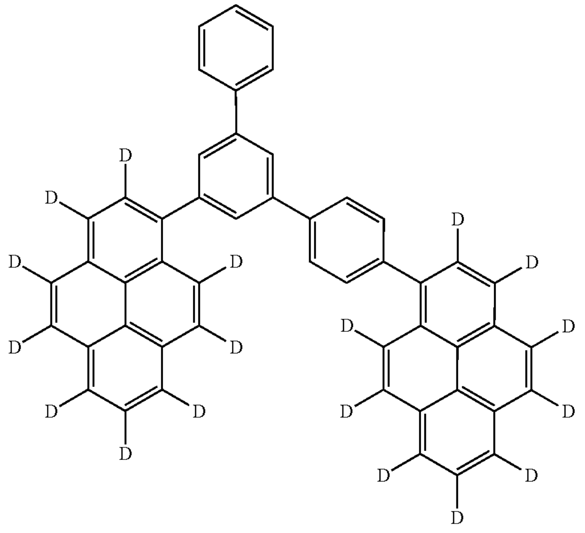
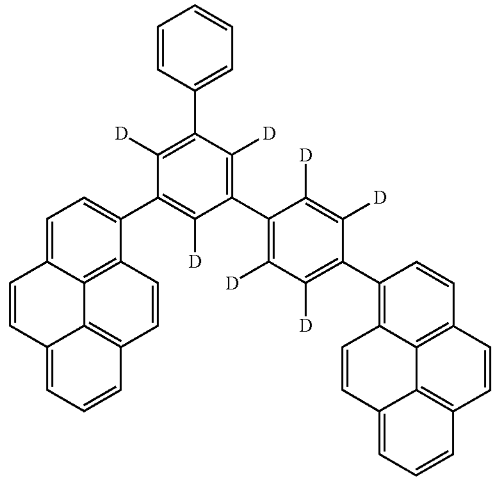

-continued
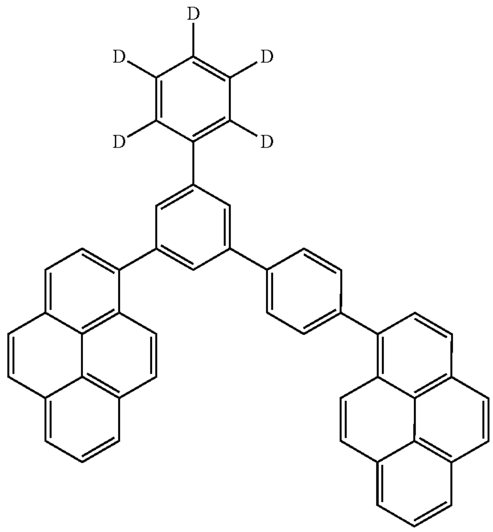
[Formula 221]
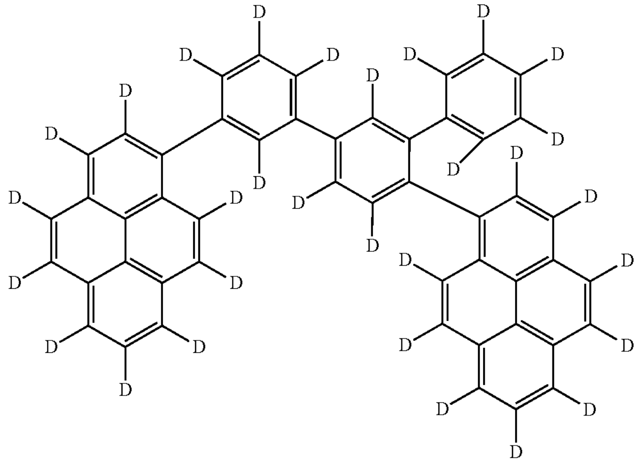
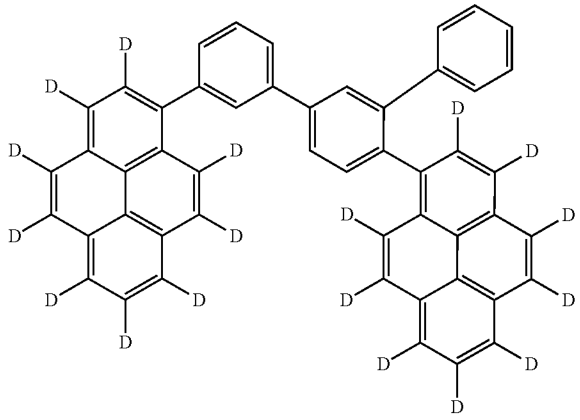
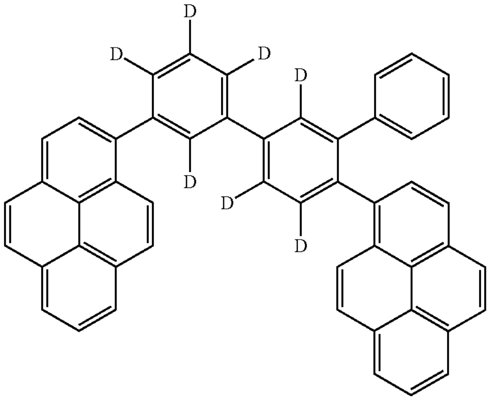

-continued
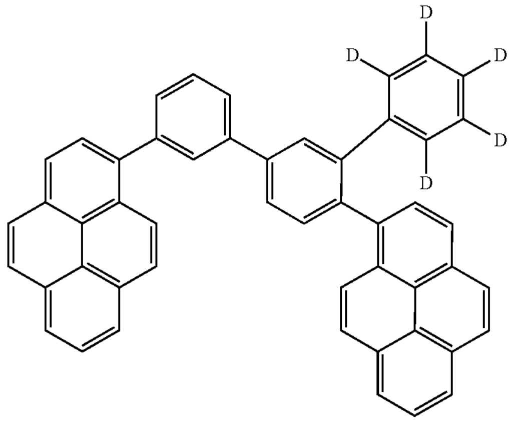
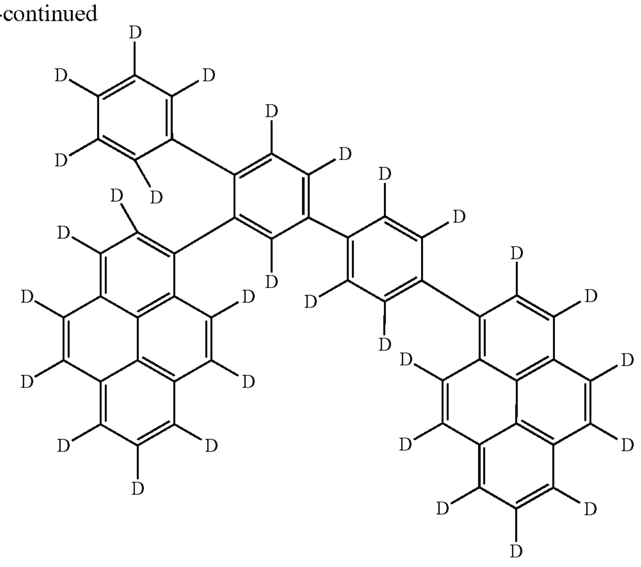
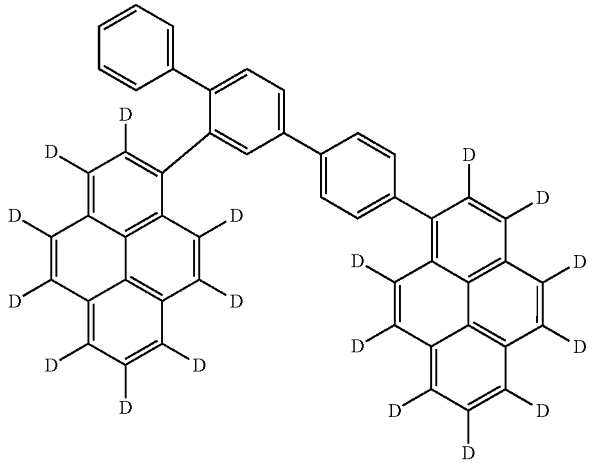
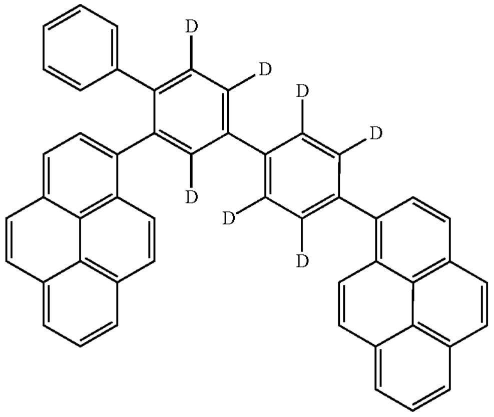
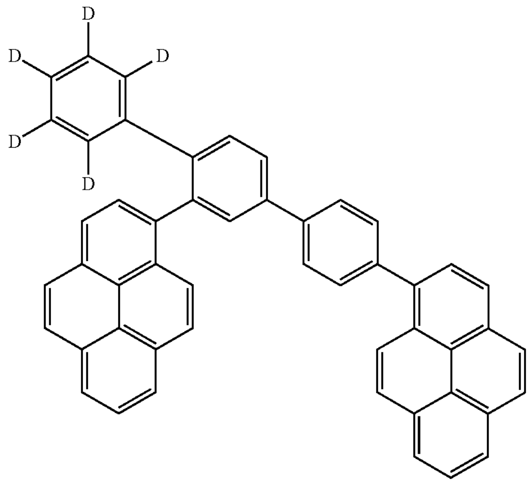

-continued
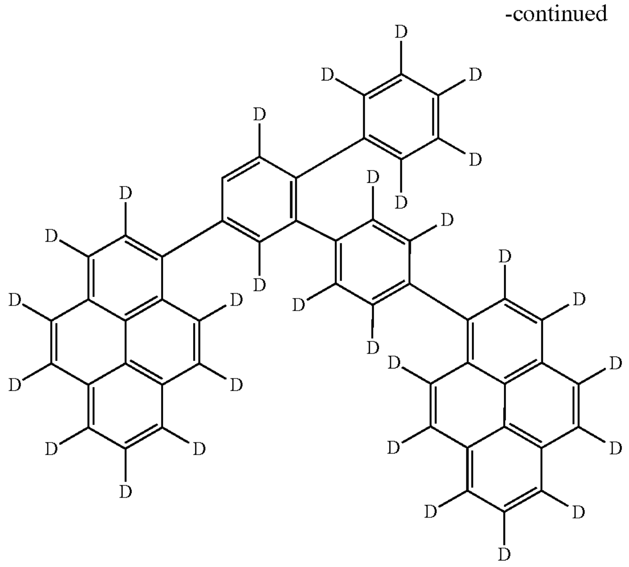
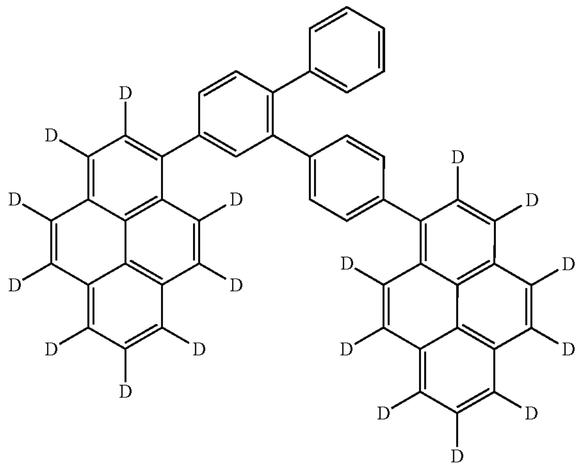
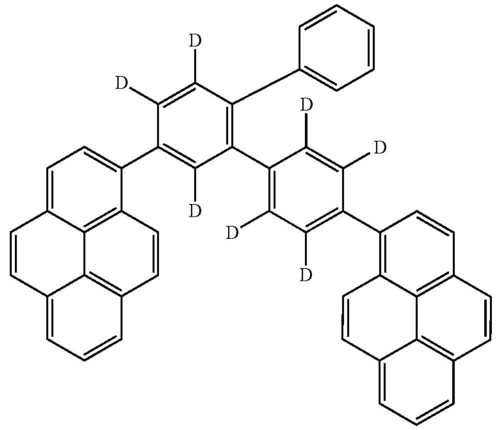
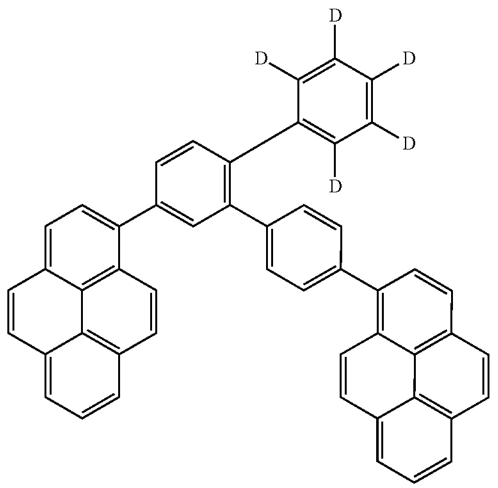

[Formula 222]
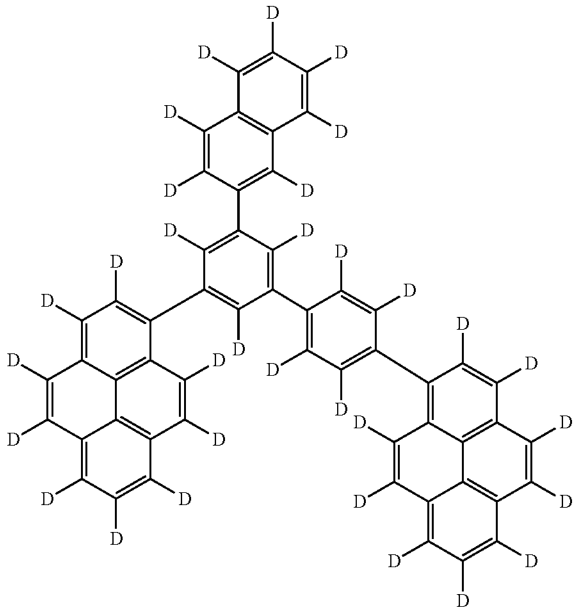
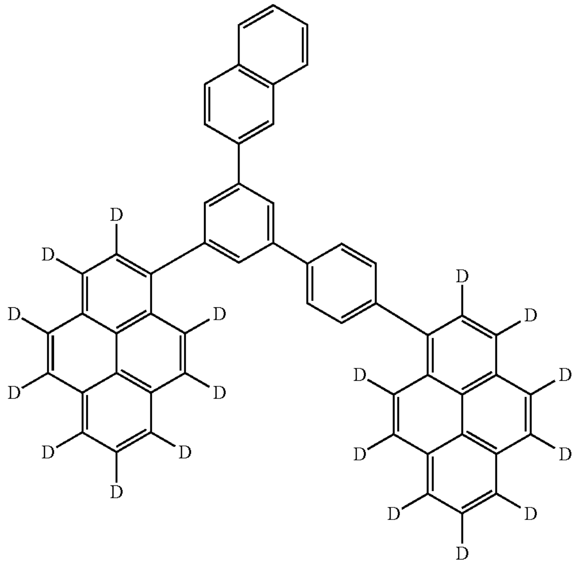
-continued
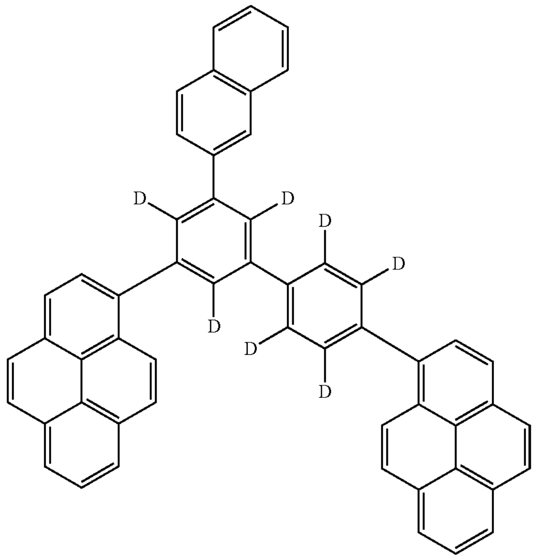
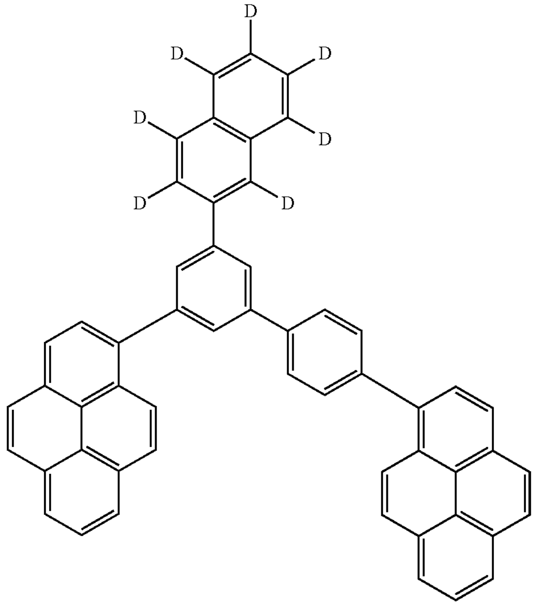
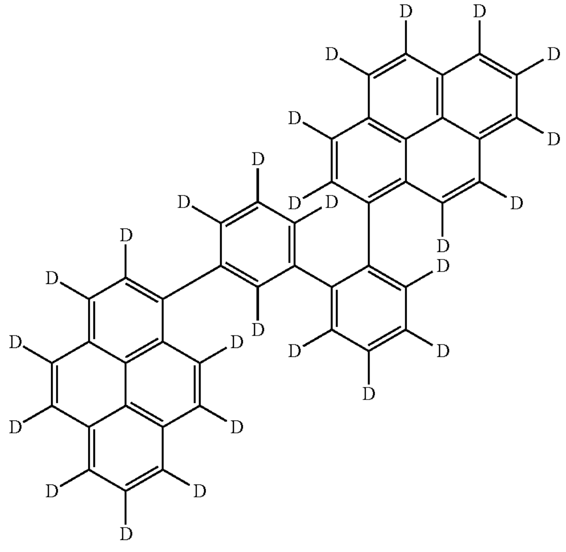

-continued
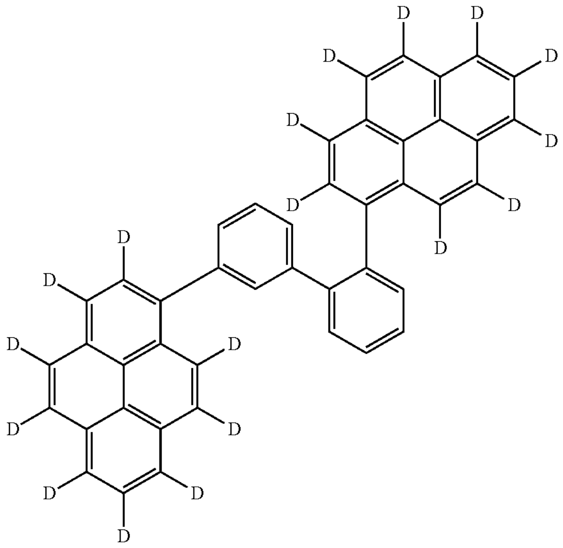
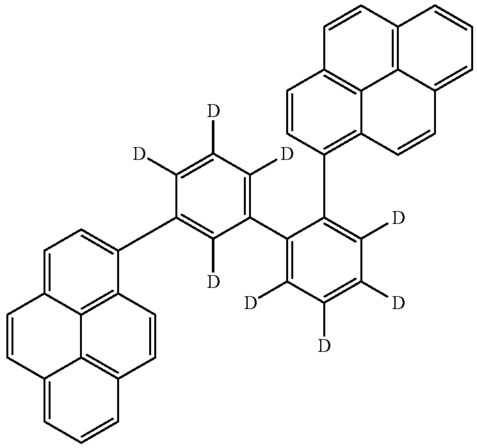
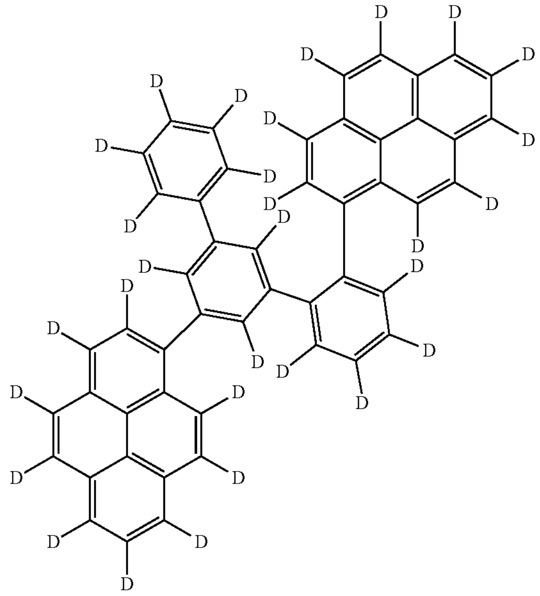
-continued
[Formula 223]
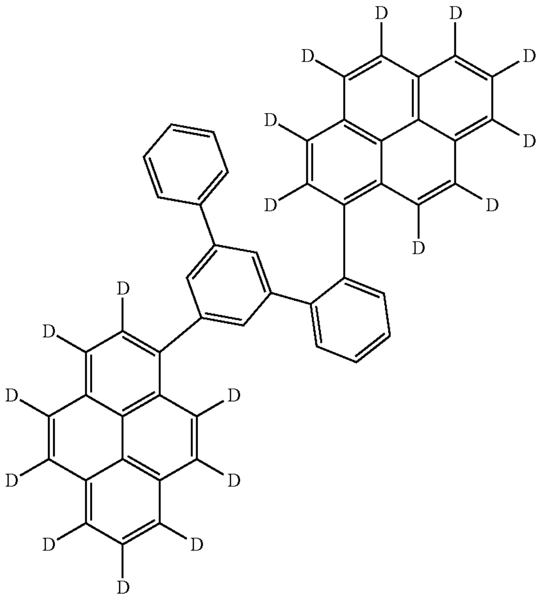
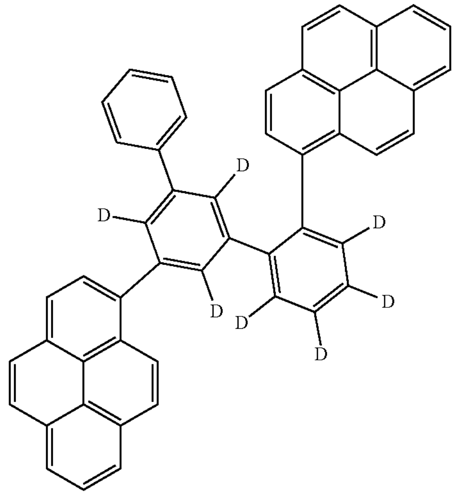
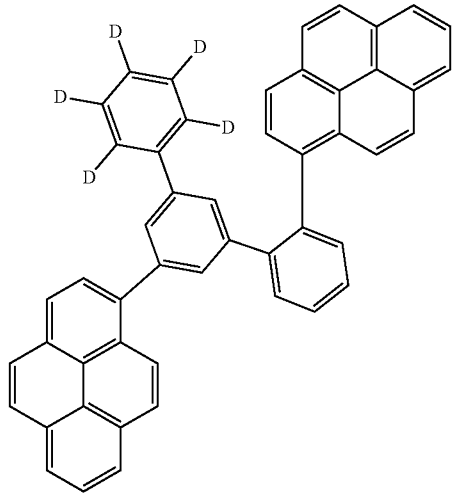

-continued
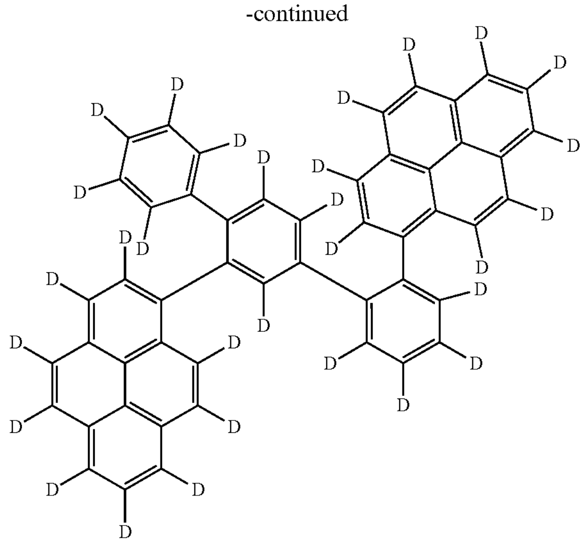
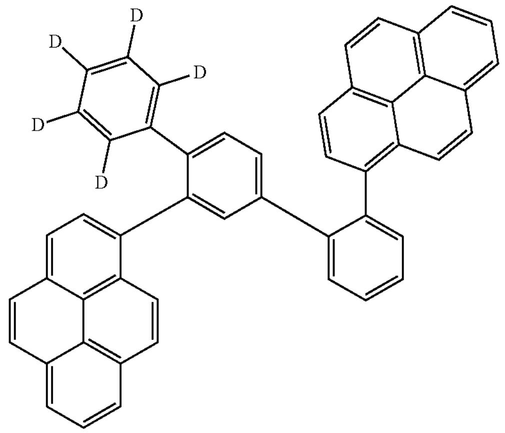
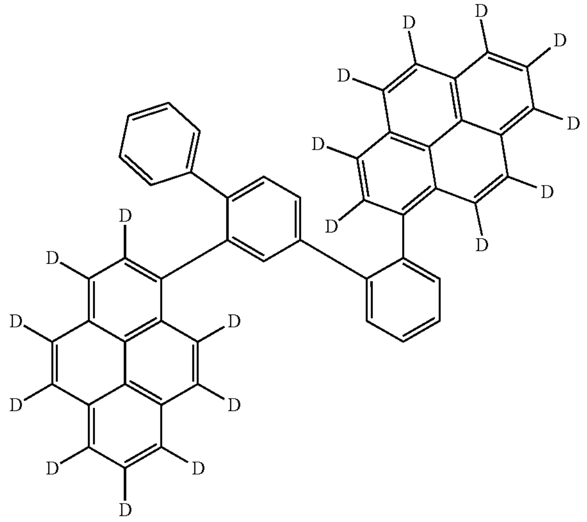
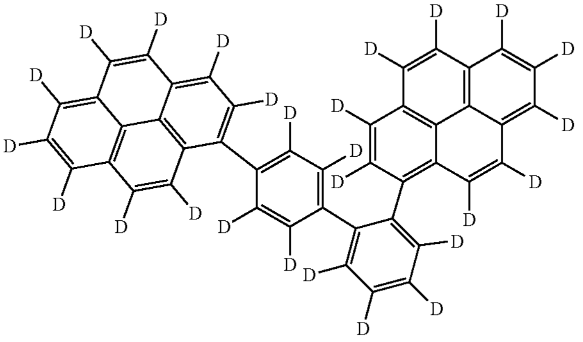
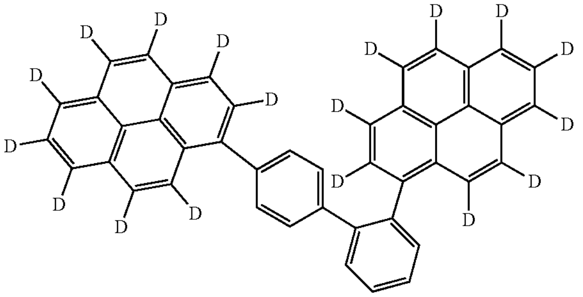
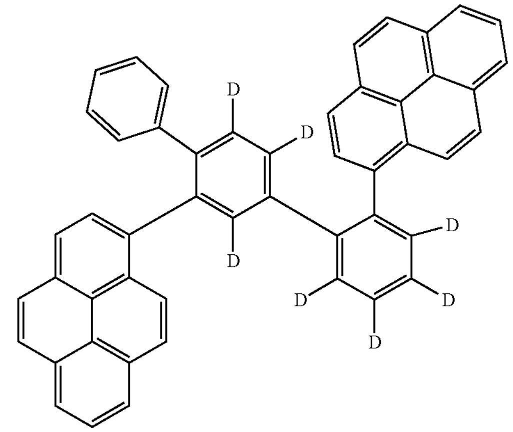
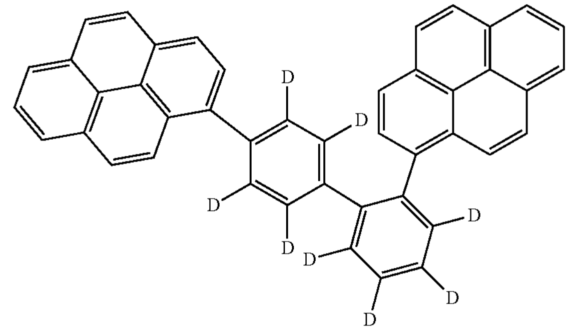

-continued
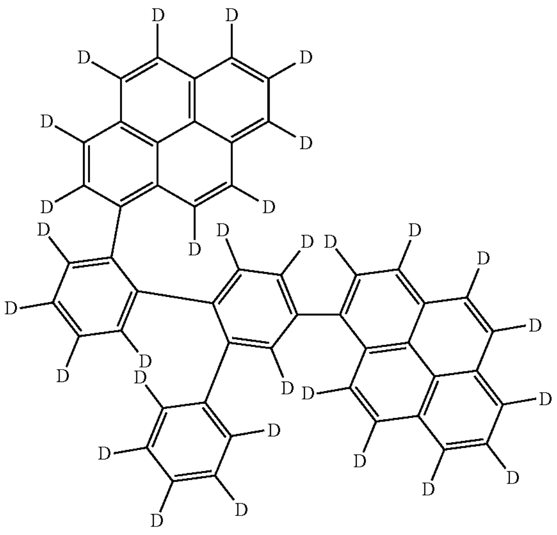
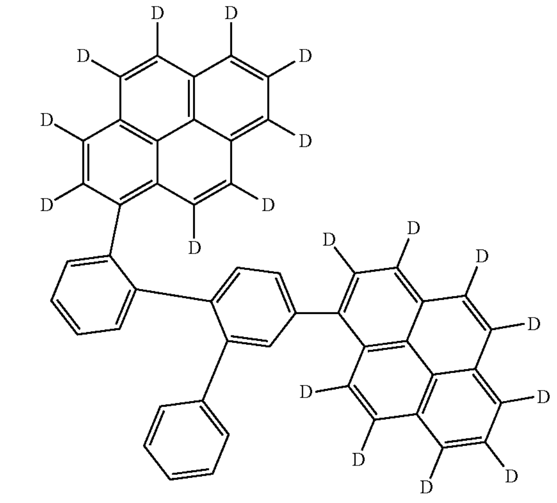
[Formula 224]
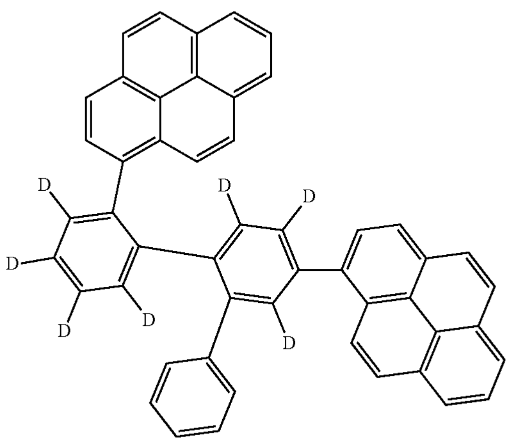
-continued
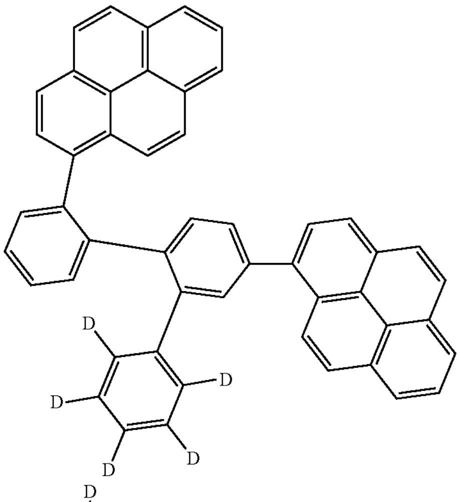
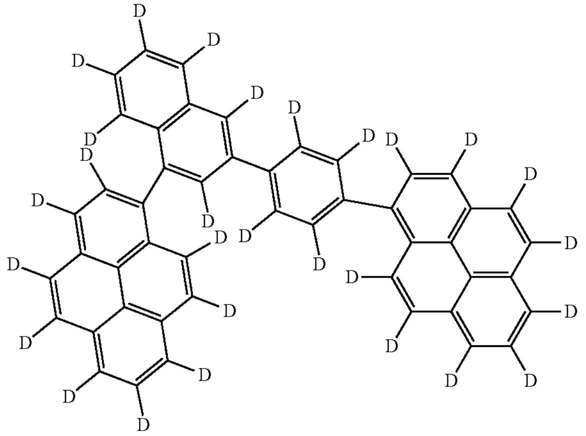
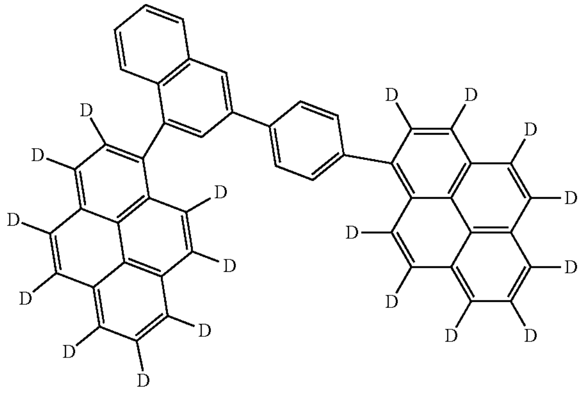
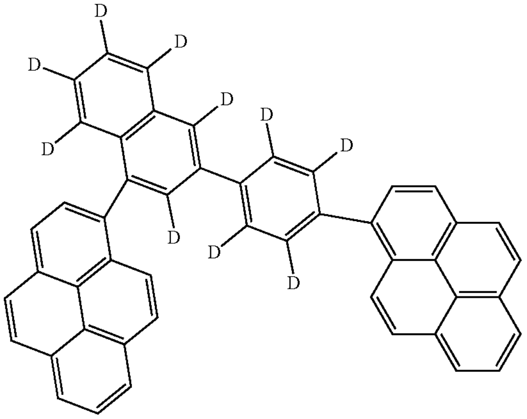

-continued
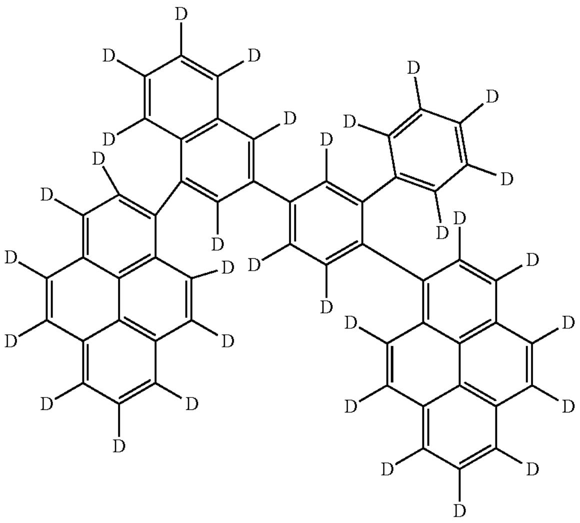
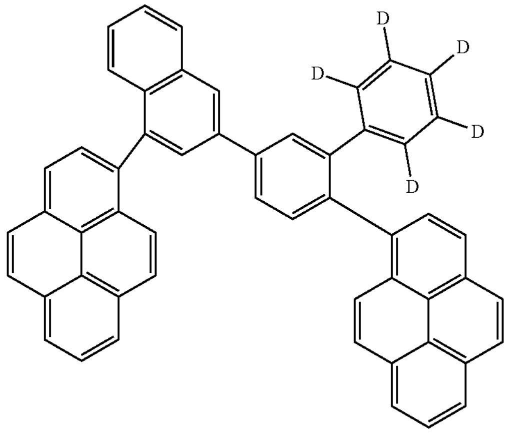
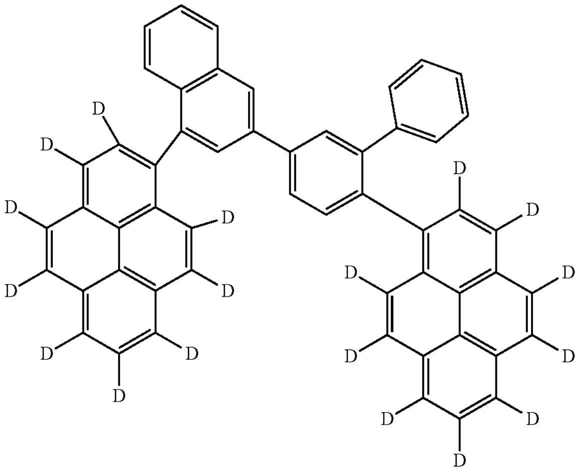
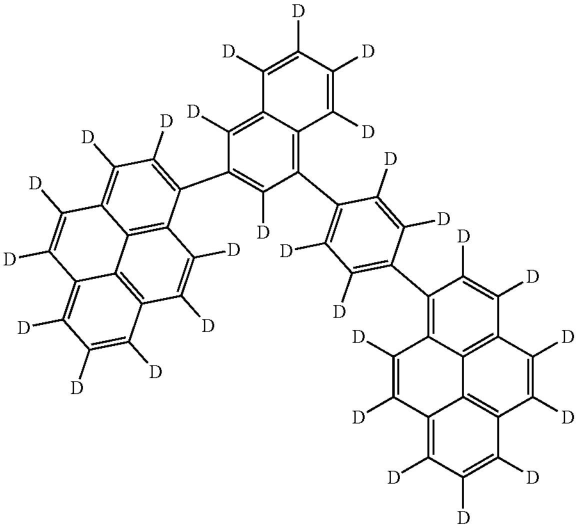
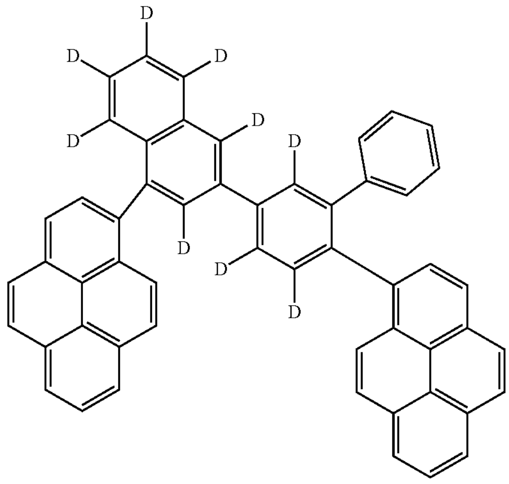
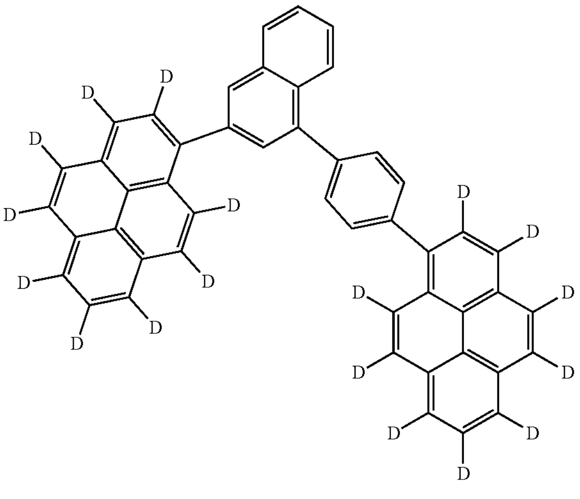

-continued
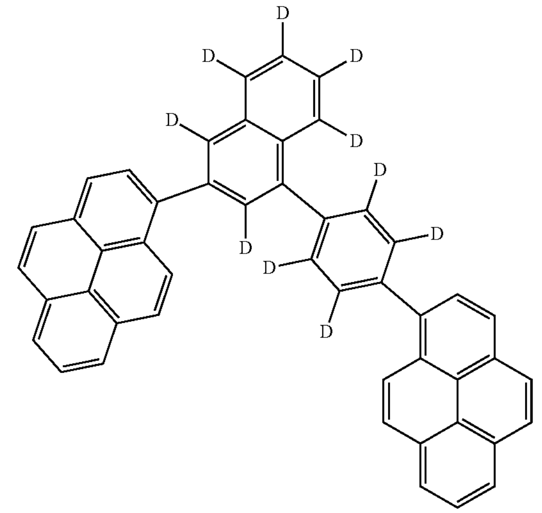
[Formula 225]
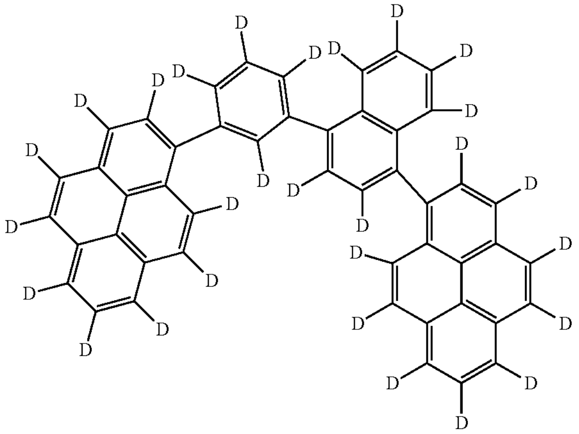
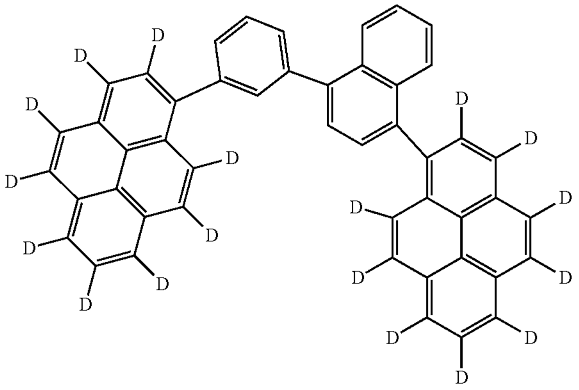
-continued
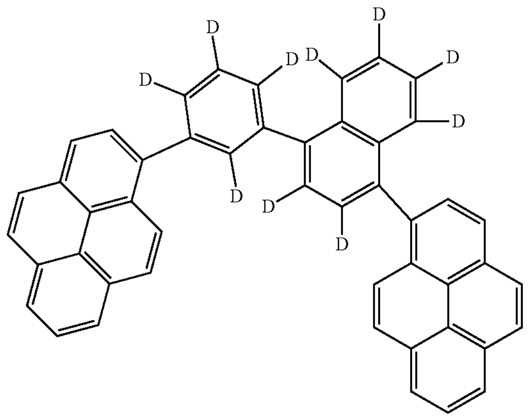
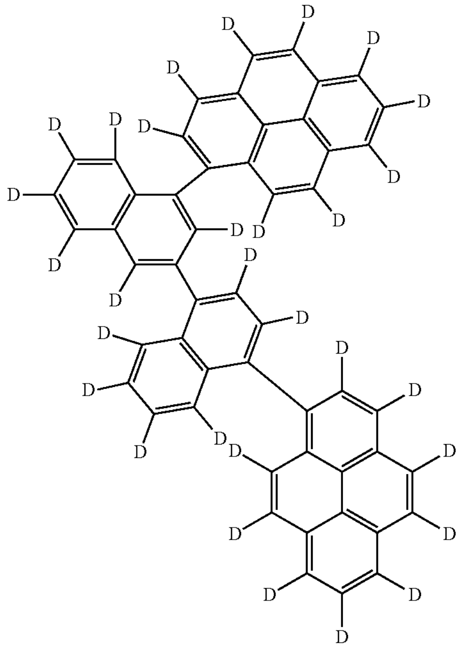

[Formula 226]
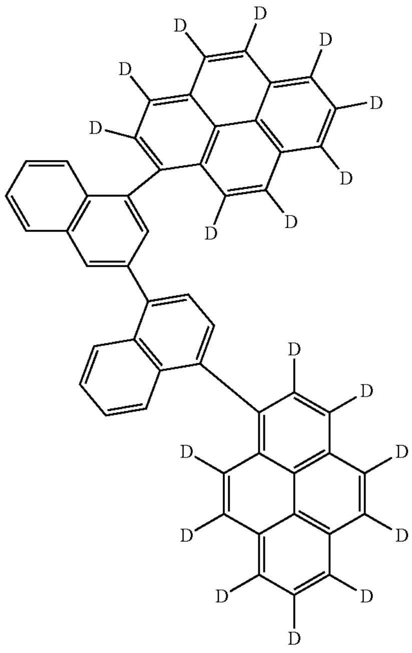
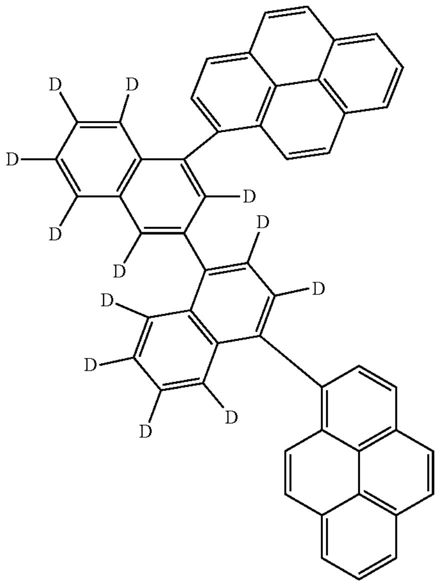
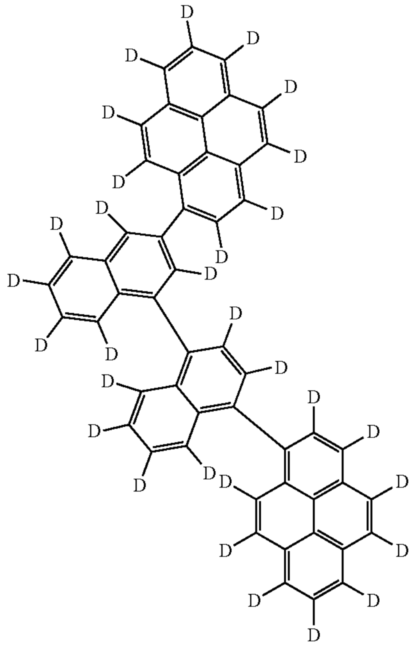
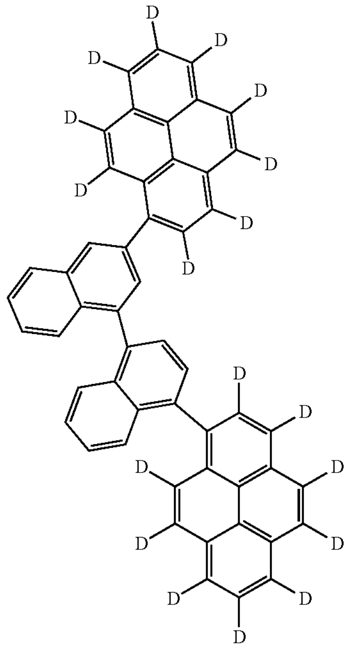

-continued
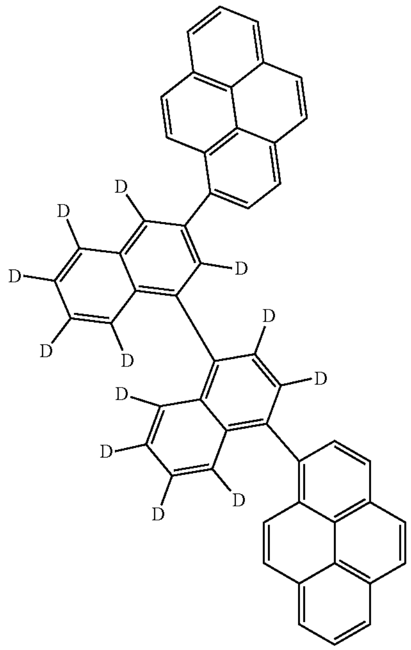
-continued
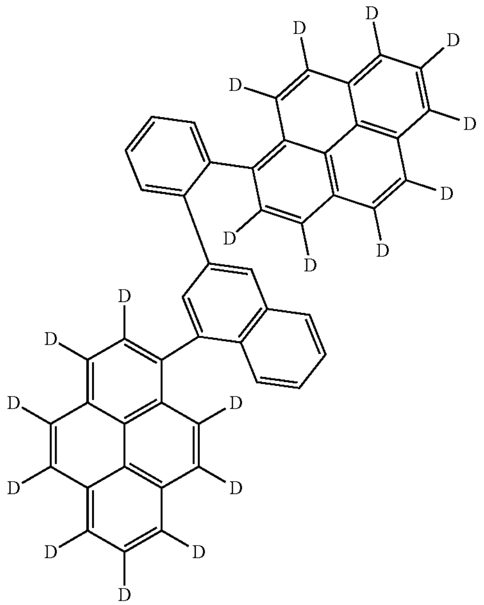
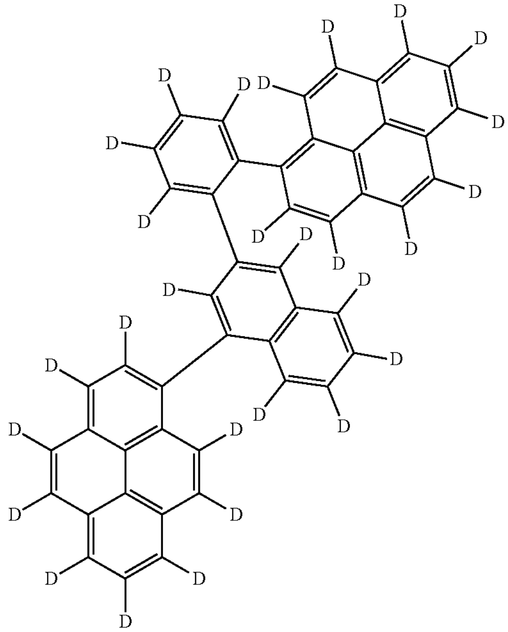
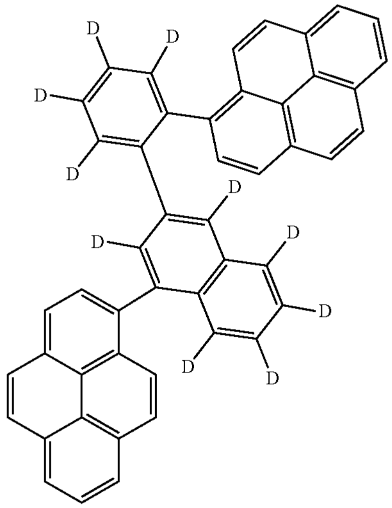

-continued
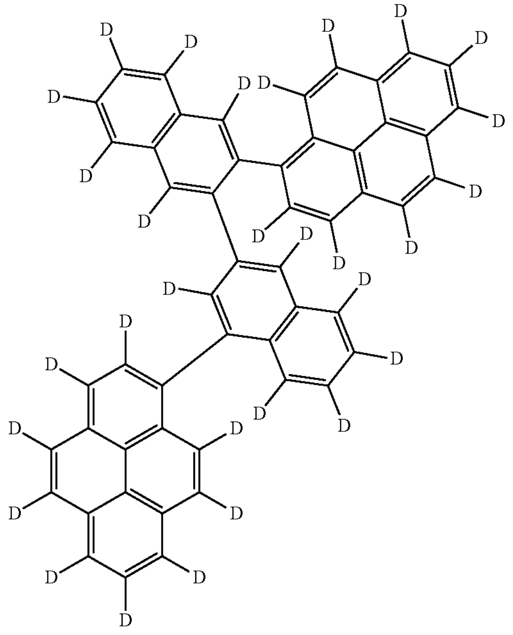
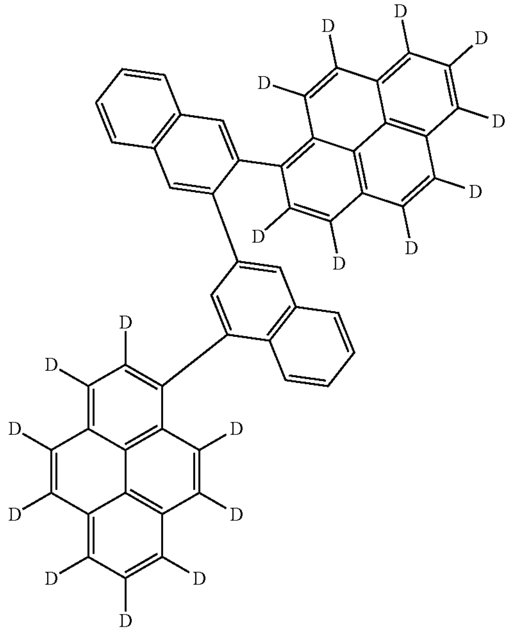
-continued
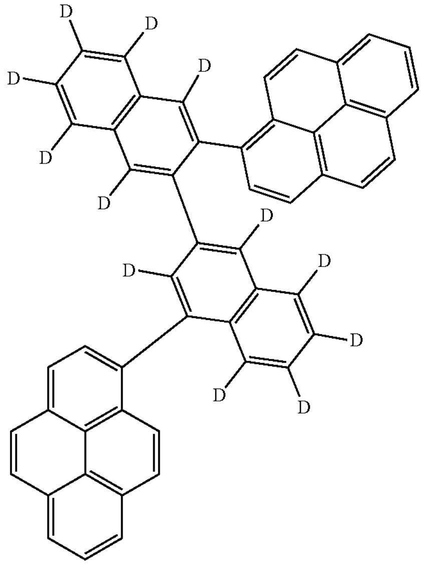
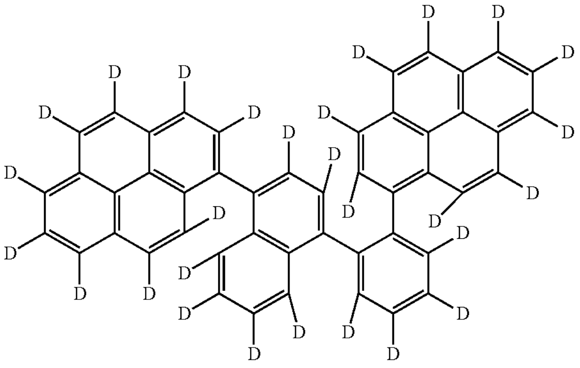
[Formula 227]
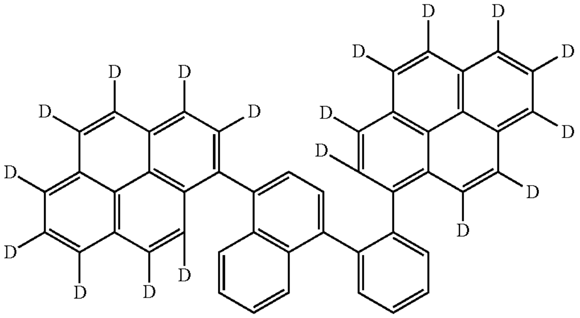
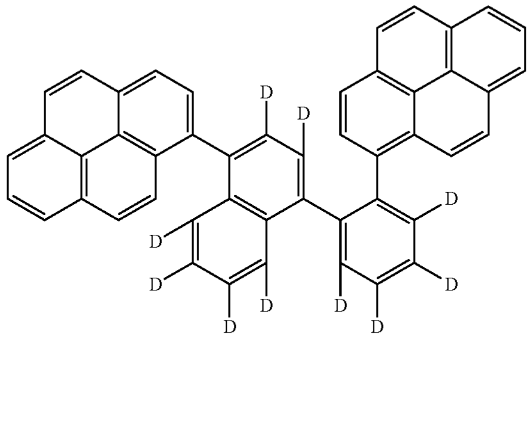

-continued
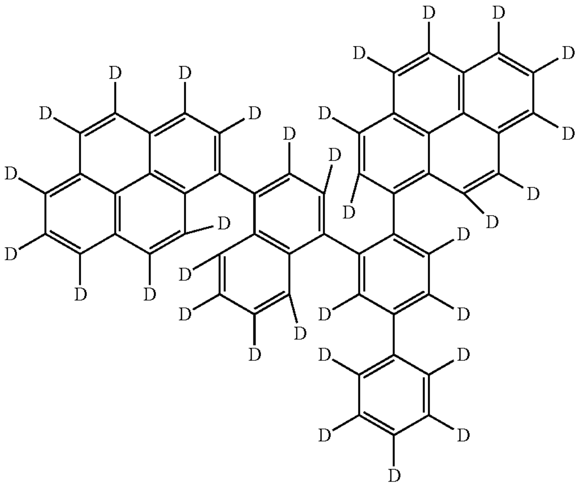
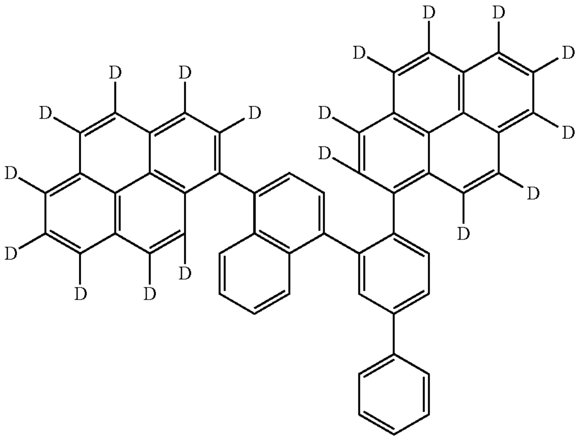
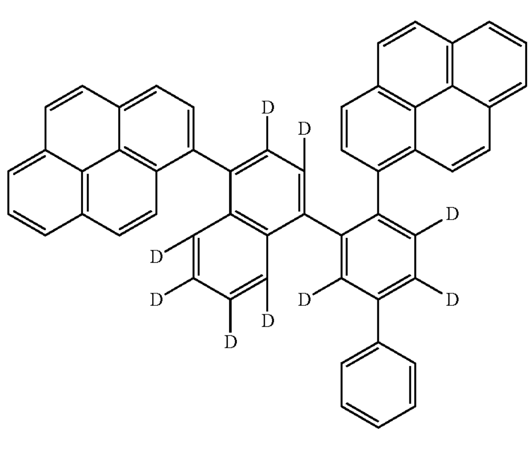
-continued
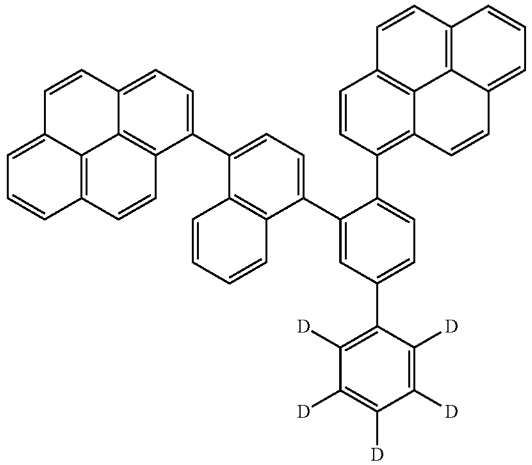
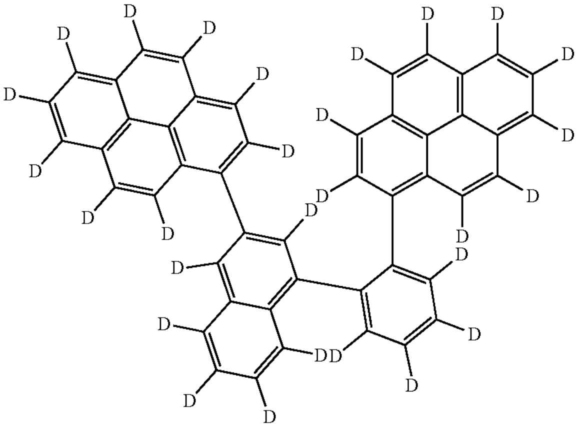
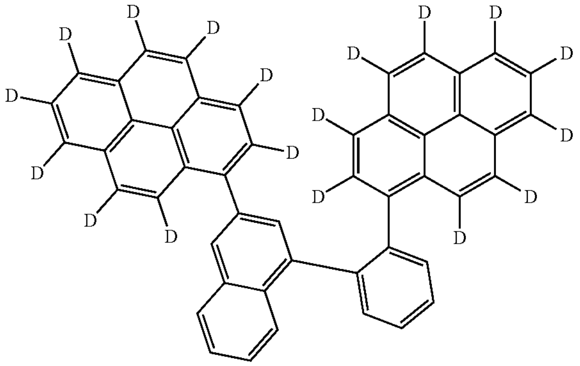
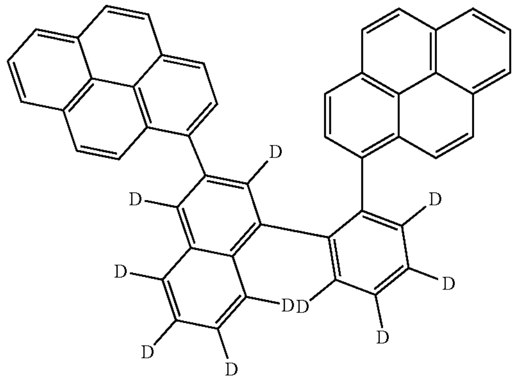

-continued
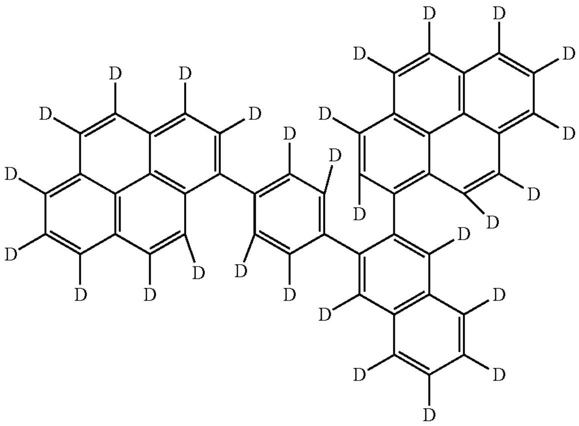
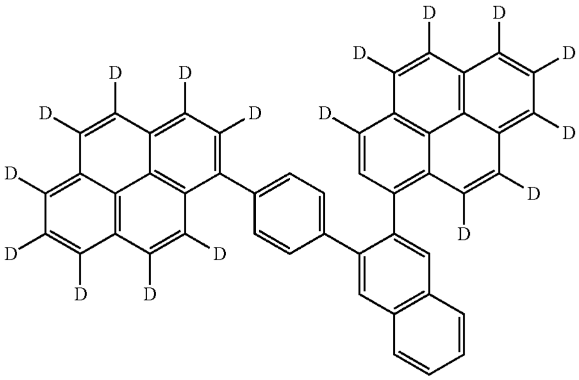
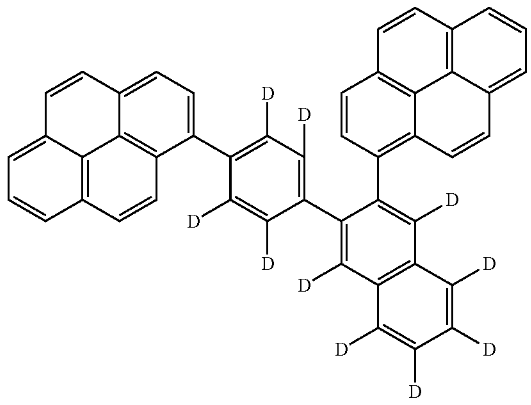
[Formula 228]
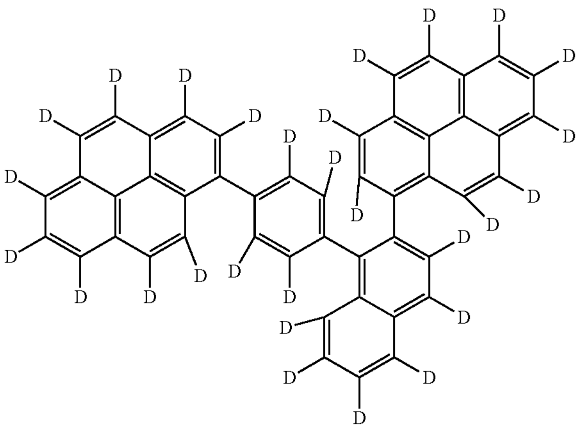
-continued
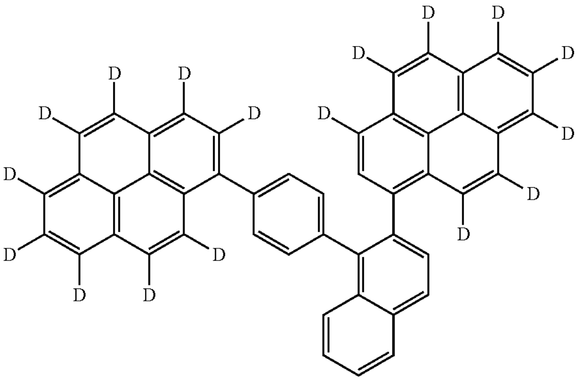
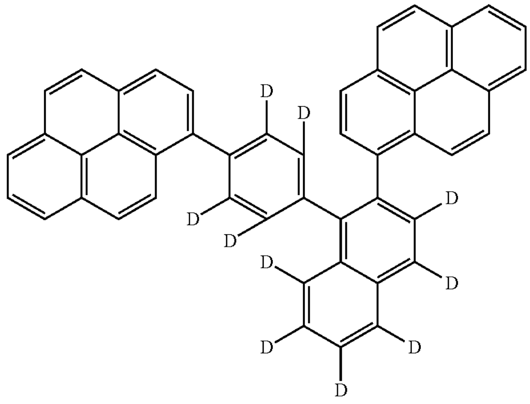
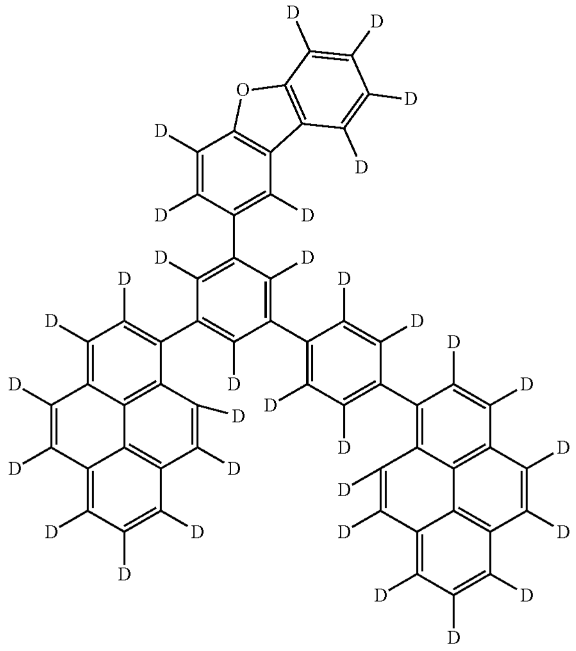

-continued
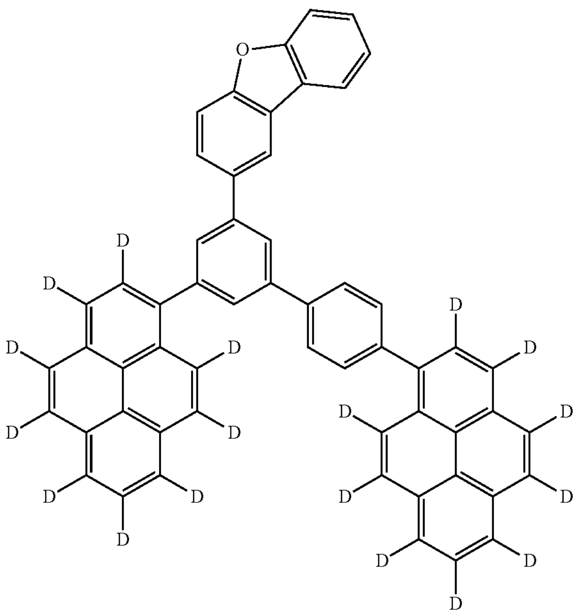
-continued
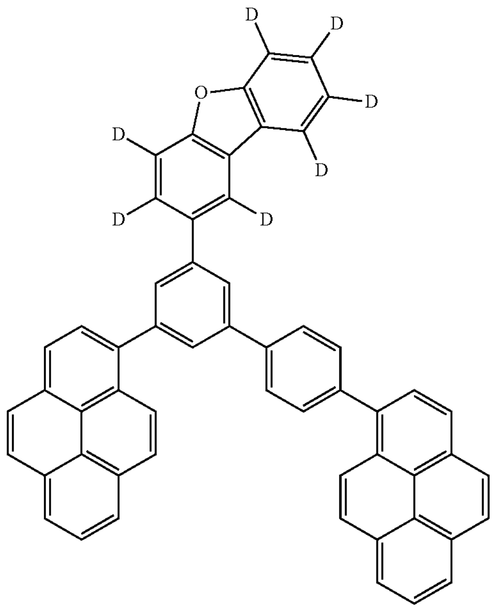
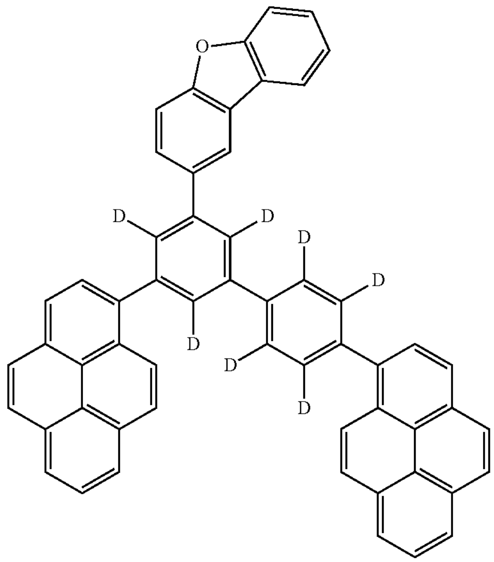
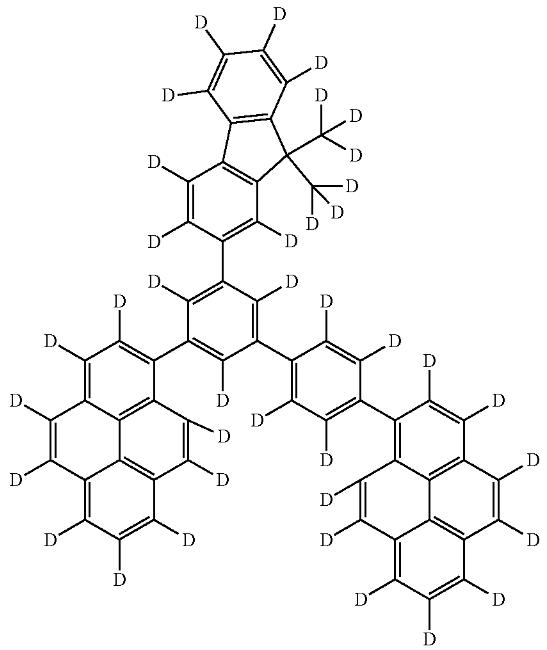

-continued
[Formula 229]
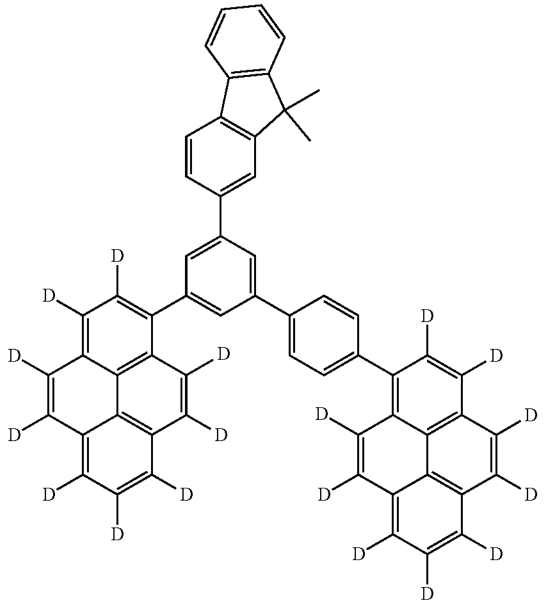
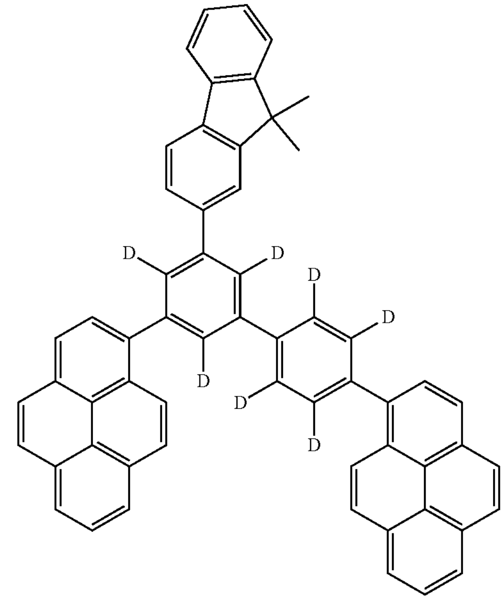
-continued
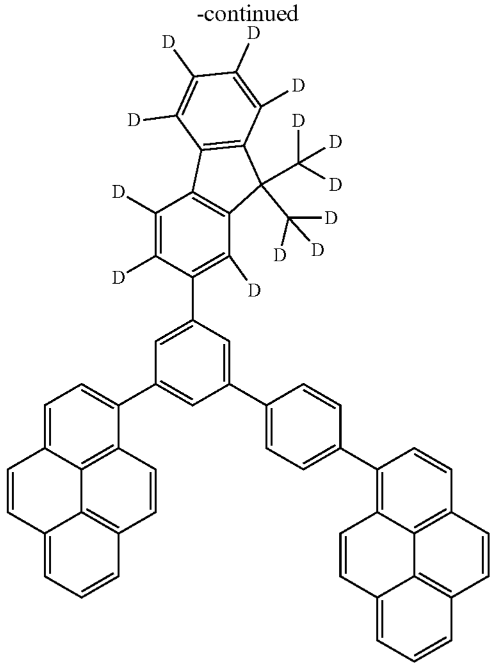
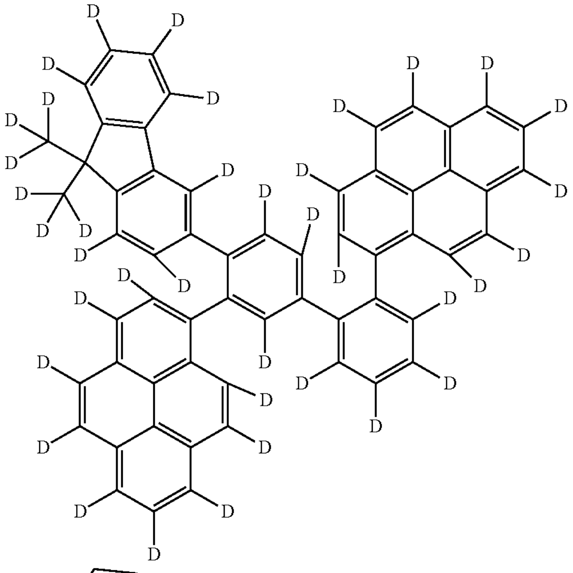
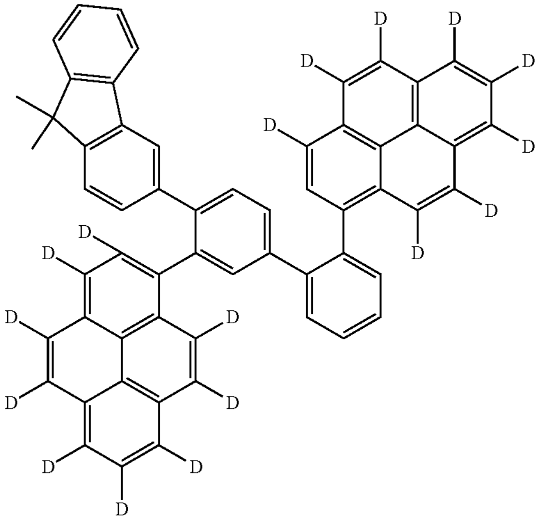

-continued
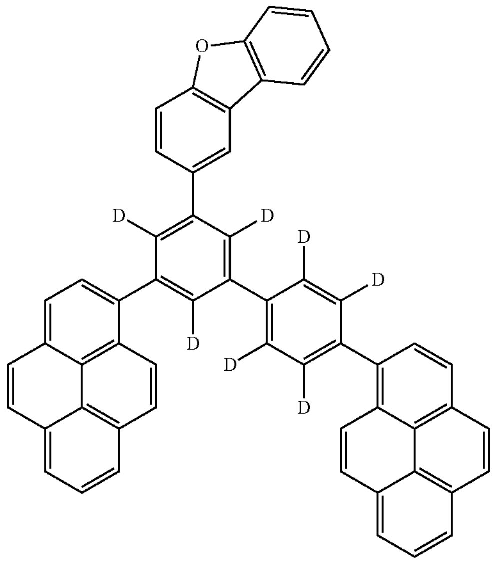
-continued
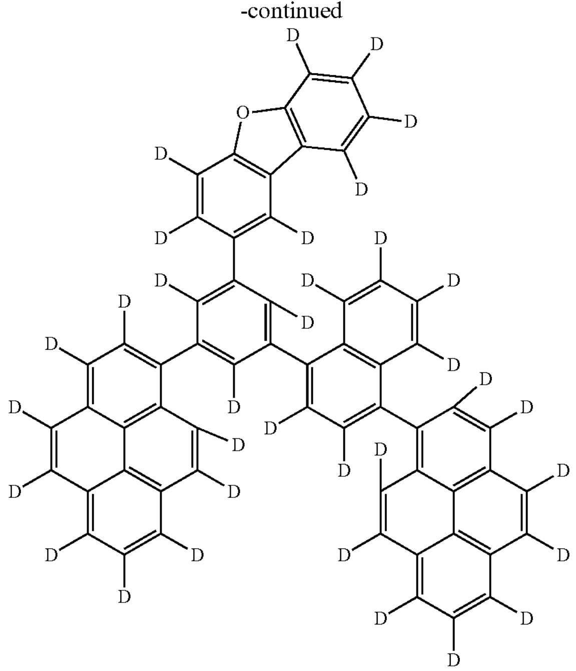
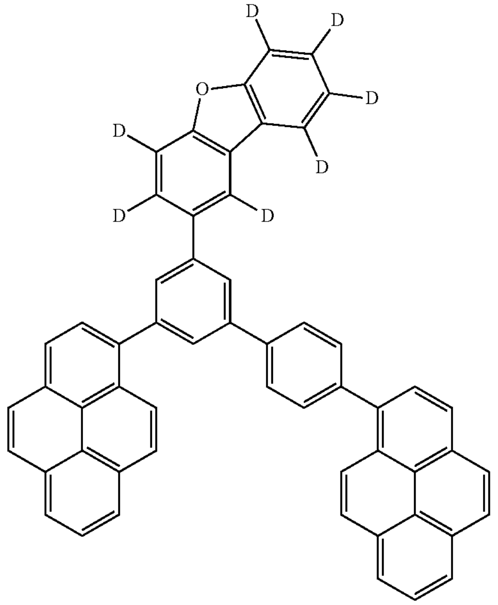
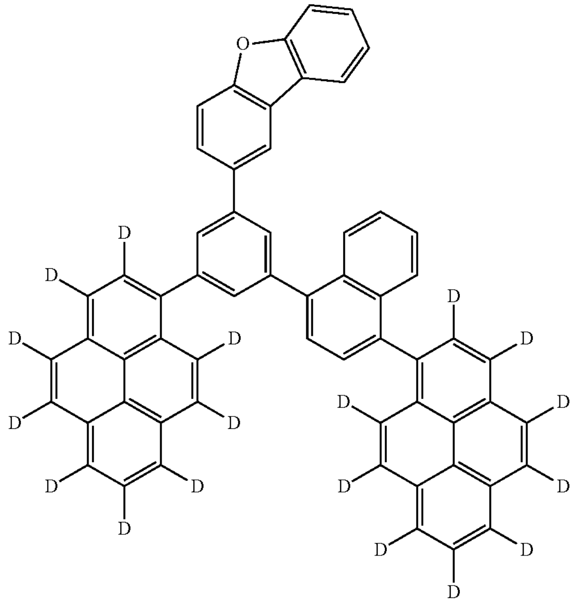

-continued
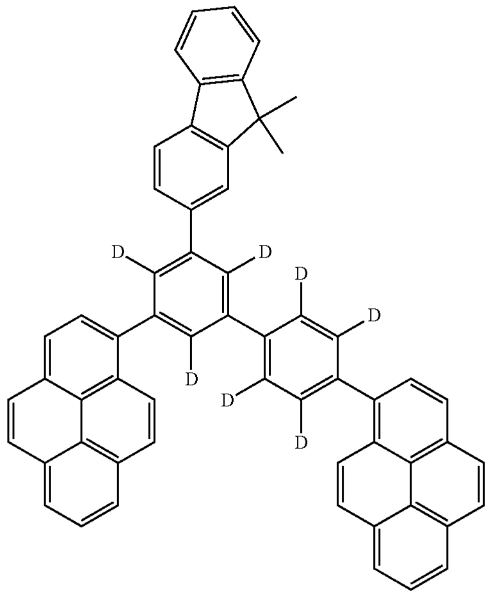
-continued
[Formula 230]
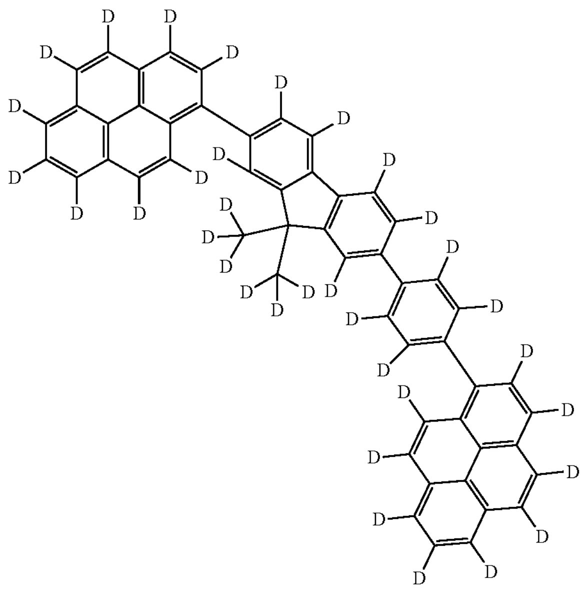
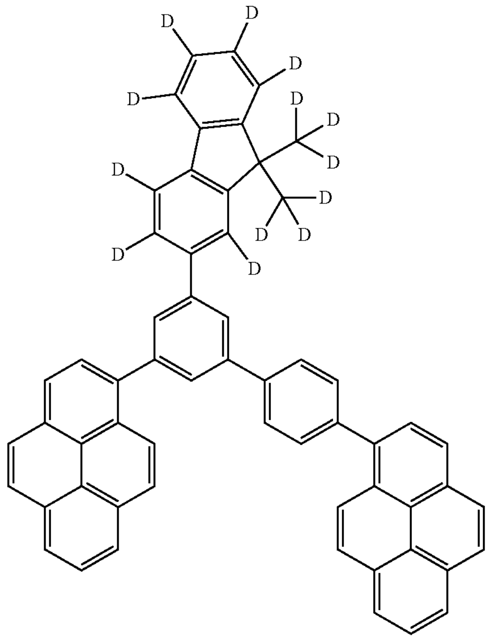
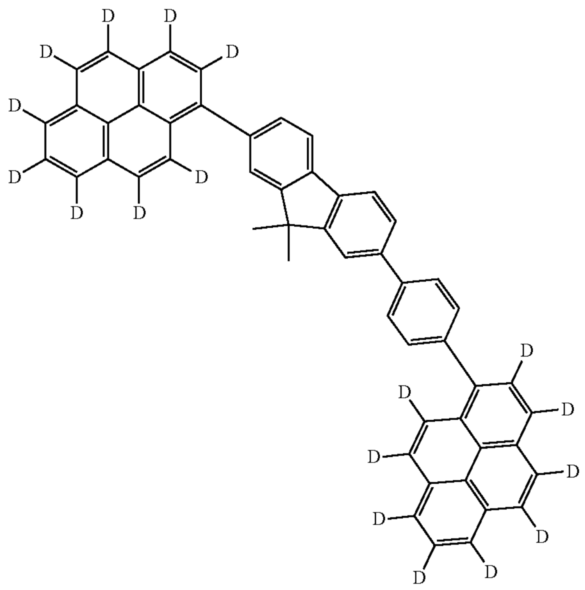

-continued
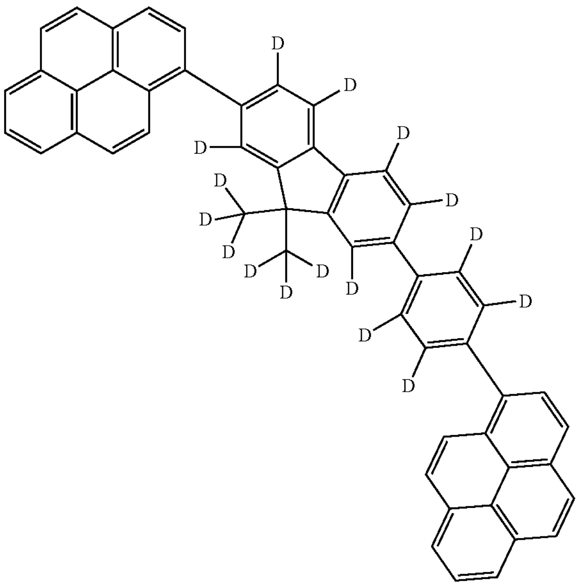
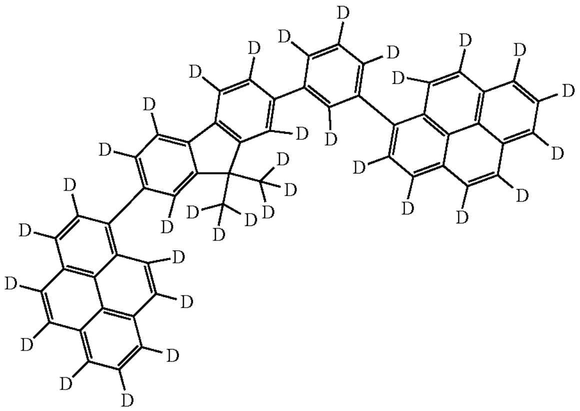
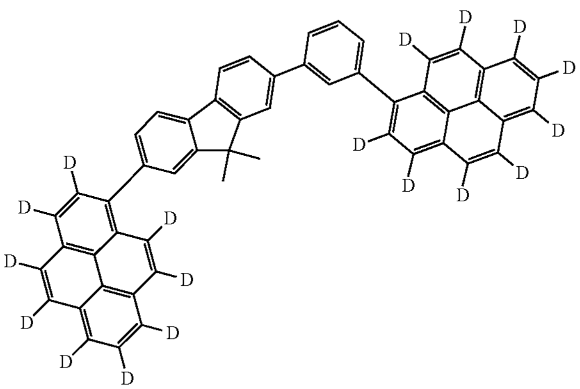
-continued
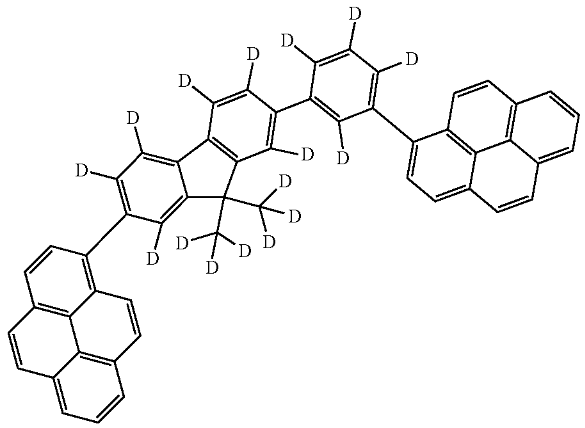
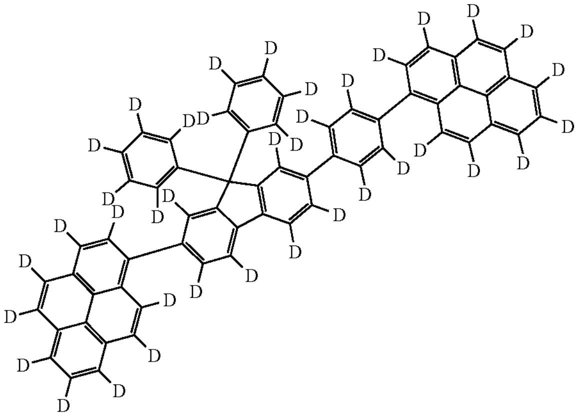
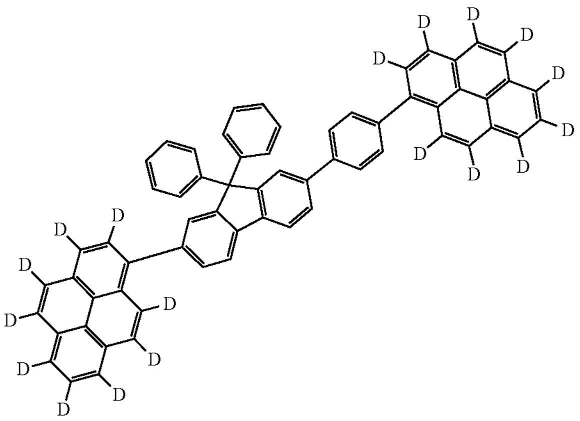
[Formula 231]
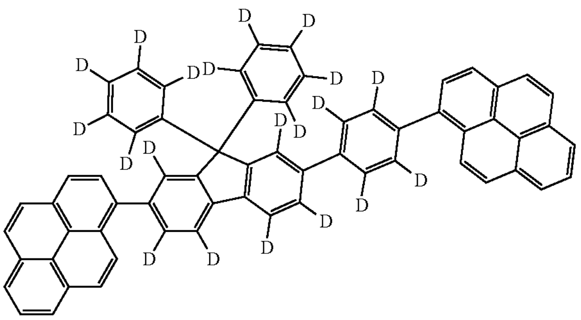

-continued
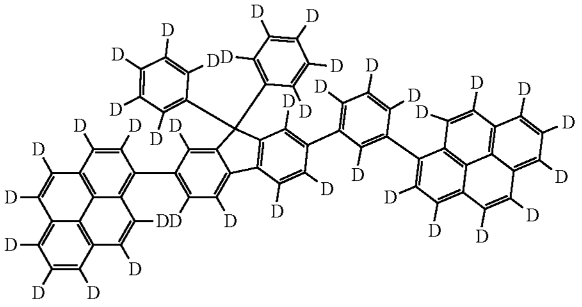
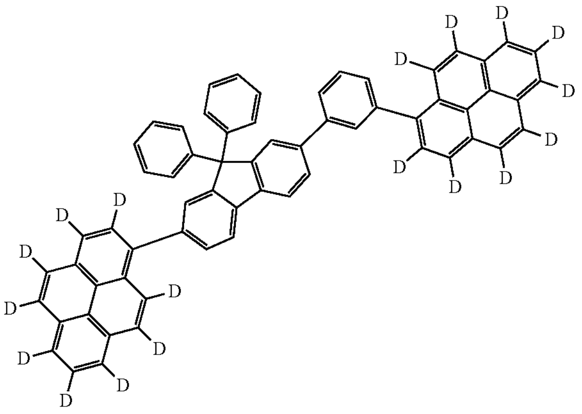
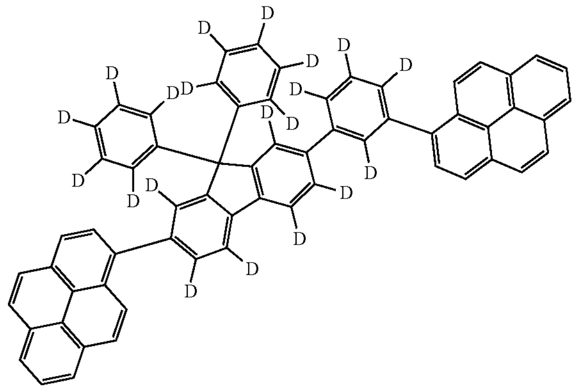
[Formula 232]
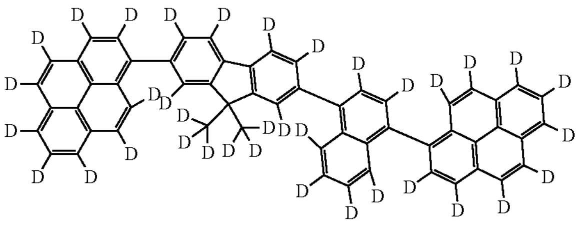
-continued
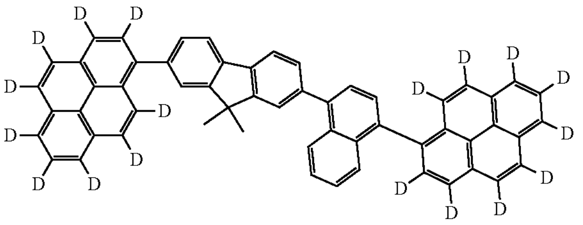
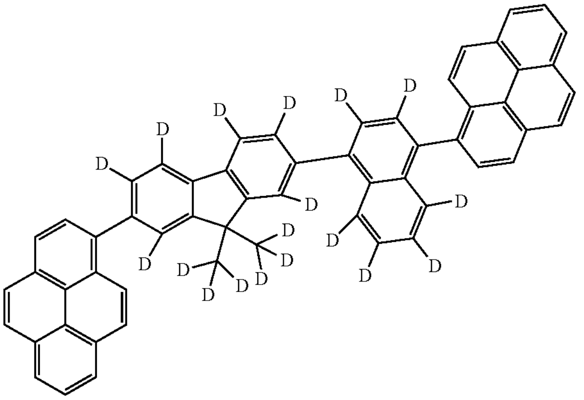
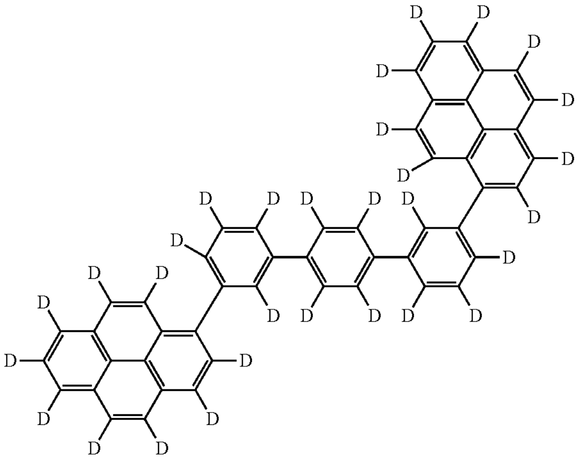

[Formula 233]
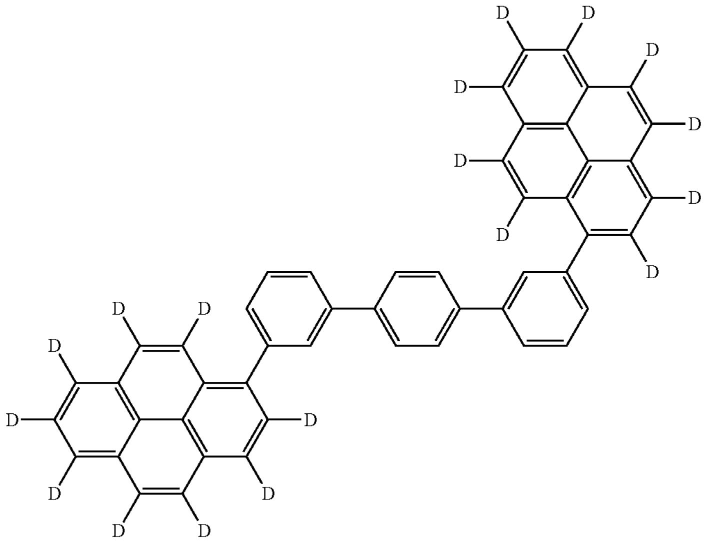
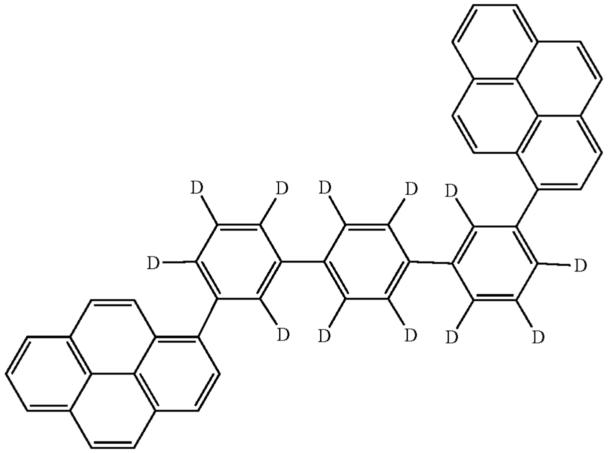
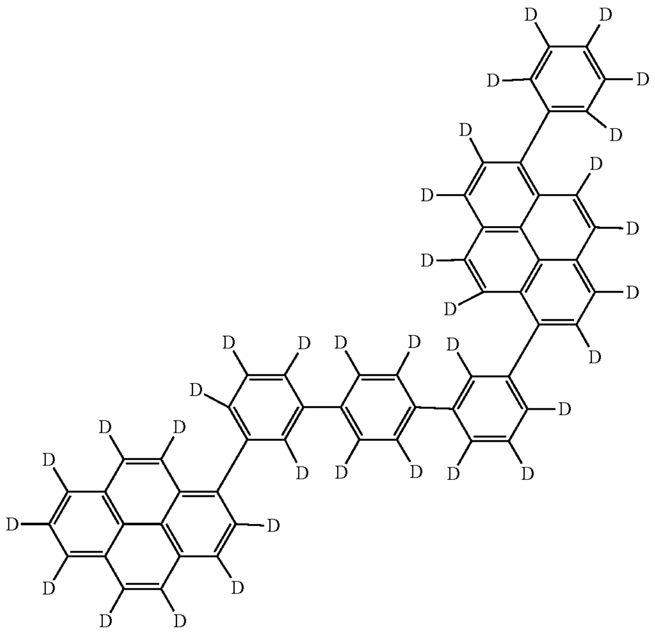

-continued
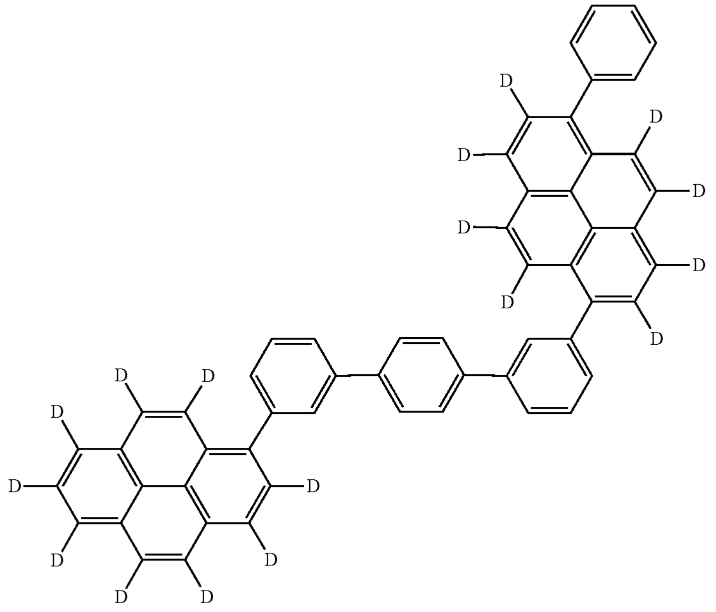
[Formula 234]
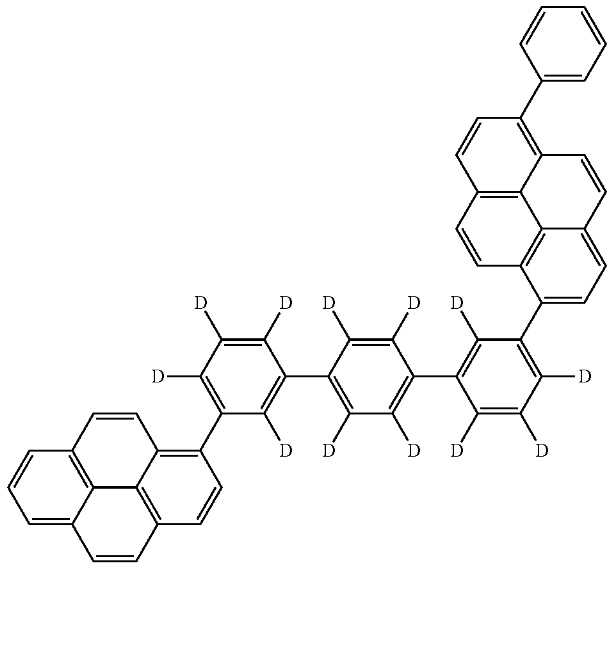

-continued
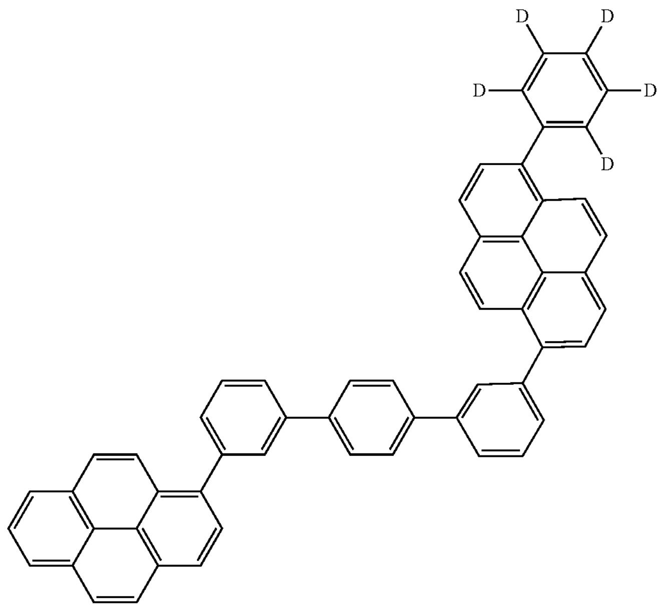
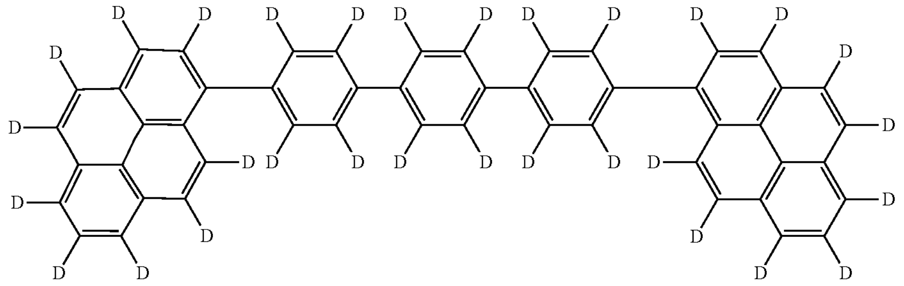
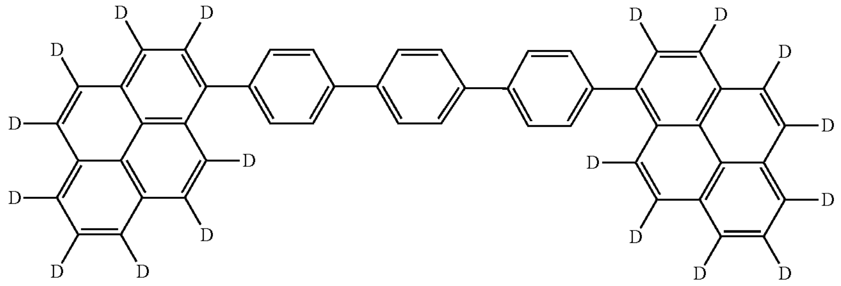
[Formula 235]
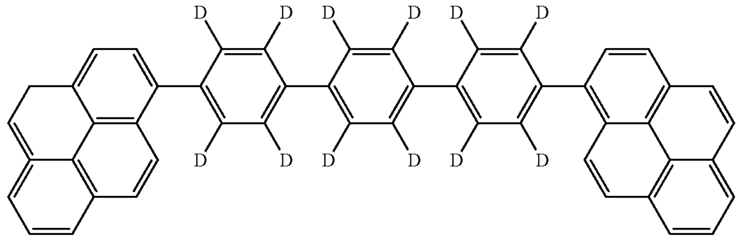

-continued
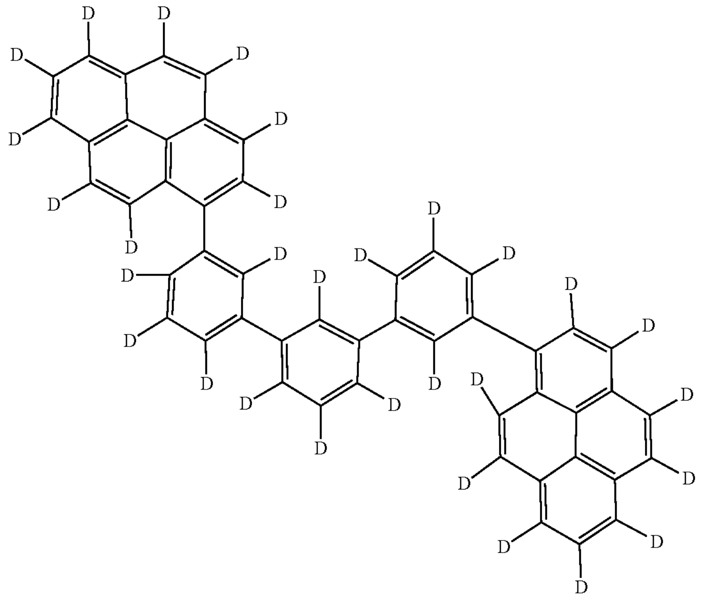
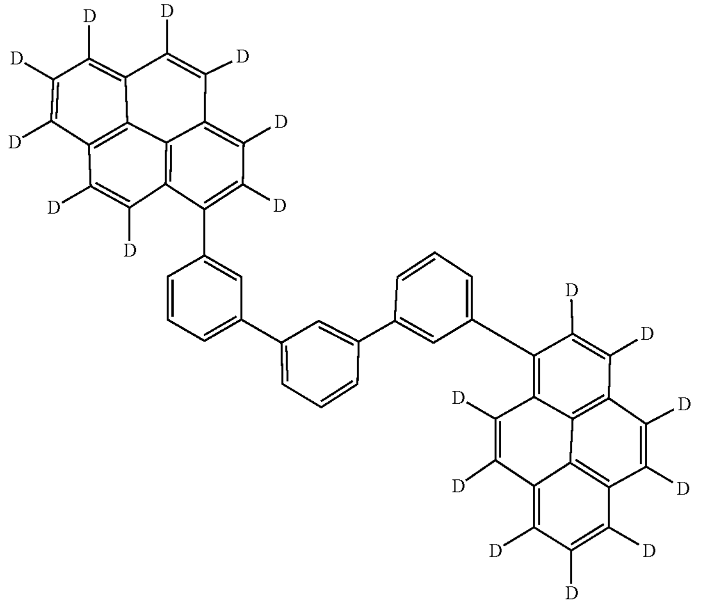
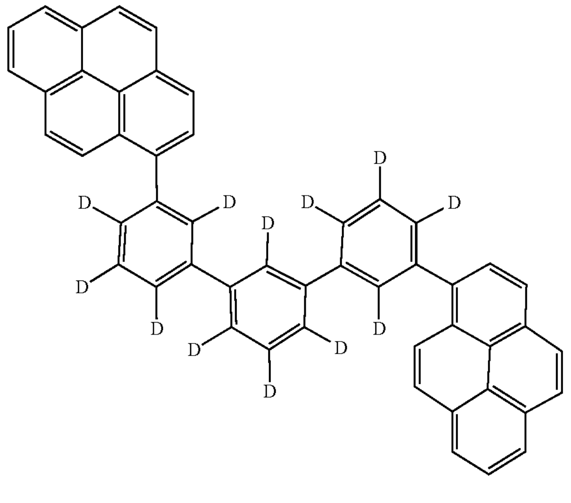

-continued
[Formula 236]
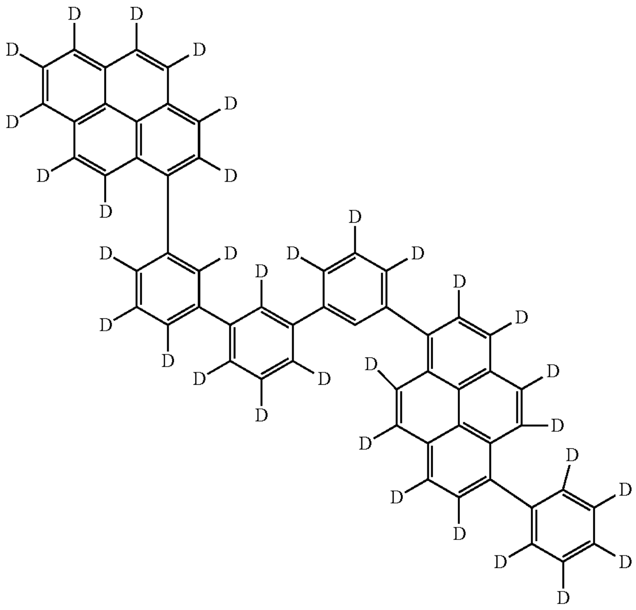
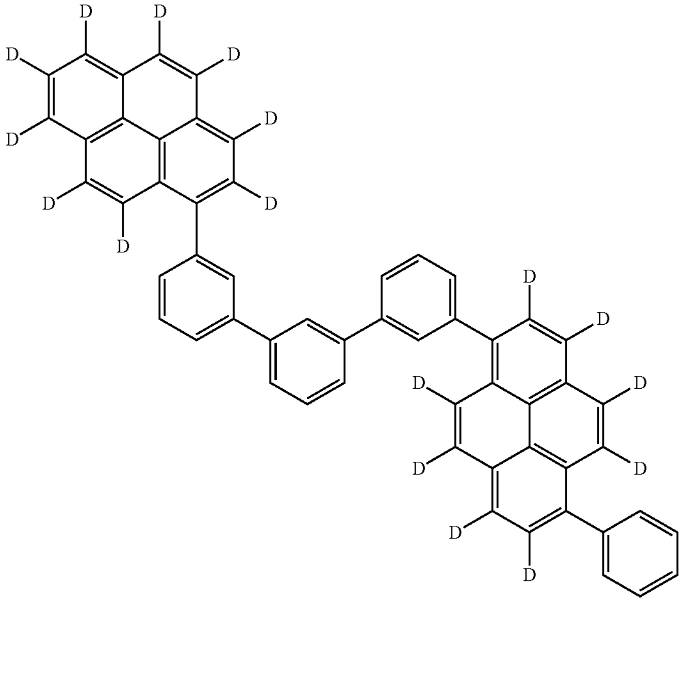

-continued
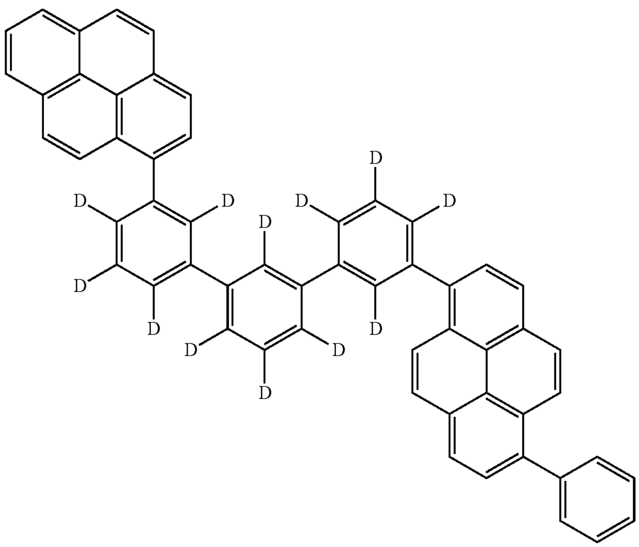
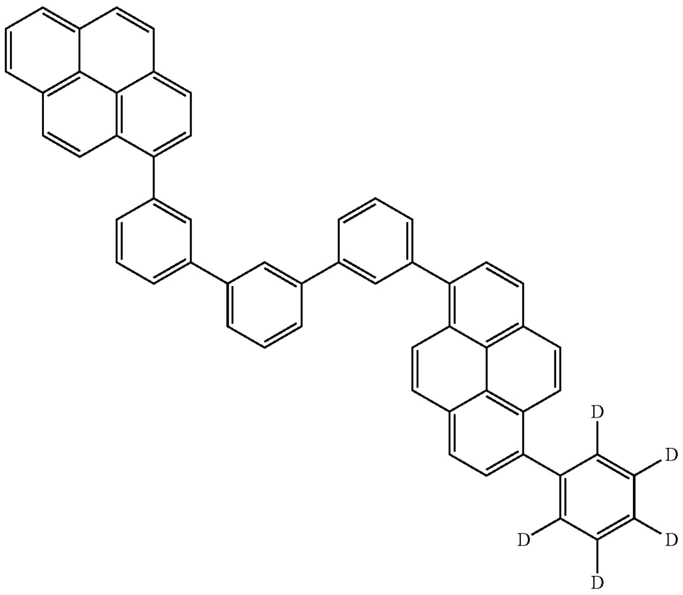

-continued
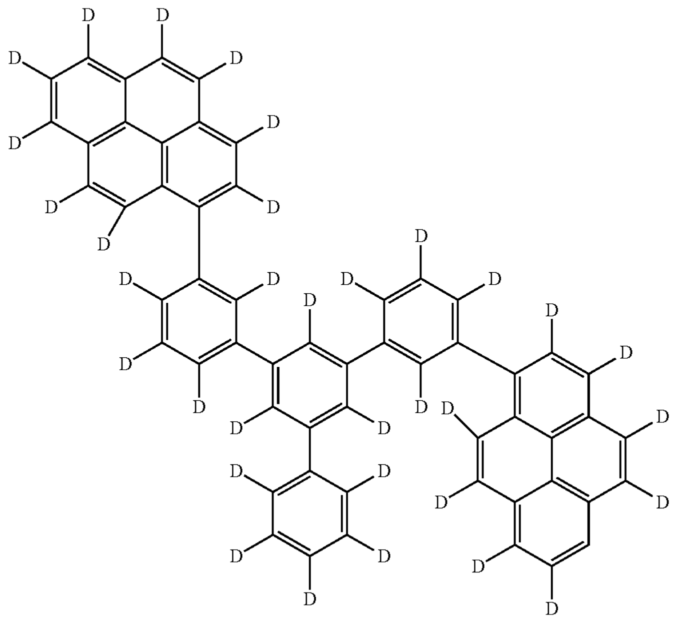
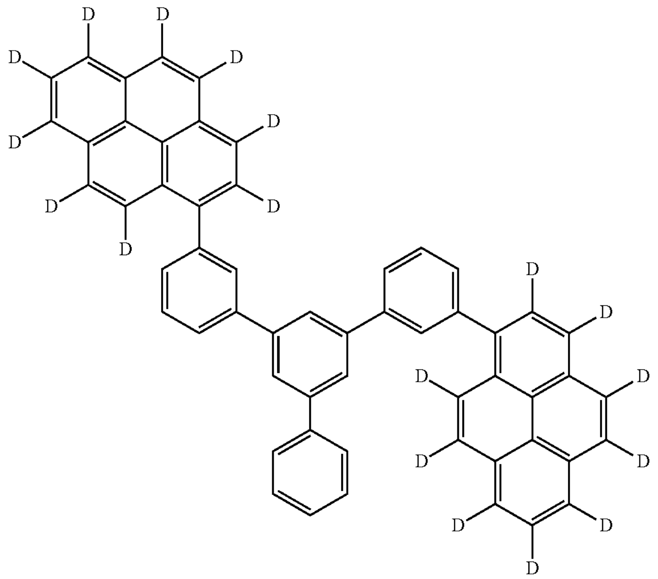
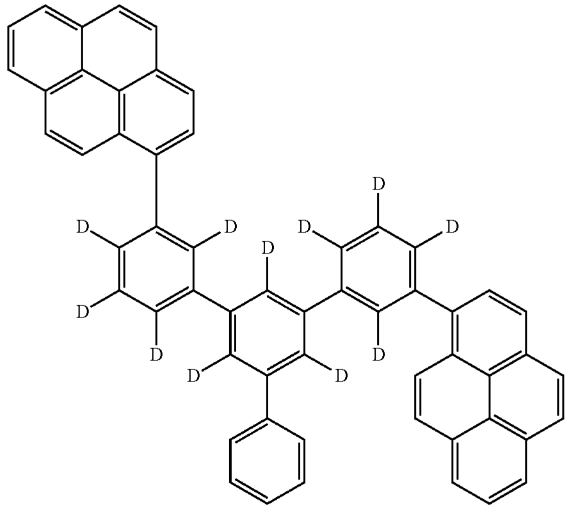
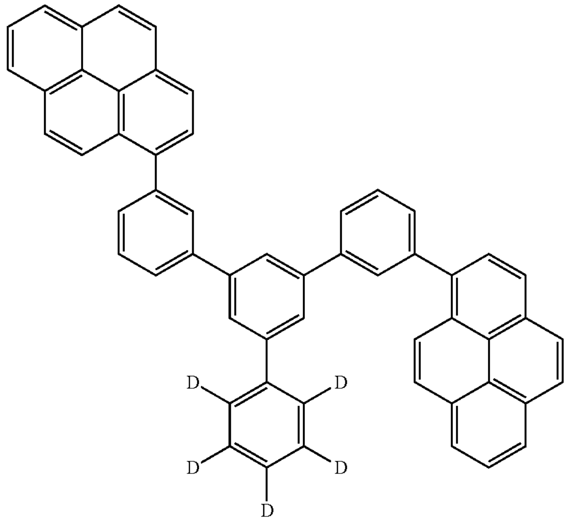

-continued
[Formyla 237]
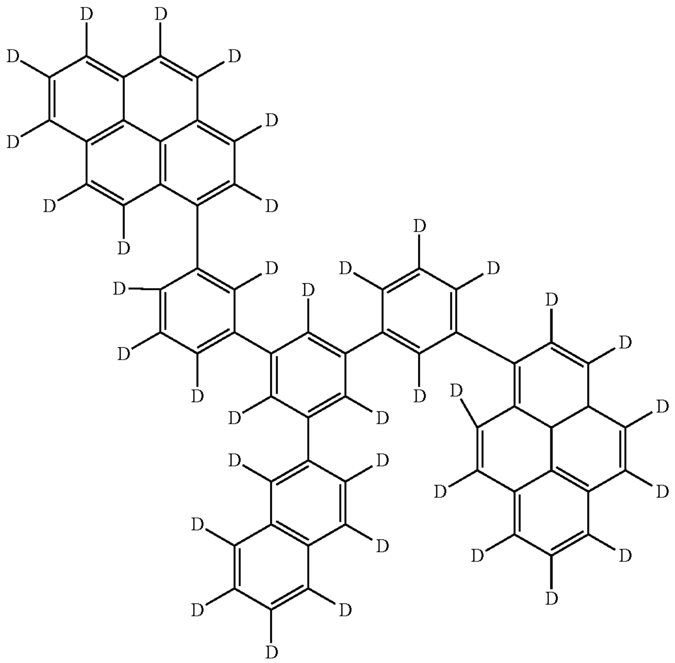
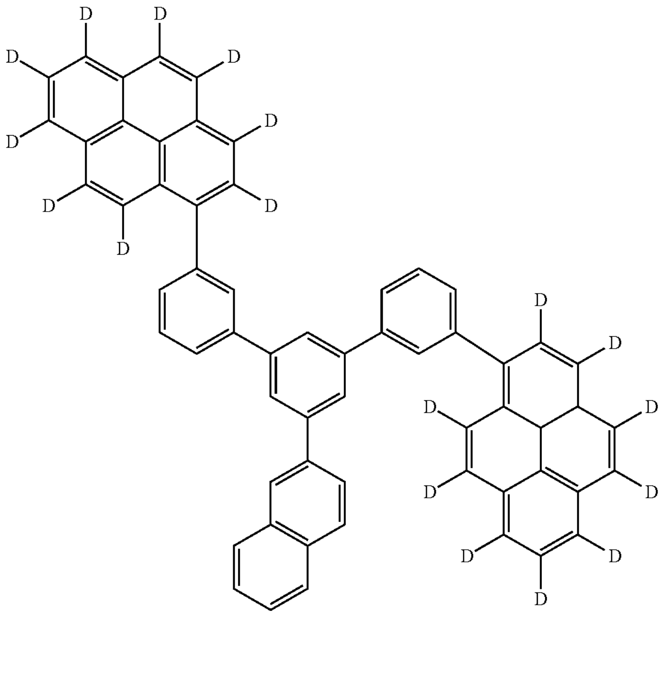

-continued
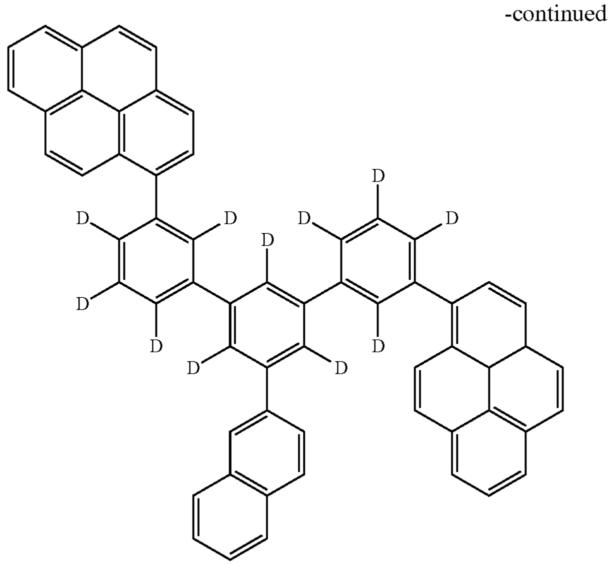
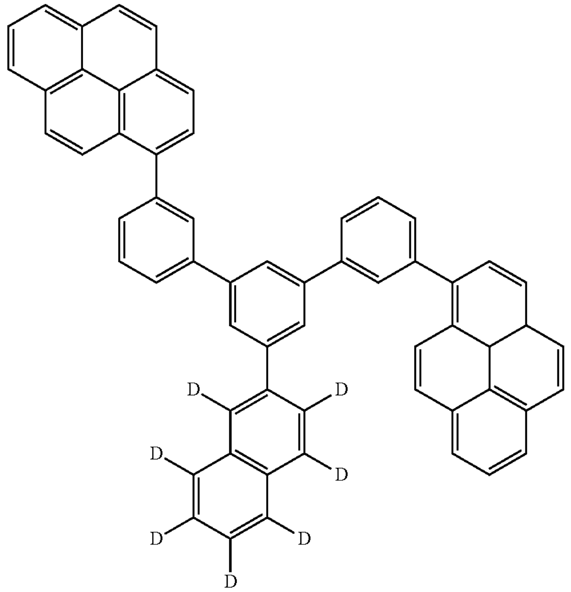
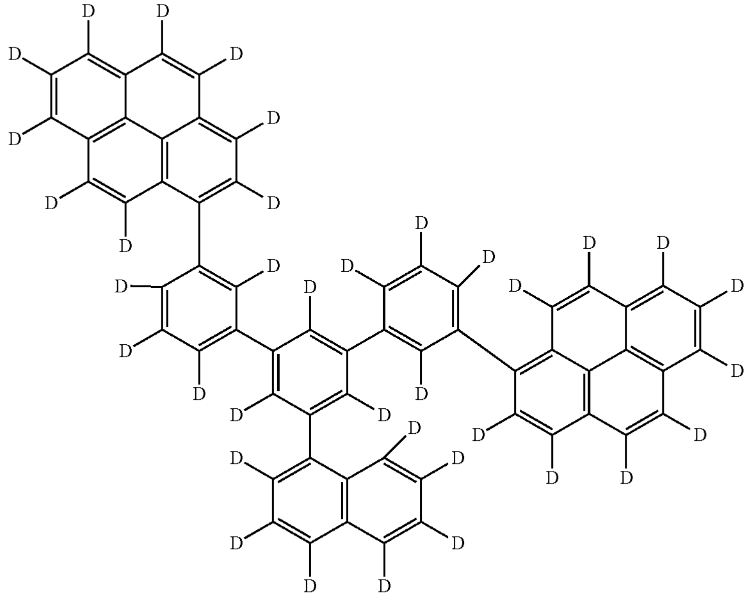

-continued
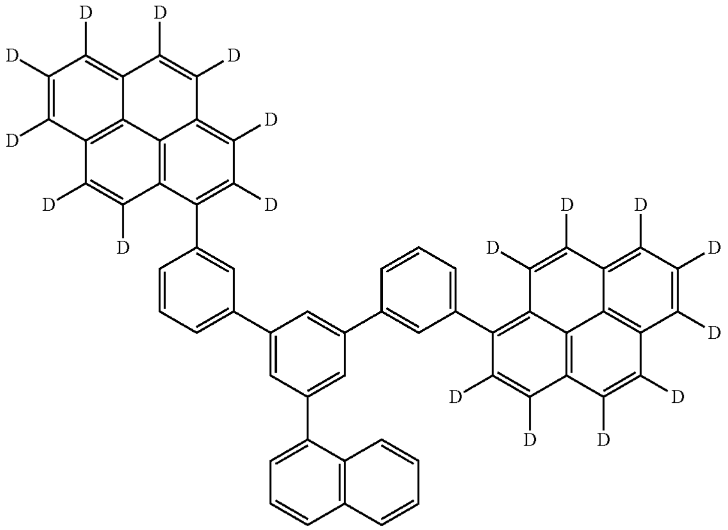
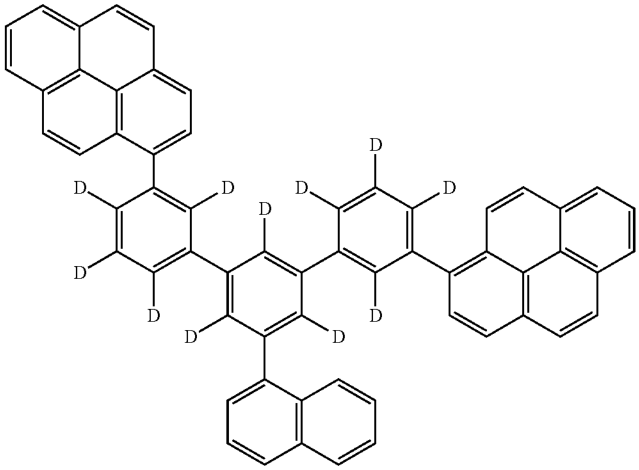
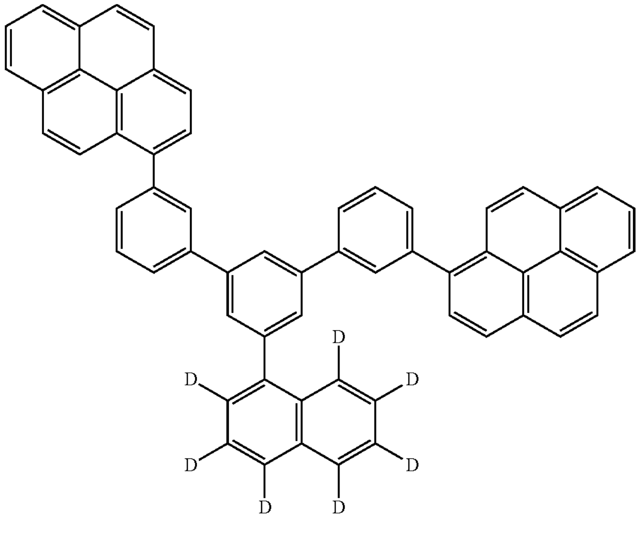

-continued
[Formula 238]
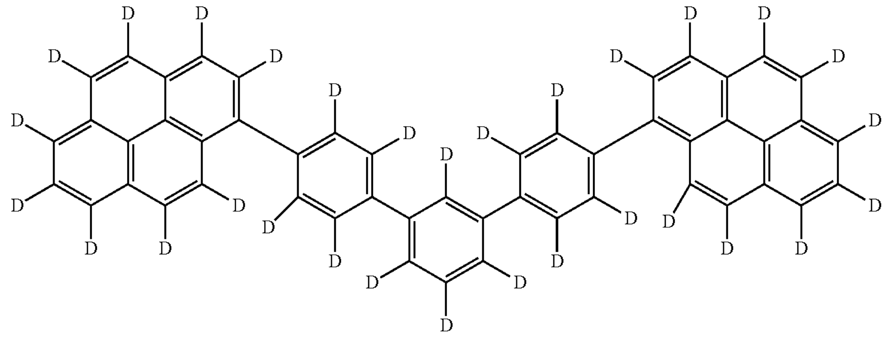
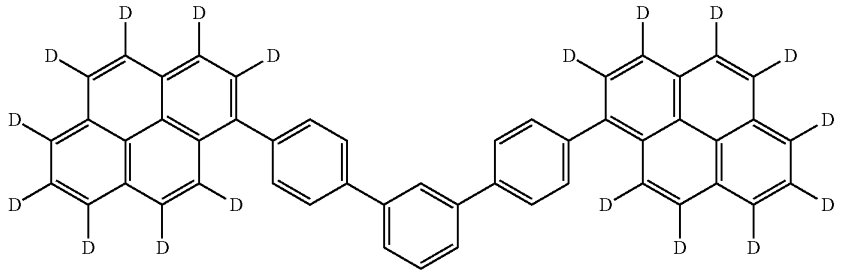
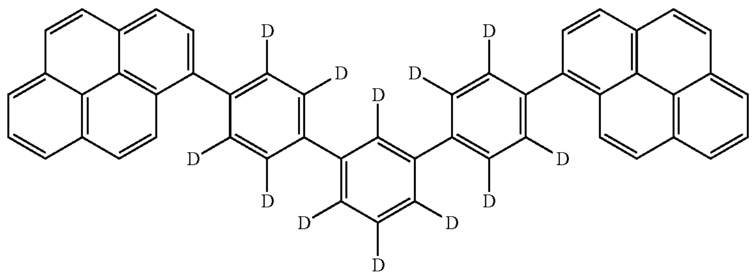
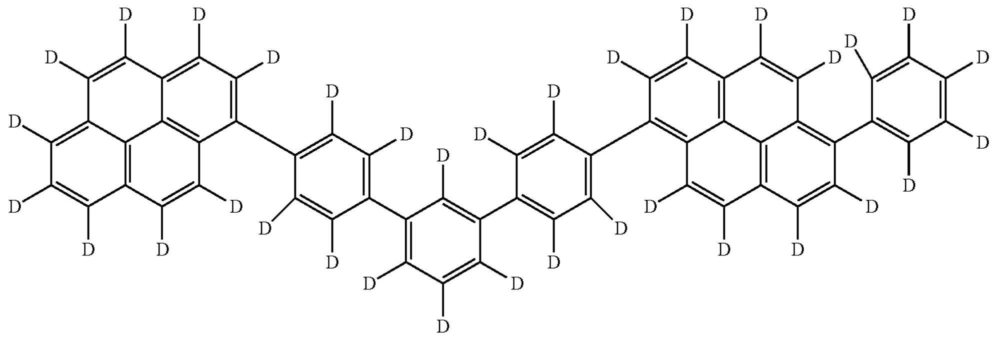
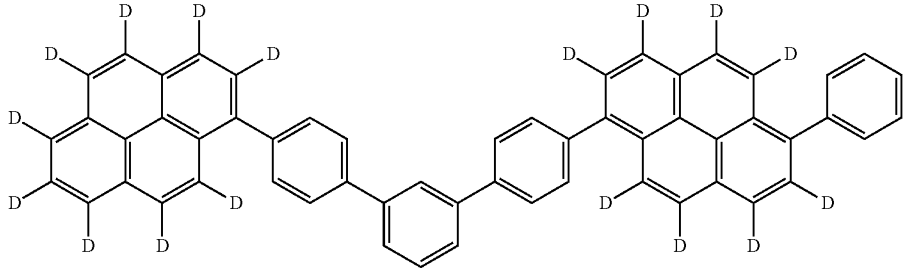

-continued
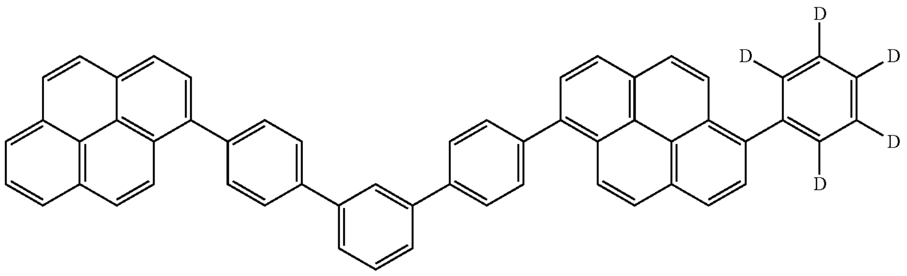
[Formula 239]
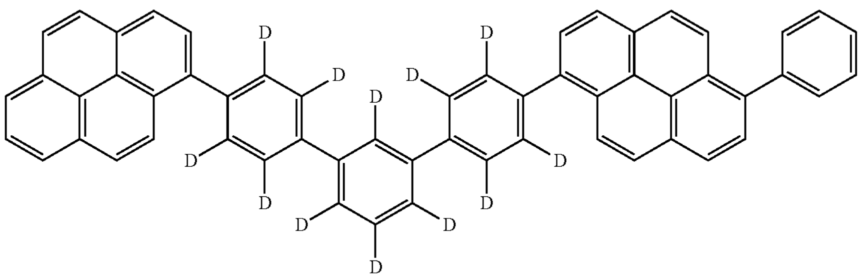
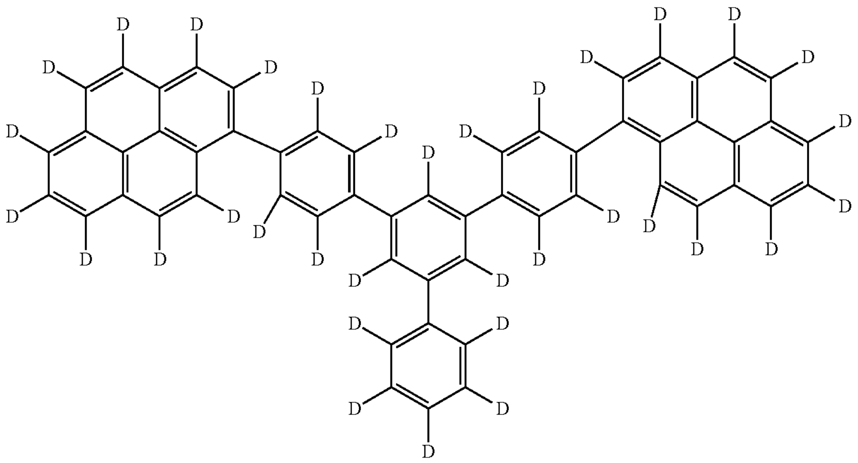
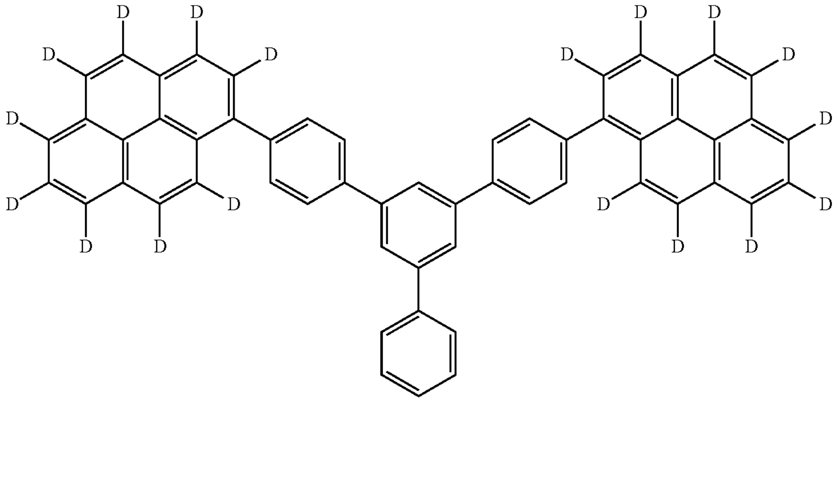

-continued
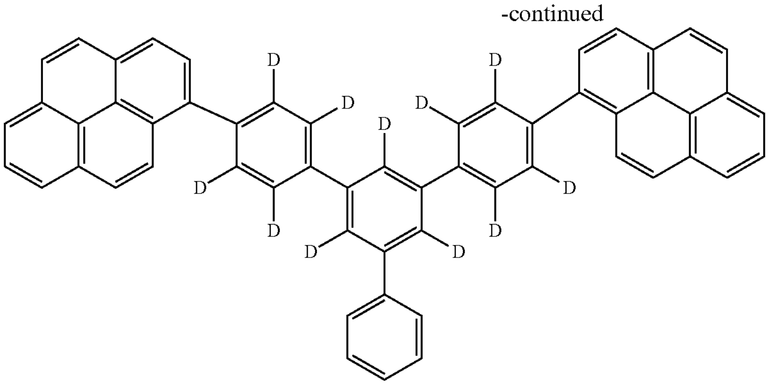
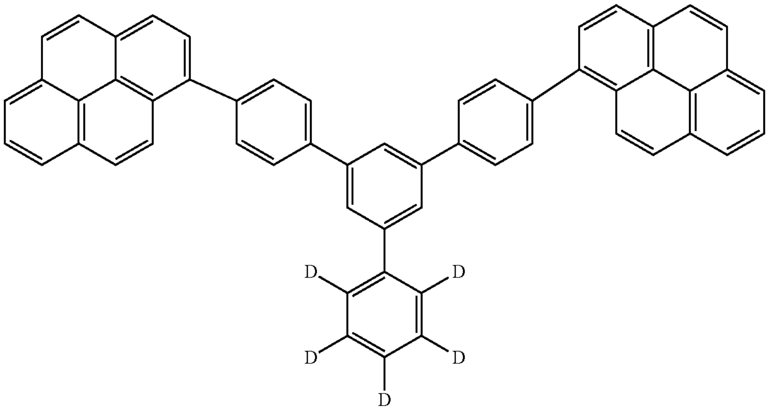
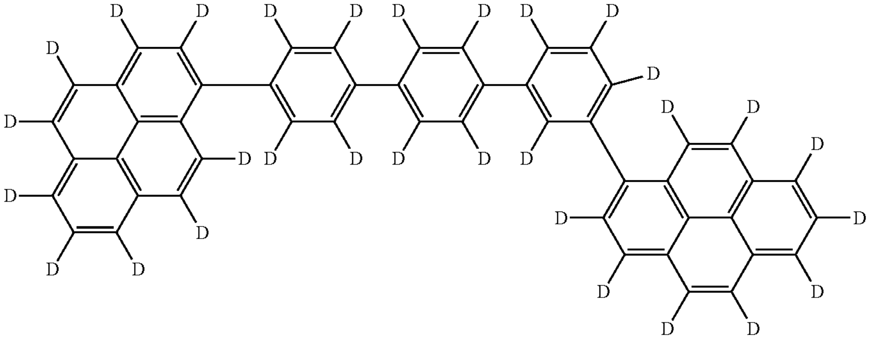
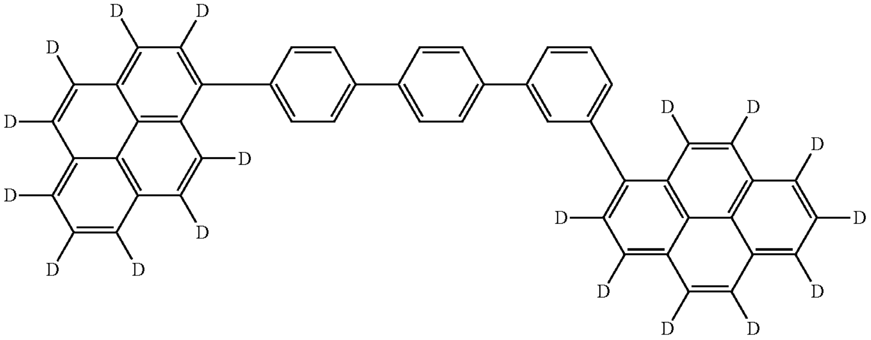
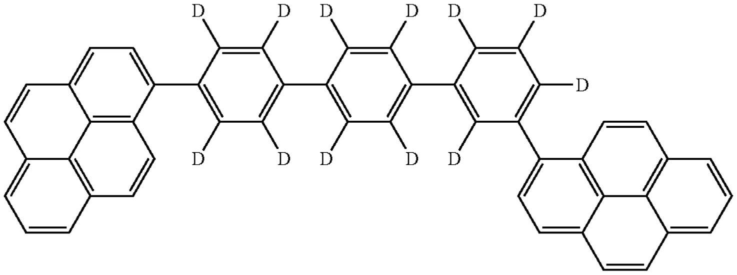

-continued
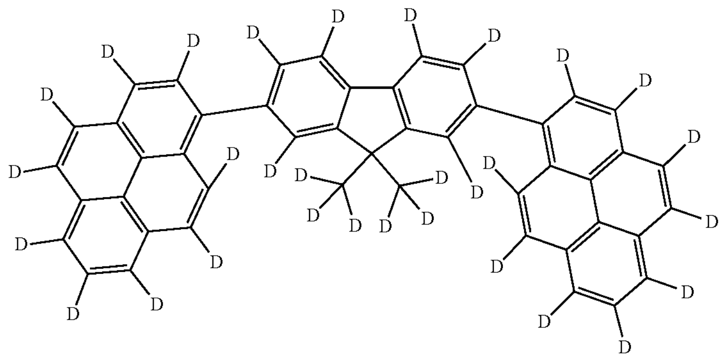
[Formula 240]
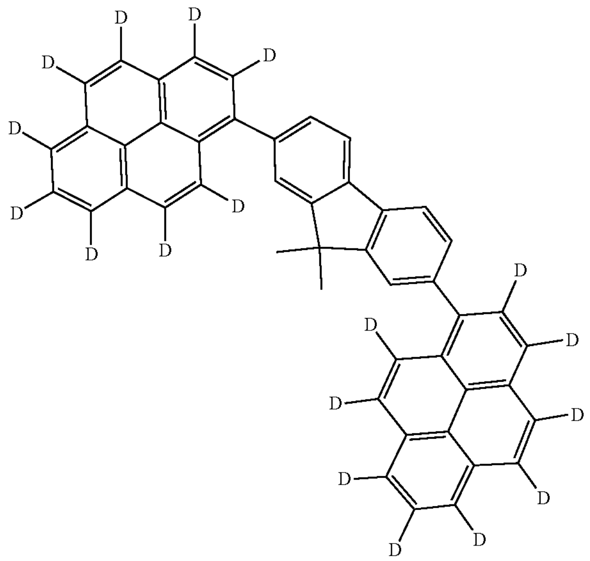
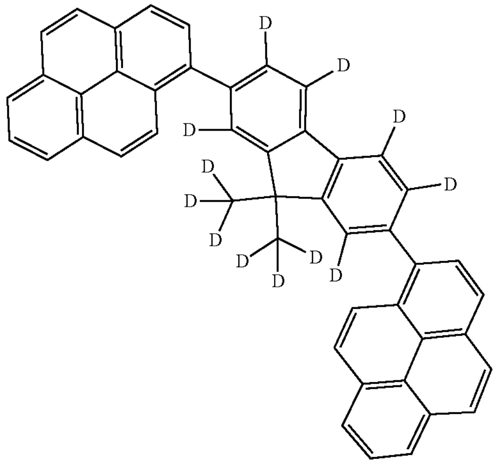
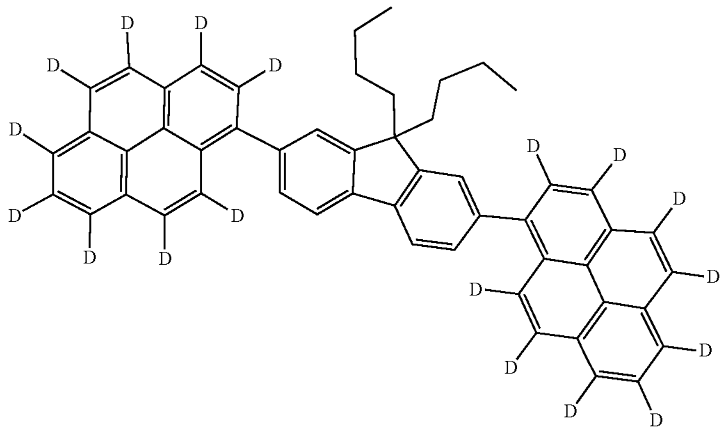

-continued
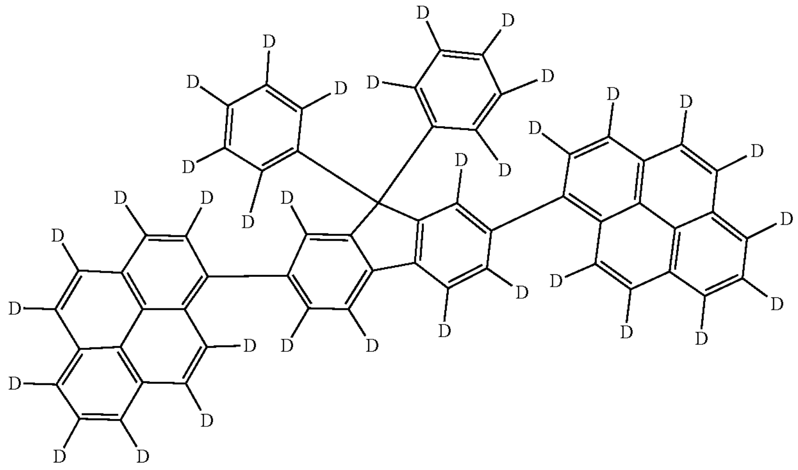
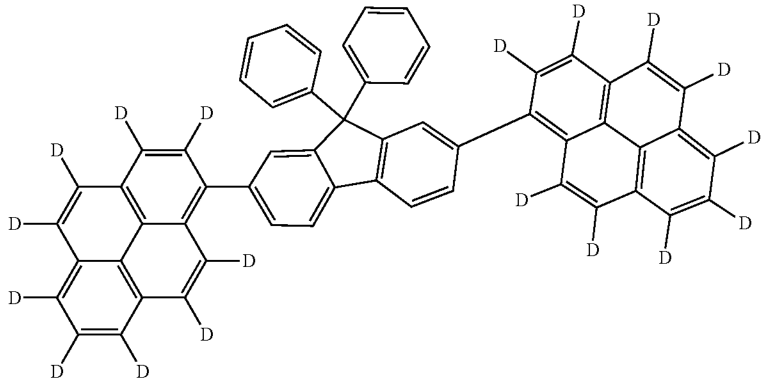
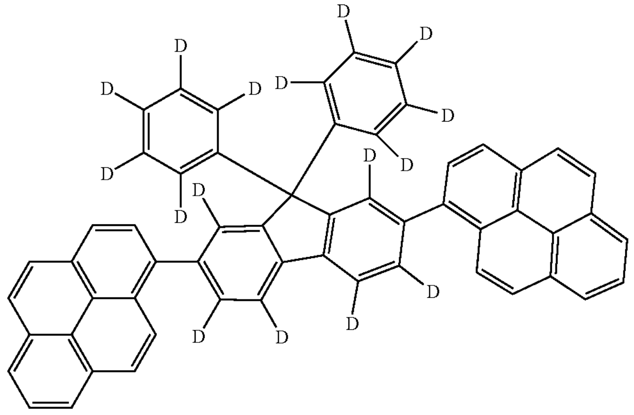

-continued
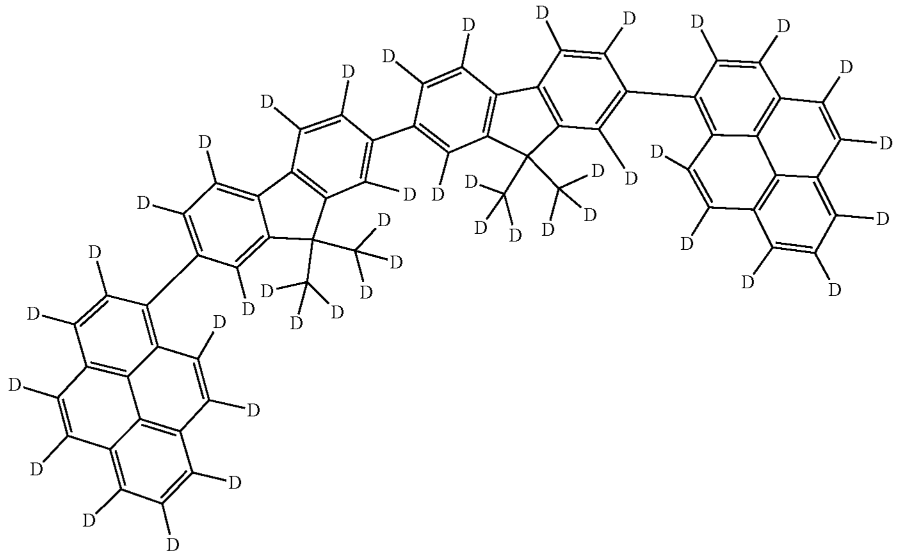
[Formula 241]
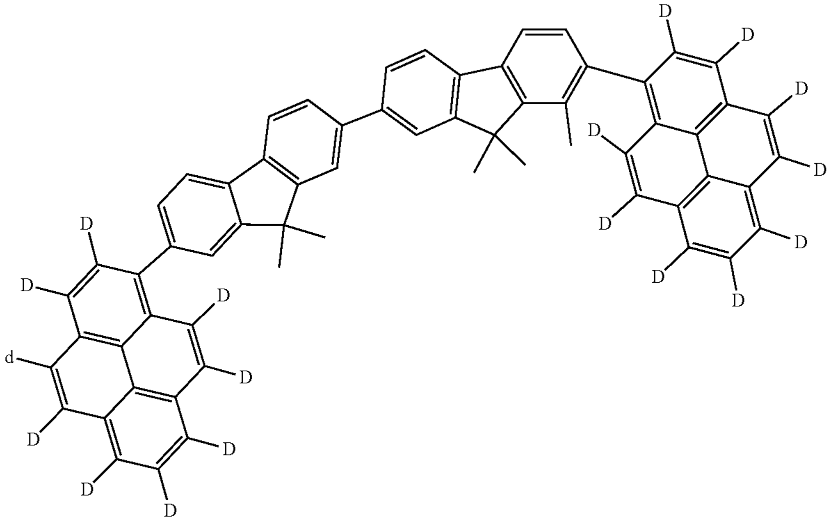
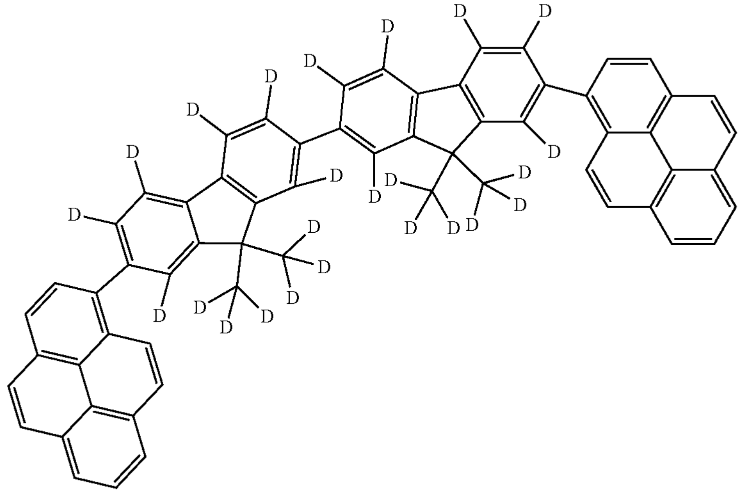

-continued
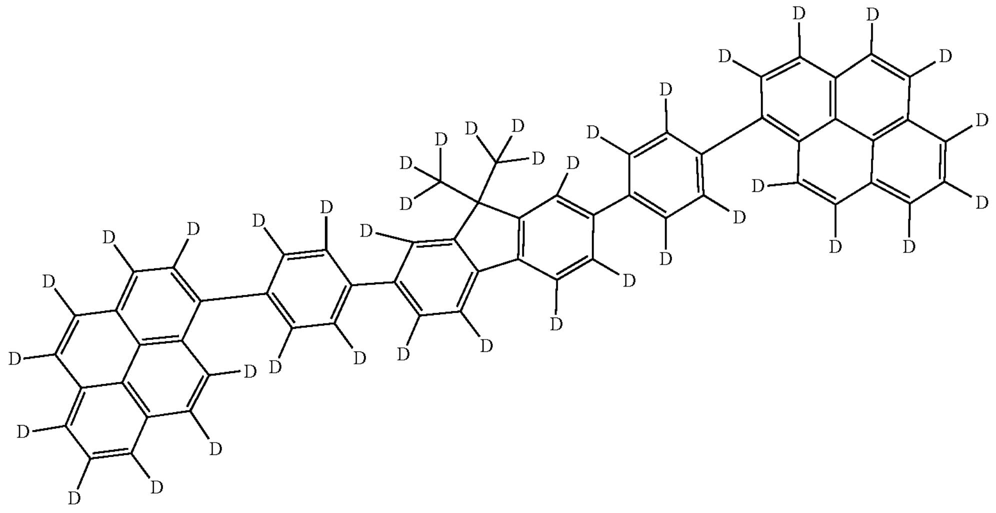
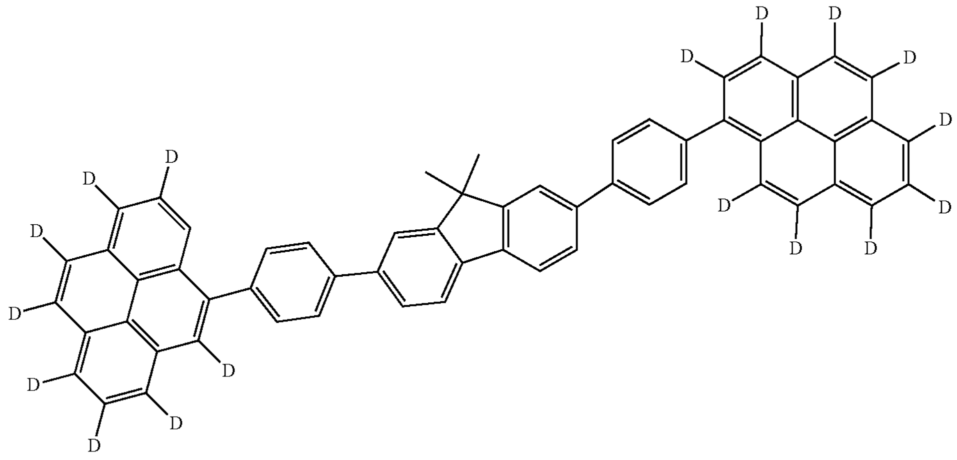
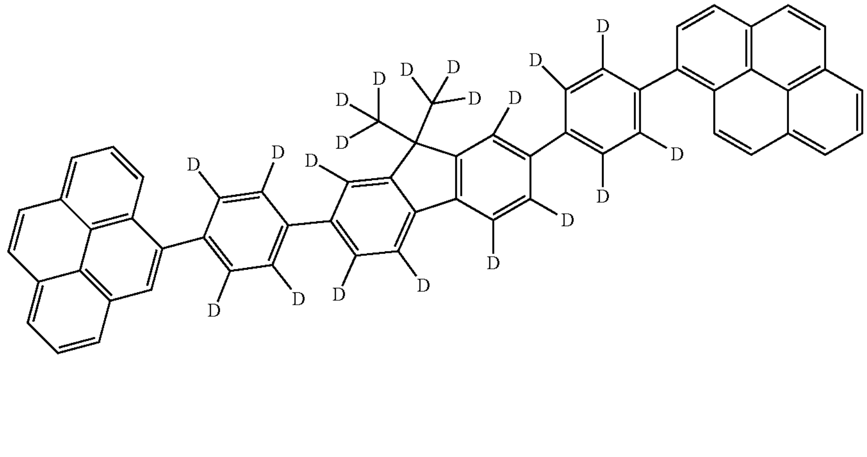

-continued
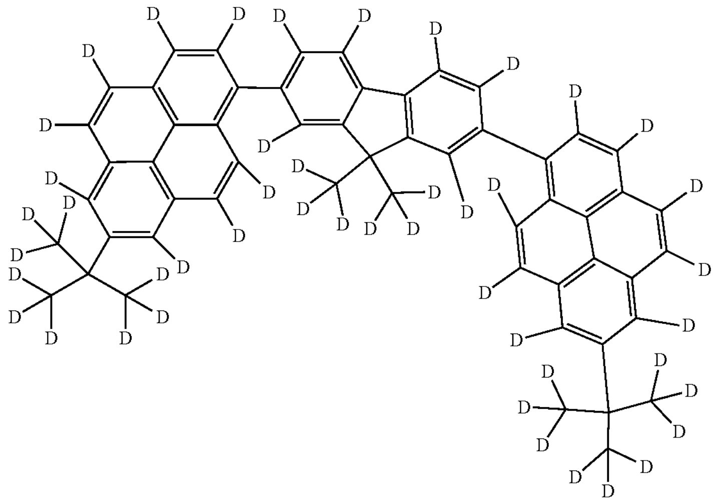
[Formula 242]
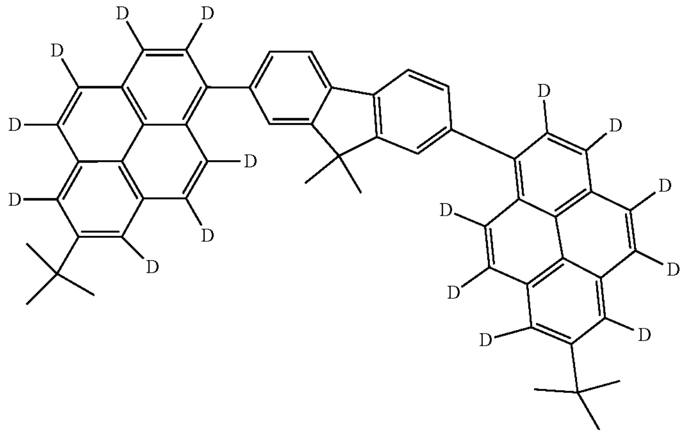
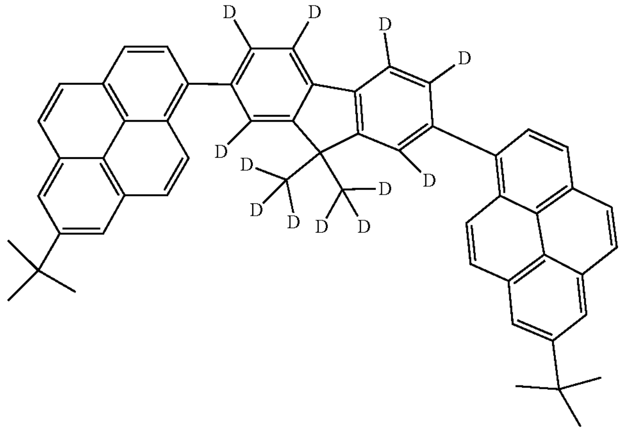

-continued
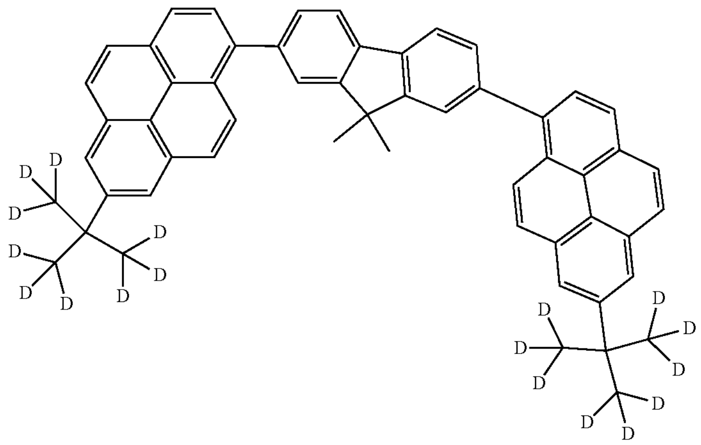
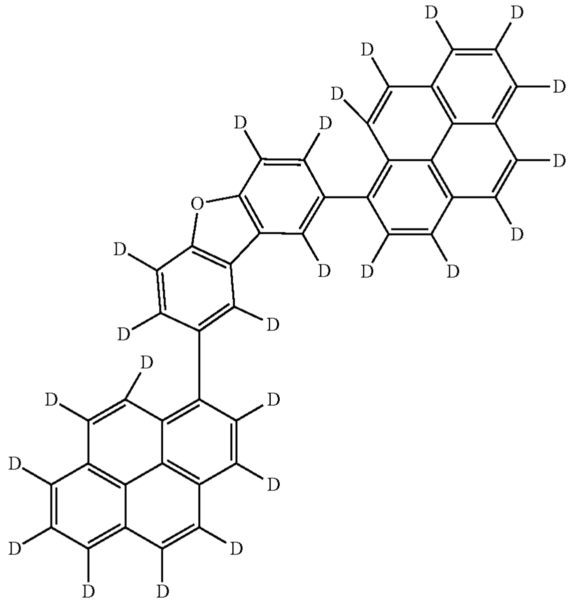
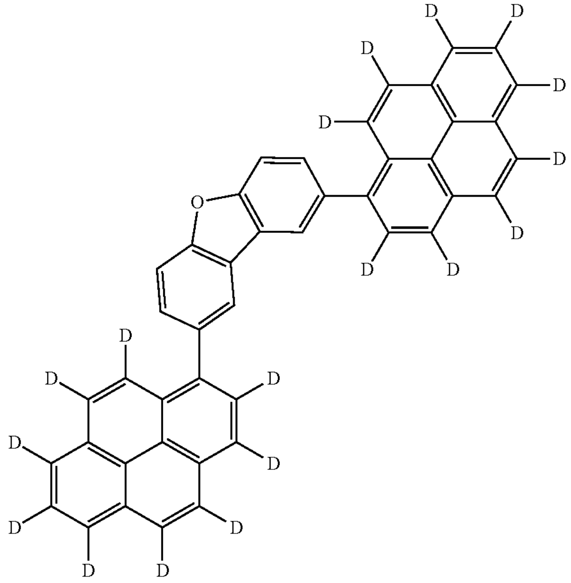

-continued
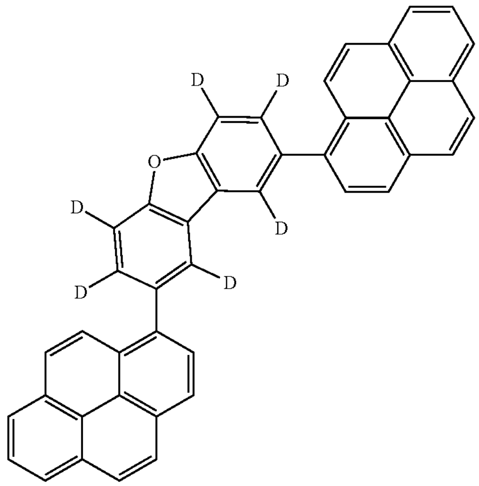
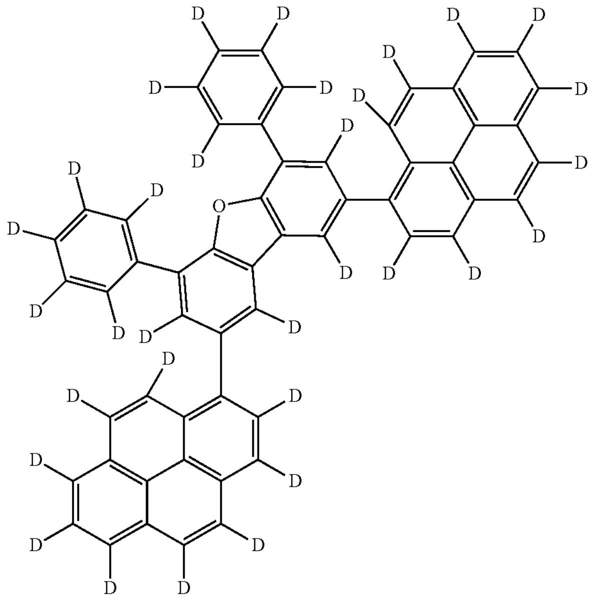
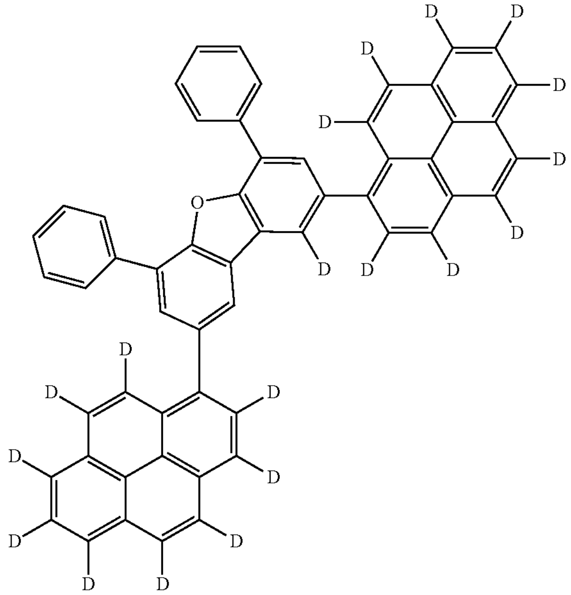

-continued
[Formula 243]
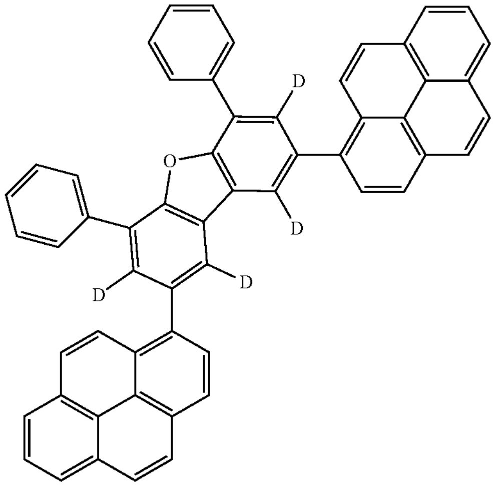
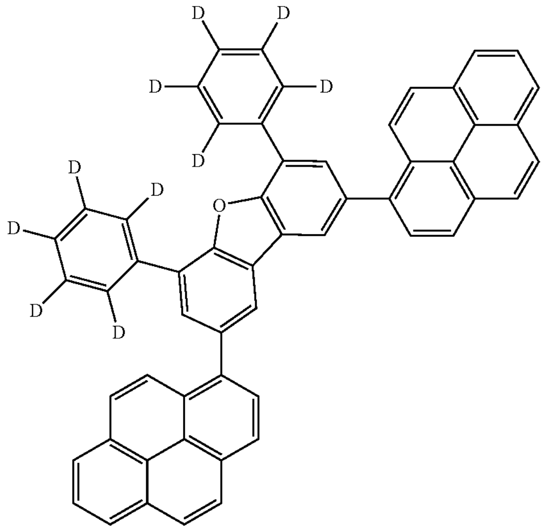
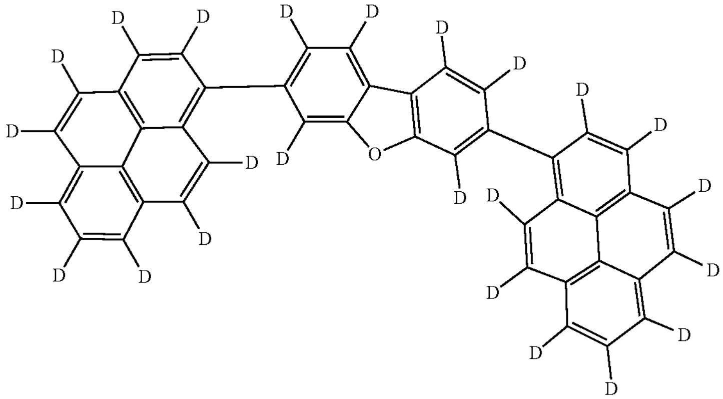
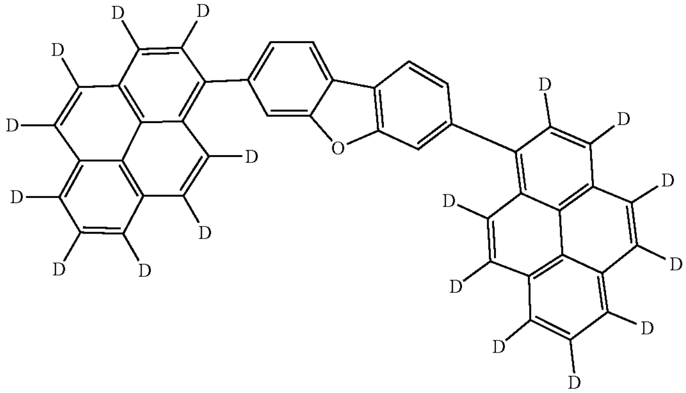
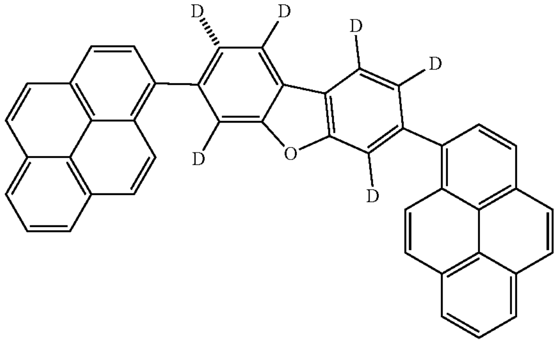

-continued
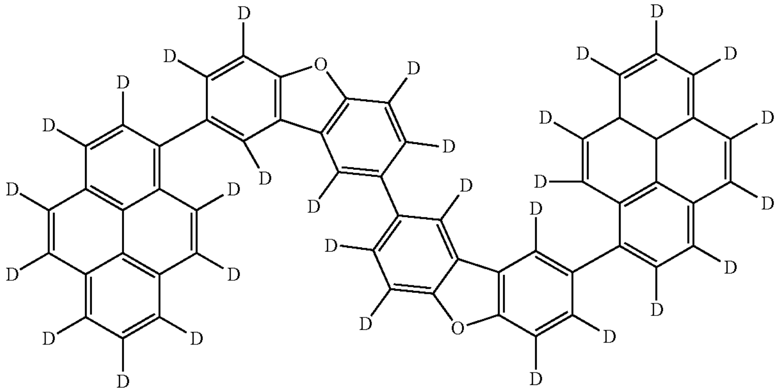
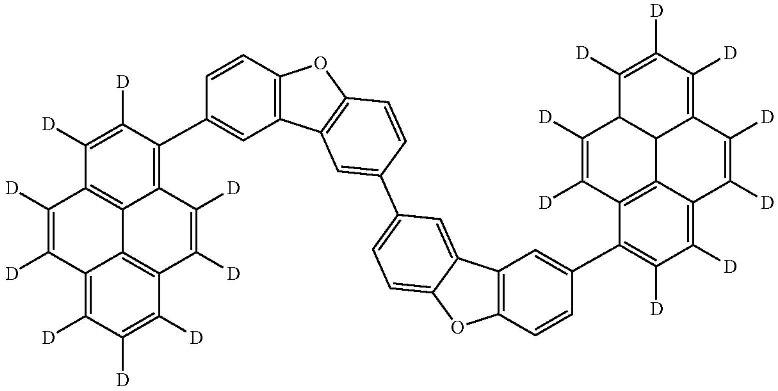
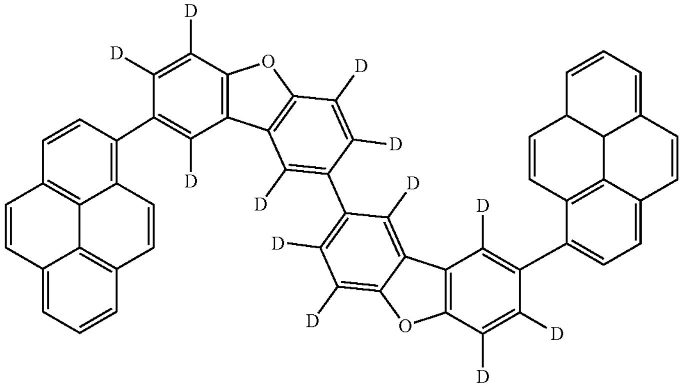
[Formula 244]
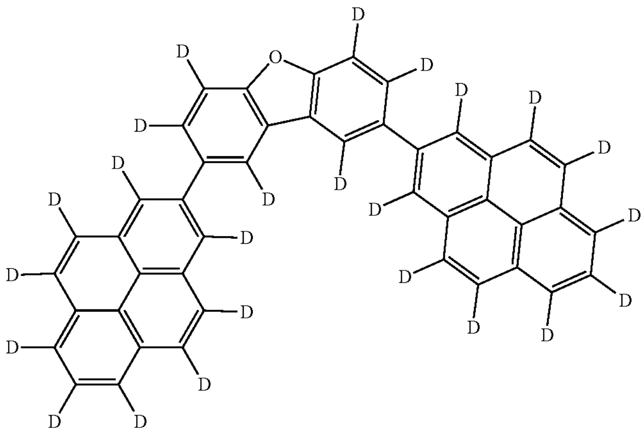

-continued
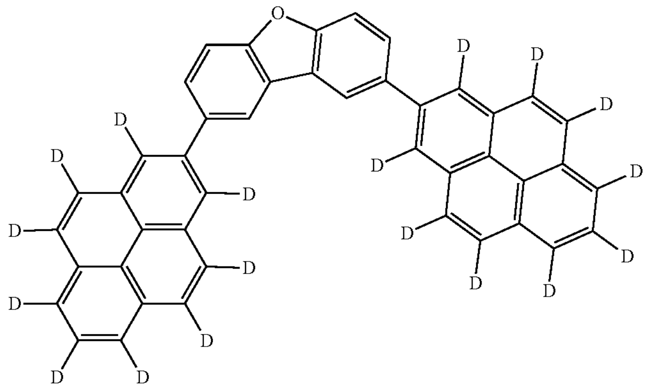
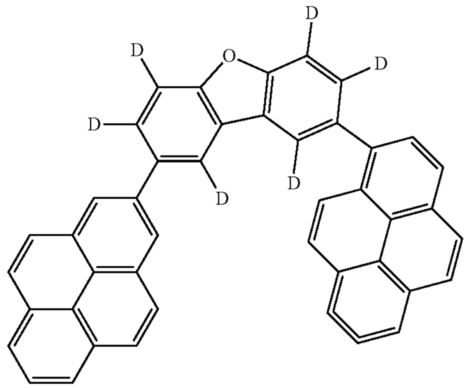
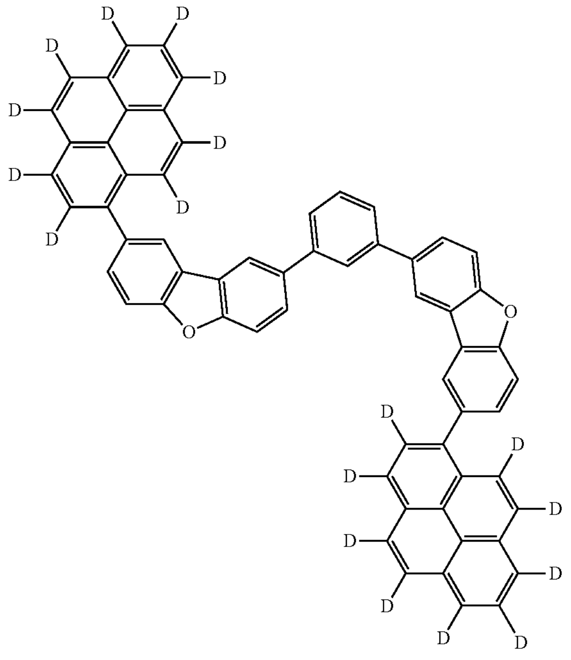

-continued
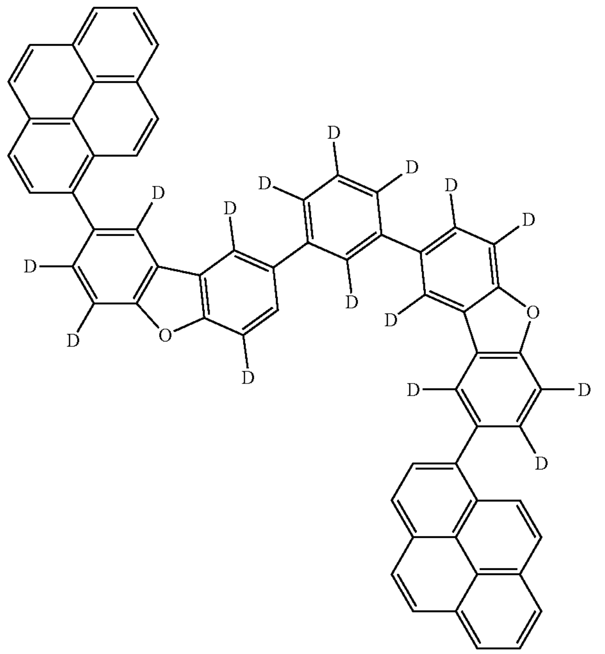
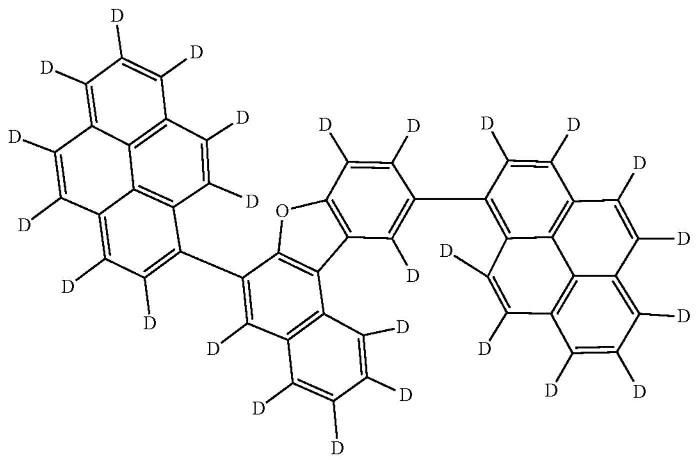
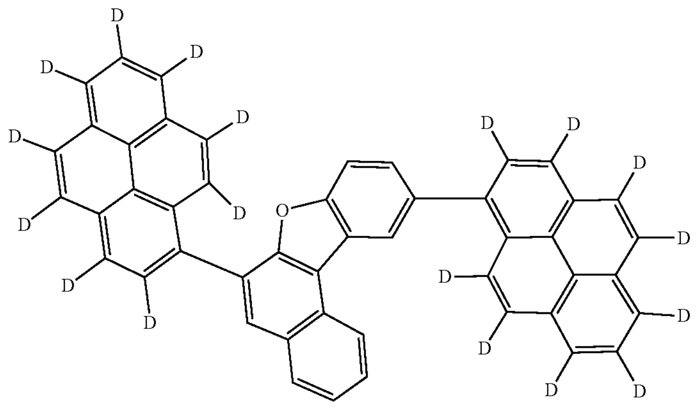

-continued
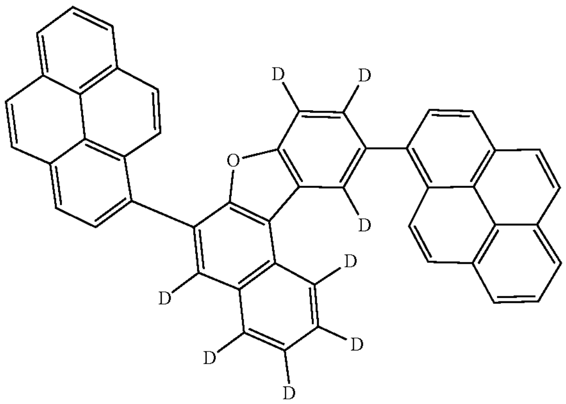
[Formula 245]
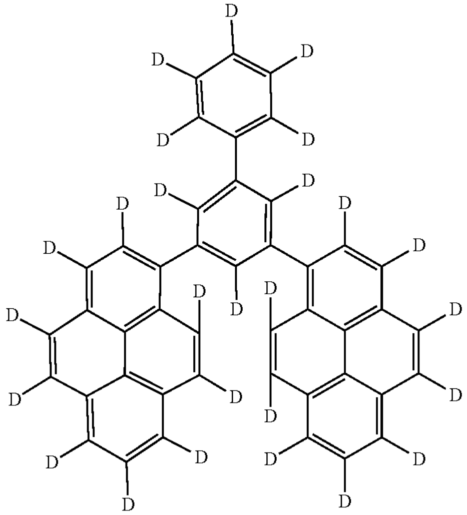
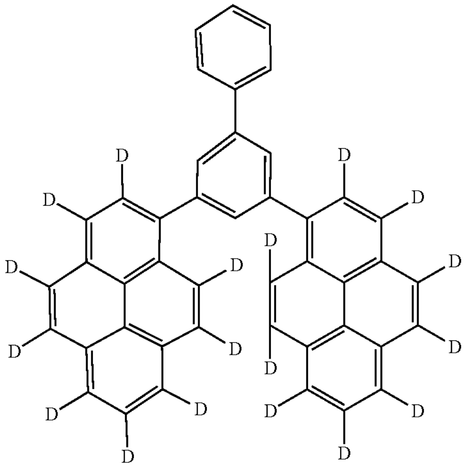
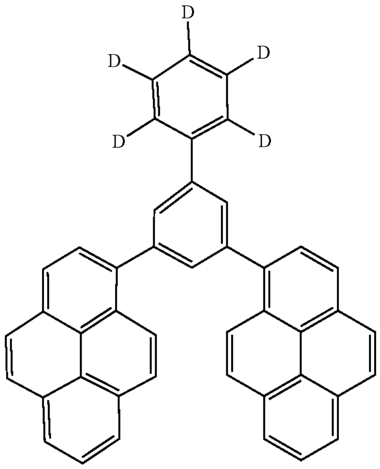
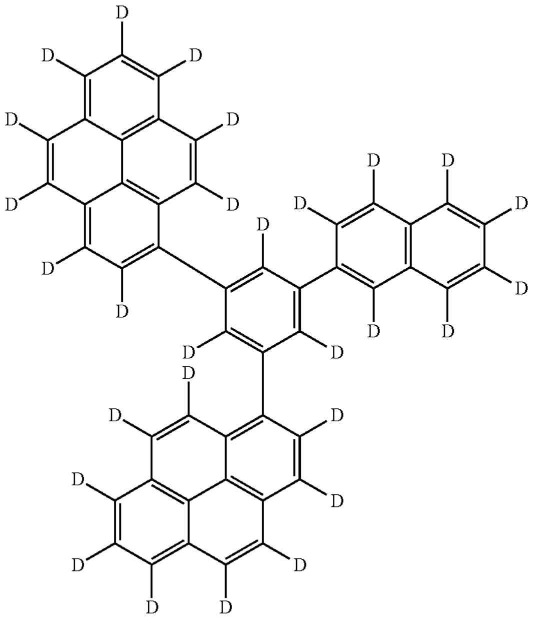

-continued
[Formula 246]
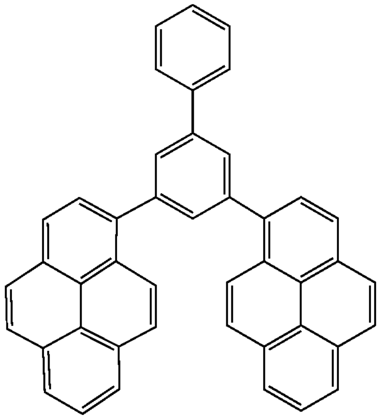
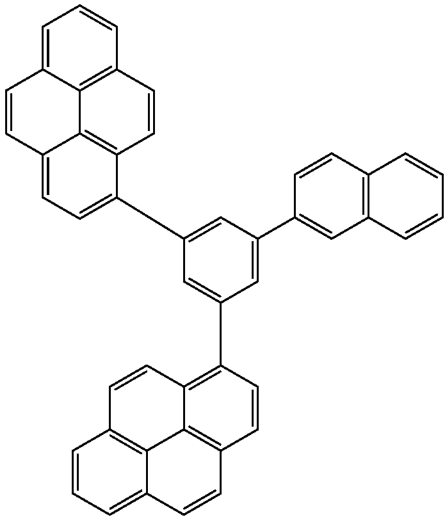
[Formula 247]
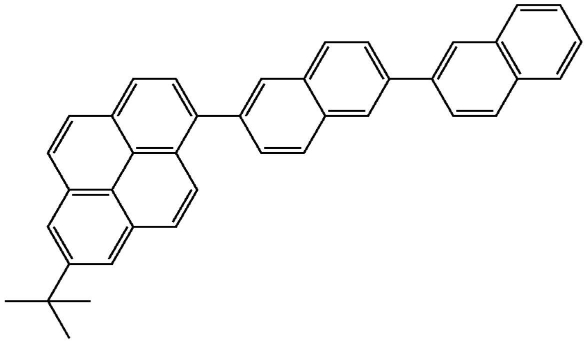
[Formula 248]
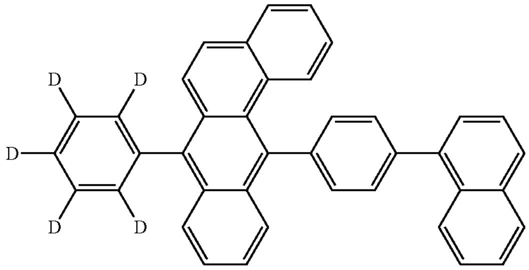
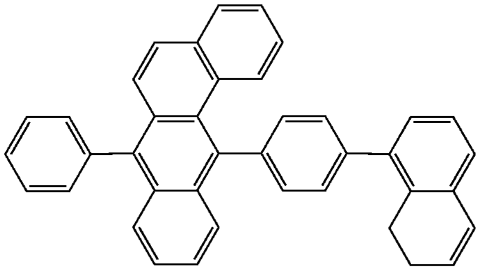
[Formula 249]
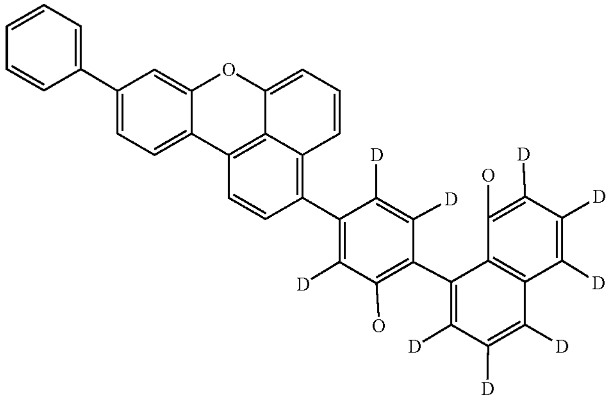

-continued

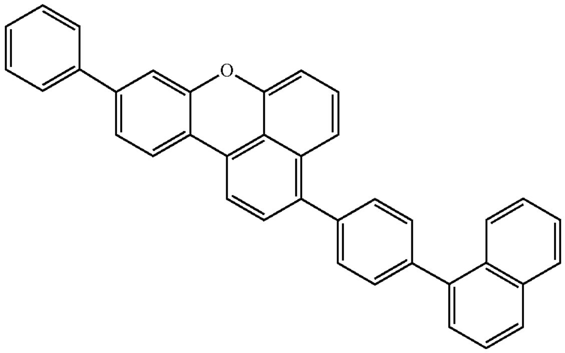

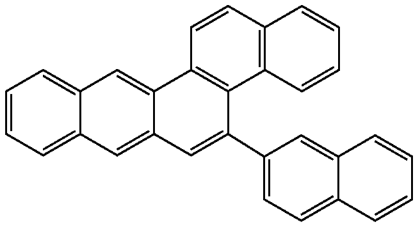

Herein, the "host material" refers to, for instance, a material that accounts for "50 mass % or more of the layer".

That is, for instance, the first emitting layer contains 50 mass % or more of the first host material with respect to the total mass of the first emitting layer.

For instance, the second emitting layer contains 50 mass % or more of the second host material with respect to the total mass of the second emitting layer.

Emitting Compounds

Emitting compounds usable for the emitting layers in the exemplary embodiments will be described.

In the organic EL device in each exemplary embodiment, the first emitting compound, the second emitting compound, and the third emitting compound used are each preferably, for example, at least one compound selected from the group consisting of a compound represented by a formula (3) below, a compound represented by a formula (4) below, a compound represented by a formula (5) below, a compound represented by a formula (6) below, a compound represented by a formula (7) below, a compound represented by a formula (8) below, a compound represented by a formula (9) below, a compound represented by a formula (10) below, and a compound represented by a formula (50) below.

Compound Represented by Formula (3)

The compound represented by the formula (3) will be described below.

[Formula 250]

(3)

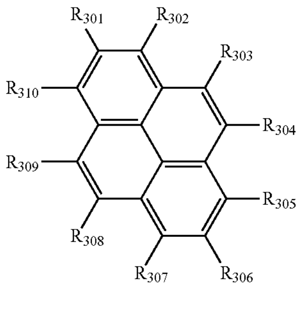

In the formula (3):

at least one combination of adjacent two or more of $R_{301}$ to $R_{310}$ are mutually bonded to form a substituted or unsubstituted monocyclic ring, mutually bonded to form a substituted or unsubstituted fused ring, or not mutually bonded; and at least one of $R_{301}$ to $R_{310}$ is a monovalent group represented by a formula (31) below; and $R_{301}$ to $R_{310}$ forming neither the monocyclic ring nor the fused ring and not being the monovalent group represented by the formula (31) are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms.

[Formula 251]

(31)

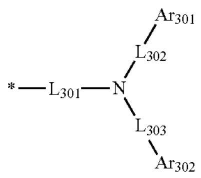

In the formula (31):

$Ar_{301}$ and $Ar_{302}$ are each independently a substituted or unsubstituted aryl group having 6 to 50 ring carbon atoms, or a substituted or unsubstituted heterocyclic group having 5 to 50 ring atoms;

$L_{301}$ to $L_{303}$ are each independently a single bond, a substituted or unsubstituted arylene group having 6 to 30 ring carbon atoms, or a substituted or unsubstituted divalent heterocyclic group having 5 to 30 ring atoms; and

* represents a bonding position to a pyrene ring in the formula (3).

In the formulae for the first emitting compound, the second emitting compound, and the third emitting compound: $R_{901}$, $R_{902}$, $R_{903}$, $R_{904}$, $R_{905}$, $R_{906}$, and $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, a substituted or unsubstituted heterocyclic group having 5 to 50 ring atoms, a substituted or unsubstituted alkyl group having 1 to 50 carbon atoms, or a substituted or unsubstituted aryl group having 6 to 50 ring carbon atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different; and when a plurality of $R_{907}$ are present, the plurality of $R_{907}$ are mutually the same or different.

In the formula (3), two of $R_{301}$ to $R_{310}$ are each preferably a group represented by the formula (31).

In an exemplary embodiment, the compound represented by the formula (3) is a compound represented by a formula (33) below.

[Formula 252]

(33)

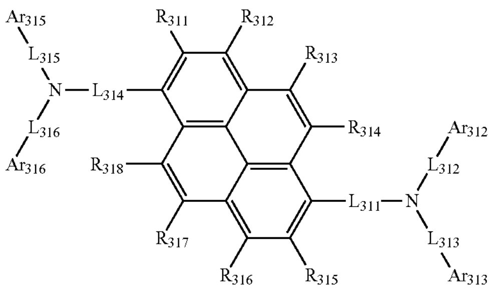

In the formula (33):

$R_{311}$ to $R_{318}$ each independently represent the same as $R_{301}$ to $R_{310}$ in the formula (3) that are not a monovalent group represented by the formula (31); and $L_{311}$ to $L_{316}$ are each independently a single bond, a substituted or unsubstituted arylene group having 6 to 30 ring carbon atoms, or a substituted or unsubstituted divalent heterocyclic group having 5 to 30 ring atoms;

$Ar_{312}$, $Ar_{313}$, $Ar_{315}$, and $Ar_{316}$ are each independently a substituted or unsubstituted aryl group having 6 to 50 ring carbon atoms, or a substituted or unsubstituted heterocyclic group having 5 to 50 ring atoms.

In the formula (31), $L_{301}$ is preferably a single bond, and $L_{302}$ and $L_{303}$ are each preferably a single bond.

In an exemplary embodiment, the compound represented by the formula (3) is represented by a formula (34) or a formula (35) below.

[Formula 253]

(34)

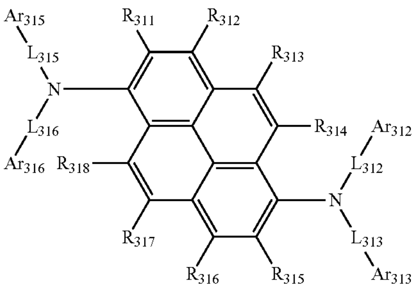

In the formula (34):

$R_{311}$ to $R_{318}$ each independently represent the same as $R_{301}$ to $R_{310}$ in the formula (3) that are not a monovalent group represented by the formula (31); and $L_{312}$, $L_{313}$, $L_{315}$ and $L_{316}$ each independently represent the same as $L_{312}$, $L_{313}$, $L_{315}$ and $L_{316}$ in the formula (33); and $Ar_{312}$, $Ar_{313}$, $Ar_{315}$ and $Ar_{316}$ each independently represent the same as $Ar_{312}$, $Ar_{313}$, $Ar_{315}$ and $Ar_{316}$ in the formula (33).

[Formula 254]

(35)

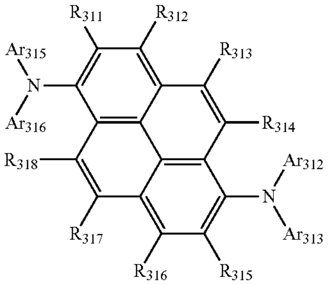

In the formula (35):

$R_{311}$ to $R_{318}$ each independently represent the same as $R_{301}$ to $R_{310}$ in the formula (3) that are not a monovalent group represented by the formula (31); and $Ar_{312}$, $Ar_{313}$, $Ar_{315}$ and $Ar_{316}$ each independently represent the same as $Ar_{312}$, $Ar_{313}$, $Ar_{315}$ and $Ar_{316}$ in the formula (33).

In the formula (31), at least one of $Ar_3O_1$ or $Ar_3O_2$ is preferably a group represented by a formula (36) below.

In the formulae (33) to (35), at least one of $Ar_{312}$ or $Ar_{313}$ is preferably a group represented by the formula (36).

In the formulae (33) to (35), at least one of $Ar_{315}$ or $Ar_{316}$ is preferably a group represented by the formula (36).

[Formula 255]

(36)

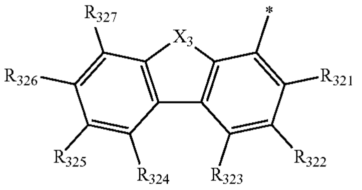

In the formula (36):

$X_3$ represents an oxygen atom or a sulfur atom;

at least one combination of adjacent two or more of $R_{321}$ to $R_{327}$ are mutually bonded to form a substituted or unsubstituted monocyclic ring, mutually bonded to form a substituted or unsubstituted fused ring, or not mutually bonded; and $R_{321}$ to $R_{327}$ forming neither the monocyclic ring nor the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and

* represents a bonding position to $L_{302}$, $L_{303}$, $L_{312}$, $L_{313}$, $L_{315}$ or $L_{316}$.

$X_3$ is preferably an oxygen atom.

At least one of $R_{321}$ to $R_{327}$ is preferably a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

In the formula (31), preferably, $Ar_{301}$ is a group represented by the formula (36) and $Ar_{302}$ is a substituted or unsubstituted aryl group having 6 to 50 ring carbon atoms.

In the formulae (33) to (35), preferably, $Ar_{312}$ is a group represented by the formula (36) and $Ar_{313}$ is a substituted or unsubstituted aryl group having 6 to 50 ring carbon atoms.

In the formulae (33) to (35), preferably, $Ar_{315}$ is a group represented by the formula (36) and $Ar_{316}$ is a substituted or unsubstituted aryl group having 6 to 50 ring carbon atoms.

In an exemplary embodiment, the compound represented by the formula (3) is represented by a formula (37) below.

[Formula 256]

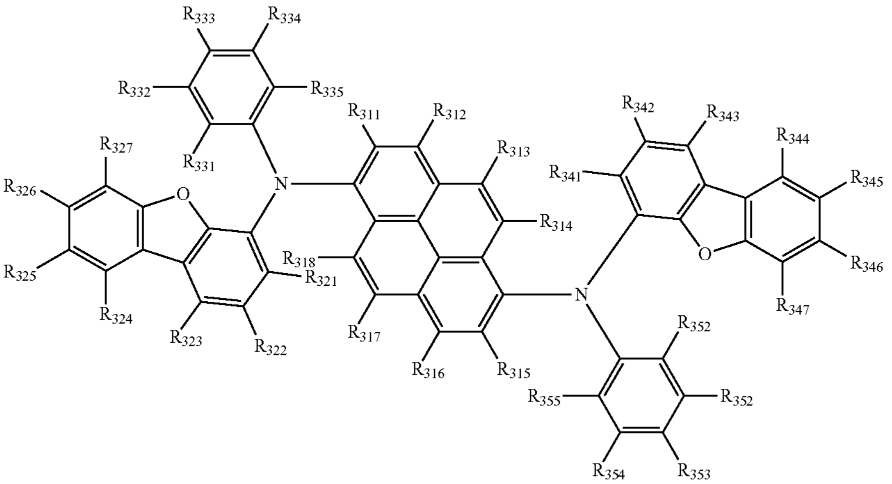

(37)

In the formula (37):

$R_{311}$ to $R_{318}$ each independently represent the same as $R_{301}$ to $R_{310}$ in the formula (3) that are not a monovalent group represented by the formula (31);

at least one combination of adjacent two or more of $R_{321}$ to $R_{327}$ are mutually bonded to form a substituted or unsubstituted monocyclic ring, mutually bonded to form a substituted or unsubstituted fused ring, or not mutually bonded;

at least one combination of adjacent two or more of $R_{341}$ to $R_{347}$ are mutually bonded to form a substituted or unsubstituted monocyclic ring, mutually bonded to form a substituted or unsubstituted fused ring, or not mutually bonded; and $R_{321}$ to $R_{327}$ and $R_{341}$ to $R_{347}$ forming neither the monocyclic ring nor the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms, $R_{331}$ to $R_{335}$ and $R_{351}$ to $R_{335}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

Specific Examples of Compound Represented by Formula (3)

Specific examples of the compound represented by the formula (3) include compounds shown below.

[Formula 257]

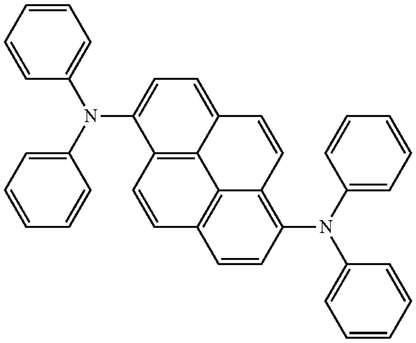

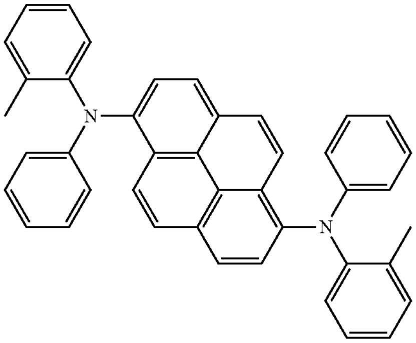

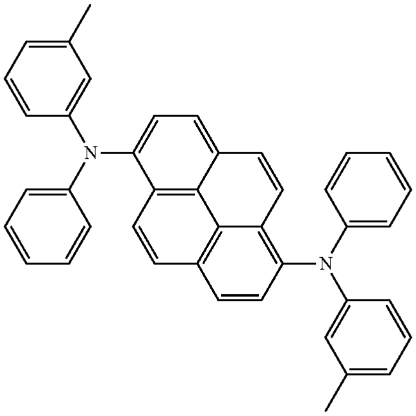

-continued

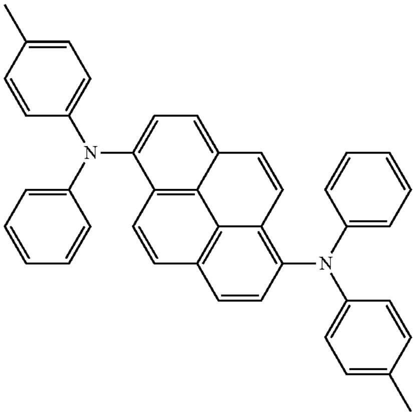

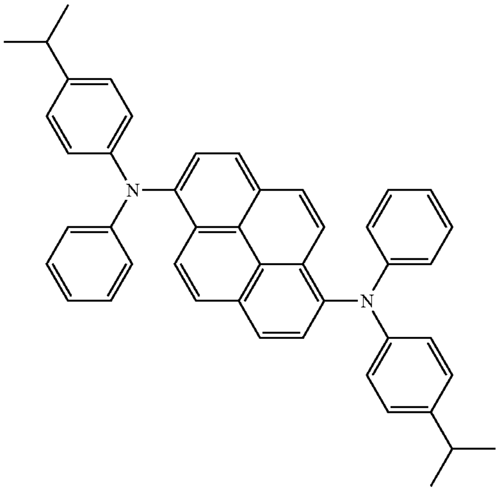

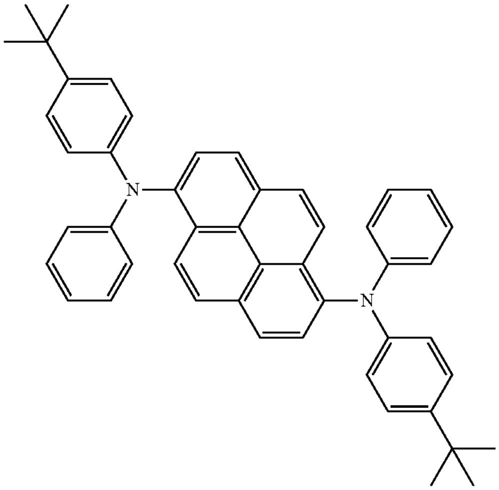

-continued
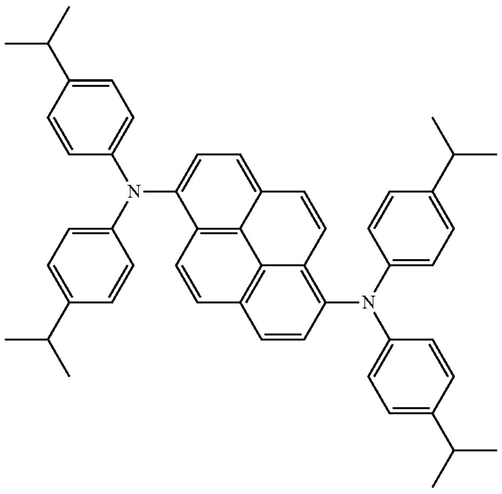
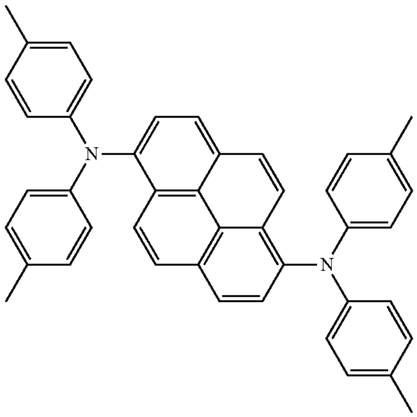
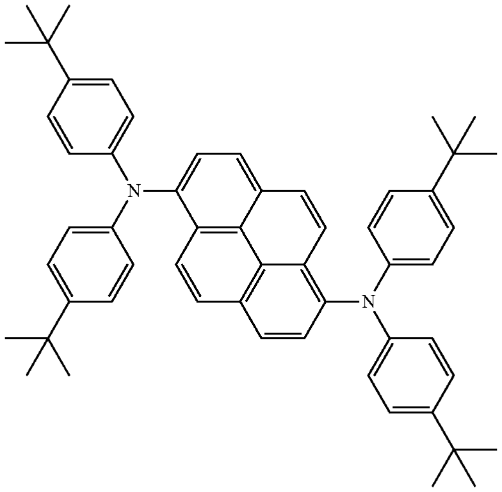
-continued
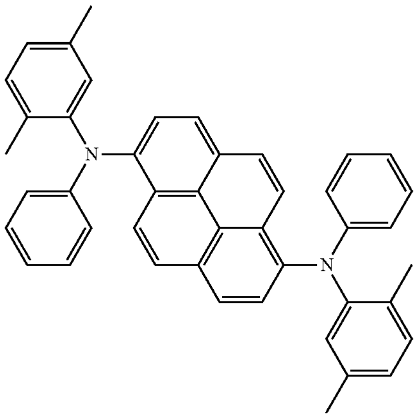
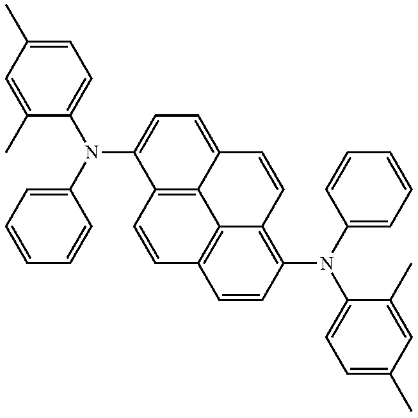
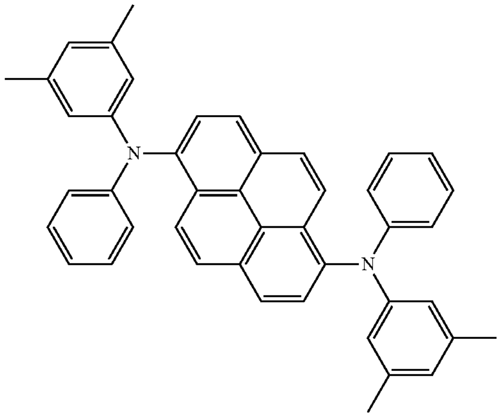
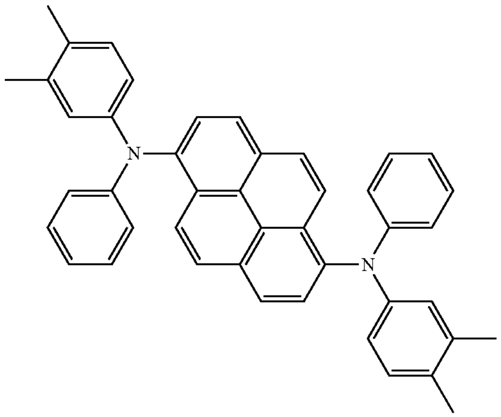

-continued
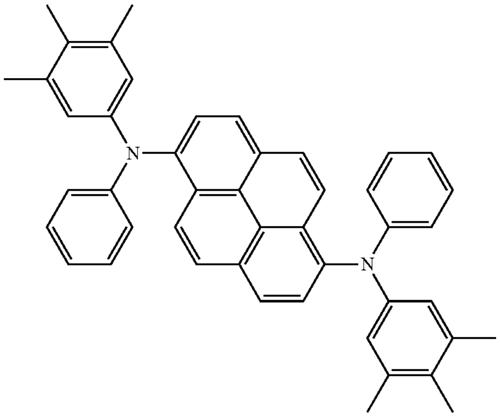
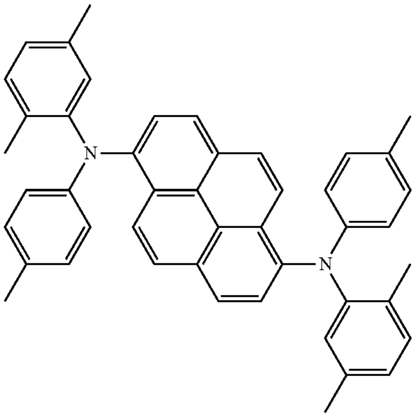
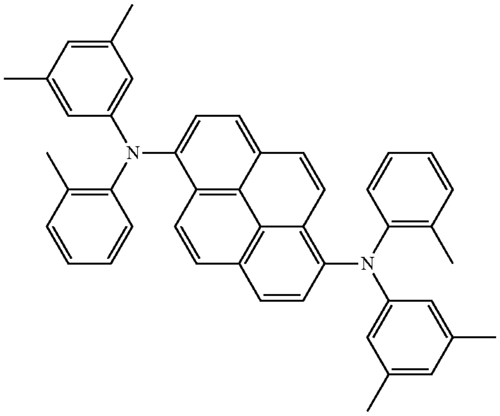
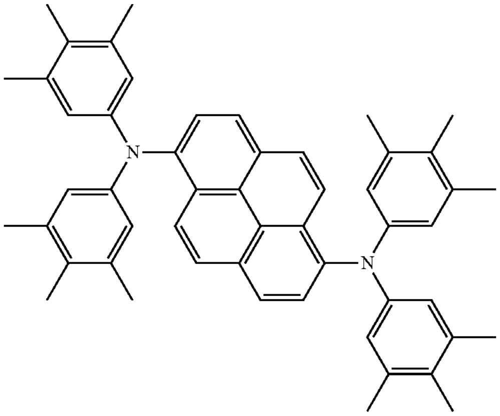
-continued
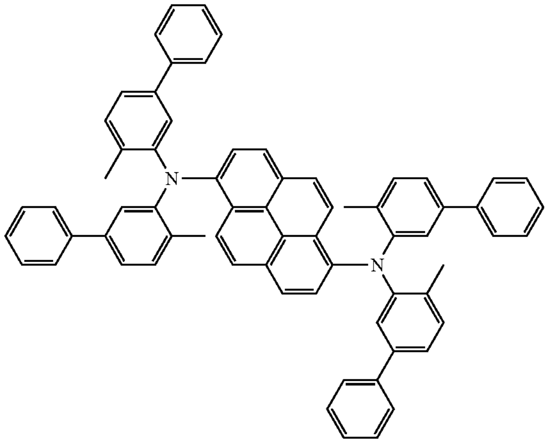
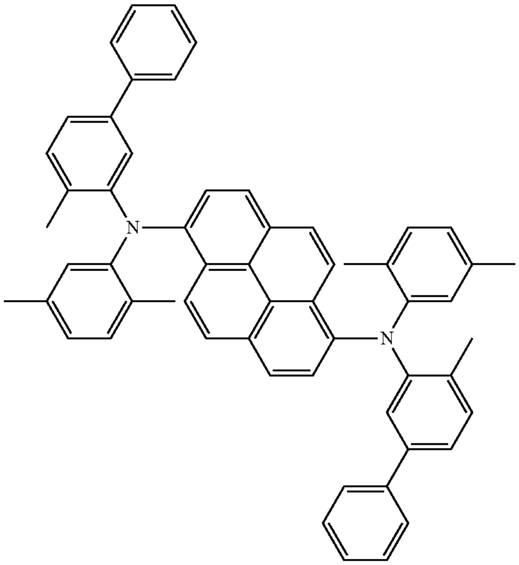
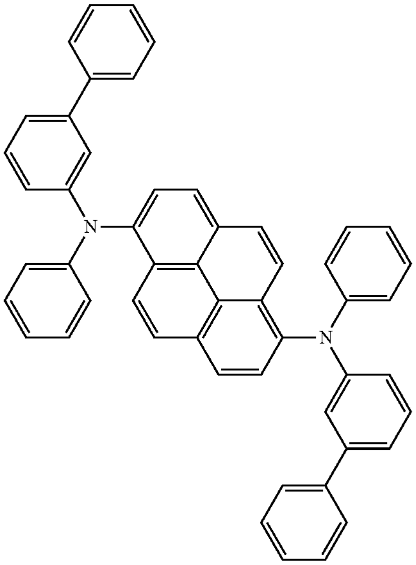

-continued
[Formula 258]
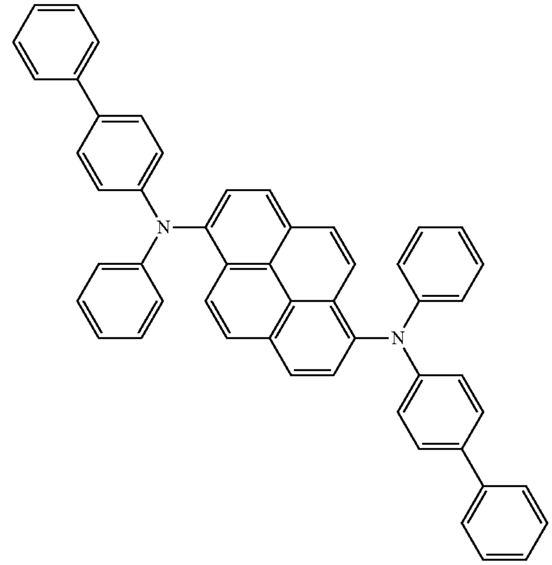
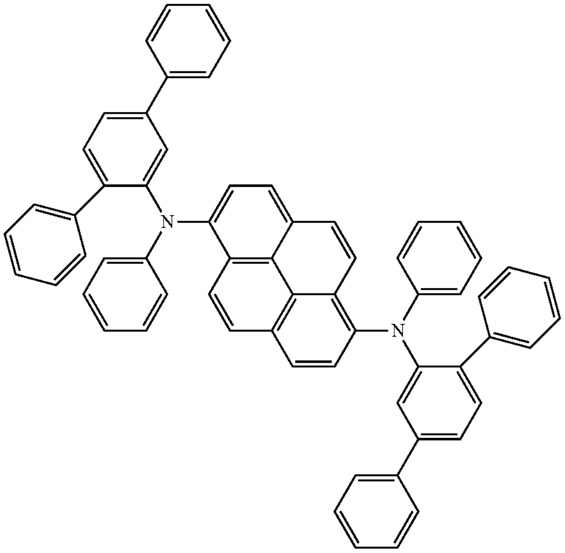
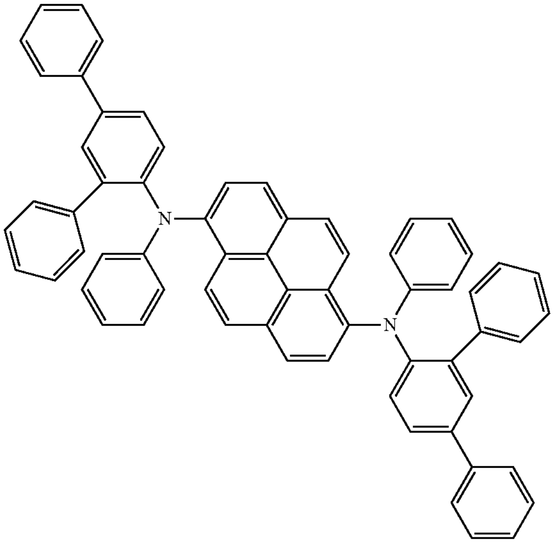
-continued
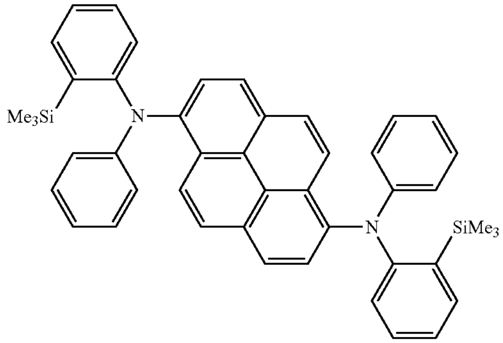
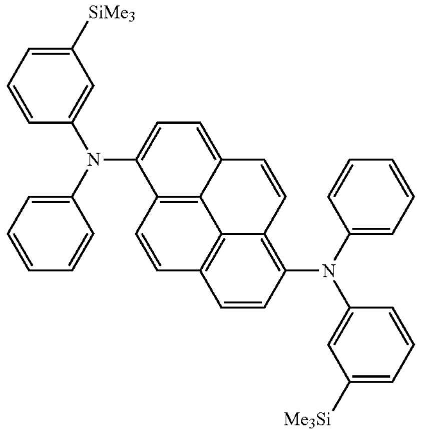
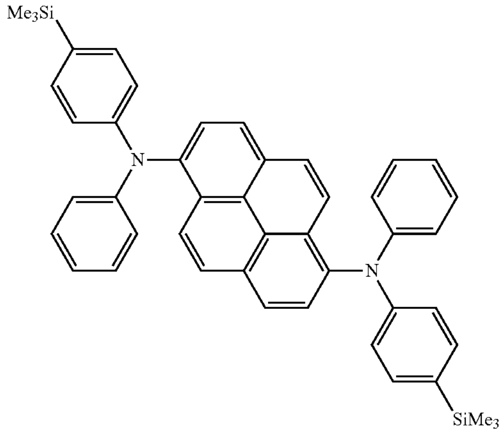
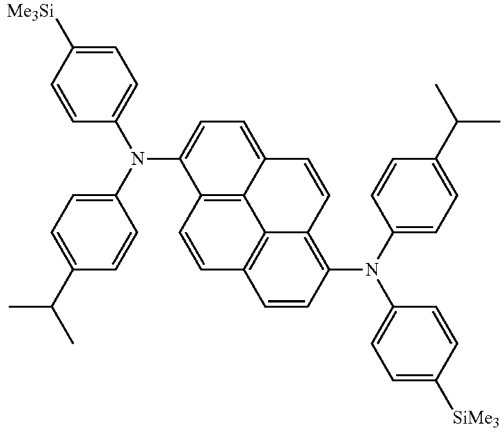

-continued
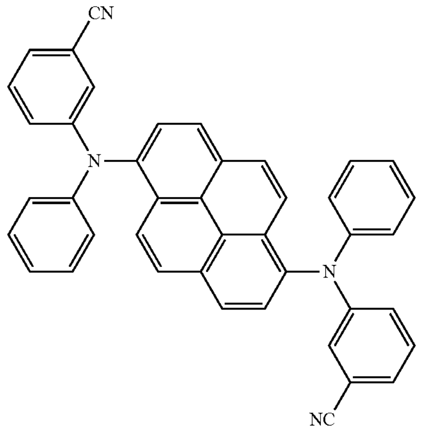
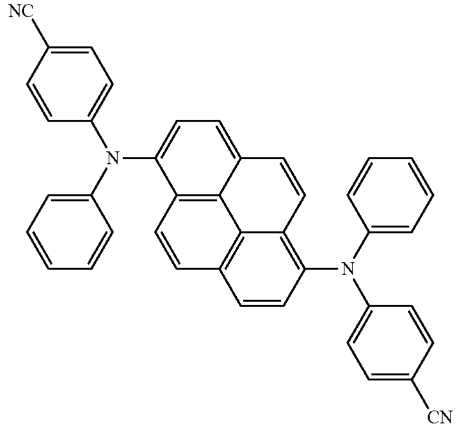
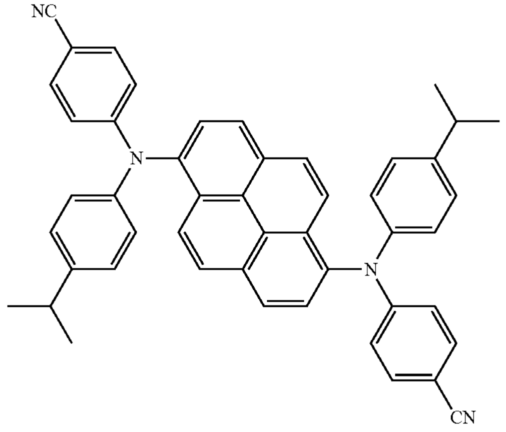
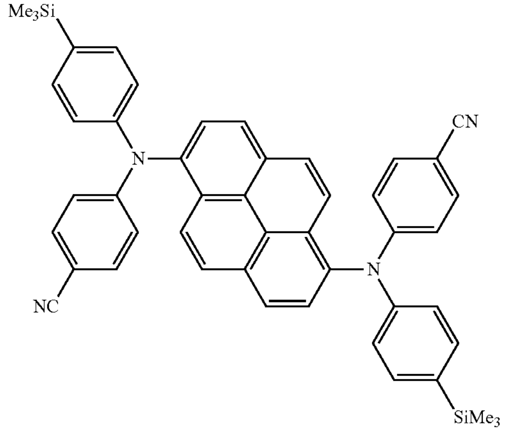
-continued
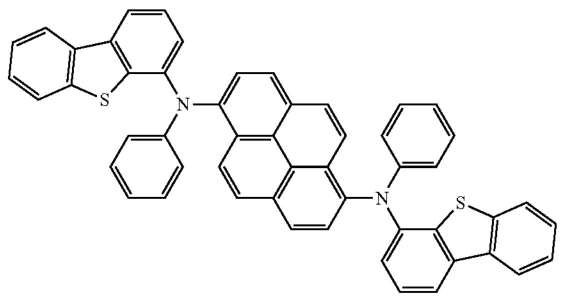
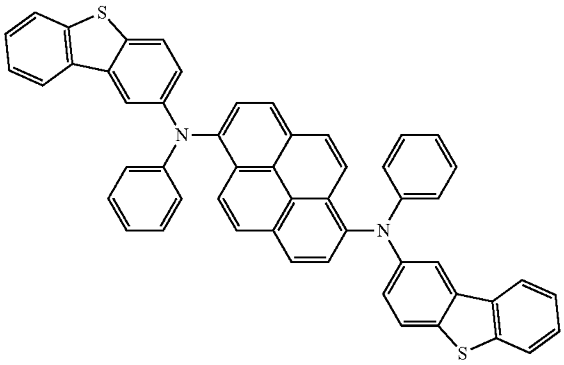
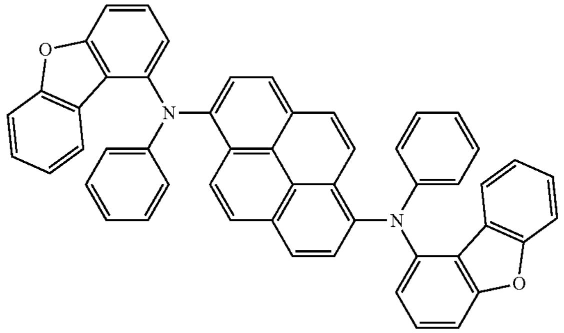
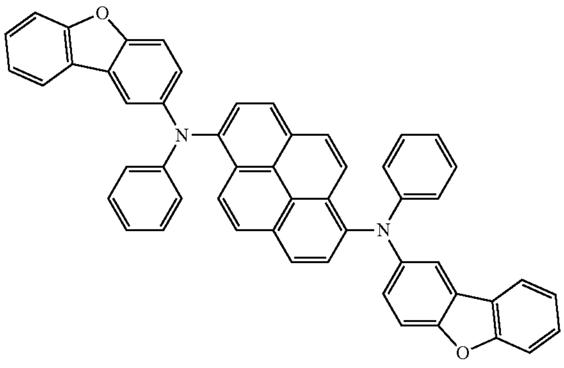
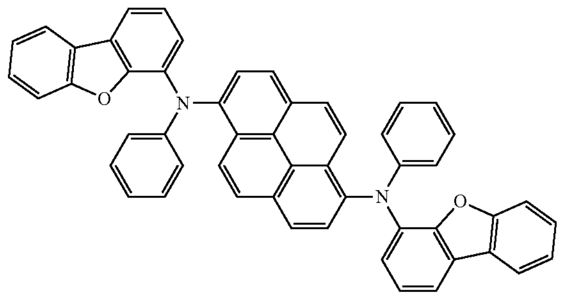

-continued
[Formula 259]
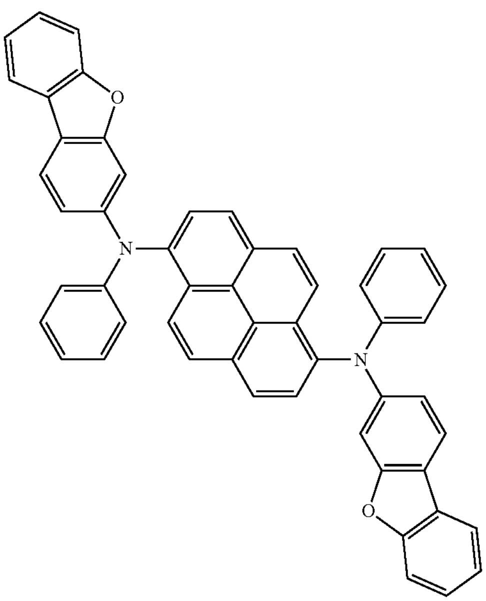
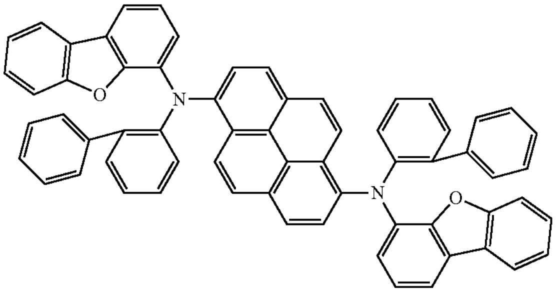
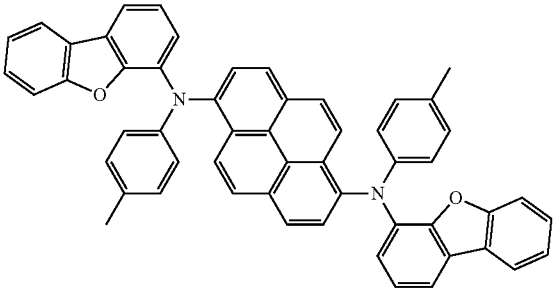
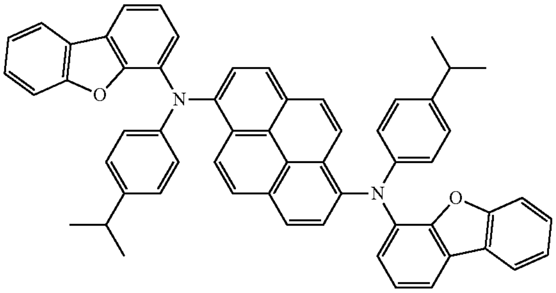
-continued
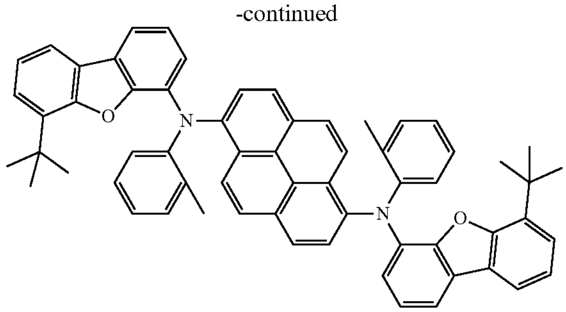
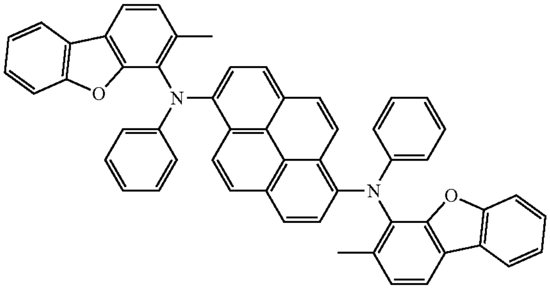
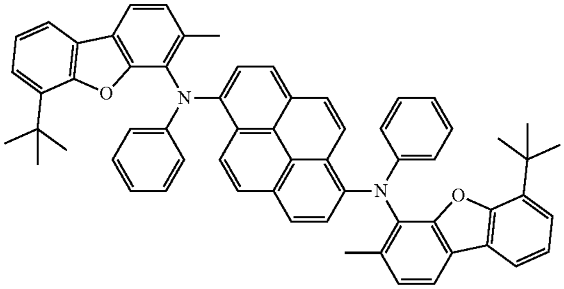
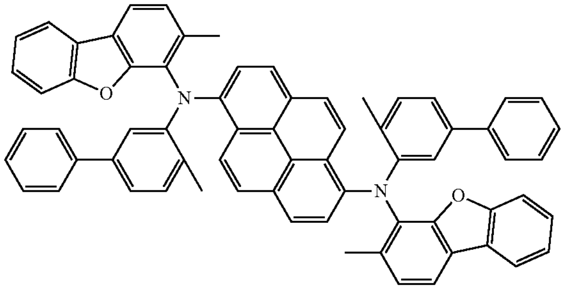
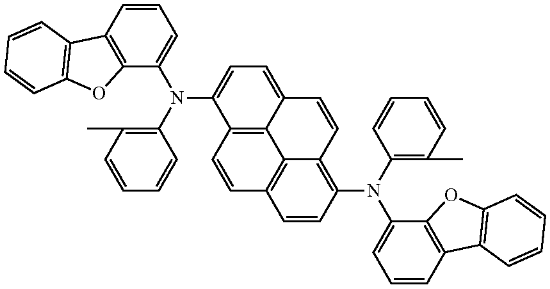
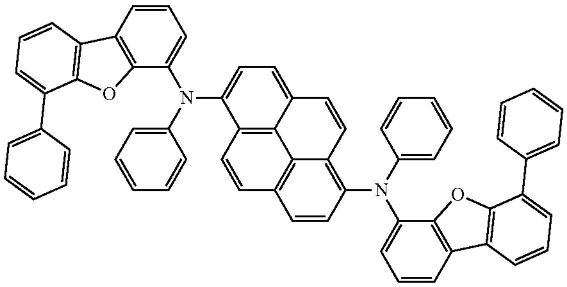

-continued
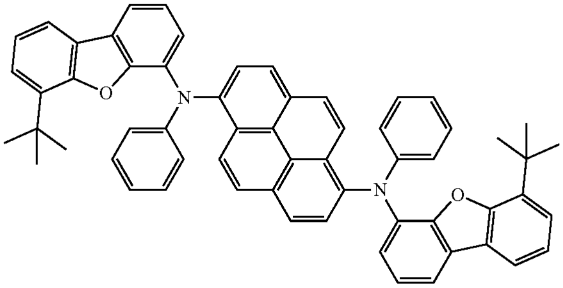
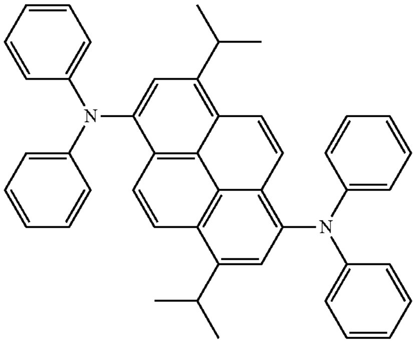
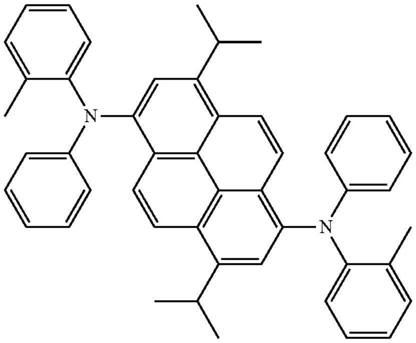
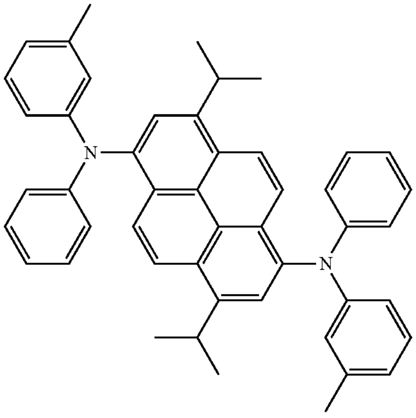
-continued
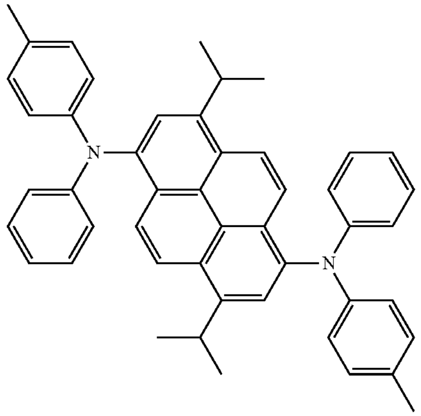
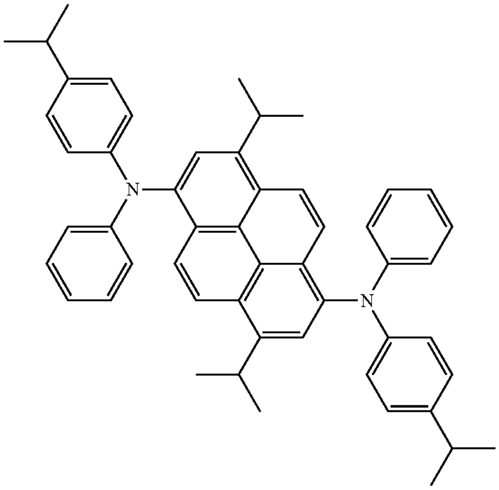
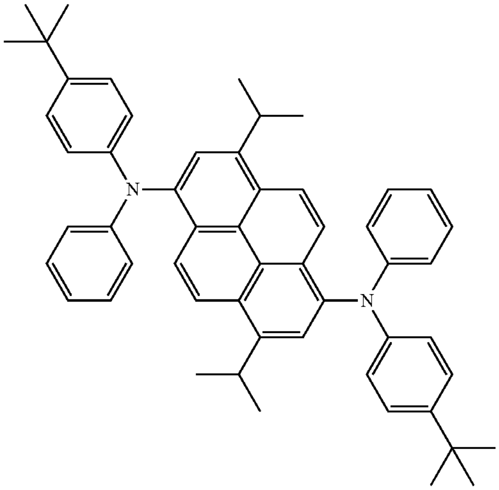

-continued
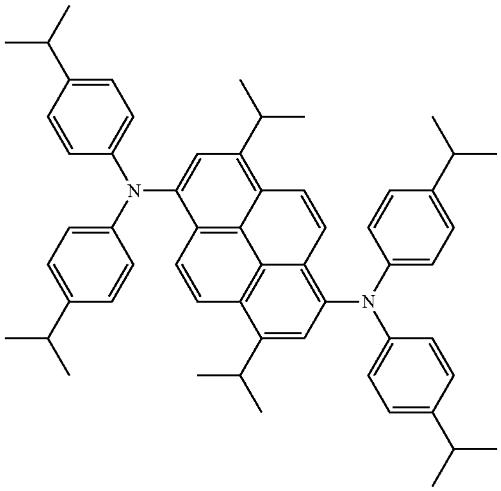
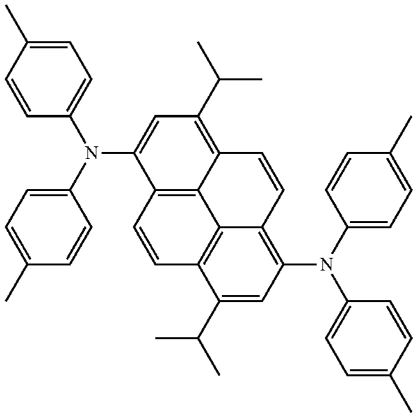
[Formula 260]
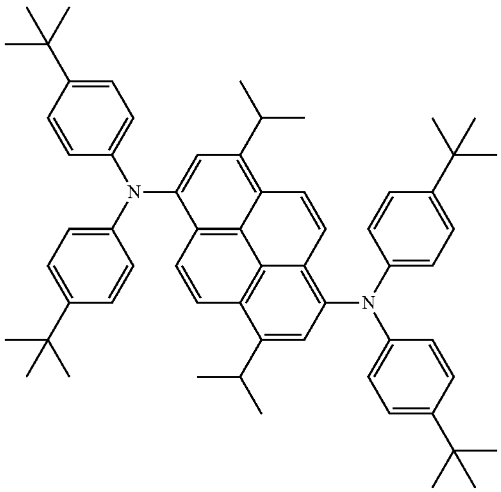
-continued
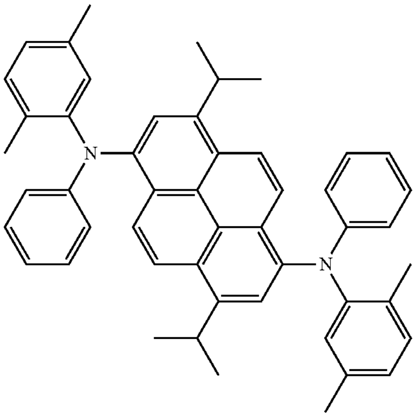
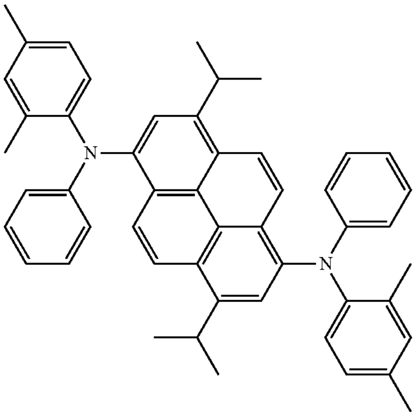
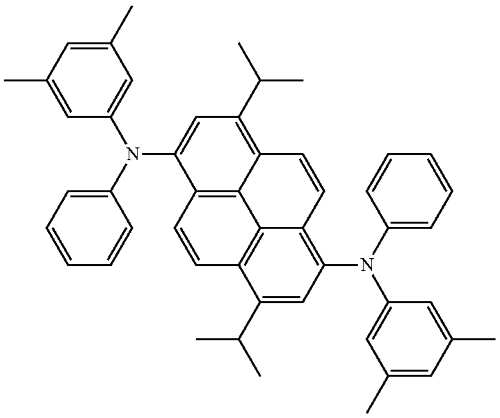
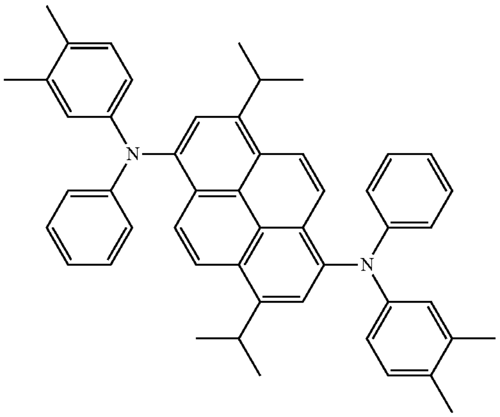

-continued
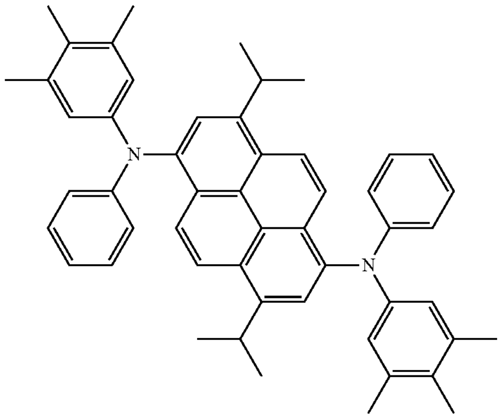
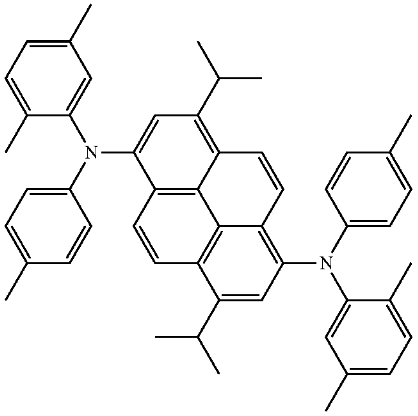
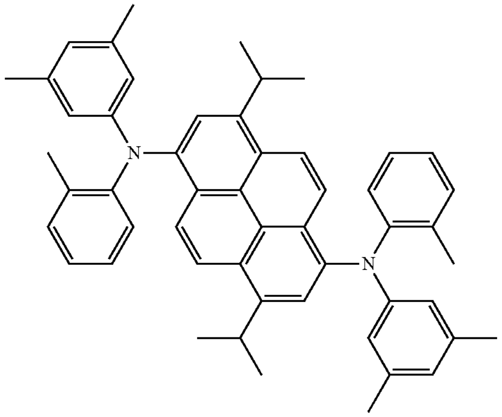
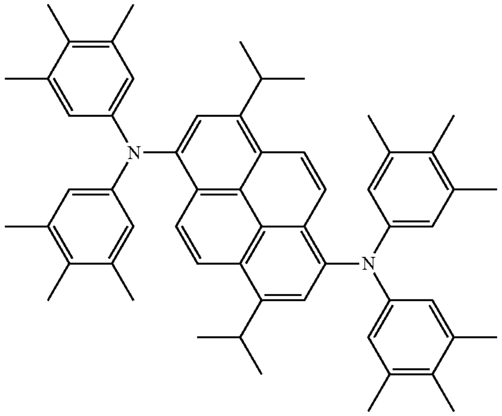
-continued
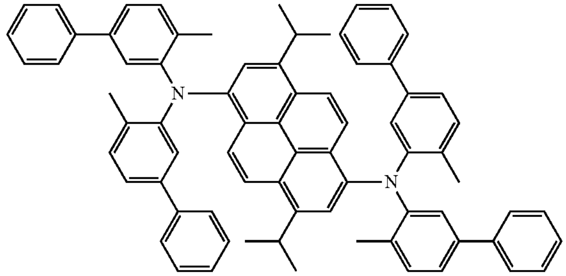
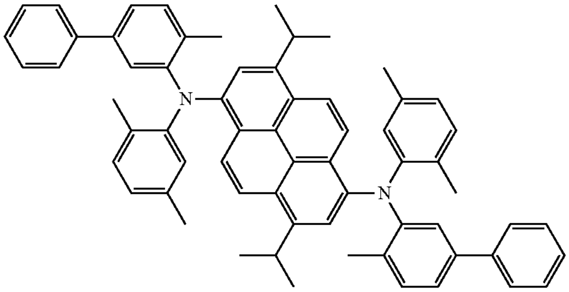
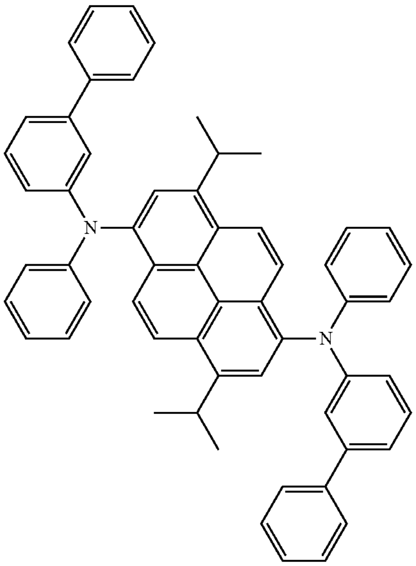
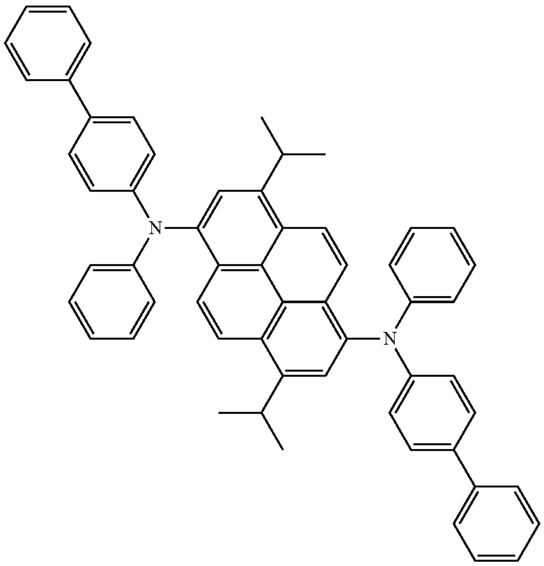

-continued
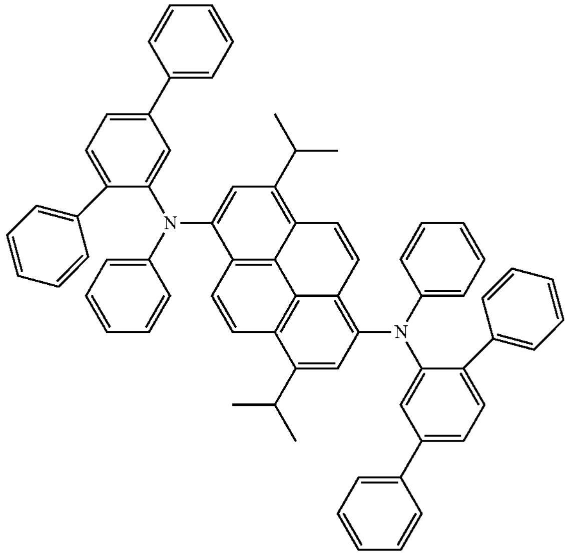
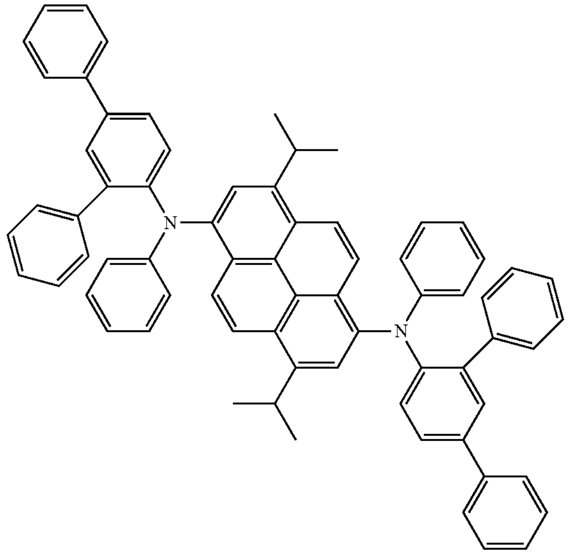
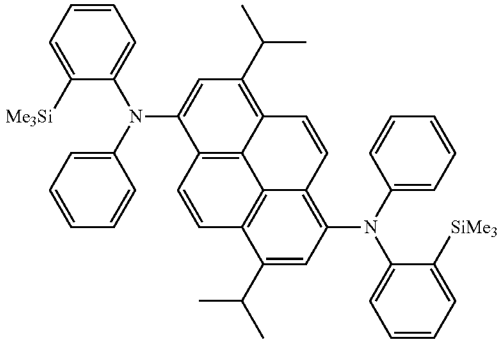
-continued
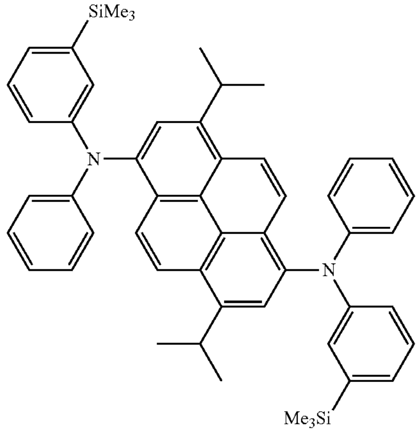
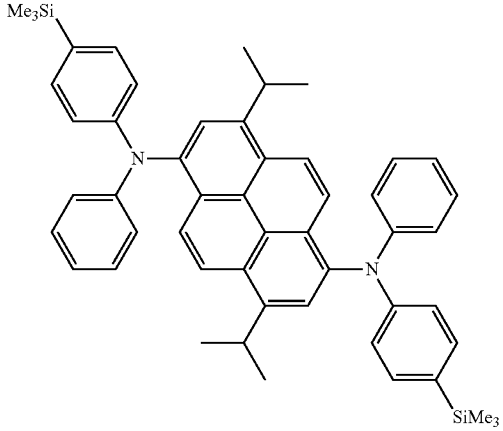
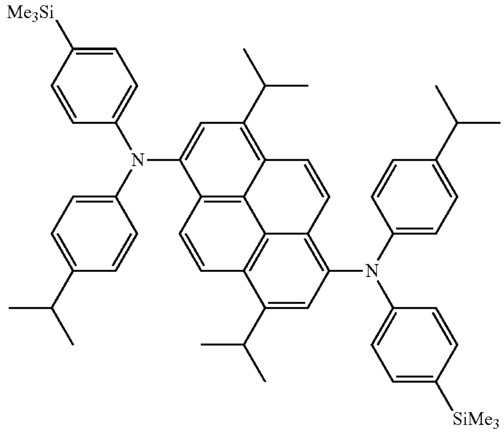
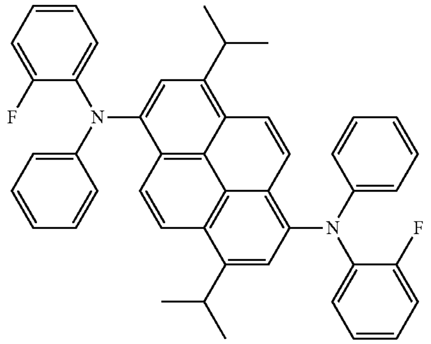

-continued
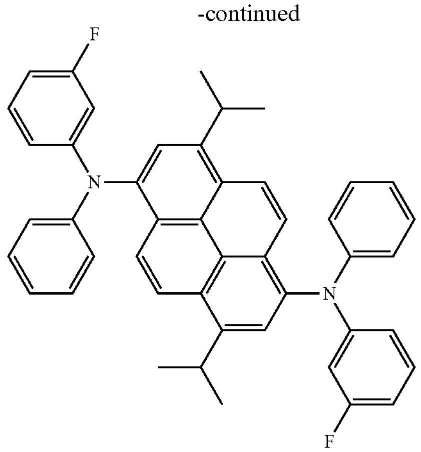
[Formula 261]
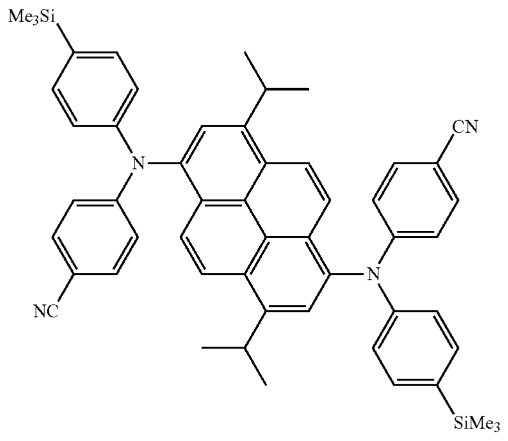
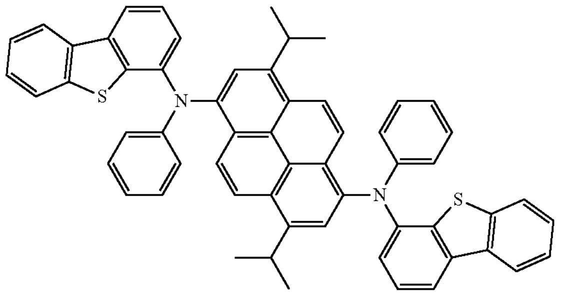
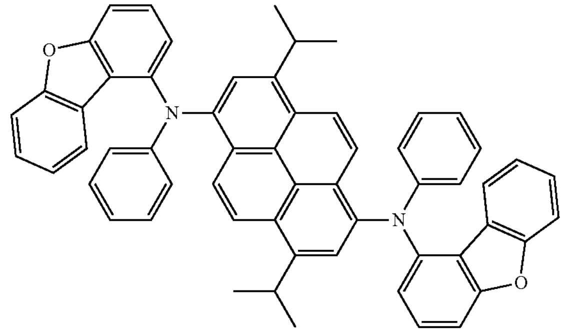
-continued
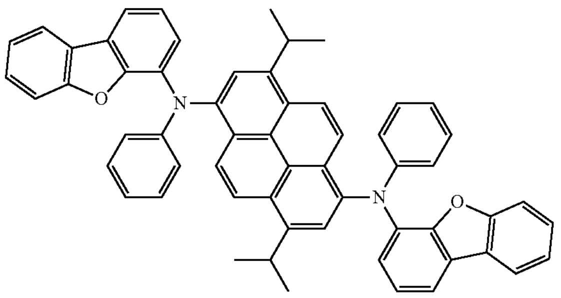
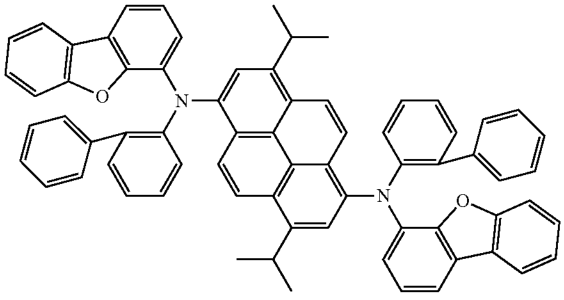
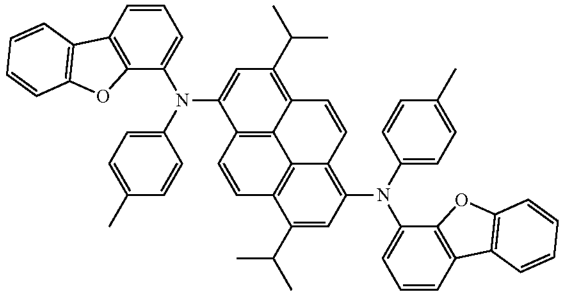
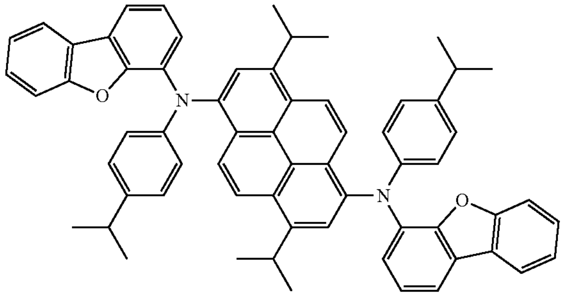
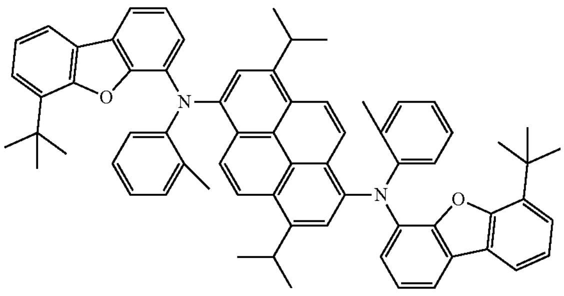

-continued

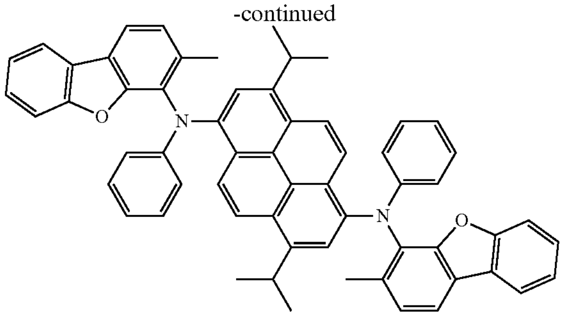

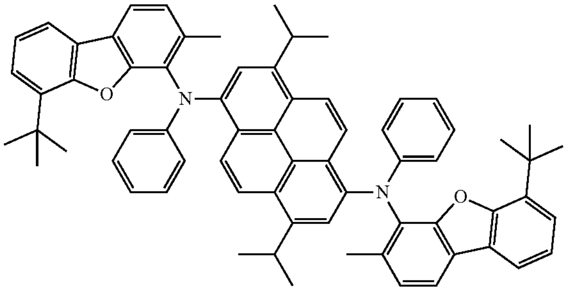

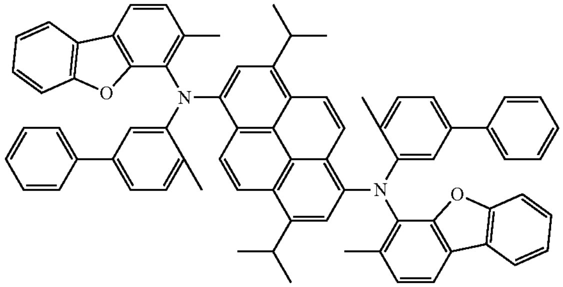

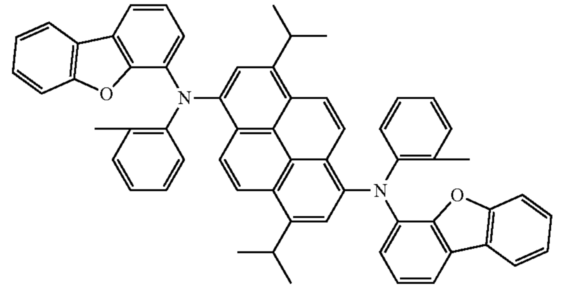

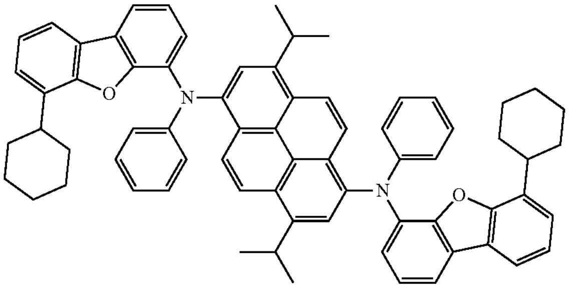

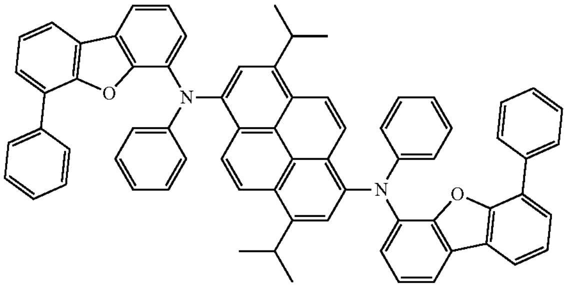

-continued

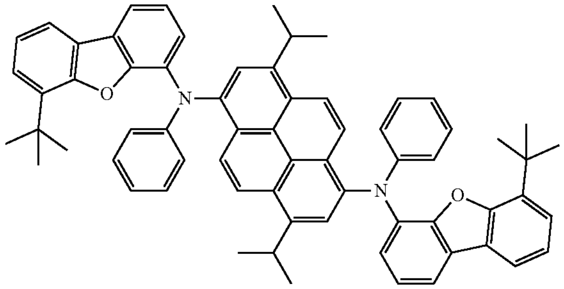

Compound Represented by Formula (4)

The compound represented by the formula (4) will be described below.

[Formula 262]

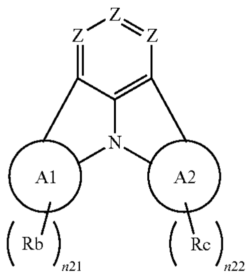

(4)

In the formula (4):

Z are each independently CRa or a nitrogen atom;

A1 ring and A2 ring are each independently a substituted or unsubstituted aromatic hydrocarbon ring having 6 to 50 ring carbon atoms, or a substituted or unsubstituted heterocycle having 5 to 50 ring atoms;

when a plurality of Ra are present, at least one combination of adjacent two or more of the plurality of Ra are mutually bonded to form a substituted or unsubstituted monocyclic ring, mutually bonded to form a substituted or unsubstituted fused ring, or not mutually bonded;

n21 and n22 are each independently 0, 1, 2, 3 or 4;

when a plurality of Rb are present, at least one combination of adjacent two or more of the plurality of Rb are mutually bonded to form a substituted or unsubstituted monocyclic ring, mutually bonded to form a substituted or unsubstituted fused ring, or not mutually bonded;

when a plurality of RC are present, at least one combination of adjacent two or more of the plurality of RC are mutually bonded to form a substituted or unsubstituted monocyclic ring, mutually bonded to form a substituted or unsubstituted fused ring, or not mutually bonded; and Ra, Rb, and RC forming neither the monocyclic ring nor the fused ring are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

The "aromatic hydrocarbon ring" for the A1 ring and A2 ring has the same structure as a compound formed by introducing a hydrogen atom to the "aryl group" described above.

Ring atoms of the "aromatic hydrocarbon ring" for the A1 ring and A2 ring include two carbon atoms on a fused bicyclic structure at the center of the formula (4).

Specific examples of the "substituted or unsubstituted aromatic hydrocarbon ring having 6 to 50 ring carbon atoms" include a compound formed by introducing a hydrogen atom to the "aryl group" described in the specific example group G1.

The "heterocycle" for the A1 ring and A2 ring has the same structure as a compound formed by introducing a hydrogen atom to the "heterocyclic group" described above.

Ring atoms of the "heterocycle" for the A1 ring and A2 ring include two carbon atoms on a fused bicyclic structure at the center of the formula (4).

Specific examples of the "substituted or unsubstituted heterocycle having 5 to 50 ring atoms" include a compound formed by introducing a hydrogen atom to the "heterocyclic group" described in the specific example group G2.

Rb is bonded to any one of carbon atoms forming the aromatic hydrocarbon ring as the A1 ring or any one of atoms forming the heterocycle as the A1 ring.

RC is bonded to any one of carbon atoms forming the aromatic hydrocarbon ring as the A2 ring or any one of atoms forming the heterocycle as the A2 ring.

At least one of Ra, Rb, or RC is preferably a group represented by a formula (4a) below. More preferably, at least two of Ra, Rb, or RC are each a group represented by the formula (4a).

$$*\text{-}L_{401}\text{-}Ar_{401}$$ [Formula 263]

In the formula (4a):

$L_{401}$ is a single bond, a substituted or unsubstituted arylene group having 6 to 30 ring carbon atoms, or a substituted or unsubstituted divalent heterocyclic group having 5 to 30 ring atoms;

$Ar_{401}$ is a substituted or unsubstituted aryl group having 6 to 50 ring carbon atoms, a substituted or unsubstituted heterocyclic group having 5 to 50 ring atoms, or a group represented by a formula (4b) below.

[Formula 264]

(4b)

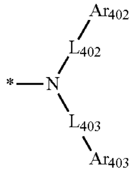

In the formula (4b):

$L_{402}$ and $L_{403}$ are each independently a single bond, a substituted or unsubstituted arylene group having 6 to 30 ring carbon atoms, or a substituted or unsubstituted divalent heterocyclic group having 5 to 30 ring atoms;

a combination of $Ar_{402}$ and $Ar_{403}$ are mutually bonded to form a substituted or unsubstituted monocyclic ring, mutually bonded to form a substituted or unsubstituted fused ring, or not mutually bonded; and $Ar_{402}$ and $Ar_{403}$ forming neither the monocyclic ring nor the fused ring are each independently a substituted or unsubstituted aryl group having 6 to 50 ring carbon atoms, or a substituted or unsubstituted heterocyclic group having 5 to 50 ring atoms.

In an exemplary embodiment, the compound represented by the formula (4) is represented by a formula (42) below.

[Formula 265]

(42)

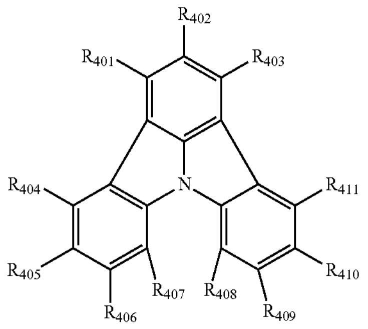

In the formula (42):

at least one combination of adjacent two or more of $R_{401}$ to $R_{411}$ are mutually bonded to form a substituted or unsubstituted monocyclic ring, mutually bonded to form a substituted or unsubstituted fused ring, or not mutually bonded, and $R_{401}$ to $R_{411}$ forming neither the monocyclic ring nor the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

At least one of $R_{401}$ to $R_{411}$ is preferably a group represented by the formula (4a). More preferably, at least two of $R_{401}$ to $R_{411}$ are each a group represented by the formula (4a).

$R_{404}$ and $R_{411}$ are each preferably a group represented by the formula (4a).

In an exemplary embodiment, the compound represented by the formula (4) is a compound formed by bonding a structure represented by a formula (4-1) or a formula (4-2) below to the A1 ring.

Further, in an exemplary embodiment, the compound represented by the formula (42) is a compound formed by bonding the structure represented by the formula (4-1) or the formula (4-2) to a ring bonded to $R_{404}$ to $R_{407}$.

[Formula 266]

(4-1)

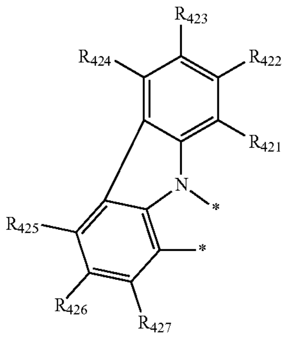

(4-2)

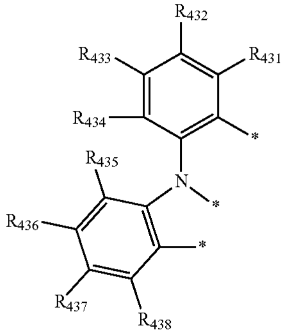

In the formula (4-1), two bonds * are each independently bonded to a ring-forming carbon atom of the aromatic hydrocarbon ring or a ring atom of the heterocycle as the A1 ring in the formula (4) or bonded to one of $R_{404}$ to $R_{407}$ in the formula (42);

in the formula (4-2), three bonds * are each independently bonded to a ring-forming carbon atom of the aromatic hydrocarbon ring or a ring atom of the heterocycle as the A1 ring in the formula (4) or bonded to one of $R_{404}$ to $R_{407}$ in the formula (42);

at least one combination of adjacent two or more of $R_{421}$ to $R_{427}$ are mutually bonded to form a substituted or unsubstituted monocyclic ring, mutually bonded to form a substituted or unsubstituted fused ring, or not mutually bonded;

at least one combination of adjacent two or more of $R_{431}$ to $R_{438}$ are mutually bonded to form a substituted or unsubstituted monocyclic ring, mutually bonded to form a substituted or unsubstituted fused ring, or not mutually bonded, and $R_{421}$ to $R_{427}$ and $R_{431}$ to $R_{438}$ forming neither the monocyclic ring nor the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms.

In an exemplary embodiment, the compound represented by the formula (4) is a compound represented by a formula (41-3), a formula (41-4) or a formula (41-5) below.

[Formula 267]

(41-3)

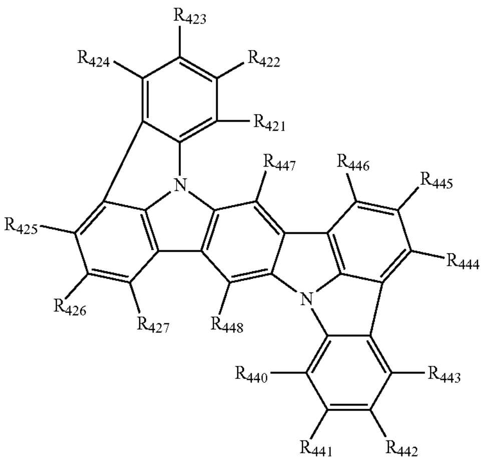

[Formula 268]

(41-4)

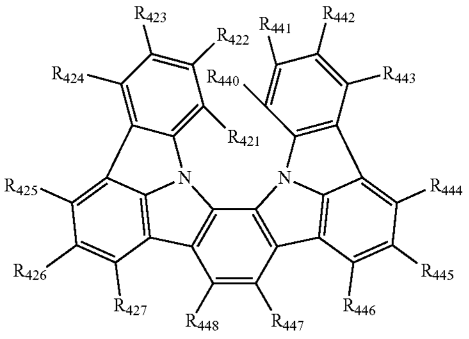

[Formula 269]

(41-5)

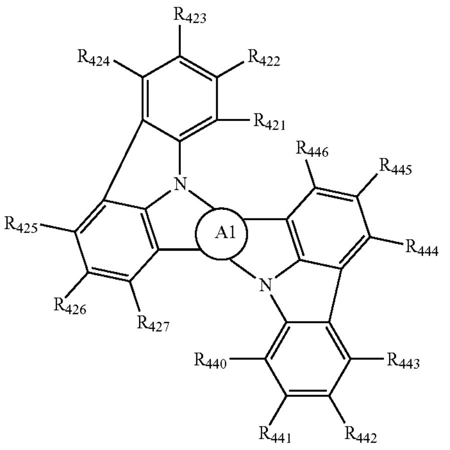

In the formulae (41-3), (41-4), and (41-5):

A1 ring is as defined in the formula (4);

$R_{421}$ to $R_{427}$ each independently represent the same as $R_{421}$ to $R_{427}$ in the formula (4-1); and $R_{440}$ to $R_{448}$ each independently represent the same as $R_{401}$ to $R_{411}$ in the formula (42).

In an exemplary embodiment, a substituted or unsubstituted aromatic hydrocarbon ring having 6 to 50 ring carbon atoms as the A1 ring in the formula (41-5) is a substituted or unsubstituted naphthalene ring, or a substituted or unsubstituted fluorene ring.

In an exemplary embodiment, a substituted or unsubstituted heterocycle having 5 to 50 ring atoms as the A1 ring in the formula (41-5) is a substituted or unsubstituted dibenzofuran ring, a substituted or unsubstituted carbazole ring, or a substituted or unsubstituted dibenzothiophene ring.

In an exemplary embodiment, the compound represented by the formula (4) or the formula (42) is selected from the group consisting of compounds represented by formulae (461) to (467) below.

[Formula 270]

(461)

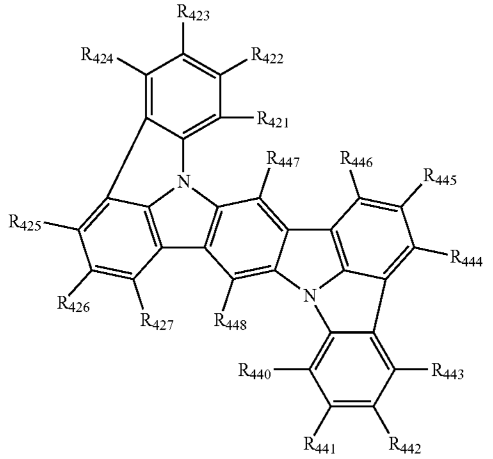

(462)

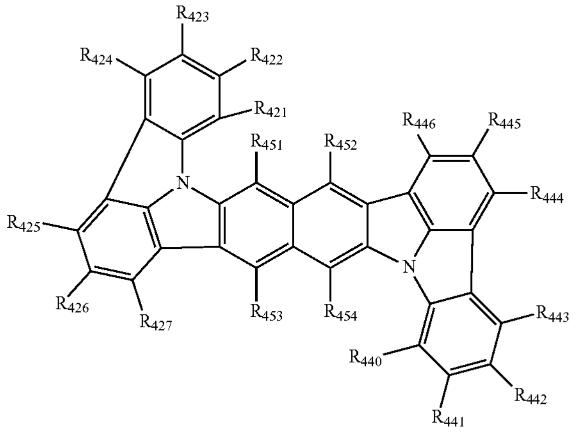

-continued

[Formula 271]

(463)

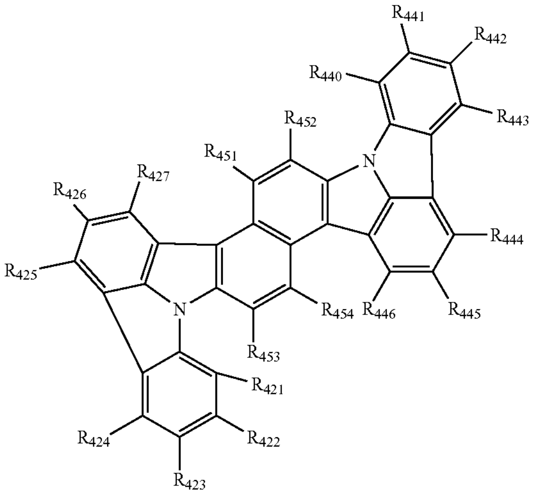

(464)

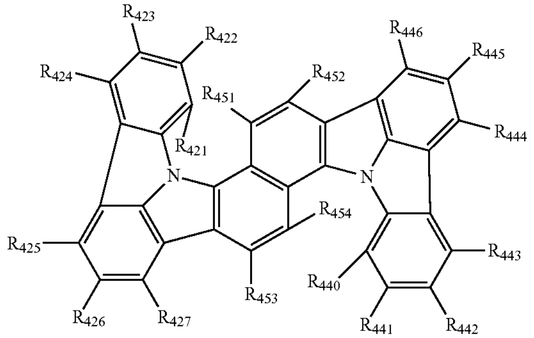

[Formula 272]

(465)

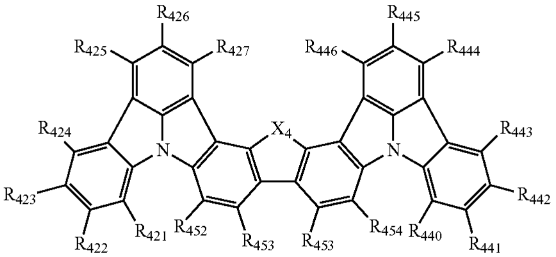

[Formula 273]

(466)

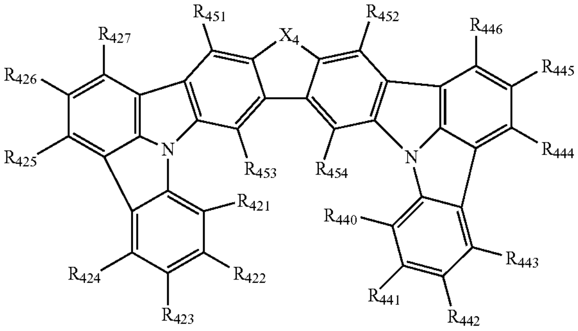

-continued

[Formula 274]

(467)

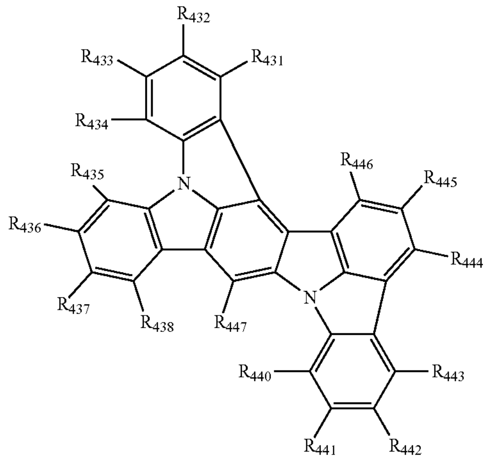

In the formulae (461), (462), (463), (464), (465), (466), and (467):

$R_{421}$ to $R_{427}$ each independently represent the same as $R_{421}$ to $R_{427}$ in the formula (4-1);

$R_{431}$ to $R_{438}$ each independently represent the same as $R_{431}$ to $R_{438}$ in the formula (4-2);

$R_{440}$ to $R_{448}$ and $R_{451}$ to $R_{454}$ each independently represent the same as $R_{401}$ to $R_{411}$ in the formula (42);

$X_4$ is an oxygen atom, $NR_{801}$, or $C(R_{802})(R_{803})$;

$R_{801}$, $R_{802}$, and $R_{803}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms, a substituted or unsubstituted alkyl group having 1 to 50 carbon atoms, or a substituted or unsubstituted aryl group having 6 to 50 ring carbon atoms;

when a plurality of $R_{801}$ are present, the plurality of $R_{801}$ are mutually the same or different;

when a plurality of $R_{802}$ are present, the plurality of $R_{802}$ are mutually the same or different; and when a plurality of $R_{803}$ are present, the plurality of $R_{803}$ are mutually the same or different.

In an exemplary embodiment, at least one combination of adjacent two or more of $R_{401}$ to $R_{411}$ in the compound represented by the formula (42) are mutually bonded to form a substituted or unsubstituted monocyclic ring, or mutually bonded to form a substituted or unsubstituted fused ring. This exemplary embodiment will be described in detail below as a compound represented by a formula (45) below.

Compound Represented by Formula (45)

The compound represented by the formula (45) will be described below.

[Formula 275]

(45)

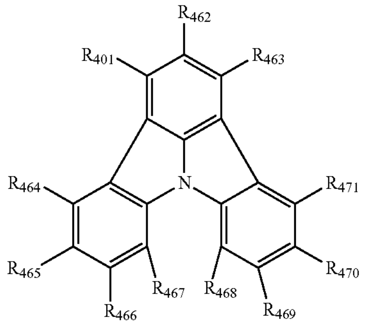

In the formula (45):

two or more of combinations selected from the group consisting of a combination of $R_{461}$ and $R_{462}$, a combination of $R_{462}$ and $R_{463}$, a combination of $R_{464}$ and $R_{465}$, a combination of $R_{465}$ and $R_{466}$, a combination of $R_{466}$ and $R_{467}$, a combination of $R_{468}$ and $R_{469}$, a combination of $R_{469}$ and $R_{470}$, and a combination of $R_{470}$ and $R_{471}$ are mutually bonded to form a substituted or unsubstituted monocyclic ring or mutually bonded to form a substituted or unsubstituted fused ring;

the combination of $R_{461}$ and $R_{462}$ and the combination of $R_{462}$ and $R_{463}$;

the combination of $R_{464}$ and $R_{465}$ and the combination of $R_{465}$ and $R_{466}$;

the combination of $R_{465}$ and $R_{466}$ and the combination of $R_{466}$ and $R_{467}$;

the combination of $R_{468}$ and $R_{469}$ and the combination of $R_{469}$ and $R_{470}$; and the combination of $R_{469}$ and $R_{470}$ and the combination of $R_{470}$ and $R_{471}$ do not form a ring at the same time;

the two or more rings formed by $R_{461}$ to $R_{471}$ are mutually the same or different; and $R_{461}$ to $R_{471}$ forming neither the monocyclic ring nor the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a group represented by $—N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms.

In the formula (45), $R_n$ and $R_{n+1}$ (n being an integer selected from 461, 462, 464 to 466, and 468 to 470) are mutually bonded to form a substituted or unsubstituted monocyclic ring or fused ring together with two ring-forming carbon atoms bonded to $R_n$ and $R_{n+1}$.

The ring is preferably formed of atoms selected from the group consisting of a carbon atom, an oxygen atom, a sulfur atom, and a nitrogen atom, and is made of preferably 3 to 7 atoms, more preferably 5 or 6 atoms.

The number of the above cyclic structures in the compound represented by the formula (45) is, for instance, 2, 3, or 4.

The two or more of the cyclic structures may be present on the same benzene ring on the basic skeleton represented by the formula (45) or may be present on different benzene rings.

For instance, when three cyclic structures are present, each of the cyclic structures may be present on the corresponding one of the three benzene rings of the formula (45).

Examples of the above cyclic structures in the compound represented by the formula (45) include structures represented by formulae (451) to (460) below.

[Formula 276]

(451)

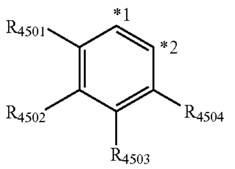

(452)

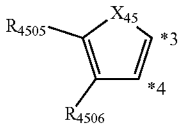

(453)

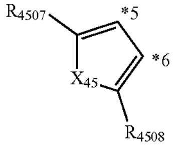

(454)

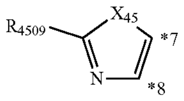

(455)

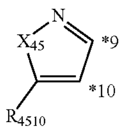

(456)

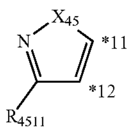

(457)

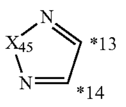

In the formulae (451) to (457):

each combination of *1 and *2, *3 and *4, *5 and *6, *7 and *8, *9 and *10, *11 and *12, and *13 and *14 represents the two ring-forming carbon atoms bonded to $R_n$ and $R_n+_1$;

the ring-forming carbon atom bonded to $R_n$ may be any one of the two ring-forming carbon atoms represented by *1 and *2, *3 and *4, *5 and *6, *7 and *8, *9 and *10, *11 and *12, and *13 and *14;

$X_{45}$ is $C(R_{4512})(R_{4513})$, $NR_{4514}$, an oxygen atom, or a sulfur atom;

at least one combination of adjacent two or more of $R_{4501}$ to $R_{4506}$ and $R_{4512}$ to $R_{4513}$ are mutually bonded to form a substituted or unsubstituted monocyclic ring, mutually bonded to form a substituted or unsubstituted fused ring, or not mutually bonded; and $R_{4501}$ to $R_{4514}$ forming neither the monocyclic ring nor the fused ring each independently represent the same as $R_{461}$ to $R_{471}$ in the formula (45).

[Formula 277]

(458)

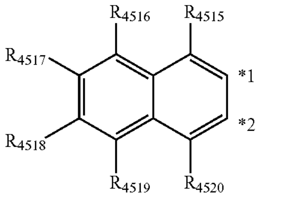

(459)

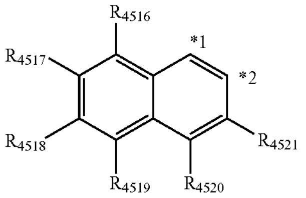

(460)

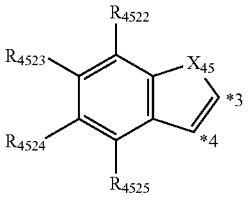

In the formulae (458) to (460):

each combination of *1 and *2, and *3 and *4 represents the two ring-forming carbon atoms bonded to $R_n$ and $R_n+1$;

the ring-forming carbon atom bonded to $R_n$ may be any one of the two ring-forming carbon atoms represented by *1 and *2, or *3 and *4;

$X_{45}$ is $C(R_{4512})(R_{4513})$, $NR_{4514}$, an oxygen atom, or a sulfur atom;

at least one combination of adjacent two or more of $R_{4512}$ to $R_{4513}$ and $R_{4515}$ to $R_{4525}$ are mutually bonded to form a substituted or unsubstituted monocyclic ring, mutually bonded to form a substituted or unsubstituted fused ring, or not mutually bonded; and $R_{4512}$ to $R_{4513}$, $R_{4515}$ to $R_{4521}$ and $R_{4522}$ to $R_{4525}$ forming neither the monocyclic ring nor the fused ring, and $R_{4514}$ each independently represent the same as $R_{461}$ to $R_{471}$ in the formula (45).

In the formula (45), preferably, at least one of $R_{462}$, $R_{464}$, $R_{465}$, $R_{470}$ or $R_{471}$ (preferably, at least one of $R_{462}$, $R_{465}$ or $R_{470}$, more preferably $R_{462}$) is a group forming no cyclic structure.

(i) A substituent, if present, for a cyclic structure formed by $R_n$ and $R_n+1$ in the formula (45), (ii) $R_{461}$ to $R_{471}$ forming no cyclic structure in the formula (45), and (iii) $R_{4501}$ to $R_{4514}$, $R_{4515}$ to $R_{4525}$ in the formulae (451) to (460) are preferably each independently any one of groups selected from the group consisting of a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —N($R_{906}$)($R_{907}$), a substituted or unsubstituted aryl group having 6 to 50 ring carbon atoms, a substituted or unsubstituted heterocyclic group having 5 to 50 ring atoms, or groups represented by formulae (461) to (464) below.

[Formula 278]

(461)

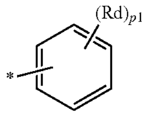

(462)

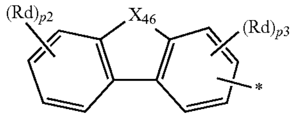

(463)

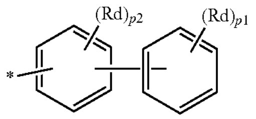

(464)

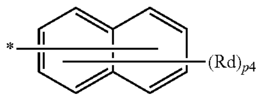

In the formulae (461) to (464):

$R_d$ is each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

$X_{46}$ is C($R_{801}$)($R_{802}$), $NR_{803}$, an oxygen atom, or a sulfur atom;

$R_{801}$, $R_{802}$, and $R_{803}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms, a substituted or unsubstituted alkyl group having 1 to 50 carbon atoms, or a substituted or unsubstituted aryl group having 6 to 50 ring carbon atoms;

when a plurality of $R_{801}$ are present, the plurality of $R_{801}$ are mutually the same or different;

when a plurality of $R_{802}$ are present, the plurality of $R_{802}$ are mutually the same or different;

when a plurality of $R_{803}$ are present, the plurality of $R_{803}$ are mutually the same or different;

p1 is 5;

p2 is 4;

p3 is 3;

p4 is 7; and

* in the formulae (461) to (464) each independently represent a bonding position to a cyclic structure.

In the first emitting compound, the second emitting compound, and the third emitting compound, $R_{901}$ to $R_{907}$ are as defined above.

In an exemplary embodiment, the compound represented by the formula (45) is represented by one of the following formulae (45-1) to (45-6).

[Formula 279]

(45-1)

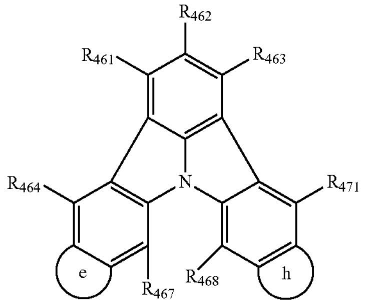

(45-2)

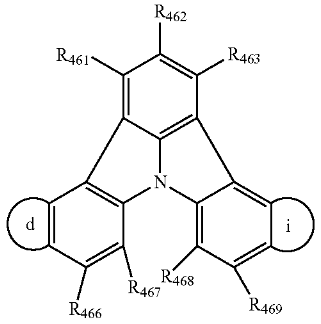

(45-3)

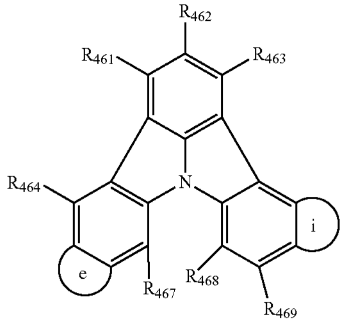

-continued

[Formula 280]

(45-4)

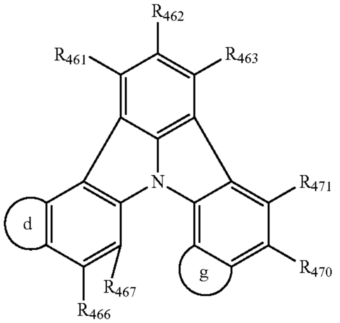

(45-5)

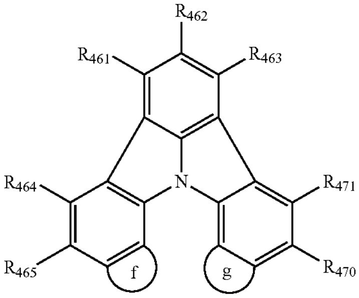

(45-6)

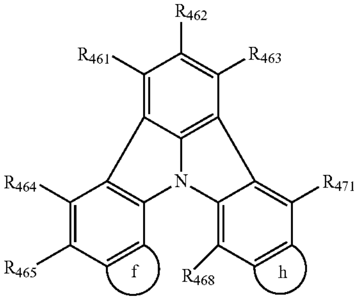

In the formulae (45-1) to (45-6):

rings d to i are each independently a substituted or unsubstituted monocyclic ring or a substituted or unsubstituted fused ring; and $R_{461}$ to $R_{471}$ each independently represent the same as $R_{461}$ to $R_{471}$ in the formula (45).

In an exemplary embodiment, the compound represented by the formula (45) is represented by one of the following formulae (45-7) to (45-12).

[Formula 281]

(45-7)

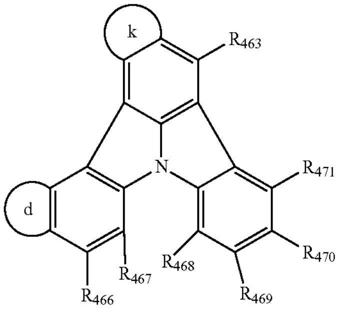

-continued (45-8)

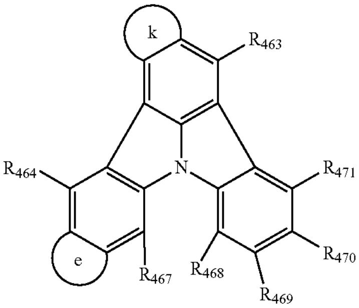

(45-9)

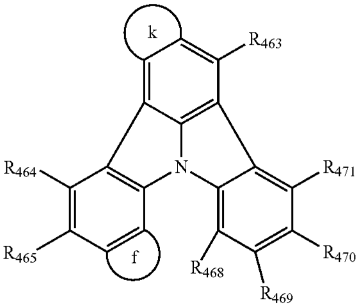

[Formula 282]

(45-10)

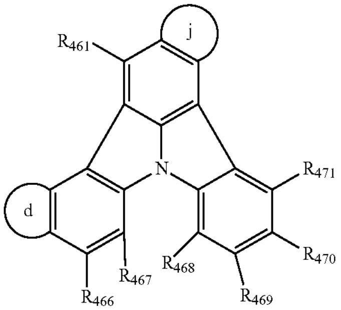

(45-11)

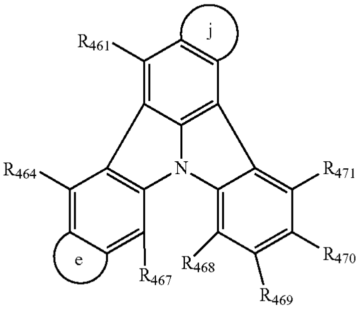

(45-12)

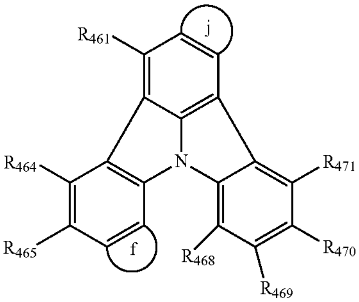

In the formulae (45-7) to (45-12):

rings d to f, k and j are each independently a substituted or unsubstituted monocyclic ring or a substituted or unsubstituted fused ring; and $R_{461}$ to $R_{471}$ each independently represent the same as $R_{461}$ to $R_{471}$ in the formula (45).

In an exemplary embodiment, the compound represented by the formula (45) is represented by one of the following formulae (45-13) to (45-21).

[Formula 283]

(45-13)

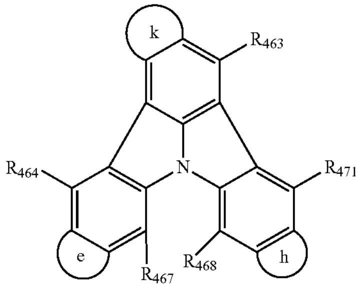

(45-14)

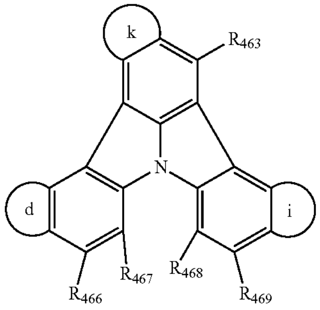

(45-15)

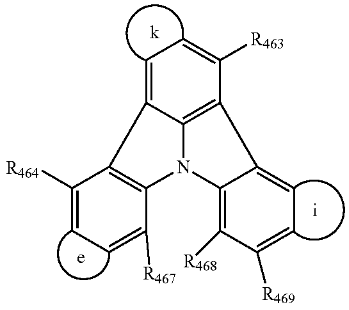

[Formula 284]

(45-16)

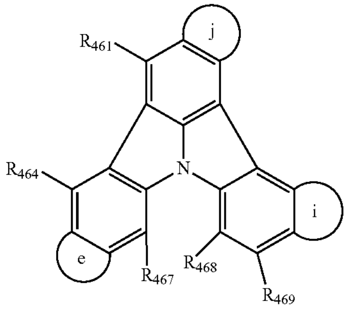

-continued (45-17)

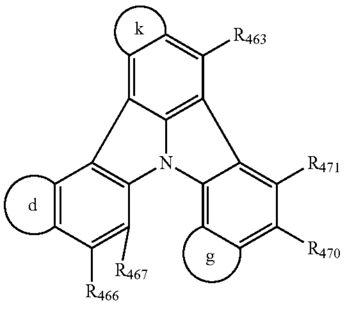

(45-18)

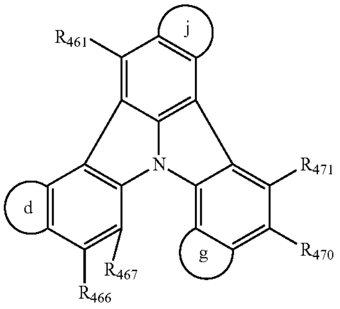

[Formula 285]

(45-19)

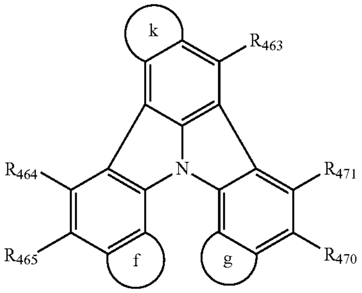

(45-20)

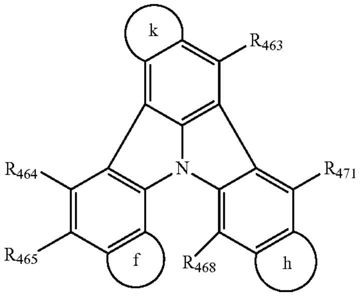

(45-21)

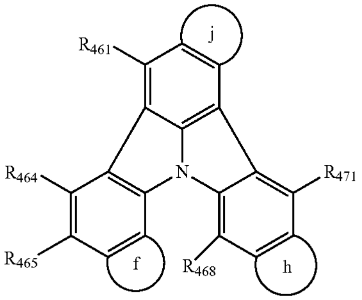

In the formulae (45-13) to (45-21):

rings d to k are each independently a substituted or unsubstituted monocyclic ring or a substituted or unsubstituted fused ring; and $R_{461}$ to $R_{471}$ each independently represent the same as $R_{461}$ to $R_{471}$ in the formula (45).

When the ring g or the ring h further has a substituent, examples of the substituent include a substituted or unsubstituted alkyl group having 1 to 50 carbon atoms, a substituted or unsubstituted aryl group having 6 to 50 ring carbon atoms, a group represented by the formula (461), a group represented by the formula (463), and a group represented by the formula (464).

In an exemplary embodiment, the compound represented by the formula (45) is represented by one of the following formulae (45-22) to (45-25).

[Formula 286]

(45-22)

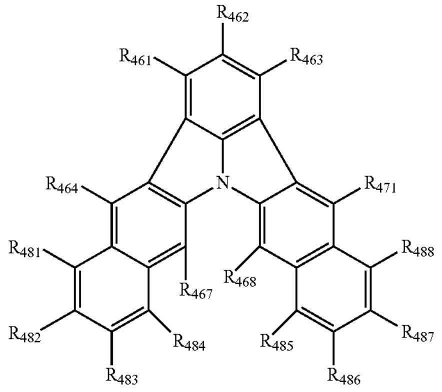

(45-23)

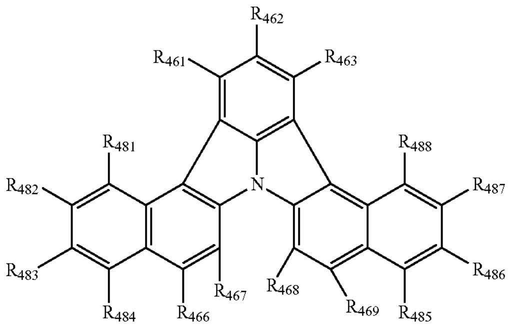

-continued (45-24)

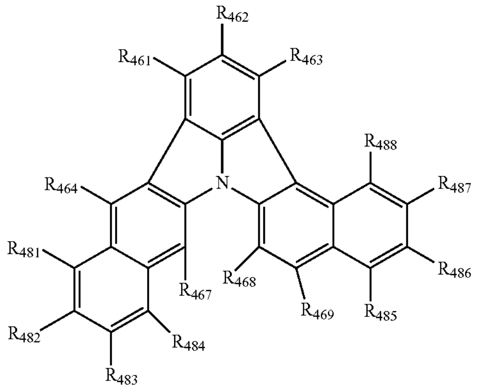

(45-25)

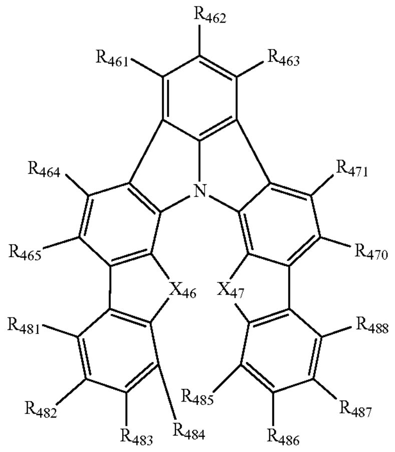

In the formulae (45-22) to (45-25):

$X_{46}$ and $X_{47}$ are each independently $C(R_{801})(R_{802})$, $NR_{803}$, an oxygen atom, or a sulfur atom;

$R_{461}$ to $R_{471}$ and $R_{481}$ to $R_{488}$ each independently represent the same as $R_{461}$ to $R_{471}$ in the formula (45);

$R_{801}$, $R_{802}$, and $R_{803}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms, a substituted or unsubstituted alkyl group having 1 to 50 carbon atoms, or a substituted or unsubstituted aryl group having 6 to 50 ring carbon atoms;

when a plurality of $R_{801}$ are present, the plurality of $R_{801}$ are mutually the same or different;

when a plurality of $R_{802}$ are present, the plurality of $R_{802}$ are mutually the same or different; and when a plurality of $R_{803}$ are present, the plurality of $R_{803}$ are mutually the same or different.

In an exemplary embodiment, the compound represented by the formula (45) is represented by a formula (45-26) below.

[Formula 287]

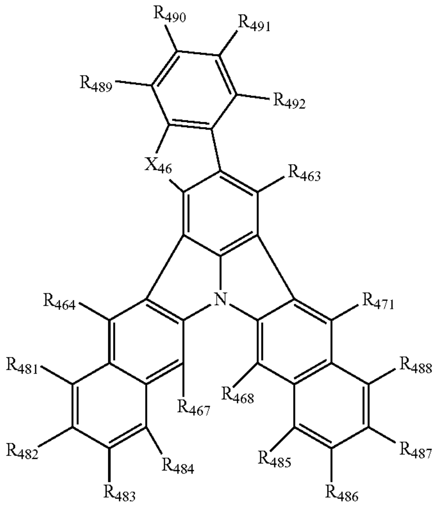

(45-26)

In the formula (45-26):

$X_{46}$ is $C(R_{801})(R_{802})$, $NR_{803}$, an oxygen atom, or a sulfur atom;

$R_{463}$, $R_{464}$, $R_{467}$, $R_{468}$, $R_{471}$, and $R_{481}$ to $R_{492}$ each independently represent the same as $R_{461}$ to $R_{471}$ in the formula (45);

$R_{801}$, $R_{802}$, and $R_{803}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms, a substituted or unsubstituted alkyl group having 1 to 50 carbon atoms, or a substituted or unsubstituted aryl group having 6 to 50 ring carbon atoms;

when a plurality of $R_{801}$ are present, the plurality of $R_{801}$ are mutually the same or different;

when a plurality of $R_{802}$ are present, the plurality of $R_{802}$ are mutually the same or different; and when a plurality of $R_{803}$ are present, the plurality of $R_{803}$ are mutually the same or different.

Specific Examples of Compound Represented by Formula (4)

Specific examples of the compound represented by the formula (4) include compounds shown below.

In the specific examples below, Ph represents a phenyl group, and D represents a deuterium atom.

[Formula 288]

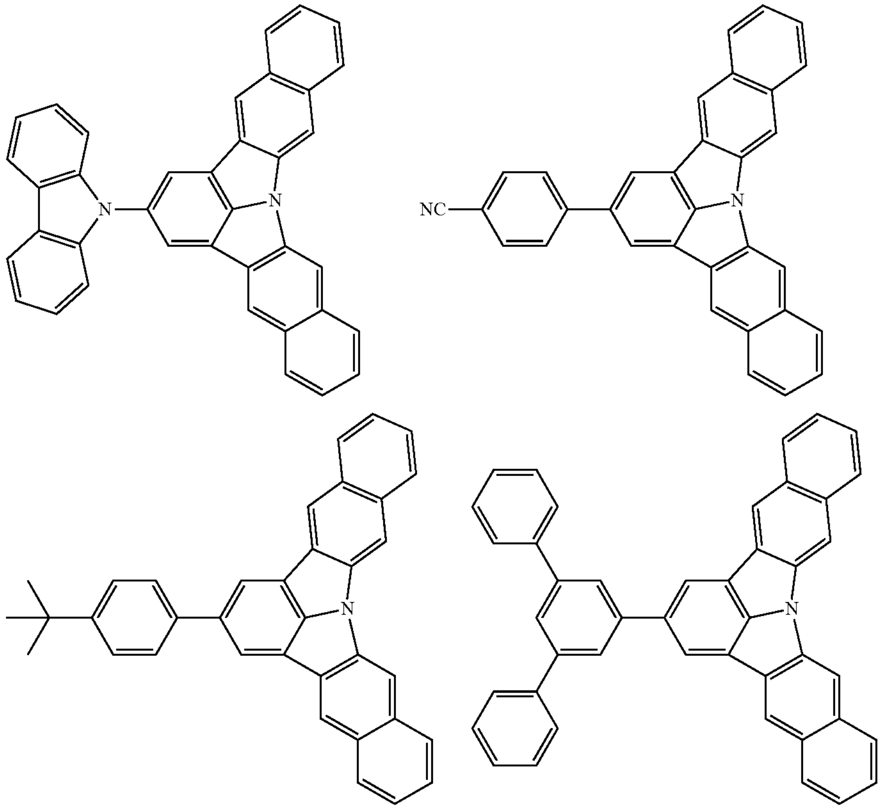

-continued
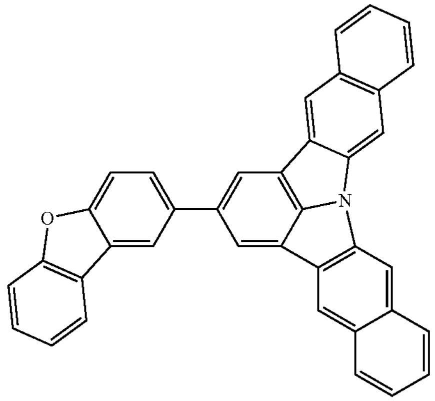
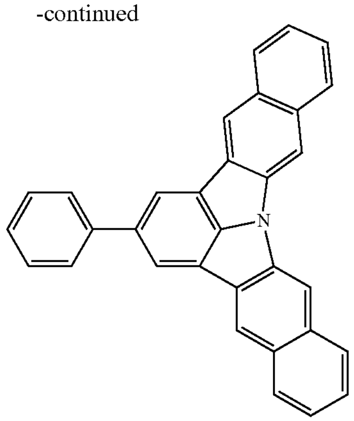
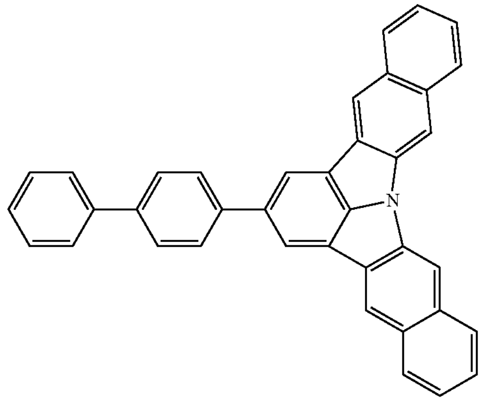
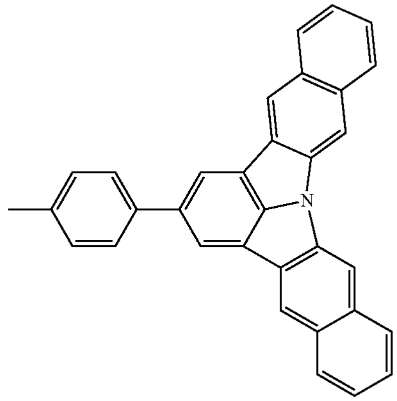
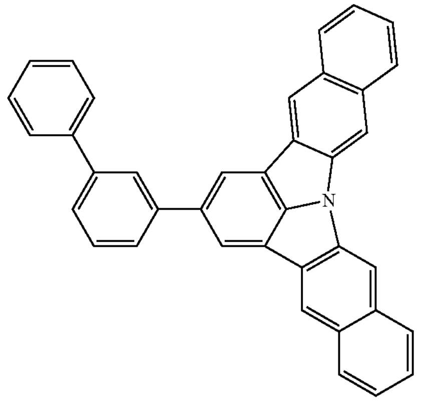
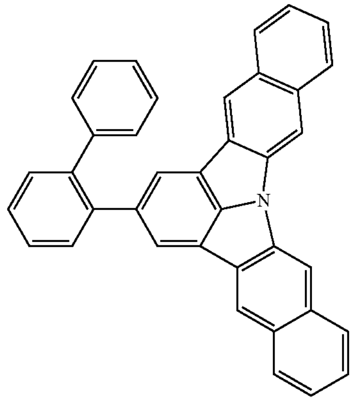
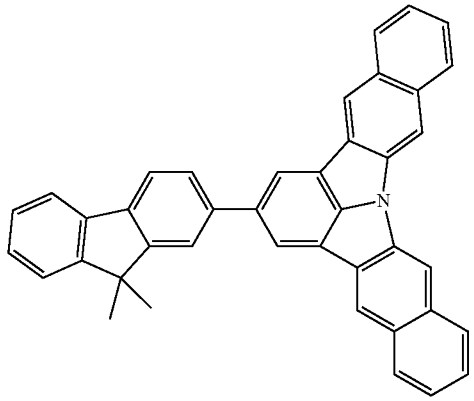
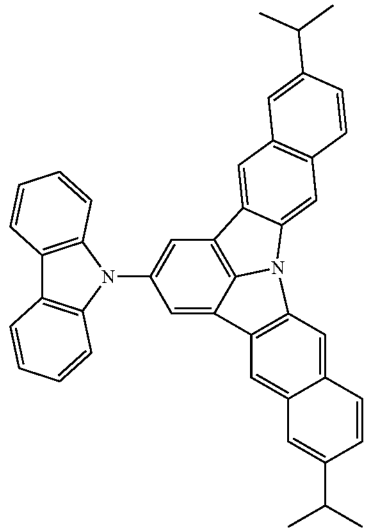

-continued
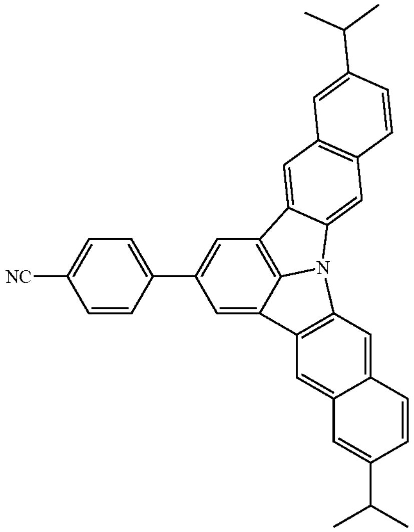
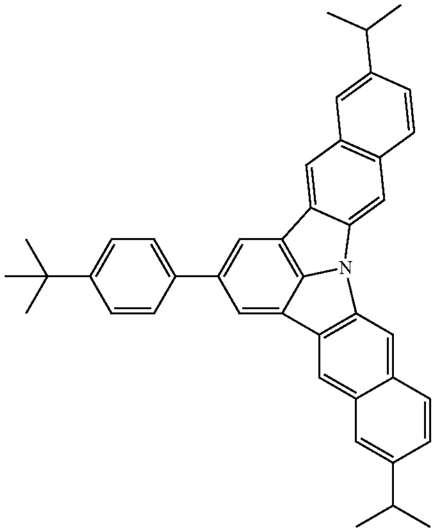
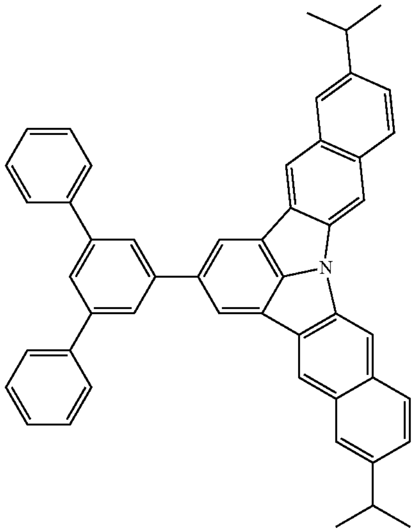
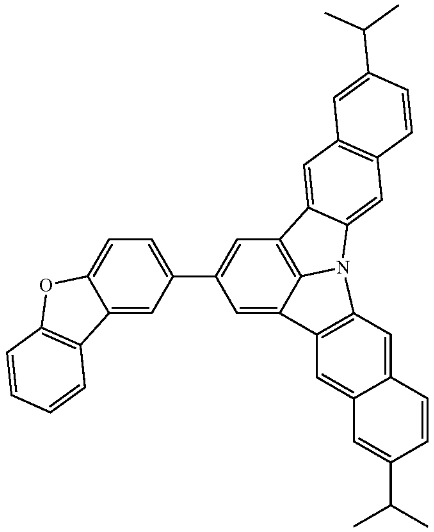
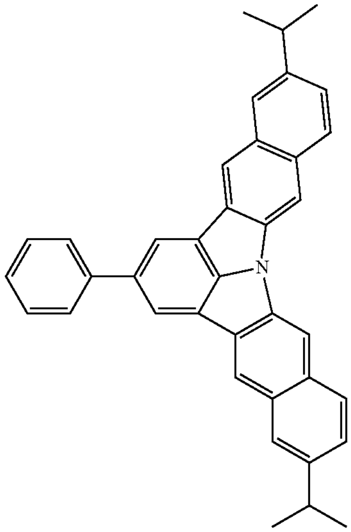
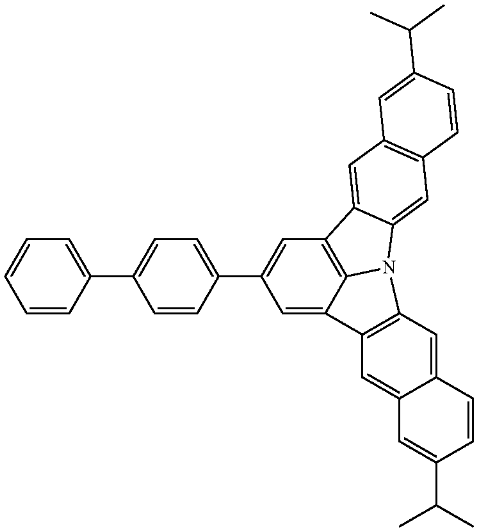

-continued
[Formula 289]
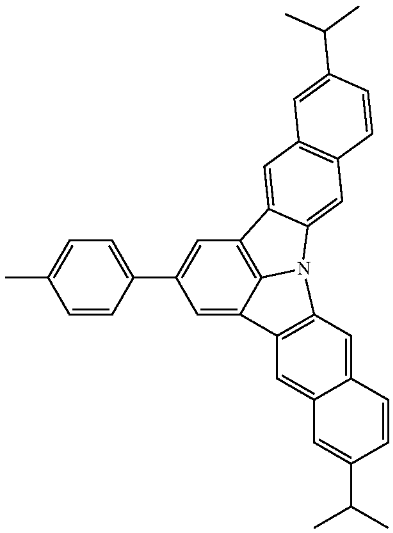
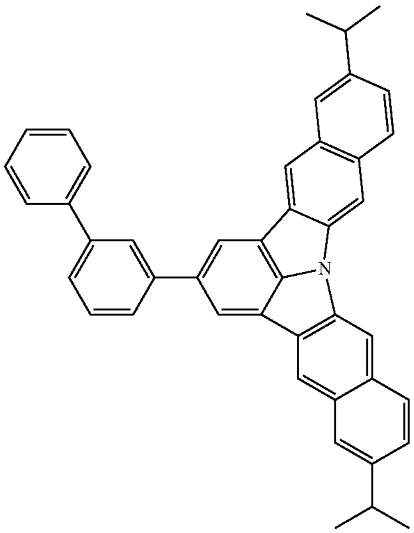
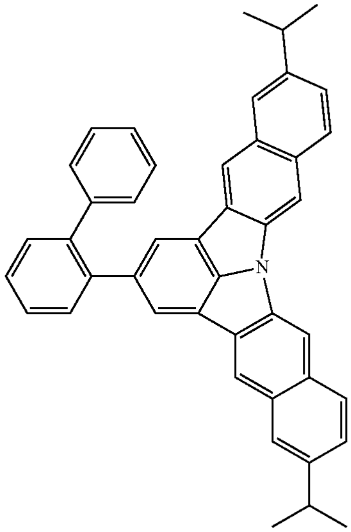
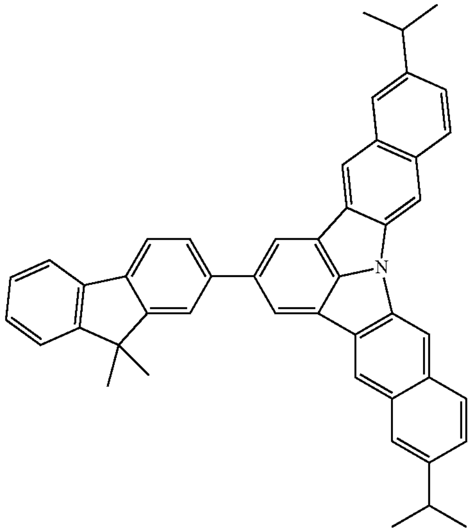
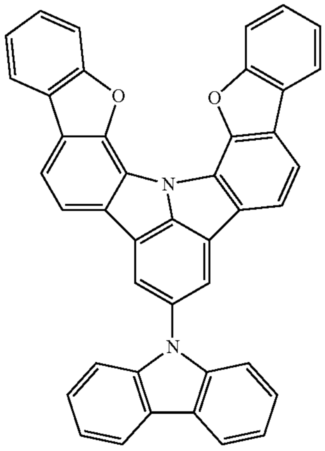
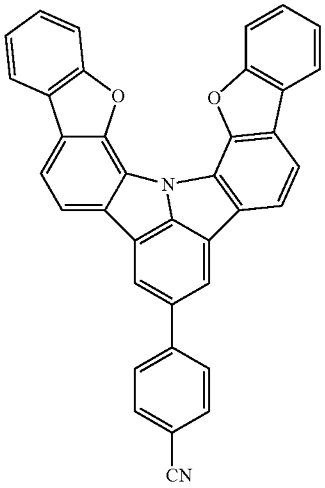
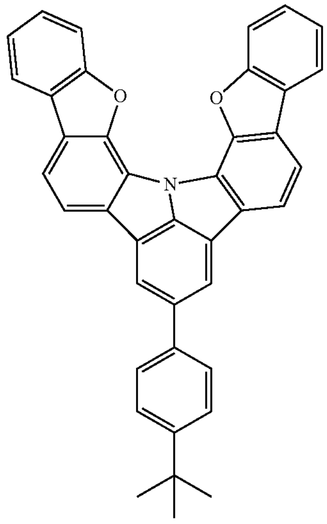

-continued
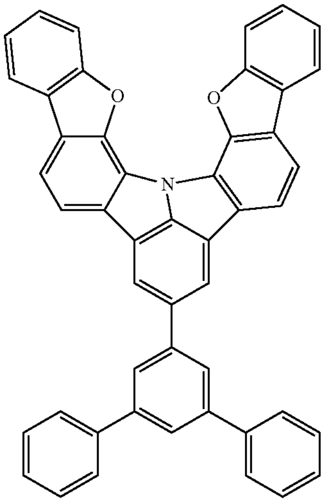
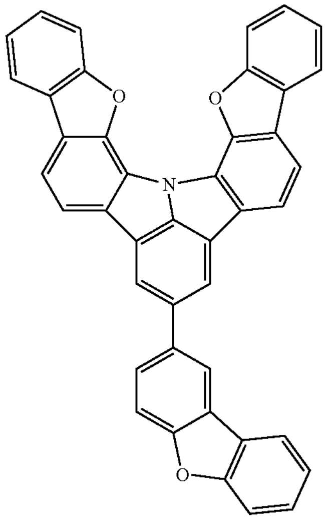
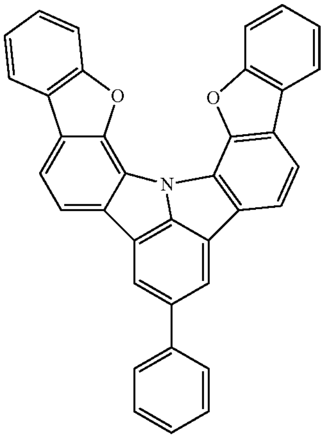
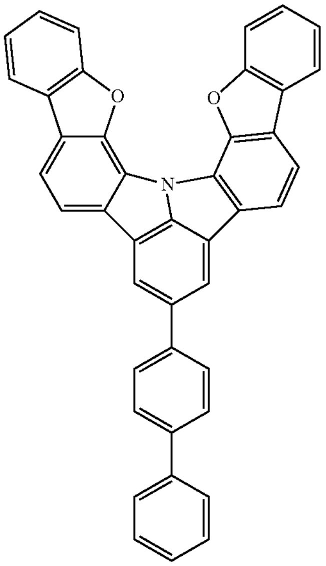
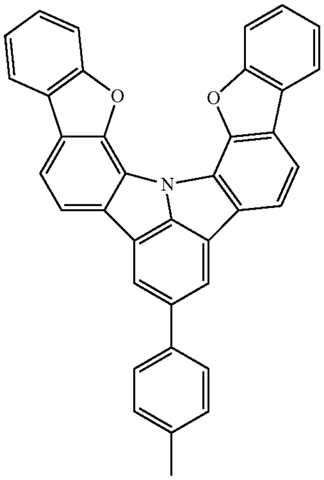
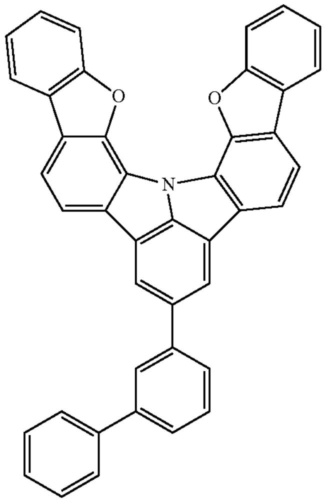
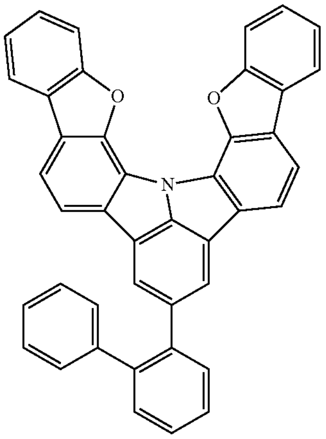
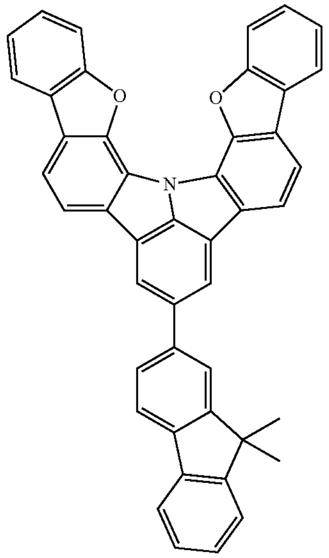

-continued
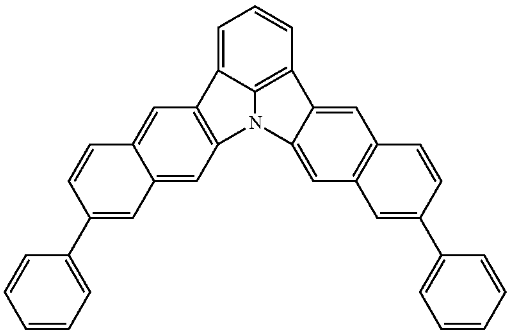
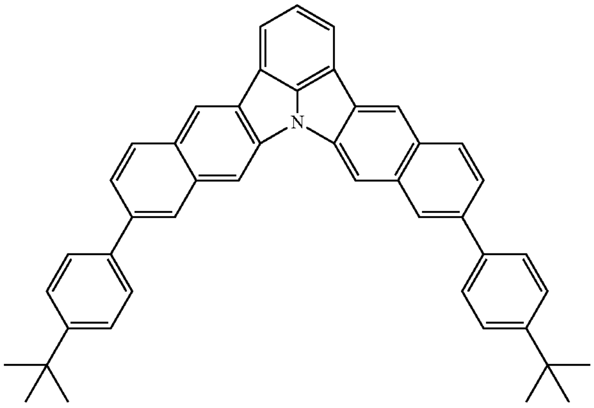
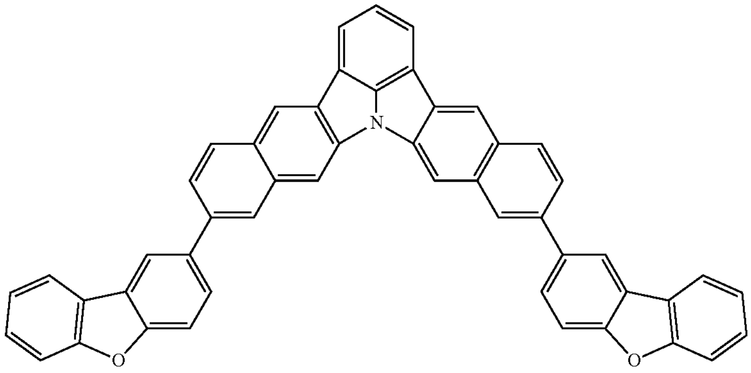
[Formula 290]
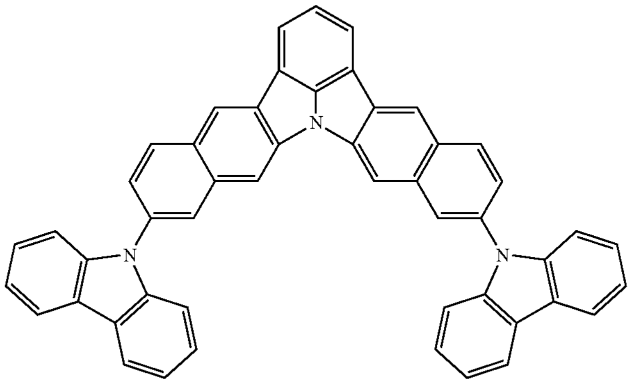
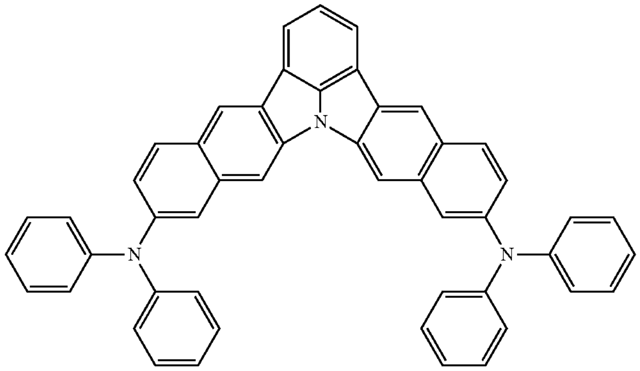

-continued
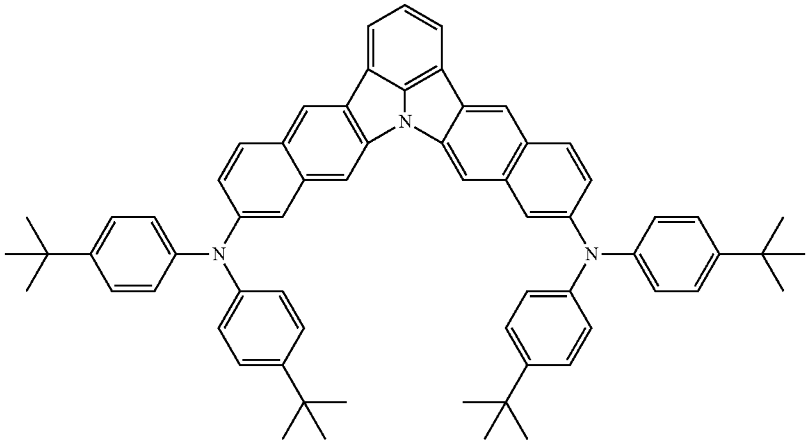
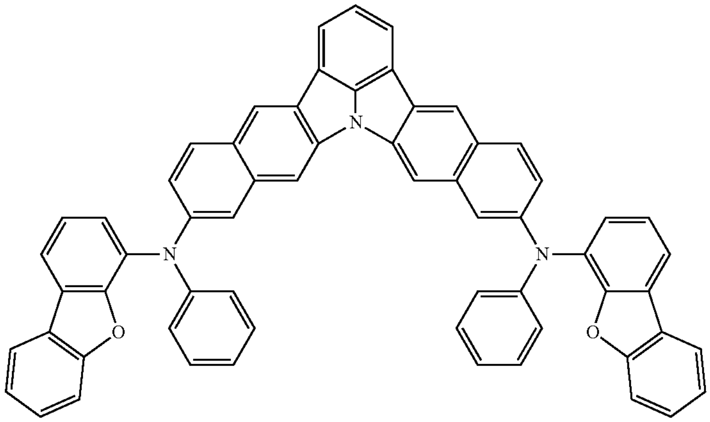
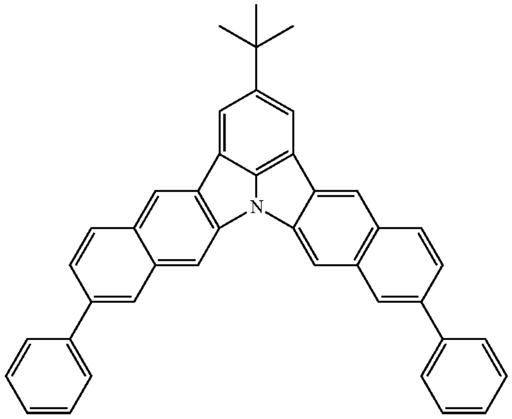
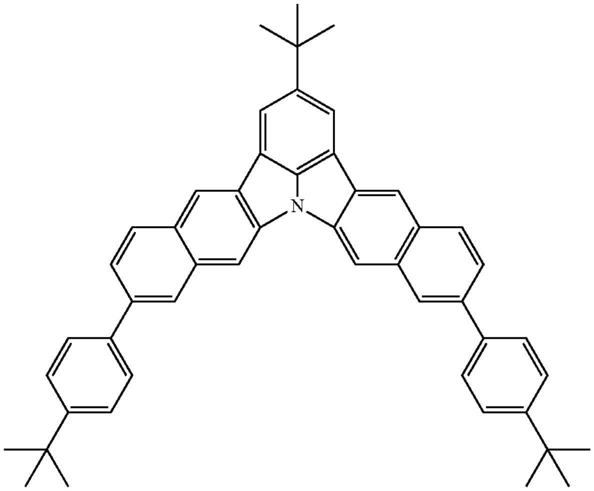

-continued
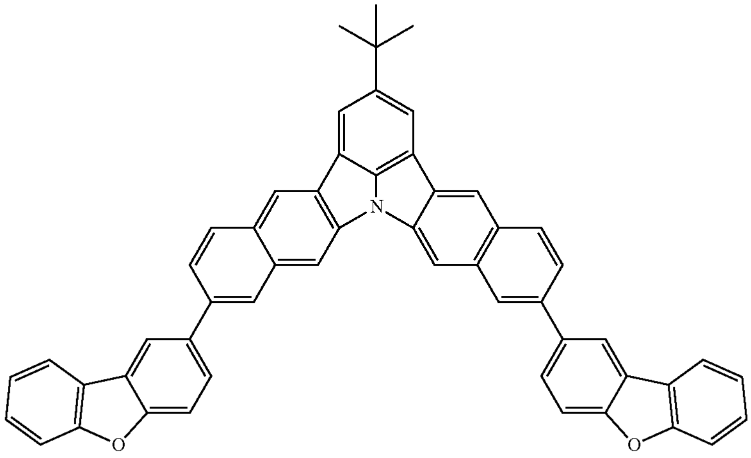
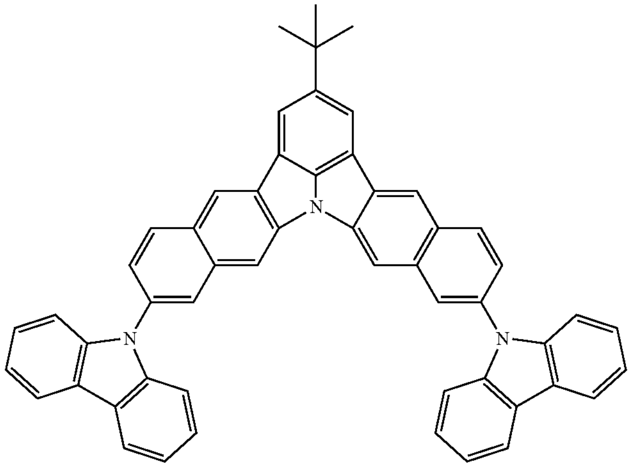
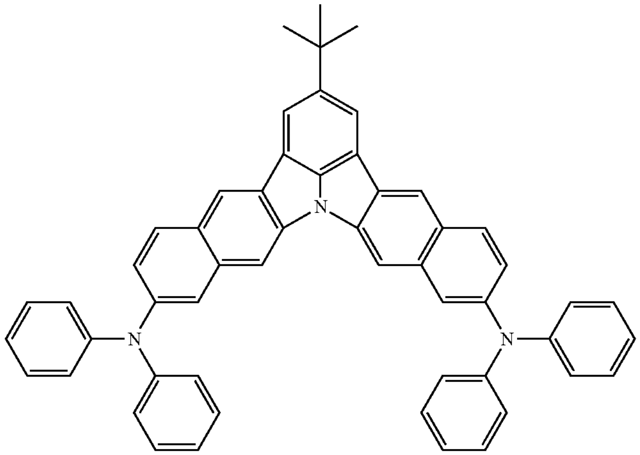

-continued
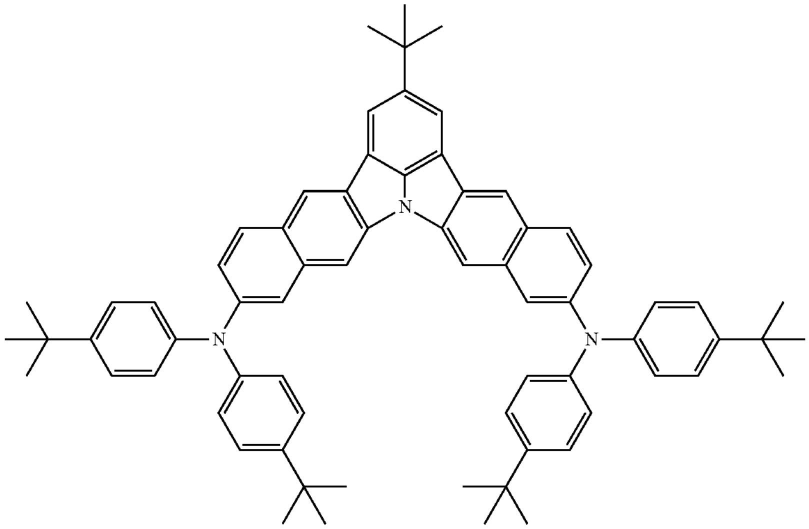
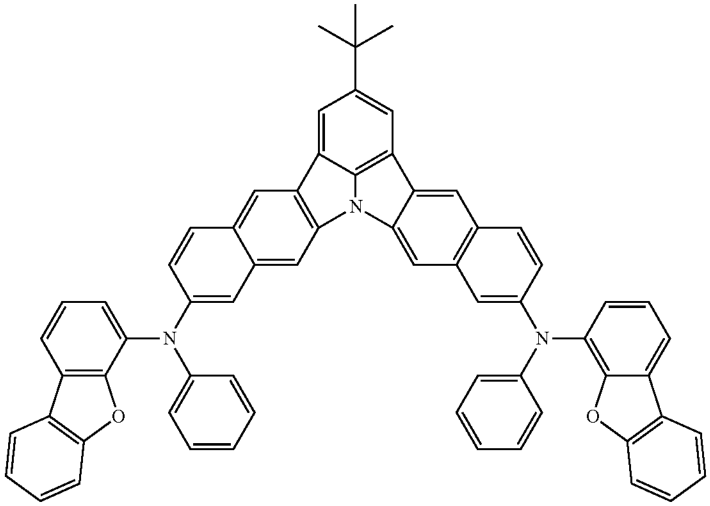
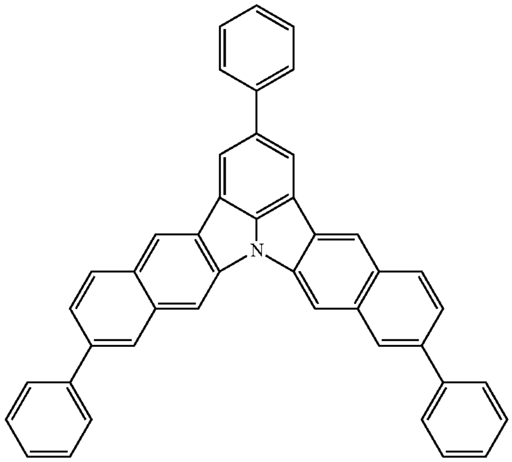
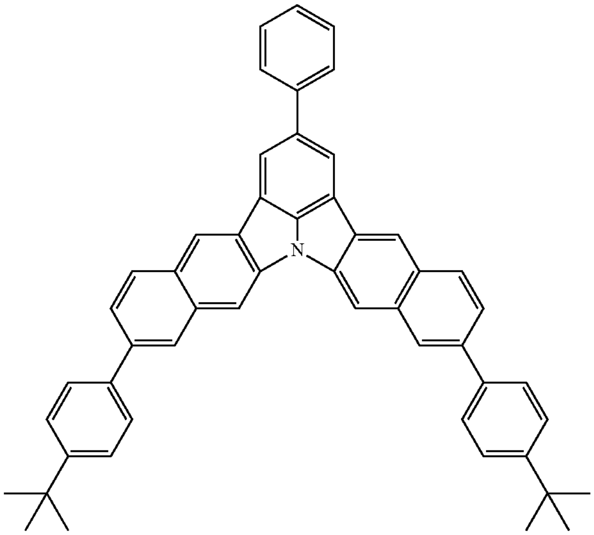

-continued
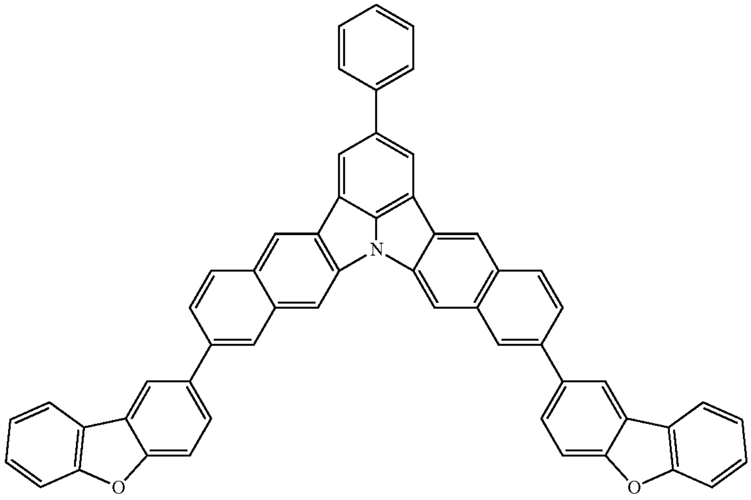
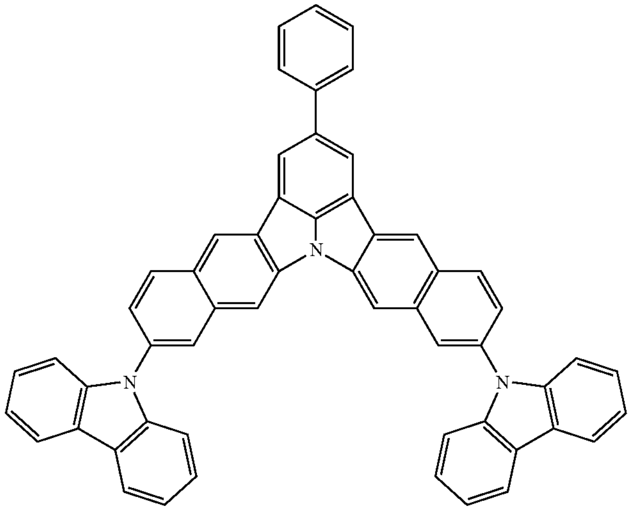
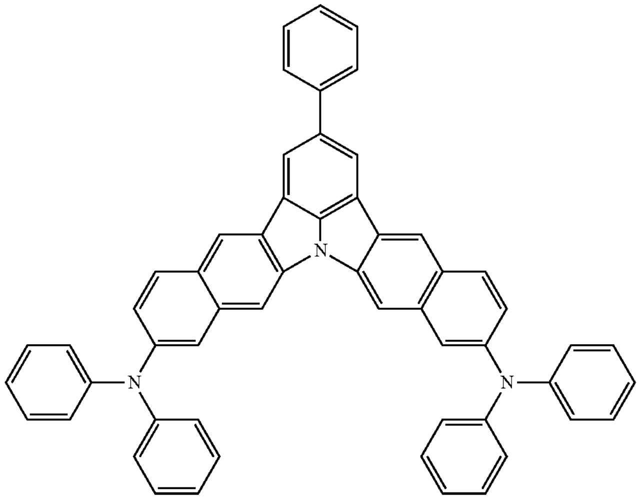

-continued
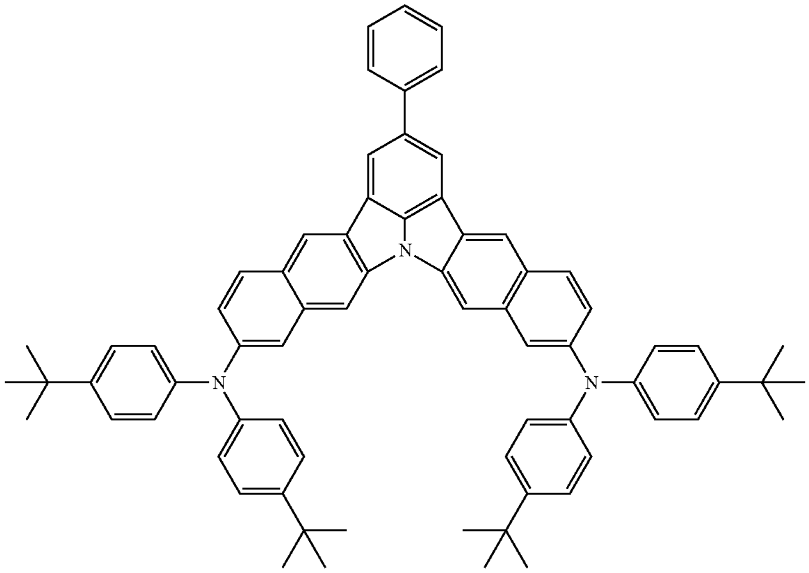
[Formula 291]
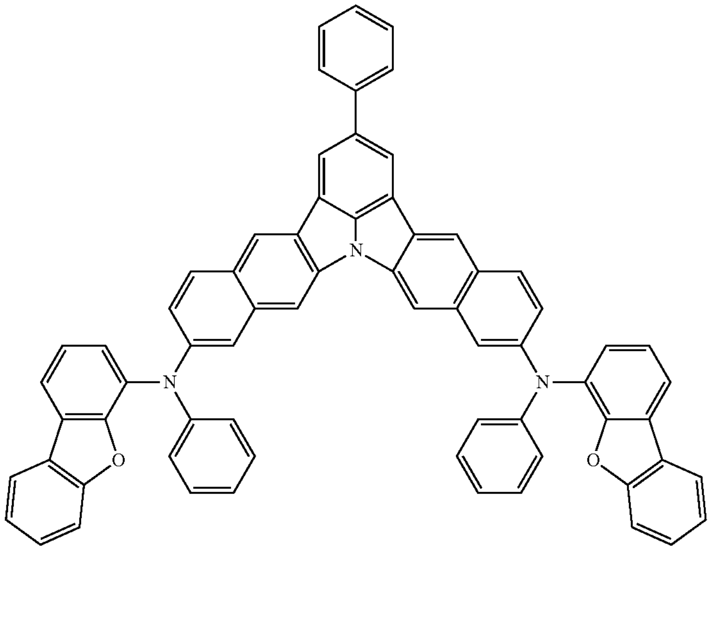

-continued
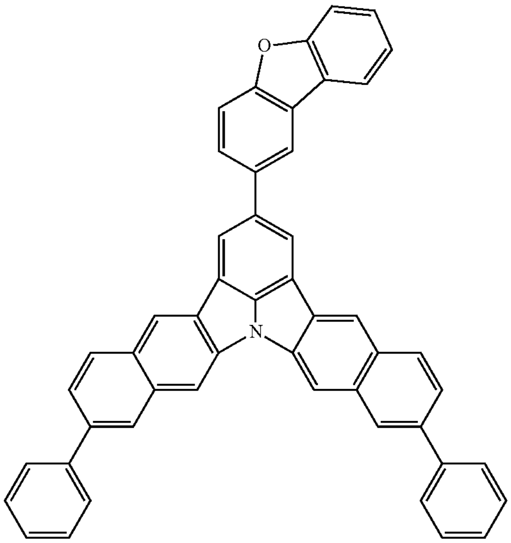
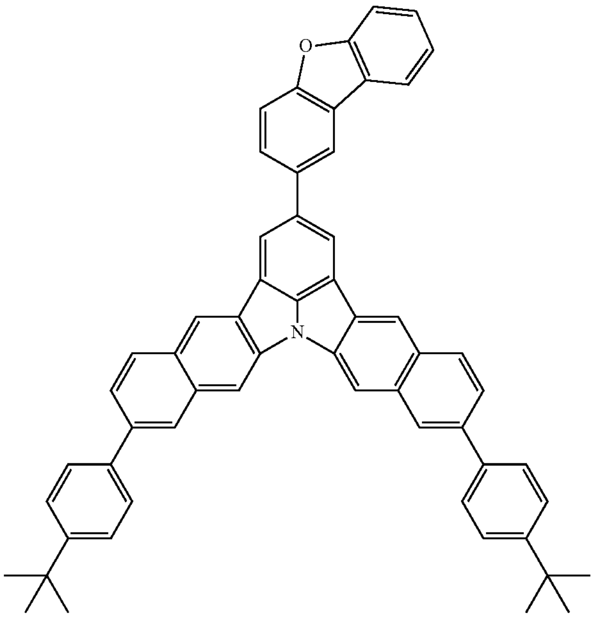
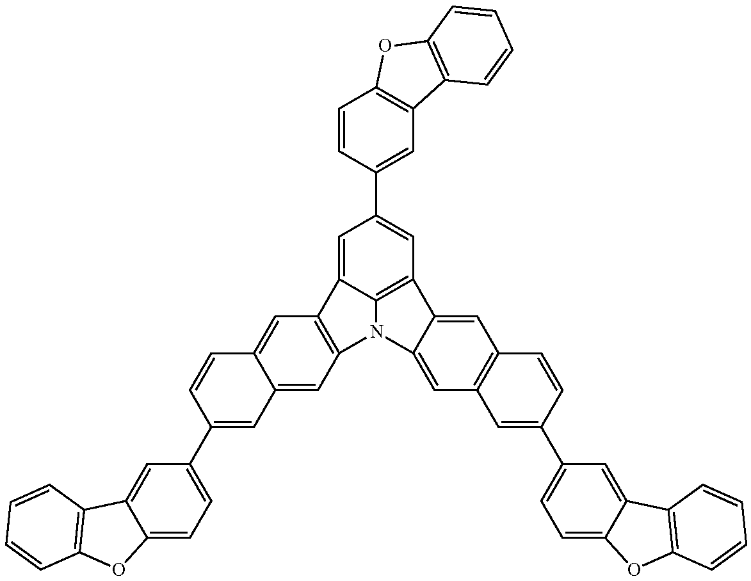

-continued
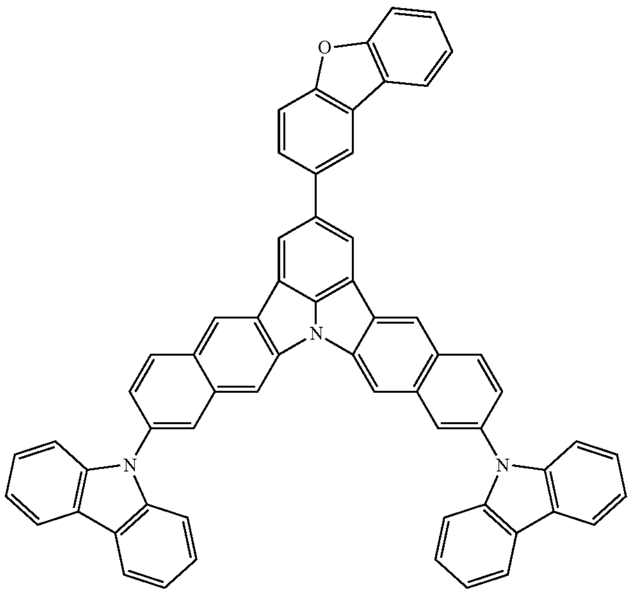
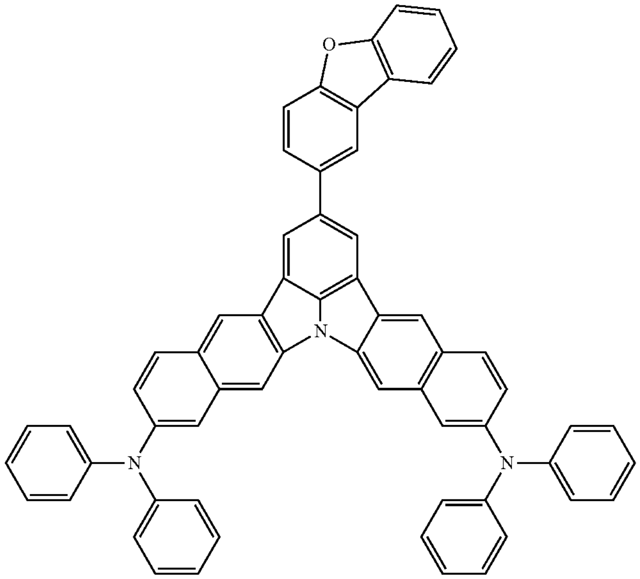

-continued
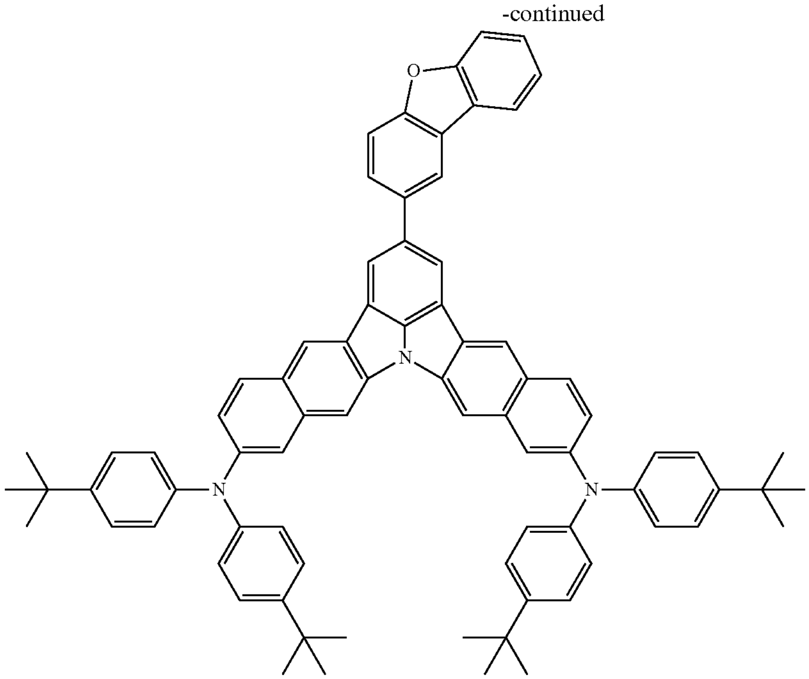
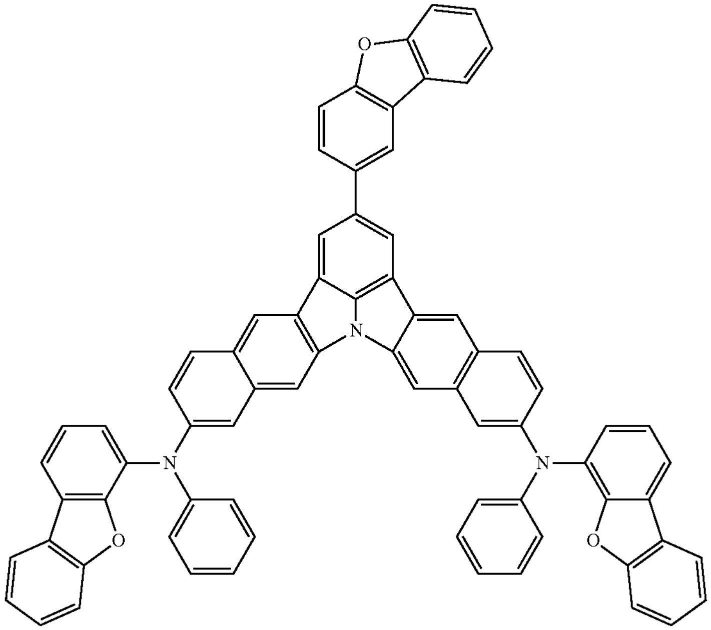

-continued
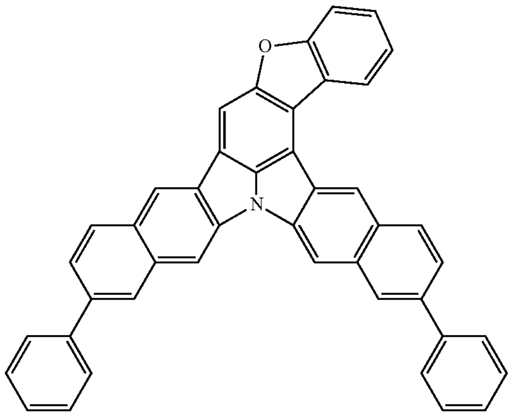
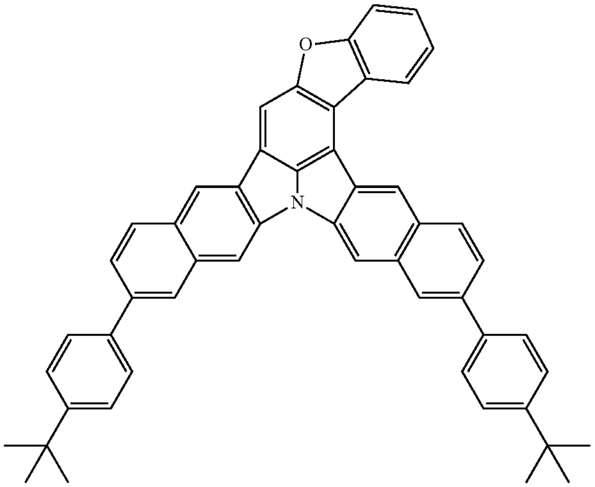
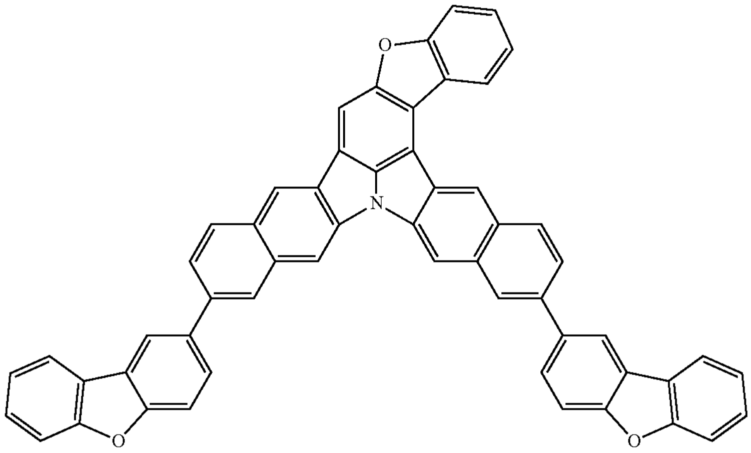
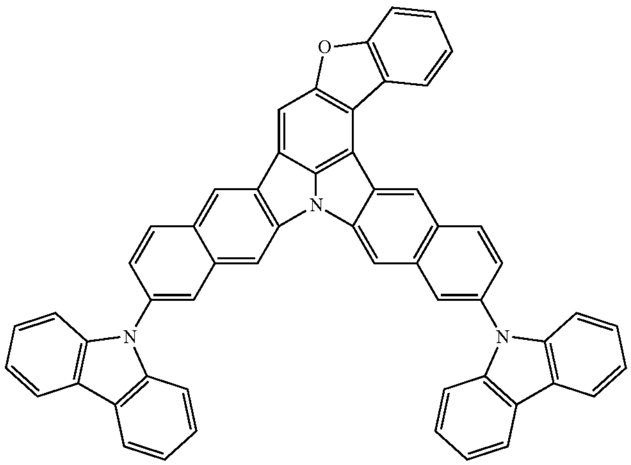

-continued
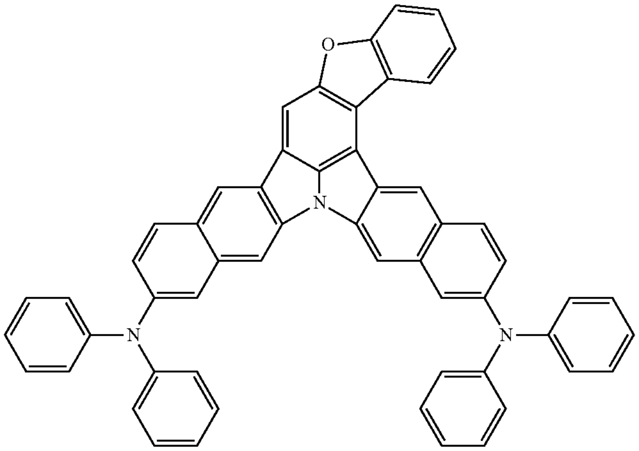
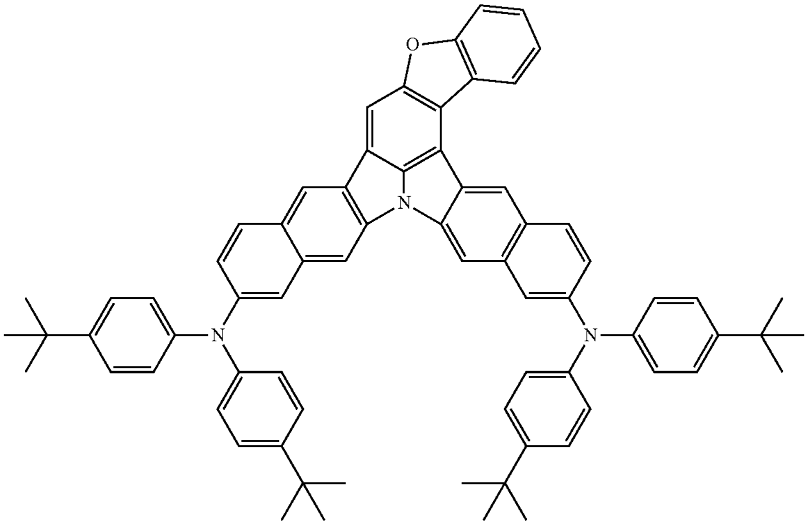
[Formula 292]
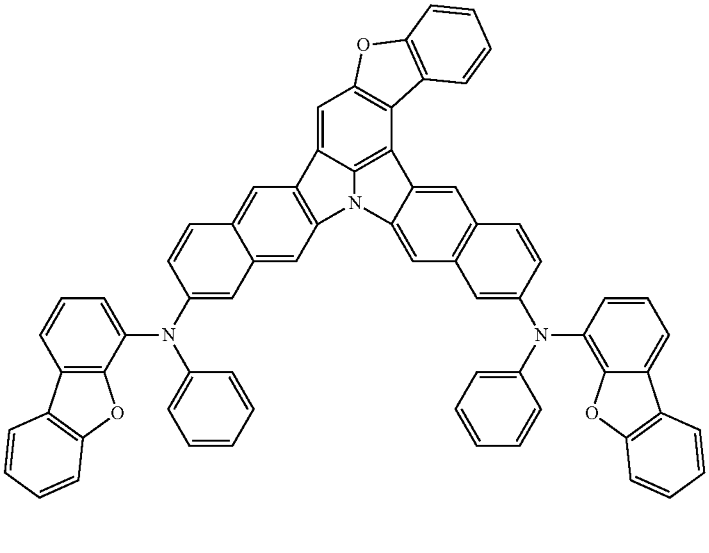

-continued
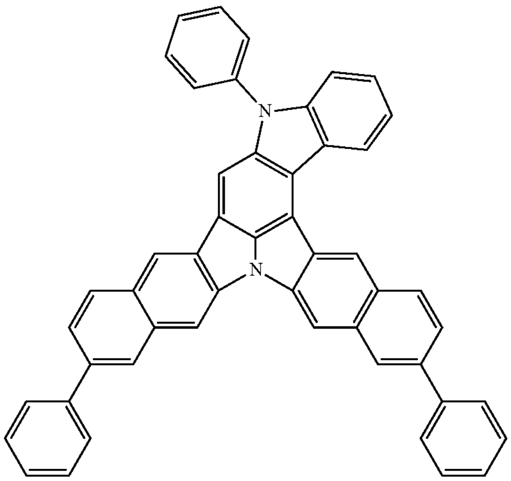
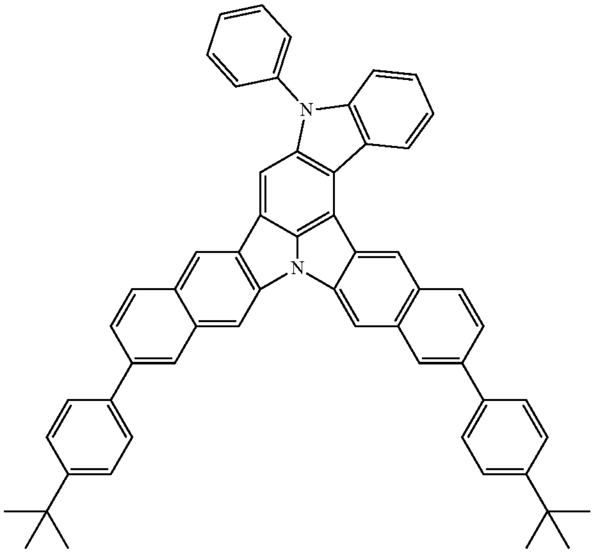
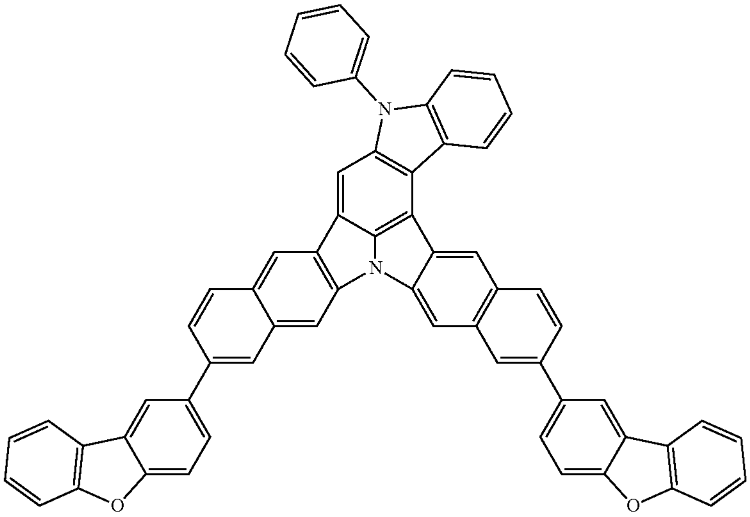
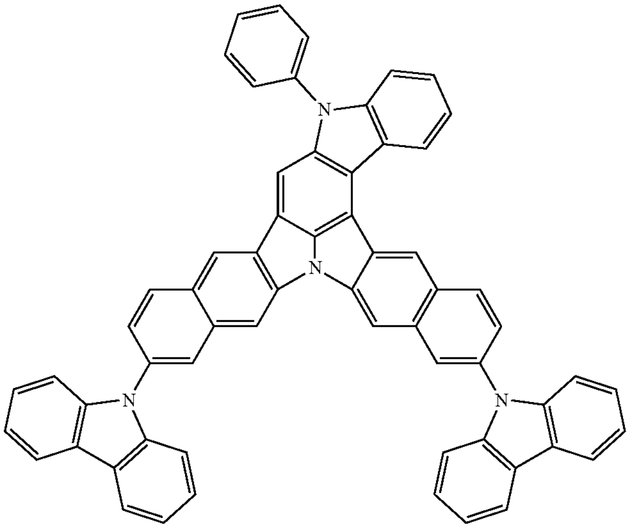

-continued
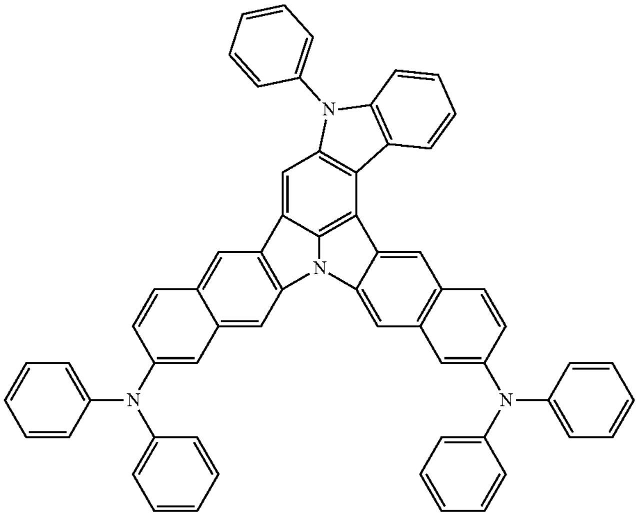
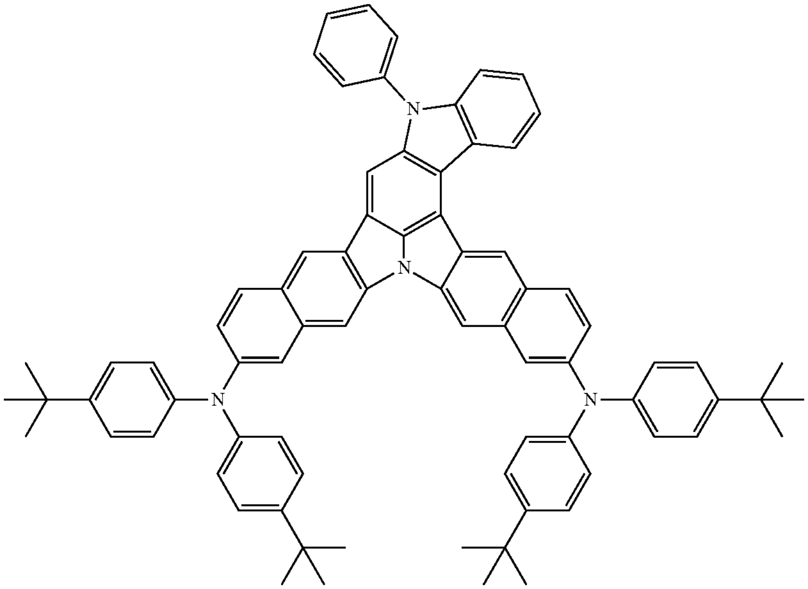
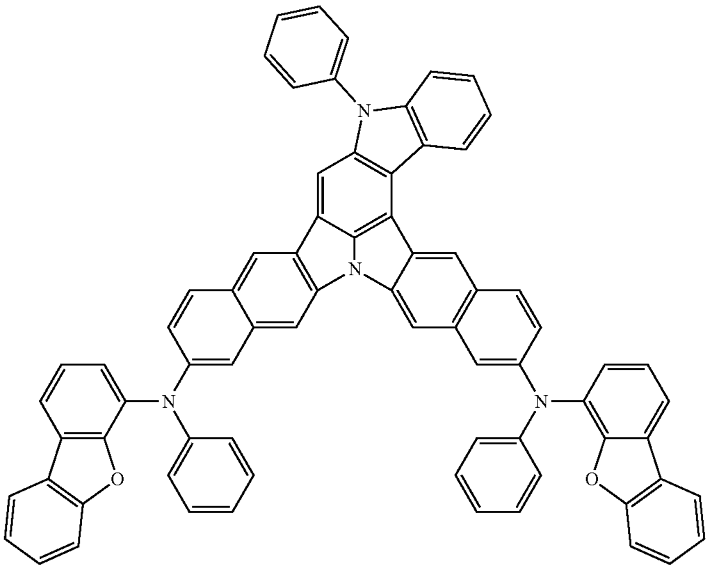

-continued
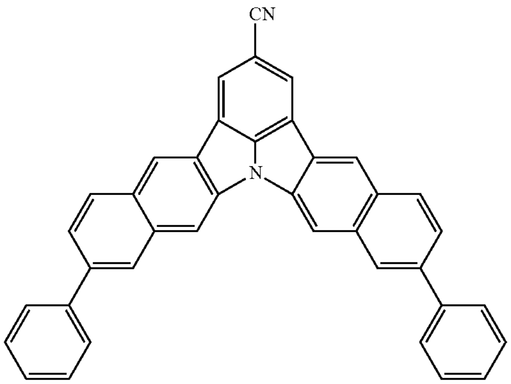
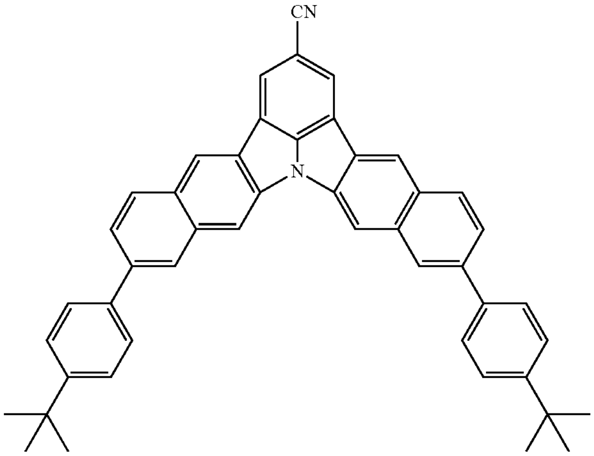
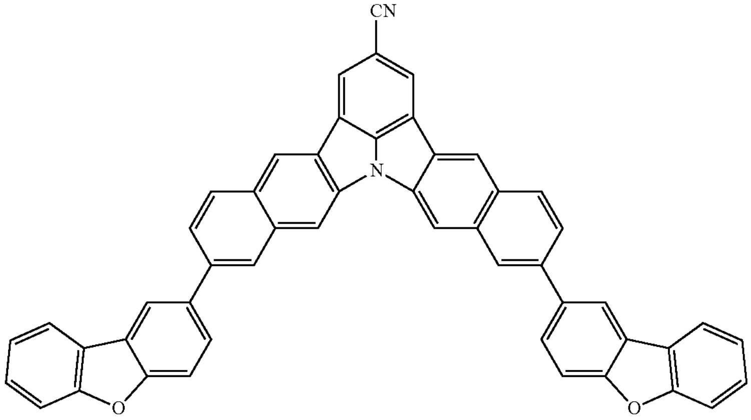
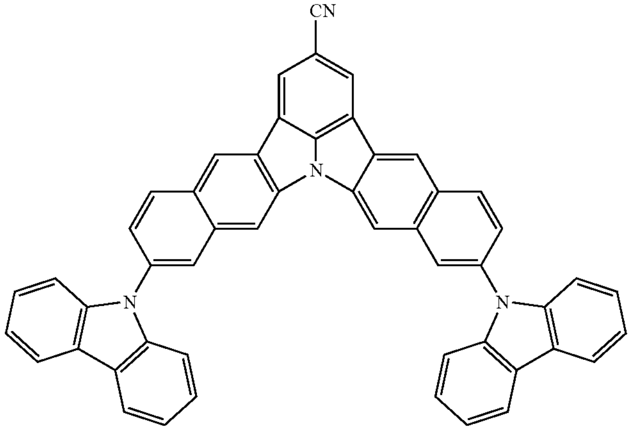
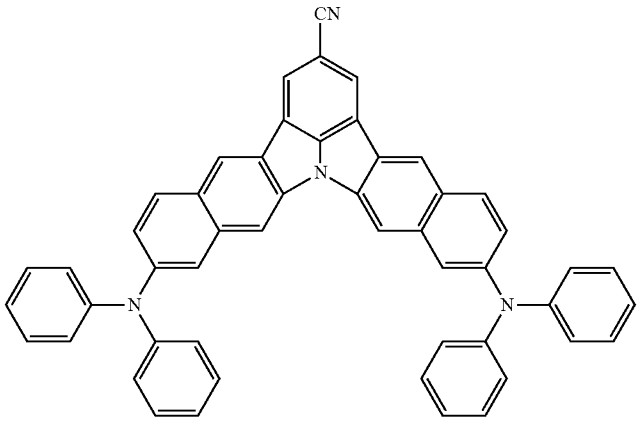

-continued
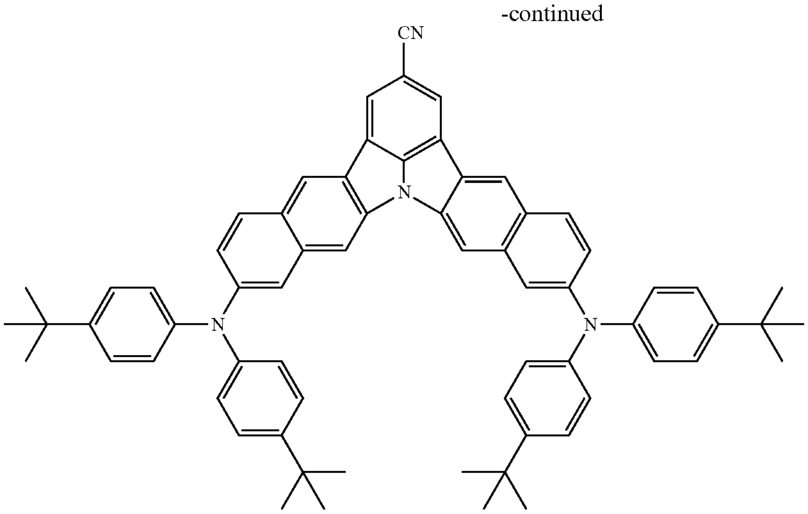
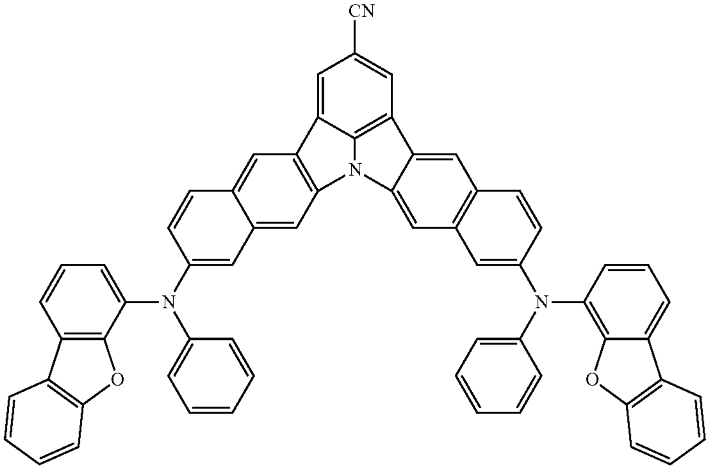
[Formula 293]
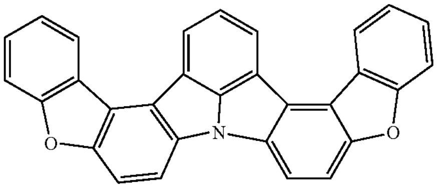
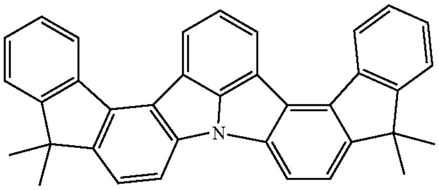
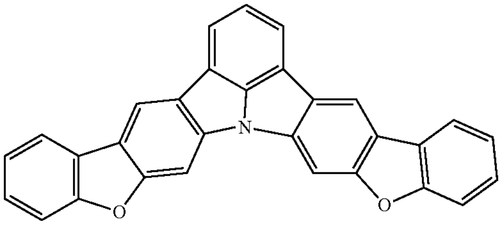
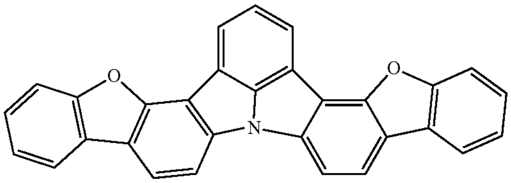
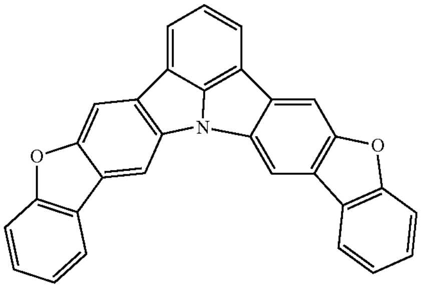
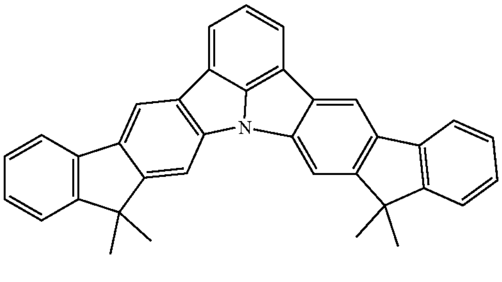

-continued
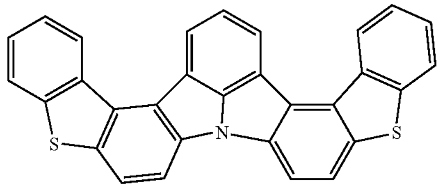
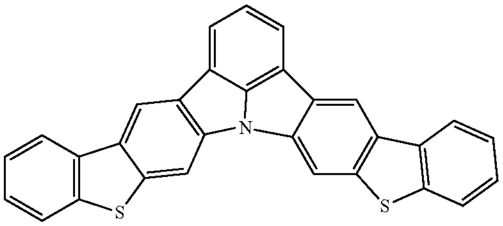
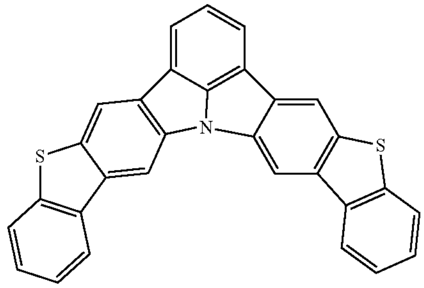
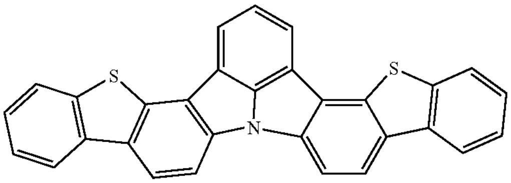
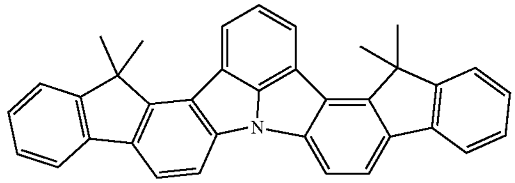
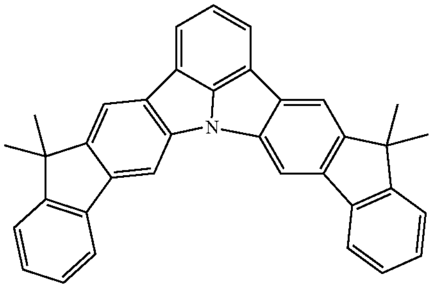
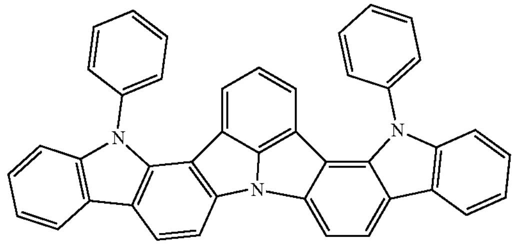
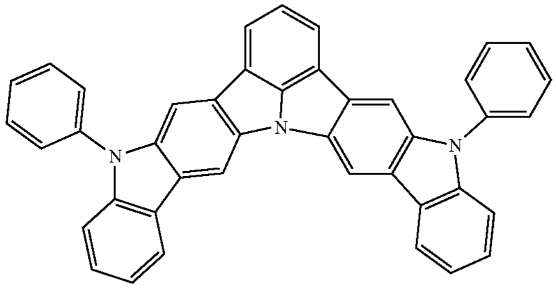
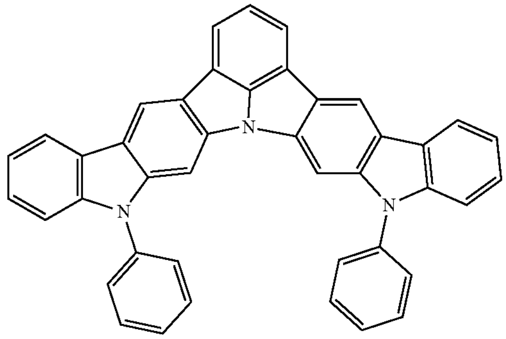
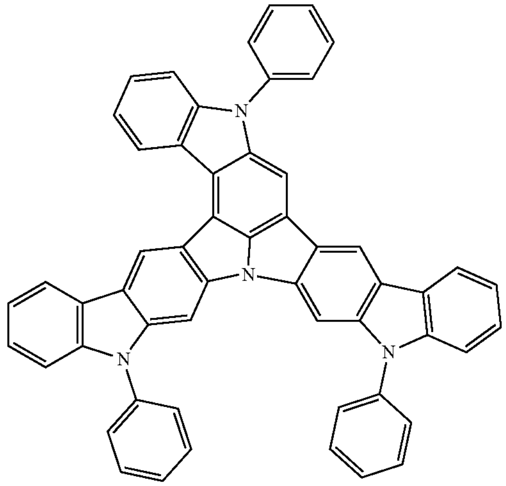

-continued
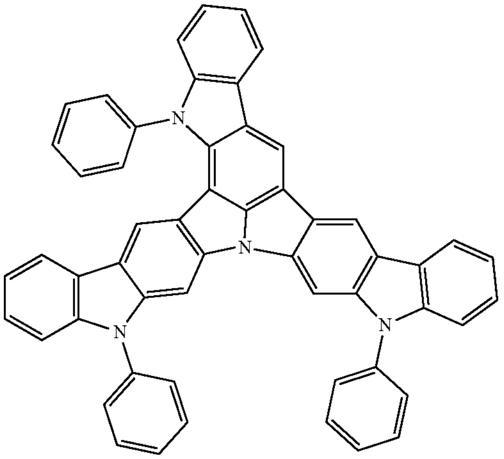
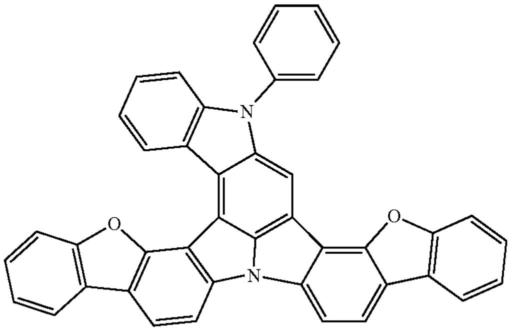
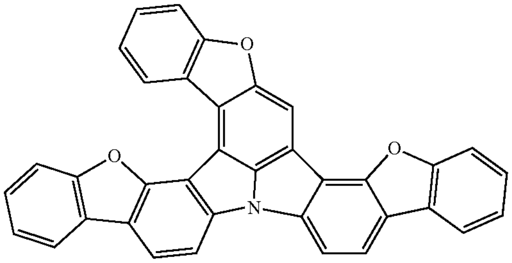
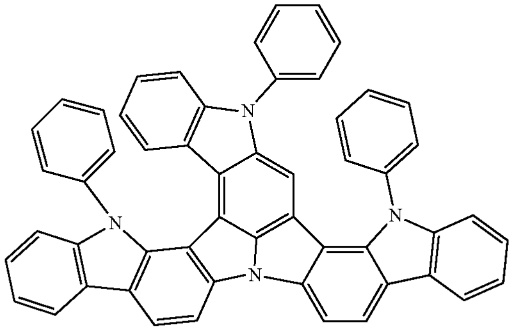
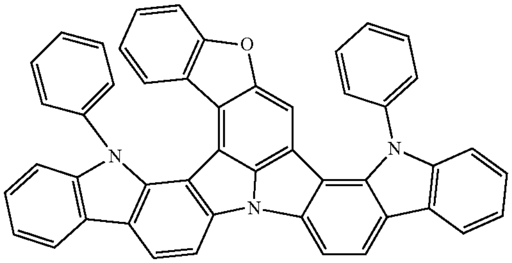
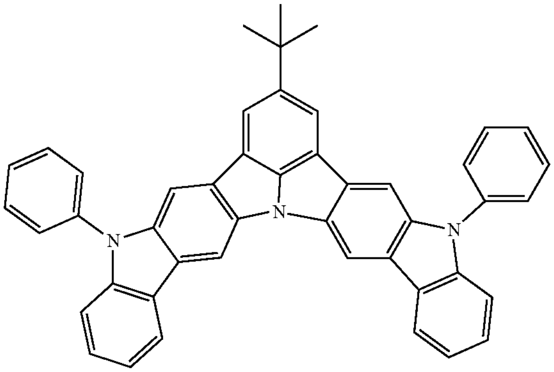
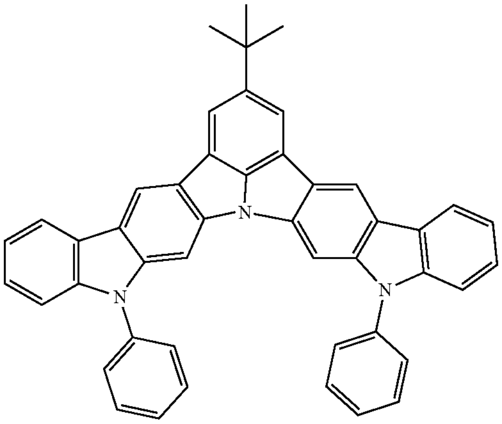

-continued
[Formula 294]
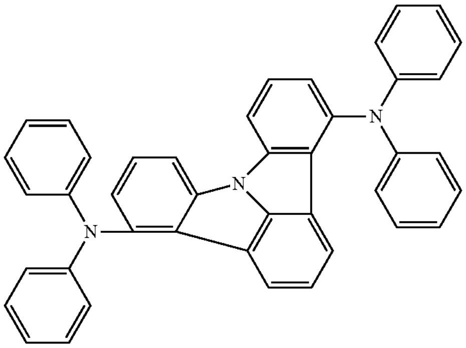
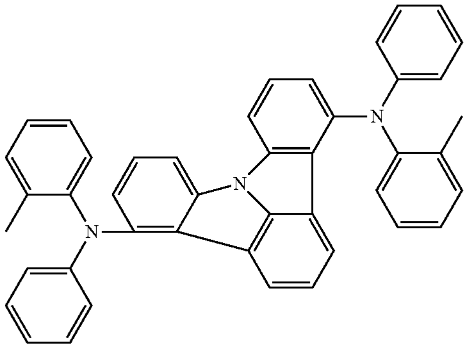
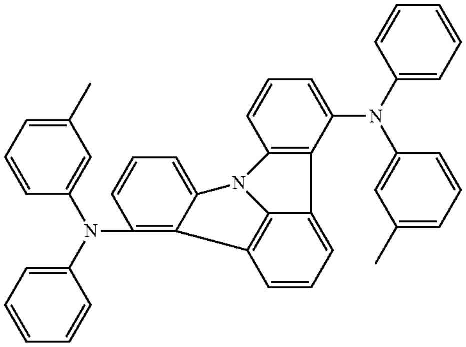
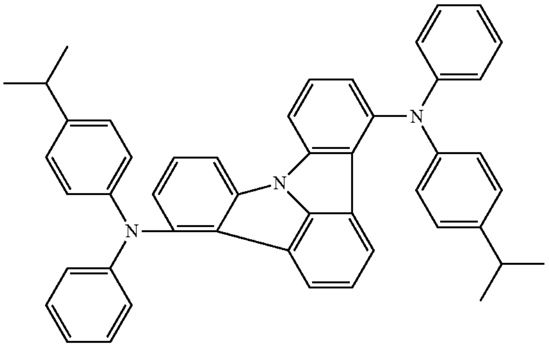
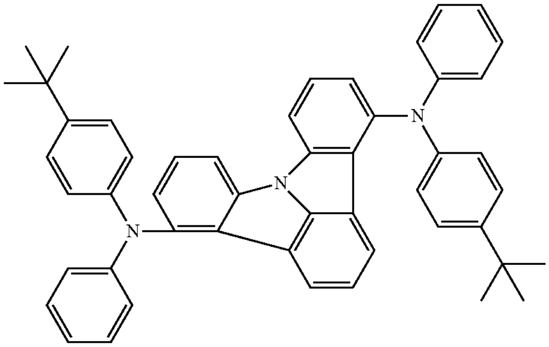
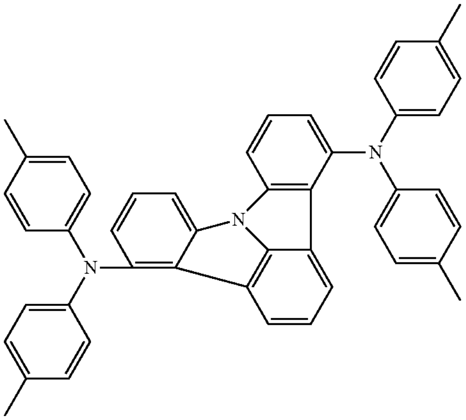
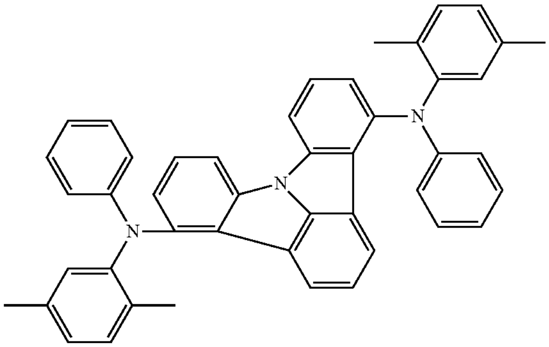
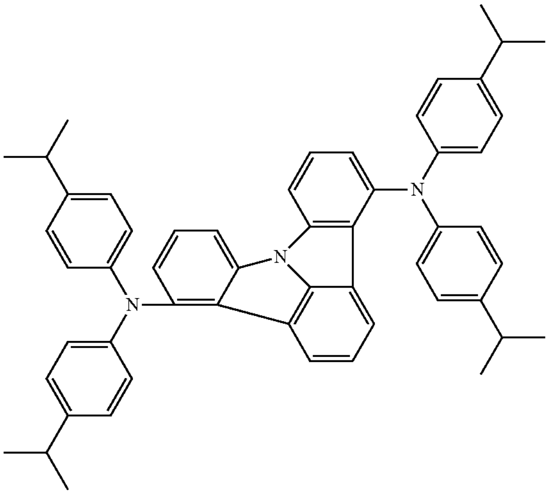

-continued
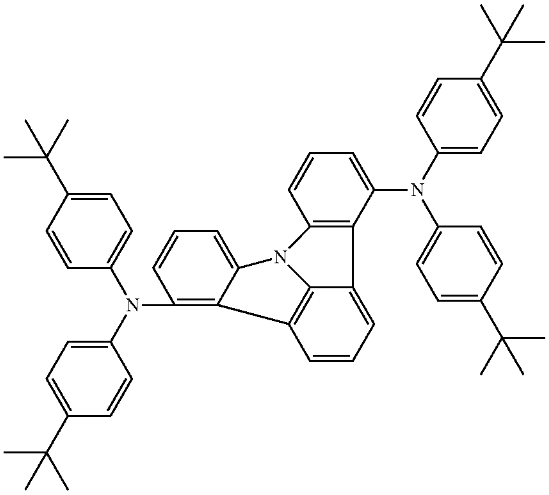
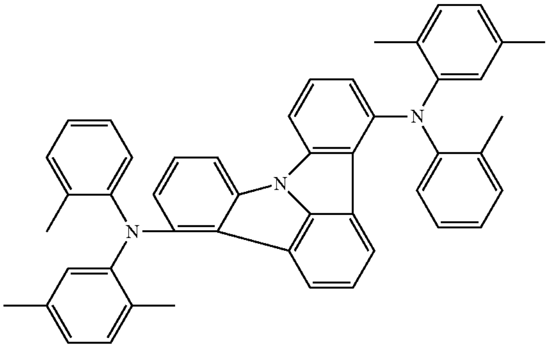
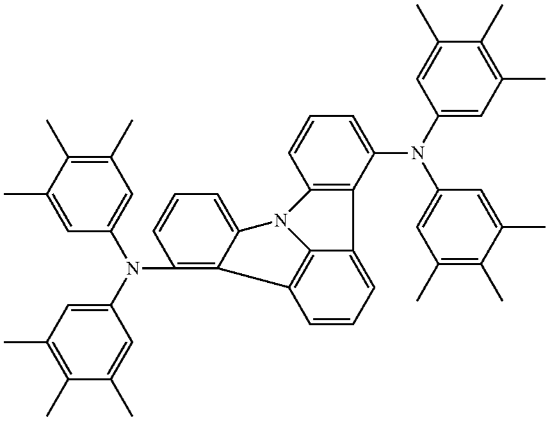
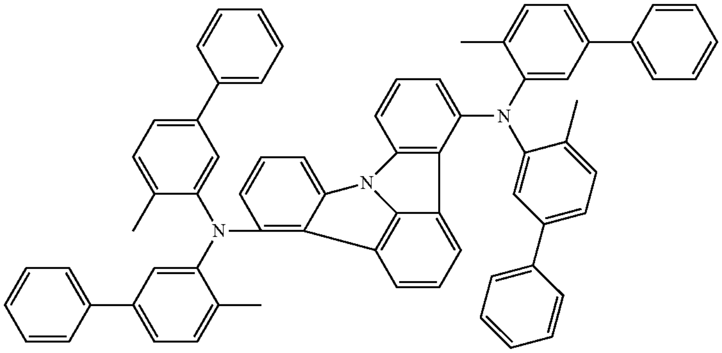
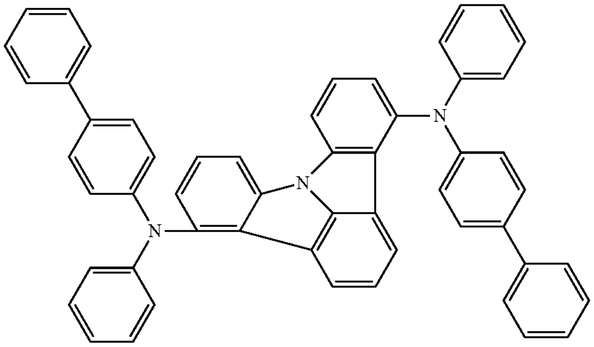

-continued
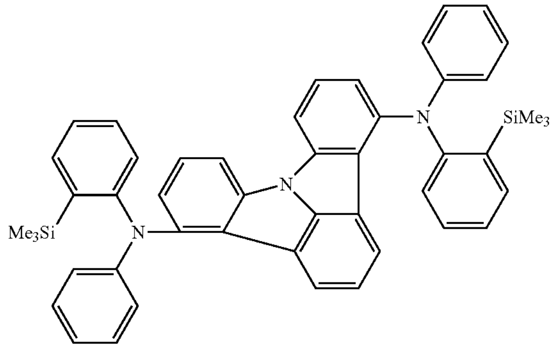
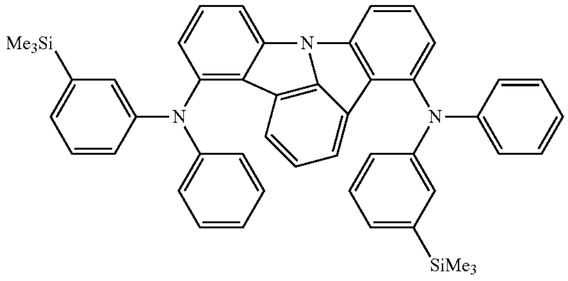
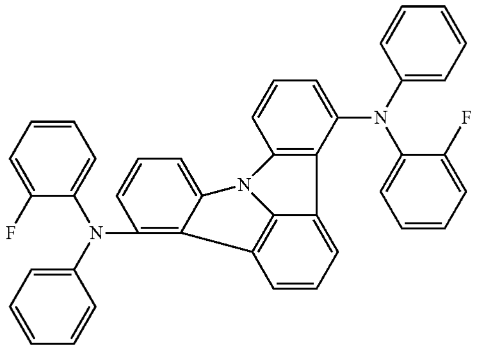
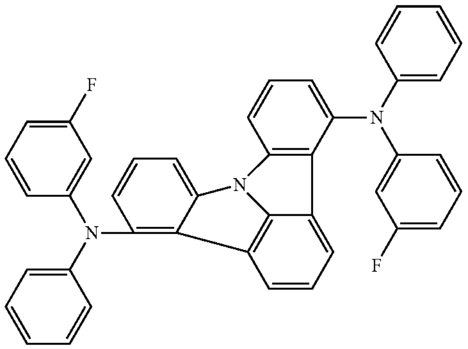
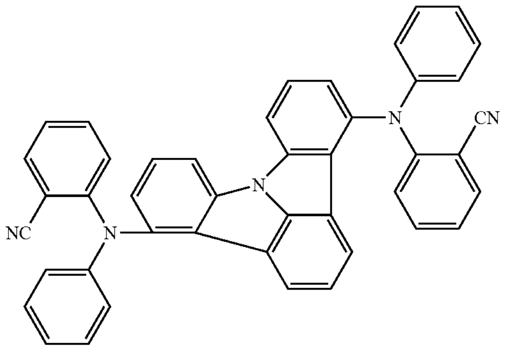
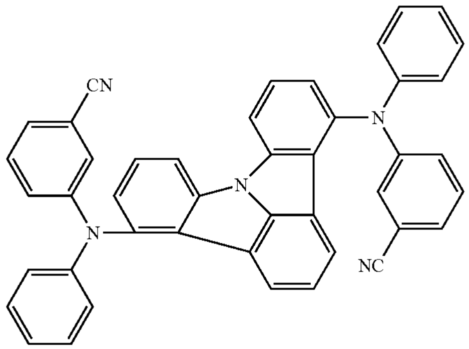
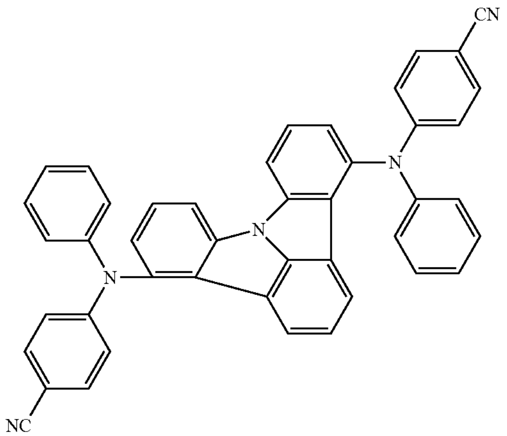
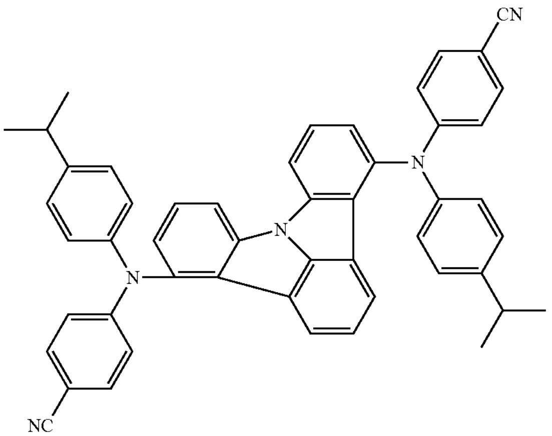

-continued
[Formula 295]
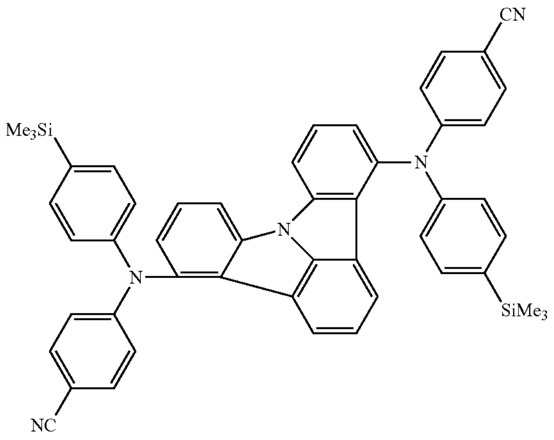
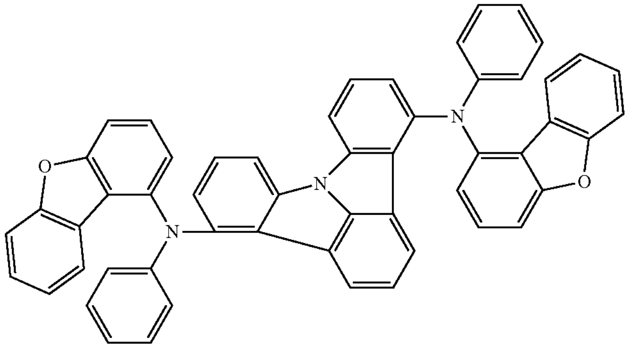
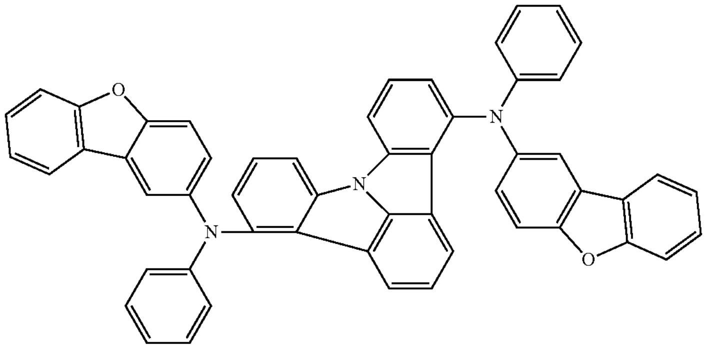
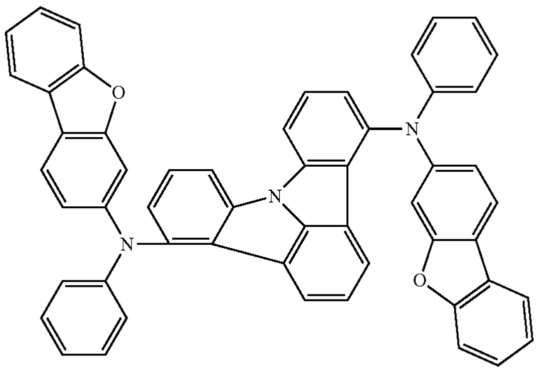

-continued
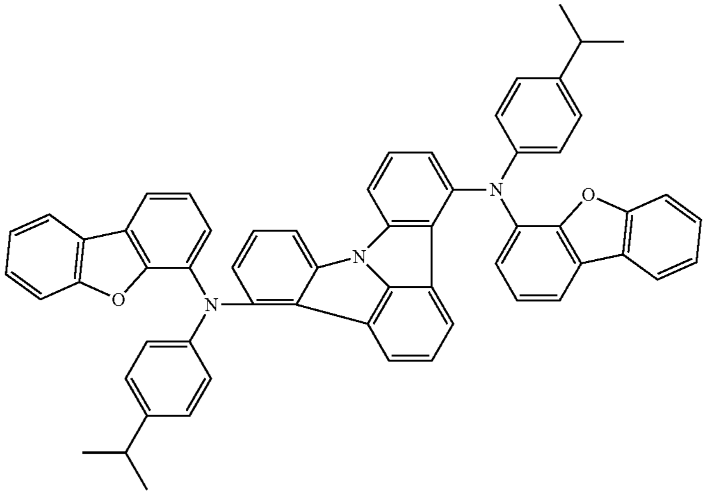
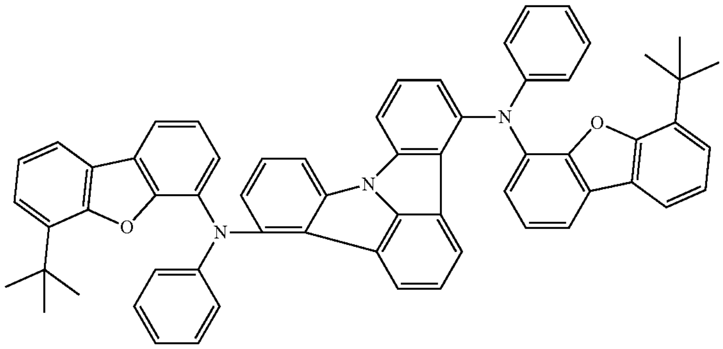
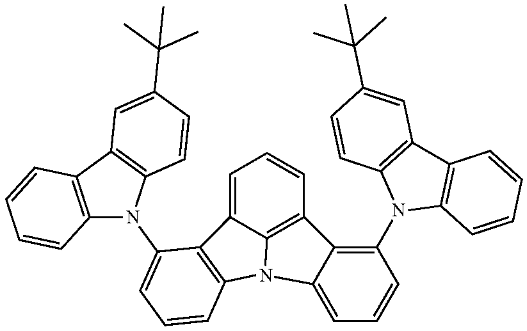
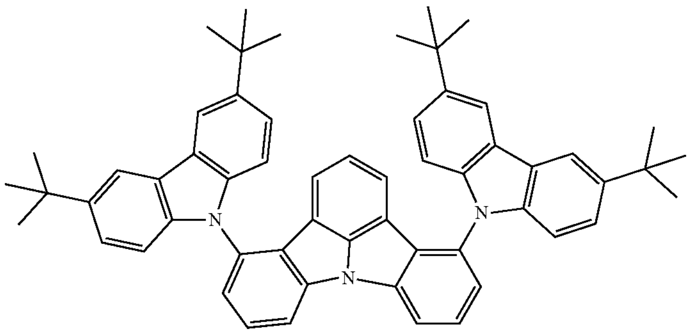

-continued
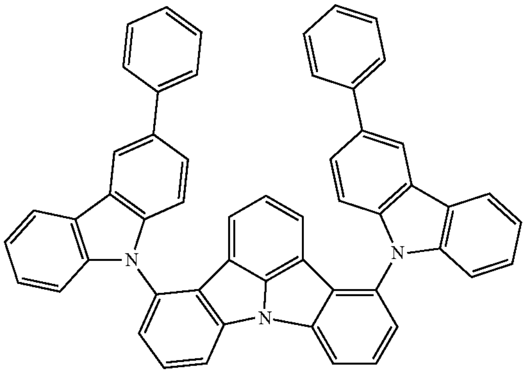
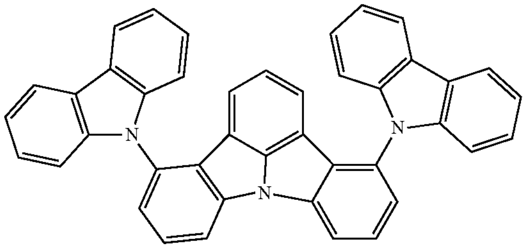
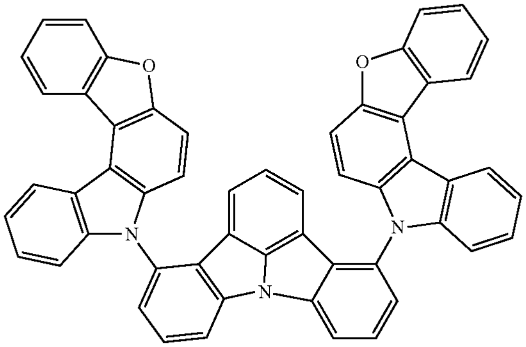
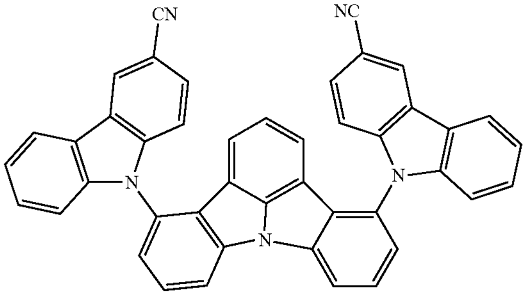
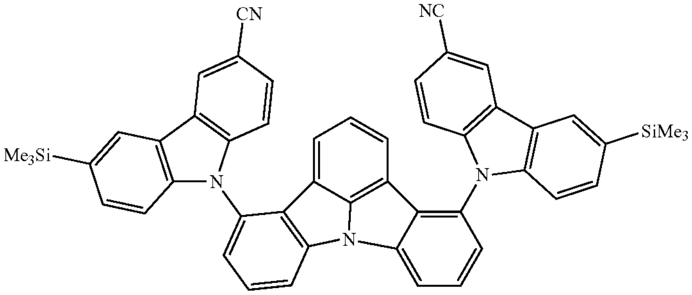
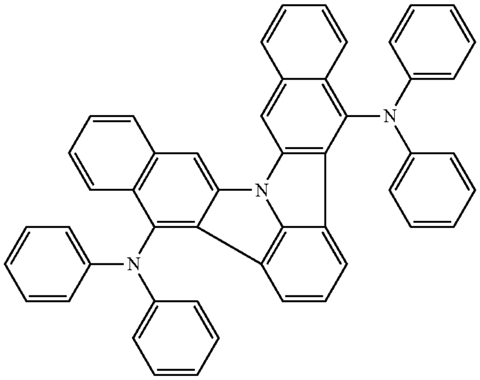
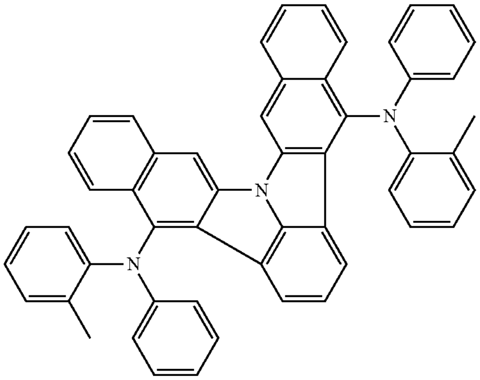

-continued
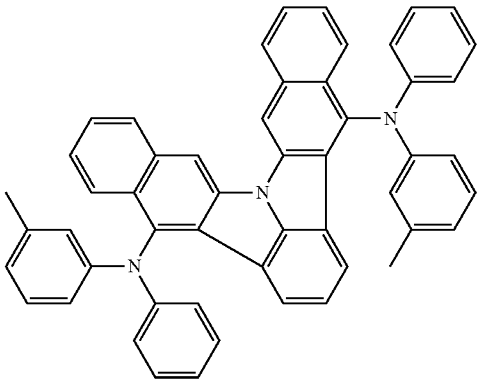
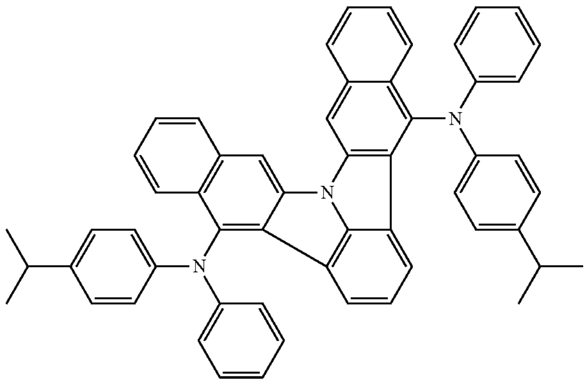
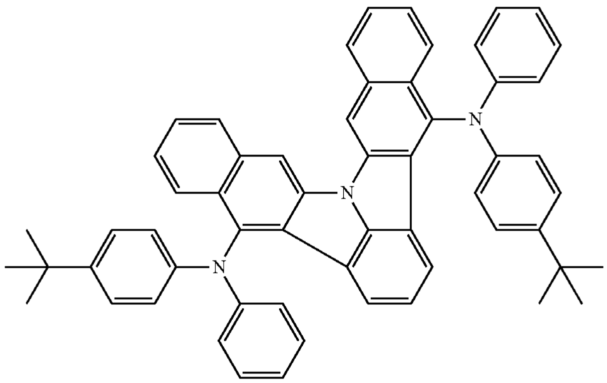
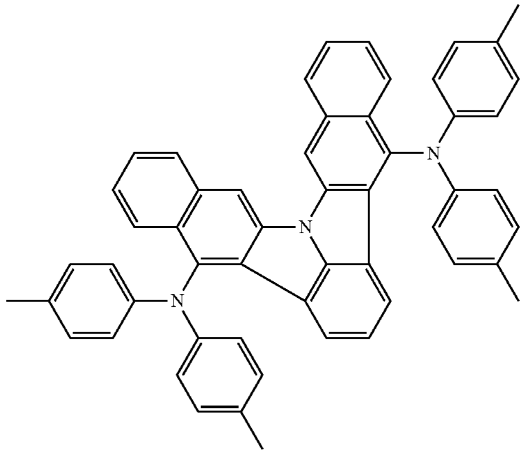
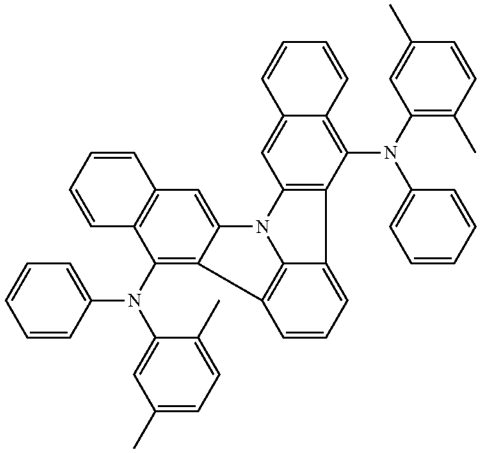
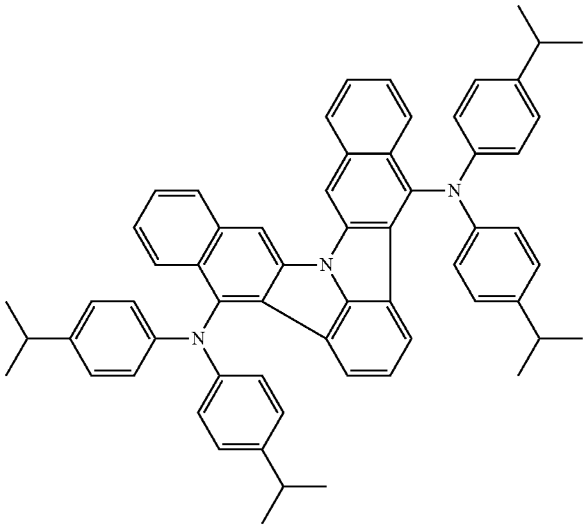

-continued
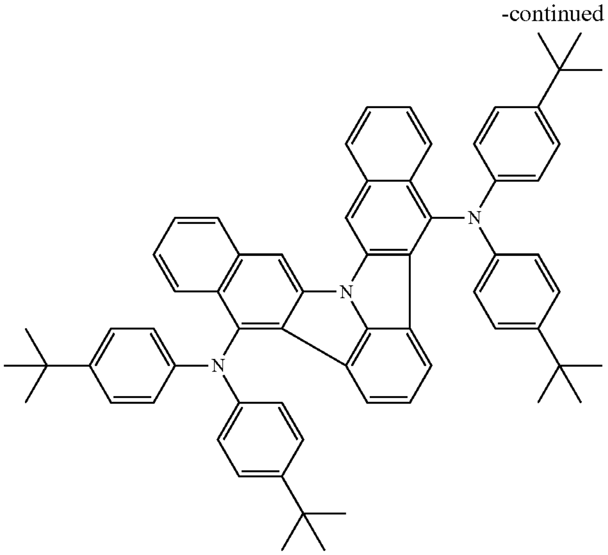
[Formula 296]
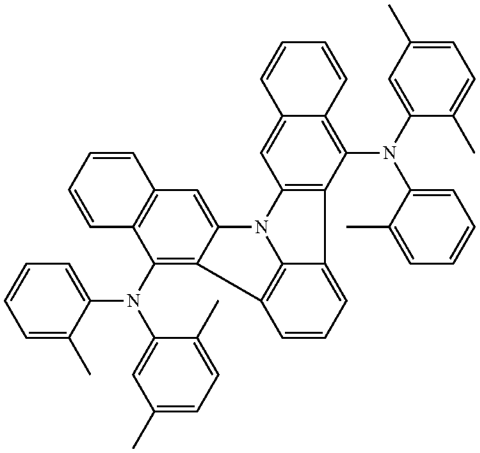
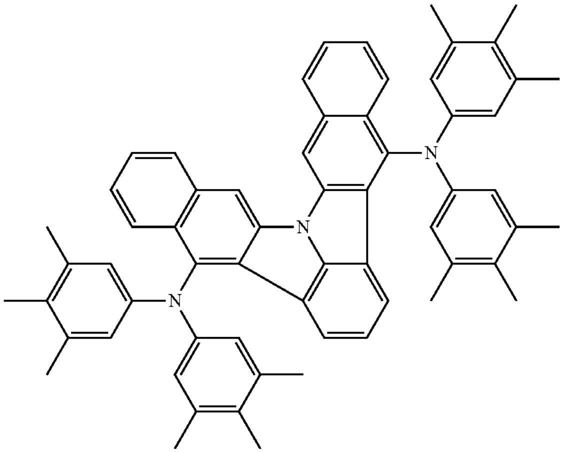
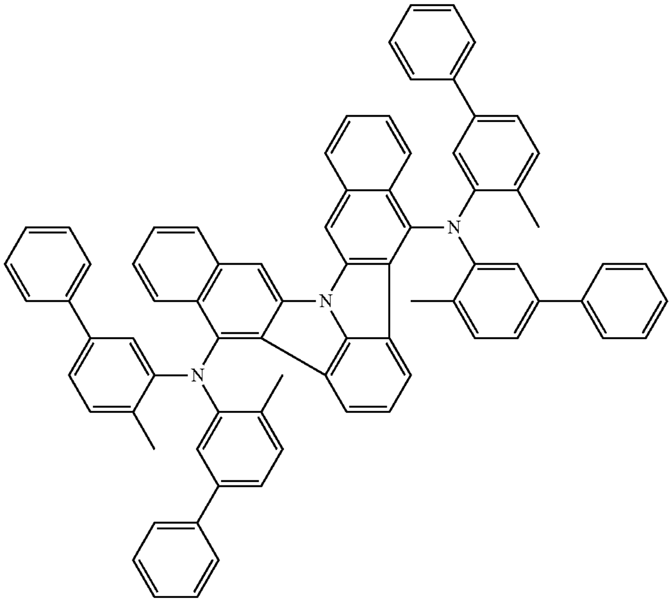

-continued
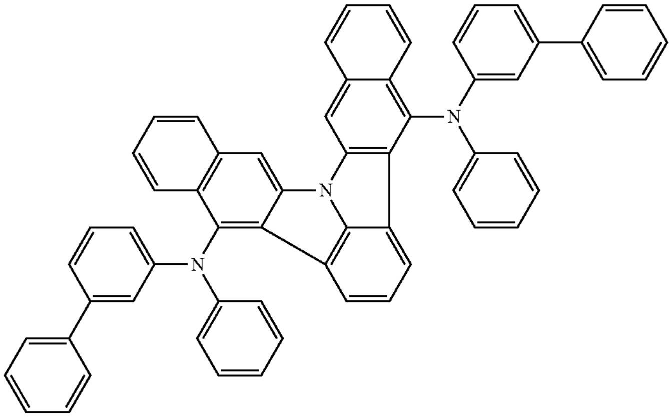
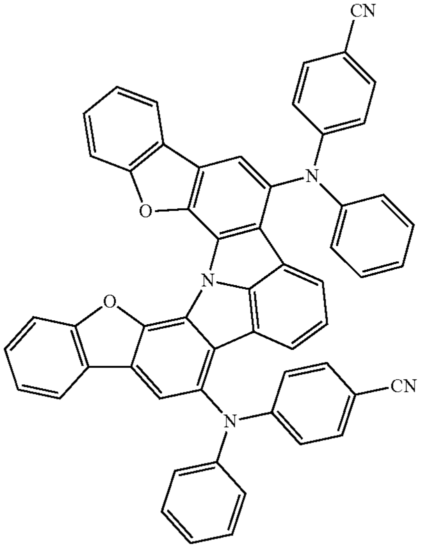
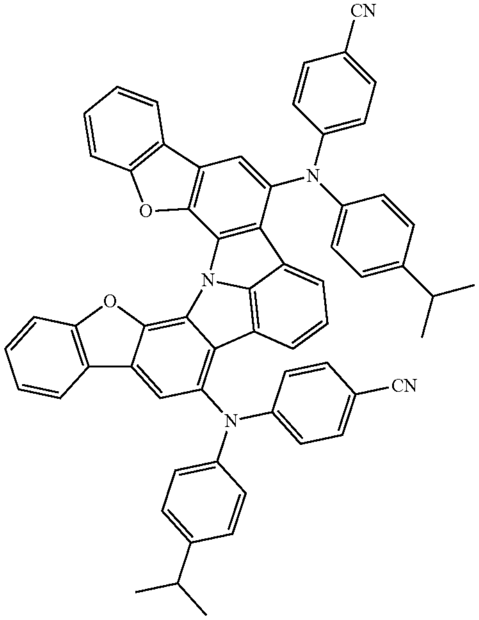
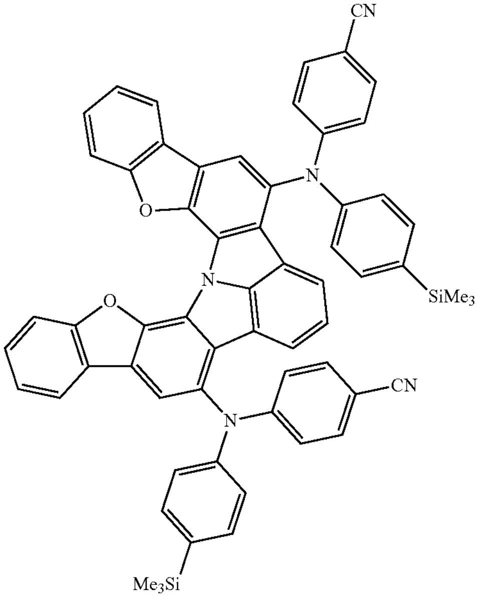
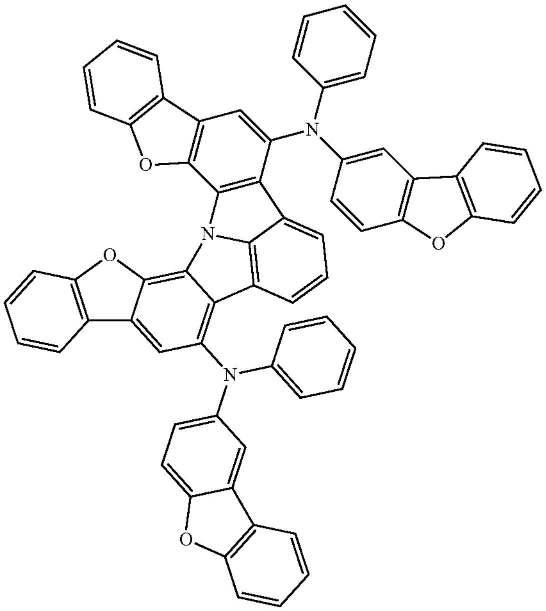

-continued
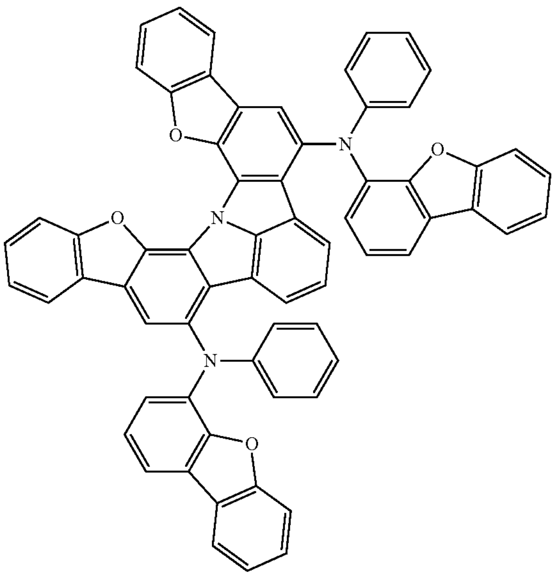
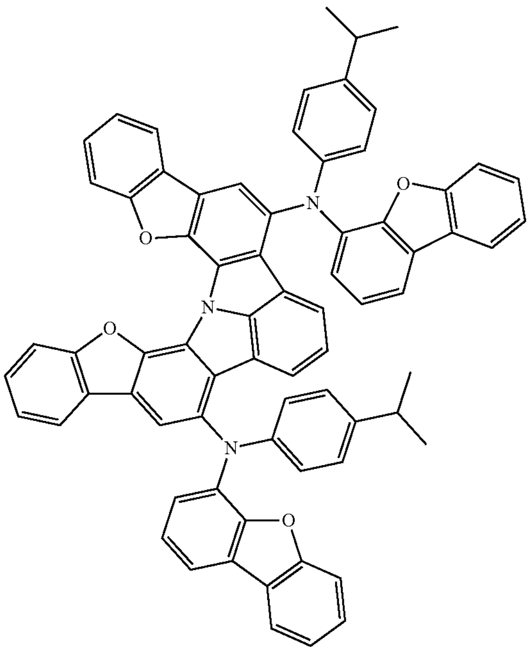
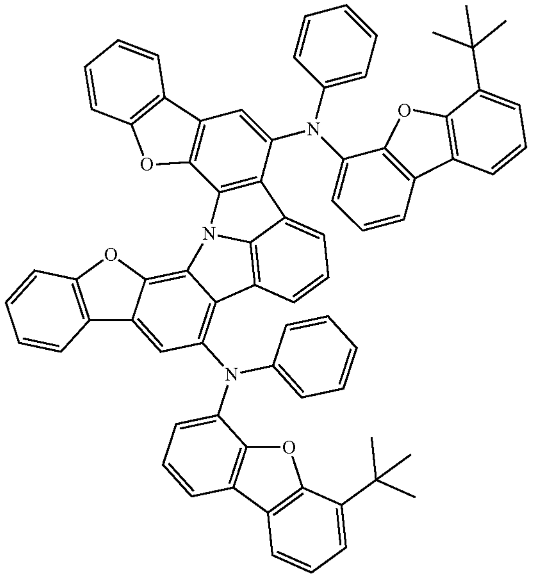
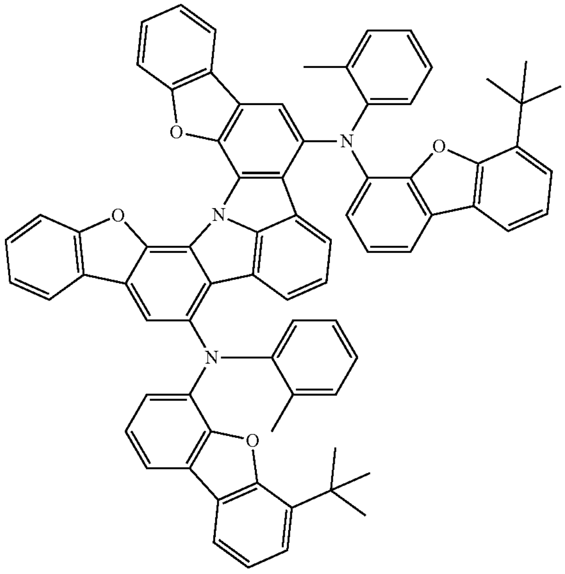

-continued
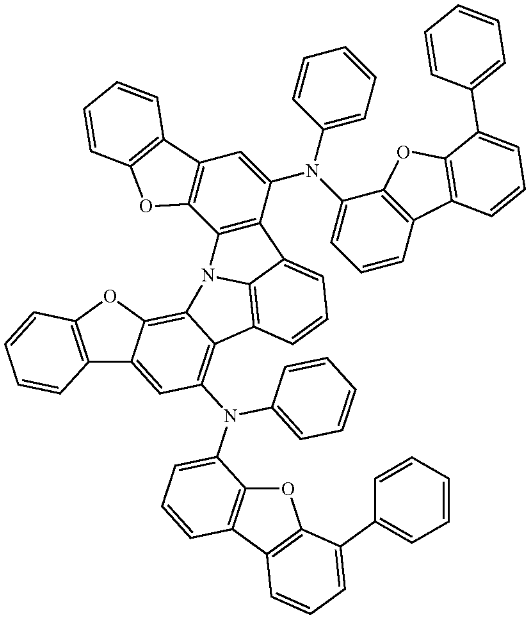
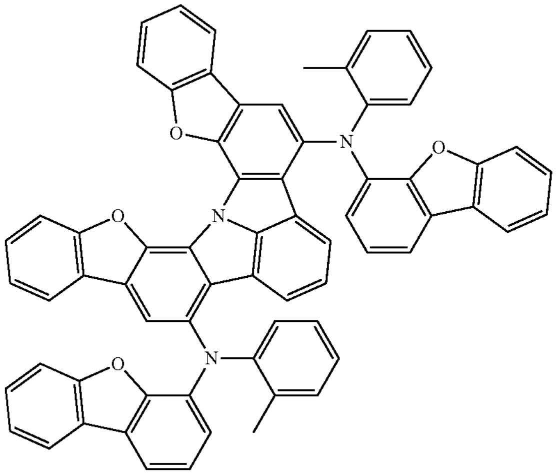
[Formula 297]
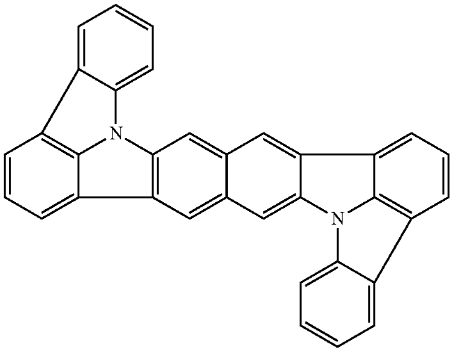
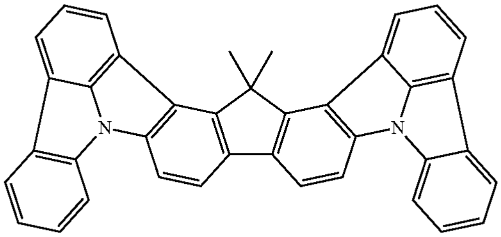
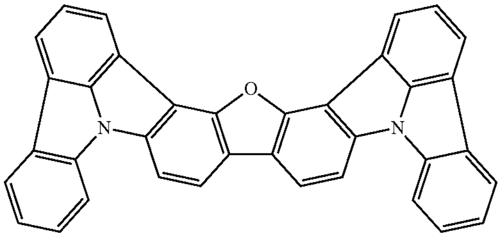
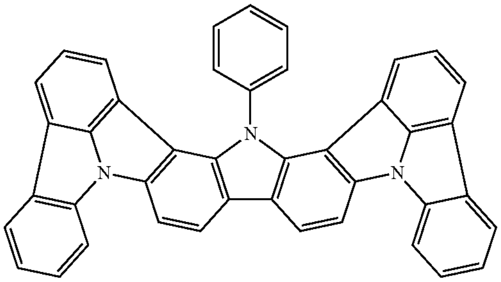
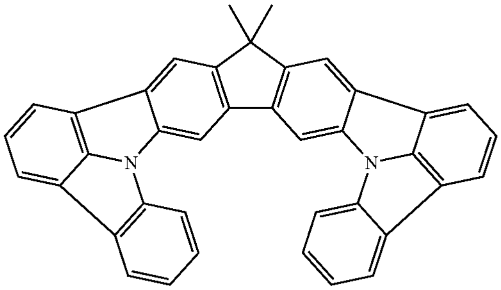
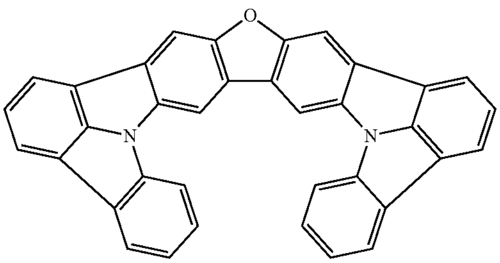

-continued
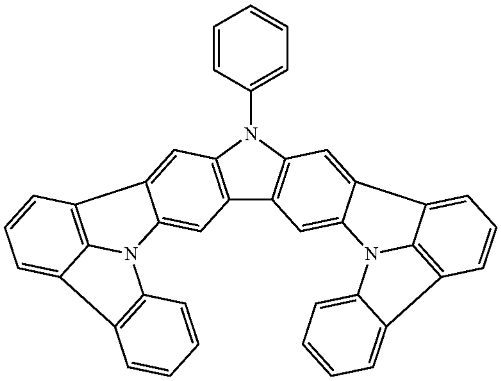
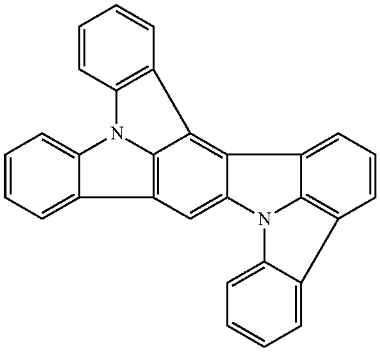
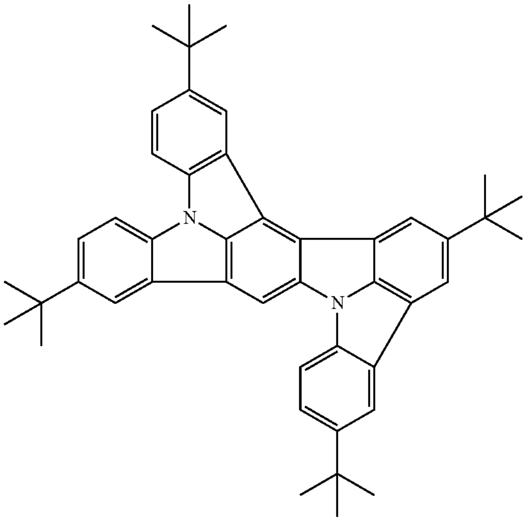
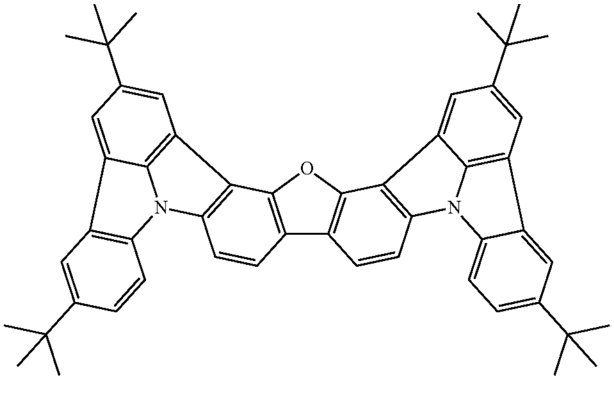

Compound Represented by Formula (5)

The compound represented by the formula (5) will be described below.

The compound represented by the formula (5) corresponds to a compound represented by the formula (41-3).

[Formula 298]

(5)

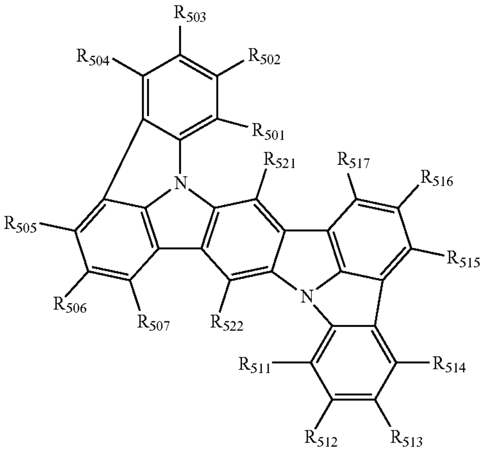

In the formula (5):

at least one combination of adjacent two or more of $R_{501}$ to $R_{507}$ and $R_{511}$ to $R_{517}$ are mutually bonded to form a substituted or unsubstituted monocyclic ring, mutually bonded to form a substituted or unsubstituted fused ring, or not mutually bonded; and $R_{501}$ to $R_{507}$ and $R_{511}$ to $R_{517}$ forming neither the monocyclic ring nor the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

$R_{521}$ and $R_{522}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

"A combination of adjacent two or more of $R_{501}$ to $R_{507}$ and $R_{511}$ to $R_{517}$" refers to, for instance, a combination of $R_{501}$ and $R_{502}$, a combination of $R_{502}$ and $R_{503}$, a combination of $R_{503}$ and $R_{504}$, a combination of $R_{505}$ and $R_{506}$, a combination of $R_{506}$ and $R_{507}$, and a combination of $R_{501}$, $R_{502}$, and $R_{503}$.

In an exemplary embodiment, at least one, preferably two of $R_{501}$ to $R_{507}$ or $R_{511}$ to $R_{517}$ are each a group represented by —N($R_{906}$)($R_{907}$).

In an exemplary embodiment, $R_{501}$ to $R_{507}$ and $R_{511}$ to $R_{517}$ are each independently a hydrogen atom, a substituted or unsubstituted aryl group having 6 to 50 ring carbon atoms, or a substituted or unsubstituted heterocyclic group having 5 to 50 ring atoms.

In an exemplary embodiment, the compound represented by the formula (5) is a compound represented by a formula (52) below.

[Formula 299]

(52)

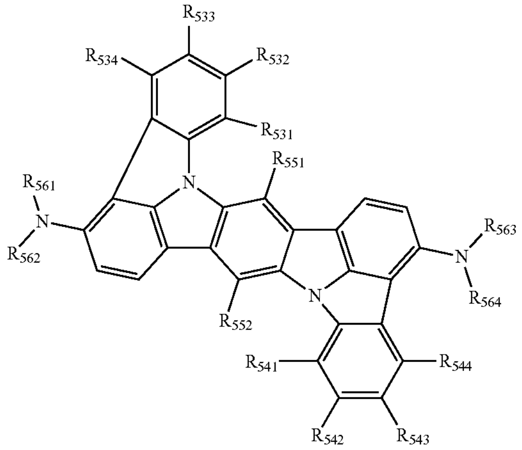

In the formula (52):

at least one combination of adjacent two or more of $R_{531}$ to $R_{534}$ and $R_{541}$ to $R_{544}$ are mutually bonded to form a substituted or unsubstituted monocyclic ring, mutually bonded to form a substituted or unsubstituted fused ring, or not mutually bonded; and $R_{531}$ to $R_{534}$, $R_{541}$ to $R_{544}$ forming neither the monocyclic ring nor the fused ring, and $R_{551}$ and $R_{552}$ are each independently a hydrogen atom, a substituted or unsubstituted aryl group having 6 to 50 ring carbon atoms, or a substituted or unsubstituted heterocyclic group having 5 to 50 ring atoms; and $R_{561}$ to $R_{564}$ are each independently a substituted or unsubstituted aryl group having 6 to 50 ring carbon atoms, or a substituted or unsubstituted heterocyclic group having 5 to 50 ring atoms.

In an exemplary embodiment, the compound represented by the formula (5) is a compound represented by a formula (53) below.

[Formula 300]

(53)

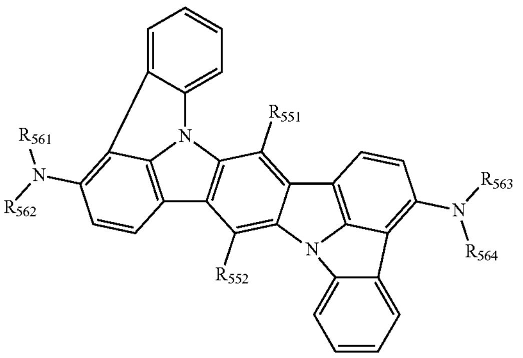

In the formula (53), $R_{551}$, $R_{552}$ and $R_{561}$ to $R_{564}$ each independently represent the same as $R_{551}$, $R_{552}$ and $R_{561}$ to $R_{564}$ in the formula (52).

[Formula 301]

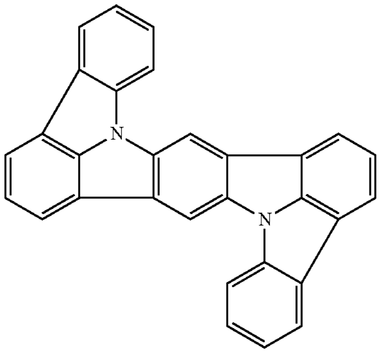

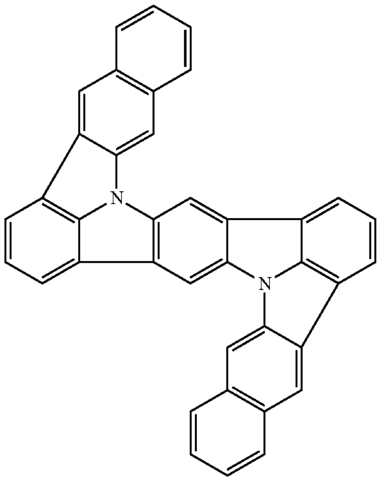

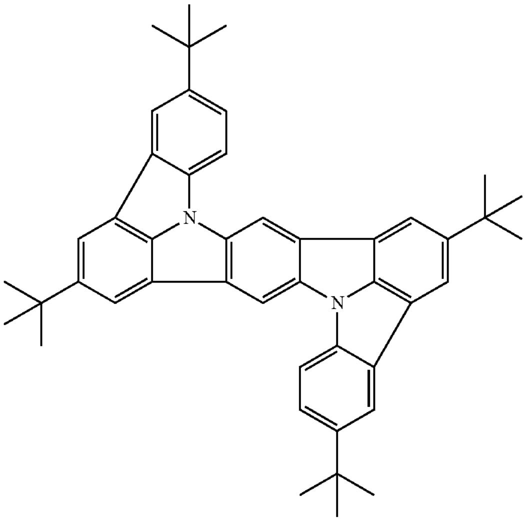

In an exemplary embodiment, $R_{561}$ to $R_{564}$ in the formulae (52) and (53) are each independently a substituted or unsubstituted aryl group having 6 to 50 ring carbon atoms (preferably a phenyl group).

In an exemplary embodiment, $R_{521}$ and $R_{522}$ in the formula (5) and $R_{551}$ and $R_{552}$ in the formulae (52) and (53) are each a hydrogen atom.

In an exemplary embodiment, the substituent for the "substituted or unsubstituted" group in the formulae (5), (52) and (53) is a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

Specific Examples of Compound Represented by Formula (5)

Specific examples of the compound represented by the formula (5) include compounds shown below.

-continued
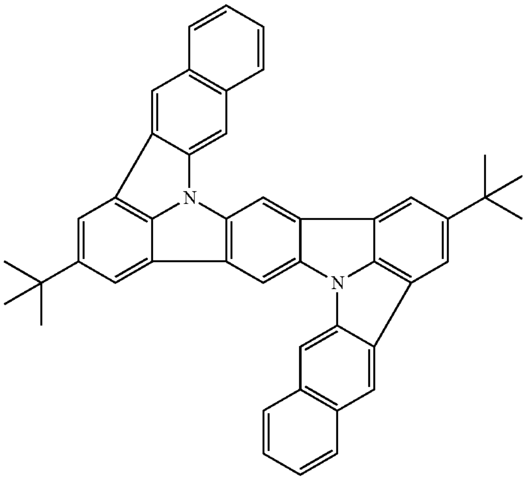
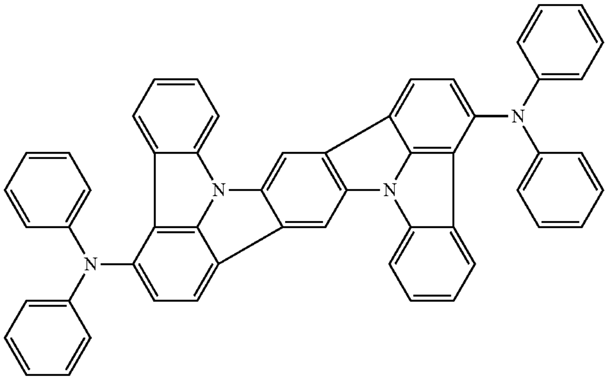
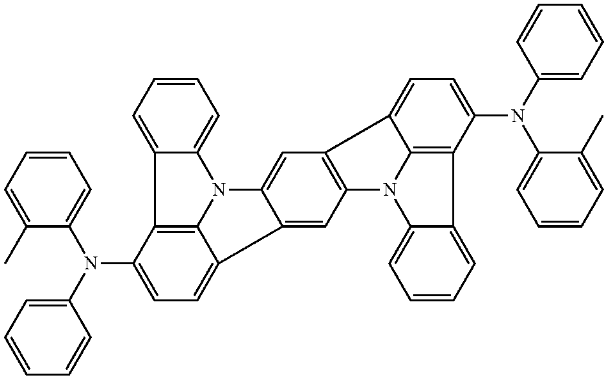
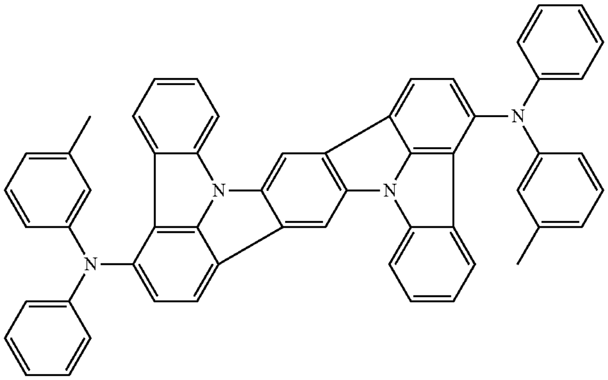

-continued
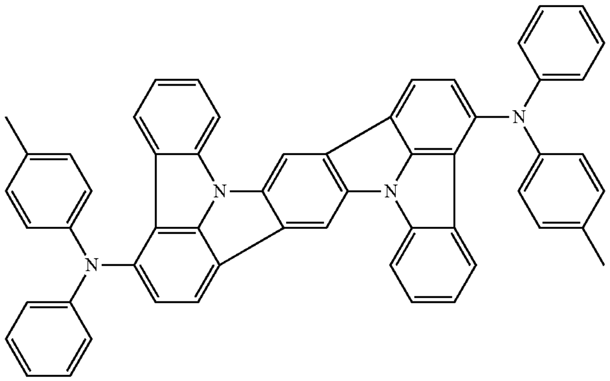
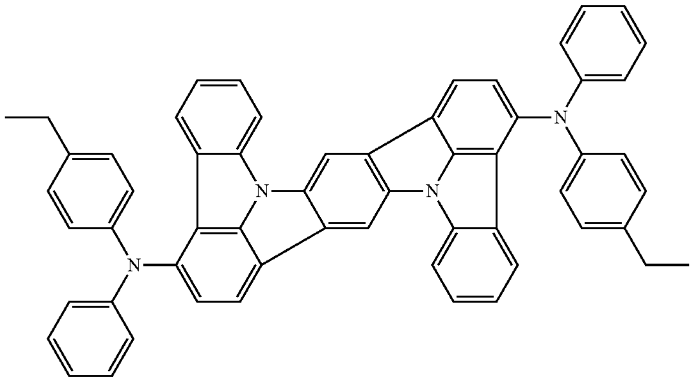
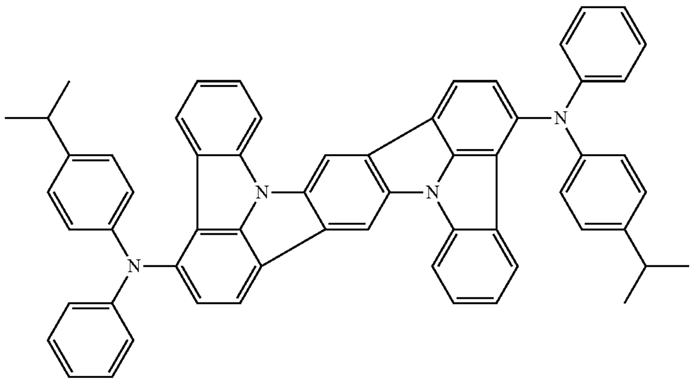
[Formula 302]
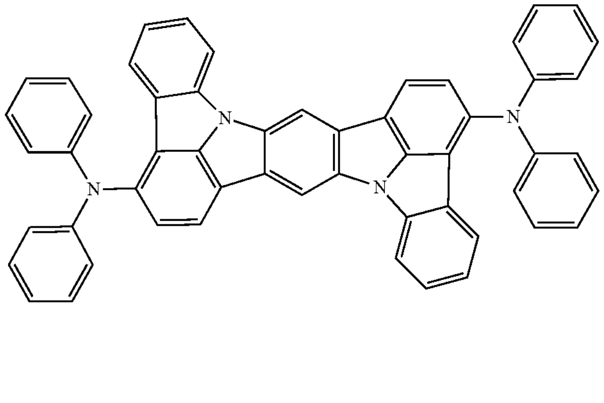

-continued
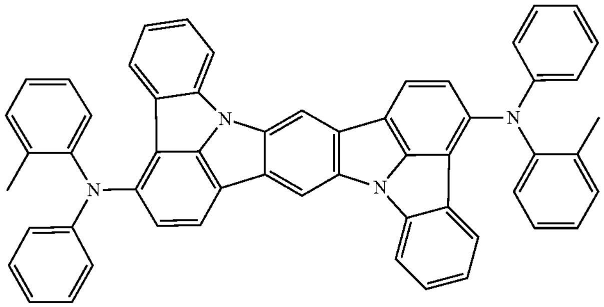
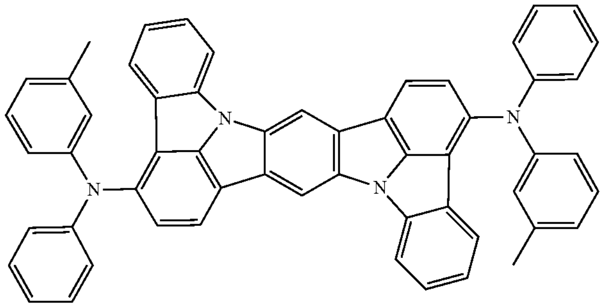
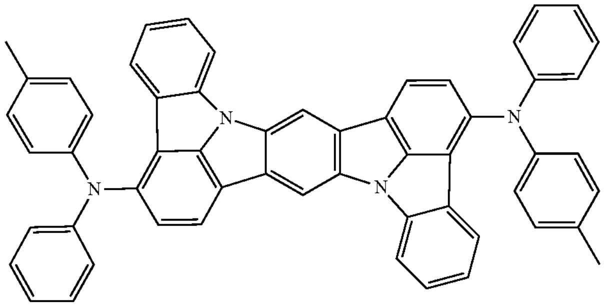
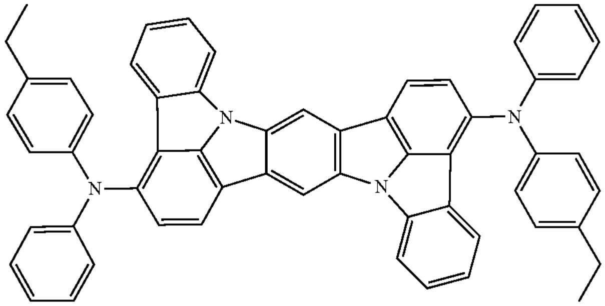
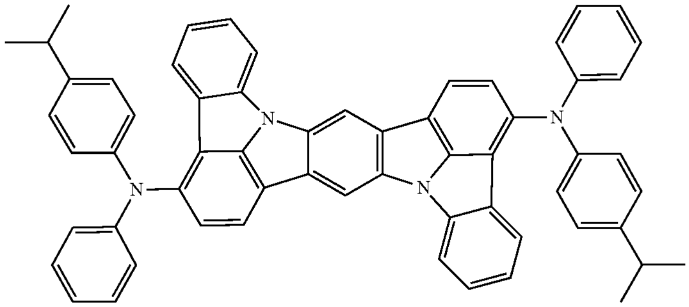

-continued
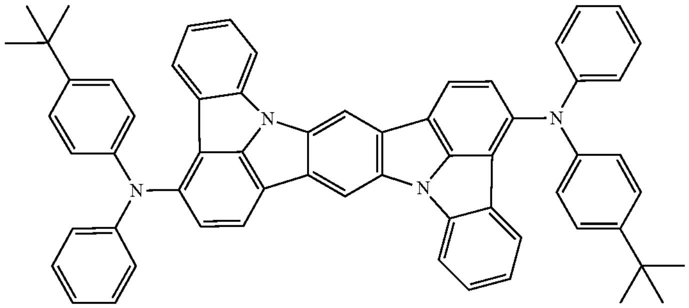
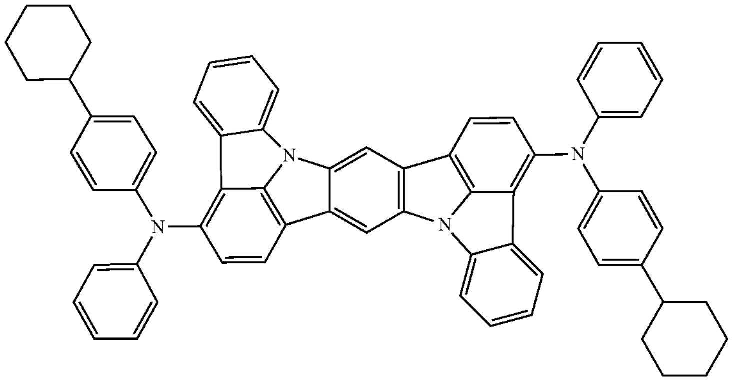
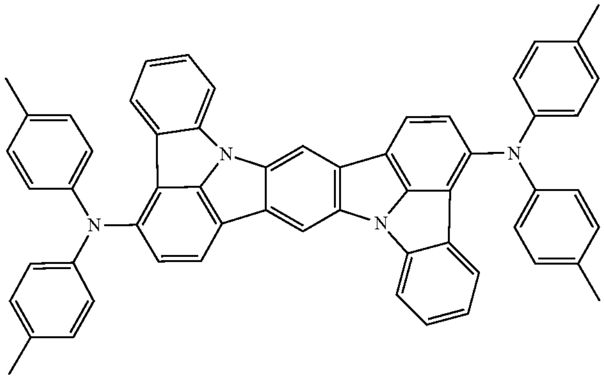
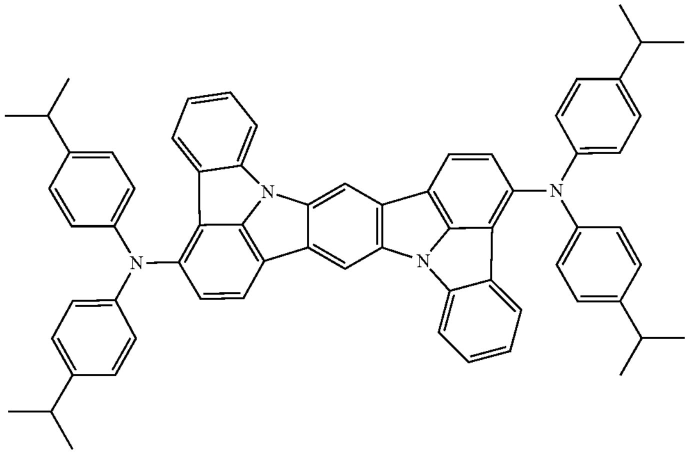

-continued
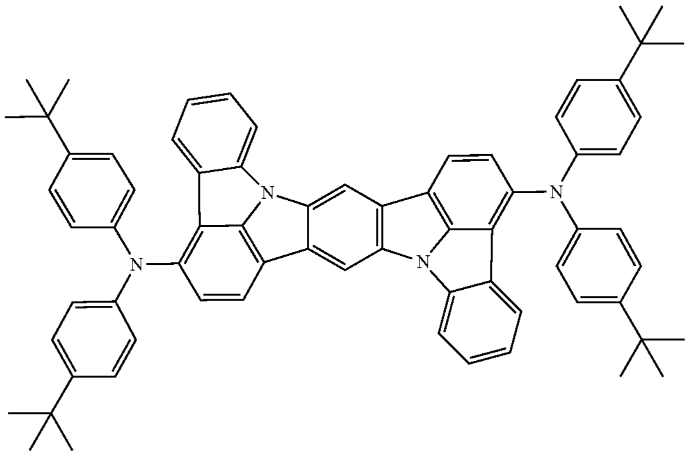
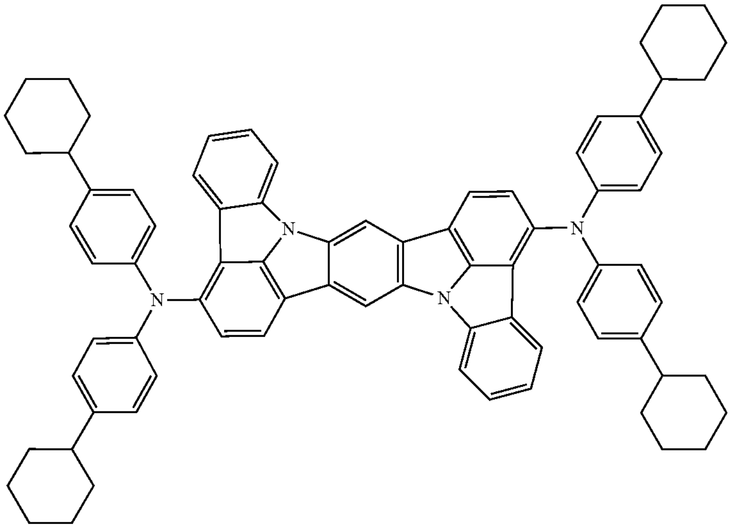
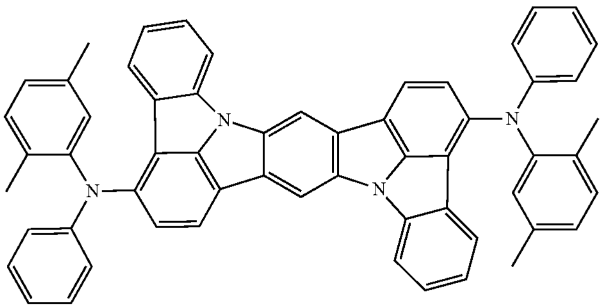
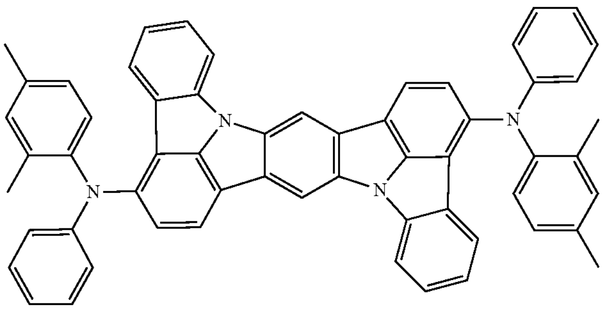

-continued
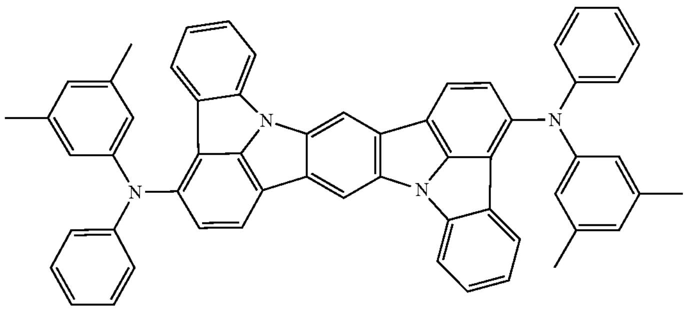
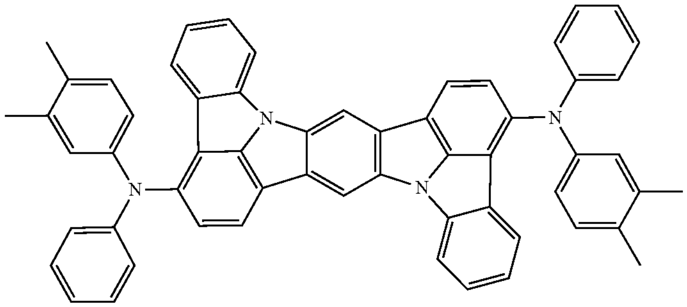
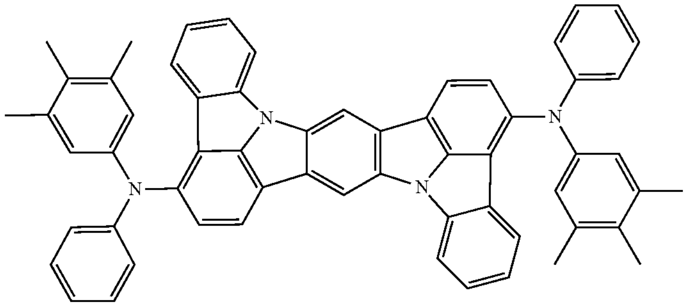
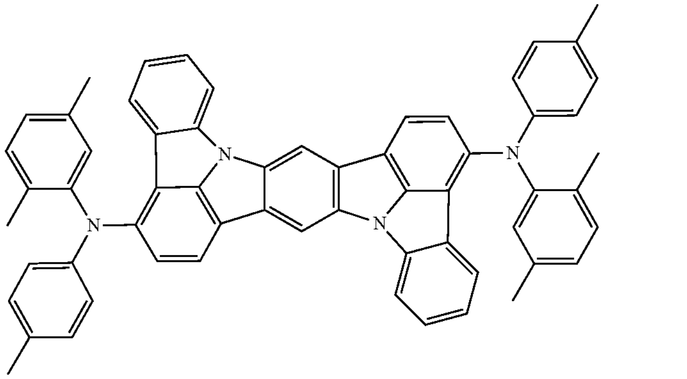
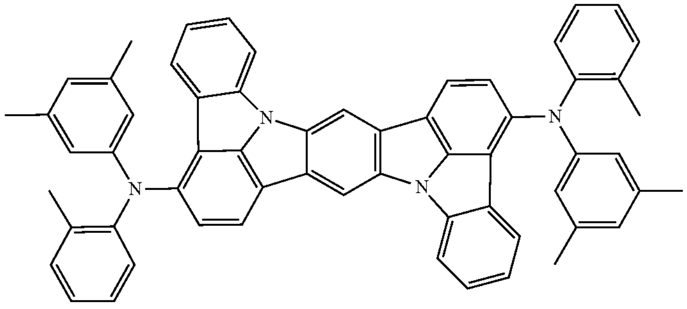

-continued
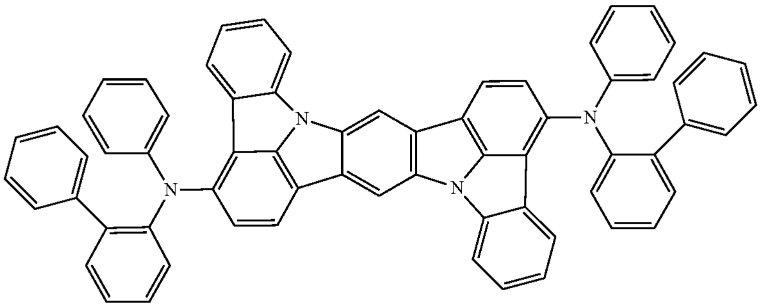
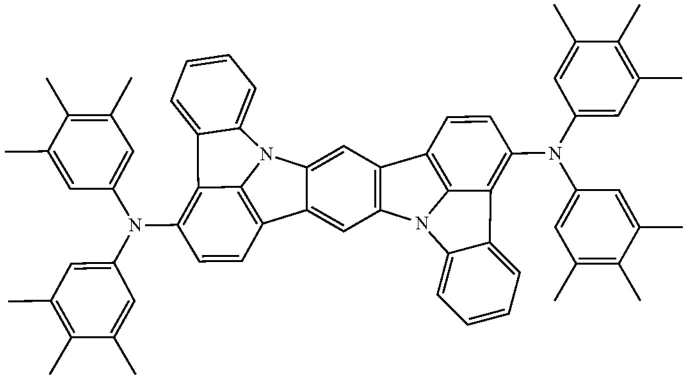
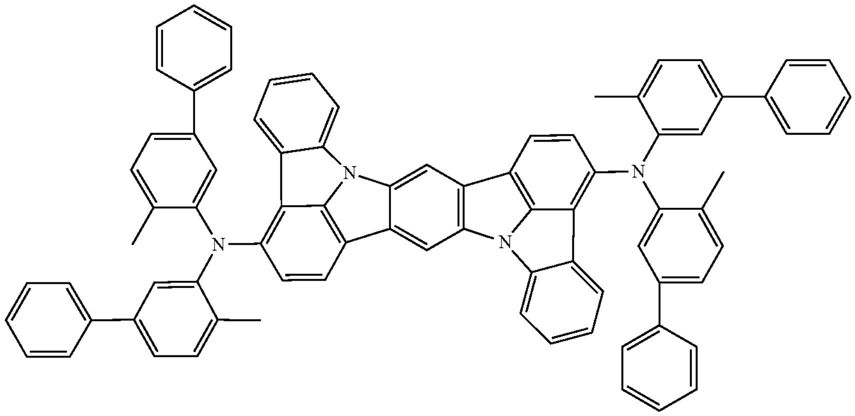
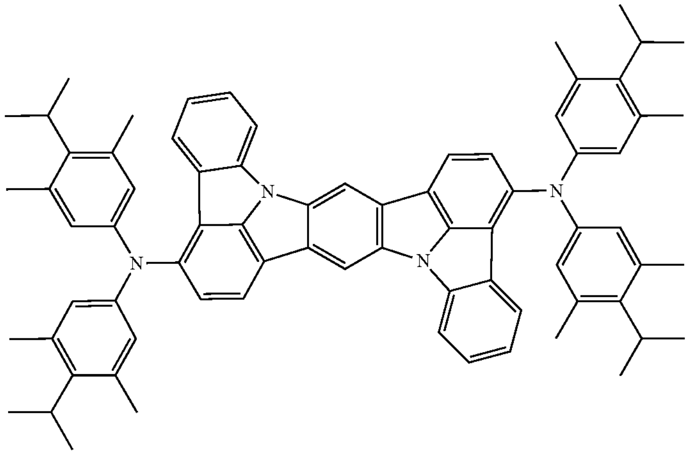

-continued
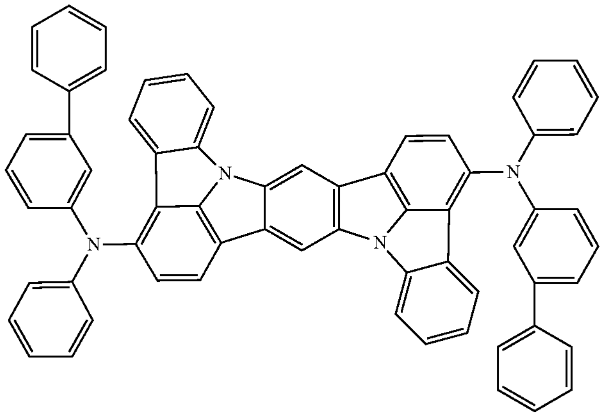
[Formula 303]
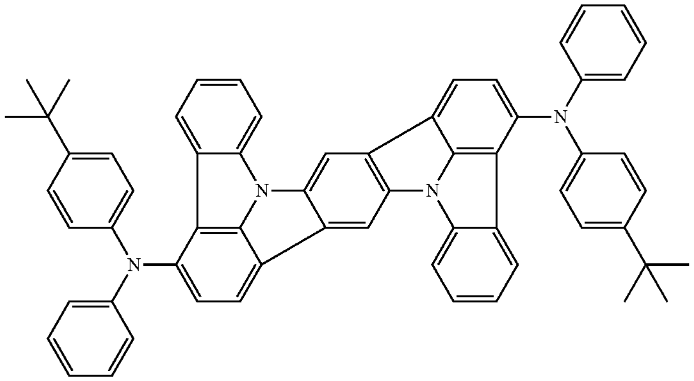
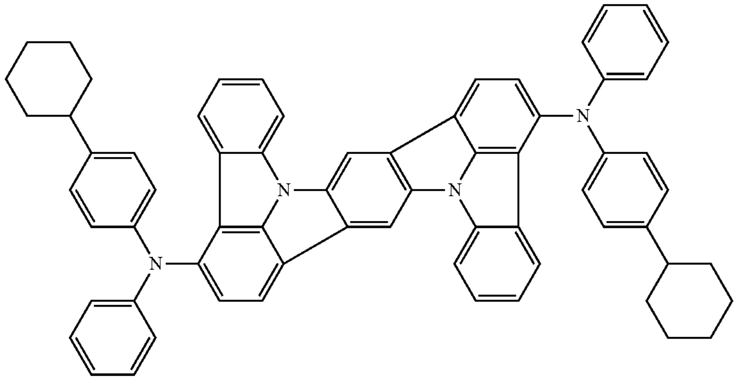
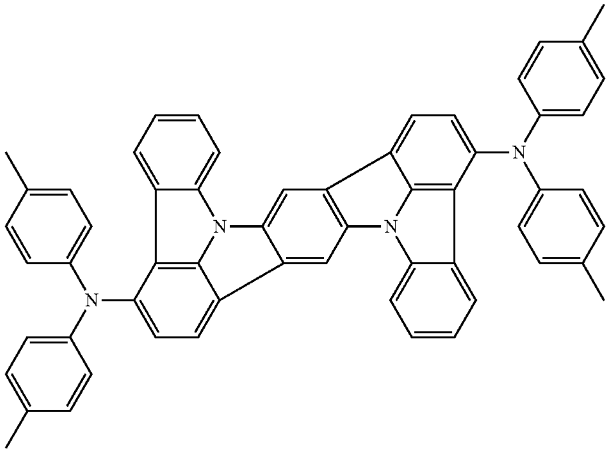

-continued
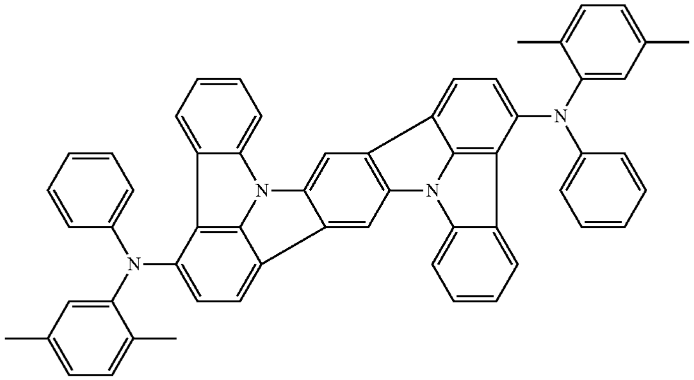
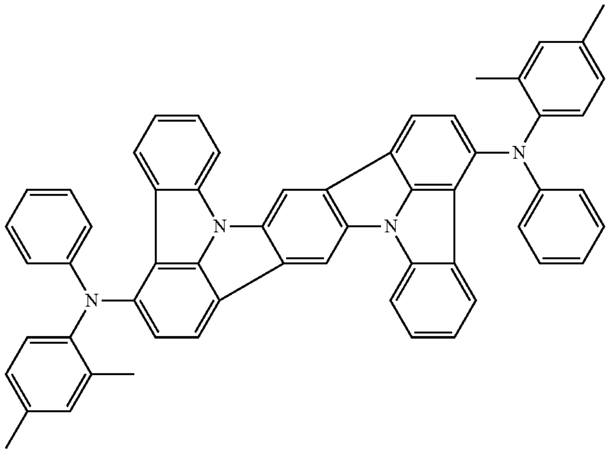
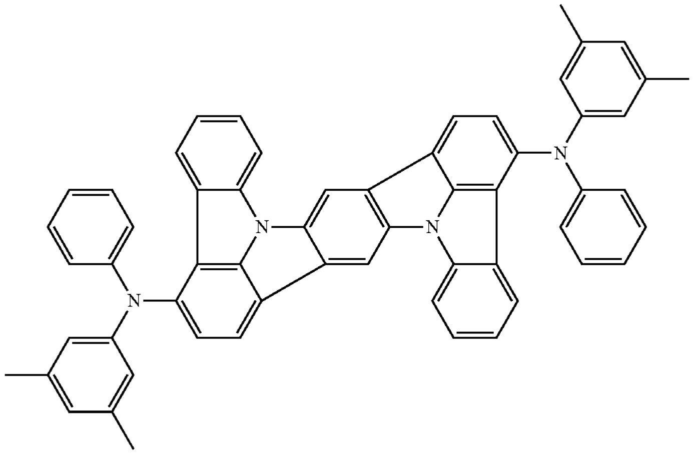

-continued
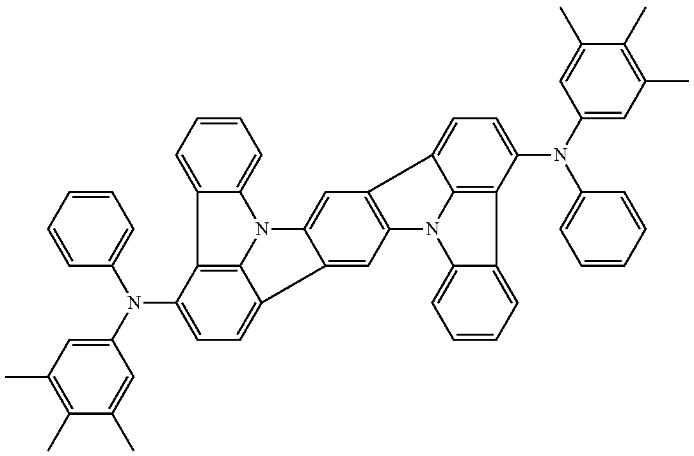
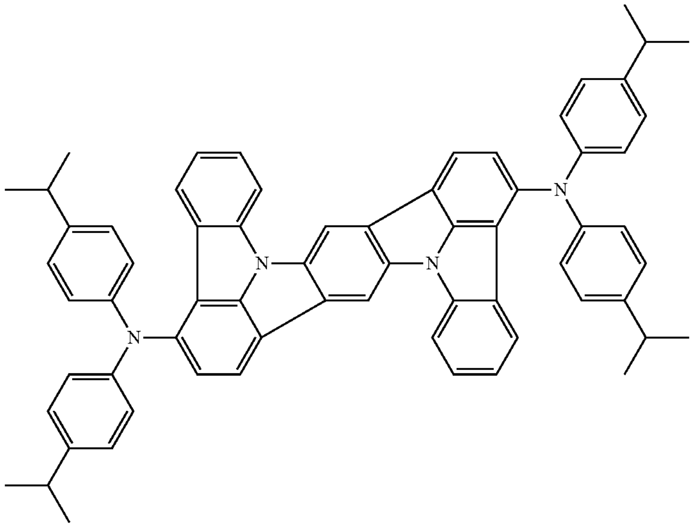
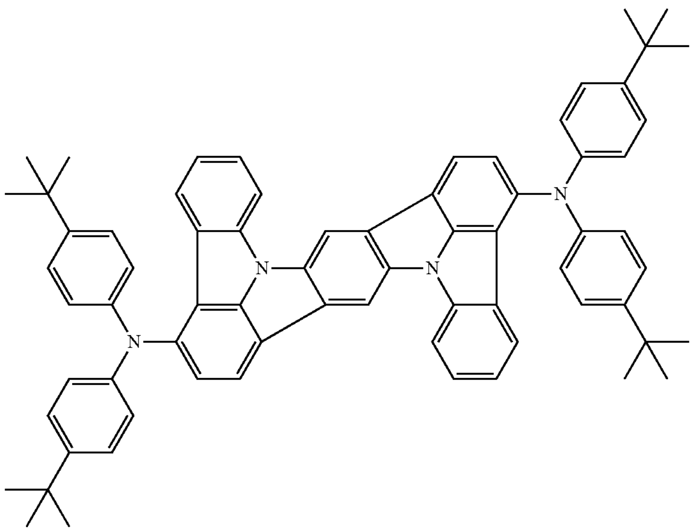

-continued
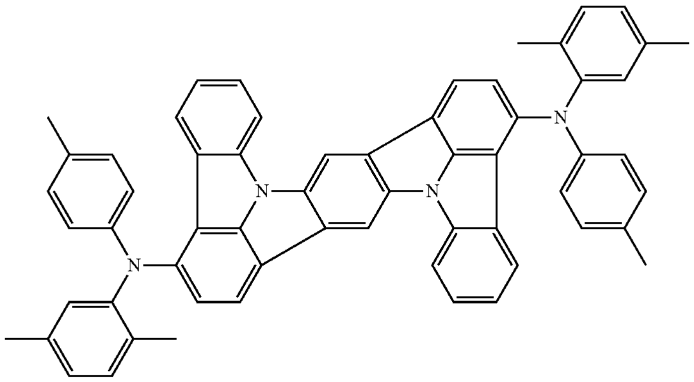
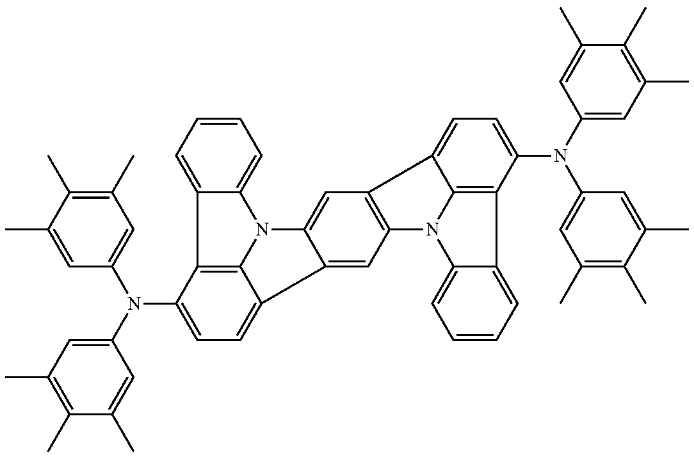
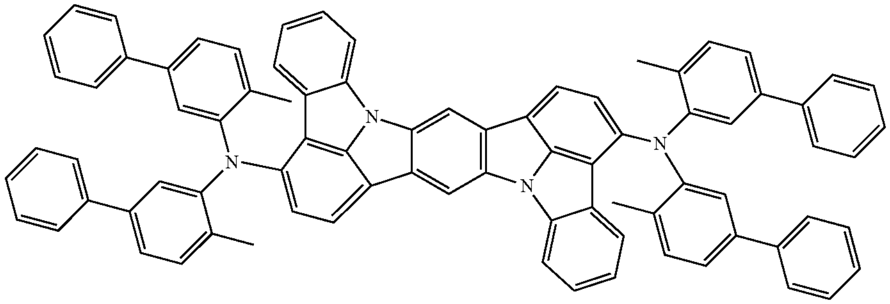
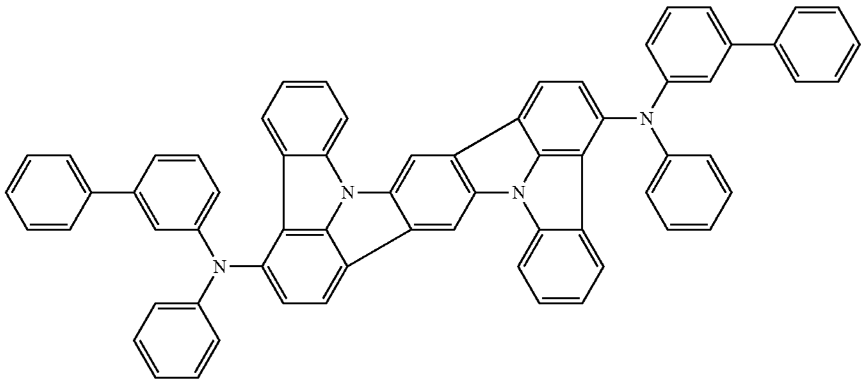

-continued
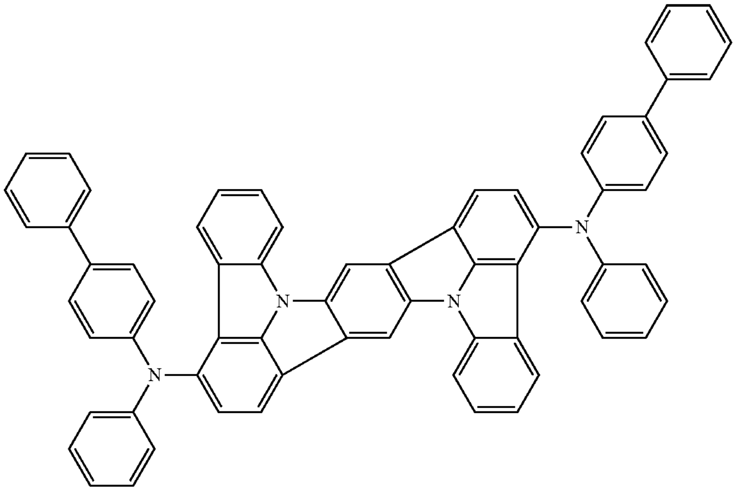
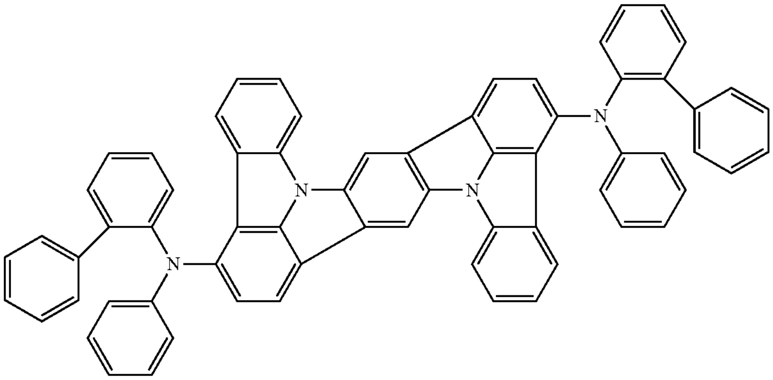
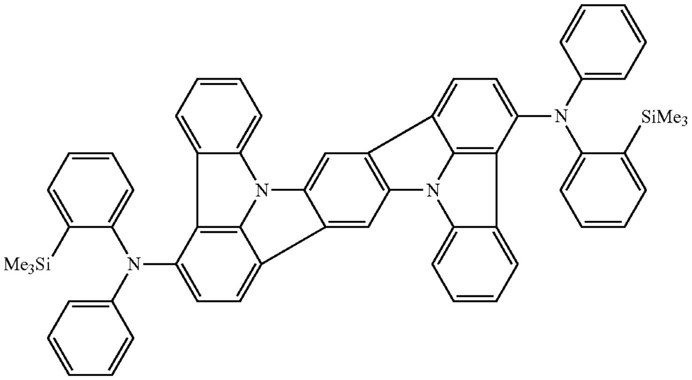
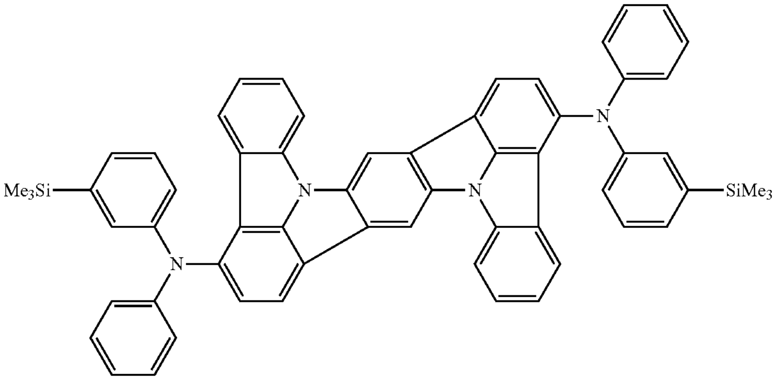

-continued
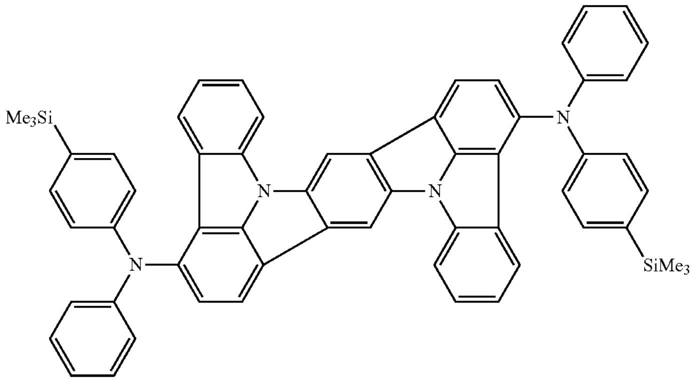
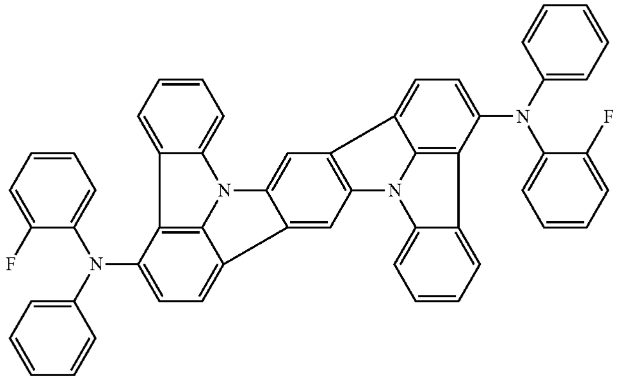
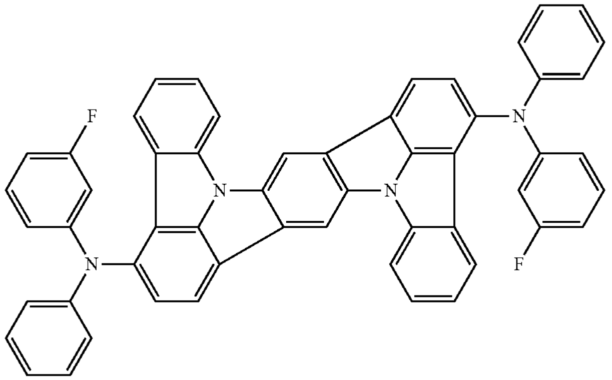
[Formula 304]
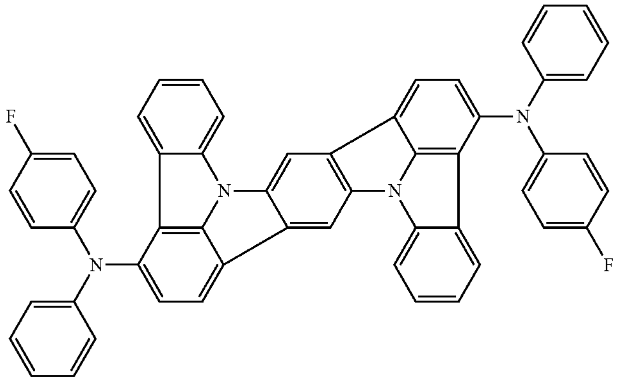

-continued
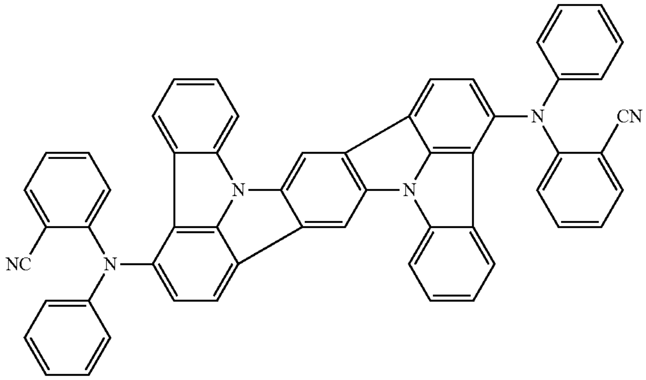
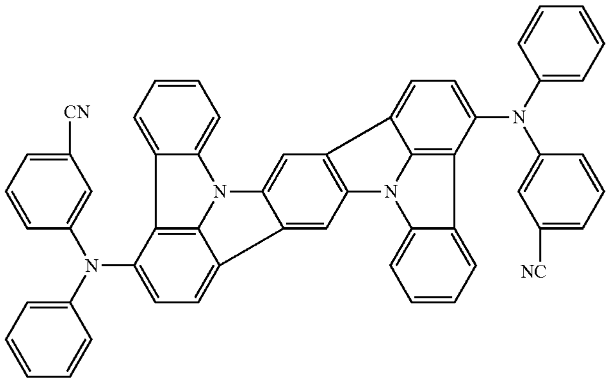
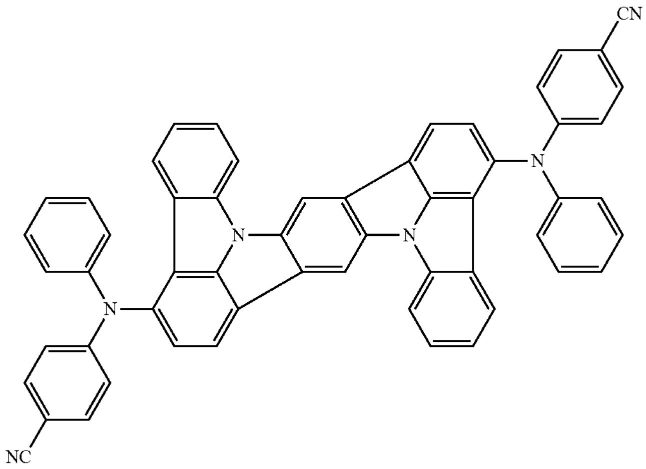
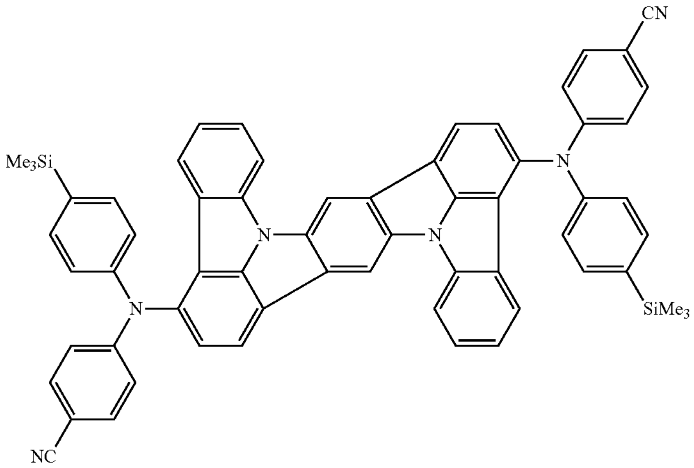

-continued
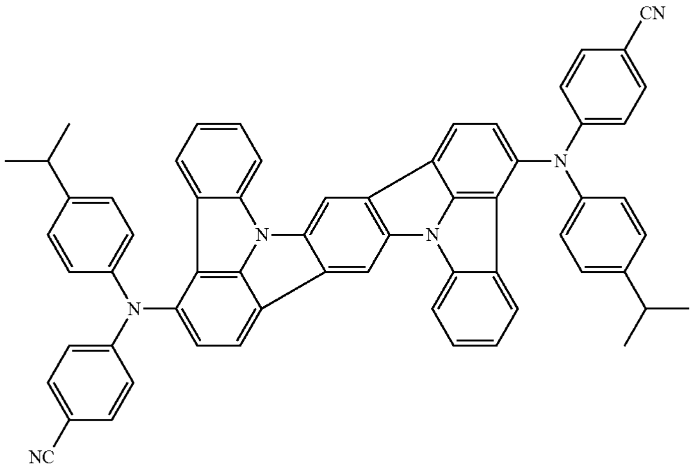
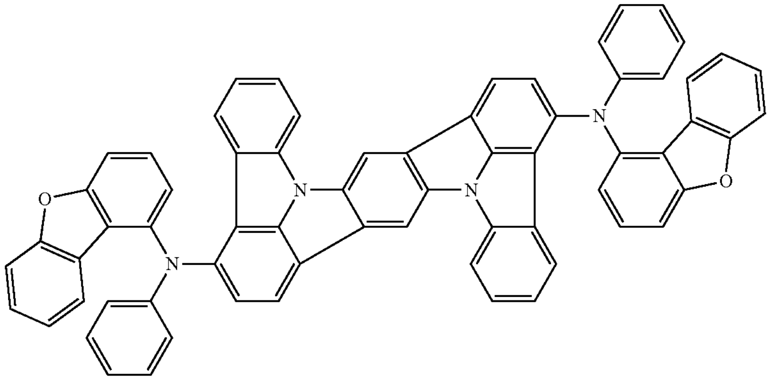
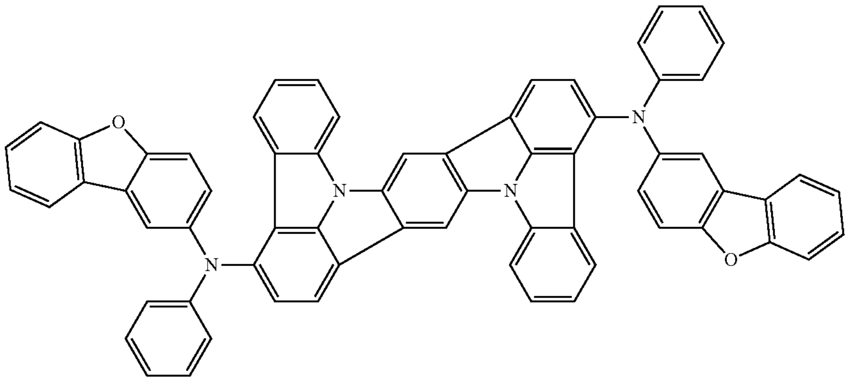
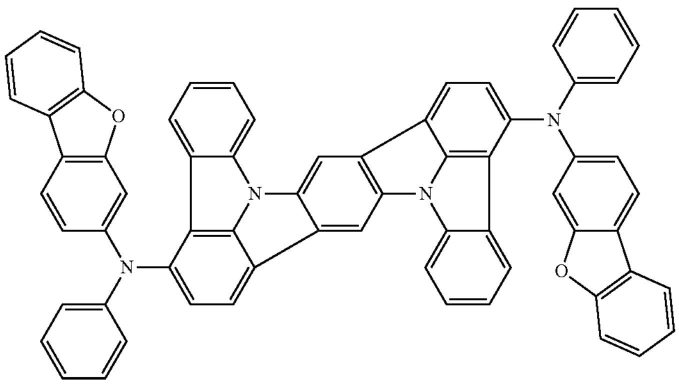

-continued
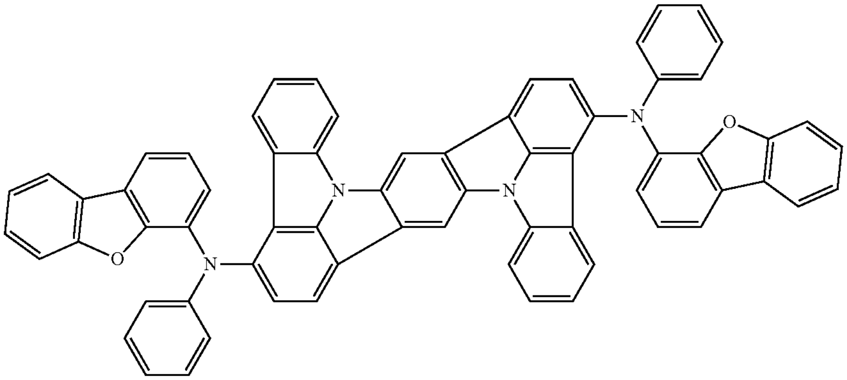
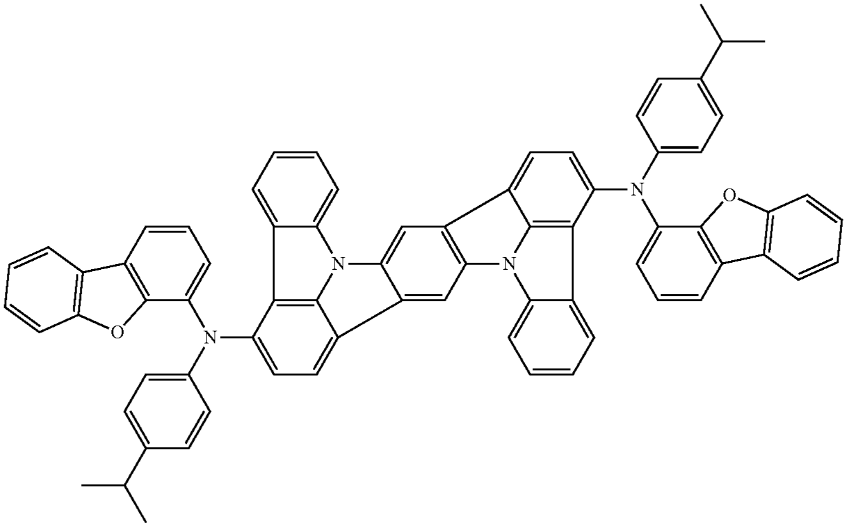
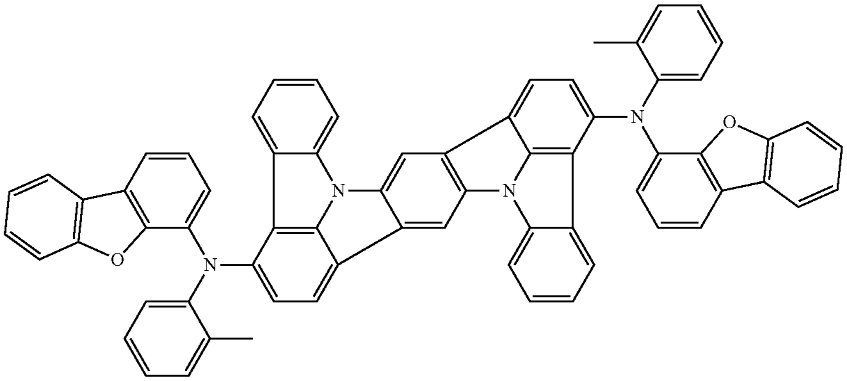

-continued
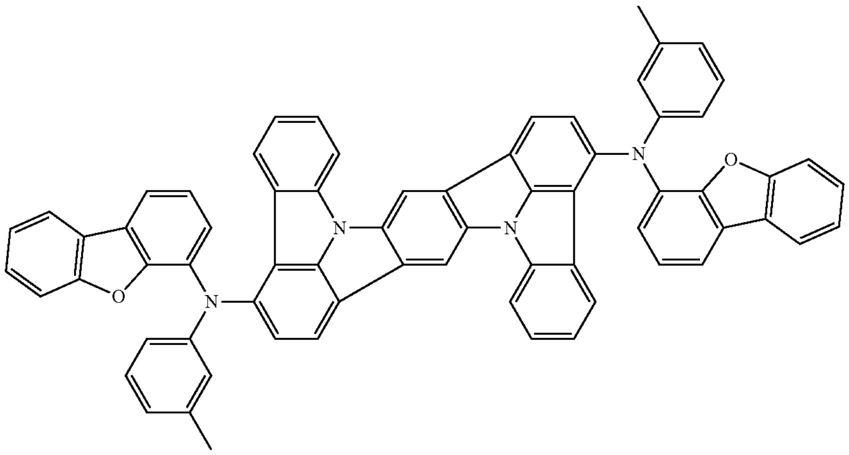
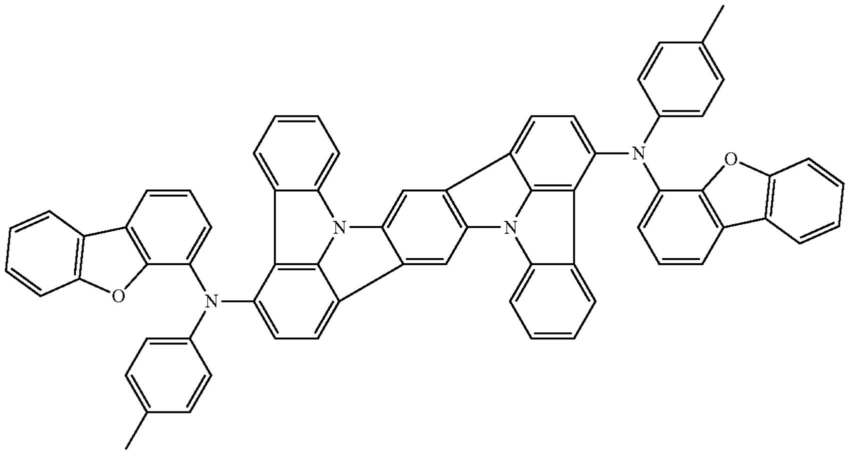
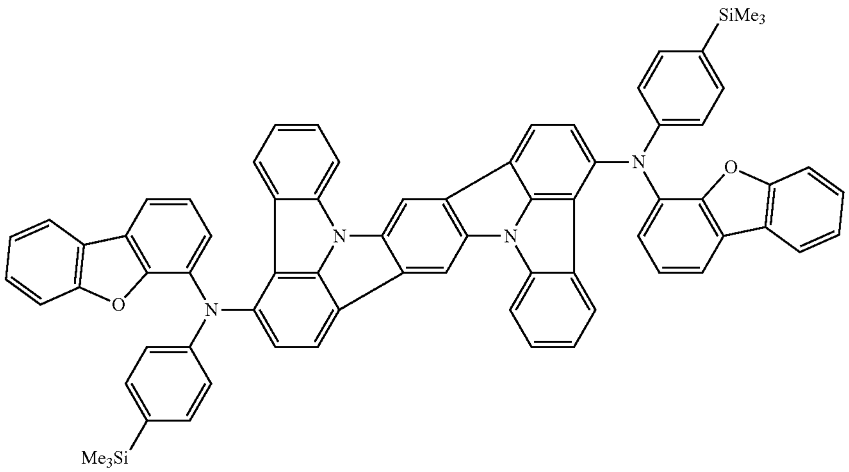

-continued
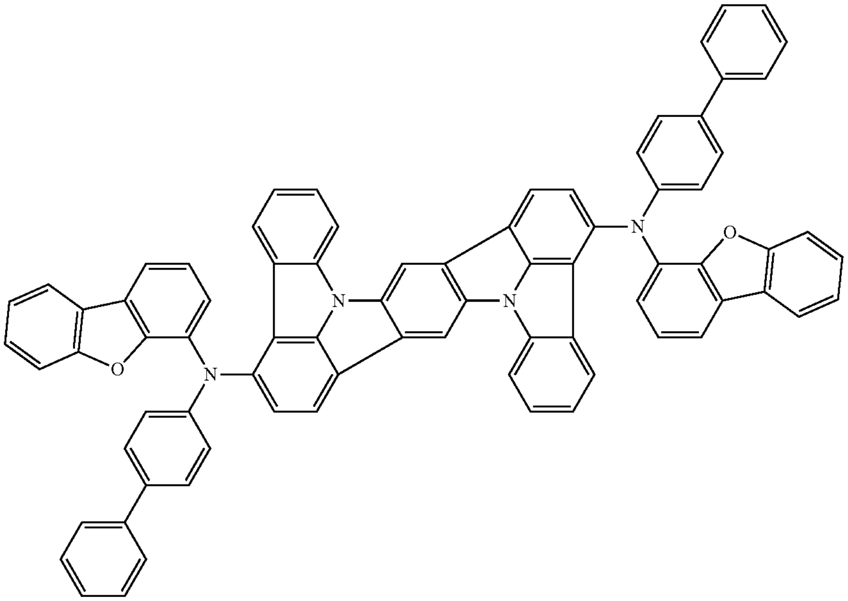
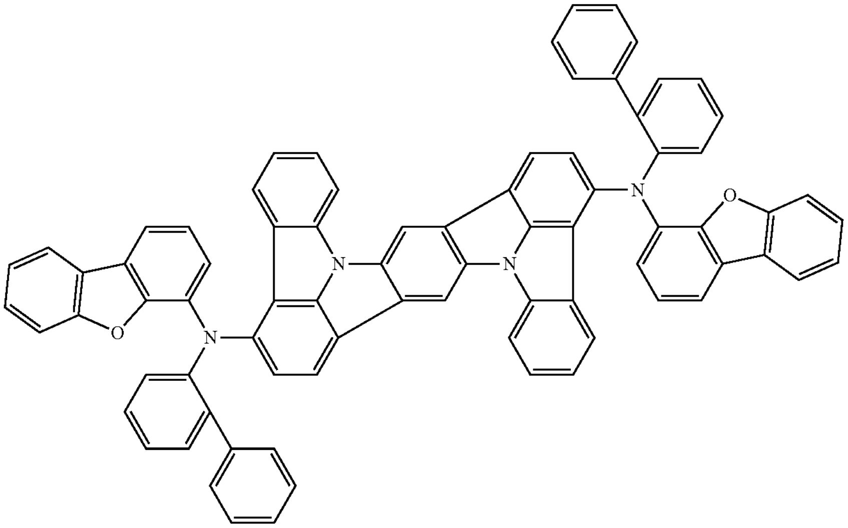
[Formula 305]
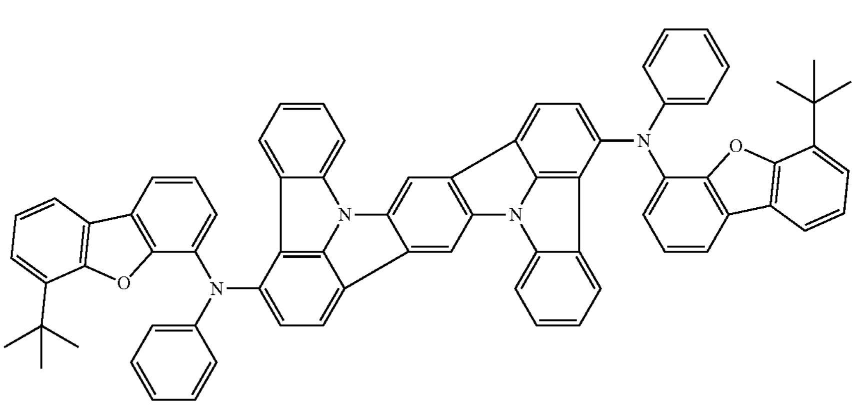

-continued
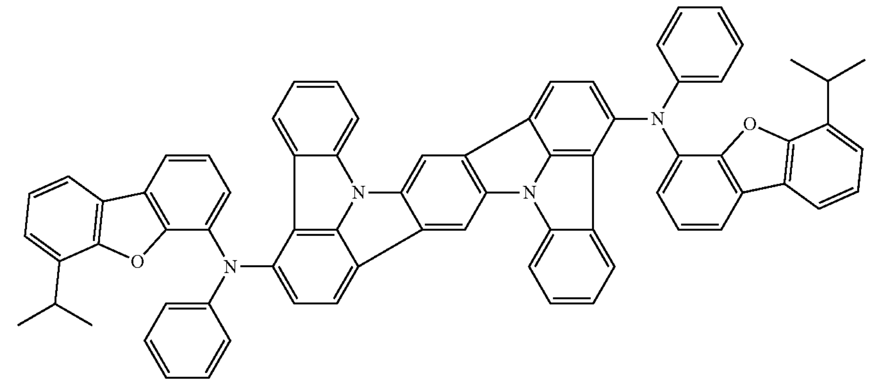
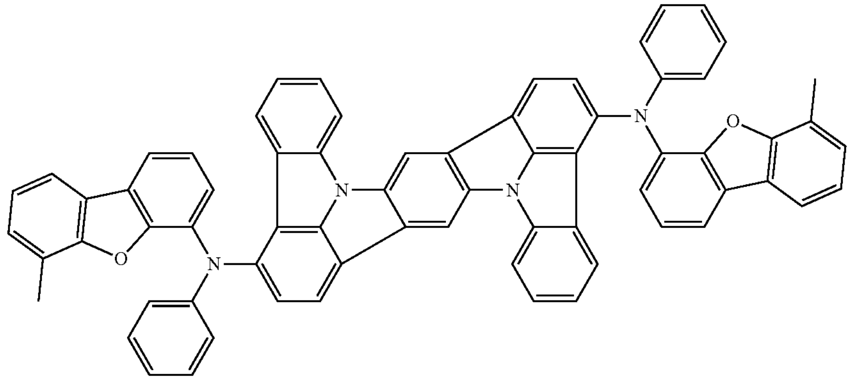
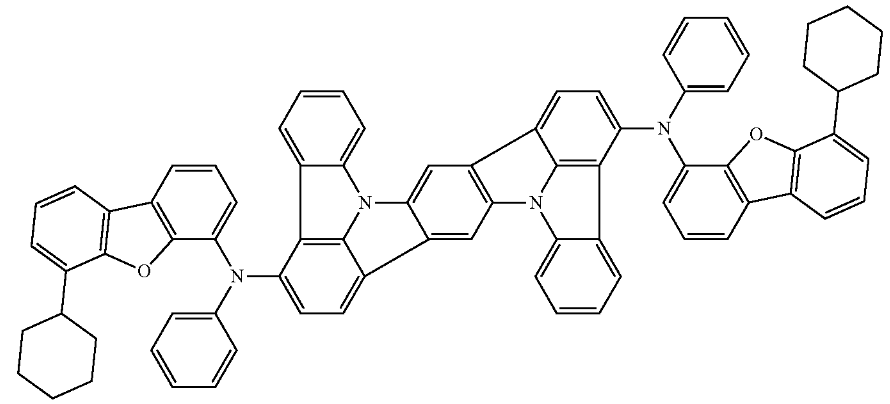
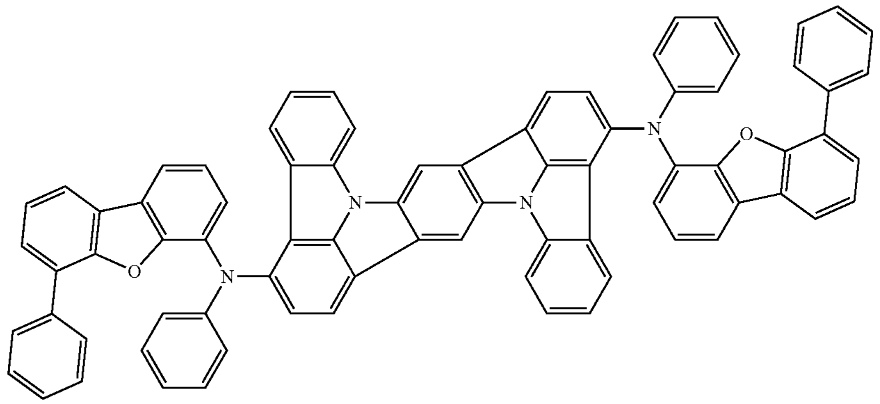

-continued
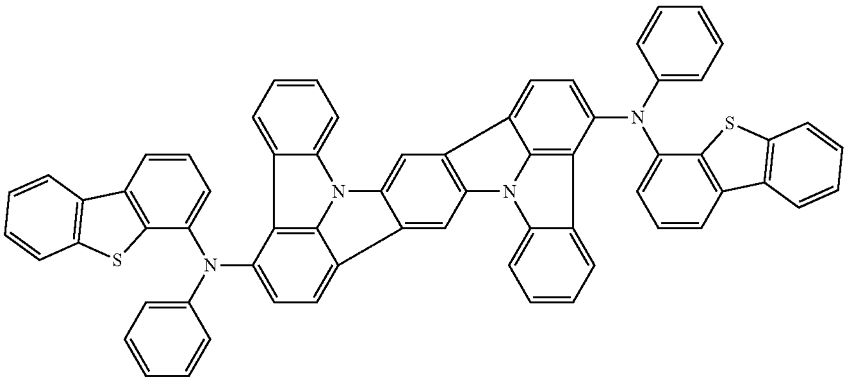
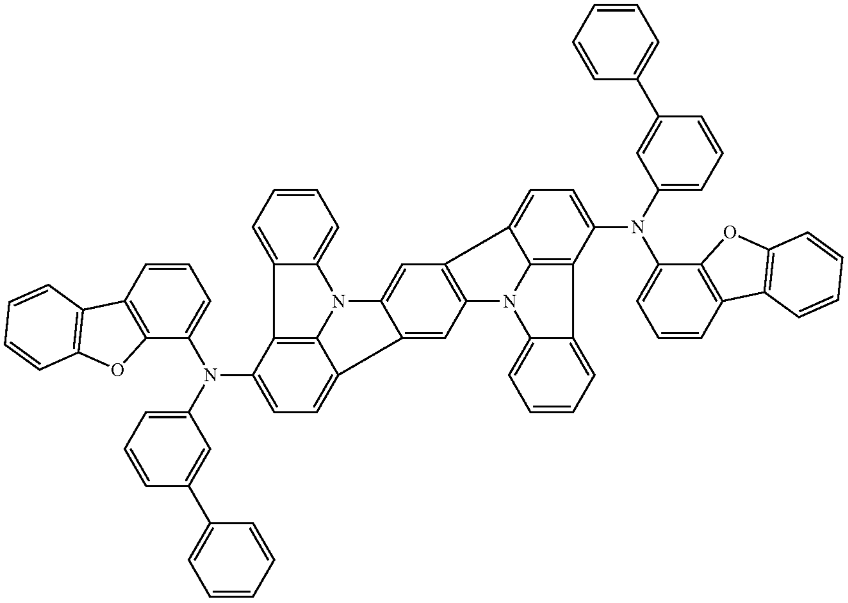
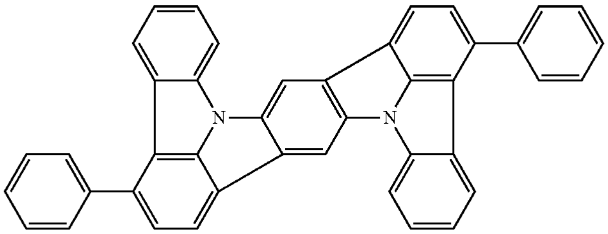
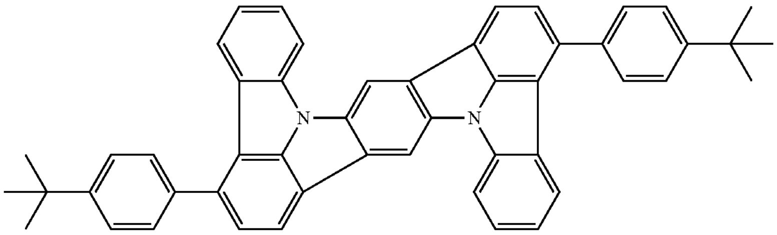
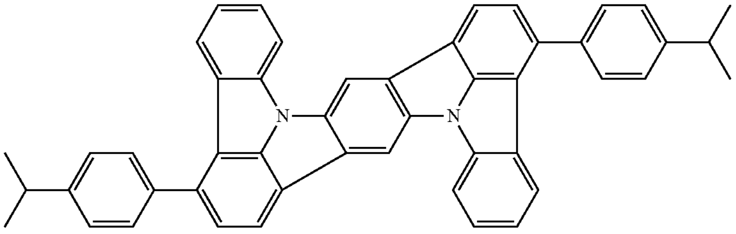

-continued
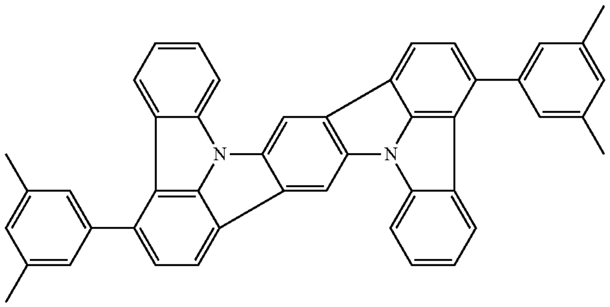
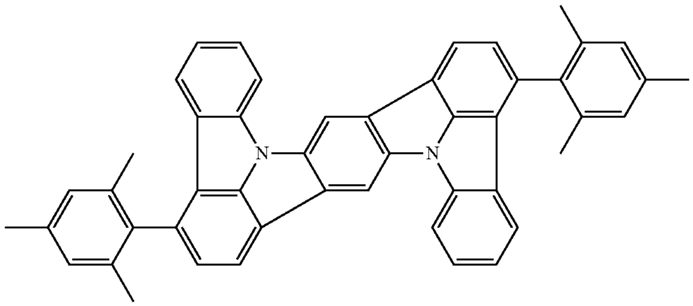
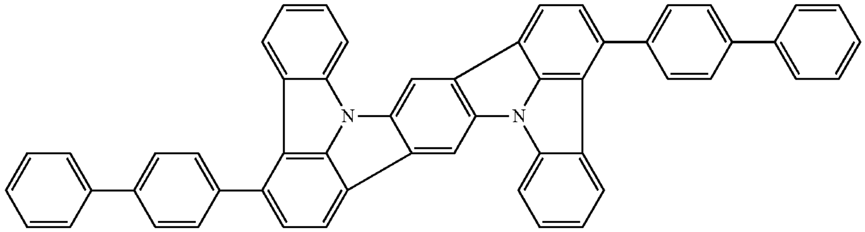
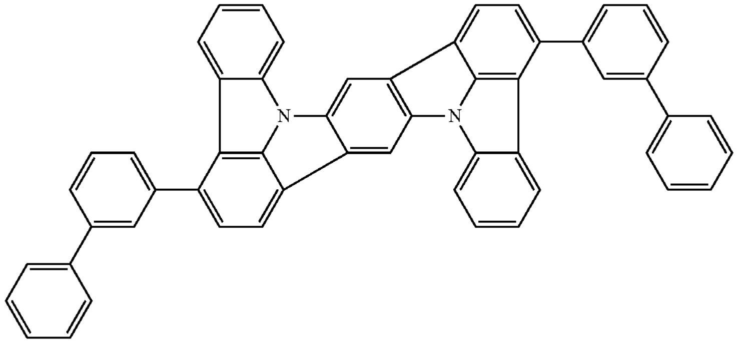
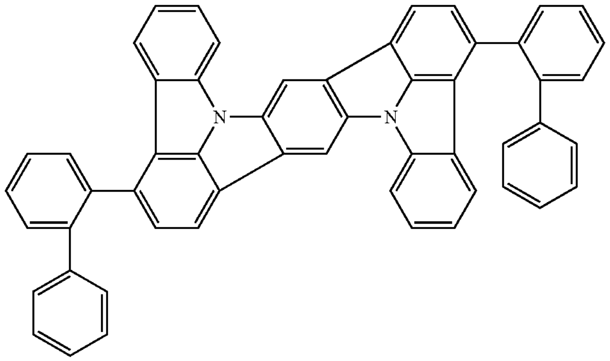

-continued
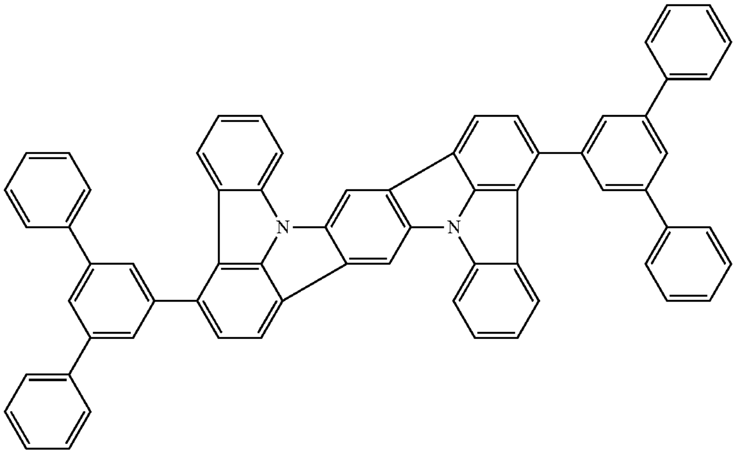
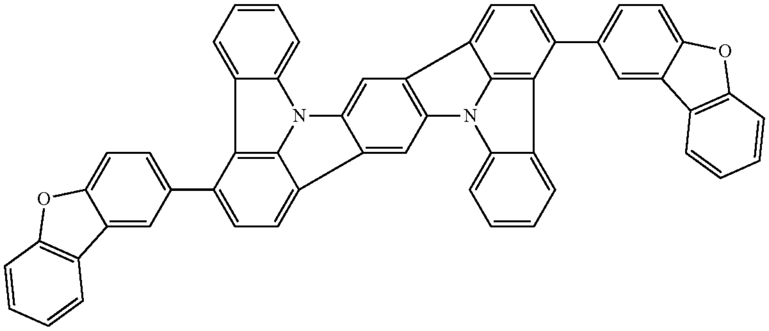
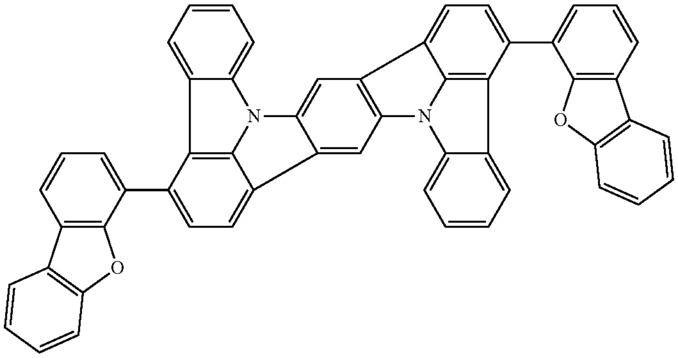
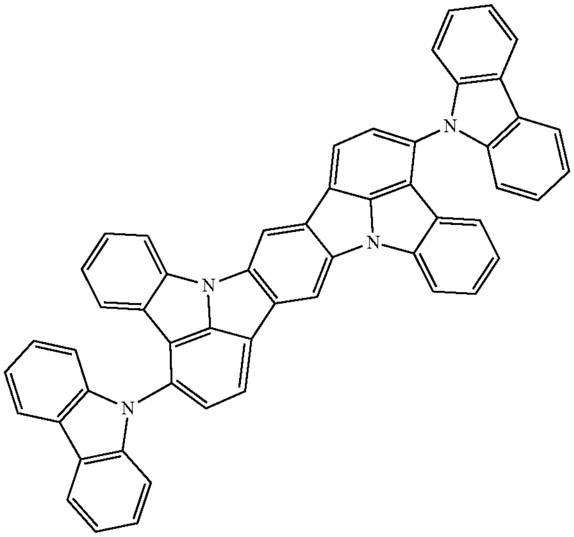

-continued
[Formula 306]
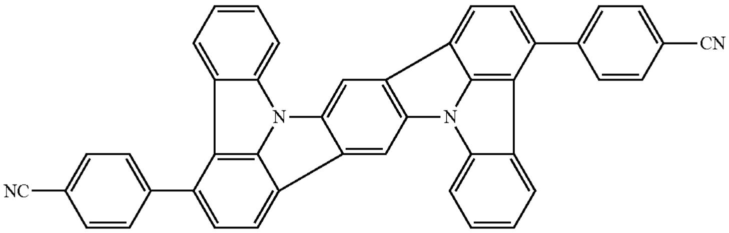
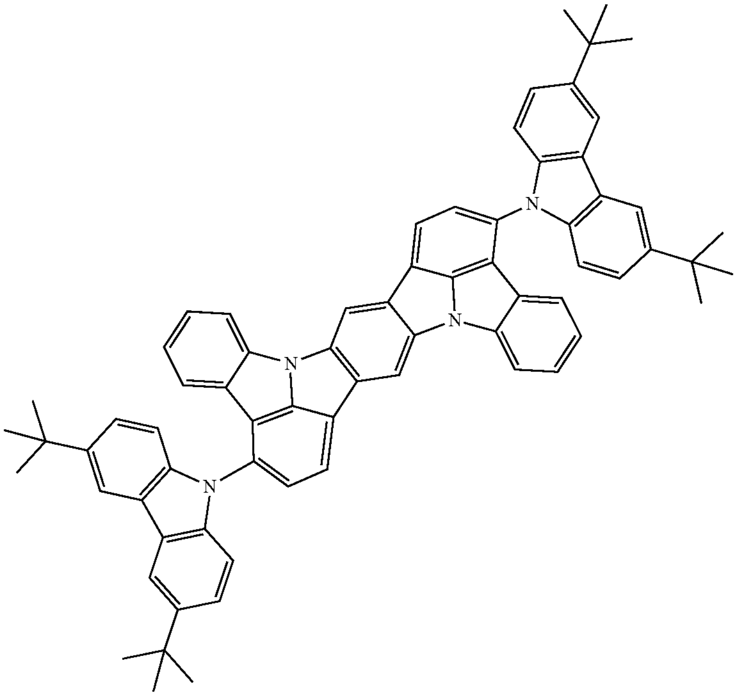
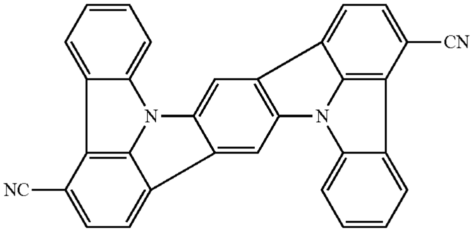
[Formula 307]
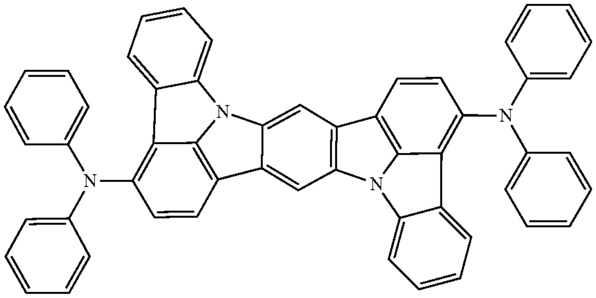

-continued
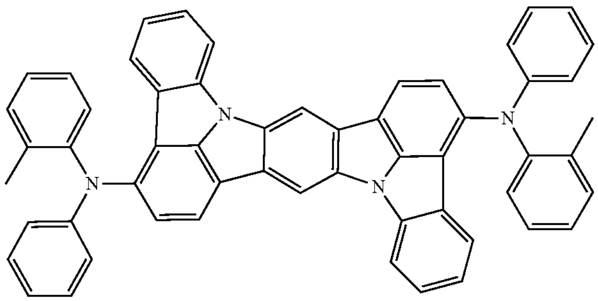
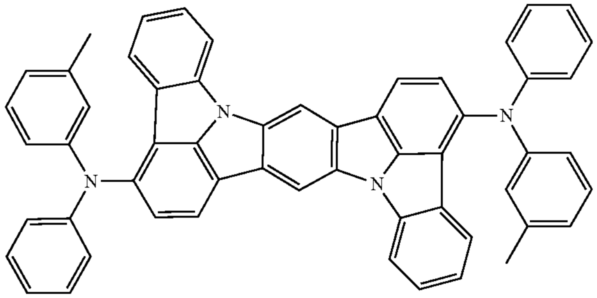
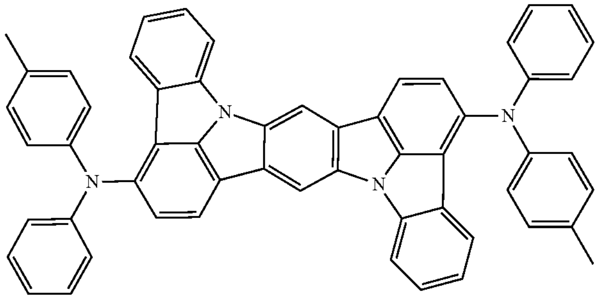
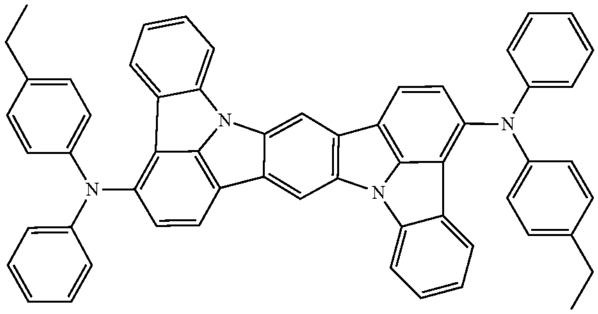
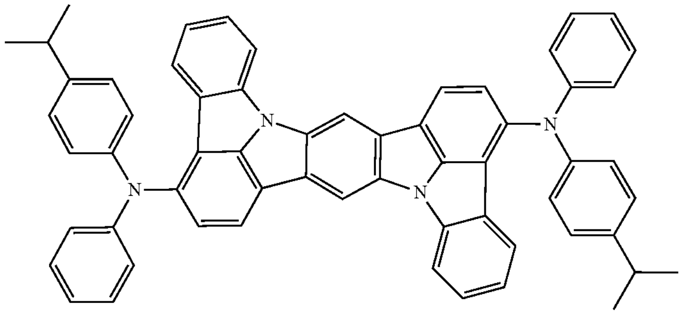

-continued
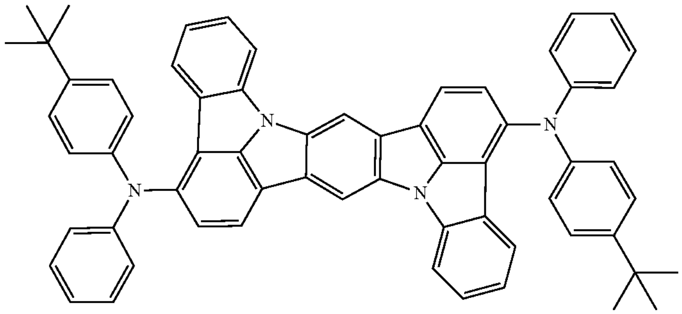
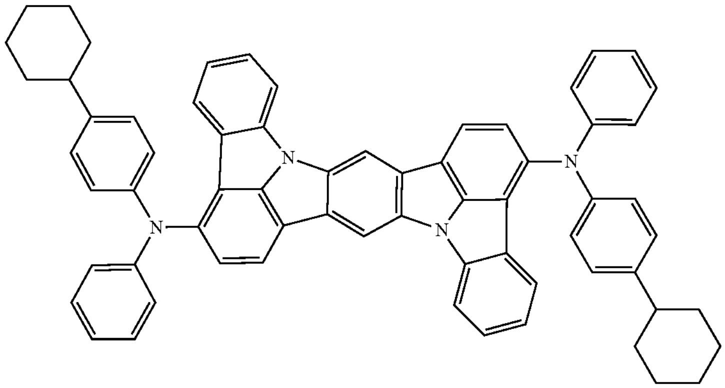
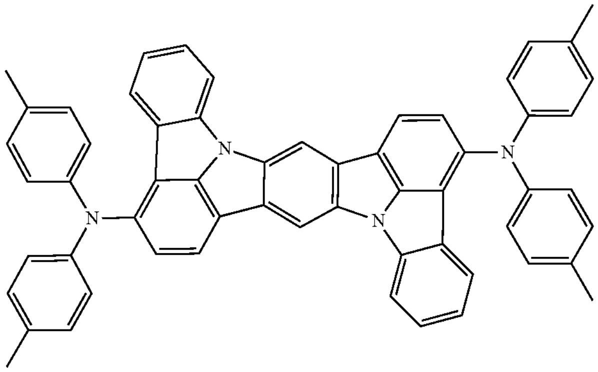
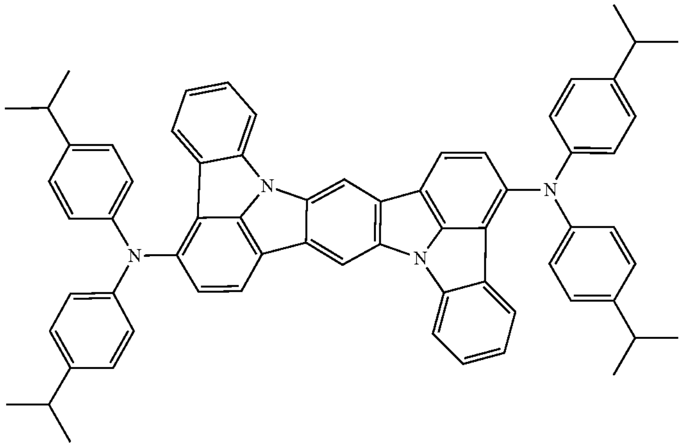

-continued
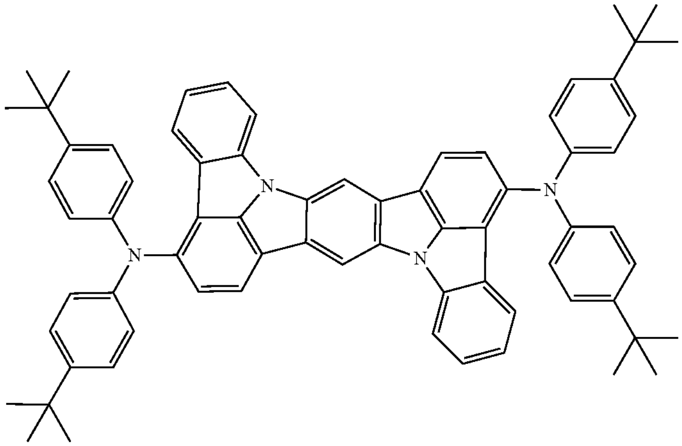
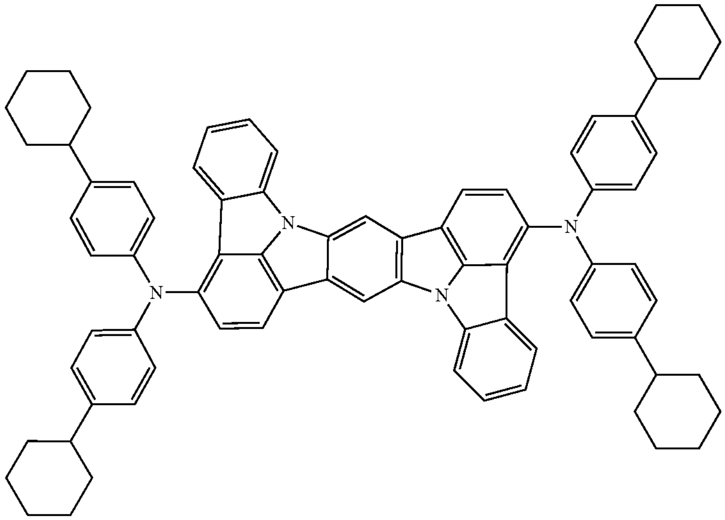
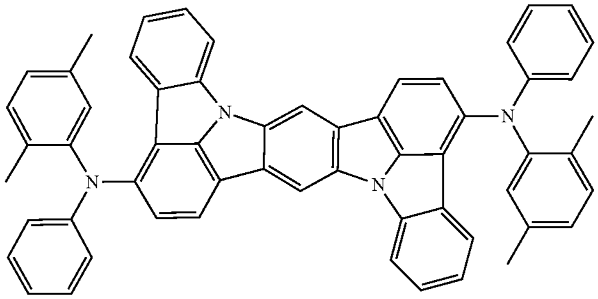
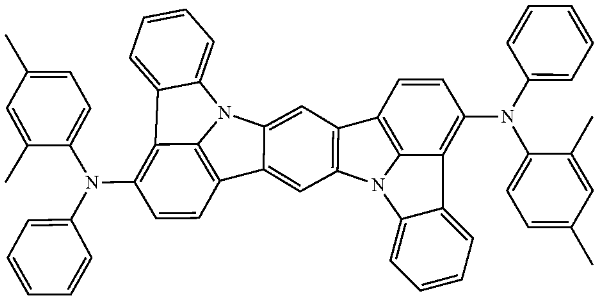

-continued
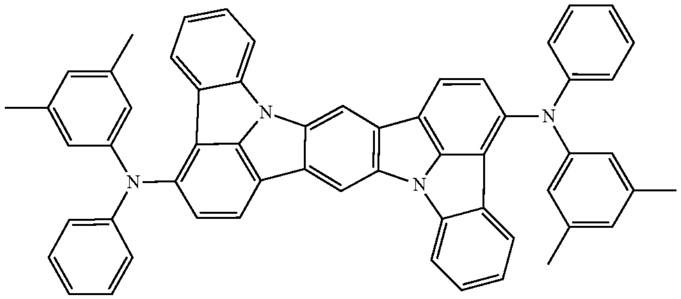
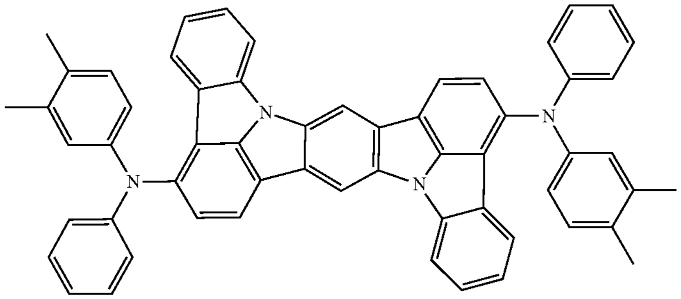
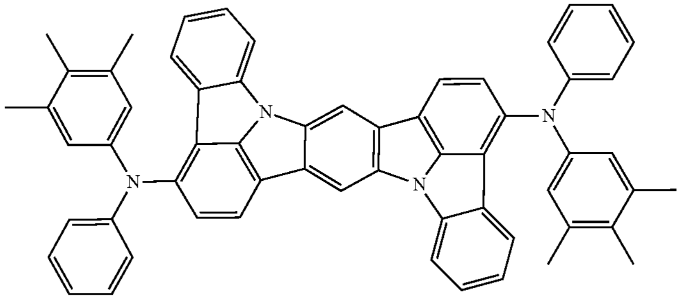
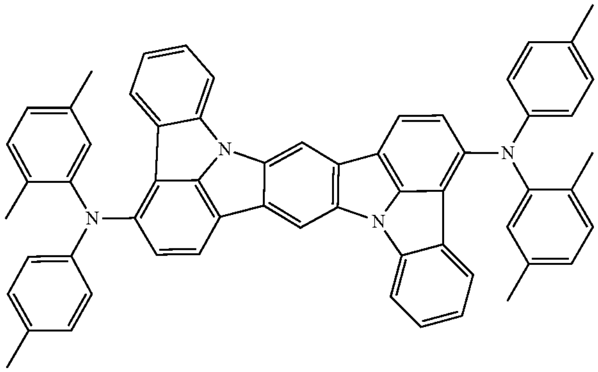
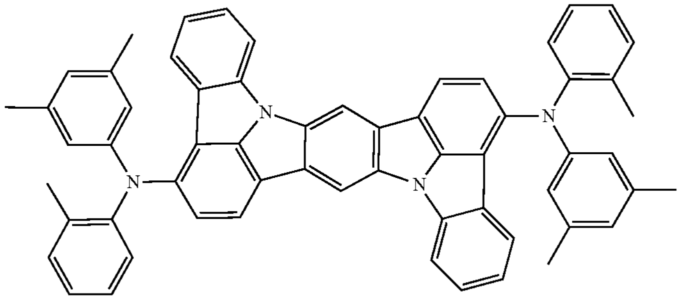

-continued
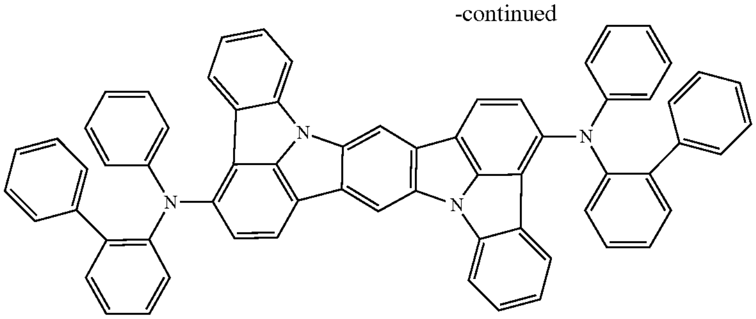
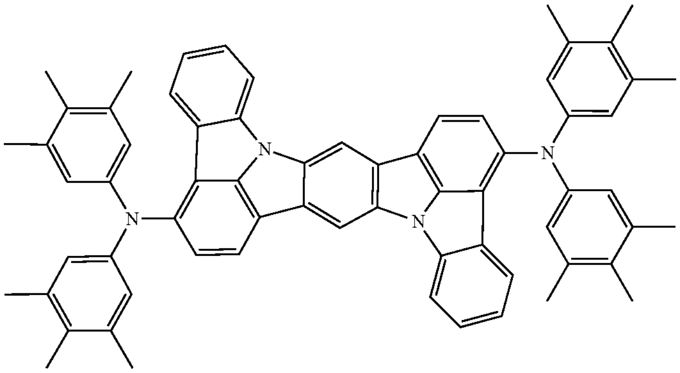
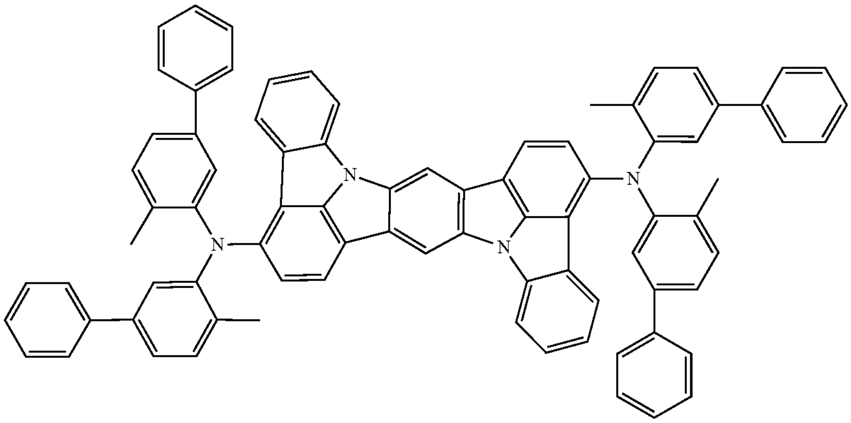
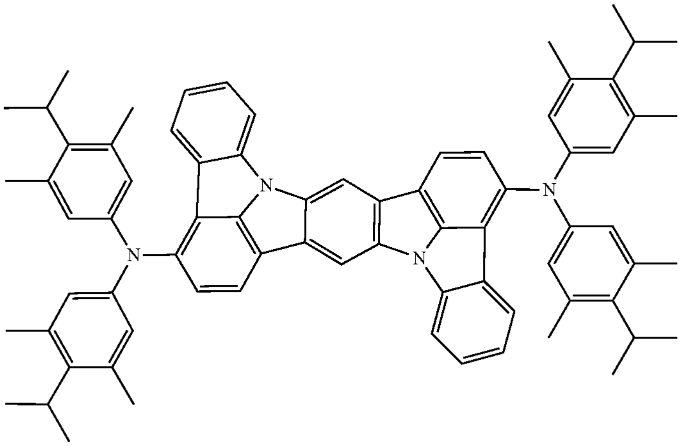

-continued
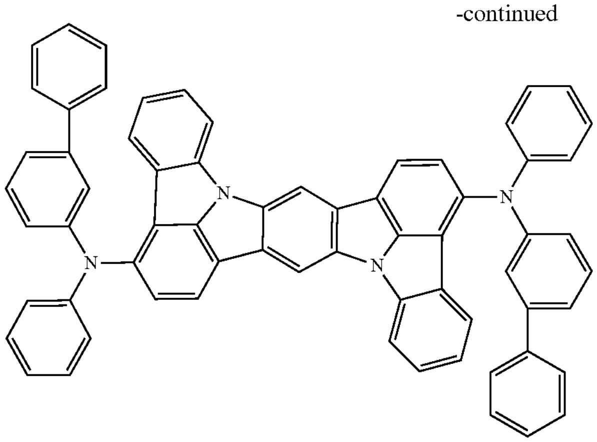
[Formula 308]
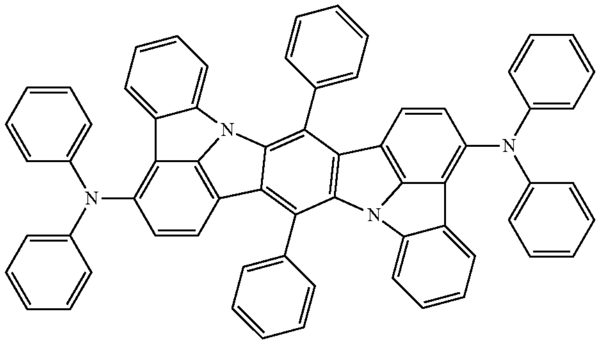
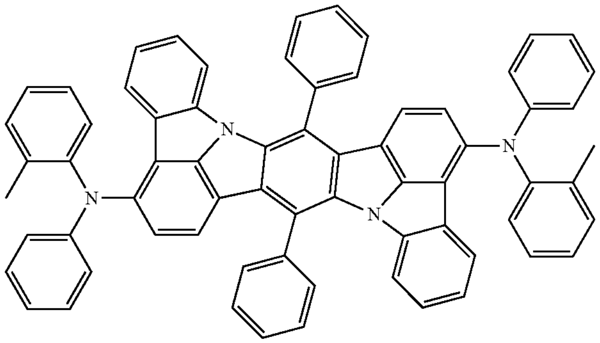
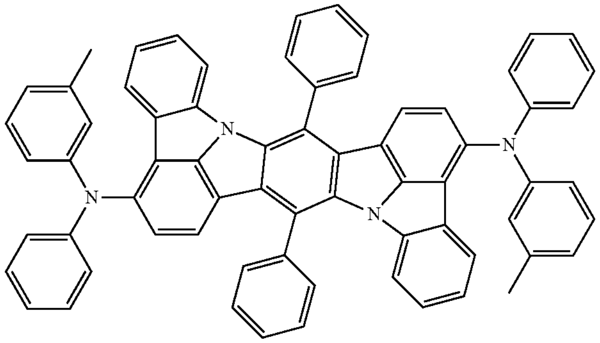

-continued
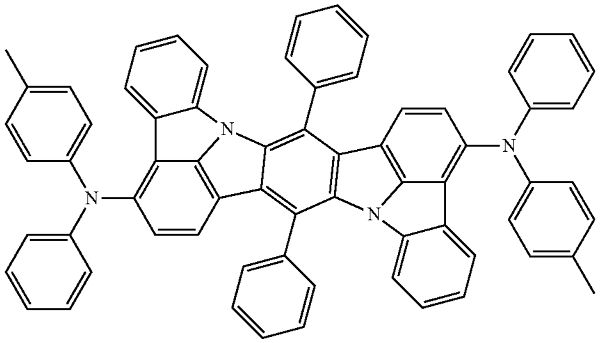
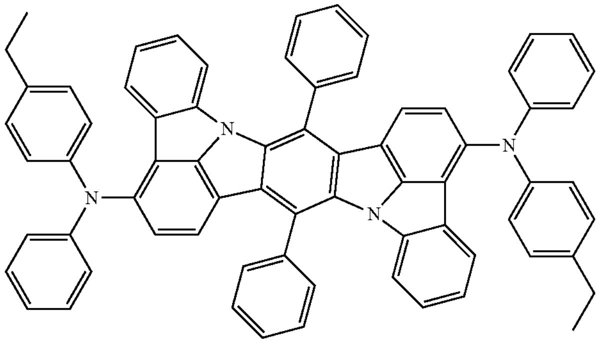
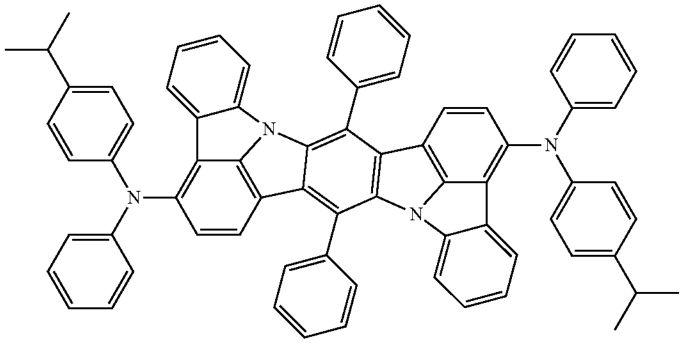
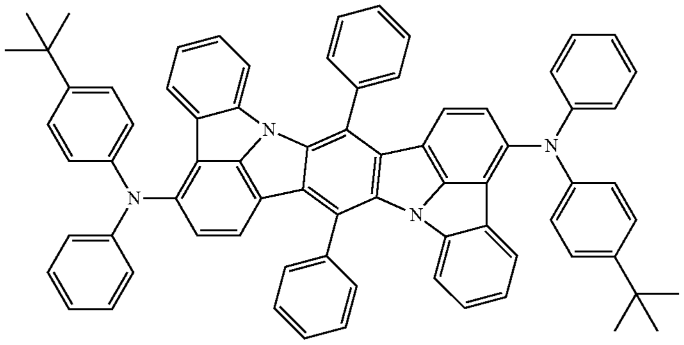

-continued
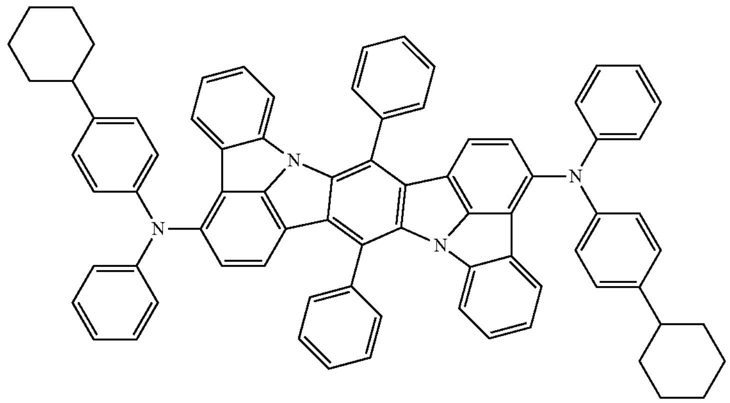
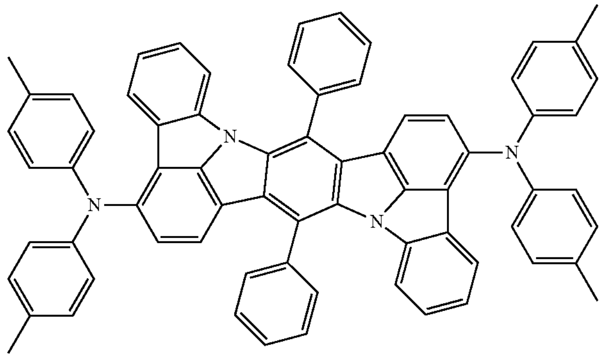
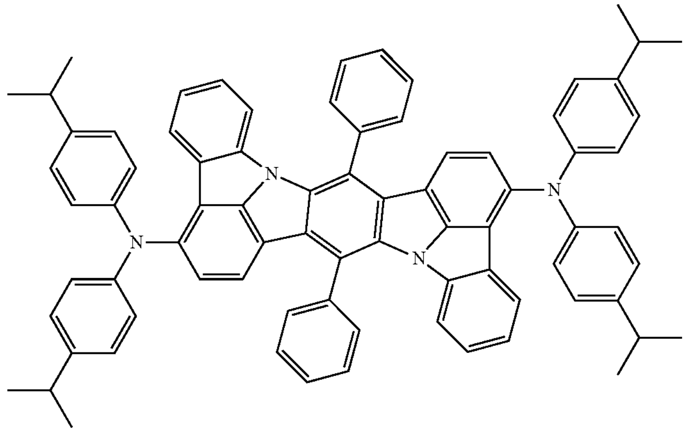
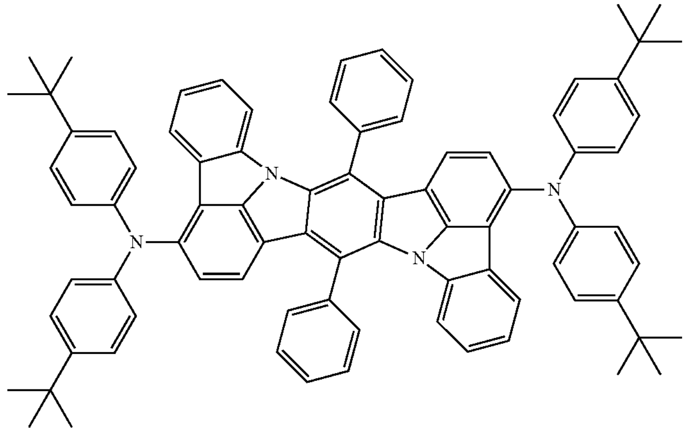

-continued
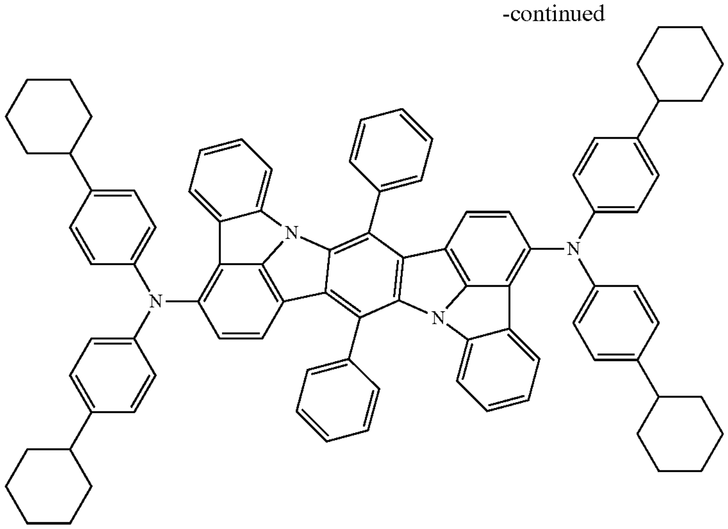
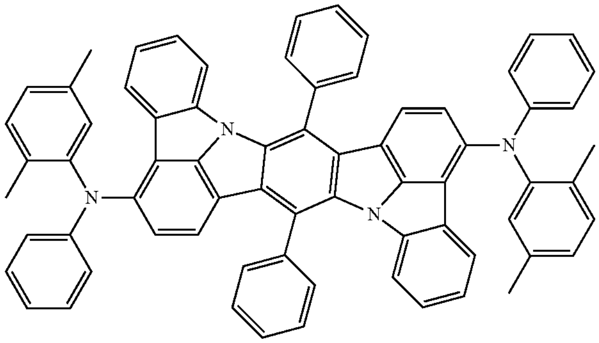
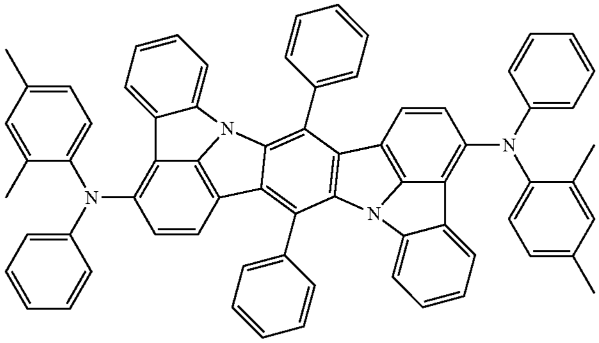
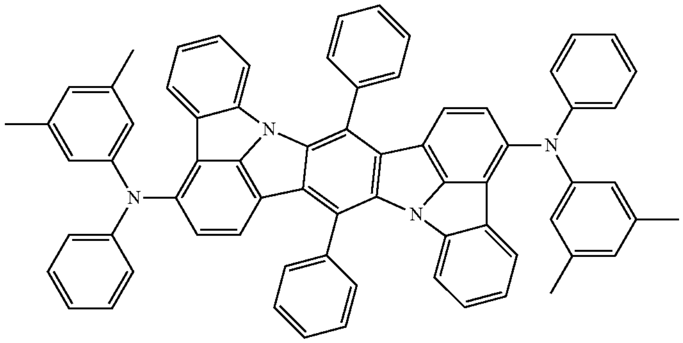

-continued
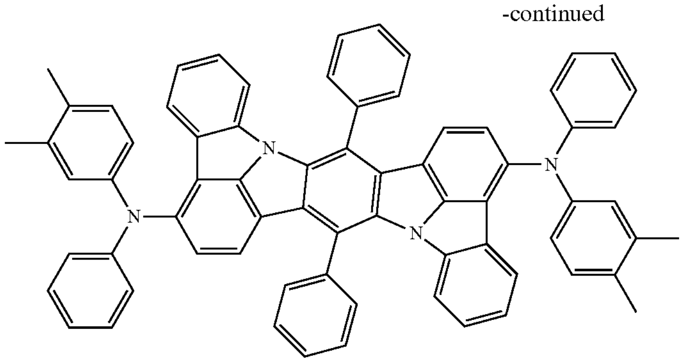
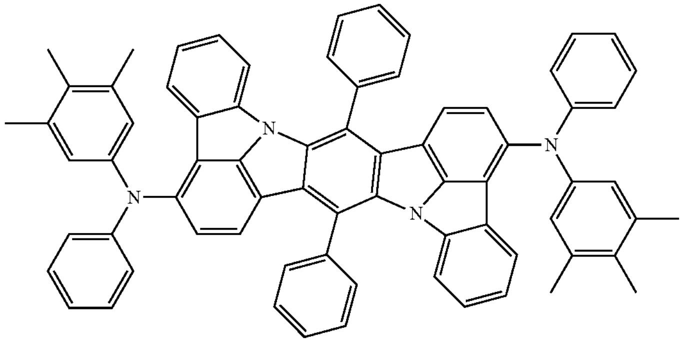
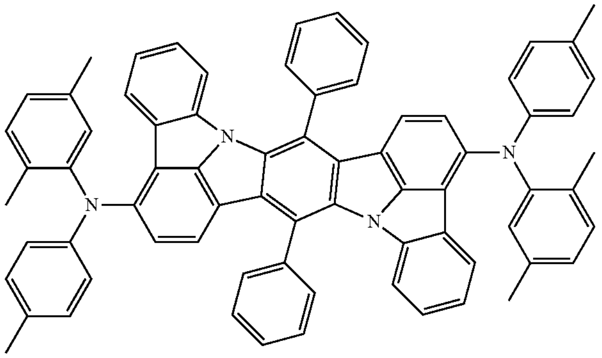
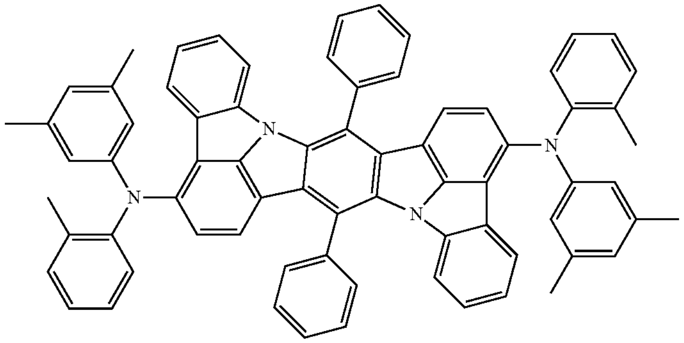
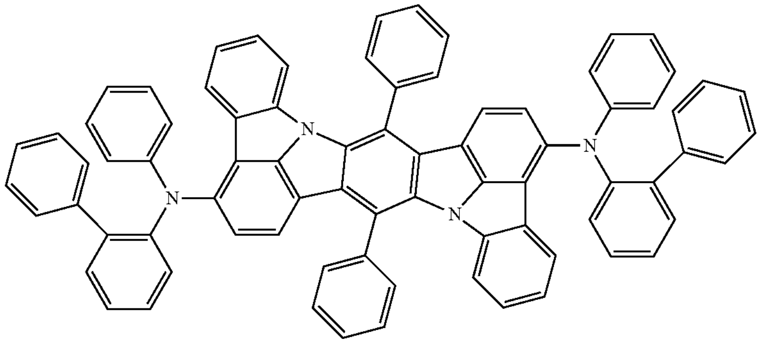

-continued
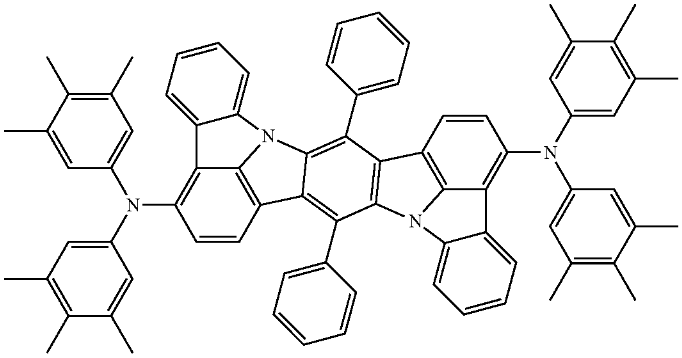
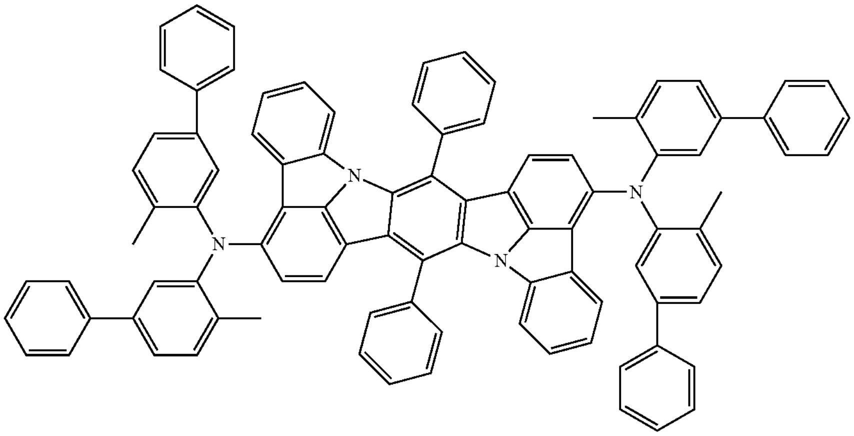
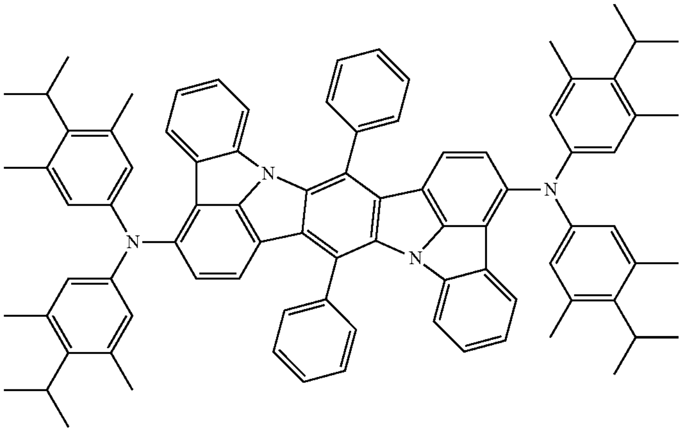
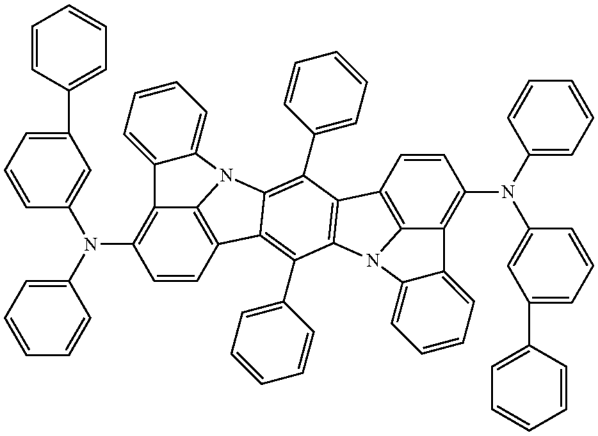

-continued
[Formula 309]
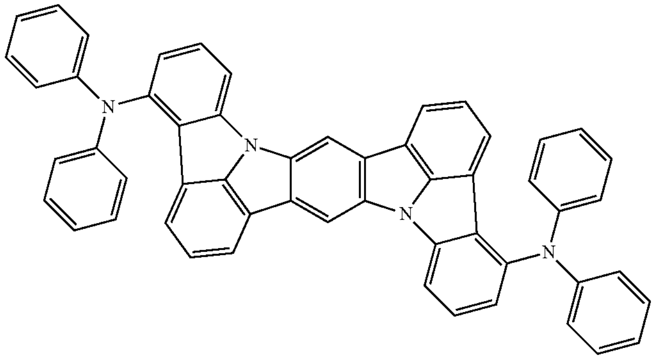
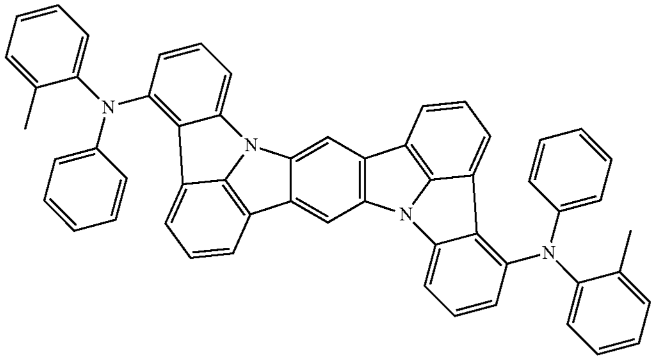
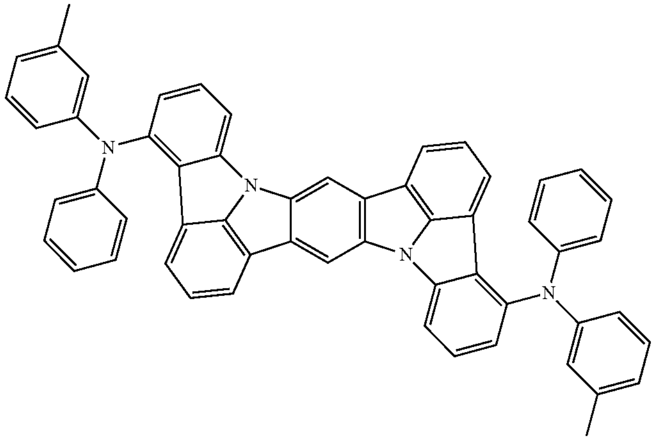
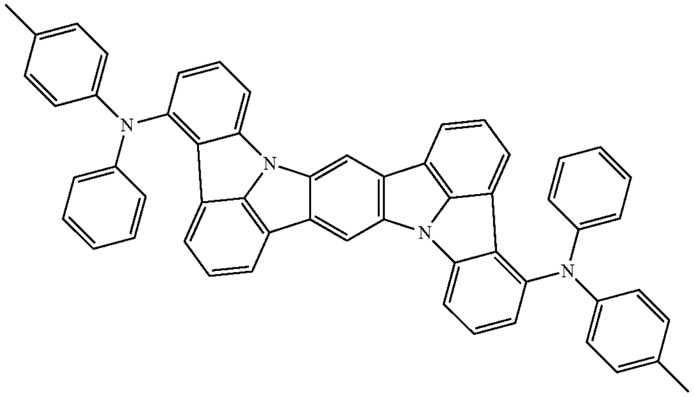

-continued
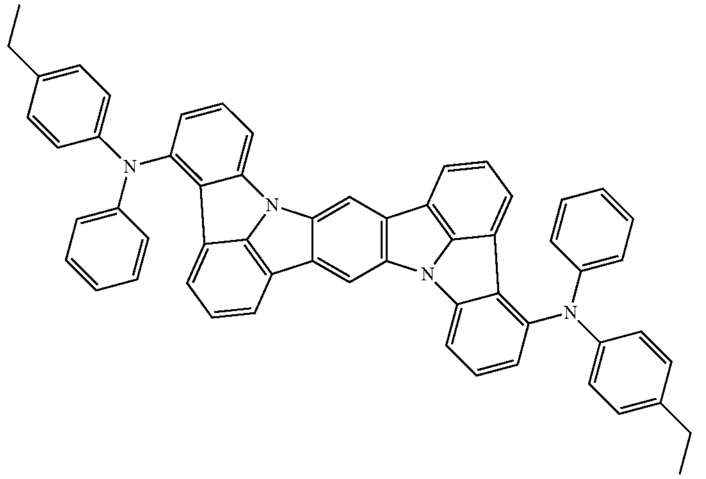
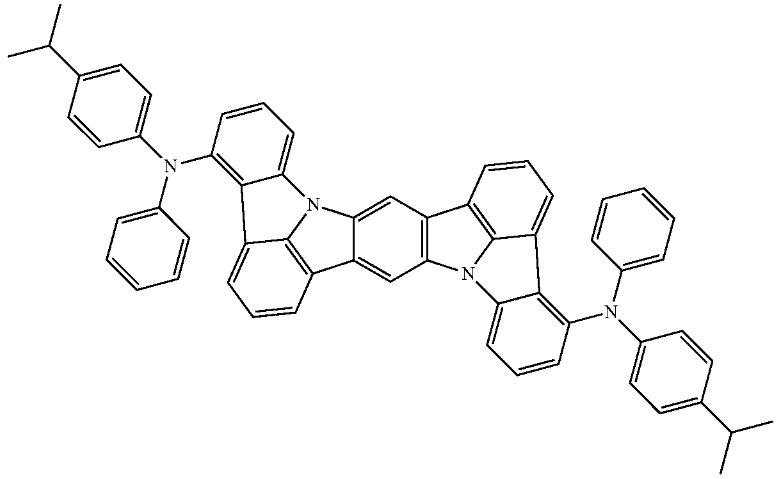
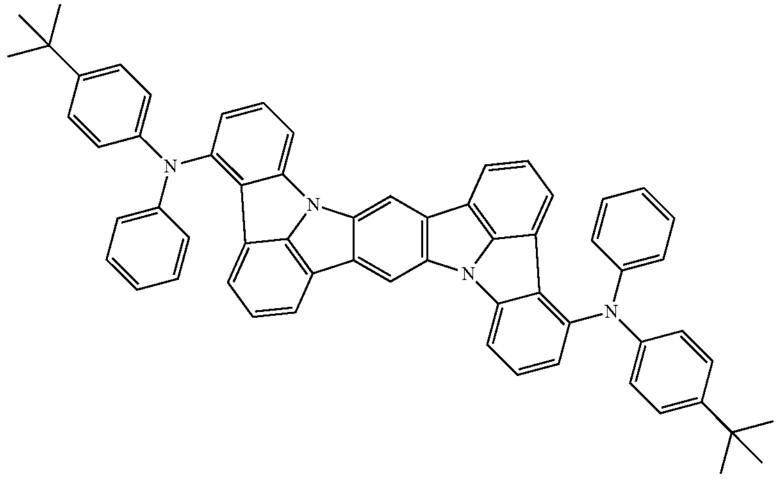

-continued
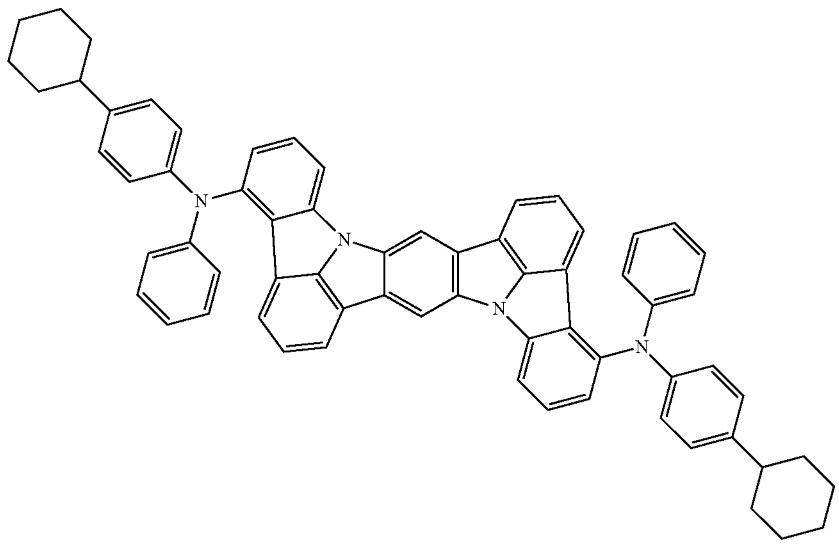
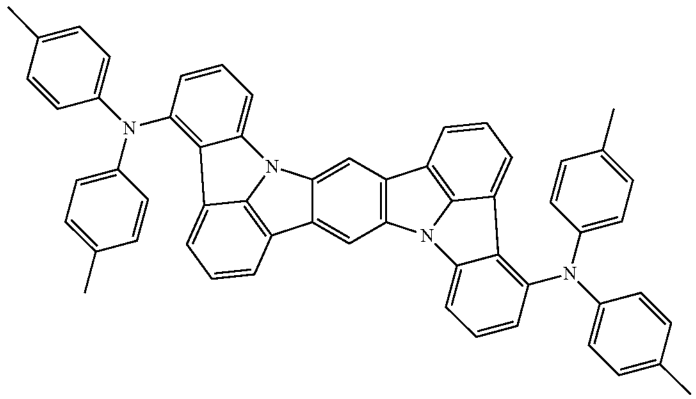
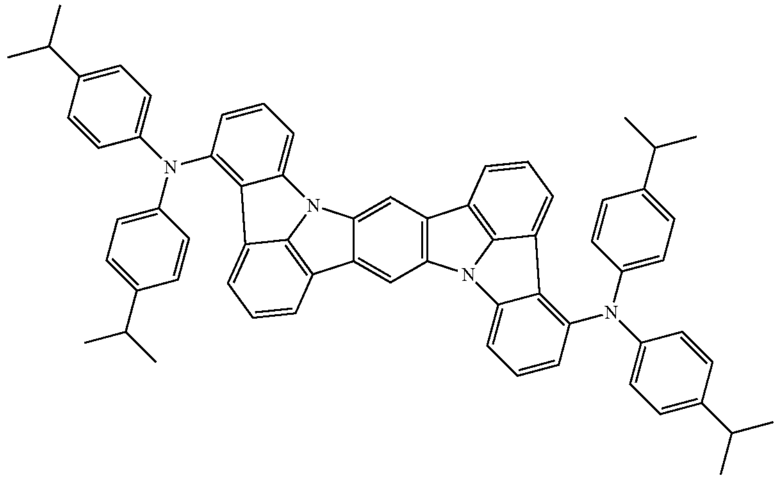

-continued
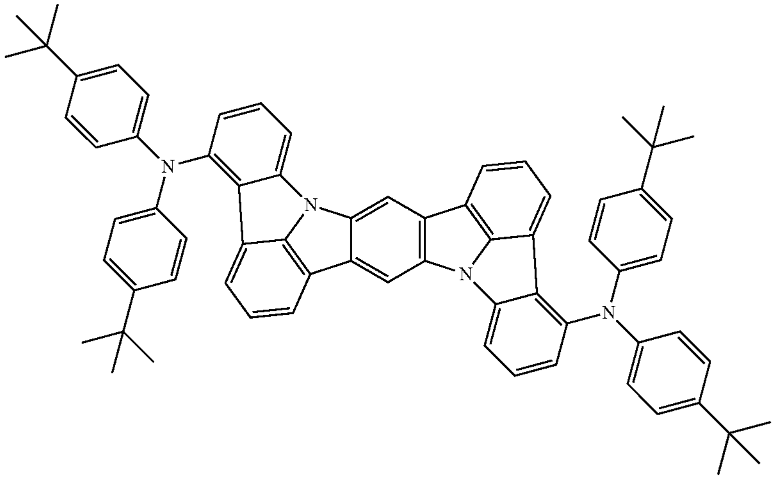
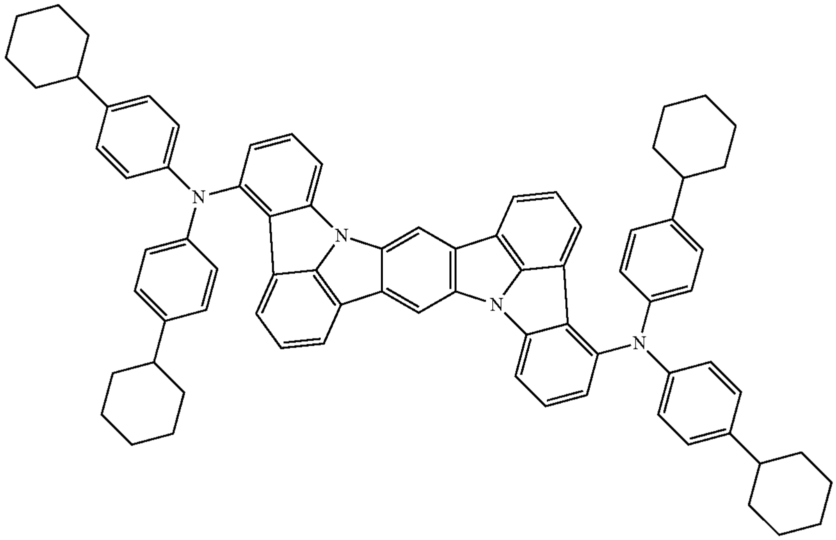
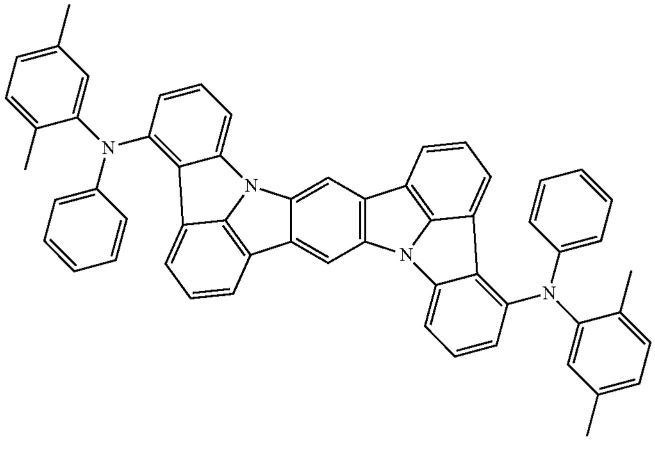

-continued
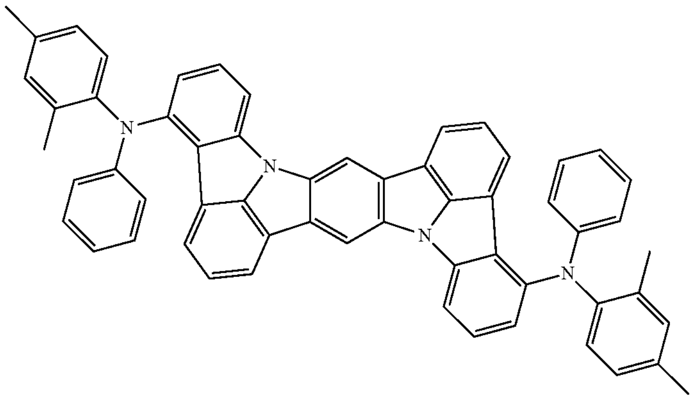
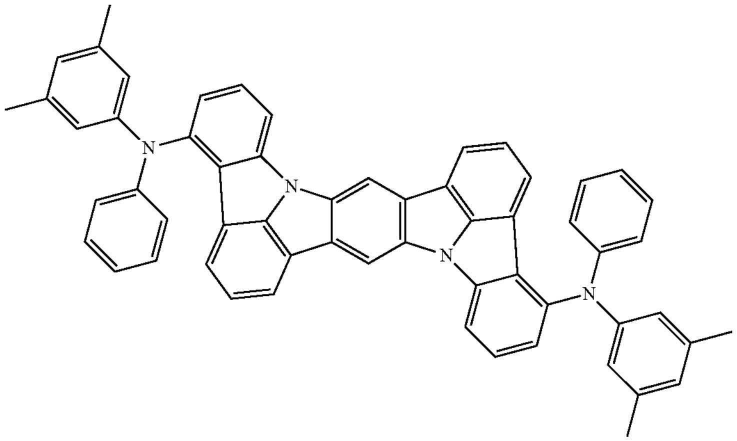
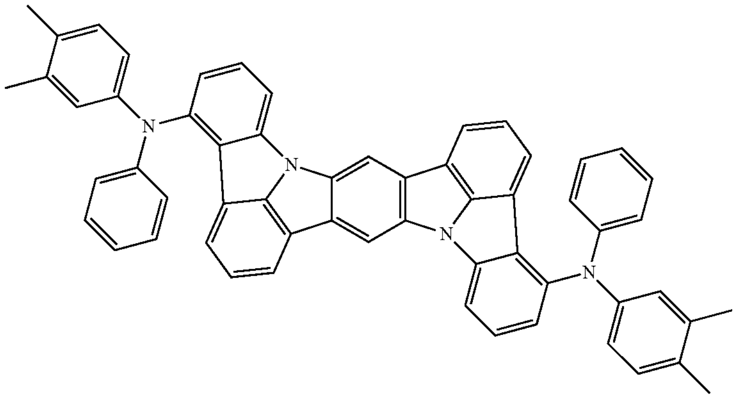
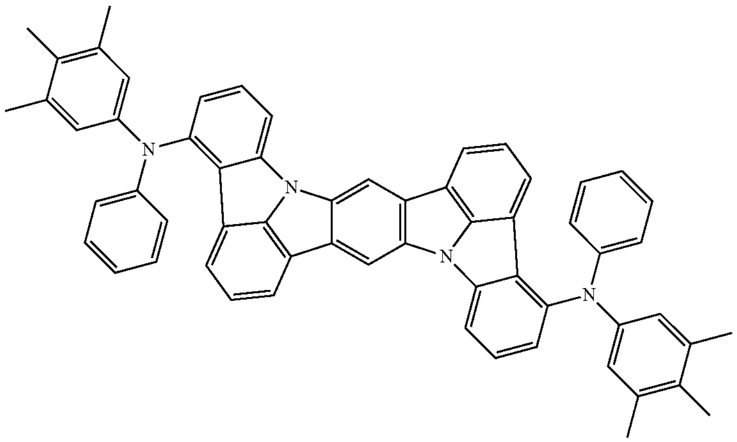

-continued
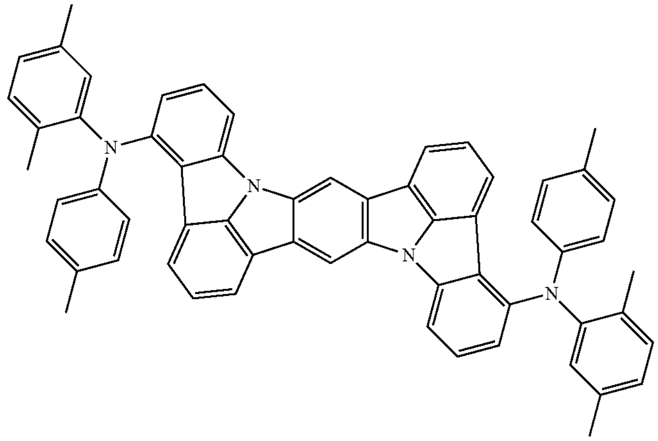
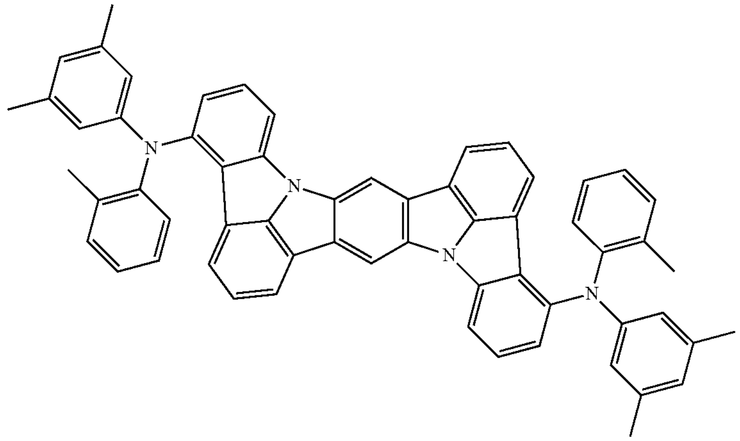
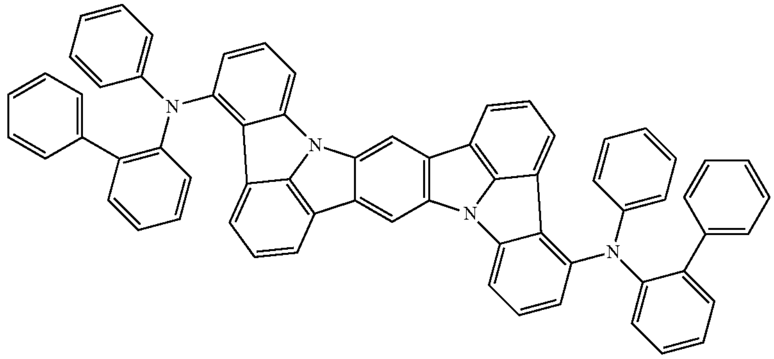
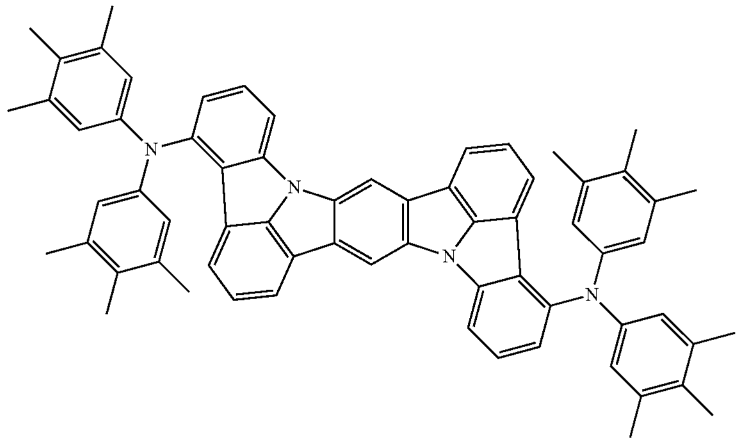

-continued
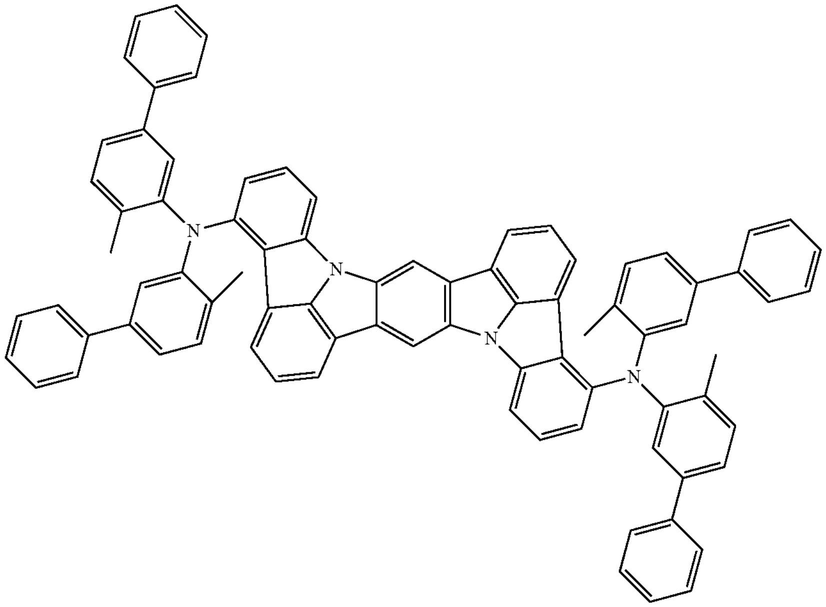
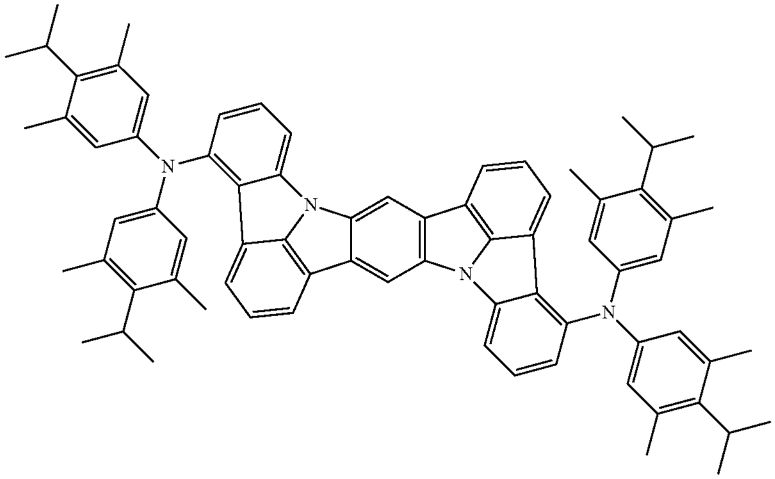
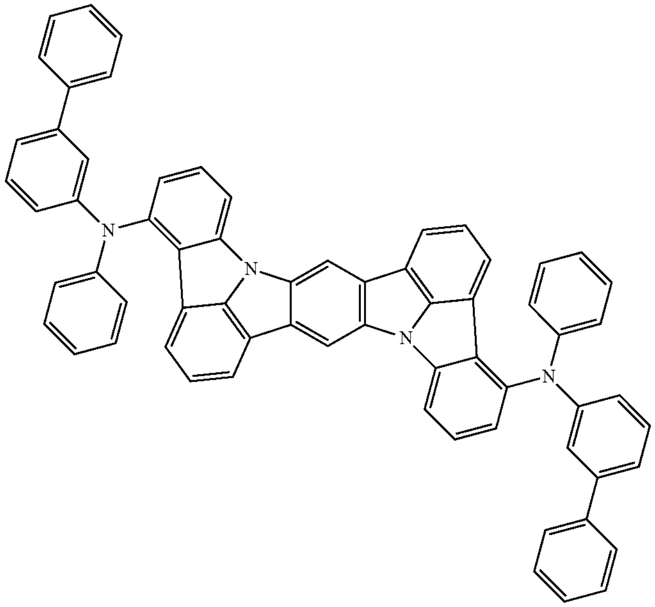

-continued
[Formula 310]
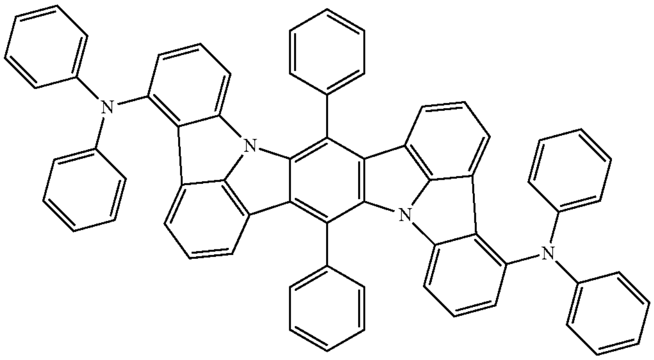
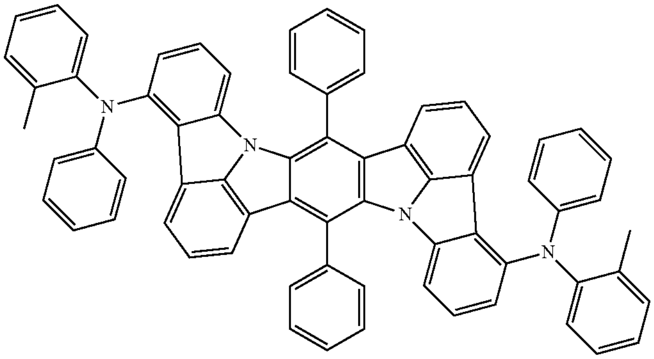
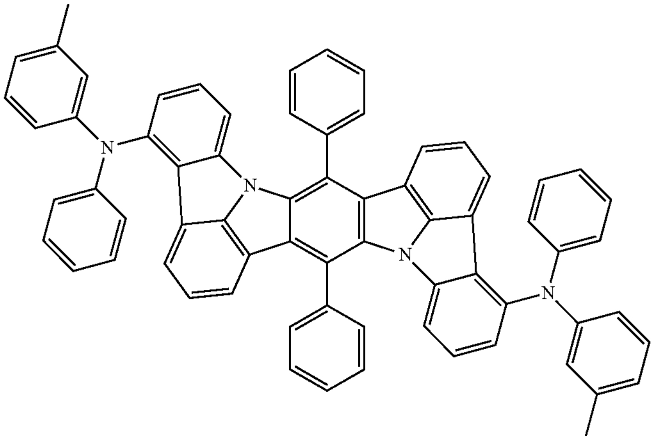
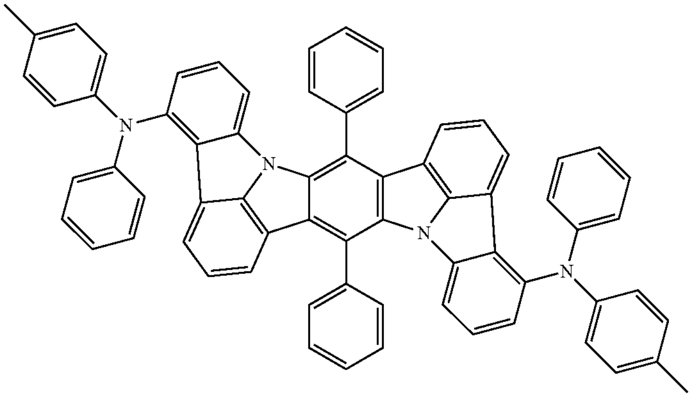

-continued
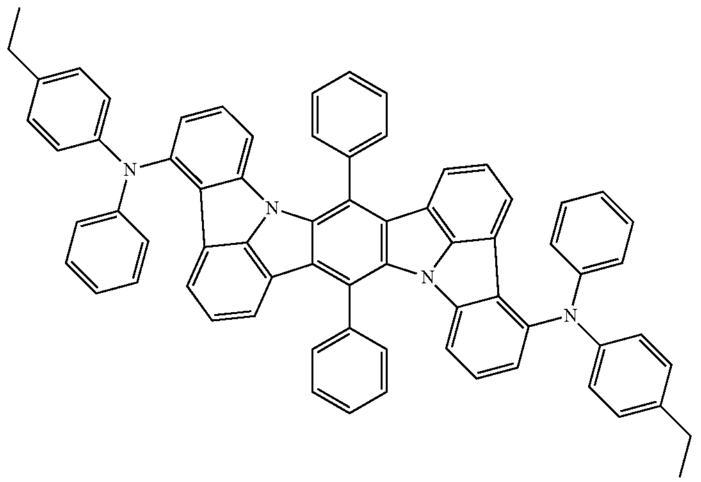
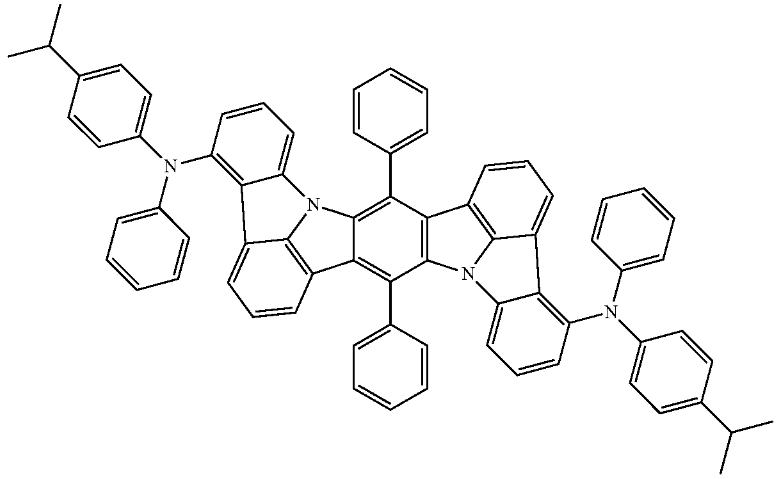
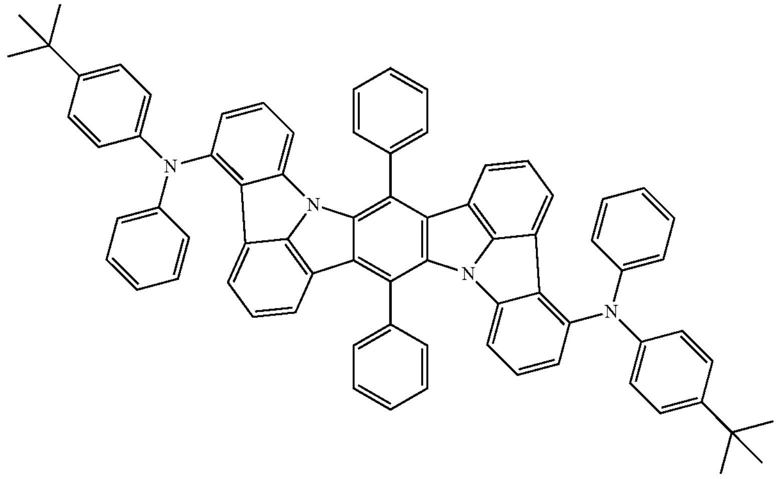

-continued
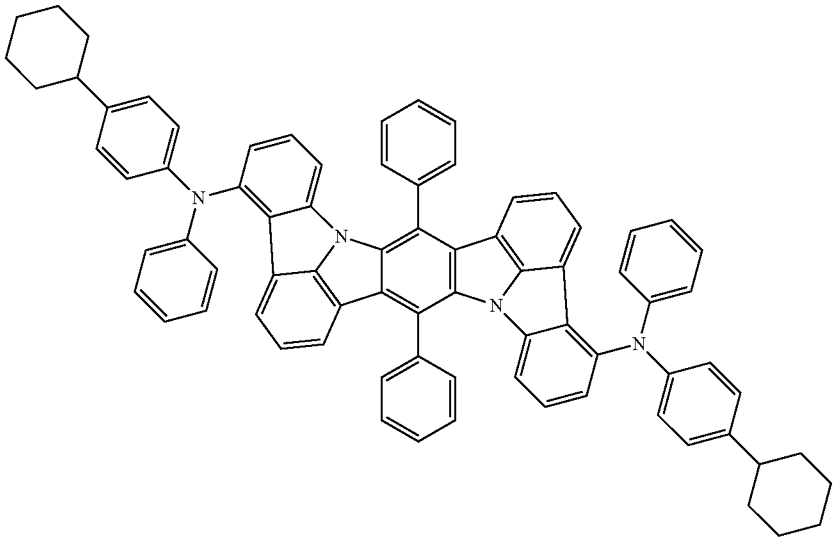
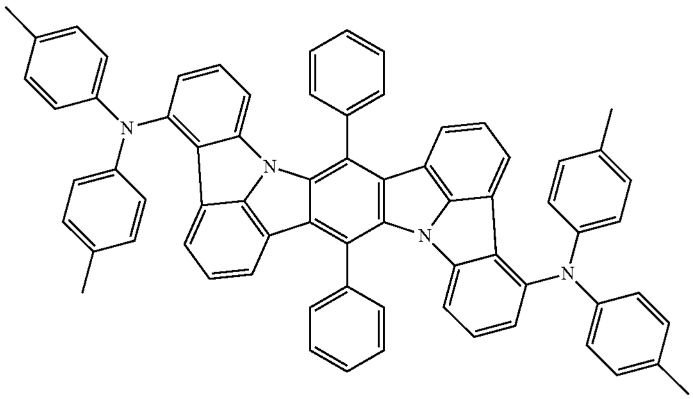
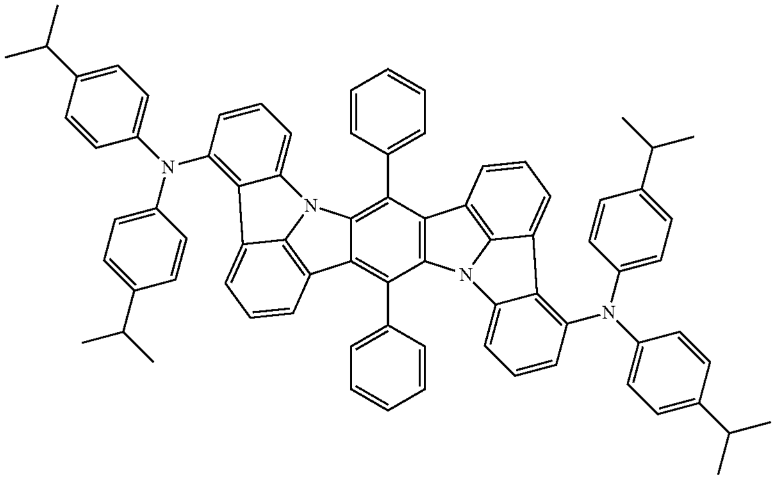

-continued
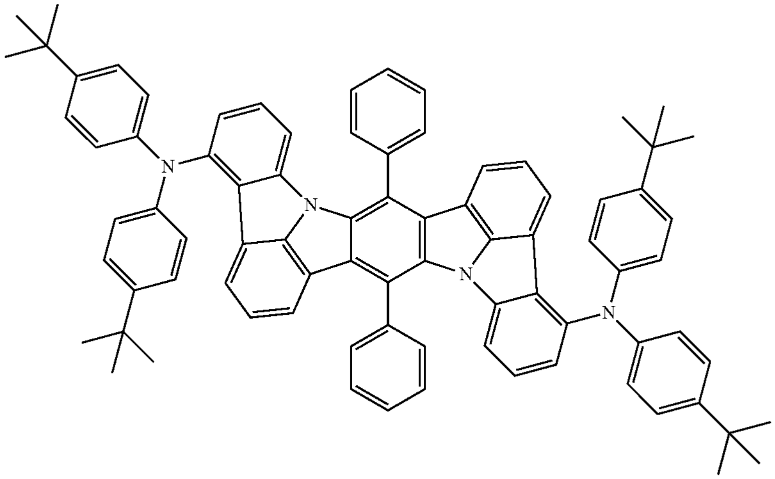
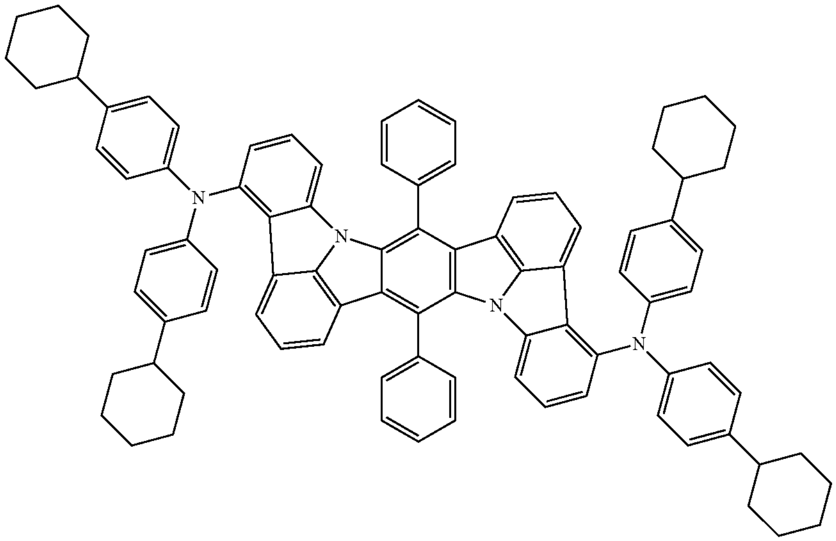
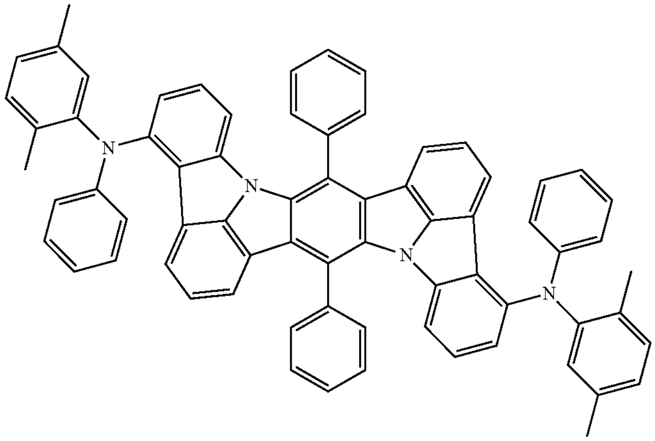

-continued
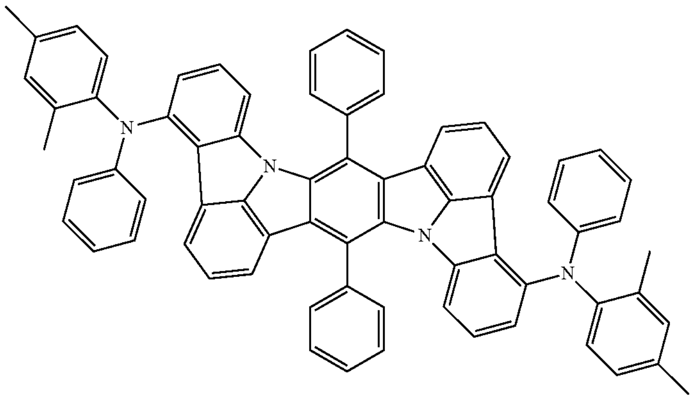
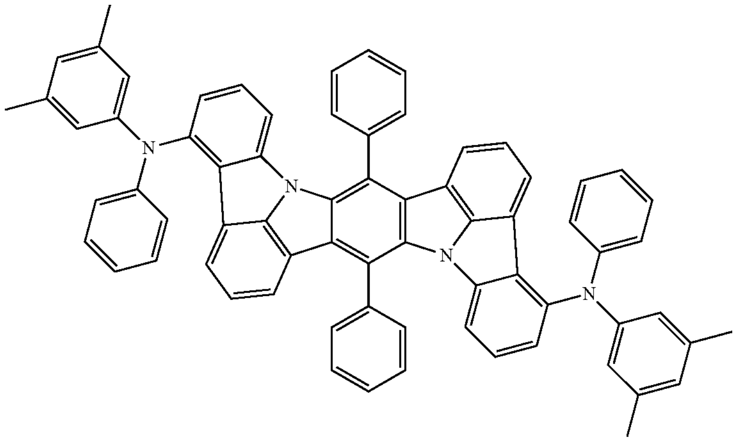
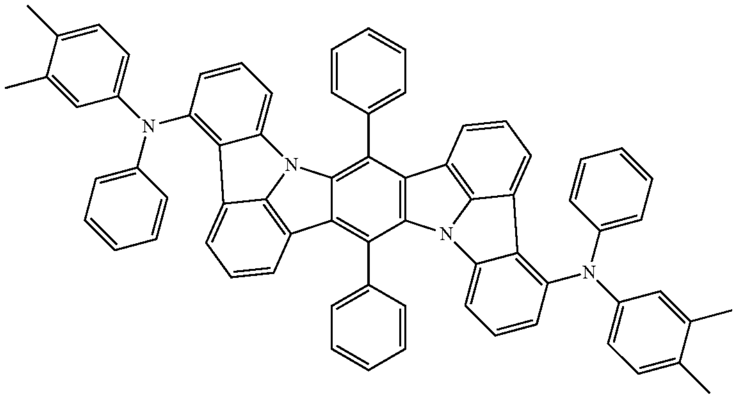
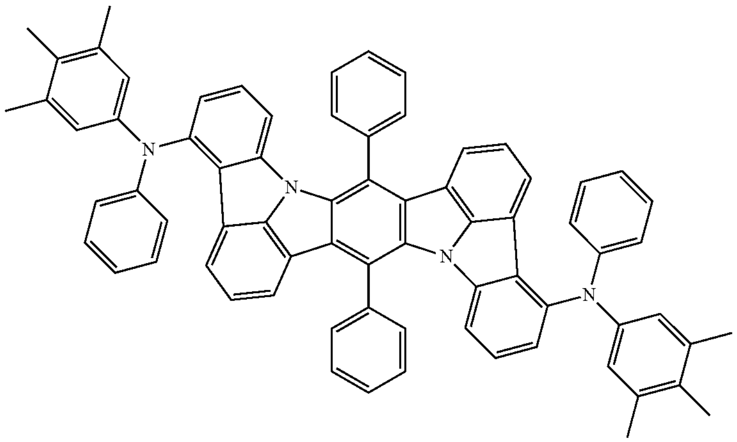

-continued
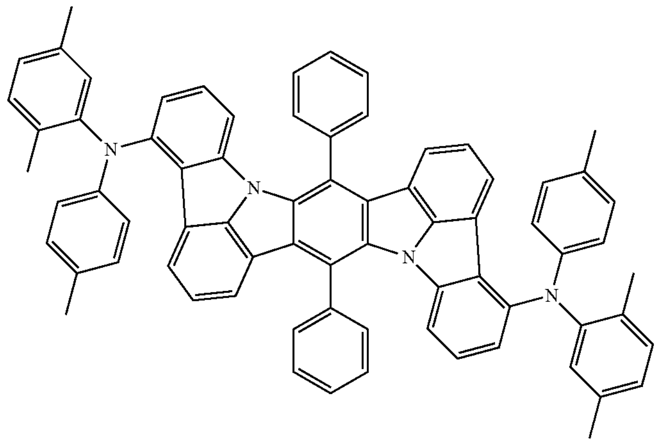
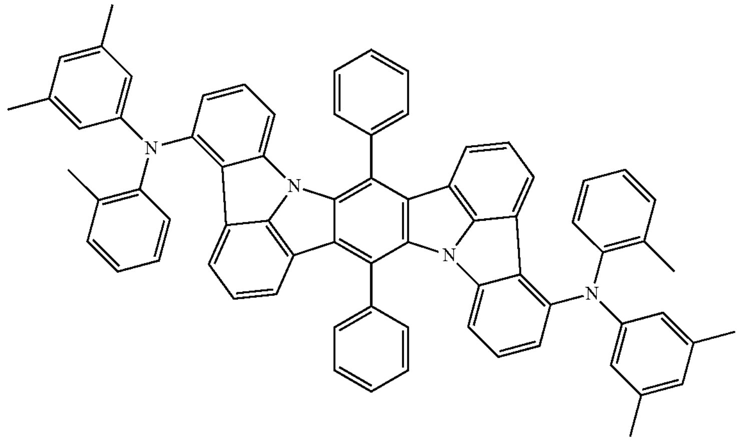
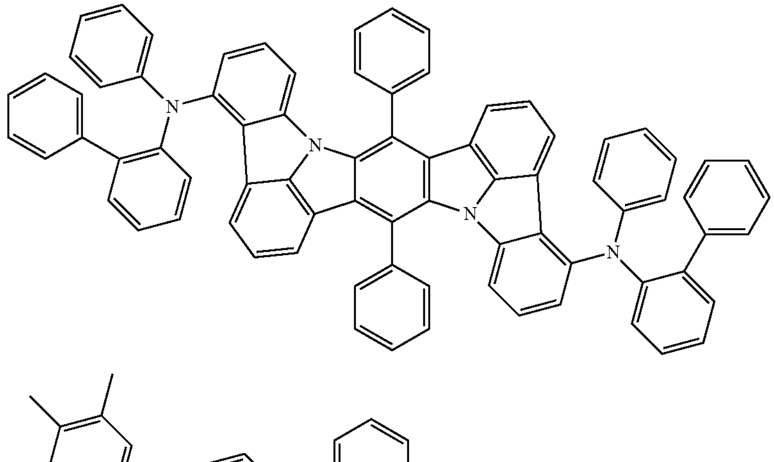
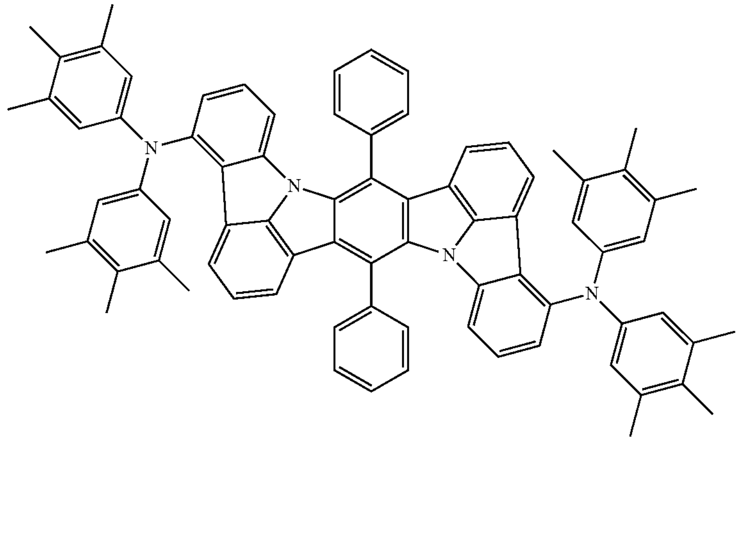

-continued
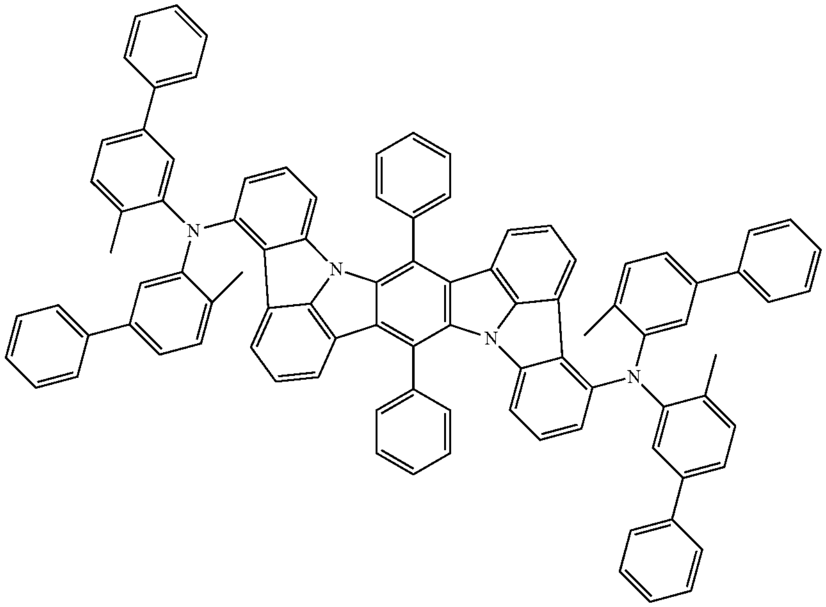
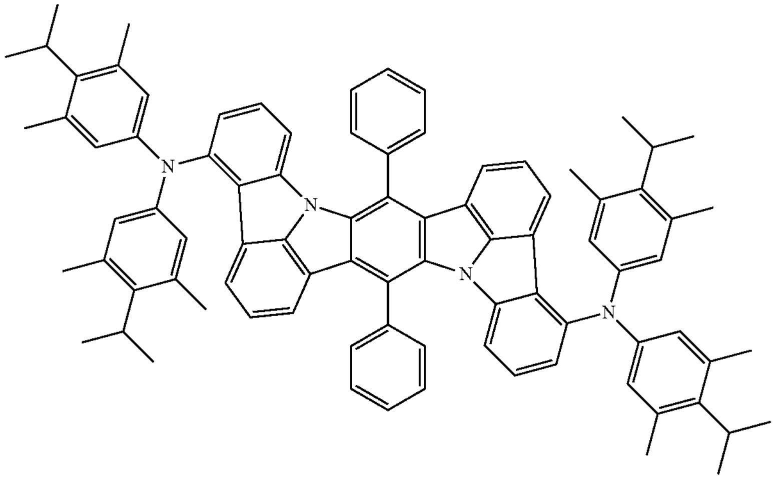
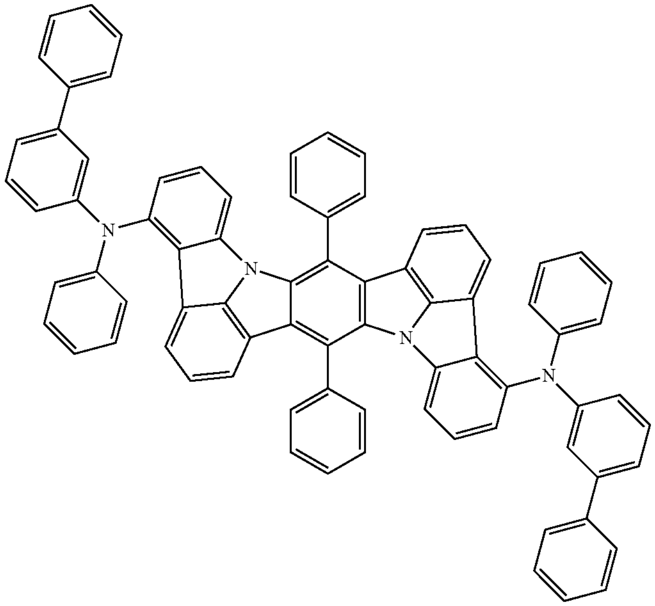

-continued
[Formula 311]
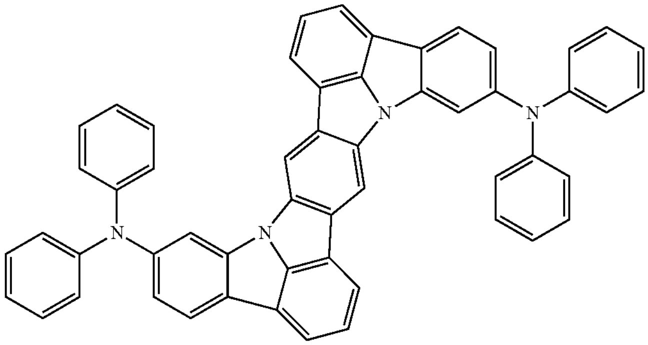
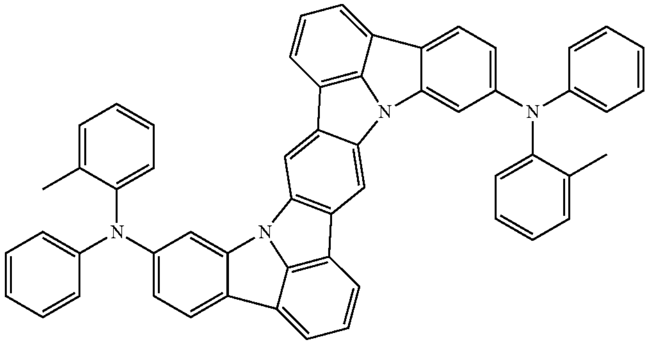
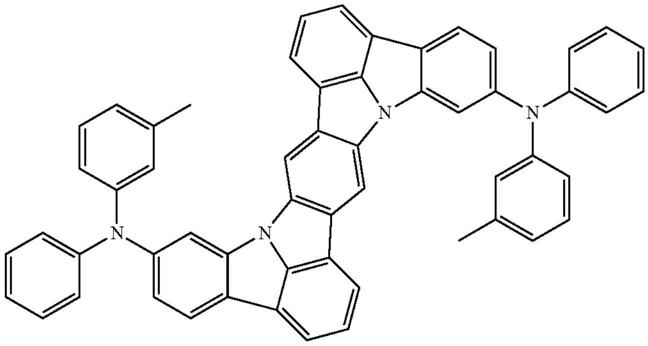
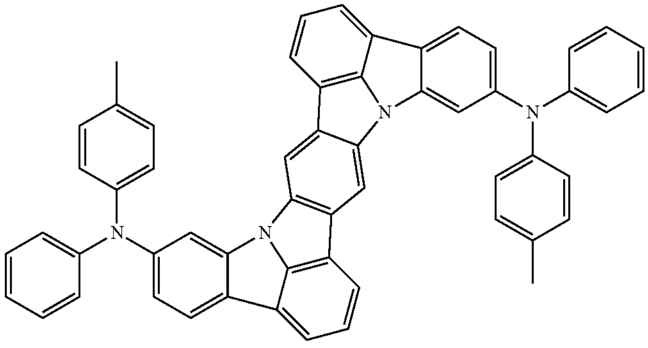

-continued
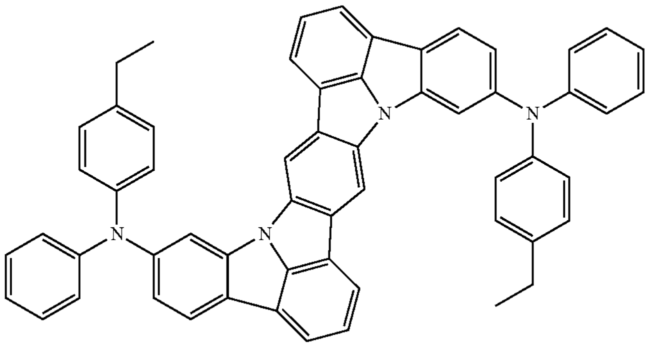
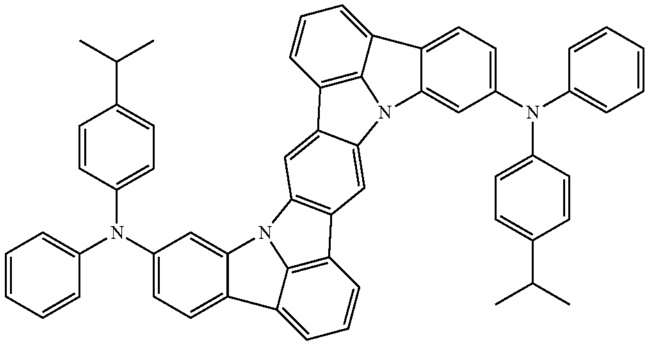
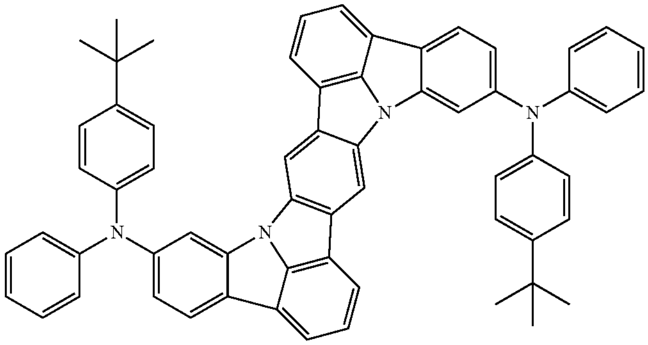
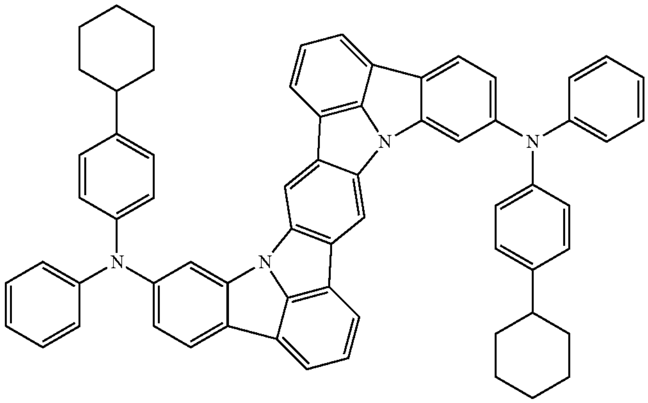

-continued
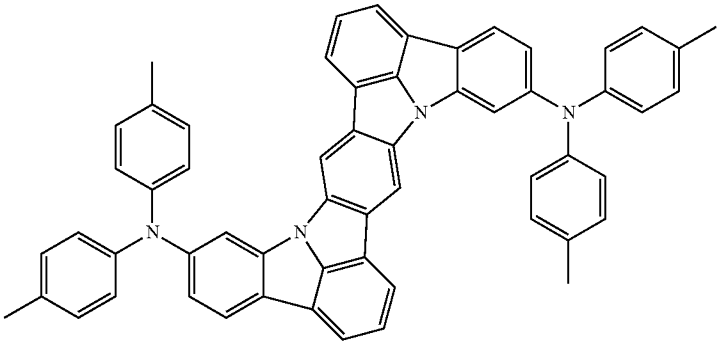
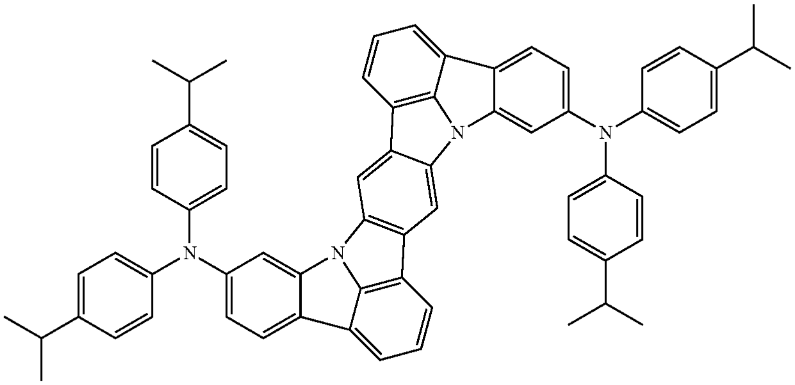
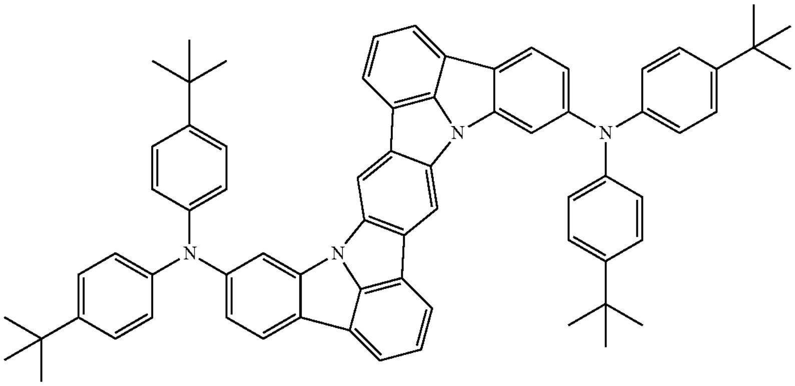
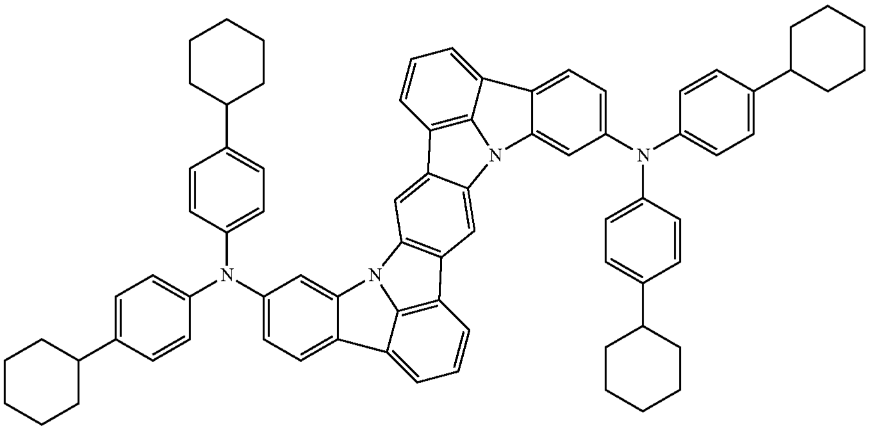

-continued
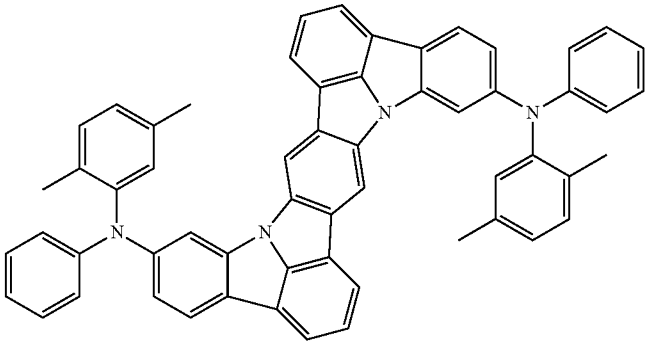
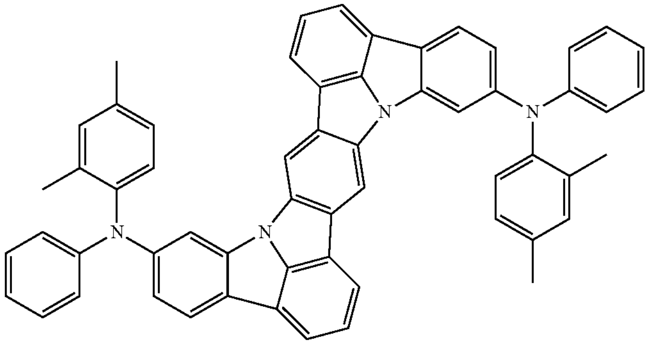
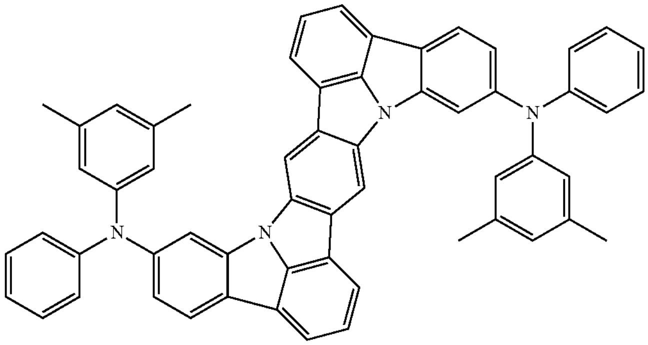
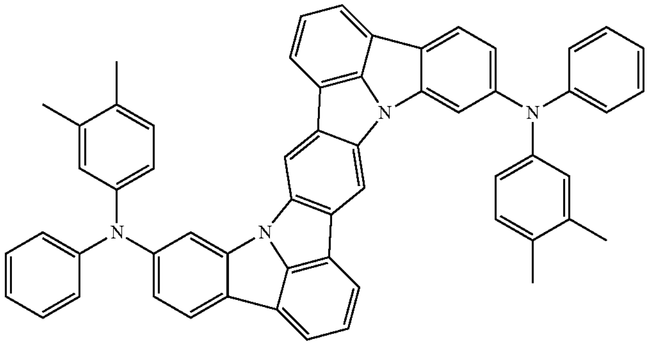
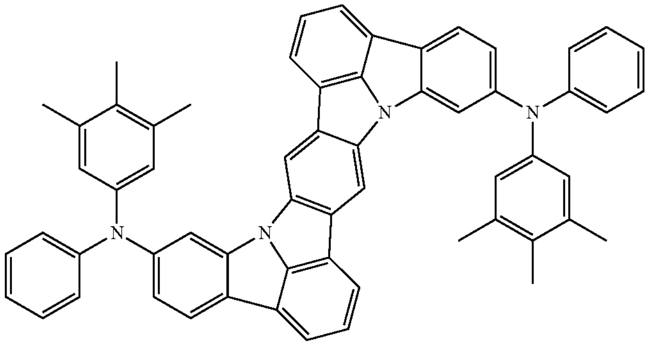

-continued
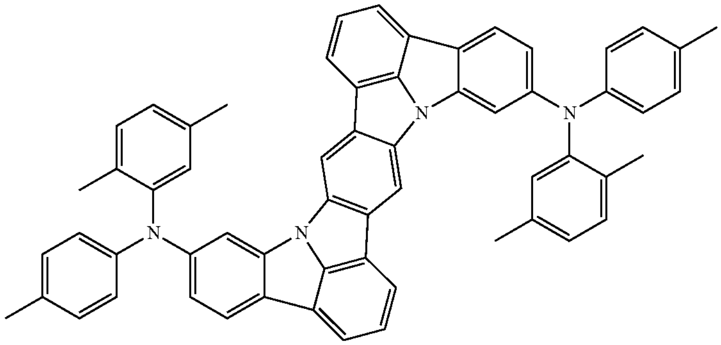
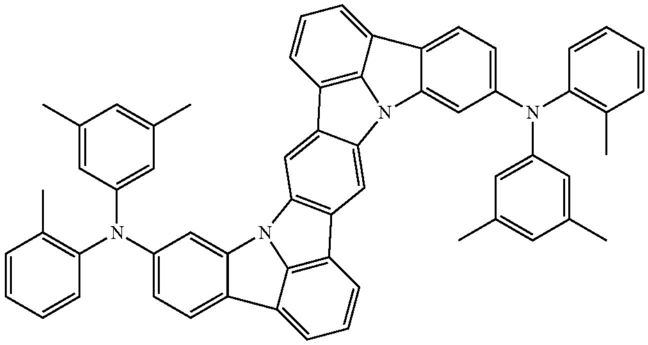
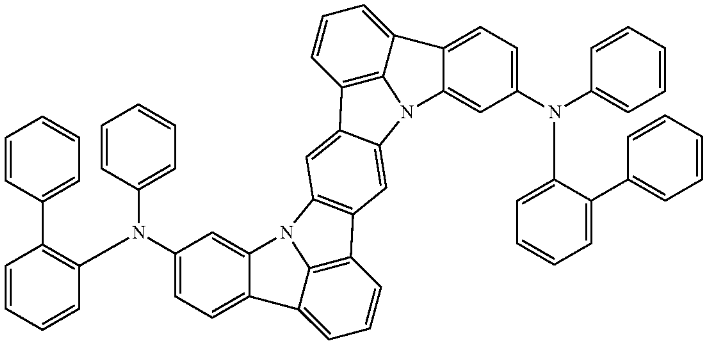
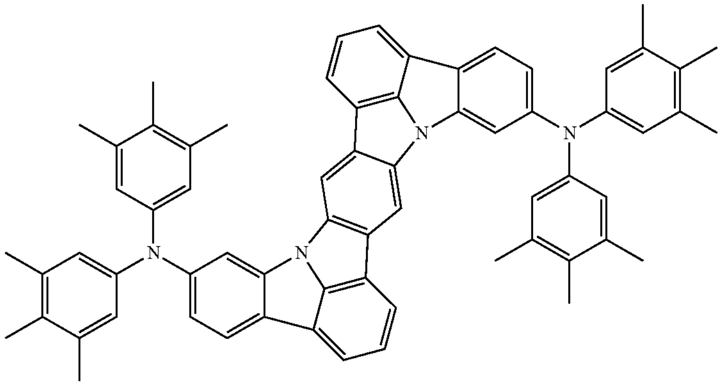

-continued
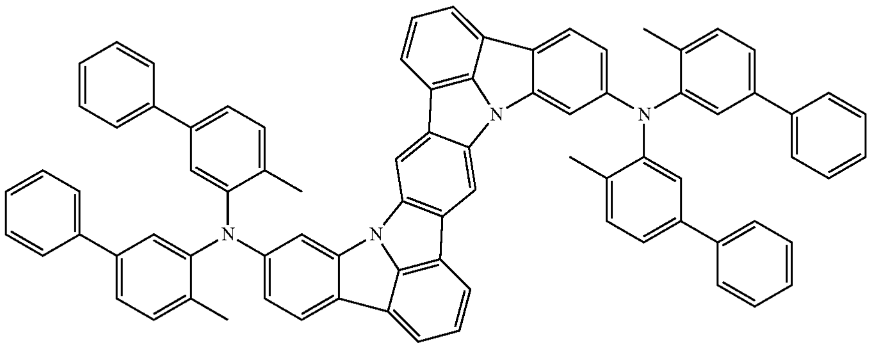
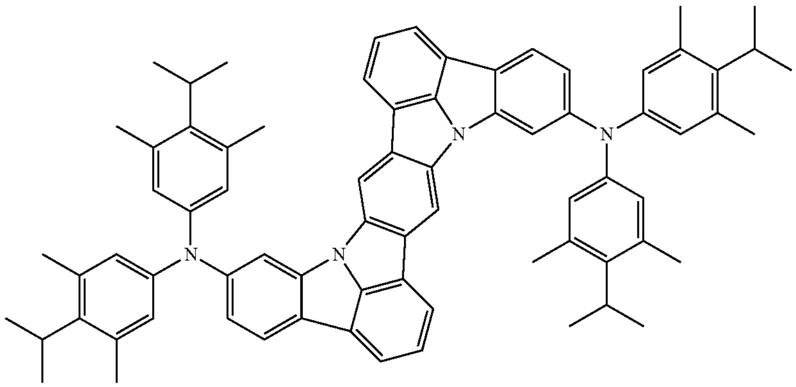
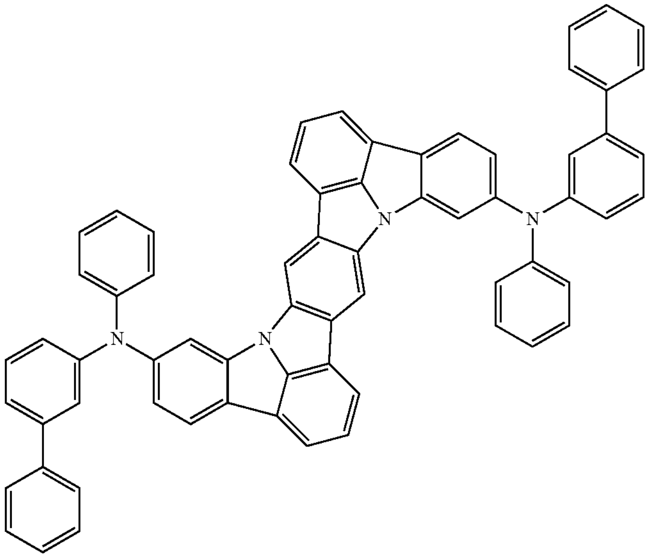

-continued
[Formula 312]
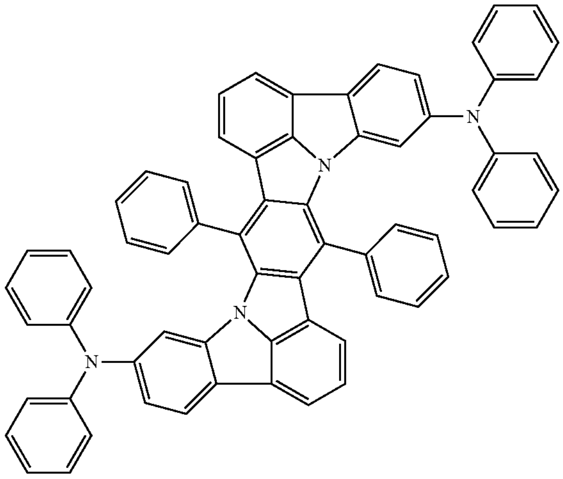
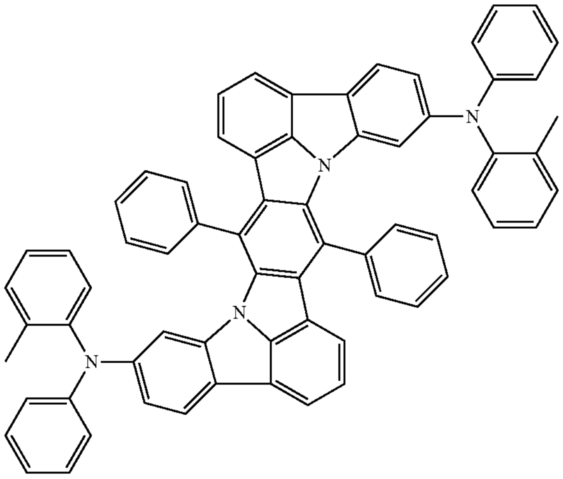
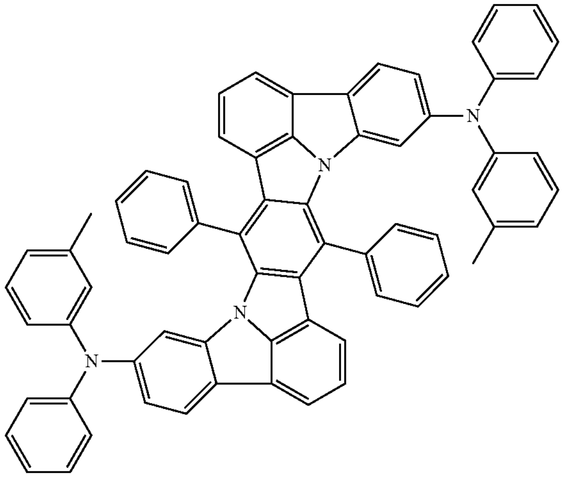
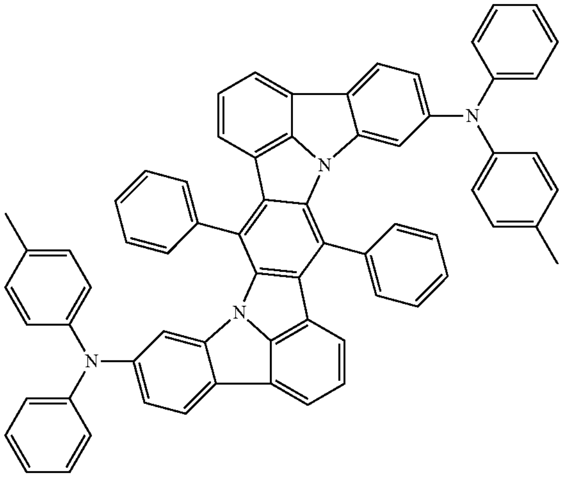
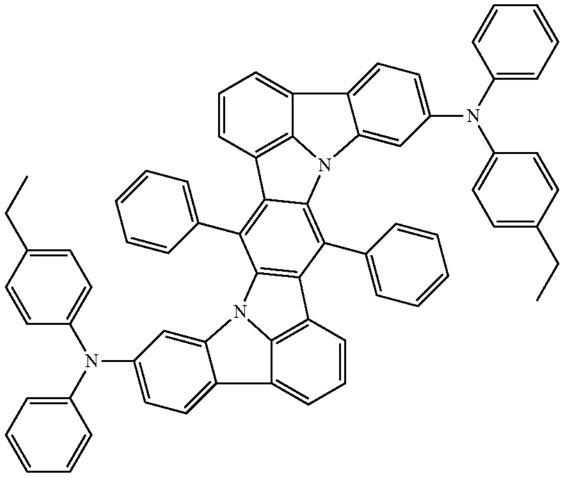

-continued
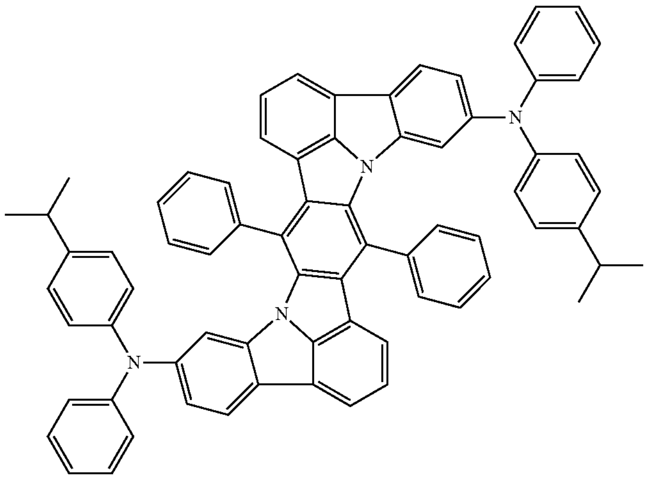
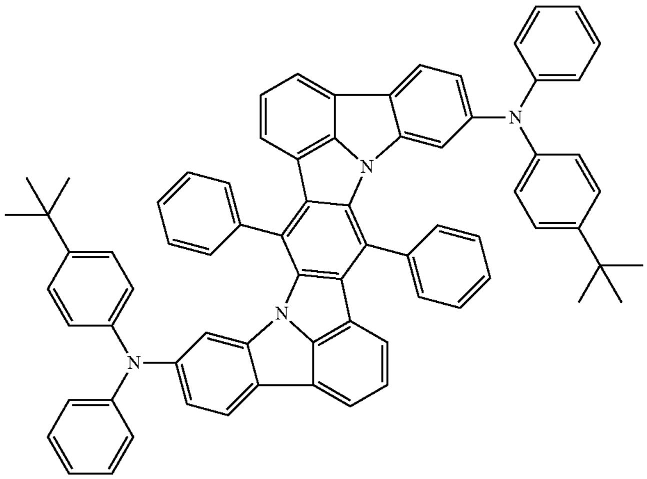
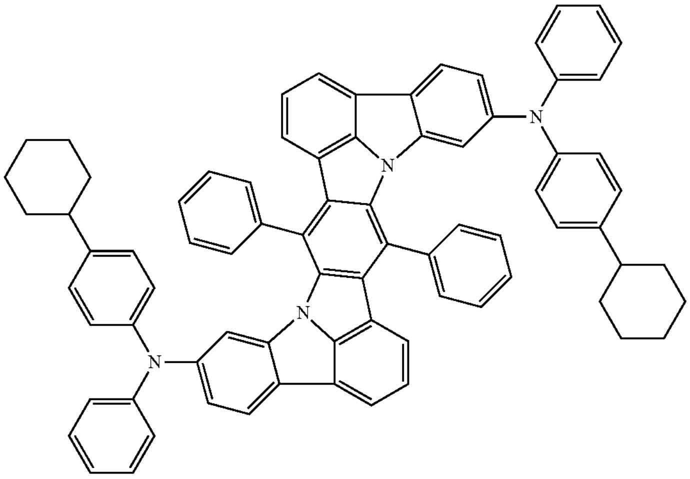

-continued
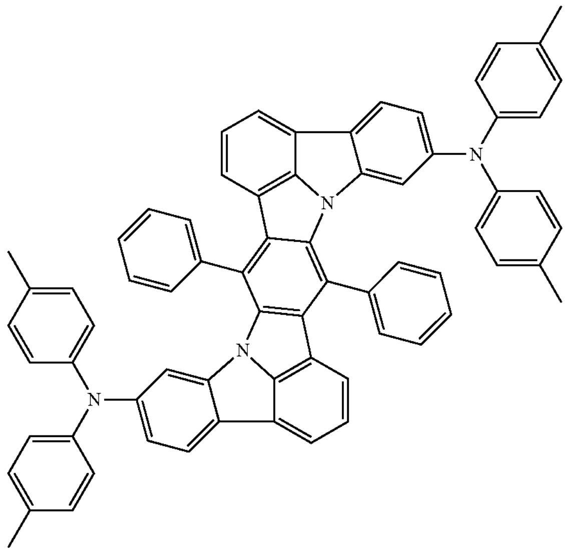
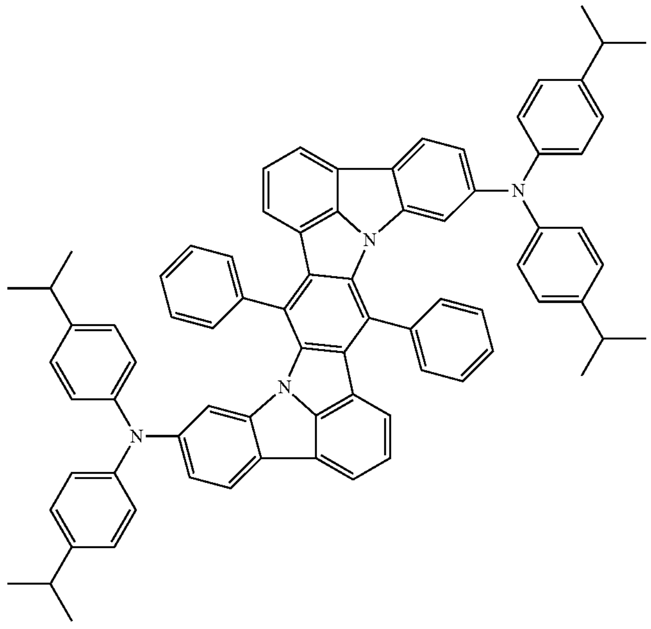

-continued
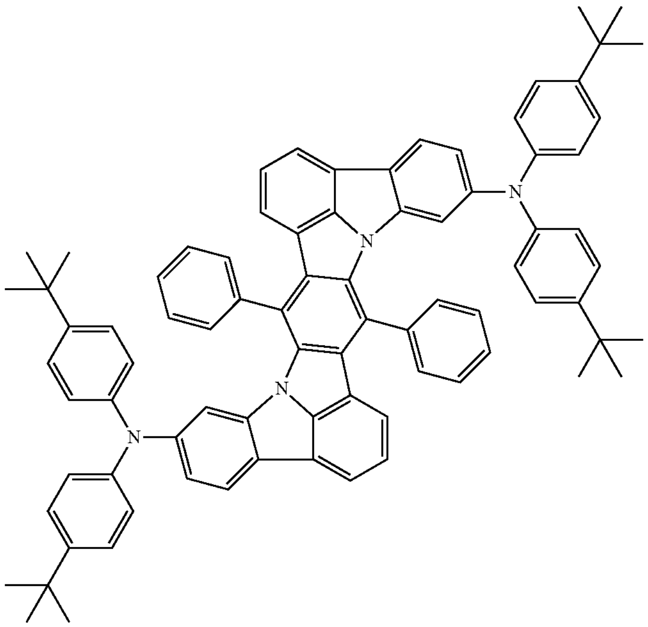
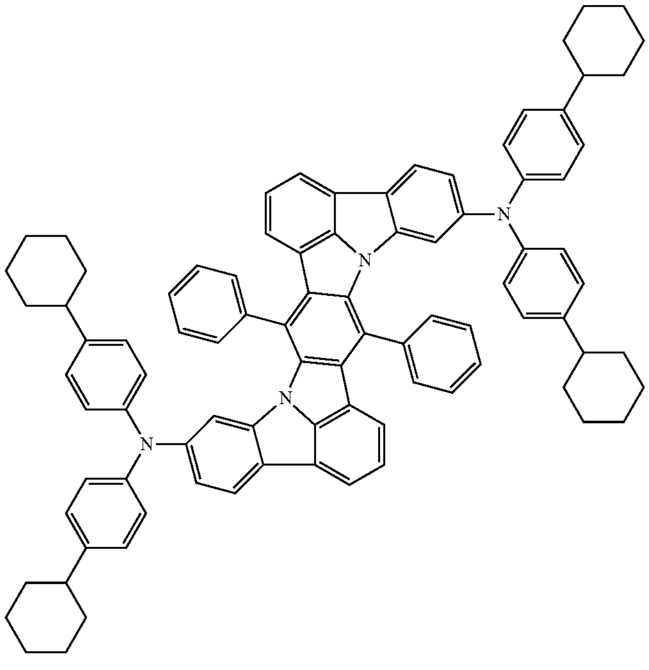

-continued
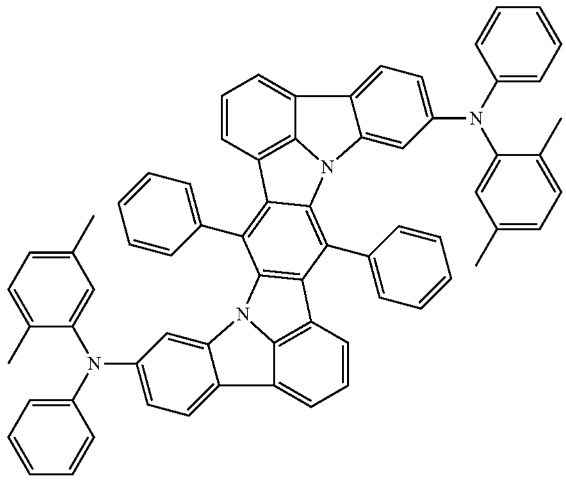
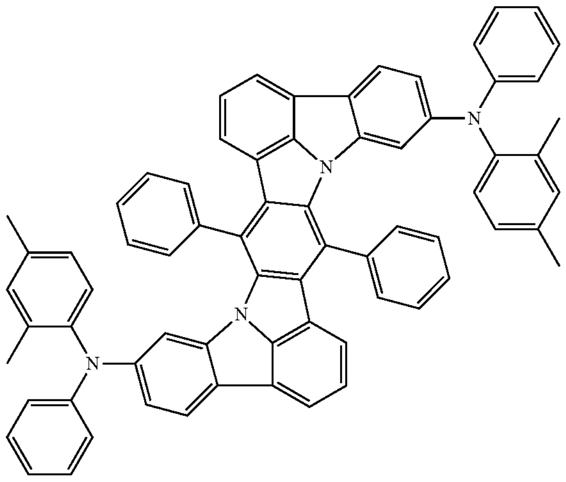
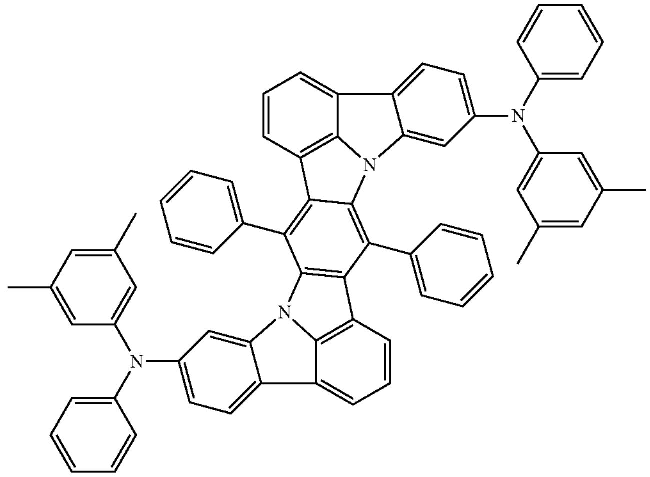
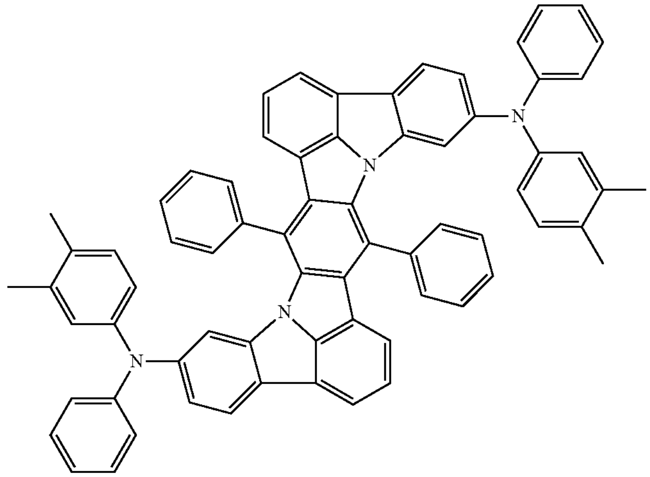

-continued
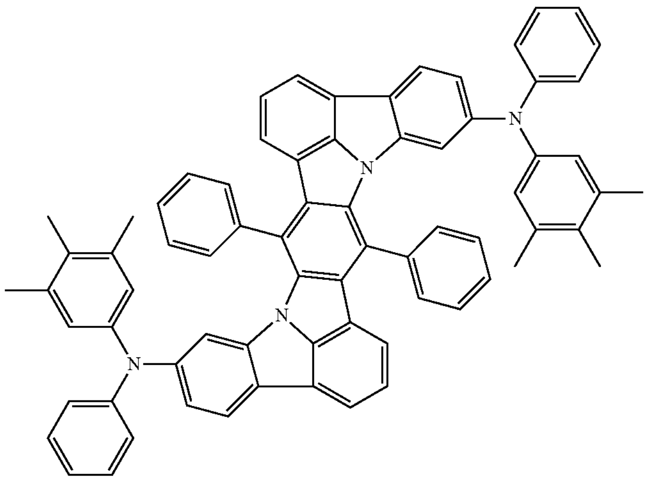
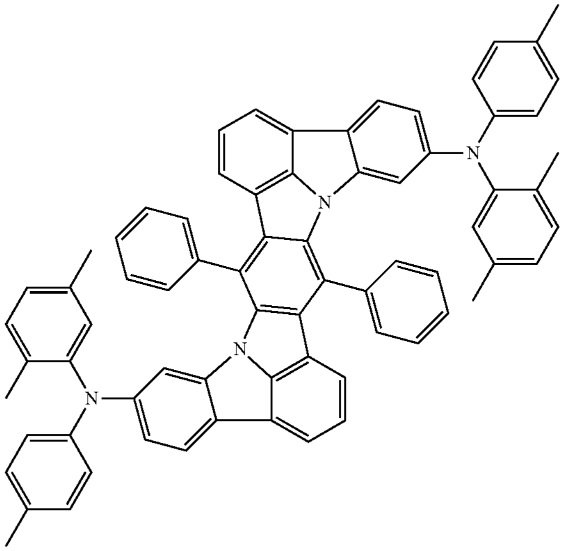
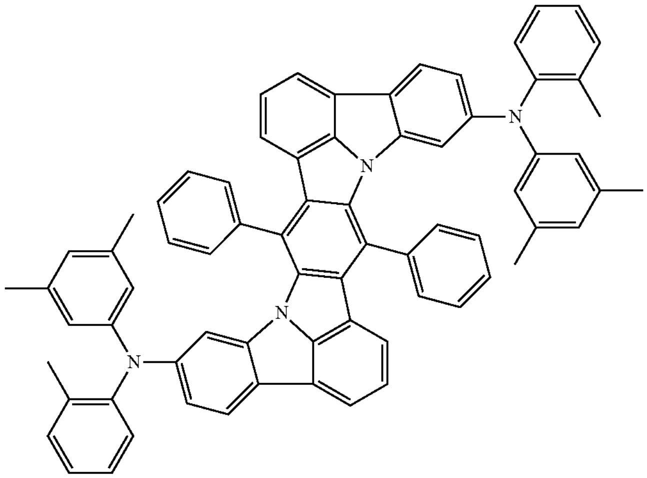

-continued
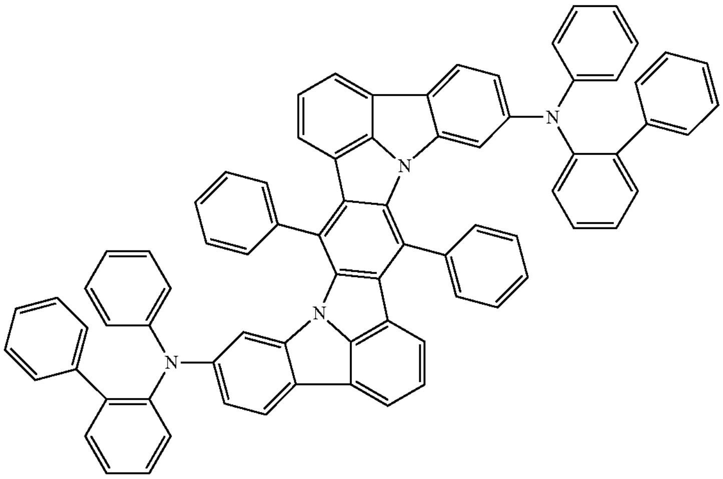
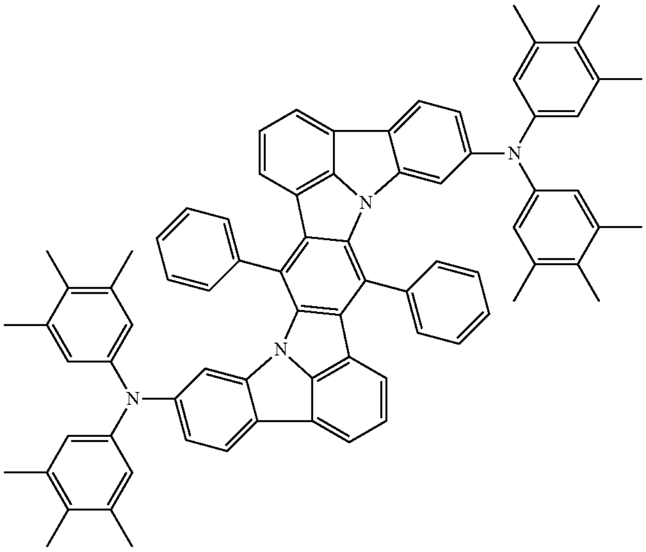
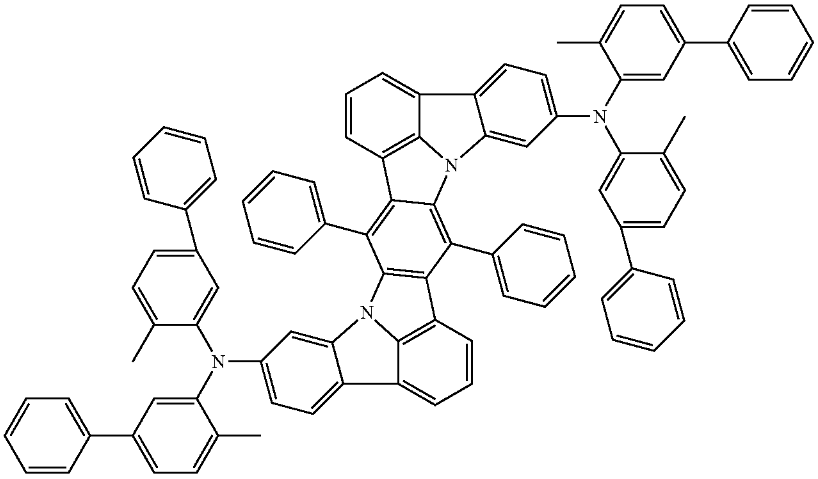

-continued
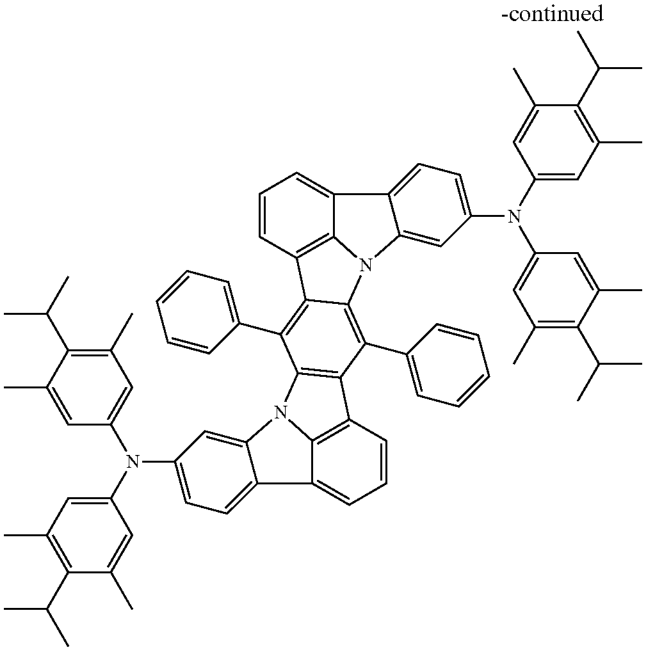
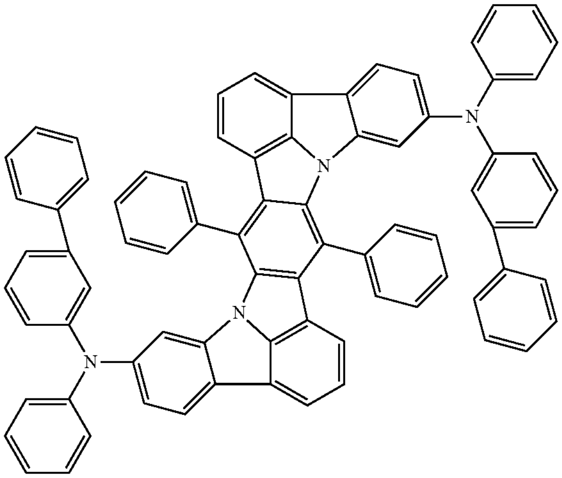
[Formula 313]
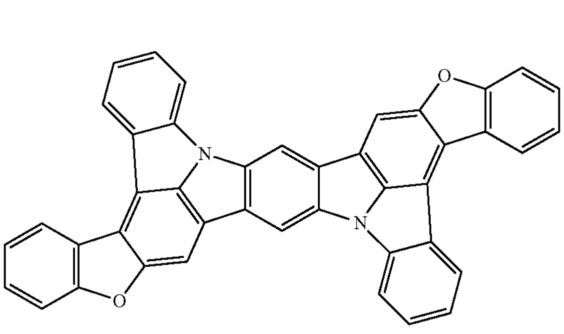
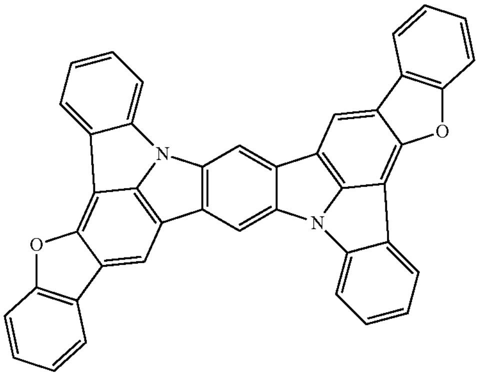

-continued
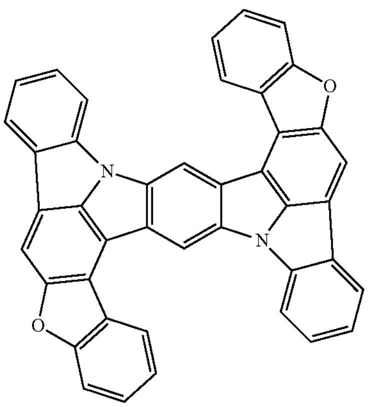
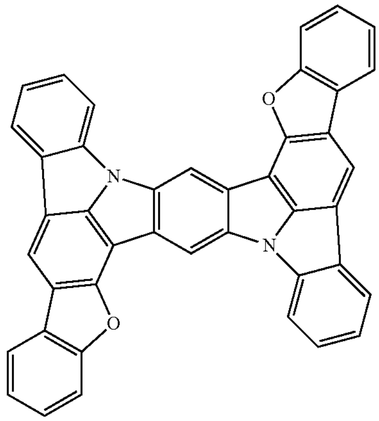
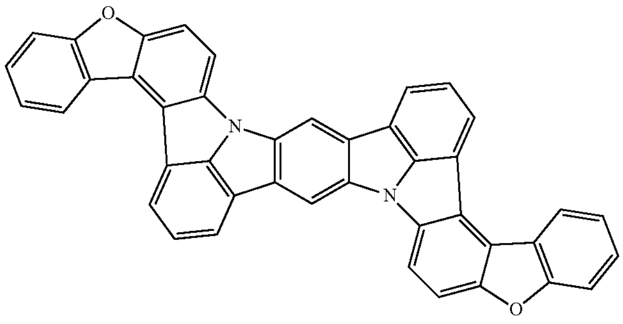
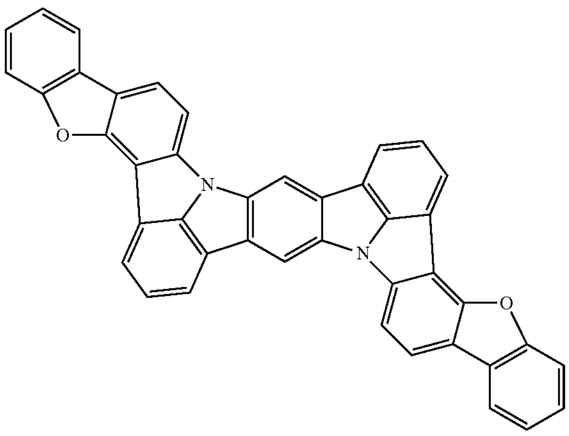
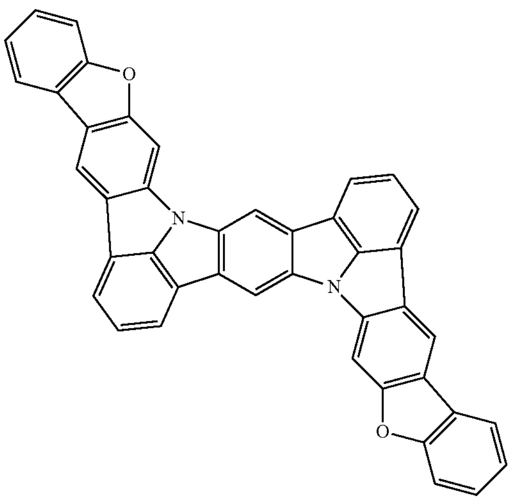

-continued
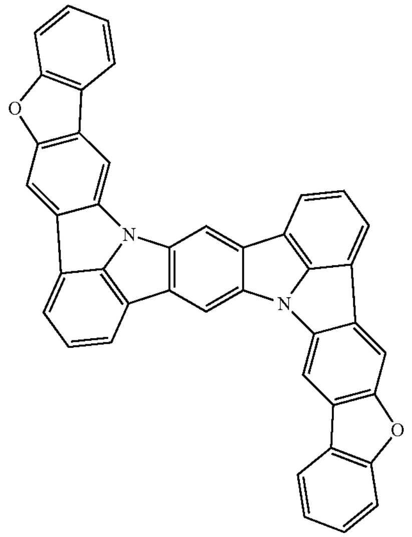
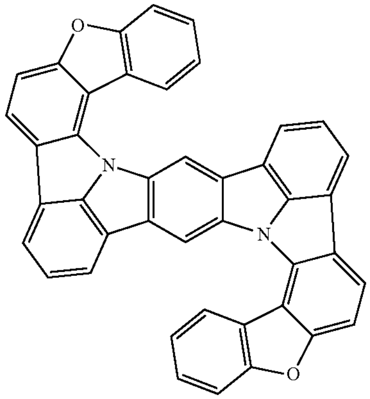
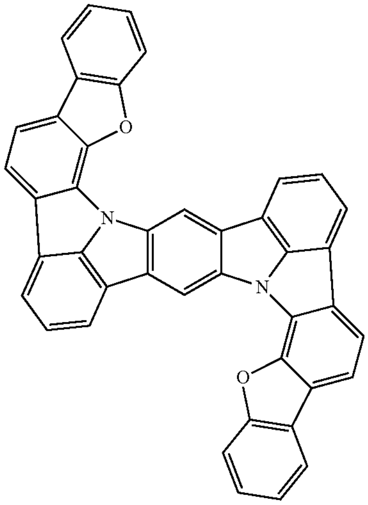
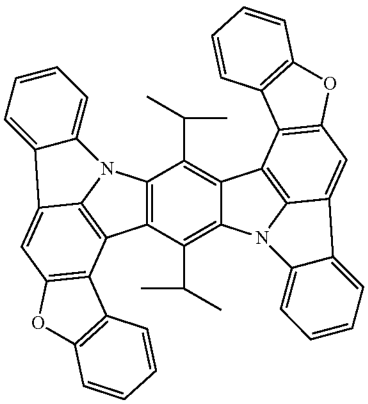
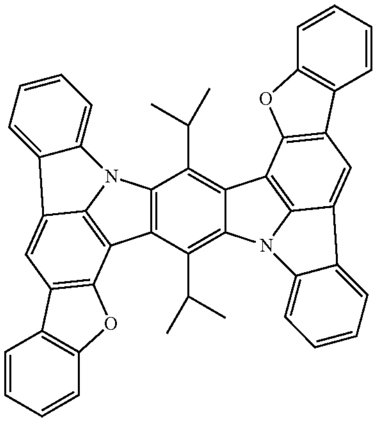
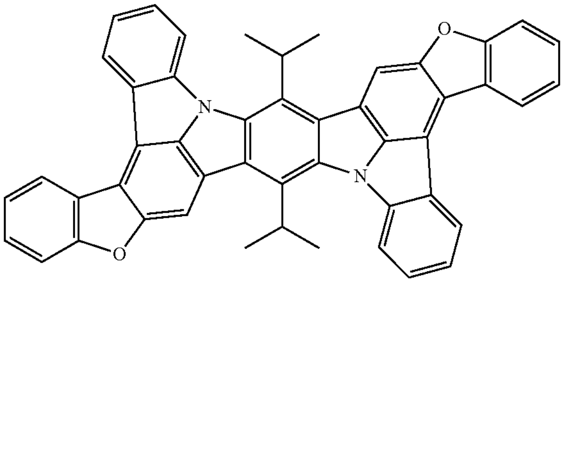
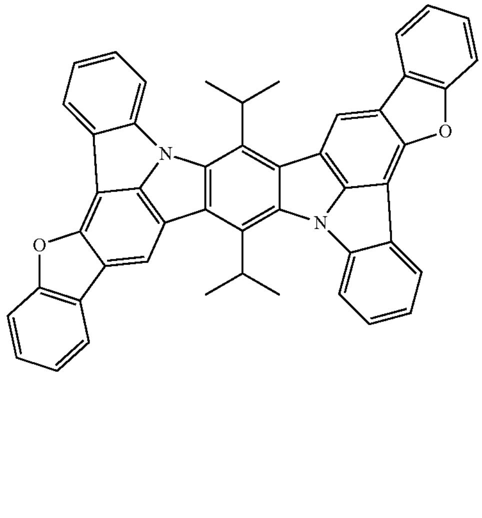

-continued
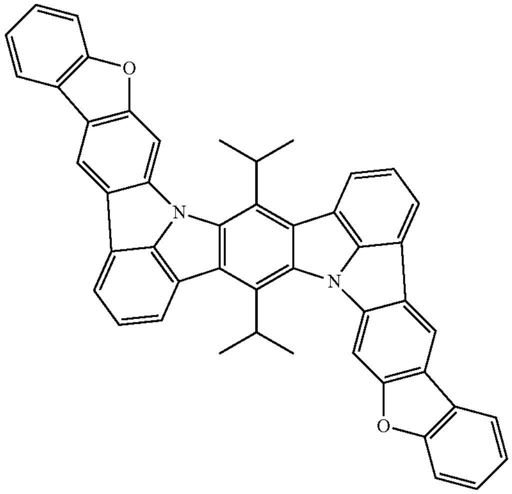
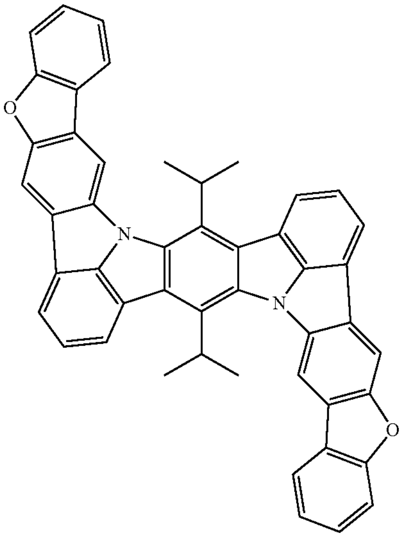
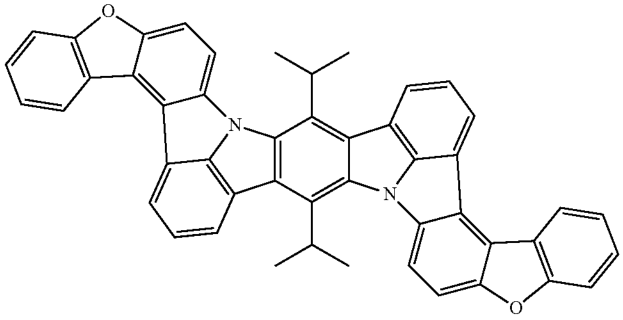
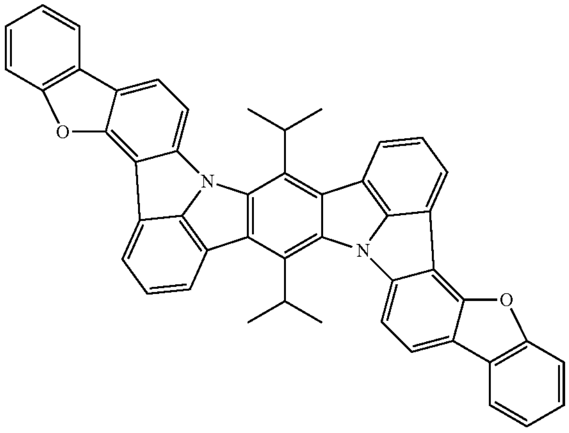
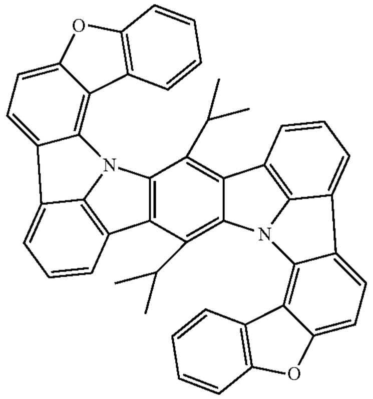

-continued
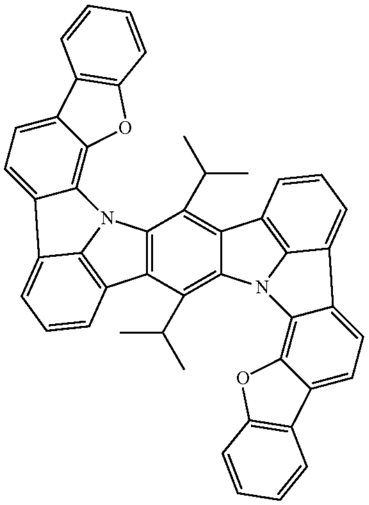
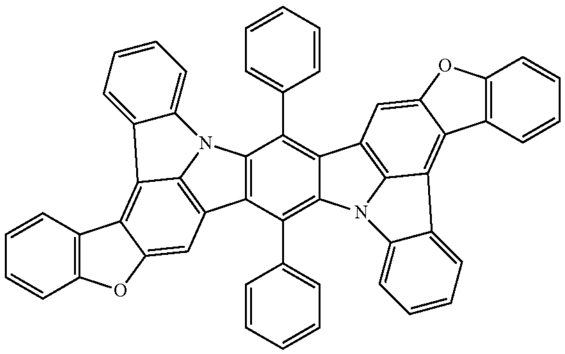
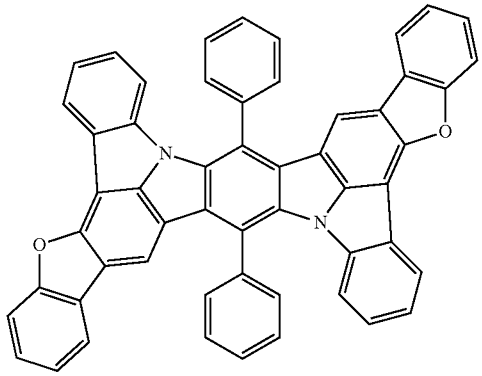
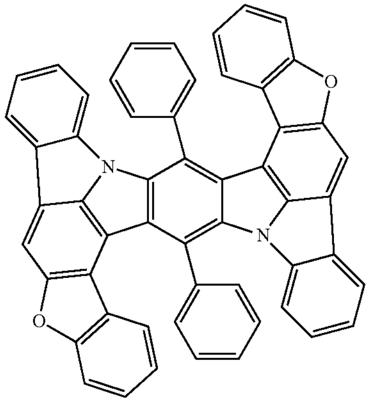
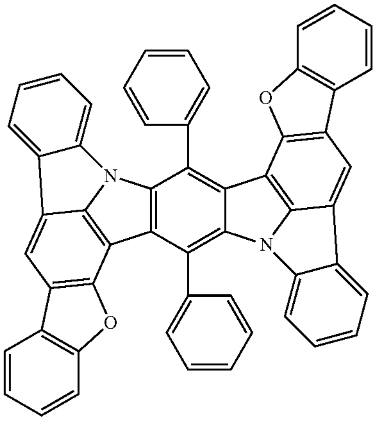
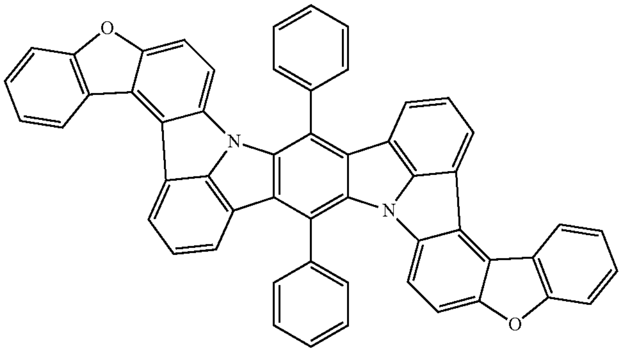

-continued
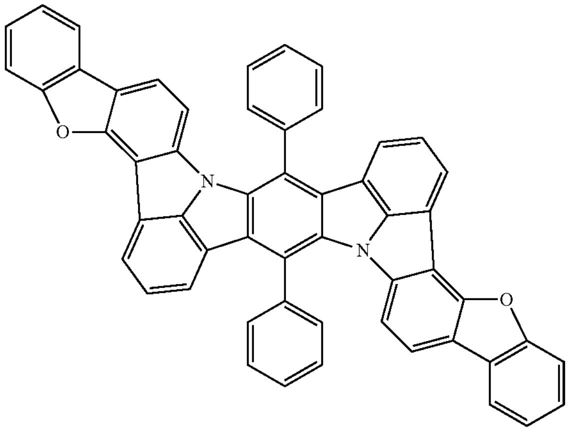
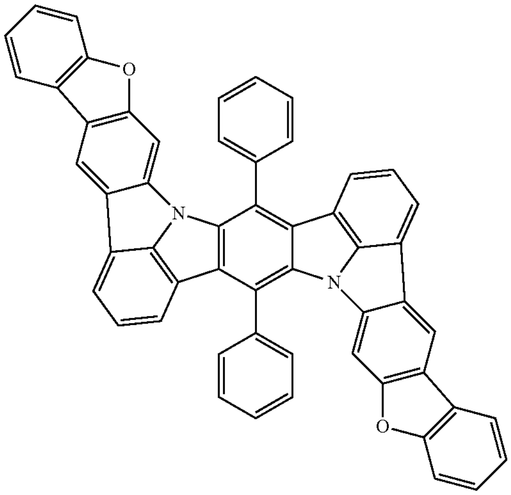
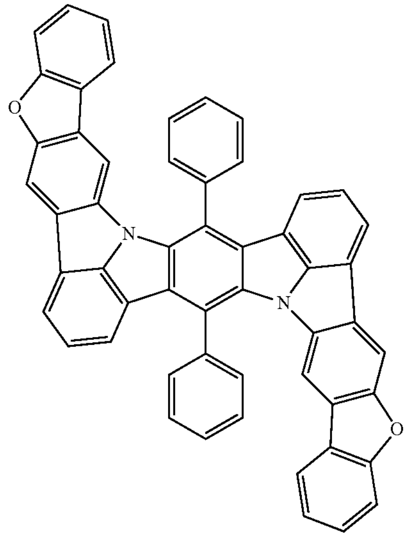
[Formula 314]
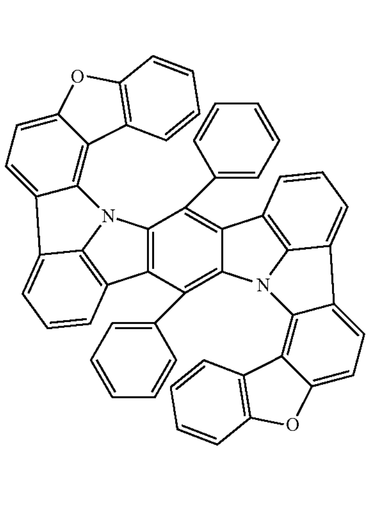
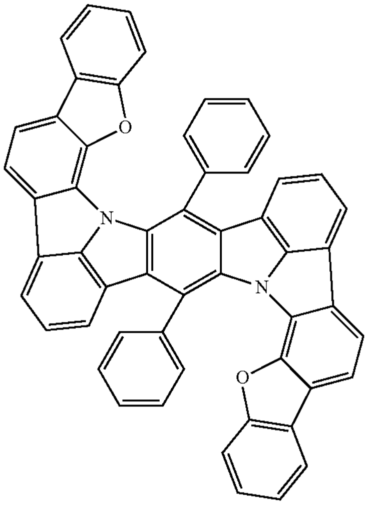

-continued
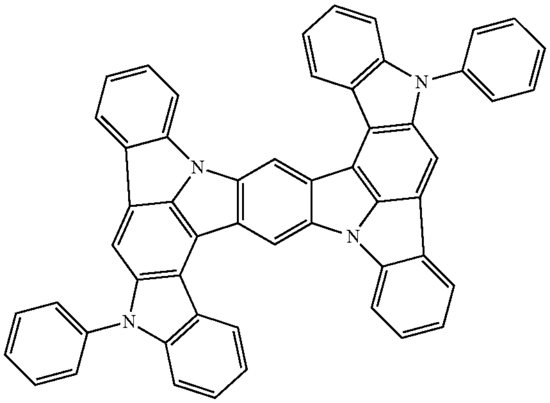
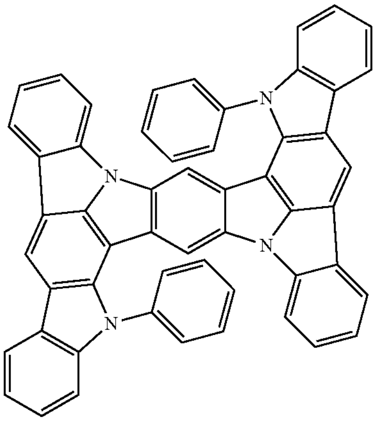
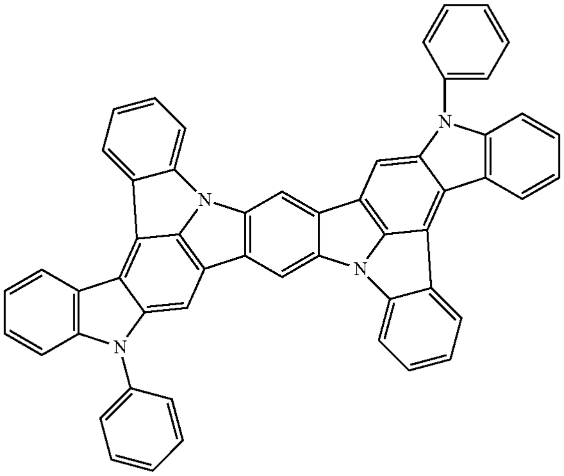
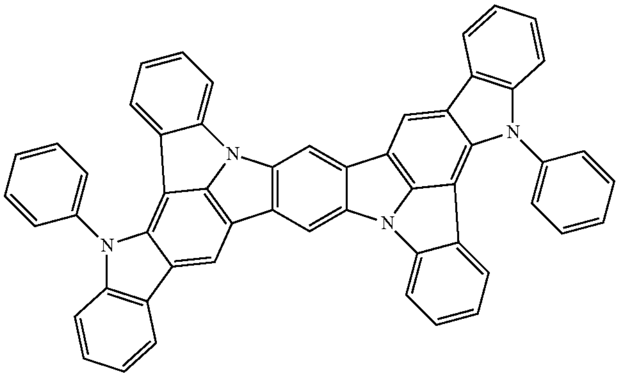

-continued
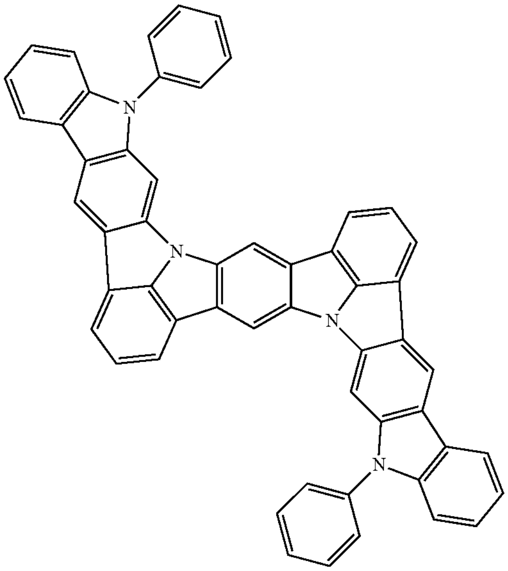
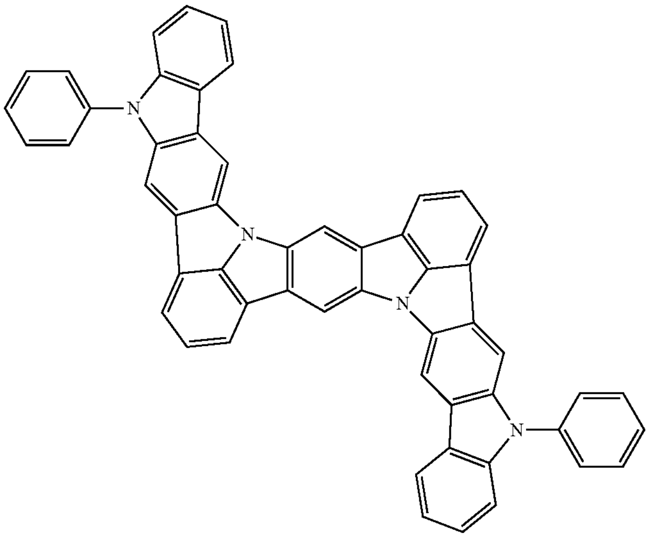
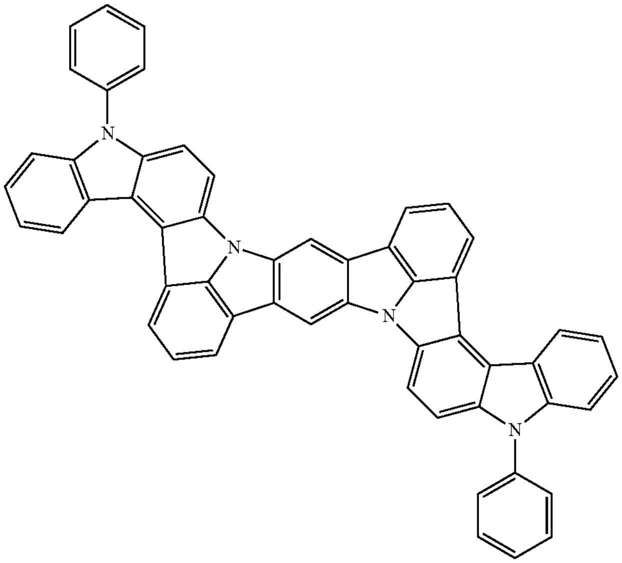

-continued
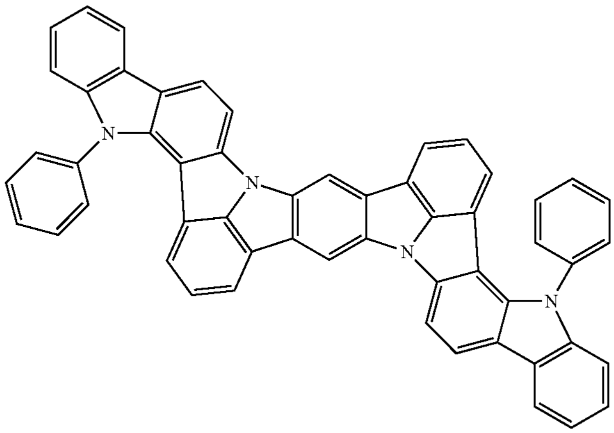
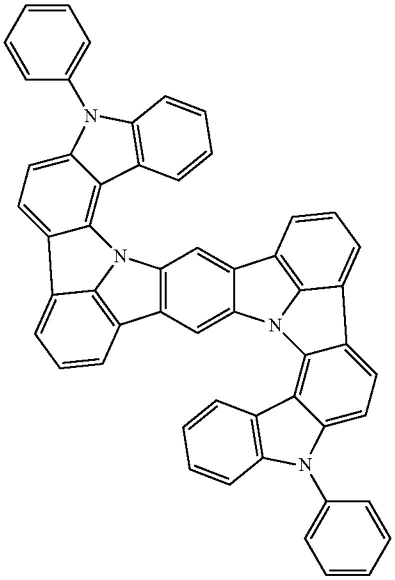
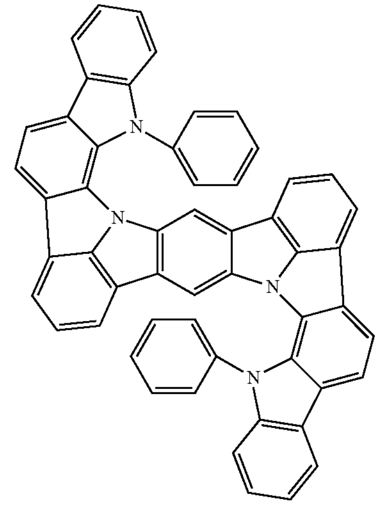
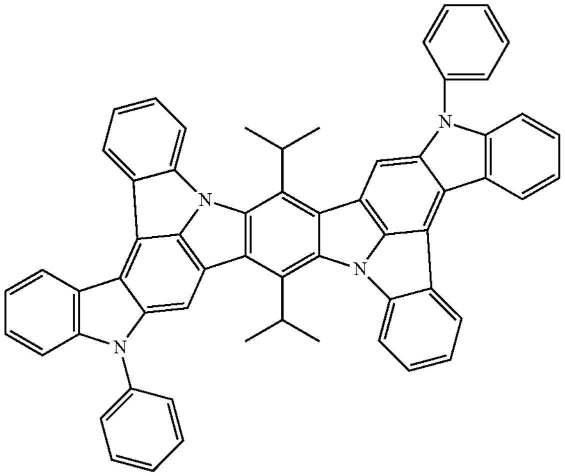
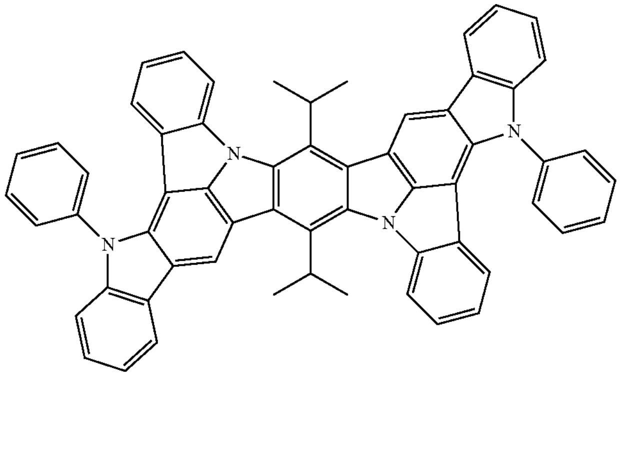

-continued
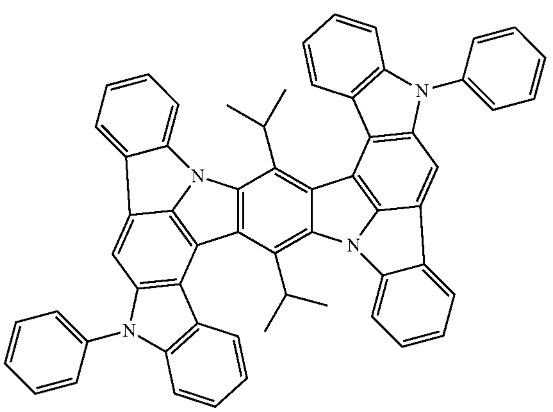
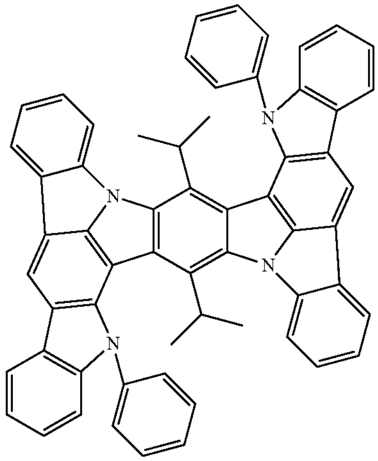
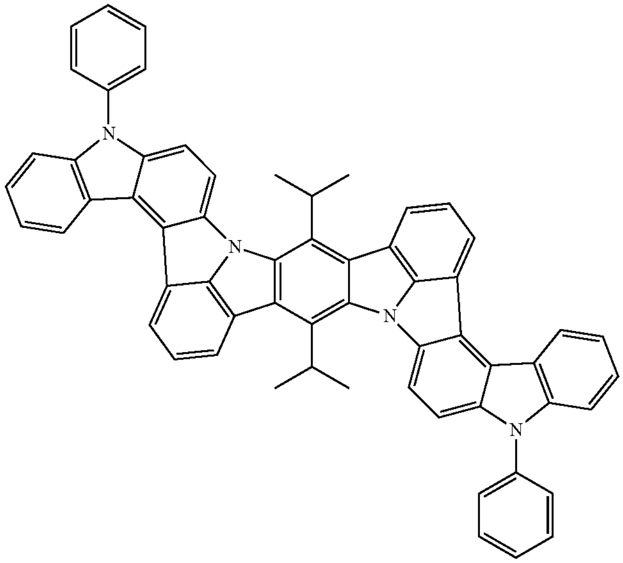
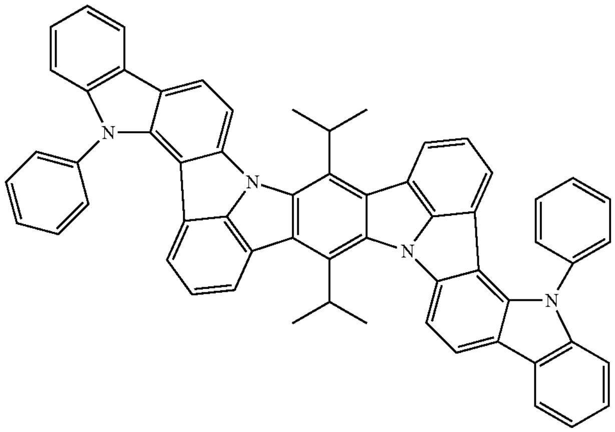

-continued
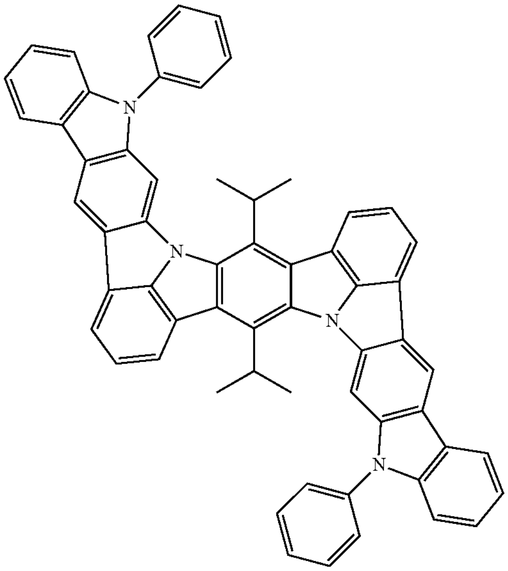
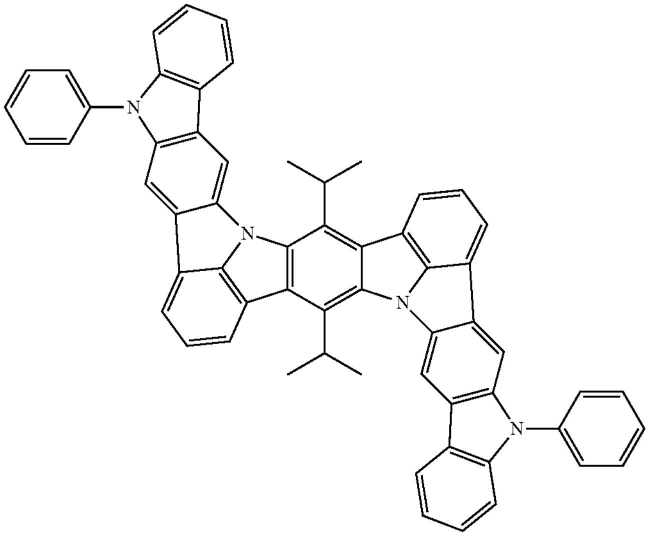
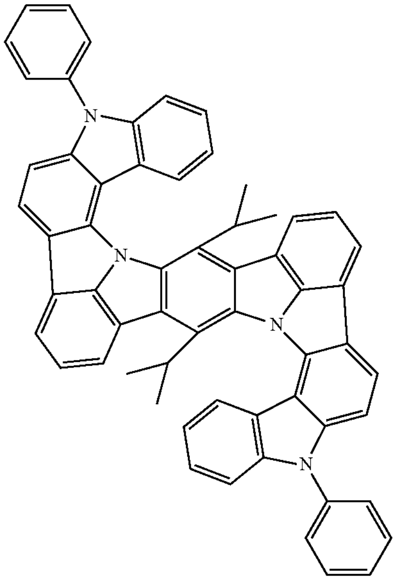

-continued
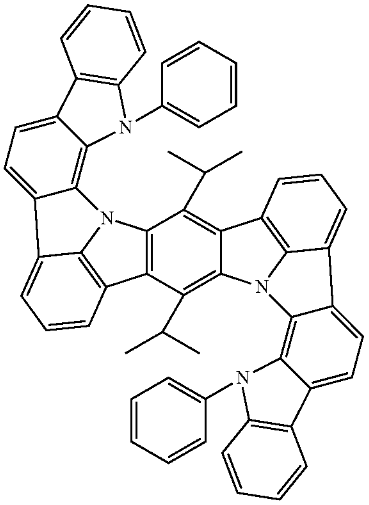
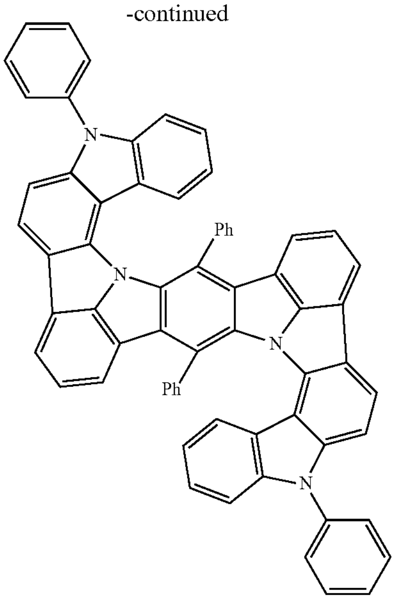
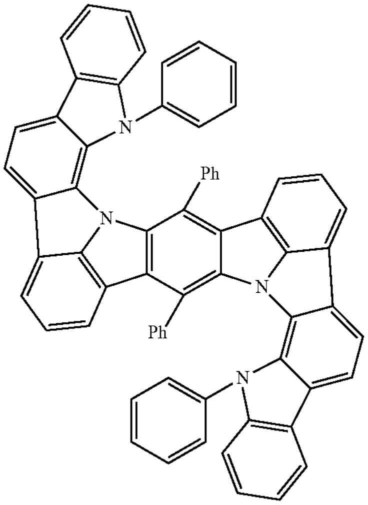
In the formulae, Ph is a phenyl group.
[Formula 315]
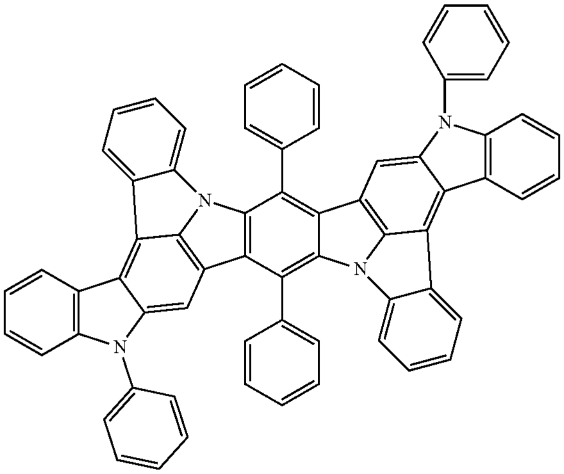
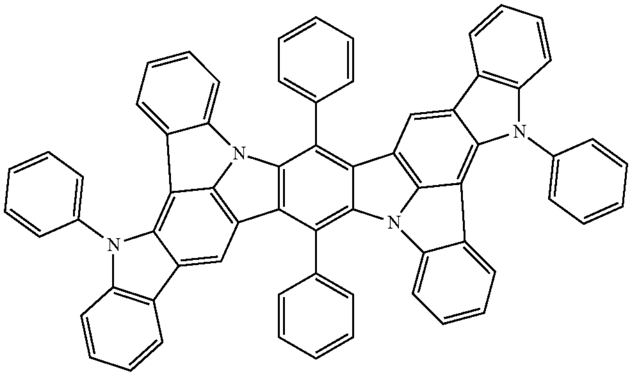

-continued
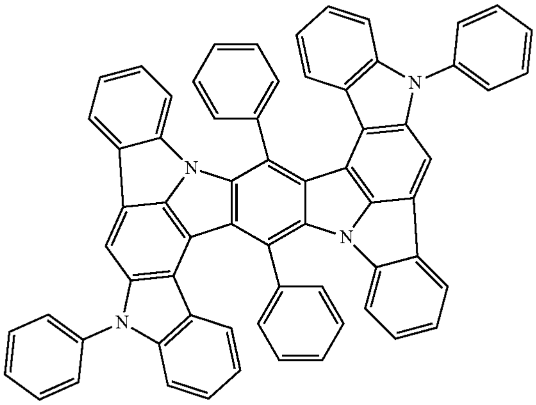
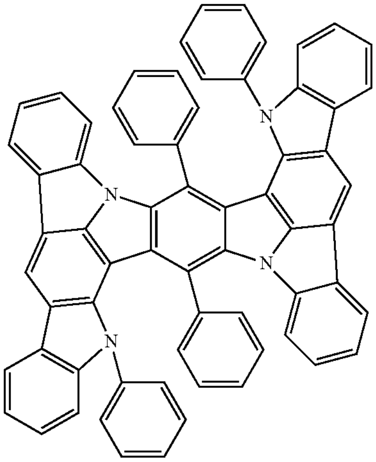
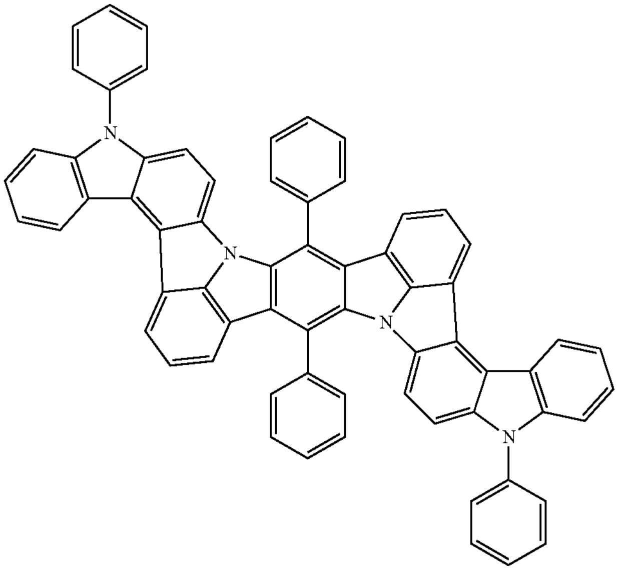
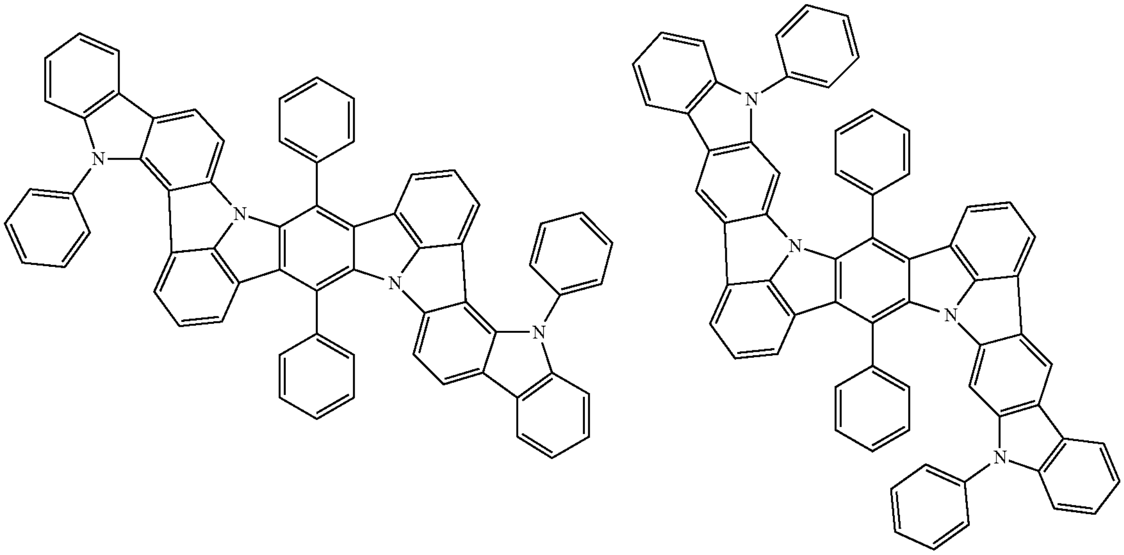

-continued
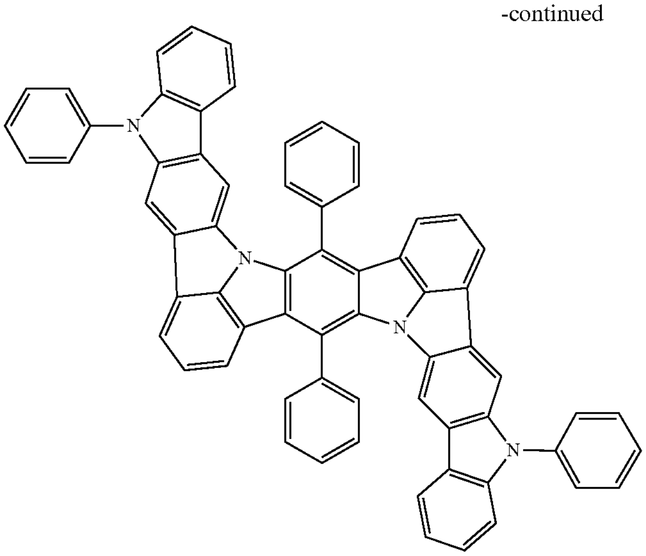
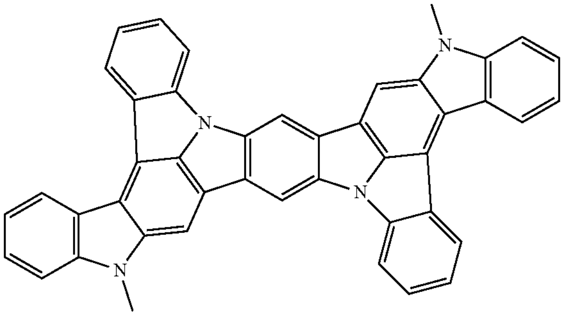
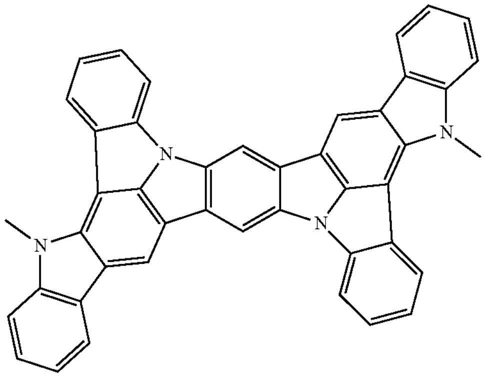
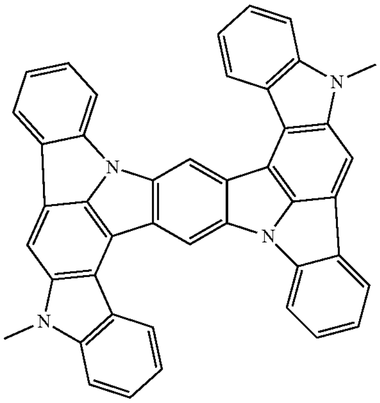
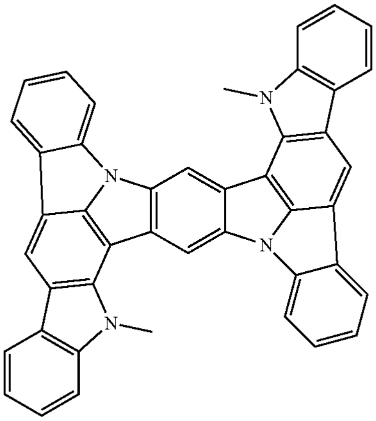
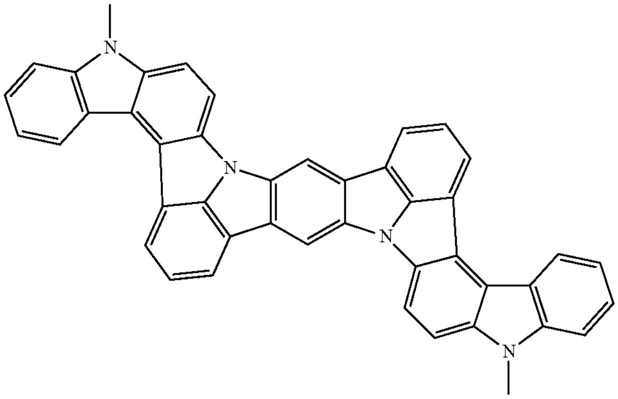

-continued
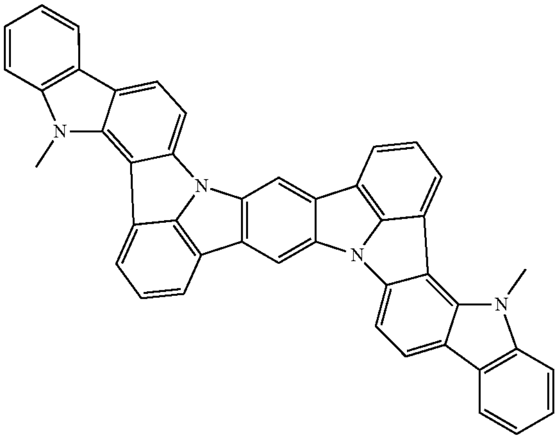
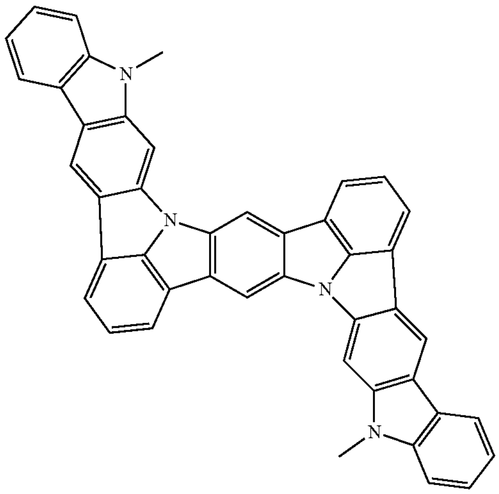
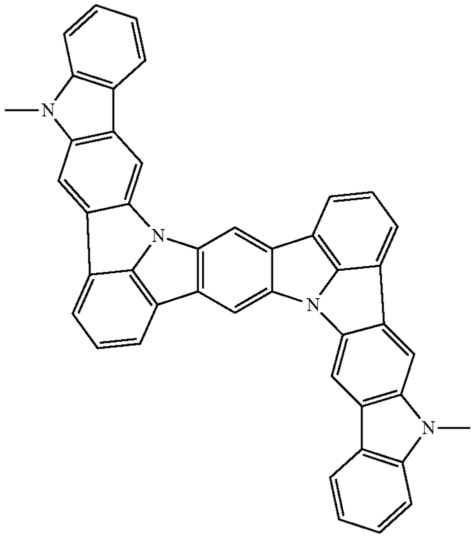
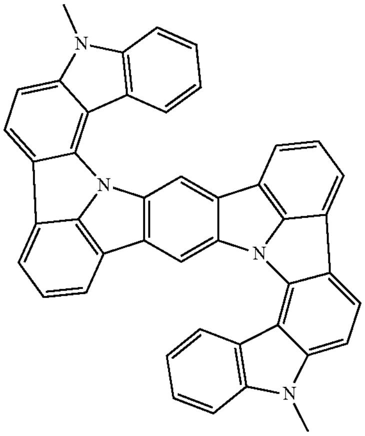
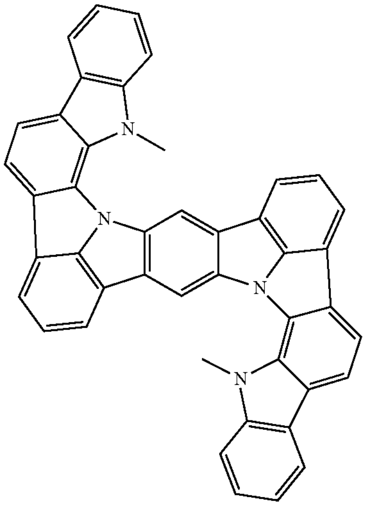
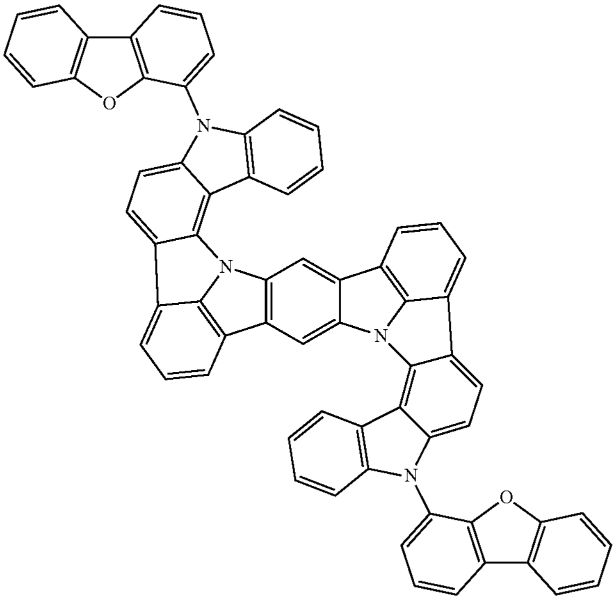

-continued
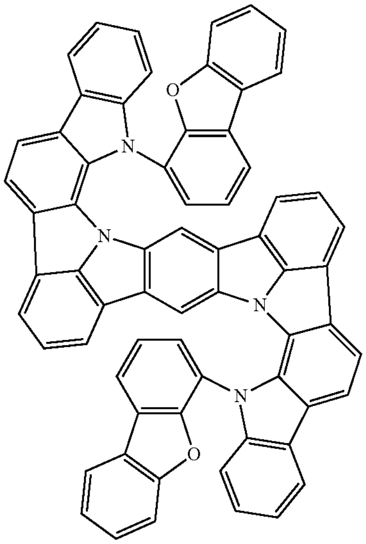
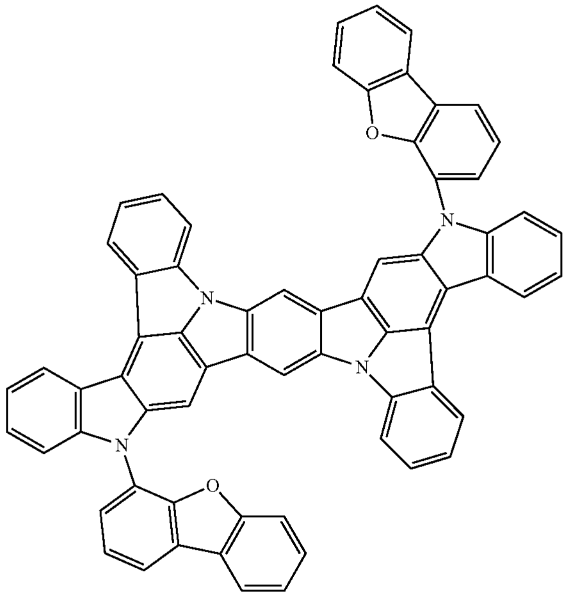
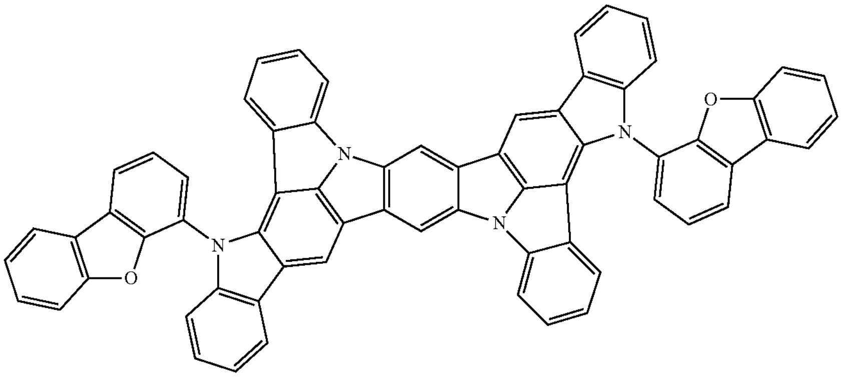
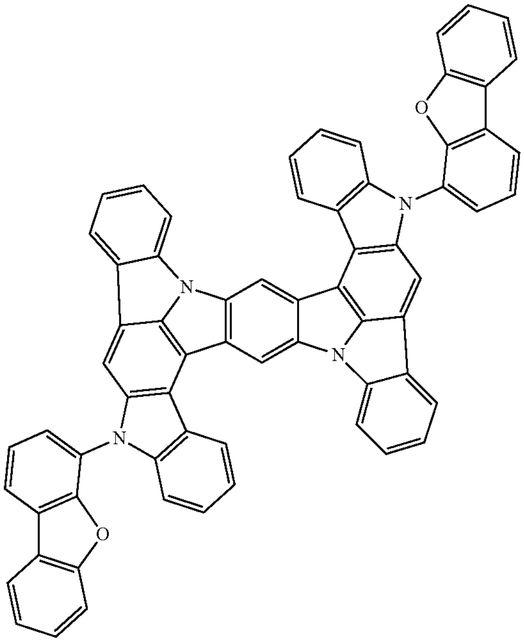
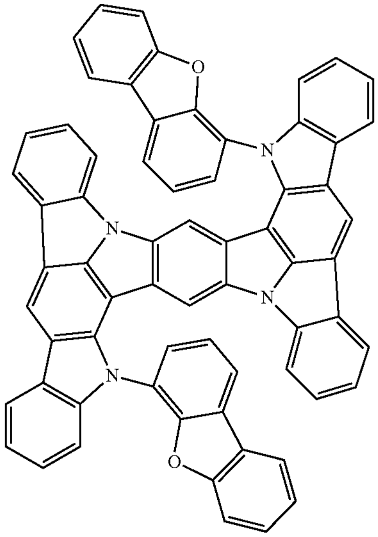

-continued
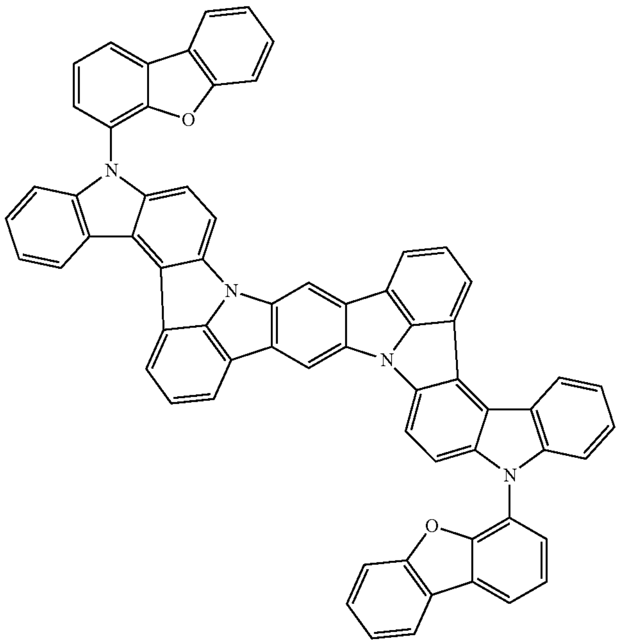
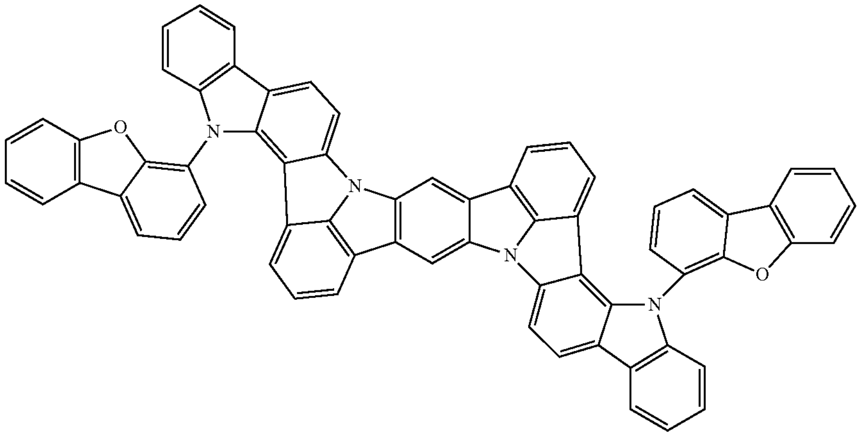
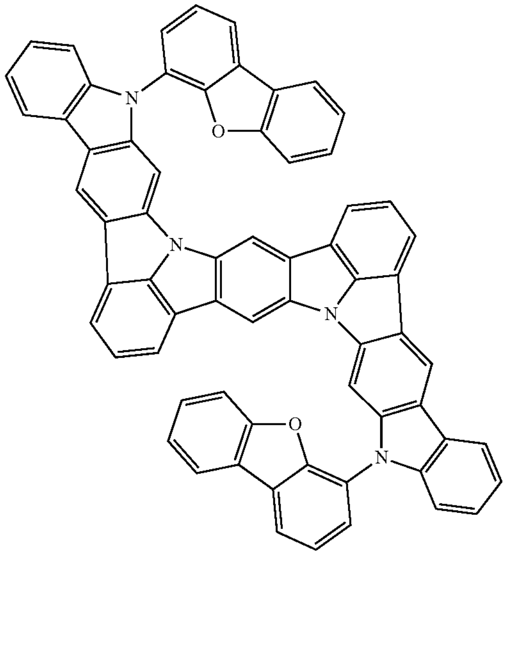

-continued
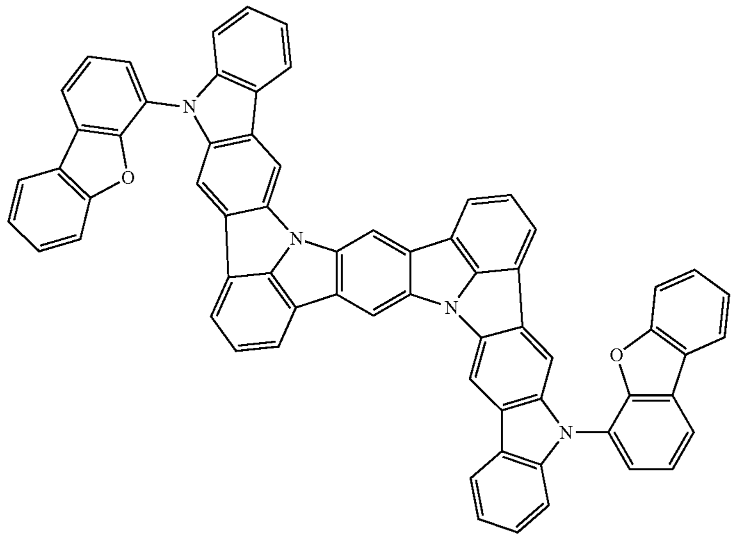
[Formula 316]
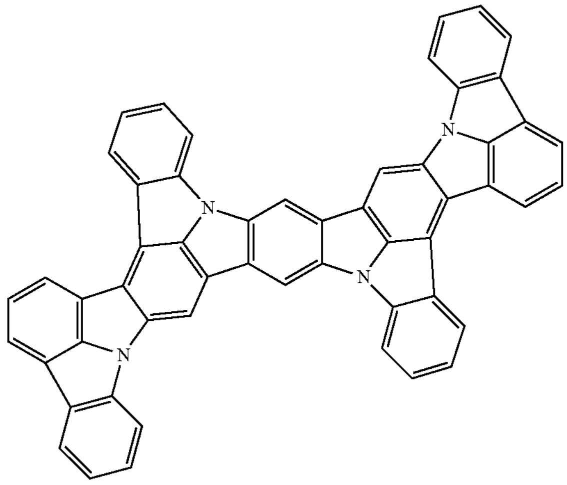
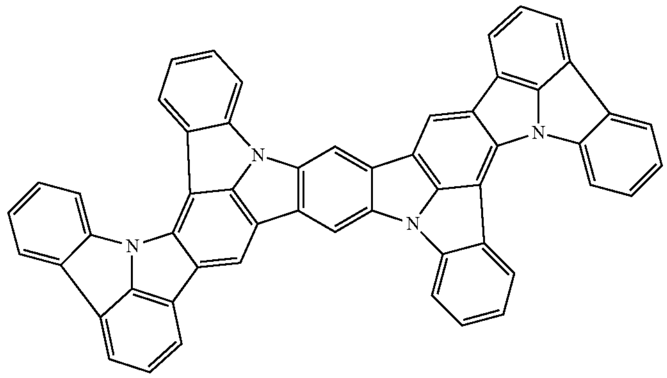

-continued
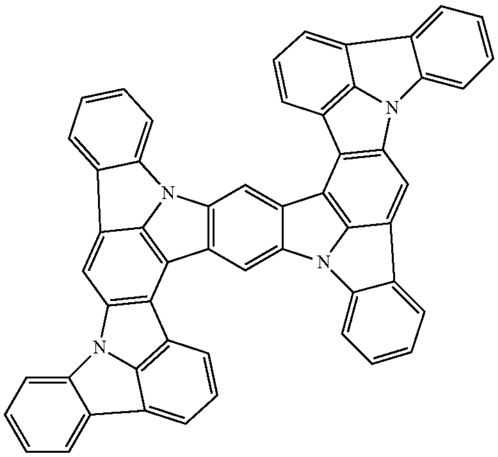
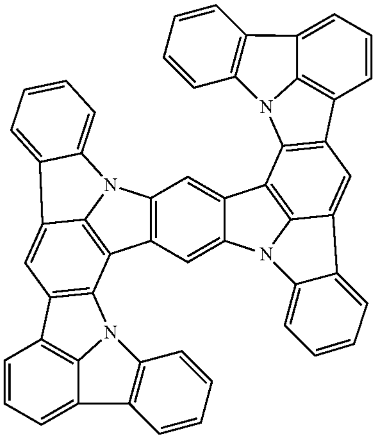
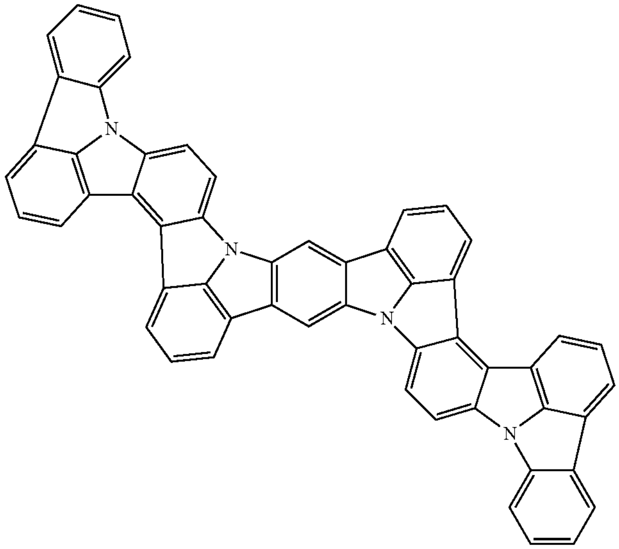
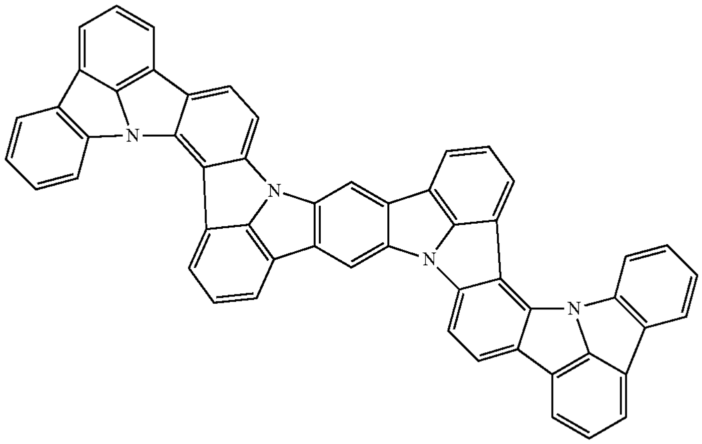

-continued
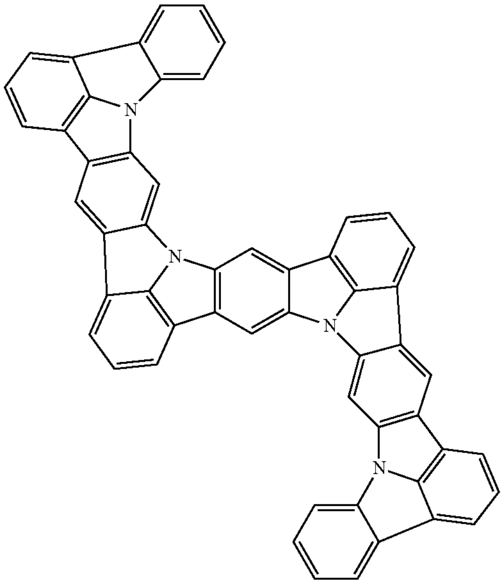
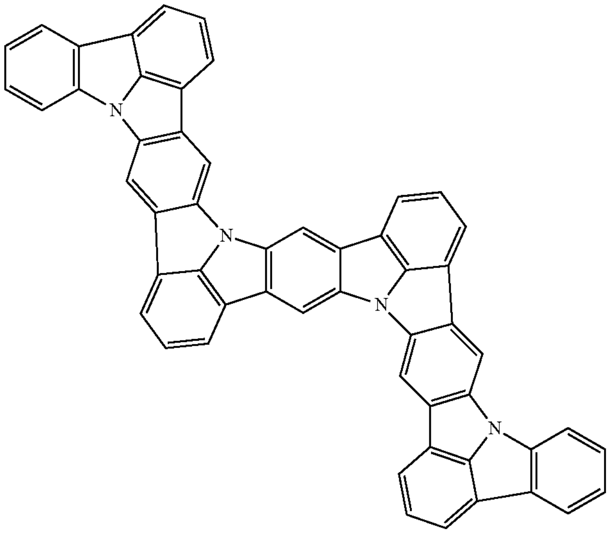
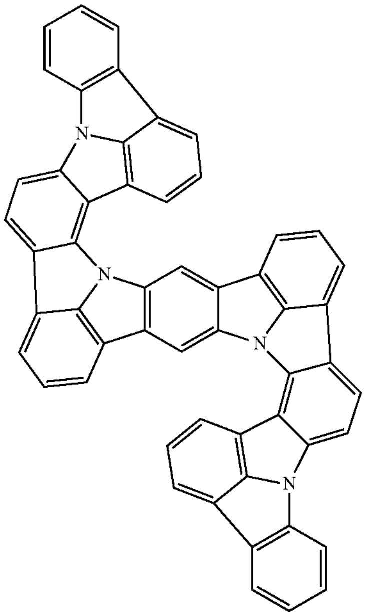
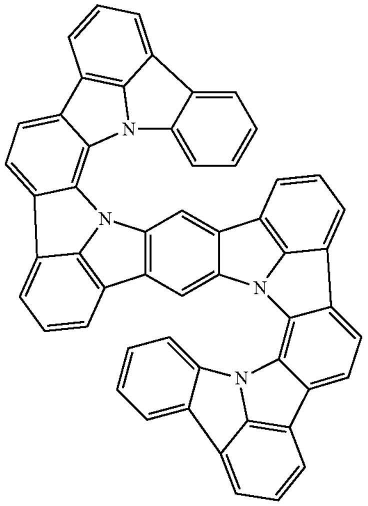
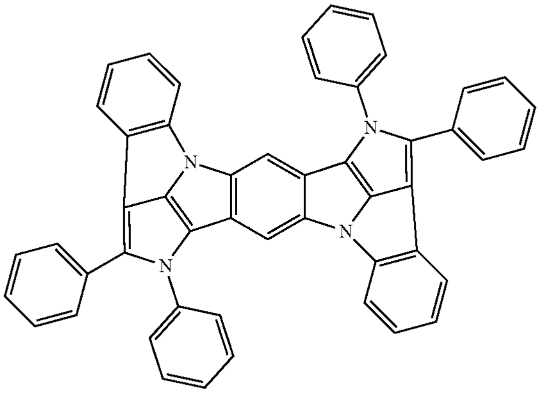
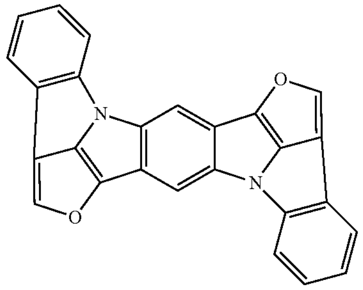

-continued
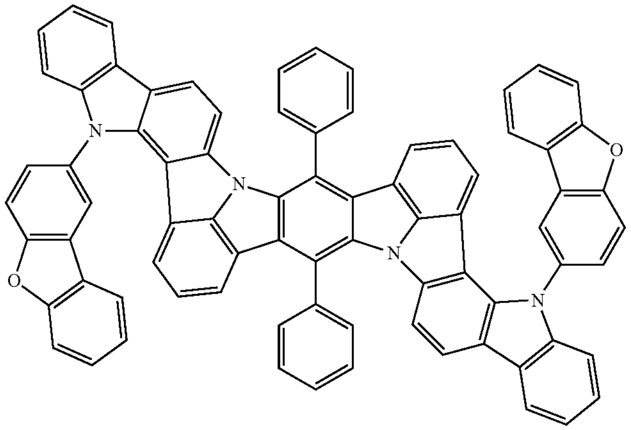
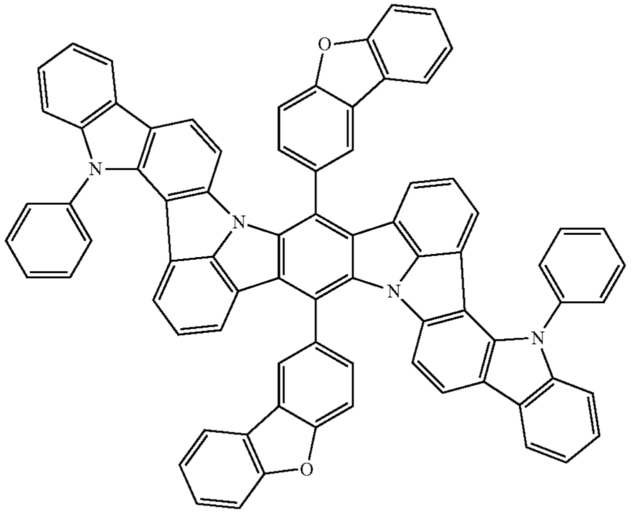
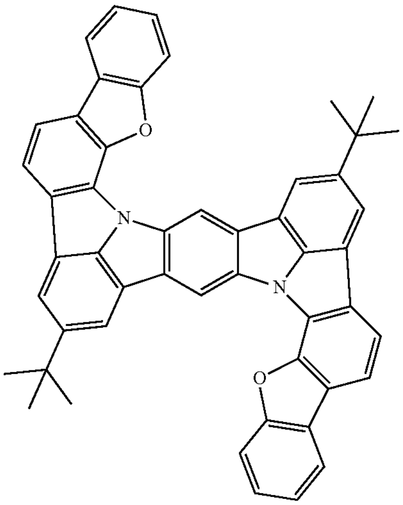
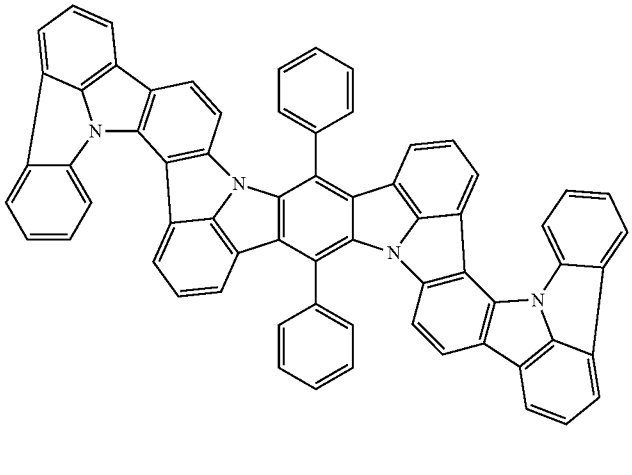

-continued

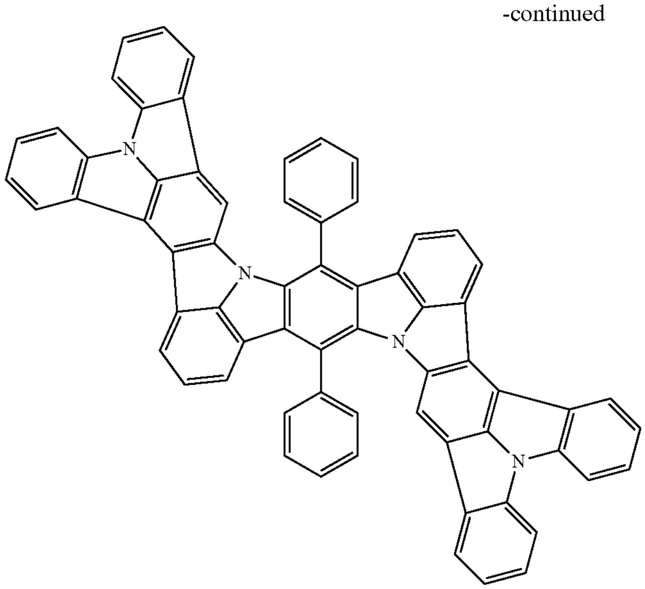

Compound Represented by Formula (6)

The compound represented by the formula (6) will be described below.

It is also preferable that the first emitting compound and the second emitting compound are each a compound represented by the following formula (6).

[Formula 317]

(6)

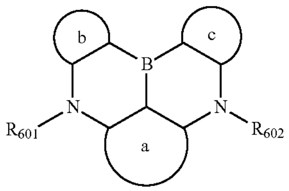

In the formula (6):

a ring a, a ring b and a ring c are each independently a substituted or unsubstituted aromatic hydrocarbon ring having 6 to 50 ring carbon atoms, or a substituted or unsubstituted heterocycle having 5 to 50 ring atoms;

$R_{601}$ and $R_{602}$ are each independently bonded to the ring a, ring b or ring c to form a substituted or unsubstituted heterocycle, or not bonded thereto to form no substituted or unsubstituted heterocycle; and $R_{601}$ and $R_{602}$ not forming the substituted or unsubstituted heterocycle are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

The ring a, the ring b, and the ring c are each a ring fused to the central fused bicyclic structure including a boron atom (B atom) and two nitrogen atoms (N atoms) in the formula (6) (a substituted or unsubstituted aromatic hydrocarbon ring having 6 to 50 ring carbon atoms or a substituted or unsubstituted heterocycle having 5 to 50 ring atoms).

The "aromatic hydrocarbon ring" that can serve as each of the ring a, the ring b, and the ring c has the same structure as the structure of a compound in which a hydrogen atom is introduced into the "aryl group" described above.

The "aromatic hydrocarbon ring" that can serve as the ring a includes three carbon atoms in the central fused bicyclic structure in the formula (6) as ring atoms.

The "aromatic hydrocarbon ring" that can serve as each of the ring b and the ring c includes two carbon atoms in the central fused bicyclic structure in the formula (6) as ring atoms.

Specific examples of the "substituted or unsubstituted aromatic hydrocarbon ring having 6 to 50 ring carbon atoms" include a compound formed by introducing a hydrogen atom to the "aryl group" described in the specific example group G1.

The "heterocycle" that can serve as each of the ring a, the ring b, and the ring c has the same structure as the structure of a compound in which a hydrogen atom is introduced into the "heterocyclic group" described above.

The "heterocycle" that can serve as the ring a includes three carbon atoms in the central fused bicyclic structure in the formula (6) as ring atoms.

The "heterocycle" that can serve as each of the ring b and the ring c includes two carbon atoms in the central fused bicyclic structure in the formula (6) as ring atoms.

Specific examples of the "substituted or unsubstituted heterocycle having 5 to 50 ring atoms" include a compound formed by introducing a hydrogen atom to the "heterocyclic group" described in the specific example group G2.

$R_{601}$ and $R_{602}$ may be each independently bonded with the ring a, ring b, or ring c to form a substituted or unsubstituted heterocycle.

The "heterocycle" in this arrangement includes a nitrogen atom on the fused bicyclic structure at the center of the formula (6).

The heterocycle in the above arrangement optionally includes a hetero atom other than the nitrogen atom.

$R_{601}$ and $R_{602}$ being bonded with the ring a, ring b, or ring c specifically means that atoms forming $R_{901}$ and $R_{602}$ are bonded with atoms forming the ring a, ring b, or ring c.

For instance, $R_{601}$ may be bonded with the ring a to form a bicyclic (or tri-or-more cyclic) fused nitrogen-containing heterocycle, in which the ring including $R_{601}$ and the ring a are fused.

Specific examples of the nitrogen-containing heterocycle include a compound corresponding to the nitrogen-containing bi(or-more)cyclic fused heterocyclic group in the specific example group G2.

The same applies to $R_{601}$ bonded with the ring b, $R_{602}$ bonded with the ring a, and $R_{602}$ bonded with the ring c.

In an exemplary embodiment, the ring a, ring b and ring c in the formula (6) are each independently a substituted or unsubstituted aromatic hydrocarbon ring having 6 to 50 ring carbon atoms.

In an exemplary embodiment, the ring a, the ring b, and the ring c in the formula (6) are each independently a substituted or unsubstituted benzene ring or a substituted or unsubstituted naphthalene ring.

In an exemplary embodiment, $R_{601}$ and $R_{602}$ in the formula (6) are each independently a substituted or unsubstituted aryl group having 6 to 50 ring carbon atoms, or a substituted or unsubstituted heterocyclic group having 5 to 50 ring atoms; preferably a substituted or unsubstituted aryl group having 6 to 50 ring carbon atoms.

In an exemplary embodiment, the compound represented by the formula (6) is a compound represented by a formula (62) below.

[Formula 318]

(62)

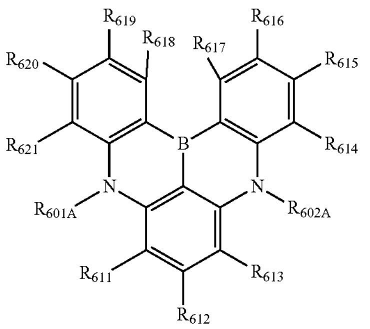

In the formula (62):

$R_{601A}$ is bonded with at least one of $R_{611}$ or $R_{621}$ to form a substituted or unsubstituted heterocycle, or not bonded therewith to form no substituted or unsubstituted heterocycle;

$R_{602A}$ is bonded with at least one of $R_{613}$ or $R_{614}$ to form a substituted or unsubstituted heterocycle, or not bonded therewith to form no substituted or unsubstituted heterocycle;

$R_{601A}$ and $R_{602A}$ not forming the substituted or unsubstituted heterocycle are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

at least one combination of adjacent two or more of $R_{611}$ to $R_{621}$ are mutually bonded to form a substituted or unsubstituted monocyclic ring, mutually bonded to form a substituted or unsubstituted fused ring, or not mutually bonded; and $R_{611}$ to $R_{621}$ not forming the substituted or unsubstituted heterocycle, and not forming the substituted or unsubstituted monocyclic ring, and not forming the substituted or unsubstituted fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

$R_{601A}$ and $R_{602A}$ in the formula (62) are groups corresponding to $R_{601}$ and $R_{602}$ in the formula (6), respectively.

For instance, $R_{601A}$ and $R_{611}$ are optionally bonded with each other to form a bicyclic (or tri-or-more cyclic) fused nitrogen-containing heterocycle, in which the ring including $R_{601A}$ and $R_{611}$ and a benzene ring corresponding to the ring a are fused.

Specific examples of the nitrogen-containing heterocycle include a compound corresponding to the nitrogen-containing bi(or-more)cyclic fused heterocyclic group in the specific example group G2.

The same applies to $R_{601A}$ bonded with $R_{621}$, $R_{602A}$ bonded with $R_{613}$, and $R_{602A}$ bonded with $R_{614}$.

At least one combination of adjacent two or more of $R_{611}$ to $R_{621}$ are mutually bonded to form a substituted or unsubstituted monocyclic ring, or mutually bonded to form a substituted or unsubstituted fused ring.

For instance, $R_{611}$ and $R_{612}$ are optionally mutually bonded to form a structure in which a benzene ring, indole ring, pyrrole ring, benzofuran ring, benzothiophene ring or the like is fused to the six-membered ring bonded with $R_{611}$ and $R_{612}$, the resultant fused ring forming a naphthalene ring, carbazole ring, indole ring, dibenzofuran ring, or dibenzothiophene ring, respectively.

In an exemplary embodiment, $R_{611}$ to $R_{621}$ not contributing to ring formation are each independently a hydrogen atom, a substituted or unsubstituted alkyl group having 1 to 50 carbon atoms, a substituted or unsubstituted aryl group having 6 to 50 ring carbon atoms, or a substituted or unsubstituted heterocyclic group having 5 to 50 ring atoms.

In an exemplary embodiment, $R_{611}$ to $R_{621}$ not contributing to ring formation are each independently a hydrogen atom, a substituted or unsubstituted aryl group having 6 to 50 ring carbon atoms, or a substituted or unsubstituted heterocyclic group having 5 to 50 ring atoms.

In an exemplary embodiment, $R_{611}$ to $R_{621}$ not contributing to ring formation are each independently a hydrogen atom, or a substituted or unsubstituted alkyl group having 1 to 50 carbon atoms.

In an exemplary embodiment, $R_{611}$ to $R_{621}$ not contributing to ring formation are each independently a hydrogen atom, or a substituted or unsubstituted alkyl group having 1 to 50 carbon atoms; and at least one of $R_{611}$ to $R_{621}$ is a substituted or unsubstituted alkyl group having 1 to 50 carbon atoms.

In an exemplary embodiment, the compound represented by the formula (62) is a compound represented by a formula (63) below.

[Formula 319]

(63)

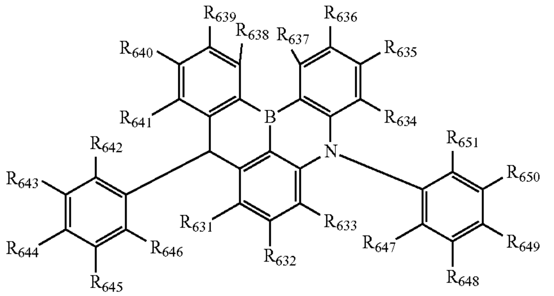

In the formula (63):

$R_{631}$ is bonded with $R_{646}$ to form a substituted or unsubstituted heterocycle, or not bonded therewith to form no substituted or unsubstituted heterocycle;

$R_{633}$ is bonded with $R_{647}$ to form a substituted or unsubstituted heterocycle, or not bonded therewith to form no substituted or unsubstituted heterocycle;

$R_{634}$ is bonded with $R_{651}$ to form a substituted or unsubstituted heterocycle, or not bonded therewith to form no substituted or unsubstituted heterocycle;

$R_{641}$ is bonded with $R_{642}$ to form a substituted or unsubstituted heterocycle, or not bonded therewith to form no substituted or unsubstituted heterocycle;

at least one combination of adjacent two or more of $R_{631}$ to $R_{651}$ are mutually bonded to form a substituted or unsubstituted monocyclic ring, mutually bonded to form a substituted or unsubstituted fused ring, or not mutually bonded; and $R_{631}$ to $R_{651}$ not forming the substituted or unsubstituted heterocycle, not forming the substituted or unsubstituted monocyclic ring, and not forming the substituted or unsubstituted fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

$R_{631}$ is optionally bonded with $R_{646}$ to form a substituted or unsubstituted heterocycle.

For instance, $R_{631}$ and $R_{646}$ are optionally bonded with each other to form a tri-or-more cyclic fused nitrogen-containing heterocycle, in which a benzene ring bonded with $R_{646}$, a ring including a nitrogen atom, and a benzene ring corresponding to the ring a are fused.

Specific examples of the nitrogen-containing heterocycle include a compound corresponding to a nitrogen-containing tri(-or-more)cyclic fused heterocyclic group in the specific example group G2.

The same applies to $R_{633}$ bonded with $R_{647}$, $R_{634}$ bonded with $R_{651}$, and $R_{641}$ bonded with $R_{642}$.

In an exemplary embodiment, $R_{631}$ to $R_{651}$ not contributing to ring formation are each independently a hydrogen atom, a substituted or unsubstituted alkyl group having 1 to 50 carbon atoms, a substituted or unsubstituted aryl group having 6 to 50 ring carbon atoms, or a substituted or unsubstituted heterocyclic group having 5 to 50 ring atoms.

In an exemplary embodiment, $R_{631}$ to $R_{651}$ not contributing to ring formation are each independently a hydrogen atom, a substituted or unsubstituted aryl group having 6 to 50 ring carbon atoms, or a substituted or unsubstituted heterocyclic group having 5 to 50 ring atoms.

In an exemplary embodiment, $R_{631}$ to $R_{651}$ not contributing to ring formation are each independently a hydrogen atom, or a substituted or unsubstituted alkyl group having 1 to 50 carbon atoms.

In an exemplary embodiment, $R_{631}$ to $R_{651}$ not contributing to ring formation are each independently a hydrogen atom, or a substituted or unsubstituted alkyl group having 1 to 50 carbon atoms; and at least one of $R_{631}$ to $R_{651}$ is a substituted or unsubstituted alkyl group having 1 to 50 carbon atoms.

In an exemplary embodiment, the compound represented by the formula (63) is a compound represented by a formula (63A) below.

[Formula 320]

(63A)

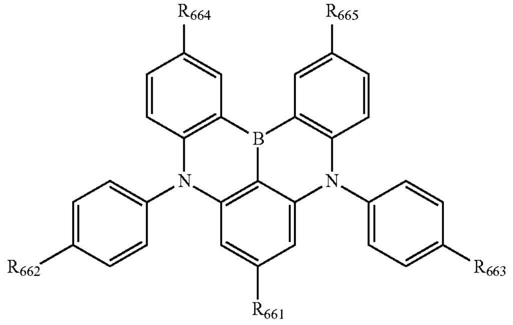

In the formula (63A):

$R_{661}$ is a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, or a substituted or unsubstituted aryl group having 6 to 50 ring carbon atoms; and $R_{662}$ to $R_{665}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, or a substituted or unsubstituted aryl group having 6 to 50 ring carbon atoms.

In an exemplary embodiment, $R_{661}$ to $R_{665}$ are each independently a substituted or unsubstituted alkyl group having 1 to 50 carbon atoms or a substituted or unsubstituted aryl group having 6 to 50 ring carbon atoms.

In an exemplary embodiment, $R_{661}$ to $R_{665}$ are each independently a substituted or unsubstituted alkyl group having 1 to 50 carbon atoms.

In an exemplary embodiment, the compound represented by the formula (63) is a compound represented by a formula (63B) below.

[Formula 321]

(63B)

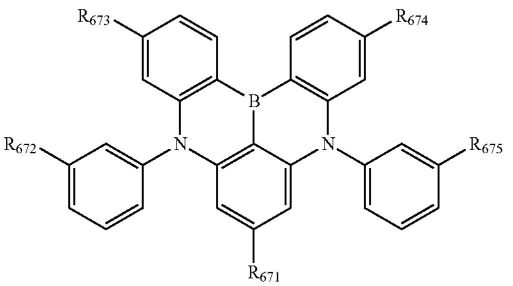

In the formula (63B):

$Ar_{671}$ and $Ar_{672}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —N($R_{906}$)($R_{907}$), or a substituted or unsubstituted aryl group having 6 to 50 ring carbon atoms, $R_{673}$ to $R_{675}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —N($R_{906}$)($R_{907}$), or a substituted or unsubstituted aryl group having 6 to 50 ring carbon atoms.

In an exemplary embodiment, the compound represented by the formula (63) is a compound represented by a formula (63B') below.

[Formula 322]

(63B')

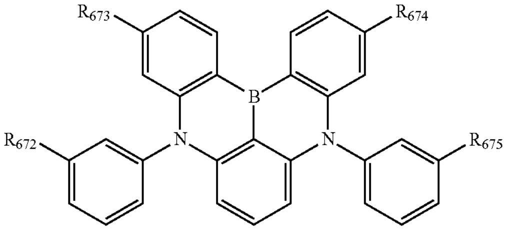

In the formula (63B'), $R_{672}$ to $R_{675}$ each independently represent the same as $R_{672}$ to $R_{675}$ in the formula (63B).

In an exemplary embodiment, at least one of $R_{671}$ to $R_{675}$ is a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —N($R_{906}$)($R_{907}$), or a substituted or unsubstituted aryl group having 6 to 50 ring carbon atoms.

In an exemplary embodiment:

$R_{672}$ is a hydrogen atom, a substituted or unsubstituted alkyl group having 1 to 50 carbon atoms, a group represented by —N($R_{906}$)($R_{907}$), or a substituted or unsubstituted aryl group having 6 to 50 ring carbon atoms; and $R_{671}$ and $R_{673}$ to $R_{675}$ are each independently a substituted or unsubstituted alkyl group having 1 to 50 carbon atoms, a group represented by —N($R_{906}$)($R_{907}$), or a substituted or unsubstituted aryl group having 6 to 50 ring carbon atoms.

In an exemplary embodiment, the compound represented by the formula (63) is a compound represented by a formula (63C) below.

[Formula 323]

(63C)

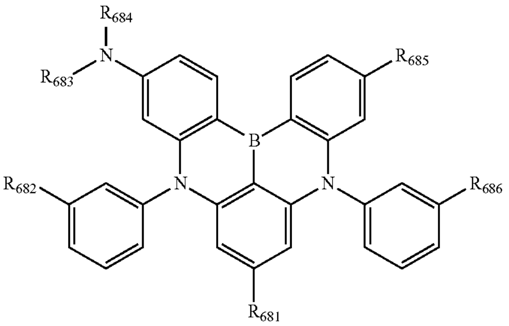

In the formula (63C):

$R_{681}$ and $R_{682}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, or a substituted or unsubstituted aryl group having 6 to 50 ring carbon atoms, $R_{683}$ to $R_{686}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, or a substituted or unsubstituted aryl group having 6 to 50 ring carbon atoms.

In an exemplary embodiment, the compound represented by the formula (63) is a compound represented by a formula (63C') below.

[Formula 324]

(63C')

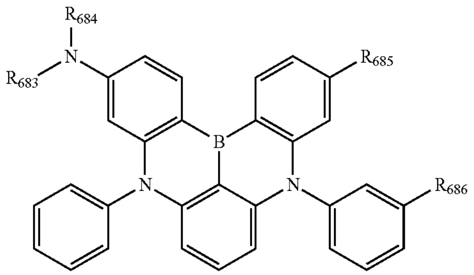

In the formula (63C'), $R_{683}$ to $R_{686}$ each independently represent the same as $R_{683}$ to $R_{686}$ in the formula (63C).

In an exemplary embodiment, $R_{681}$ to $R_{686}$ are each independently a substituted or unsubstituted alkyl group having 1 to 50 carbon atoms or a substituted or unsubstituted aryl group having 6 to 50 ring carbon atoms.

In an exemplary embodiment, $R_{681}$ to $R_{686}$ are each independently a substituted or unsubstituted aryl group having 6 to 50 carbon atoms.

The compound represented by the formula (6) is producible by initially bonding the ring a, ring b and ring c with linking groups (a group including N—$R_{601}$ and a group including N—$R_{602}$) to form an intermediate (first reaction), and bonding the ring a, ring b and ring c with a linking group (a group including a boron atom) to form a final product (second reaction).

In the first reaction, an amination reaction (e.g. Buchwald-Hartwig reaction) is applicable.

In the second reaction, Tandem Hetero-Friedel-Crafts Reactions or the like is applicable.

Specific Examples of Compound Represented by Formula (6)

Specific examples of the compound represented by the formula (6) are shown below. It should however be noted that these specific examples are merely exemplary and do not limit the compound represented by the formula (6).

[Formula 325]

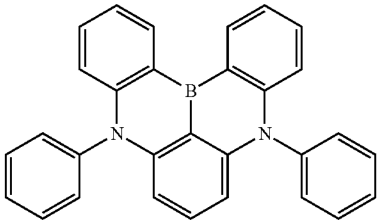

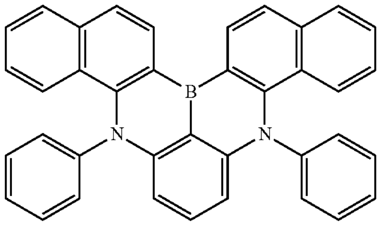

-continued

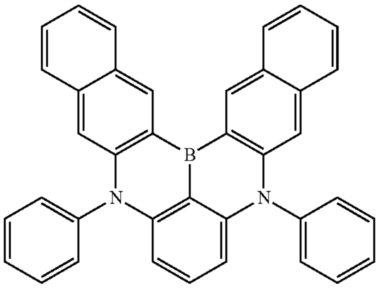

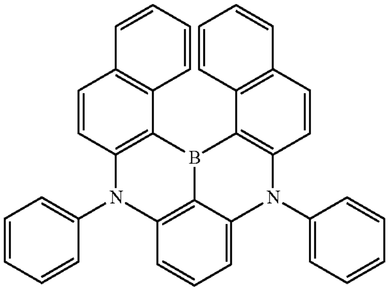

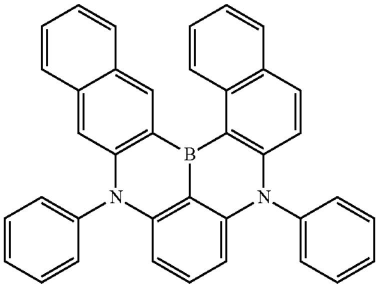

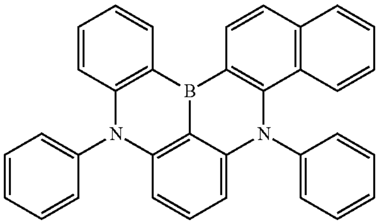

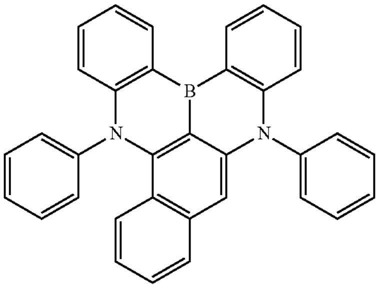

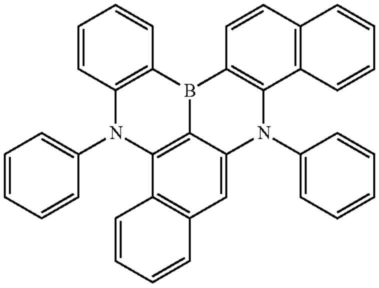

-continued
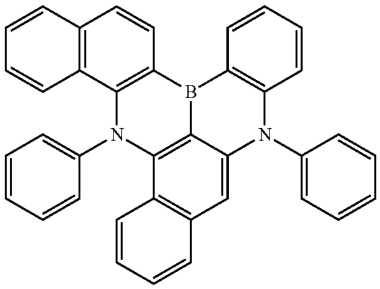
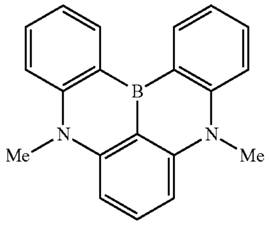
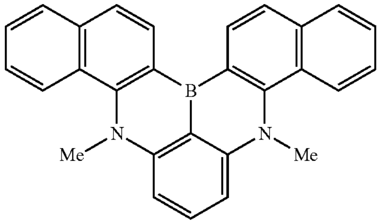
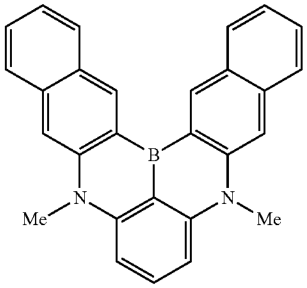
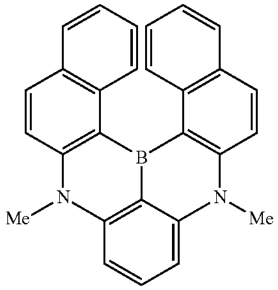
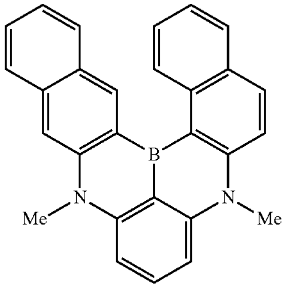
-continued
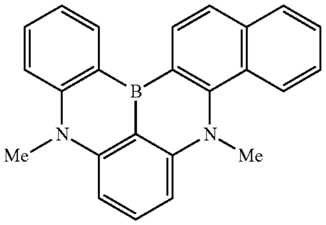
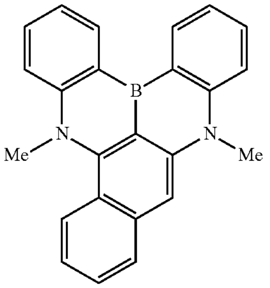
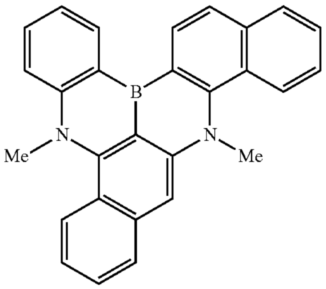
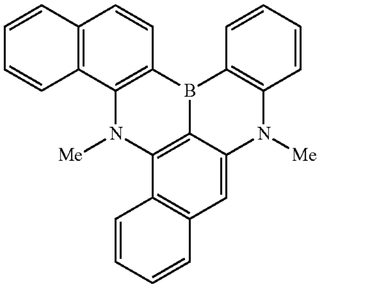
[Formula 326]
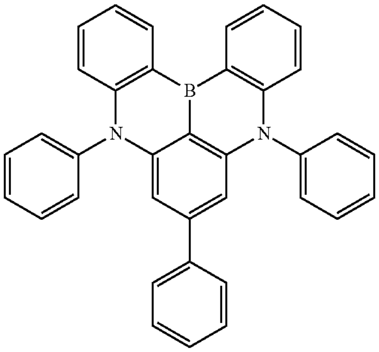

-continued
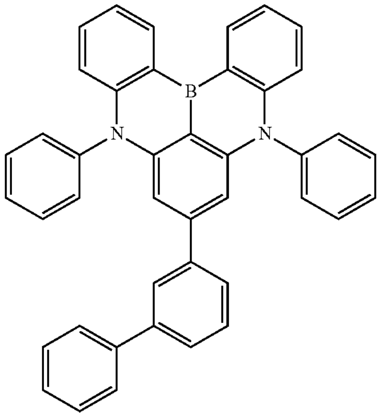
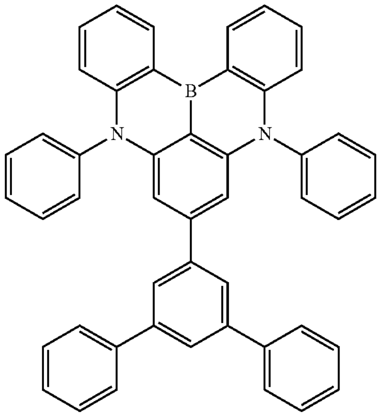
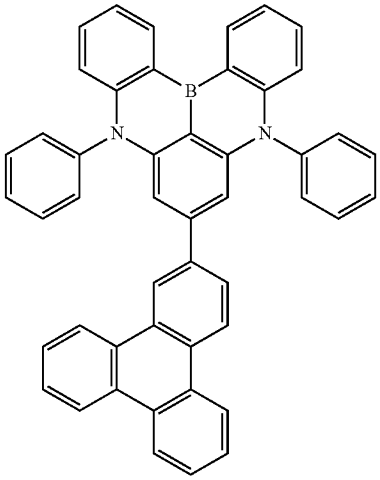
-continued
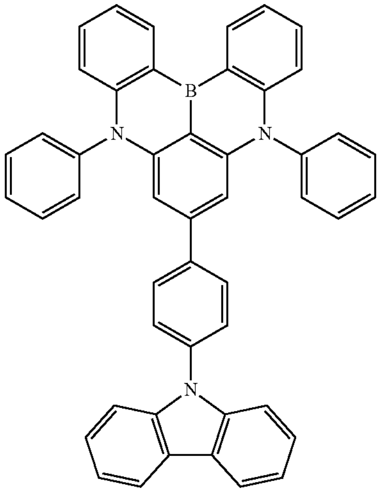
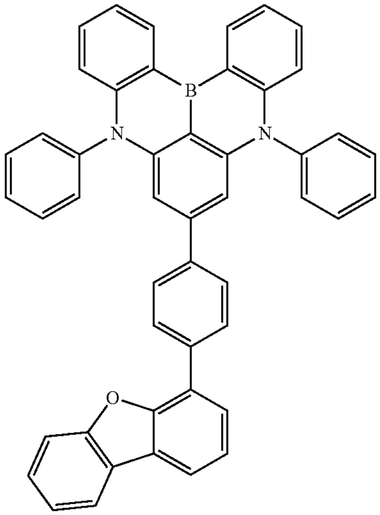
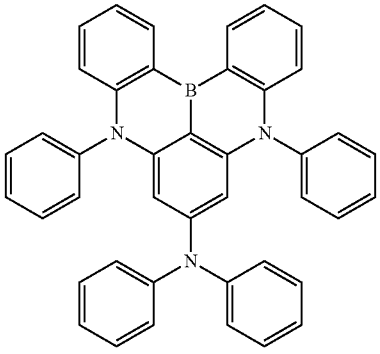
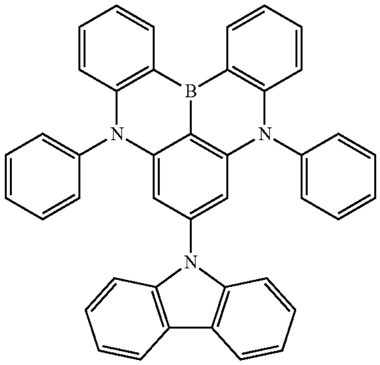

-continued
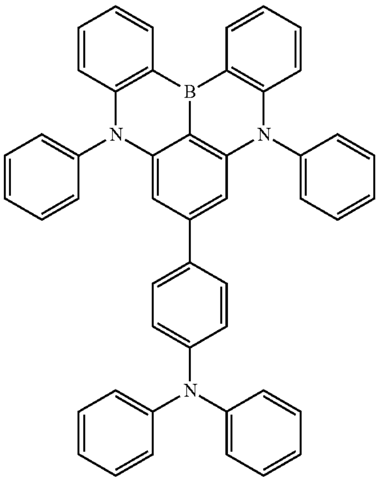
[Formula 327]
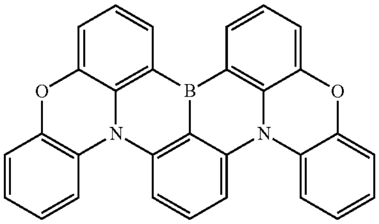
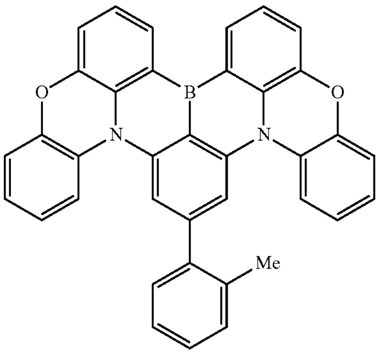
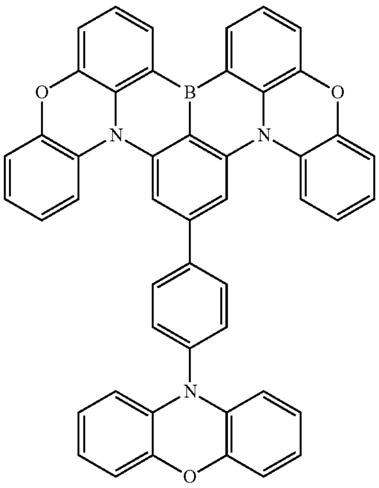
-continued
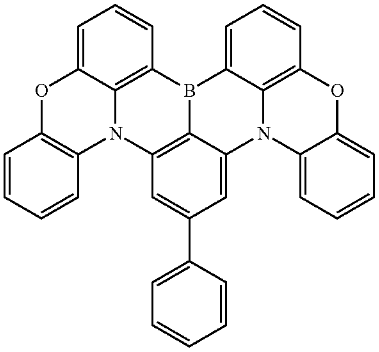
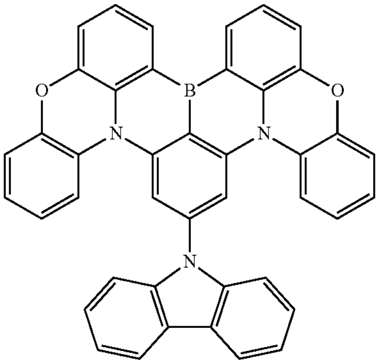
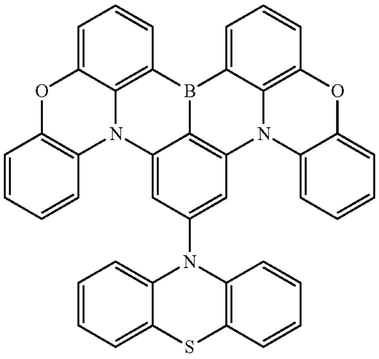
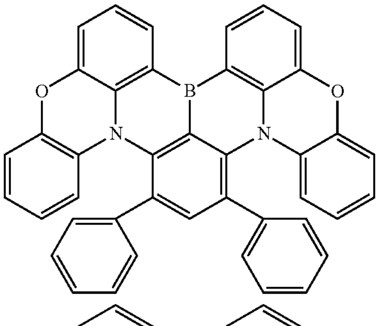
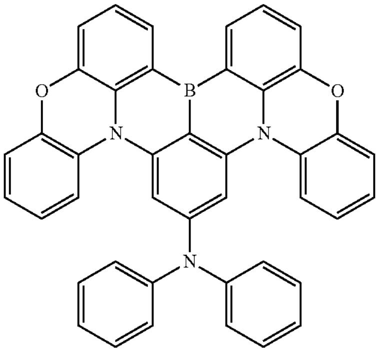

-continued
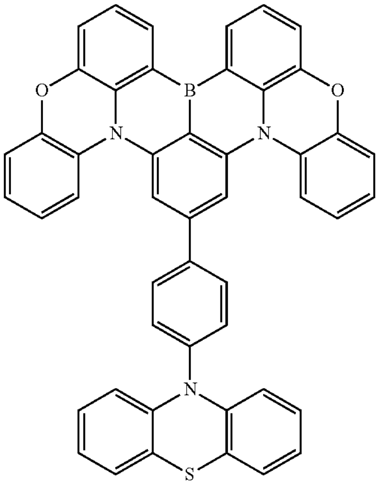
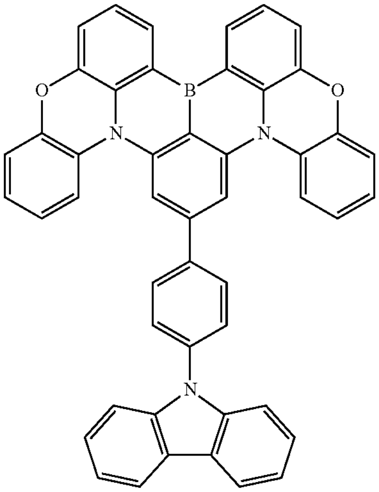
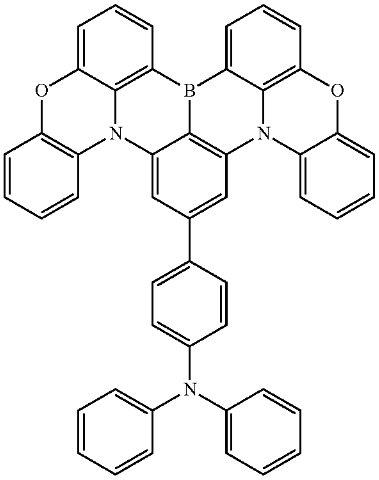
-continued
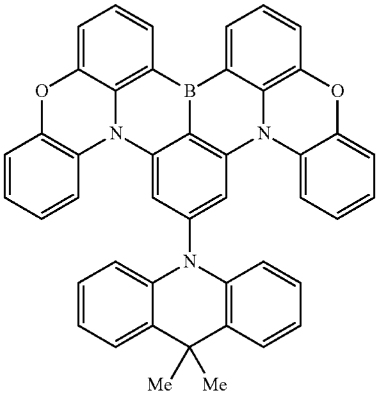
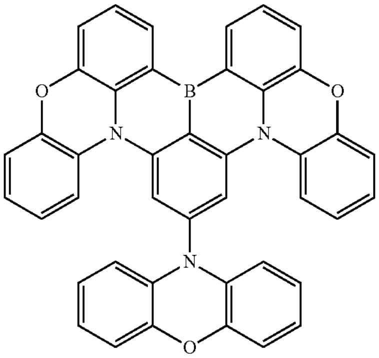
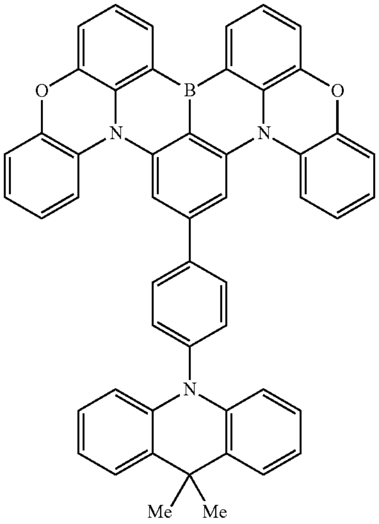
[Formula 328]
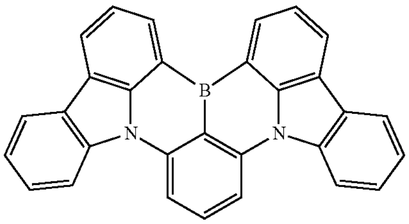

-continued
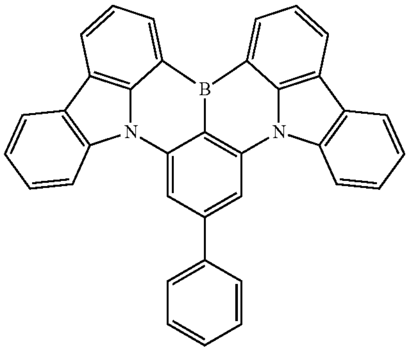
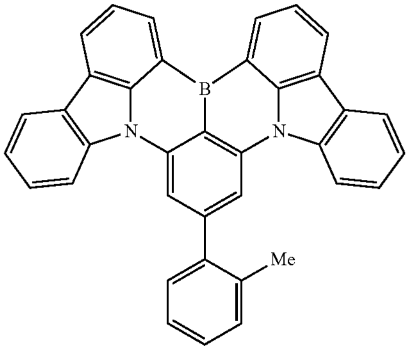
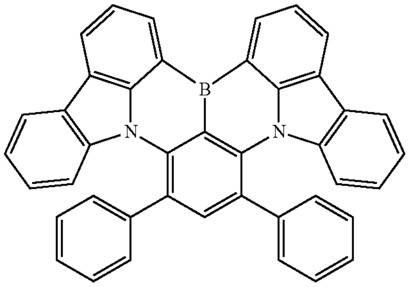
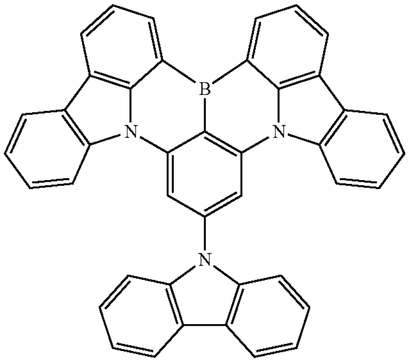
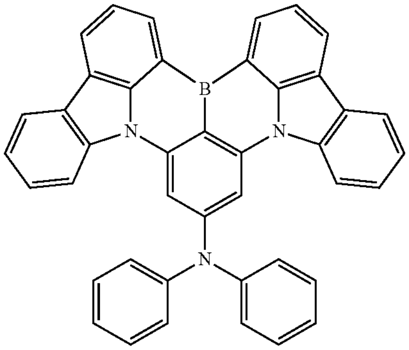
-continued
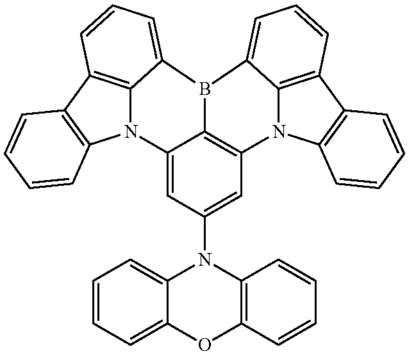
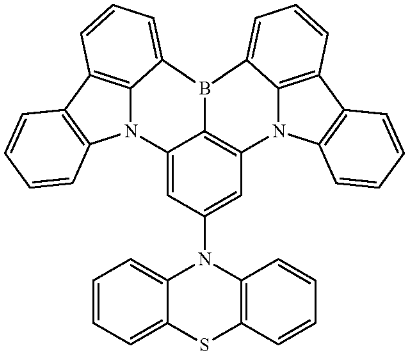
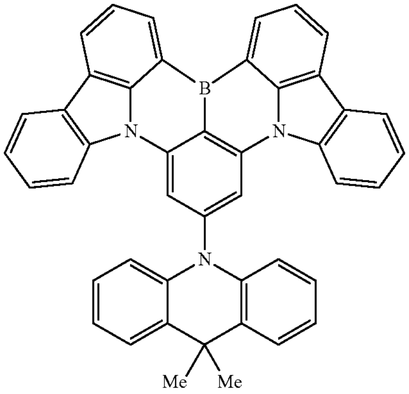
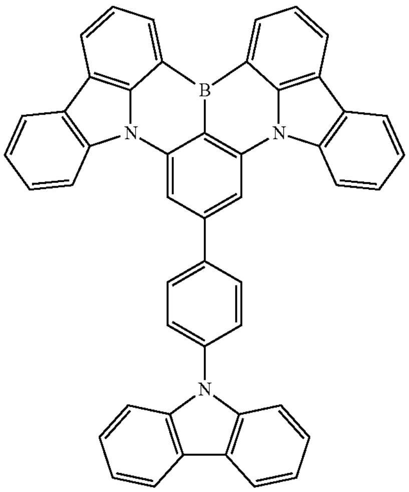

-continued
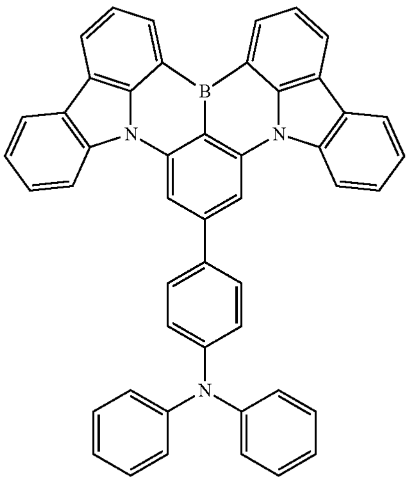
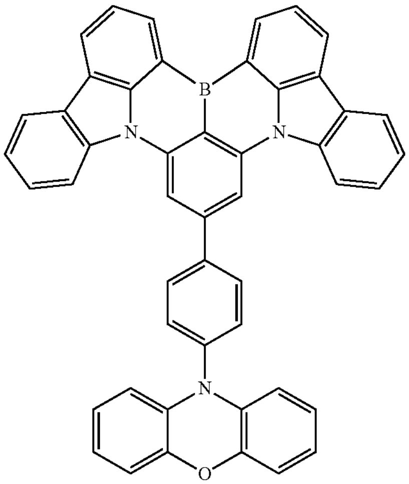
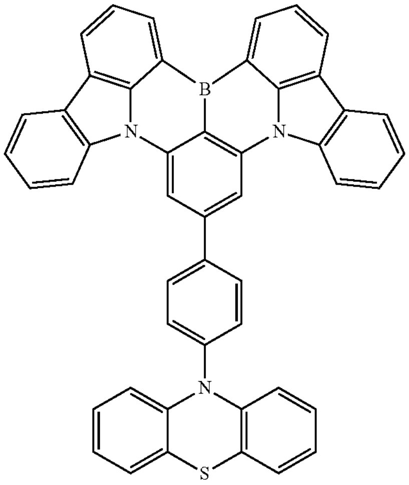
-continued
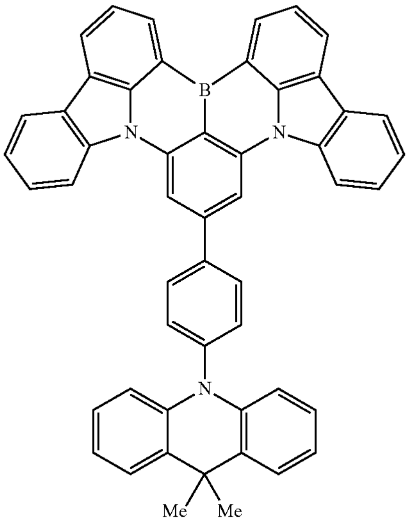
[Formula 329]
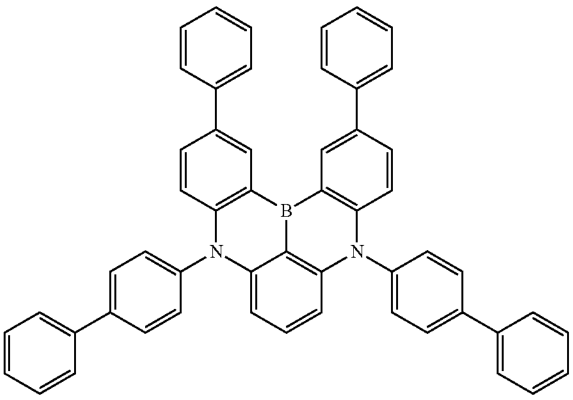
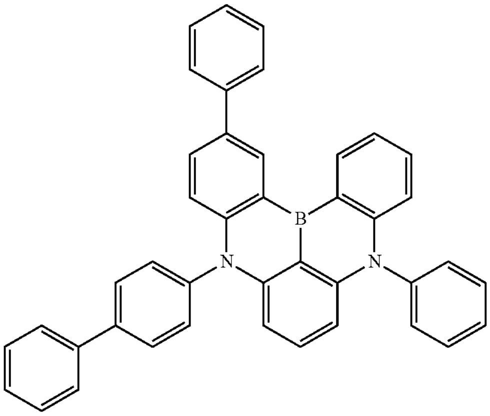
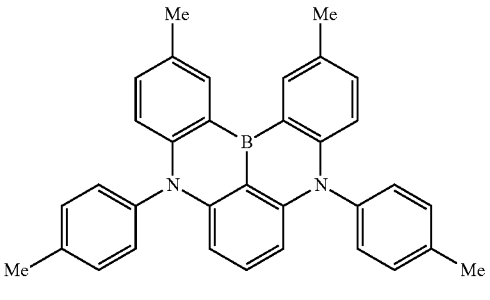

-continued
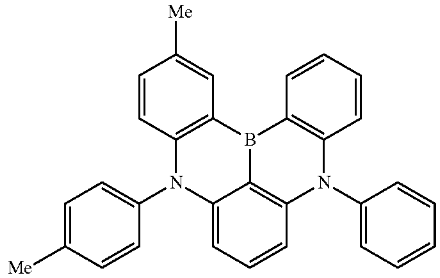
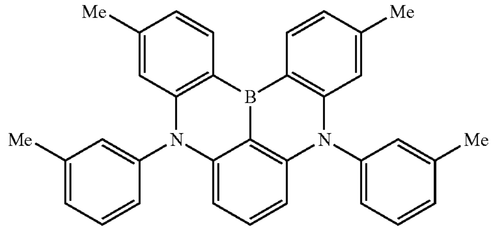
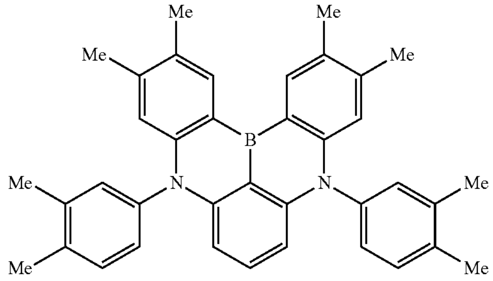
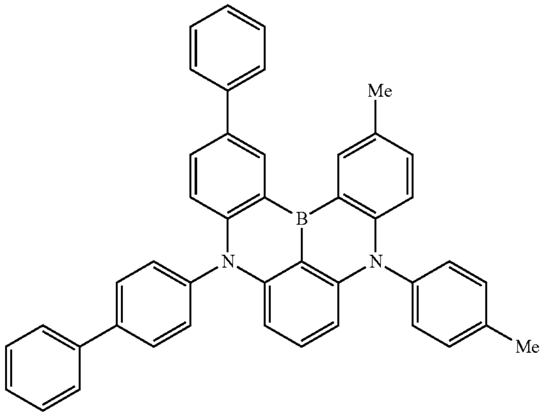
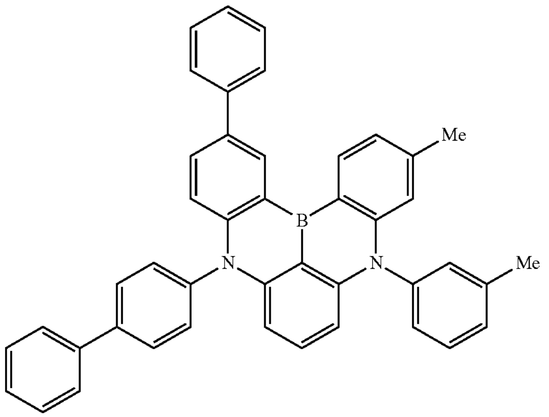
-continued
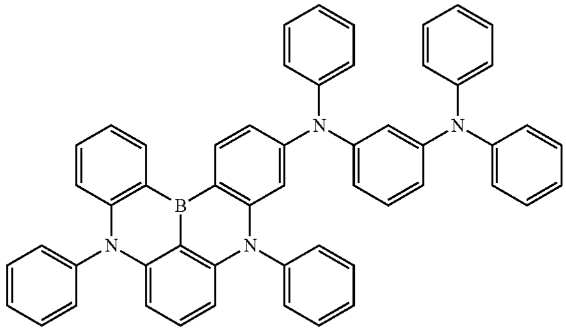
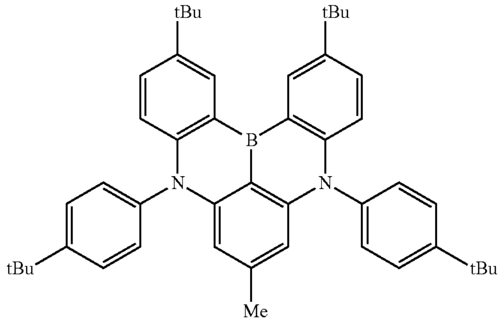
[Formula 330]
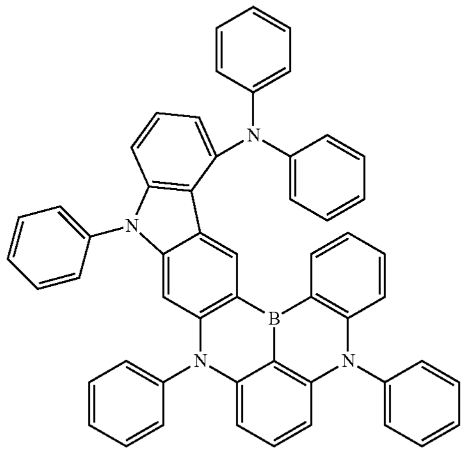
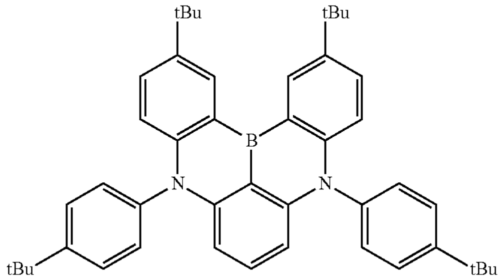
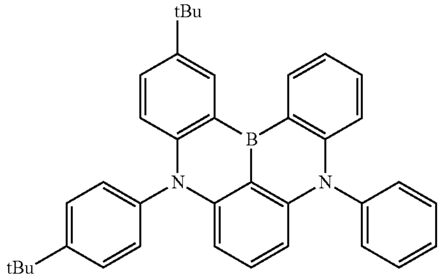

-continued
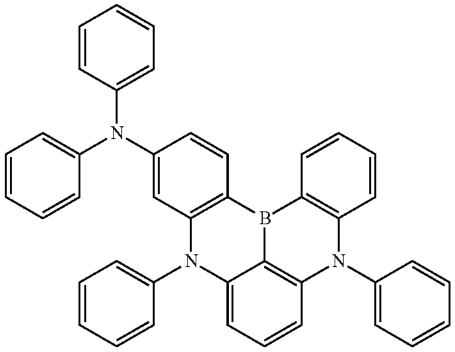
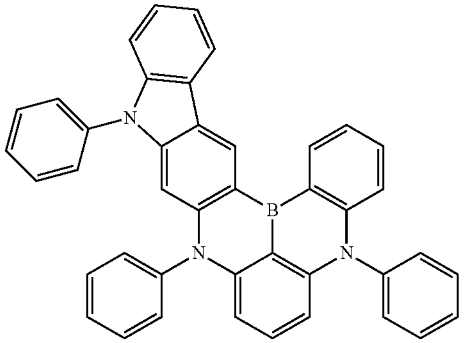
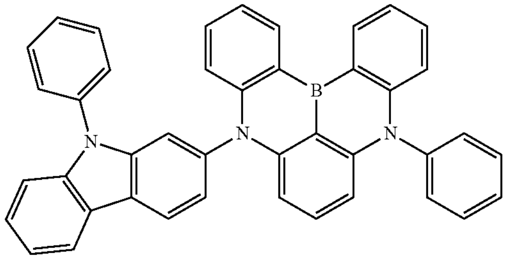
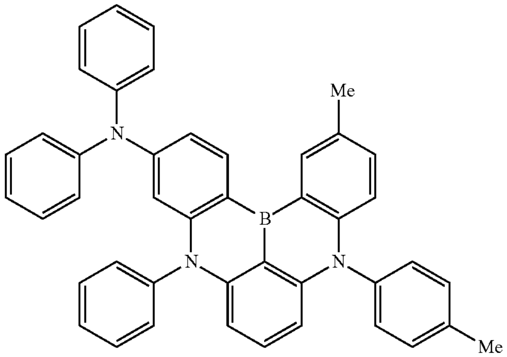
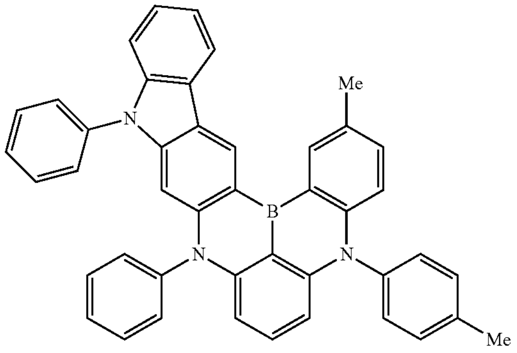
-continued
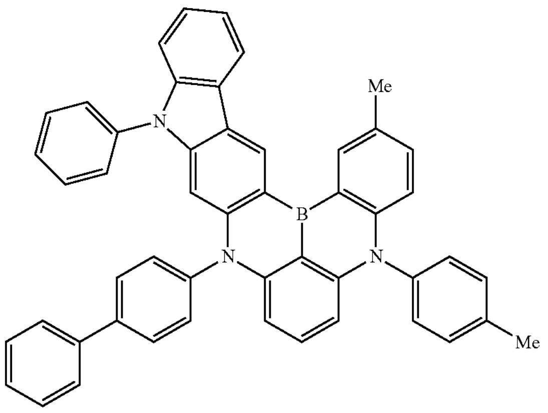
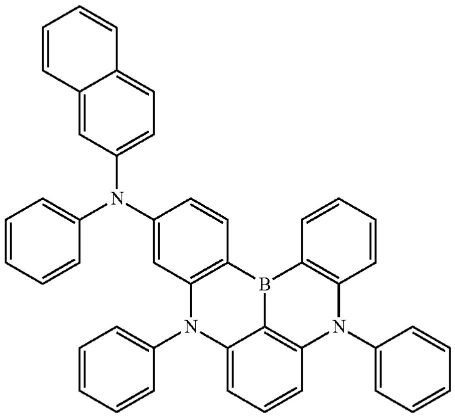
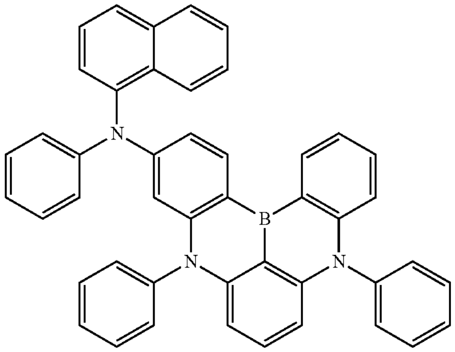
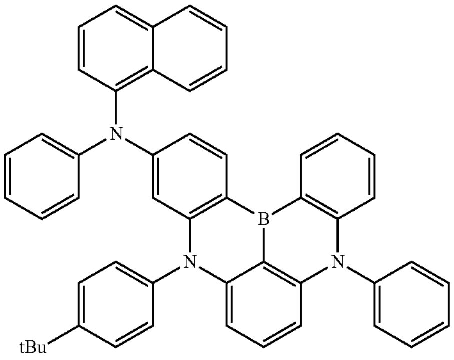

-continued
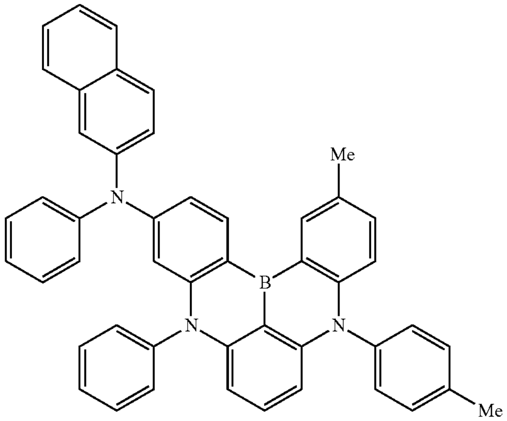
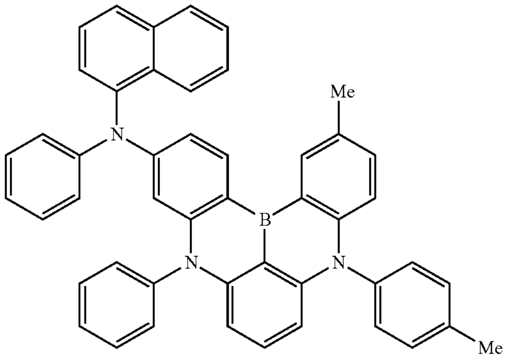
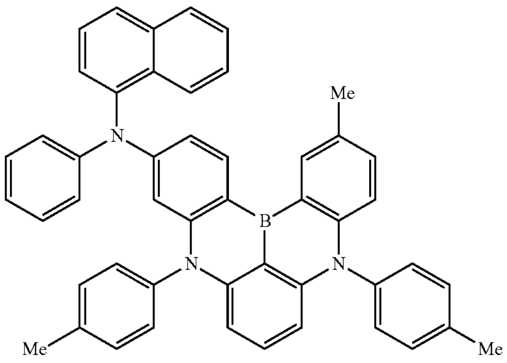
[Formula 331]
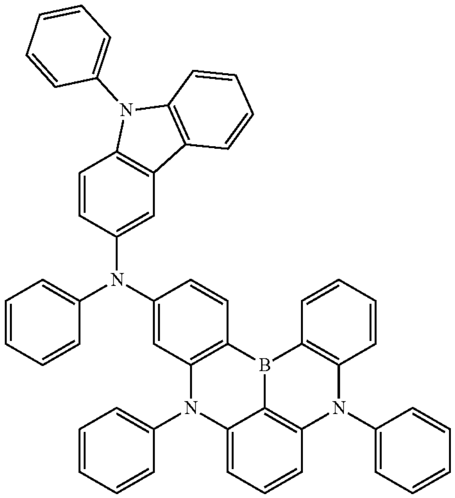
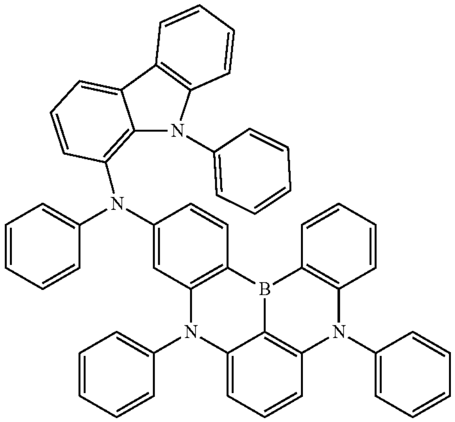
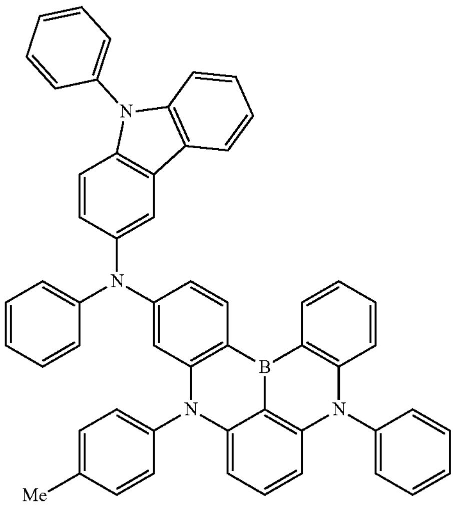

-continued
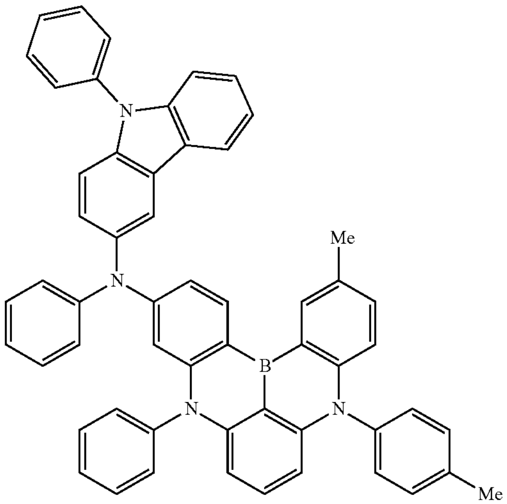
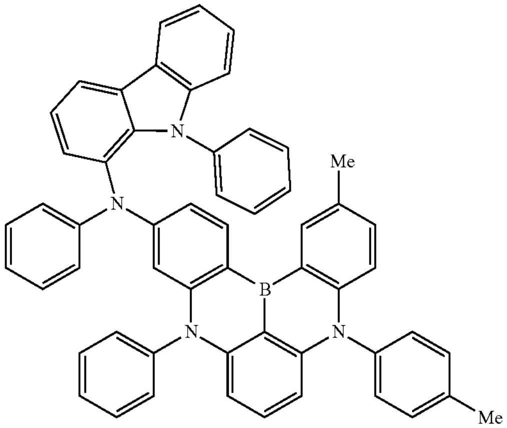
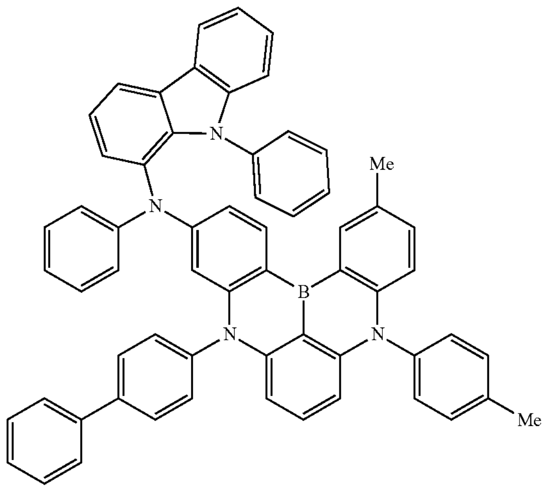
-continued
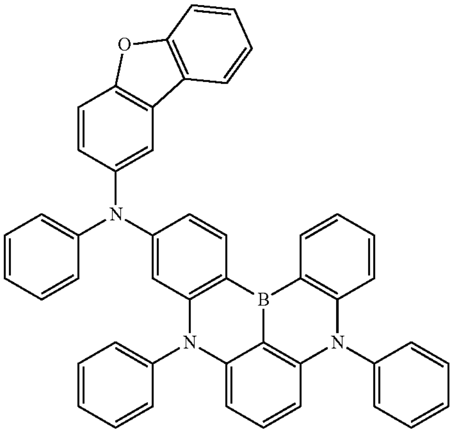
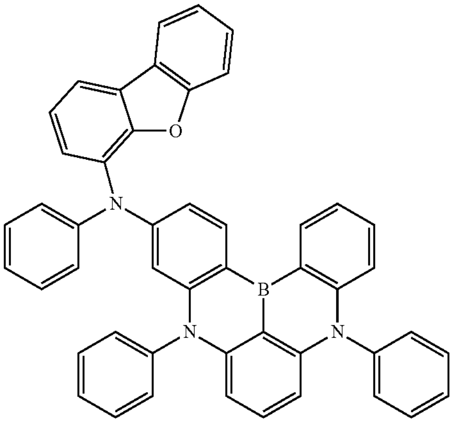
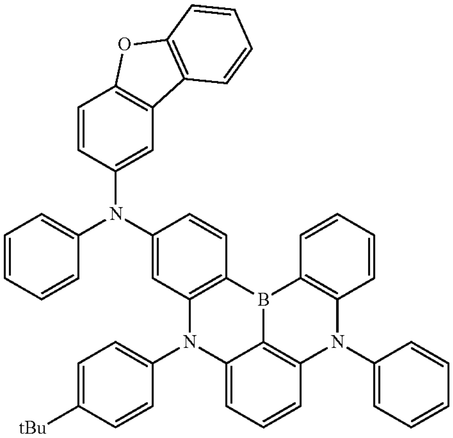
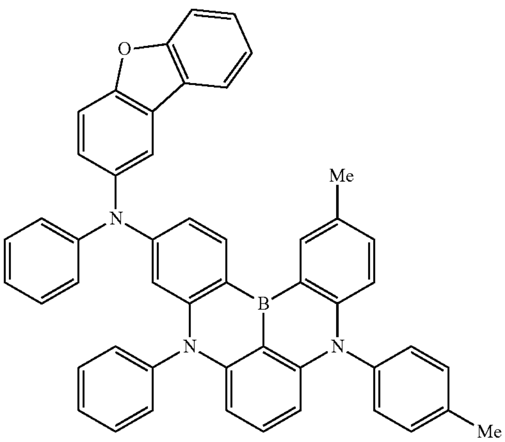

-continued
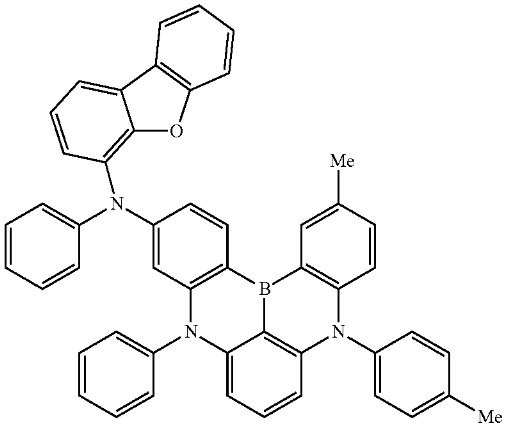
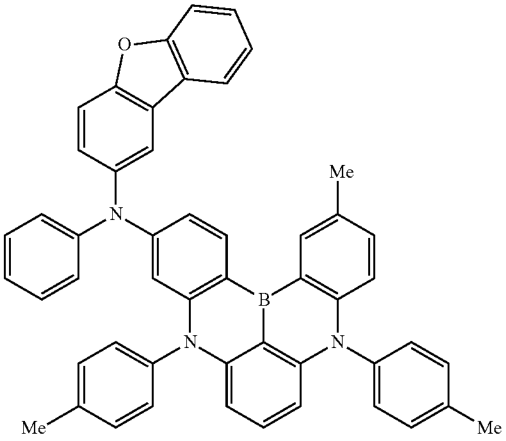
[Formula 332]
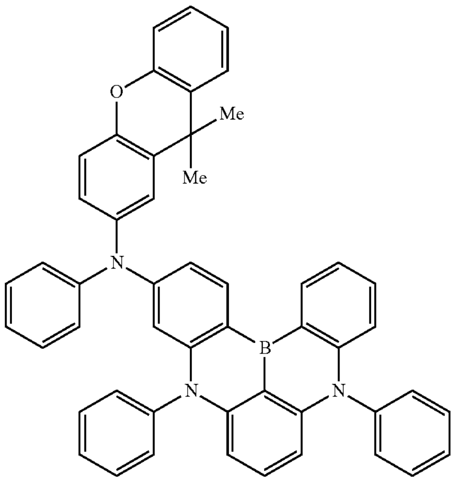
-continued
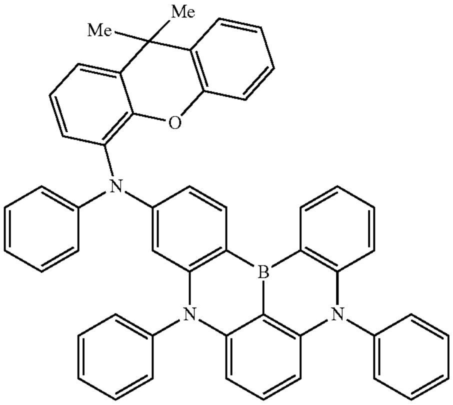
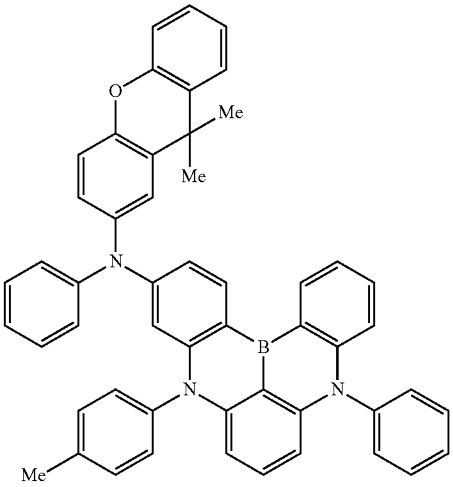
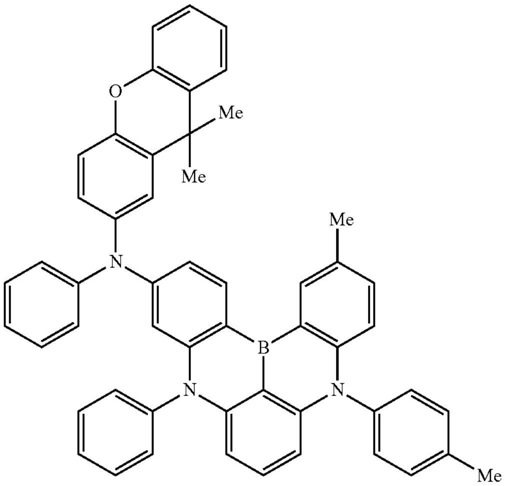

-continued
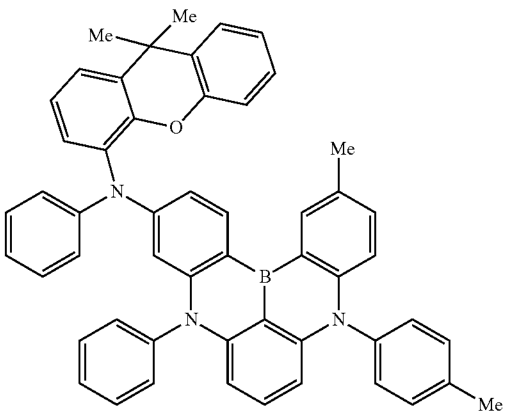
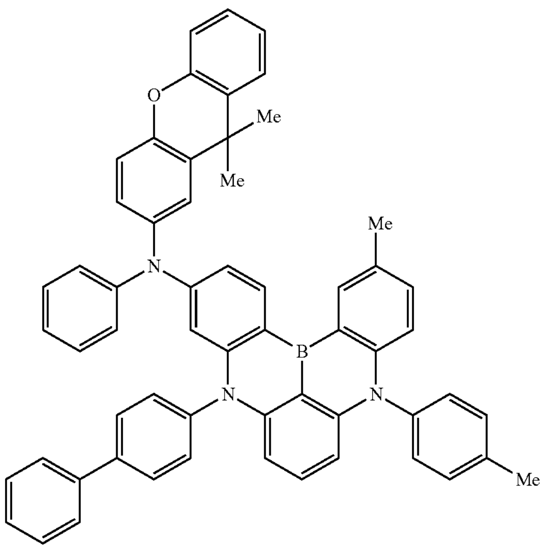
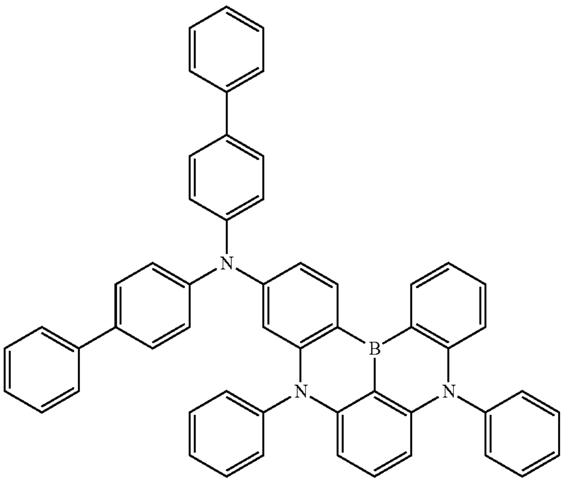
-continued
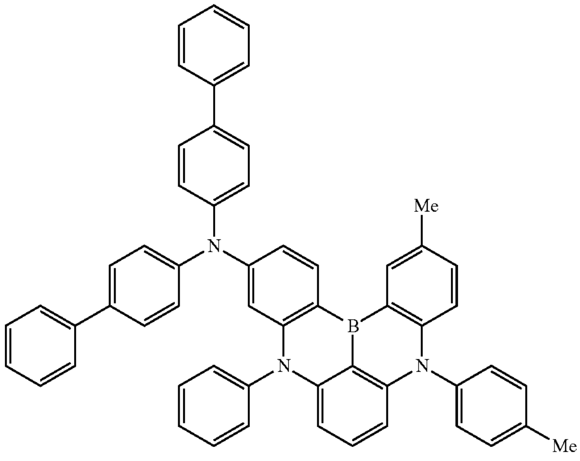
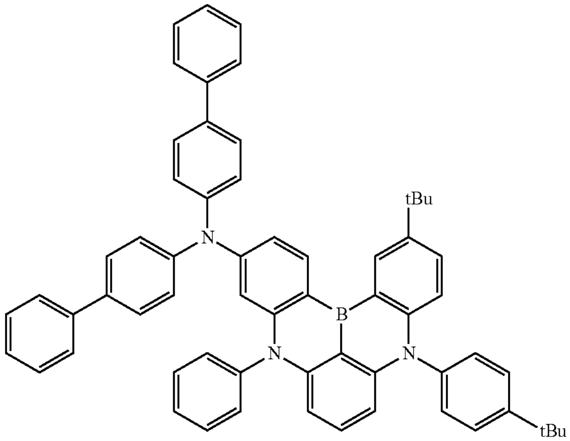
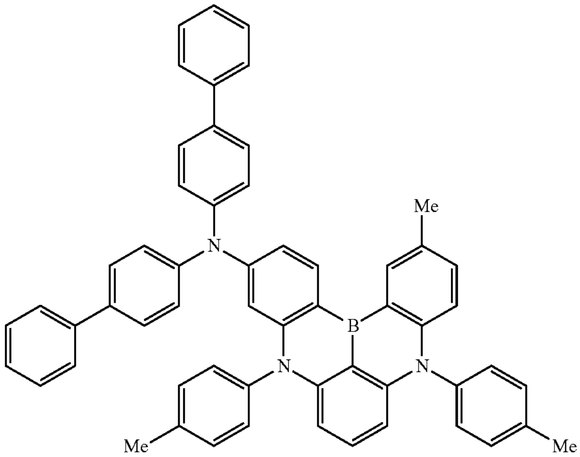
[Formula 333]
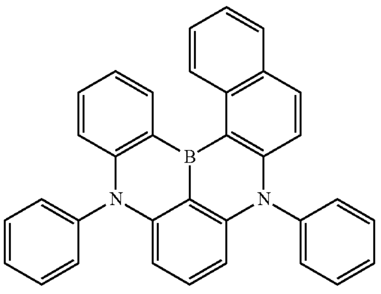

-continued
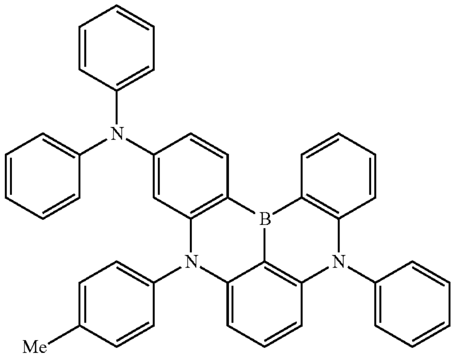
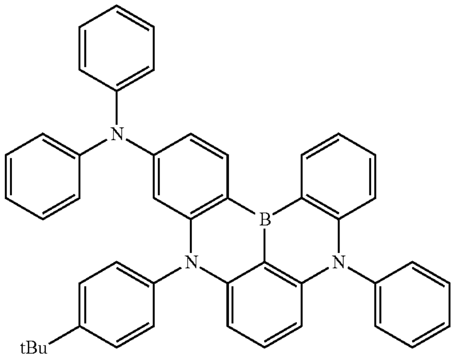
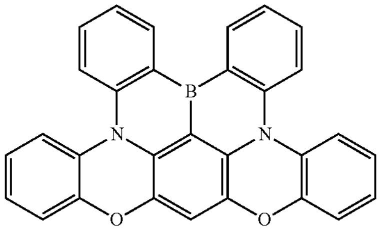
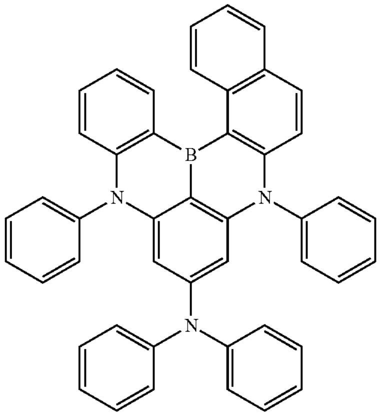
-continued
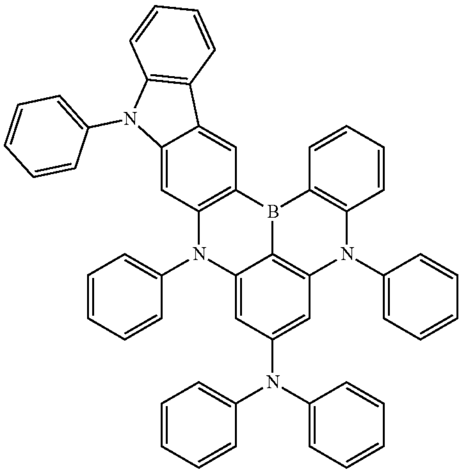
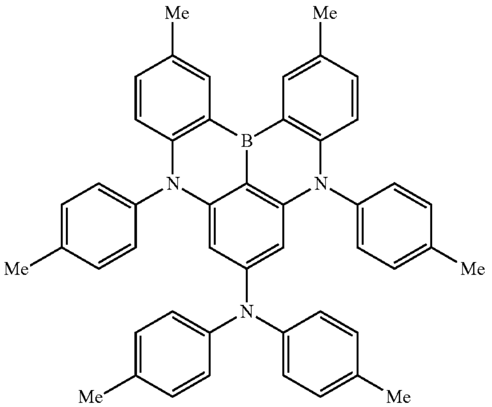
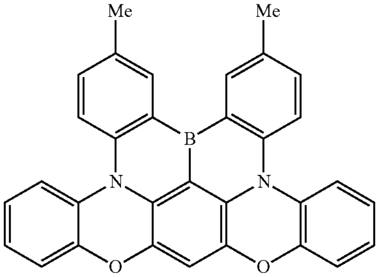
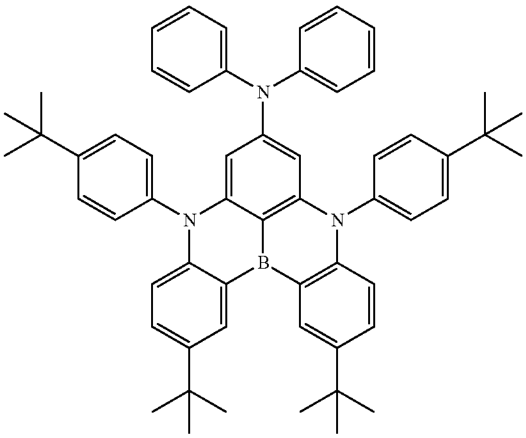

-continued
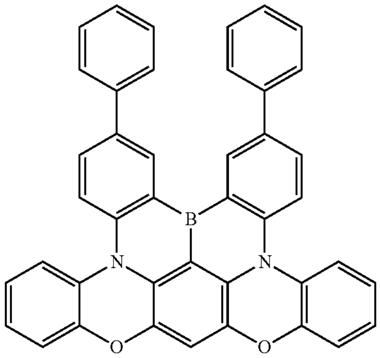
[Formula 334]
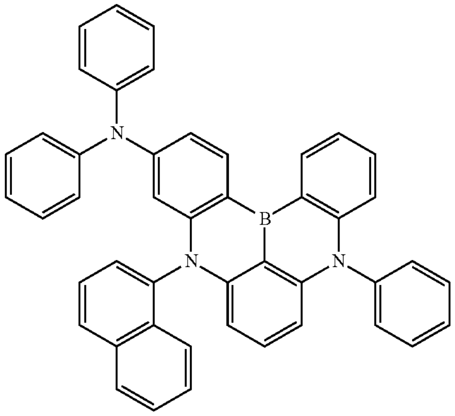
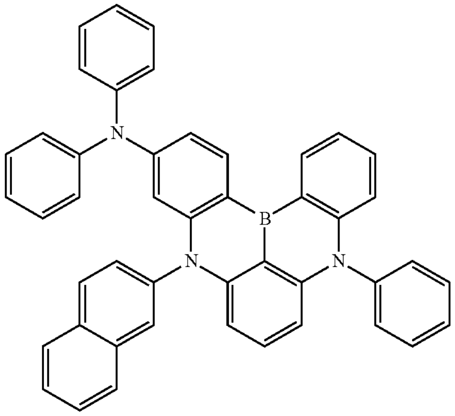
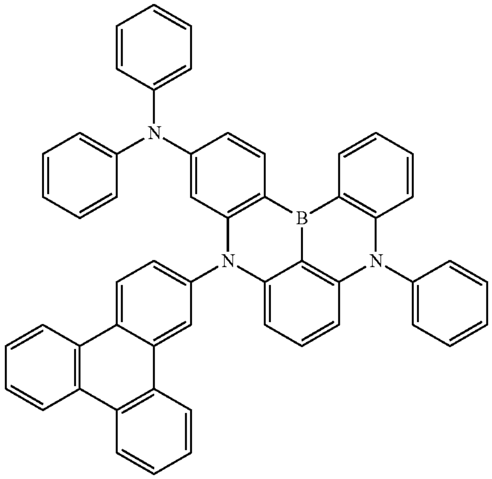
-continued
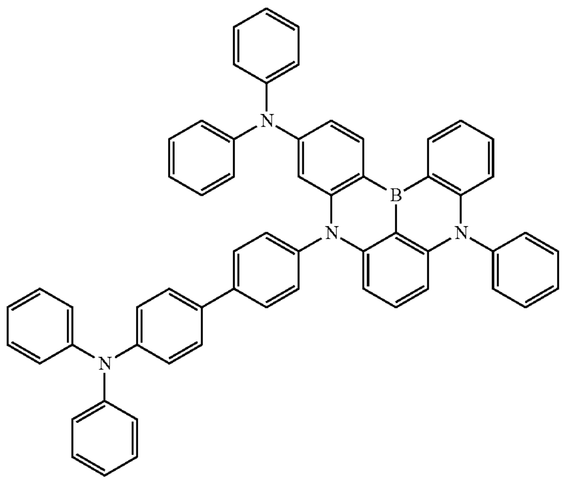
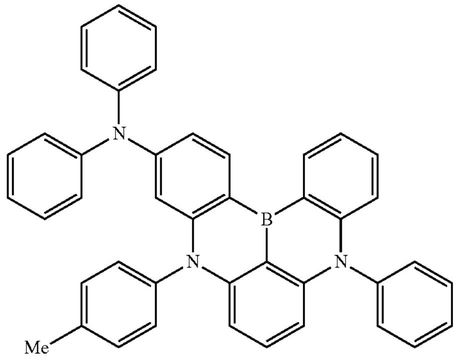
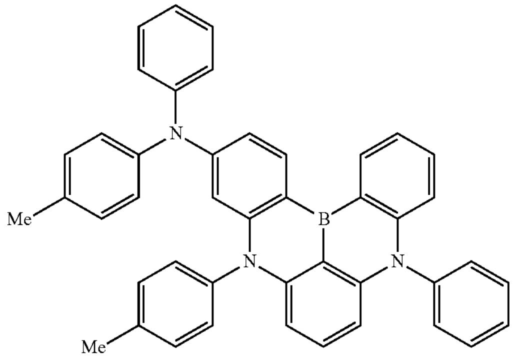
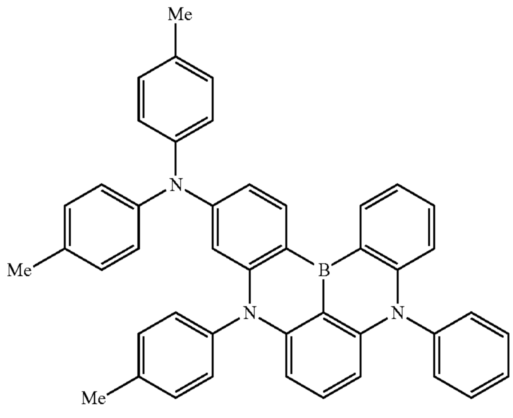

-continued
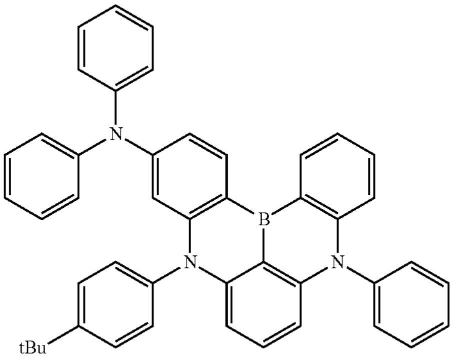
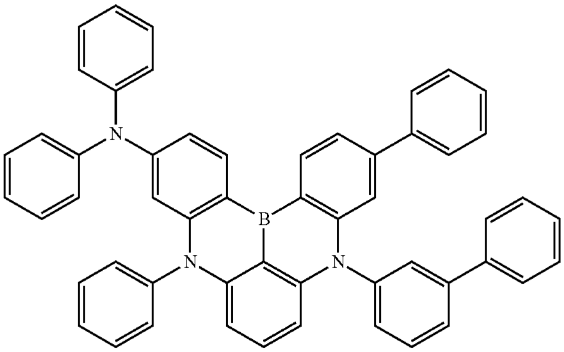
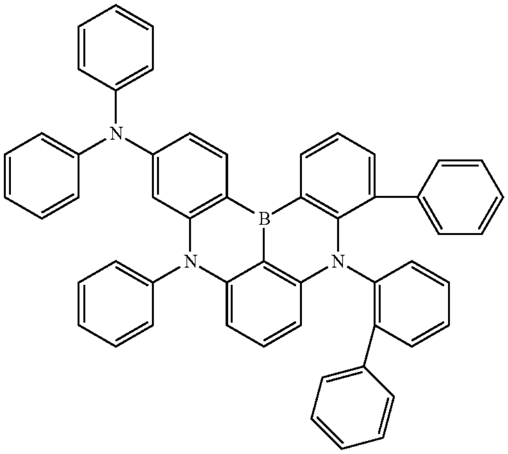
[Formula 335]
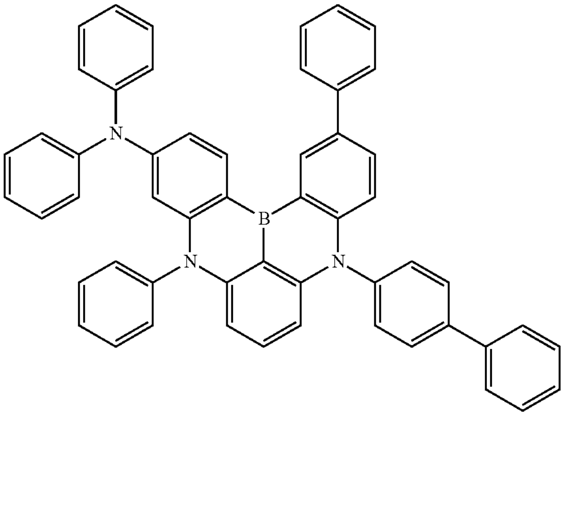
-continued
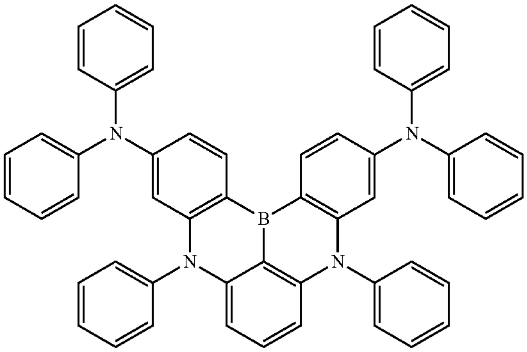
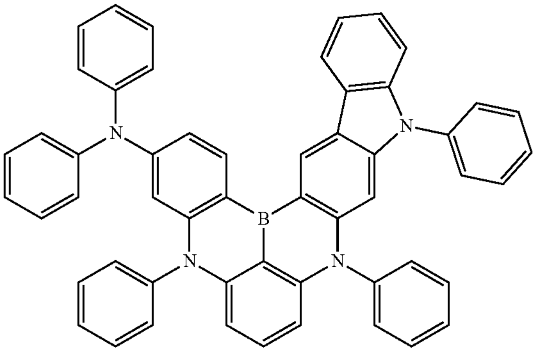
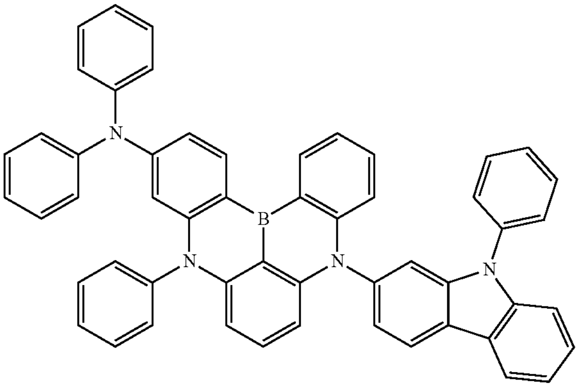
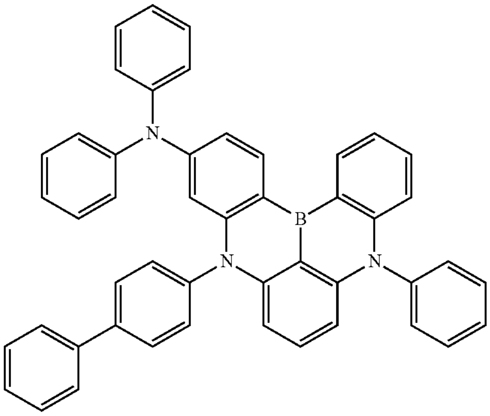

-continued
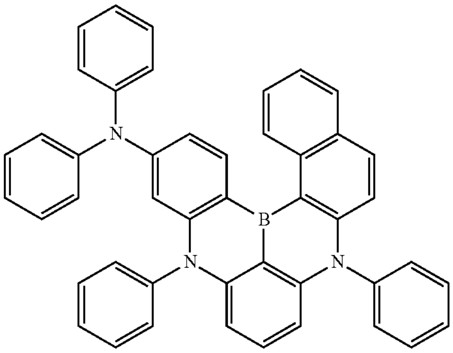
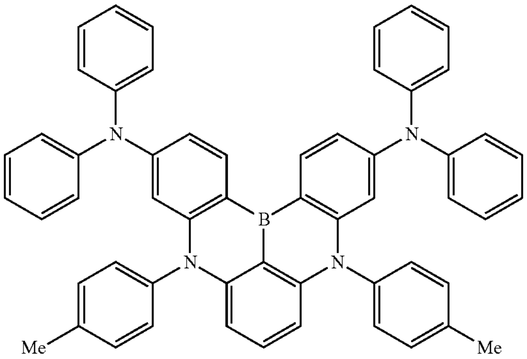
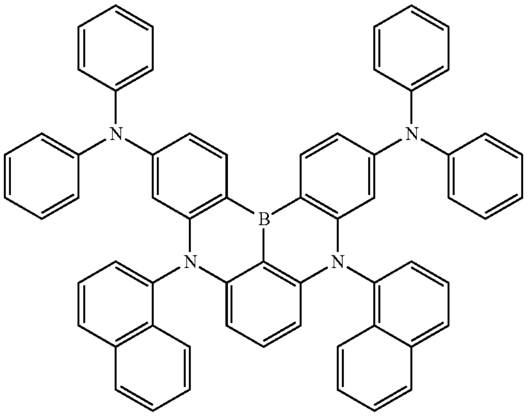
[Formula 336]
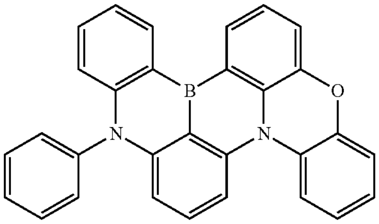
-continued
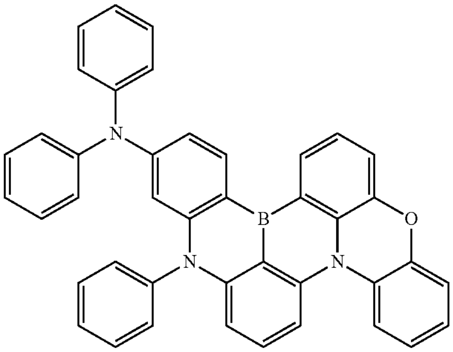
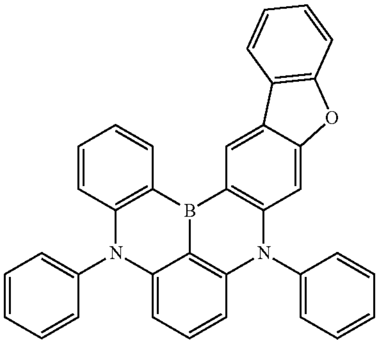
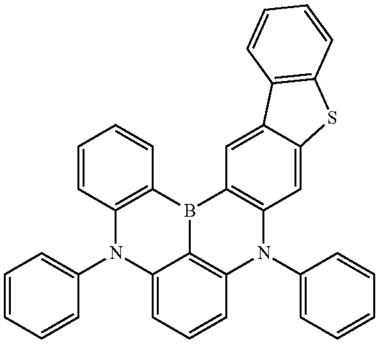
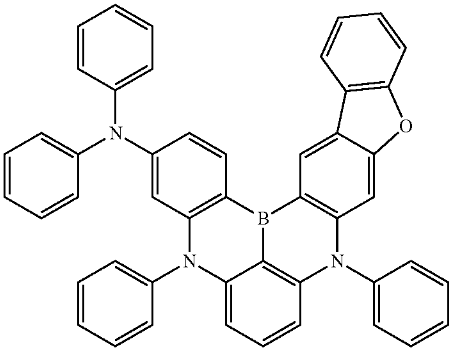
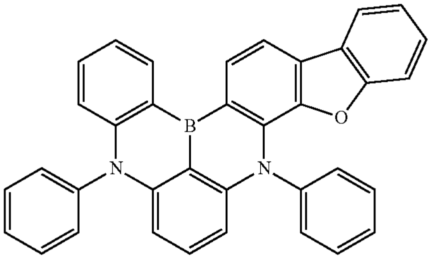

-continued

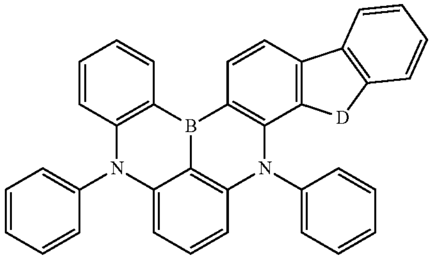

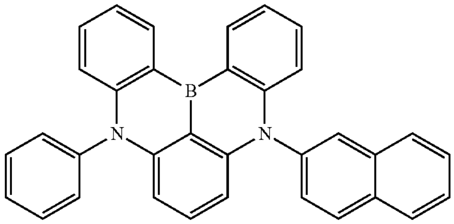

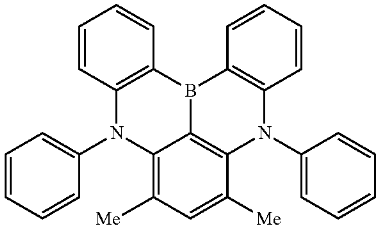

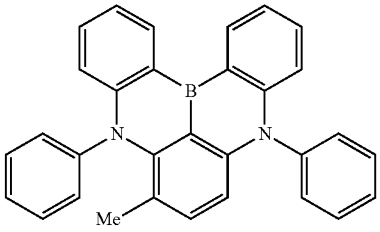

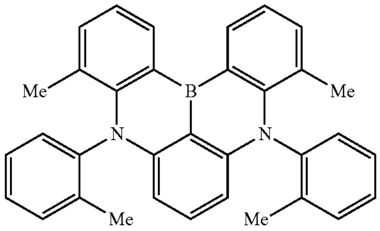

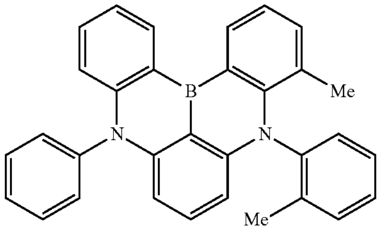

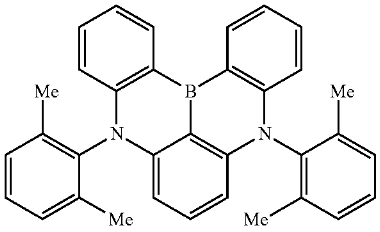

-continued

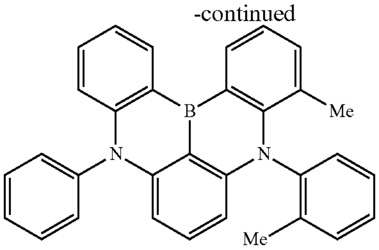

Compound Represented by Formula (7)

The compound represented by the formula (7) will be described below.

[Formula 337]

(7)

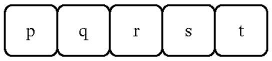

[Formula 338]

(72)

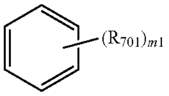

(73)

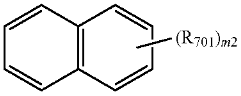

(74)

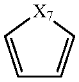

(75)

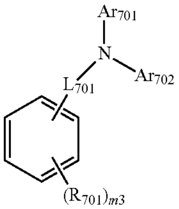

(76)

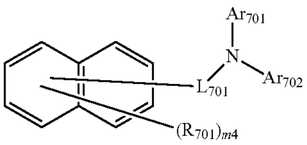

In the formula (7):

a ring r is a ring represented by the formula (72) or the formula (73), the ring r being fused with adjacent ring(s) at any position(s);

a ring q and a ring s are each independently a ring represented by the formula (74) and fused with adjacent ring(s) at any position(s);

a ring p and a ring t are each independently a structure represented by the formula (75) or the formula (76) and fused with adjacent ring(s) at any position(s);

$X_7$ is an oxygen atom, a sulfur atom, or $NR_{702}$;

when a plurality of $R_{701}$ are present, adjacent ones of the plurality of $R_{701}$ are mutually bonded to form a substituted or unsubstituted monocyclic ring, mutually bonded to form a substituted or unsubstituted fused ring, or not mutually bonded; and $R_{701}$ and $R_{702}$ forming neither the monocyclic ring nor the fused ring are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms;

$Ar_{701}$ and $Ar_{702}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

$L_{701}$ is a substituted or unsubstituted alkylene group having 1 to 50 carbon atoms, a substituted or unsubstituted alkenylene group having 2 to 50 carbon atoms, a substituted or unsubstituted alkynylene group having 2 to 50 carbon atoms, a substituted or unsubstituted cycloalkylene group having 3 to 50 ring carbon atoms, a substituted or unsubstituted arylene group having 6 to 50 ring carbon atoms, or a substituted or unsubstituted divalent heterocyclic group having 5 to 50 ring atoms;

m1 is 0, 1, or 2;

m2 is 0, 1, 2, 3, or 4;

m3 is each independently 0, 1, 2, or 3;

m4 is each independently 0, 1, 2, 3, 4, or 5;

when a plurality of $R_{701}$ are present, the plurality of $R_{701}$ are mutually the same or different;

when a plurality of $X_7$ are present, the plurality of $X_7$ are mutually the same or different;

when a plurality of $R_{702}$ are present, the plurality of $R_{702}$ are mutually the same or different;

when a plurality of $Ar_{701}$ are present, the plurality of $Ar_{701}$ are mutually the same or different;

when a plurality of $Ar_{702}$ are present, the plurality of $Ar_{702}$ are mutually the same or different; and when a plurality of $L_{701}$ are present, the plurality of $L_{701}$ are mutually the same or different.

In the formula (7), each of the ring p, ring q, ring r, ring s, and ring t is fused with an adjacent ring(s) sharing two carbon atoms.

The fused position and orientation are not limited but may be defined as required.

In an exemplary embodiment, in the formula (72) or the formula (73) representing the ring r, m1=0 or m2=0 is satisfied.

In an exemplary embodiment, the compound represented by the formula (7) is represented by any one of formulae (71-1) to (71-6) below.

[Formula 339]

(71-1)

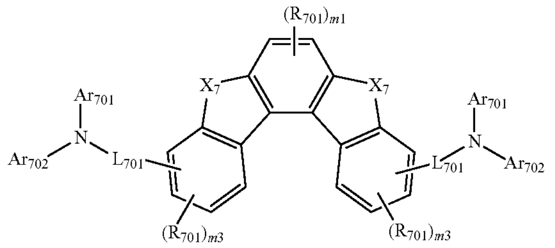

[Formula 340]

(71-2)

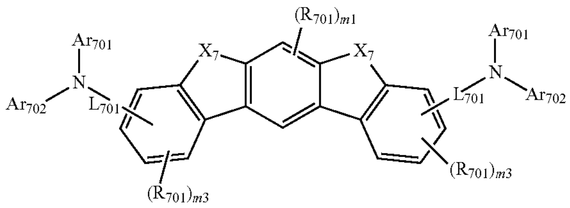

[Formula 341]

(71-3)

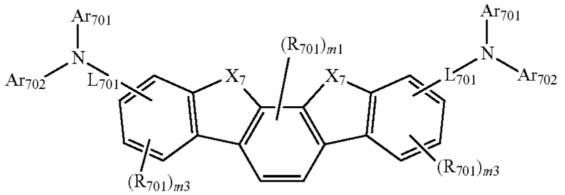

[Formula 342]

(71-4)

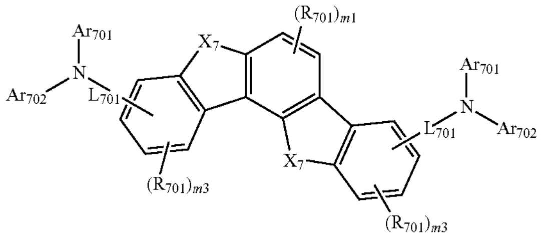

[Formula 343]

(71-5)

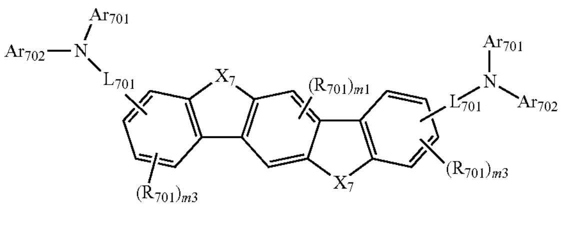

-continued

[Formula 344]

(71-6)

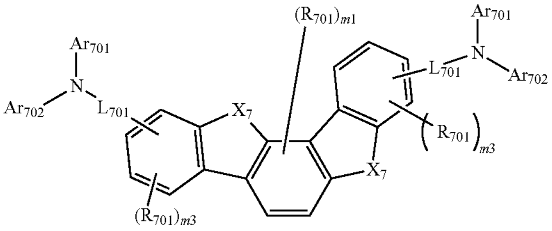

In the formulae (71-1) to (71-6), $R_{701}$, $X_7$, $Ar_{701}$, $Ar_{702}$, $L_{701}$, m1 and m3 respectively represent the same as $R_{701}$, $X_7$, $Ar_{701}$, $Ar_{702}$, $L_{701}$, m1 and m3 in the formula (7).

In an exemplary embodiment, the compound represented by the formula (7) is represented by any one of formulae (71-11) to (71-13) below.

[Formula 345]

(71-11)

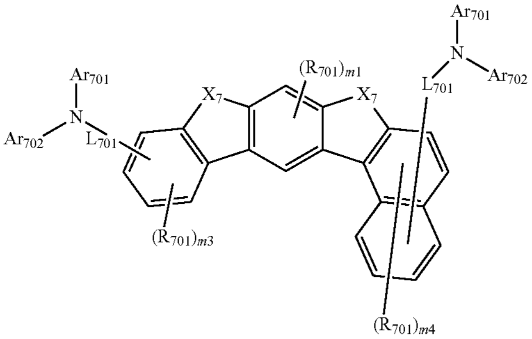

-continued

[Formula 346]

(71-12)

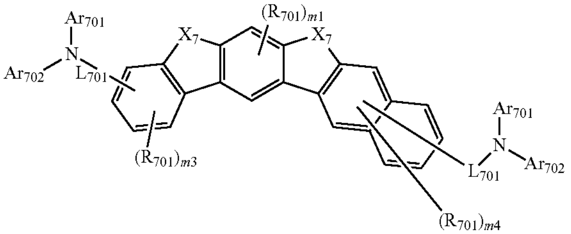

[Formula 347]

(71-13)

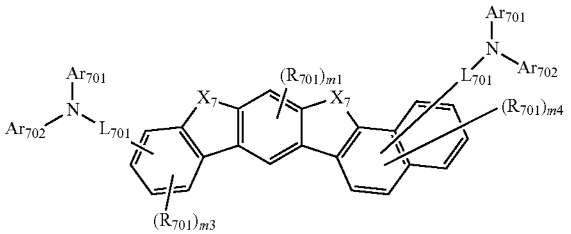

In the formulae (71-11) to (71-13), $R_{701}$, $X_7$, $Ar_{701}$, $Ar_{702}$, $L_{701}$, m1, m3 and m4 respectively represent the same as $R_{701}$, $X_7$, $Ar_{701}$, $Ar_{702}$, $L_{701}$, m1, m3 and m4 in the formula (7).

In an exemplary embodiment, the compound represented by the formula (7) is represented by any one of formulae (71-21) to (71-25) below.

[Formula 348]

(71-21)

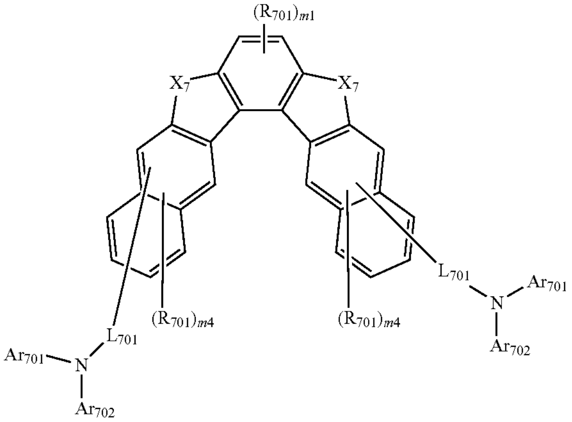

-continued
[Formula 349]
(71-22)
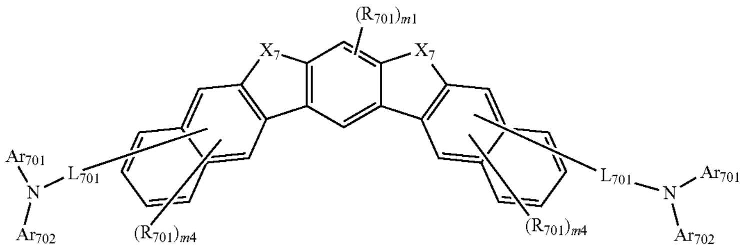
[Formula 350]
(71-23)
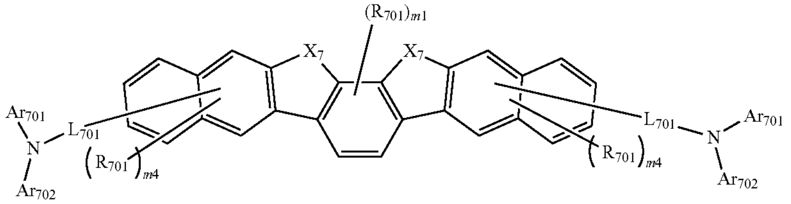
[Formula 351]
(71-24)
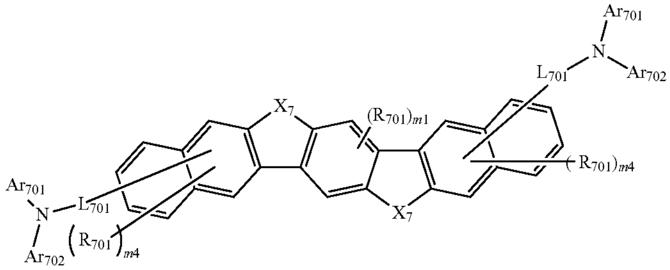
[Formula 352]
(71-25)
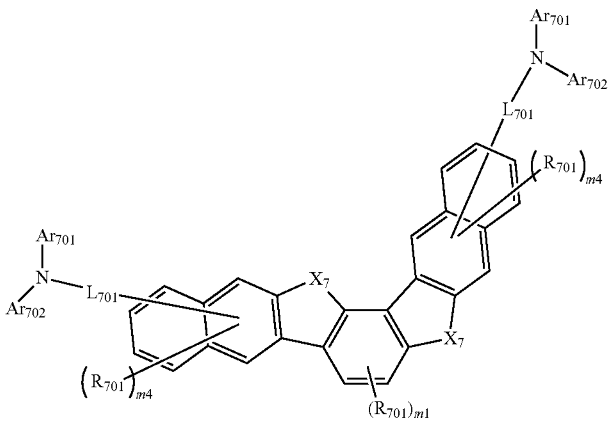
In the formulae (71-21) to (71-25), $R_{701}$, $X_7$, $Ar_{701}$, $Ar_{702}$, $L_{701}$, m1 and m4 respectively represent the same as $R_{701}$, $X_7$, $Ar_{701}$, $Ar_{702}$, $L_{701}$, m1 and m4 in the formula (7).
In an exemplary embodiment, the compound represented by the formula (7) is represented by any one of formulae (71-31) to (71-33) below.

[Formula 353]

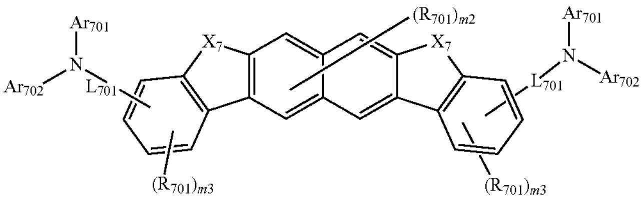

(71-31)

[Formula 354]

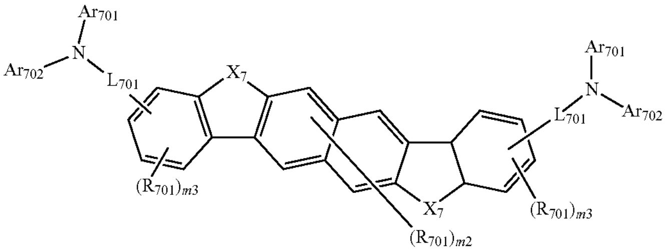

(71-32)

[Formula 355]

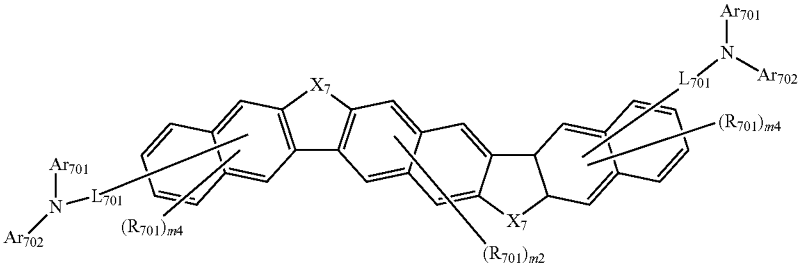

(71-33)

In the formulae (71-31) to (71-33), $R_{701}$, $X_7$, $Ar_{701}$, $Ar_{702}$, $L_{701}$, and m2 to m4 respectively represent the same as $R_{701}$, $X_7$, $Ar_{701}$, $Ar_{702}$, $L_{701}$, and m2 to m4 in the formula (7).

In an exemplary embodiment, $Ar_{701}$ and $Ar_{702}$ are each independently a substituted or unsubstituted aryl group having 6 to 50 ring carbon atoms.

In an exemplary embodiment, one of $Ar_{701}$ and $Ar_{702}$ is a substituted or unsubstituted aryl group having 6 to 50 ring carbon atoms, and the other of $Ar_{701}$ and $Ar_{702}$ is a substituted or unsubstituted heterocyclic group having 5 to 50 ring atoms.

Specific Examples of Compound Represented by Formula (7)

Specific examples of the compound represented by the formula (7) include compounds shown below.

[Formula 356]

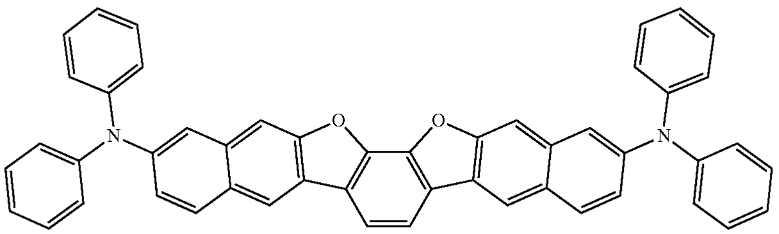

-continued
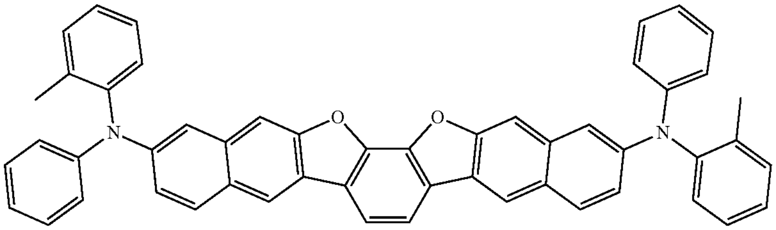
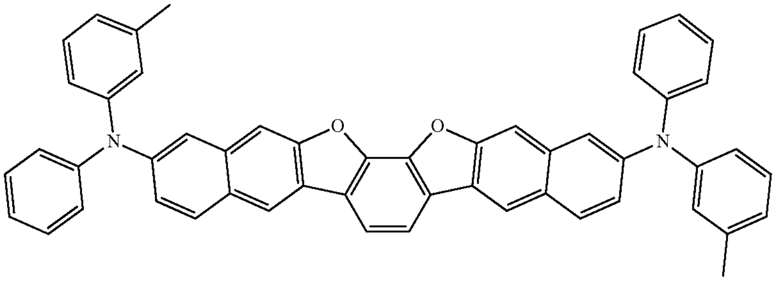
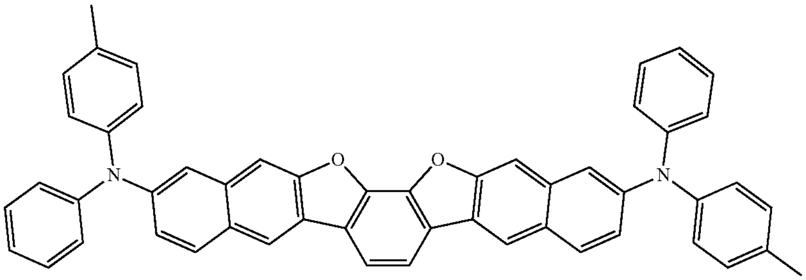
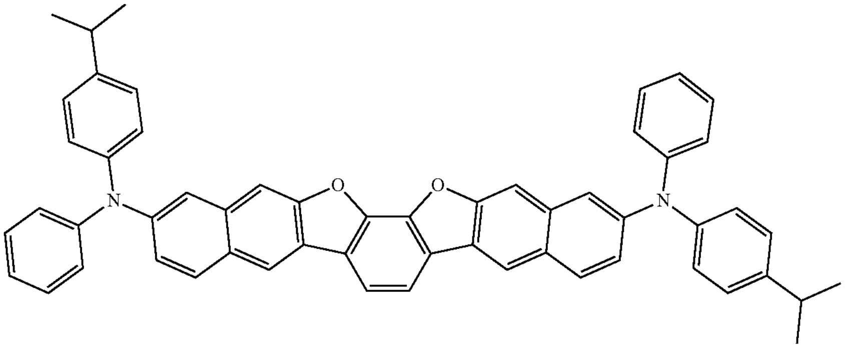
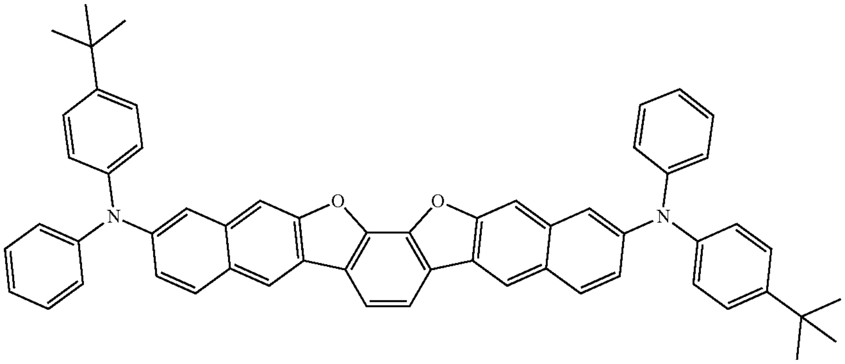

-continued
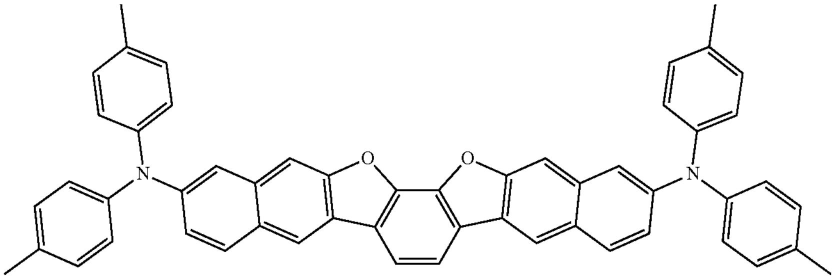
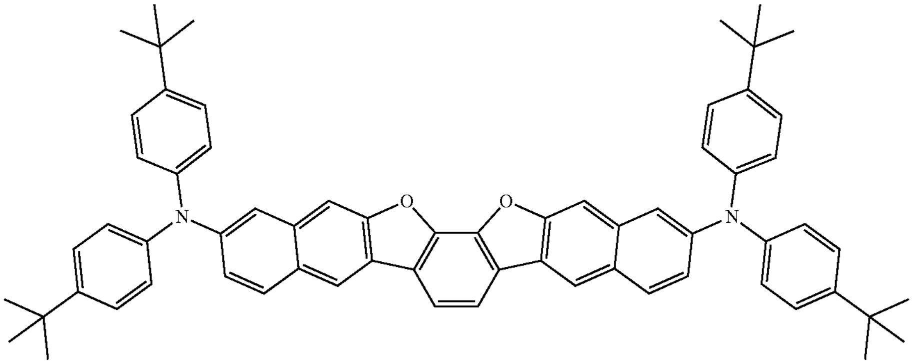
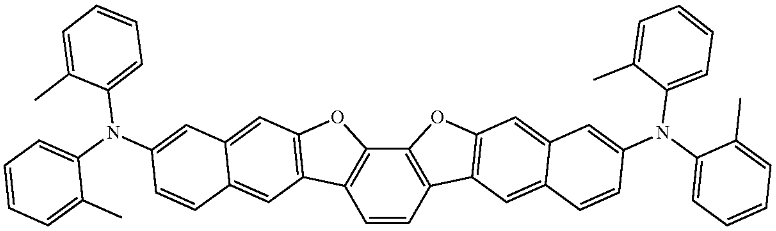
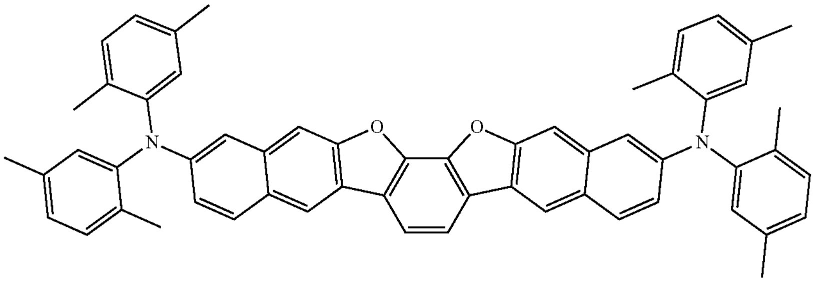
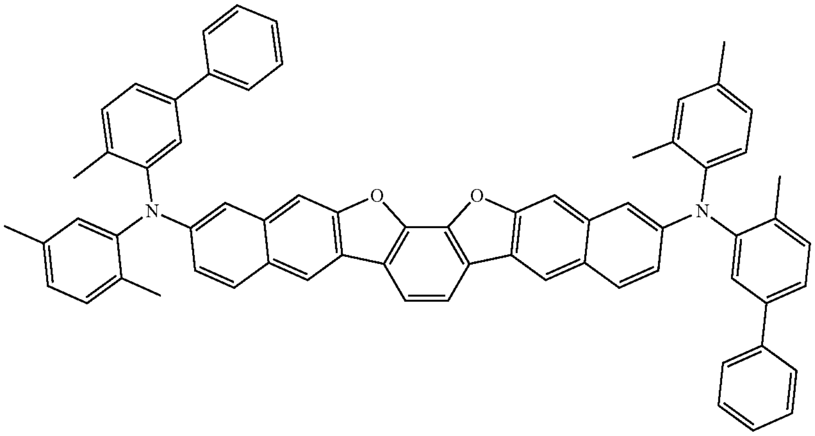

-continued
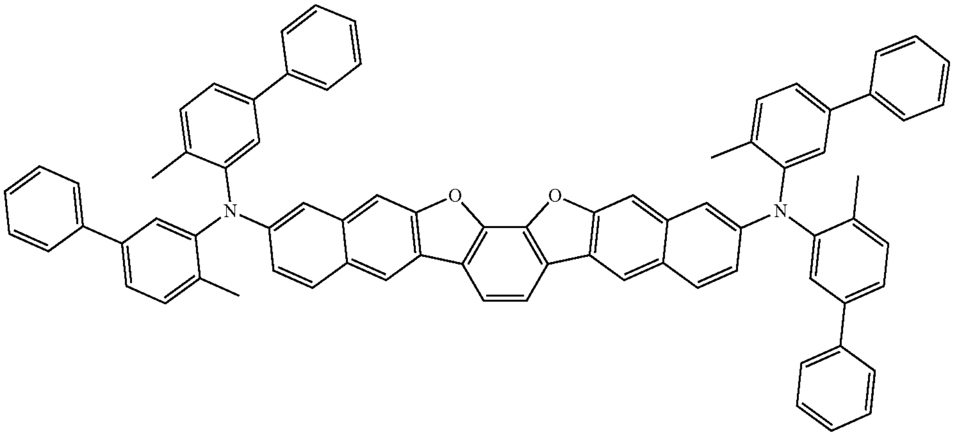
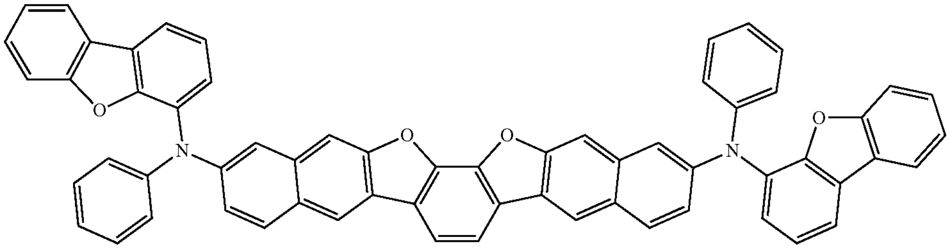
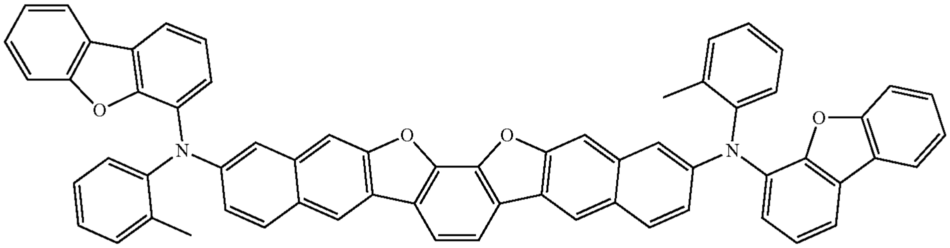
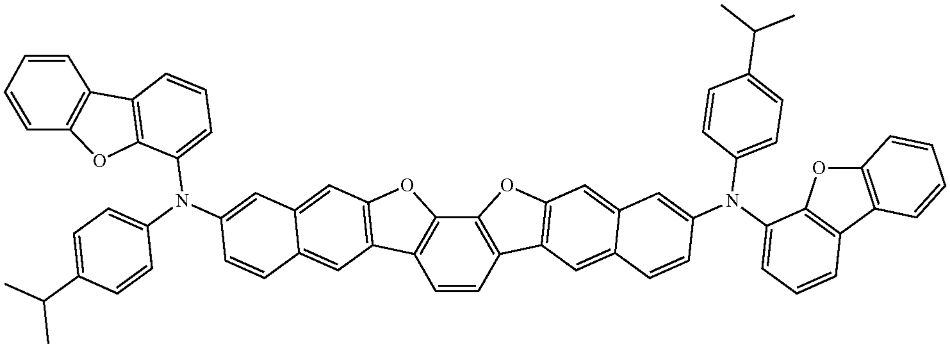
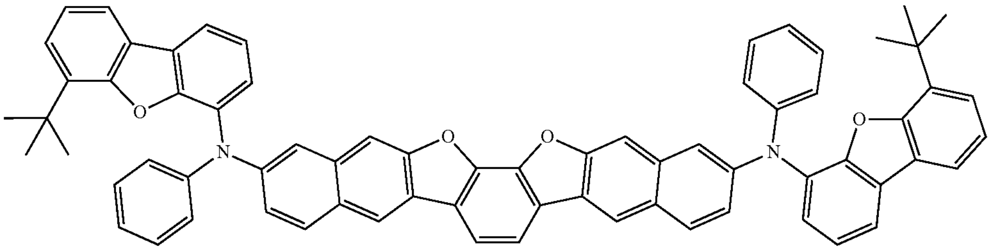

-continued
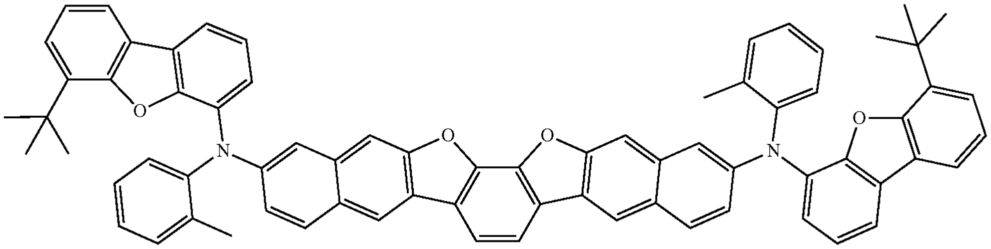
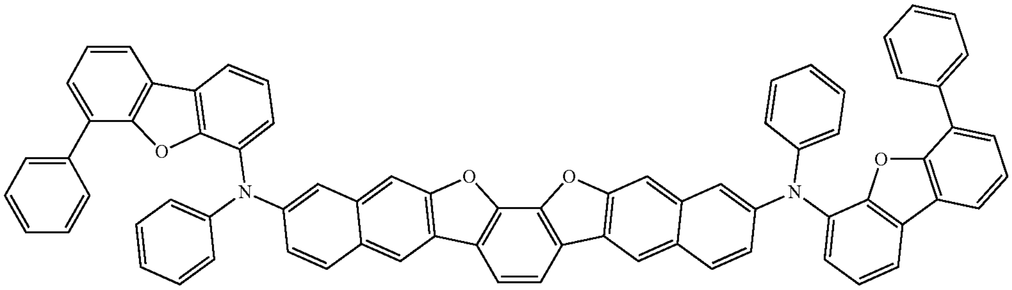
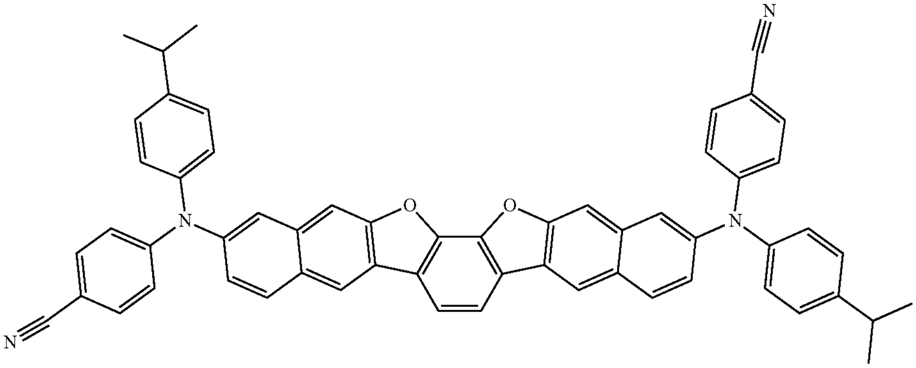
[Formula 357]
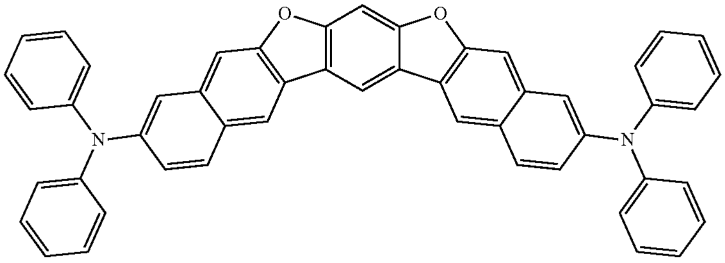
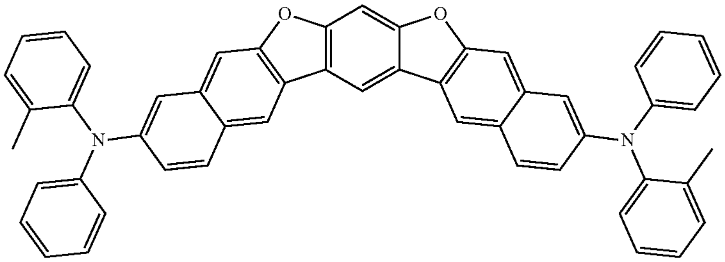

-continued
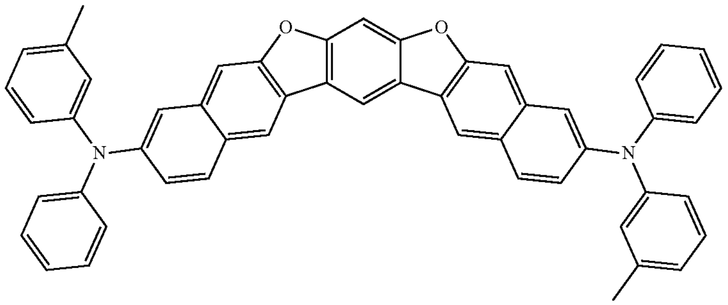
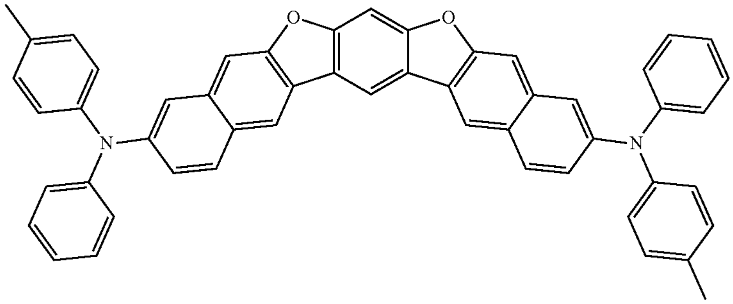
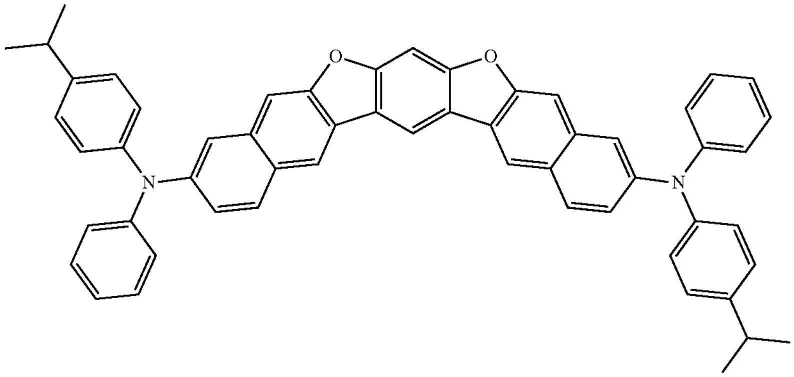
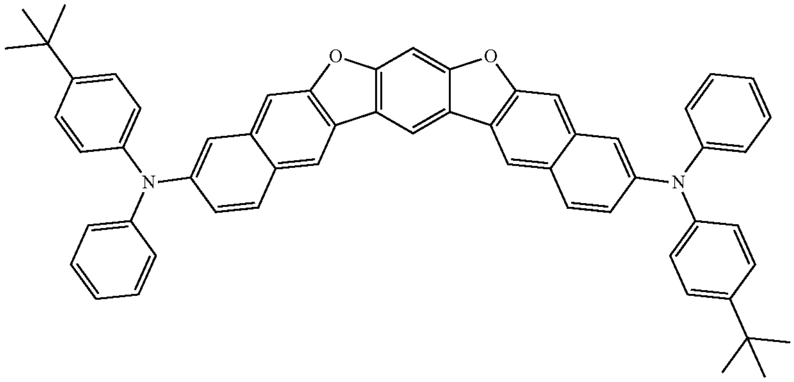
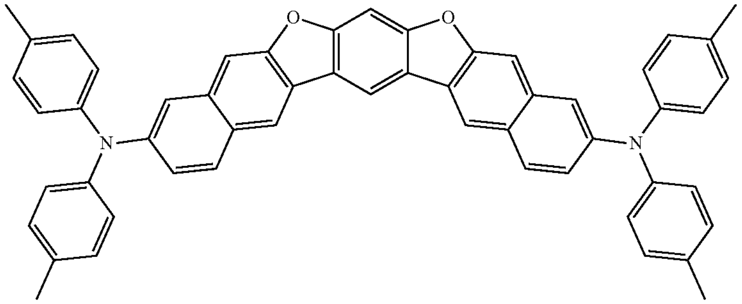

-continued
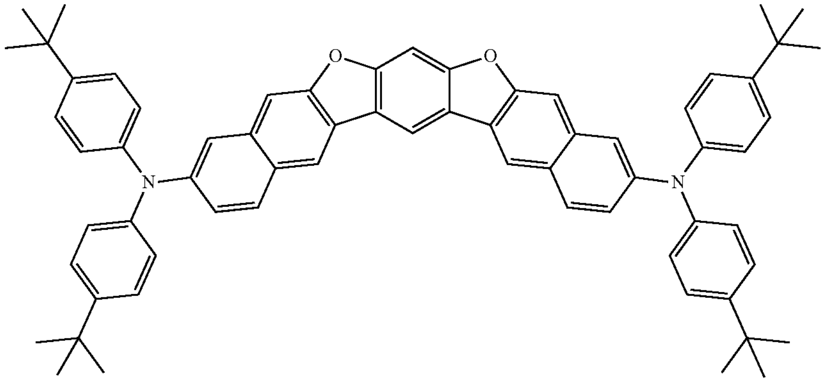
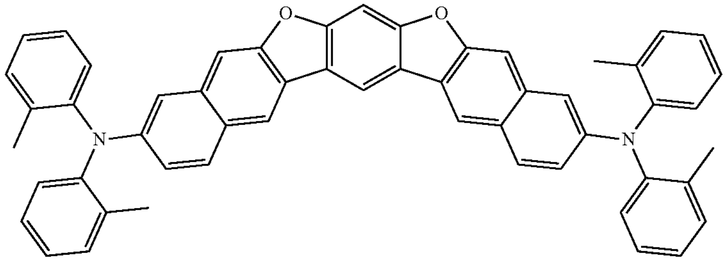
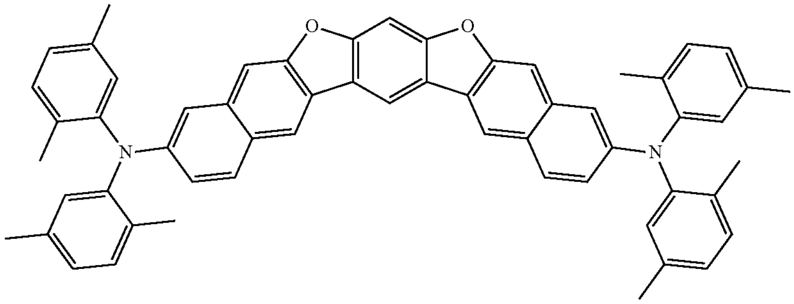
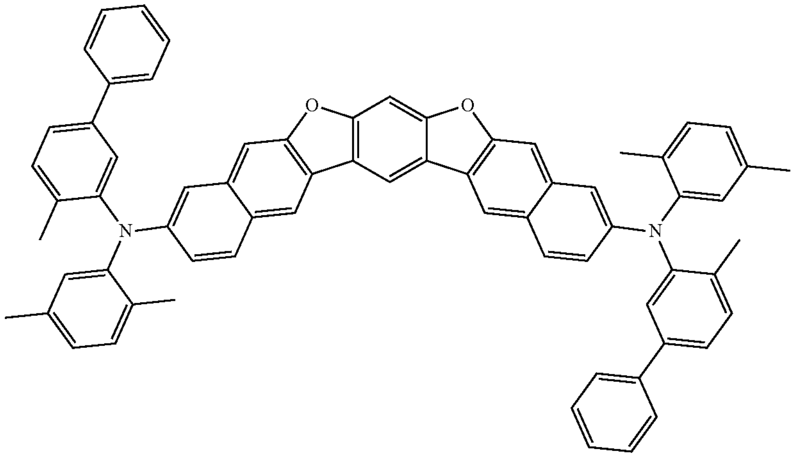

-continued
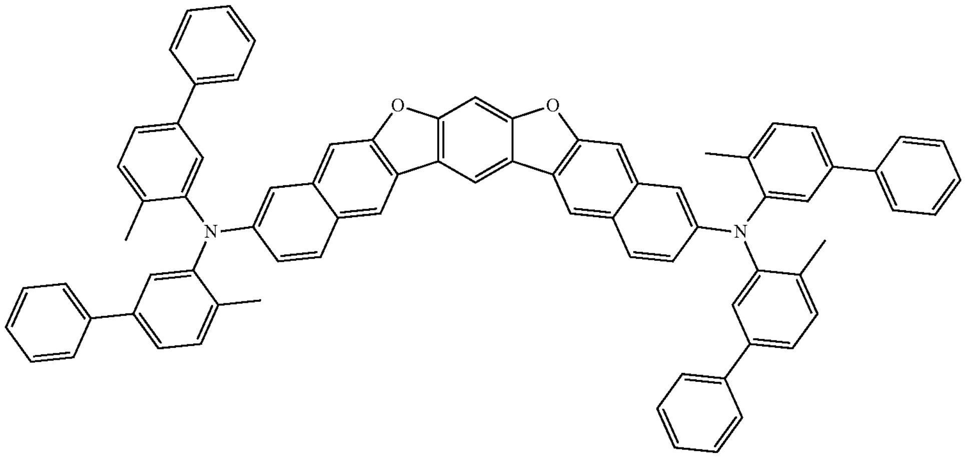
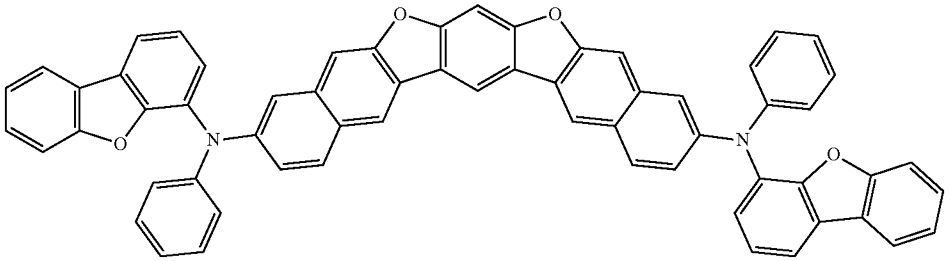
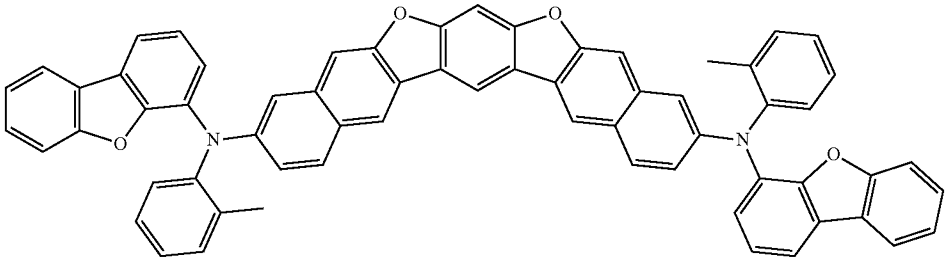
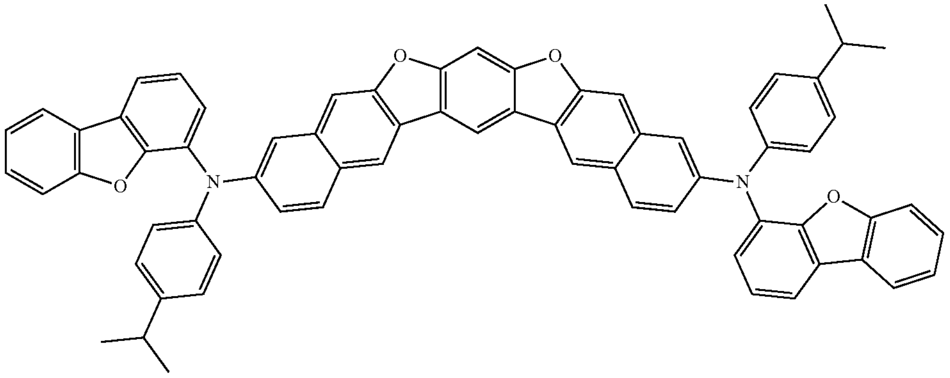
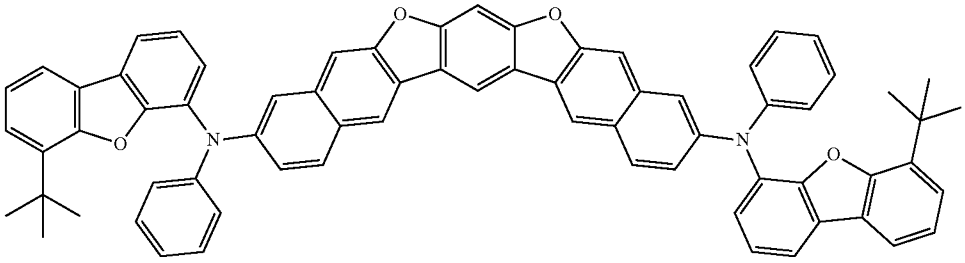

-continued
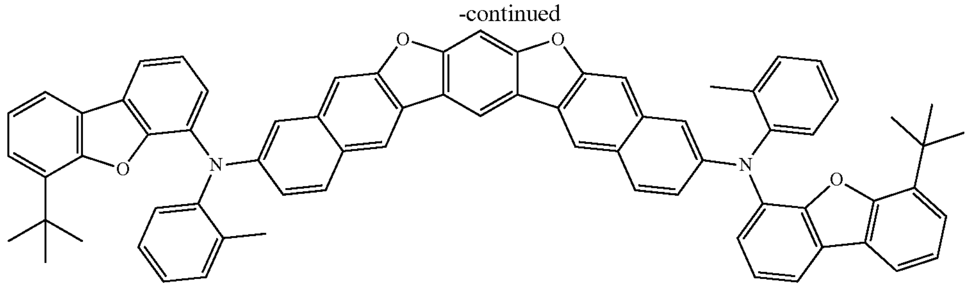
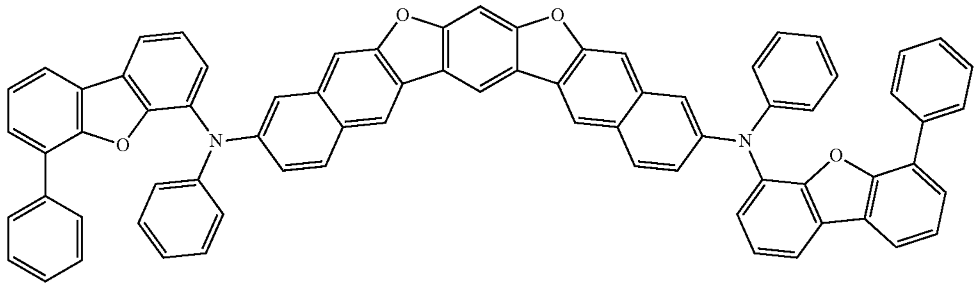
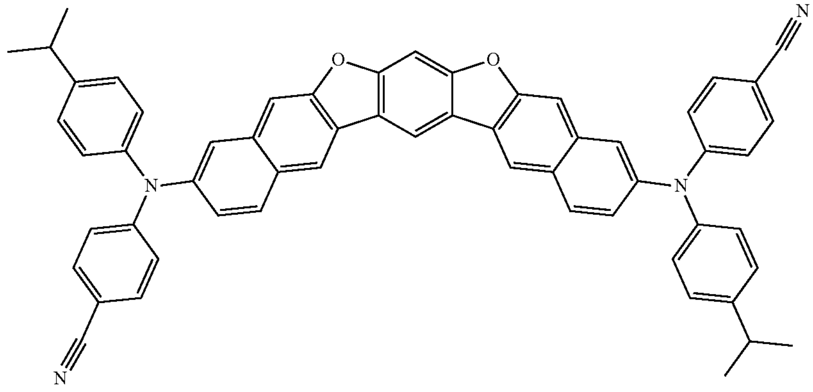
[Formula 358]
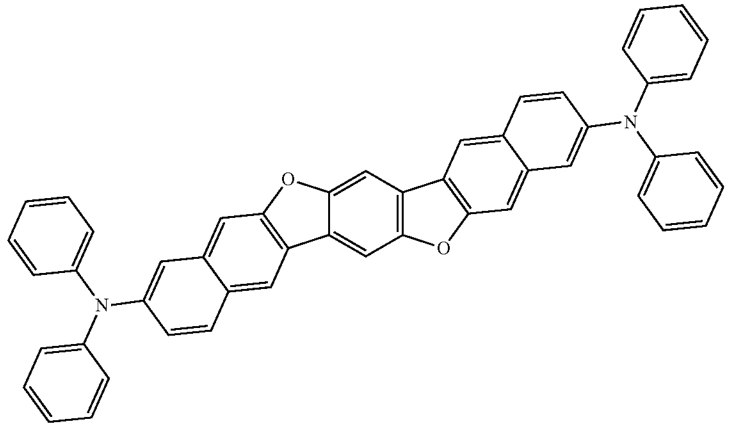

-continued
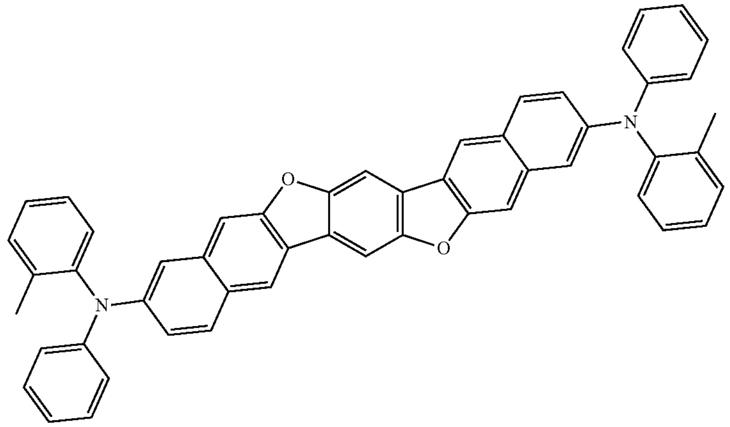
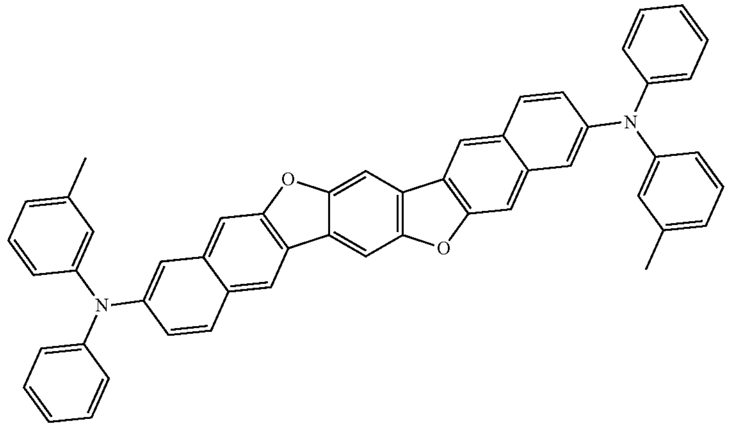
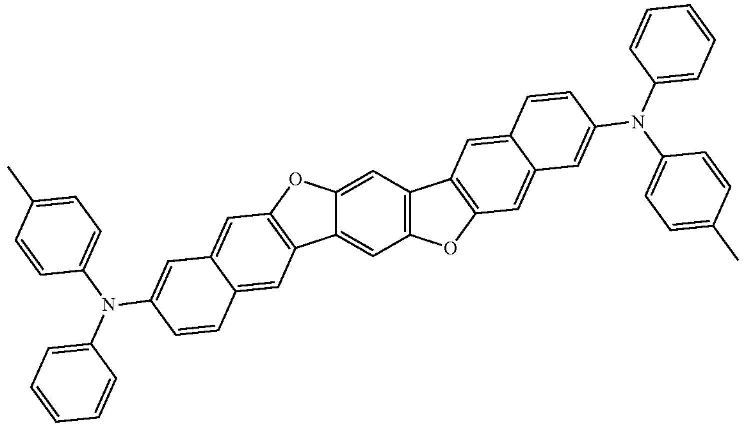
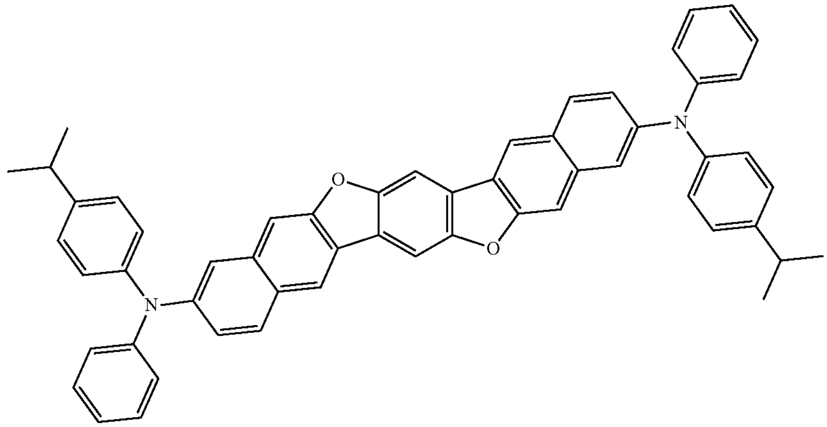

-continued
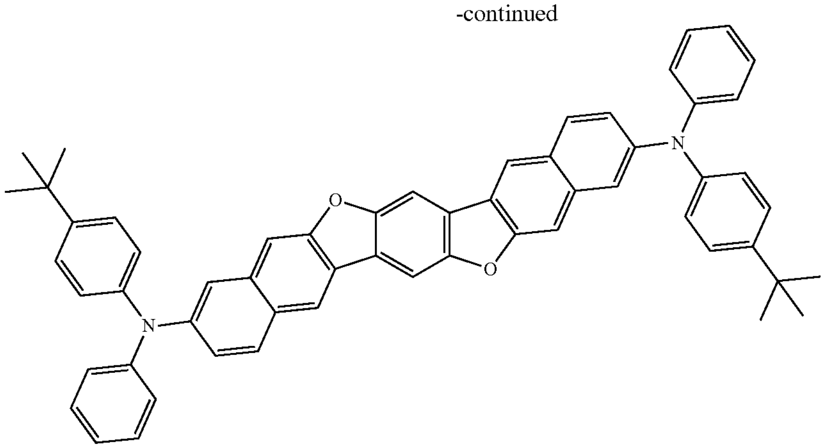
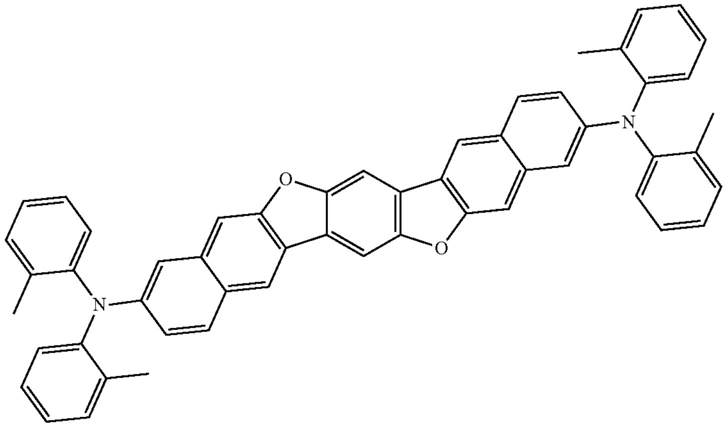
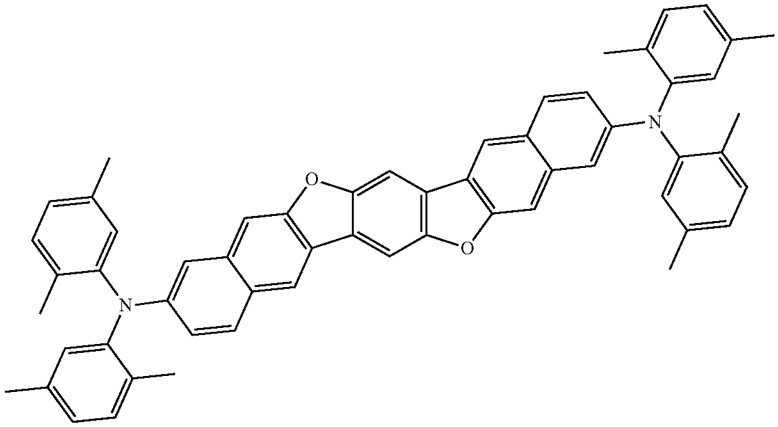
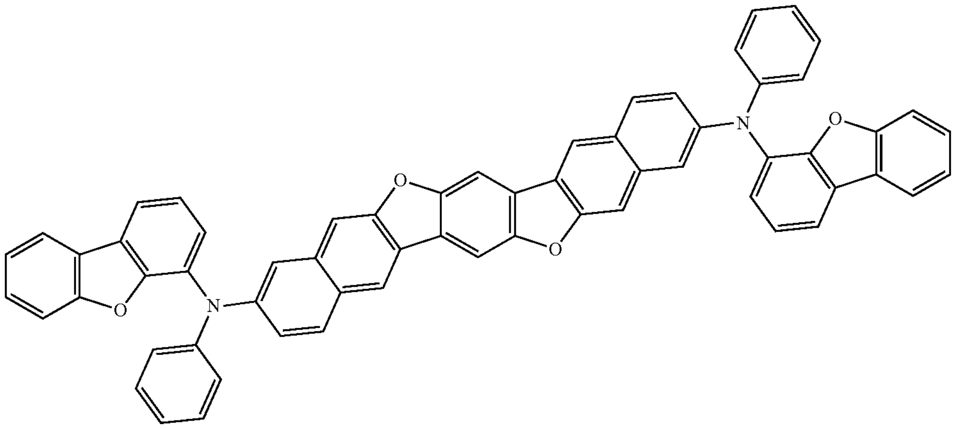

-continued
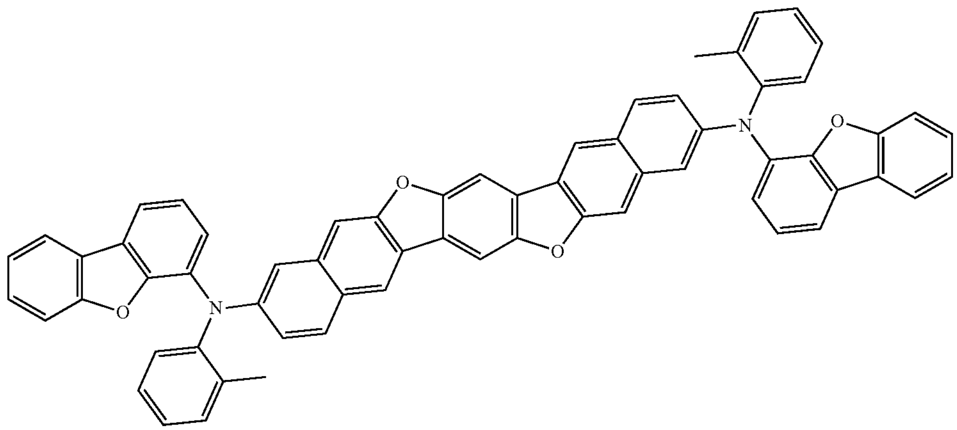
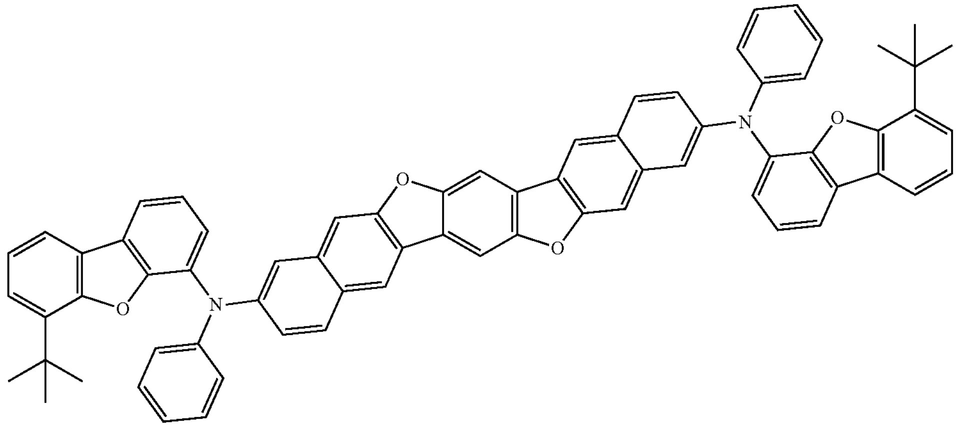
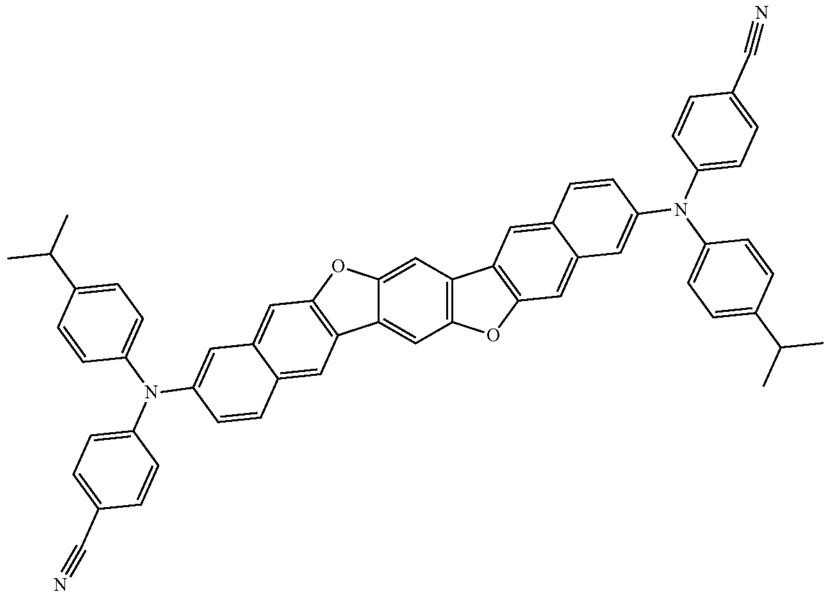

-continued
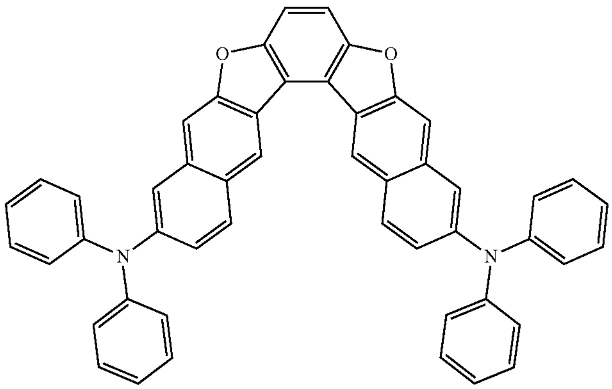
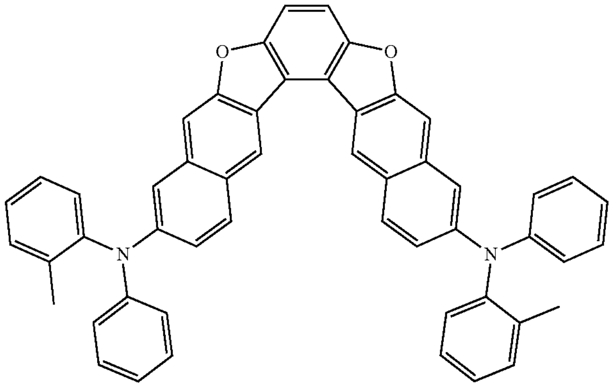
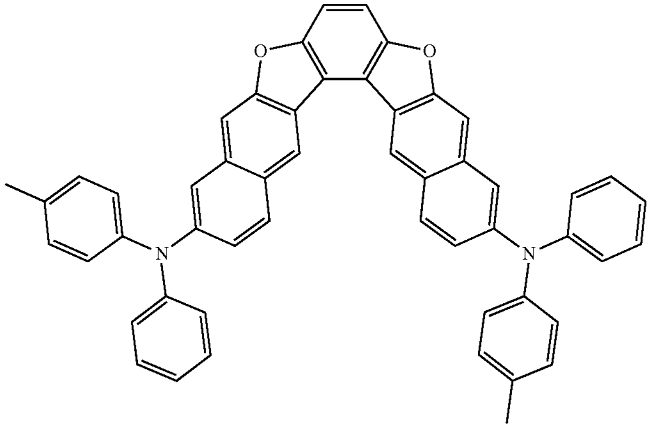
[Formula 359]
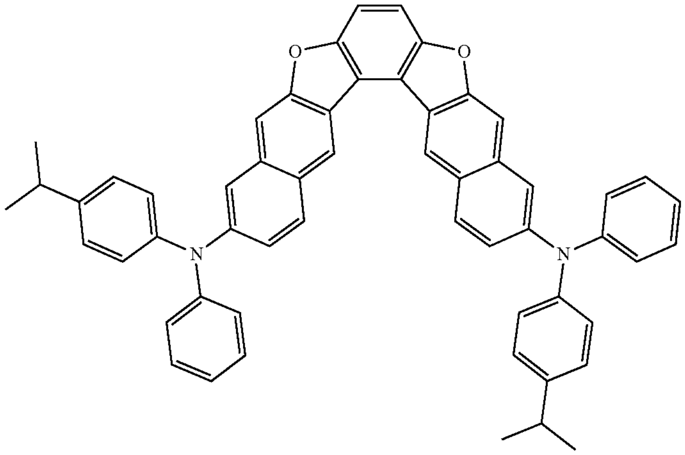

-continued
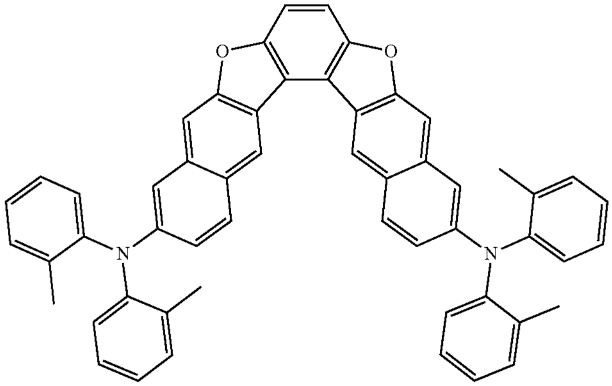
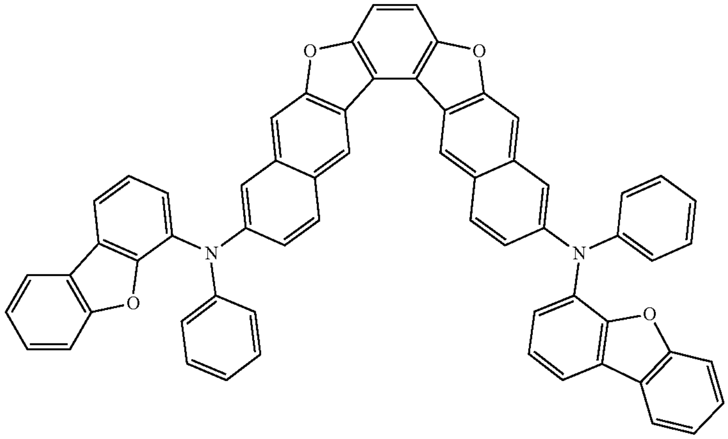
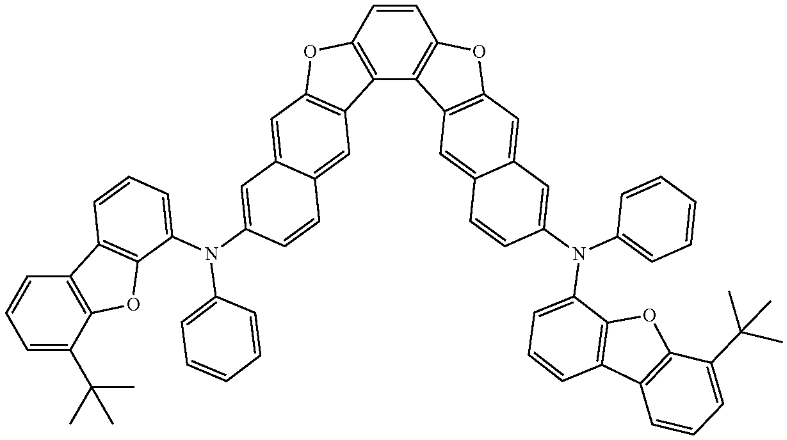
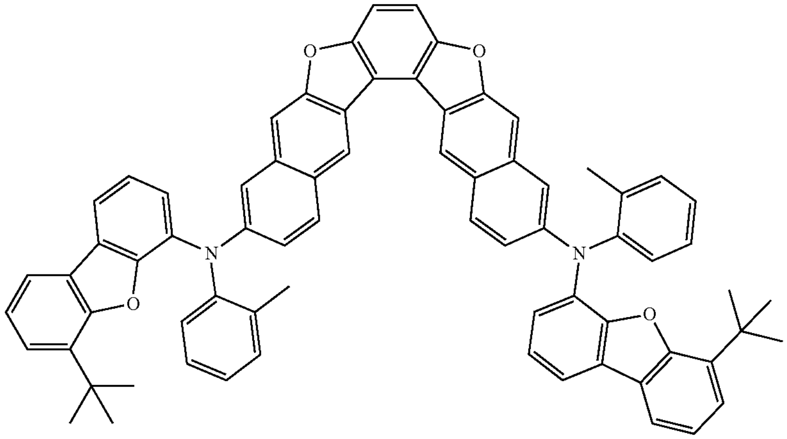

-continued
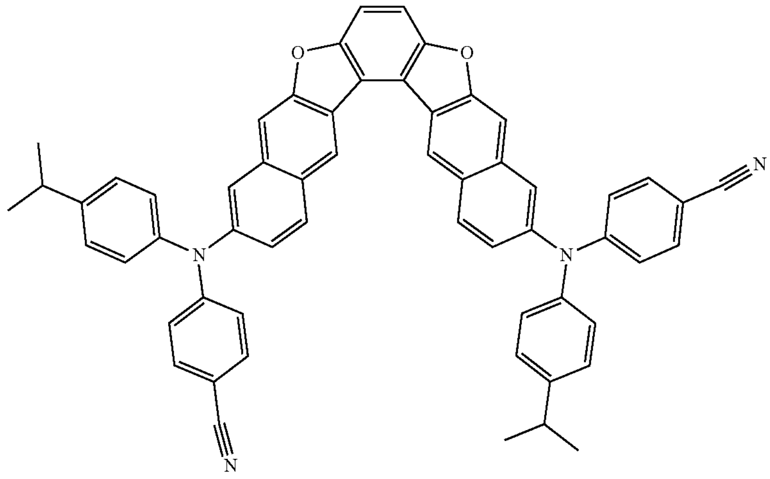
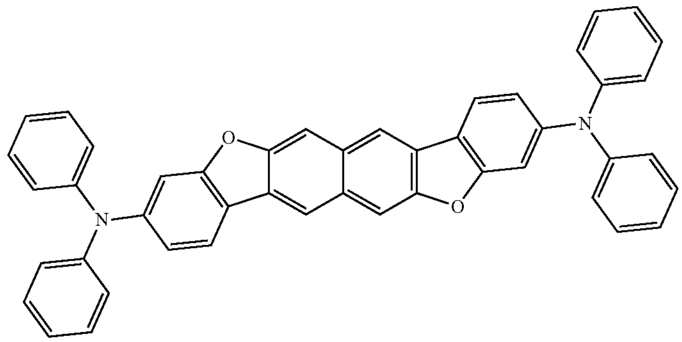
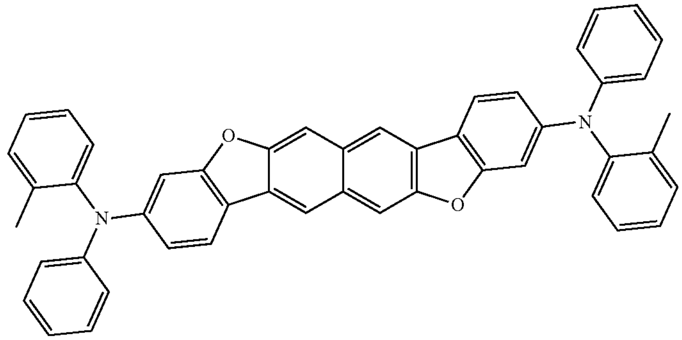
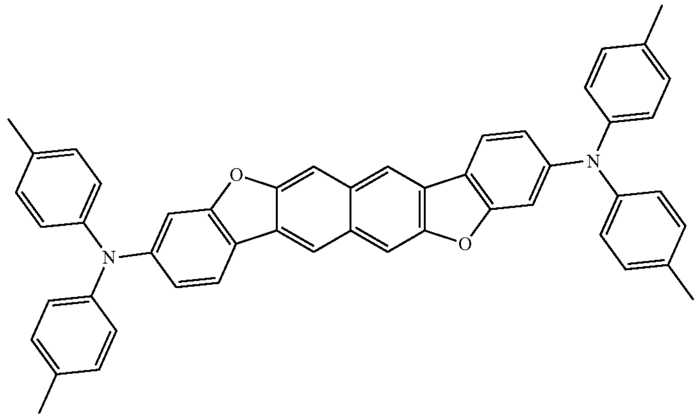

-continued
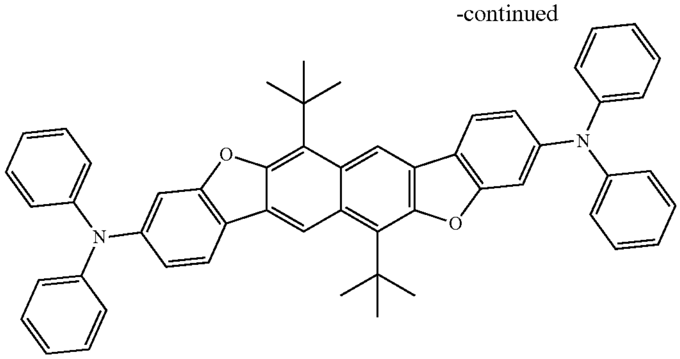
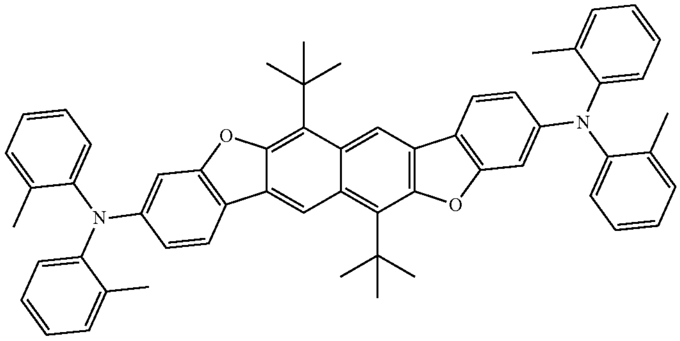
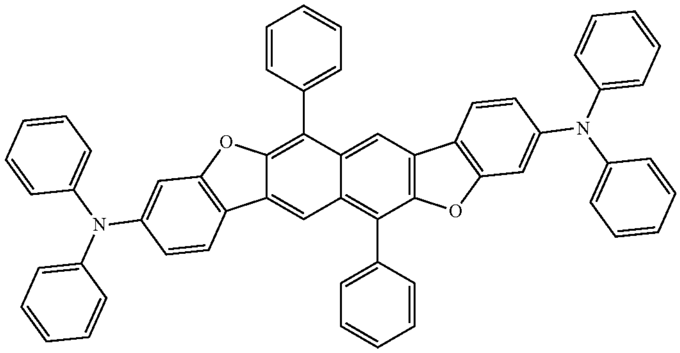
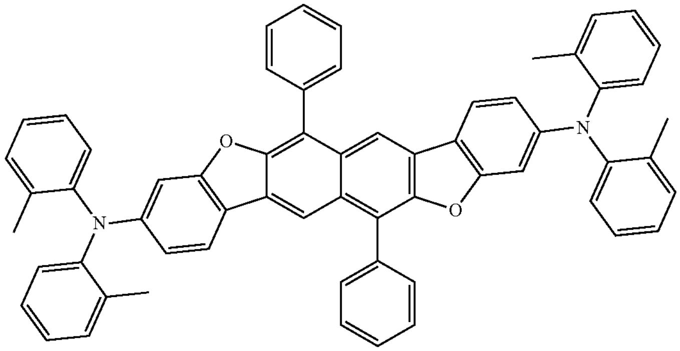
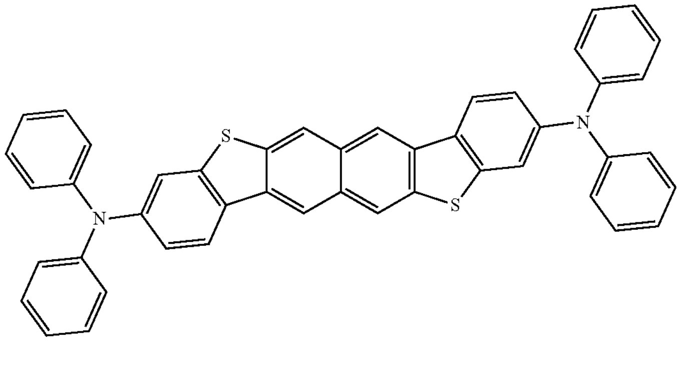

-continued
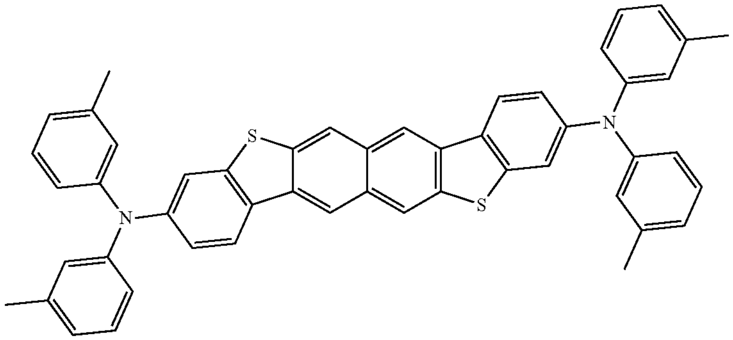
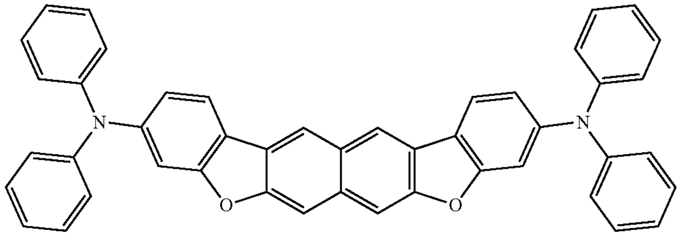
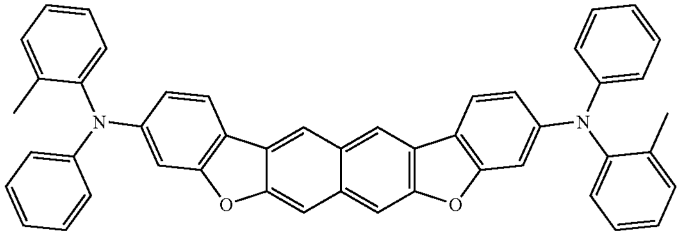
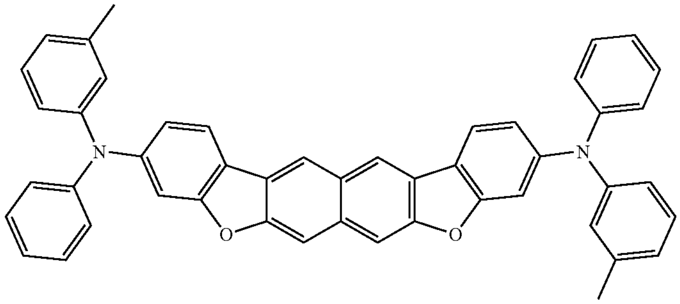
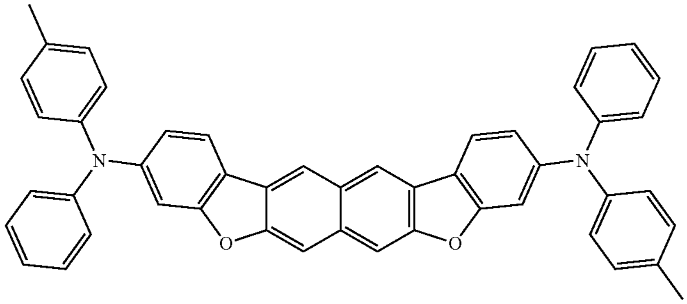

-continued
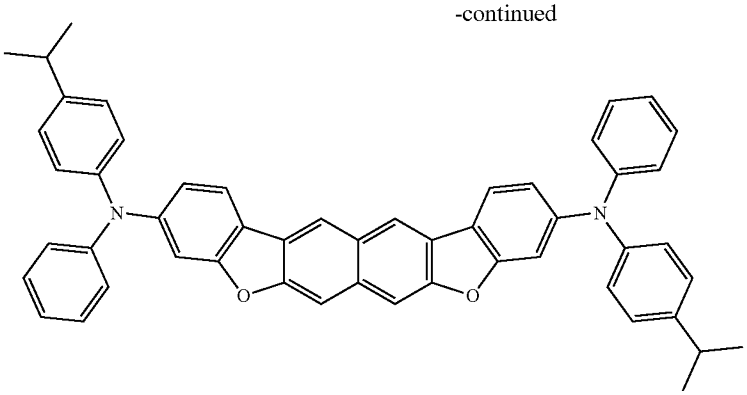
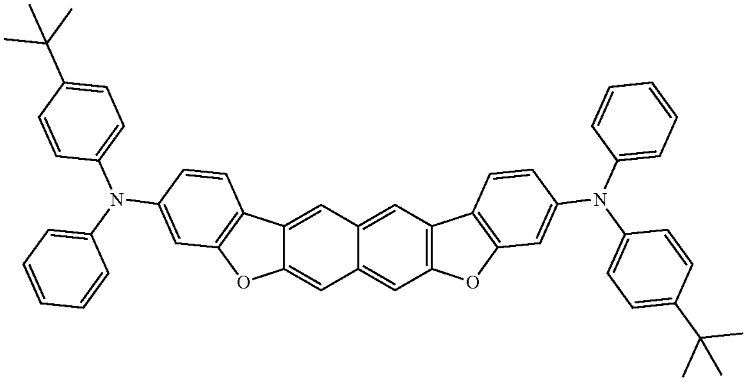
[Formula 360]
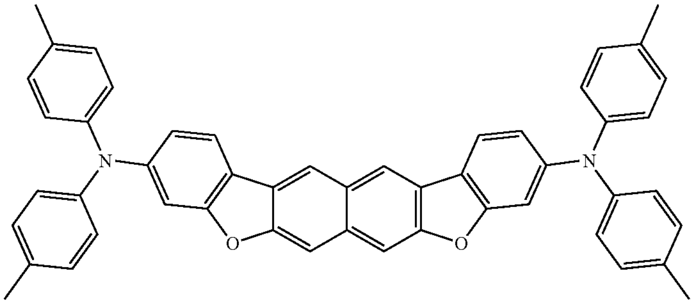
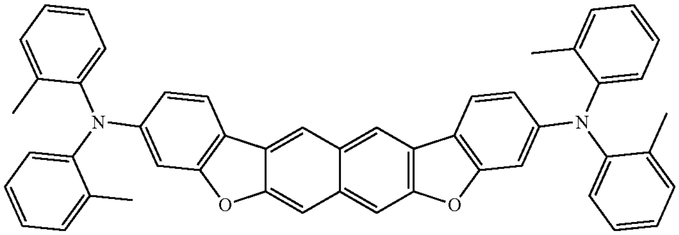
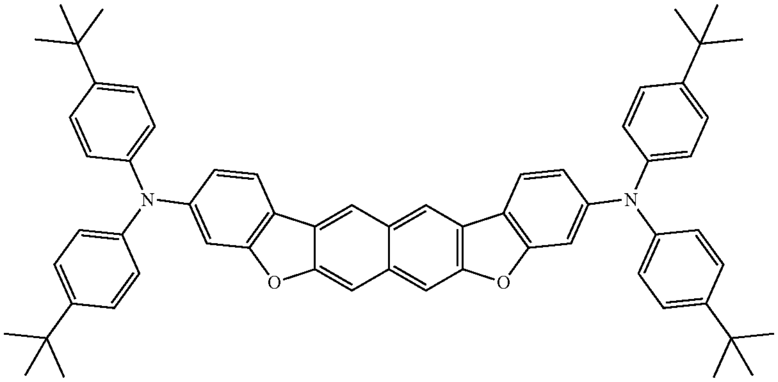

-continued
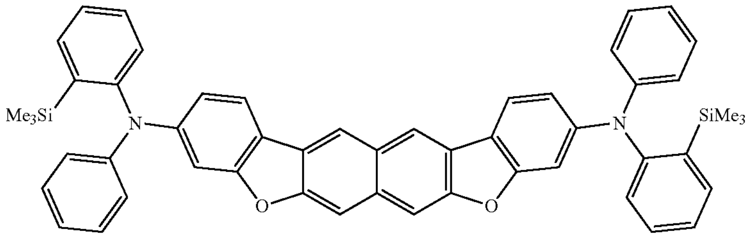
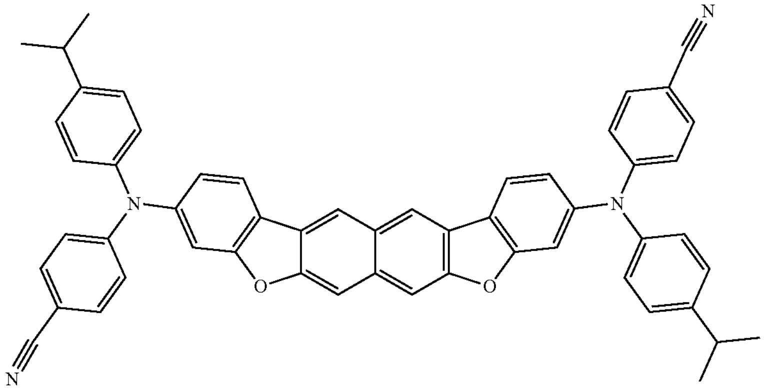
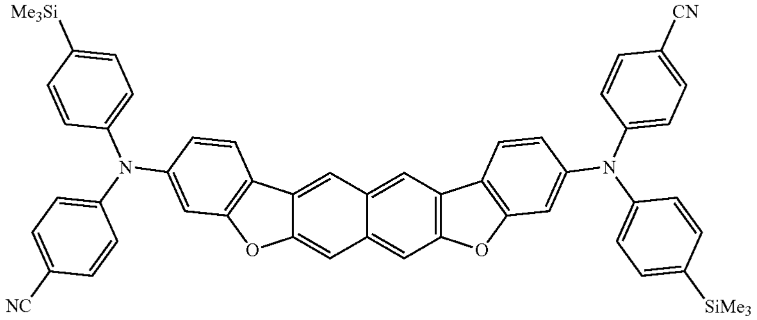
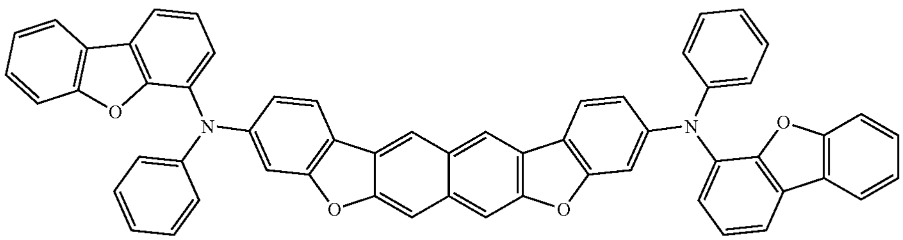
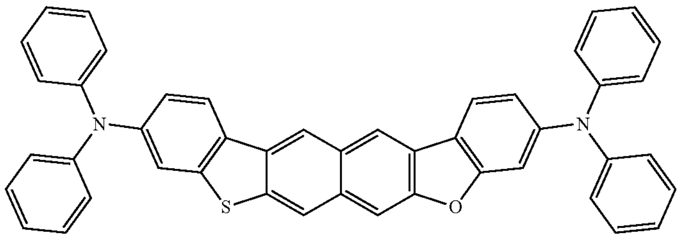

-continued
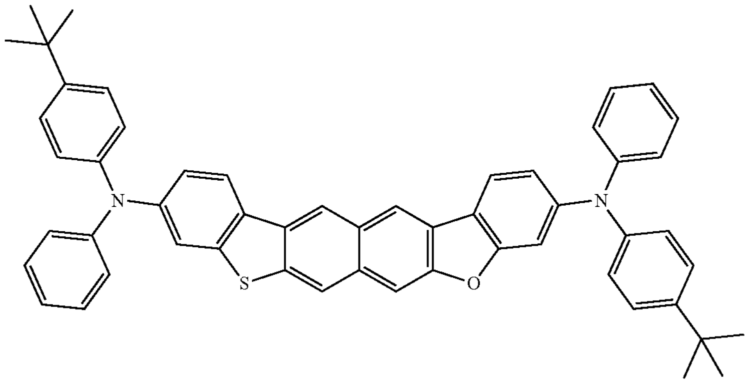
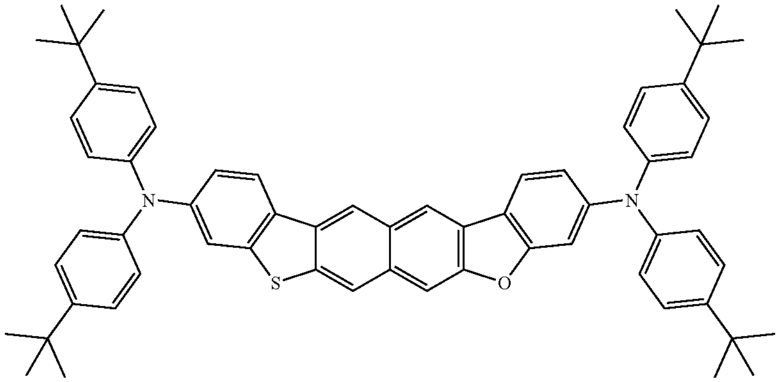
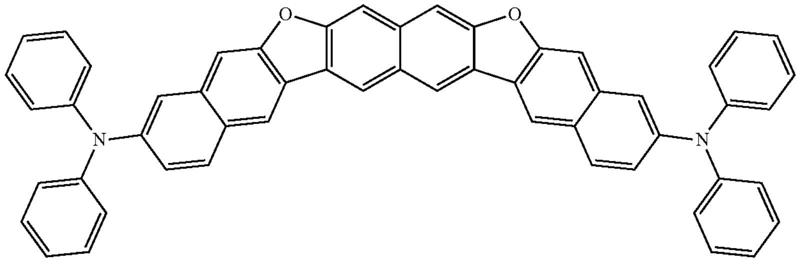
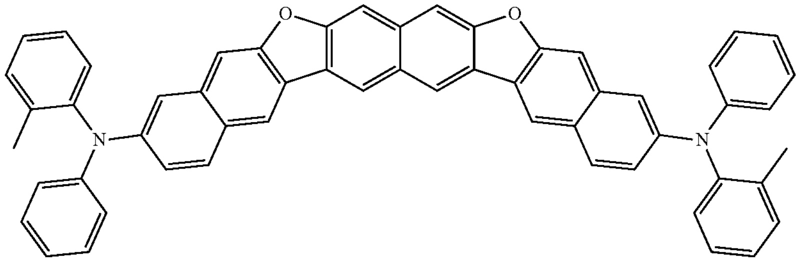
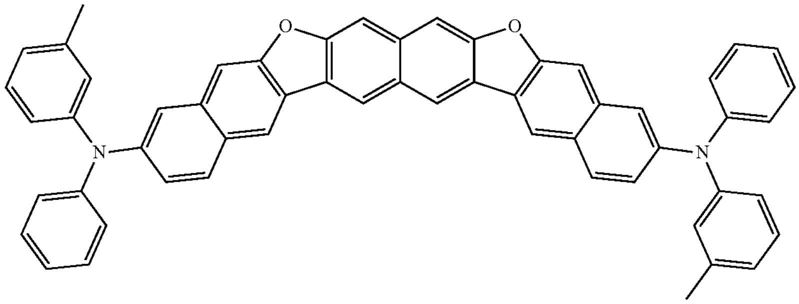

-continued
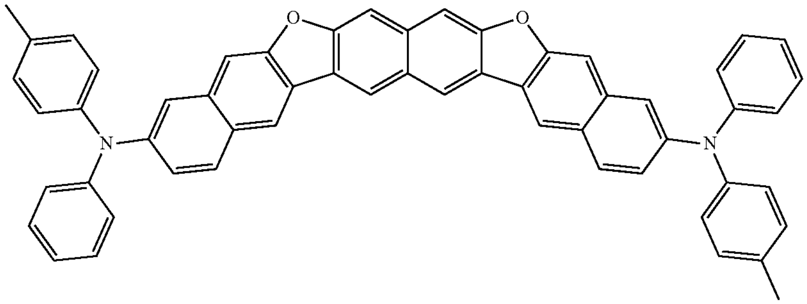
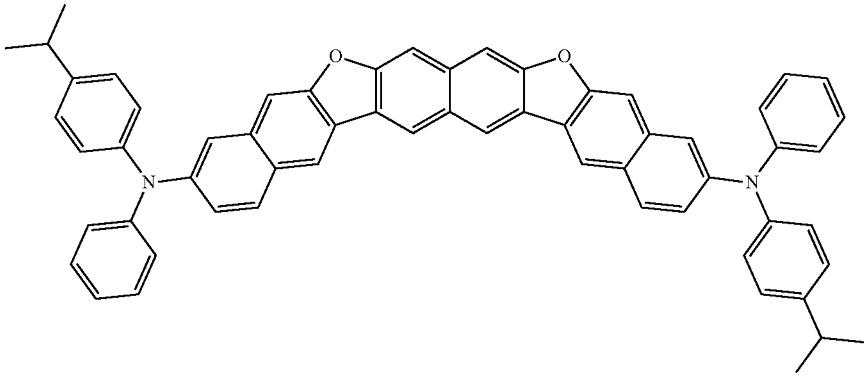
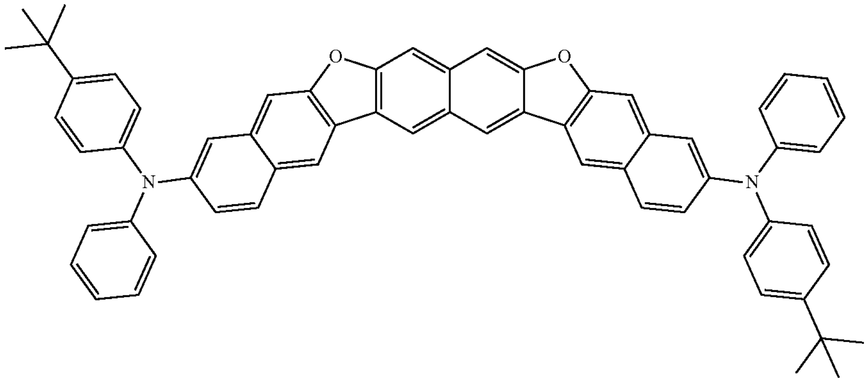
[Formula 361]
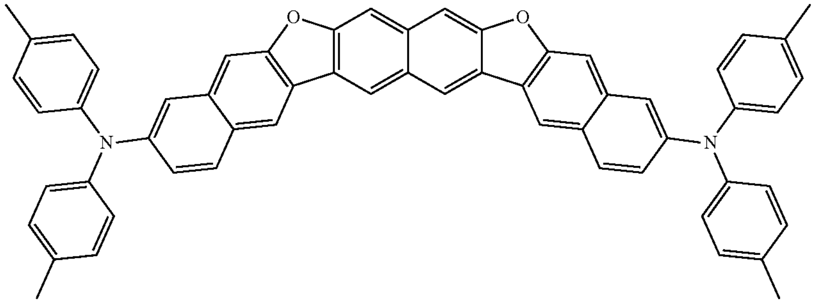
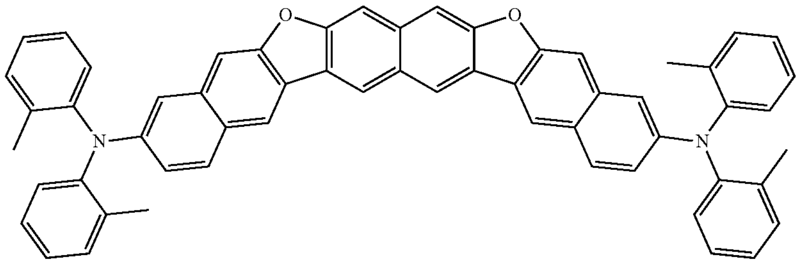

-continued
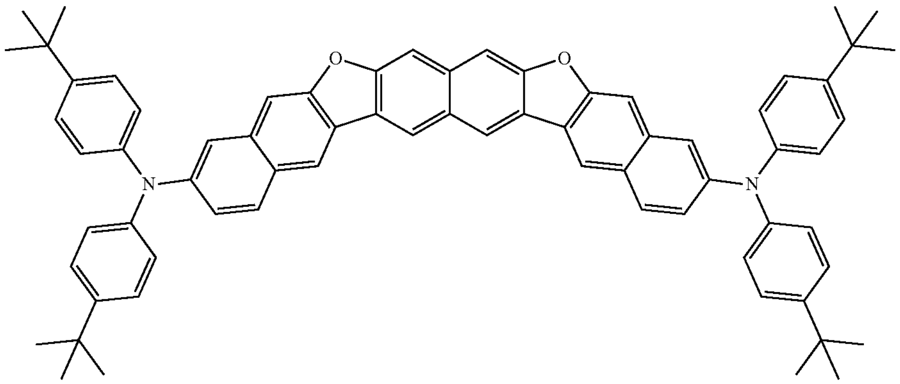
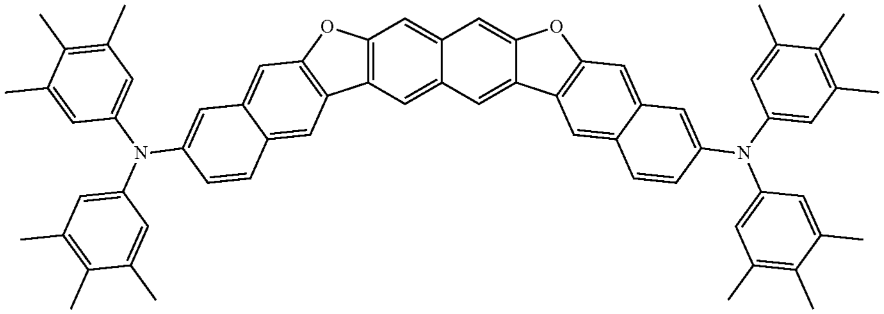
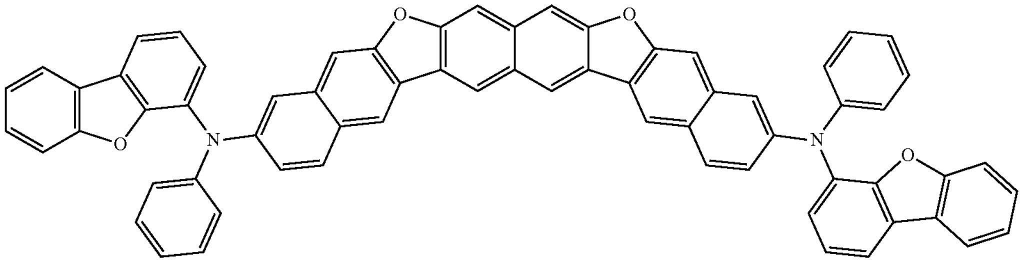
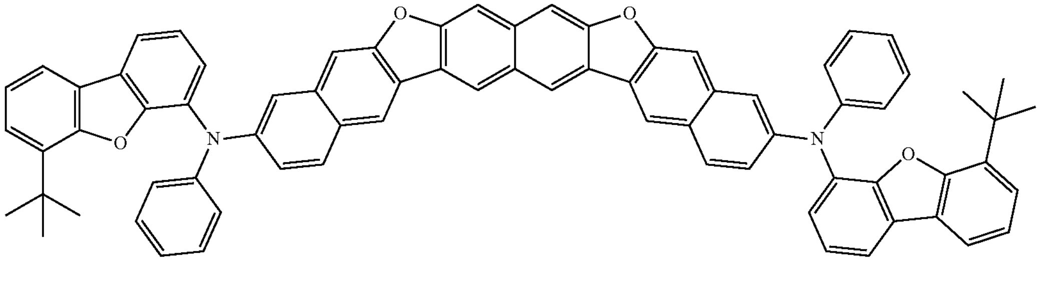

Compound Represented by Formula (8)

The compound represented by the formula (8) will be described below.

[Formula 362]

(8)

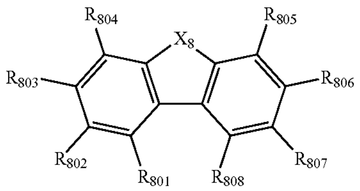

In the formula (8):

at least one combination of $R_{801}$ and $R_{802}$, $R_{802}$ and $R_{803}$, or $R_{803}$ and $R_{804}$ are mutually bonded to form a divalent group represented by a formula (82) below, and at least one combination of $R_{805}$ and $R_{806}$, $R_{806}$ and $R_{807}$, or $R_{807}$ and $R_{808}$ are mutually bonded to form a divalent group represented by a formula (83) below.

[Formula 363]

(82)

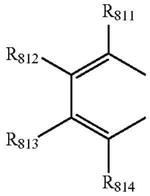

(83)

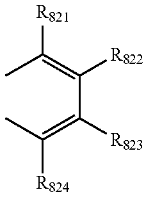

At least one of $R_{801}$ to $R_{804}$ not forming the divalent group represented by the formula (82) or $R_{811}$ to $R_{814}$ is a monovalent group represented by a formula (84) below;

at least one of $R_{805}$ to $R_{808}$ not forming the divalent group represented by the formula (83) or $R_{821}$ to $R_{824}$ is a monovalent group represented by a formula (84) below;

$X_8$ is an oxygen atom, a sulfur atom, or $NR_{809}$;

$R_{801}$ to $R_{808}$ not forming the divalent group represented by the formula (82) or (83) and not being the monovalent group represented by the formula (84), $R_{811}$ to $R_{814}$ and $R_{821}$ to $R_{824}$ not being the monovalent group represented by the formula (84), and $R_{809}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a group represented by $—N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms.

[Formula 364]

(84)

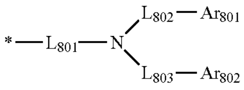

In the formula (84):

$Ar_{801}$ and $Ar_{802}$ are each independently a substituted or unsubstituted aryl group having 6 to 50 ring carbon atoms, or a substituted or unsubstituted heterocyclic group having 5 to 50 ring atoms;

$L_{801}$ to $L_{803}$ are each independently a single bond, a substituted or unsubstituted arylene group having 6 to 30 ring carbon atoms, a substituted or unsubstituted divalent heterocyclic group having 5 to 30 ring atoms, or a divalent linking group formed by bonding two, three or four groups selected from the group consisting of a substituted or unsubstituted arylene group having 6 to 30 ring carbon atoms and a substituted or unsubstituted divalent heterocyclic group having 5 to 30 ring atoms; and

* in the formula (84) represents a bonding position to a cyclic structure represented by the formula (8) or a bonding position to a group represented by the formula (82) or (83).

In the formula (8), the positions for the divalent group represented by the formula (82) and the divalent group represented by the formula (83) to be formed are not specifically limited but the divalent groups may be formed at any possible positions on $R_{801}$ to $R_{808}$.

In an exemplary embodiment, the compound represented by the formula (8) is represented by any one of formulae (81-1) to (81-6) below.

[Formula 365]

(81-1)

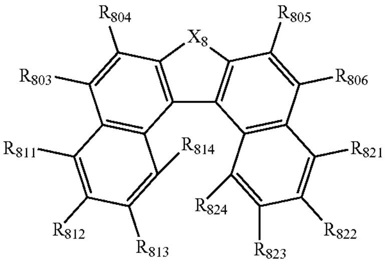

(81-2)

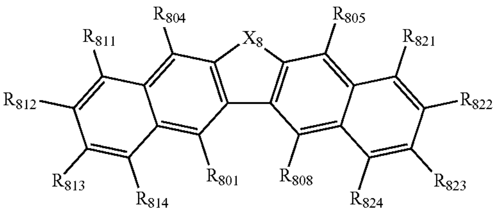

-continued

[Formula 366]

(81-3)

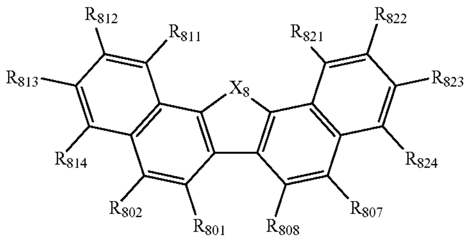

(81-4)

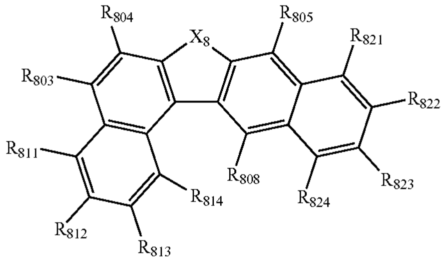

[Formula 367]

(81-5)

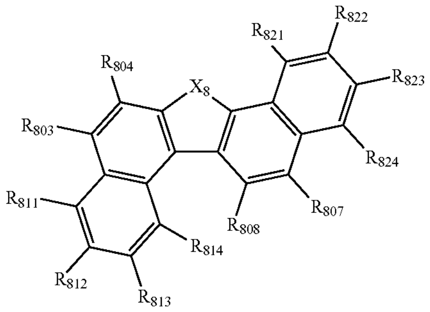

(81-6)

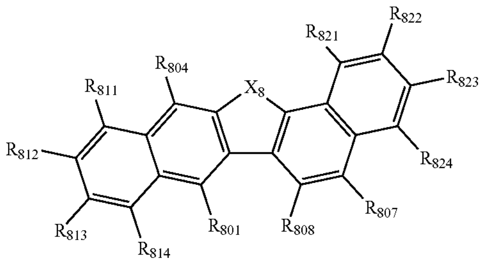

In the formulae (81-1) to (81-6):

$X_8$ represents the same as $X_8$ in the formula (8);

at least two of $R_{801}$ to $R_{824}$ are each a monovalent group represented by the formula (84); and $R_{801}$ to $R_{824}$ not being the monovalent group represented by the formula (84) are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

In an exemplary embodiment, the compound represented by the formula (8) is represented by any one of formulae (81-7) to (81-18) below.

[Formula 368]

(81-7)

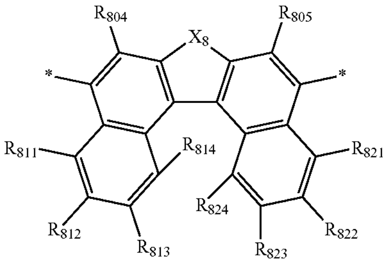

(81-8)

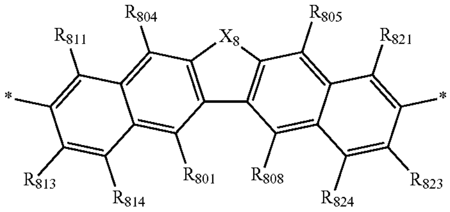

[Formula 369]

(81-9)

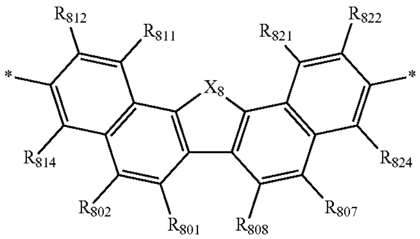

(81-10)

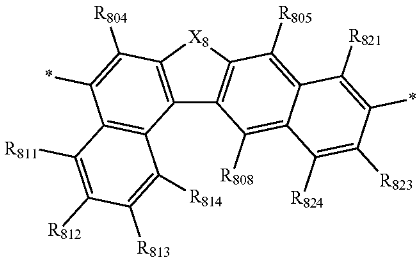

[Formula 370]

(81-11)

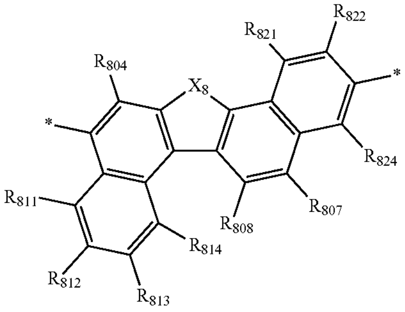

-continued (81-12)

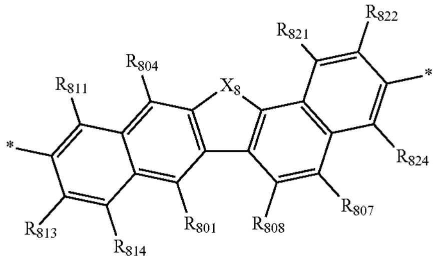

[Formula 371]

(81-13)

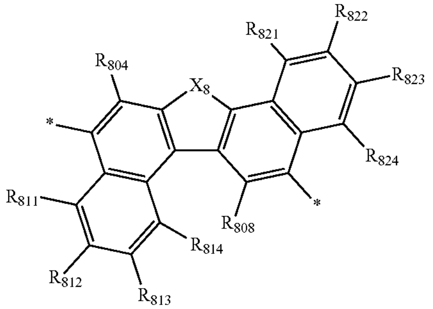

(81-14)

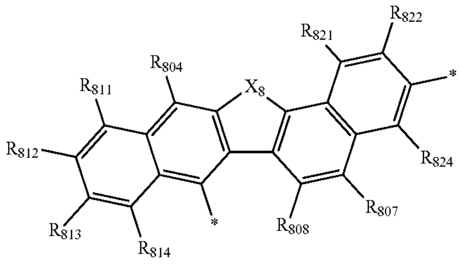

[Formula 372]

(81-15)

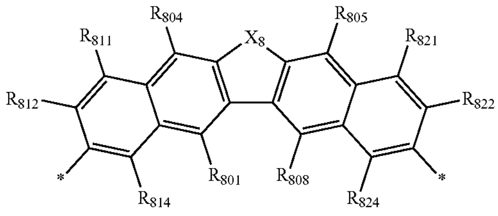

(81-16)

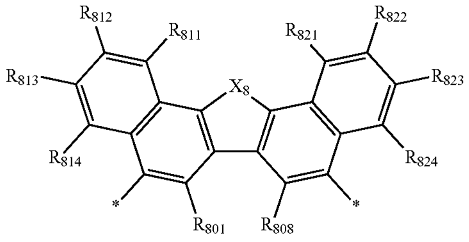

-continued

[Formula 373]

(81-17)

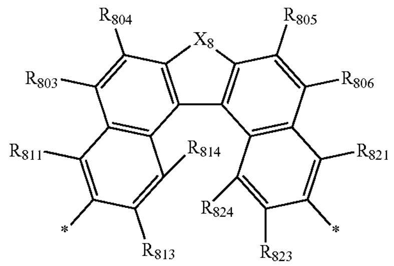

(81-18)

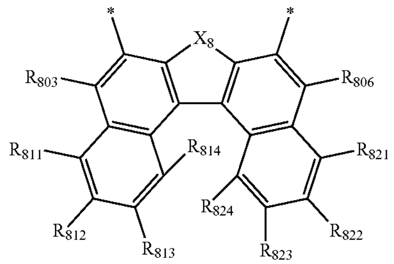

In the formulae (81-7) to (81-18):

$X_8$ represents the same as $X_8$ in the formula (8);

* is a single bond bonded to a monovalent group represented by the formula (84); and $R_{801}$ to $R_{824}$ each independently represent the same as $R_{801}$ to $R_{824}$ in the formulae (81-1) to (81-6) that are not the monovalent group represented by the formula (84).

$R_{801}$ to $R_{808}$ not forming the divalent group represented by the formula (82) or (83) and not being the monovalent group represented by the formula (84), and $R_{811}$ to $R_{814}$ and $R_{821}$ to $R_{824}$ not being the monovalent group represented by the formula (84) are preferably each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

The monovalent group represented by the formula (84) is preferably represented by a formula (85) or (86) below.

[Formula 374]

(85)

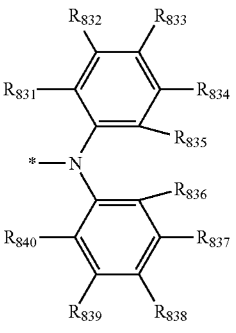

In the formula (85):

$R_{831}$ to $R_{840}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and

* in the formula (85) represents the same as * in the formula (84).

[Formula 375]

(86)

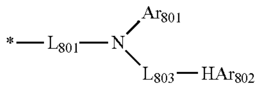

In the formula (86):

$Ar_{801}$, $L_{801}$, and $L_{803}$ represent the same as $Ar_{801}$, $L_{801}$, and $L_{803}$ in the formula (84); and $HAr_{801}$ is a structure represented by a formula (87) below.

[Formula 376]

(87)

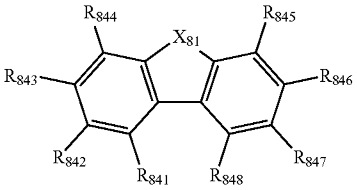

In the formula (87):

$X_{81}$ is an oxygen atom or a sulfur atom;

one of $R_{841}$ to $R_{848}$ is a single bond with $L_{803}$; and $R_{841}$ to $R_{848}$ not being the single bond are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

Specific Examples of Compound Represented by Formula (8)

Specific examples of the compound represented by the formula (8) include compounds shown below as well as the compounds disclosed in WO 2014/104144.

[Formula 377]

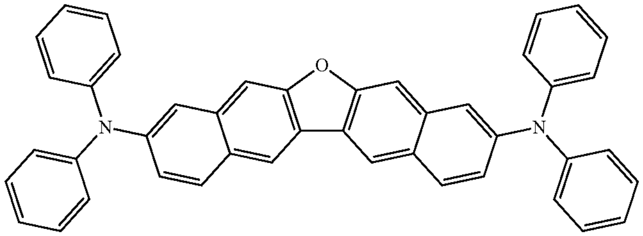

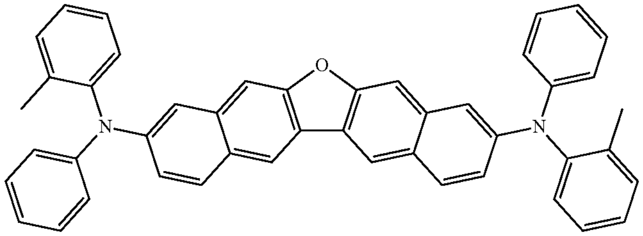

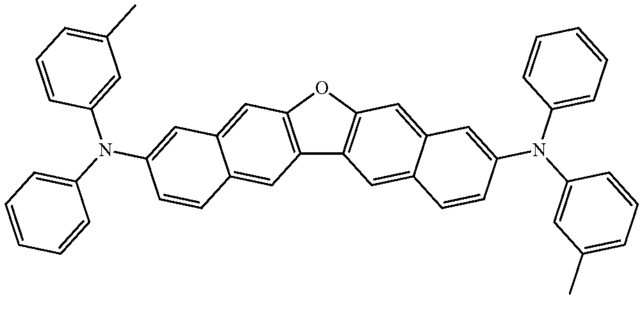

-continued
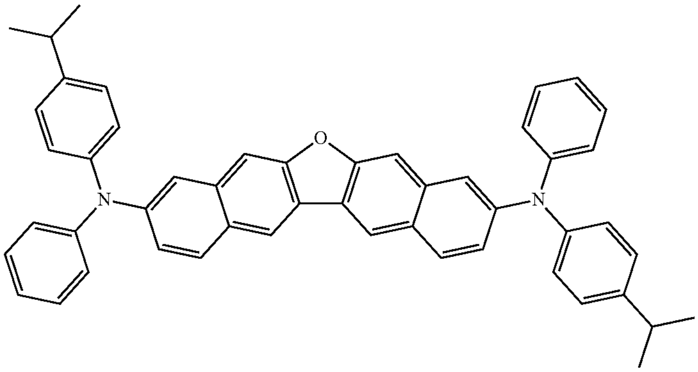
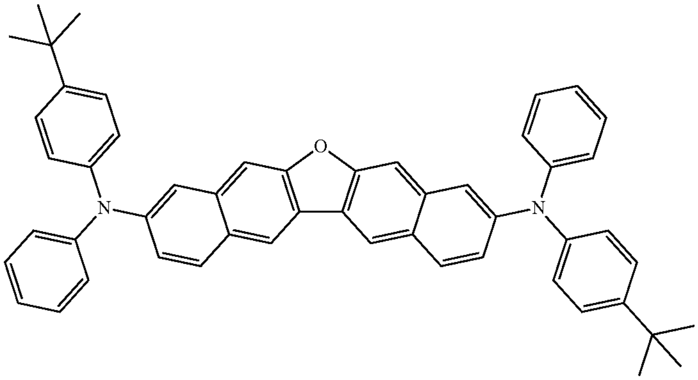
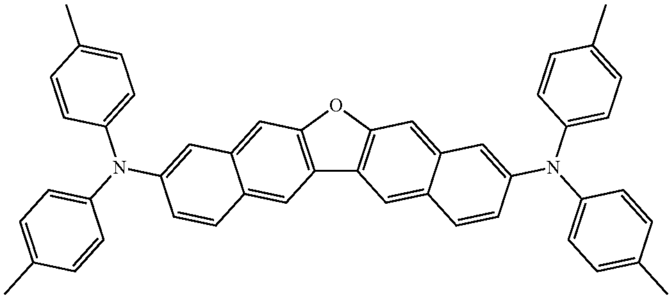
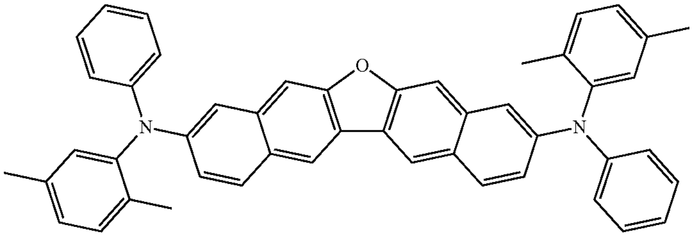
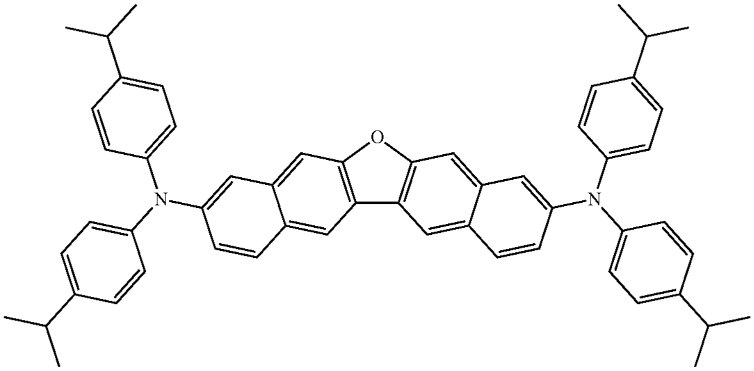

-continued
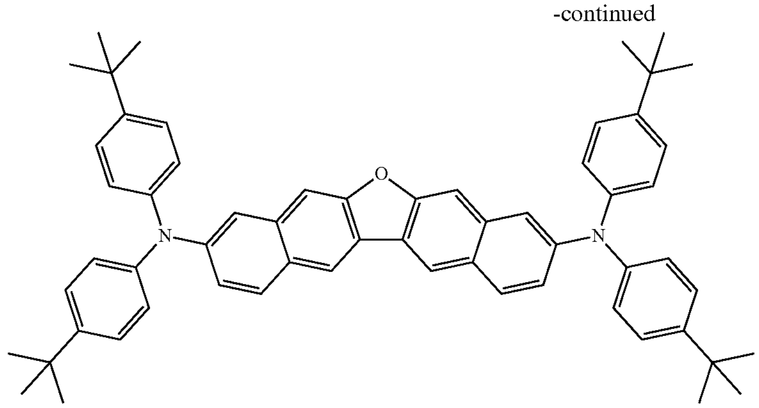
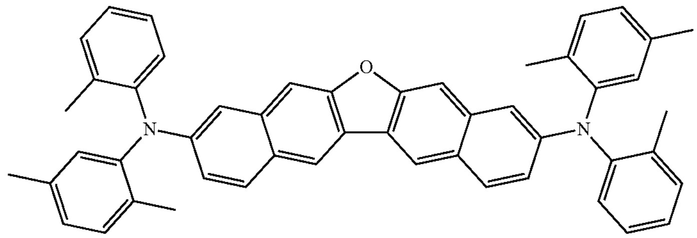
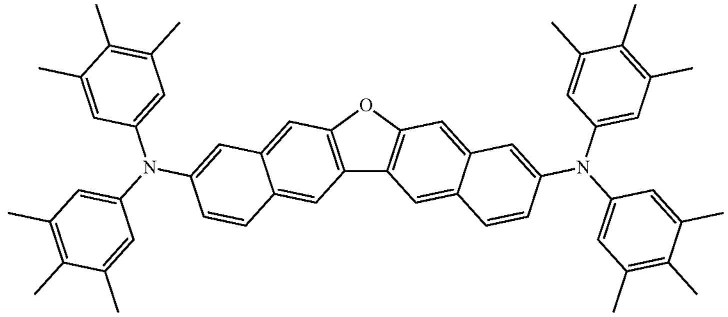
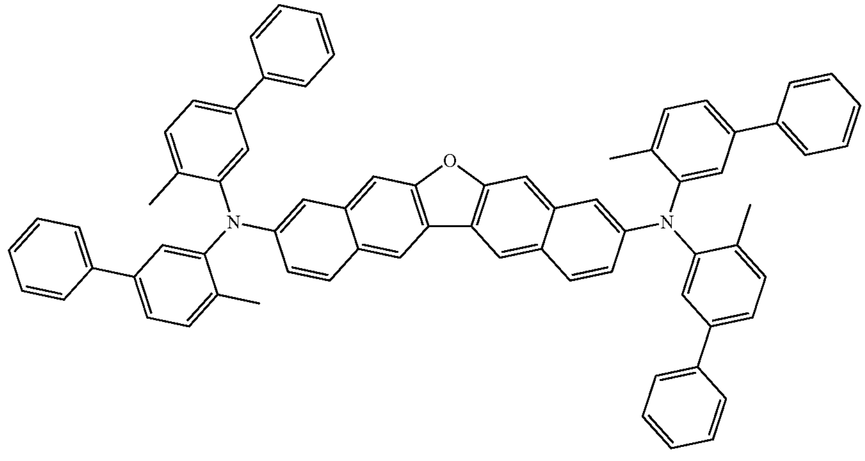

-continued
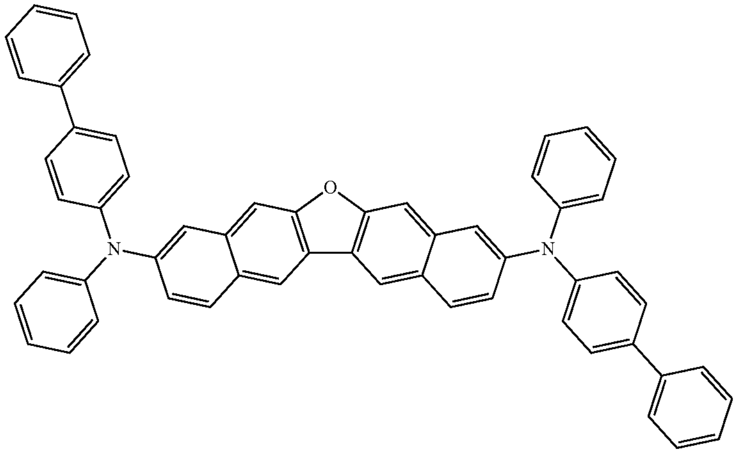
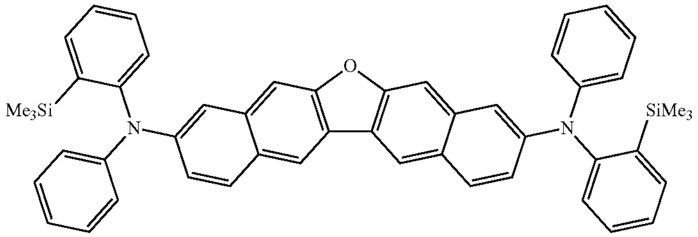
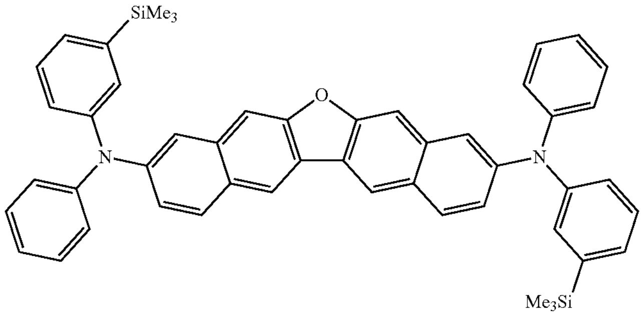
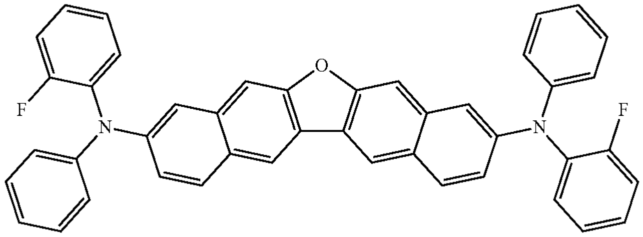
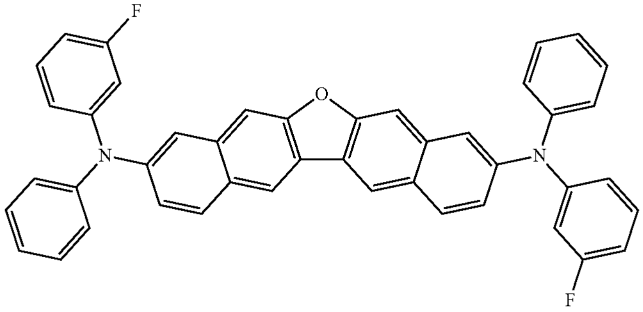

-continued
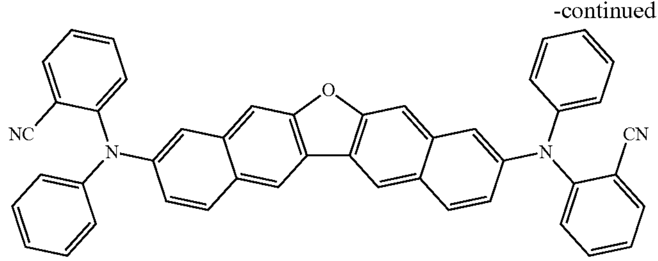
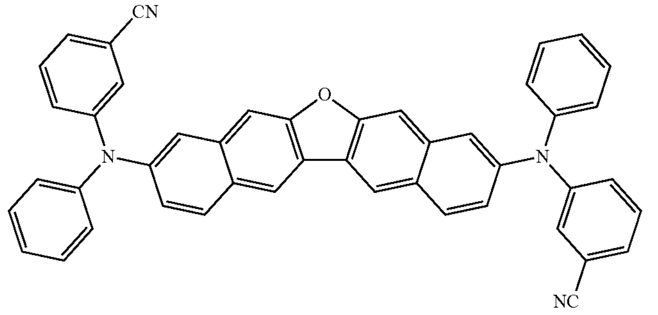
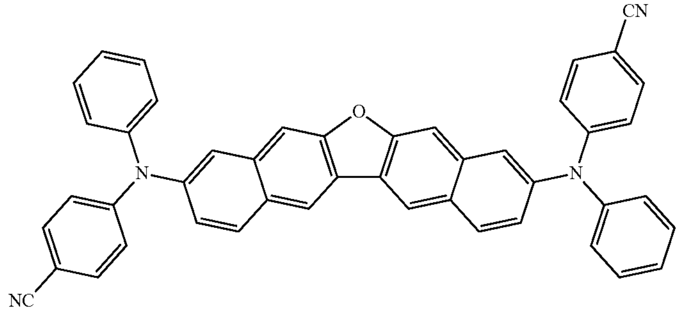
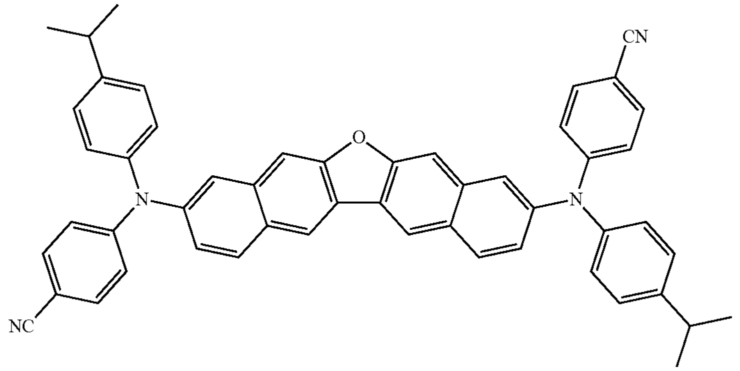
[Formula 378]
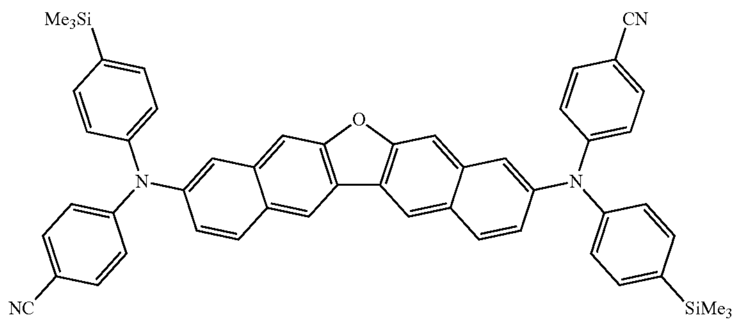

-continued
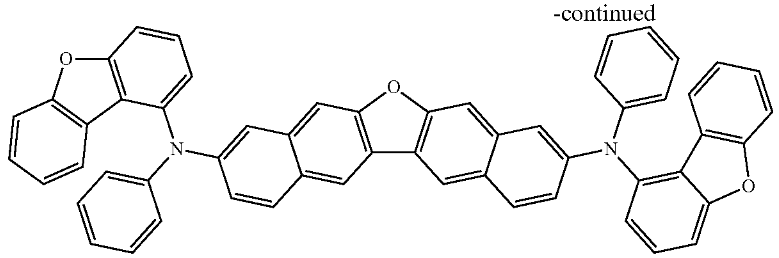
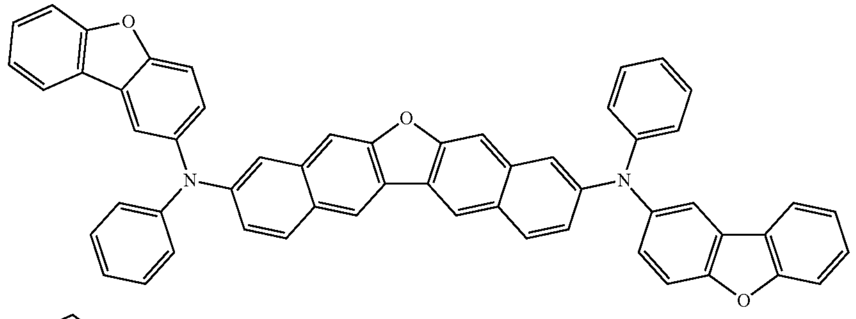
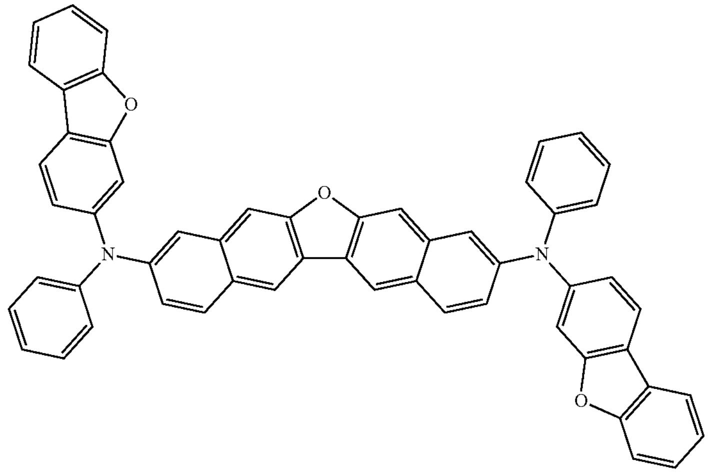
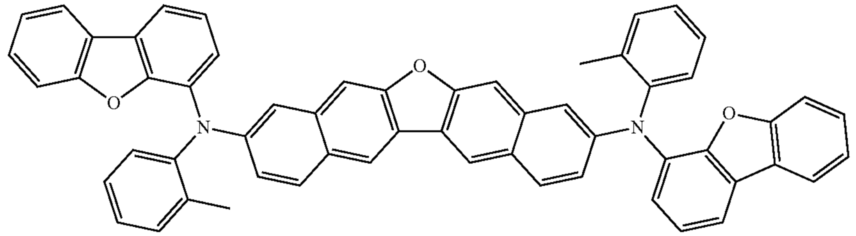
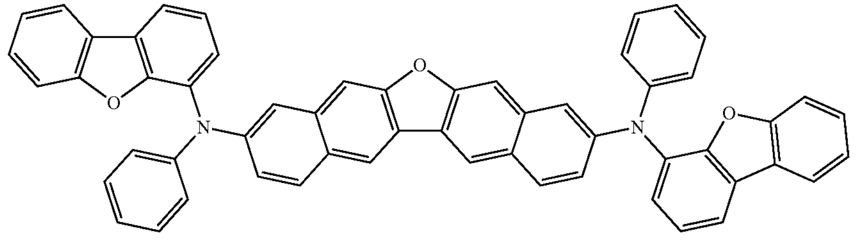
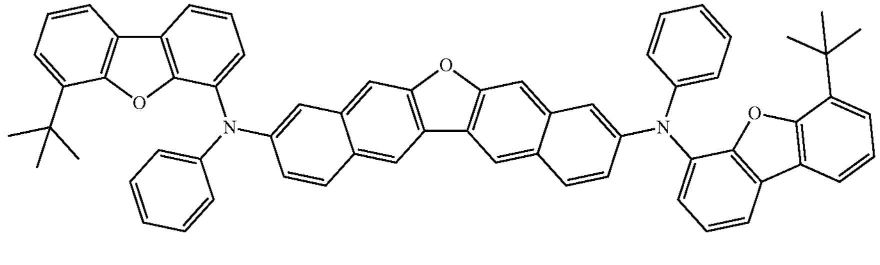

-continued
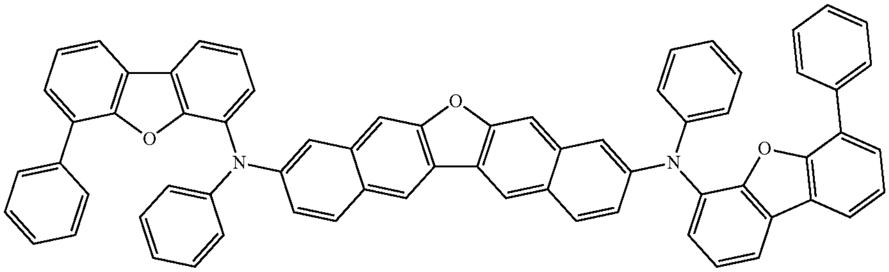
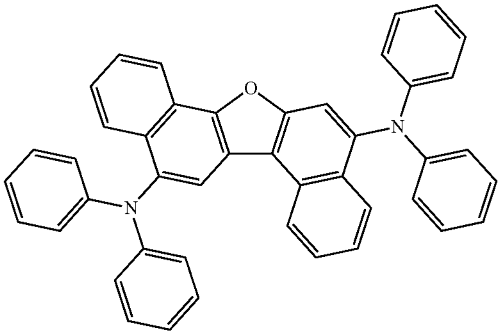
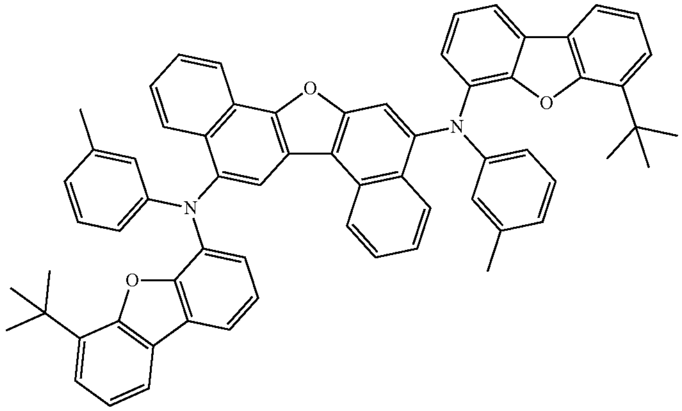
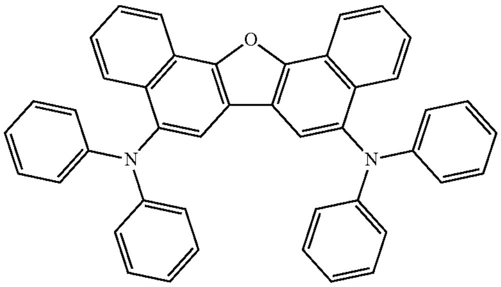
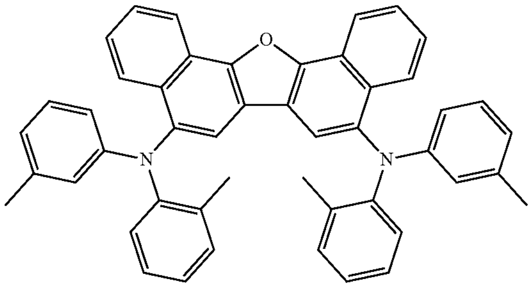
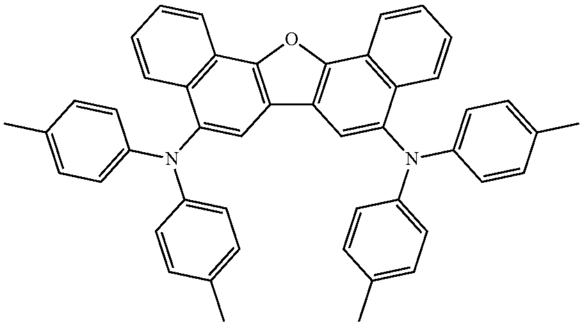

-continued
[Formula 379]
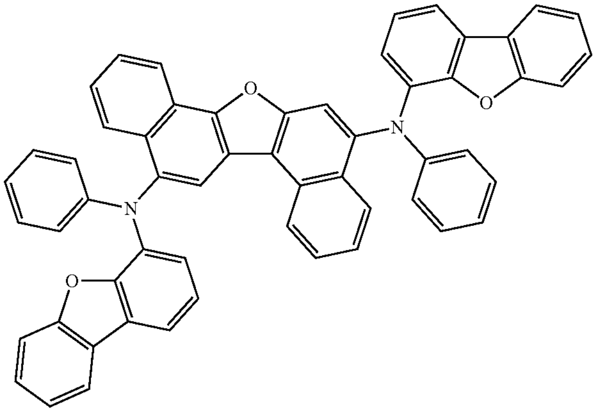
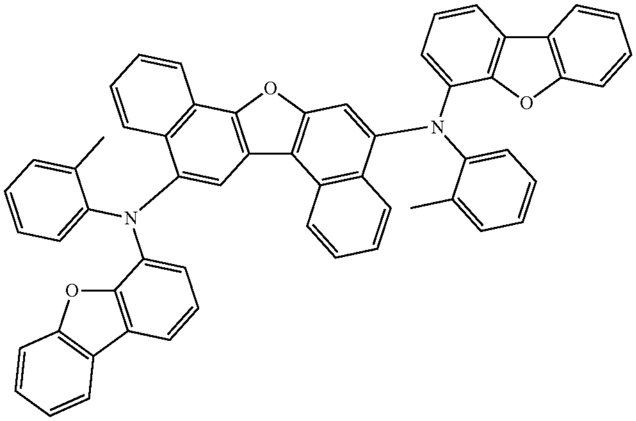
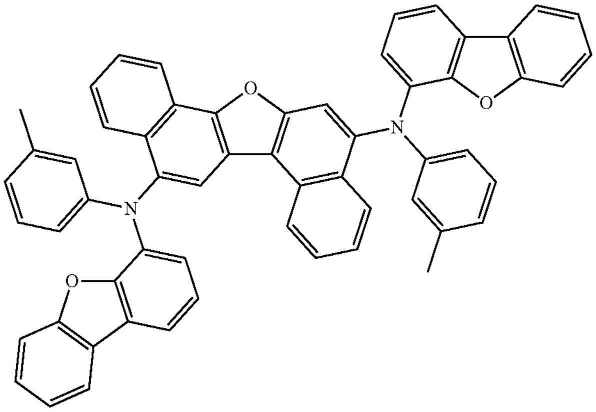
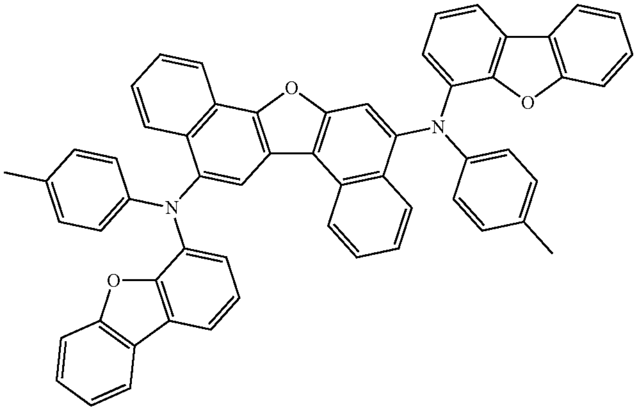

-continued
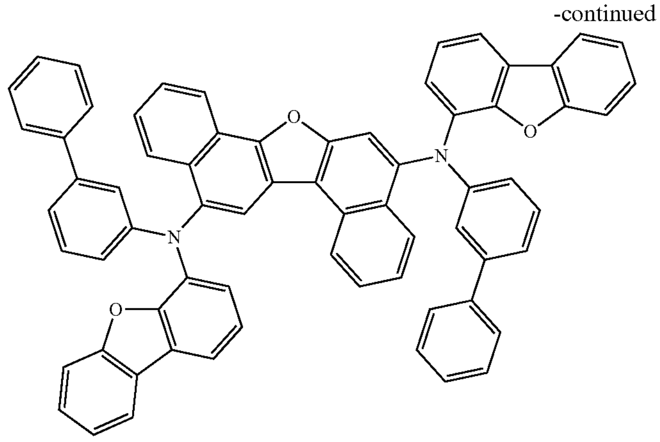
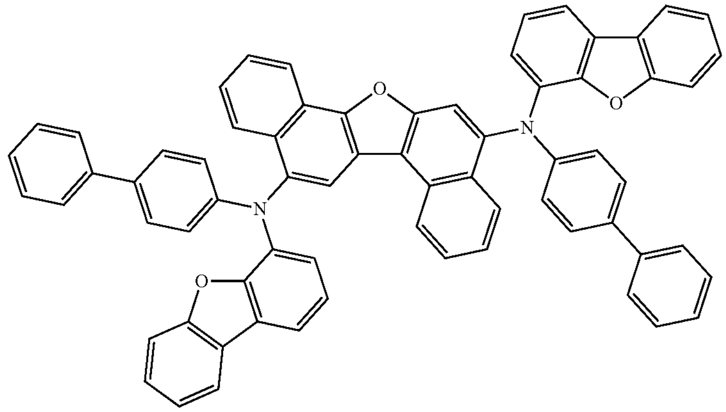
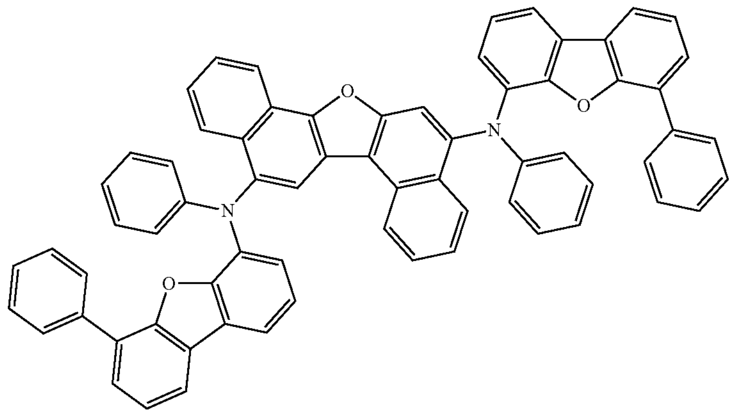
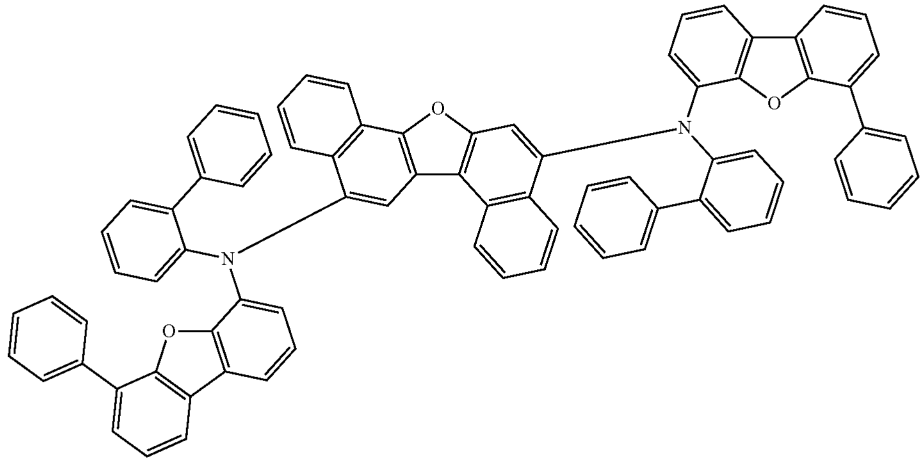

-continued
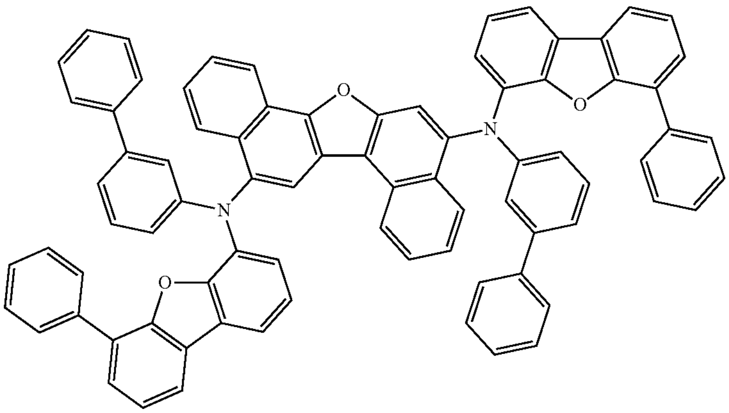
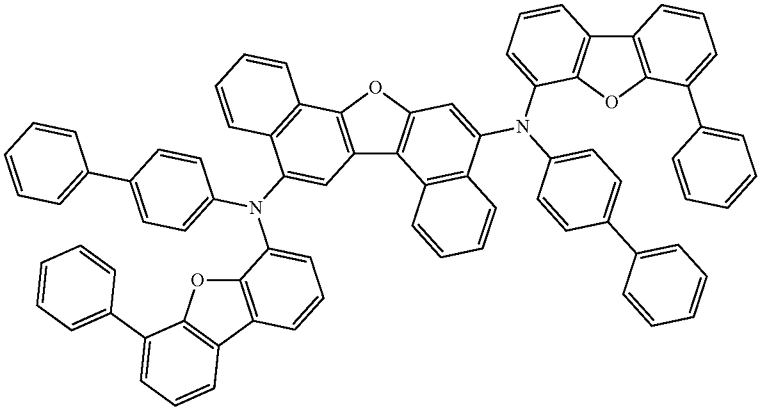
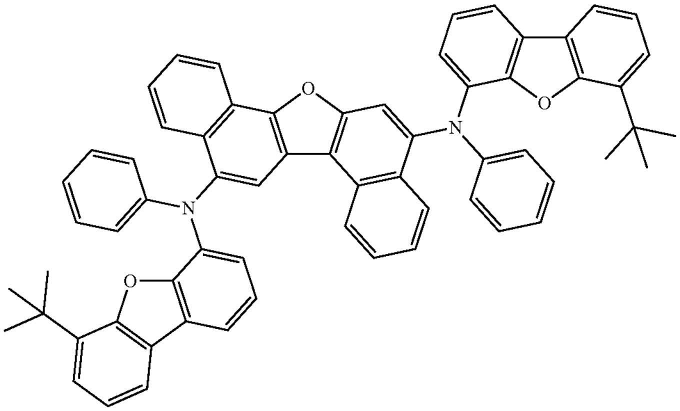
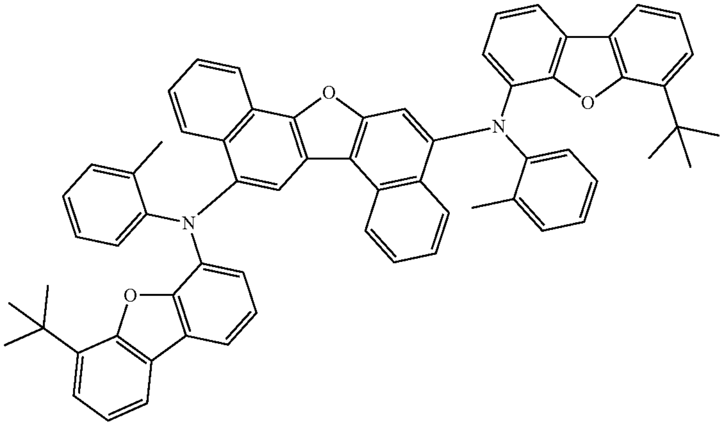

-continued
[Formula 380]
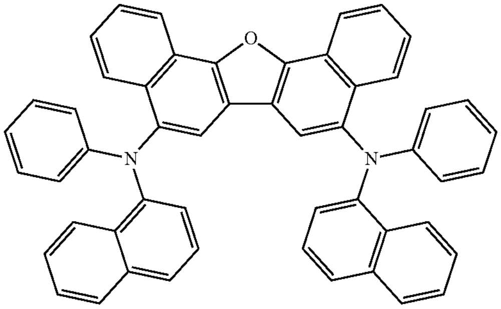
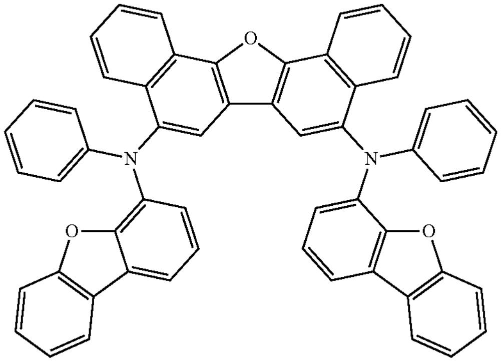
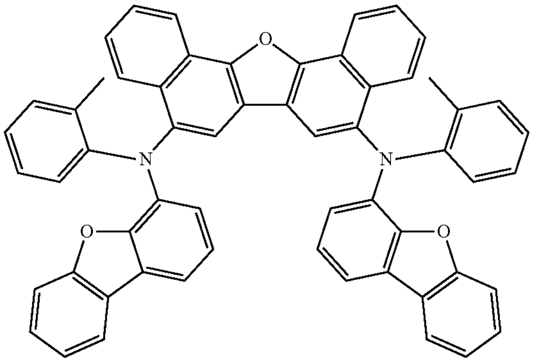
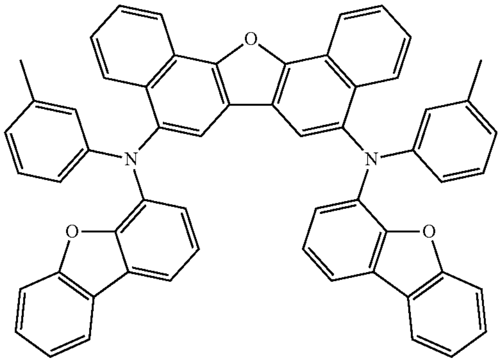
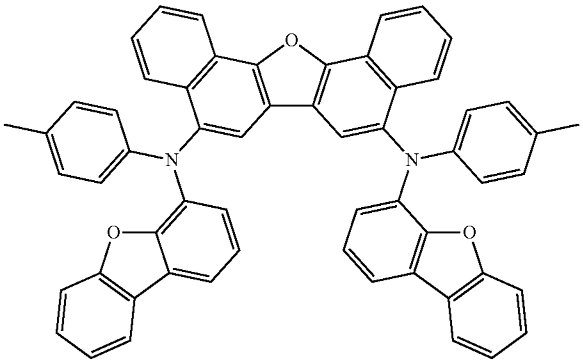
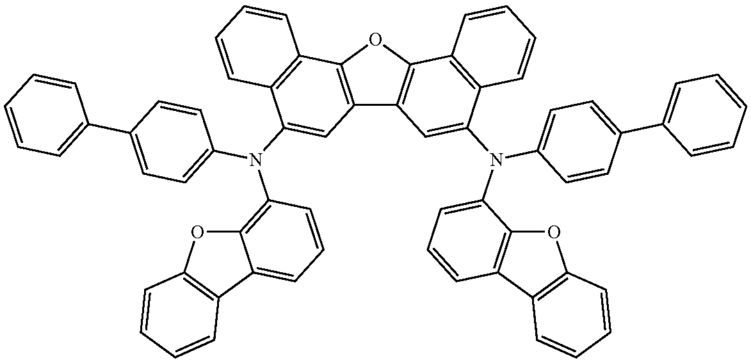

-continued
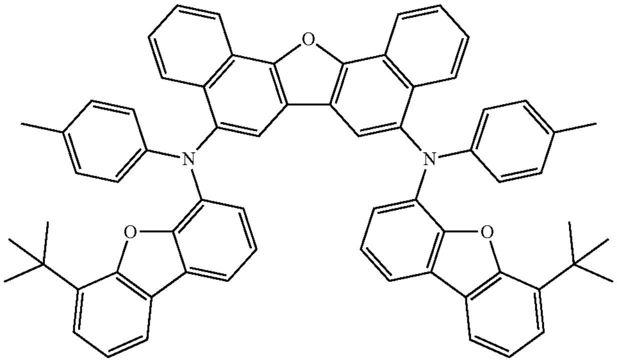
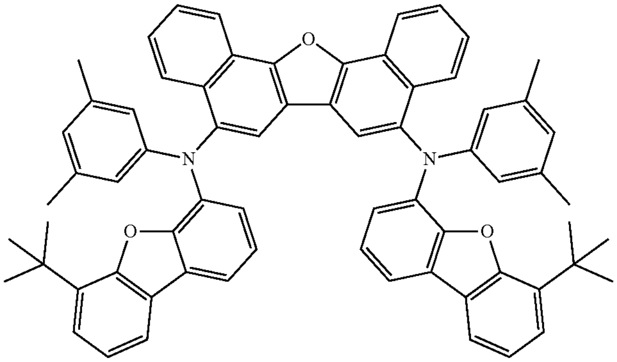
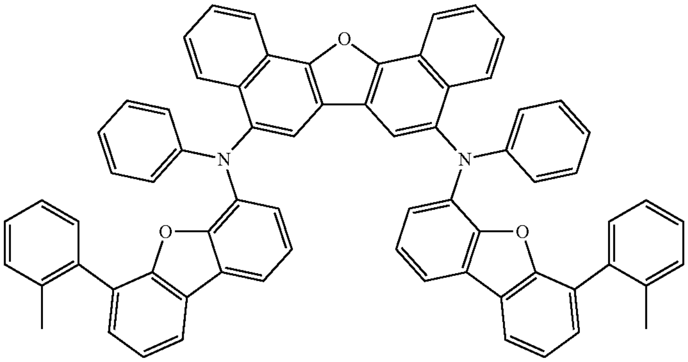
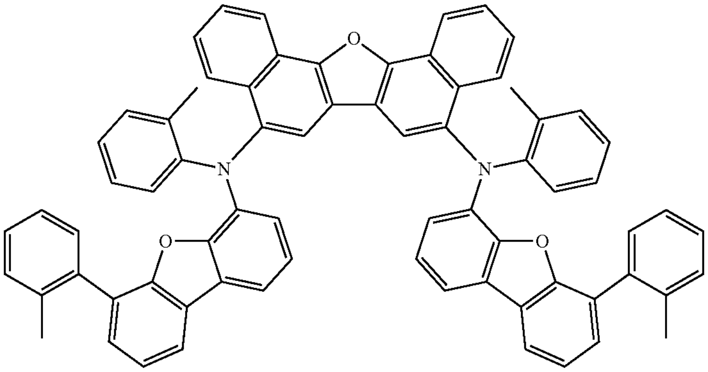

-continued
[Formula 381]
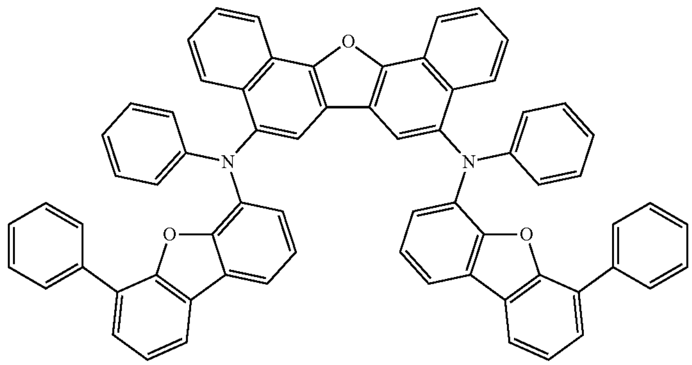
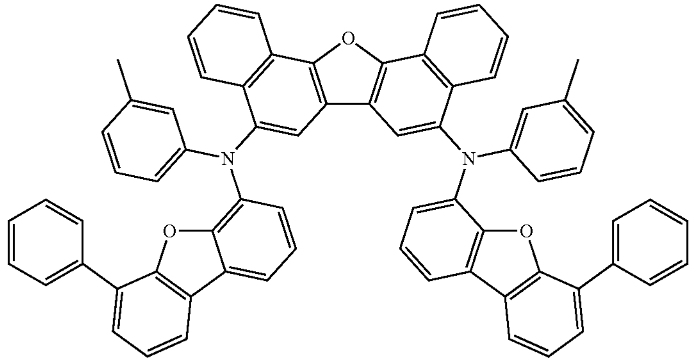
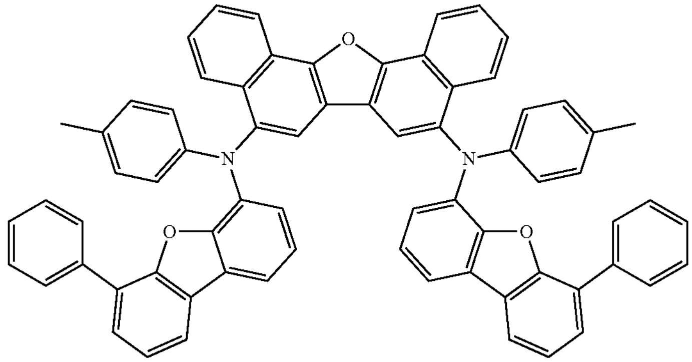
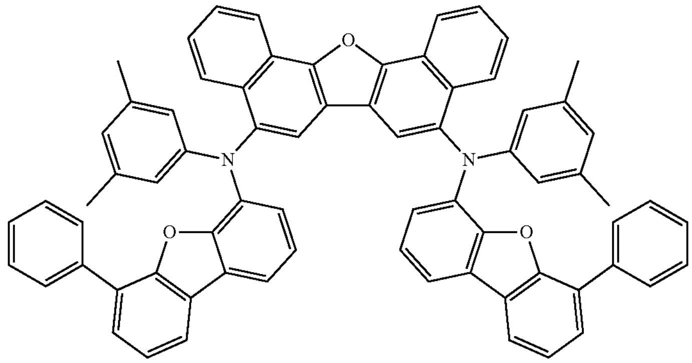

-continued
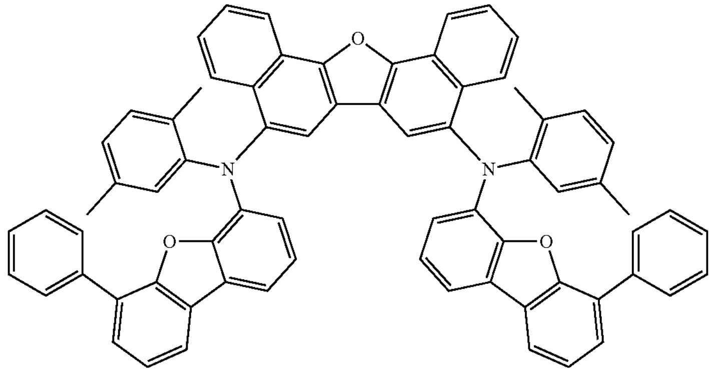
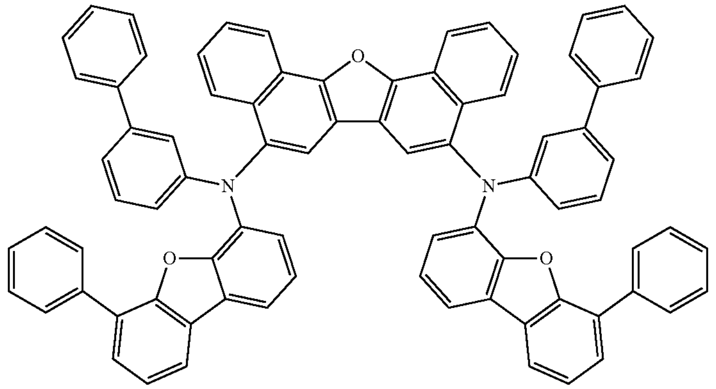
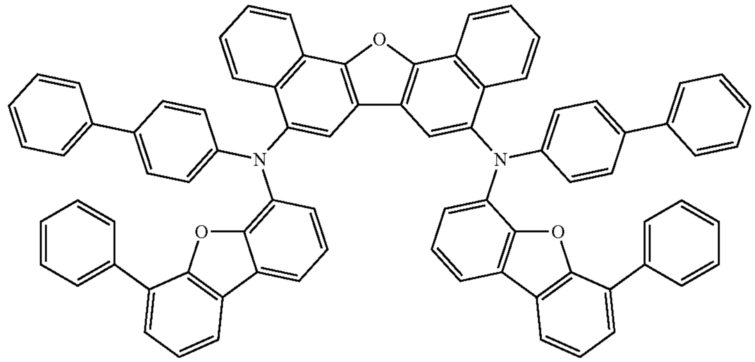
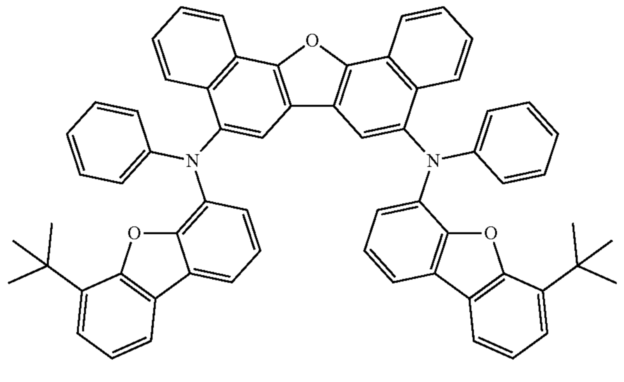

[Formula 382]
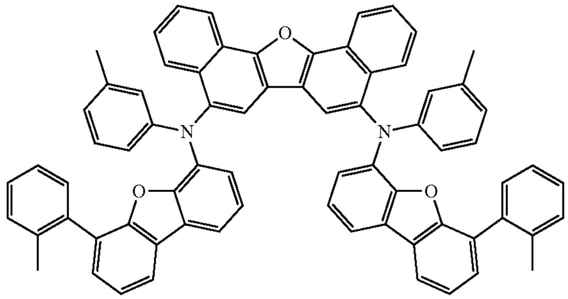
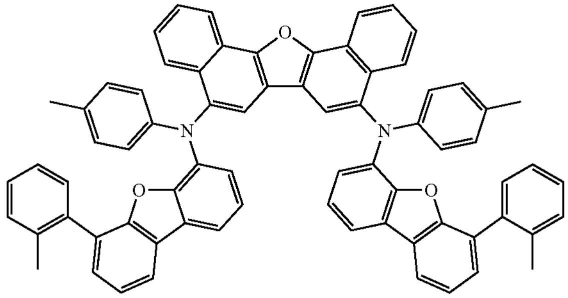
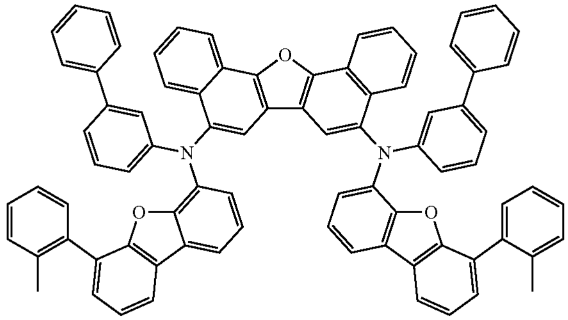
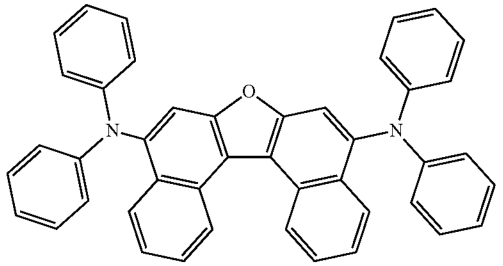
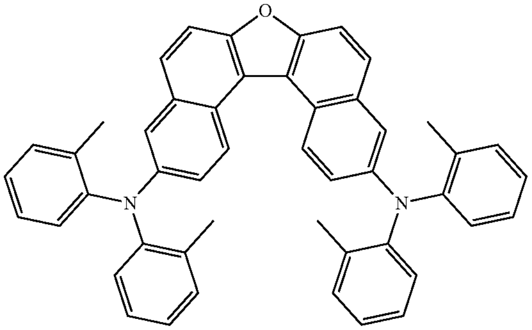
-continued
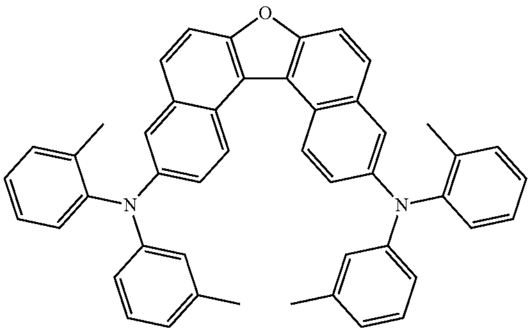
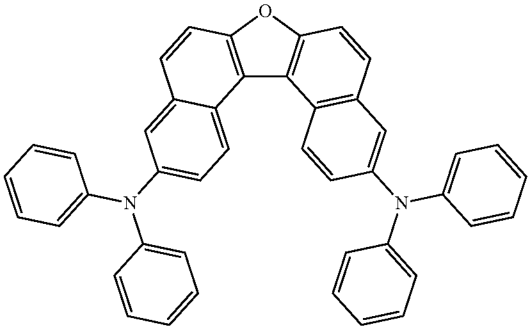
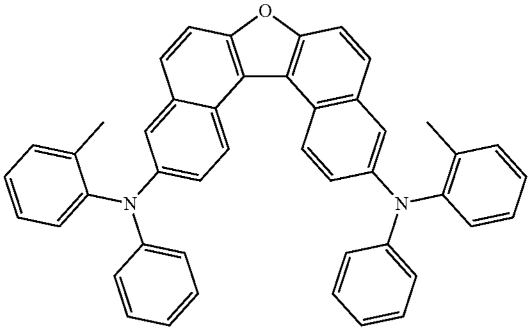
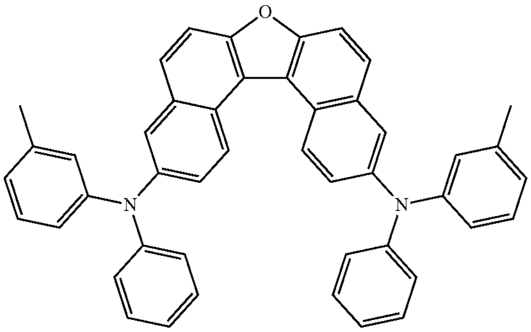
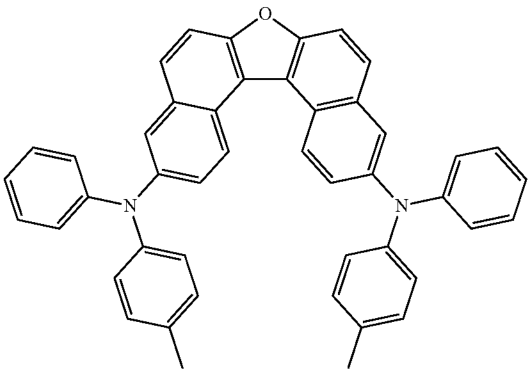

-continued

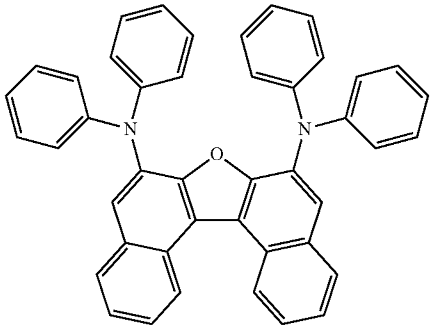

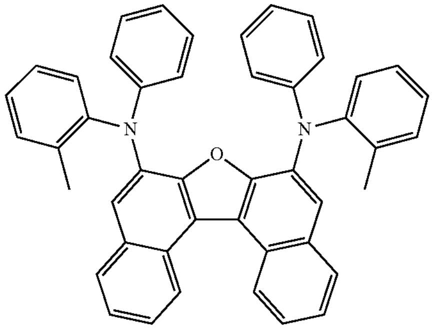

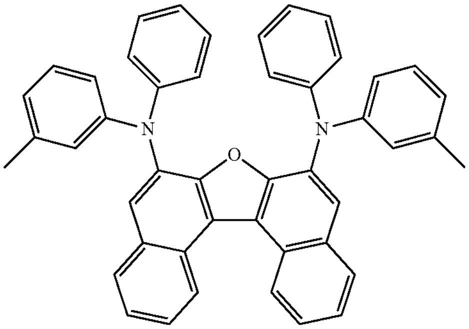

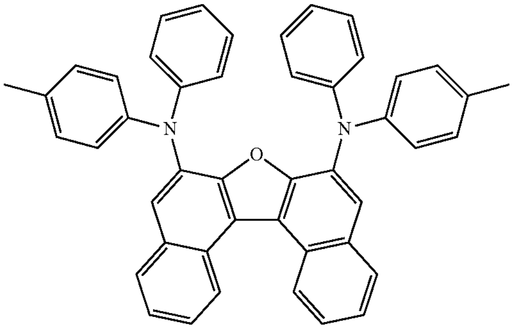

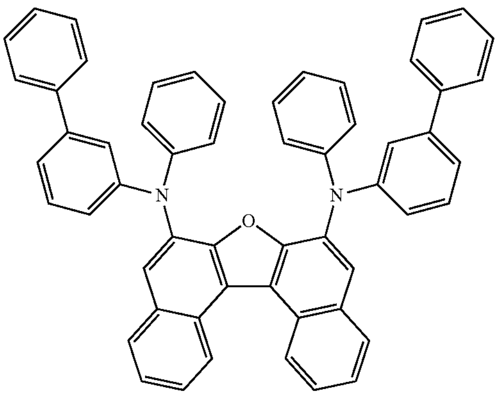

-continued

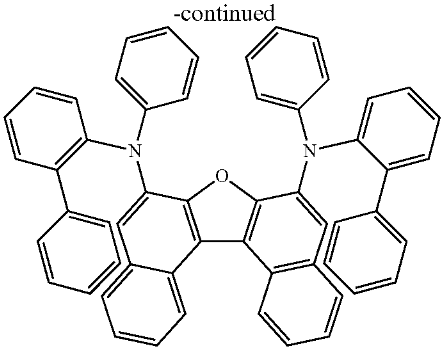

Compound Represented by Formula (9)

The compound represented by the formula (9) will be described below.

[Formula 383]

(9)

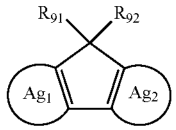

In the formula (9):

$A_{91}$ ring and $A_{92}$ ring are each independently a substituted or unsubstituted aromatic hydrocarbon ring having 6 to 50 ring carbon atoms, or a substituted or unsubstituted heterocycle having 5 to 50 ring atoms; and at least one of $A_{91}$ ring or $A_{92}$ ring is bonded with * in a structure represented by a formula (92) below.

[Formula 384]

(92)

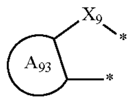

In the formula (92):

$A_{93}$ is a substituted or unsubstituted aromatic hydrocarbon ring having 6 to 50 ring carbon atoms, or a substituted or unsubstituted heterocycle having 5 to 50 ring atoms;

$X_9$ is $NR_{93}$, $C(R_{94})(R_{95})$, $S_1(R_{96})(R_{97})$, $Ge(R_{98})(R_{99})$, an oxygen atom, a sulfur atom, or a selenium atom;

$R_{91}$ and $R_{92}$ are mutually bonded to form a substituted or unsubstituted monocyclic ring, mutually bonded to form a substituted or unsubstituted fused ring, or not mutually bonded; and $R_{91}$ and $R_{92}$ not forming the monocyclic ring and not forming the fused ring, and $R_{93}$ to $R_{99}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

At least one of $A_{91}$ ring or $A_{92}$ ring is bonded to a bond * of a structure represented by the formula (92).

In other words, the ring-forming carbon atoms of the aromatic hydrocarbon ring or the ring atoms of the heterocycle of $A_{91}$ ring in an exemplary embodiment are bonded to the bonds * in a structure represented by the formula (92).

Further, the ring-forming carbon atoms of the aromatic hydrocarbon ring or the ring atoms of the heterocycle of $A_{92}$ ring in an exemplary embodiment are bonded to the bonds * in a structure represented by the formula (92).

In an exemplary embodiment, a group represented by a formula (93) below is bonded to one or both of $A_{91}$ ring and $A_{92}$ ring.

[Formula 385]

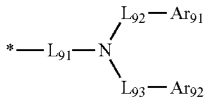

(93)

In the formula (93):

$Ar_{91}$ and $Ar_{92}$ are each independently a substituted or unsubstituted aryl group having 6 to 50 ring carbon atoms, or a substituted or unsubstituted heterocyclic group having 5 to 50 ring atoms;

$L_{91}$ to $L_{93}$ are each independently a single bond, a substituted or unsubstituted arylene group having 6 to 30 ring carbon atoms, a substituted or unsubstituted divalent heterocyclic group having 5 to 30 ring atoms, or a divalent linking group formed by bonding two, three or four groups selected from the group consisting of a substituted or unsubstituted arylene group having 6 to 30 ring carbon atoms and a substituted or unsubstituted divalent heterocyclic group having 5 to 30 ring atoms; and

* in the formula (93) represents a bonding position to one of $A_{91}$ ring and $A_{92}$ ring.

In an exemplary embodiment, in addition to $A_{91}$ ring, the ring-forming carbon atoms of the aromatic hydrocarbon ring or the ring atoms of the heterocycle of $A_{92}$ ring are bonded to * in a structure represented by the formula (92).

In this case, the structures represented by the formula (92) may be mutually the same or different.

In an exemplary embodiment, $R_{91}$ and $R_{92}$ are each independently a substituted or unsubstituted aryl group having 6 to 50 ring carbon atoms.

In an exemplary embodiment, $R_{91}$ and $R_{92}$ are mutually bonded to form a fluorene structure.

In an exemplary embodiment, $A_{91}$ ring and $A_{92}$ ring are each independently a substituted or unsubstituted aromatic hydrocarbon ring having 6 to 50 ring carbon atoms, example of which is a substituted or unsubstituted benzene ring.

In an exemplary embodiment, $A_{93}$ ring is a substituted or unsubstituted aromatic hydrocarbon ring having 6 to 50 ring carbon atoms, example of which is a substituted or unsubstituted benzene ring.

In an exemplary embodiment, $X_9$ is an oxygen atom or a sulfur atom.

Specific Examples of Compound Represented by Formula (9)

Specific examples of the compound represented by the formula (9) include compounds shown below.

[Formula 386]

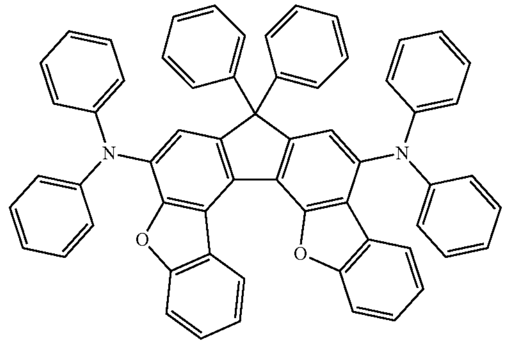

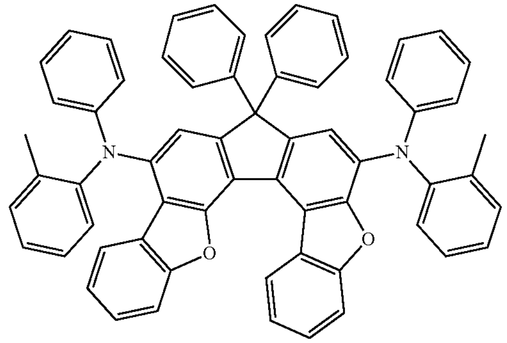

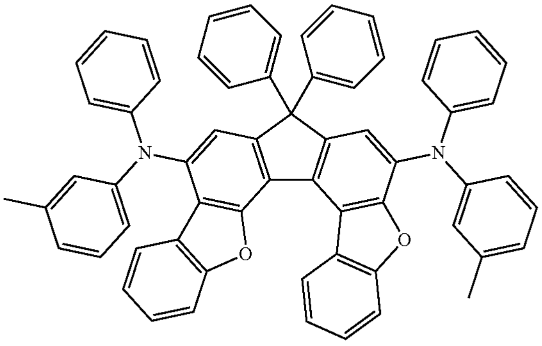

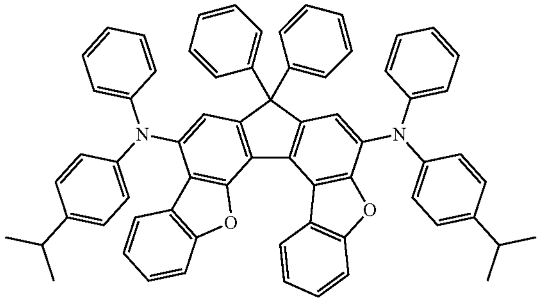

-continued
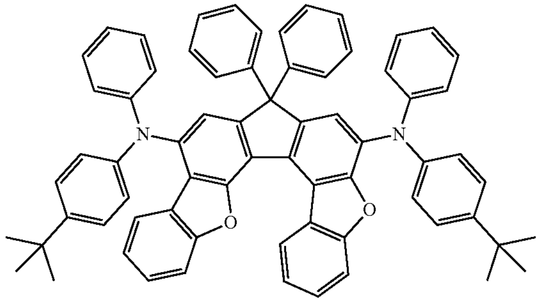
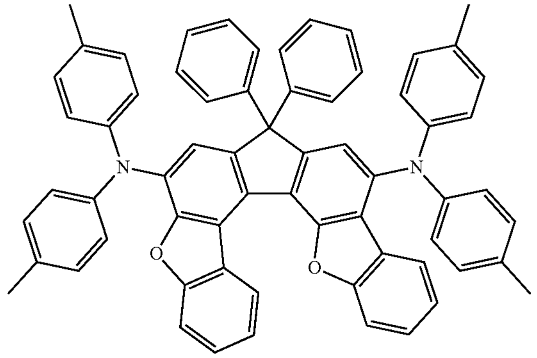
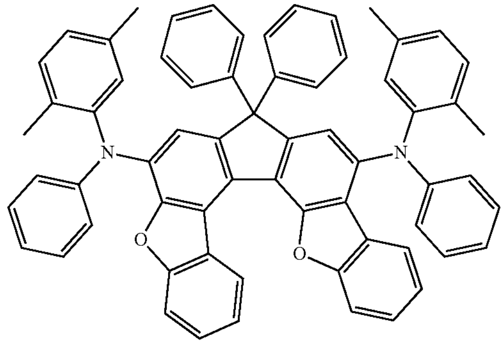
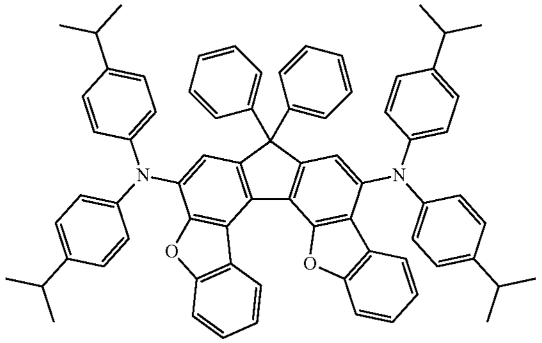
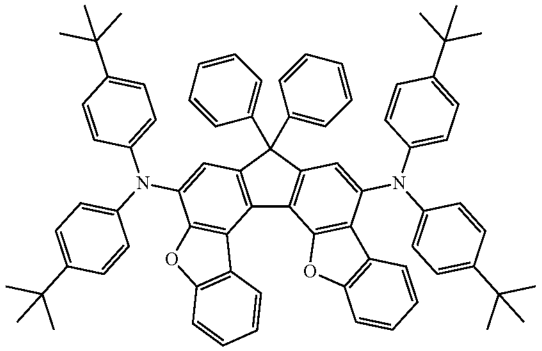
-continued
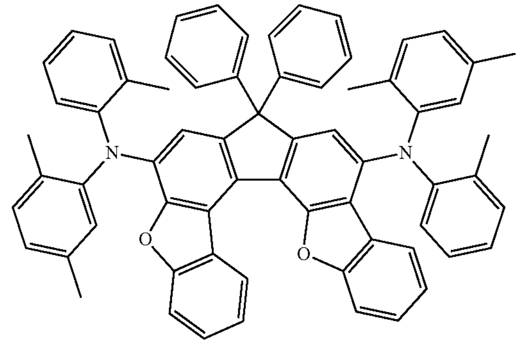
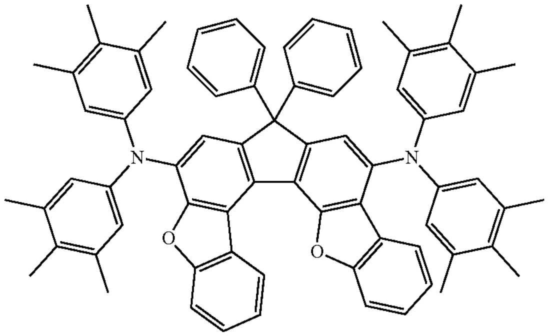
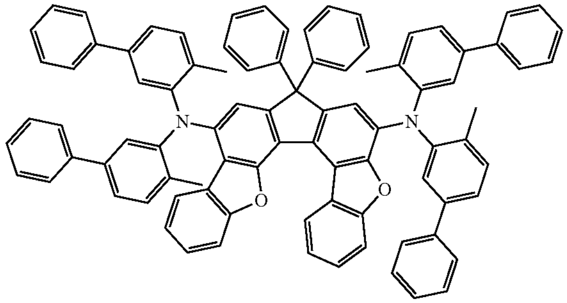
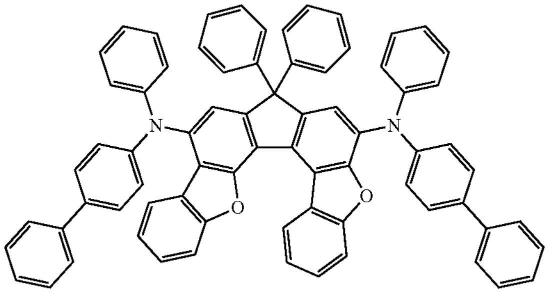
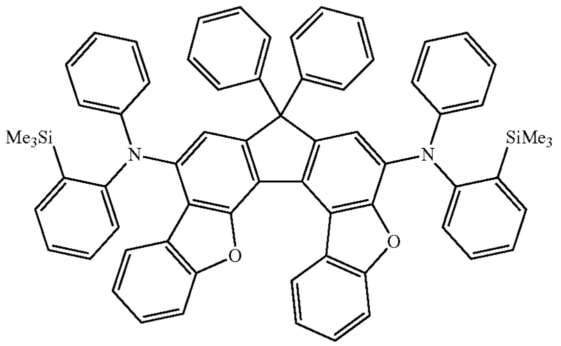

-continued
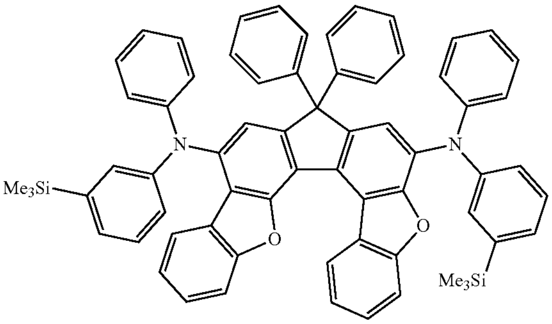
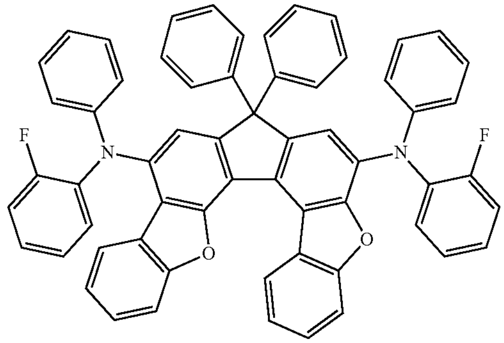
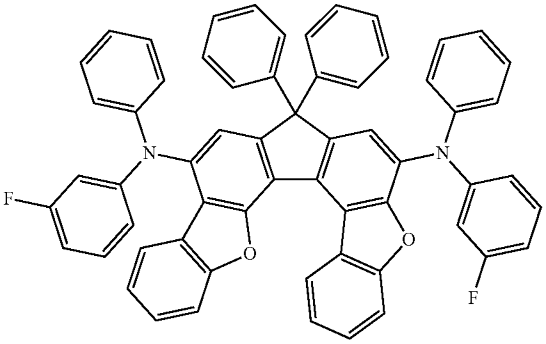
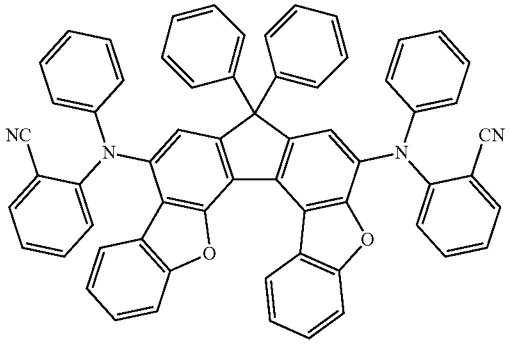
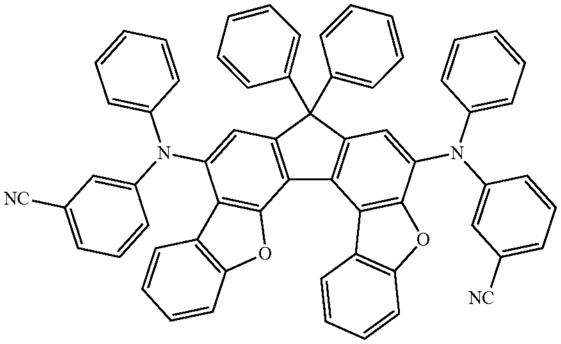
-continued
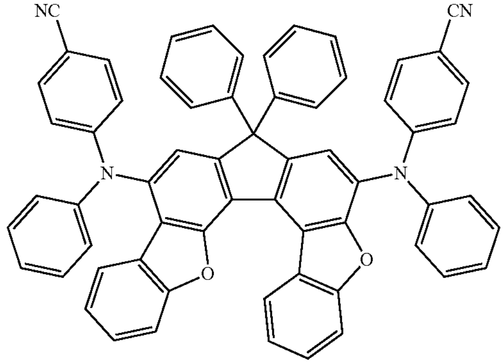
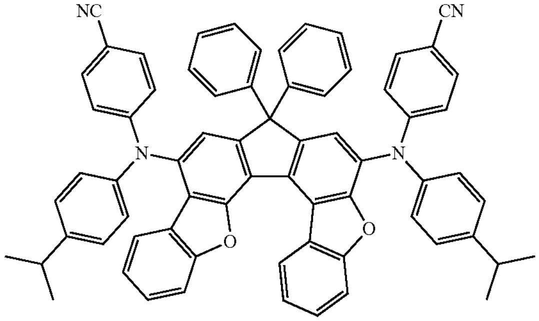
[Formula 387]
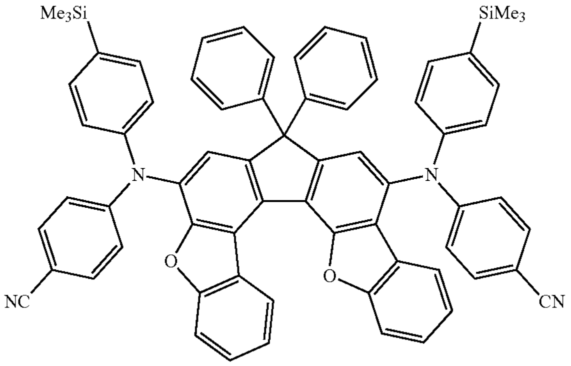
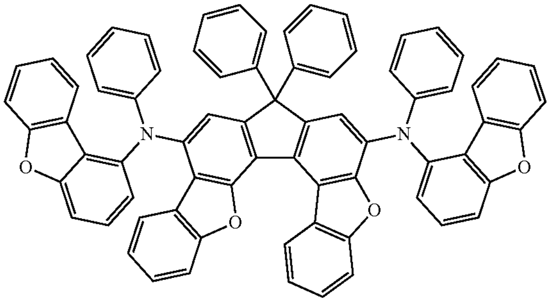
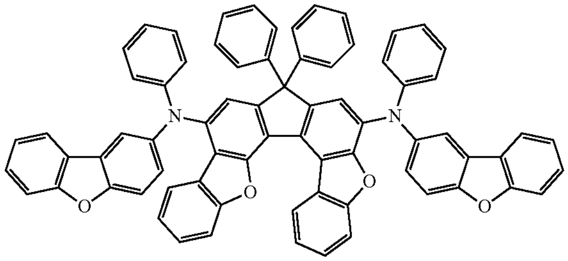

-continued
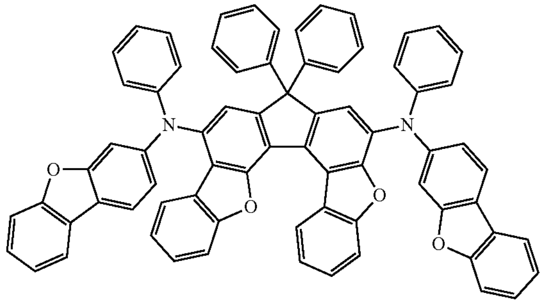
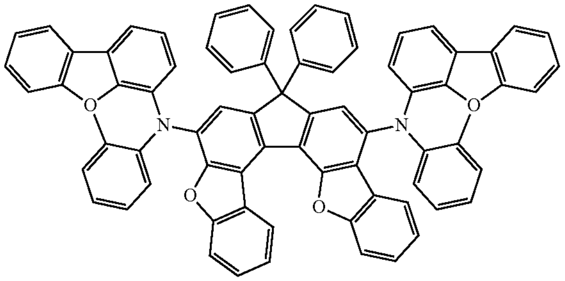
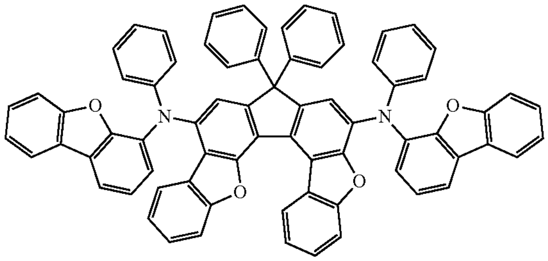
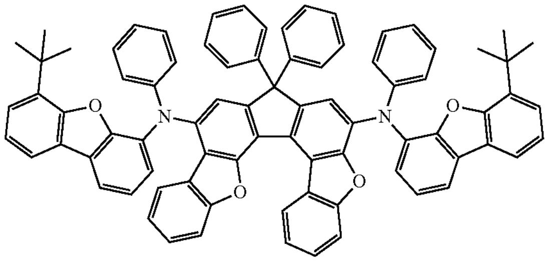
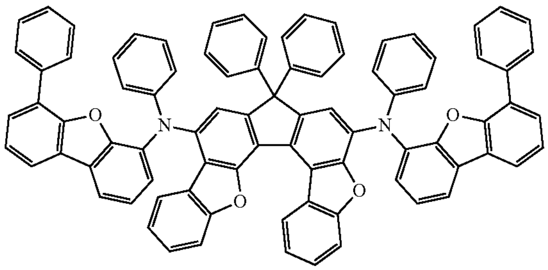
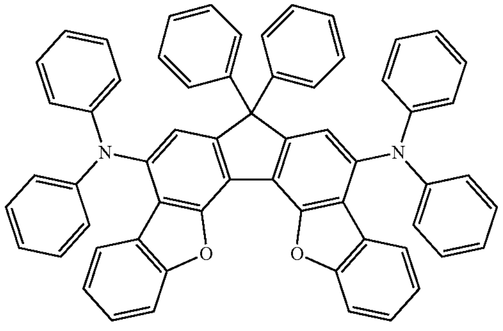
-continued
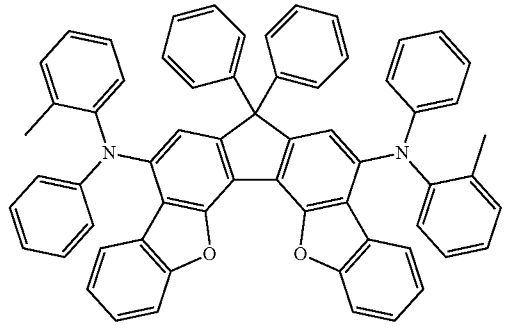
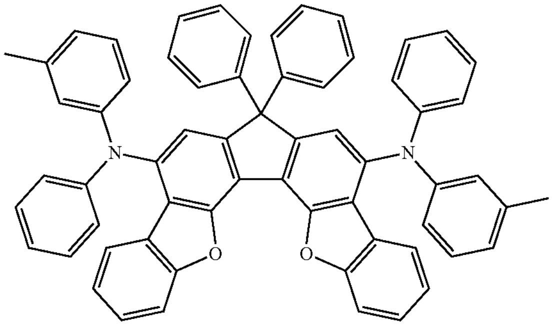
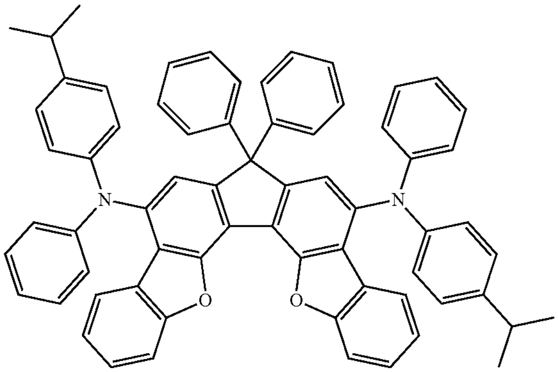
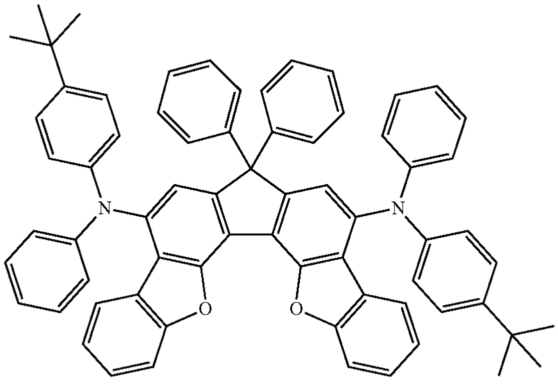

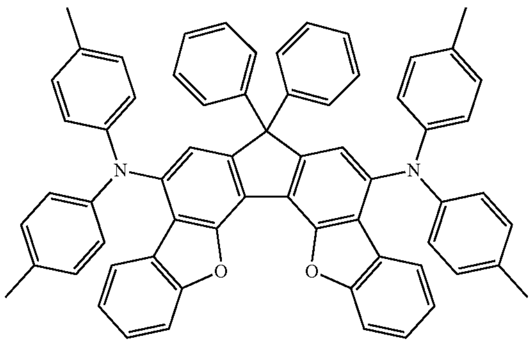
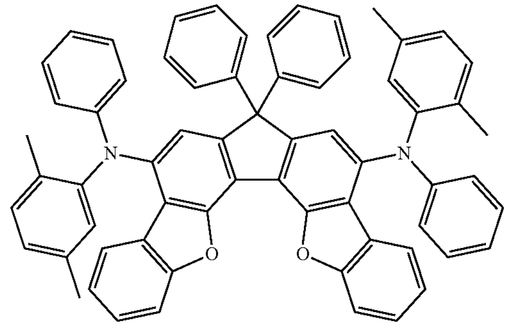
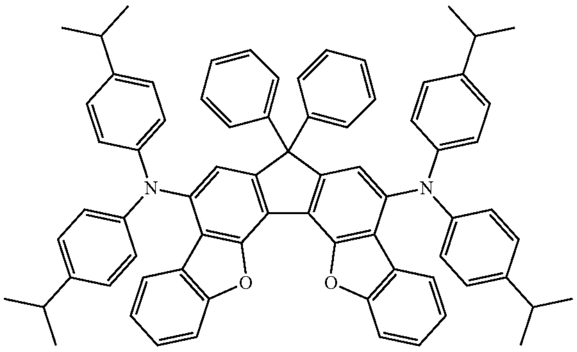
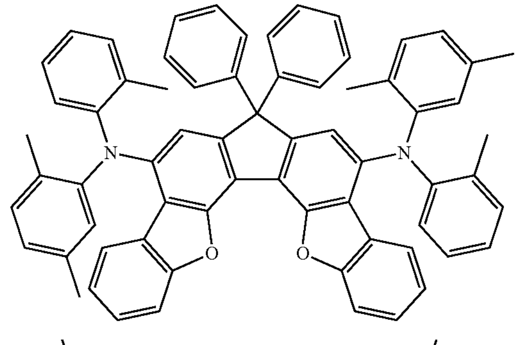
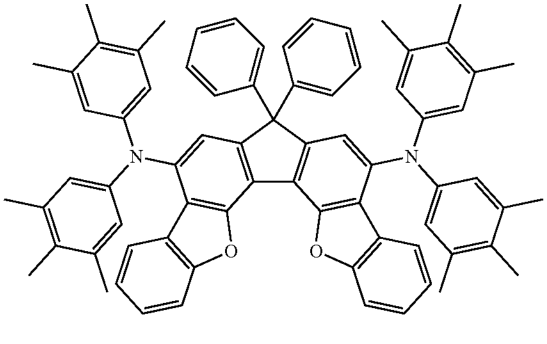
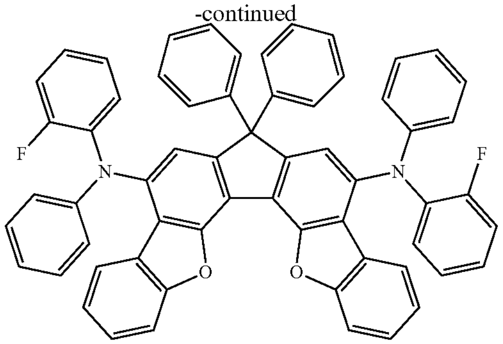
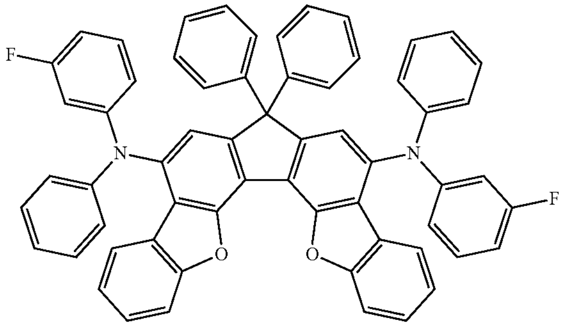
[Formula 388]
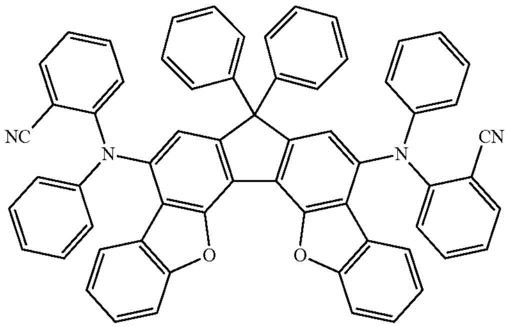
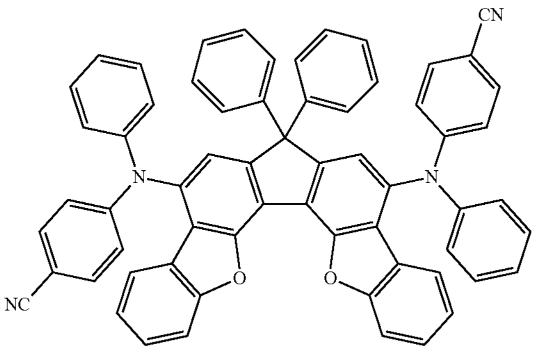
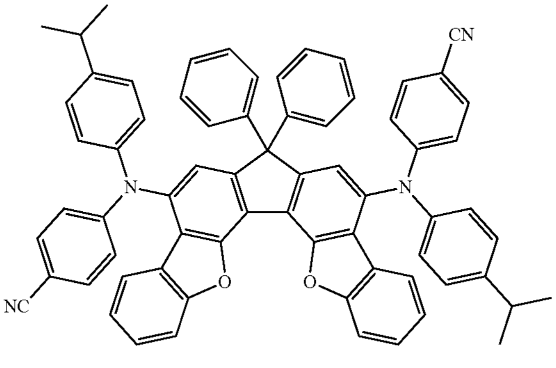

-continued
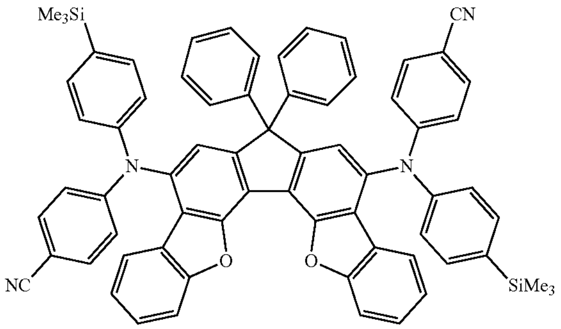
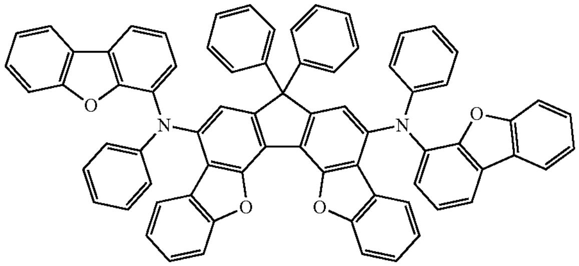
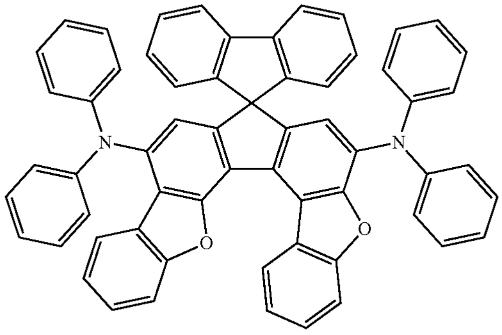
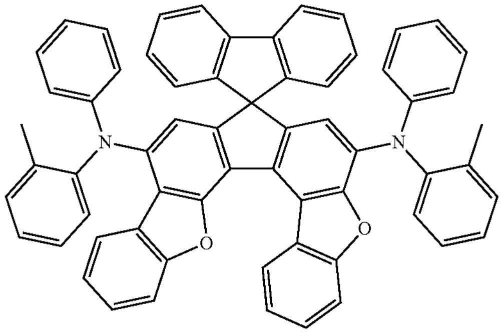
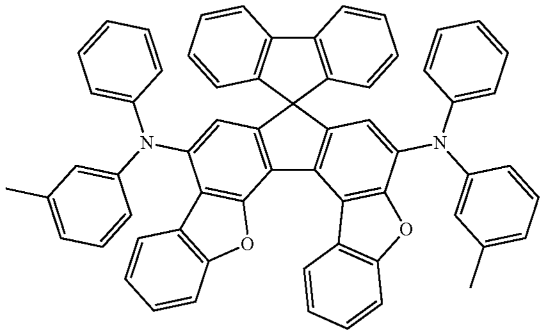
-continued
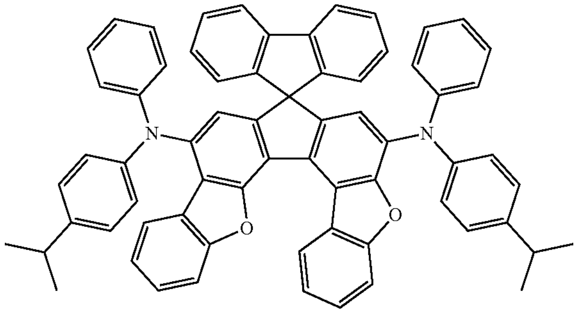
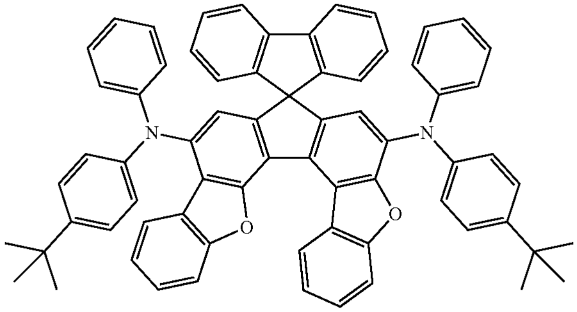
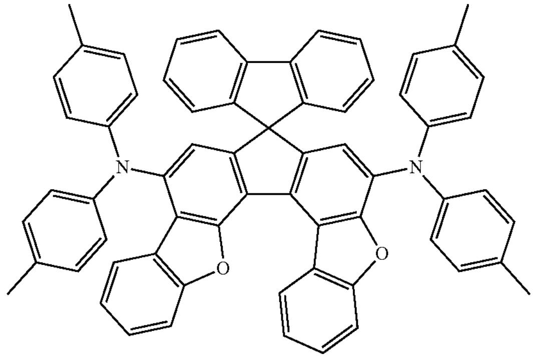
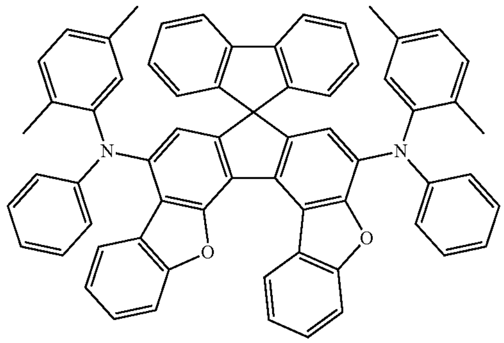
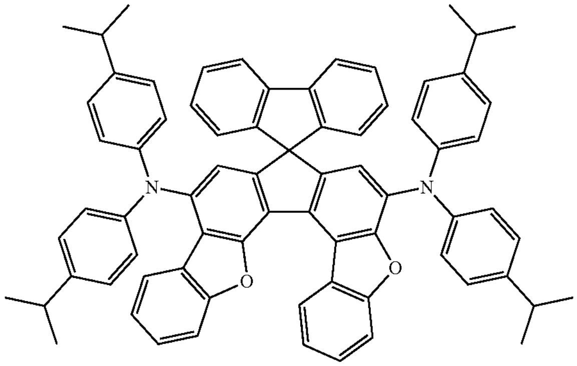

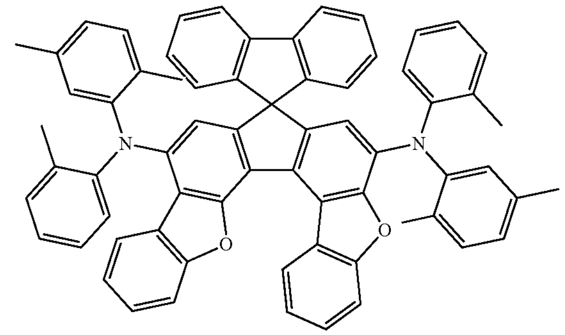
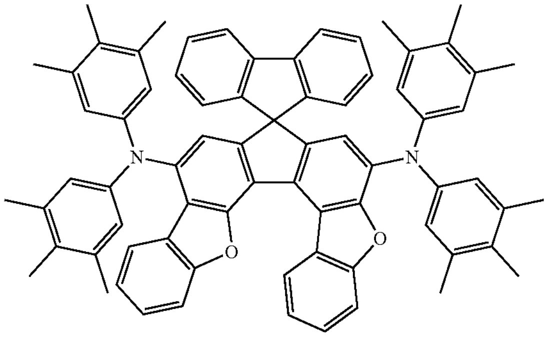
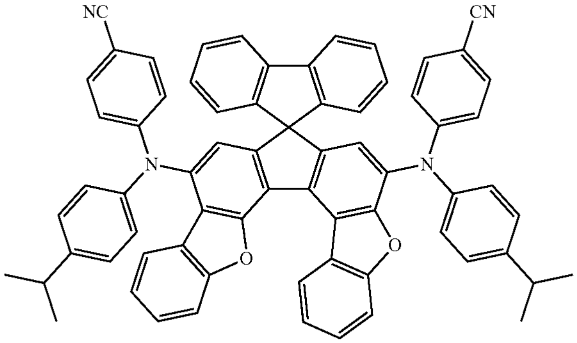
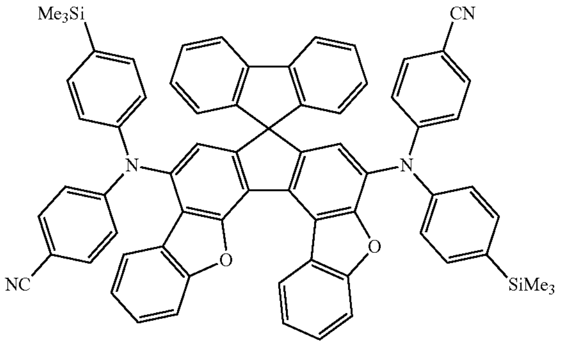
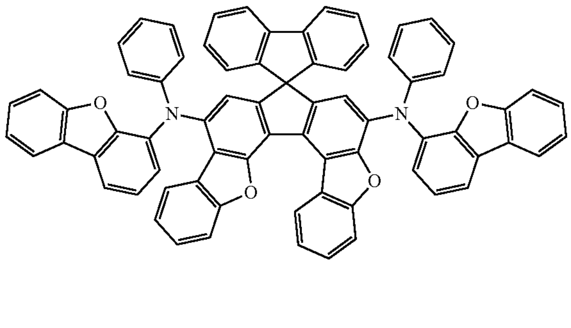
[Formula 389]
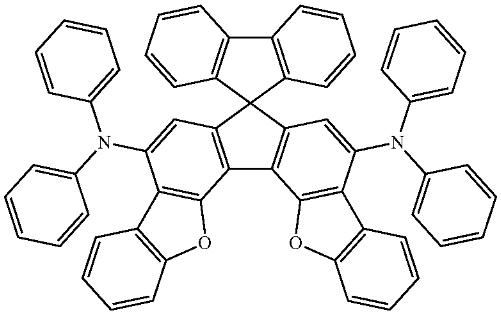
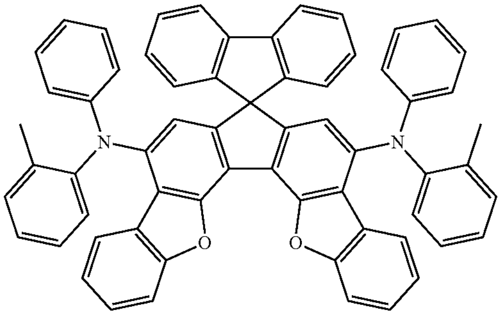
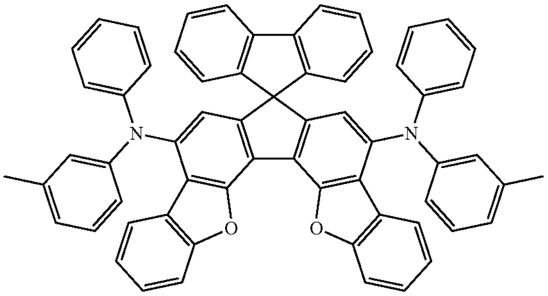
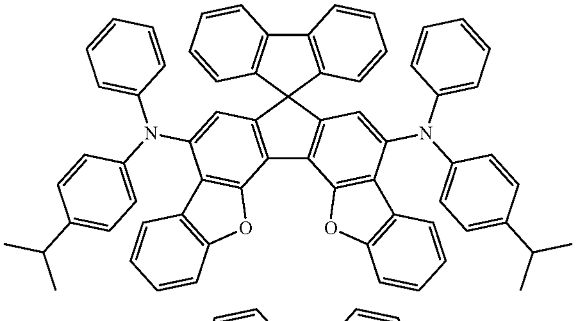
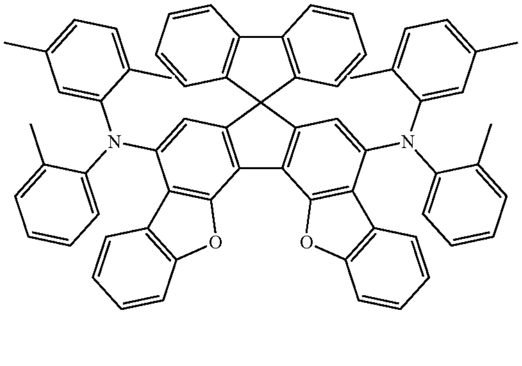

-continued

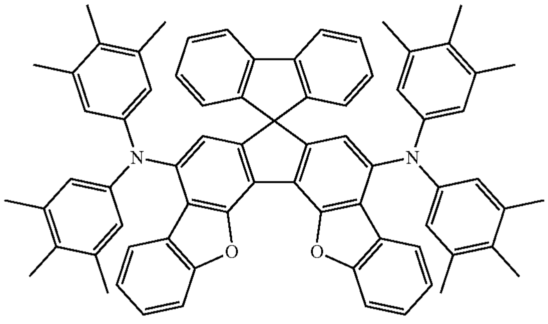

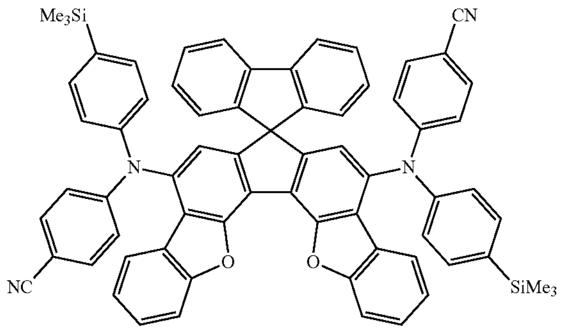

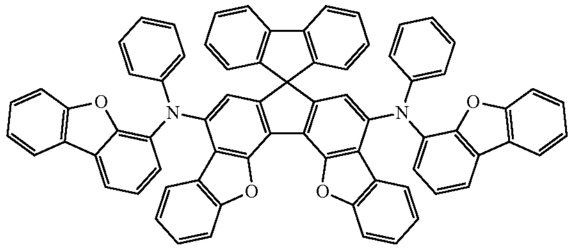

Compound Represented by Formula (10)

The compound represented by the formula (10) will be described below.

[Formula 390]

(10)

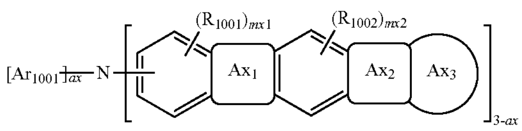

[Formula 391]

(10a)

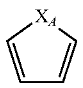

(10b)

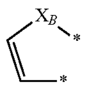

In the formula (10):

$Ax_1$ ring is a ring represented by the formula (10a) that is fused with adjacent ring(s) at any position(s);

$Ax_2$ ring is a ring represented by the formula (10b) that is fused with adjacent ring(s) at any position(s);

two * in the formula (10b) are bonded to $Ax_3$ ring at any position(s);

$X_A$ and $X_B$ are each independently $C(R_{1003})(R_{1004})$, $Si(R_{1005})(R_{1006})$, an oxygen atom or a sulfur atom;

$Ax_3$ ring is a substituted or unsubstituted aromatic hydrocarbon ring having 6 to 50 ring carbon atoms, or a substituted or unsubstituted heterocycle having 5 to 50 ring atoms;

$Ar_{1001}$ is a substituted or unsubstituted aryl group having 6 to 50 ring carbon atoms, or a substituted or unsubstituted heterocyclic group having 5 to 50 ring atoms;

$R_{1001}$ to $R_{1006}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a group represented by $—N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms;

mx1 is 3, and mx2 is 2;

a plurality of $R_{1001}$ are mutually the same or different;

a plurality of $R_{1002}$ are mutually the same or different;

ax is 0, 1, or 2;

when ax is 0 or 1, the structures enclosed by brackets indicated by "3-ax" are mutually the same or different; and when ax is 2, a plurality of $A_{1001}$ are mutually the same or different.

In an exemplary embodiment, $Ar_{1001}$ is a substituted or unsubstituted aryl group having 6 to 50 ring carbon atoms.

In an exemplary embodiment, $Ax_3$ ring is a substituted or unsubstituted aromatic hydrocarbon ring having 6 to 50 ring carbon atoms, example of which is a substituted or unsubstituted benzene ring, a substituted or unsubstituted naphthalene ring, or a substituted or unsubstituted anthracene ring.

In an exemplary embodiment, $R_{1003}$ and $R_{1004}$ are each independently a substituted or unsubstituted alkyl group having 1 to 50 carbon atoms.

In an exemplary embodiment, ax is 1.

Specific Examples of Compound Represented by Formula (10)

Specific examples of the compound represented by the formula (10) include compounds shown below.

[Formula 392]
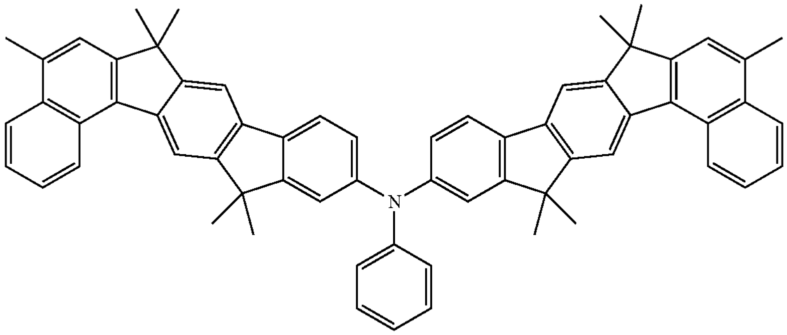
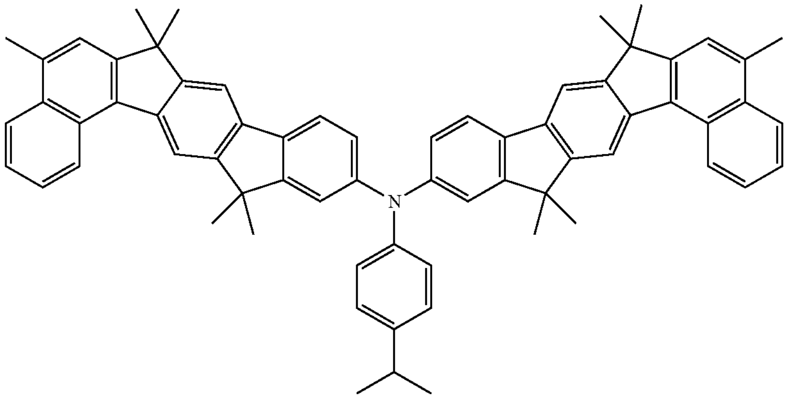
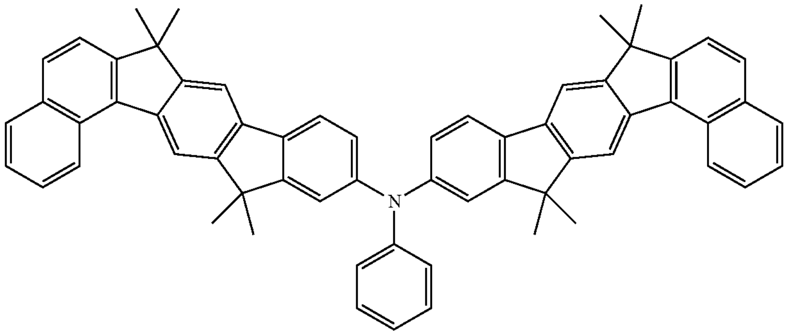
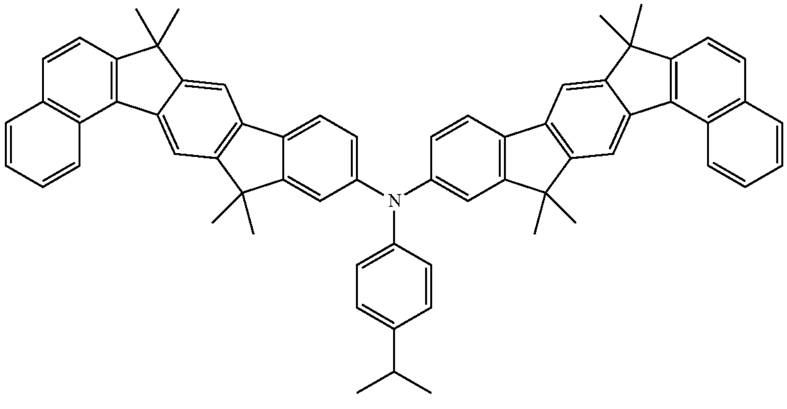

-continued
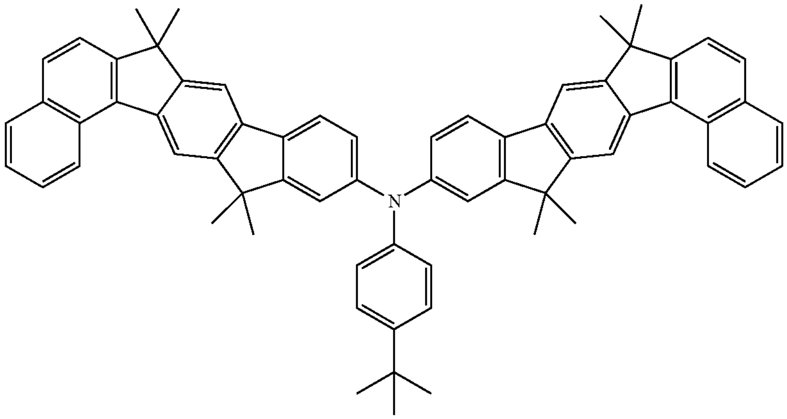
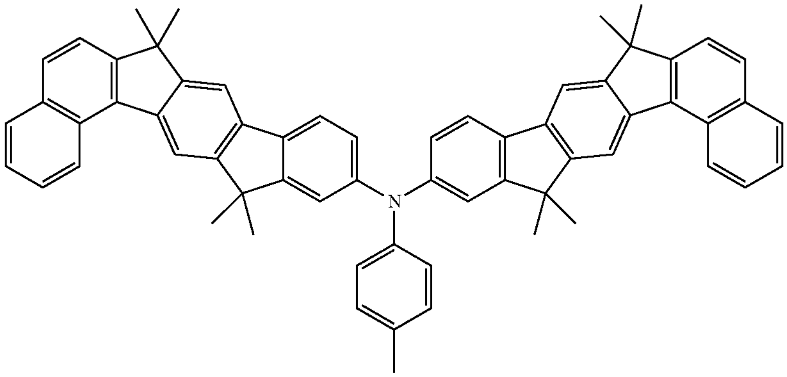
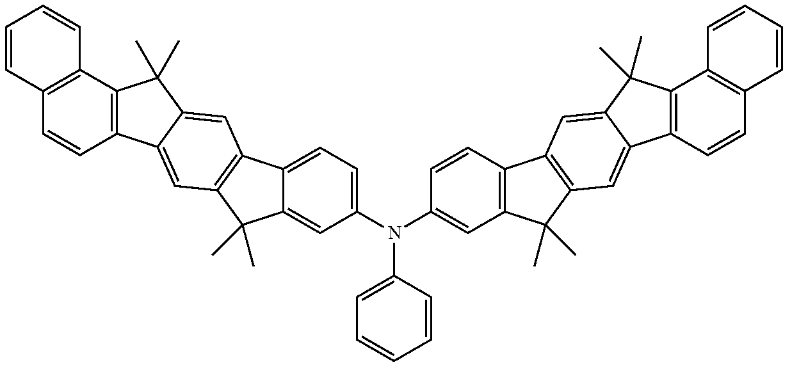
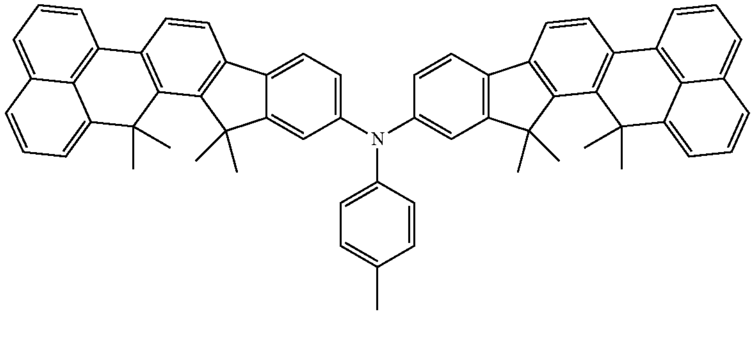

-continued
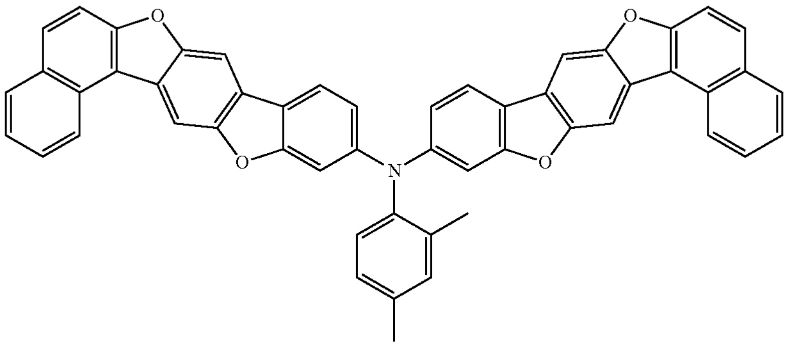
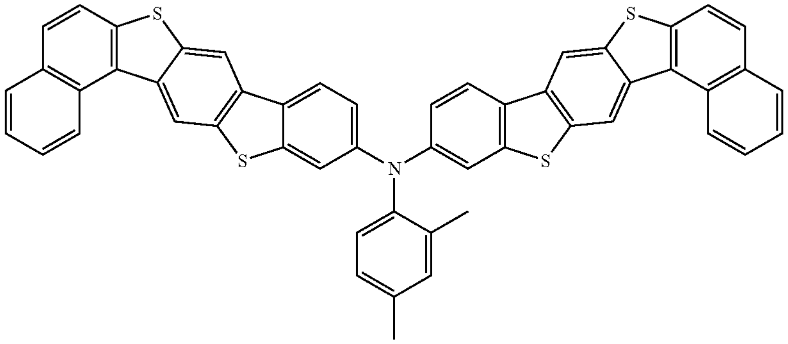
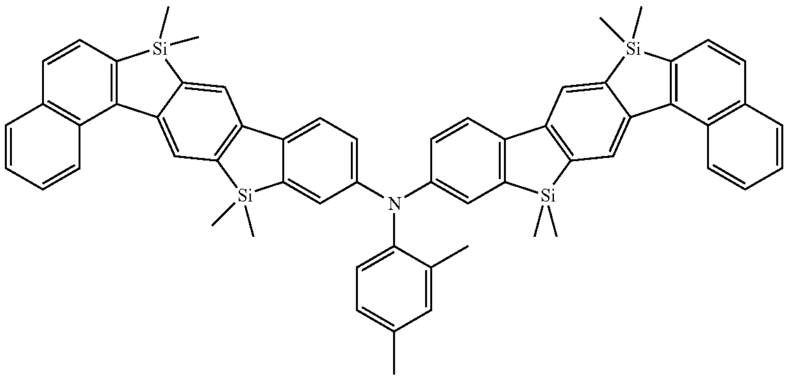

Compound Represented by Formula (50)

The compound represented by the formula (50) will be described below.

In the organic EL device in each exemplary embodiment, it is also preferable that the first emitting compound and the second emitting compound are each a compound represented by the following formula (50).

[Formula 393]

(50)

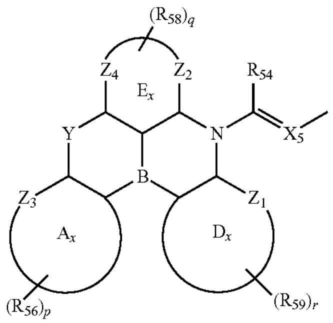

[Formula 394]

(51A)

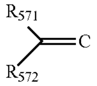

(52A)

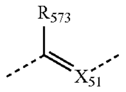

In the formula (50):

a ring Ax, a ring Dx, and a ring Ex are each independently a substituted or unsubstituted aromatic hydrocarbon ring having 6 to 50 ring carbon atoms, or a substituted or unsubstituted heterocycle having 5 to 50 ring atoms;

$X_5$ is $CR_{55}$ or a nitrogen atom;

a broken line extending from $X_5$ is a single bond bonded to $Z_1$ or a single bond bonded to $Z_2$;

$Z_1$ is a carbon atom when bonded to $X_5$ through the single bond represented by the broken line or $CR_{X9}$ or a nitrogen atom when not bonded to $X_5$ through the single bond represented by the broken line;

$Z_2$ is a carbon atom when bonded to $X_5$ through the single bond represented by the broken line or $CR_{X8}$ or a nitrogen atom when not bonded to $X_5$ through the single bond represented by the broken line;

a combination of $R_{54}$ and $R_{55}$ are mutually bonded to form a substituted or unsubstituted monocyclic ring, mutually bonded to form a substituted or unsubstituted fused ring, or not mutually bonded; and $R_{54}$ and $R_{55}$ forming neither the substituted or unsubstituted monocyclic ring nor the substituted or unsubstituted fused ring are each independently a hydrogen atom, a halogen atom, a substituted or unsubstituted alkyl group having 1 to 50 carbon atoms, a substituted or unsubstituted fluoroalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{581})(R_{582})(R_{583})$, a group represented by $—O—(R_{584})$, a group represented by $—S—(R_{585})$, a group represented by $—N(R_{586})(R_{587})$, a group represented by $—C(=O)R_{588}$, a group represented by $—COOR_{589}$, a group represented by $—C(=O)—N(R_{590})(R_{591})$, a group represented by $—P(=O)(R_{592})(R_{593})$, a cyano group, a substituted or unsubstituted aryl group having 6 to 50 ring carbon atoms, or a substituted or unsubstituted heterocyclic group having 5 to 50 ring atoms;

Y is $NR_{51}$, an oxygen atom, a sulfur atom, or $C(R_{523})(R_{524})$ or is represented by the formula (51A);

$R_{51}$ is a substituted or unsubstituted alkyl group having 1 to 50 carbon atoms, a substituted or unsubstituted fluoroalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, a substituted or unsubstituted heterocyclic group having 5 to 50 ring atoms, or a group represented by the formula (52A);

$R_{51}$ is bonded to the ring Ax, bonded to the ring Ex, or not bonded to the ring Ax and the ring Ex;

$X_{51}$ in the formula (52A) is $CR_{574}$ or a nitrogen atom;

a combination of $R_{573}$ and $R_{574}$ in the formula (52A) are mutually bonded to form a substituted or unsubstituted monocyclic ring, mutually bonded to form a substituted or unsubstituted fused ring, or not mutually bonded; and $R_{573}$ and $R_{574}$ forming neither the substituted or unsubstituted monocyclic ring nor the substituted or unsubstituted fused ring each independently represent the same as $R_{54}$ and $R_{55}$ forming neither the substituted or unsubstituted monocyclic ring nor the substituted or unsubstituted fused ring;

among the two broken lines in the formula (52A), the broken line extending from $X_{51}$ is a single bond bonded to $Z_3$ or a single bond bonded to $Z_4$, and the other broken line represents a bonding position to a nitrogen atom in the group represented by $NR_{51}$;

$Z_3$ is a carbon atom when bonded to $X_{51}$ through the single bond represented by the broken line or $CR_{X64}$ or a nitrogen atom when not bonded to $X_{51}$ through the single bond represented by the broken line;

$Z_4$ is a carbon atom when bonded to $X_{51}$ through the single bond represented by the broken line or $CR_{X84}$ or a nitrogen atom when not bonded to $X_{51}$ through the single bond represented by the broken line;

a combination of $R_{523}$ and $R_{524}$ are mutually bonded to form a substituted or unsubstituted monocyclic ring, mutually bonded to form a substituted or unsubstituted fused ring, or not mutually bonded; and $R_{523}$ and $R_{524}$ forming neither the substituted or unsubstituted monocyclic ring nor the substituted or unsubstituted fused ring, and $R_{571}$ and $R_{572}$ are each independently a hydrogen atom, a halogen atom, a substituted or unsubstituted alkyl group having 1 to 50 carbon atoms, a substituted or unsubstituted fluoroalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{981})(R_{582})(R_{583})$, a group represented by $—O—(R_{584})$, a group represented by $—S—(R_{585})$, a group represented by —$N(R_{586})(R_{587})$, a group represented by —$C({=}O)R_{588}$, a group represented by —$COOR_{589}$, a group represented by —$C({=}O)$—$N(R_{590})(R_{591})$, a group represented by —$P({=}O)(R_{592})(R_{593})$, a cyano group, a substituted or unsubstituted aryl group having 6 to 50 ring carbon atoms, or a substituted or unsubstituted heterocyclic group having 5 to 50 ring atoms;

one of $R_{571}$ and $R_{572}$ is bonded to the ring Ax or bonded to the ring Ex, or both of $R_{571}$ and $R_{572}$ are not bonded to the ring Ax and the ring Ex;

q is 0 or 1;

p and r are each independently 0, 1, 2, or 3;

at least one combination of a combination of adjacent two or more of a plurality of $R_{56}$, a combination of adjacent two or more of a plurality of $R_{58}$, a combination of adjacent two or more of a plurality of $R_{59}$, a combination of $R_{X6A}$ and $R_{56}$ adjacent to $R_{X6A}$, a combination of $R_{X9}$ and $R_{59}$ adjacent to $R_{X9}$, a combination of $R_{X8}$ and $R_{58}$ adjacent to $R_{X8}$, and a combination of $R_{X8A}$ and $R_{58}$ adjacent to $R_{X8A}$ are mutually bonded to form a substituted or unsubstituted monocyclic ring, mutually bonded to form a substituted or unsubstituted fused ring, or not mutually bonded; and $R_{56}$, $R_{58}$, $R_{59}$, $R_{X6A}$, $R_{X8A}$, $R_{X8}$, and $R_{X9}$ forming neither the substituted or unsubstituted monocyclic ring nor the substituted or unsubstituted fused ring are each independently a hydrogen atom, a halogen atom, a substituted or unsubstituted alkyl group having 1 to 50 carbon atoms, a substituted or unsubstituted fluoroalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{581})(R_{582})(R_{583})$, a group represented by —O—$(R_{584})$, a group represented by —S—$(R_{585})$, a group represented by —$N(R_{586})(R_{587})$, a group represented by —$C({=}O)R_{588}$, a group represented by —$COOR_{589}$, a group represented by —$C({=}O)$—$N(R_{590})(R_{591})$, a group represented by —$P({=}O)(R_{592})(R_{593})$, a cyano group, a substituted or unsubstituted aryl group having 6 to 50 ring carbon atoms, or a substituted or unsubstituted heterocyclic group having 5 to 50 ring atoms.

In the compound represented by the formula (50): $R_{581}$ to $R_{593}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{581}$ are present, the plurality of $R_{581}$ are mutually the same or different;

when a plurality of $R_{582}$ are present, the plurality of $R_{582}$ are mutually the same or different;

when a plurality of $R_{583}$ are present, the plurality of $R_{583}$ are mutually the same or different;

when a plurality of $R_{584}$ are present, the plurality of $R_{584}$ are mutually the same or different;

when a plurality of $R_{585}$ are present, the plurality of $R_{585}$ are mutually the same or different;

when a plurality of $R_{586}$ are present, the plurality of $R_{586}$ are mutually the same or different;

when a plurality of $R_{587}$ are present, the plurality of $R_{587}$ are mutually the same or different;

when a plurality of $R_{588}$ are present, the plurality of $R_{588}$ are mutually the same or different;

when a plurality of $R_{589}$ are present, the plurality of $R_{589}$ are mutually the same or different;

when a plurality of $R_{590}$ are present, the plurality of $R_{590}$ are mutually the same or different;

when a plurality of $R_{591}$ are present, the plurality of $R_{591}$ are mutually the same or different;

when a plurality of $R_{592}$ are present, the plurality of $R_{592}$ are mutually the same or different; and when a plurality of $R_{593}$ are present, the plurality of $R_{593}$ are mutually the same or different.

In the formula (50), it is also preferable that the ring Ax, the ring Dx, and the ring Ex are each independently a substituted or unsubstituted aromatic hydrocarbon ring having 6 to 30 ring carbon atoms, or a substituted or unsubstituted heterocycle having 5 to 30 ring atoms.

In formula (50), it is also preferable that a combination of $R_{54}$ and $R_{55}$ form a substituted or unsubstituted aliphatic ring.

It is also preferable that the compound represented by the formula (50) is a compound represented by the following formula (53).

[Formula 395]

(53)

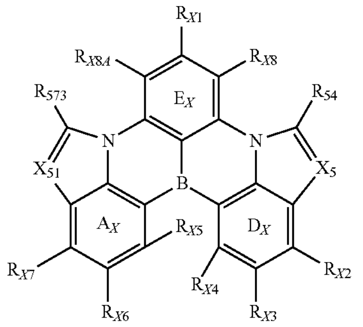

In the formula (53):

at least one combination of a combination of $R_{X1}$ and $R_{X8A}$, a combination of $R_{X1}$ and $R_{X8}$, a combination of $R_{X2}$ and $R_{X3}$, a combination of $R_{X3}$ and $R_{X4}$, a combination of $R_{X5}$ and $R_{X6}$, and a combination of $R_{X6}$ and $R_{X7}$ are mutually bonded to form a substituted or unsubstituted monocyclic ring, mutually bonded to form a substituted or unsubstituted fused ring, or not mutually bonded; and $R_{X1}$, $R_{X2}$, $R_{X3}$, $R_{X4}$, $R_{X5}$, $R_{X6}$, $R_{X7}$, $R_{X8A}$, and $R_{X8}$ forming neither the substituted or unsubstituted monocyclic ring nor the substituted or unsubstituted fused ring are each independently a hydrogen atom, a halogen atom, a substituted or unsubstituted alkyl group having 1 to 50 carbon atoms, a substituted or unsubstituted fluoroalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{581})(R_{582})(R_{583})$, a group represented by —O—$(R_{584})$, a group represented by —S—$(R_{585})$, a group represented by —$N(R_{586})(R_{587})$, a group represented by —$C({=}O)R_{588}$, a group represented by —$COOR_{589}$, a group represented by —$C({=}O)$—$N(R_{590})(R_{591})$, a group represented by —P(═O)($R_{592}$)($R_{593}$), a cyano group, a substituted or unsubstituted aryl group having 6 to 50 ring carbon atoms, or a substituted or unsubstituted heterocyclic group having 5 to 50 ring atoms;

$X_5$ represents the same as $X_5$ in the formula (50);

$R_{54}$ represents the same as $R_{54}$ in the formula (50);

$X_{51}$ represents the same as $X_{51}$ in the formula (52A); and $R_{573}$ represents the same as $R_{573}$ in the formula (52A).

It is also preferable that the compound represented by the formula (50) is a compound represented by the following formula (531).

[Formula 396]

(531)

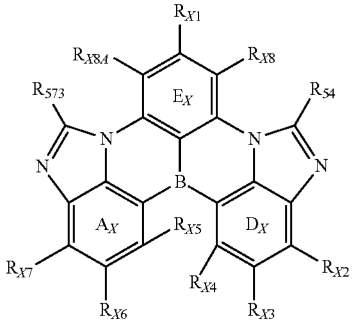

In the formula (531):

$R_{X1}$, $R_{X2}$, $R_{X3}$, $R_{X4}$, $R_{X5}$, $R_{X6}$, $R_{X7}$, $R_{X8A}$, and $R_{X8}$ each independently represent the same as $R_{X1}$, $R_{X2}$, $R_{X3}$, $R_{X4}$, $R_{X5}$, $R_{X6}$, $R_{X7}$, $R_{X8A}$, and $R_{X8}$ in the formula (53);

$R_{54}$ represents the same as $R_{54}$ in the formula (50); and $R_{573}$ represents the same as $R_{573}$ in the formula (52A).

In the formula (531):

it is also preferable that at least one combination of a combination of $R_{X1}$ and $R_{X8A}$, a combination of $R_{X1}$ and $R_{X8}$, a combination of $R_{X2}$ and $R_{X3}$, a combination of $R_{X3}$ and $R_{X4}$, a combination of $R_{X5}$ and $R_{X6}$, and a combination of $R_{X6}$ and $R_{X7}$ form a ring structure represented by the following formula (532) or a ring structure represented by the following formula (533).

[Formula 397]

(532)

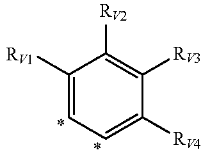

(533)

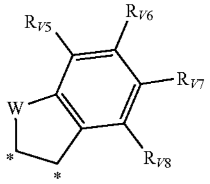

In the formulae (532) and (533):

$R_{V1}$ to $R_{V8}$ are each independently a hydrogen atom, a substituted or unsubstituted alkyl group having 1 to 25 carbon atoms (preferably a substituted or unsubstituted alkyl group having 1 to 8 carbon atoms and more preferably a substituted or unsubstituted alkyl group having 1 to 4 carbon atoms), or a substituted or unsubstituted aryl group having 6 to 30 ring carbon atoms (preferably a substituted or unsubstituted aryl group having 6 to 10 ring carbon atoms and more preferably a substituted or unsubstituted aryl group having 6 ring carbon atoms);

W is C($R_{V9}$)($R_{V10}$), an oxygen atom, a sulfur atom, or $NR_{V11}$;

$R_{V9}$ and $R_{V10}$ are each independently a substituted or unsubstituted alkyl group having 1 to 25 carbon atoms (preferably a substituted or unsubstituted alkyl group having 1 to 8 carbon atoms and more preferably a substituted or unsubstituted alkyl group having 1 to 4 carbon atoms);

$R_{V11}$ is a substituted or unsubstituted alkyl group having 1 to 25 carbon atoms (preferably a substituted or unsubstituted alkyl group having 1 to 8 carbon atoms and more preferably a substituted or unsubstituted alkyl group having 1 to 4 carbon atoms) or a substituted or unsubstituted aryl group having 6 to 30 ring carbon atoms (preferably a substituted or unsubstituted aryl group having 6 to 10 ring carbon atoms and more preferably a substituted or unsubstituted aryl group having 6 ring carbon atoms); and each * represents a bonding position to the ring Ax, the ring Dx, or the ring Ex.

In the formula (531), it is preferable that $R_{54}$ and $R_{573}$ are each independently a methyl group, a tert-butyl group, —$CF_3$, an unsubstituted phenyl group, a p-tert-butylphenyl group, a xylyl group, or a mesityl group.

In the formula (531), it is preferable that $R_{X2}$, $R_{X3}$, $R_{X6}$, and $R_{X7}$ are each independently a hydrogen atom, a methyl group, an ethyl group, an isopropyl group, a sec-propyl group, a n-butyl group, a tert-butyl group, —$C(Me)_2C_2H_5$, an unsubstituted phenyl group, a p-tert-butylphenyl group, a mesityl group, a xylyl group, an o-methylphenyl group, or a substituted or unsubstituted biphenyl group (preferably an unsubstituted biphenyl group).

In the formula (531), it is preferable that $R_{X1}$, $R_{X8A}$, and $R_{X8}$ are each independently a hydrogen atom, a methyl group, an ethyl group, a n-butyl group, an unsubstituted phenyl group, an —O-phenyl group, —$NPh_2$, an N-carbazolyl group, or —N($C_6$H5tBu)$_2$.

Ph represents an unsubstituted phenyl group, and $^t$Bu represents a tert-butyl group.

In the formula (531), $R_{X4}$ and $R_{X5}$ are each preferably a hydrogen atom.

In the formula (531), $R_{X4}$, $R_{X5}$, $R_{X8A}$, and $R_{X8}$ are each preferably a hydrogen atom.

It is also preferable that the compound represented by the formula (50) is a compound represented by the following formula (534).

[Formula 398]

(534)

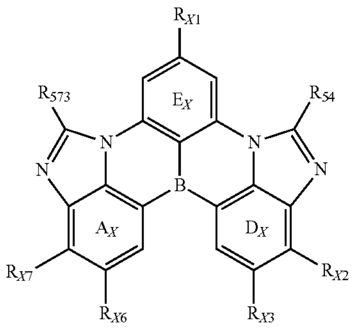

In the formula (534): $R_{X1}$, $R_{X2}$, $R_{X3}$, $R_{X6}$, and $R_{X7}$ each independently represent the same as $R_{X1}$, $R_{X2}$, $R_{X3}$, $R_{X6}$, and $R_{X7}$ in the formula (53); $R_{54}$ represents the same as $R_{54}$ in the formula (50); and $R_{573}$ represents the same as $R_{573}$ in the formula (52A).

In the compound represented by the formula (50), it is preferable that $R_{581}$ to $R_{593}$ are each independently a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

Specific Examples of Compound Represented by Formula (50)

Specific examples of the compound represented by the formula (50) include compounds shown below.

[Formula 399]

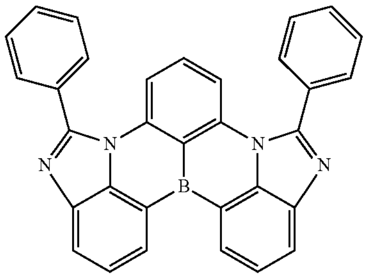

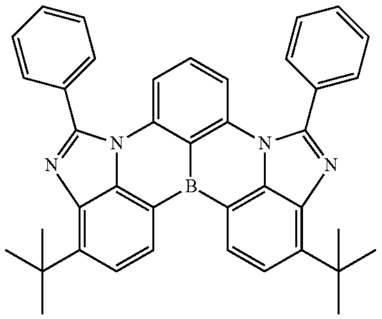

-continued

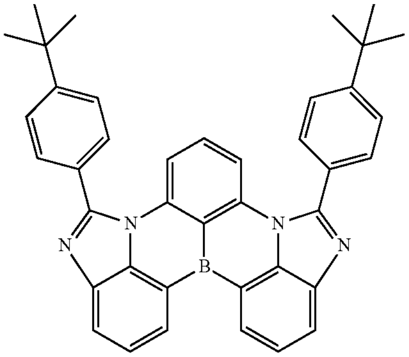

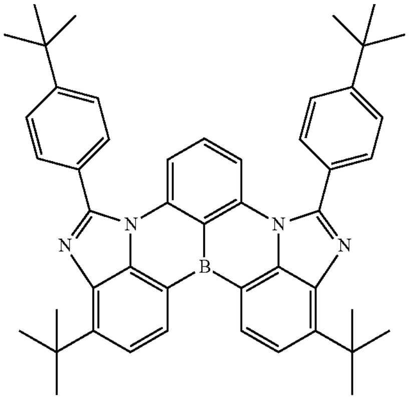

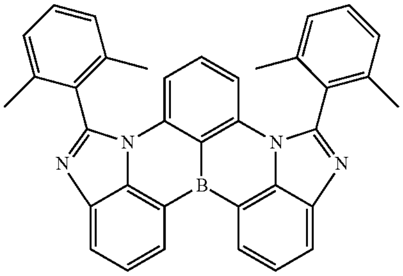

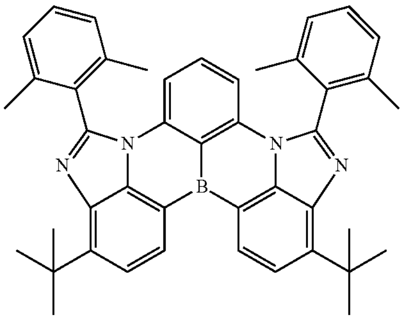

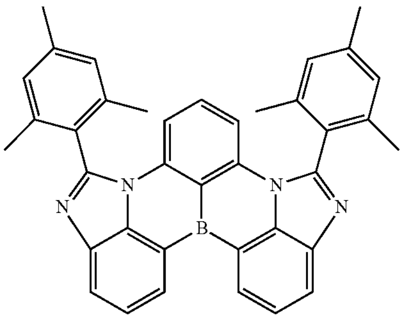

-continued
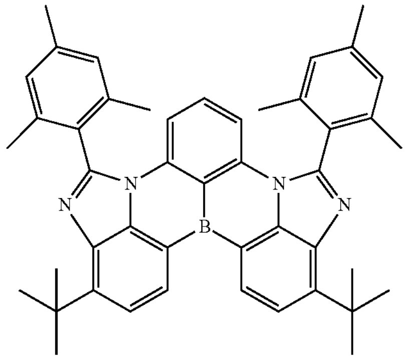
[Formula 400]
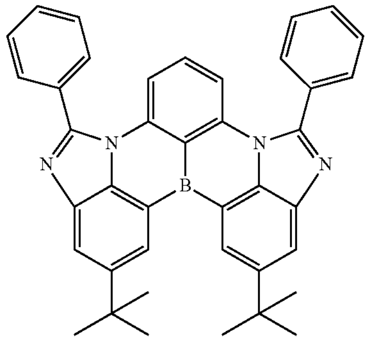
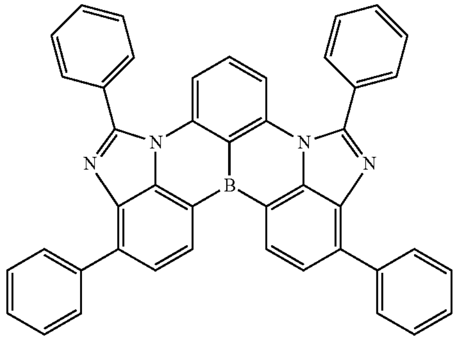
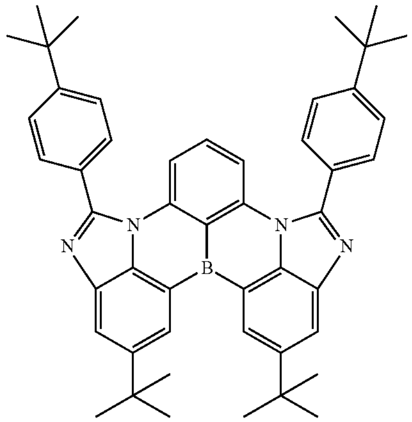
-continued
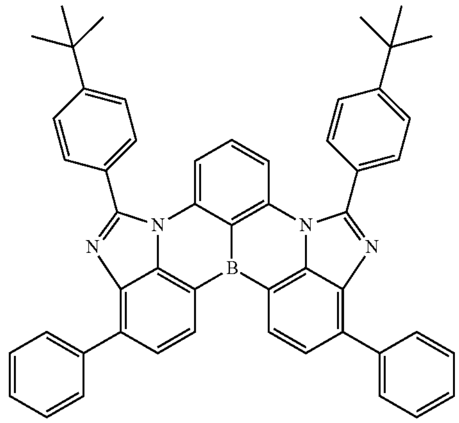
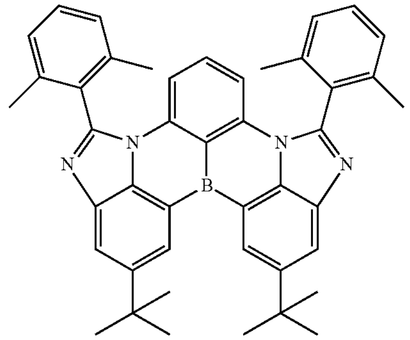
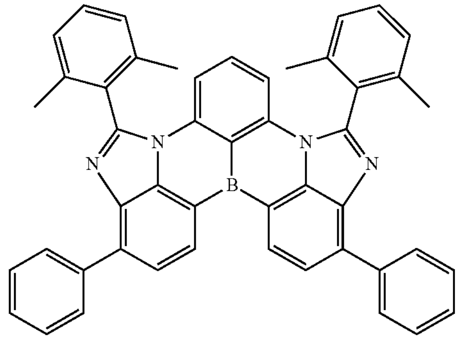
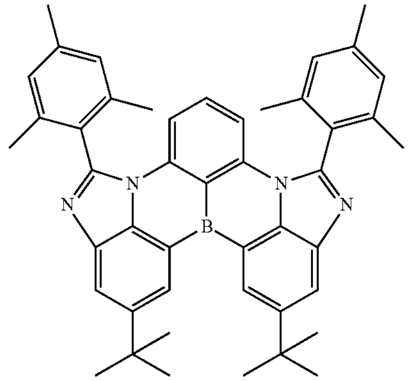

-continued
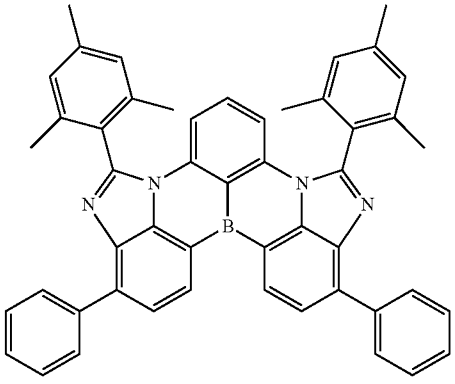
[Formula 401]
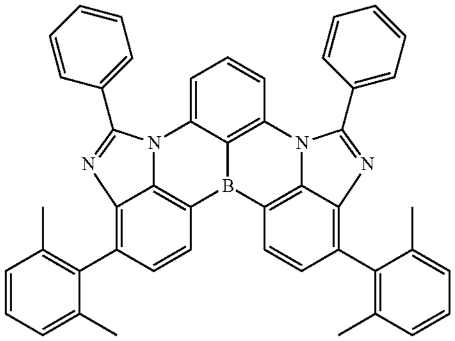
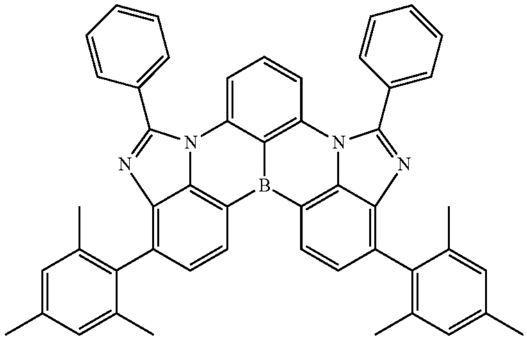
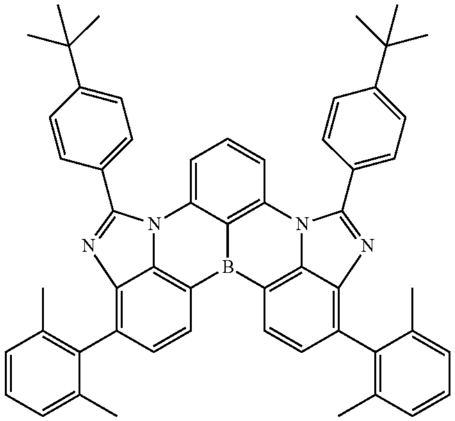
-continued
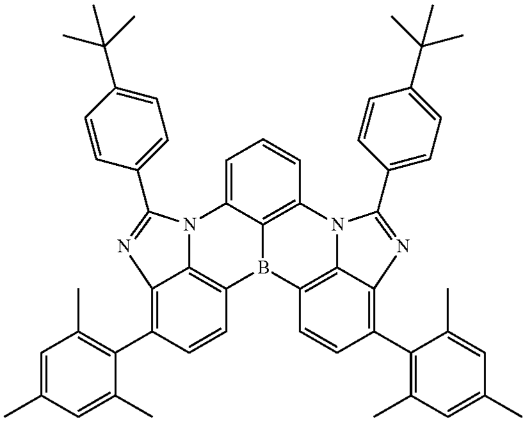
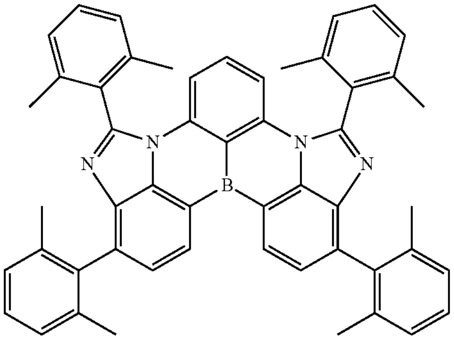
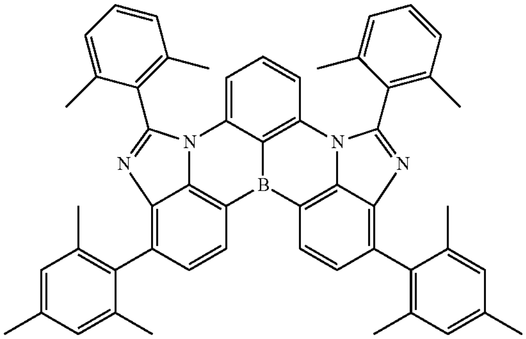
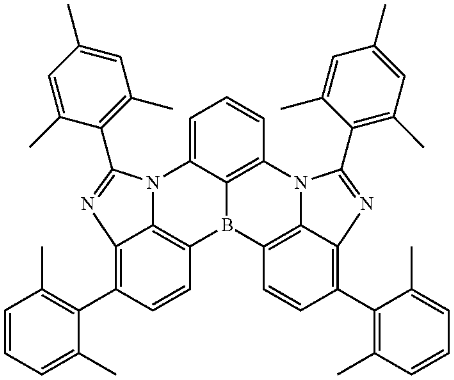

-continued
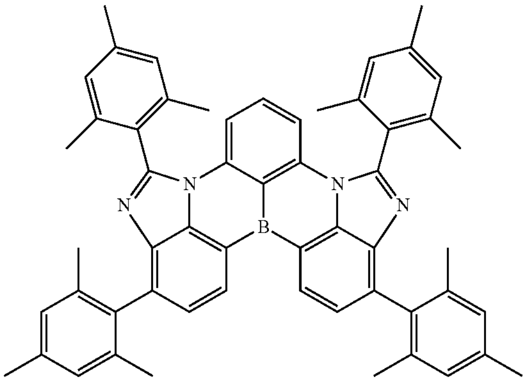
[Formula 402]
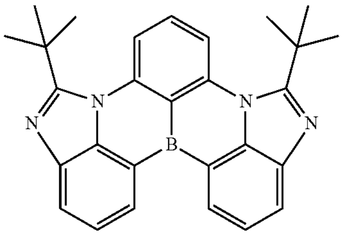
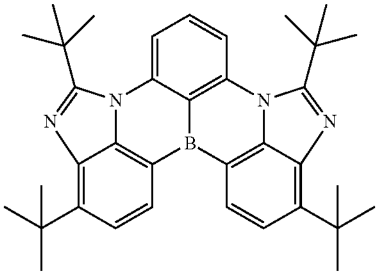
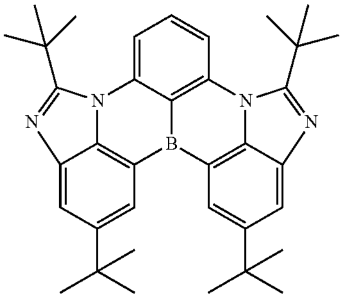
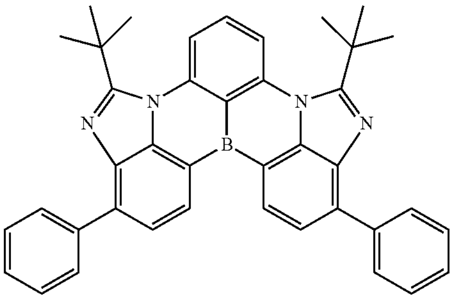
-continued
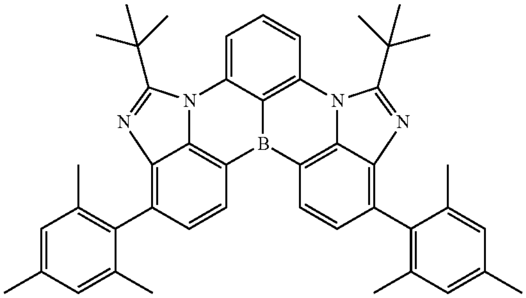
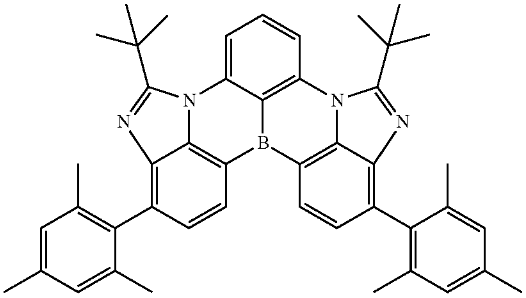
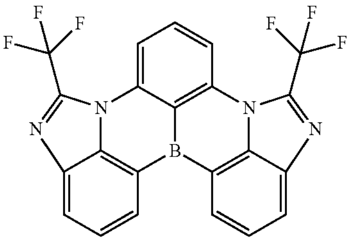
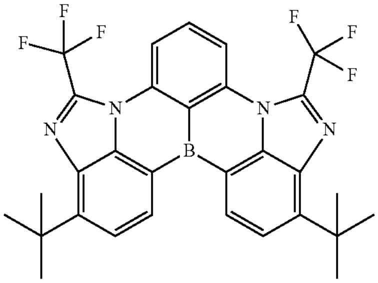
[Formula 403]
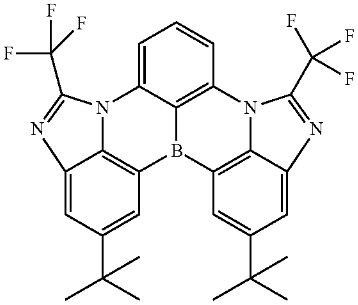
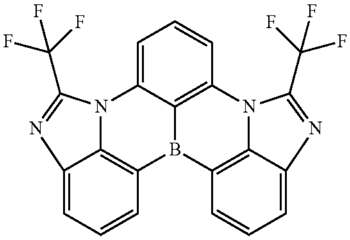

-continued
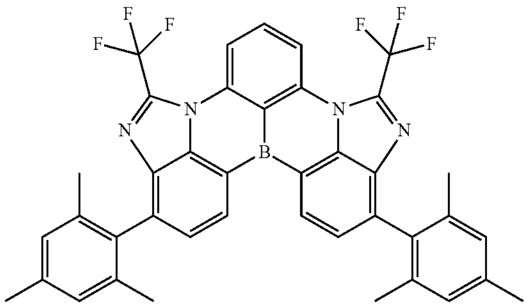
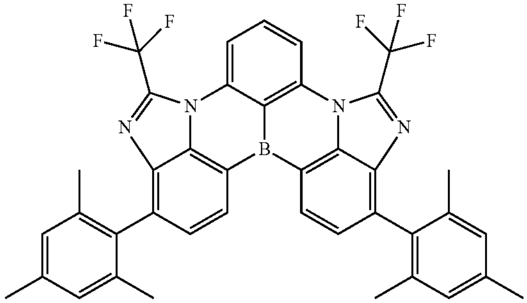
[Formula 404]
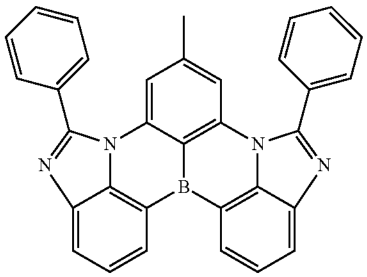
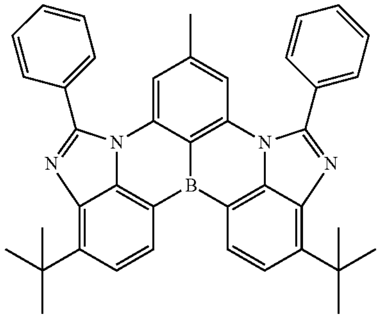
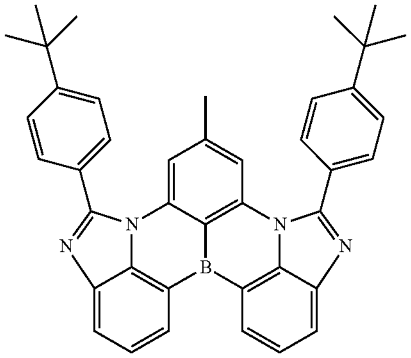
-continued
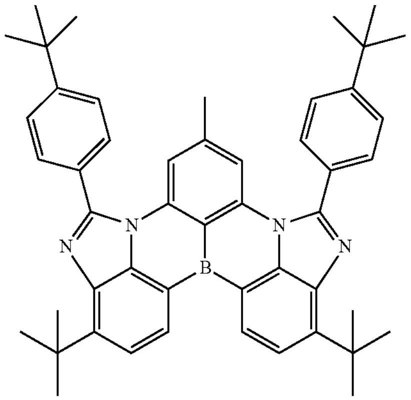
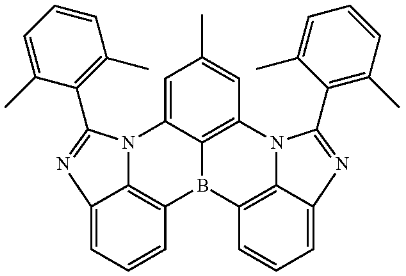
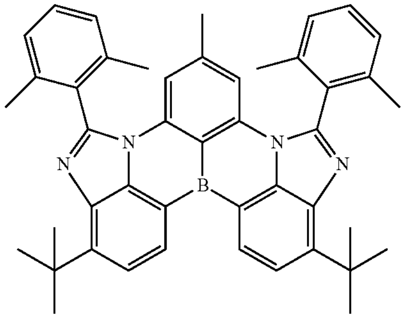
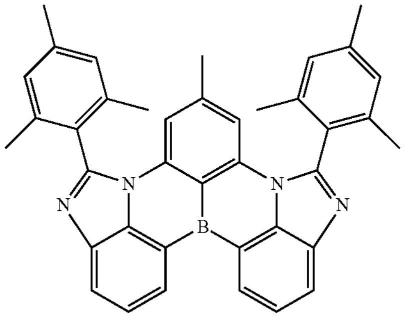
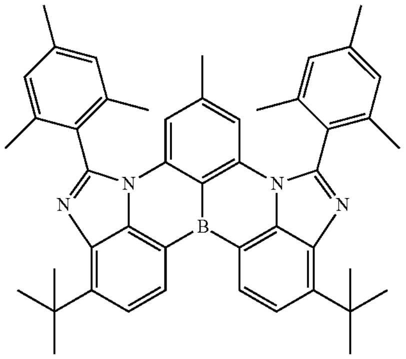

-continued
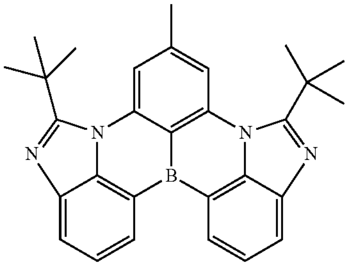
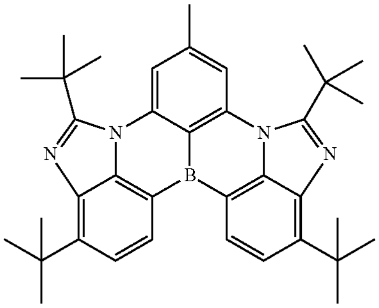
[Formula 405]
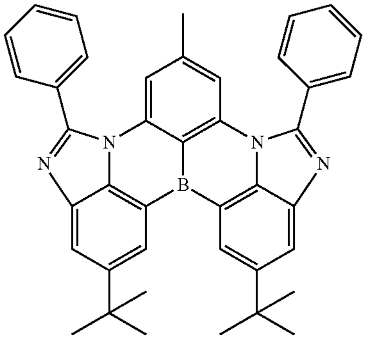
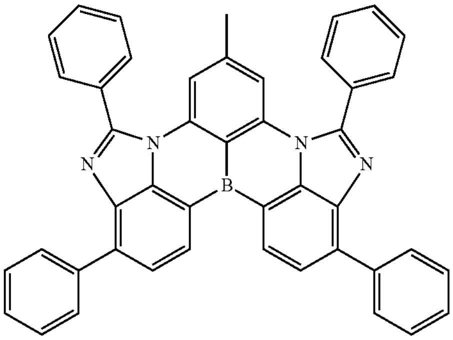
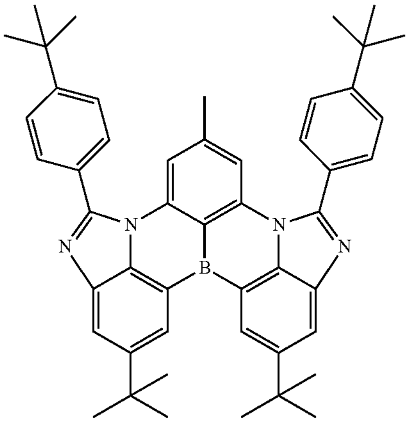
-continued
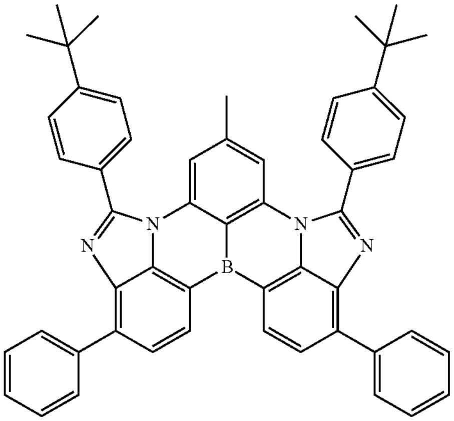
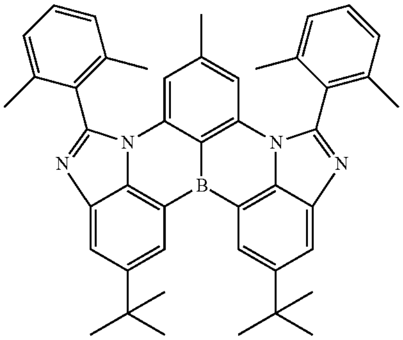
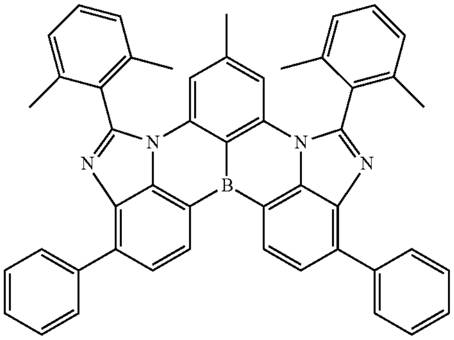
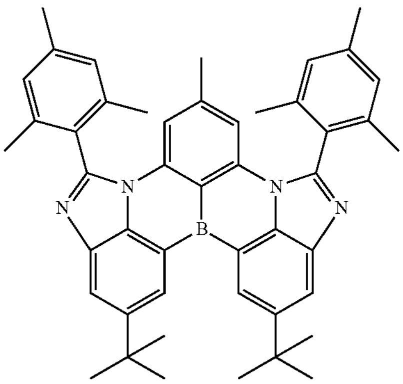

-continued
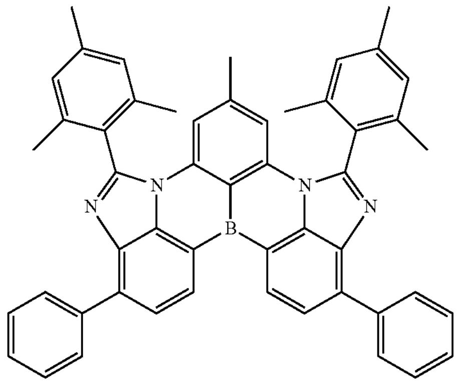
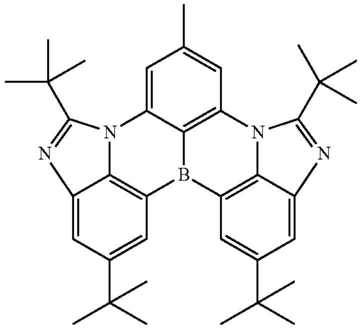
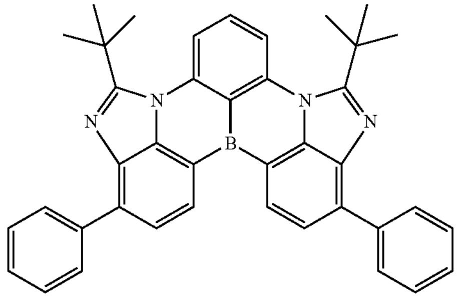
[Formula 406]
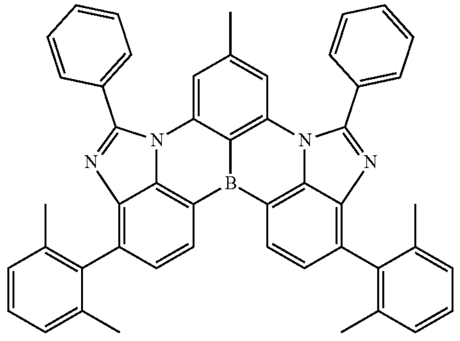
-continued
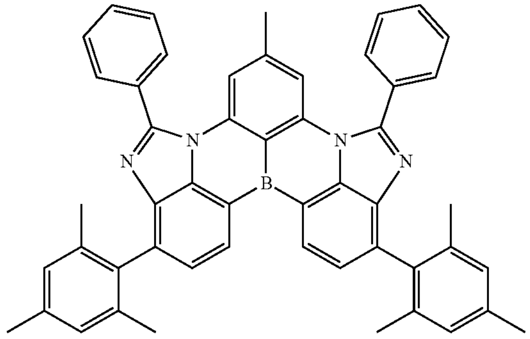
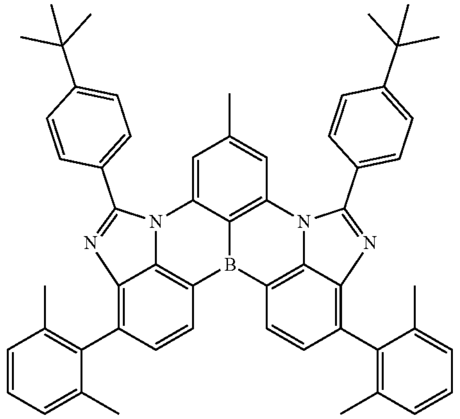
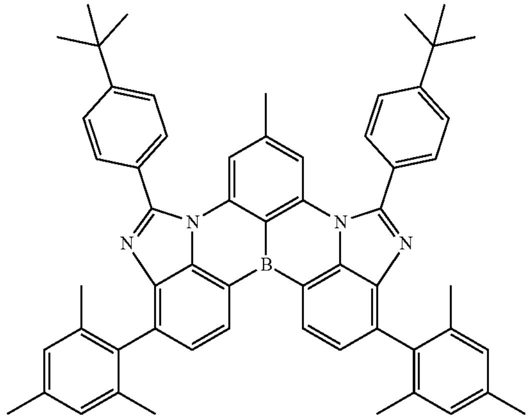
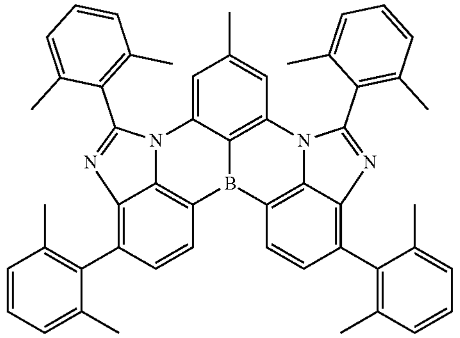

-continued
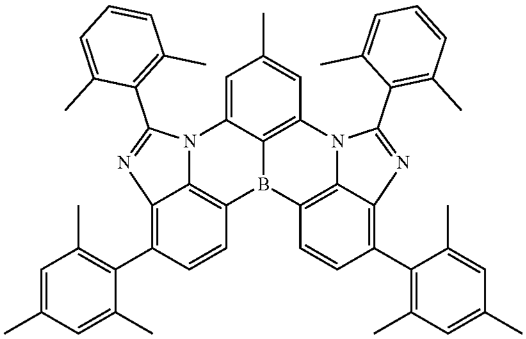
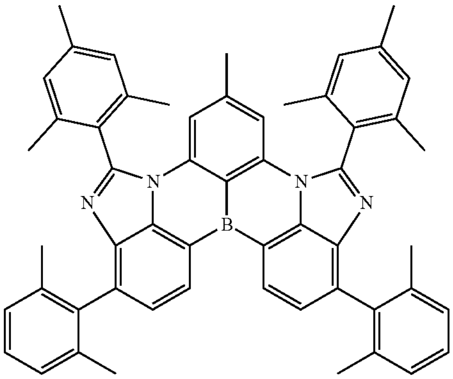
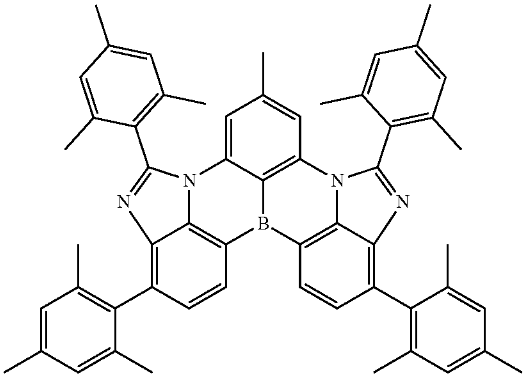
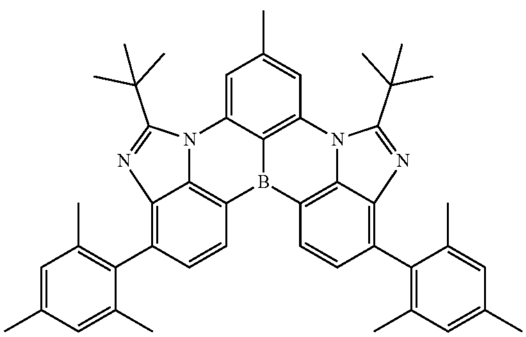
-continued
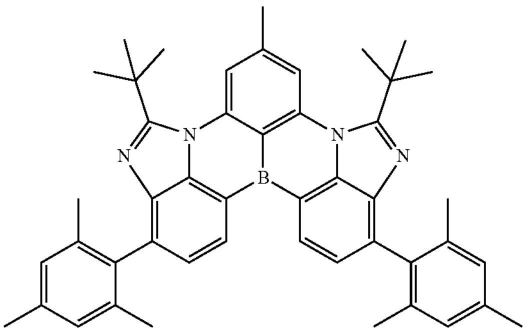
[Formula 407]
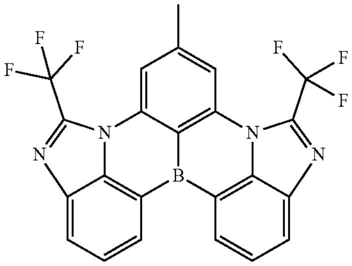
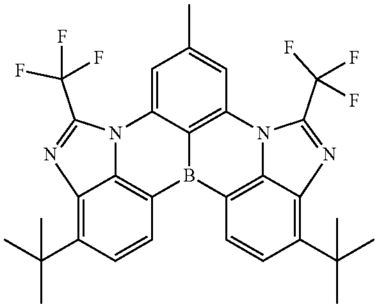
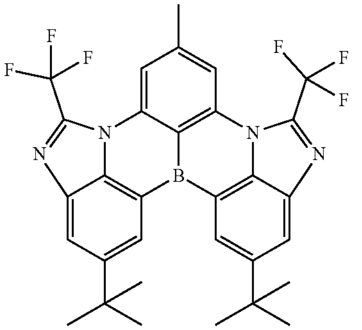
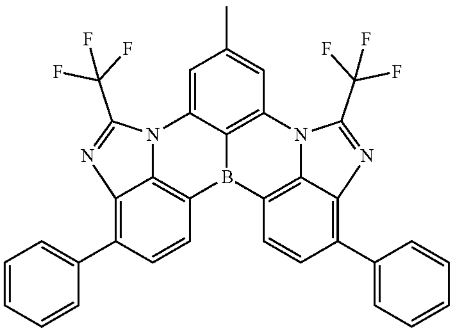

-continued
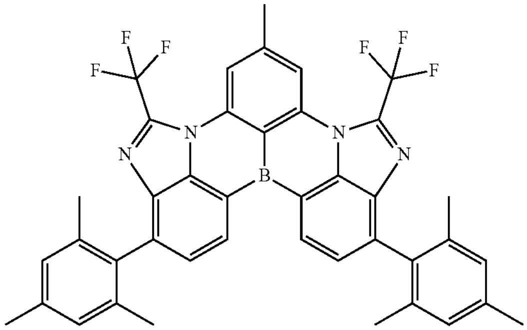
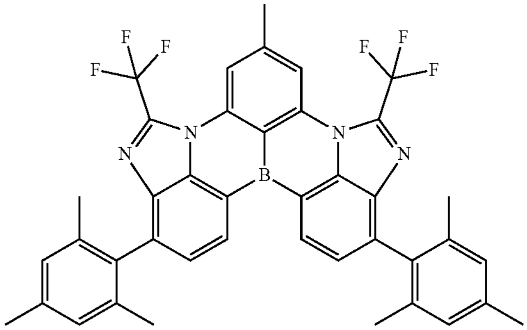
[Formula 408]
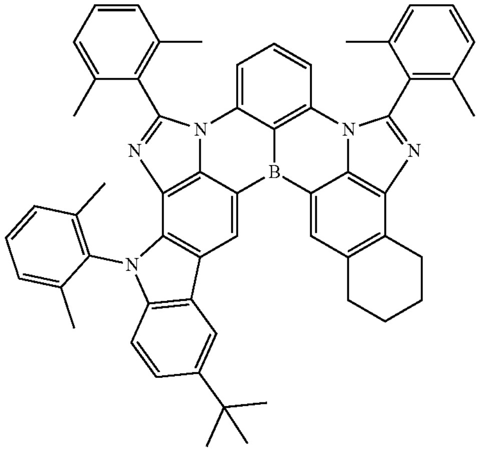
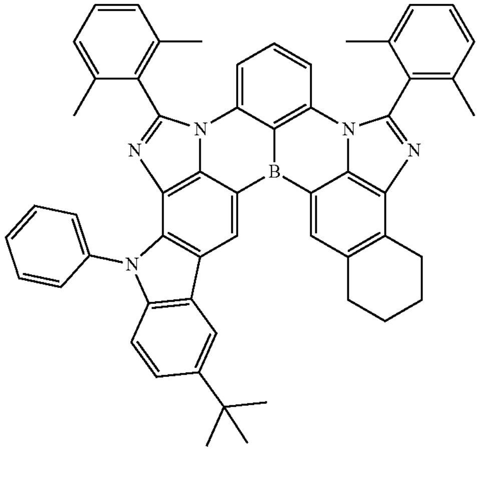
-continued
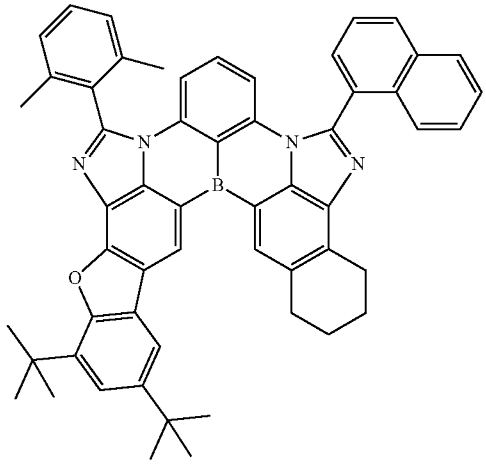
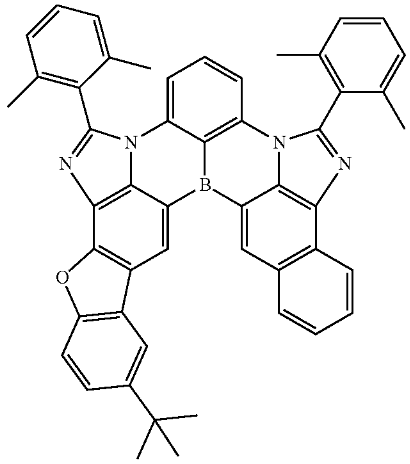
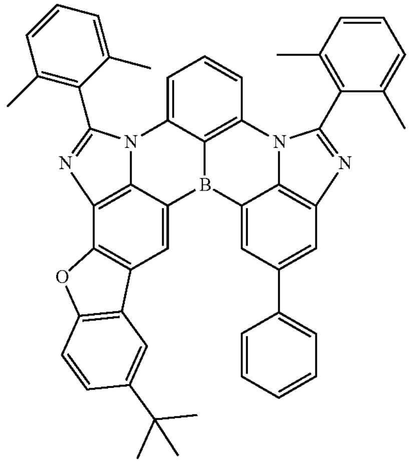

-continued
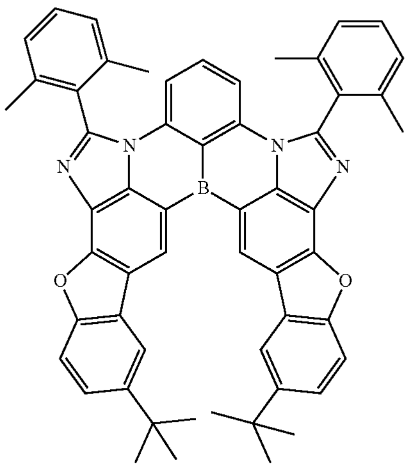
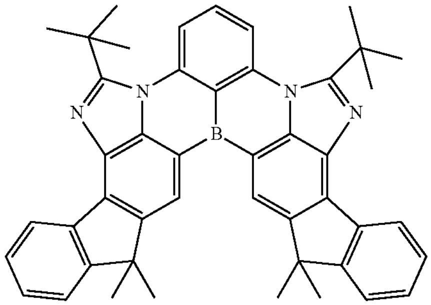
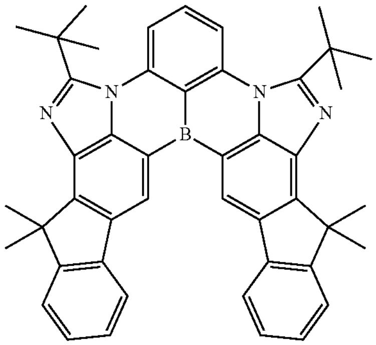
[Formula 409]
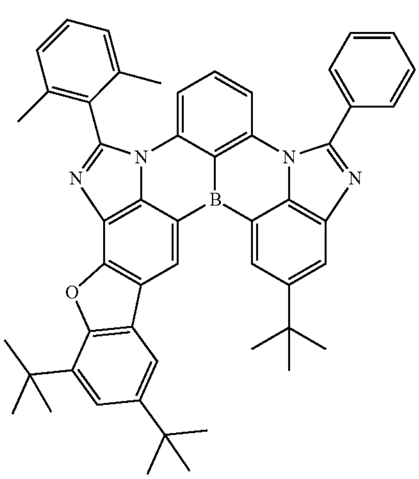
-continued
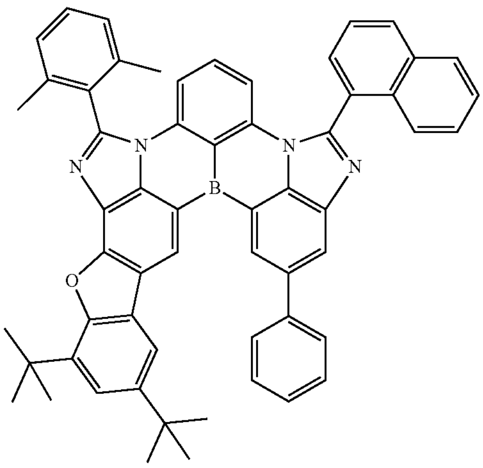
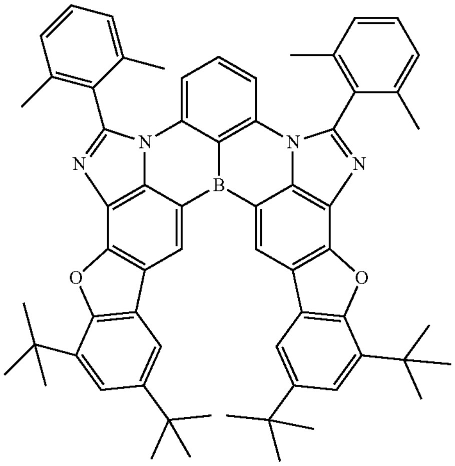
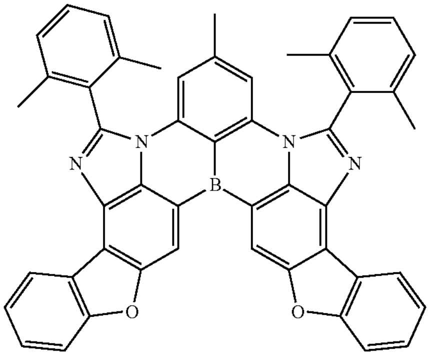
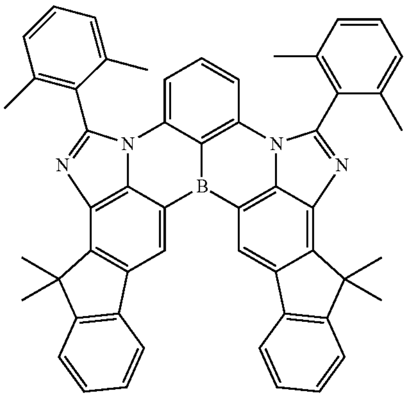

-continued
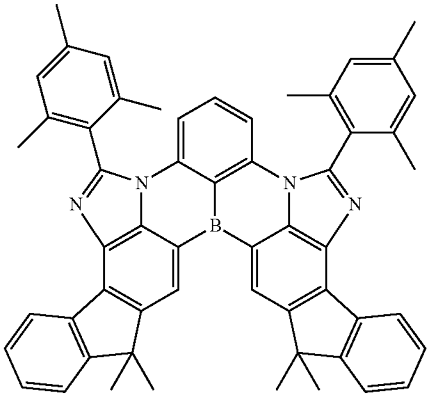
[Formula 410]
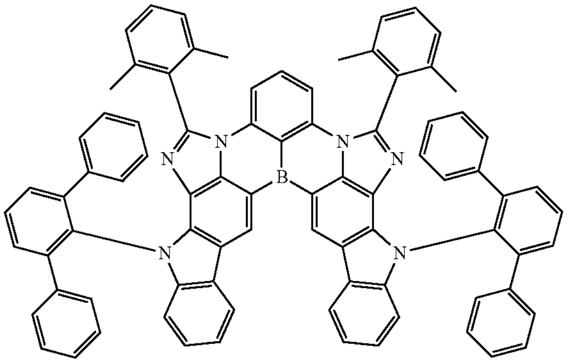
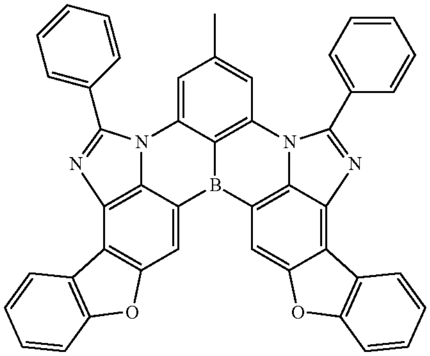
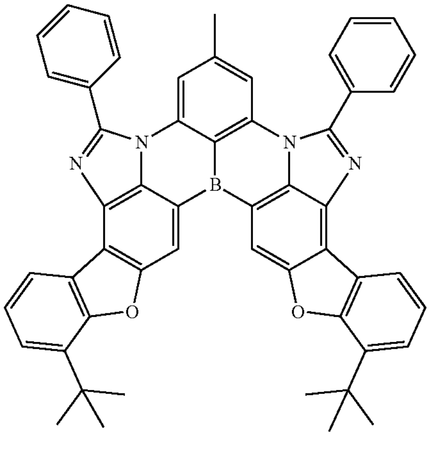
-continued
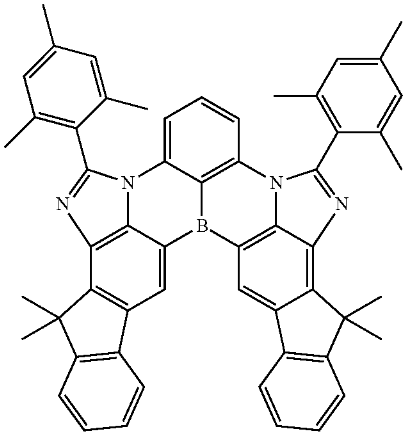
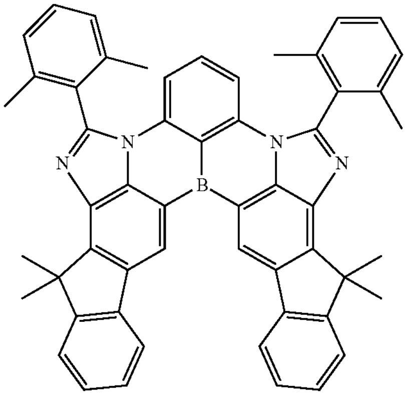
[Formula 411]
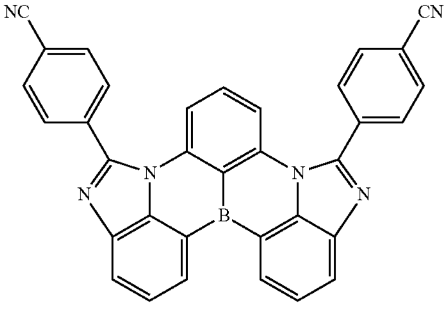
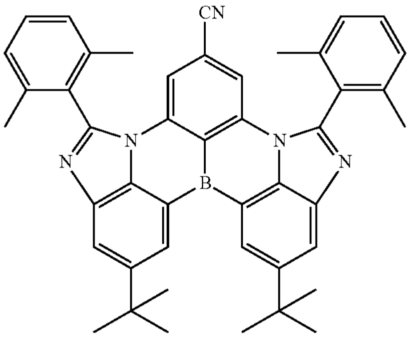

-continued
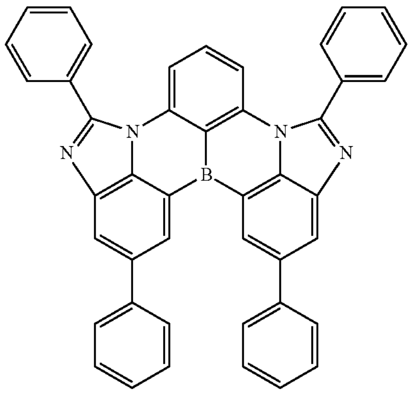
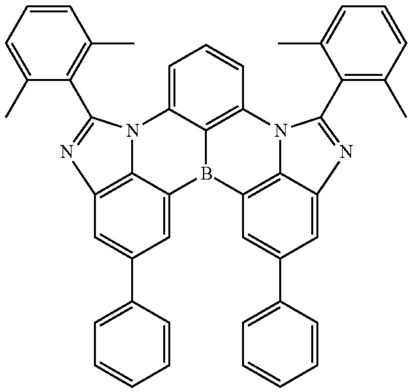
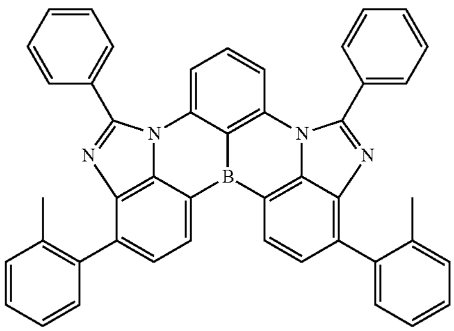
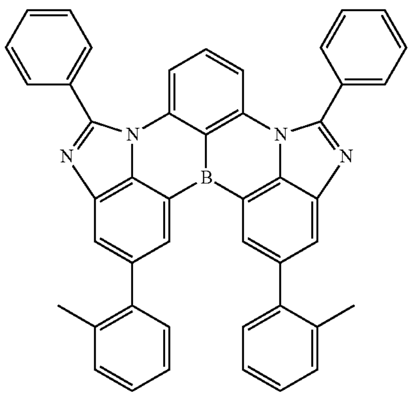
-continued
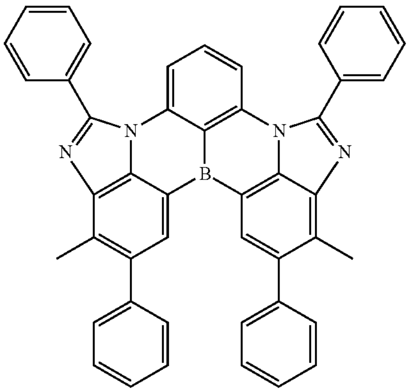
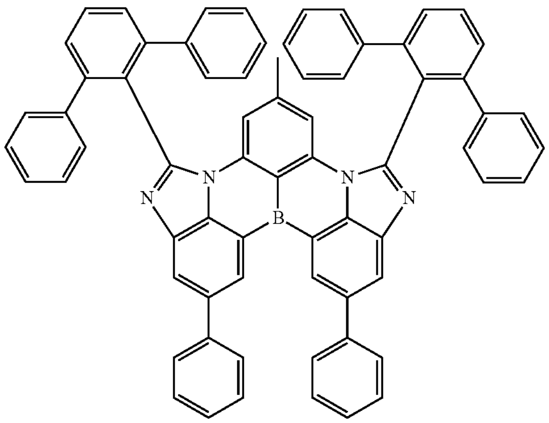
[Formula 412]
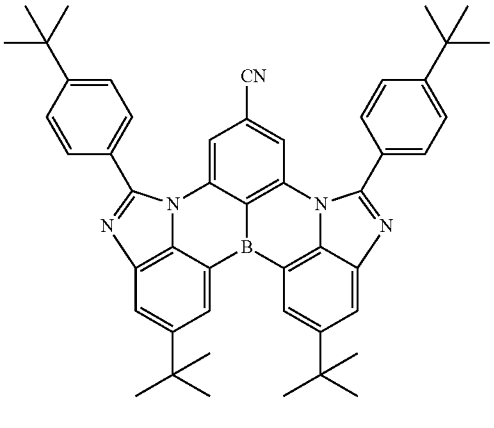

-continued
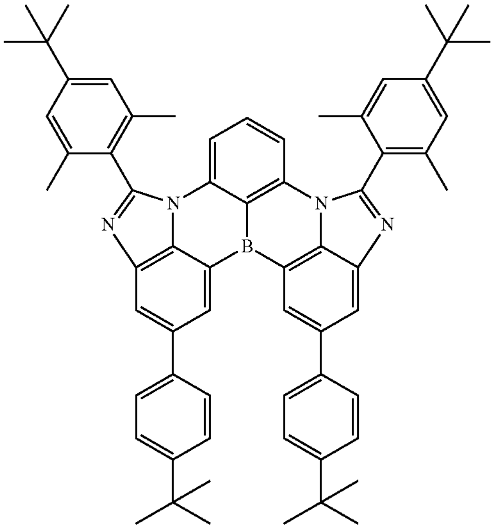
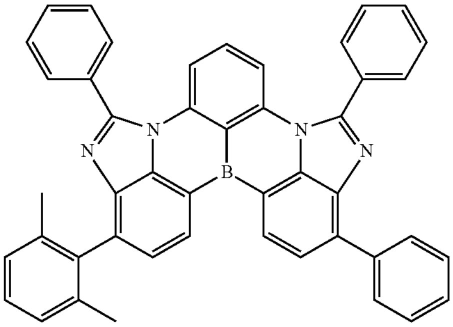
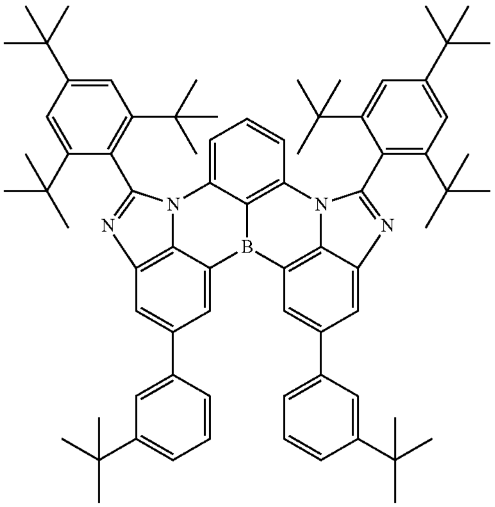
-continued
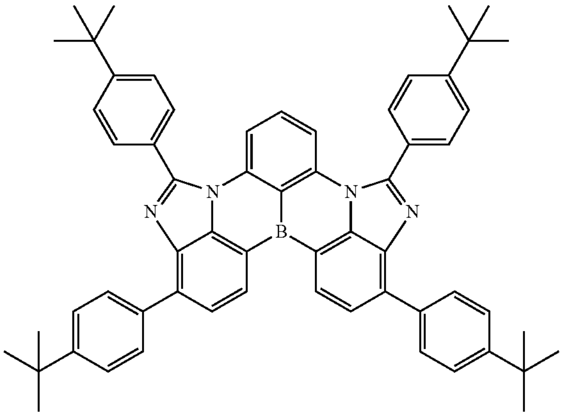
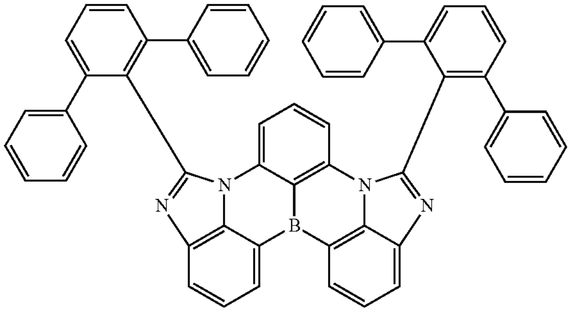
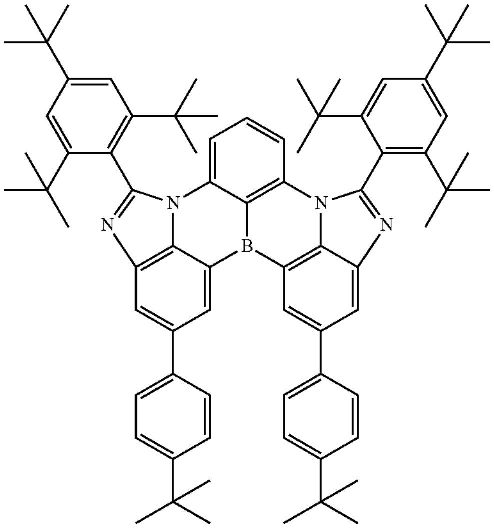
[Formula 413]
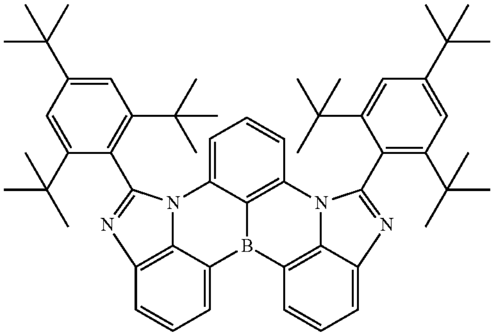

-continued
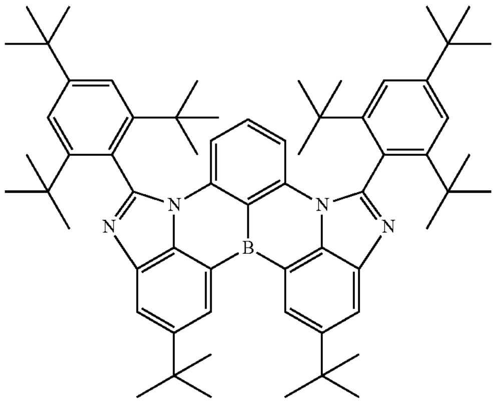
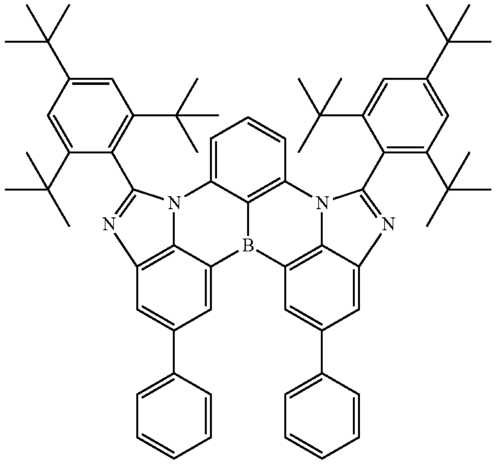
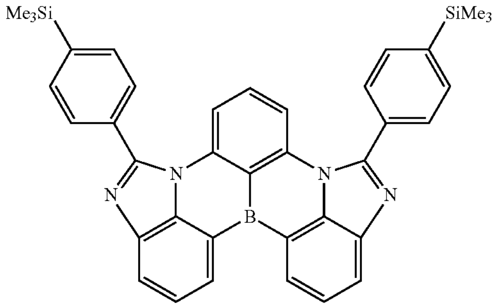
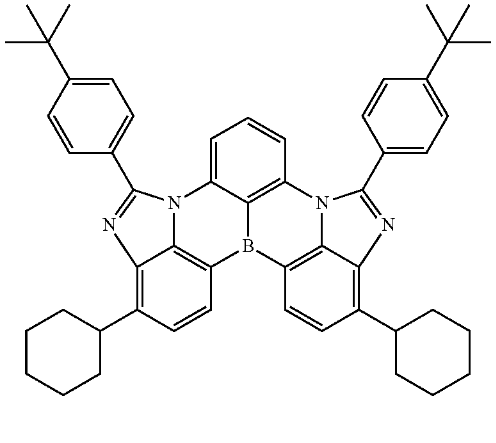
-continued
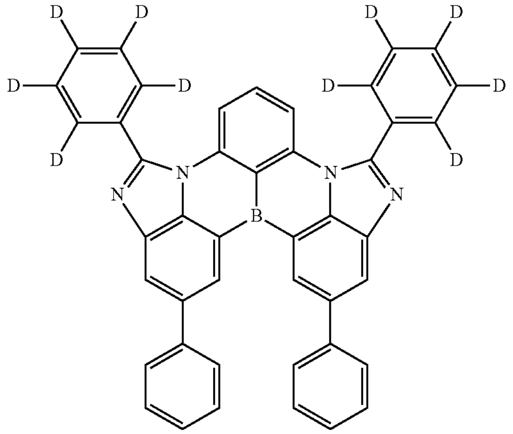
[Formula 414]
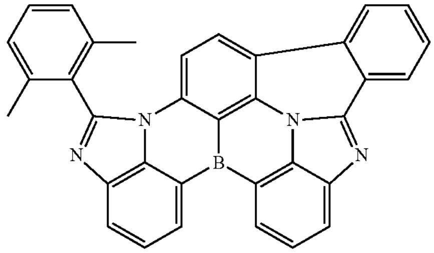
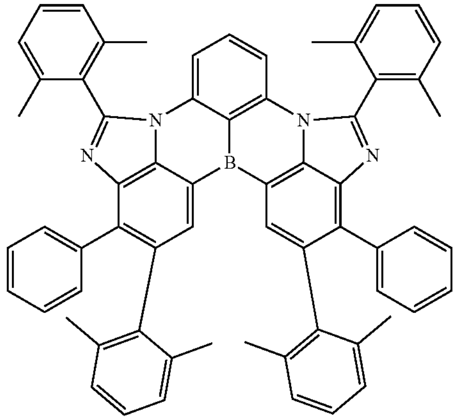
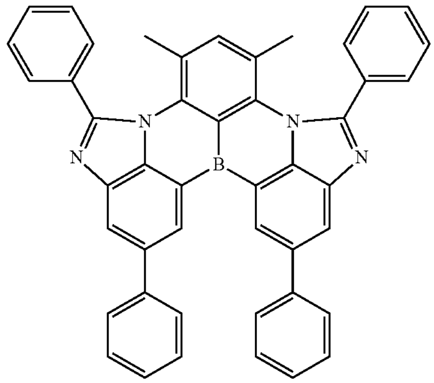

-continued
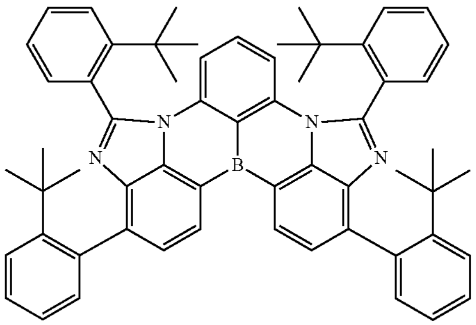
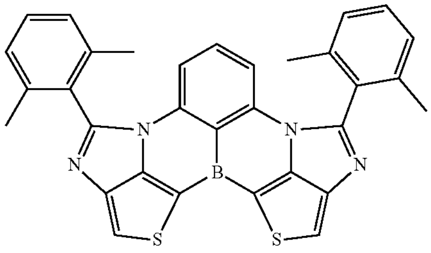
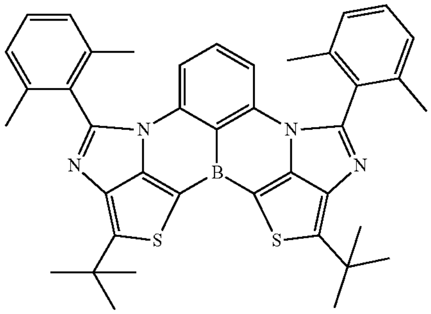
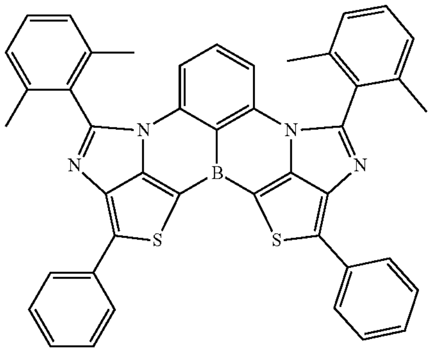
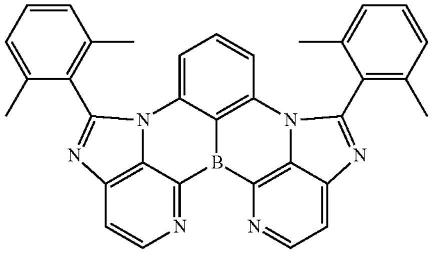
-continued
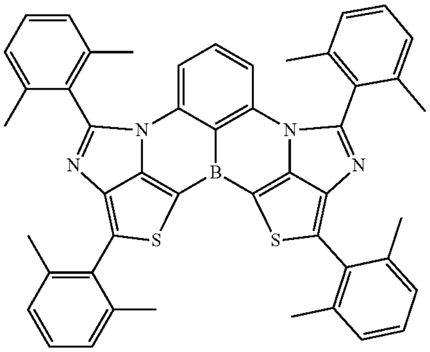
[Formula 415]
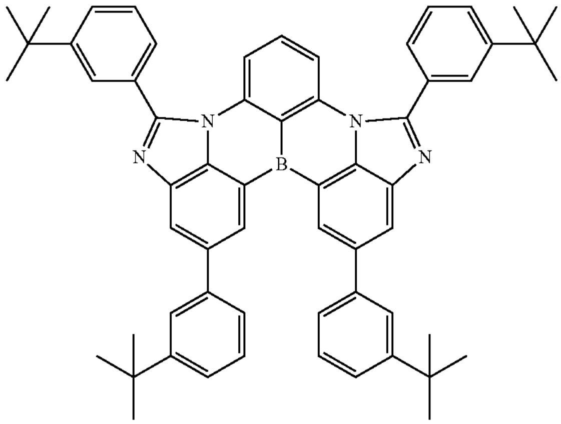
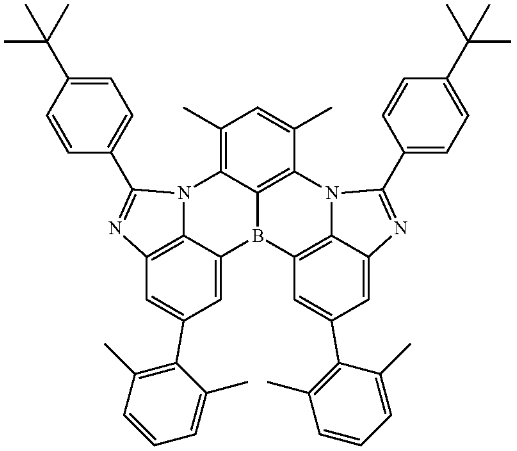
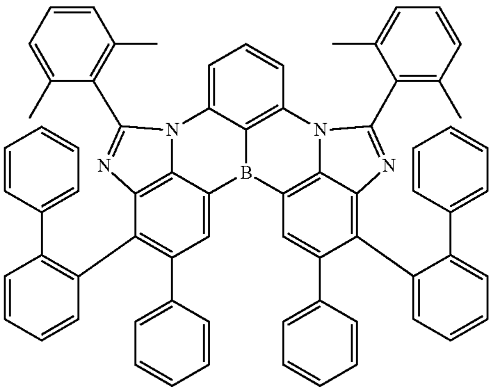

-continued
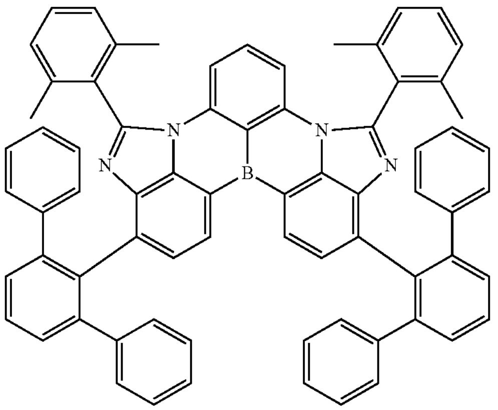
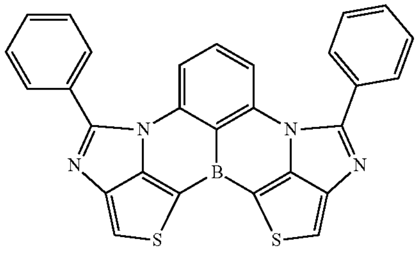
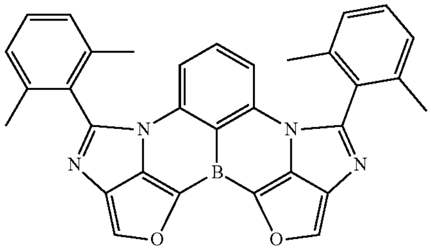
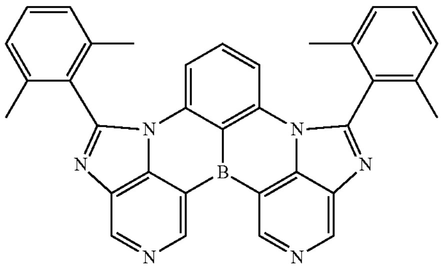
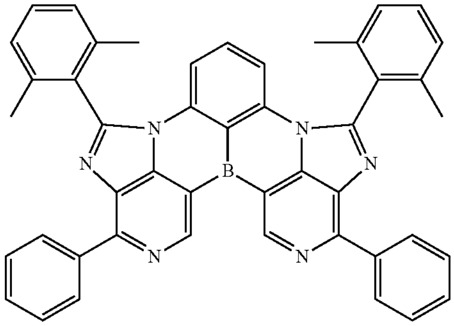
-continued
[Formula 416]
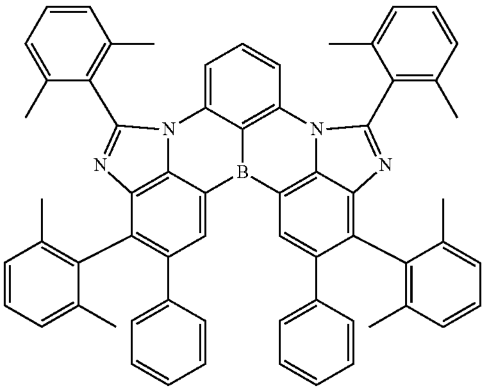
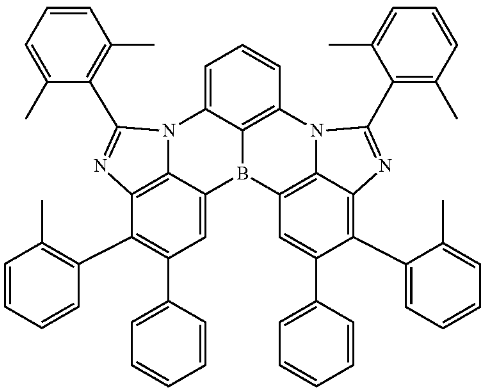
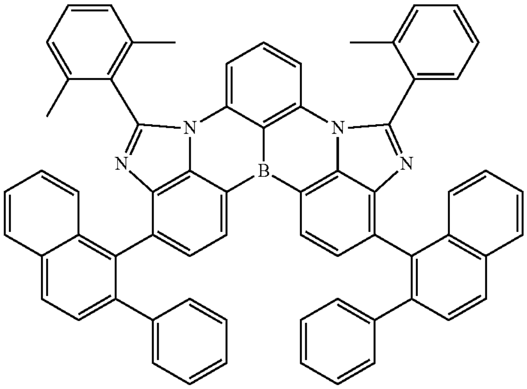
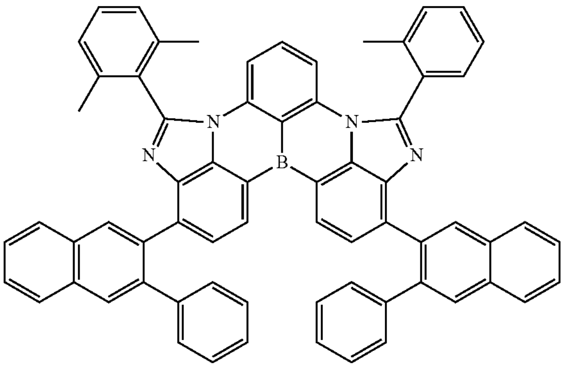

-continued
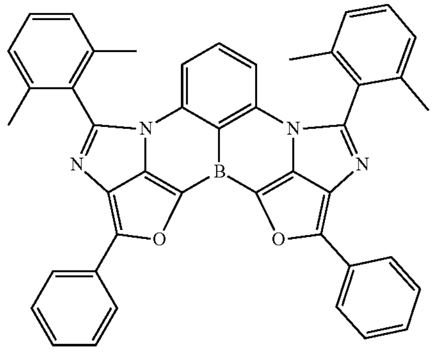
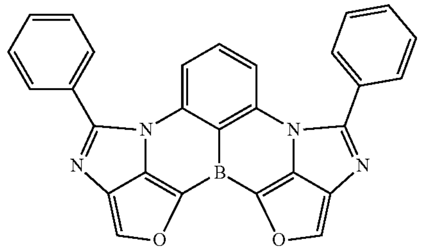
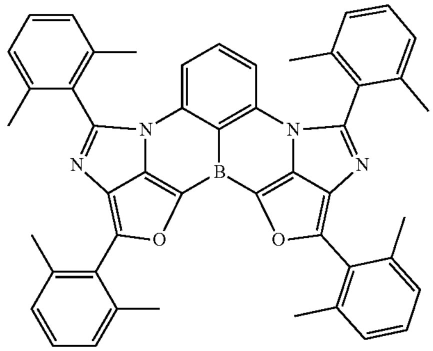
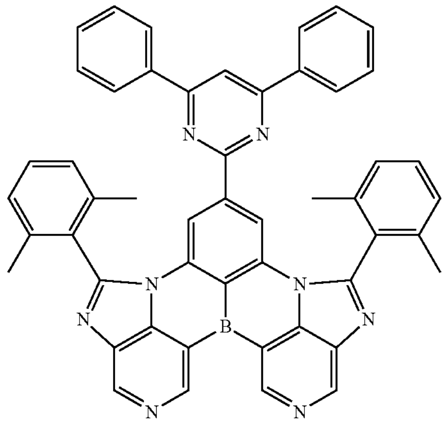
[Formula 417]
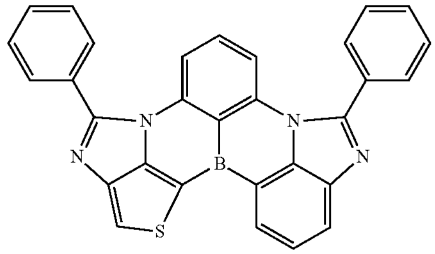
-continued
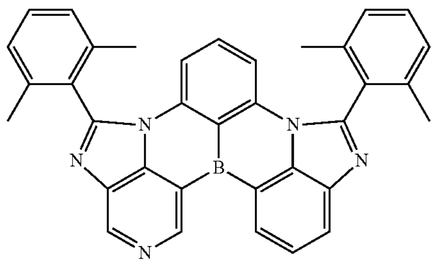
[Formula 418]
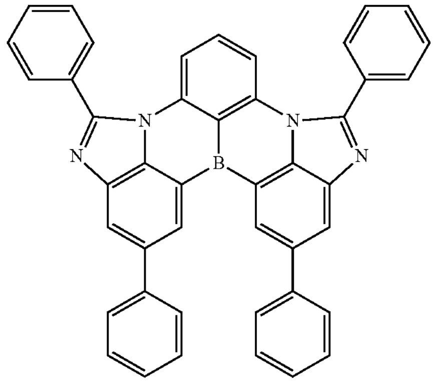
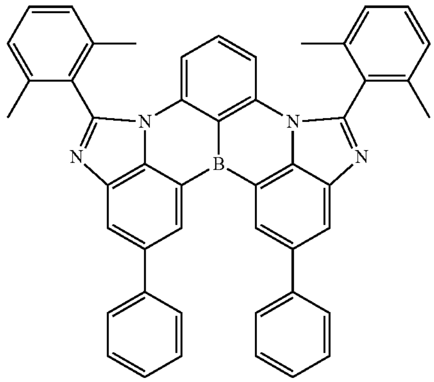
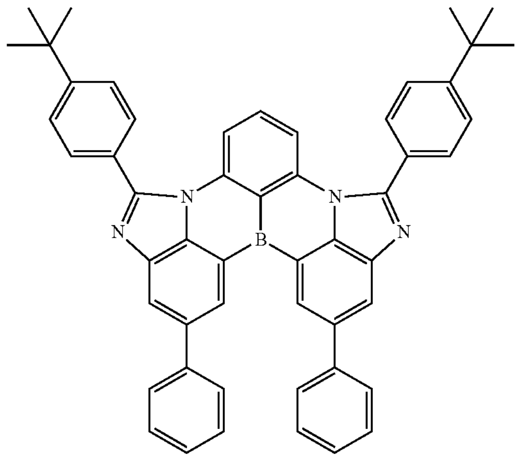

-continued
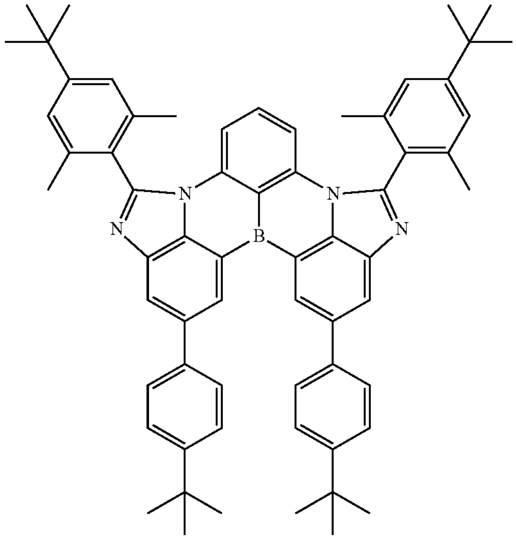
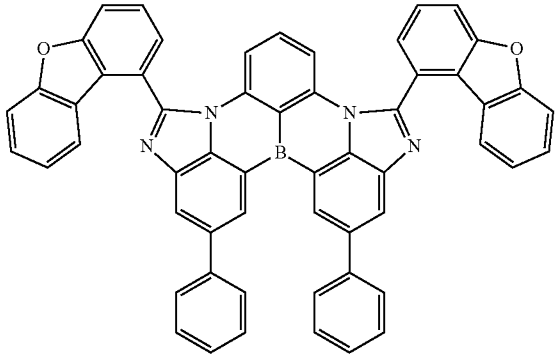
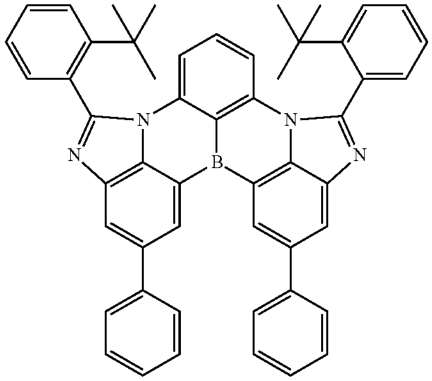
[Formula 419]
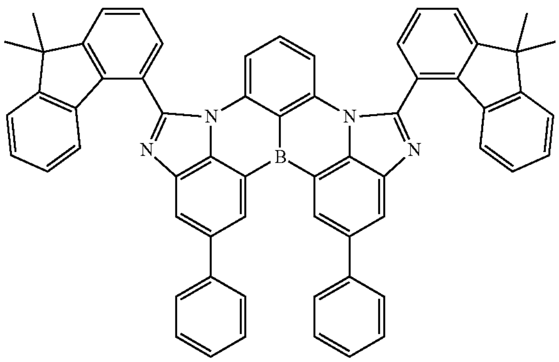
-continued
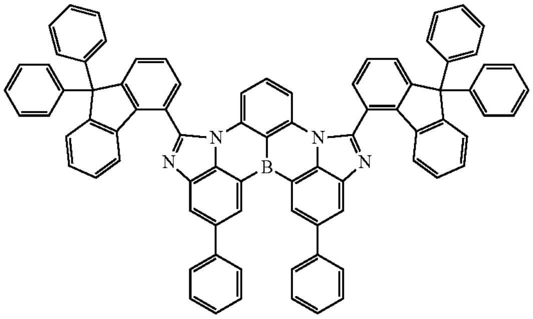
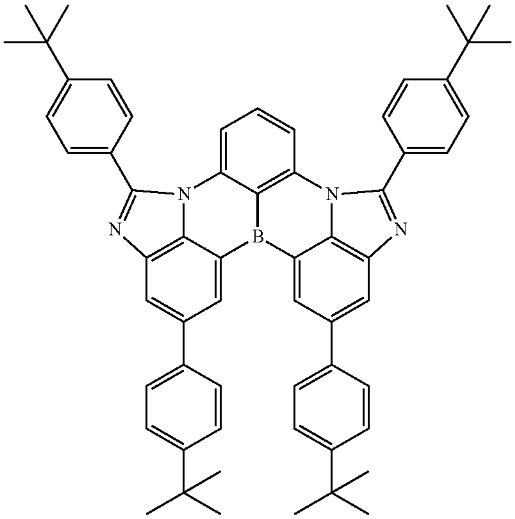
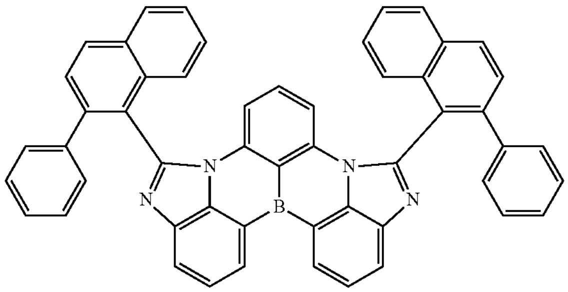
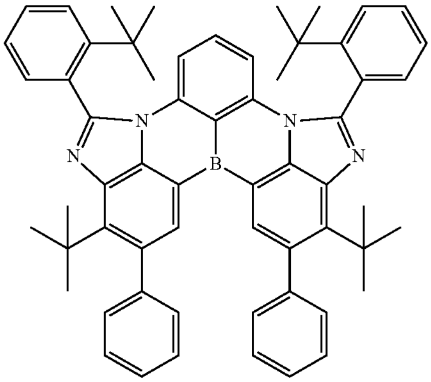

-continued
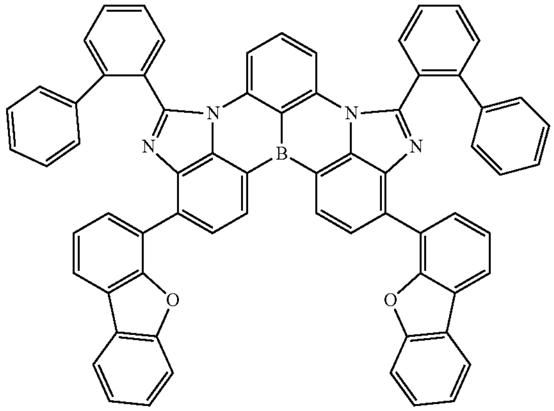
[Formula 420]
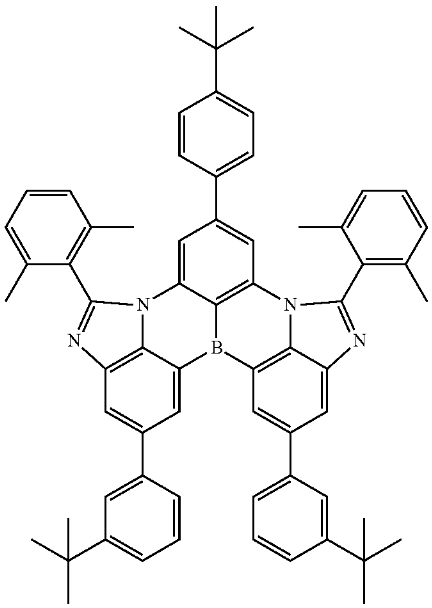
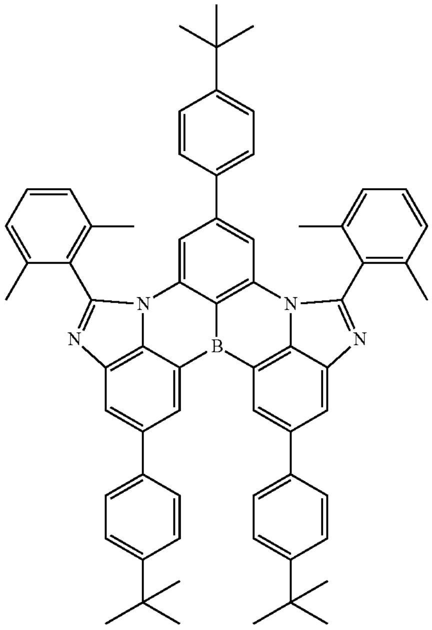
-continued
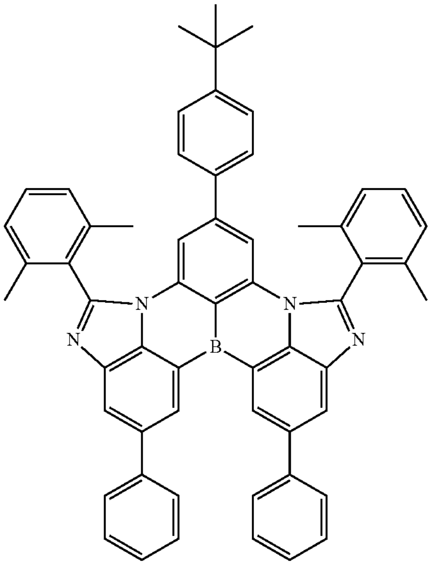
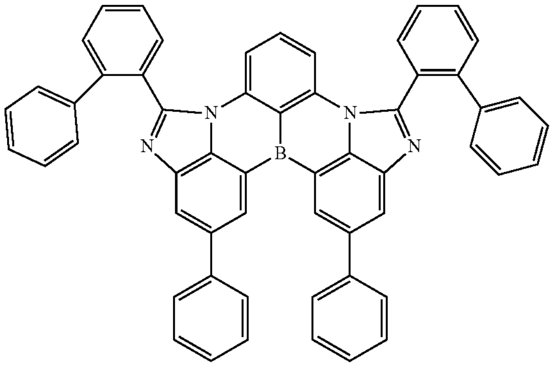
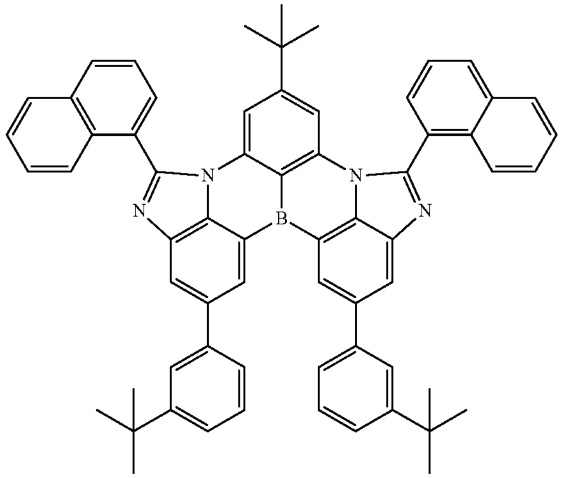

-continued
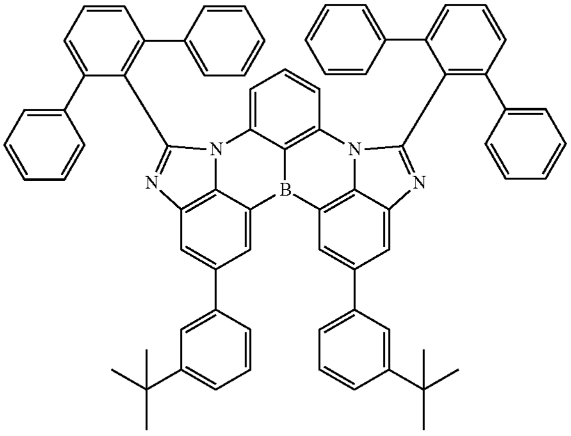
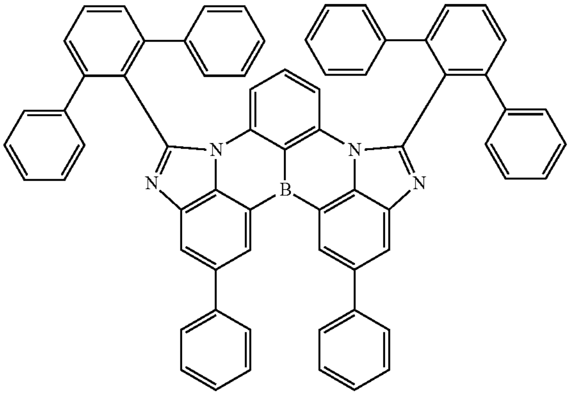
[Formula 421]
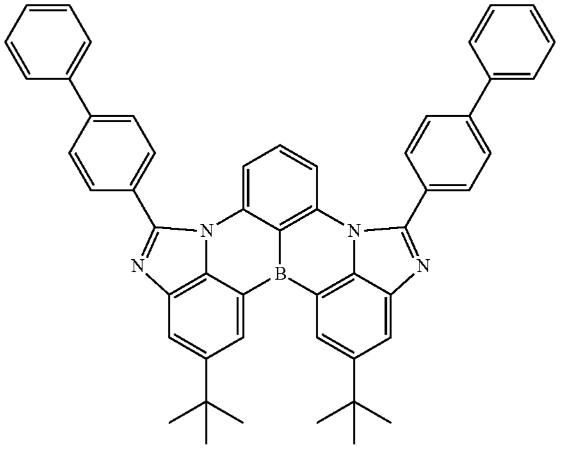
-continued
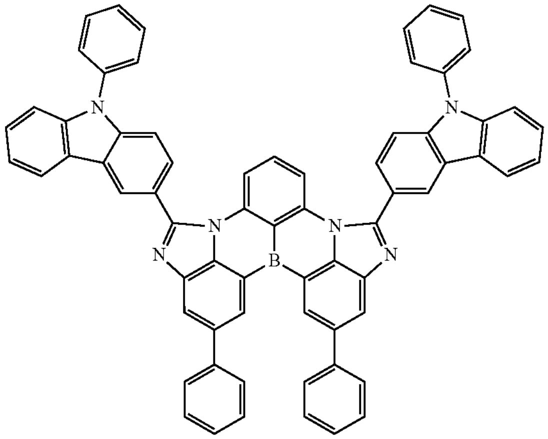
[Formula 422]
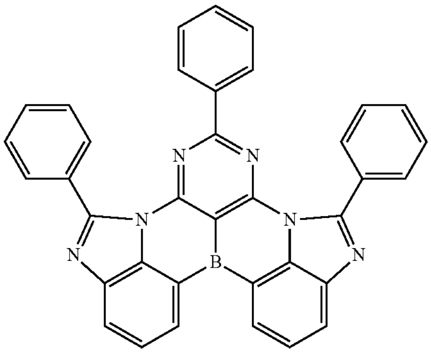
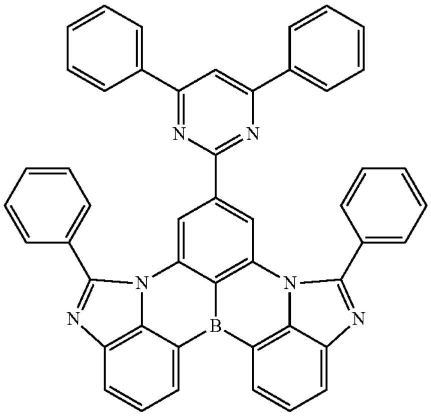

-continued
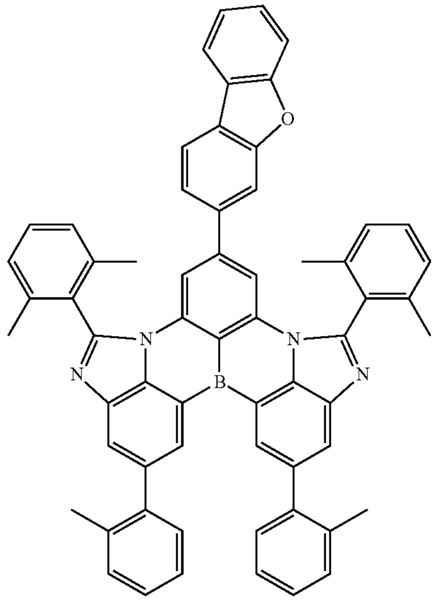
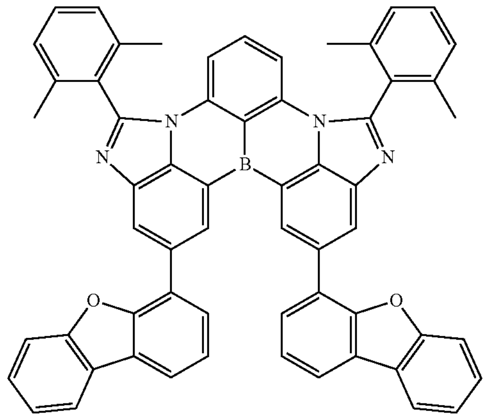
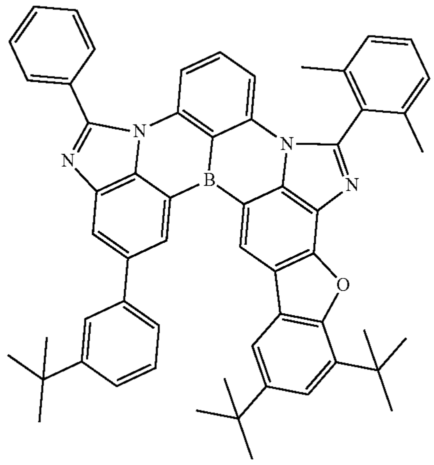
-continued
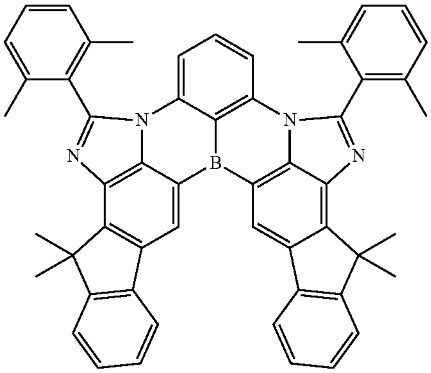
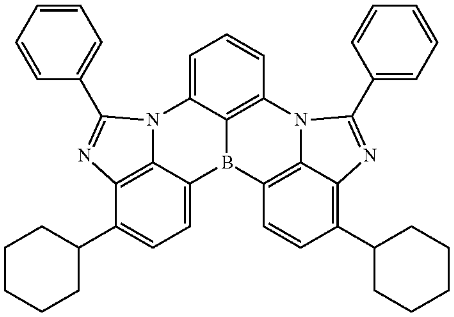
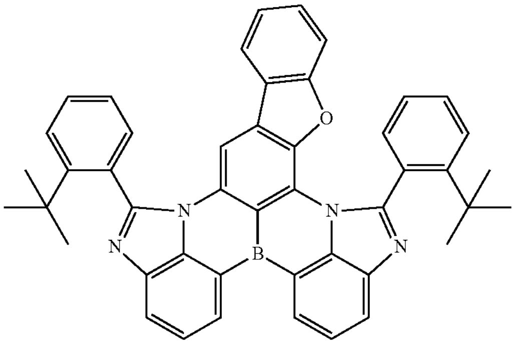
[Formula 423]
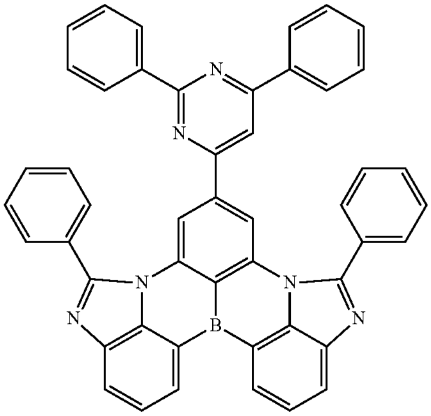

-continued
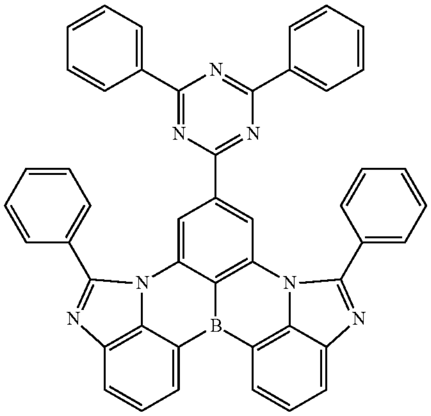
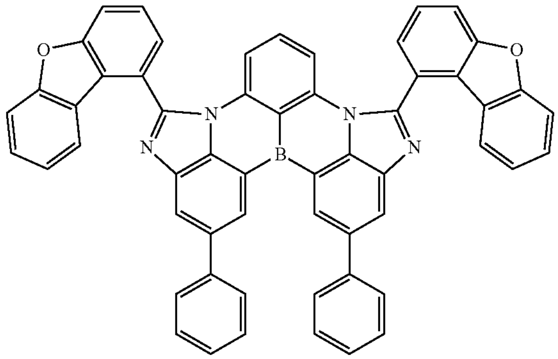
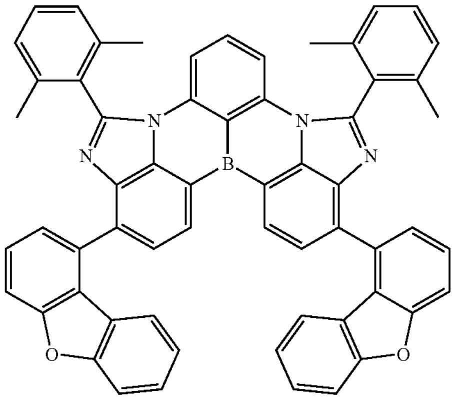
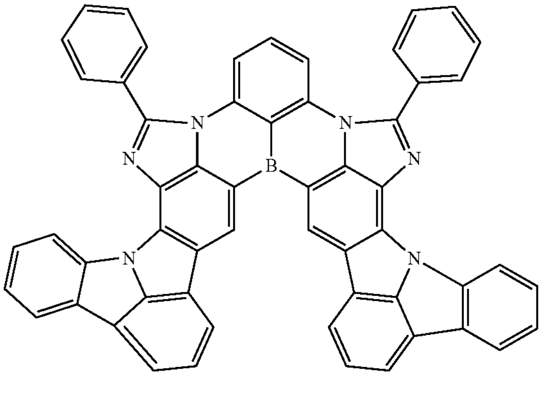
-continued
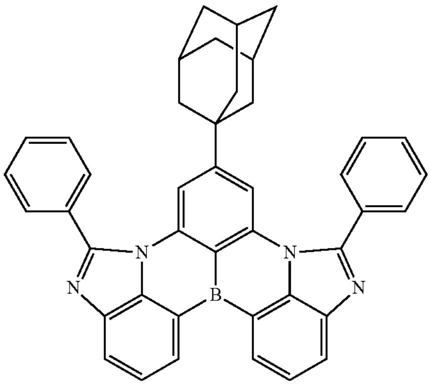
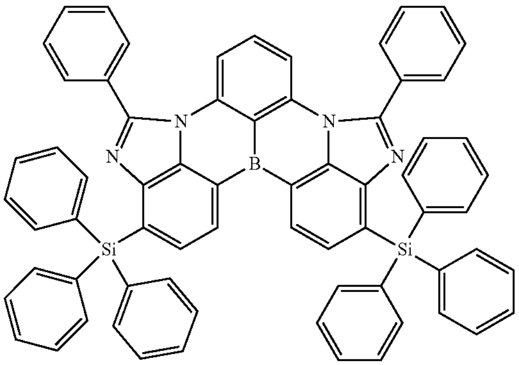
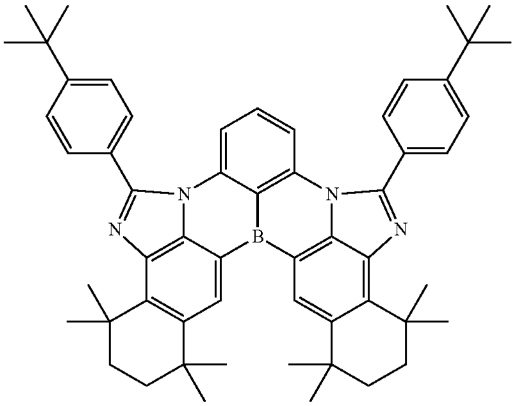
[Formula 424]
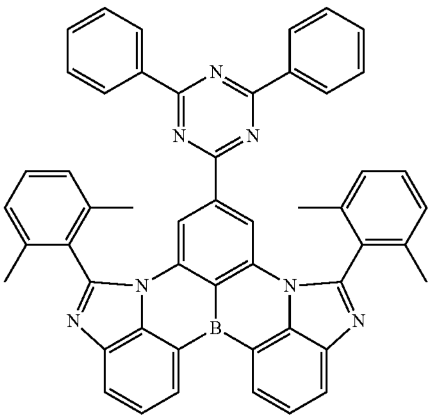

-continued
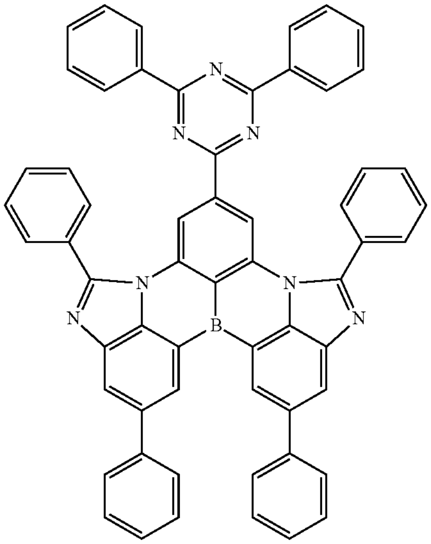
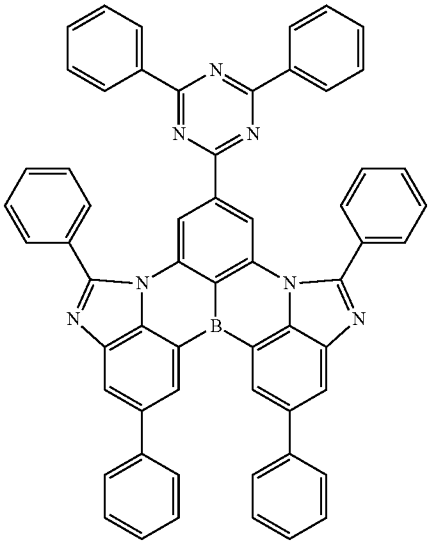
[Formula 425]
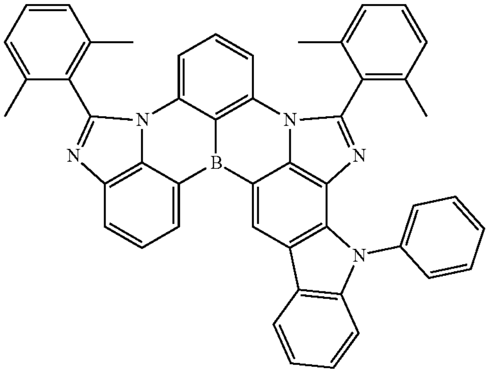
-continued
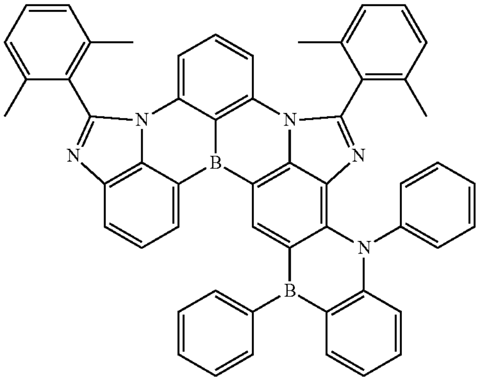
[Formula 426]
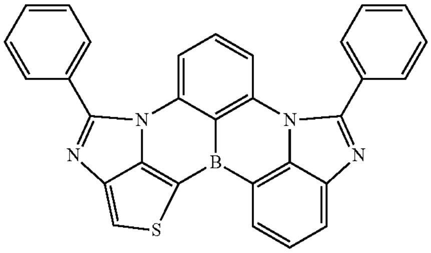
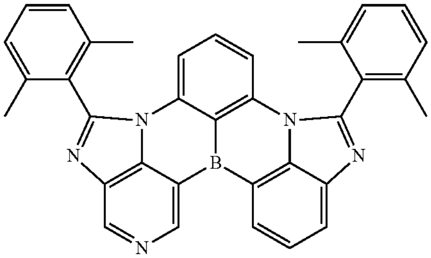
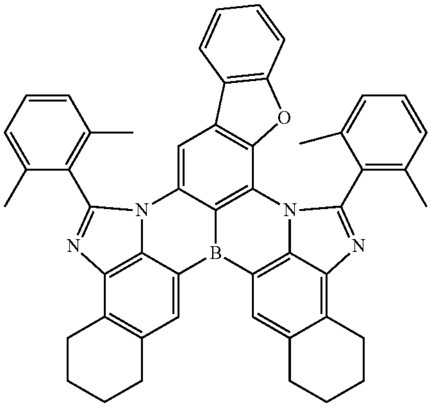

-continued

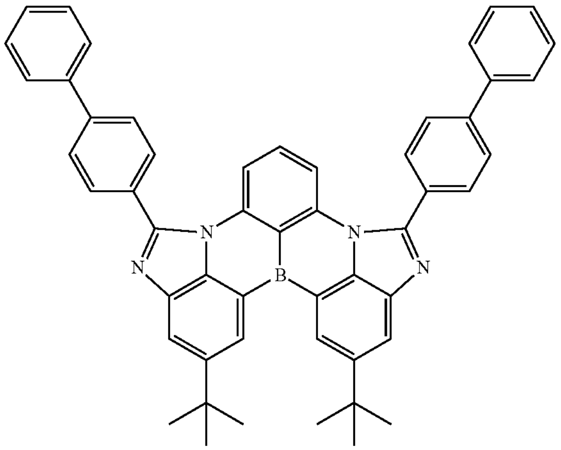

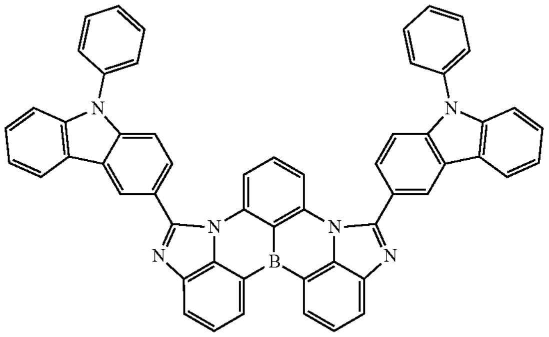

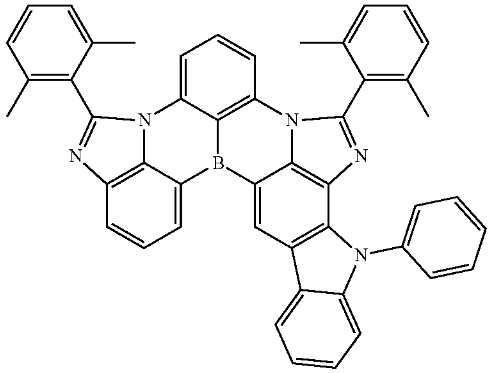

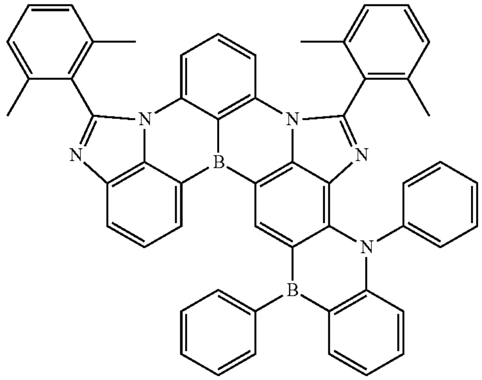

In the organic EL device in each exemplary embodiment, the first emitting compound and the second emitting compound used may each be, for example, at least one compound selected from the group consisting of a compound represented by formulae (31-1) and (31-3) below, a compound represented by formulae (31-2) and (31-3) below, a compound represented by the formula (6), and a compound represented by the formula (50).

In the organic EL device in each exemplary embodiment, no particular limitation is imposed on the third emitting compound. However, the third emitting compound used may be, for example, at least one compound selected from the group consisting of a compound represented by the formulae (31-1) and (31-3) below, a compound represented by the formulae (31-2) and (31-3) below, a compound represented by the formula (6), and a compound represented by the formula (50).

Compound Represented by Formulae (31-1) and (31-3) or Compound Represented by Formulae (31-2) and (31-3)

The compound represented by the formulae (31-1) and (31-3) or the compound represented by the formulae (31-2) and (31-3) will be described.

It is also preferable that the first emitting compound and the second emitting compound are each the compound represented by formulae (31-1) and (31-3) below or the compound represented by formulae (31-2) and (31-3) below.

[Formula 427]

(31-1)

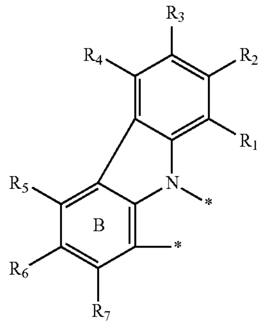

(31-2)

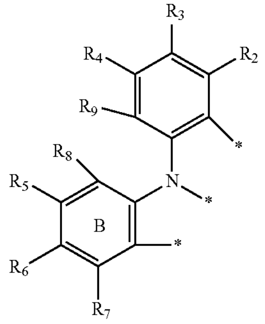

(31-3)

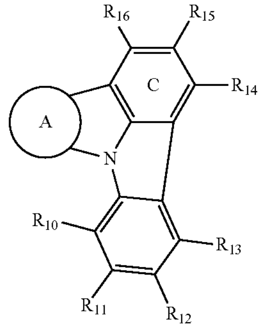

In the formula (31-1), the formula (31-2), and the formula (31-3):

a ring A is a substituted or unsubstituted aromatic hydrocarbon ring having 6 to 50 ring carbon atoms, or a substituted or unsubstituted heterocycle having 5 to 50 ring atoms;

two *s in the formula (31-1) are each independently bonded to a ring carbon atom of the aromatic hydrocarbon ring serving as the ring A in the formula (31-3) or a ring atom of the heterocycle serving as the ring A in the formula (31-3);

three *s in the formula (31-2) are each independently bonded to a ring carbon atom of the aromatic hydrocarbon ring serving as the ring A in the formula (31-3) or a ring atom of the heterocycle serving as the ring A in the formula (31-3);

at least one combination of adjacent two or more of $R_1$ to $R_{16}$ are mutually bonded to form a substituted or unsubstituted monocyclic ring, mutually bonded to form a substituted or unsubstituted fused ring, or not mutually bonded; and $R_1$ to $R_{16}$ forming neither the substituted or unsubstituted monocyclic ring nor the substituted or unsubstituted fused ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted alkylthio group having 1 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted aralkyl group having 7 to 50 carbon atoms, a group represented by —$Si(R_{31})(R_{32})(R_{33})$, a group represented by —$C(=O)R_{34}$, a group represented by —$COOR_{35}$, a group represented by —$N(R_{36})(R_{37})$, a halogen atom, a cyano group, a nitro group, a substituted or unsubstituted aryl group having 6 to 50 ring carbon atoms, or a substituted or unsubstituted heterocyclic group having 5 to 50 ring atoms.

In the formula (31-1), the formula (31-2), and the formula (31-3):

$R_{31}$ to $R_{37}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{31}$ are present, the plurality of $R_{31}$ are mutually the same or different;

when a plurality of $R_{32}$ are present, the plurality of $R_{32}$ are mutually the same or different;

when a plurality of $R_{33}$ are present, the plurality of $R_{33}$ are mutually the same or different;

when a plurality of $R_{34}$ are present, the plurality of $R_{34}$ are mutually the same or different;

when a plurality of $R_{35}$ are present, the plurality of $R_{35}$ are mutually the same or different;

when a plurality of $R_{36}$ are present, the plurality of $R_{36}$ are mutually the same or different; and and when a plurality of $R_{37}$ are present, the plurality of $R_{37}$ are mutually the same or different.

It is also preferable that the ring A in the formula (31-3) is a benzene ring represented by the following formula (32).

[Formula 428]

(32)

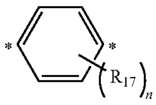

In the formula (32): one of two ring carbon atoms marked with * is bonded to the bond extending from the ring B in the formula (31-1) or the formula (31-2), and the other ring carbon atom marked with * is bonded to the bond extending from the ring C in the formula (31-3);

$R_{17}$ represents the same as $R_1$ to $R_{16}$ forming neither the substituted or unsubstituted monocyclic ring nor the substituted or unsubstituted fused ring;

n is 1 or 2; and, when n is 2, two $R_{17}$ are mutually the same or different.

The compound represented by the formulae (31-1) and (31-3) or the compound represented by the formulae (31-2) and (31-3) is preferably a compound represented by the following formula (D33), (D34), or (D35).

[Formula 429]

(D33)

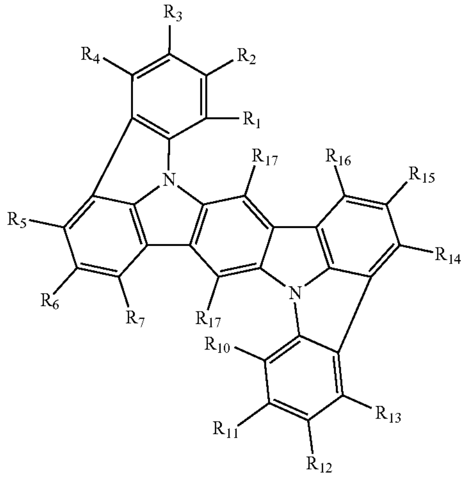

(D34)

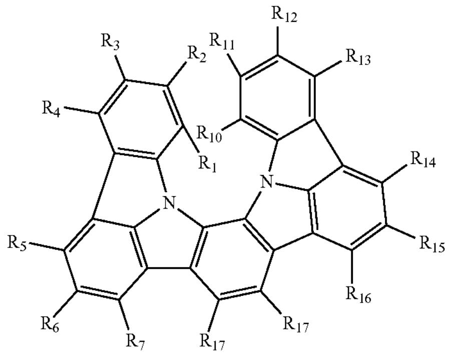

-continued (D35)

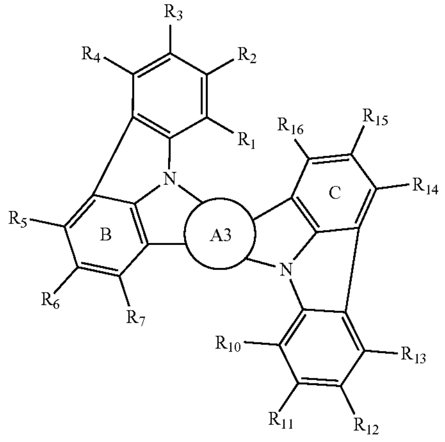

In the formula (D33), the formula (D34), and the formula (D35):

- a ring A3 is a substituted or unsubstituted aromatic hydrocarbon ring having 6 to 50 ring carbon atoms or a substituted or unsubstituted heterocycle having 5 to 50 ring atoms; and
- $R_1$ to $R_7$ and $R_{10}$ to $R_{17}$ each independently represent the same as $R_1$ to $R_{16}$ in the formula (31-1), the formula (31-2), and the formula (31-3).

Two $R_{17}$ are mutually the same or different.

It is also preferable that the substituted or unsubstituted aromatic hydrocarbon ring having 6 to 50 ring carbon atoms that serves as the ring A in the formula (31-3) and the substituted or unsubstituted aromatic hydrocarbon ring having 6 to 50 ring carbon atoms that serves as the ring A3 in the formula (D35) are each independently a substituted or unsubstituted fused aryl ring having 10 to 50 ring carbon atoms.

It is also preferable that the substituted or unsubstituted aromatic hydrocarbon ring having 6 to 50 ring carbon atoms that serves as the ring A in the formula (31-3) and the substituted or unsubstituted aromatic hydrocarbon ring having 6 to 50 ring carbon atoms that serves as the ring A3 in the formula (D35) are each independently a substituted or unsubstituted naphthalene ring, a substituted or unsubstituted anthracene ring, or a substituted or unsubstituted fluorene ring.

It is more preferable that the substituted or unsubstituted aromatic hydrocarbon ring having 6 to 50 ring carbon atoms that serves as the ring A in the formula (31-3) and the substituted or unsubstituted aromatic hydrocarbon ring having 6 to 50 ring carbon atoms that serves as the ring A3 in the formula (D35) are each independently a substituted or unsubstituted naphthalene ring or a substituted or unsubstituted fluorene ring.

It is also preferable that the substituted or unsubstituted heterocycle having 5 to 50 ring atoms that serves as the ring A in the formula (31-3) and the substituted or unsubstituted heterocycle having 5 to 50 ring atoms that serves as the ring A3 in the formula (D35) are each independently a substituted or unsubstituted fused heterocycle having 8 to 50 ring atoms.

It is also preferable that the substituted or unsubstituted heterocycle having 5 to 50 ring atoms that serves as the ring A in the formula (31-3) and the substituted or unsubstituted heterocycle having 5 to 50 ring atoms that serves as the ring A3 in the formula (D35) are each independently a substituted or unsubstituted dibenzofuran ring, a substituted or unsubstituted carbazole ring, or a substituted or unsubstituted dibenzothiophene ring.

It is preferable that the compound represented by the formulae (31-1) and (31-3) or the compound represented by the formulae (31-2) and (31-3) is selected from the group consisting of compounds represented by the following formulae (36-1) to (36-6).

[Formula 430]

(36-1)

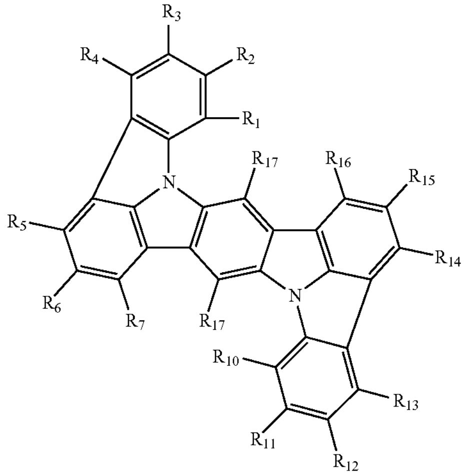

(36-2)

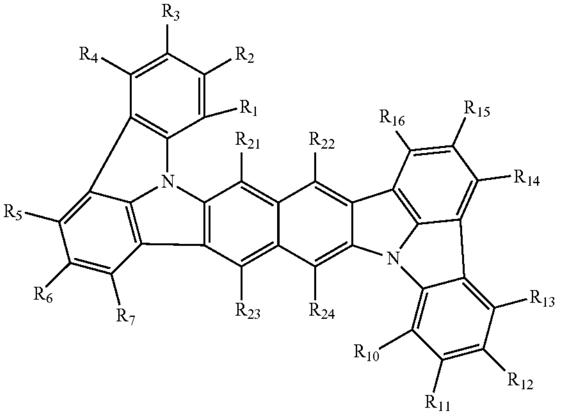

[Formula 431]

(36-3)

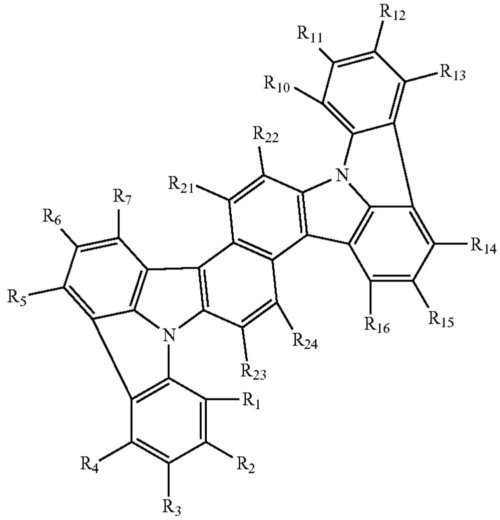

-continued (36-4)

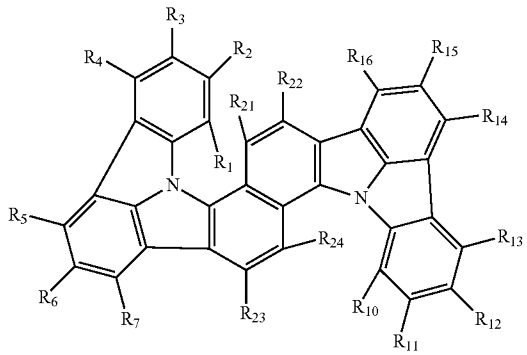

[Formula 432]

(36-5)

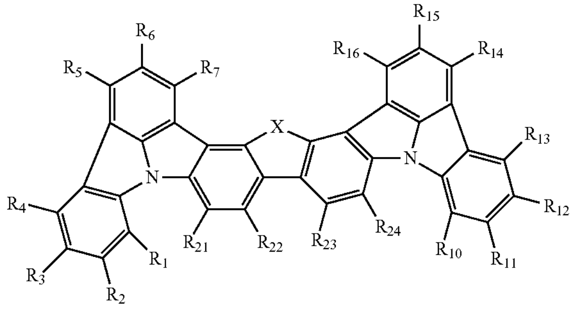

(36-6)

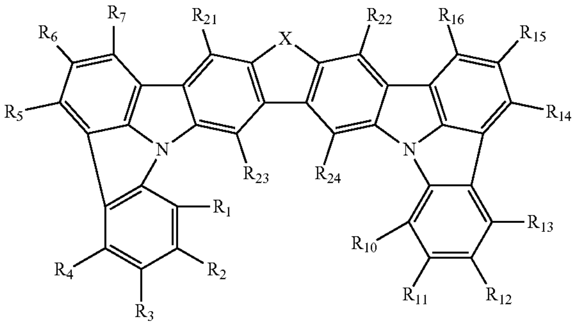

In the formulae (36-1) to (36-6):

$R_1$ to $R_7$ and $R_{10}$ to $R_{17}$ each independently represent the same as $R_1$ to $R_{16}$ in the formula (31-1), the formula (31-2), and the formula (31-3); two $R_{17}$ are mutually the same or different;

X is O, $NR_{25}$, or $C(R_{26})(R_{27})$;

at least one combination of adjacent two or more of $R_{21}$ to $R_{27}$ are mutually bonded to form a substituted or unsubstituted monocyclic ring, mutually bonded to form a substituted or unsubstituted fused ring, or not mutually bonded; and $R_{21}$ to $R_{27}$ forming neither the substituted or unsubstituted monocyclic ring nor the substituted or unsubstituted fused ring each independently represent the same as $R_1$ to $R_{16}$ forming neither the substituted or unsubstituted monocyclic ring nor the substituted or unsubstituted fused ring in the formula (31-1), the formula (31-2), and the formula (31-3).

It is preferable that $R_1$ to $R_{17}$ in the compound represented by the formulae (31-1) and (31-3) or the compound represented by the formulae (31-2) and (31-3) are each independently selected from the group consisting of a hydrogen atom, a substituted or unsubstituted aryl group having 6 to 50 ring carbon atoms, and a substituted or unsubstituted heterocyclic group having 5 to 50 ring atoms.

It is preferable that $R_1$ to $R_{17}$ in the compound represented by the formulae (31-1) and (31-3) or the compound represented by the formulae (31-2) and (31-3) are each independently selected from the group consisting of a hydrogen atom, a substituted or unsubstituted aryl group having 6 to 18 ring carbon atoms, and a substituted or unsubstituted heterocyclic group having 5 to 18 ring atoms.

It is preferable that the compound represented by the formulae (31-1) and (31-3) or the compounds represented by the formulae formula (31-2) and (31-3) is a compound represented by the following formula (33-2).

[Formula 433]

(33-2)

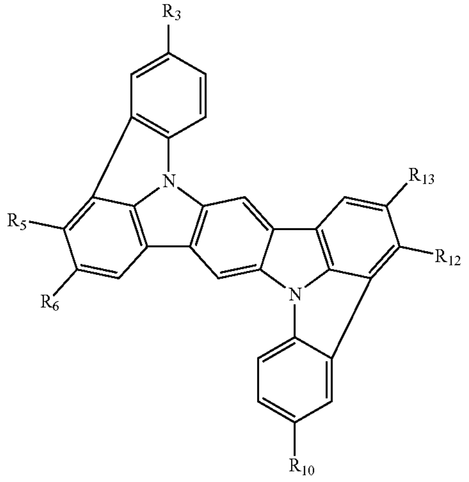

In the formula (33-2), $R_3$, $R_5$, $R_6$, $R_{10}$, $R_{12}$, and $R_{13}$ each independently represent the same as $R_1$ to $R_{16}$ in the formula (31-1), the formula (31-2), and the formula (31-3).

In the compound represented by the formulae (31-1) and (31-3) or the compound represented by the formulae (31-2) and (31-3), it is preferable that the substituent for each of the "substituted or unsubstituted" groups is selected from the group consisting of an alkyl group having 1 to 50 carbon atoms, a haloalkyl group having 1 to 50 carbon atoms, an alkenyl group having 2 to 50 carbon atoms, an alkynyl group having 2 to 50 carbon atoms, a cycloalkyl group having 3 to 50 ring carbon atoms, an alkoxy group having 1 to 50 carbon atoms, an alkylthio group having 1 to 50 carbon atoms, an aryloxy group having 6 to 50 ring carbon atoms, an arylthio group having 6 to 50 ring carbon atoms, an aralkyl group having 7 to 50 carbon atoms, a group represented by $-Si(R_{341})(R_{342})(R_{343})$, a group represented by $-C(=O)R_{344}$, a group represented by $-COOR_{345}$, a group represented by $-S(=O)_2R_{346}$, a group represented by $-P(=O)(R_{347})(R_{348})$, a group represented by $-Ge(R_{349})(R_{350})(R_{351})$, a group represented by $-N(R_{352})(R_{353})$, a hydroxy group, a halogen atom, a cyano group, a nitro group, an aryl group having 6 to 50 ring carbon atoms, and a heterocyclic group having 5 to 50 ring atoms;

$R_{341}$ to $R_{353}$ are each independently a hydrogen atom, an alkyl group having 1 to 50 carbon atoms, a substituted or unsubstituted cycloalkyl group having 3 to 50 ring carbon atoms, an aryl group having 6 to 50 ring carbon atoms, or a heterocyclic group having 5 to 50 ring atoms;

when a plurality of $R_{341}$ are present, the plurality of $R_{341}$ are mutually the same or different;

when a plurality of $R_{342}$ are present, the plurality of $R_{342}$ are mutually the same or different;

when a plurality of $R_{343}$ are present, the plurality of $R_{343}$ are mutually the same or different;

when a plurality of $R_{344}$ are present, the plurality of $R_{344}$ are mutually the same or different;

when a plurality of $R_{345}$ are present, the plurality of $R_{345}$ are mutually the same or different;

when a plurality of $R_{346}$ are present, the plurality of $R_{346}$ are mutually the same or different;

when a plurality of $R_{347}$ are present, the plurality of $R_{347}$ are mutually the same or different;

when a plurality of $R_{348}$ are present, the plurality of $R_{348}$ are mutually the same or different;

when a plurality of $R_{349}$ are present, the plurality of $R_{349}$ are mutually the same or different;

when a plurality of $R_{350}$ are present, the plurality of $R_{350}$ are mutually the same or different;

when a plurality of $R_{351}$ are present, the plurality of $R_{351}$ are mutually the same or different;

when a plurality of $R_{352}$ are present, the plurality of $R_{352}$ are mutually the same or different; and and, when a plurality of $R_{353}$ are present, the plurality of $R_{353}$ are mutually the same or different.

In the compound represented by the formulae (31-1) and (31-3) or the compound represented by the formulae (31-2) and (31-3), it is preferable that the substituent for each of the "substituted or unsubstituted" groups is an alkyl group having 1 to 50 carbon atoms, an aryl group having 6 to 50 ring carbon atoms, or a heterocyclic group having 5 to 50 ring atoms.

In the compound represented by the formulae (31-1) and (31-3) or the compound represented by the formulae (31-2) and (31-3), it is preferable that the substituent for each of the "substituted or unsubstituted" groups is an alkyl group having 1 to 18 carbon atoms, an aryl group having 6 to 18 ring carbon atoms, or a heterocyclic group having 5 to 18 ring atoms.

It is also preferable that the compound represented by the formulae (31-1) and (31-3) or the compound represented by the formulae (31-2) and (31-3) is a compound represented by the following formula (31-11).

[Formula 434]

(31-11)

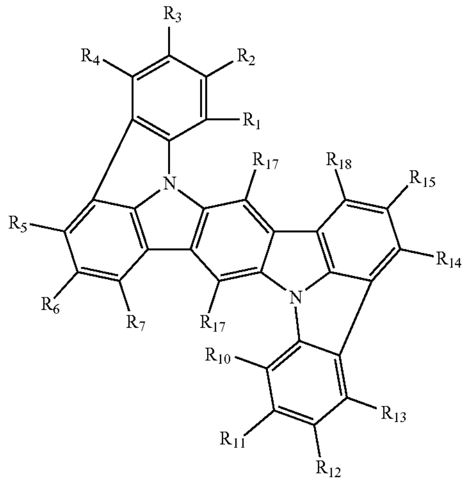

In the formula (33-11):

at least one combination of adjacent two or more of $R_1$ to $R_7$ and $R_{10}$ to $R_{16}$ are mutually bonded to form a substituted or unsubstituted monocyclic ring, mutually bonded to form a substituted or unsubstituted fused ring, or not mutually bonded; and $R_1$ to $R_7$ and $R_{10}$ to $R_{16}$ forming neither the substituted or unsubstituted monocyclic ring nor the substituted or unsubstituted fused ring and $R_{17}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted alkylthio group having 1 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted aralkyl group having 7 to 50 carbon atoms, a group represented by $—Si(R_{31})(R_{32})(R_{33})$, a group represented by $—C(=O)R_{34}$, a group represented by $—COOR_{35}$, a group represented by $—N(R_{36})(R_{37})$, a halogen atom, a cyano group, a nitro group, a substituted or unsubstituted aryl group having 6 to 50 ring carbon atoms, or a substituted or unsubstituted heterocyclic group having 5 to 50 ring atoms, provided that at least one selected from $R_1$ to $R_7$ and $R_{10}$ to $R_{16}$ is a group represented by $—N(R_{36})(R_{37})$;

two $R_{17}$ are mutually the same or different; and $R_{31}$ to $R_{37}$ each independently represent the same as $R_{31}$ to $R_{37}$ in the formula (31-1), the formula (31-2), and the formula (31-3).

It is also preferable that any two selected from $R_1$ to $R_7$ and $R_{10}$ to $R_{16}$ in the formula (31-11) are each a group represented by $—N(R_{36})(R_{37})$.

It is also preferable that the compound represented by the formula (31-11) is a compound represented by the following formula (33-13).

[Formula 435]

(33-13)

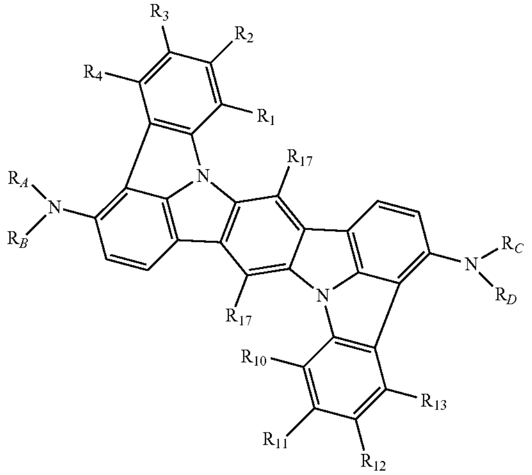

In the formula (33-13):

at least one combination of adjacent two or more of $R_1$ to $R_4$ and $R_{10}$ to $R_{13}$ are mutually bonded to form a substituted or unsubstituted monocyclic ring, mutually bonded to form a substituted or unsubstituted fused ring, or not mutually bonded; and $R_1$ to $R_4$ and $R_{10}$ to $R_{13}$ forming neither the substituted or unsubstituted monocyclic ring nor the substituted or unsubstituted fused ring and $R_{17}$ are each independently a hydrogen atom, a substituted or unsubstituted aryl group having 6 to 18 ring carbon atoms, or a substituted or unsubstituted heterocyclic group having 5 to 18 ring atoms;

two $R_{17}$ are mutually the same or different; and $R_A$, $R_B$, $R_C$, and $R_D$ are each independently a substituted or unsubstituted aryl group having 6 to 18 ring carbon atoms, or a substituted or unsubstituted heterocyclic group having 5 to 18 ring atoms.

It is also preferable that the compound represented by the formula (31-13) is a compound represented by the following formula (33-14).

[Formula 436]

(33-14)

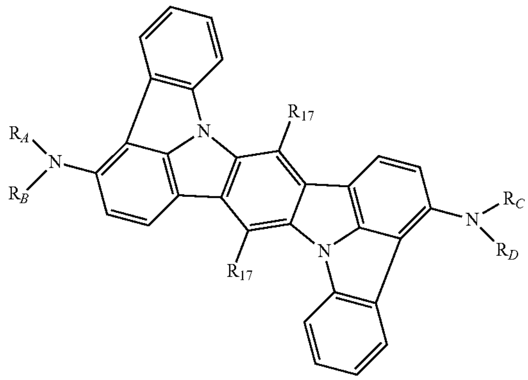

In the formula (33-14): $R_{17}$, $R_A$, $R_B$, $R_C$, and $R_D$ each independently represent the same as $R_{17}$, $R_A$, $R_B$, $R_C$, and $R_D$ in the formula (33-13); and two $R_{17}$ are mutually the same or different.

In the formula (33-13) and the formula (33-14), it is preferable that $R_A$, $R_B$, $R_C$, and $R_D$ are each independently a substituted or unsubstituted aryl group having 6 to 18 ring carbon atoms.

In the formula (33-13) and the formula (33-14), it is preferable that $R_A$, $R_B$, $R_C$, and $R_D$ are each independently a substituted or unsubstituted phenyl group.

In the compound represented by the formulae (31-1) and (31-3) or the compound represented by the formulae (31-2) and (31-3), $R_{17}$ is preferably a hydrogen atom.

In the compounds represented by the formula (31-11), the formula (33-13), and the formula (33-14), it is preferable that the substituent for each of the "substituted or unsubstituted" groups is selected from the group consisting of an alkyl group having 1 to 18 carbon atoms, an aryl group having 6 to 18 ring carbon atoms, and a heterocyclic group having 5 to 18 ring atoms.

In the compounds represented by the formula (31-11), the formula (33-13), and the formula (33-14), it is preferable that the substituent for each of the "substituted or unsubstituted" groups is an alkyl group having 1 to 5 carbon atoms.

Specific Examples of Compound Represented by Formulae (31-1) and (31-3) or Compound Represented by Formulae (31-2) and (31-3)

Specific example of the compound represented by the formulae (31-1) and (31-3) or the compound represented by the formulae (31-2) and (31-3) include the following compounds.

[Formula 437]

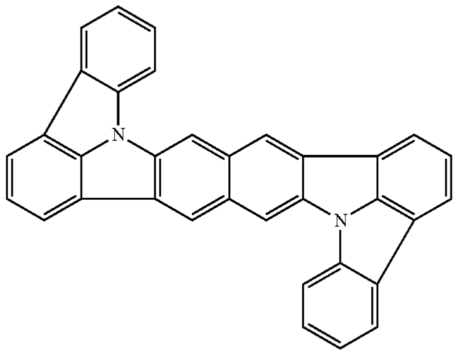

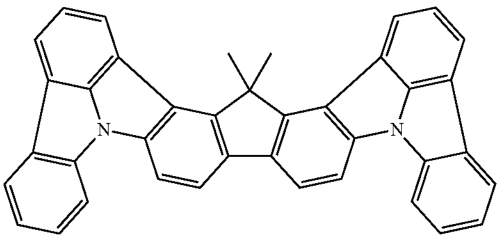

-continued
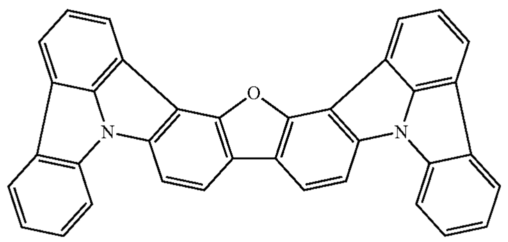
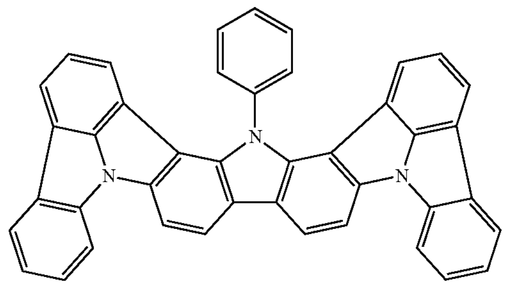
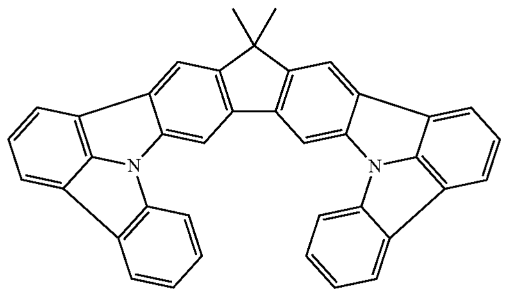
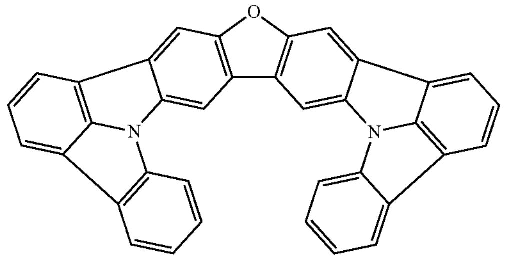
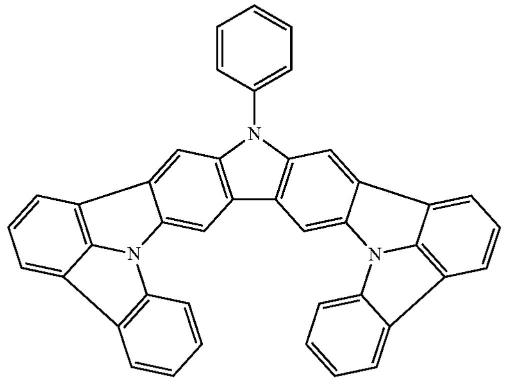
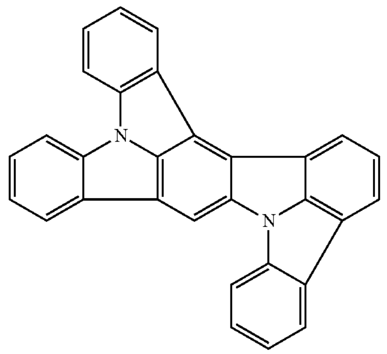
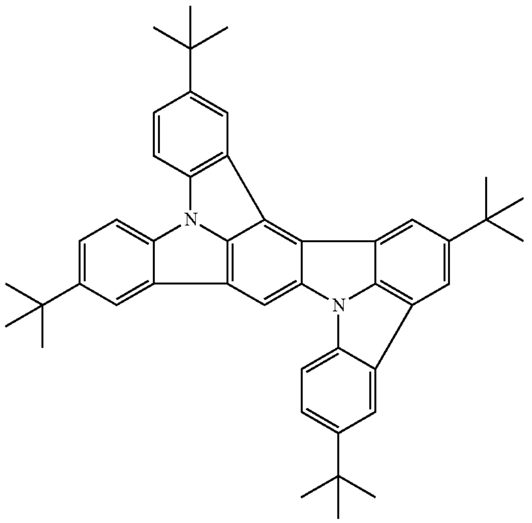
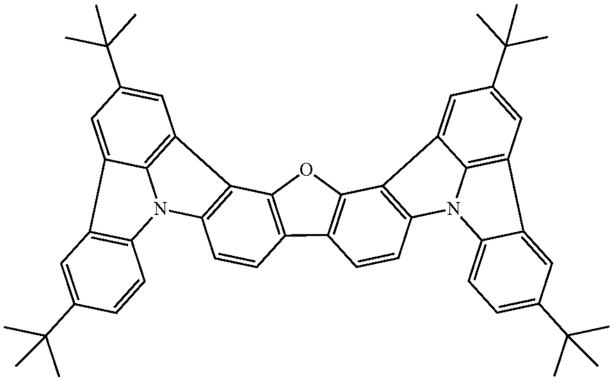

-continued
[Formula 438]
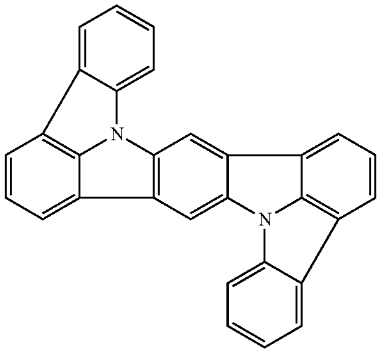
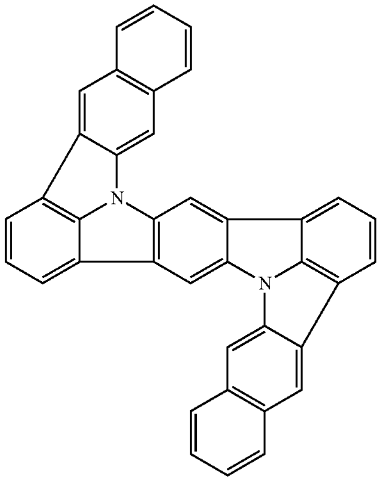
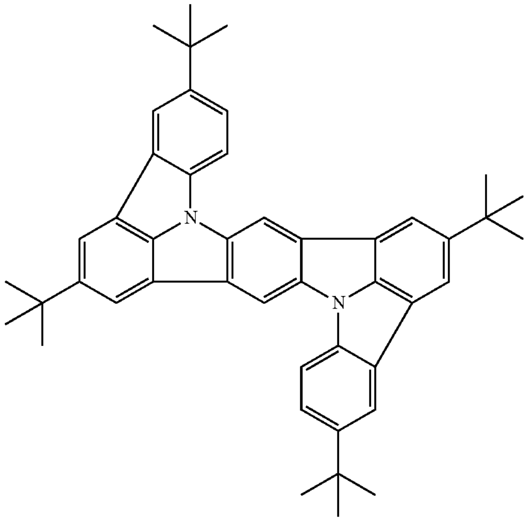
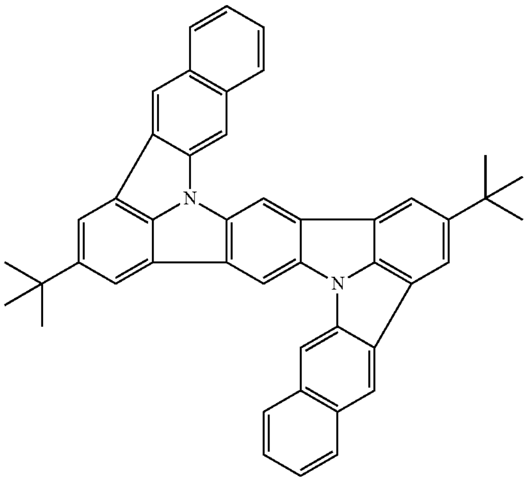
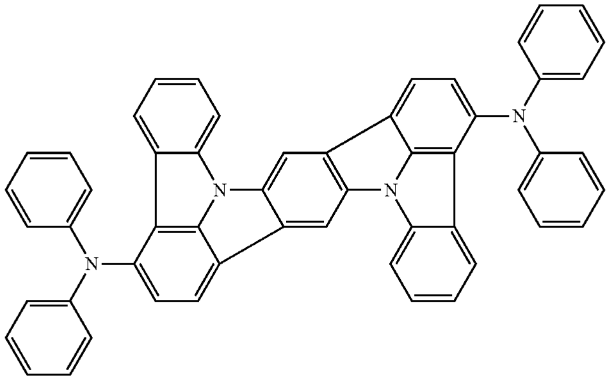

-continued
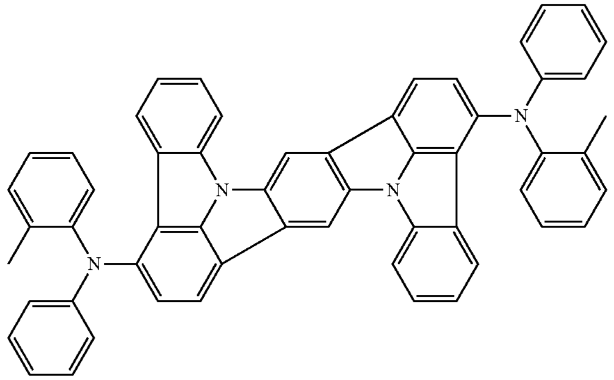
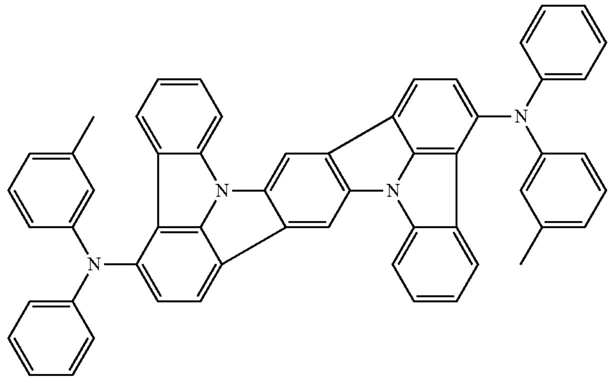
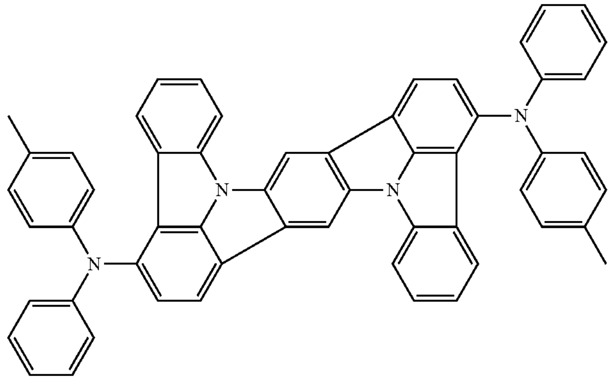
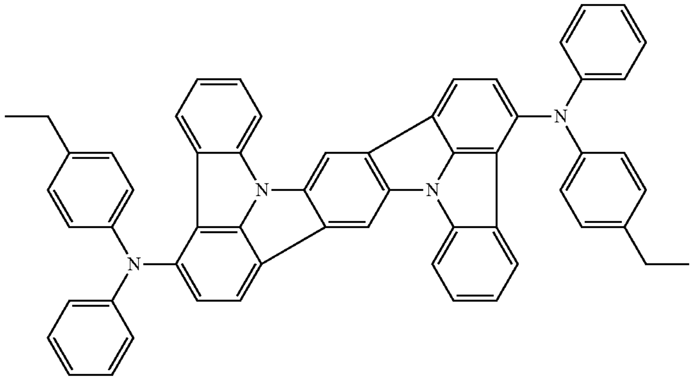

-continued
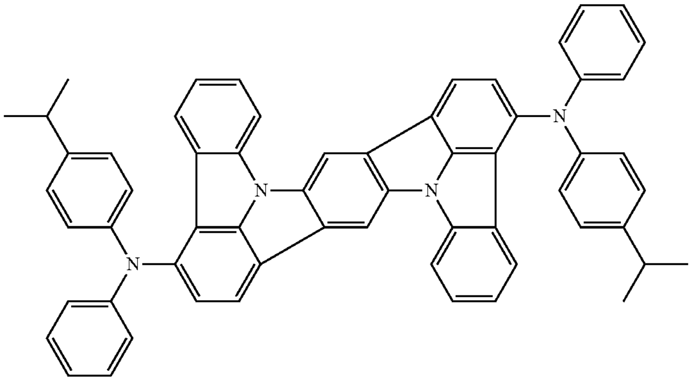
[Formula 439]
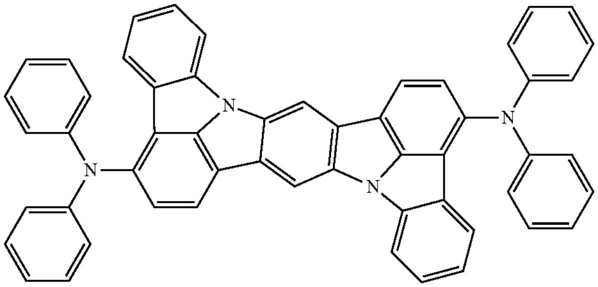
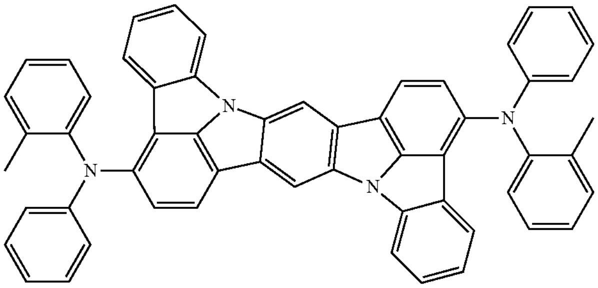
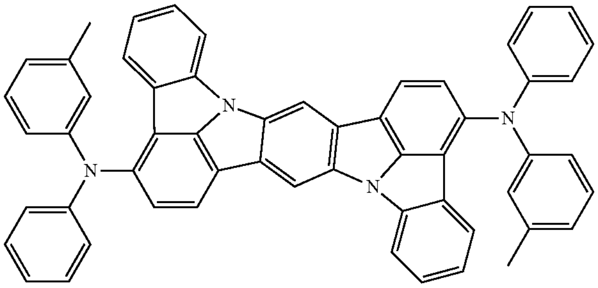
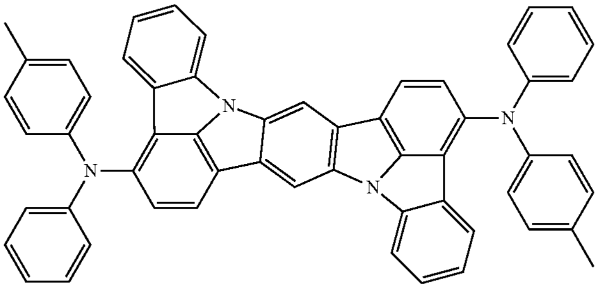

-continued
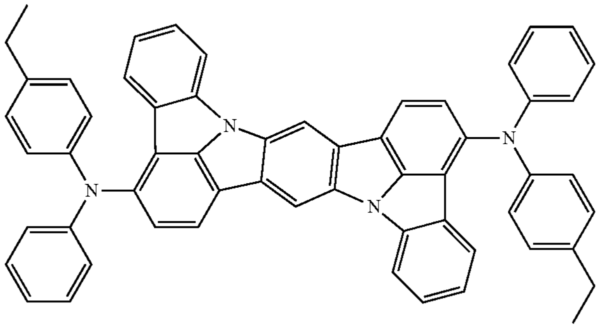
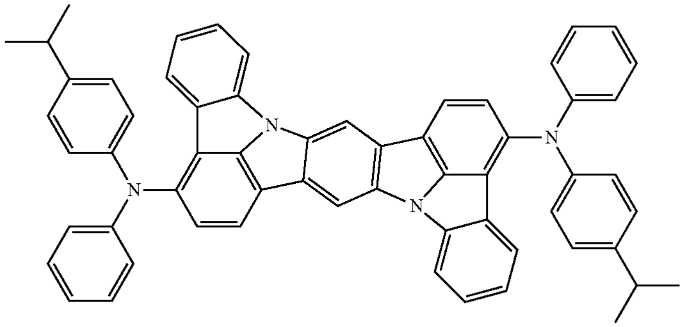
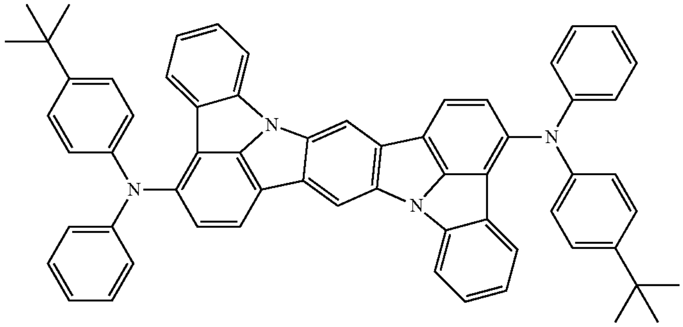
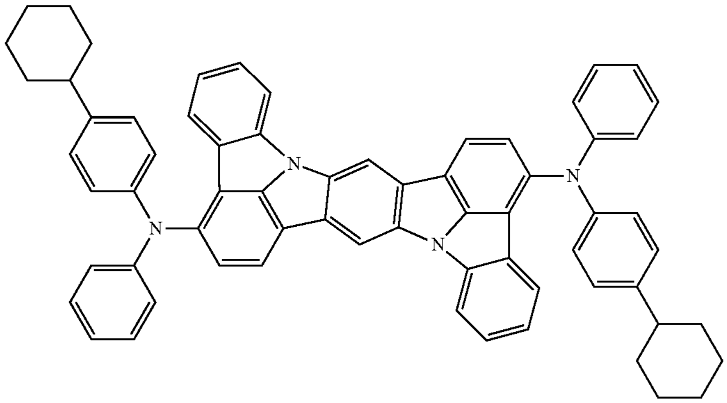

-continued
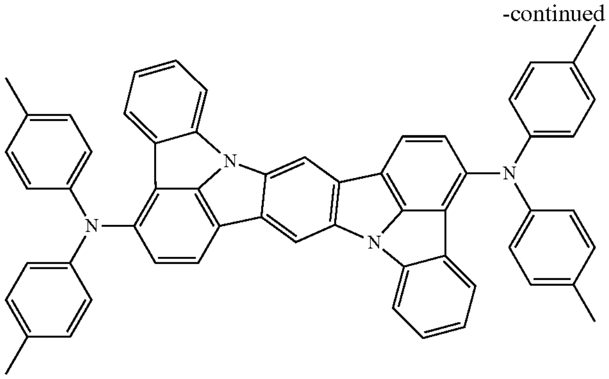
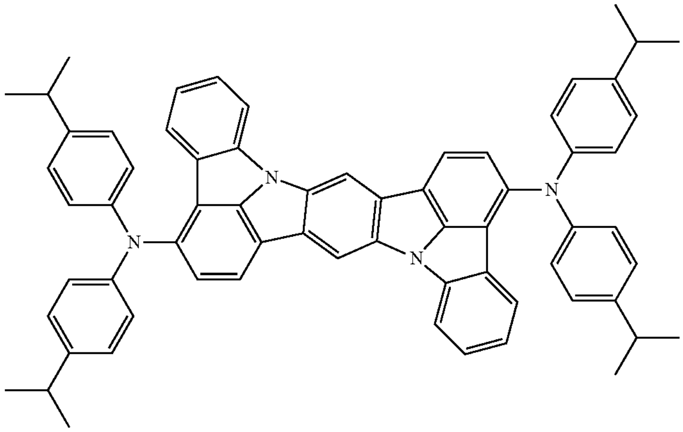
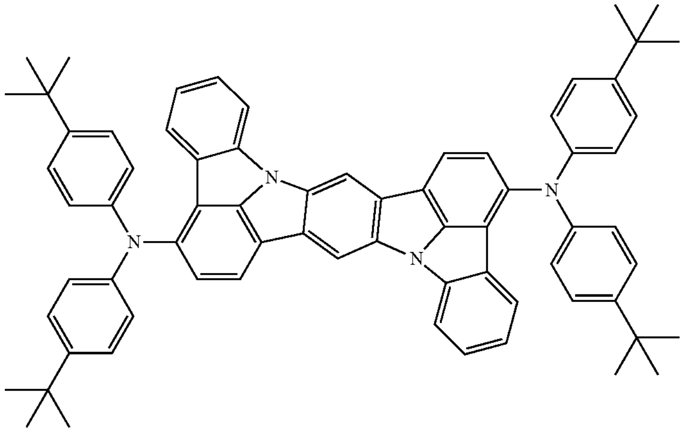
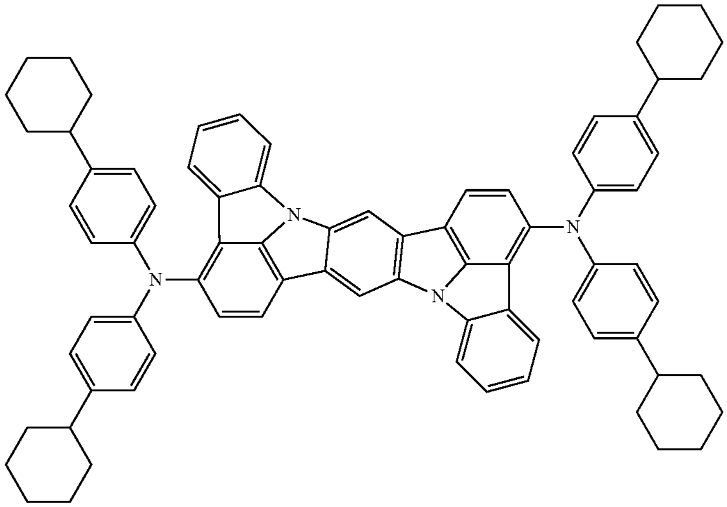

-continued
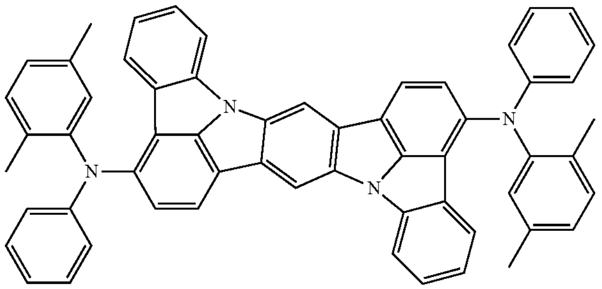
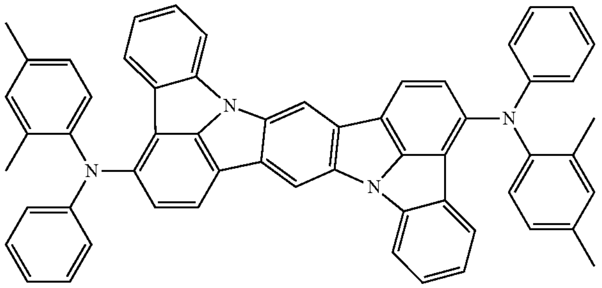
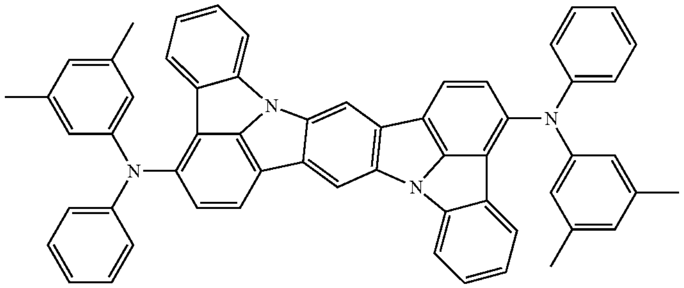
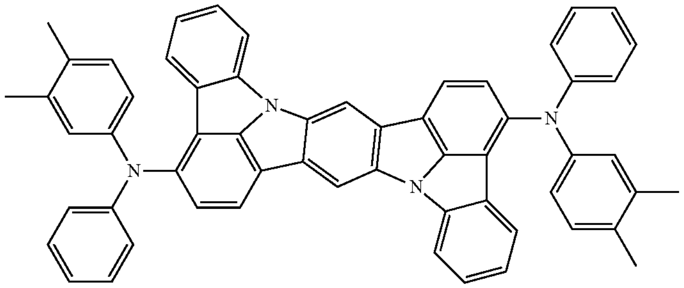
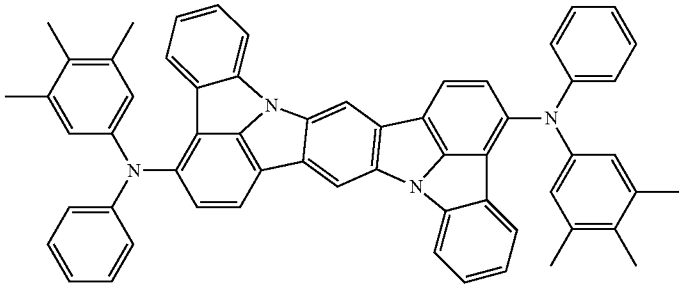

-continued
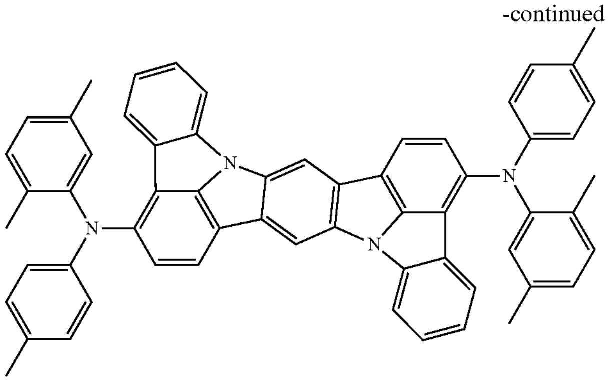
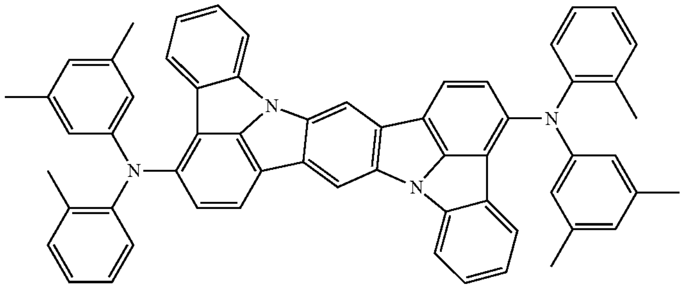
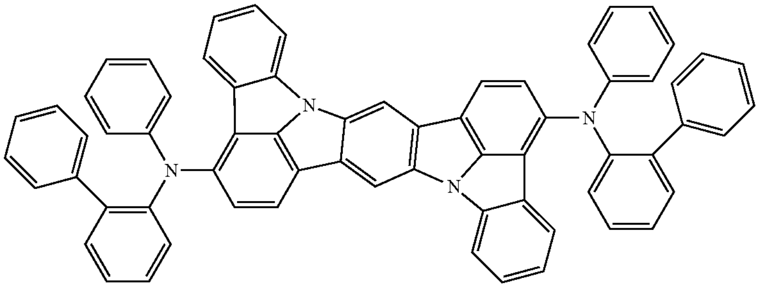
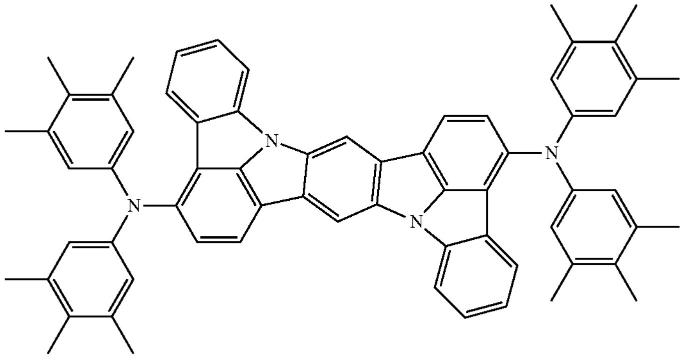
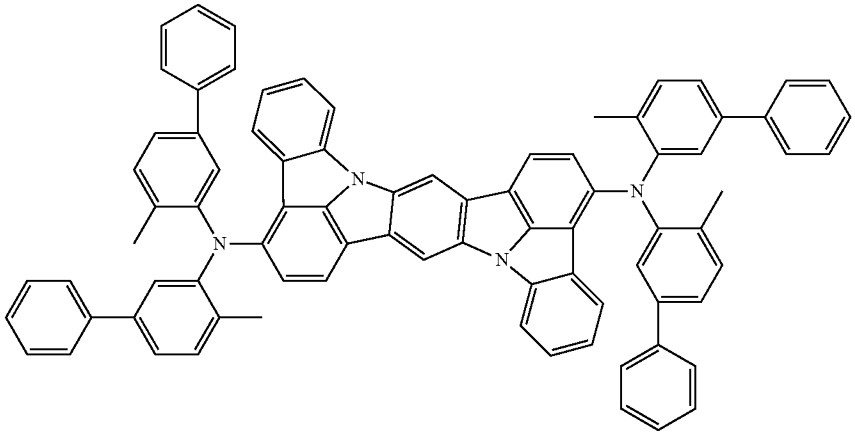

-continued
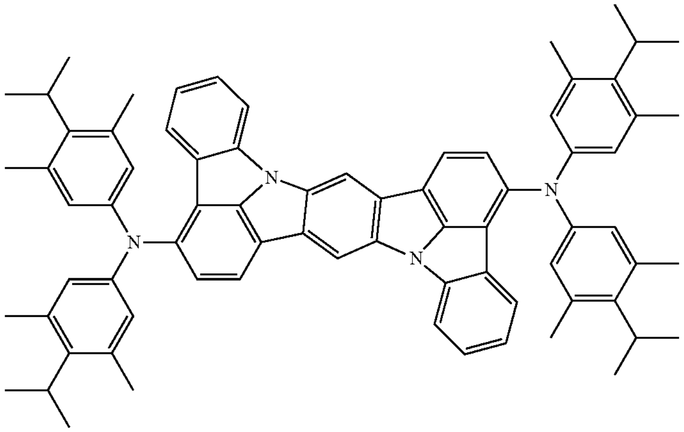
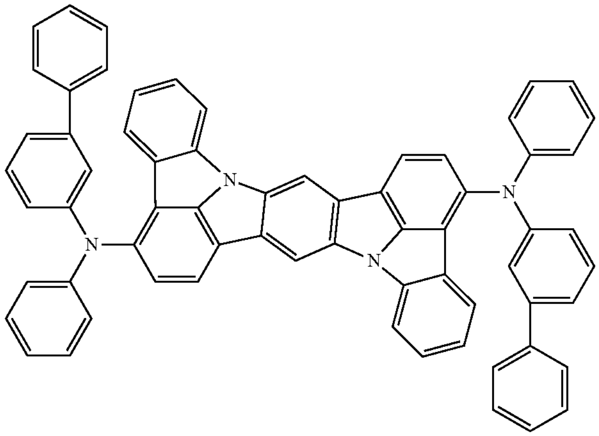
[Formula 440]
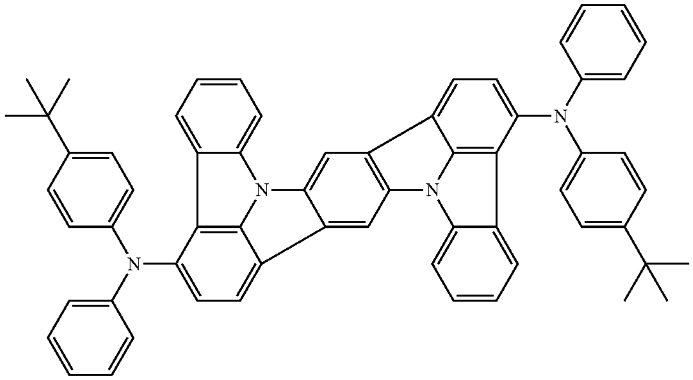
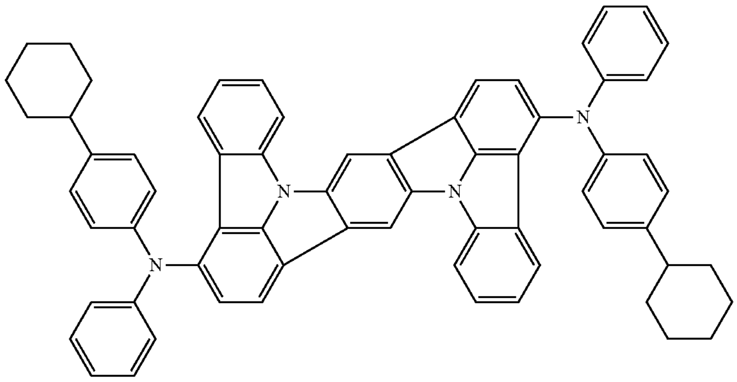

-continued
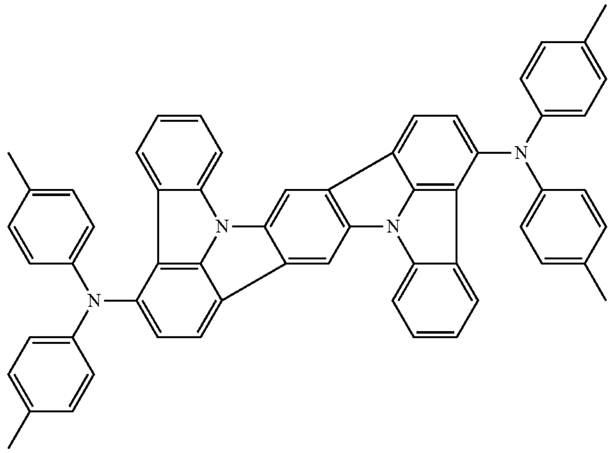
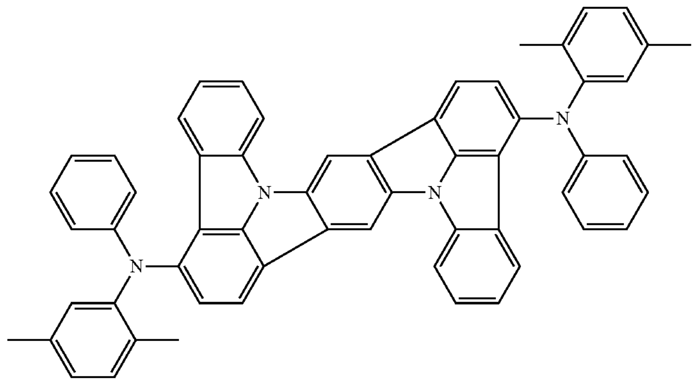
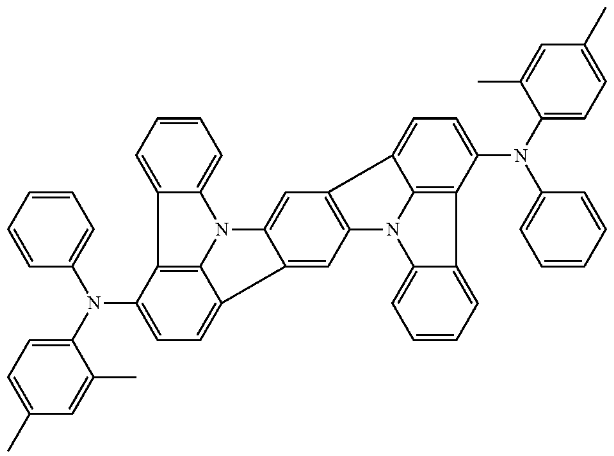

-continued
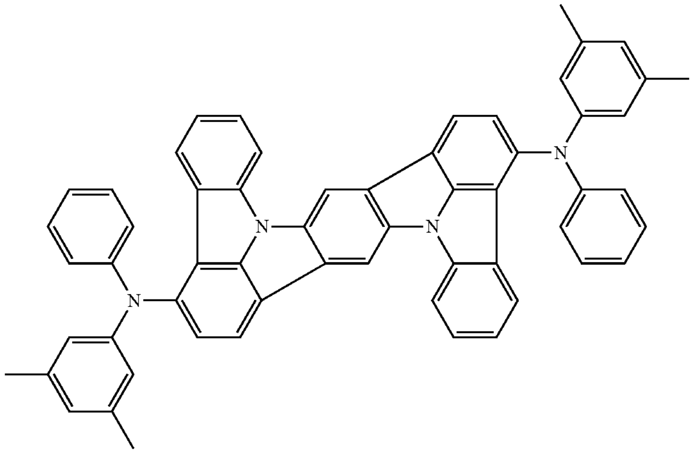
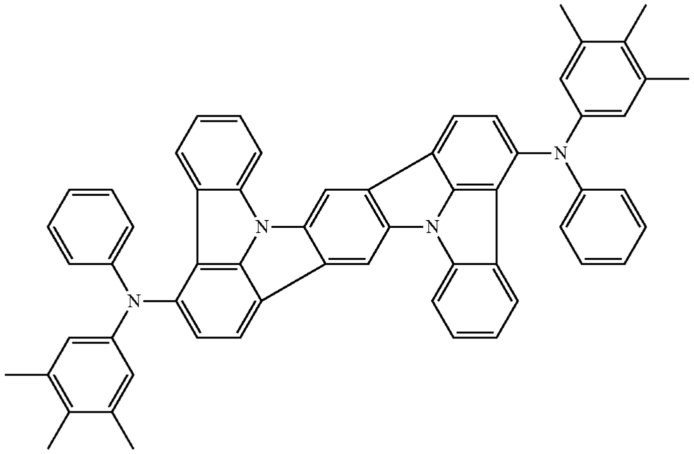
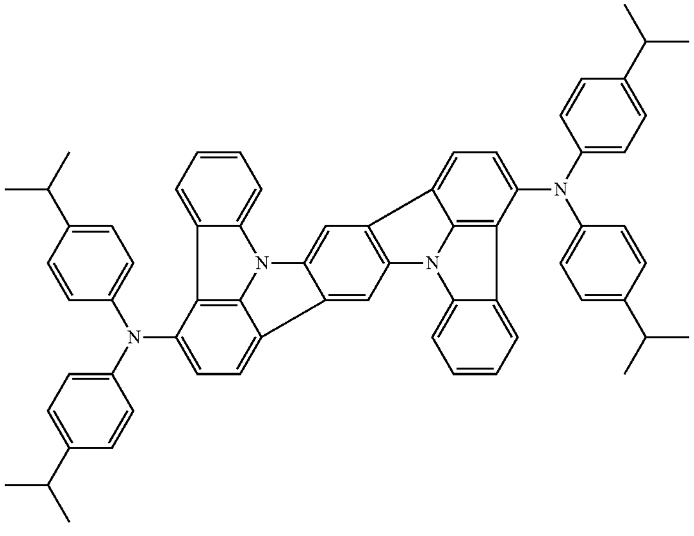

-continued
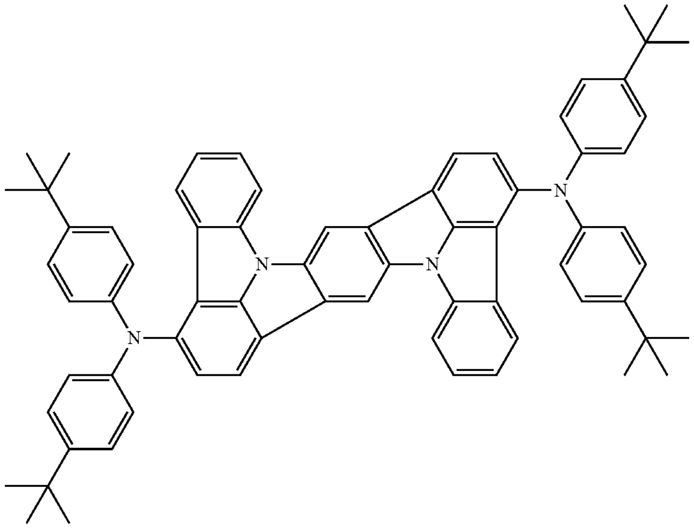
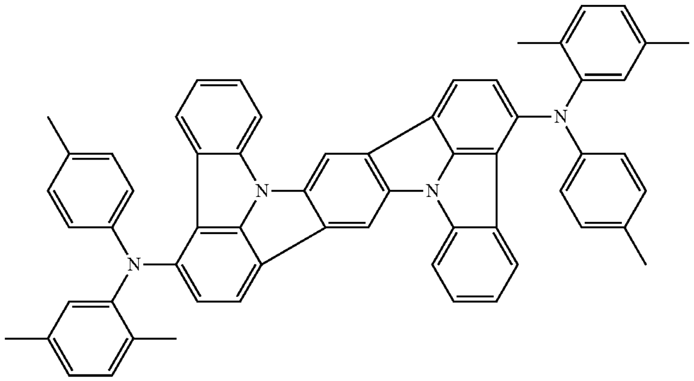
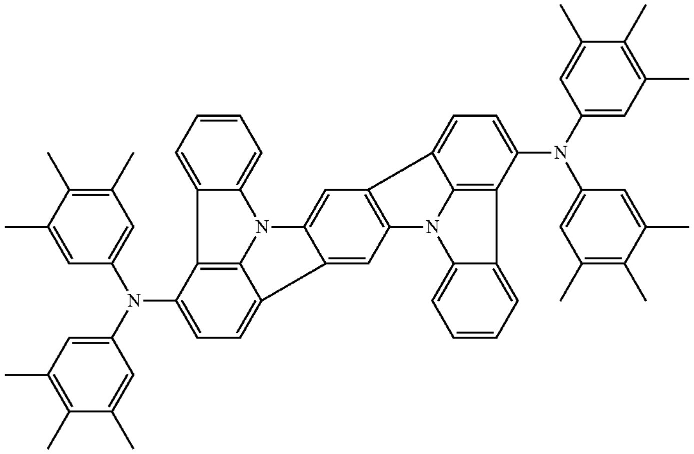
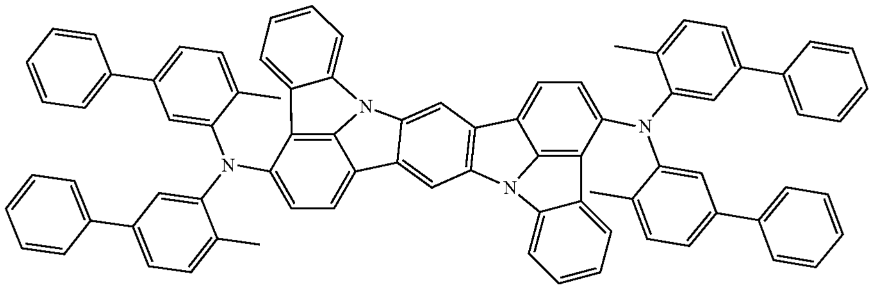

-continued
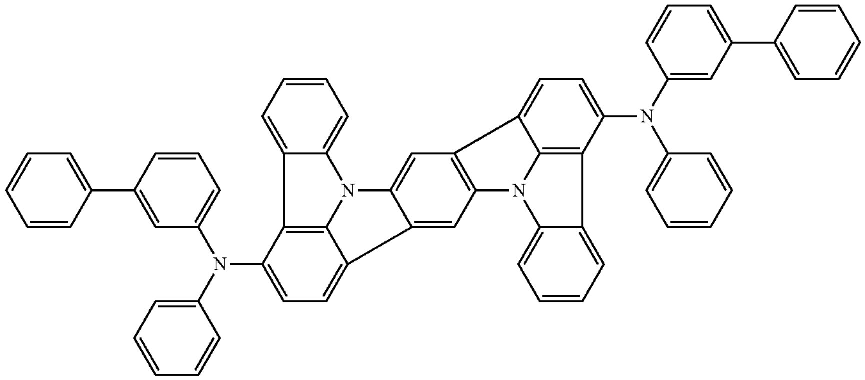
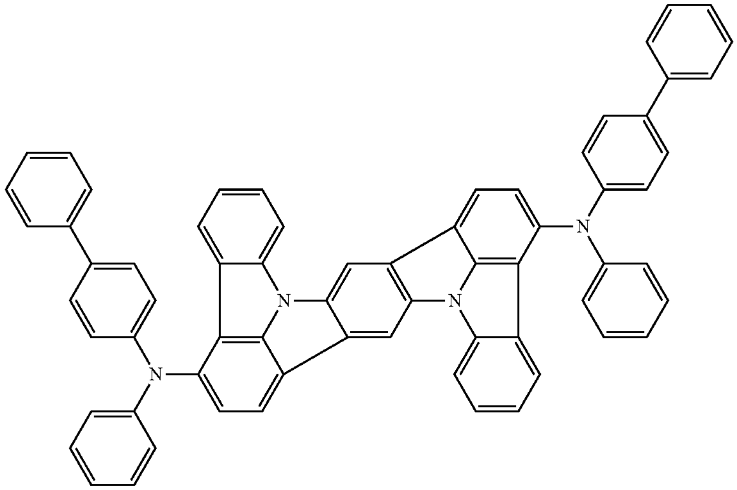
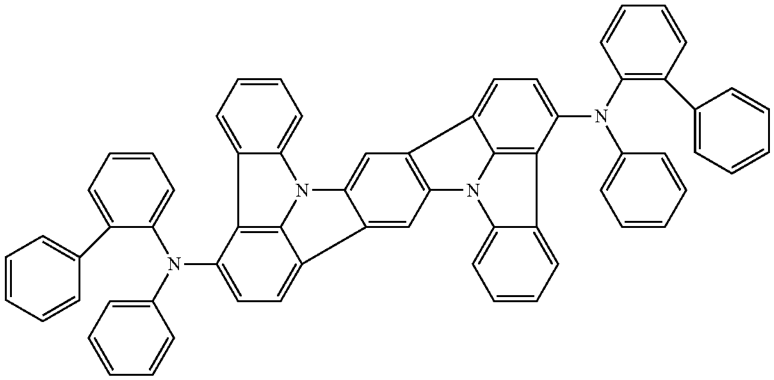
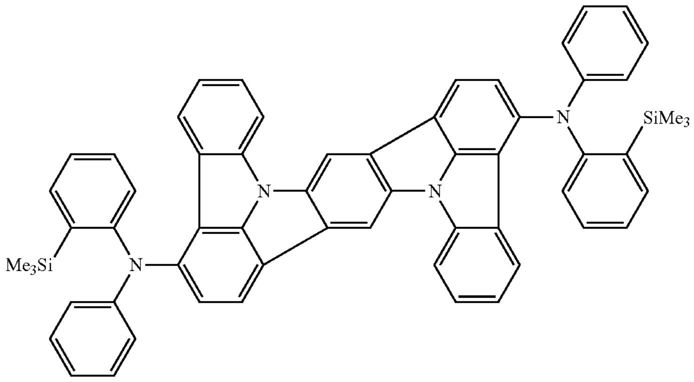

-continued
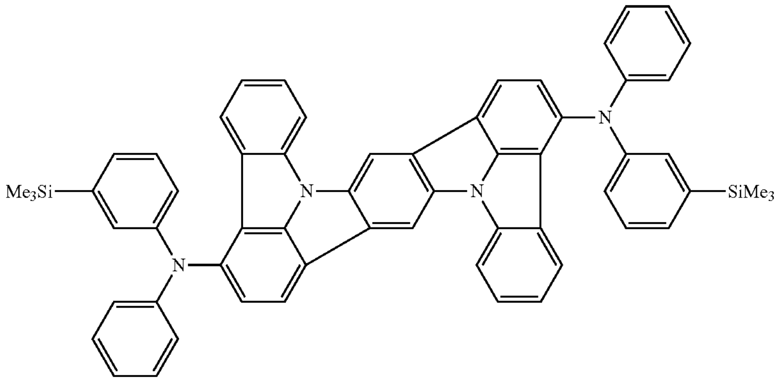
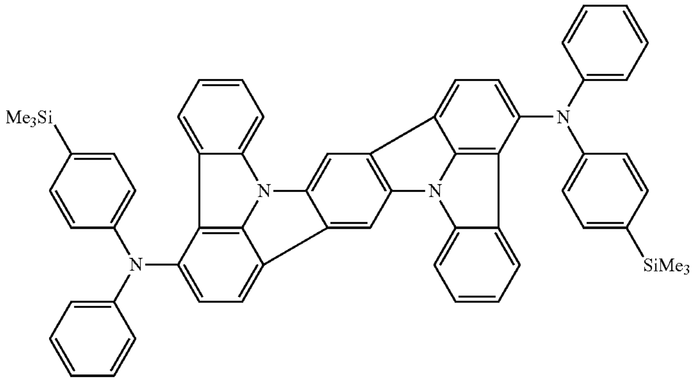
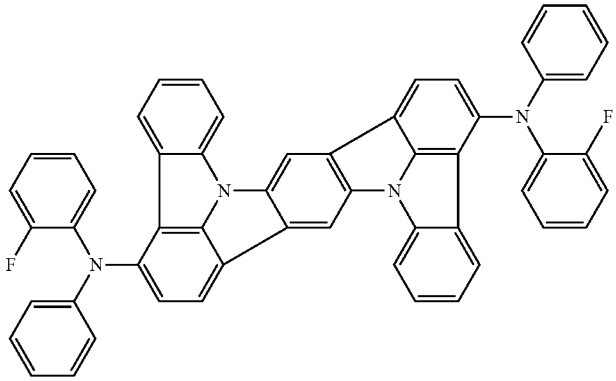
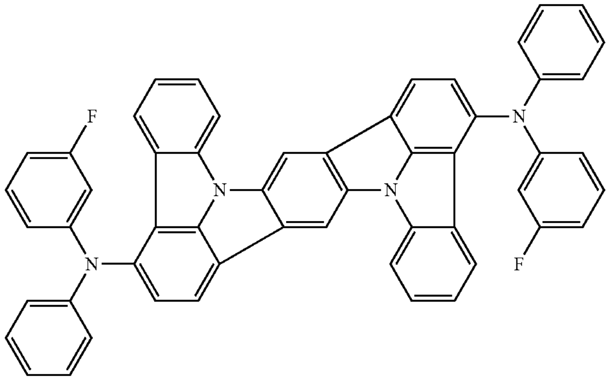

-continued
[Formula 441]
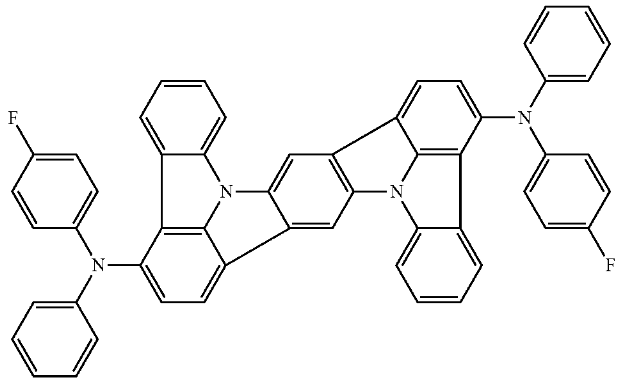
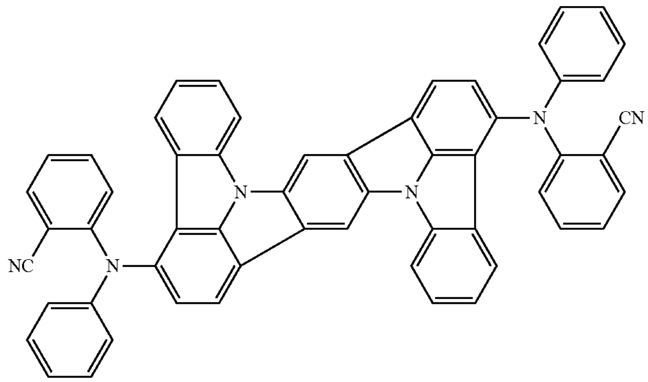
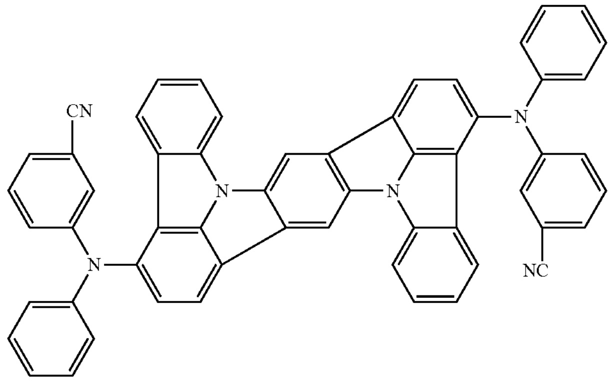
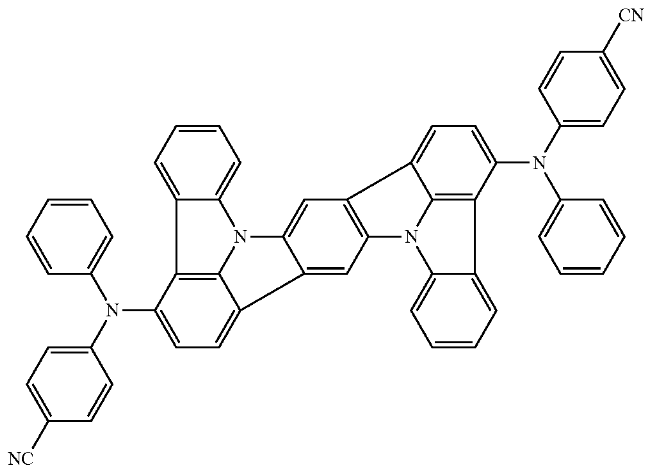

-continued
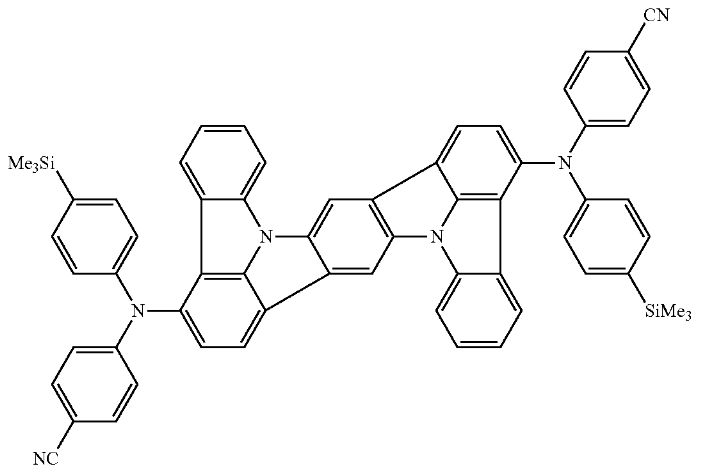
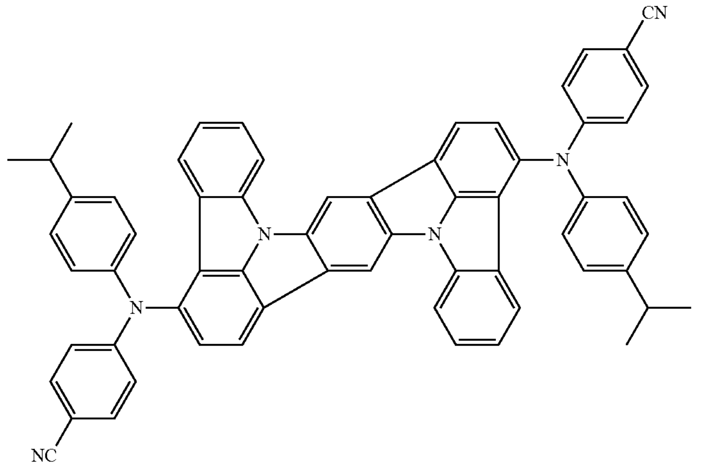
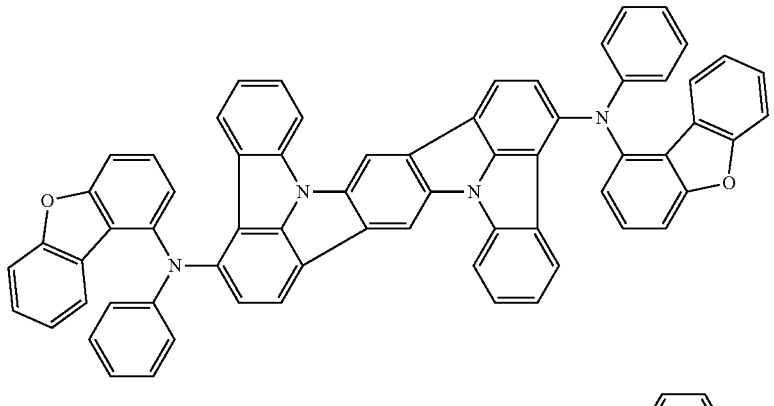
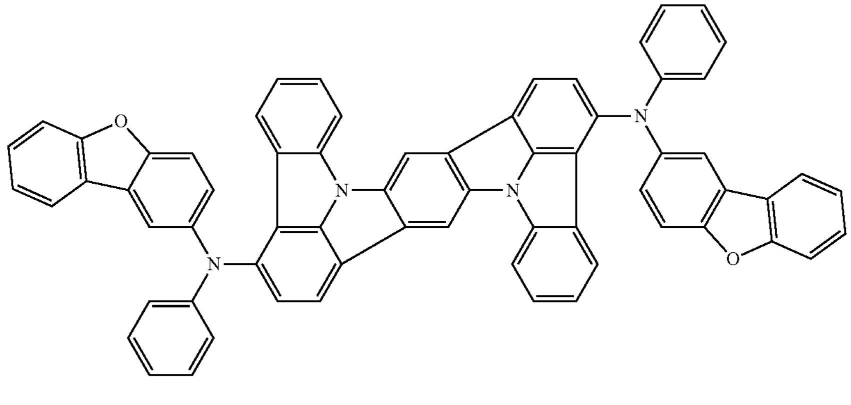

-continued
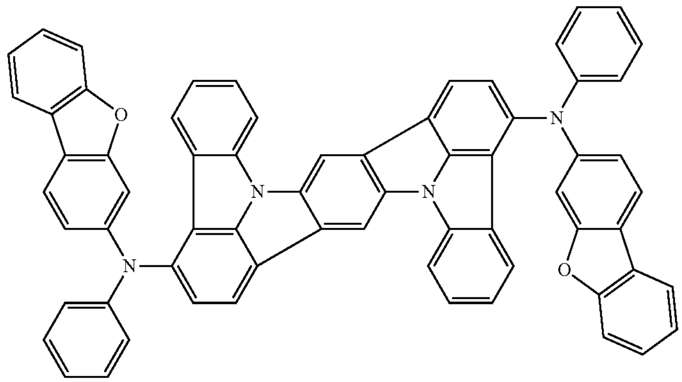
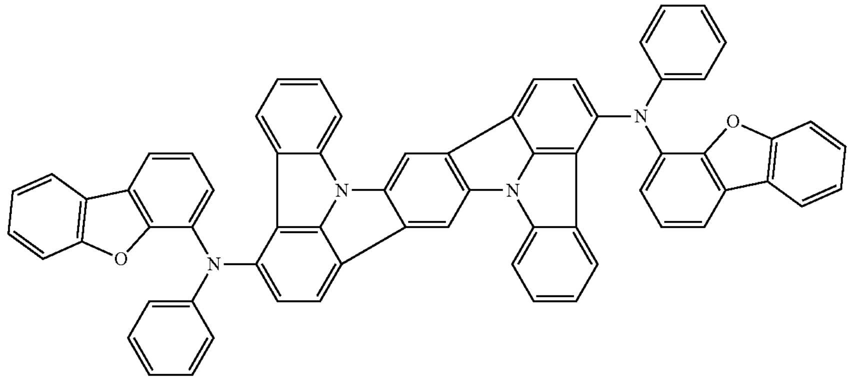
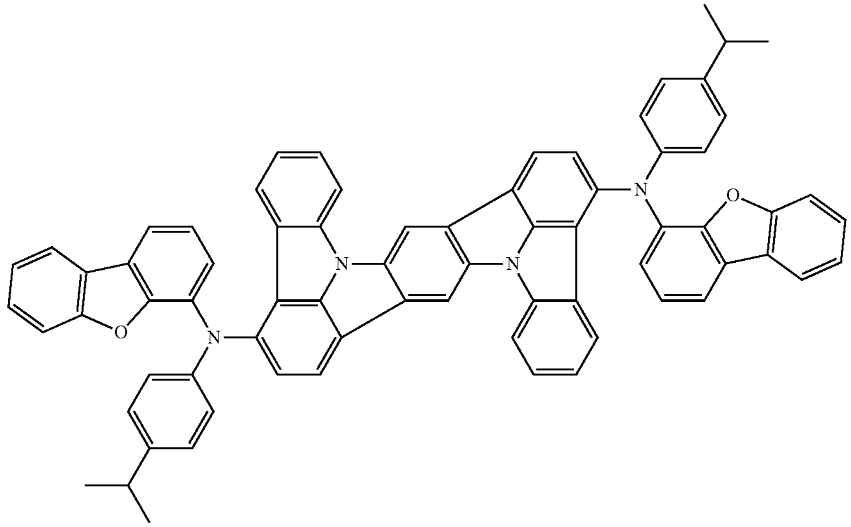
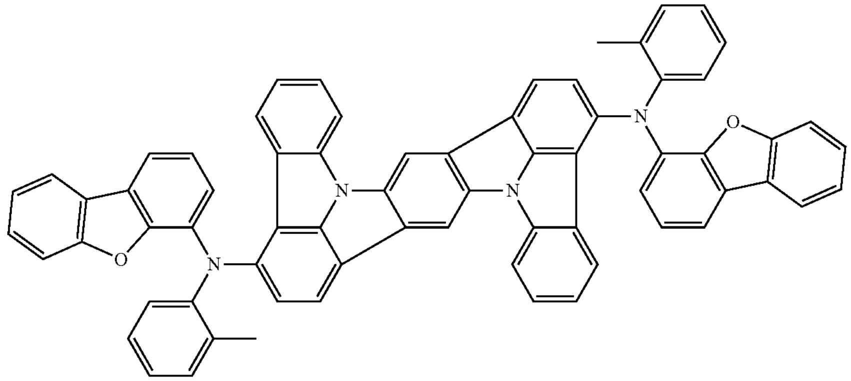

-continued
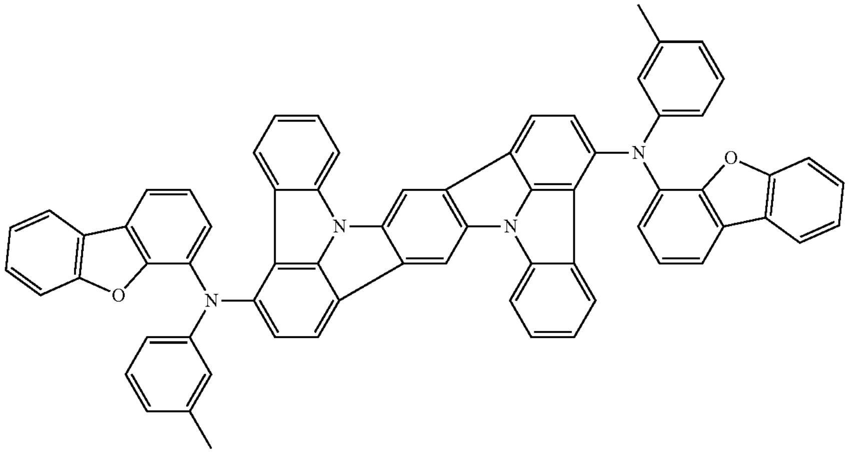
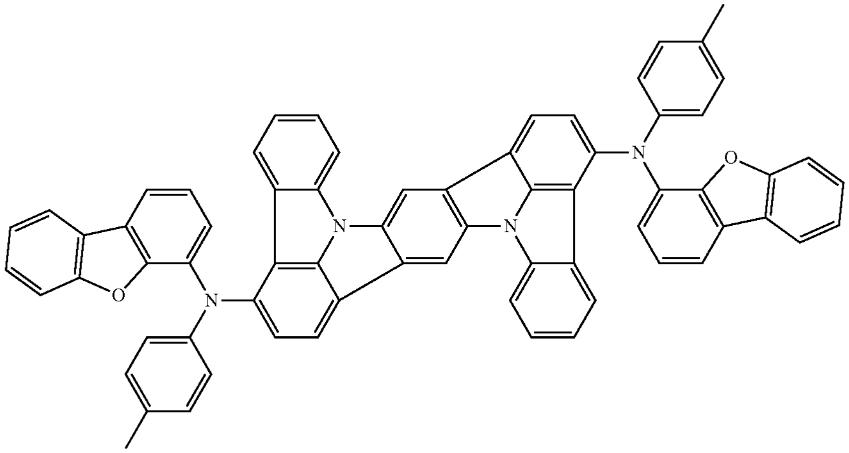
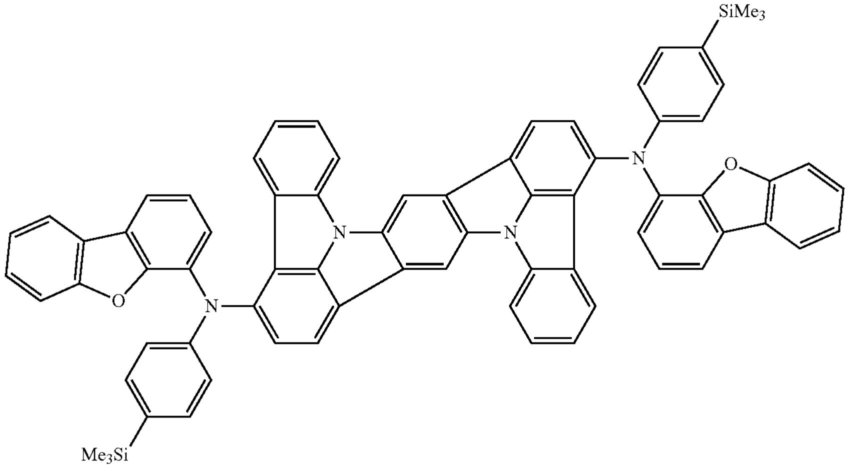

-continued
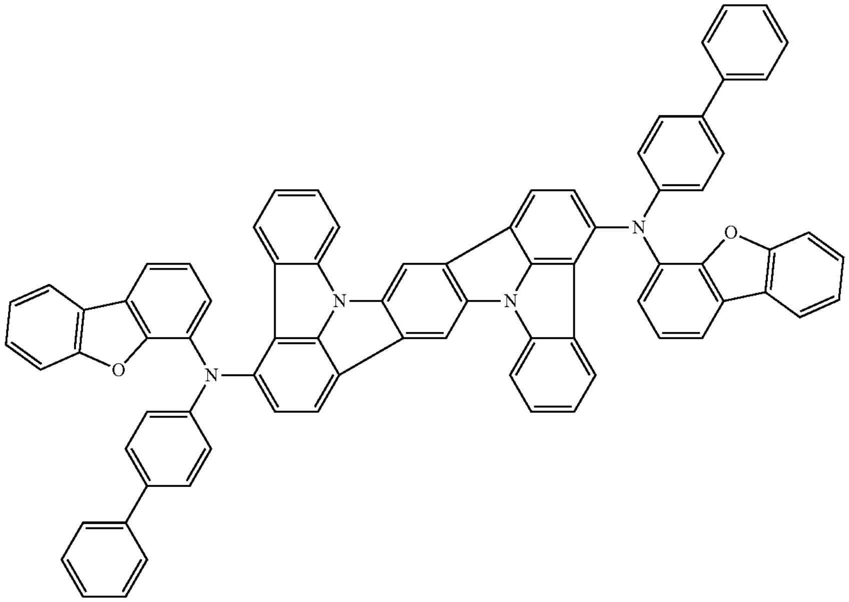
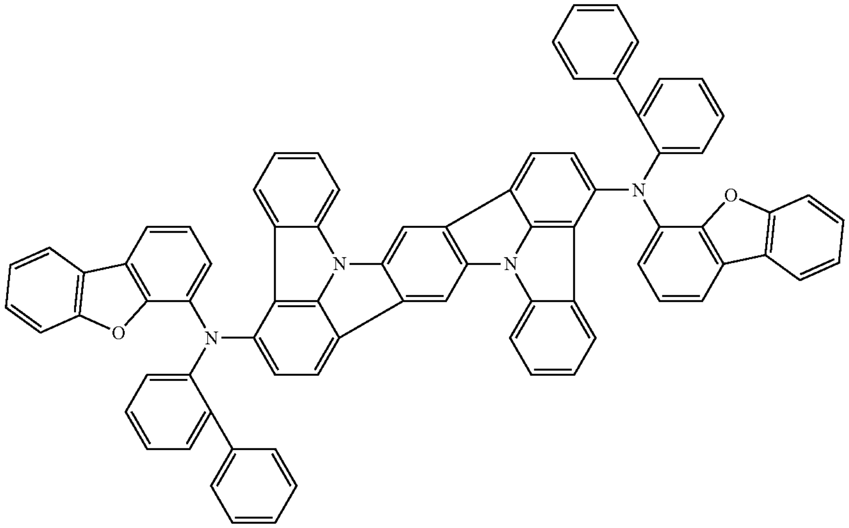
[Formula 442]
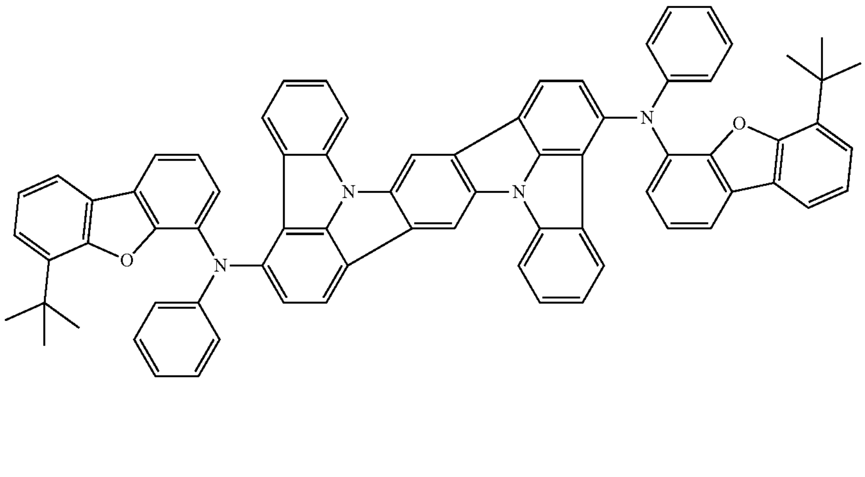

-continued
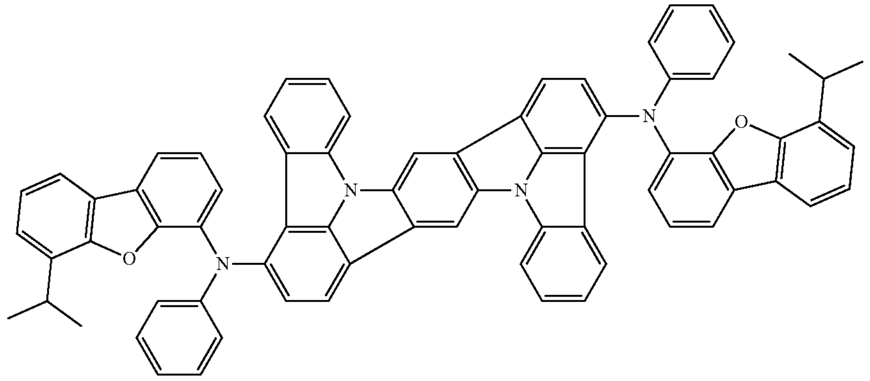
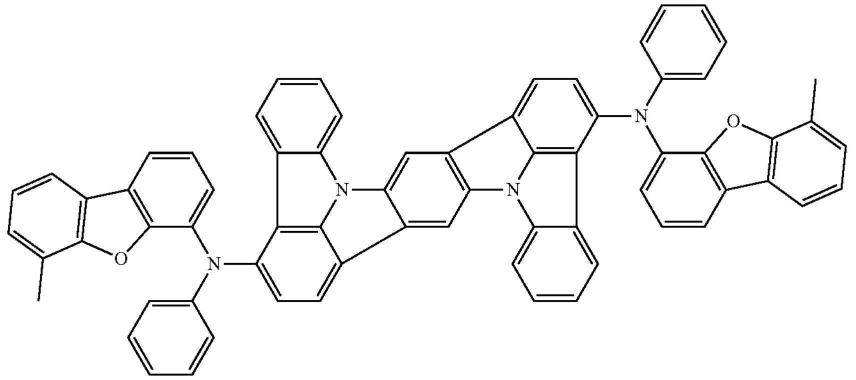
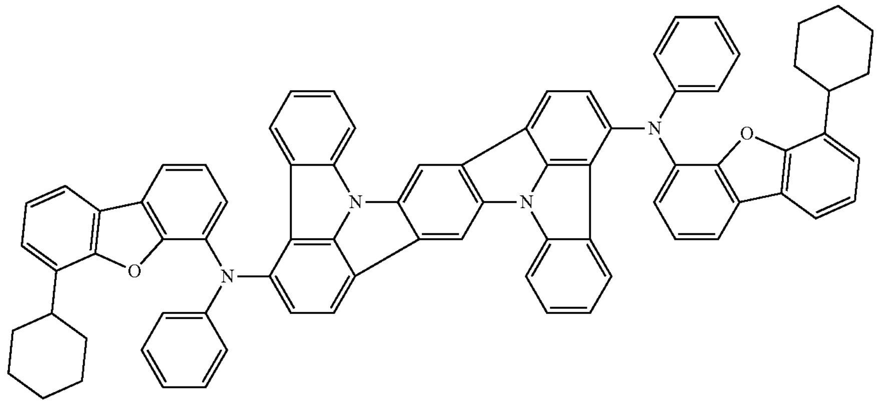
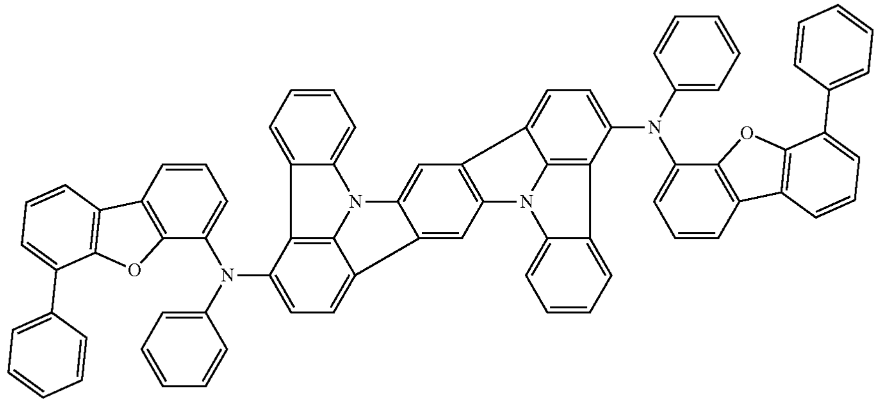

-continued
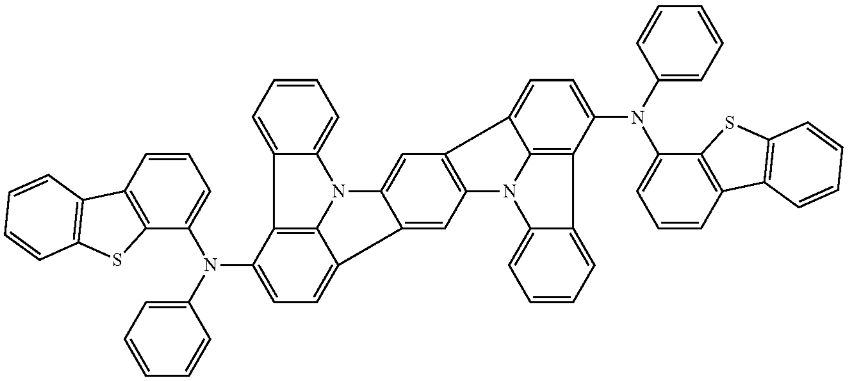
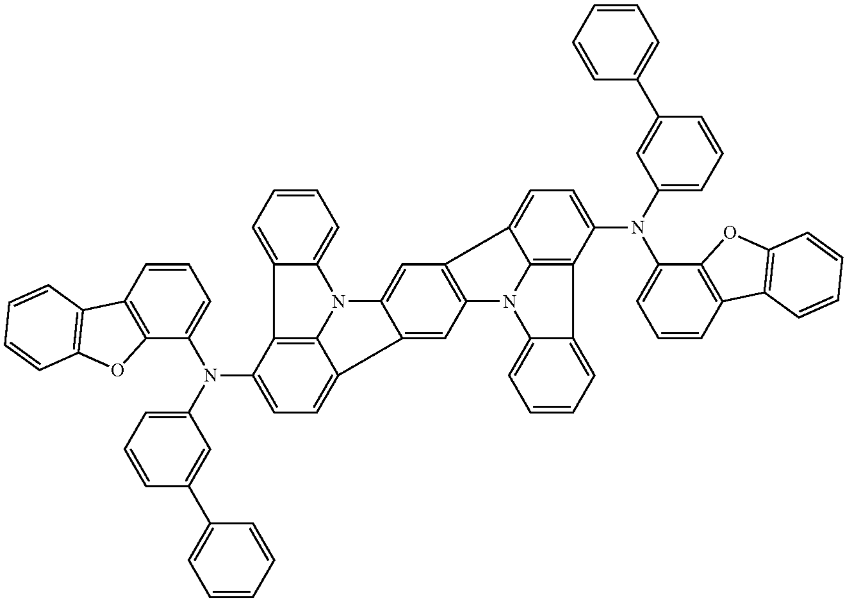
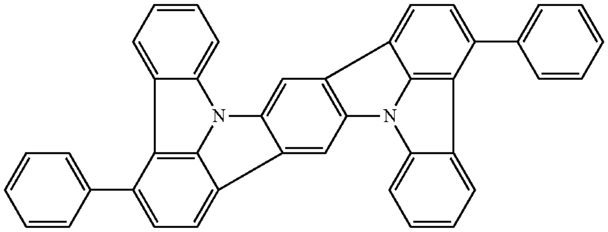
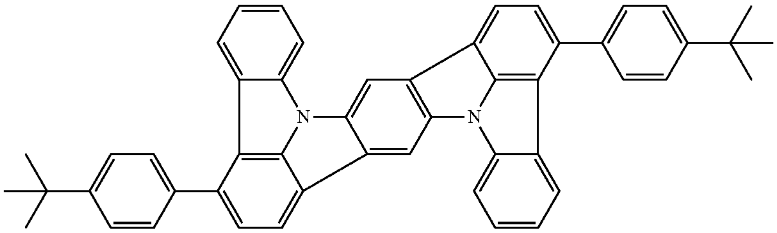
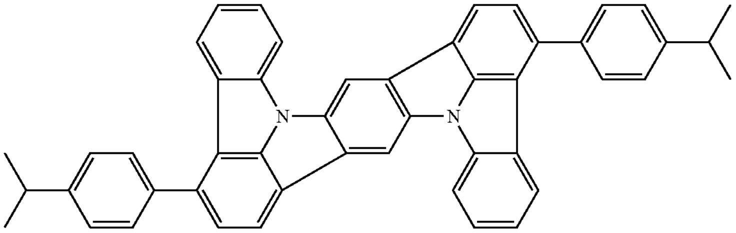

-continued
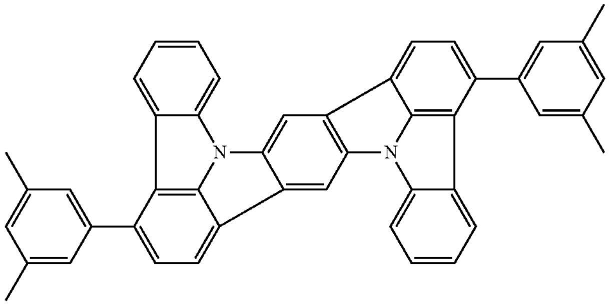
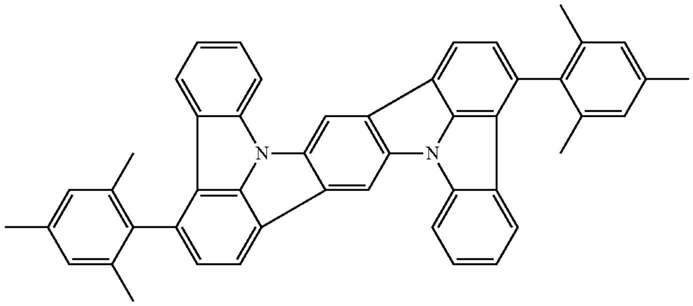
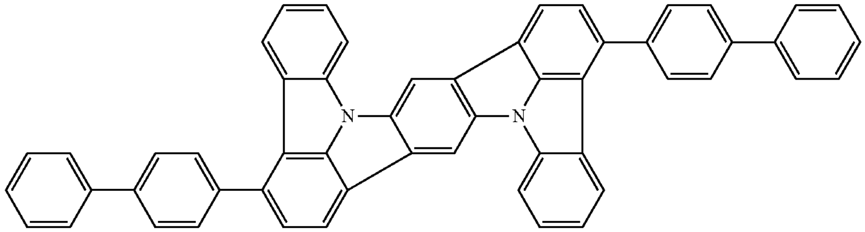
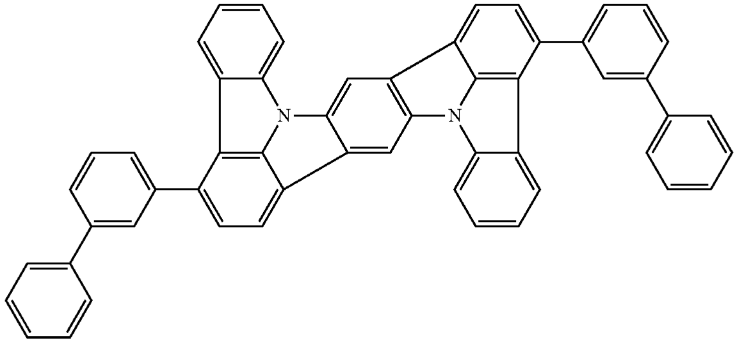
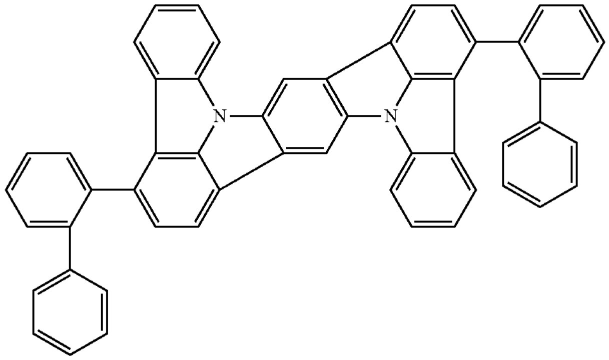

-continued
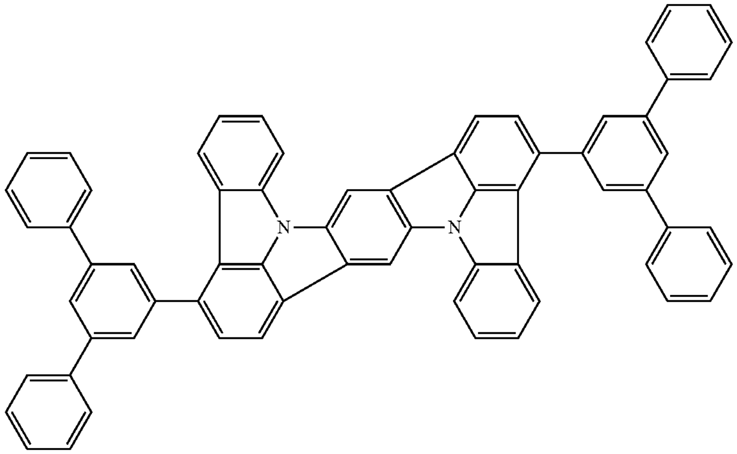
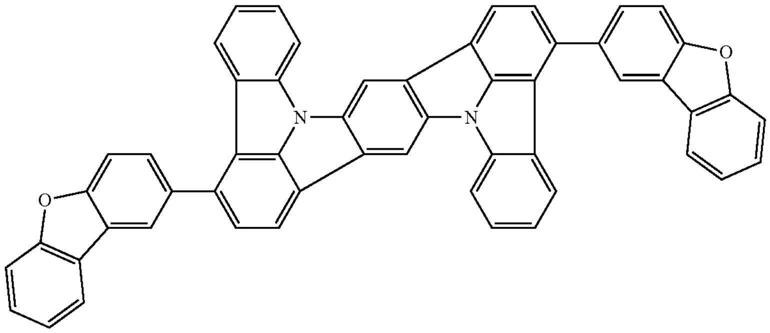
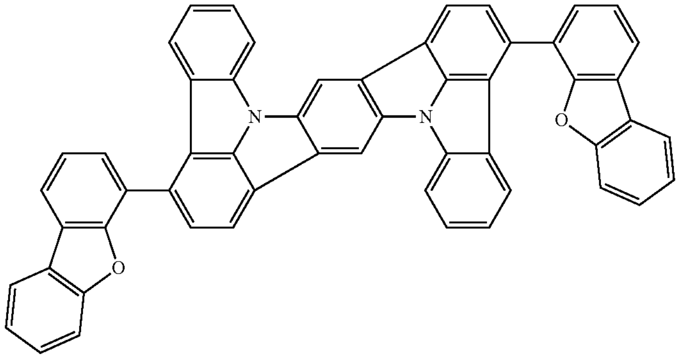
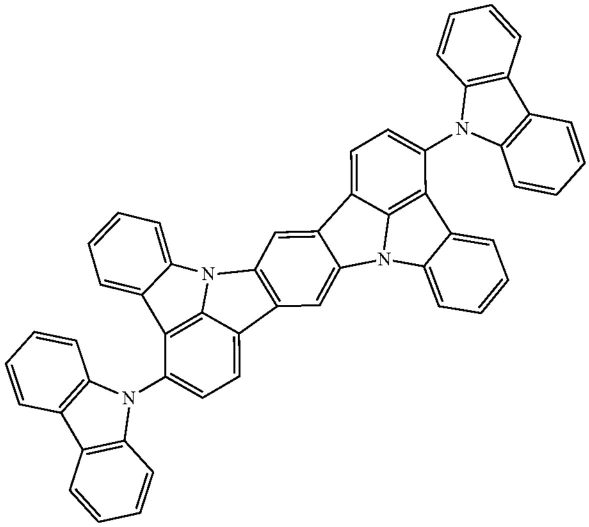 [SMILES: c1ccc2c(c1)c1ccccc1n2-c1ccc2c3cc4c(cc3n3c5ccccc5c1c23)c1ccc(-n2c3ccccc3c3ccccc32)c2c3ccccc3n4c12]

[Formula 443]
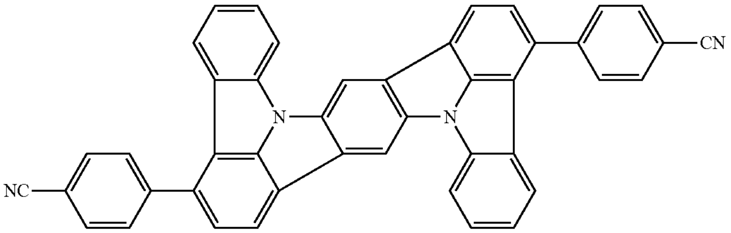
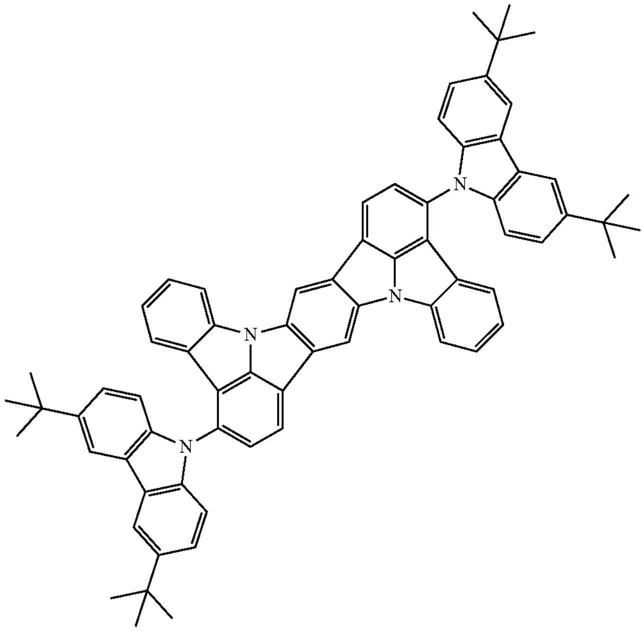
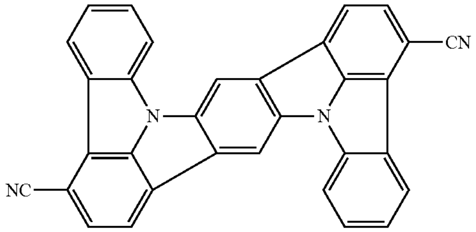
[Formula 444]
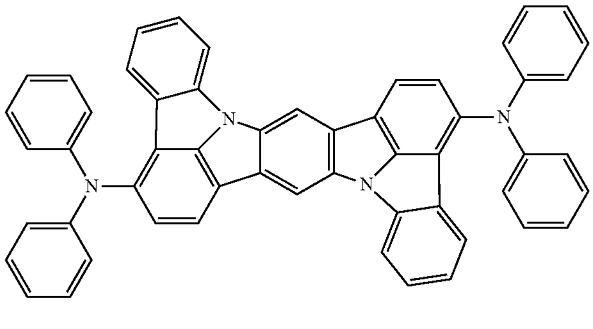

-continued
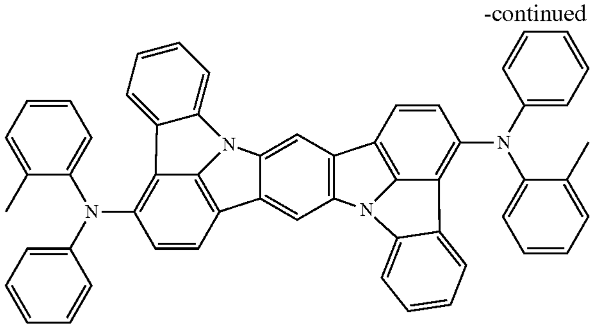
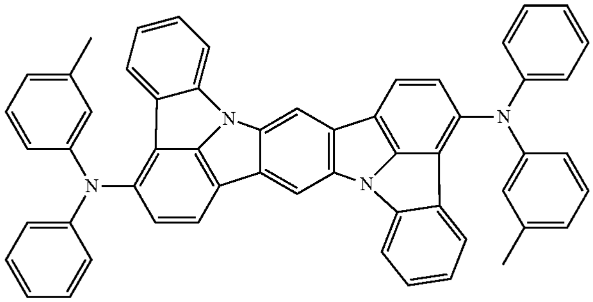
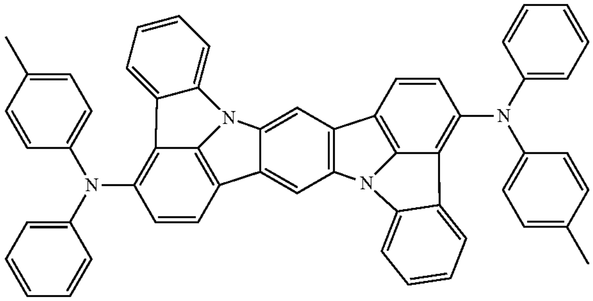
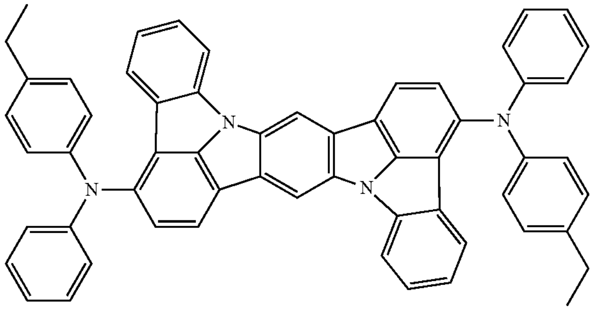
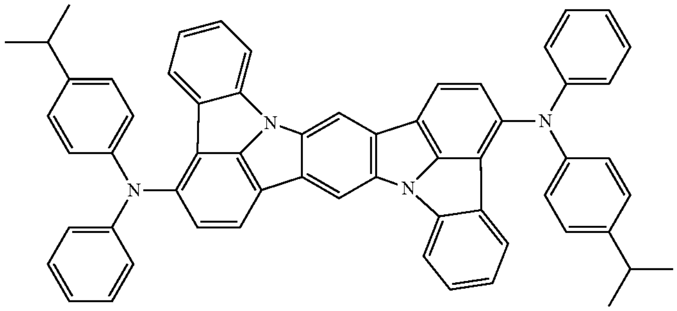

-continued
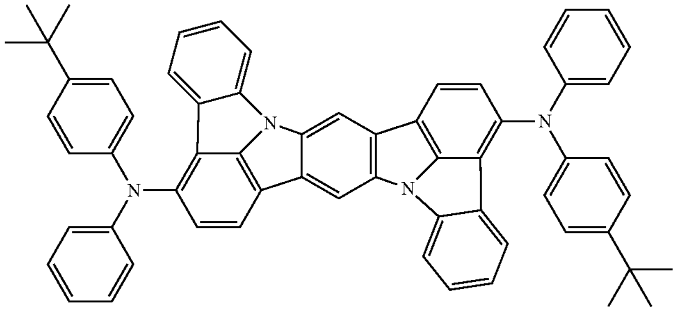
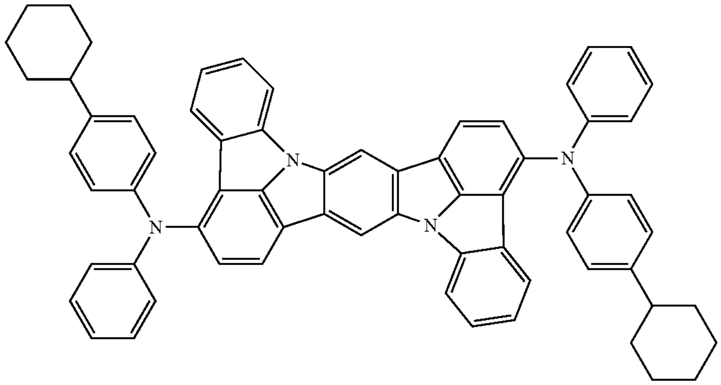
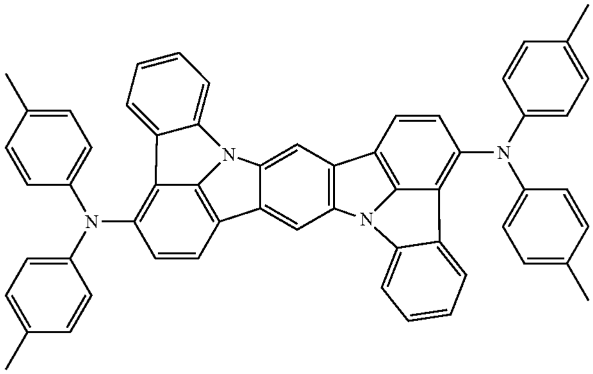
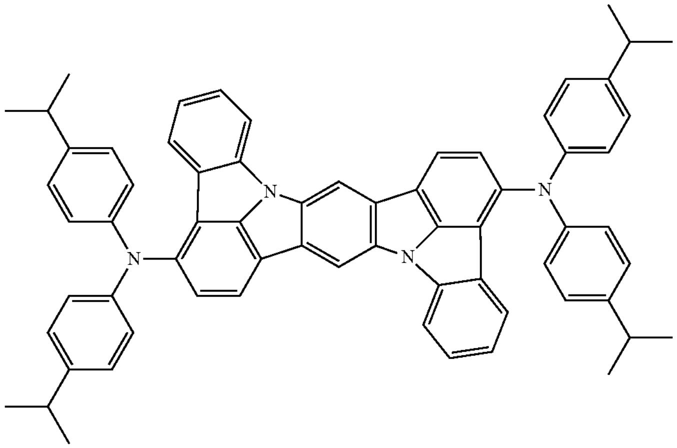

-continued
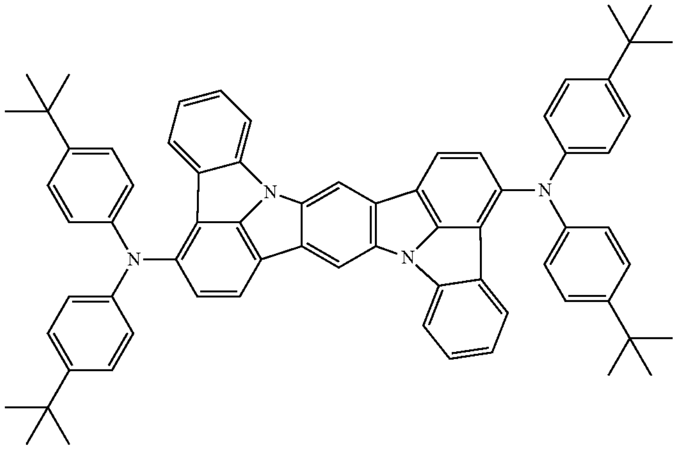
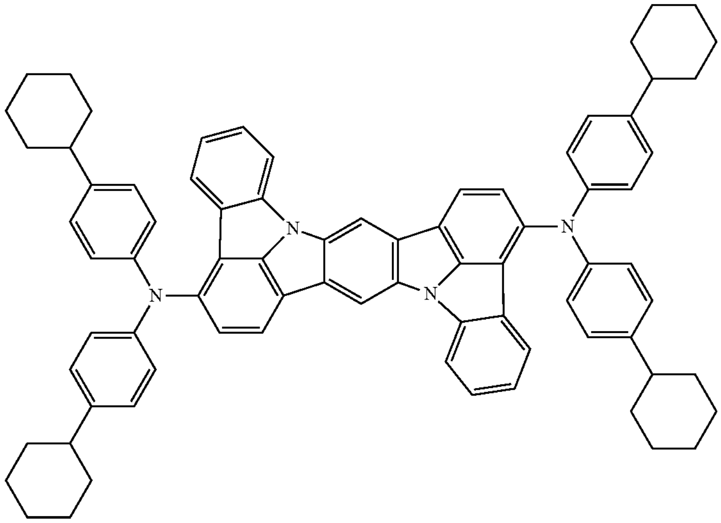
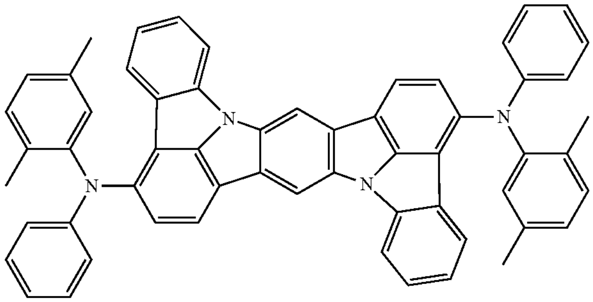
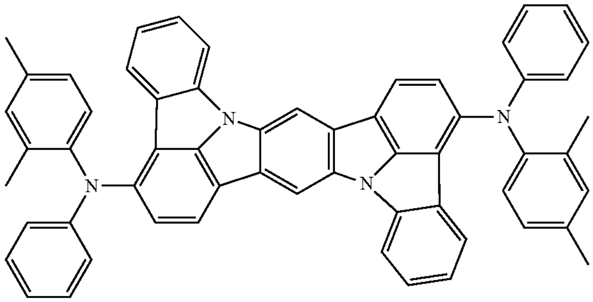

-continued
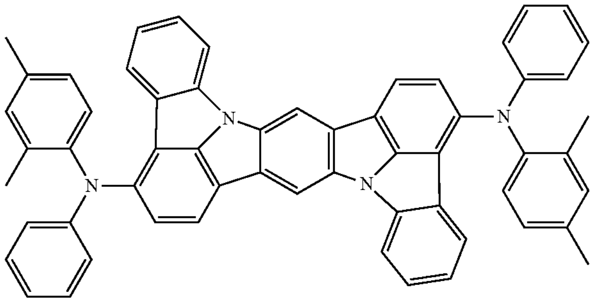
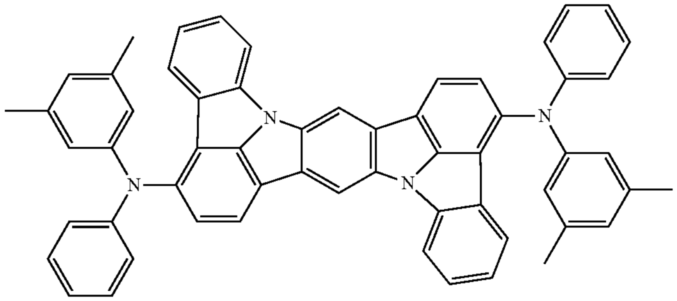
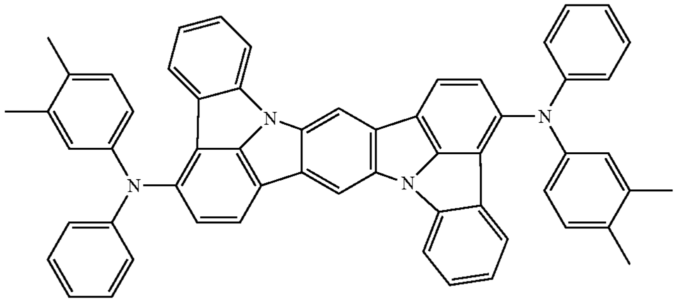
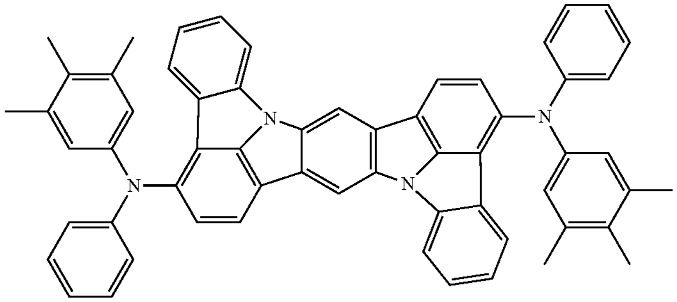
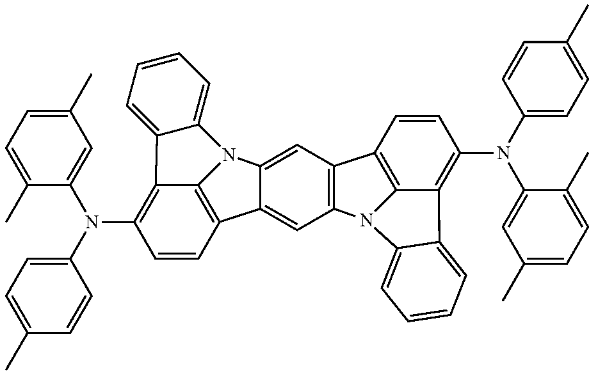

-continued
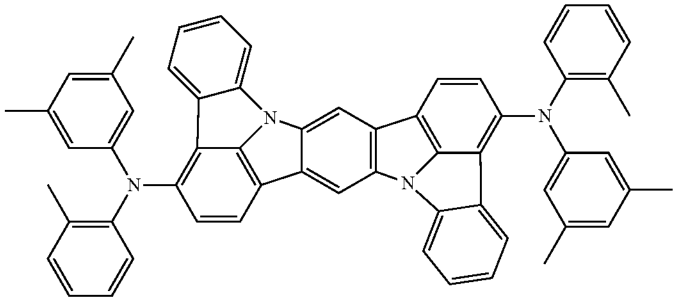
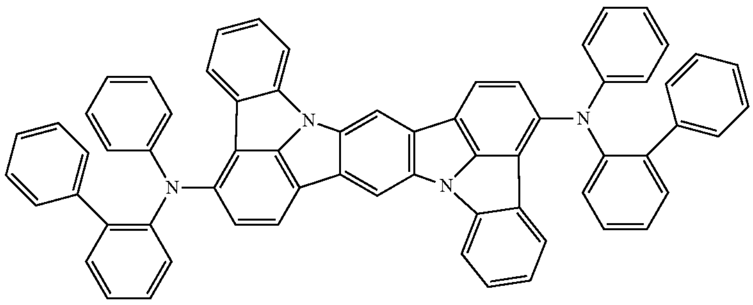
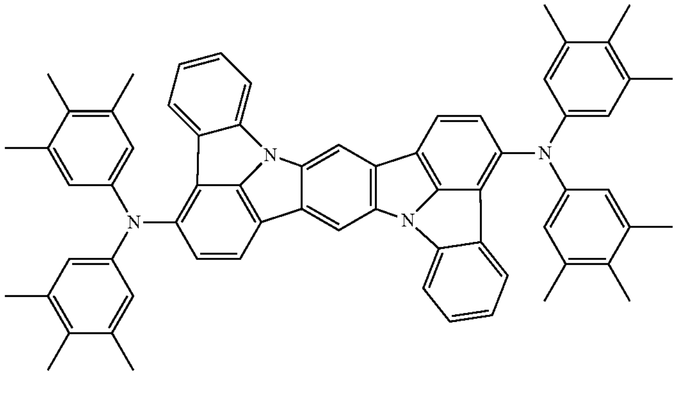
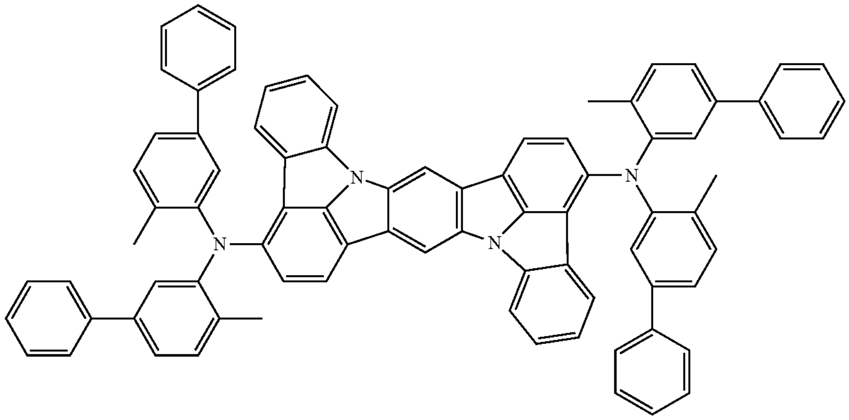

-continued
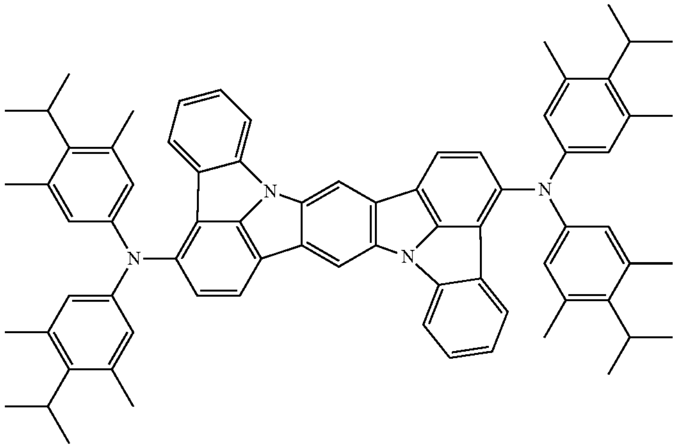
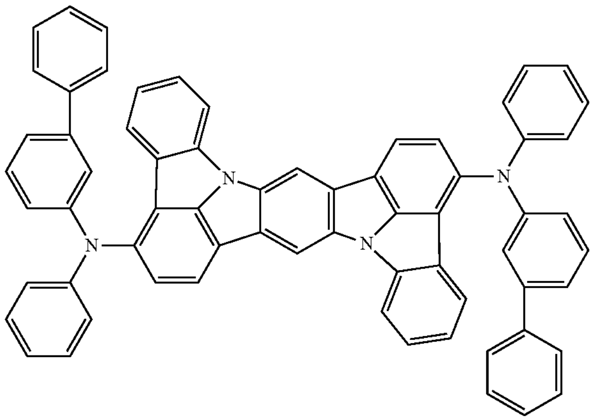
[Formula 445]
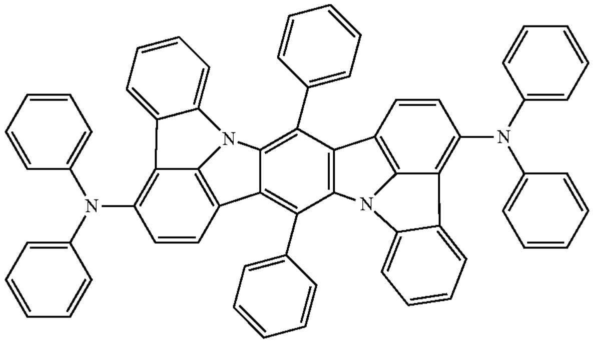
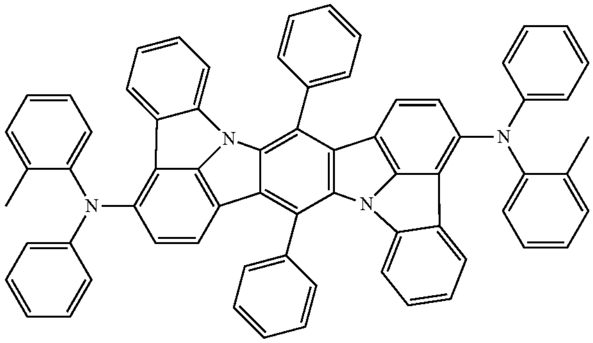

-continued
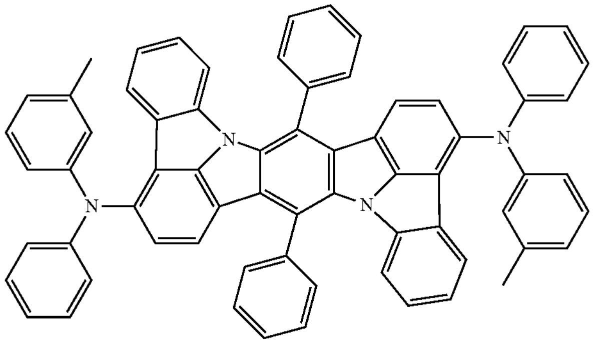
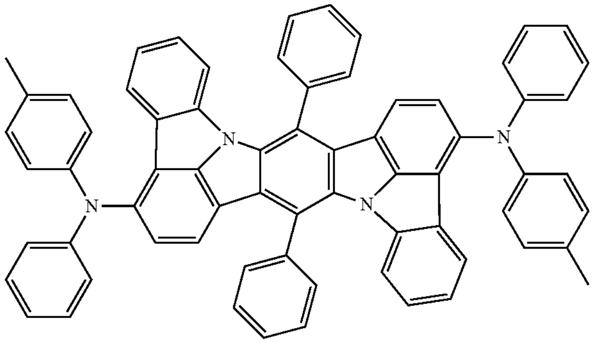
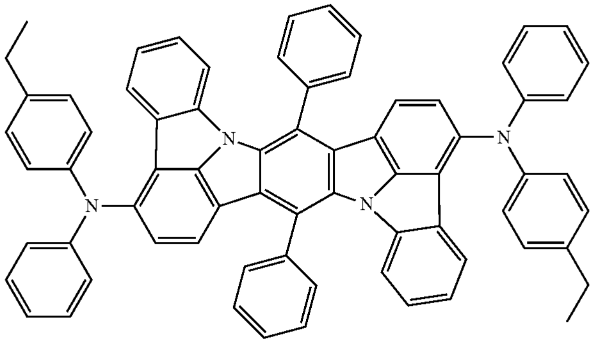
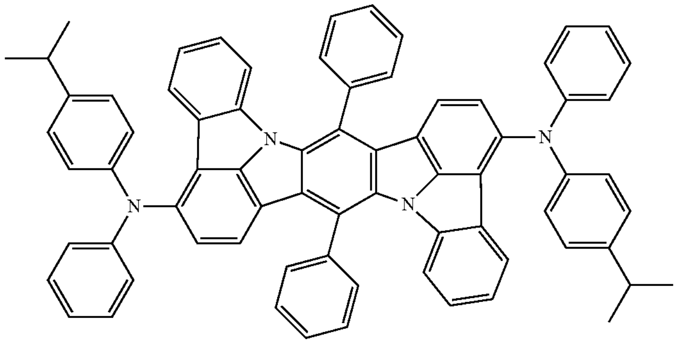
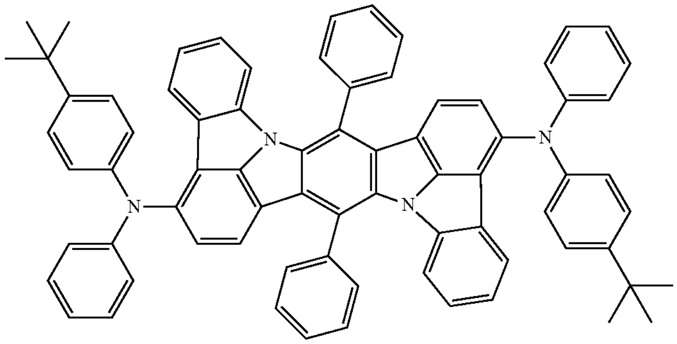

-continued
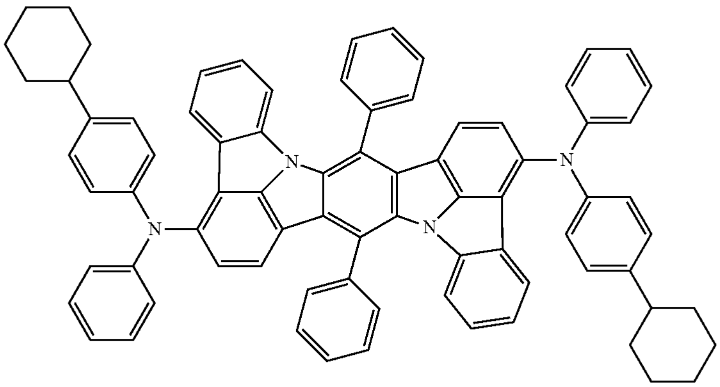
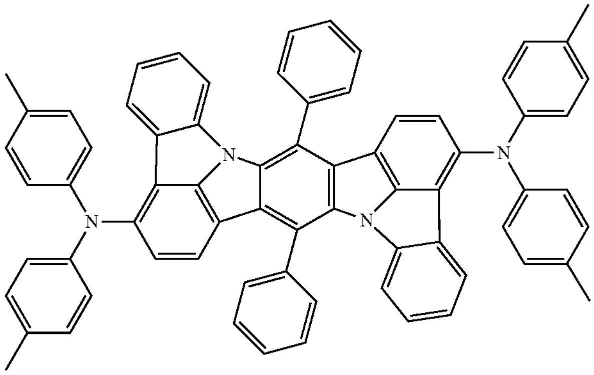
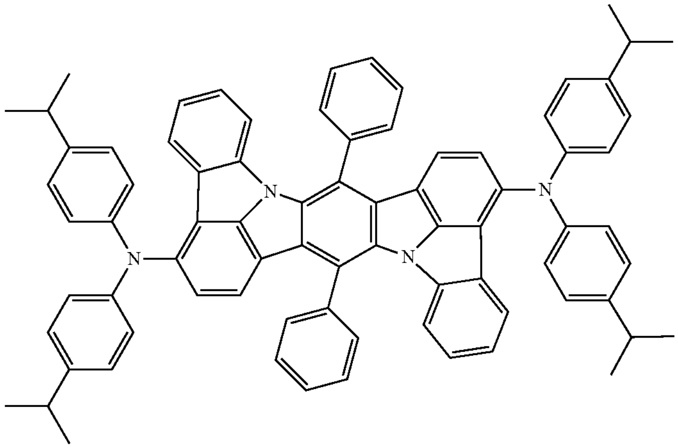
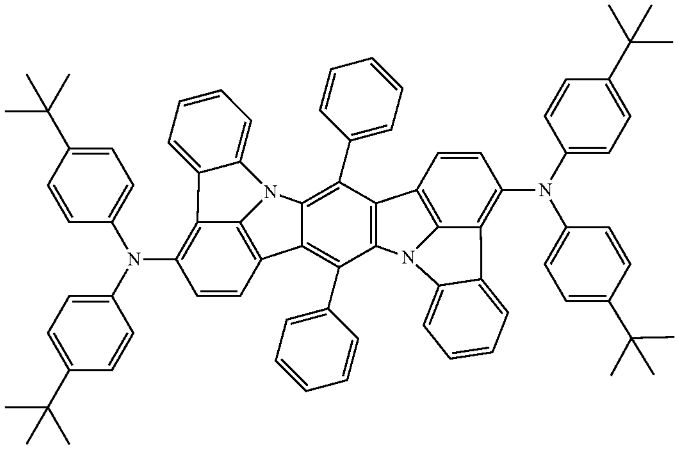

-continued
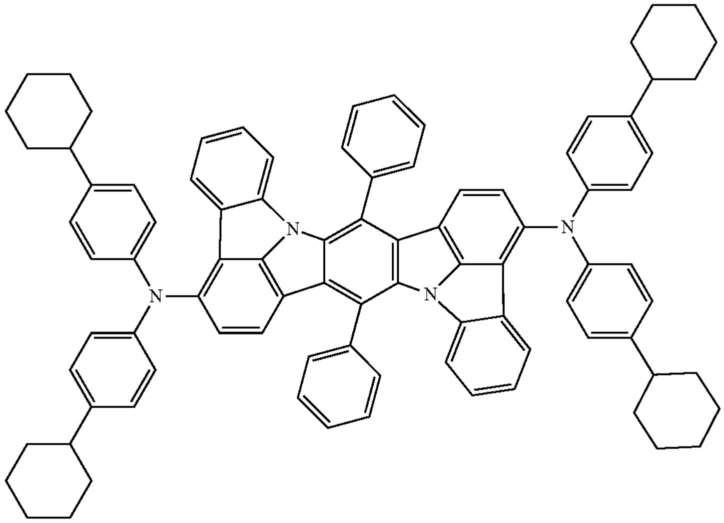
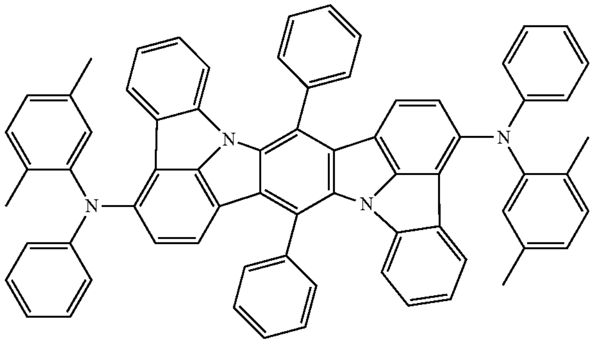
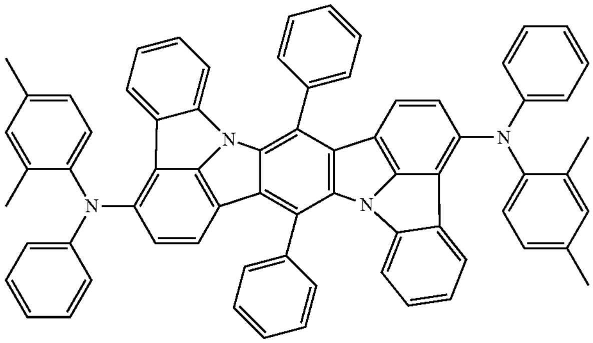
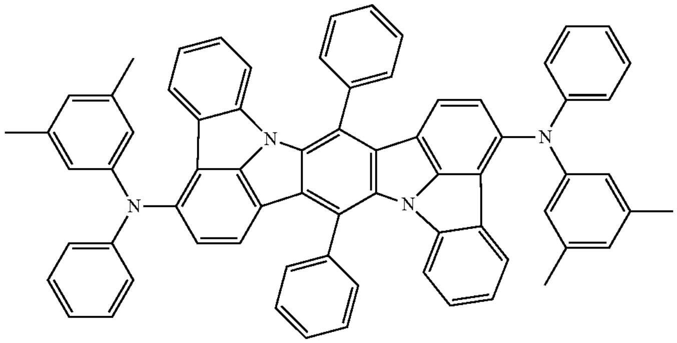

-continued
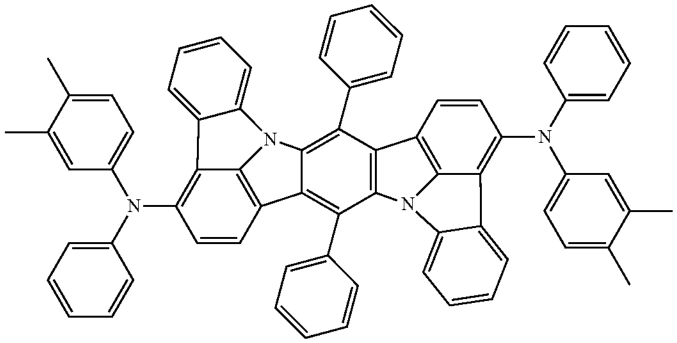
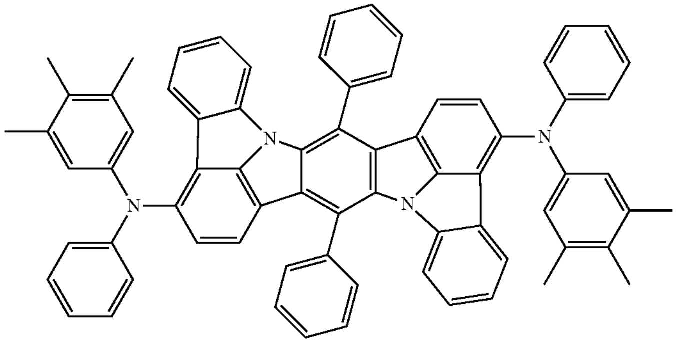
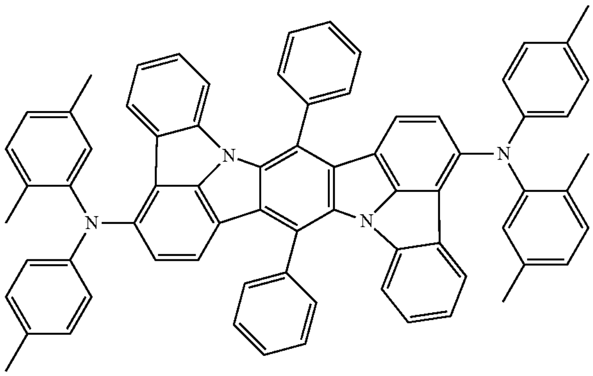
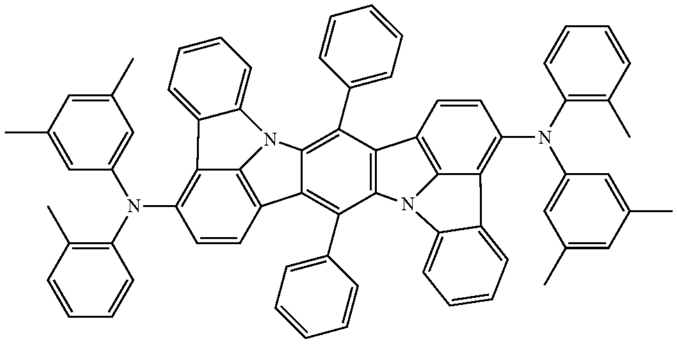

-continued
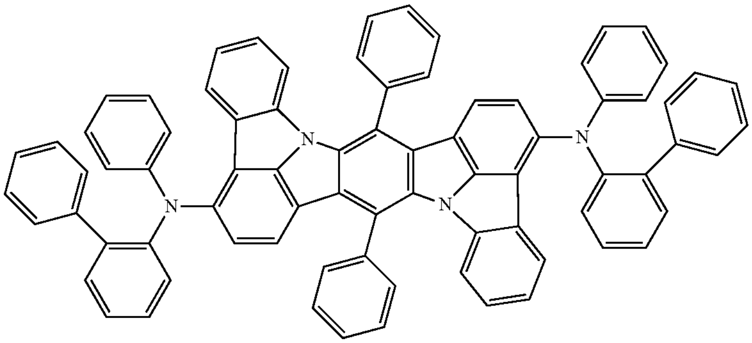
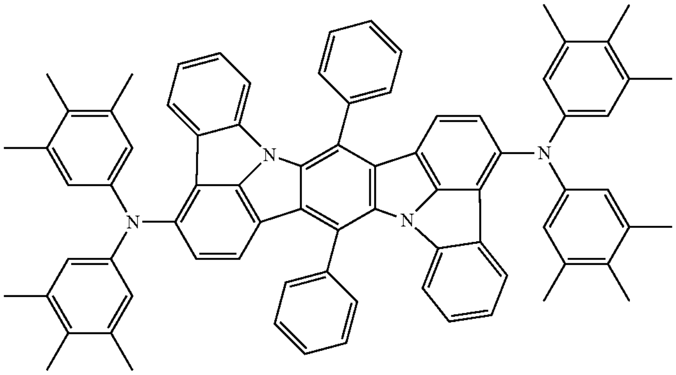
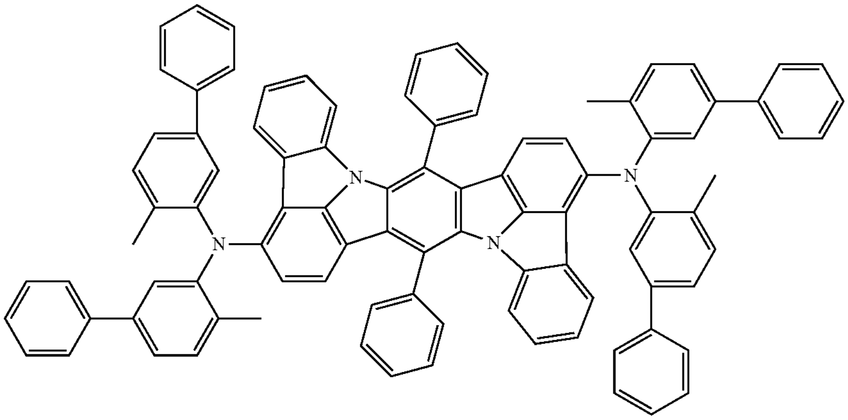
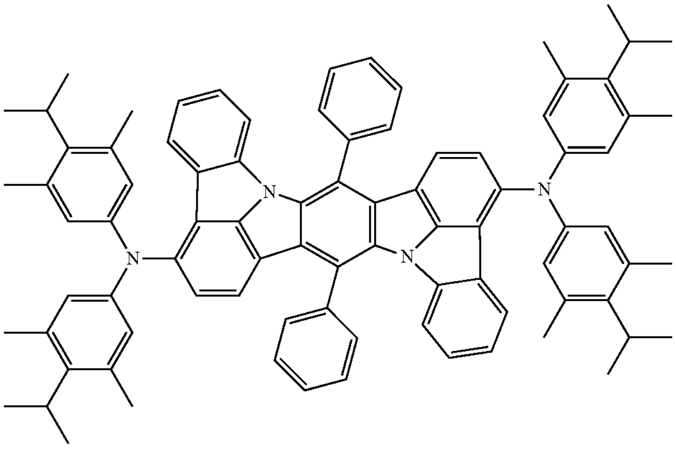

-continued
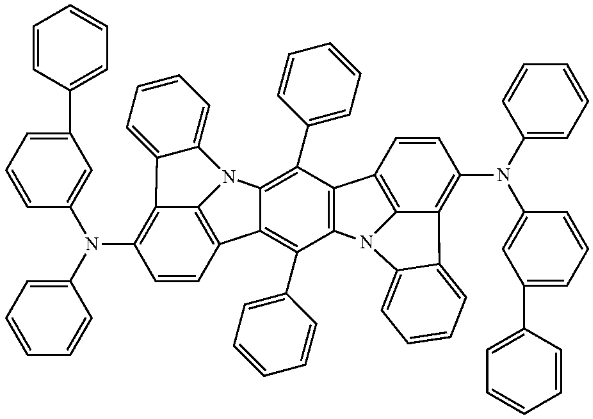
[Formula 446]
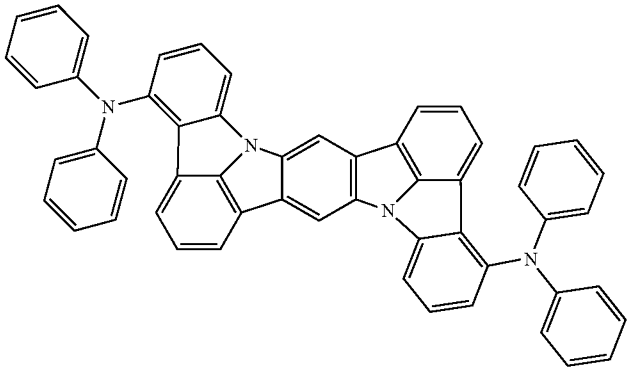
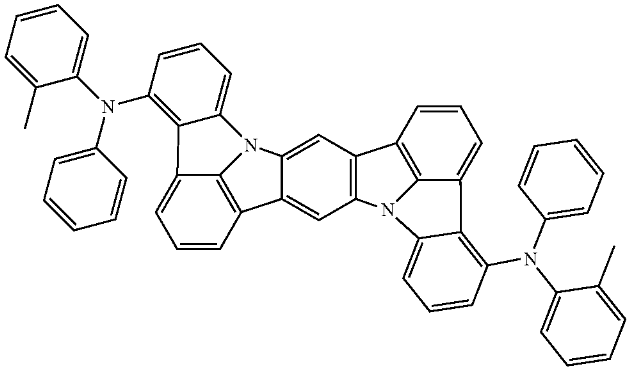
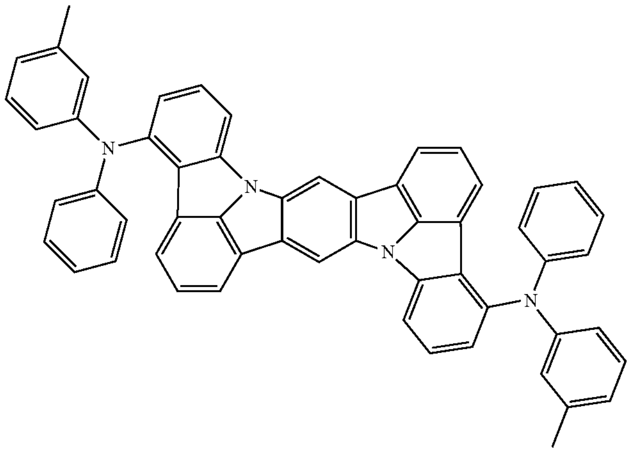

-continued
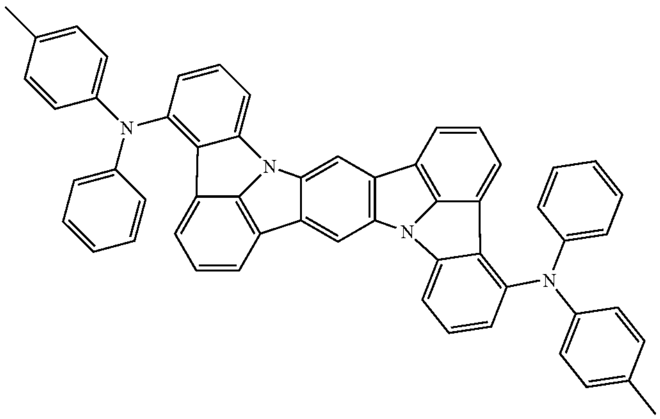
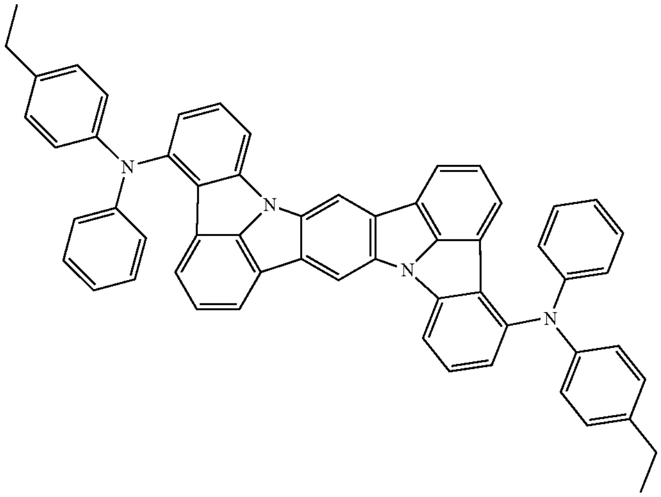
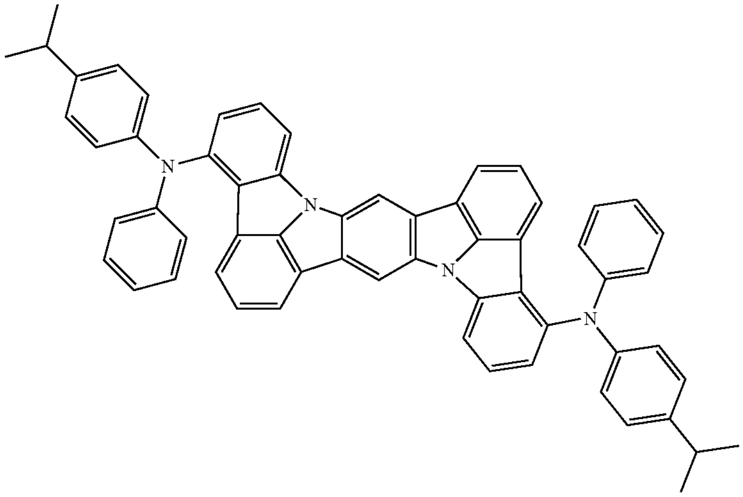

-continued
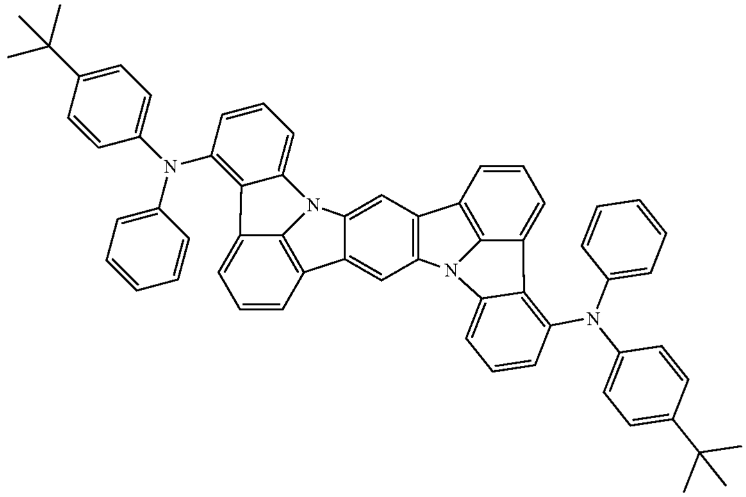
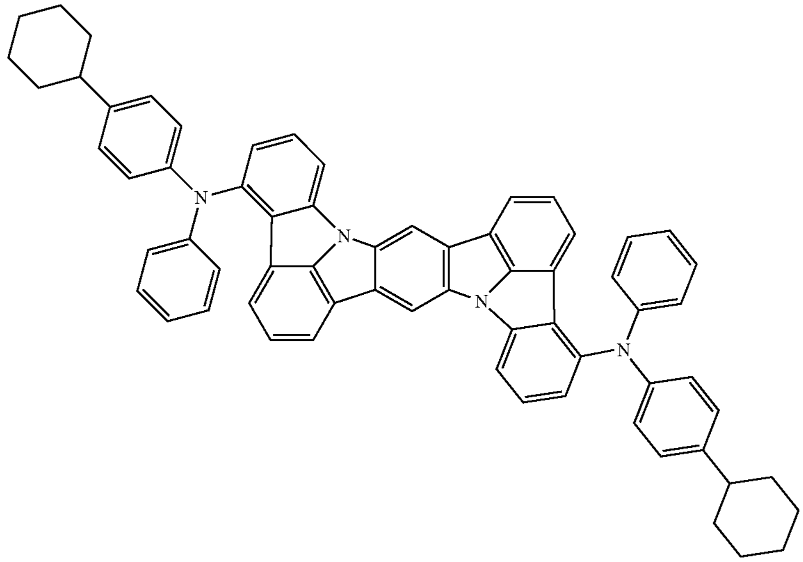
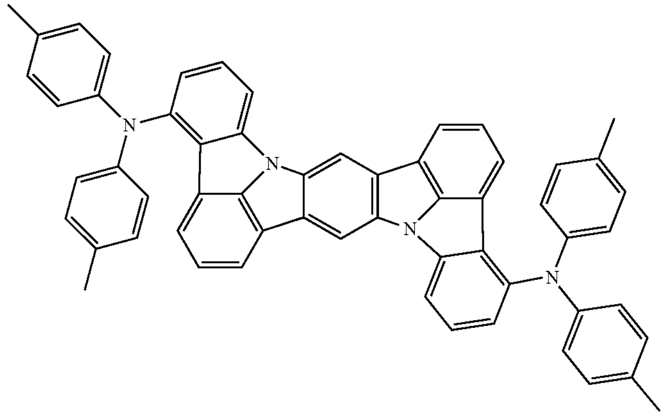

-continued
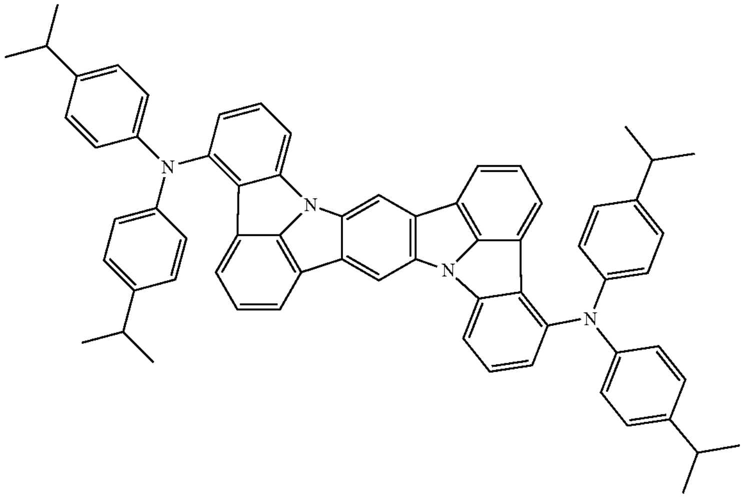
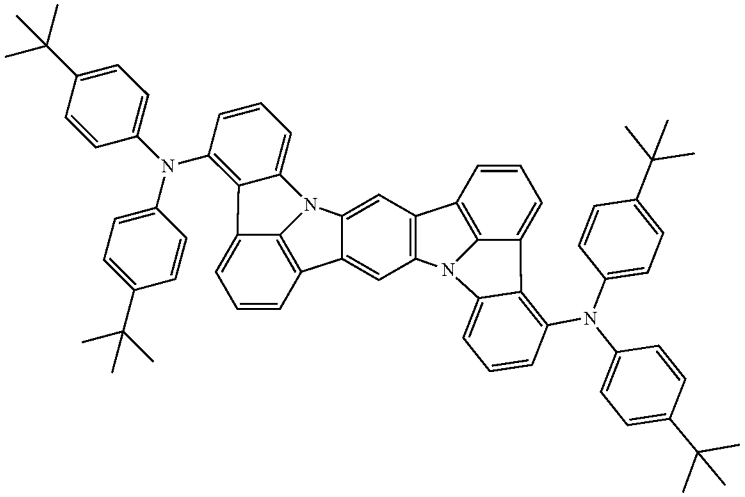
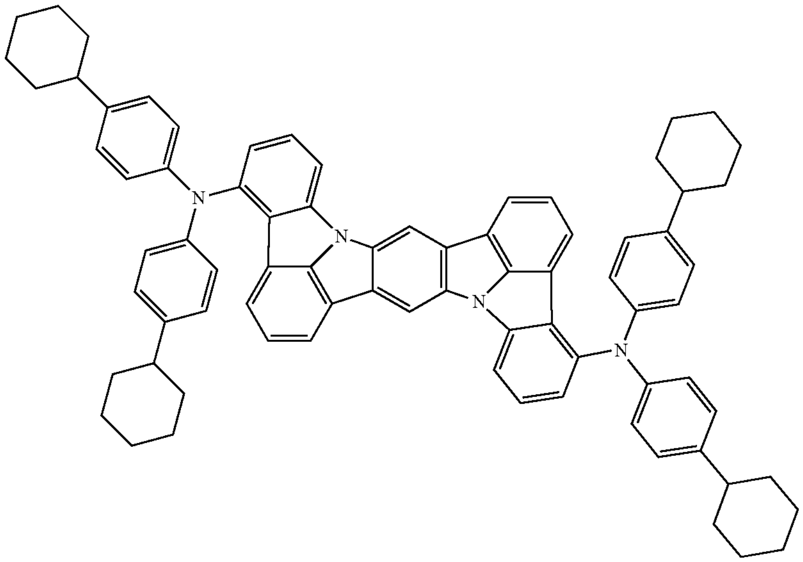

-continued
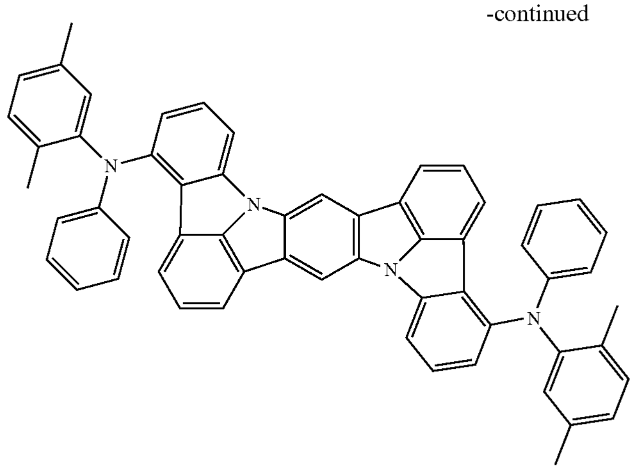
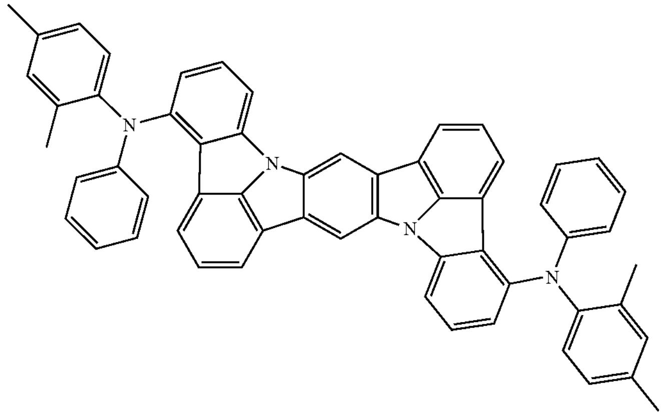
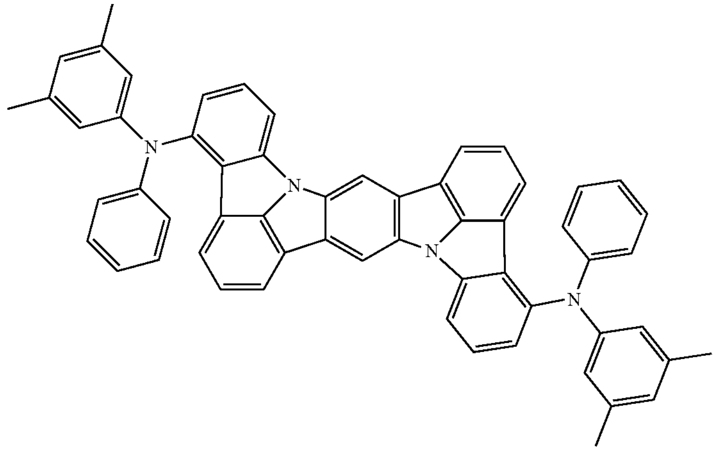
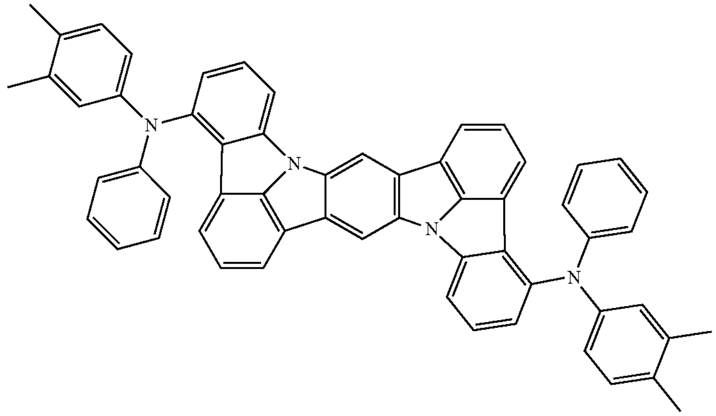

-continued
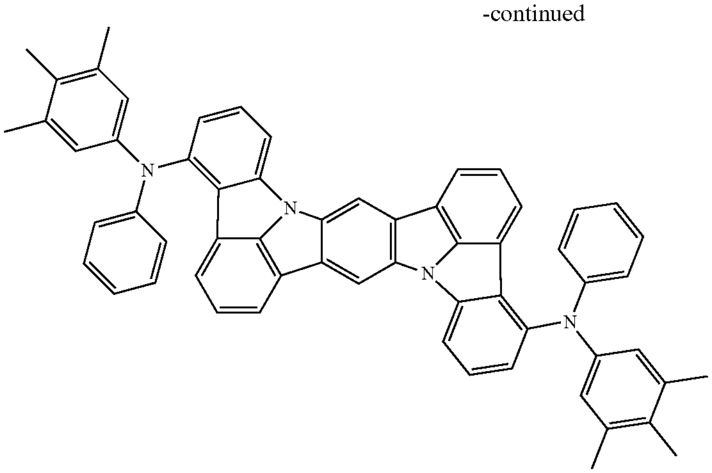
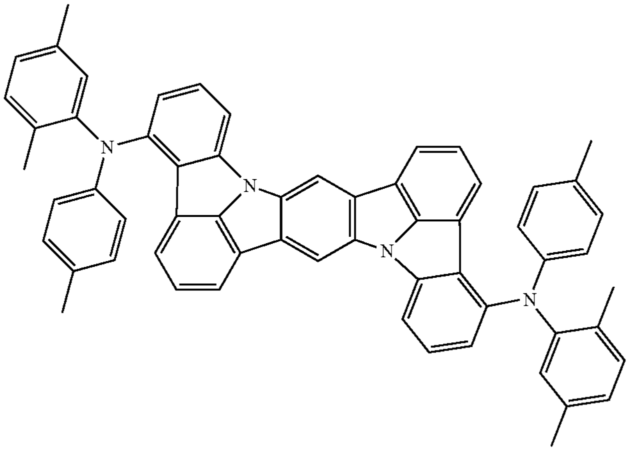
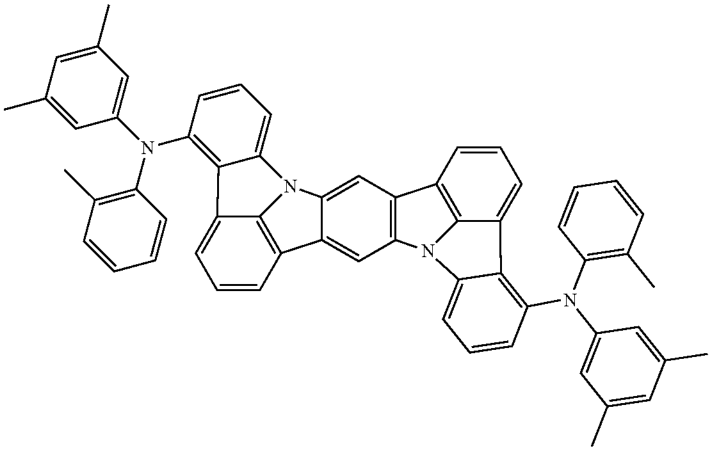
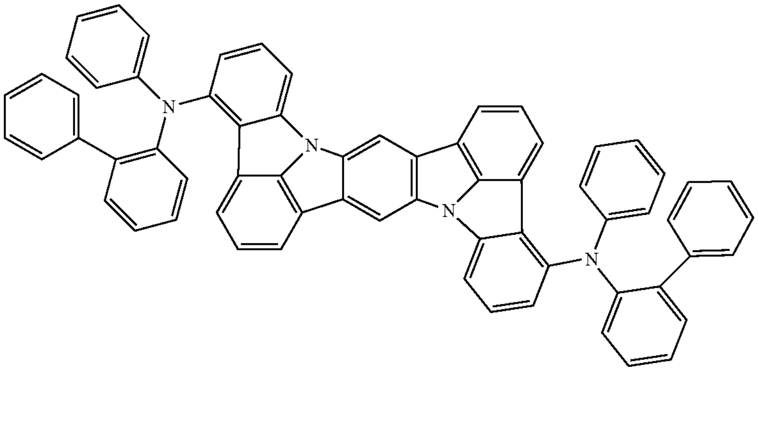

-continued
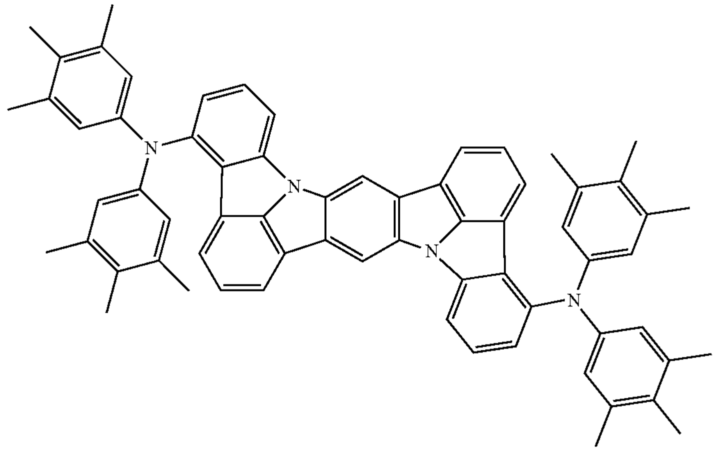
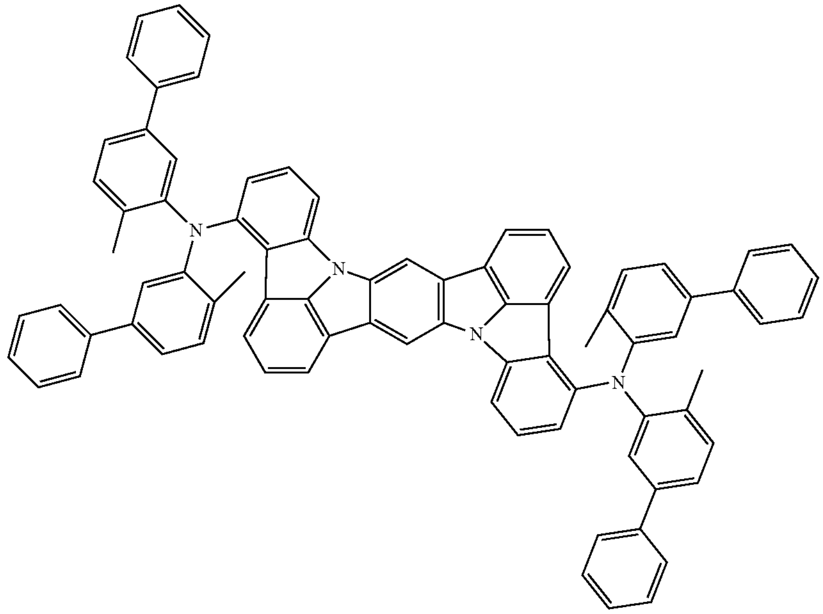
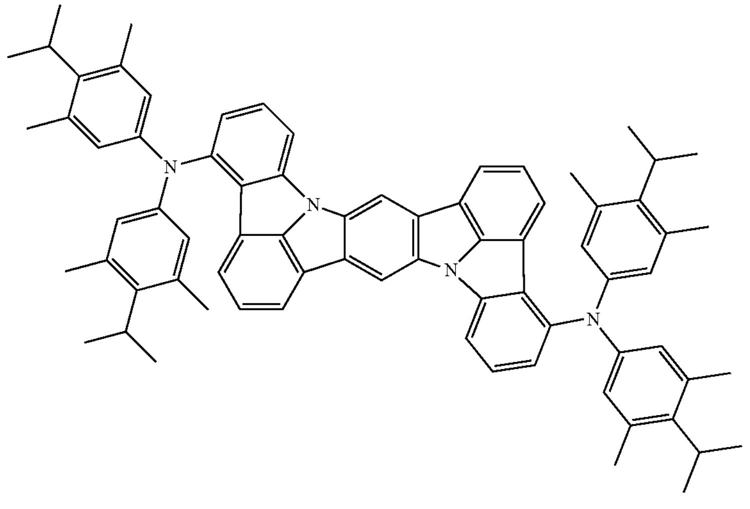

-continued
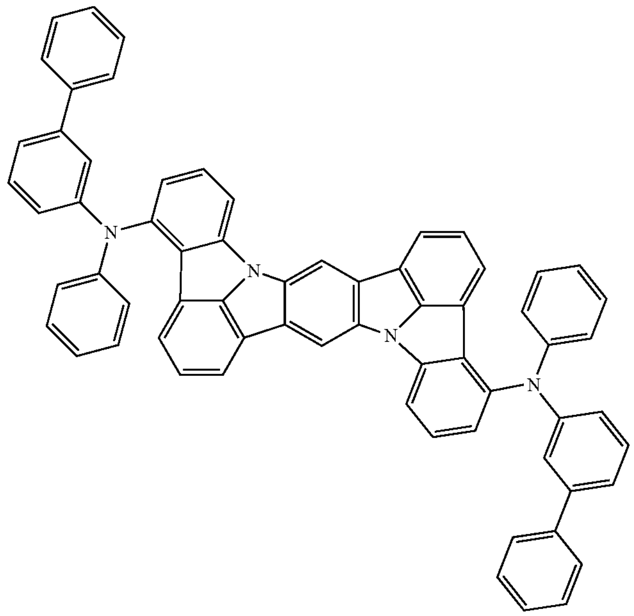
[Formula 447]
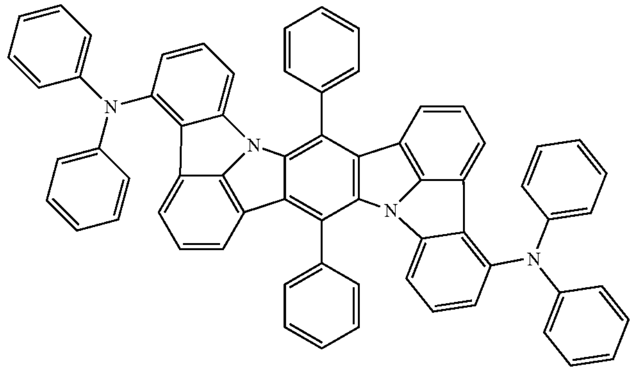
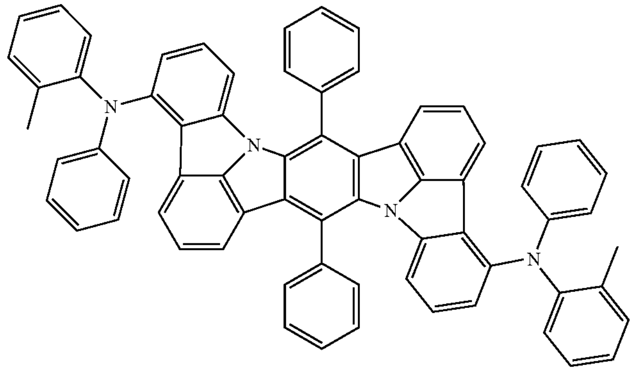

-continued
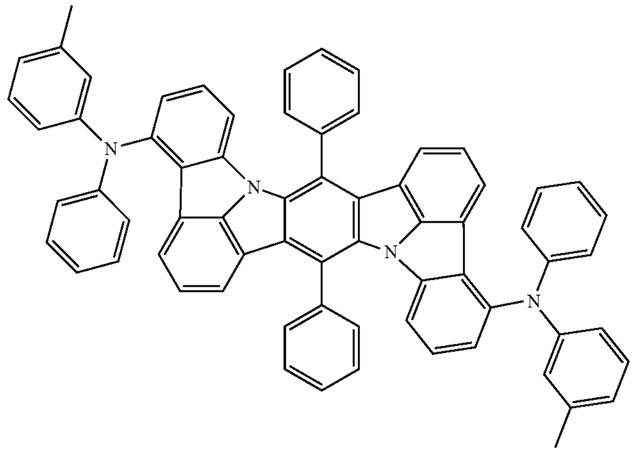
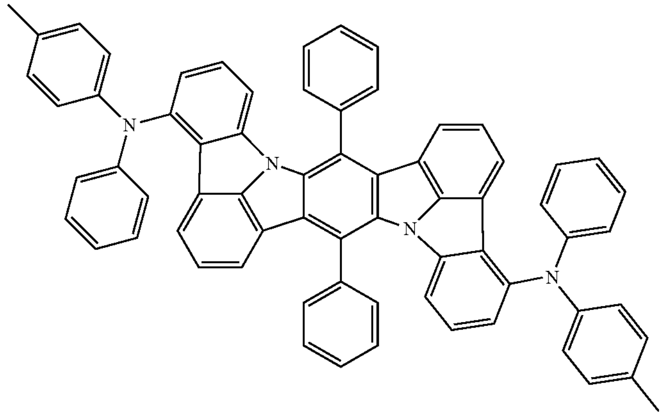
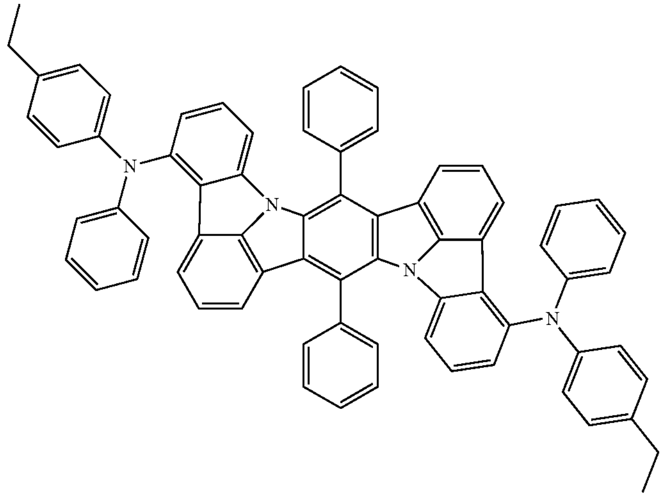

-continued
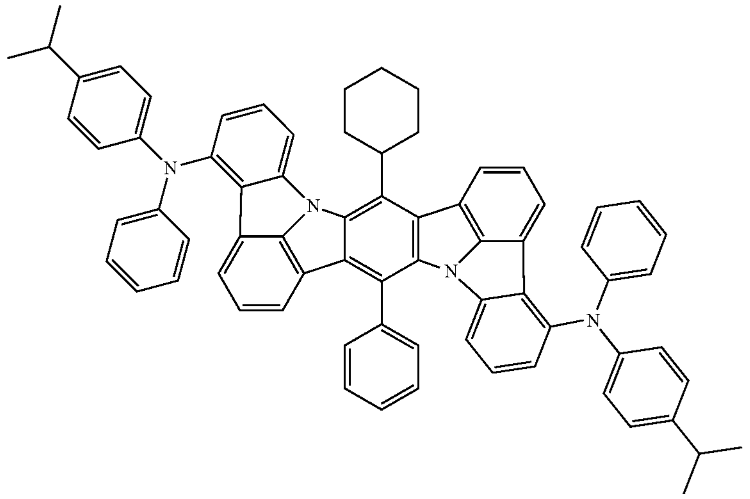
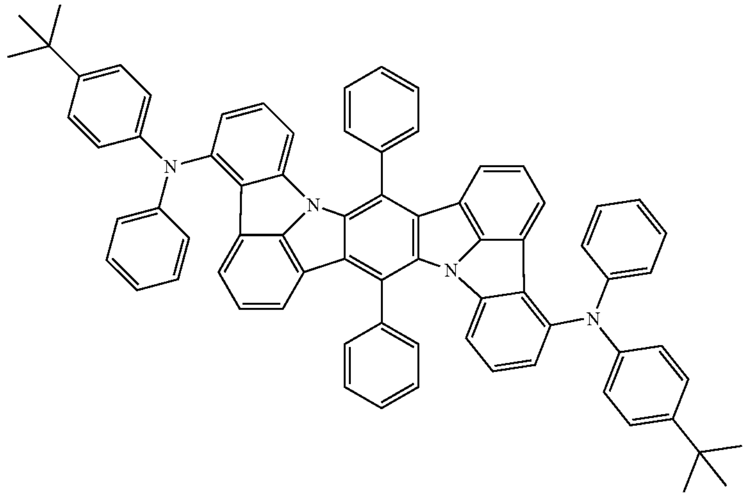
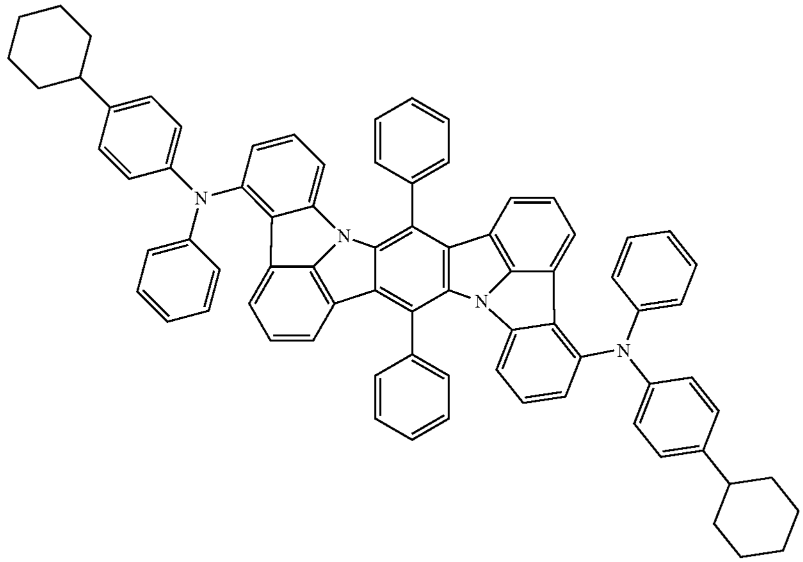

-continued
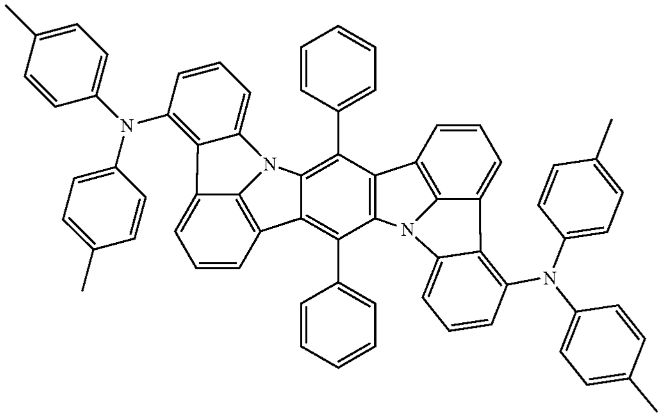
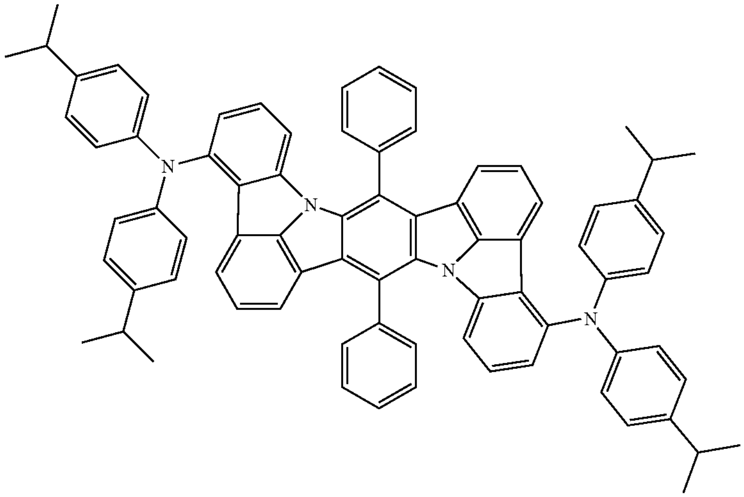
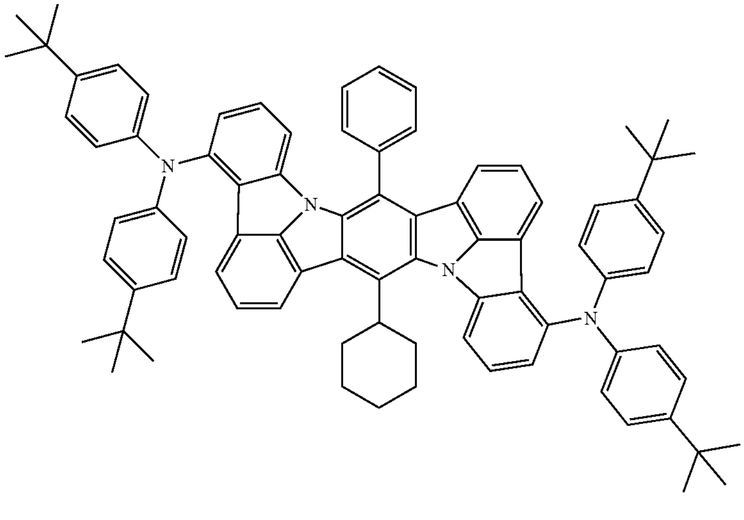

-continued
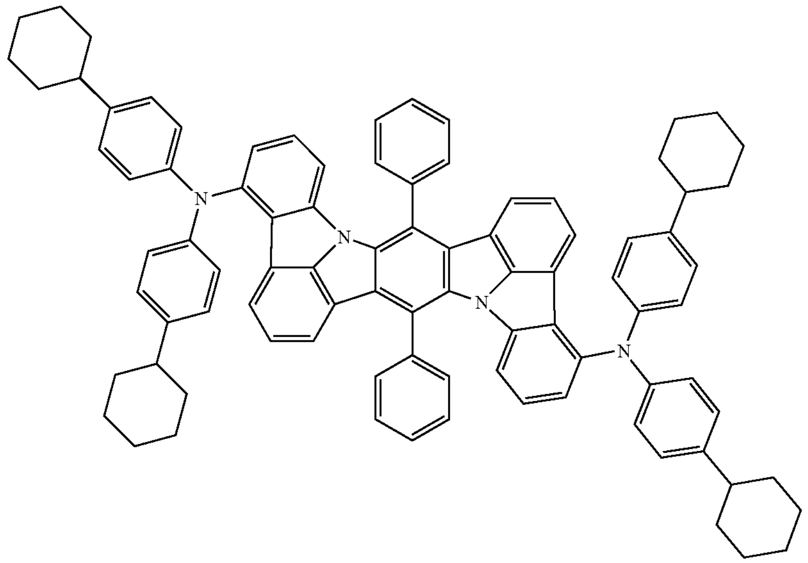
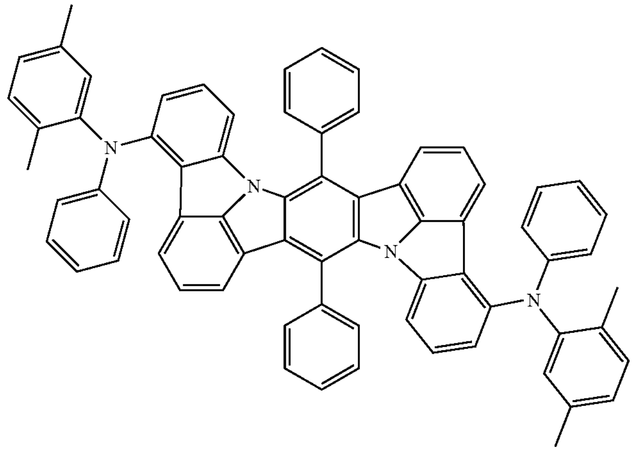
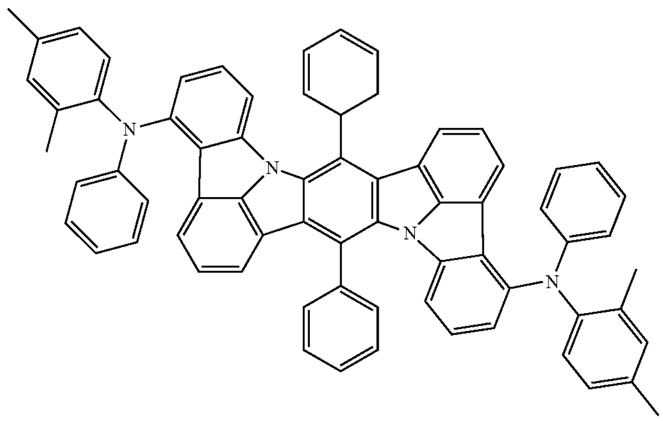

-continued
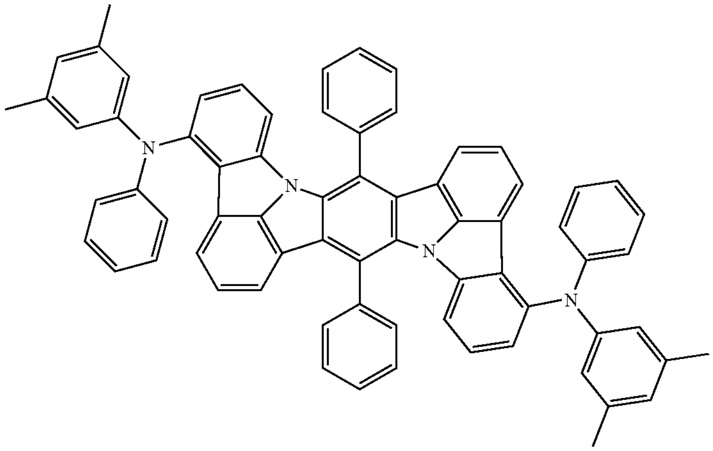
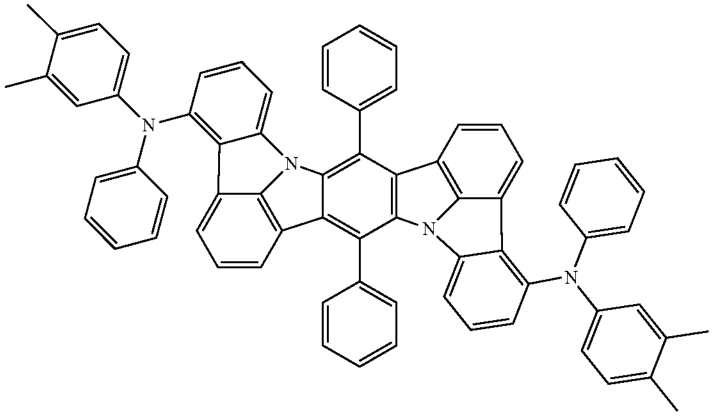
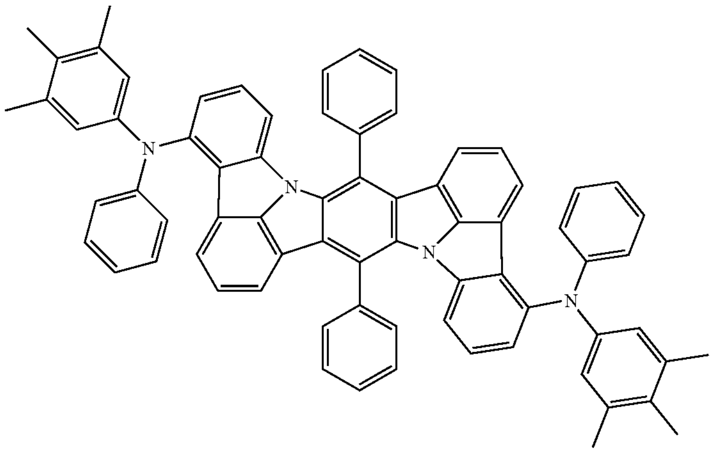

-continued
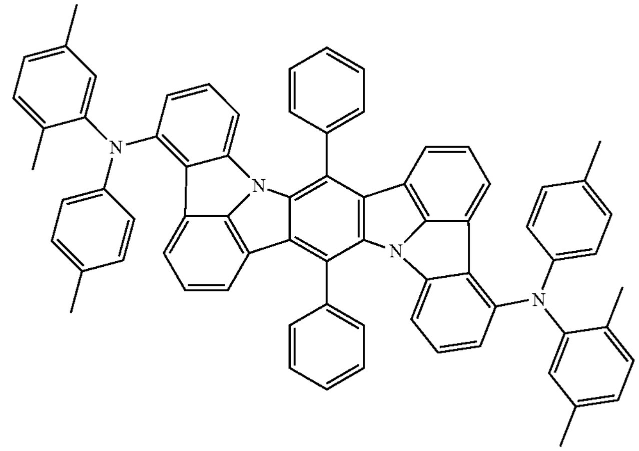
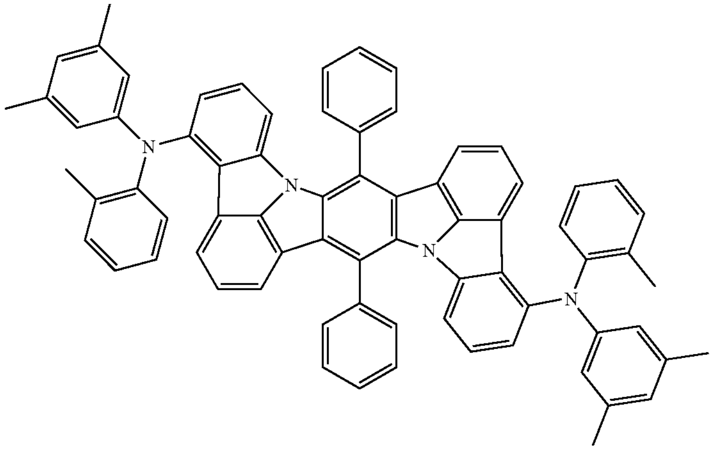
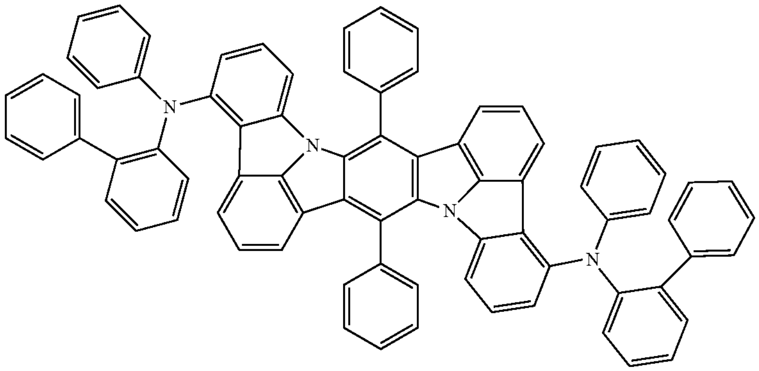
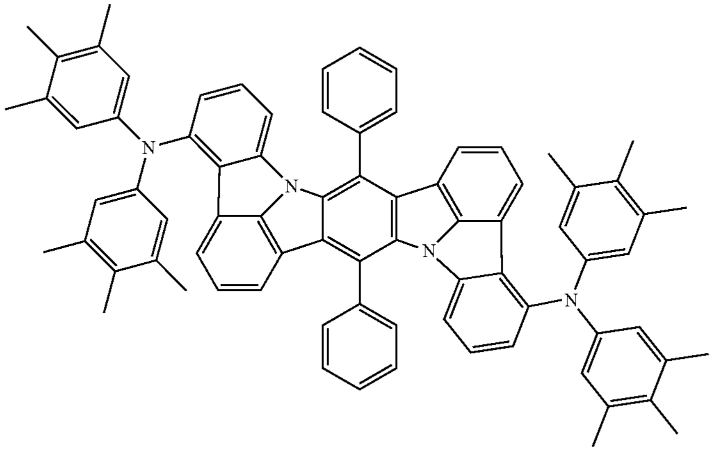

-continued
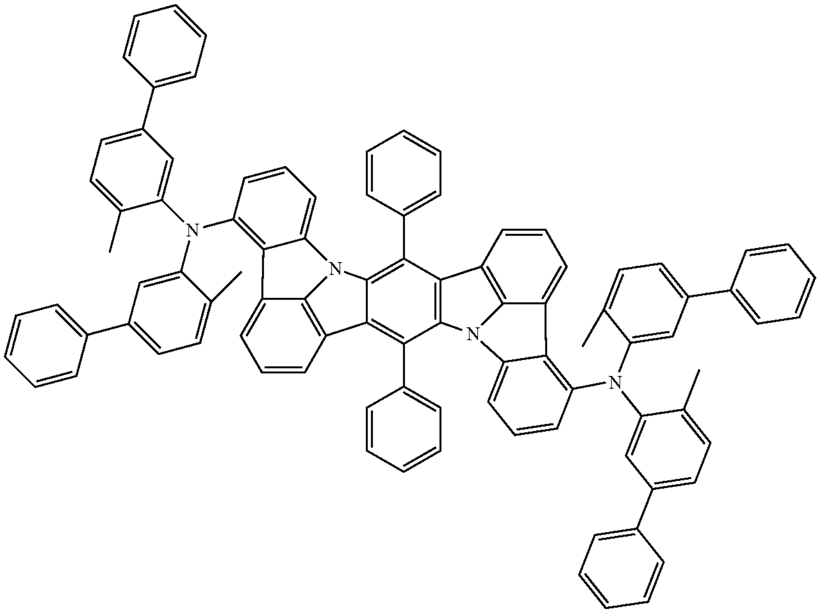
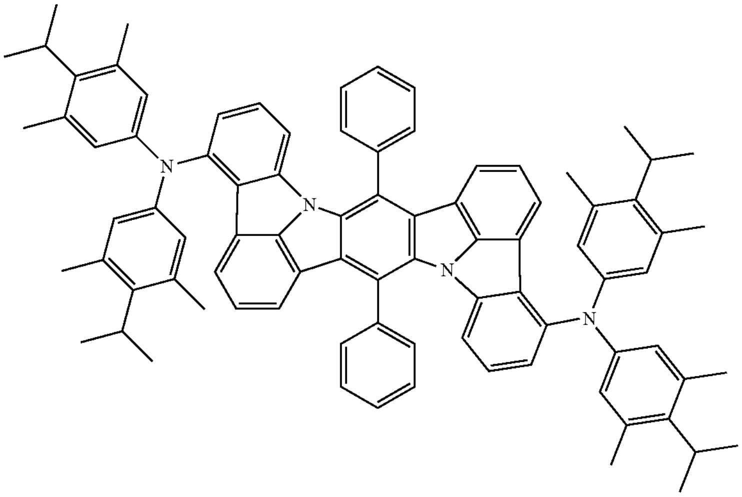
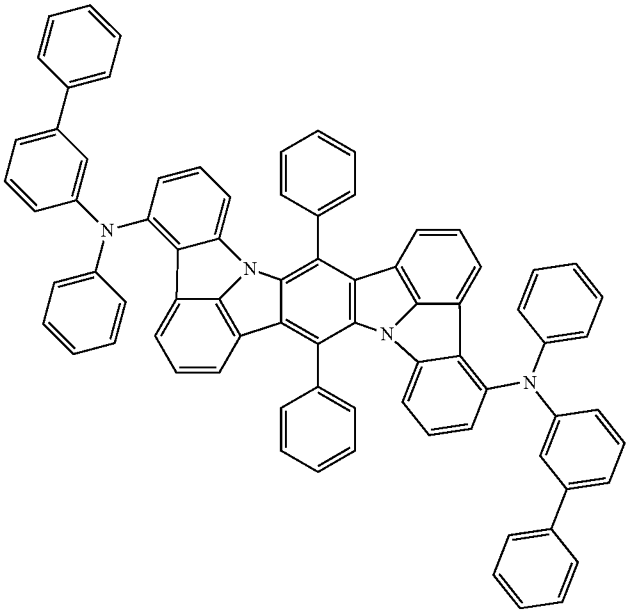

-continued
[Formula 448]
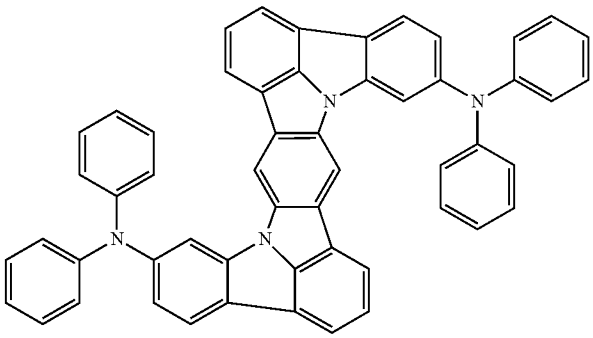
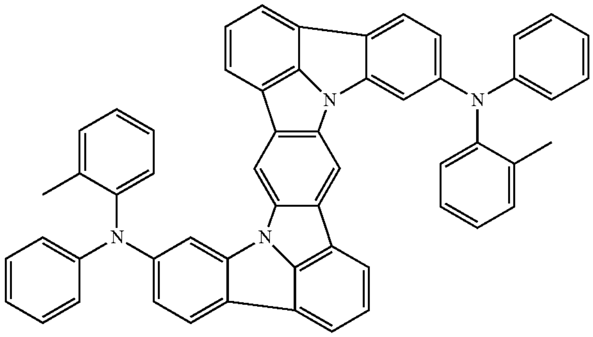
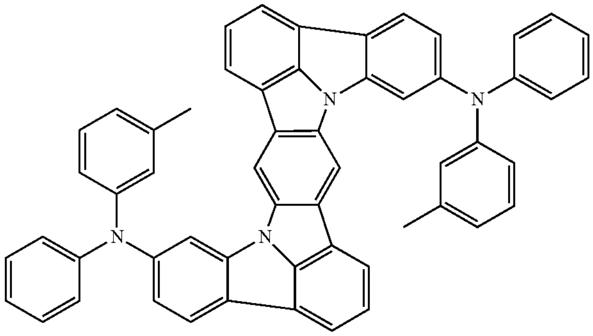
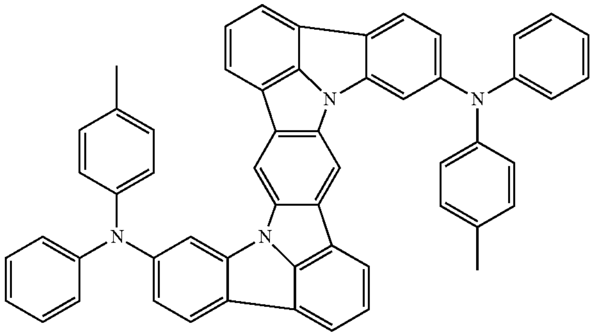
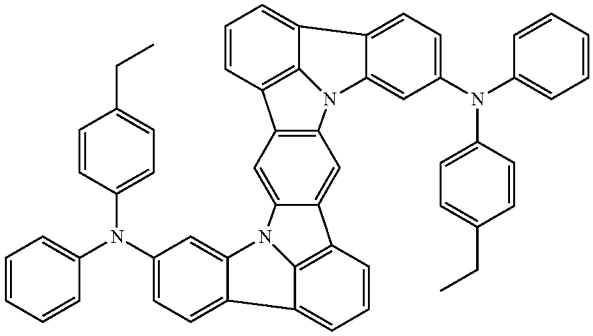

-continued
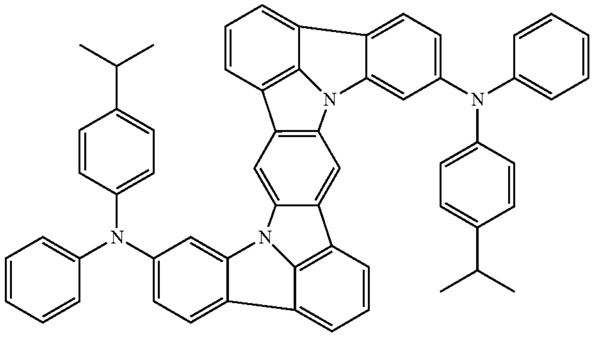
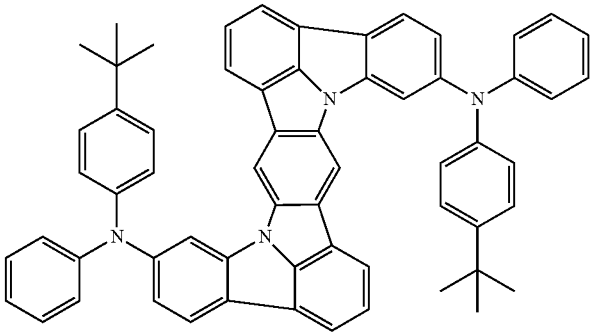
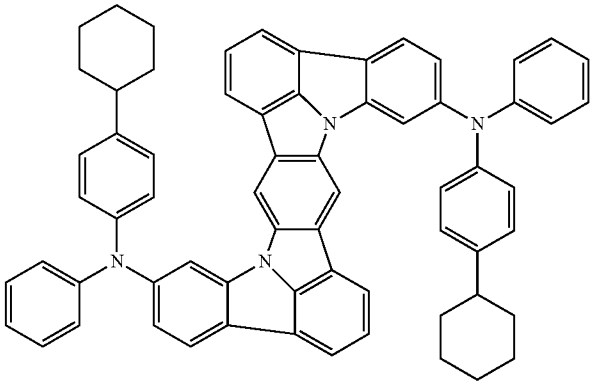
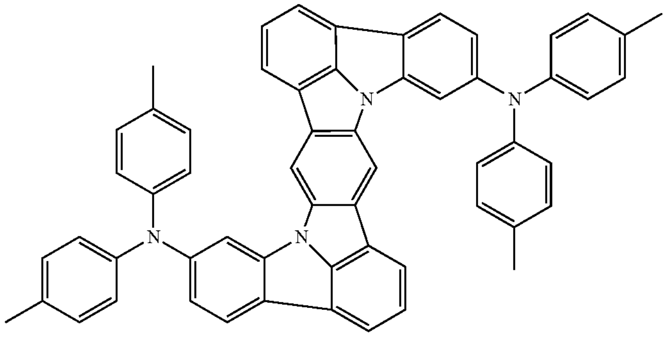

-continued
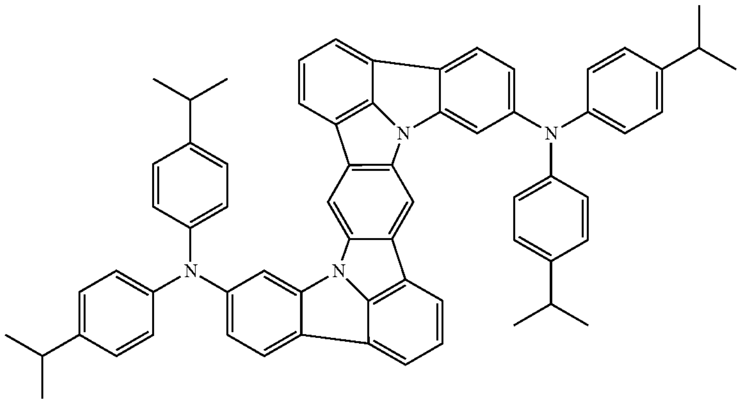
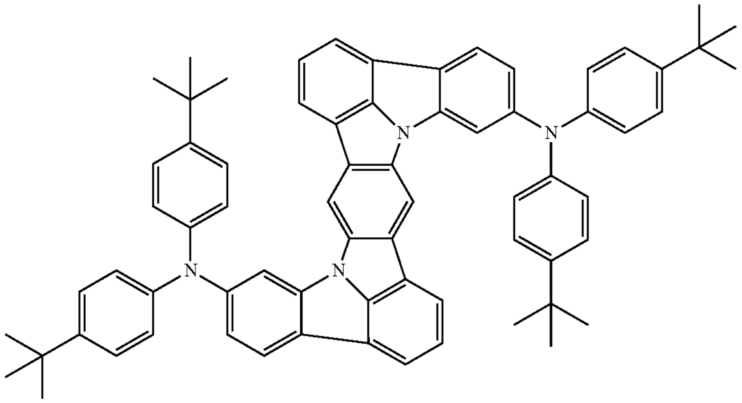
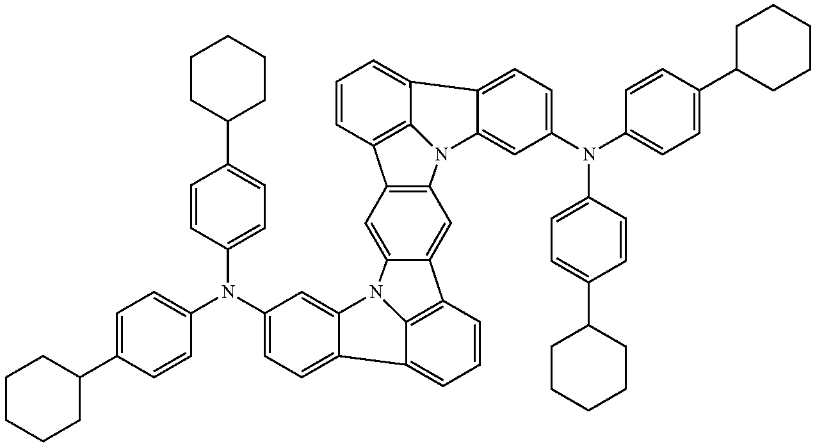
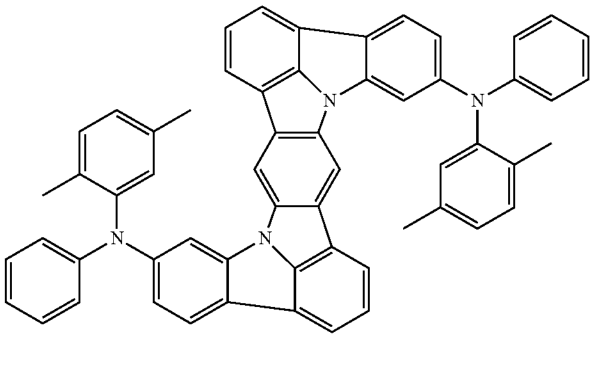

-continued
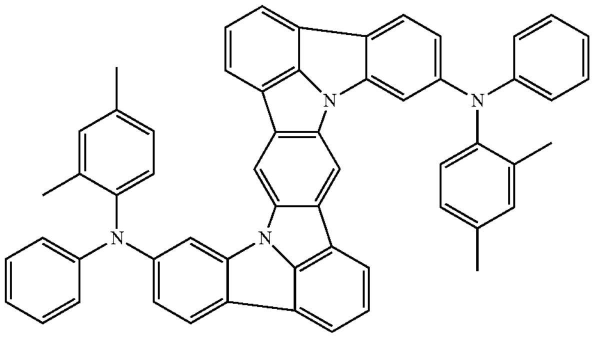
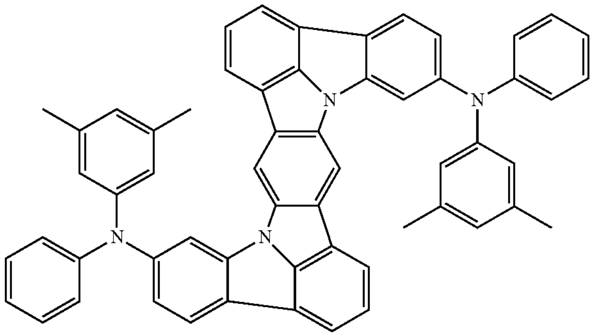
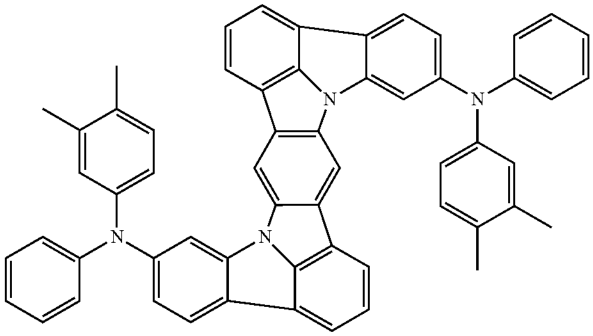
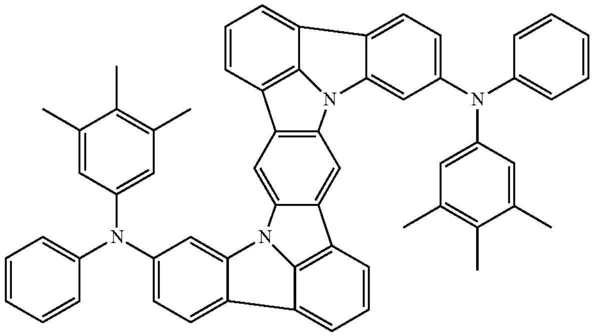
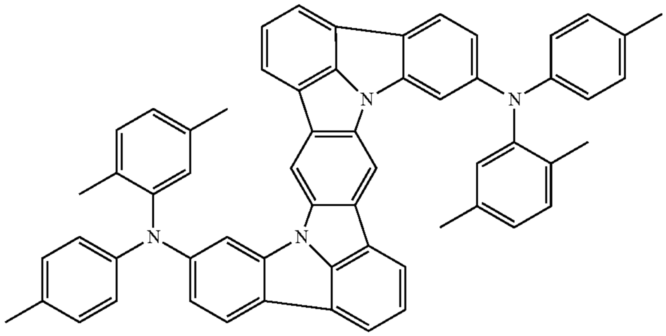

-continued
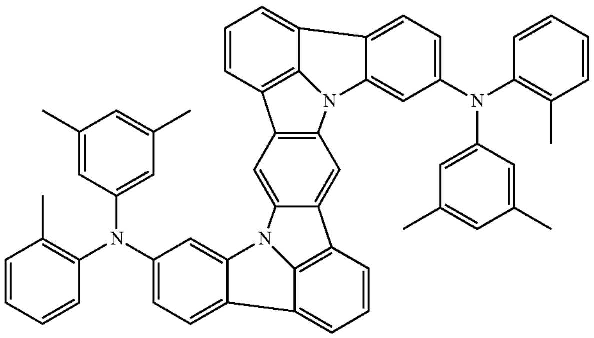
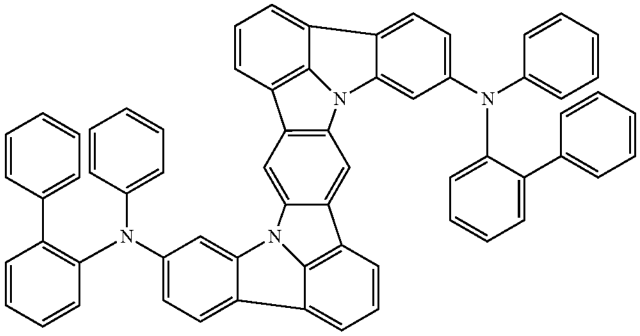
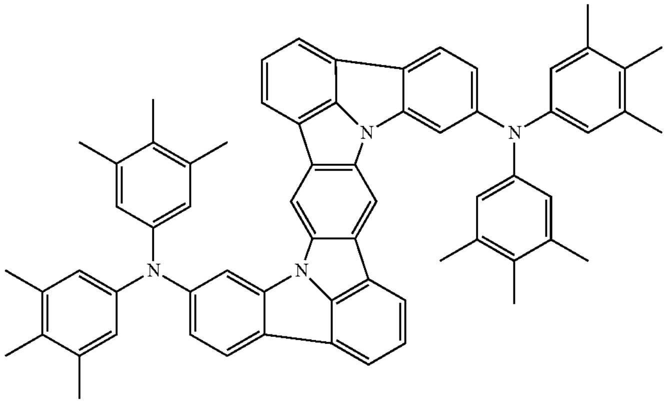
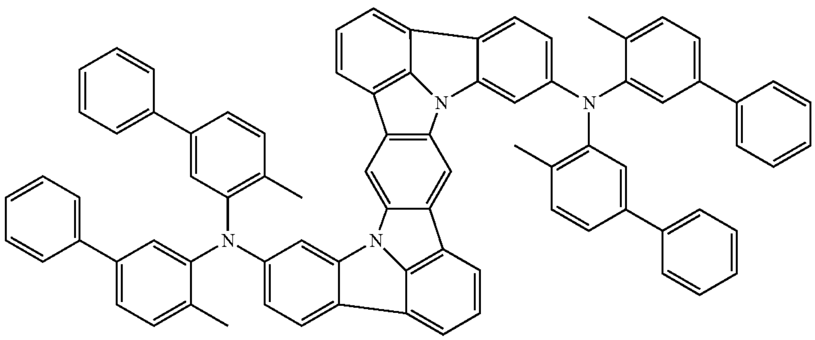

-continued
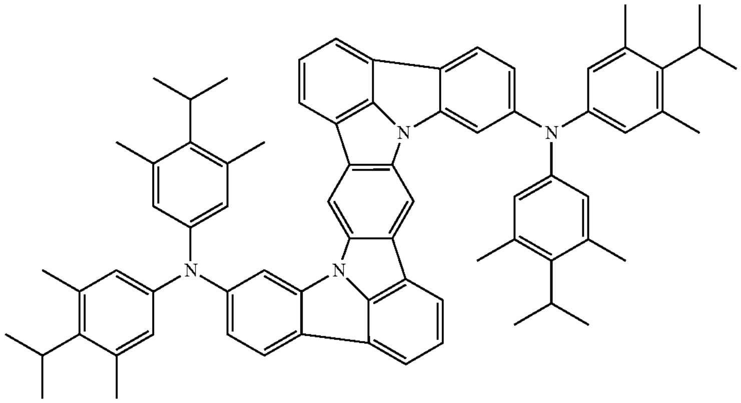
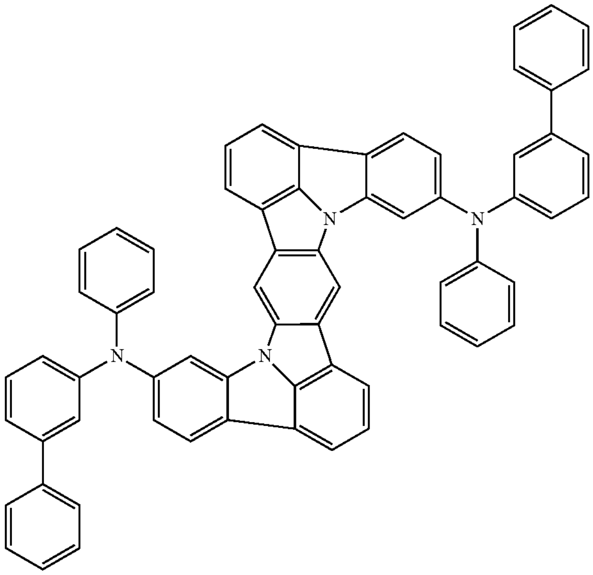
[Formula 449]
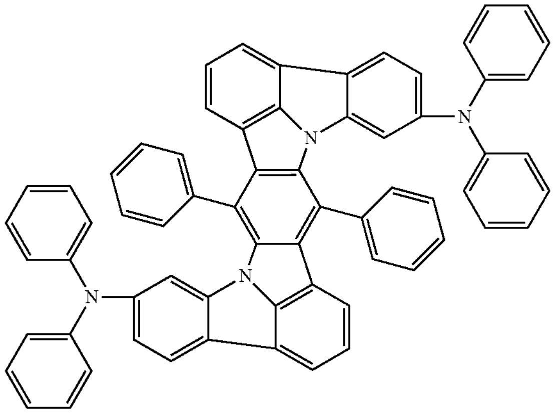

-continued
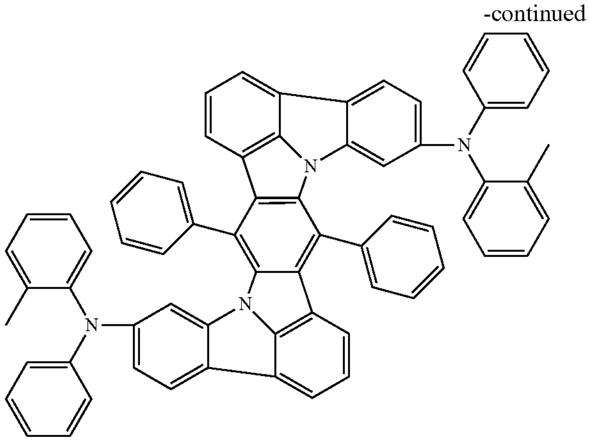
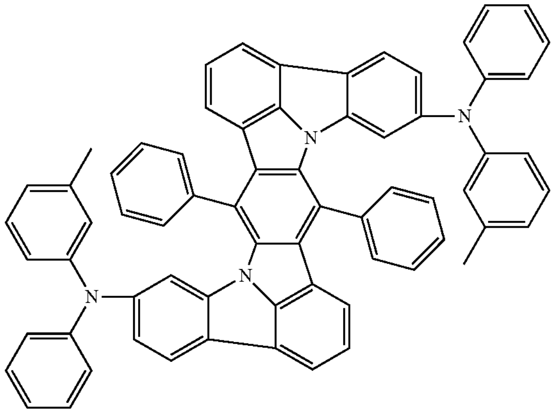
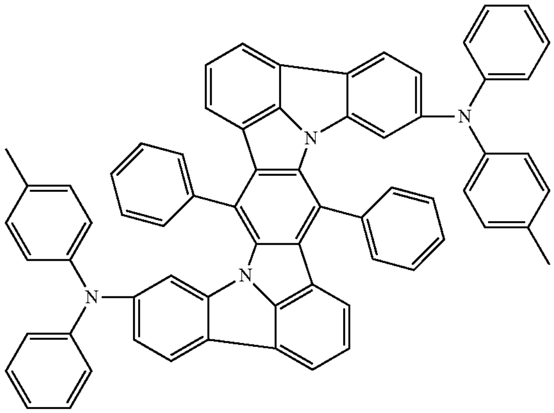
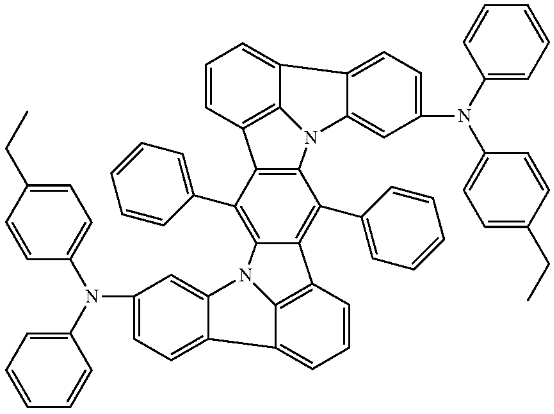

-continued
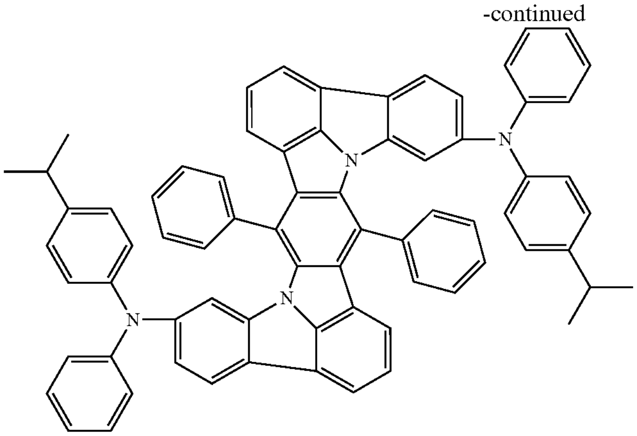
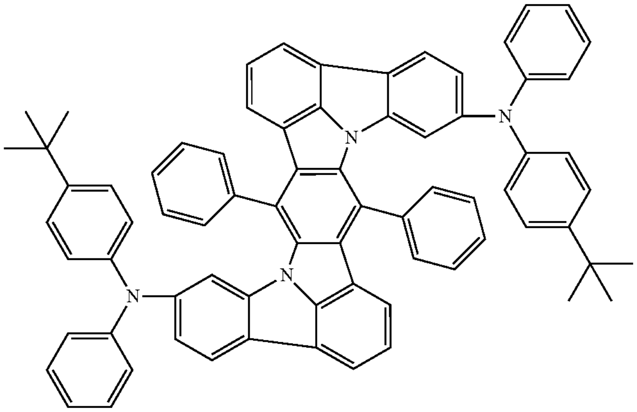
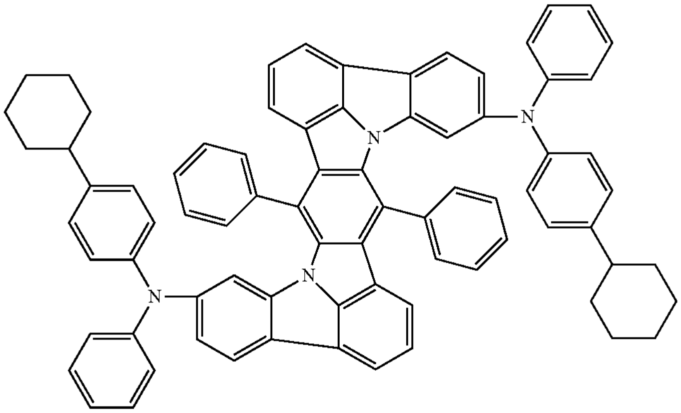
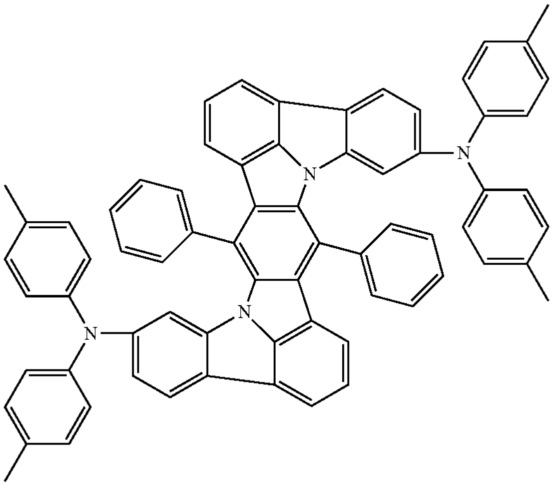

-continued
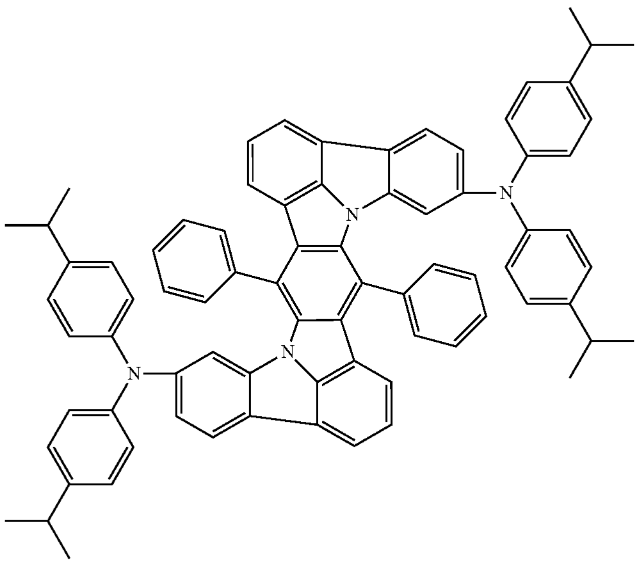
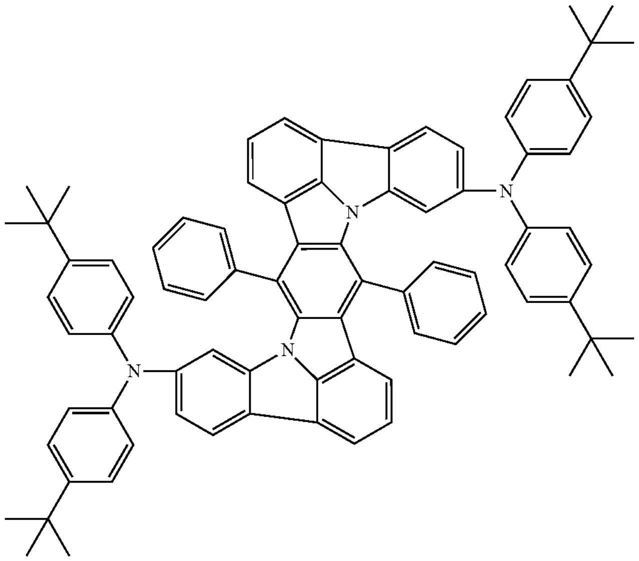

-continued
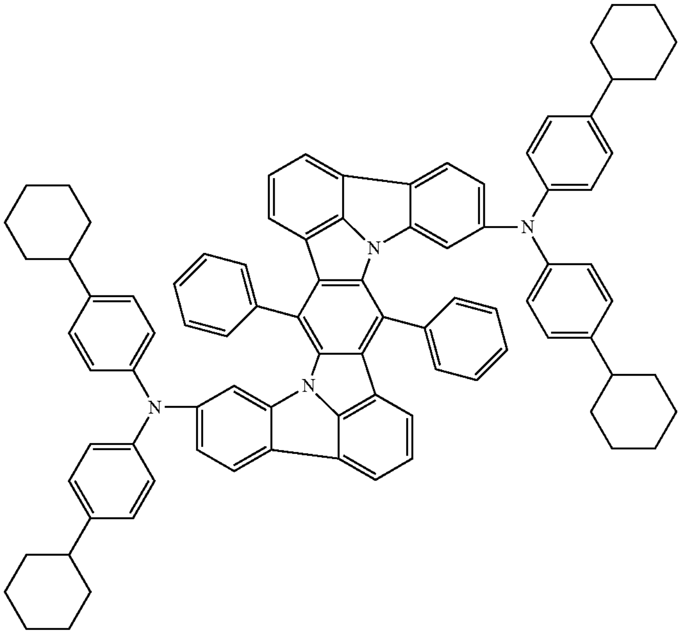
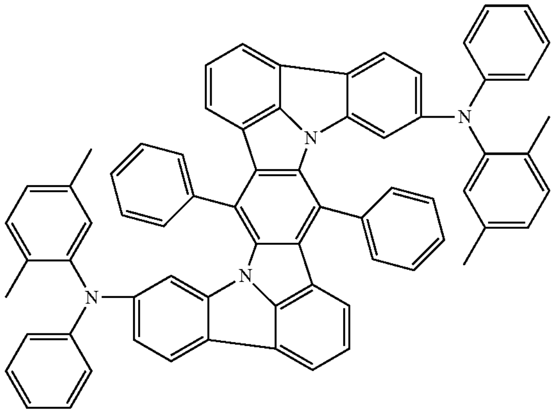
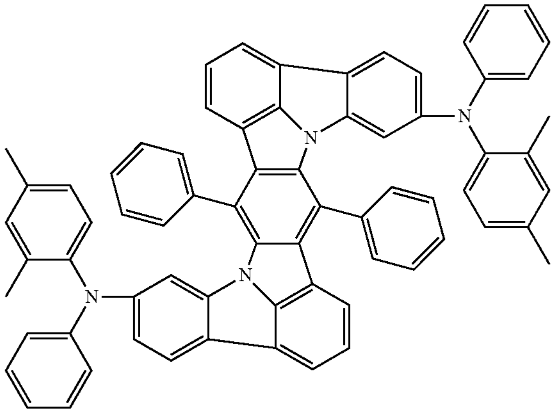

-continued
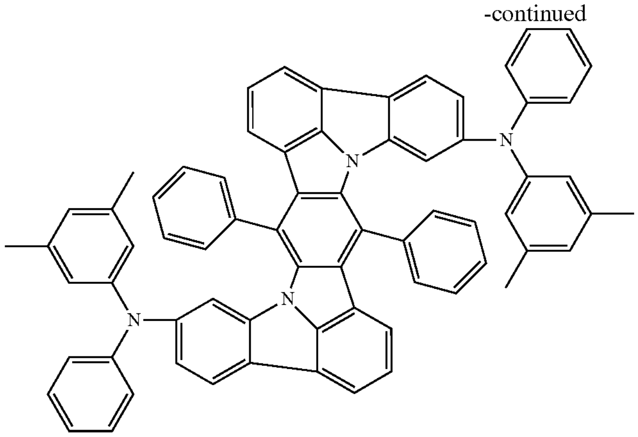
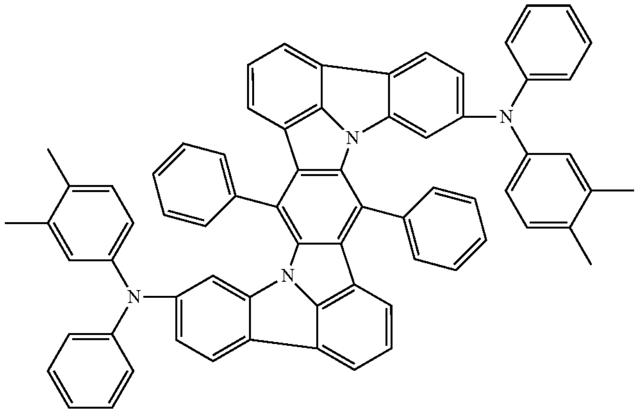
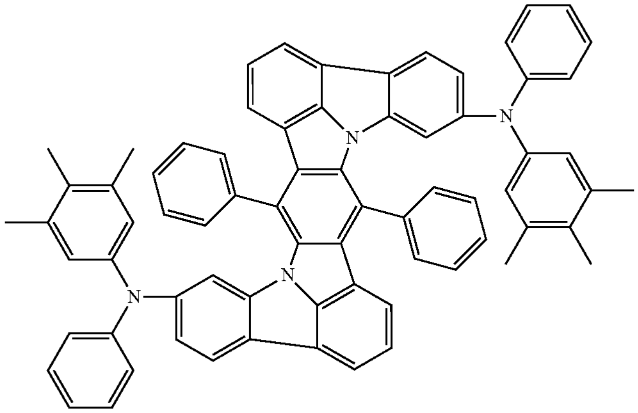
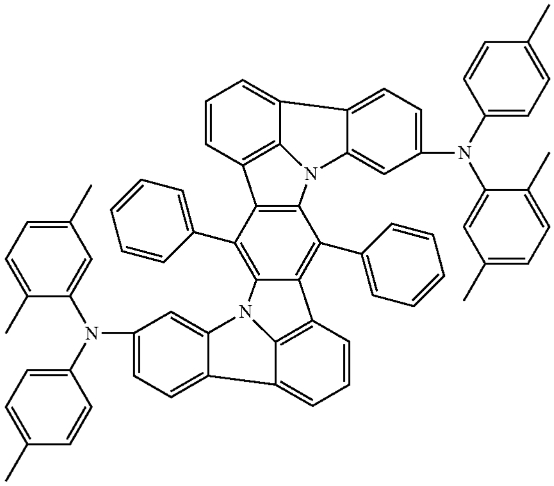

-continued
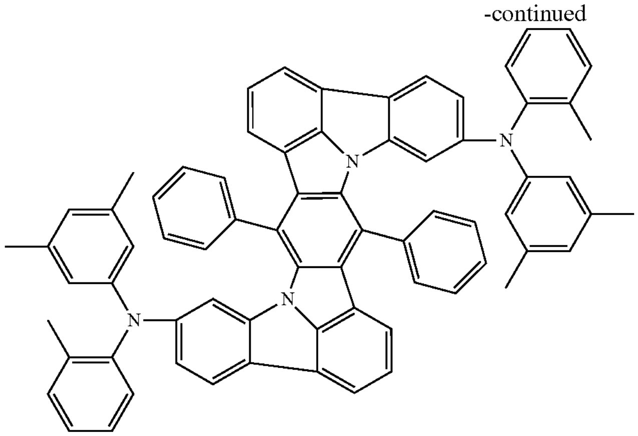
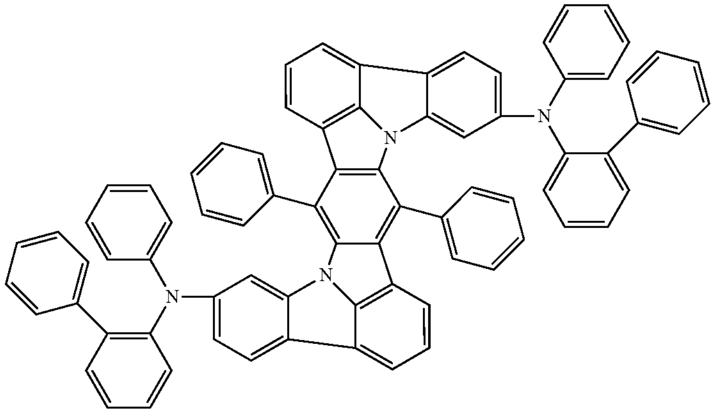
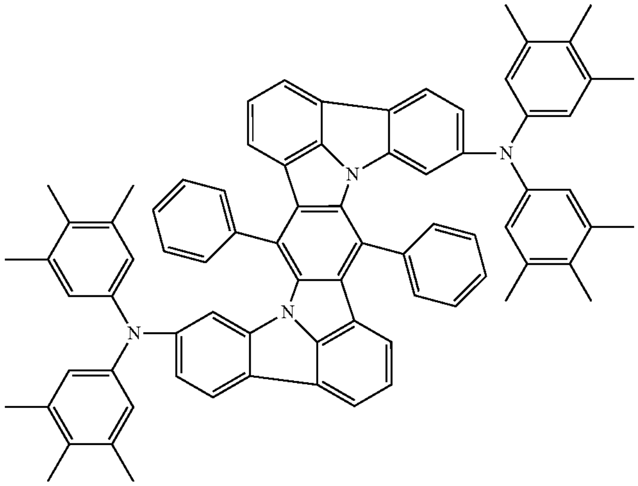
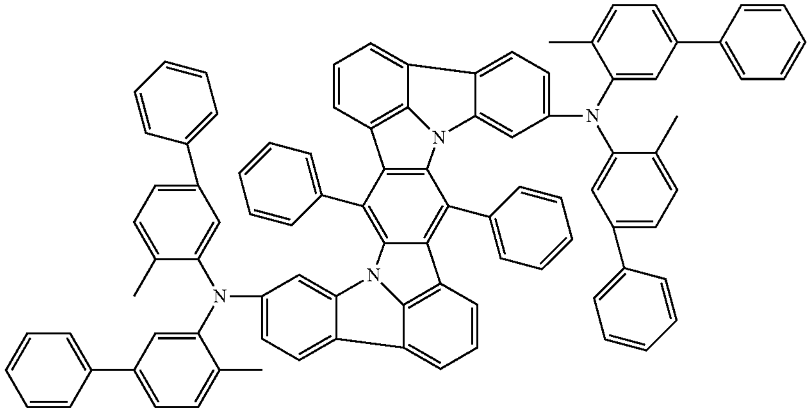

-continued
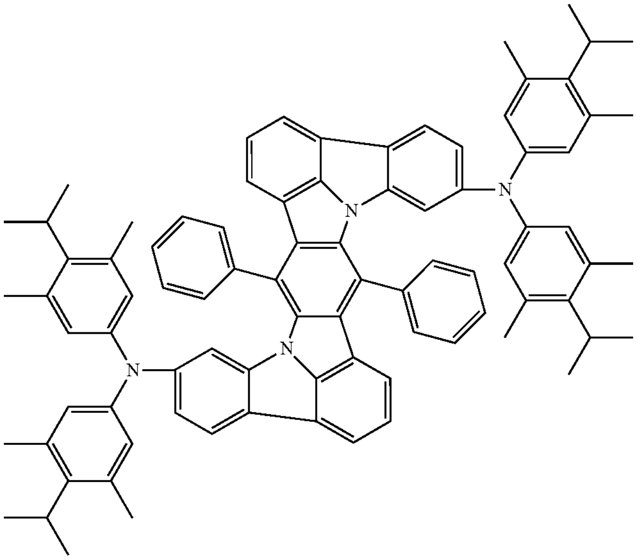
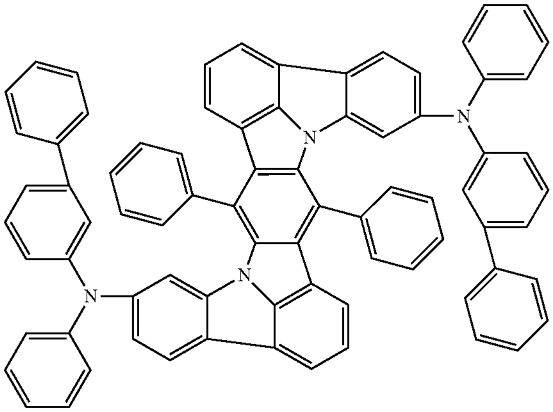
[Formula 450]
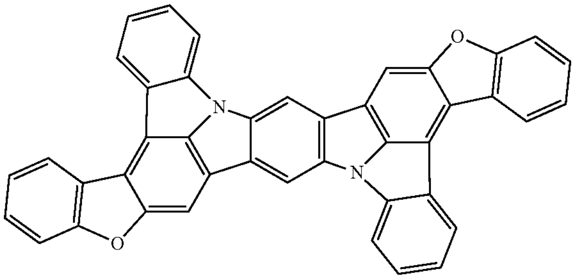
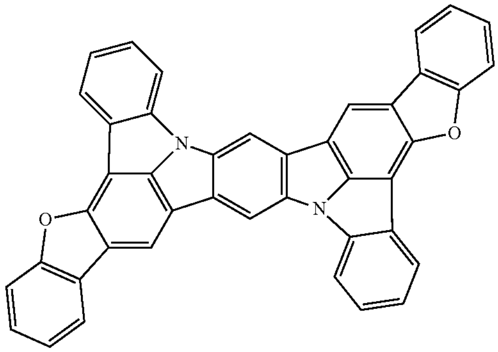

-continued
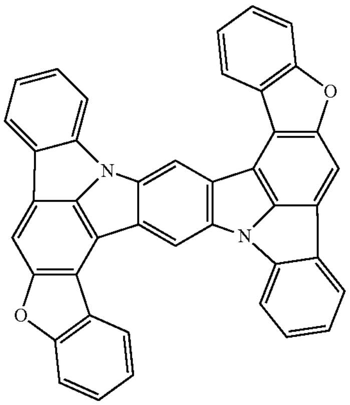
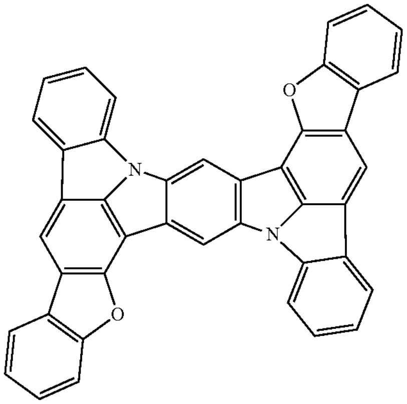
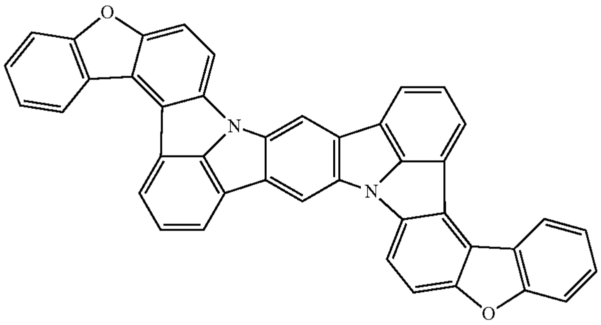
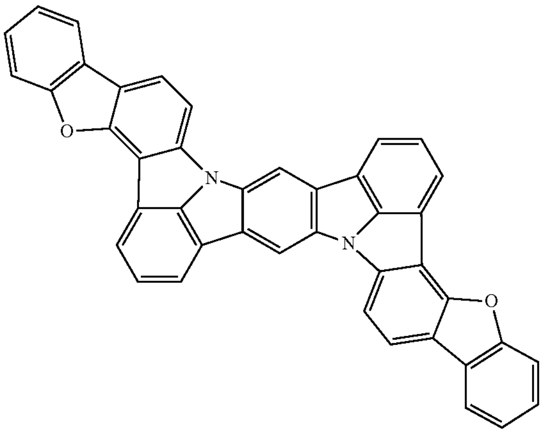
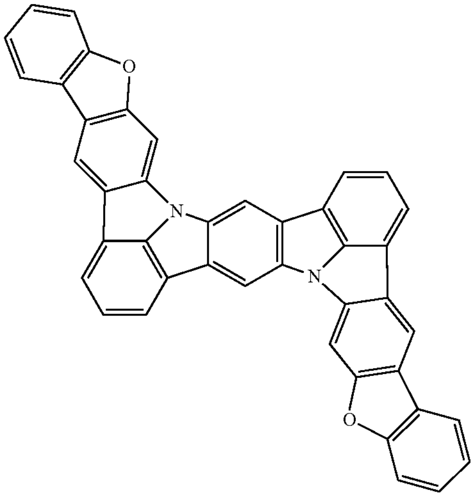
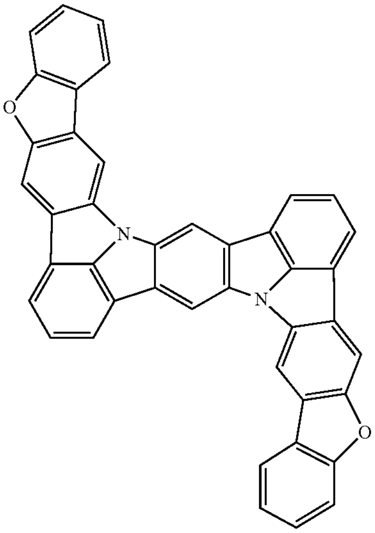

-continued
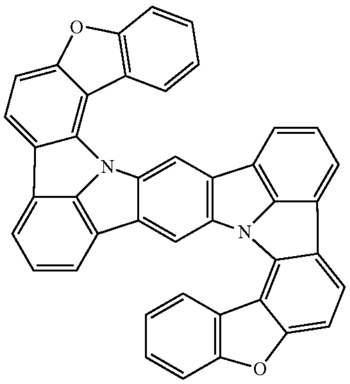
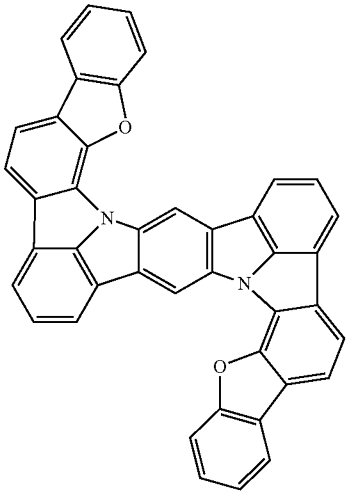
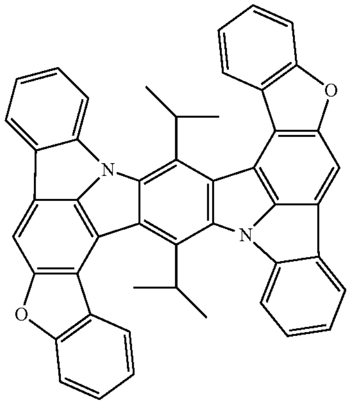
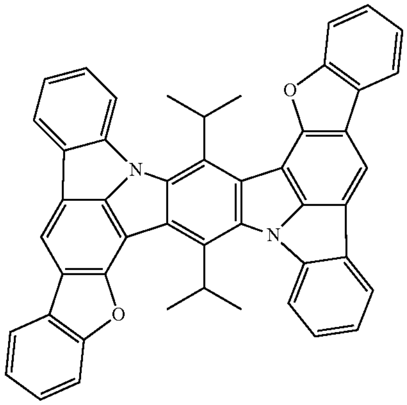
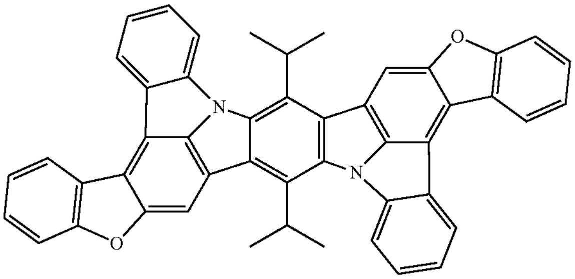
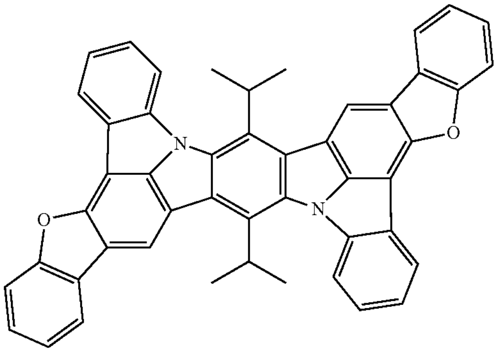

-continued
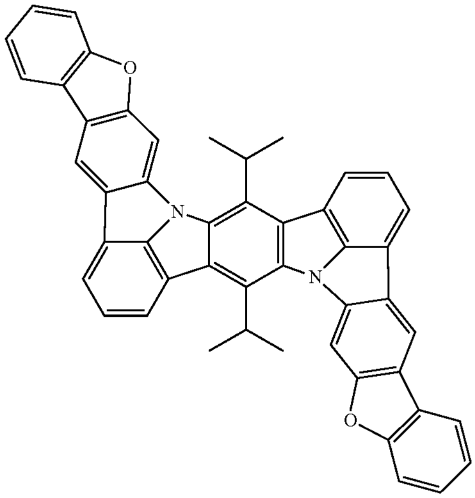
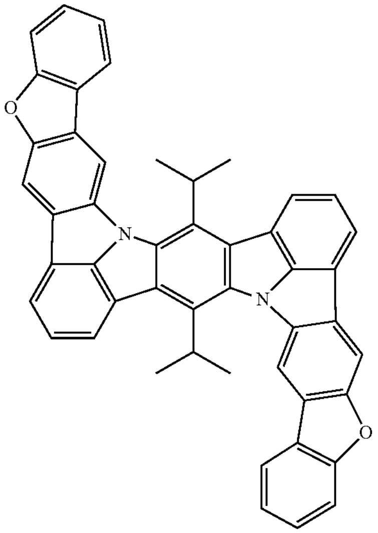
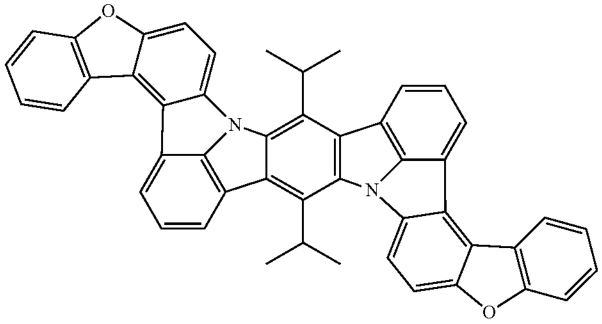
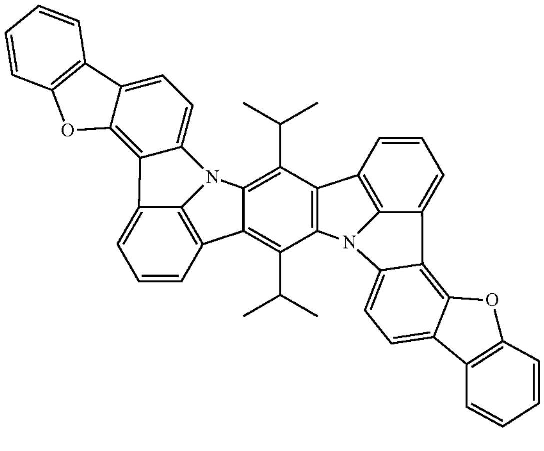
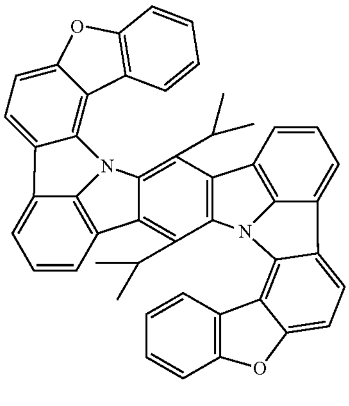

-continued
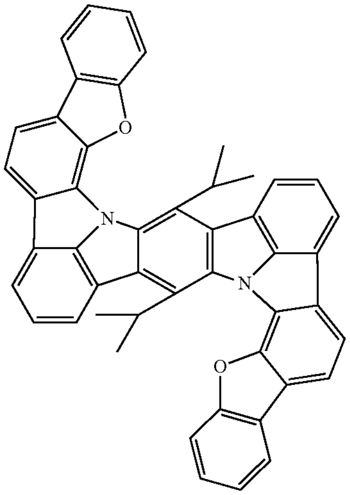
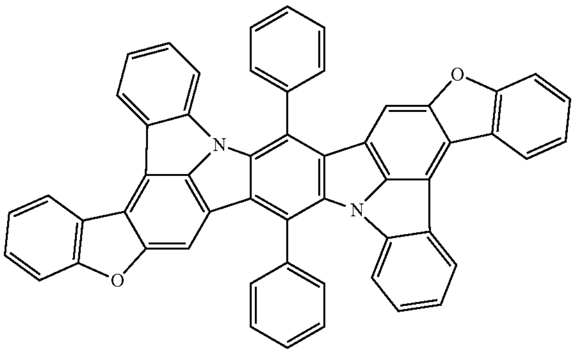
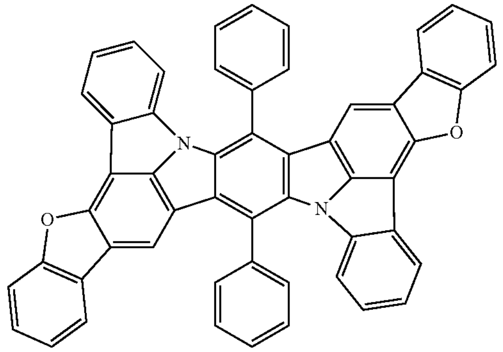
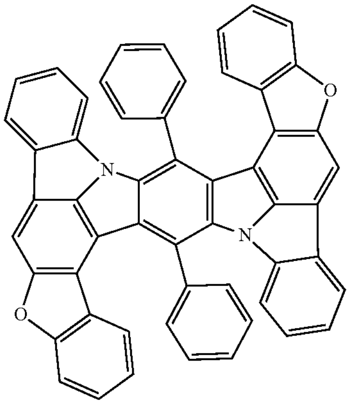
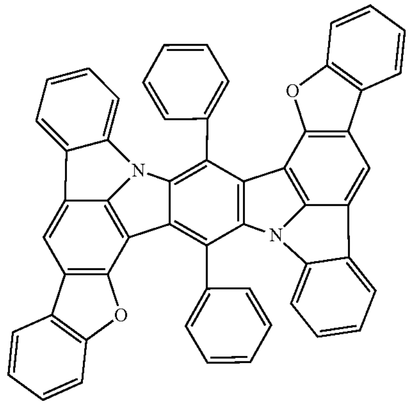
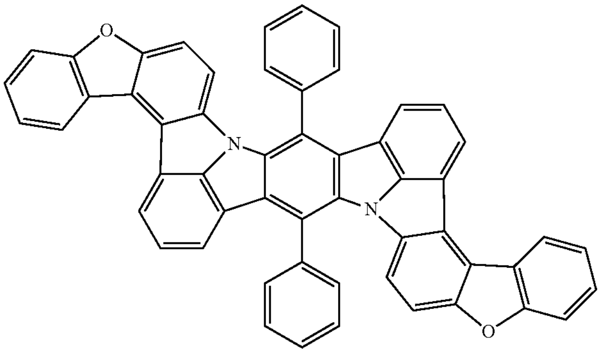

-continued
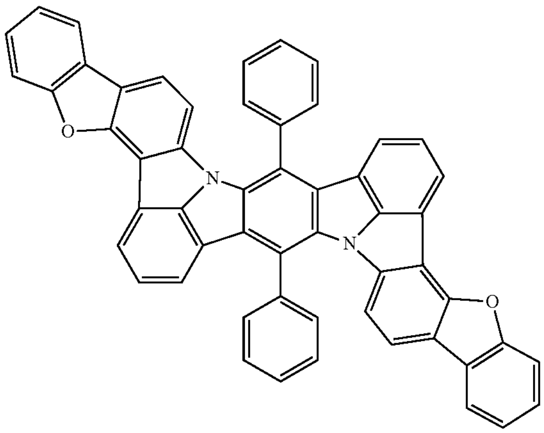
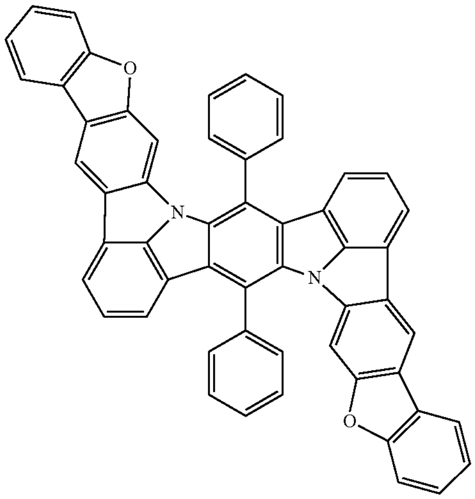
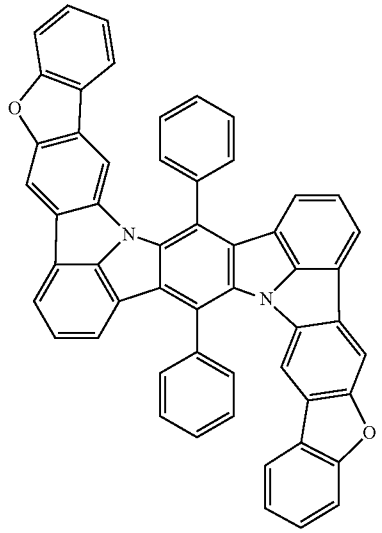
[Formula 451]
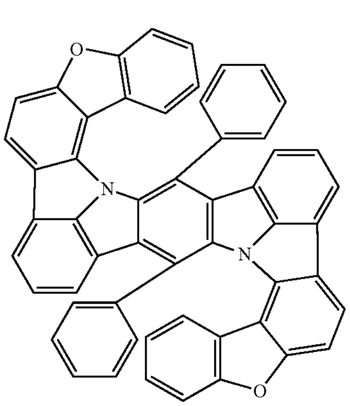
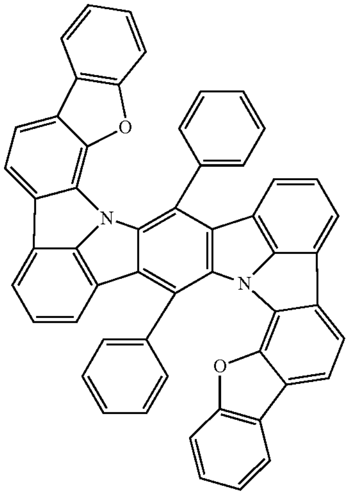

-continued
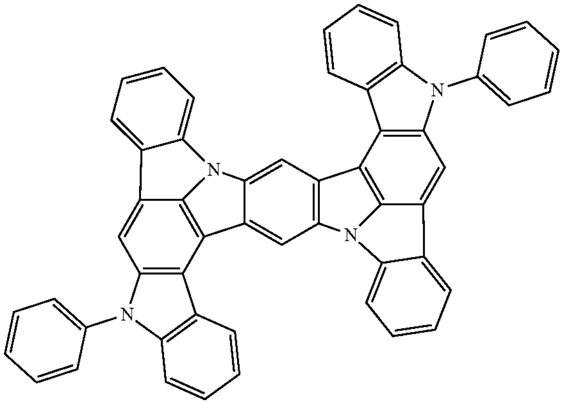
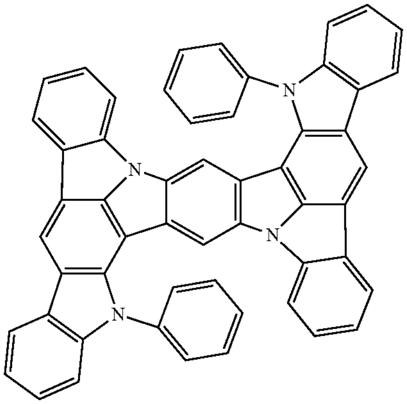
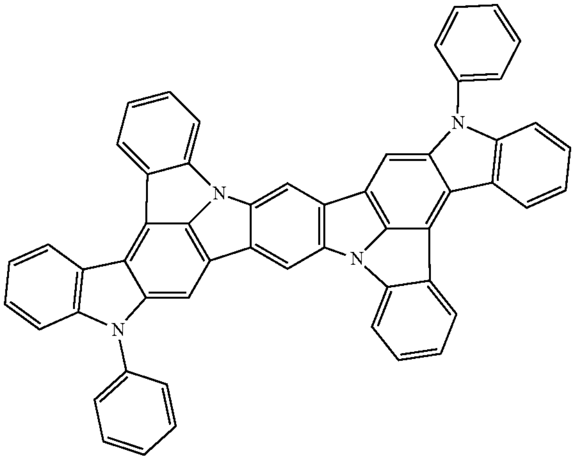
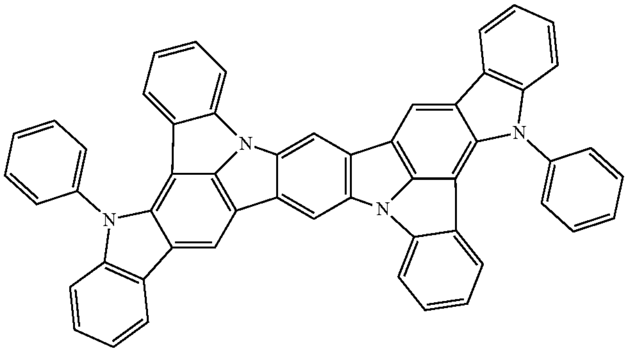

-continued
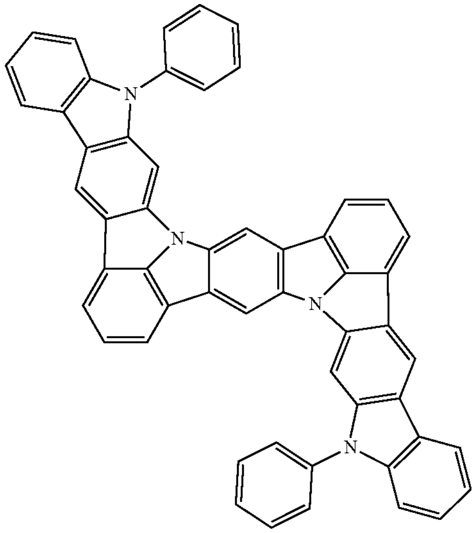
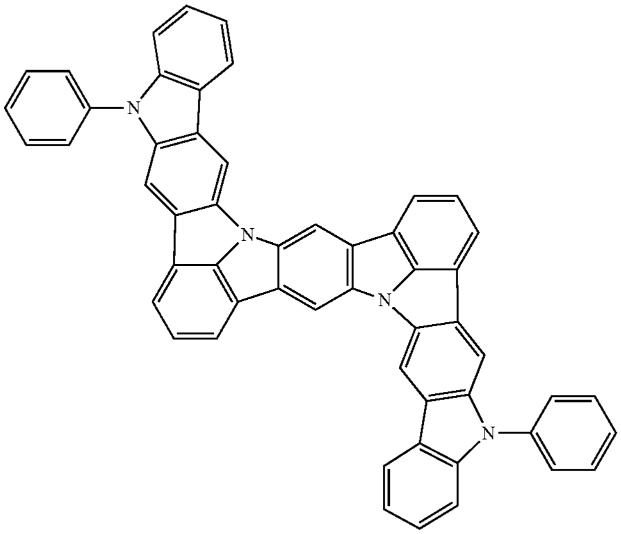
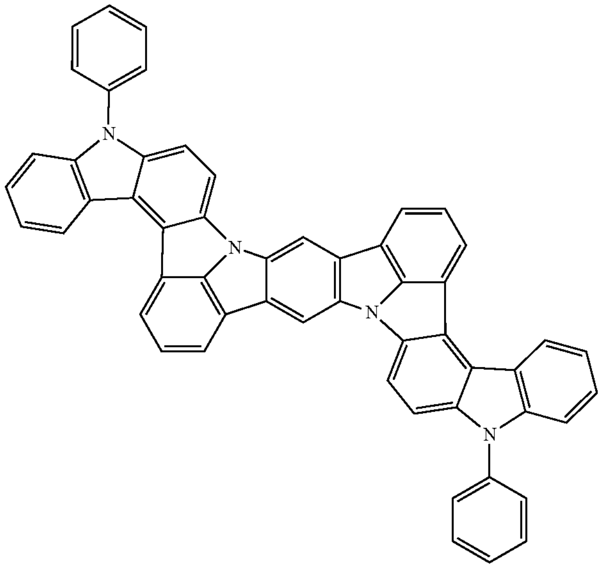
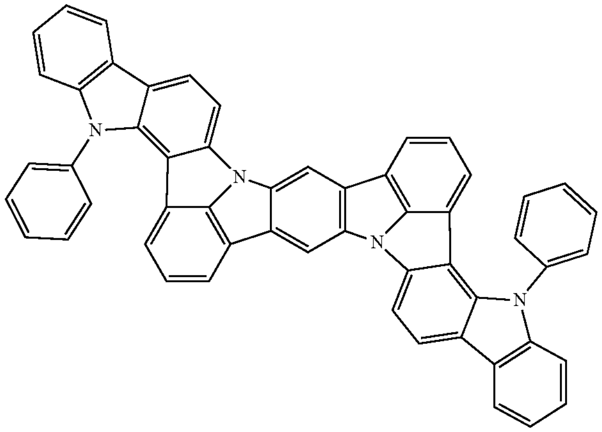

-continued
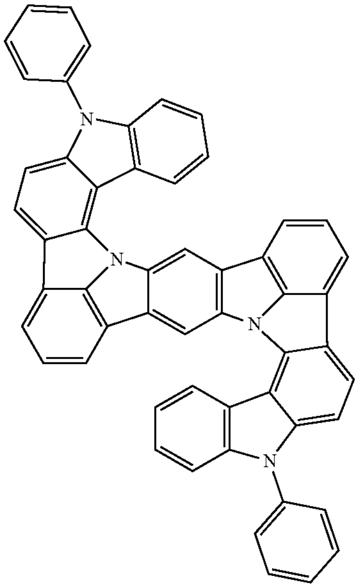
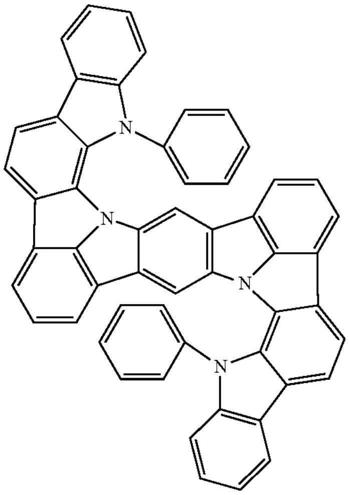
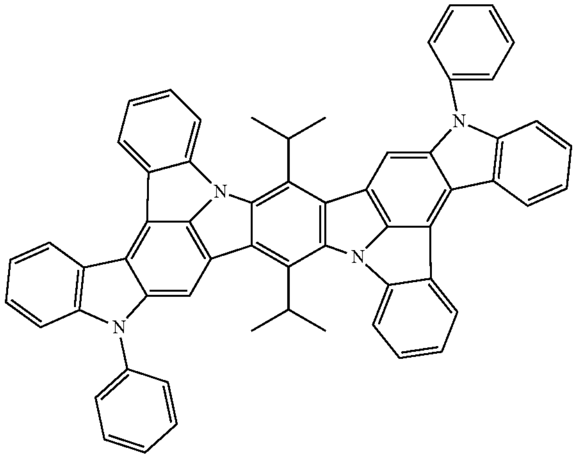
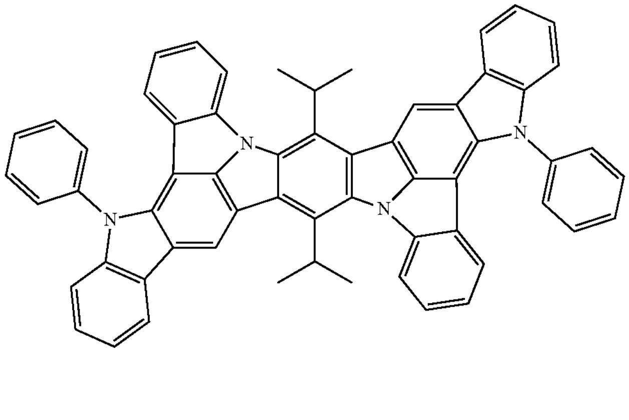

-continued
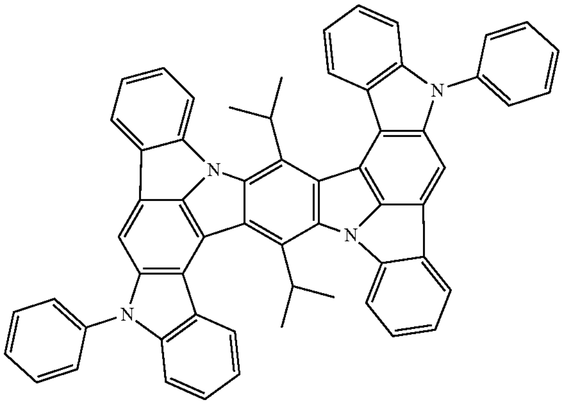
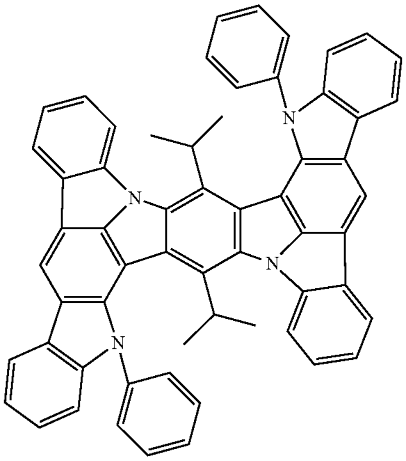
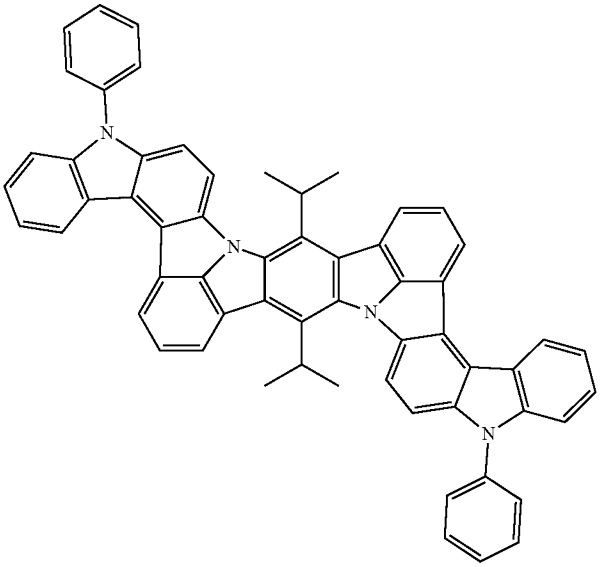
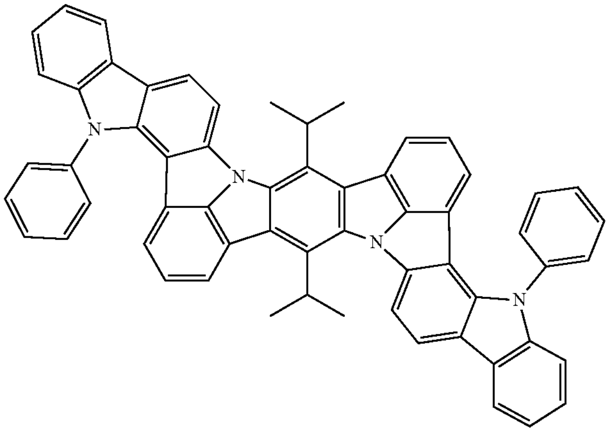

-continued
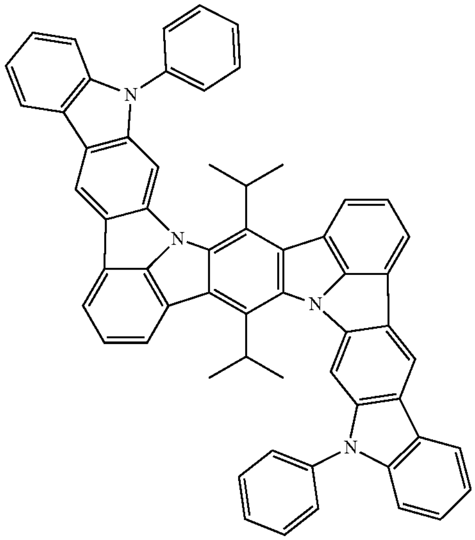
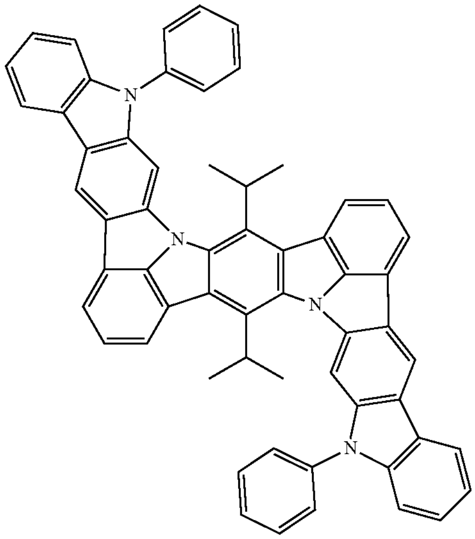
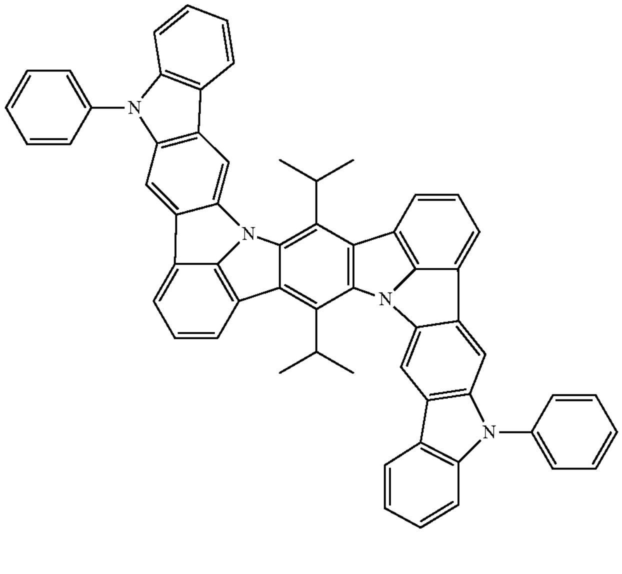
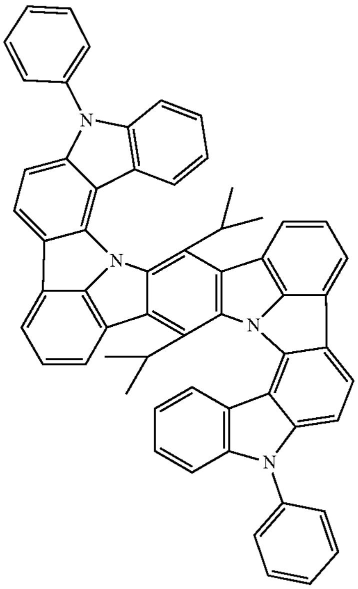

-continued
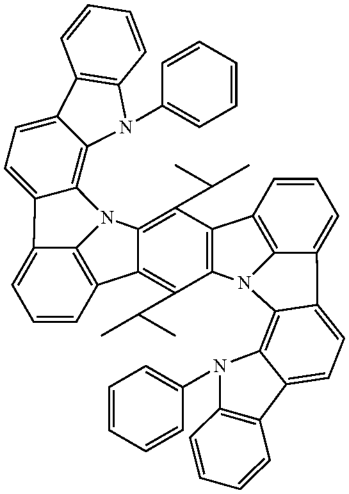
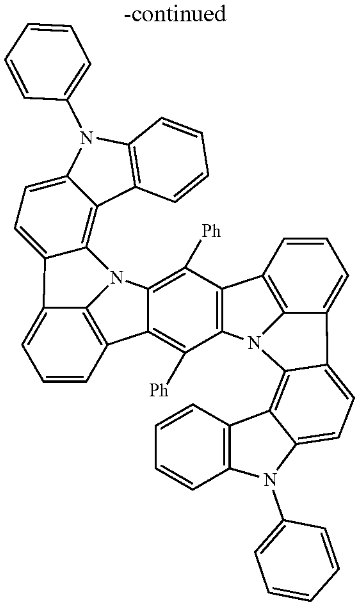
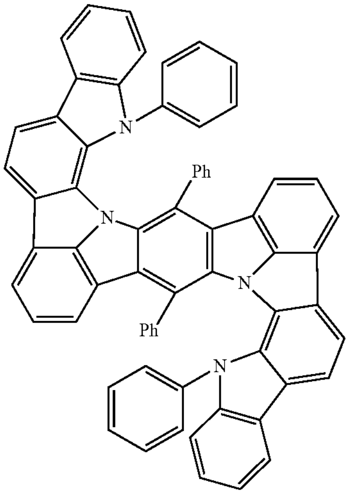
In the formulae, Ph represents a phenyl group,
[Formula 452]
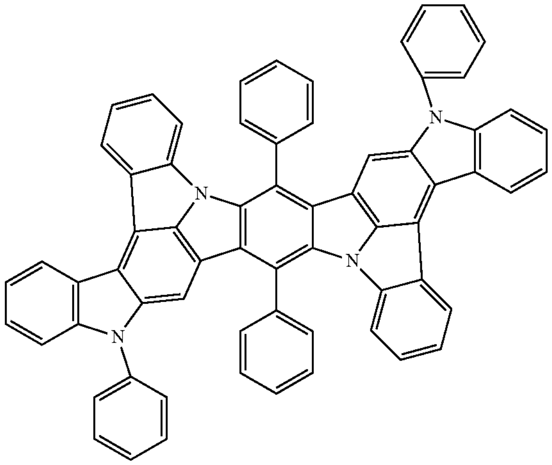
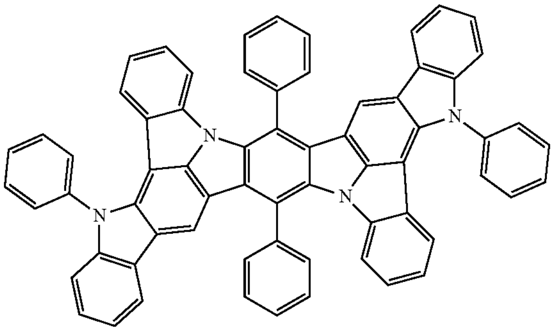
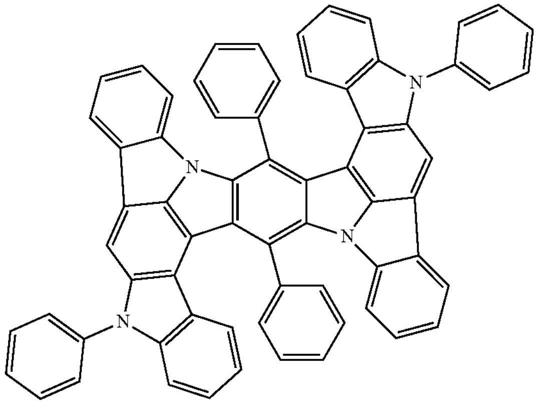
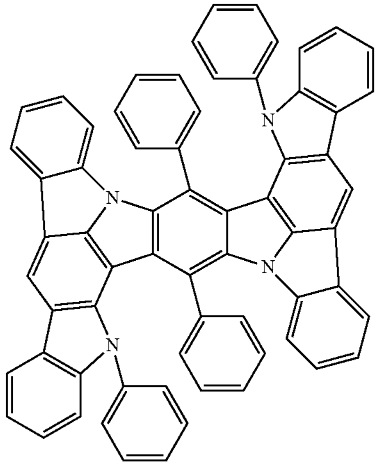

-continued
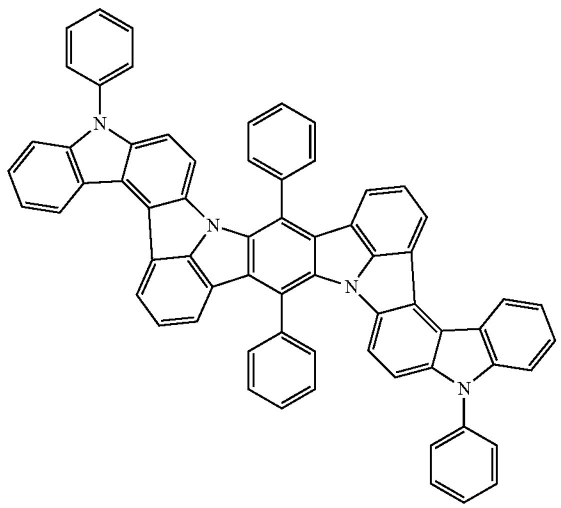
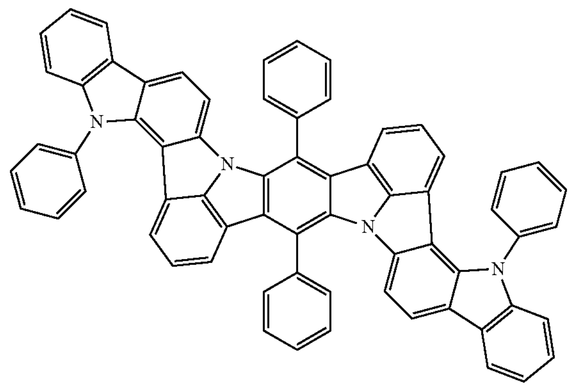
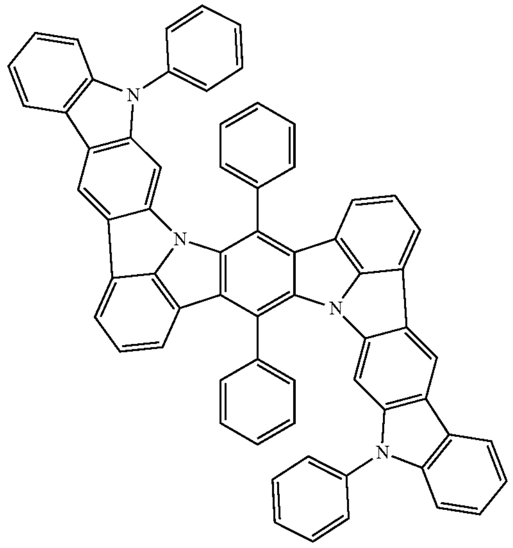
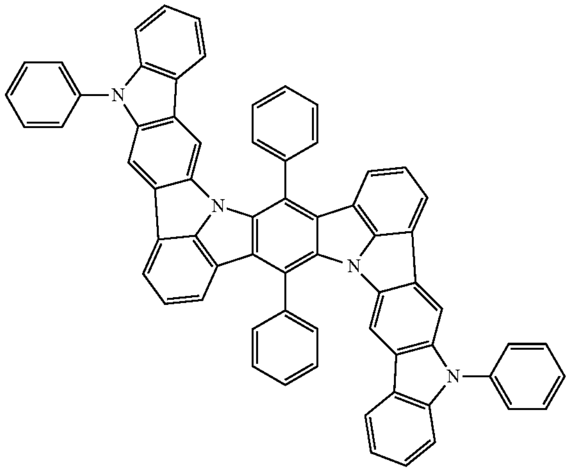
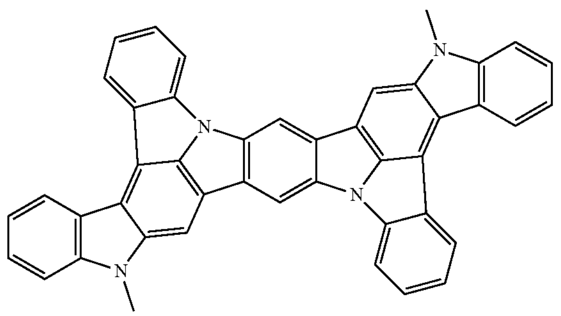
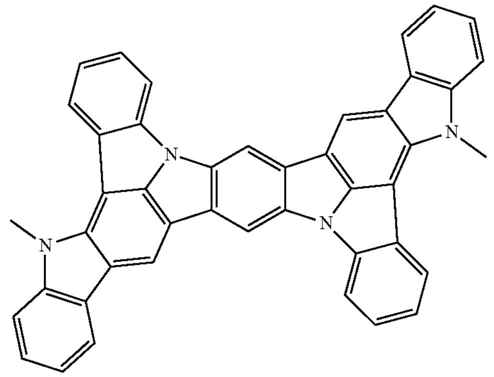

-continued
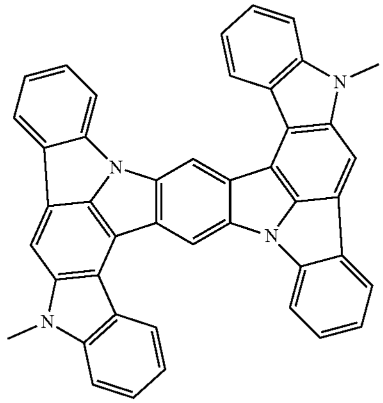
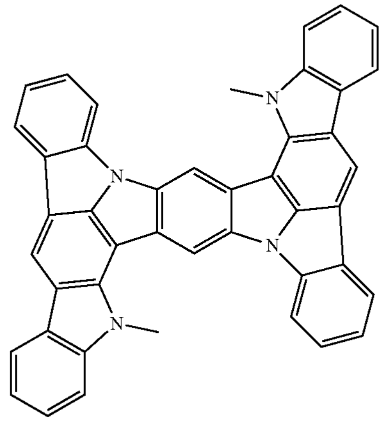
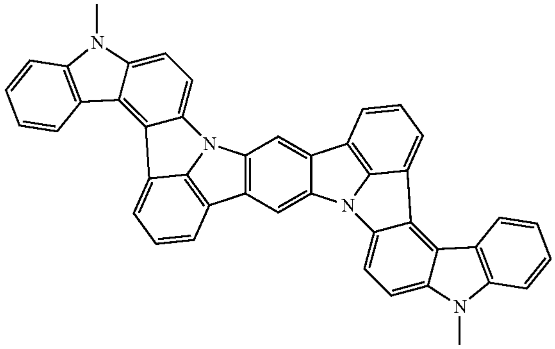
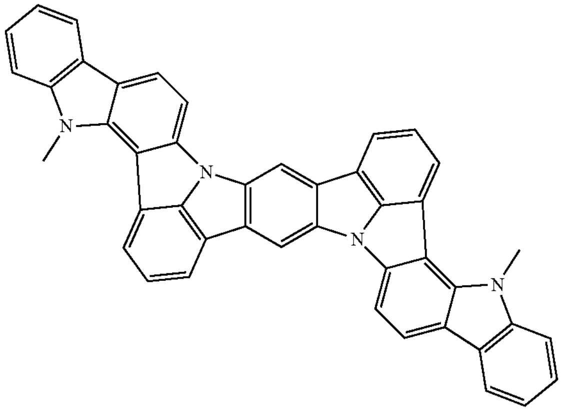
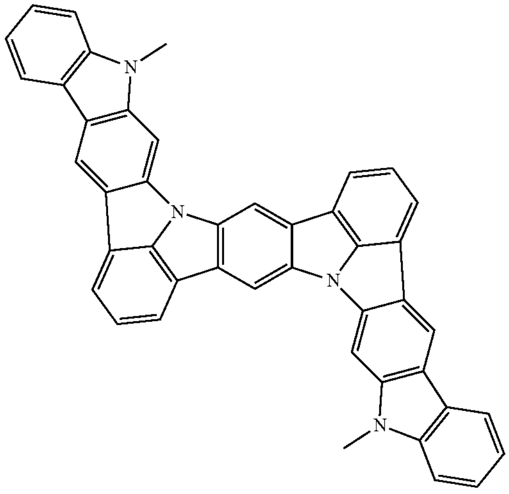
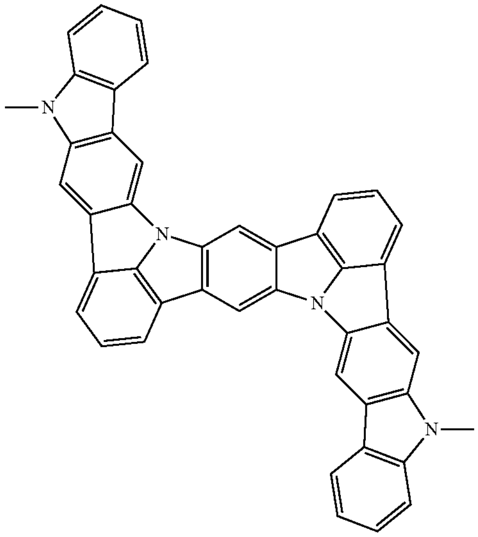

-continued
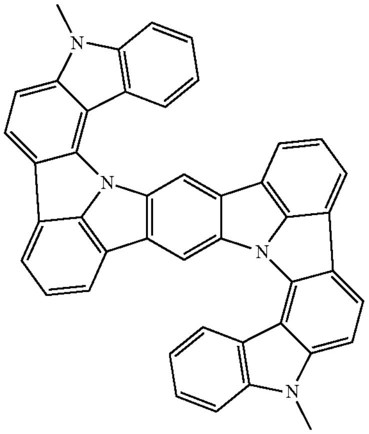
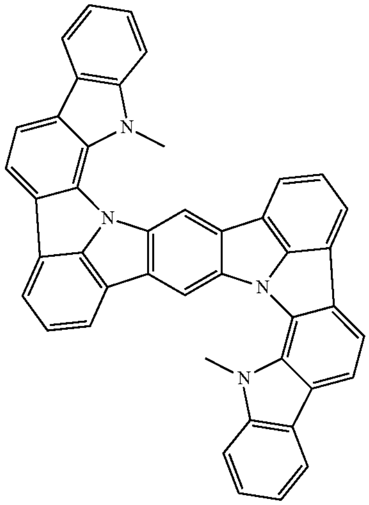
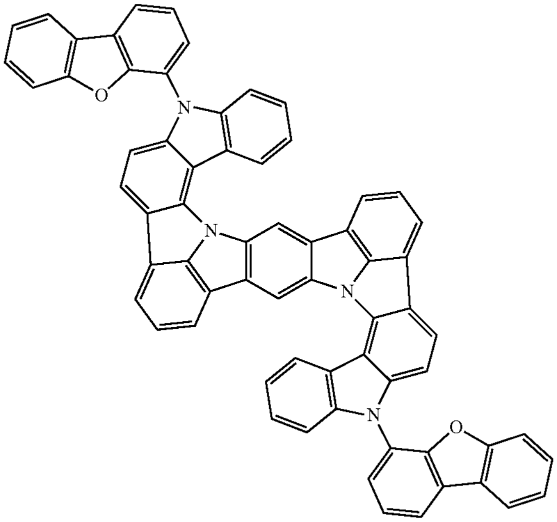
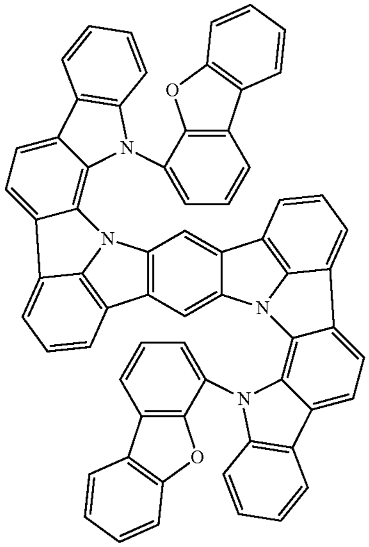
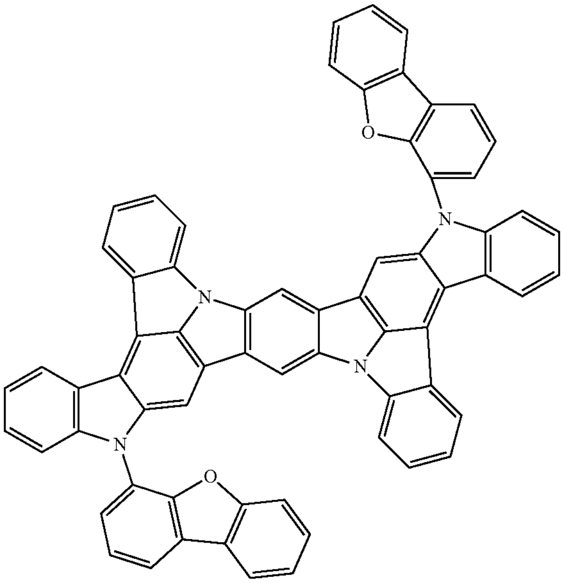

-continued
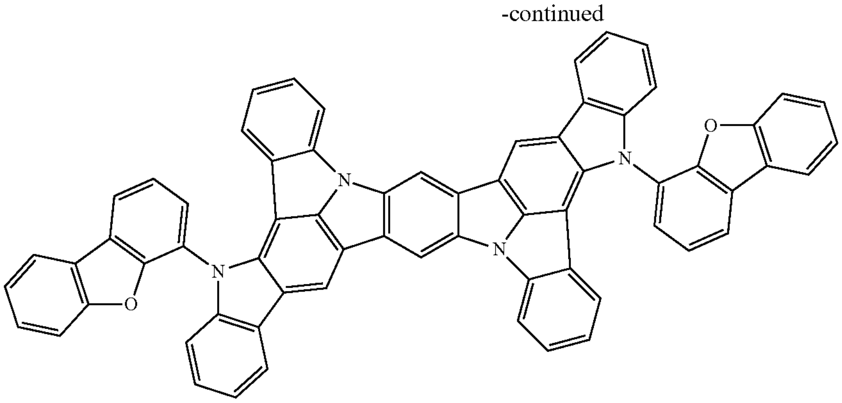
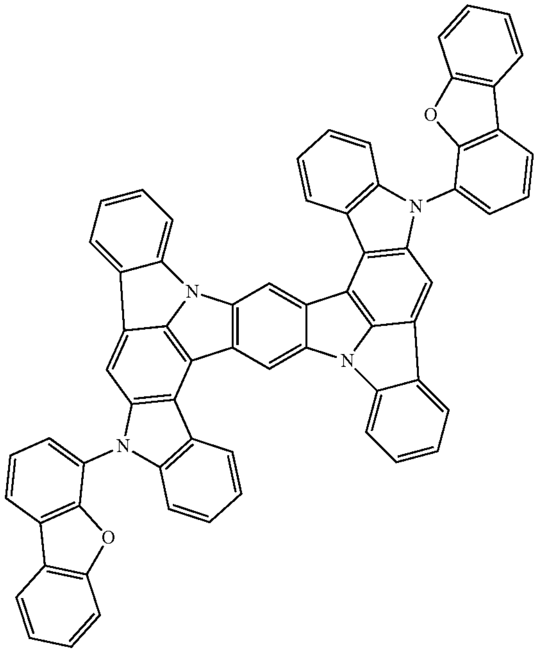
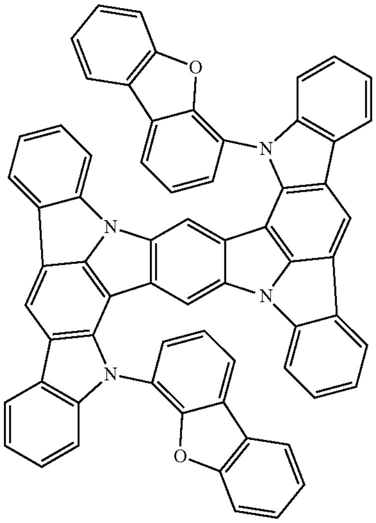
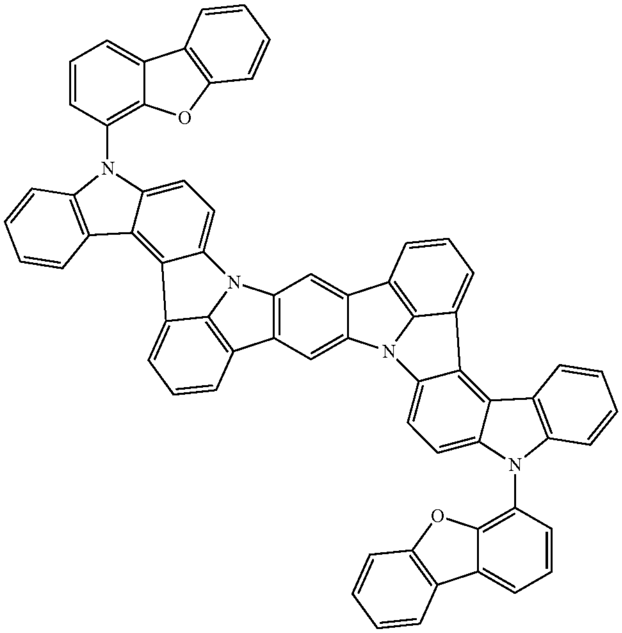

-continued
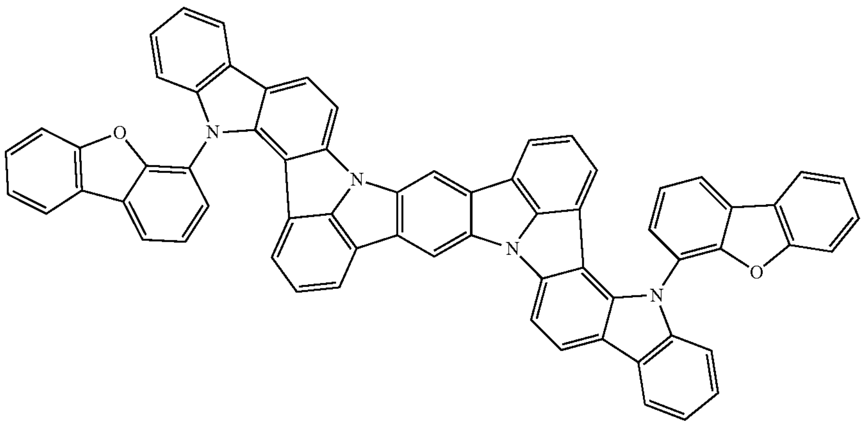
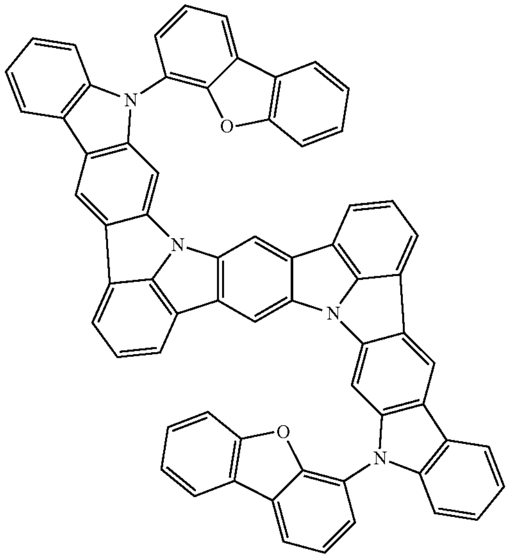
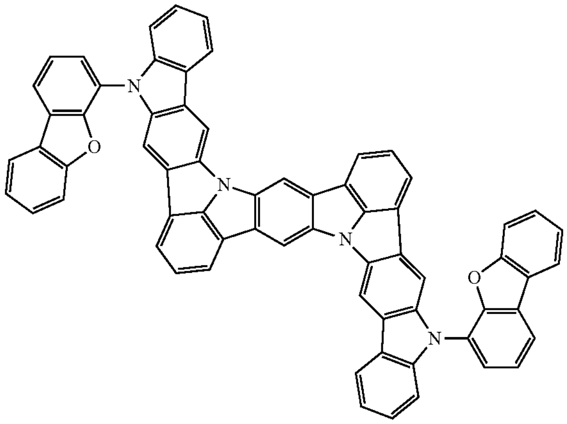
[Formula 453]
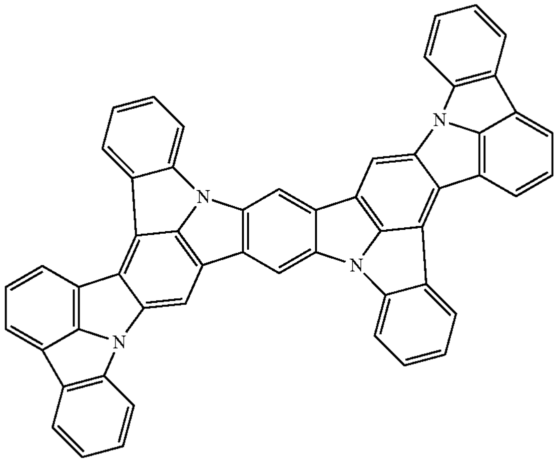
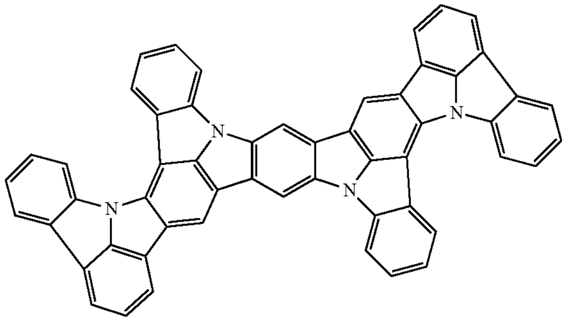

-continued
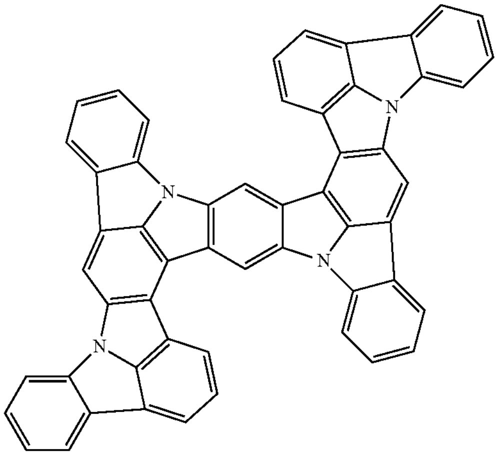
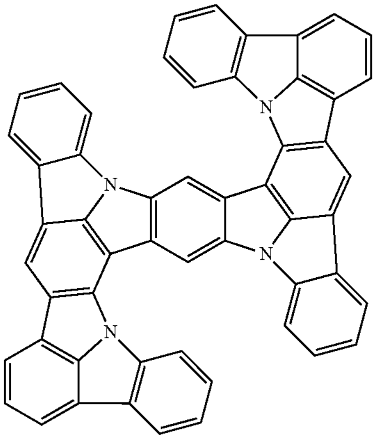
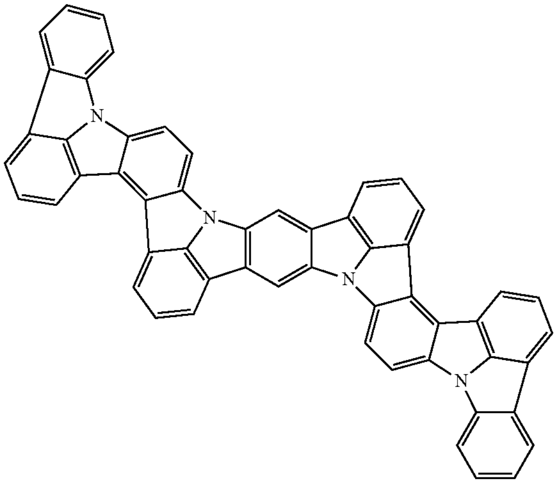
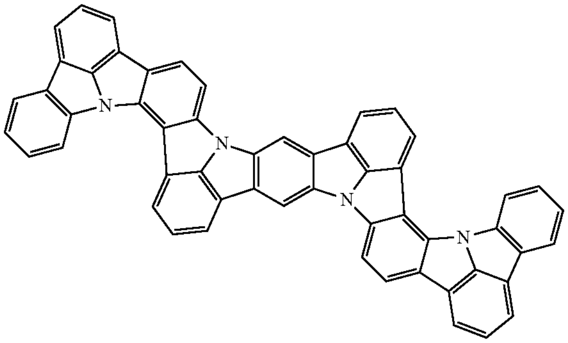
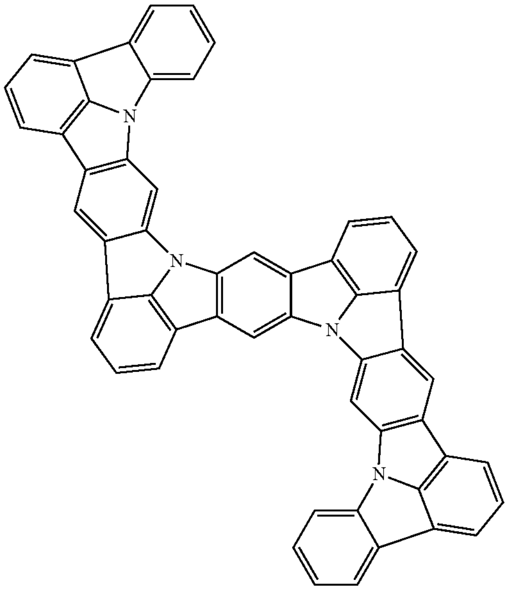
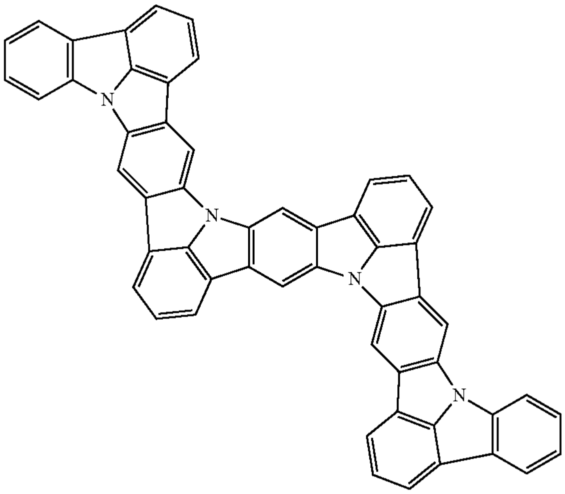

-continued
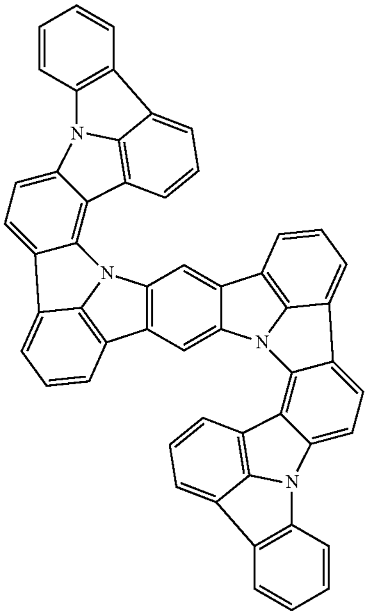
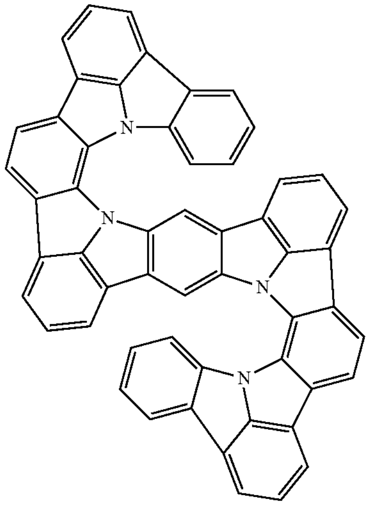
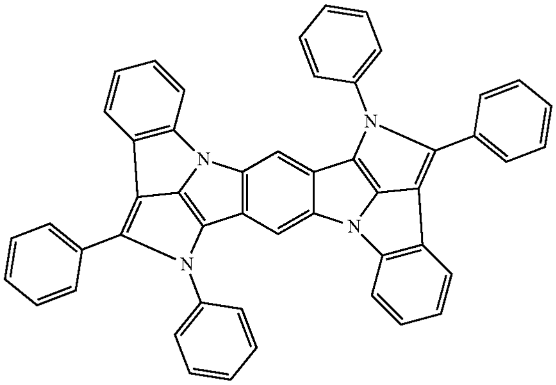
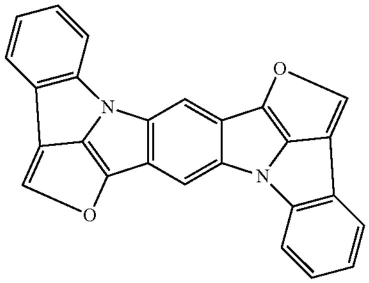
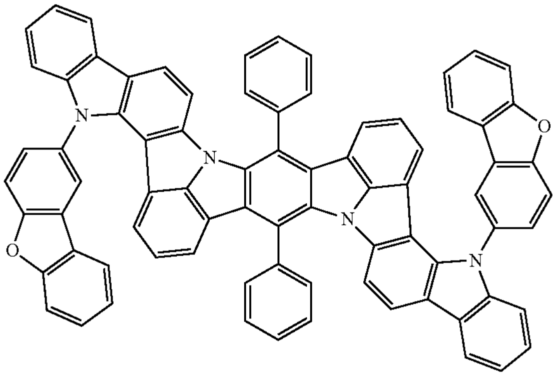
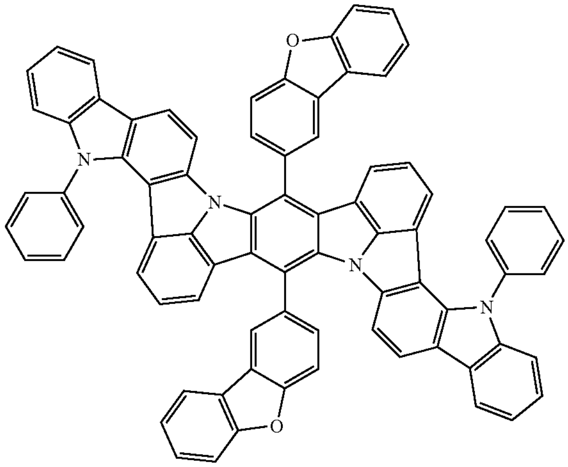

-continued
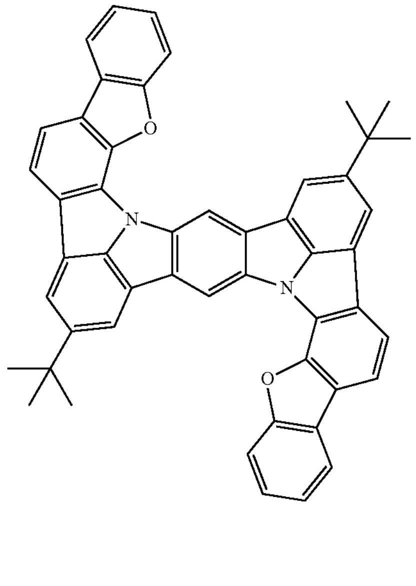
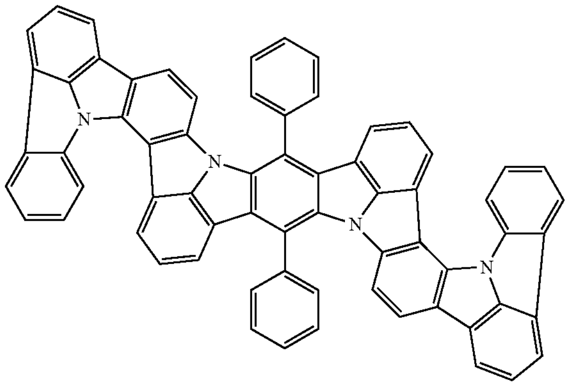
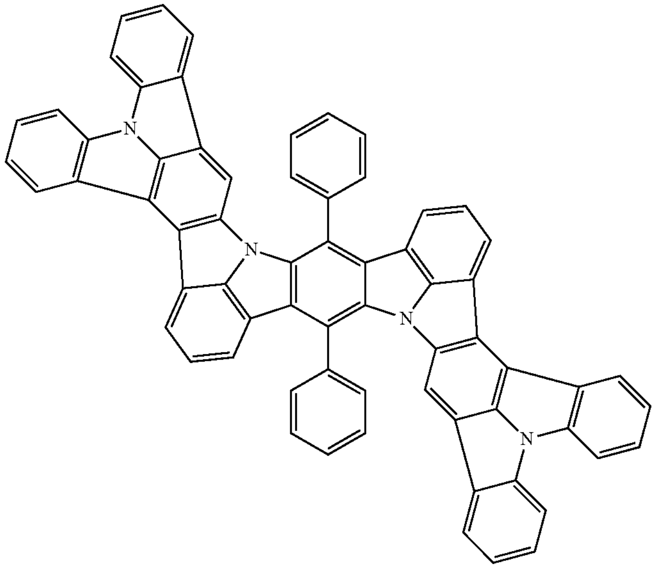

In an exemplary embodiment, the emitting layer contains, as at least one of the first emitting compound, the second emitting compound, or the third emitting compound, at least one compound selected from the group consisting of the compound represented by the formula (4), the compound represented by the formula (5), the compound represented by the formula (7), the compound represented by the formula (8), the compound represented by the formula (9), and a compound represented by the following formula (63a).

[Formula 454]

(63a)

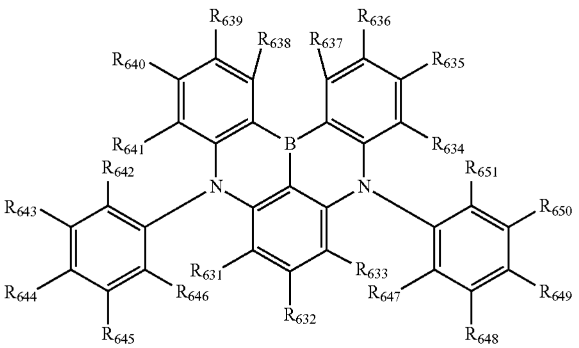

In the formula (63a):

$R_{631}$ is bonded with $R_{646}$ to form a substituted or unsubstituted heterocycle, or not bonded therewith to form no substituted or unsubstituted heterocycle;

$R_{633}$ is bonded with $R_{647}$ to form a substituted or unsubstituted heterocycle, or not bonded therewith to form no substituted or unsubstituted heterocycle;

$R_{634}$ is bonded with $R_{651}$ to form a substituted or unsubstituted heterocycle, or not bonded therewith to form no substituted or unsubstituted heterocycle;

$R_{641}$ is bonded with $R_{642}$ to form a substituted or unsubstituted heterocycle, or not bonded therewith to form no substituted or unsubstituted heterocycle;

at least one combination of adjacent two or more of $R_{631}$ to $R_{651}$ are mutually bonded to form a substituted or unsubstituted monocyclic ring, mutually bonded to form a substituted or unsubstituted fused ring, or not mutually bonded;

$R_{631}$ to $R_{651}$ not forming the substituted or unsubstituted heterocycle, not forming the monocyclic ring, and not forming the fused ring are each independently a hydrogen atom, a halogen atom, a cyano group, a nitro group, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aryl group having 6 to 50 ring carbon atoms, or a substituted or unsubstituted heterocyclic group having 5 to 50 ring atoms; and at least one of $R_{631}$ to $R_{651}$ not forming the substituted or unsubstituted heterocycle, not forming the monocyclic ring, and not forming the fused ring is a halogen atom, a cyano group, a nitro group, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

In an exemplary embodiment, the compound represented by the formula (4) is a compound represented by the formula (41-3), the formula (41-4), or the formula (41-5), A1 ring in the formula (41-5) being a substituted or unsubstituted fused aromatic hydrocarbon ring having 10 to 50 ring carbon atoms, or a substituted or unsubstituted fused heterocycle having 8 to 50 ring atoms.

In an exemplary embodiment, the substituted or unsubstituted fused aromatic hydrocarbon ring having 10 to 50 ring carbon atoms in the formulae (41-3), (41-4) and (41-5) is a substituted or unsubstituted naphthalene ring, a substituted or unsubstituted anthracene ring, or a substituted or unsubstituted fluorene ring; and the substituted or unsubstituted fused heterocycle having 8 to 50 ring atoms is a substituted or unsubstituted dibenzofuran ring, a substituted or unsubstituted carbazole ring, or a substituted or unsubstituted dibenzothiophene ring.

In an exemplary embodiment, the substituted or unsubstituted fused aromatic hydrocarbon ring having 10 to 50 ring carbon atoms in the formula (41-3), (41-4) or (41-5) is a substituted or unsubstituted naphthalene ring, or a substituted or unsubstituted fluorene ring; and the substituted or unsubstituted fused heterocycle having 8 to 50 ring atoms is a substituted or unsubstituted dibenzofuran ring, a substituted or unsubstituted carbazole ring, or a substituted or unsubstituted dibenzothiophene ring.

In an exemplary embodiment, the compound represented by the formula (4) is selected from the group consisting of a compound represented by a formula (461) below, a compound represented by a formula (462) below, a compound represented by a formula (463) below, a compound represented by a formula (464) below, a compound represented by a formula (465) below, a compound represented by a formula (466) below, and a compound represented by a formula (467) below.

[Formula 455]

(461)

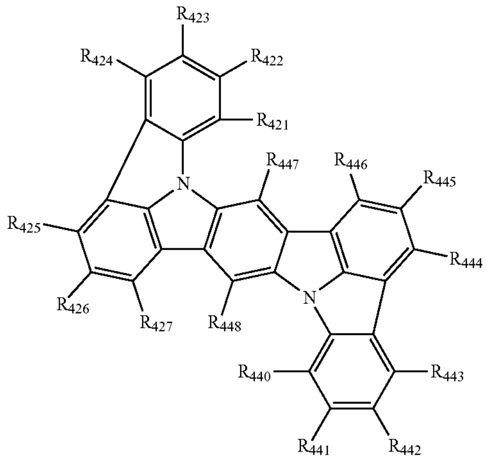

-continued (462)

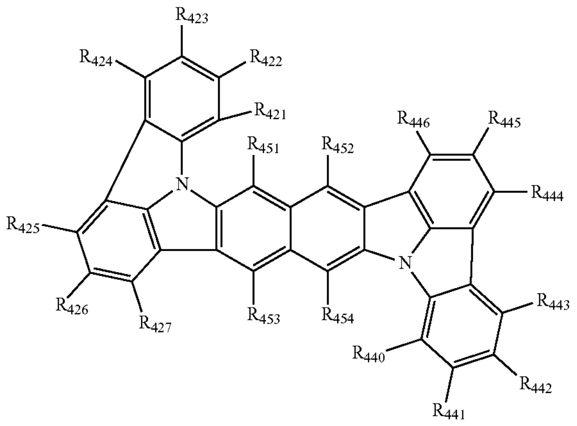

[Formula 456]

(463)

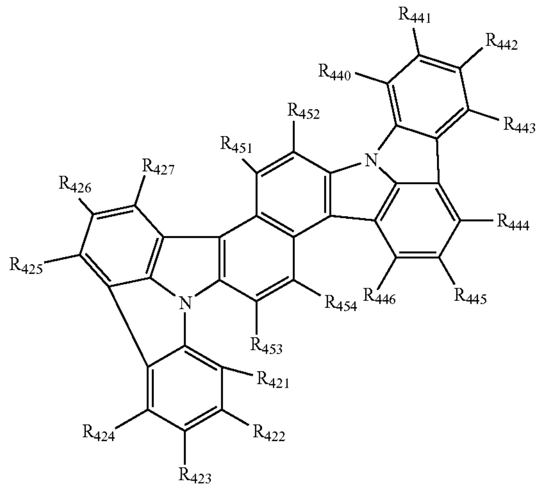

(464)

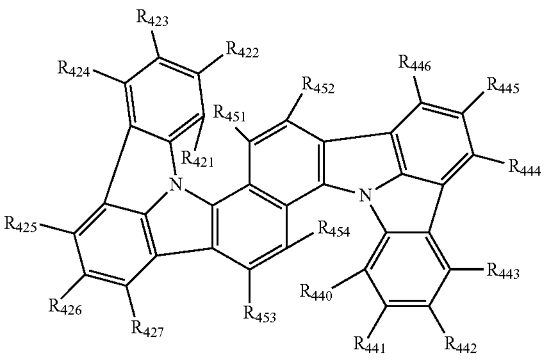

-continued

[Formula 457]

(465)

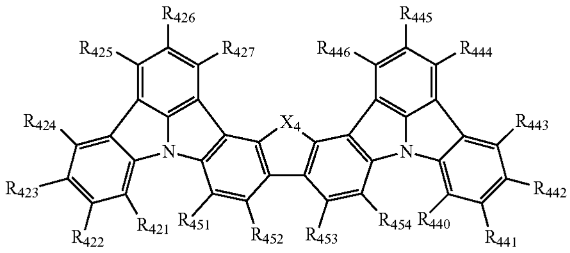

[Formula 458]

(466)

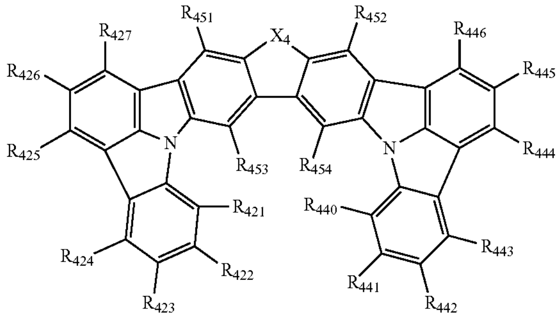

[Formula 459]

(467)

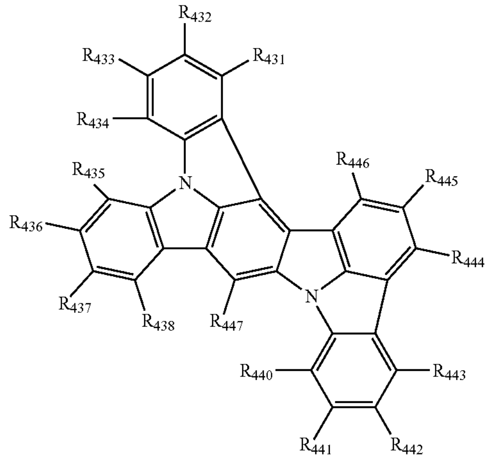

In the formulae (461) to (467):

at least one combination of adjacent two or more of $R_{421}$ to $R_{427}$, $R_{431}$ to $R_{436}$, $R_{440}$ to $R_{448}$, and $R_{451}$ to $R_{454}$ are mutually bonded to form a substituted or unsubstituted monocyclic ring, mutually bonded to form a substituted or unsubstituted fused ring, or not mutually bonded; and $R_{421}$ to $R_{427}$, $R_{431}$ to $R_{436}$, $R_{44}$ to $R_{443}$, and $R_{451}$ to $R_{454}$ forming neither the monocyclic ring nor the fused ring, and $R_{437}$ and $R_{438}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

$X_4$ is an oxygen atom, $NR_{801}$, or $C(R_{802})(R_{803})$;

$R_{801}$, $R_{802}$, and $R_{803}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, a substituted or unsubstituted heterocyclic group having 5 to 50 ring atoms, a substituted or unsubstituted alkyl group having 1 to 50 carbon atoms, or a substituted or unsubstituted aryl group having 6 to 50 ring carbon atoms;

when a plurality of $R_{801}$ are present, the plurality of $R_{801}$ are mutually the same or different;

when a plurality of $R_{802}$ are present, the plurality of $R_{802}$ are mutually the same or different; and when a plurality of $R_{803}$ are present, the plurality of $R_{803}$ are mutually the same or different.

In an exemplary embodiment, $R_{421}$ to $R_{427}$ and $R_{440}$ to $R_{448}$ are each independently selected from the group consisting of a hydrogen atom, a substituted or unsubstituted aryl group having 6 to 50 ring carbon atoms, or a substituted or unsubstituted heterocyclic group having 5 to 50 ring atoms.

In an exemplary embodiment, $R_{421}$ to $R_{427}$ and $R_{440}$ to $R_{447}$ are each independently selected from the group consisting of a hydrogen atom, a substituted or unsubstituted aryl group having 6 to 18 ring carbon atoms, and a substituted or unsubstituted heterocyclic group having 5 to 18 ring atoms.

In an exemplary embodiment, the compound represented by the formula (41-3) is a compound represented by a formula (41-3-1) below.

[Formula 460]

(41-3-1)

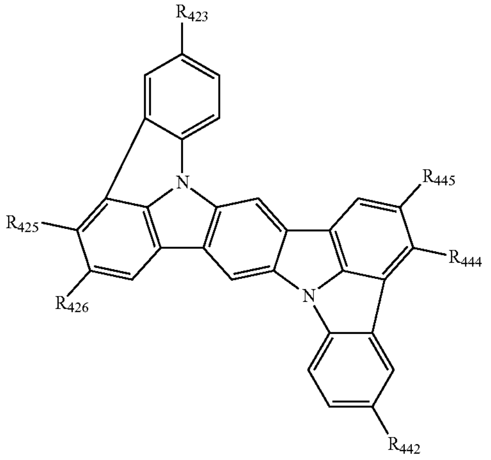

In the formula (41-3-1), $R_{423}$, $R_{425}$, $R_{426}$, $R_{442}$, $R_{444}$ and $R_{445}$ each independently represent the same as $R_{423}$, $R_{425}$, $R_{426}$, $R_{442}$, $R_{444}$ and $R_{445}$ in the formula (41-3).

In an exemplary embodiment, the compound represented by the formula (41-3) is a compound represented by a formula (41-3-2) below.

[Formula 461]

(41-3-2)

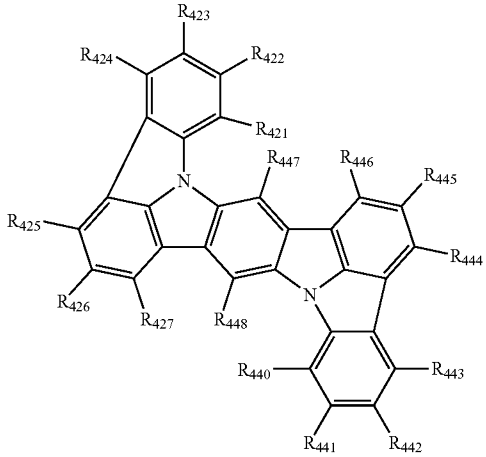

In the formula (41-3-2), $R_{421}$ to $R_{427}$ and $R_{440}$ to $R_{448}$ each independently represent the same as $R_{421}$ to $R_{427}$ and $R_{440}$ to $R_{448}$ in the formula (41-3); and at least one of $R_{421}$ to $R_{427}$ or $R_{440}$ to $R_{446}$ is a group represented by —N($R_{906}$)($R_{907}$).

In an exemplary embodiment, two of $R_{421}$ to $R_{427}$ and $R_{440}$ to $R_{446}$ in the formula (41-3-2) are each a group represented by —N($R_{906}$)($R_{907}$).

In an exemplary embodiment, the compound represented by the formula (41-3-2) is a compound represented by a formula (41-3-3) below.

[Formula 462]

(41-3-3)

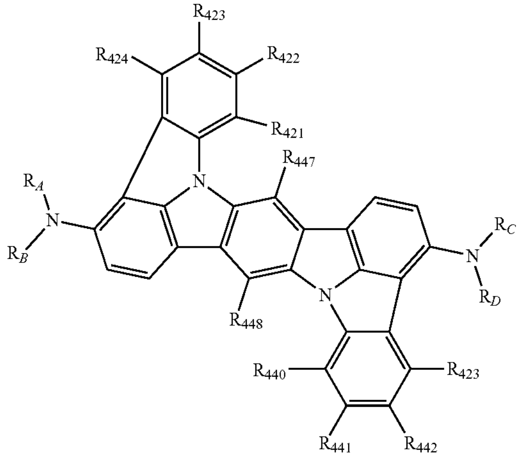

In the formula (41-3-3), $R_{421}$ to $R_{424}$, $R_{440}$ to $R_{443}$, $R_{447}$, and $R_{448}$ each independently represent the same as $R_{421}$ to $R_{424}$, $R_{440}$ to $R_{443}$, $R_{447}$, and $R_{448}$ in the formula (41-3); and $R_A$, $R_B$, $R_C$, and $R_D$ are each independently a substituted or unsubstituted aryl group having 6 to 18 ring carbon atoms, or a substituted or unsubstituted heterocyclic group having 5 to 18 ring atoms.

In an exemplary embodiment, the compound represented by the formula (41-3-3) is a compound represented by a formula (41-3-4) below.

[Formula 463]

(41-3-4)

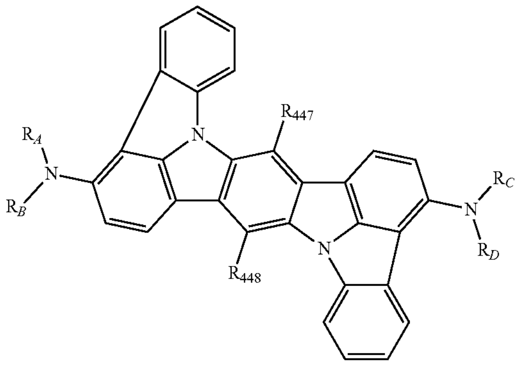

In the formula (41-3-4), $R_{447}$, $R_{448}$, $R_A$, $R_B$, $R_C$ and $R_D$ each independently represent the same as $R_{447}$, $R_{448}$, $R_A$, $R_B$, $R_C$ and $R_D$ in the formula (41-3-3).

In an exemplary embodiment, $R_A$, $R_B$, $R_C$, and $R_D$ are each independently a substituted or unsubstituted aryl group having 6 to 18 ring carbon atoms.

In an exemplary embodiment, $R_A$, $R_B$, $R_C$, and $R_D$ are each independently a substituted or unsubstituted phenyl group.

In an exemplary embodiment, $R_{447}$ and $R_{448}$ are each a hydrogen atom.

In an exemplary embodiment, the substituent for "the substituted or unsubstituted" group in each of the formulae is an unsubstituted alkyl group having 1 to 50 carbon atoms, an unsubstituted alkenyl group having 2 to 50 carbon atoms, an unsubstituted alkynyl group having 2 to 50 carbon atoms, an unsubstituted cycloalkyl group having 3 to 50 ring carbon atoms, —Si($R_{901a}$)($R_{902a}$)($R_{903a}$), —O—($R_{904a}$), —S—($R_{905a}$), —N($R_{906a}$)($R_{907a}$), a halogen atom, a cyano group, a nitro group, an unsubstituted aryl group having 6 to 50 ring carbon atoms, or an unsubstituted heterocyclic group having 5 to 50 ring atoms;

$R_{901a}$ to $R_{907a}$ are each independently a hydrogen atom, an unsubstituted alkyl group having 1 to 50 carbon atoms, an unsubstituted aryl group having 6 to 50 ring carbon atoms, or an unsubstituted heterocyclic group having 5 to 50 ring atoms;

when two or more $R_{901a}$ are present, the two or more $R_{901a}$ are mutually the same or different;

when two or more $R_{902a}$ are present, the two or more $R_{902a}$ are mutually the same or different;

when two or more $R_{903a}$ are present, the two or more $R_{903a}$ are mutually the same or different;

when two or more $R_{904a}$ are present, the two or more $R_{904a}$ are mutually the same or different;

when two or more $R_{905a}$ are present, the two or more $R_{905a}$ are mutually the same or different;

when two or more $R_{906a}$ are present, the two or more $R_{906a}$ are mutually the same or different; and when two or more $R_{907a}$ are present, the two or more $R_{907a}$ are mutually the same or different.

In an exemplary embodiment, the substituent for each of the "substituted or unsubstituted" groups in each of the formulae is an unsubstituted alkyl group having 1 to 50 carbon atoms, an unsubstituted aryl group having 6 to 50 ring carbon atoms, or an unsubstituted heterocyclic group having 5 to 50 ring atoms.

In an exemplary embodiment, the substituent for each of the "substituted or unsubstituted" groups in each of the formulae is an unsubstituted alkyl group having 1 to 18 carbon atoms, an unsubstituted aryl group having 6 to 18 ring carbon atoms, or an unsubstituted heterocyclic group having 5 to 18 ring atoms.

Interposed Layer

The organic EL device according to each exemplary embodiment may include an interposed layer that is an organic layer disposed between the first emitting layer and the second emitting layer.

In each of the exemplary embodiments, the interposed layer contains no emitting compound in order to prevent a Singlet emitting region and a TTF emitting region from overlapping each other or contains an emitting compound in such an amount that does not allow these regions to overlap each other.

For example, the content ratio of the emitting compound in the interposed layer is not necessarily 0 mass %. For example, when components accidentally mixed during the production process or components contained as impurities in the raw materials are emitting compounds, the interposed layer is allowed to contain these compounds.

For example, when the materials forming the interposed layer are a material A, a material B, and a material C, the content ratios of the materials A, B, and C in the interposed layer are each 10 mass % or more, and the total content ratio of the materials A, B, and C is 100 mass %.

In the following description, the interposed layer may be referred to as a "non-doped layer."

A layer containing an emitting compound is occasionally referred to as a "doped layer".

It is considered that luminous efficiency is improvable in an arrangement including layered emitting layers because the Singlet emitting region and the TTF emitting region are typically likely to be separated from each other.

In the organic EL device in each exemplary embodiment, when the interposed layer (non-doped layer) is disposed between the first emitting layer and the second emitting layer in the emitting region, the region in which the Singlet emitting region and the TTF emitting region overlap each other is reduced in size, and it can be expected that a reduction in the TTF efficiency due to collision between triplet excitons and carriers will be reduced.

Specifically, the insertion of the interposed layer (non-doped layer) between the emitting layers may contribute to an improvement in the TTF emission efficiency.

The interposed layer is a non-doped layer.

The interposed layer contains no metal atoms.

Therefore, the interposed layer contains no metal complexes.

The interposed layer contains an interposed layer material.

The interposed layer material is not an emitting compound.

No particular limitation is imposed on the interposed layer material, so long as it is a material other than emitting compounds.

Examples of the interposed layer material include: 1) heterocyclic compounds such as oxadiazole derivatives, benzimidazole derivatives, or phenanthroline derivatives; 2) fused aromatic compounds such as carbazole derivatives, anthracene derivatives, phenanthrene derivatives, pyrene derivatives, or chrysene derivatives; and 3) aromatic amine compounds such as triarylamine derivatives and fused polycyclic aromatic amine derivatives.

One or both of the first host material and the second host material may be used as the interposed layer material. However, no particular limitation is imposed on the interposed layer material so long as the Singlet emitting region and the TTF emitting region are separated from each other and the Singlet emission and the TTF emission are not inhibited.

In the organic EL device according to each exemplary embodiment, the content ratio of each of the materials forming the interposed layer with respect to the total mass of the interposed layer is 10 mass % or more.

The interposed layer contains the interposed layer material as one of the materials forming the interposed layer.

The interposed layer contains the interposed layer material in an amount of preferably 60 mass % or more based on the total mass of the interposed layer, more preferably 70 mass % or more based on the total mass of the interposed layer, still more preferably 80 mass % or more based on the total mass of the interposed layer, still further more preferably 90 mass % or more based on the total mass of the interposed layer, and yet still further more preferably 95 mass % or more based on the total mass of the interposed layer.

The interposed layer may contain only one interposed layer material or may contain two or more interposed layer materials.

When the interposed layer contains two or more interposed layer materials, the upper limit of the total content ratio of the two or more interposed layer materials is 100 mass %.

In each of the exemplary embodiments, it is not excluded that the interposed layer contains a material other than the interposed layer material.

The interposed layer may be formed as a single layer or may include two or more layered layers.

No particular limitation is imposed on the thickness of the interposed layer so long as the interposed layer can prevent the Singlet emitting region and the TTF emitting region from overlapping each other. The thickness per layer is preferably in a range from 3 nm to 15 nm and more preferably in a range from 5 nm to 10 nm.

When the thickness of the interposed layer is 3 nm or more, the Singlet emitting region and an emitting region derived from TTF can be easily separated from each other.

When the thickness of the interposed layer is 15 nm or less, the light emission phenomenon of the host material in the interposed layer can be easily suppressed.

It is preferable that the interposed layer contains at least one interposed layer material as a material forming the interposed layer and that the triplet energy of the first host material $T_1(H1)$, the triplet energy of the second host material $T_1(H2)$, and the triplet energy of at least one interposed layer material $T_1(M_{mid})$ satisfy the relationship of the following numerical formula (Numerical Formula 21).

$$T_1(H2) \geq T_1(M_{mid}) \geq T_1(H1) \quad \text{(Numerical Formula 21)}$$

When the interposed layer contains two or more interposed layer materials as materials forming the interposed layer, it is more preferable that the triplet energy of the first host material $T_1(H1)$, the triplet energy of the second host material $T_1(H2)$, and the triplet energy of each of the interposed layer materials $T_1(M_{EA})$ satisfy the relationship of the following numerical formula (Numerical Formula 21A).

$$T_1(H2) \geq T_1(M_{EA}) \geq T_1(H1) \quad \text{(Numerical Formula 21A)}$$

The organic EL device according to each exemplary embodiment may further include a diffusion layer.

When the organic EL device according to each exemplary embodiment includes the diffusion layer, it is preferable that the diffusion layer is disposed between the first emitting layer and the second emitting layer.

The structure of the organic EL device in each exemplary embodiment will be further described.

It should be noted that the reference numerals are occasionally omitted below.

Substrate

The substrate is used as a support for the organic EL device.

For instance, glass, quartz, plastics and the like are usable for the substrate.

A flexible substrate is also usable.

The flexible substrate is a bendable substrate, which is exemplified by a plastic substrate.

Examples of the material for the plastic substrate include polycarbonate, polyarylate, polyethersulfone, polypropylene, polyester, polyvinyl fluoride, polyvinyl chloride, polyimide, and polyethylene naphthalate.

Moreover, an inorganic vapor deposition film is also usable.

Anode

Metal, an alloy, an electrically conductive compound, a mixture thereof, or the like having a large work function (specifically, 4.0 eV or more) is preferably used as the anode formed on the substrate.

Specific examples of the material include indium tin oxide (ITO), indium oxide-tin oxide containing silicon or silicon oxide, indium oxide-zinc oxide, indium oxide containing tungsten oxide and zinc oxide, and graphene.

In addition, gold (Au), platinum (Pt), nickel (Ni), tungsten (W), chrome (Cr), molybdenum (Mo), iron (Fe), cobalt (Co), copper (Cu), palladium (Pd), titanium (Ti), and nitrides of a metal material (e.g., titanium nitride) are usable.

The material is typically formed into a film by a sputtering method.

For instance, the indium oxide-zinc oxide can be formed into a film by the sputtering method using a target in which zinc oxide in a range from 1 mass % to 10 mass % is added to indium oxide.

Moreover, for instance, the indium oxide containing tungsten oxide and zinc oxide can be formed by the sputtering method using a target in which tungsten oxide in a range from 0.5 mass % to 5 mass % and zinc oxide in a range from 0.1 mass % to 1 mass % are added to indium oxide.

In addition, the anode may be formed by a vacuum deposition method, a coating method, an inkjet method, a spin coating method or the like.

Among the EL layers formed on the anode, since the hole injecting layer adjacent to the anode is formed of a composite material into which holes are easily injectable irrespective of the work function of the anode, a material usable as an electrode material (e.g., metal, an alloy, an electroconductive compound, a mixture thereof, and the elements belonging to the group 1 or 2 of the periodic table) is also usable for the anode.

A material having a small work function such as elements belonging to Groups 1 and 2 in the periodic table of the elements, specifically, an alkali metal such as lithium (Li) and cesium (Cs), an alkaline earth metal such as magnesium (Mg), calcium (Ca) and strontium (Sr), alloys (e.g., MgAg and AlLi) including the alkali metal or the alkaline earth metal, a rare earth metal such as europium (Eu) and ytterbium (Yb), alloys including the rare earth metal are also usable for the anode.

It should be noted that the vacuum deposition method and the sputtering method are usable for forming the anode using the alkali metal, alkaline earth metal and the alloy thereof.

Further, when a silver paste is used for the anode, the coating method and the inkjet method are usable.

Cathode

It is preferable to use metal, an alloy, an electroconductive compound, a mixture thereof, or the like having a small work function (specifically, 3.8 eV or less) for the cathode.

Examples of the material for the cathode include elements belonging to Groups 1 and 2 in the periodic table of the elements, specifically, an alkali metal such as lithium (Li) and cesium (Cs), an alkaline earth metal such as magnesium (Mg), calcium (Ca) and strontium (Sr), alloys (e.g., MgAg and AlLi) including the alkali metal or the alkaline earth metal, a rare earth metal such as europium (Eu) and ytterbium (Yb), and alloys including the rare earth metal.

It should be noted that the vacuum deposition method and the sputtering method are usable for forming the cathode using the alkali metal, alkaline earth metal and the alloy thereof.

Further, when a silver paste is used for the cathode, the coating method and the inkjet method are usable.

By providing the electron injecting layer, various conductive materials such as Al, Ag, ITO, graphene, and indium oxide-tin oxide containing silicon or silicon oxide may be used for forming the cathode regardless of the work function.

The conductive materials can be formed into a film using the sputtering method, inkjet method, spin coating method and the like.

Hole Injecting Layer

The hole injecting layer is a layer containing a substance exhibiting a high hole injectability.

Examples of the substance exhibiting a high hole injectability include molybdenum oxide, titanium oxide, vanadium oxide, rhenium oxide, ruthenium oxide, chrome oxide, zirconium oxide, hafnium oxide, tantalum oxide, silver oxide, tungsten oxide, and manganese oxide.

In addition, the examples of the highly hole-injectable substance include: an aromatic amine compound, which is a low-molecule organic compound, such that 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl(abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazole-3-yl)-N-phenylamino]-9-phenylcarbazole (abbreviation: PCzPCA1), 3,6-bis[N-(9-phenylcarbazole-3-yl)-N-phenylamino]-9-phenylcarbazole (abbreviation: PCzPCA2), and 3-[N-(1-naphthyl)-N-(9-phenylcarbazole-3-yl)amino]-9-phenylcarbazole (abbreviation: PCzPCN1); and dipyrazino[2,3-f:20,30-h]quinoxaline-2,3,6,7,10,11-hexacarbonitrile (HAT-CN).

In addition, a high polymer compound (e.g., oligomer, dendrimer and polymer) is usable as the substance exhibiting a high hole injectability.

Examples of the high-molecule compound include poly (N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacrylamide](abbreviation: PTPDMA), and poly[N,N'-bis(4-butylphenyl)-N,N'-bis(phenyl)benzidine] (abbreviation: Poly-TPD).

Moreover, an acid-added high polymer compound such as poly(3,4-ethylenedioxythiophene)/poly(styrene sulfonic acid) (PEDOT/PSS) and polyaniline/poly(styrene sulfonic acid) (PAni/PSS) are also usable.

Hole Transporting Layer

The hole transporting layer is a layer containing a highly hole-transporting substance.

An aromatic amine compound, carbazole derivative, anthracene derivative and the like are usable for the hole transporting layer.

Specific examples of a material for the hole transporting layer include 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4-phenyl-4'-(9-phenylfluorene-9-yl)triphenylamine (abbreviation: BAFLP), 4,4'-bis[N-(9,9-dimethylfluorene-2-yl)-N-phenylamino]biphenyl (abbreviation: DFLDPBi), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluorene-2-yl)-N-phenylamino]biphenyl (abbreviation: BSPB).

The above-described substances mostly have a hole mobility of $10^{-6}$ $cm^2Ns$ or more.

For the hole transporting layer, a carbazole derivative such as CBP, 9-[4-(N-carbazolyl)]phenyl-10-phenylanthracene (CzPA), and 9-phenyl-3-[4-(10-phenyl-9-anthryl)phenyl]-9H-carbazole (PCzPA) and an anthracene derivative such as t-BuDNA, DNA, and DPAnth may be used.

A high polymer compound such as poly(N-vinylcarbazole) (abbreviation: PVK) and poly(4-vinyltriphenylamine) (abbreviation: PVTPA) is also usable.

However, in addition to the above substances, any substance exhibiting a higher hole transportability than an electron transportability may be used.

It should be noted that the layer containing the substance exhibiting a high hole transportability may be not only a single layer but also a laminate of two or more layers formed of the above substance(s).

Electron Transporting Layer

The electron transporting layer is a layer containing a highly electron-transporting substance.

For the electron transporting layer, 1) a metal complex such as an aluminum complex, beryllium complex, and zinc complex, 2) a hetero aromatic compound such as imidazole derivative, benzimidazole derivative, azine derivative, carbazole derivative, and phenanthroline derivative, and 3) a high polymer compound are usable.

Specifically, as a low-molecule organic compound, a metal complex such as Alq, tris(4-methyl-8-quinolinato) aluminum (abbreviation: $Almq_3$), bis(10-hydroxybenzo[h] quinolinato)beryllium (abbreviation: $BeBq_2$), BAlq, Znq, ZnPBO and ZnBTZ is usable.

In addition to the metal complex, a heteroaromatic compound such as 2-(4-biphenylyl)-5-(4-tert-butylphenyl)-1,3,4-oxadiazole (abbreviation: PBD), 1,3-bis[5-(ptert-butylphenyl)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), and 4,4'-bis(5-methylbenzoxazole-2-yl)stilbene (abbreviation: BzOs) is usable.

In the exemplary embodiment, a benzimidazole compound is preferably usable.

The above-described substances mostly have an electron mobility of $10^{-6}$ $cm^2/(V \cdot s)$ or more.

It should be noted that any substance other than the above substance may be used for the electron transporting layer as long as the substance exhibits a higher electron transportability than the hole transportability.

The electron transporting layer may be provided in the form of a single layer or a laminate of two or more layers of the above substance(s).

Further, a high polymer compound is usable for the electron transporting layer.

For instance, poly[(9,9-dihexylfluorene-2,7-diyl)-co-(pyridine-3,5-diyl)](abbreviation: PF-Py), poly[(9,9-dioctylfluorene-2,7-diyl)-co-(2,2'-bipyridine-6,6'-diyl)] (abbreviation: PF-BPy) and the like are usable.

Electron Injecting Layer

The electron injecting layer is a layer containing a highly electron-injectable substance.

Examples of a material for the electron injecting layer include an alkali metal, alkaline earth metal and a compound thereof, examples of which include lithium (Li), cesium (Cs), calcium (Ca), lithium fluoride (LiF), cesium fluoride (CsF), calcium fluoride ($CaF_2$), and lithium oxide (LiOx).

In addition, the alkali metal, alkaline earth metal or the compound thereof may be added to the substance exhibiting the electron transportability in use. Specifically, for instance, magnesium (Mg) added to Alq may be used.

In this case, the electrons can be more efficiently injected from the cathode.

Alternatively, the electron injecting layer may be provided by a composite material in a form of a mixture of the organic compound and the electron donor.

Such a composite material exhibits excellent electron injectability and electron transportability since electrons are generated in the organic compound by the electron donor.

In this case, the organic compound is preferably a material excellent in transporting the generated electrons. Specifically, the above examples (e.g., the metal complex and the hetero aromatic compound) of the substance forming the electron transporting layer are usable.

As the electron donor, any substance exhibiting electron donating property to the organic compound is usable.

Specifically, the electron donor is preferably alkali metal, alkaline earth metal and rare earth metal such as lithium, cesium, magnesium, calcium, erbium and ytterbium.

The electron donor is also preferably alkali metal oxide and alkaline earth metal oxide such as lithium oxide, calcium oxide, and barium oxide.

Moreover, a Lewis base such as magnesium oxide is usable.

Further, the organic compound such as tetrathiafulvalene (abbreviation: TTF) is usable.

Layer Formation Method

A method for forming each of the layers of the organic EL device in each exemplary embodiment is not particularly limited except for those described above, and a known method can be used. Examples of the usable method include: dry deposition methods such as a vacuum deposition method, a sputtering method, a plasma method, and an ion plating method; and wet deposition methods such as a spin coating method, a dipping method, a flow coating method, and an inkjet method.

Film Thickness

No limitation is imposed on the thickness of each of the layers in the organic EL device in each exemplary embodiment, except for the specific limitations described above.

In general, the thickness preferably ranges from several nanometers to 1 μm because an excessively small film thickness is likely to cause defects (e.g. pin holes) and an excessively large thickness leads to the necessity of applying high voltage and consequent reduction in efficiency.

Emission Wavelength of Organic EL Device

It is preferable that the organic electroluminescence device according to each exemplary embodiment emits light with a maximum peak wavelength of 500 nm or less when the device is driven.

It is more preferable that the organic electroluminescence device according to each exemplary embodiment emits light with a maximum peak wavelength in a range from 430 nm to 480 nm when the device is driven.

The maximum peak wavelength of the light emitted from the organic EL device when the device is driven is measured as follows.

Voltage is applied on the organic EL device such that a current density becomes 10 $mA/cm^2$, where spectral radiance spectrum is measured by a spectroradiometer CS-2000 (produced by Konica Minolta, Inc.).

In the obtained spectral radiance spectrum, the wavelength of the emission spectrum peak at which the luminous intensity is maximum is measured and used as the maximum peak wavelength (unit: nm).

Triplet Energy $T_1$

To measure the triplet energy $T_1$, the following method may be used.

A compound used for the measurement is dissolved in EPA (diethyl ether:isopentane:ethanol=5:5:2 (volume ratio)) at a concentration in a range from $10^{-5}$ mol/L to $10^{-4}$ mol/L to produce a solution. This solution is placed in a quartz cell to prepare a measurement sample.

A phosphorescent spectrum (the vertical axis: phosphorescent luminous intensity, the horizontal axis: wavelength) of the measurement sample is measured at a low temperature (77K).

A tangent to the rise of the phosphorescent spectrum on the short-wavelength side is drawn, and the amount of energy is calculated according to a conversion formula (F1) below based on the wavelength value λedge [nm] at the intersection of the tangent and the horizontal axis and used as the triplet energy $T_1$.

$$T_1\ [eV]=12390.85/\lambda_{edge} \quad \text{Conversion Equation (F1):}$$

The tangent to the rise of the phosphorescence spectrum close to the short-wavelength region is drawn as follows.

While moving on a curve of the phosphorescence spectrum from the short-wavelength region to the local maximum value closest to the short-wavelength region among the local maximum values of the phosphorescence spectrum, a tangent is checked at each point on the curve toward the long-wavelength of the phosphorescence spectrum.

An inclination of the tangent is increased along the rise of the curve (i.e., a value of the ordinate axis is increased).

A tangent drawn at a point of the local maximum inclination (i.e., a tangent at an inflection point) is defined as the tangent to the rise of the phosphorescence spectrum close to the short-wavelength region.

A local maximum point where a peak intensity is 15% or less of the maximum peak intensity of the spectrum is not counted as the above-mentioned local maximum peak intensity closest to the short-wavelength region. The tangent drawn at a point that is closest to the local maximum peak intensity closest to the short-wavelength region and where the inclination of the curve is the local maximum is defined as a tangent to the rise of the phosphorescence spectrum close to the short-wavelength region.

For phosphorescence measurement, a spectrophotofluorometer body F-4500 (produced by Hitachi High-Technologies Corporation) is usable.

Any device for phosphorescence measurement is usable. A combination of a cooling unit, a low temperature container, an excitation light source and a light-receiving unit may be used for phosphorescence measurement.

Singlet Energy $S_1$

To measure the singlet energy $S_1$ using a solution, the following method (which may be referred to as a solution method) may be used.

A toluene solution of a measurement target compound at a concentration ranging from $10^{-5}$ mol/L to $10^{-4}$ mol/L is prepared and put in a quartz cell. An absorption spectrum (ordinate axis: absorption intensity, abscissa axis: wavelength) of the thus-obtained sample is measured at a normal temperature (300K).

A tangent is drawn to the fall of the absorption spectrum close to the long-wavelength region, and a wavelength value $\lambda_{edge}$ (nm) at an intersection of the tangent and the abscissa axis is assigned to a conversion equation (F2) below to calculate singlet energy.

$$S_1\ [\text{eV}]=12390.85/\lambda_{edge} \qquad \text{Conversion Equation (F2):}$$

Any device for measuring absorption spectrum is usable. For instance, a spectrophotometer (U3310 produced by Hitachi, Ltd.) is usable.

The tangent to the fall of the absorption spectrum close to the long-wavelength region is drawn as follows.

While moving on a curve of the absorption spectrum from the local maximum value closest to the long-wavelength region, among the local maximum values of the absorption spectrum, in a long-wavelength direction, a tangent at each point on the curve is checked.

An inclination of the tangent is decreased and increased in a repeated manner as the curve falls (i.e., a value of the ordinate axis is decreased).

A tangent drawn at a point where the inclination of the curve is the local minimum closest to the long-wavelength region (except when absorbance is 0.1 or less) is defined as the tangent to the fall of the absorption spectrum close to the long-wavelength region.

The local maximum absorbance of 0.2 or less is not counted as the above-mentioned local maximum absorbance closest to the long-wavelength region.

Maximum Peak Wavelength of Compound

A method for measuring the maximum peak wavelength of a compound is as follows.

A 5 μmol/L toluene solution of the compound used as the measurement target is prepared and placed in a quartz cell, and the emission spectrum (the vertical axis: luminous intensity, the horizontal axis; wavelength) of the sample is measured at room temperature (300K).

The emission spectrum can be measured using a spectrophotometer (machine name: F-7000) produced by Hitachi High-Tech Science Corporation.

It should be noted that the machine for measuring the emission spectrum is not limited to the machine used herein.

In the emission spectrum, the emission spectrum peak wavelength at which the luminous intensity is maximum is used as the maximum peak wavelength.

Herein, the maximum peak wavelength of the fluorescent emission may be referred to as a maximum fluorescence peak wavelength (FL-peak).

The full width at half maximum FWHM (unit: nm) of the maximum peak of the compound can be measured from the measured emission spectrum.

Stokes Shift

The Stokes shift can be measured using a method described below.

A compound used for the measurement is dissolved in toluene at a concentration of $2.0\times10^{-5}$ mol/L to prepare a measurement sample.

The measurement sample placed in a quartz cell is irradiated with continuous light in the ultraviolet-visible range at room temperature (300K) to measure an absorption spectrum (the vertical axis: absorbance, the horizontal axis: wavelength).

To measure the absorption spectrum, a spectrophotometer may be used, and, for example, a spectrophotometer U-3900/3900H produced by Hitachi High-Tech Science Corporation may be used.

Moreover, the compound used for the measurement is dissolved in toluene at a concentration of $4.9\times10^{-6}$ mol/L to prepare a measurement sample.

The measurement sample was put into a quartz cell and was irradiated with excited light at a room temperature (300K) to measure fluorescence spectrum (ordinate axis: fluorescence intensity, abscissa axis: wavelength).

To measure the fluorescence spectrum, a spectrophotometer may be used, and, for example, a spectrophotofluorometer F-7000 produced by Hitachi High-Tech Science Corporation may be used.

The absorption spectrum and the fluorescence spectrum are used to compute the difference between the maximum absorption wavelength and the maximum fluorescence wavelength, and then the Stokes shift (SS) is determined.

The unit of the Stokes shift SS is nm.

Maximum Peak Wavelength $A_{EML}$ of Light Emitted from Emitting Layer when Device is Driven The maximum peak wavelength of light emitted from an emitting layer when the device is driven can be measured using the following method.

The maximum peak wavelength $A_{EML1}$ of the light emitted from the first emitting layer when the device is driven is measured as follows. An organic EL device in which the second emitting layer is formed using the same material as the material of the first emitting layer is produced, and the spectral radiance spectrum when a voltage is applied to the device such that the current density in the organic EL device is 10 mA/cm$^2$ is measured using a spectroradiometer CS-2000 (produced by KONICA MINOLTA, INC.).

The maximum peak wavelength $A_{EML1}$ (unit: nm) is calculated from the obtained spectral radiance spectrum.

The maximum peak wavelength $A_{EML2}$ of the light emitted from the second emitting layer when the device is driven is measured as follows. An organic EL device in which the first emitting layer is formed using the same material as the material of the second emitting layer is produced, and the spectral radiance spectrum when a voltage is applied to the device such that the current density in the organic EL device is 10 mA/cm$^2$ is measured using a spectroradiometer CS-2000 (produced by KONICA MINOLTA, INC.).

The maximum peak wavelength $A_{EML2}$ (unit: nm) is calculated from the obtained spectral radiance spectrum.

Fourth Exemplary Embodiment

Electronic Device

An electronic device according to a fourth exemplary embodiment is installed with any one of the organic EL devices according to the above exemplary embodiments.

Examples of the electronic device include a display device and a light-emitting unit.

Examples of the display device include a display component (e.g., an organic EL panel module), TV, mobile phone, tablet and personal computer.

Examples of the light-emitting unit include an illuminator and a vehicle light.

Modification of Embodiment(s)

The scope of the invention is not limited to the above-described exemplary embodiments but includes any modification and improvement as long as such modification and improvement are compatible with the invention.

For example, the number of emitting layers is not limited to 2, and a plurality of emitting layers more than two emitting layers may be layered.

When the organic EL device includes a plurality of emitting layers, i.e., more than two emitting layers, it is only necessary that at least two emitting layers satisfy the conditions described in the above exemplary embodiments.

For instance, the rest of the emitting layers may be a fluorescent emitting layer or a phosphorescent emitting layer with use of emission caused by electron transfer from the triplet excited state directly to the ground state.

When the organic EL device includes a plurality of emitting layers, these emitting layers may be mutually adjacently provided, or may form a so-called tandem organic EL device, in which a plurality of emitting units are layered via an intermediate layer.

For instance, a blocking layer may be provided adjacent to at least one of a side of the emitting layer close to the anode or a side of the emitting layer close to the cathode.

The blocking layer is preferably provided in contact with the emitting layer to block at least one of holes, electrons, or excitons.

For instance, when the blocking layer is provided in contact with the side of the emitting layer close to the cathode, the blocking layer permits transport of electrons, and blocks holes from reaching a layer provided closer to the cathode (e.g., the electron transporting layer) beyond the blocking layer.

When the organic EL device includes the electron transporting layer, the blocking layer is preferably interposed between the emitting layer and the electron transporting layer.

When the blocking layer is provided in contact with the side of the emitting layer close to the anode, the blocking layer permits transport of holes and blocks electrons from reaching a layer provided closer to the anode (e.g., the hole transporting layer) beyond the blocking layer.

When the organic EL device includes the hole transporting layer, the blocking layer is preferably interposed between the emitting layer and the hole transporting layer.

Alternatively, the blocking layer may be provided adjacent to the emitting layer so that the excitation energy does not leak out from the emitting layer toward neighboring layer(s).

The blocking layer blocks excitons generated in the emitting layer from being transferred to a layer(s) (e.g., the electron transporting layer and the hole transporting layer) closer to the electrode(s) beyond the blocking layer.

The emitting layer is preferably bonded with the blocking layer.

Specific structure, shape and the like of the components in the invention may be designed in any manner as long as an object of the invention can be achieved.

EXAMPLES

The present invention will be described in more detail by way of Examples.

The invention is not at all limited to these Examples.

Compounds (1)

The structure of a compound used to produce an organic EL device according to Example 1 is shown below.

[Formula 464]

BD1

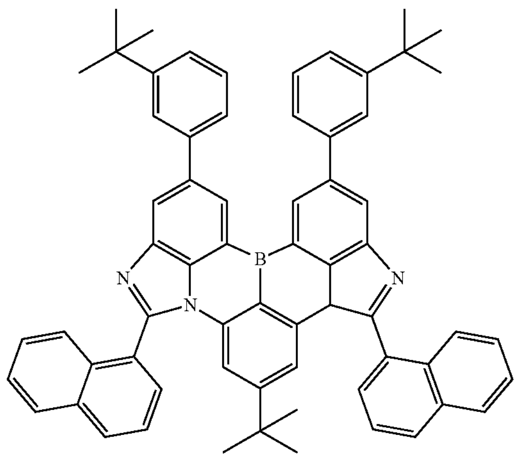

The structure of a compound used to produce an organic EL device according to Comparative Example 1 is shown below.

[Formula 465]

Ref-BD

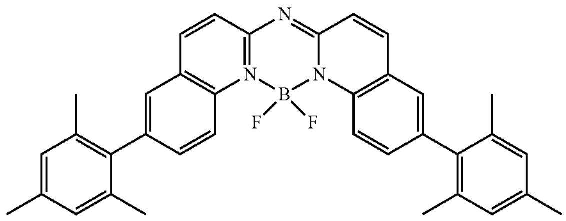

The structures of other compounds used to produce the organic EL devices according to Example 1 and Comparative Example 1 are shown below.

[Formula 466]

HT1

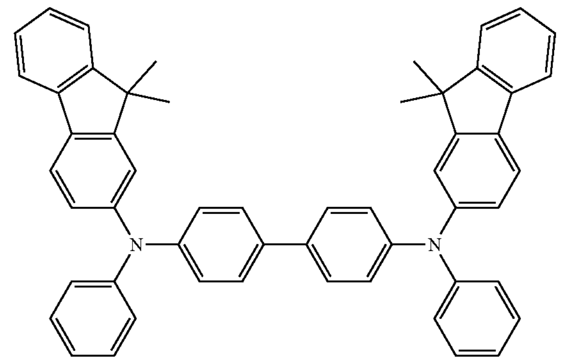

HT2

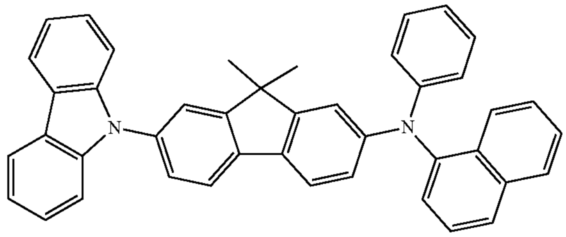

BH1

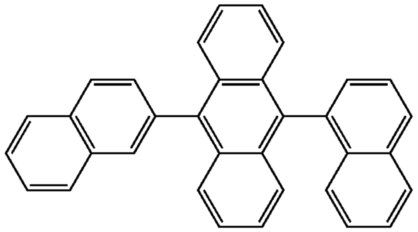

BH2

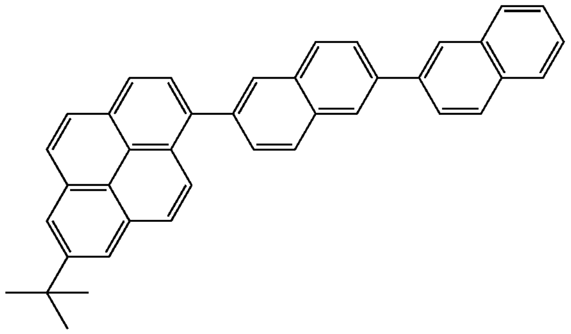

-continued

HBL

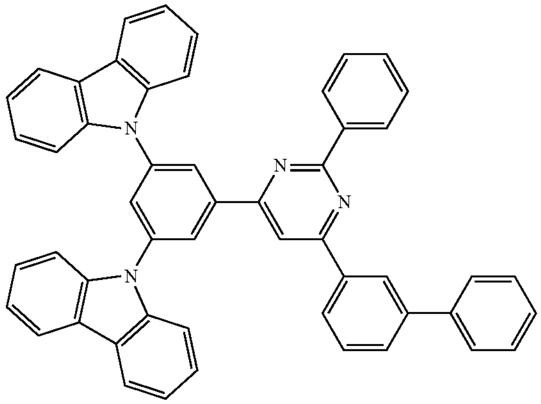

ET1

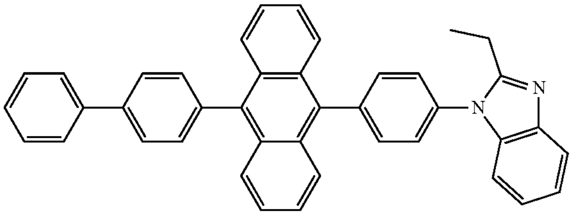

Production (1) of Organic EL Devices

Example 1

A glass substrate (size: 25 mm×75 mm×1.1 mm thick, produced by Geomatec Co., Ltd.) having an ITO transparent electrode (anode) was ultrasonic-cleaned in isopropyl alcohol for five minutes, and then UV-ozone-cleaned for 30 minutes.

The film thickness of the ITO transparent electrode was 130 nm.

The cleaned glass substrate with the transparent electrode line attached thereto was placed in a substrate holder of a vacuum vapor deposition apparatus, and a compound HT1 was co-deposited on the surface with the transparent electrode line formed thereon such that the transparent electrode was covered with the deposited compound to thereby form a hole injecting layer having a film thickness of 65 nm.

A compound HT2 was vapor-deposited on the hole injecting layer to thereby form a hole transporting layer having a film thickness of 45 nm.

A compound BH1 (first host material (BH)) and a compound BD1 (first emitting compound (BD)) were co-deposited on the hole transporting layer such that the ratio of the compound BD1 was 1 mass % to thereby form a first emitting layer having a film thickness of 20 nm.

A compound BH2 (second host material (BH)) and the compound BD1 (second emitting compound (BD)) were co-deposited on the first emitting layer such that the ratio of the compound BD1 was 1 mass % to thereby form a second emitting layer having a film thickness of 5 nm.

A compound HBL was vapor-deposited on the second emitting layer to thereby form a hole blocking layer (HBL) having a film thickness of 5 nm.

A compound $ET_1$ was vapor-deposited on the hole blocking layer to thereby form an electron transporting layer (ET) having a film thickness of 20 nm.

Lithium fluoride (LiF) was vapor-deposited on the electron transporting layer to thereby form an electron injecting layer having a film thickness of 0.5 nm.

Metal A1 was vapor-deposited on the electron injecting layer to form a cathode having a film thickness of 150 nm.

The schematic device structure in Example 1 is as follows.

ITO (130)/HT1 (65)/HT2 (45)/BH1:BD1 (20, 99%:1%)/BH2:BD1 (5, 99%:1%)/HBL (5)/ET1 (20)/LiF (0.5)/A1 (150)

Numerals in parentheses represent a film thickness (unit: nm).

Similarly, numerals (99%:1%) expressed in percentages in parentheses indicate the ratios (mass %) of the host material (the compound BH1 or BH2) and the emitting compound (the compound BD1) in the first emitting layer or the second emitting layer.

Comparative 1

An organic EL device in Comparative Example 1 was produced in the same manner as that for the organic EL device in Example 1 except that the compound BD1 for the first emitting layer and the second emitting layer was changed to a compound Ref-BD as shown in Table 1.

Evaluation (1) of Organic EL Device

The organic EL devices produced were evaluated as follows.

Table 1 shows the evaluation results.

Lifetime LT80

A voltage was applied to one of the produced organic EL devices such that the current density was adjusted to 50 mA/cm$^2$, and the time (LT80 (unit: hour)) until the luminance was reduced to 80% of the initial luminance was measured as the lifetime.

The luminance was measured using a spectroradiometer CS-2000 (produced by KONICA MINOLTA, INC.).

[Formula 467]

BH1-a

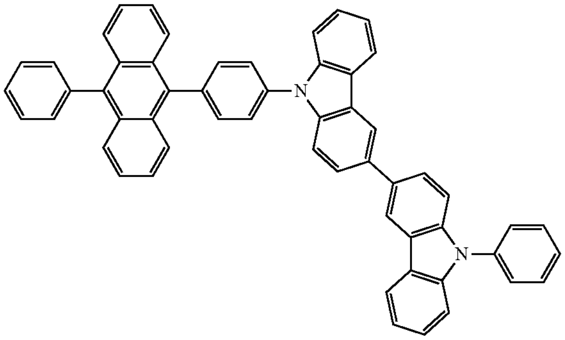

BH1-f

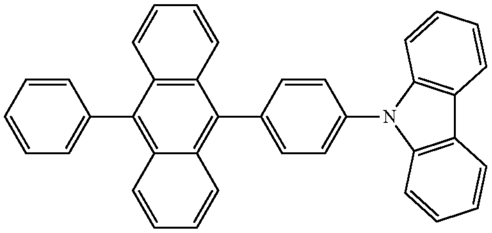

The structures of compounds used to produce organic EL devices according to Comparative Examples 2-1 to 2-3 are shown below.

TABLE 1

| | First emitting layer | | | | | Second emitting layer | | | | | |
|---|---|---|---|---|---|---|---|---|---|---|---|
| | First host material | | | First emitting compound | | Second host material | | | Second emitting compound | | Evaluation |
| | Name | $T_1$ [eV] | \|HOMO\| [eV] | Name | \|HOMO\| [eV] | Name | $T_1$ [eV] | \|LUMO\| [eV] | Name | \|LUMO\| [eV] | LT80 [hr] |
| Example 1 | BH1 | 1.90 | 5.98 | BD1 | 5.90 | BH2 | 2.00 | 2.70 | BD1 | 3.10 | 100 |
| Comparative Example 1 | BH1 | 1.90 | 5.98 | Ref-BD | 6.20 | BH2 | 2.00 | 2.70 | Ref-BD | 3.45 | 50 |

As shown in Table 1, in the organic EL device according to Example 1 in which the compound satisfying the relationships of the above numerical formulae (Numerical Formula 1) and (Numerical Formula 2) was contained in the first emitting layer and the second emitting layer, the lifetime was longer than that of the organic EL device according to Comparative Example 1 in which the relationship of the above numerical formula (Numerical Formula 2) is not satisfied.

Compounds (2)

The structures of compounds used to produce organic EL devices according to Examples 2-1 to 2-4 are shown below.

[Formula 468]

BH1-b

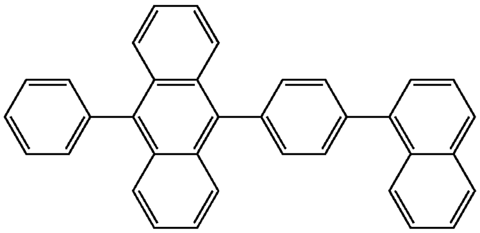

-continued
BH1-d
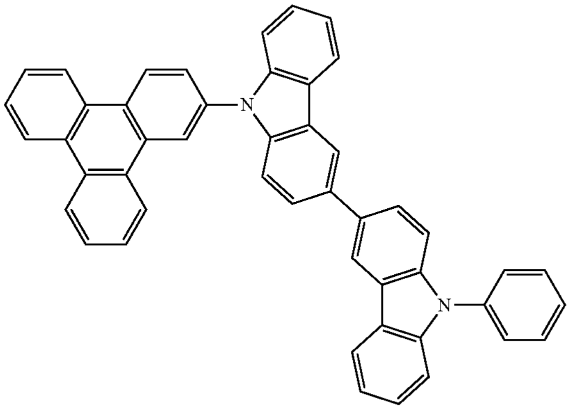
BH1-e
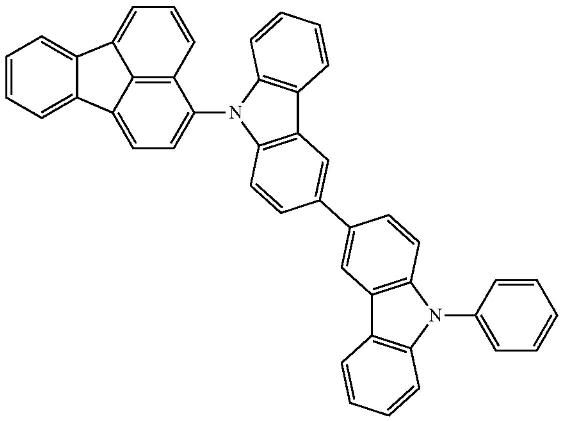
The structures of other compounds used to produce organic EL devices according to Examples 2-1 to 2-4 and Comparative Examples 2-1 to 2-3 are shown below.
[Formula 469]
BH2-a
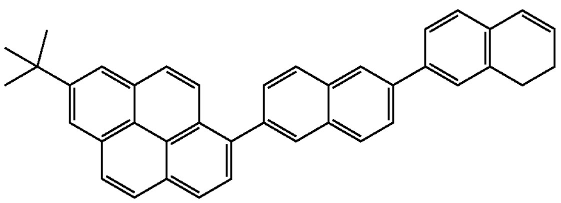
BH2-b
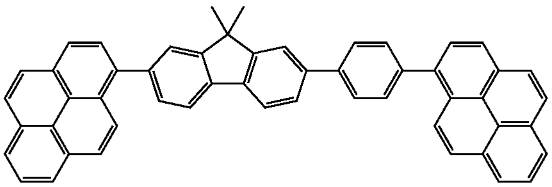
-continued
[Formula 470]
BD1
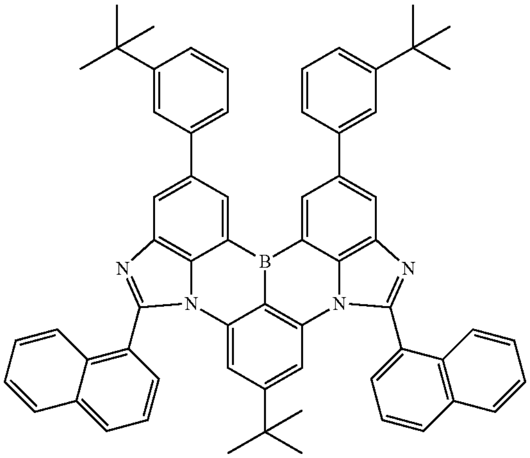
[Formula 471]
HA
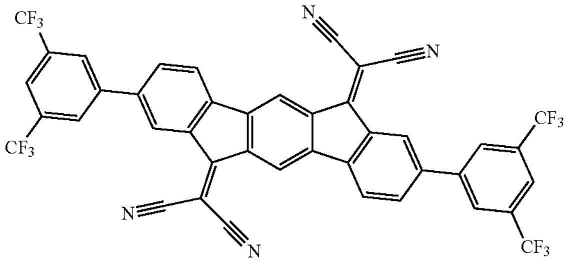
HT-a
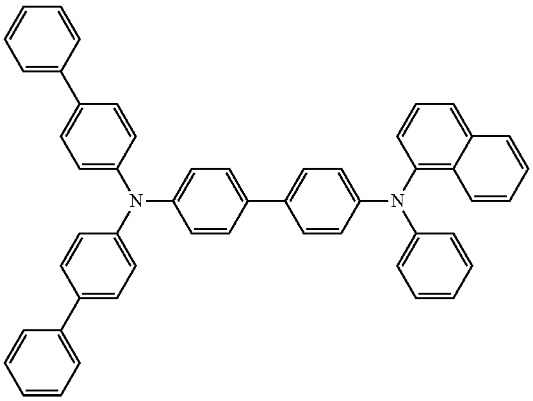
HT-b
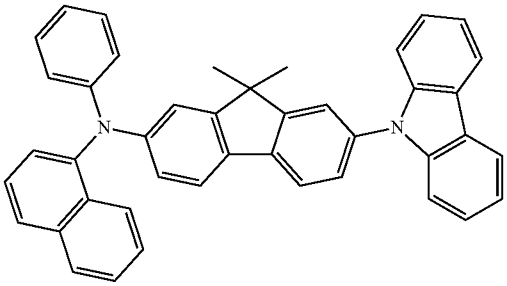

-continued

HB-a

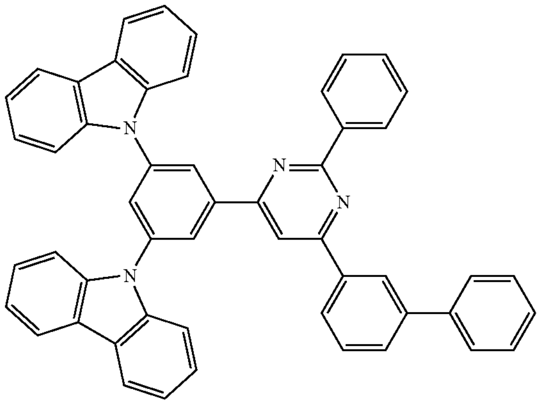

ET-a

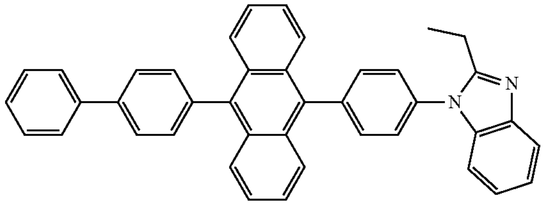

Production (2) of Organic EL Devices Example 2-1

A glass substrate (size: 25 mm×75 mm×1.1 mm thick, produced by Geomatec Co., Ltd.) having an ITO transparent electrode (anode) was ultrasonic-cleaned in isopropyl alcohol for five minutes, and then UV-ozone-cleaned for 30 minutes.

The film thickness of the ITO transparent electrode was 130 nm.

The cleaned glass substrate with the transparent electrode line attached thereto was placed in a substrate holder of a vacuum vapor deposition apparatus, and a compound HA was vapor-deposited on the surface with the transparent electrode line formed thereon such that the transparent electrode was covered with the deposited compound to thereby form a hole injecting layer having a film thickness of 5 nm.

A compound HT-a was vapor-deposited on the hole injecting layer to thereby form a hole transporting layer having a film thickness of 120 nm.

A compound HT-b was vapor-deposited on the hole transporting layer to thereby form an electron blocking layer (EBL) having a film thickness of 5 nm.

A compound BH1-a (first host material (BH)) and the compound BD1 (first emitting compound (BD)) were co-deposited on the electron blocking layer such that the ratio of the compound BD1 was 1 mass % to thereby form a first emitting layer having a film thickness of 12.5 nm.

A compound BH2-a (second host material (BH)) and the compound BD1 (second emitting compound (BD)) were co-deposited on the first emitting layer such that the ratio of the compound BD1 was 1 mass % to thereby form a second emitting layer having a film thickness of 12.5 nm.

A compound HB-a was vapor-deposited on the second emitting layer to thereby form a hole blocking layer (HBL) having a film thickness of 5 nm.

A compound ET-a was vapor-deposited on the hole blocking layer to thereby form an electron transporting layer (ET) having a film thickness of 20 nm.

Lithium fluoride (LiF) was vapor-deposited on the electron transporting layer to thereby form an electron injecting layer having a film thickness of 1 nm.

Metal A1 was vapor-deposited on the electron injecting layer to thereby form a cathode having a film thickness of 80 nm.

The schematic device structure in Example 2-1 is as follows.

ITO (130)/HA (5)/HT-a (120)/HT-b (5)/BH1-a:BD1 (12.5, 99%:1%)/BH2-a:BD1 (12.5, 99%:1%)/HB-a (5)/ET-a (20)/LiF (1)/A1 (80)

Numerals in parentheses represent a film thickness (unit: nm).

Similarly, numerals (99%:1%) expressed in percentages in parentheses indicate the ratios (mass %) of the host material (the compound BH1-a or BH2-a) and the emitting compound (the compound BD1) in the first emitting layer or the second emitting layer.

Example 2-2

An organic EL device in Example 2-2 was produced in the same manner as in Example 2-1 except that the BH2-a (second host material) used for the second emitting layer in Example 2-1 was replaced by a compound shown in Table 2.

Example 2-3

An organic EL device in Example 2-3 was produced in the same manner as in Example 2-1 except that the compound BH1-a (first host material) used for the first emitting layer in Example 2-1 was replaced by a compound shown in Table 2.

Example 2-4

An organic EL device in Example 2-4 was produced in the same manner as in Example 2-1 except that the compound HT-b used for the electron blocking layer in Example 2-1 was replaced by a compound shown in Table 2.

Comparative Examples 2-1 to 2-3

Organic EL devices in Comparative Examples 2-1 to 2-3 were each produced in the same manner as in Example 2-1 except that the compound BH1-a (first host material) used for the first emitting layer in Example 2-1 was replaced by a compound shown in Table 2.

Evaluation (2) of Organic EL Devices

Each of the organic EL devices produced in Examples 2-1 to 2-4 and Comparative Examples 2-1 to 2-3 was evaluated as follows. Table 2 shows the evaluation results.

External Quantum Efficiency EQE

Voltage was applied to the organic EL device such that a current density was 10 mA/cm$^2$, where spectral radiance spectrum was measured by a spectroradiometer CS-2000 (produced by Konica Minolta, Inc.).

The external quantum efficiency EQE (unit: %) was calculated based on the obtained spectral radiance spectra, assuming that the spectra was provided under a Lambertian radiation.

The measured value of the EQE in an Example and the following numerical formula (Numerical Formula 1X) were used to compute "EQE (relative value)" (unit: %).

EQE (relative value)=(EQE in the Example/EQE in Example 2-1)×100 (Numerical Formula 1X)

Lifetime LT95

A voltage was applied to one of the produced organic EL devices such that the current density was adjusted to 50 mA/cm$^2$, and the time (LT95 (unit: hour)) until the luminance was reduced to 95% of the initial luminance was measured.

The luminance was measured using a spectroradiometer CS-2000 (produced by KONICA MINOLTA, INC.).

The measured value of the LT95 in an Example and the following numerical formula (Numerical Formula 2X) were used to compute "LT95 (relative value)" (unit: %).

LT95(relative value)=(LT95 in the Example/LT95 in Example 2-1)×100 (Numerical Formula 2X)

TABLE 2

| | Electron blocking layer | First emitting layer: First host material | | First emitting layer: First emitting compound | | Second emitting layer: Second host material | | Second emitting layer: Second emitting | Hole blocking layer | Device evaluation | |
|---|---|---|---|---|---|---|---|---|---|---|---|
| | Compound Name | Name | $T_1$ [eV] | Name | $T_1$ [eV] | Name | $T_1$ [eV] | compound Name | Compound Name | EQE (relative value) [%] | LT95 (relative value) [%] |
| Example 2-1 | HT-b | BH1-a | 1.80 | BD1 | 2.58 | BH2-a | 2.00 | BD1 | HB-a | 100 | 100 |
| Example 2-2 | HT-b | BH1-a | 1.80 | BD1 | 2.58 | BH2-b | 2.09 | BD1 | HB-a | 105 | 110 |
| Example 2-3 | HT-b | BH1-f | 1.80 | BD1 | 2.58 | BH2-a | 2.00 | BD1 | HB-a | 105 | 100 |
| Example 2-4 | HT-a | BH1-a | 1.80 | BD1 | 2.58 | BH2-a | 2.00 | BD1 | HB-a | 100 | 100 |
| Comparative Example 2-1 | HT-b | BH1-b | 1.85 | BD1 | 2.58 | BH2-a | 2.00 | BD1 | HB-a | 85 | 80 |
| Comparative Example 2-2 | HT-b | BH1-d | 2.86 | BD1 | 2.58 | BH2-a | 2.00 | BD1 | HB-a | 75 | 90 |
| Comparative Example 2-3 | HT-b | BH1-e | 2.26 | BD1 | 2.58 | BH2-a | 2.00 | BD1 | HB-a | 80 | 85 |

In the organic EL devices in Examples 2-1 to 2-4, the luminous efficiency was high, and the lifetime was long.

Compounds (3)

The structures of compounds used to produce organic EL devices according to Example 3-1 and Comparative Example 3-1 are shown below.

[Formula 472]

HA1

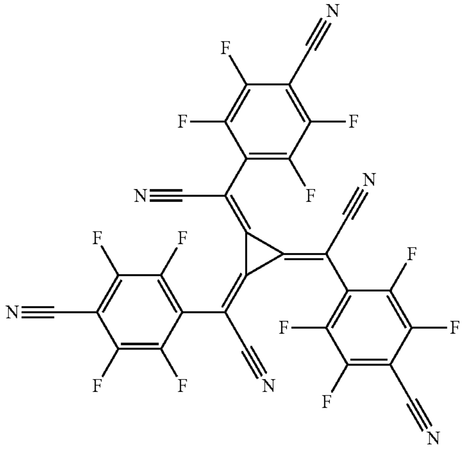

HT3

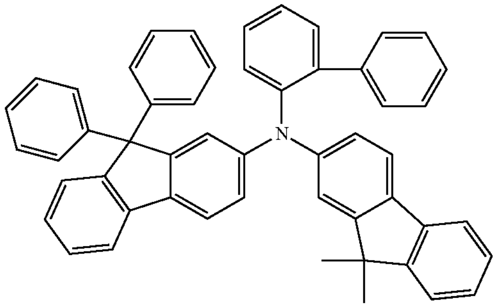

-continued

HT4

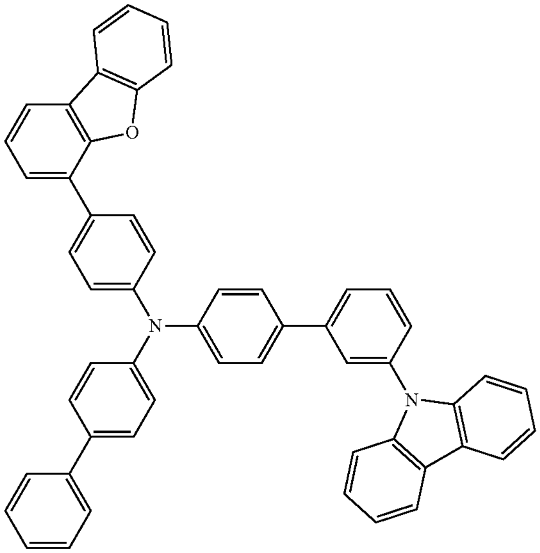

[Formula 473]

BH2-1

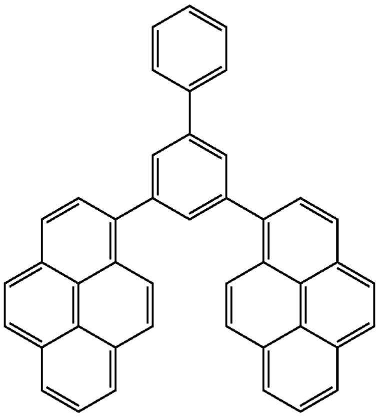

-continued

BH1-1

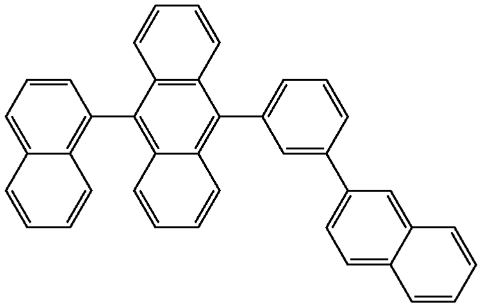

[Formula 474]

BD2

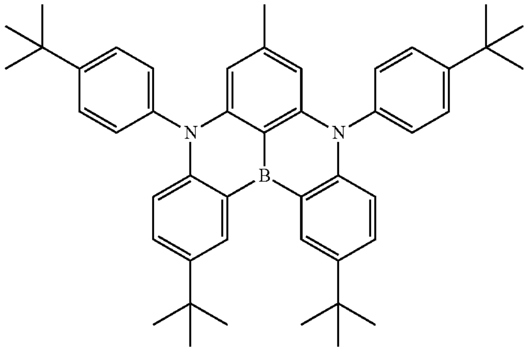

ET1-1

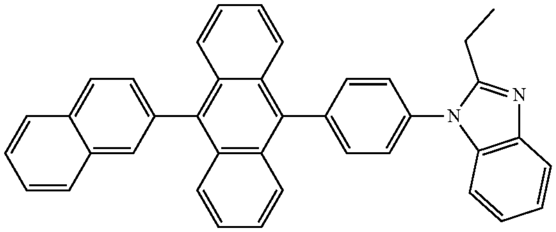

ET2-1

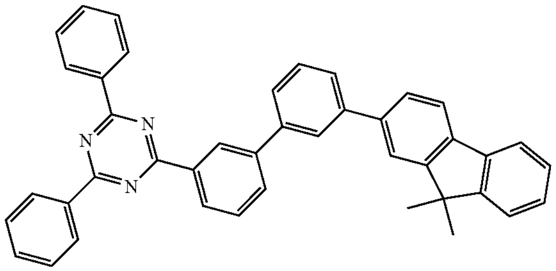

Liq

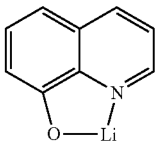

Production (3) of Organic EL Devices

The organic EL devices were produced and evaluated as follows.

Example 3-1

A glass substrate (size: 25 mm×75 mm×1.1 mm thick, produced by Geomatec Co., Ltd.) having an ITO transparent electrode (anode) was ultrasonic-cleaned in isopropyl alcohol for five minutes, and then UV-ozone-cleaned for 30 minutes.

The film thickness of the ITO transparent electrode was 130 nm.

The cleaned glass substrate with the transparent electrode line attached thereto was placed in a substrate holder of a vacuum vapor deposition apparatus, and a compound HT3 and a compound HA1 were co-deposited on the surface with the transparent electrode line formed thereon such that the transparent electrode was covered with the deposited compounds to thereby form a hole injecting layer having a film thickness of 10 nm.

The ratios of the compound HT3 and the compound HA1 in the hole injecting layer were 97 mass % and 3 mass %, respectively.

After the deposition of the hole injecting layer, the compound HT3 was vapor-deposited to form a first hole transporting layer having a film thickness of 80 nm.

After the deposition of the first hole transporting layer, a compound HT4 was vapor-deposited to form a second hole transporting layer (which may be referred to as an electron blocking layer (EBL) having a film thickness of 5 nm.

A compound BH2-1 (second host material (BH)) and the compound BD2 (second emitting compound (BD)) were co-deposited on the second hole transporting layer such that the ratio of the compound BD2 was adjusted to 1 mass % to thereby form a second emitting layer having a film thickness of 5 nm.

A compound BH1-1 (first host material (BH)) and the compound BD2 (first emitting compound(BD)) were co-deposited on the second emitting layer such that the ratio of the compound BD2 was adjusted to 1 mass % to thereby form a first emitting layer having a film thickness of 15 nm.

A compound ET1-1 (first electron transporting-zone material) and a compound ET2-1 (second electron transporting-zone material) were co-deposited on the first emitting layer to thereby form an electron transporting layer (ET) having a film thickness of 30 nm.

The ratio of the compound ET1-1 in the electron transporting layer was adjusted to 50 mass %, and the ratio of the compound ET2-1 was adjusted to 50 mass %.

A compound Liq was vapor-deposited onto the electron transporting layer to thereby form an electron injecting layer having a film thickness of 1 nm.

Metal Al was vapor-deposited on the electron injecting layer to form a cathode having a film thickness of 60 nm.

The schematic device structure in Example 3-1 is as follows.

ITO (130)/HT3:HA1 (10, 97%:3%)/HT3 (80)/HT4 (5)/BH2-1:BD2 (5, 99%:1%)/BH1-1:BD2 (15, 99%:1%)/ET1-1:ET2-1 (30, 50%:50%)/Liq (1)/Al (60)

Numerals in parentheses represent a film thickness (unit: nm).

Similarly, numerals (97%:3%) expressed in percentages in parentheses indicate the ratios (mass %) of the compound HT3 and the compound HA1 in the hole injecting layer. Numerals (99%:1%) expressed in percentages indicate the ratios (mass %) of the host material (the compound BH2-1 or BH1-1) and the emitting compound (the compound BD2) in the second emitting layer or the first emitting layer. Numerals (50%:50%) expressed in percentages indicate the ratios (mass %) of the compound ET1-1 and the compound ET2-1 in the electron transporting layer.

Comparative Example 3-1

An organic EL device in Comparative Example 3-1 was produced in the same manner as in Example 3-1 except that the second emitting layer was not formed, that the compounds for the first emitting layer in Example 3-1 and its thickness were changed to those shown in Table 3, and that only the first emitting layer was formed as the emitting layer.

TABLE 3

| | Emitting layer | | | | | | | | | | | | Electron transporting layer | | | | |
|---|---|---|---|---|---|---|---|---|---|---|---|---|---|---|---|---|---|
| | Second emitting layer | | | | | | | First emitting layer | | | | | First electron-transporting zone material | | Second electron-transporting zone material | | $T_1$ |
| | Second host material | | | Second emitting compound | | | Thickness | First host material | | | First emitting compound | Thickness | | | | | |
| | Name | $S_1$ [eV] | $T_1$ [eV] | Name | $S_1$ [eV] | $T_1$ [eV] | [nm] | Name | $S_1$ [eV] | $T_1$ [eV] | Name | [nm] | Name | $T_1$ [eV] | Name | $T_1$ [eV] | (ETL) [eV] |
| Example 3-1 | BH2-1 | 3.31 | 2.09 | BD2 | 2.71 | 2.64 | 5 | BH1-1 | 3.01 | 1.85 | BD2 | 15 | ET1-1 | 1.80 | ET2-1 | 2.54 | 2.17 |
| Comparative Example 3-1 | — | — | — | — | — | — | — | BH1-1 | 3.01 | 1.85 | BD2 | 20 | ET1-1 | 1.80 | ET2-1 | 2.54 | 2.17 |

Evaluation (3) of Organic EL Devices Each of the organic EL devices produced in Example 3-1 and Comparative Example 3-1 was evaluated as follows.

Table 4 shows the evaluation results.

External Quantum Efficiency EQE

Voltage was applied to the organic EL device such that a current density was 10 mA/cm$^2$, where spectral radiance spectrum was measured by a spectroradiometer CS-2000 (produced by Konica Minolta, Inc.).

The external quantum efficiency EQE (unit: %) was calculated based on the obtained spectral radiance spectra, assuming that the spectra was provided under a Lambertian radiation.

The measured value of the EQE in each example and the following numerical formula (Numerical Formula 3X) were used to compute "EQE (relative value)" (unit: %).

EQE(relative value)=(EQE in the Example/EQE in Comparative Example 3-1)×100 (Numerical Formula 3X)

Lifetime LT95

A voltage was applied to one of the produced organic EL devices such that the current density was adjusted to 50 mA/cm$^2$, and the time (LT95 (unit: hour)) until the luminance was reduced to 95% of the initial luminance was measured.

The luminance was measured using a spectroradiometer CS-2000 (produced by KONICA MINOLTA, INC.).

The measured value of the LT95 in each Example and the following numerical formula (Numerical Formula 4X) were used to compute "LT95 (relative value)" (unit: %).

LT95(relative value)=(LT95 in the Example/LT95 in Comparative Example 3-1)×100 (Numerical Formula 4X)

In the organic EL device according to Comparative Example 3-1, although the triplet energy $T_1$(ETL) of the electron transporting layer calculated using the numerical formula (Numerical Formula 1A) was larger than 2.00 eV, the emitting layer was a single layer (only the second emitting layer), so that the lifetime of the device was short.

However, in the organic EL device according to Example 3-1, the triplet energy $T_1$(ETL) of the electron transporting layer calculated using the numerical formula (Numerical Formula 1A) was larger than 2.00 eV, and the first emitting layer and the second emitting layer were layered together. Therefore, the external quantum efficiency EQE was at least equivalent, and the lifetime of the device was significantly long.

Evaluation Method of Compounds

Methods for evaluating compounds will be shown below.

Triplet Energy $T_1$

A compound used for the measurement was dissolved in EPA (diethyl ether:isopentane:ethanol=5:5:2 (volume ratio)) at a concentration of 10 μmol/L to produce a solution, and this solution was placed in a quartz cell to prepare a measurement sample.

A phosphorescent spectrum (the vertical axis: phosphorescent luminous intensity, the horizontal axis: wavelength) of the measurement sample was measured at a low temperature (77K).

A tangent to the rise of the phosphorescent spectrum on the short-wavelength side was drawn, and the amount of energy was calculated according to a conversion equation (F1) below based on the wavelength value $\lambda_{edge}$ [nm] at the intersection of the tangent and the horizontal axis and used as the triplet energy $T_1$.

TABLE 4

| | Emitting layer | | | | | | Electron transporting layer | | | |
|---|---|---|---|---|---|---|---|---|---|---|
| | Second emitting layer | | | First emitting layer | | | First electron transporting-zone material | Second electron transporting-zone material | Device evaluation | |
| | Second host material | Second emitting compound | Thickness [nm] | First host material | First emitting compound | Thickness [nm] | | | EQE (relative value) [%] | LT95 (relative value) [%] |
| Example 3-1 | BH2-1 | BD2 | 5 | BH1-1 | BD2 | 15 | ET1-1 | ET2-1 | 102 | 202 |
| Comparative Example 3-1 | — | — | — | BH1-1 | BD2 | 20 | ET1-1 | ET2-1 | 100 | 100 |

It should be noted that the triplet energy $T_1$ may have an error of about plus or minus 0.02 eV depending on measurement conditions.

$$T_1\ [eV]=12390.85/\lambda_{edge} \quad \text{Conversion Equation (F1):}$$

The tangent to the rise of the phosphorescence spectrum close to the short-wavelength region is drawn as follows.

While moving on a curve of the phosphorescence spectrum from the short-wavelength region to the local maximum value closest to the short-wavelength region among the local maximum values of the phosphorescence spectrum, a tangent is checked at each point on the curve toward the long-wavelength of the phosphorescence spectrum.

An inclination of the tangent is increased along the rise of the curve (i.e., a value of the ordinate axis is increased).

A tangent drawn at a point of the local maximum inclination (i.e., a tangent at an inflection point) is defined as the tangent to the rise of the phosphorescence spectrum close to the short-wavelength region.

A local maximum point where a peak intensity is 15% or less of the maximum peak intensity of the spectrum is not counted as the above-mentioned local maximum peak intensity closest to the short-wavelength region. The tangent drawn at a point that is closest to the local maximum peak intensity closest to the short-wavelength region and where the inclination of the curve is the local maximum is defined as a tangent to the rise of the phosphorescence spectrum close to the short-wavelength region.

For phosphorescence measurement, a spectrophotofluorometer body F-4500 produced by Hitachi High-Technologies Corporation was used.

Singlet Energy $S_1$

A toluene solution of a measurement target compound at a concentration of 10 μmol/L is prepared and put in a quartz cell. An absorption spectrum (ordinate axis: absorption intensity, abscissa axis: wavelength) of the thus-obtained sample is measured at a normal temperature (300K).

A tangent was drawn to the fall of the absorption spectrum close to the long-wavelength region, and a wavelength value $\lambda_{edge}$ (nm) at an intersection of the tangent and the abscissa axis was assigned to a conversion equation (F2) below to calculate singlet energy.

$$S_1\ [eV]=12390.85/\lambda_{edge} \quad \text{Conversion Equation (F2):}$$

A spectrophotometer (U3310 produced by Hitachi, Ltd.) was used for measuring absorption spectrum.

The tangent to the fall of the absorption spectrum close to the long-wavelength region is drawn as follows.

While moving on a curve of the absorption spectrum from the local maximum value closest to the long-wavelength region, among the local maximum values of the absorption spectrum, in a long-wavelength direction, a tangent at each point on the curve is checked.

An inclination of the tangent is decreased and increased in a repeated manner as the curve falls (i.e., a value of the ordinate axis is decreased).

A tangent drawn at a point where the inclination of the curve is the local minimum closest to the long-wavelength region (except when absorbance is 0.1 or less) is defined as the tangent to the fall of the absorption spectrum close to the long-wavelength region.

The local maximum absorbance of 0.2 or less is not counted as the above-mentioned local maximum absorbance closest to the long-wavelength region.

Highest Occupied Molecular Orbital Energy Level HOMO

The highest occupied molecular orbital energy level HOMO of a material was measured in air using a photoelectron spectrometer ("AC-3" produced by RIKEN KEIKI Co., Ltd.).

Specifically, the material was irradiated with light, and the amount of electrons generated by charge separation was measured to thereby measure the highest occupied molecular orbital energy level HOMO of the compound.

Lowest Unoccupied Molecular Orbital Energy Level LUMO

Herein, the lowest unoccupied molecular orbital energy level LUMO was calculated based on the measured highest occupied molecular orbital energy level HOMO and the value of the singlet energy $S_1$ using the following numerical formula (Numerical Formula 11X).

$$LUMO=HOMO+S_1 \quad \text{(Numerical Formula 11X)}$$

Measurement of Maximum Fluorescence Peak Wavelength (FL-peak)

A compound used for the measurement was dissolved in toluene at a concentration of $4.9\times10^{-6}$ mol/L to prepare a toluene solution.

A fluorescence spectrum measurement apparatus (spectrophotofluorometer F-7000 (produced by Hitachi High-Tech Science Corporation)) was used to measure the maximum fluorescence peak wavelength A (unit: nm) when the toluene solution was excited at 390 nm.

The maximum fluorescence peak wavelength A is the same as the value of a PL maximum peak wavelength $A_{PL}$ described below.

The maximum fluorescence peak wavelength A of the compound BD1 was 457 nm.

The maximum fluorescence peak wavelength A of the compound BD2 was 455 nm.

Measurement of Integrated Value of Emission Spectrum

A compound used for the measurement was dissolve in toluene at a concentration of $4.9\times10^{-6}$ mol/L to prepare a toluene solution, and a sample for measuring the integrated value of the emission spectrum was thereby produced.

The sample for measuring the integrated value of the emission spectrum was used to measure the photoluminescent spectrum (PL spectrum).

To measure the PL spectrum, a spectrophotofluorometer F-7000 produced by Hitachi High-Tech Science Corporation was used.

The area of the obtained PL spectrum in the visible range (the wavelength range from 380 nm to 700 nm) was calculated (the total integrated value ITG(B)).

Moreover, in the PL spectrum obtained, the area of the spectrum in the range of plus or minus 10 nm from the maximum peak wavelength (PL maximum peak wavelength $A_{PL}$) at which the PL intensity was maximum was calculated (the integrated value ITG(A)).

The ratio of the integrated value ITG(A) with respect to the total integrated value ITG(B) was calculated using the following numerical formula (3A).

$$\{ITG(A)/ITG(B)\}\times100 \quad \text{(Numerical Formula 3A)}$$

Values for the evaluation of the compounds are shown in Table 5.

TABLE 5

| Compound | HOMO [eV] | LUMO [eV] | $S_1$ [eV] | $T_1$ [eV] | $\lambda_{PL}$ [nm] | (Numerical Formula 3A) Computed value [%] |
|---|---|---|---|---|---|---|
| BH1 | −5.98 | −2.97 | 3.01 | 1.90 | — | — |
| BH2 | −5.70 | −2.70 | 3.00 | 2.00 | — | — |
| BD1 | −5.90 | −3.10 | 2.80 | 2.58 | 457 | 57 |
| Ref-BD | −6.20 | −3.45 | 2.75 | 2.54 | 455 | 39 |

Calculation Values of HOMO and $T_1$ of Hole Injecting Structural Moiety and Triplet Structural Moiety of Compound Values of the HOMO and triplet energy $T_1$ of each of the hole injecting structural moiety and the triplet structural moiety of a compound were calculated using a quantum chemical calculation program (Gaussian 16, Revision B (Gaussian Inc.); computational method: B3LYP/6-31 G* (this means that B3LYP was used for the theory and 6-31 G* was used for the basis function).

The calculation values of the triplet energy $T_1$ are shown in Table 6 and Table 7.

Ionization Potential

The ionization potential of a compound was measured in air using a photoelectron spectrometer (“AC-3” produced by RIKEN KEIKI Co., Ltd.).

Specifically, the material was irradiated with light, and the amount of electrons generated by charge separation during the irradiation was measured to thereby measure the ionization potential of the compound.

“Ip” in the tables is an abbreviation of the ionization potential.

Tables 6 and 7 show the values of the ionization potential, HOMO, and triplet energy of each of the compounds as a whole and the structural moieties of the first host materials.

Table 6 shows the values of the ionization potential, HOMO, and triplet energy of each of other compounds used in Examples 2-1 to 2-4 and Comparative Examples 2-1 to 2-3.

TABLE 6

| Compound | | A | | B | Measured value of Ip (eV) | Computed value of HOMO (eV) | | | Measured value of $T_1$ (eV) | Computed value of $T_2$ (ev) | | |
|---|---|---|---|---|---|---|---|---|---|---|---|---|
| Name | Structure | Triplet structural moiety | L | Hole injecting structural moiety | Com-pound as a whole | Com-pound as a whole | Triplet structural moiety | Hole Ejecting moiety | Com-pound as a whole | Com-pound as a whole | Triplet structural moiety | Hole injecting Structural moiety |
| 8H1-a | 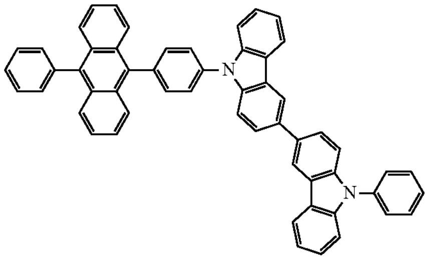 BH1-a | 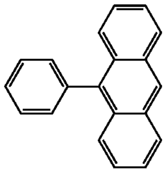 |  | 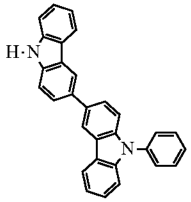 | 5.72 | −4.98 | −5.15 | −4,99 | 1.80 | 1.73 | 1.77 | 3.04 |
| | | 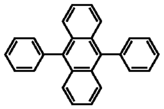 | Single bond | 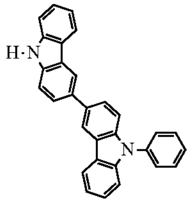 | | | −5.09 | −4.99 | | | 1.73 | 3.04 |
| BH1-b | 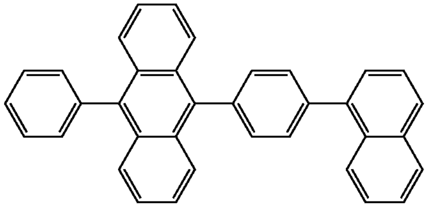 BH1-b | 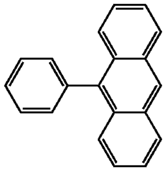 |  | 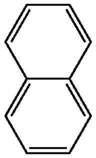 | 5.94 | −5.11 | −5.15 | −5.79 | 1.85 | 1.73 | 1.77 | 2.73 |

TABLE 6-continued

| Compound | | A | | B | Measured value of Ip (eV) | Computed value of HOMO (eV) | | | Measured value of $T_1$ (eV) | Computed value of $T_2$ (ev) | | |
|---|---|---|---|---|---|---|---|---|---|---|---|---|
| Name | Structure | Triplet structural moiety | L | Hole injecting structural moiety | Compound as a whole | Compound as a whole | Triplet structural moiety | Hole Ejecting moiety | Compound as a whole | Compound as a whole | Triplet structural moiety | Hole injecting Structural moiety |
| | | 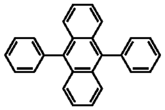 | Single bond | 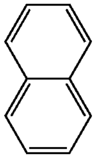 | | | −5.09 | −5.79 | | | 1.73 | 2.73 |

| Compound | | A | | B | Measured value of Ip (eV) | Computed value of HOMO (eV) | | | Measured value of Ip (eV) | Computed value of $T_1$ (eV) | | |
|---|---|---|---|---|---|---|---|---|---|---|---|---|
| Name | Structure | Tripset structural moiety | L | Hole injecting structural moiety | Compound as a whole | Compound as a whole | Triple: stuctural moiety | Hole injecting structural moiety | Compound as a whole | Compound as a whole | Triplet structural moiety | Hole infecting structural moiety |
| BH1-d | 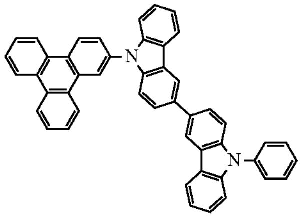 BH1-d | 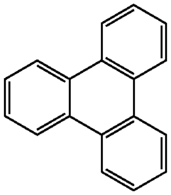 | Single bond | 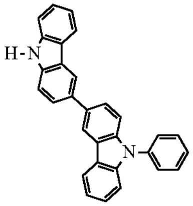 | 5.69 | −4.97 | −5.85 | −4.99 | 2.86 | 2.79 | 2.86 | 3.04 |
| BH1-e | 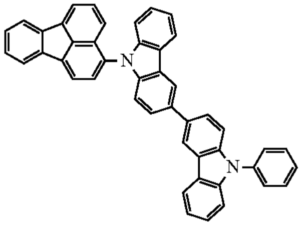 BH1-e | 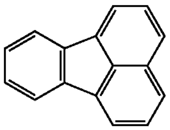 | Single bond | 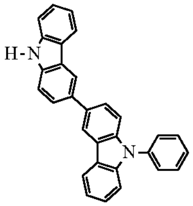 | 5.73 | −4.97 | −5.77 | −4.99 | 2.26 | 2.23 | 2.38 | 3.04 |
| BH1-f | 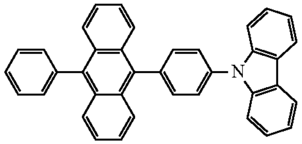 BH1-f | 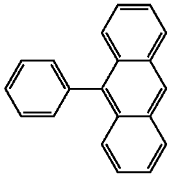 |  | 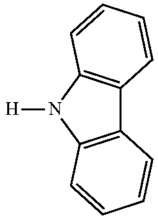 | 5.96 | −5.20 | −5.15 | −5.44 | 1.80 | 1.73 | 1.77 | 3.19 |

-continued

| Compound | | A | | B | Measured value of Ip (eV) | Computed value of HOMO (eV) | | | Measured value of Ip (eV) | Computed value of $T_1$ (eV) | | |
|---|---|---|---|---|---|---|---|---|---|---|---|---|
| Name | Structure | Tripset structural moiety | L | Hole injecting structural moiety | Compound as a whole | Compound as a whole | Triple: stuctural moiety | Hole injecting structural moiety | Compound as a whole | Compound as a whole | Triplet structural moiety | Hole infecting structural molety |
| | | 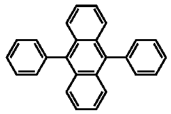 | Single bond | 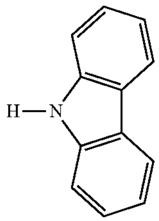 | | | −5.09 | −5.44 | | | 1.73 | 3.19 |

TABLE 8

| Compound | Measured value of Ip (eV) | Calculation value of HOMO (eV) | Measured value of $S_1$ (eV) | Measured value of $T_1$ (eV) | Calculation value of $T_1$ (eV) |
|---|---|---|---|---|---|
| Name | Compound as a whole | Compound as a whole | Compound as a whole | Compound as a whole | Compound as a whole |
| BH1-a | 5.72 | −4.98 | 3.00 | 1.80 | 1.73 |
| BH1-b | 5.94 | −5.11 | 3.02 | 1.85 | 1.73 |
| BH1-d | 5.69 | −4.97 | 3.40 | 2.86 | 2.79 |
| BH1-e | 5.73 | −4.97 | 2.72 | 2.26 | 2.23 |
| BH1-f | 5.96 | −5.20 | 3.00 | 1.80 | 1.73 |
| BD1 | 5.90 | −5.45 | 2.80 | 2.58 | 2.48 |
| BH2-a | 5.70 | −5.16 | 3.00 | 2.00 | 2.29 |
| BH2-b | 5.92 | −5.14 | 3.12 | 2.09 | 2.04 |
| HT-a | 5.54 | −4.72 | 3.10 | 2.48 | 2.49 |
| HT-b | 5.59 | −4.91 | 3.14 | 2.46 | 2.47 |
| HB-a | 6.18 | −5.46 | 3.14 | 2.90 | 2.86 |
| ET-a | 6.06 | −5.30 | 3.01 | 1.80 | 1.73 |

Electron Mobility μe

The electron mobility μe was measured by the following method using impedance spectroscopy.

A measurement target layer having a film thickness of 200 nm was held between an anode and a cathode, and a small AC voltage of 100 mV or less was applied while a bias DC voltage was applied.

The values of the AC current (its absolute value and phase) flowing in this case were measured.

The measurement was performed while the frequency of the AC voltage was changed, and complex impedance (Z) was calculated from the current and voltage values.

The frequency dependence of the imaginary part (ImM) of the modulus M=iωZ (i: imaginary unit, w: angular frequency) was determined. The reciprocal number of the frequency ω at which the ImM is maximum is defined as the response time of electrons transferred through the measurement target layer.

The electron mobility μe (unit: $cm^2/(V \cdot s)$) was calculated using the following numerical formula.

Electron mobility μe=(film thickness of measurement target layer)$^2$/(response time·voltage)

Hole Mobility μh

The hole mobility μh was measured using a mobility evaluation device produced by the following procedure.

A glass substrate (produced by GEOMATEC Co., Ltd.) having a size of 25 mm×75 mm×1.1 mm thick with an ITO transparent electrode (anode) attached thereto was ultrasonic-cleaned in isopropyl alcohol for five minutes and then UV-ozone-cleaned for 30 minutes.

The film thickness of ITO was 130 nm.

The cleaned glass substrate was placed in a substrate holder of a vacuum vapor deposition apparatus, and a compound HA-2 was vapor-deposited on the surface with the transparent electrode line formed thereon such that the transparent electrode was covered with the deposited compound to thereby form a hole injecting layer having a film thickness of 5 nm.

A compound HT-A was vapor-deposited on the deposited hole injecting layer to thereby form a hole transporting layer having a film thickness of 10 nm.

Then a compound Target used for the measurement of the hole mobility μh was vapor-deposited, and a measurement target layer having a film thickness of 200 nm was thereby formed.

Then metal aluminum (Al) was vapor-deposited on the measurement target layer to form a metal cathode having a film thickness of 80 nm.

The schematic structure of the above mobility evaluation device is as follow.

ITO (130)/HA-2 (5)/HT-A (10)/Target (200)/Al (80)

Numerals in parentheses represent a film thickness (unit: nm).

[Formula 475]

HA-2

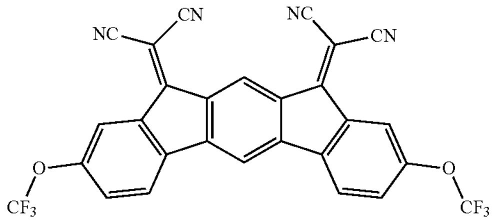

HT-A

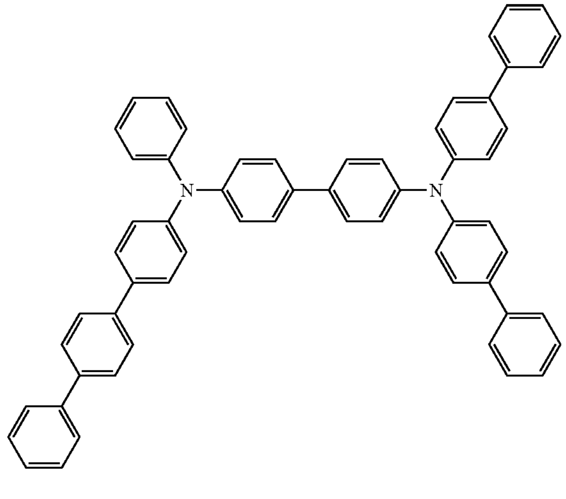

Next, the hole mobility was measured using the mobility evaluation device produced by the above procedure as follows.

The mobility evaluation device was placed in an impedance measurement apparatus to measure the impedance.

The impedance was measured while the measurement frequency was swept from 1 Hz to 1 MHz.

In this case, an AC amplitude of 0.1 V and a DC voltage V were applied simultaneously to the device.

The modulus M was calculated from the measured impedance Z according to the relationship of the following computational formula (C1).

$M=j\omega Z$ Computational formula (C1):

In the computational formula (C1), j is an imaginary unit, i.e., its square is −1. ω is the angular frequency (rad/s).

In a Bode plot in which the imaginary part of the modulus M was plotted on the vertical axis and the frequency (Hz) was plotted on the horizontal axis, a frequency fmax representing a peak was used to determine the electrical time constant T of the mobility evaluation device according to the following computational formula (C2).

$\tau=1/(2\pi f\max)$ Computational formula (C2):

π in the computational formula (C2) is a symbol representing the circular constant.

Using the above-obtained τ, the hole mobility μh was calculated from the relationship of the following computational formula (C3).

$\mu h=d^2/(V_T)$ Computational formula (C3):

In the computational formula (C3), d is the total film thickness of the organic thin films included in the device, and d=215 [nm] as described above for the structure of the mobility evaluation device.

The mobility herein is the value when the square root of the electric field intensity is $E^{1/2}=500$ [$V^{1/2}/cm^{1/2}$].

The square root of the electric field intensity $E^{1/2}$ can be calculated using the relationship of the following computational formula (C4).

$E^{1/2}=V^{1/2}/d^{1/2}$ Computational formula (C4):

In the present Examples, a Solartron 1260 impedance measurement apparatus was used for the impedance measurement, and a Solartron 1296 dielectric interface was also used to improve the accuracy.

TABLE 9

| Compound | $S_1$ [eV] | $T_1$ [eV] | μe [$cm^2/(Vs)$] | μh [$cm^2/(Vs)$] | μe/μh [—] |
|---|---|---|---|---|---|
| BH2-1 | 3.31 | 2.09 | $8.99\times10^{-6}$ | $3.26\times10^{-7}$ | 28 |
| BH1-1 | 3.04 | 1.85 | $1.23\times10^{-4}$ | $1.22\times10^{-9}$ | $1.0\times10^{5}$ |
| BD2 | 2.71 | 2.64 | — | — | — |

Synthesis Examples

Synthesis of Compound BD1
Synthesis of Intermediate 1-1

[Formula 476]

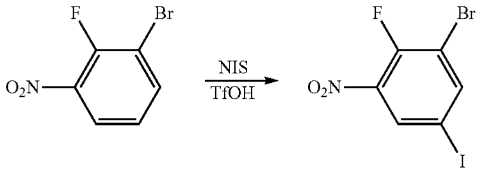

1-1

1-Bromo-2-fluoro-3 nitrobenzene (87.8 g, 399 mmol) was added to 130 mL of trifluoromethanesulfonic acid, and the resulting solution was cooled to 0 degrees C.

N-iodosuccinimide (116.5 g, 517 mmol) was added to the cooled solution, and the mixture was stirred at room temperature for 19 hours.

The reaction solution was poured into 400 mL of water, and the resulting reaction solution was neutralized with a 40% aqueous sodium hydroxide solution and then extracted with heptane.

The collected organic layer was washed with a 10% aqueous sodium sulfite solution until colorless, washed with a saturated saline solution, and dried over magnesium sulfate.

The solid was removed by filtration, and the filtrate was concentrated.

The resulting oily product was distilled and purified to thereby obtain a yellow oily product (102.5 g, yield: 71%).

The obtained oily produce was a target product, i.e., an intermediate 1-1. The results of mass spectroscopy showed that its molecular weight was 346 and m/z=346.

Synthesis of Intermediate 1-2

[Formula 477]

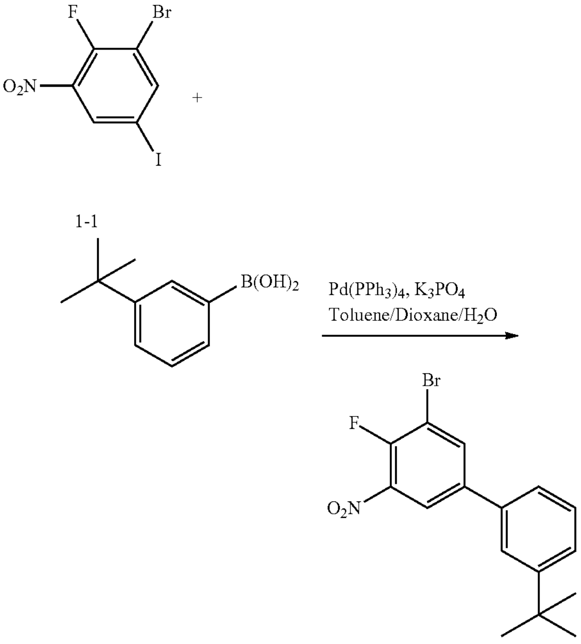

1-1

1-2

In a nitrogen atmosphere, the intermediate 1-1 (70.0 g, 202 mmol), 3-t-butylphenylboronic acid (39.6 g, 223 mmol), and potassium phosphate (107 g, 506 mmol) were suspended in a solvent mixture of 280 mL of toluene, 210 mL of 1,4-dioxane, and 140 mL of water.

Then tetrakis(triphenylphosphine) palladium (4.68 g, 4.05 mmol) was added, and the mixture was stirred at 80 degrees C. for 24 hours.

The resulting mixture was cooled to room temperature. Then the aqueous layer was extracted with toluene, and the collected organic layer was washed with a saturated saline and dried over magnesium sulfate.

The solid was separated by filtration, and the resulting solution was concentrated to thereby obtain a brown oily product.

Methanol was poured into the oily product for crystallization, and the obtained crystals were collected by filtration and washed with methanol to thereby obtain a white solid (43 g, yield: 60%).

The obtained solid was a target product, i.e., an intermediate 1-2. The results of mass spectroscopy showed that its molecular weight was 352 and m/z=352.

Synthesis of Intermediate 1-3

[Formula 478]

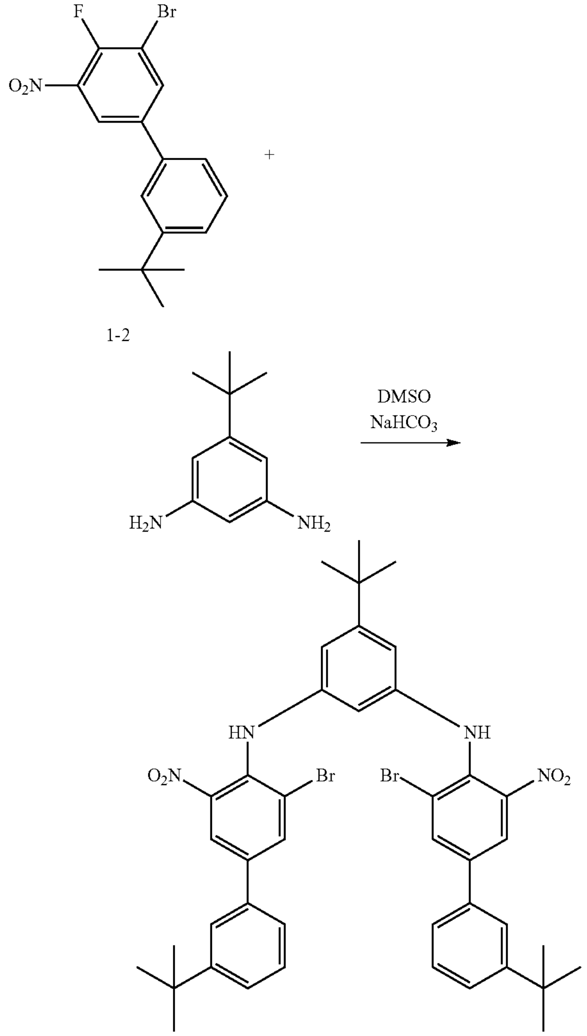

1-2

1-3

In a nitrogen atmosphere, the intermediate 1-2 (35.2 g, 100 mmol), 1,3-diaminobenzene (4.5 g, 41.6 mmol), and sodium hydrogencarbonate (7.7 g, 92 mmol) were added to 60 mL of dimethyl sulfoxide, and the mixture was stirred at 100 degrees C. for 48 hours.

The reaction solution was cooled to room temperature, and 30 mL of methanol and 15 mL of water were added.

The obtained solid was collected by filtration and washed with methanol and water.

The solid was added to 80 mL of ethanol and heated and stirred. The undissolved solid was separated by filtration, and a red solid was thereby obtained (26.7 g, yield: 83%).

The obtained solid was a target product, i.e., an intermediate 1-3. The results of mass spectroscopy showed that its molecular weight was 828 and m/z=828.

Synthesis of Intermediate 1-4

[Formula 479]

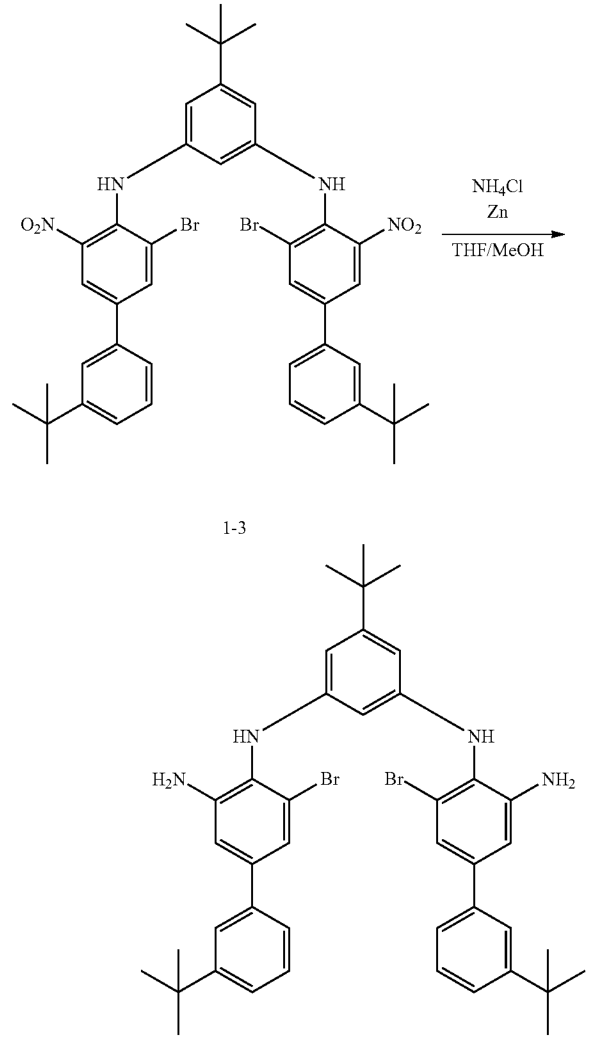

1-3

1-4

The intermediate 1-3 (17.7 g, 22.9 mmol) was dissolved in 650 mL of tetrahydrofuran, and 60 mL of methanol was added. The mixture was heated to 50 degrees C., and ammonium chloride (73.5 g, 1.375 mol) was added.

Then zinc powder (33.7 g, 412 mmol) was gradually added, and the mixture was stirred for 2 hours.

Then ammonium chloride (35.0 g, 654 mmol) and zinc powder (17.5 g, 267 mmol) were further added, and the resulting mixture was stirred at 50 degrees C. for 18 hours.

The mixture was cooled to room temperature. Then the solid was separated by filtration, and the filtrate was concentrated. 200 mL of water was added to the residue, and the solution was extracted with ethyl acetate.

The collected organic layer was washed with water and a saturated saline solution and dried over magnesium sulfate.

The resulting solution was concentrated to thereby obtain a pink solid (14.3 g, yield: 87%).

The obtained solid was a target product, i.e., an intermediate 1-4. The results of mass spectroscopy showed that its molecular weight was 768 and m/z=768.

Synthesis of Intermediate 1-5

[Formula 480]

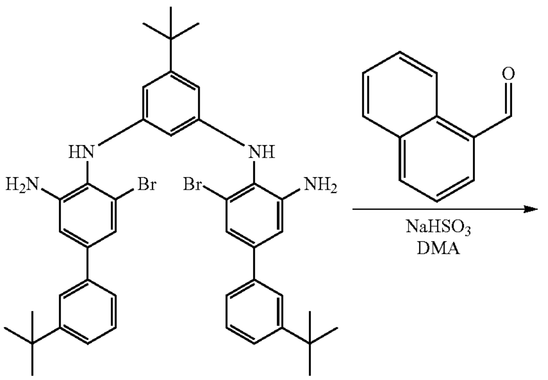

1-4

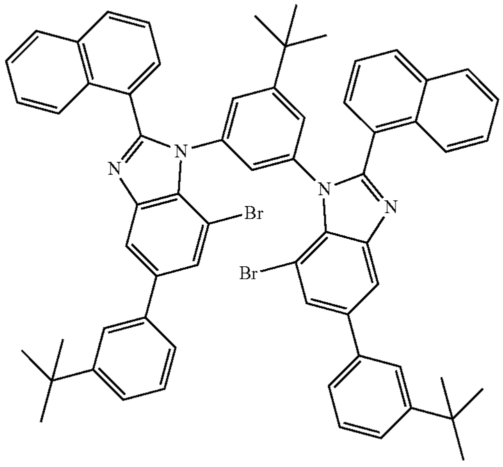

1-5

Sodium hydrogen sulfite (31.5 g, 303 mmol) was suspended in 30 mL of dimethylacetamide (DMA), and the suspension was stirred at 120 degrees C.

The intermediate 1-4 (9.69 g, 12.6 mmol) dissolved in 30 mL of dimethylacetamide was added to the suspension, and 1-naphthylaldehyde (7.89 g, 50.5 mmol) dissolved in 30 mL of dimethylacetamide was added to the resulting suspension. The mixture was stirred at 130 degrees C. for 24 hours.

Then the mixture was cooled to room temperature. The reaction mixture was poured into 500 mL of methanol, and 500 mL of water and 500 mL of methanol were added under stirring.

The solid generated was separated by filtration and washed with methanol.

The solid was crystallized using 250 mL of methylene chloride and 100 mL of heptane.

The resulting solid was separated by filtration and washed with heptane to thereby obtain a white solid (9.71 g, yield: 74%).

The obtained solid was a target product, i.e., an intermediate 1-5. The results of mass spectroscopy showed that its molecular weight was 1040 and m/z=1040.

Synthesis of Compound BD1

[Formula 481]

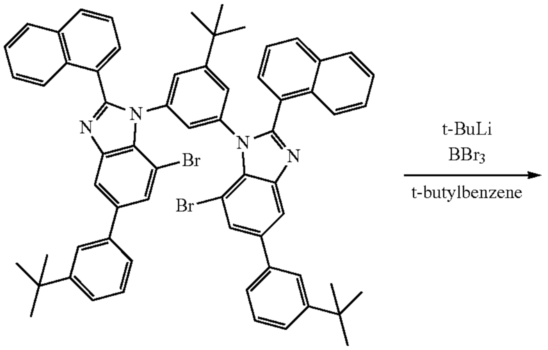

1-5

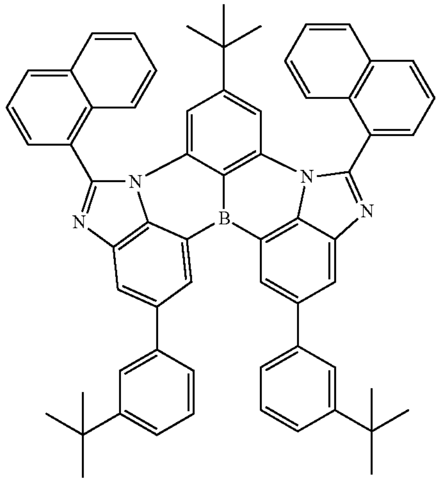

BD1

The intermediate 1-5 (6.62 g, 6.36 mmol) was dissolved in 400 mL of t-butylbenzene and cooled to −50 degrees C., and a 1.7M t-butyllithium (t-BuLi) pentane solution (15 mL, 25.4 mmol) was added dropwise to the solution.

The mixture was stirred at room temperature for 45 minutes and cooled again to −50 degrees C., and boron tribromide (6.38 g, 25.4 mmol) was added dropwise to the mixture.

The resulting mixture was heated to room temperature and stirred for 2 hours, and the resulting reaction solution was added to 1200 mL of iced water and 200 mL of 1M sodium hydroxide using a cannula.

Then the mixture was extracted with ethyl acetate, and the collected organic layer was washed with a saturated saline solution and dried over magnesium sulfate.

The resulting solution was concentrated, and the residue was purified by silica gel chromatography to thereby obtain a yellow solid (0.34 g, yield: 6%).

The obtained solid was a target compound, i.e., the compound BD1. The results of mass spectroscopy showed that its molecular weight was 890 and m/z=890.

The invention claimed is:

1. An organic electroluminescence device, comprising:

an anode;

a cathode;

a first emitting layer disposed between the anode and the cathode; and a second emitting layer disposed between the first emitting layer and the cathode, wherein the first emitting layer and the second emitting layer are disposed in this order between the anode and the cathode, the first emitting layer comprises a first host material, the second emitting layer comprises a second host material, the first host material and the second host material are mutually different, the first emitting layer comprises at least a first emitting compound, the second emitting layer comprises at least a second emitting compound, the first emitting compound and the second emitting compound are mutually the same or different, a triplet energy of the first host material $T_1(H1)$ and a triplet energy of the second host material $T_1(H2)$ satisfy a relationship of a numerical formula (Numerical Formula 1) below, and a lowest unoccupied molecular orbital energy level of the second host material LUMO(H2) and a lowest unoccupied molecular orbital energy level of the second emitting compound LUMO(D2) satisfy a relationship of a numerical formula (Numerical Formula 2) below, $$T_1(H1)<T_1(H2) \quad \text{(Numerical Formula 1)}$$

$$|\text{LUMO}(D2)|-|\text{LUMO}(H2)|<0.74\text{ eV} \quad \text{(Numerical Formula 2).}$$

2. The organic electroluminescence device according to claim 1, wherein an integrated value ITG(A) in a range of plus or minus 10 nm from a maximum peak wavelength of an emission spectrum of the second emitting compound and a total integrated value ITG(B) of the emission spectrum of the second emitting compound satisfy a relationship of a numerical formula (Numerical Formula 3) below, $$40\leq\{ITG(A)/ITG(B)\}\times100 \quad \text{(Numerical Formula 3).}$$

3. The organic electroluminescence device according to claim 1, wherein the lowest unoccupied molecular orbital energy level of the second host material LUMO(H2) and the lowest unoccupied molecular orbital energy level of the second emitting compound LUMO(D2) satisfy a relationship of a numerical formula (Numerical Formula 2D) below, $$0\text{ eV}<|\text{LUMO}(D2)|-|\text{LUMO}(H2)| \quad \text{(Numerical Formula 2D).}$$

4. The organic electroluminescence device according to claim 1, wherein the first emitting compound has a maximum peak wavelength of 500 nm or less.

5. The organic electroluminescence device according to claim 1, wherein the second emitting compound has a maximum peak wavelength of 500 nm or less.

6. The organic electroluminescence device according to claim 1, wherein a highest occupied molecular orbital energy level of the first host material HOMO(H1) and a highest occupied molecular orbital energy level of the first emitting compound HOMO(D1) satisfy a relationship of a numerical formula (Numerical Formula 4) below:

$$|\text{HOMO}(D1)|-|\text{HOMO}(H1)|<0.21\text{ eV} \quad \text{(Numerical Formula 4).}$$

7. The organic electroluminescence device according to claim 1, further comprising: a first anode side organic layer; and a first cathode side organic layer, wherein the first anode side organic layer, the first emitting layer, the second emitting layer, and the first cathode side organic layer are disposed in this order between the anode and the cathode, the first anode side organic layer comprises a first anode side organic material, the first host material is a compound represented by a formula (1H) below, the first cathode side organic layer comprises a first cathode side organic material, and the triplet energy of the first host material $T_1(H1)$, the triplet energy of the second host material $T_1(H2)$, and a triplet energy of the second emitting compound $T_1(D2)$ satisfy a relationship of a numerical formula (Numerical Formula A1) below:

$$T_1(H1)<T_1(H2)<T_1(D2) \quad \text{(Numerical Formula A1),}$$

$$A\text{-}L\text{-}B \quad \text{(1H),}$$

where, in the formula (1H):

A is a triplet structural moiety;

B is a hole injecting structural moiety;

L is a single bond or a linking group; and a calculation value of a highest occupied molecular orbital energy level HOMO(B) of the hole injecting structural moiety B is-5.70 eV or more.

8. The organic electroluminescence device according to claim 7, wherein a calculation value of a triplet energy of the triplet structural moiety A of the first host material $T_{1C}(A)$ and a calculation value of a triplet energy of the hole injecting structural moiety of the first host material $T_{1C}(B)$ satisfy a relationship of a numerical formula (Numerical Formula B12) below:

$$T_{1C}(A)<T_{1C}(B) \quad \text{(Numerical Formula B12).}$$

9. The organic electroluminescence device according to claim 7, wherein the calculation value of the triplet energy of the triplet structural moiety A of the first host material $T_{1C}(A)$ and a calculation value of a triplet energy of the second host material $T_{1C}(H2)$ satisfy a numerical formula (Numerical Formula B11) below:

$$T_{1C}(A)<T_{1C}(H2) \quad \text{(Numerical Formula B11).}$$

10. The organic electroluminescence device according to claim 7, wherein the triplet structural moiety A of the first host material is substituted or unsubstituted anthracene.

11. The organic electroluminescence device according to claim 10, wherein a carbon atom at a position 9 or a position 10 of the substituted or unsubstituted anthracene serving as the triplet structural moiety A is bonded to L.

12. The organic electroluminescence device according to claim 7, wherein L in the first host material is a substituted or unsubstituted phenylene group or a substituted or unsubstituted biphenylene group.

13. The organic electroluminescence device according to claim 10, wherein the triplet structural moiety A of the first host material is substituted or unsubstituted 9,10-diphenylanthracene, and L is a single bond.

14. The organic electroluminescence device according to claim 13, wherein substituted or unsubstituted phenyl groups are respectively independently bonded to carbon atoms at positions 9 and 10 of the substituted or unsubstituted 9,10-diphenylanthracene serving as the triplet structural moiety A, and the hole injecting structural moiety B is bonded to one of the substituted or unsubstituted phenyl groups.

15. The organic electroluminescence device according to claim 7, wherein a triplet energy of the first cathode side organic material $T_1$(HBL), the triplet energy of the first host material $T_1$(H1), the triplet energy of the second host material $T_1$(H2), and the triplet energy of the second emitting compound $T_1$(D2) satisfy a relationship of a numerical formula (Numerical Formula A11) below:

$$T_1(H1)<T_1(H2)<T_1(D2)<T_1(HBL) \quad \text{(Numerical Formula A11).}$$

16. The organic electroluminescence device according to claim 7, wherein a triplet energy of the first anode side organic material $T_1$(EBL) and the triplet energy of the first host material $T_1$(H1) satisfy a relationship of a numerical formula (Numerical Formula A12) below:

$$T_1(EBL)>T_1(H1) \quad \text{(Numerical Formula A12).}$$

17. The organic electroluminescence device according to claim 7, wherein a calculation value HOMOc(EBL) of a highest occupied molecular orbital energy level HOMO (EBL) of the first anode side organic material and a calculation value HOMOc(B) of the highest occupied molecular orbital energy level HOMO(B) of the hole injecting structural moiety B satisfy a relationship of a numerical formula (Numerical Formula A13) below:

$$|HOMO_C(EBL)|<|HOMO_C(B)| \quad \text{(Numerical Formula A13).}$$

18. The organic electroluminescence device according to claim 7, wherein the first emitting layer and the first anode side organic layer are in direct contact with each other.

19. The organic electroluminescence device according to claim 7, wherein the second emitting layer and the first cathode side organic layer are in direct contact with each other.

20. The organic electroluminescence device according to claim 1, further comprising:

an electron injecting layer disposed between the second emitting layer and the cathode; and an electron transporting layer disposed between the electron injecting layer and the second emitting layer, wherein the electron injecting layer comprises a metal element-containing compound containing a metal element in an amount of 70 mass % or more based on a mass of the electron injecting layer, the electron transporting layer comprises at least an electron transporting-zone material as at least one compound forming the electron transporting layer, a triplet energy of the electron transporting layer $T_1$(ETL) that is calculated using a numerical formula (Numerical Formula 1A) below is larger than 2.00 eV, the electron transporting layer is a single layer, and the electron transporting layer is in direct contact with the second emitting layer and with the electron injecting layer, $$T_1(ETL)=\sum_{k=1}^{n}(T_1(ET_k)\times R(ET_k)) \quad \text{(Numerical Formula 1A)}$$

where, in the numerical formula (Numerical Formula 1A):

$T_1(ET_k)$ is a triplet energy of each of the at least one compound forming the electron transporting layer;

R $(ET_k)$ is a content ratio of the each of the at least one compound forming the electron transporting layer; and n is the number of the at least one compound forming the electron transporting layer.

21. The organic electroluminescence device according to claim 20, wherein the triplet energy of the electron transporting layer $T_1$(ETL) that is calculated using the numerical formula (Numerical Formula 1A) is larger than 2.15 eV.

22. The organic electroluminescence device according to claim 20, wherein the second emitting layer and the electron transporting layer are in direct contact with each other.

23. The organic electroluminescence device according to claim 20, wherein the electron transporting layer comprises, as the at least one compound forming the electron transporting layer, at least a first electron transporting-zone material and a second electron transporting-zone material.

24. The organic electroluminescence device according to claim 23, wherein the first electron transporting-zone material is a compound represented by a formula (E21), (E22), (E23), or (E24) below:

(E21)

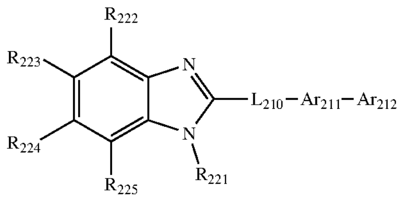

(E22)

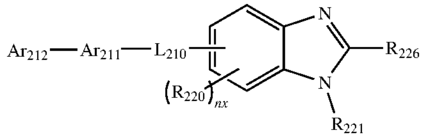

(E23)

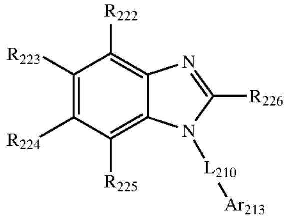

(E24)

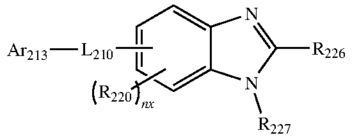

where, in the formula (E21):

$R_{221}$ is a substituted or unsubstituted aryl group having 6 to 50 ring carbon atoms, a substituted or unsubstituted pyridyl group, a substituted or unsubstituted quinolyl group, a substituted or unsubstituted alkyl group having 1 to 50 carbon atoms, or a group represented by —O—($R_{904}$);

$R_{222}$ to $R_{225}$ are each independently a hydrogen atom, a substituted or unsubstituted aryl group having 6 to 50 ring carbon atoms, a substituted or unsubstituted pyridyl group, a substituted or unsubstituted quinolyl group, a substituted or unsubstituted alkyl group having 1 to 50 carbon atoms, or a group represented by —O—($R_{904}$);

$L_{210}$ is a substituted or unsubstituted arylene group having 6 to 50 ring carbon atoms, a substituted or unsubstituted pyridinylene group, a substituted or unsubstituted quinolinylene group, or a substituted or unsubstituted fluorenylene group;

$Ar_{211}$ is a substituted or unsubstituted arylene group having 6 to 50 ring carbon atoms, a substituted or unsubstituted pyridinylene group, or a substituted or unsubstituted quinolinylene group; and $Ar_{212}$ is a substituted or unsubstituted aryl group having 6 to 50 ring carbon atoms, a substituted or unsubstituted pyridyl group, a substituted or unsubstituted quinolyl group, a substituted or unsubstituted alkyl group having 1 to 50 carbon atoms, or a group represented by —O—($R_{904}$), where, in the formula (E22):

$R_{221}$, $L_{210}$, $Ar_{211}$, and $Ar_{212}$ respectively represent the same as $R_{221}$, $L_{210}$, $Ar_{211}$, and $Ar_{212}$ in the formula (E21);

$R_{220}$ and $R_{226}$ are each independently a hydrogen atom, a substituted or unsubstituted aryl group having 6 to 50 ring carbon atoms, a substituted or unsubstituted pyridyl group, a substituted or unsubstituted quinolyl group, a substituted or unsubstituted alkyl group having 1 to 50 carbon atoms, or a group represented by —O—($R_{904}$);

nx is 3; and a plurality of $R_{220}$ are mutually the same or different, where, in the formula (E23):

$R_{222}$ to $R_{226}$ are each independently a hydrogen atom, a substituted or unsubstituted aryl group having 6 to 50 ring carbon atoms, a substituted or unsubstituted pyridyl group, a substituted or unsubstituted quinolyl group, a substituted or unsubstituted alkyl group having 1 to 50 carbon atoms, or a group represented by —O—($R_{904}$);

$L_{210}$ represents the same as $L_{210}$ in the formula (E21);

$Ar_{213}$ is a substituted or unsubstituted aryl group having 6 to 50 ring carbon atoms, a substituted or unsubstituted pyridyl group, a substituted or unsubstituted quinolyl group, a substituted or unsubstituted alkyl group having 1 to 50 carbon atoms, a group represented by —O—($R_{904}$), or a group represented by —$Ar_{214}$—$Ar_{215}$;

$Ar_{214}$ represents the same as $Ar_{211}$ in the formula (E21); and $Ar_{215}$ represents the same as $Ar_{212}$ in the formula (E21), where, in the formula (E24):

$R_{220}$, $R_{226}$, and $R_{227}$ are each independently a hydrogen atom, a substituted or unsubstituted aryl group having 6 to 50 ring carbon atoms, a substituted or unsubstituted pyridyl group, a substituted or unsubstituted quinolyl group, a substituted or unsubstituted alkyl group having 1 to 50 carbon atoms, or a group represented by —O—($R_{904}$);

nx is 3;

a plurality of $R_{220}$ are mutually the same or different;

$L_{210}$ represents the same as $L_{210}$ in the formula (E21); and $Ar_{213}$ represents the same as $Ar_{213}$ in the formula (E23), where, in the formulae (E21) to (E24):

$R_{904}$ is a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms; and when a plurality of $R_{904}$ are present, the plurality of $R_{904}$ are mutually the same or different.

25. The organic electroluminescence device according to claim 23, wherein the second electron transporting-zone material is a compound represented by a formula (E11) below:

(E11)

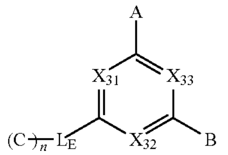

where, in the formula (E11):

$X_{31}$, $X_{32}$, and $X_{33}$ are each independently a nitrogen atom or $CR_E$;

at least one of $X_{31}$, $X_{32}$, or $X_{33}$ is a nitrogen atom;

$R_E$ is a hydrogen atom, a cyano group, a substituted or unsubstituted alkyl group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a substituted or unsubstituted aryl group having 6 to 50 ring carbon atoms, or a substituted or unsubstituted heterocyclic group having 5 to 50 ring atoms;

when a plurality of $R_E$ are present, the plurality of $R_E$ are mutually the same or different;

A is a substituted or unsubstituted aryl group having 6 to 18 ring carbon atoms, or a substituted or unsubstituted heterocyclic group having 5 to 13 ring atoms;

B is a substituted or unsubstituted aryl group having 6 to 18 ring carbon atoms, or a substituted or unsubstituted heterocyclic group having 5 to 13 ring atoms;

$L_E$ is a single bond, a substituted or unsubstituted (n+1)-valent aromatic hydrocarbon ring group having 6 to 18 ring carbon atoms, a substituted or unsubstituted (n+1)-valent heterocyclic group having 5 to 13 ring atoms, or an (n+1)-valent group having a structure in which two or three mutually different groups selected from the group consisting of a substituted or unsubstituted aromatic hydrocarbon ring group having 6 to 18 ring carbon atoms and a substituted or unsubstituted heterocyclic group having 5 to 13 ring atoms are bonded to each other;

C is a substituted or unsubstituted aryl group having 6 to 30 ring carbon atoms, or a substituted or unsubstituted heterocyclic group having 5 to 50 ring atoms;

n is 1, 2, or 3;

when n is 2 or more, $L_E$ is not a single bond;

when n is 2 or more, a plurality of C are mutually the same or different;

$R_{901}$, $R_{902}$, $R_{903}$, and $R_{904}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different; and when a plurality of $R_{904}$ are present, the plurality of $R_{904}$ are mutually the same or different.

26. The organic electroluminescence device according to claim 1, wherein a singlet energy of the first host material $S_1(H1)$ and a singlet energy of the first emitting compound $S_1(D1)$ satisfy a relationship of a numerical formula (Numerical Formula 5) below:

$$S_1(H1)>S_1(D1) \quad \text{(Numerical Formula 5).}$$

27. The organic electroluminescence device according to claim 1, wherein the triplet energy of the first host material $T_1(H1)$ and a triplet energy of the first emitting compound $T_1(D1)$ satisfy a relationship of a numerical formula (Numerical Formula 6) below:

$$T_1(D1)>T_1(H1) \quad \text{(Numerical Formula 6).}$$

28. The organic electroluminescence device according to claim 1, wherein a singlet energy of the second host material $S_1(H2)$ and a singlet energy of the second emitting compound $S_1(D2)$ satisfy a relationship of a numerical formula (Numerical Formula 7) below:

$$S_1(H2)>S_1(D2) \quad \text{(Numerical Formula 7).}$$

29. The organic electroluminescence device according to claim 1, wherein the triplet energy of the second emitting compound $T_1(D2)$ and the triplet energy of the second host material $T_1(H2)$ satisfy a relationship of a numerical formula (Numerical Formula 8) below:

$$T_1(D2)>T_1(H2) \quad \text{(Numerical Formula 8).}$$

30. The organic electroluminescence device according to claim 1, wherein the triplet energy of the first host material $T_1(H1)$ and the triplet energy of the second host material $T_1(H2)$ satisfy a relationship of a numerical formula (Numerical Formula 9) below:

$$T_1(H2)-T_1(H1)>0.03 \text{ eV} \quad \text{(Numerical Formula 9).}$$

31. The organic electroluminescence device according to claim 1, wherein a thickness of the first emitting layer is larger than a thickness of the second emitting layer.

32. The organic electroluminescence device according to claim 1, wherein the first emitting layer and the second emitting layer are in direct contact with each other.

33. The organic electroluminescence device according to claim 1, wherein a triplet energy of the first emitting compound or the second emitting compound $T_1(DX)$, the triplet energy of the first host material $T_1(H1)$, and the triplet energy of the second host material $T_1(H2)$ satisfy a relationship of a numerical formula (Numerical Formula 10) below:

$$2.6 \text{ eV}>T_1(DX)>T_1(H2)>T_1(H1) \quad \text{(Numerical Formula 10).}$$

34. The organic electroluminescence device according to claim 1, wherein the triplet energy of the first emitting compound or the second emitting compound $T_1(DX)$ and the triplet energy of the second host material $T_1(H2)$ satisfy a relationship of a numerical formula (Numerical Formula 11) below:

$$0 \text{ eV}<T_1(DX)-T_1(H2)<0.6 \text{ eV} \quad \text{(Numerical Formula 11).}$$

35. The organic electroluminescence device according to claim 1, wherein the triplet energy of the second host material $T_1(H2)$ satisfies a relationship of a numerical formula (Numerical Formula 12) below:

$$T_1(H2)>2.0 \text{ eV} \quad \text{(Numerical Formula 12).}$$

36. The organic electroluminescence device according to claim 1, wherein the triplet energy of the second host material $T_1(H2)$ satisfies a relationship of a numerical formula (Numerical Formula 12A) below:

$$T_1(H2)>2.10 \text{ eV} \quad \text{(Numerical Formula 12A).}$$

37. The organic electroluminescence device according to claim 1, wherein the triplet energy of the second host material $T_1(H2)$ satisfies a relationship of the numerical formula (Numerical Formula 12C) below:

$$2.08 \text{ eV}>T_1(H2)>1.87 \text{ eV} \quad \text{(Numerical Formula 12C).}$$

38. The organic electroluminescence device according to claim 1, wherein the triplet energy of the first emitting compound $T_1(D1)$ satisfies a relationship of a numerical formula (Numerical Formula 14A) below:

$$2.60 \text{ eV}>T_1(D1) \quad \text{(Numerical Formula 14A).}$$

39. The organic electroluminescence device according to claim 1, wherein the triplet energy of the second emitting compound $T_1(D2)$ satisfies a relationship of a numerical formula (Numerical Formula 14C) below:

$$2.60 \text{ eV}>T_1(D2) \quad \text{(Numerical Formula 14C).}$$

40. The organic electroluminescence device according to claim 1, wherein the triplet energy of the first host material $T_1(H1)$ satisfies a relationship of a numerical formula (Numerical Formula 13) below:

$$T_1(H1)>1.9 \text{ eV} \quad \text{(Numerical Formula 13).}$$

41. The organic electroluminescence device according to claim 1, wherein the triplet energy of the first host material $T_1(H1)$ satisfies a relationship of a numerical formula (Numerical Formula 13A) below:

$$1.9 \text{ eV}>T_1(H1)>1.8 \text{ eV} \quad \text{(Numerical Formula 13A).}$$

42. The organic electroluminescence device according to claim 1, wherein the second host material comprises, in a molecule thereof, a linking structure comprising a benzene ring and a naphthalene ring linked to each other through a single bond, the benzene ring and the naphthalene ring in the linking structure are each independently fused or not fused with a further monocyclic ring or fused ring, and the benzene ring and the naphthalene ring in the linking structure are further linked to each other by cross-linking at at least one site other than the single bond.

43. The organic electroluminescence device according to claim 42, wherein the cross-linking comprises a double bond.

44. The organic electroluminescence device according to claim 1, wherein the second host material comprises, in a molecule thereof, a biphenyl structure comprising a first benzene ring and a second benzene ring linked to each other through a single bond, and the first benzene ring and the second benzene ring in the biphenyl structure are further linked to each other by cross-linking at at least one site other than the single bond.

45. The organic electroluminescence device according to claim 44, wherein the first benzene ring and the second benzene ring in the biphenyl structure are further linked to each other by the cross-linking at one site other than the single bond.

46. The organic electroluminescence device according to claim 44, wherein the cross-linking comprises a double bond.

47. The organic electroluminescence device according to claim 44, wherein the first benzene ring and the second benzene ring in the biphenyl structure are further linked to each other by the cross-linking at two sites other than the single bond, and the cross-linking comprises no double bond.

48. An electronic device comprising the organic electroluminescence device according to claim 1.

* * * * *